US011024815B2

(12) United States Patent
Stoessel et al.

(10) Patent No.: US 11,024,815 B2
(45) Date of Patent: Jun. 1, 2021

(54) METAL COMPLEXES

(71) Applicant: Merck Patent GmbH, Darmstadt (DE)

(72) Inventors: Philipp Stoessel, Frankfurt am Main (DE); Nils Koenen, Griesheim (DE); Philipp Harbach, Muehltal (DE); Christian Ehrenreich, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 756 days.

(21) Appl. No.: 15/548,496

(22) PCT Filed: Jan. 7, 2016

(86) PCT No.: PCT/EP2016/000010

§ 371 (c)(1),
(2) Date: Aug. 3, 2017

(87) PCT Pub. No.: WO2016/124304

PCT Pub. Date: Aug. 11, 2016

(65) Prior Publication Data

US 2018/0026209 A1 Jan. 25, 2018

(30) Foreign Application Priority Data

Feb. 3, 2015 (EP) .................................... 15000307

(51) Int. Cl.
*H01L 51/50* (2006.01)
*H01L 51/54* (2006.01)
(Continued)

(52) U.S. Cl.
CPC ........ *H01L 51/0085* (2013.01); *C07B 59/004* (2013.01); *C07F 3/06* (2013.01);
(Continued)

(58) Field of Classification Search
CPC ............... H01L 51/0085; H01L 51/077; H01L 51/0079; H01L 51/0083; H01L 51/0084;
(Continued)

(56) References Cited

U.S. PATENT DOCUMENTS

2003/0091862 A1* 5/2003 Tokito ................. H01L 51/0085 428/690
2005/0170206 A1* 8/2005 Ma ...................... C07F 15/0073 428/690
(Continued)

FOREIGN PATENT DOCUMENTS

JP 2013243234 A * 12/2013
WO 2012/013271 A1 2/2012

OTHER PUBLICATIONS

Nishizeki et al., machine translation of JP-2013243234-A, pp. 1-103. (Year: 2013).*
(Continued)

*Primary Examiner* — Dylan C Kershner
(74) *Attorney, Agent, or Firm* — Faegre Drinker Biddle & Reath LLP

(57) ABSTRACT

The present invention relates to metal complexes and to electronic devices, especially organic electroluminescent devices, comprising these metal complexes, especially as emitters, and in particular monometallic metal complex containing a hexadentate tripodal ligand in which three bidentate sub-ligands coordinate to a metal and the three bidentate sub-ligands, which may be the same or different, are joined via a bridge.

20 Claims, 5 Drawing Sheets a)

b)

(51) Int. Cl.

| | |
|---|---|
| ***H01L 51/00*** | (2006.01) |
| ***C07F 15/00*** | (2006.01) |
| ***C07F 15/02*** | (2006.01) |
| ***C07F 15/06*** | (2006.01) |
| ***C07B 59/00*** | (2006.01) |
| ***C07F 3/06*** | (2006.01) |
| ***C07F 5/00*** | (2006.01) |
| ***C07F 5/06*** | (2006.01) |
| ***C09K 11/06*** | (2006.01) |

(52) U.S. Cl.

CPC .............. *C07F 5/003* (2013.01); *C07F 5/069* (2013.01); *C07F 15/002* (2013.01); *C07F 15/004* (2013.01); *C07F 15/008* (2013.01); *C07F 15/0013* (2013.01); *C07F 15/0026* (2013.01); *C07F 15/0033* (2013.01); *C07F 15/0046* (2013.01); *C07F 15/0053* (2013.01); *C07F 15/0073* (2013.01); *C07F 15/02* (2013.01); *C07F 15/025* (2013.01); *C07F 15/06* (2013.01); *C07F 15/065* (2013.01); *C09K 11/06* (2013.01); *H01L 51/0077* (2013.01); *H01L 51/0079* (2013.01); *H01L 51/0083* (2013.01); *H01L 51/0084* (2013.01); *H01L 51/0086* (2013.01); *H01L 51/0087* (2013.01); *H01L 51/0088* (2013.01); *H01L 51/0089* (2013.01); *H01L 51/0092* (2013.01); *C07B 2200/05* (2013.01); *C09K 2211/1007* (2013.01); *C09K 2211/1011* (2013.01); *C09K 2211/1029* (2013.01); *C09K 2211/1037* (2013.01); *C09K 2211/1044* (2013.01); *C09K 2211/1059* (2013.01); *C09K 2211/1088* (2013.01); *C09K 2211/182* (2013.01); *C09K 2211/185* (2013.01); *C09K 2211/186* (2013.01); *C09K 2211/187* (2013.01); *C09K 2211/188* (2013.01); *H01L 51/5016* (2013.01); *H01L 2251/5384* (2013.01); *Y02E 10/549* (2013.01)

(58) Field of Classification Search

CPC ............. H01L 51/0086; H01L 51/0087; H01L 51/0088; H01L 51/0089; H01L 51/0092; H01L 51/5016; H01L 2251/5384; C07F 3/06; C07F 5/003; C07F 15/0013; C07F 15/002; C07F 15/0026; C07F 15/0033; C07F 15/004; C07F 15/0046; C07F 15/0053; C07F 15/0073; C07F 15/008; C07F 15/02; C07F 15/025; C07F 15/06; C07F 15/065; C09K 11/06; C09K 2211/1007; C09K 2211/1011; C09K 2211/1029; C09K 2211/1037; C09K 2211/1044; C09K 2211/1059; C09K 2211/1088; C09K 2211/182; C09K 2211/185; C09K 2211/186; C09K 2211/187; C09K 2211/188; C07B 59/004; Y02E 10/549

See application file for complete search history.

(56) References Cited

U.S. PATENT DOCUMENTS

| | | | | |
|---|---|---|---|---|
| 2011/0284799 | A1* | 11/2011 | Stoessel .................. | C09B 57/00 252/301.16 |
| 2012/0199794 | A1* | 8/2012 | Stoessel .................. | C09B 57/10 252/301.16 |
| 2013/0168663 | A1 | 7/2013 | Gerhard et al. | |

OTHER PUBLICATIONS

Stilbrany, et al., "A Tris(pyrazolyl) eta6-Arene Ligand That Selects Cu(I) over Cu(II)", Inorganic Chemistry, vol. 45, No. 24, 2008, pp. 9713-9720.

International Search Report of Application No. PCT/EP2016/000010 dated Apr. 13, 2016.

* cited by examiner a)

b)

a)

b)

a)

b)

a)

b)

a)

b)

METAL COMPLEXES

CROSS-REFERENCE TO RELATED APPLICATIONS

This patent application is a U.S. national stage application, filed pursuant to 35 U.S.C. § 371, of PCT Application No. PCT/EP2016/000010, filed Jan. 7, 2016, which claims priority to European Patent Application No. 15000307.7, filed Feb. 3, 2015, both of which are incorporated by reference herein in their entireties.

The present invention relates to metal complexes suitable for use in organic electroluminescent devices, especially as emitters.

According to the prior art, triplet emitters used in phosphorescent organic electroluminescent devices (OLEDs) are iridium complexes in particular, especially bis- and tris-ortho-metallated complexes having aromatic ligands, where the ligands bind to the metal via a negatively charged carbon atom and an uncharged nitrogen atom or via a negatively charged carbon atom and an uncharged carbene carbon atom. Examples of such complexes are tris(phenylpyridyl) iridium(III) and derivatives thereof (for example according to US 2002/0034656 or WO 2010/027583). The literature discloses a multitude of related ligands and iridium complexes, for example complexes with 1- or 3-phenylisoquinoline ligands (for example according to EP 1348711 or WO 2011/028473), with 2-phenylquinolines (for example according to WO 2002/064700 or WO 2006/095943) or with phenylcarbenes (for example according to WO 2005/019373).

An improvement in the stability of the complexes was achieved by the use of polypodal ligands, as described, for example, in WO 2004/081017, WO 2006/008069 or U.S. Pat. No. 7,332,232. Even though these complexes having polypodal ligands show advantages over the complexes which otherwise have the same ligand structure except that the individual ligands therein do not have polypodal bridging, there is still a need for improvement. This lies especially in the more complex synthesis of the compounds, such that, for example, the complexation reaction requires very long reaction times and high reaction temperatures. Furthermore, in the case of the complexes having polypodal ligands too, improvements are still desirable in relation to the properties on use in an organic electroluminescent device, especially in relation to efficiency, voltage and/or lifetime.

It is therefore an object of the present invention to provide novel metal complexes suitable as emitters for use in OLEDs. It is a particular object to provide emitters which exhibit improved properties in relation to efficiency, operating voltage and/or lifetime. It is a further object of the present invention to provide metal complexes which can be synthesized under milder synthesis conditions, especially in relation to reaction time and reaction temperature, compared in each case to complexes having structurally comparable ligands. It is a further object of the present invention to provide metal complexes which do not exhibit any facial-meridional isomerization, which can be a problem in the case of complexes according to the prior art.

It has been found that, surprisingly, this object is achieved by metal complexes having a hexadentate tripodal ligand wherein the bridge of the ligand that joins the individual sub-ligands has the structure described below, which are of very good suitability for use in an organic electroluminescent device. The present invention therefore provides these metal complexes and organic electroluminescent devices comprising these complexes.

The invention thus provides a monometallic metal complex containing a hexadentate tripodal ligand in which three bidentate sub-ligands coordinate to a metal and the three bidentate sub-ligands, which may be the same or different, are joined via a bridge of the following formula (1):

Formula (1)

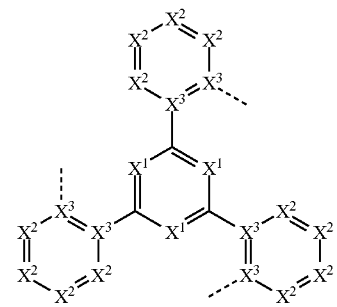

where the dotted bond represents the bond of the bidentate sub-ligands to this structure and the symbols used are as follows:

$X^1$ is the same or different at each instance and is C which may also be substituted or N;

$X^2$ is the same or different at each instance and is C which may also be substituted or N, or two adjacent $X^2$ groups together are N which may also be substituted, O or S, so as to form a five-membered ring, or two adjacent $X^2$ groups together are C which may also be substituted or N when one of the $X^3$ groups in the cycle is N, so as to form a five-membered ring, with the proviso that not more than two adjacent $X^2$ groups in each ring are N; at the same time, any substituents present may also form a ring system with one another or with substituents bonded to $X^1$;

$X^3$ is C at each instance in one cycle or one $X^3$ group is N and the other $X^3$ group in the same cycle is C; at the same time, the $X^3$ groups in the three cycles may be selected independently; with the proviso that two adjacent $X^2$ groups together are C which may also be substituted or N when one of the $X^3$ groups in the cycle is N;

at the same time, the three bidentate ligands, apart from by the bridge of the formula (1), may also be ring-closed by a further bridge to form a cryptate.

When $X^1$ or $X^2$ is C, this carbon atom either bears a hydrogen atom or is substituted by a substituent other than hydrogen. When two adjacent $X^2$ groups together are N and the $X^3$ groups in the same cycle are both C, this nitrogen atom either bears a hydrogen atom or is substituted by a substituent other than hydrogen. Preferably, the nitrogen atom is substituted by a substituent other than hydrogen. When two adjacent $X^2$ groups together are N and one of the $X^3$ groups in the same cycle is N, the nitrogen atom which represents two adjacent $X^2$ groups is unsubstituted.

According to the invention, the ligand is thus a hexadentate tripodal ligand having three bidentate sub-ligands. The structure of the hexadentate tripodal ligand is shown in schematic form by the following formula (Lig):

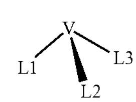

(Lig)

where V represents the bridge of formula (1) and L1, L2 and L3 are the same or different at each instance and are each bidentate sub-ligands. “Bidentate” means that the particular sub-ligand in the complex coordinates or binds to the metal via two coordination sites. “Tripodal” means that the ligand has three sub-ligands bonded to the bridge V or the bridge of the formula (1). Since the ligand has three bidentate sub-ligands, the overall result is a hexadentate ligand, i.e. a ligand which coordinates or binds to the metal via six coordination sites. The expression “bidentate sub-ligand” in the context of this application means that this unit would be a bidentate ligand if the bridge of the formula (1) were not present. However, as a result of the formal abstraction of a hydrogen atom from this bidentate ligand and the attachment to the bridge of the formula (1), it is no longer a separate ligand but a portion of the hexadentate ligand which thus arises, and so the term “sub-ligand” is used therefor.

The metal complex M-(Lig) formed with this ligand of the formula (Lig) can thus be represented schematically by the following formula:

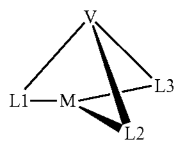

M-(Lig)

where V represents the bridge of formula (1), L1, L2 and L3 are the same or different at each instance and are each bidentate sub-ligands and M is a metal.

“Monometallic” in the context of the present invention means that the metal complex contains just a single metal atom, as also represented schematically by M-(Lig). Metal complexes in which, for example, each of the three bidentate sub-ligands is coordinated to a different metal atom are thus not encompassed by the invention.

The bond of the ligand to the metal may either be a coordinate bond or a covalent bond, or the covalent fraction of the bond may vary according to the ligand and metal. When it is said in the present application that the ligand or sub-ligand coordinates or binds to the metal, this refers in the context of the present application to any kind of bond from the ligand or sub-ligand to the metal, irrespective of the covalent fraction of the bond.

Preferably, the compounds of the invention are characterized in that they are uncharged, i.e. electrically neutral. This is achieved in a simple manner by selecting the charges of the three bidentate sub-ligands such that they compensate for the charge of the metal atom complexed.

Preferred embodiments of the bridge of the formula (1) are detailed hereinafter.

When $X^1$ and/or $X^2$ is a substituted carbon atom and/or when two adjacent $X^2$ groups are a substituted nitrogen atom or a substituted carbon atom, the substituent is preferably selected from the following substituents R:

R is the same or different at each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where the alkyl, alkoxy, thioalkoxy, alkenyl or alkynyl group may each be substituted by one or more $R^1$ radicals, where one or more nonadjacent $CH_2$ groups may be replaced by $R^1C{=}CR^1$, C≡C, $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals, or an aryloxy or heteroaryloxy group which has 5 to 40 aromatic ring atoms and may be substituted by one or more $R^1$ radicals; at the same time, two R radicals together may also form a ring system;

$R^1$ is the same or different at each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where the alkyl, alkoxy, thioalkoxy, alkenyl or alkynyl group may each be substituted by one or more $R^2$ radicals, where one or more nonadjacent $CH_2$ groups may be replaced by $R^2C{=}CR^2$, C≡C, $Si(R^2)_2$, C=O, $NR^2$, O, S or $CONR^2$, or an aromatic or heteroaromatic ring system which has 5 to 40 aromatic ring atoms and may be substituted in each case by one or more $R^2$ radicals, or an aryloxy or heteroaryloxy group which has 5 to 40 aromatic ring atoms and may be substituted by one or more $R^2$ radicals; at the same time, two or more $R^1$ radicals together may form a ring system;

$R^2$ is the same or different at each instance and is H, D, F or an aliphatic, aromatic and/or heteroaromatic organic radical, especially a hydrocarbyl radical, having 1 to 20 carbon atoms, in which one or more hydrogen atoms may also be replaced by F.

When two R or $R^1$ radicals together form a ring system, it may be mono- or polycyclic, and aliphatic, heteroaliphatic, aromatic or heteroaromatic. In this case, these radicals which together form a ring system may be adjacent, meaning that these radicals are bonded to the same carbon atom or to carbon atoms directly adjacent to one another, or they may be further removed from one another. For example, it is also possible for an R radical bonded to the $X^2$ group to form a ring with an R radical bonded to the $X^1$ group. When there is such ring formation between an R radical bonded to the $X^2$ group and an R radical bonded to the $X^1$ group, this ring is preferably formed by a group having three bridge atoms, preferably having three carbon atoms, and more preferably by a —$(CR_2)_3$— group. How such ring formation is possible can be inferred, for example, from the synthesis examples.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

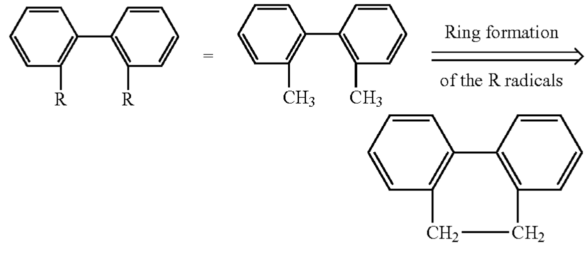

In addition, however, the abovementioned wording shall also be understood to mean that, if one of the two radicals is hydrogen, the second radical binds to the position to which the hydrogen atom was bonded, forming a ring. This shall be illustrated by the following scheme:

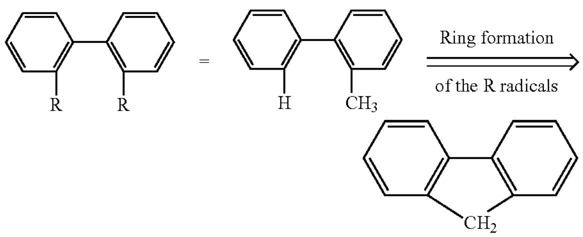

As described above, this kind of ring formation is possible in radicals bonded to carbon atoms directly adjacent to one another, or in radicals bonded to further-removed carbon atoms. However, preference is given to this kind of ring formation in radicals bonded to carbon atoms directly adjacent to one another.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. The heteroaryl group in this case preferably contains not more than three heteroatoms. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for two or more aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. are also to be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system.

A cyclic alkyl, alkoxy or thioalkoxy group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be replaced by the abovementioned groups are understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl- and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{40}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Suitable embodiments of the group of the formula (1) are the structures of the following formulae (2) to (5):

Formula (2)

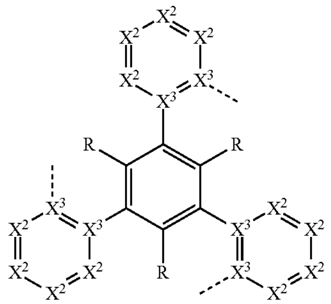

Formula (3)

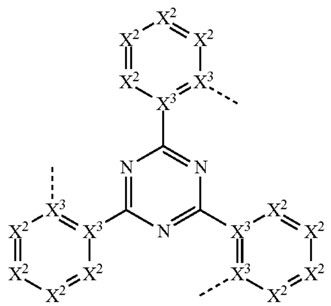

Formula (4)

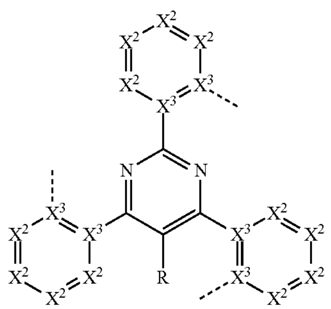

Formula (5)

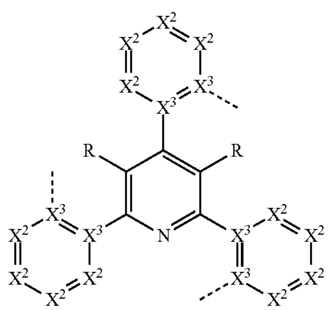

where the symbols used have the definitions given above.

In one preferred embodiment of the invention, all $X^1$ groups in the group of the formula (1) are an optionally substituted carbon atom, where the substituent is preferably selected from the abovementioned R groups, such that the central trivalent cycle of the formula (1) is a benzene. More preferably, all $X^1$ groups in the formulae (2), (4) and (5) are CH. In a further preferred embodiment of the invention, all $X^1$ groups are a nitrogen atom, and so the central trivalent cycle of the formula (1) is a triazine. Preferred embodiments of the formula (1) are thus the structures of the formulae (2) and (3).

Preferred R radicals on the trivalent central benzene ring of the formula (2) are as follows:

R is the same or different at each instance and is H, D, F, CN, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^1$ radicals but is preferably unsubstituted, or an aromatic or heteroaromatic ring system which has 5 to 24 aromatic ring atoms and may be substituted in each case by one or more $R^1$ radicals; at the same time, the R radical may also form a ring system with an R radical on $X^2$;

$R^1$ is the same or different at each instance and is H, D, F, CN, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^2$ radicals but is preferably unsubstituted, or an aromatic or heteroaromatic ring system which has 5 to 24 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic, aromatic and/or heteroaromatic organic radical having 1 to 20 carbon atoms, in which one or more hydrogen atoms may also be replaced by F.

Particularly preferred R radicals on the trivalent central benzene ring of the formula (2) are as follows:

R is the same or different at each instance and is H, D, F, CN, a straight-chain alkyl group having 1 to 4 carbon atoms or a branched or cyclic alkyl group having 3 to 6 carbon atoms, each of which may be substituted by one or more $R^1$ radicals but is preferably unsubstituted, or an aromatic or heteroaromatic ring system which has 6 to 12 aromatic ring atoms and may be substituted in each case by one or more $R^1$ radicals; at the same time, the R radical may also form a ring system with an R radical on $X^2$;

$R^1$ is the same or different at each instance and is H, D, F, CN, a straight-chain alkyl group having 1 to 4 carbon atoms or a branched or cyclic alkyl group having 3 to 6 carbon atoms, each of which may be substituted by one or more $R^2$ radicals but is preferably unsubstituted, or an aromatic or heteroaromatic ring system which has 6 to 12 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic or aromatic hydrocarbyl radical having 1 to 12 carbon atoms.

More preferably, the structure of the formula (2) is a structure of the following formula (2'):

Formula (2')

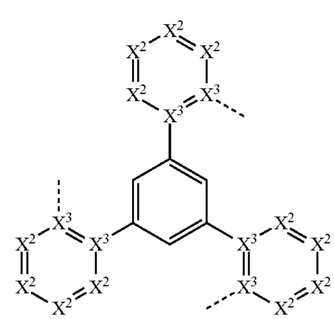

where the symbols used have the definitions given above.

There follows a description of preferred bivalent arylene or heteroarylene units as occur in the structures of the formulae (1) to (5). As apparent from structures of the formulae (1) to (5), these structures contain three ortho-bonded bivalent arylene or heteroarylene units.

In a preferred embodiment of the invention, the symbol $X^3$ is C, and so the groups of the formulae (1) to (5) can be represented by the following formulae (1a) to (5a):

Formula (1a)

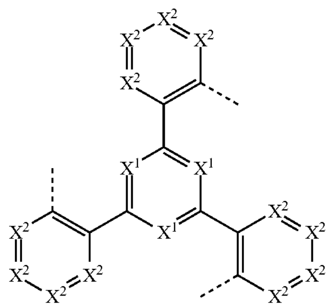

Formula (2a)

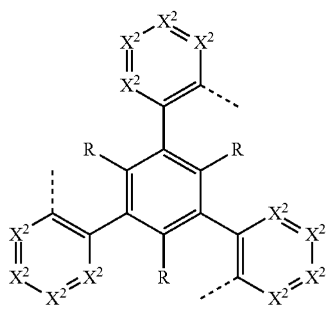

Formula (3a)

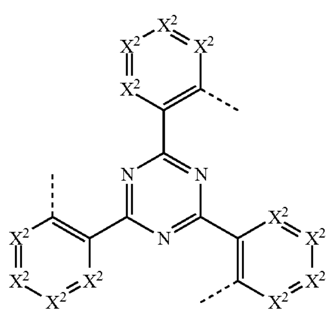

Formula (4a)

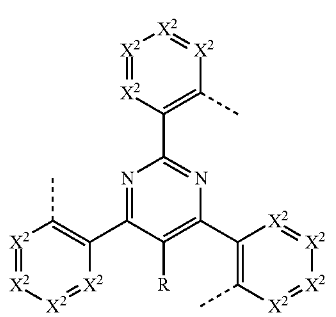

-continued

Formula (5a)

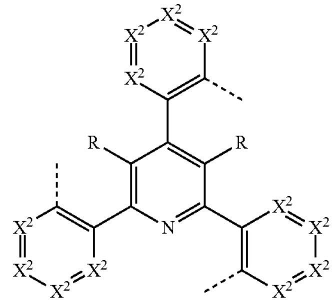

where the symbols have the definitions listed above.

The unit of the formula (1) can be formally represented by the following formula (1'), where the formulae (1) and (1') encompass the same structures:

Formula (1')

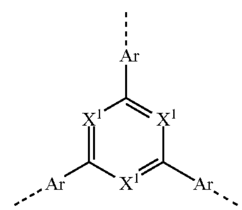

where Ar is the same or different in each case and is a group of the following formula (6):

Formula (6)

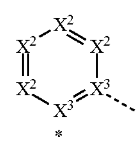

where the dotted bonded in each case represents the position of the bond of the bidentate sub-ligands to this structure, * represents the position of the linkage of the unit of the formula (6) to the central trivalent aryl or heteroaryl group and $X^2$ has the definitions given above. Preferred substituents in the group of the formula (6) are selected from the above-described substituents R.

According to the invention, the group of the formula (6) may represent a heteroaromatic five-membered ring or an aromatic or heteroaromatic six-membered ring. In a preferred embodiment of the invention, the group of the formula (6) contains not more than two heteroatoms in the aryl or heteroaryl group, more preferably not more than one heteroatom. This does not mean that any substituents bonded to this group cannot also contain heteroatoms. In addition, this definition does not mean that formation of rings by substituents cannot give rise to fused aromatic or heteroaromatic structures, for example naphthalene, benzimidazole, etc. The group of the formula (6) is thus preferably selected from benzene, pyridine, pyrimidine, pyrazine, pyridazine, pyrrole, furan, thiophene, pyrazole, imidazole, oxazole and thiazole.

When both $X^3$ groups in a cycle are carbon atoms, preferred embodiments of the group of the formula (6) are the structures of the following formulae (7) to (23):

Formula (7)

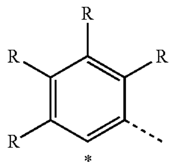

Formula (8)

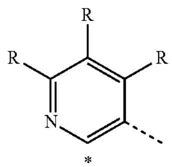

Formula (9)

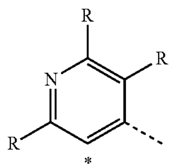

Formula (10)

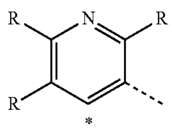

Formula (11)

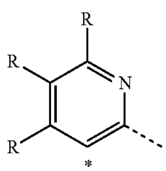

Formula (12)

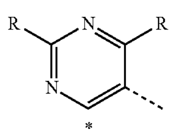

Formula (13)

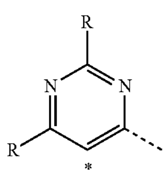

Formula (14)

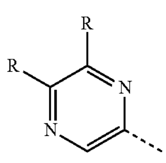

Formula (15)

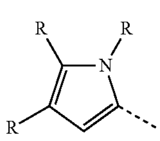

-continued

Formula (16)

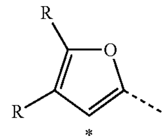

Formula (17)

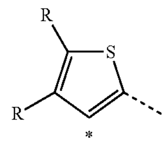

Formula (18)

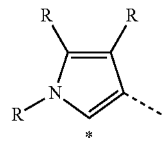

Formula (19)

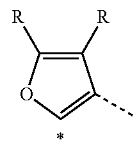

Formula (20)

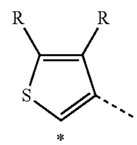

Formula (21)

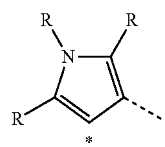

Formula (22)

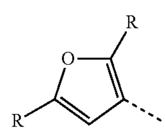

Formula (23)

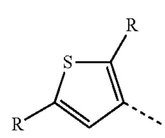

where the symbols used have the definitions given above.

When one $X^3$ group in a cycle is a carbon atom and the other $X^3$ group in the same cycle is a nitrogen atom, preferred embodiments of the group of the formula (6) are the structures of the following formulae (24) to (31):

Formula (24)

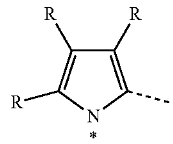

Formula (25)

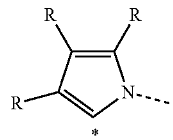

Formula (26)

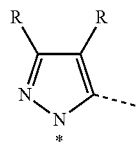

Formula (27)

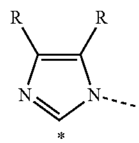

Formula (28)

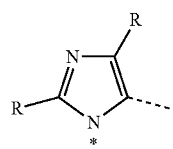

Formula (29)

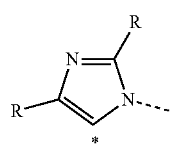

Formula (30)

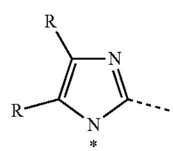

Formula (31)

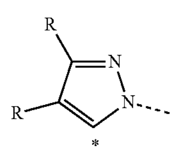

where the symbols used have the definitions given above.

Particular preference is given to the optionally substituted six-membered aromatic rings and six-membered heteroaromatic rings of the formulae (7) to (11) depicted above. Very particular preference is given to ortho-phenylene, i.e. a group of the abovementioned formula (7).

At the same time, as also described above in the description of the substituent, it is also possible for adjacent substituents together to form a ring system, such that fused structures, including fused aryl and heteroaryl groups, for example naphthalene, quinoline, benzimidazole, carbazole, dibenzofuran or dibenzothiophene, can form. Such ring formation is shown schematically below in groups of the abovementioned formula (7), which leads to groups of the following formulae (7a) to (7j):

Formula (7a)

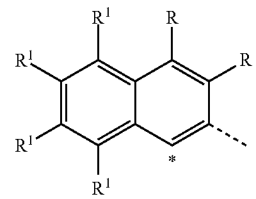

Formula (7b)

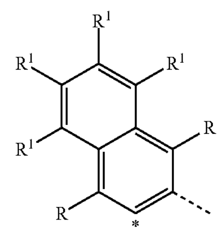

Formula (7c)

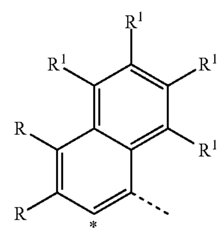

Formula (7d)

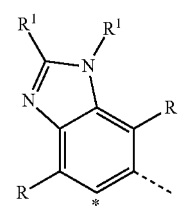

Formula (7e)

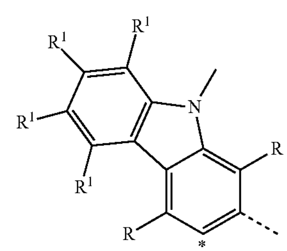

Formula (7f)

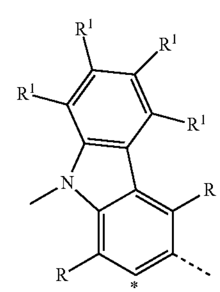

-continued

Formula (7g)

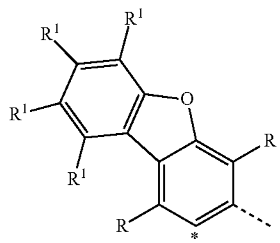

Formula (7h)

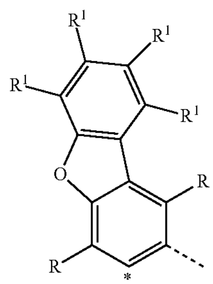

Formula (7i)

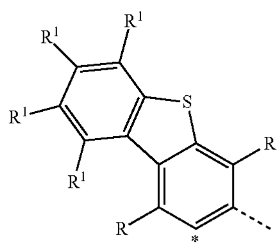

Formula (7j)

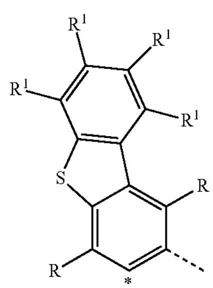

where the symbols used have the definitions given above.

In general, the groups fused on may be fused onto any position in the unit of formula (6), as shown by the fused-on benzo group in the formulae (7a) to (7c). The groups as fused onto the unit of the formula (6) in the formulae (7d) to (7j) may therefore also be fused onto other positions in the unit of the formula (6).

In this case, the three groups of the formula (6) present in the unit of the formulae (1) to (5) or formula (1') may be the same or different. In a preferred embodiment of the invention, all three groups of the formula (6) are the same in the unit of the formulae (1) to (5) or formula (1') and also have the same substitution.

More preferably, the groups of the formula (2) to (5) are selected from the groups of the following formulae (2b) to (5b):

Formula (2b)

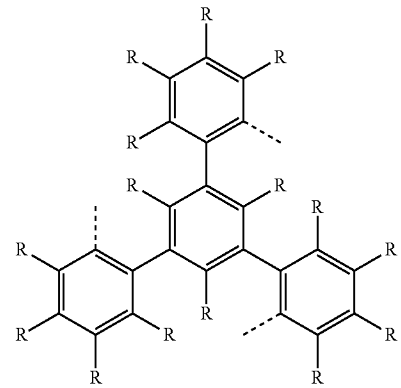

Formula (3b)

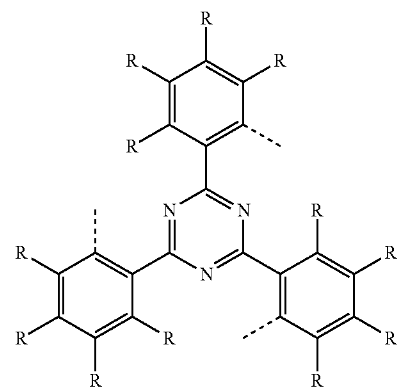

Formula (4b)

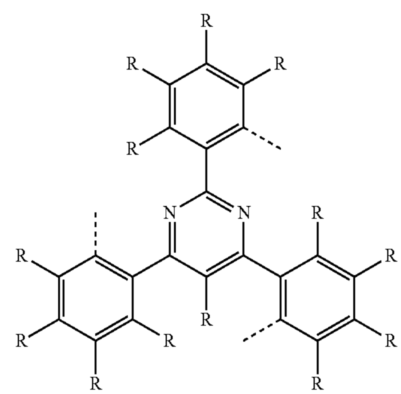

Formula (5b)

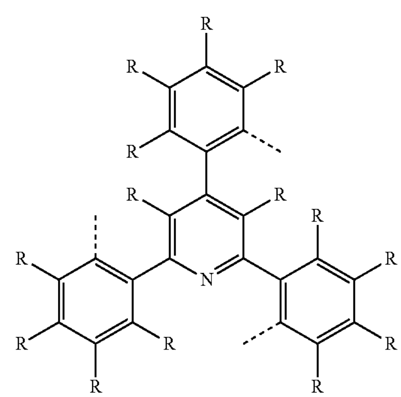

where the symbols used have the definitions given above.

A preferred embodiment of the formula (2b) is the group of the following formula (2b'):

Formula (2b')

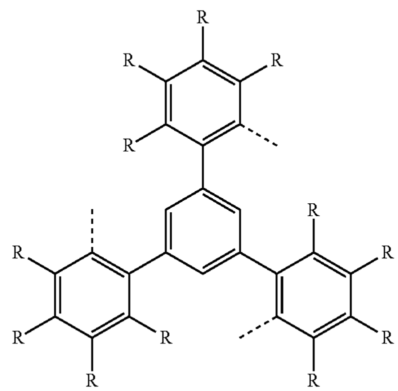

where the symbols used have the definitions given above.

More preferably, the R groups in the formulae (1) to (5) are the same or different at each instance and are H, D or an alkyl group having 1 to 4 carbon atoms. Most preferably, R═H. Very particular preference is thus given to the structures of the following formulae (2c) or (3c):

Formula (2c)

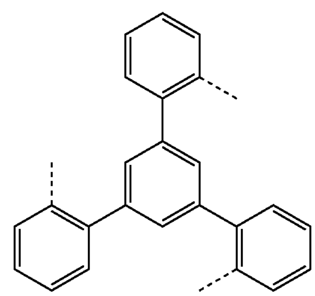

(Formula (3c)

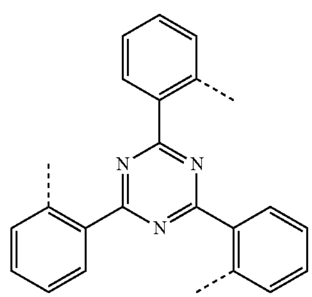

where the symbols used have the definitions given above.

There follows a description of the preferred metals in the metal complex of the invention. In a preferred embodiment of the invention, the metal is a transition metal, where transition metals in the context of the present invention do not include the lanthanides and actinides, or a main group metal. In a further preferred embodiment of the invention, the metal is a trivalent metal. When the metal is a main group metal, it is preferably selected from metals of the third and fourth main groups, preferably Al(III), In(III), Ga(III) or Sn(IV), especially Al(III). When the metal is a transition metal, it is preferably selected from the group consisting of chromium, molybdenum, tungsten, rhenium, ruthenium, osmium, rhodium, iridium, iron, cobalt, nickel, palladium, platinum, copper, silver and gold, especially molybdenum, tungsten, rhenium, ruthenium, osmium, iridium, copper, platinum and gold. Very particular preference is given to iridium. The metals may be present in different oxidation states. Preference is given to the abovementioned metals in the following oxidation states: Cr(O), Cr(III), Cr(VI), Mo(O), Mo(III), Mo(VI), W(O), W(III), W(VI), Re(I), Re(III), Re(IV), Ru(II), Ru(III), Os(II), Os(III), Os(IV), Rh(III), Ir(III), Ir(IV), Fe(II), Fe(III), Co(II), Co(III), Ni(II), Ni(IV), Pt(IV), Cu(II), Cu(III), Au(III) and Au(V). Particular preference is given to Mo(0), W(0), Re(I), Ru(II), Os(II), Rh(III) and Ir(III). Very particular preference is given to Ir(III).

It is particularly preferable when the preferred embodiments of the ligand and the bridge of the formula (1) are combined with the preferred embodiments of the metal. Particular preference is thus given to metal complexes in which the metal is Ir(III) and in which the ligand has a bridge of the formula (2) to (5) or (2a) to (5a) or (2b) to (5b) or (2c) or (3c) and which have, as bivalent arylene or heteroarylene group in the group of the formula (2) to (5) or the preferred embodiments, identically or differently at each instance, a group of the formulae (7) to (31), especially a group of the formula (7).

There follows a description of the bidentate sub-ligands joined to the bridge of the formula (1) or the abovementioned preferred embodiments.

The preferred embodiments of the bidentate sub-ligands especially depend on the particular metal used. The three bidentate sub-ligands may be the same, or they may be different. When all three bidentate sub-ligands selected are the same, this results in $C_3$-symmetric metal complexes when the unit of the formula (1) also has $C_3$ symmetry, which may be advantageous in terms of the synthesis of the ligands. However, it may also be advantageous to select the three bidentate sub-ligands differently or to select two identical sub-ligands and a different third sub-ligand, so as to give rise to $C_1$-symmetric metal complexes, because this permits greater possible variation of the ligands, such that the desired properties of the complex, for example the HOMO and LUMO position or the emission colour, can be varied more easily. Moreover, the solubility of the complexes can thus also be improved without having to attach long aliphatic or aromatic solubility-imparting groups. In addition, unsymmetric complexes frequently have a lower sublimation temperature than similar symmetric complexes.

In a preferred embodiment of the invention, either the three bidentate sub-ligands are selected identically or two of the bidentate sub-ligands are selected identically and the third bidentate sub-ligand is different from the first two bidentate sub-ligands.

In a preferred embodiment of the invention, each of the bidentate sub-ligands is the same or different and is either monoanionic or uncharged. More preferably, each of the bidentate sub-ligands is monoanionic.

In a further preferred embodiment of the invention, the coordinating atoms of the bidentate sub-ligands are the same or different at each instance and are selected from C, N, P, O and S, the preferred coordinating atoms being dependent on the metal used.

When the metal is selected from the main group metals, the coordinating atoms of the bidentate sub-ligands are preferably the same or different at each instance and are selected from N, O and/or S. More preferably, the bidentate sub-ligands have two nitrogen atoms or two oxygen atoms or one nitrogen atom and one oxygen atom per sub-ligand. In this case, the coordinating atoms of each of the three sub-ligands may be the same, or they may be different.

When the metal is selected from the transition metals, the coordinating atoms of the bidentate sub-ligands are preferably the same or different at each instance and are selected from C, N, O and/or S, more preferably C, N and/or O and most preferably C and/or N. The bidentate sub-ligands preferably have one carbon atom and one nitrogen atom or two carbon atoms or two nitrogen atoms or two oxygen atoms or one oxygen atom and one nitrogen atom as coordinating atoms. In this case, the coordinating atoms of each of the three sub-ligands may be the same, or they may be different. More preferably, at least one of the bidentate sub-ligands has one carbon atom and one nitrogen atom or two carbon atoms as coordinating atoms, especially one carbon atom and one nitrogen atom. Most preferably, at least two of the bidentate sub-ligands have one carbon atom and one nitrogen atom or two carbon atoms as coordinating atoms, especially one carbon atom and one nitrogen atom. This is especially true when the metal is Ir(III). When the metal is Ru, Co, Fe, Os, Cu or Ag, particularly preferred coordinating atoms in the bidentate sub-ligands are also two nitrogen atoms.

In a particularly preferred embodiment of the invention, the metal is Ir(III) and two of the bidentate sub-ligands each coordinate to the iridium via one carbon atom and one nitrogen atom and the third of the bidentate sub-ligands coordinates to the iridium via one carbon atom and one nitrogen atom or via two nitrogen atoms or via one nitrogen atom and one oxygen atom or via two oxygen atoms, especially via one carbon atom and one nitrogen atom. Particular preference is thus given to an iridium complex in which all three bidentate sub-ligands are ortho-metallated, i.e. form a metallacycle with the iridium in which a metal-carbon bond is present.

It is further preferable when the metallacycle which is formed from the metal and the bidentate sub-ligand is a five-membered ring, which is preferable particularly when the coordinating atoms are C and N, N and N, or N and O. When the coordinating atoms are O, a six-membered metallacyclic ring may also be preferred. This is shown schematically hereinafter:

Five-membered ring

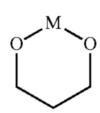

Six-membered ring where M is the metal, N is a coordinating nitrogen atom, C is a coordinating carbon atom and O represents coordinating oxygen atoms, and the carbon atoms shown are atoms of the bidentate ligand.

There follows a description of the structures of the bidentate sub-ligands which are preferred when the metal is a transition metal.

In a preferred embodiment of the invention, at least one of the bidentate sub-ligands, more preferably at least two of the bidentate sub-ligands, most preferably all three of the bidentate sub-ligands, are the same or different at each instance and are a structure of the following formula (L-1), (L-2), (L-3) and (L-4):

Formula (L-1)

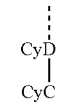

Formula (L-2)

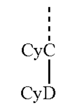

Formula (L-3)

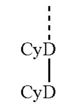

Formula (L-4)

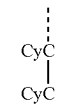

where the dotted bond represents the bond of the sub-ligand to the bridge of the formulae (1) to (5) or the preferred embodiments and the other symbols used are as follows:

CyC is the same or different at each instance and is a substituted or unsubstituted aryl or heteroaryl group which has 5 to 14 aromatic ring atoms and coordinates to the metal via a carbon atom in each case and which is bonded to CyD in (L-1) and (L-2) via a covalent bond and is bonded to a further CyC group in (L-4) via a covalent bond;

CyD is the same or different at each instance and is a substituted or unsubstituted heteroaryl group which has 5 to 14 aromatic ring atoms and coordinates to the metal via a nitrogen atom or via a carbene carbon atom and which is bonded to CyC in (L-1) and (L-2) via a covalent bond and is bonded to a further CyD group in (L-3) via a covalent bond;

at the same time, two or more of the optional substituents together may form a ring system; the optional radicals are preferably selected from the abovementioned R radicals.

At the same time, CyD in the sub-ligands of the formulae (L-1) and (L-2) preferably coordinates via an uncharged nitrogen atom or via a carbene carbon atom. Further preferably, one of the two CyD groups in the ligand of the formula (L-3) coordinates via an uncharged nitrogen atom and the other of the two CyD groups via an anionic nitrogen atom. Further preferably, CyC in the sub-ligands of the formulae (L-1), (L-2) and (L-4) coordinates via anionic carbon atoms.

When two or more of the substituents, especially two or more R radicals, together form a ring system, it is possible for a ring system to be formed from substituents bonded to directly adjacent carbon atoms. In addition, it is also possible that the substituents on CyC and CyD in the formulae (L-1) and (L-2) or the substituents on the two CyD groups in formula (L-3) or the substituents on the two CyC groups in formula (L-4) together form a ring, as a result of which CyC and CyD or the two CyD groups or the two CyC groups may also together form a single fused aryl or heteroaryl group as bidentate ligands.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, which coordinates to the metal via a carbon atom, which may be substituted by one or more R radicals and which, in (L-1) and (L-2), is bonded to CyD via a covalent bond and, in (L-4), is bonded to a further CyC group via a covalent bond.

Preferred embodiments of the CyC group are the structures of the following formulae (CyC-1) to (CyC-19) where the CyC group binds in each case at the position signified by # to CyD in (L-1) and (L-2) and to CyC in (L-4) and at the position signified by * to the metal, (CyC-1)

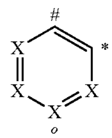

(CyC-2)

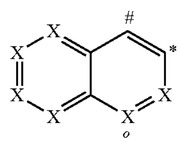

(CyC-3)

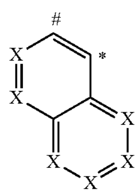

(CyC-4)

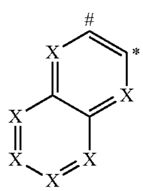

(CyC-5)

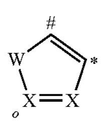

(CyC-6)

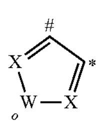

(CyC-7)

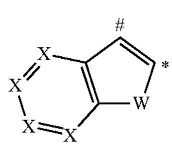

(CyC-8)

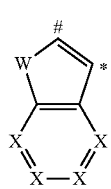

-continued (CyC-9)

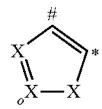

(CyC-10)

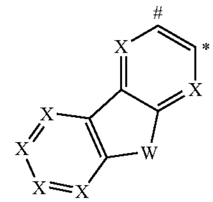

(CyC-11)

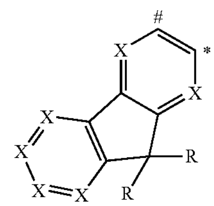

(CyC-12)

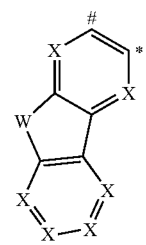

(CyC-13)

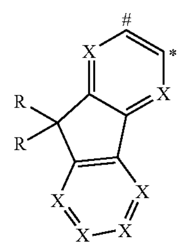

(CyC-14)

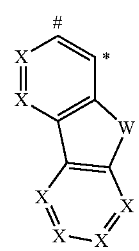

(CyC-15)

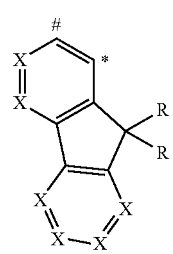

-continued (CyC-16)

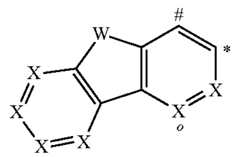

(CyC-17)

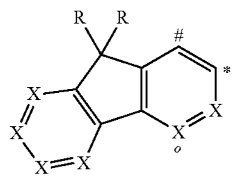

(CyC-18)

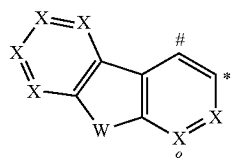

(CyC-19)

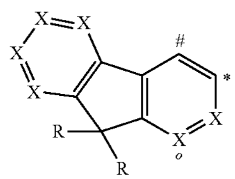

(CyC-20)

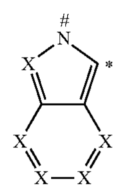

where R has the definitions given above and the other symbols used are as follows:

X is the same or different at each instance and is CR or N, with the proviso that not more than two X symbols per cycle are N;

W is the same or different at each instance and is NR, 0 or S;

with the proviso that, when the bridge of the formulae (1) to (5) or the preferred embodiments is bonded to CyC, one symbol X is C and the bridge of the formulae (1) to (5) or the preferred embodiments is bonded to this carbon atom. When the CyC group is bonded to the bridge of the formulae (1) to (5) or the preferred embodiments, the bond is preferably via the position marked by "o" in the formulae depicted above, and so the symbol X marked by "o" in that case is preferably C. The above-depicted structures which do not contain any symbol X marked by "o" are preferably not bonded directly to the bridge of the formulae (1) to (5) or the preferred embodiments, since such a bond to the bridge is not advantageous for steric reasons.

Preferably, a total of not more than two symbols X in CyC are N, more preferably not more than one symbol X in CyC is N, and most preferably all symbols X are CR, with the proviso that, when the bridge of the formulae (1) to (5) or the preferred embodiments is bonded to CyC, one symbol X is C and the bridge of the formulae (1) to (5) or the preferred embodiments is bonded to this carbon atom.

Particularly preferred CyC groups are the groups of the following formulae (CyC-1a) to (CyC-20a):

(CyC-1a)

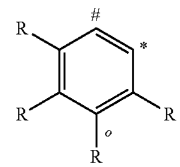

(CyC-1b)

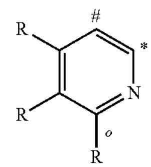

(CyC-1c)

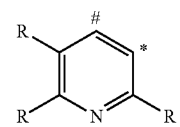

(CyC-1d)

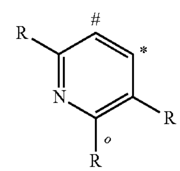

(CyC-1e)

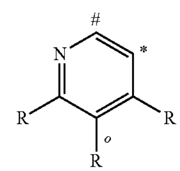

(CyC-1f)

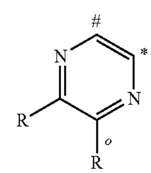

(CyC-1g)

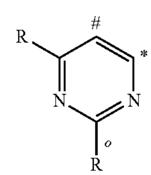

(CyC-1h)

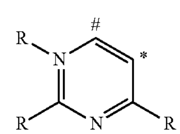

(CyC-2a)

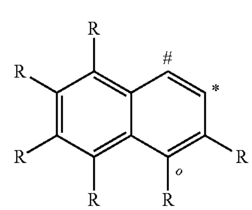

(CyC-2b)
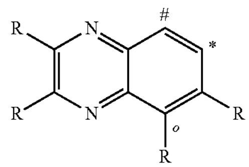
(CyC-3a)
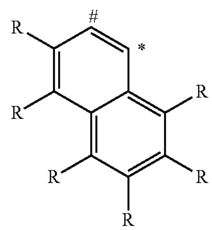
(CyC-3b)
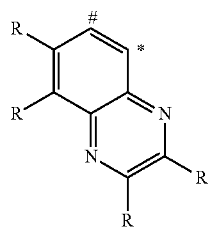
(CyC-4a)
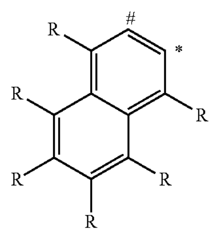
(CyC-4b)
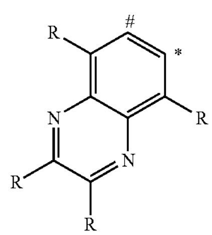
(CyC-5a)
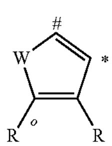
(CyC-6a)
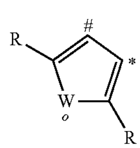
(CyC-7a)
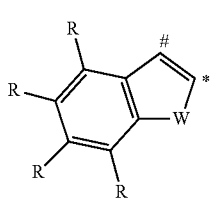
(CyC-8a)
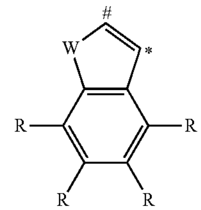
(CyC-9a)
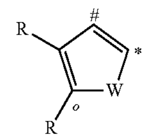
(CyC-10a)
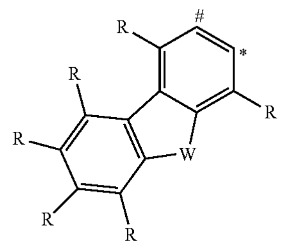
(CyC-11a)
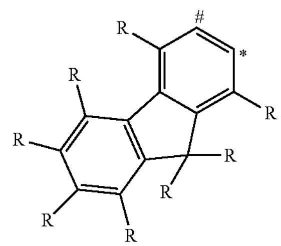
(CyC-12a)
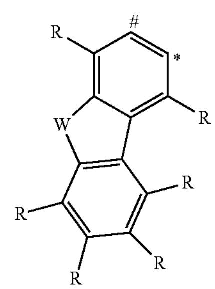
(CyC-13a)
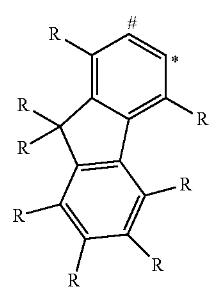

-continued (CyC-14a)

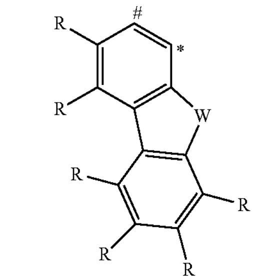

(CyC-15a)

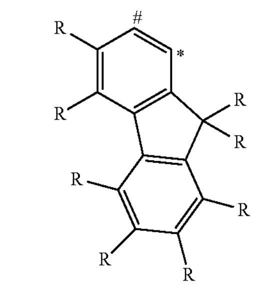

(CyC-16a)

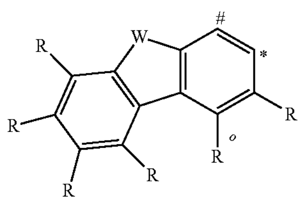

(CyC-17a)

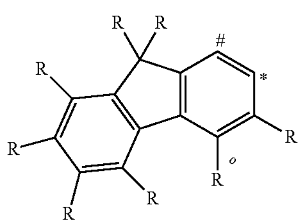

(CyC-18a)

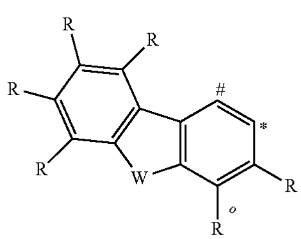

(CyC-19a)

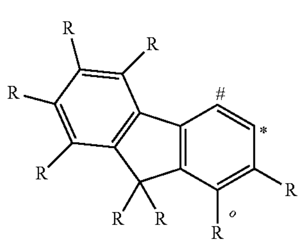

-continued (CyC-20a)

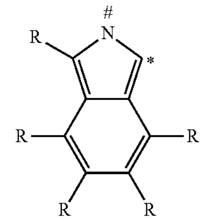

where the symbols used have the definitions given above and, when the bridge of the formulae (1) to (5) or the preferred embodiments is bonded to CyC, one R radical is not present and the bridge of the formulae (1) to (5) or the preferred embodiments is bonded to the corresponding carbon atom. When the CyC group is bonded to the bridge of the formulae (1) to (5) or the preferred embodiments, the bond is preferably via the position marked by "o" in the formulae depicted above, and so the R radical in this position in that case is preferably absent. The above-depicted structures which do not contain any carbon atom marked by "o" are preferably not bonded directly to the bridge of the formulae (1) to (5) or the preferred embodiments.

Preferred groups among the (CyC-1) to (CyC-19) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC in (L-1) and (L-2) and to CyD in (L-3).

Preferred embodiments of the CyD group are the structures of the following formulae (CyD-1) to (CyD-14) where the CyD group binds in each case at the position signified by # to CyC in (L-1) and (L-2) and to CyD in (L-3) and at the position signified by * to the metal, (CyD-1)

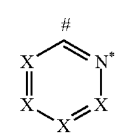

(CyD-2)

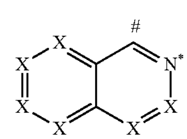

(CyD-3)

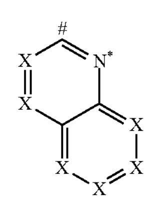

-continued (CyD-4)

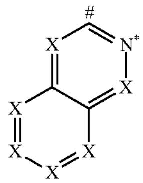

(CyD-5)

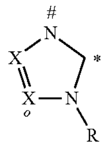

(CyD-6)

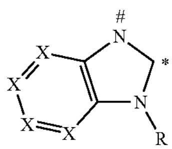

(CyD-7)

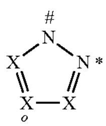

(CyD-8)

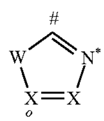

(CyD-9)

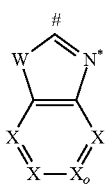

(CyD-10)

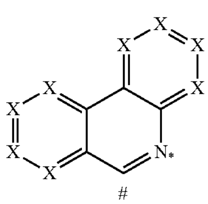

(CyD-11)

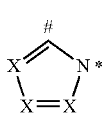

(CyD-12)

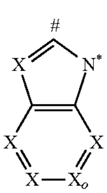

-continued (CyD-13)

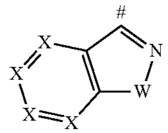

(CyD-14)

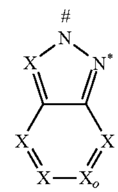

where X, W and R are as defined above, with the proviso that, when the bridge of the formulae (1) to (5) or the preferred embodiments is bonded to CyD, one symbol X is C and the bridge of the formulae (1) to (5) or the preferred embodiments is bonded to this carbon atom. When the CyD group is bonded to the bridge of the formulae (1) to (5) or the preferred embodiments, the bond is preferably via the position marked by “o” in the formulae depicted above, and so the symbol X marked by “o” in that case is preferably C. The above-depicted structures which do not contain any symbol X marked by “o” are preferably not bonded directly to the bridge of the formulae (1) to (5) or the preferred embodiments, since such a bond to the bridge is not advantageous for steric reasons.

In this case, the (CyD-1) to (CyD-4), (CyD-7) to (CyD-10), (CyD-13) and (CyD-14) groups coordinate to the metal via an uncharged nitrogen atom, the (CyD-5) and (CyD-6) groups via a carbene carbon atom and the (CyD-11) and (CyD-12) groups via an anionic nitrogen atom.

Preferably, a total of not more than two symbols X in CyD are N, more preferably not more than one symbol X in CyD is N, and especially preferably all symbols X are CR, with the proviso that, when the bridge of the formulae (1) to (5) or the preferred embodiments is bonded to CyD, one symbol X is C and the bridge of the formulae (1) to (5) or the preferred embodiments is bonded to this carbon atom.

Particularly preferred CyD groups are the groups of the following formulae (CyD-1a) to (CyD-14b):

(CyD-1a)

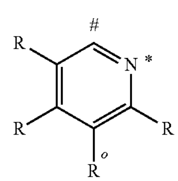

(CyD-2a)

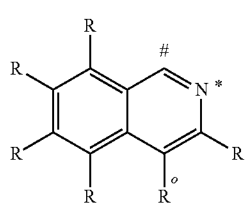

(CyD-3a)
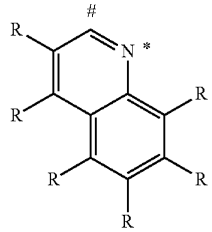
(CyD-3b)
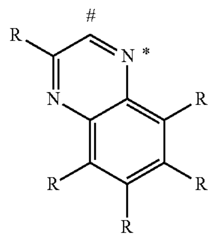
(CyD-4a)
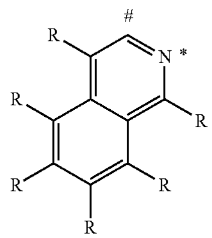
(CyD-5a)
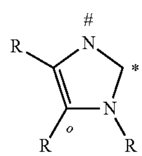
(CyD-6a)
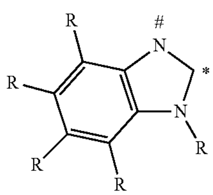
(CyD-7a)
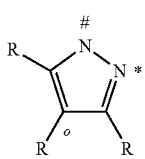
(CyD-8a)
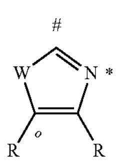
(CyD-9a)
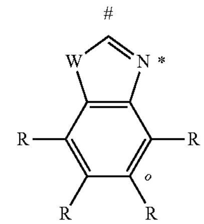
(CyD-10a)
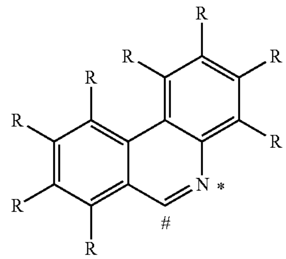
(CyD-11a)
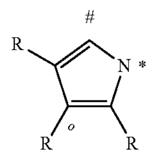
(CyD-11b)
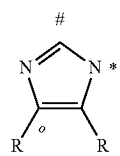
(CyD-11c)
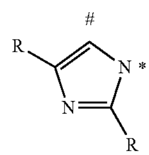
(CyD-11d)
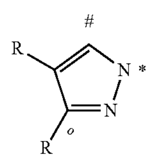
(CyD-12a)
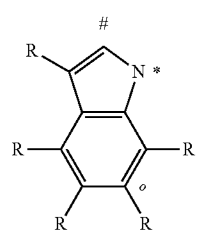
(CyD-12b)
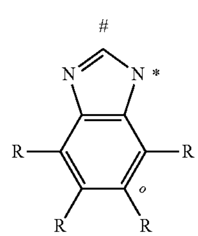

-continued (CyD-13a)

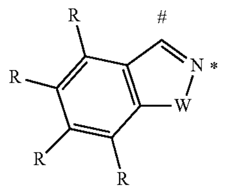

(CyD-14a)

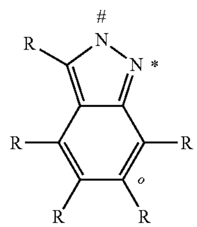

(CyD-14b)

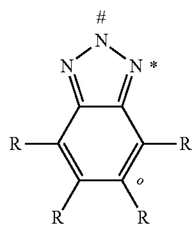

where the symbols used have the definitions given above and, when the bridge of the formulae (1) to (5) or the preferred embodiments is bonded to CyD, one R radical is not present and the bridge of the formulae (1) to (5) or the preferred embodiments is bonded to the corresponding carbon atom. When the CyD group is bonded to the bridge of the formulae (1) to (5) or the preferred embodiments, the bond is preferably via the position marked by "o" in the formulae depicted above, and so the R radical in this position in that case is preferably absent. The above-depicted structures which do not contain any carbon atom marked by "o" are preferably not bonded directly to the bridge of the formulae (1) to (5) or the preferred embodiments.

Preferred groups among the (CyD-1) to (CyD-10) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-14) groups may be combined with one another as desired in the sub-ligands of the formulae (L-1) and (L-2), provided that at least one of the CyC or CyD groups has a suitable attachment site to the bridge of the formulae (1) to (5) or the preferred embodiments, suitable attachment sites being signified by "o" in the formulae given above.

It is especially preferable when the CyC and CyD groups specified above as particularly preferred, i.e. the groups of the formulae (CyC-1a) to (CyC-20a) and the groups of the formulae (CyD1-a) bis (CyD-14b), are combined with one another, provided that at least one of the preferred CyC or CyD groups has a suitable attachment site to the bridge of the formulae (1) to (5) or the preferred embodiments, suitable attachment sites being signified by "o" in the formulae given above. Combinations in which neither CyC nor CyD has such a suitable attachment site for the bridge of the formulae (1) to (5) or the preferred embodiments are therefore not preferred.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred sub-ligands (L-1) are the structures of the following formulae (L-1-1) and (L-1-2), and preferred sub-ligands (L-2) are the structures of the following formulae (L-2-1) to (L-2-3):

(L-1-1)

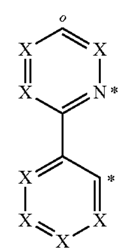

(L-1-2)

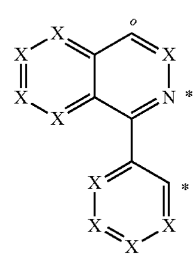

(L-2-1)

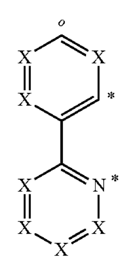

(L-2-2)

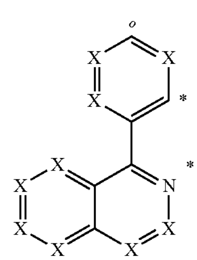

-continued (L-2-3)

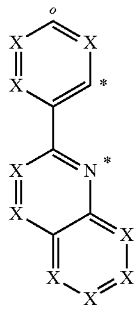

where the symbols used have the definitions given above and "o" represents the position of the bond to the bridge of the formulae (1) to (5) or the preferred embodiments.

Particularly preferred sub-ligands (L-1) are the structures of the following formulae (L-1-1a) and (L-1-2b), and particularly preferred sub-ligands (L-2) are the structures of the following formulae (L-2-1a) to (L-2-3a):

(L-1-1a)

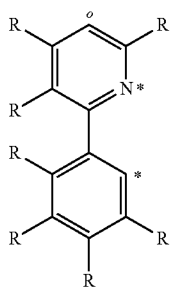

(L-1-2a)

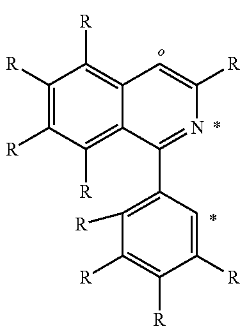

(L-2-1a)

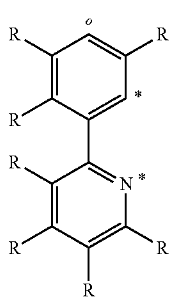

-continued (L-2-2a)

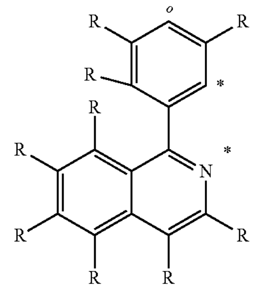

(L-2-3a)

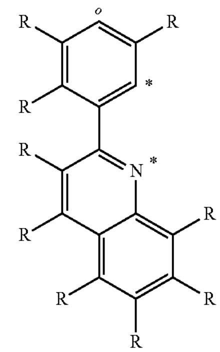

where the symbols used have the definitions given above and "o" represents the position of the bond to the bridge of the formulae (1) to (5) or the preferred embodiments.

It is likewise possible for the abovementioned preferred CyD groups in the sub-ligands of the formula (L-3) to be combined with one another as desired, it being preferable to combine an uncharged CyD group, i.e. a (CyD-1) to (CyD-10), (CyD-13) or (CyD-14) group, with an anionic CyD group, i.e. a (CyD-11) or CyD-12) group, provided that at least one of the preferred CyD groups has a suitable attachment site to the bridge of the formulae (1) to (5) or the preferred embodiments, suitable attachment sites being signified by "o" in the formulae given above.

It is likewise possible to combine the abovementioned preferred CyC groups with one another as desired in the sub-ligands of the formula (L-4), provided that at least one of the preferred CyC groups has a suitable attachment site to the bridge of the formulae (1) to (5) or the preferred embodiments, suitable attachment sites being signified by "o" in the formulae given above.

When two R radicals, one of them bonded to CyC and the other to CyD in the formulae (L-1) and (L-2) or one of them bonded to one CyD group and the other to the other CyD group in formula (L-3) or one of them bonded to one CyC group and the other to the other CyC group in formula (L-4), form an aromatic ring system with one another, this may result in bridged sub-ligands and, for example, also in sub-ligands which represent a single larger heteroaryl group overall, for example benzo[h]quinoline, etc. The ring formation between the substituents on CyC and CyD in the formulae (L-1) and (L-2) or between the substituents on the two CyD groups in formula (L-3) or between the substituents on the two (CyC) groups in formula (L-4) is preferably via a group according to one of the following formulae (32) to (41):

Formula (32)

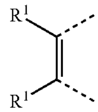

Formula (33)

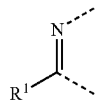

Formula (34)

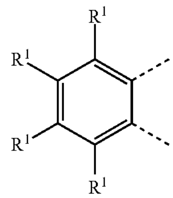

Formula (35)

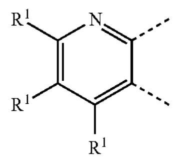

Formula (36)

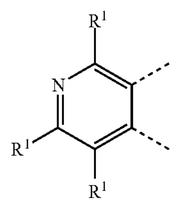

Formula (37)

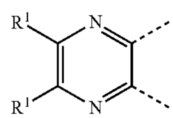

Formula (38)

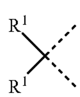

Formula (39)

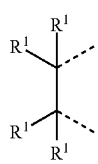

Formula (40)

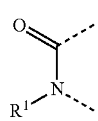

Formula (41)

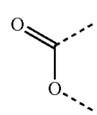

where $R^1$ has the definitions given above and the dotted bonds signify the bonds to CyC or CyD. At the same time, the unsymmetric groups among those mentioned above may be incorporated in each of the two possible options; for example, in the group of the formula (41), the oxygen atom may bind to the CyC group and the carbonyl group to the CyD group, or the oxygen atom may bind to the CyD group and the carbonyl group to the CyC group.

At the same time, the group of the formula (38) is preferred particularly when this results in ring formation to give a six-membered ring, as shown below, for example, by the formulae (L-23) and (L-24).

Preferred ligands which arise through ring formation between two R radicals in the different cycles are the structures of the formulae (L-5) to (L-32) shown below:

(L-5)

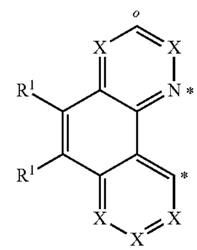

(L-6)

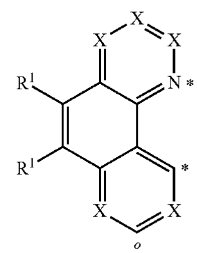

(L-7)

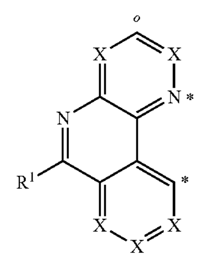

(L-8)

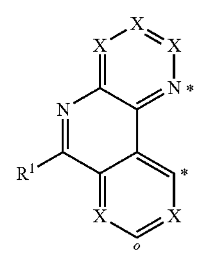

(L-9)

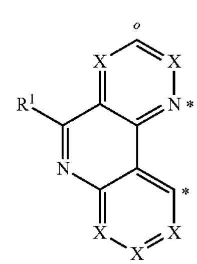

-continued
(L-10)
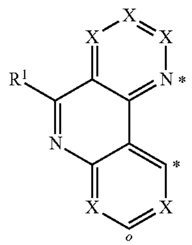
(L-11)
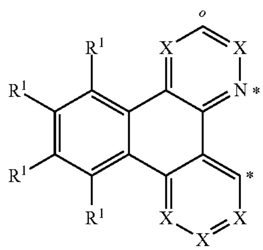
(L-12)
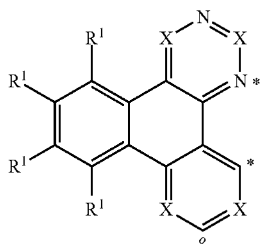
(L-13)
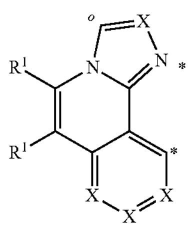
(L-14)
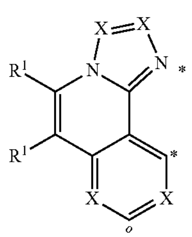
(L-15)
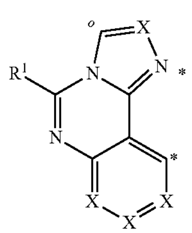
-continued
(L-16)
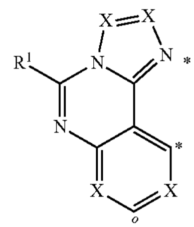
(L-17)
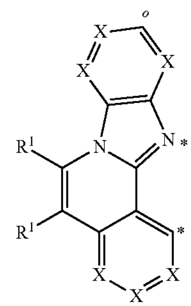
(L-18)
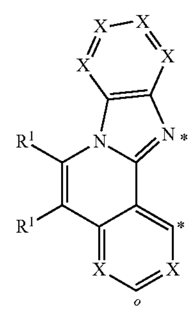
(L-19)
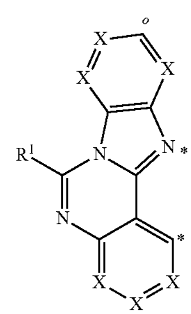
(L-20)
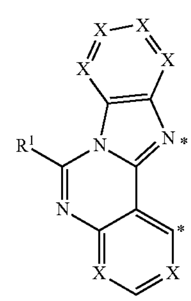

-continued
(L-21)
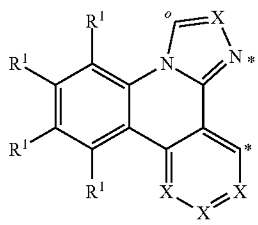
(L-22)
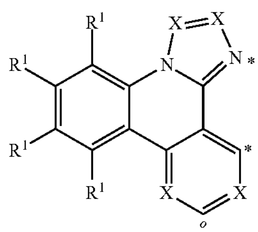
(L-23)
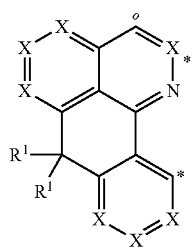
(L-24)
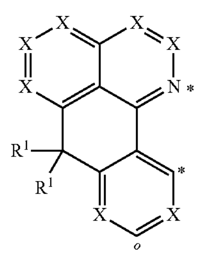
(L-25)
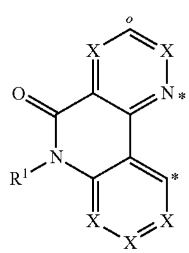
(L-26)
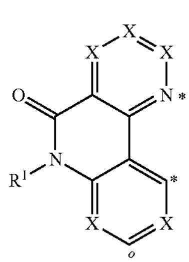
-continued
(L-27)
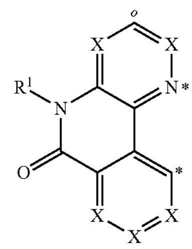
(L-28)
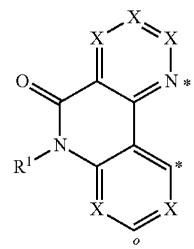
(L-29)
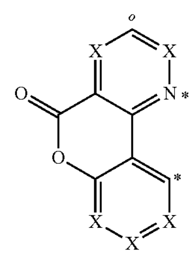
(L-30)
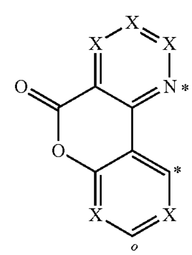
(L-31)
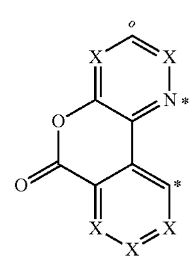
(L-32)
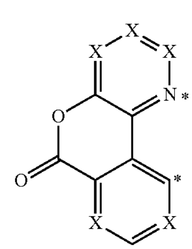

where the symbols used have the definitions given above and "o" indicates the position at which this sub-ligand is joined to the group of the formulae (1) to (5) or the preferred embodiments.

In a preferred embodiment of the sub-ligands of the formulae (L-5) to (L-32), a total of one symbol X is N and the other symbols X are CR, or all symbols X are CR.

In a further embodiment of the invention, it is preferable if, in the groups (CyC-1) to (CyC-20) or (CyD-1) to (CyD-14) or in the sub-ligands (L-5) to (L-3), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium.

This substituent R is preferably a group selected from $CF_3$, $OCF_3$, alkyl or alkoxy groups having 1 to 10 carbon atoms, especially branched or cyclic alkyl or alkoxy groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate sub-ligand for metal complexes in which the metal is a transition metal is a sub-ligand of the following formula (L-33) or (L-34):

(L-33)

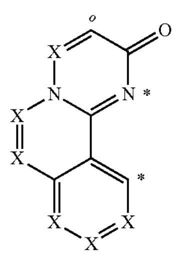

(L-34)

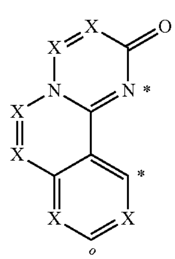

where R has the definitions given above, * represents the position of coordination to the metal, "o" represents the position of linkage of the sub-ligand to the group of the formulae (1) to (5) or the preferred embodiments and the other symbols used are as follows:

X is the same or different at each instance and is CR or N, with the proviso that not more than one X symbol per cycle is N.

When two R radicals bonded to adjacent carbon atoms in the sub-ligands (L-33) and (L-34) form an aromatic cycle with one another, this cycle together with the two adjacent carbon atoms is preferably a structure of the following formula (42):

Formula (42)

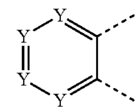

where the dotted bonds symbolize the linkage of this group within the sub-ligand and Y is the same or different at each instance and is $CR^1$ or N and preferably not more than one symbol Y is N.

In a preferred embodiment of the sub-ligand (L-33) or (L-34), not more than one group of the formula (42) is present. The sub-ligands are thus preferably sub-ligands of the following formulae (L-35) to (L-40):

(L-35)

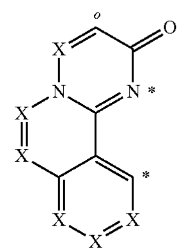

(L-36)

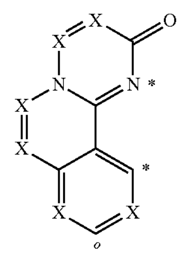

(L-37)

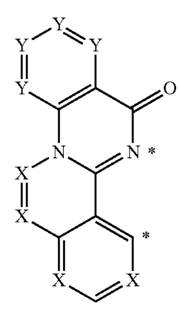

(L-38)

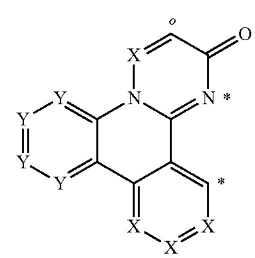

-continued (L-39)

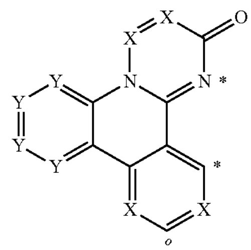

(L-40)

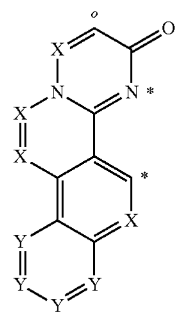

where X is the same or different at each instance and is CR or N, but the R radicals together do not form an aromatic or heteroaromatic ring system and the further symbols have the definitions given above.

In a preferred embodiment of the invention, in the sub-ligand of the formulae (L-33) to (L-40), a total of 0, 1 or 2 of the symbols X and, if present, Y are N. More preferably, a total of 0 or 1 of the symbols X and, if present, Y are N.

Preferred embodiments of the formulae (L-35) to (L-40) are the structures of the following formulae (L-35a) to (L-40f):

(L-35a)

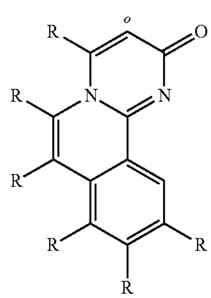

(L-35b)

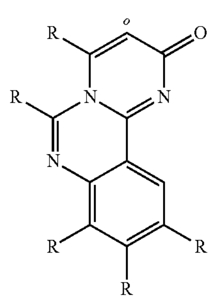

-continued (L-35c)

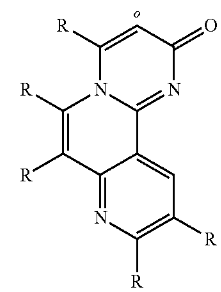

(L-35d)

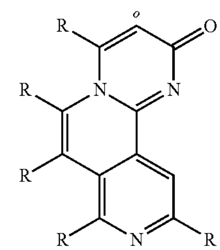

(L-36a)

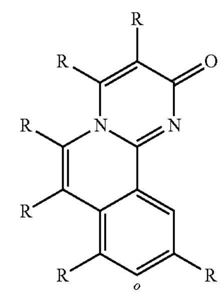

(L-36b)

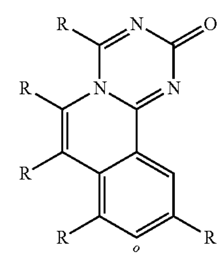

(L-36c)

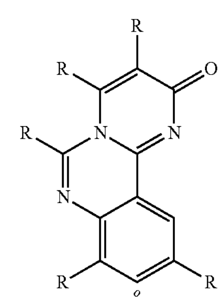

(L-36d)
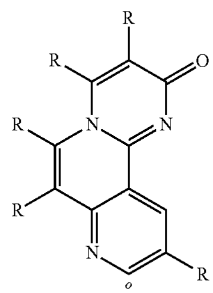
(L-37a)
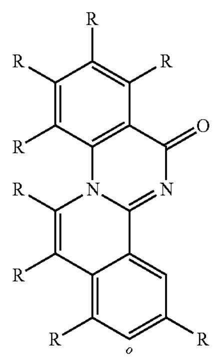
(L-37b)
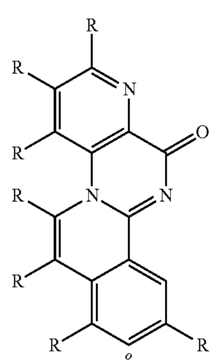
(L-37c)
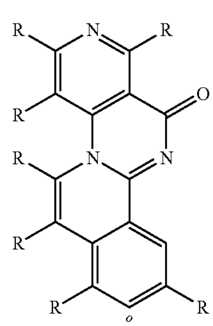
(L-37d)
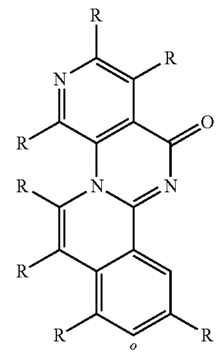
(L-37e)
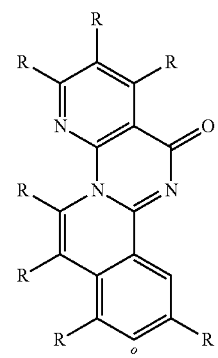
(L-37f)
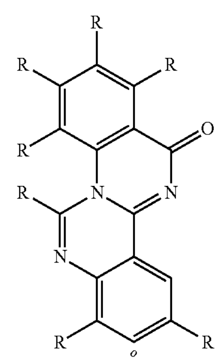
(L-37g)
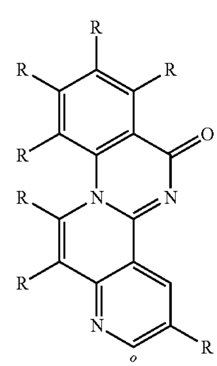

-continued
(L-38a)
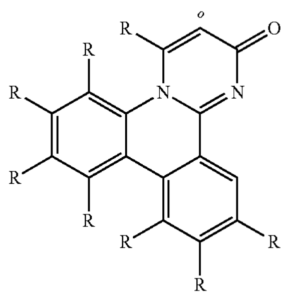
(L-38b)
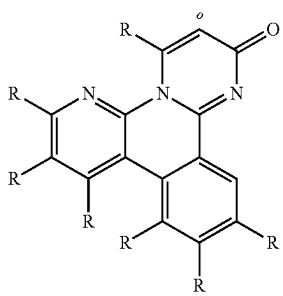
(L-38c)
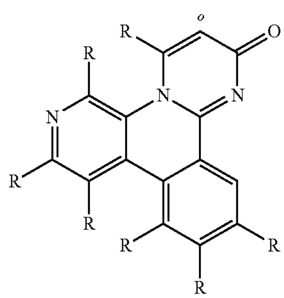
(L-38d)
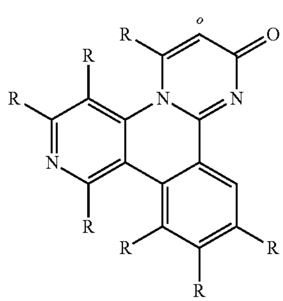
(L-38e)
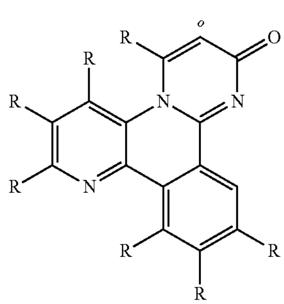
-continued
(L-38f)
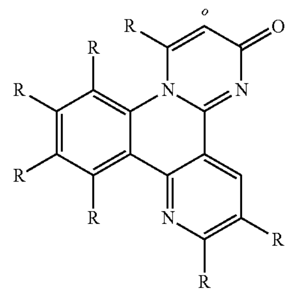
(L-38g)
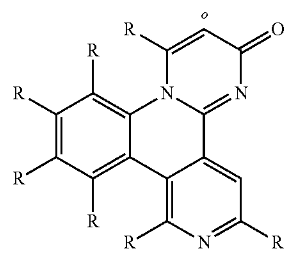
(L-39a)
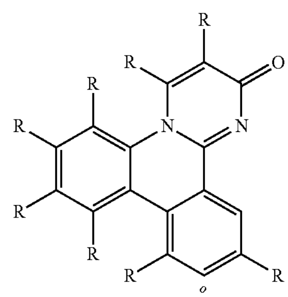
(L-39b)
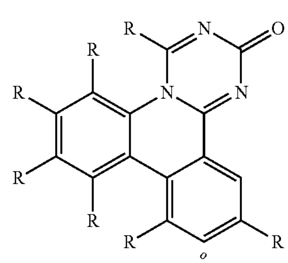
(L-39c)
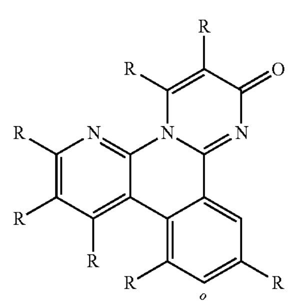

-continued
(L-39d)
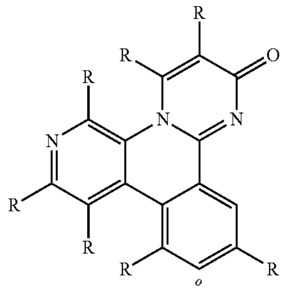
(L-39e)
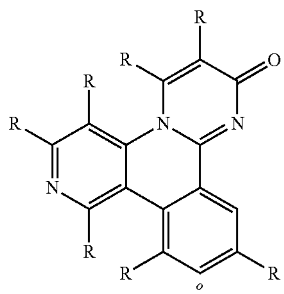
(L-39f)
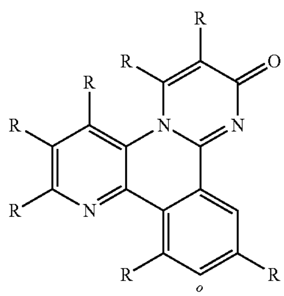
(L-39g)
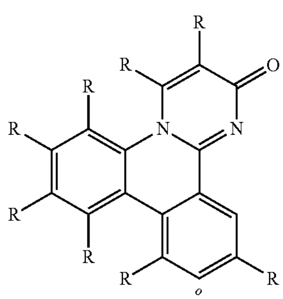
(L-40a)
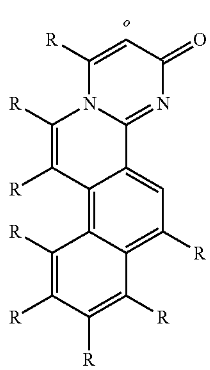
-continued
(L-40b)
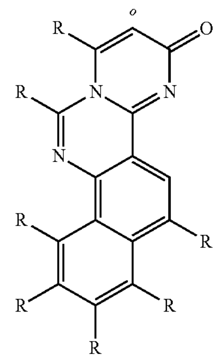
(L-40c)
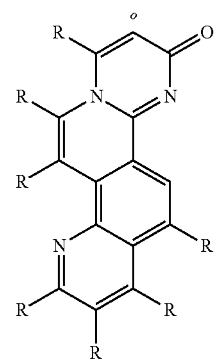
(L-40d)
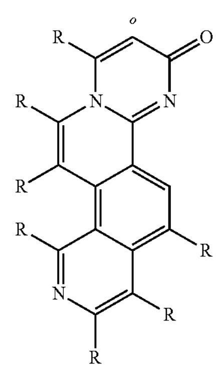
(L-40e)
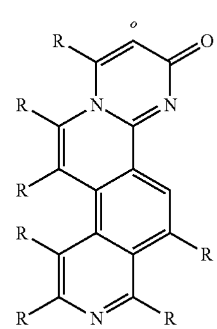

-continued (L-40f)

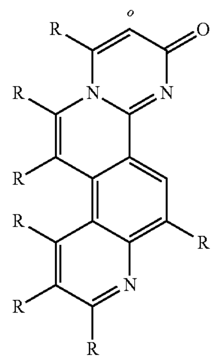

where the symbols used have the definitions given above and "o" indicates the position of the linkage to the group of the formulae (1) to (5) or the preferred embodiments.

In a preferred embodiment of the invention, the X group in the ortho position to the coordination to the metal is CR. In this radical, R bonded in the ortho position to the coordination to the metal is preferably selected from the group consisting of H, D, F and methyl.

In a further embodiment of the invention, it is preferable, if one of the atoms X or, if present, Y is N, when a substituent bonded adjacent to this nitrogen atom is an R group which is not hydrogen or deuterium.

This substituent R is preferably a group selected from $CF_3$, $OCF_3$, alkyl or alkoxy groups having 1 to 10 carbon atoms, especially branched or cyclic alkyl or alkoxy groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

When the metal in the complex of the invention is a main group metal, especially Al, preferably at least one of the bidentate sub-ligands, preferably at least two of the bidentate sub-ligands and more preferably all three bidentate sub-ligands are the same or different at each instance and are selected from the sub-ligands of the following formulae (L-41) to (L-44):

(L-41)

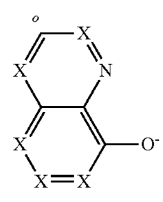

(L-42)

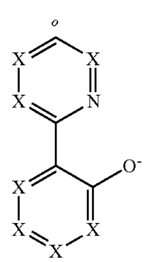

-continued (L-43)

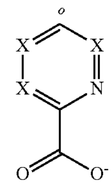

(L-44)

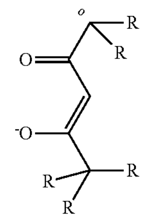

where the sub-ligands (L-41) to (L-43) each coordinate to the metal via the nitrogen atom explicitly shown and the negatively charged oxygen atom, and the sub-ligand (L-44) coordinates via the two oxygen atoms, X has the definitions given above and "o" indicates the position via which the sub-ligand is joined to the group of the formulae (1) to (5) or the preferred embodiments.

The above-recited preferred embodiments of X are also preferred for the sub-ligands of the formulae (L-41) to (L-43).

Preferred sub-ligands of the formulae (L-41) to (L-43) are therefore the sub-ligands of the following formulae (L-41a) to (L-43a):

(L-41a)

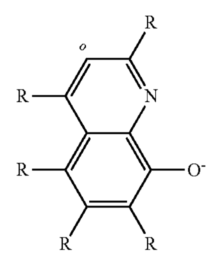

(L-42a)

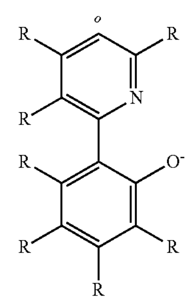

(L-43a)

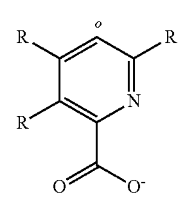

where the symbols used have the definitions given above and "o" indicates the position via which the sub-ligand is joined to the group of the formulae (1) to (5) or the preferred embodiments.

More preferably, in these formulae, R is hydrogen, where "o" indicates the position via which the sub-ligand is joined to the group of the formulae (1) to (5) or the preferred embodiments, and so the structures are those of the following formulae (L-41 b) to (L-43b):

(L-41b)

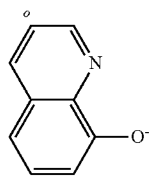

(L-42b)

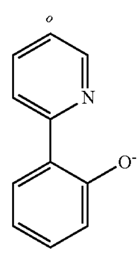

(L-43b)

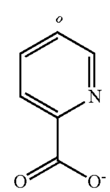

where the symbols used have the definitions given above.

The groups of the formula (L-41) or (L-41a) or (L-41b) and (L-44) are additionally also preferred as one of the sub-ligands when the metal is a transition metal, preferably in combination with one or more sub-ligands which bind to the metal via a carbon atom and a nitrogen atom, especially as described by the sub-ligands of the formulae (L-1) to (L-40) listed above.

There follows a description of preferred substituents as may be present on the above-described sub-ligands, but also on the bivalent arylene or heteroarylene group in the structure of the formulae (1) to (5), i.e. in the structure of the formula (6).

In a preferred embodiment of the invention, the metal complex of the invention contains two R substituents or two $R^1$ substituents which are bonded to adjacent carbon atoms and together form an aliphatic ring according to one of the formulae described hereinafter. In this case, the two R substituents which form this aliphatic ring may be present on the bridge of the formulae (1) to (5) or the preferred embodiments and/or on one or more of the bidentate sub-ligands. The aliphatic ring which is formed by the ring formation by two R substituents together or by two $R^1$ substituents together is preferably described by one of the following formulae (43) to (49):

Formula (43)

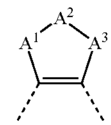

Formula (44)

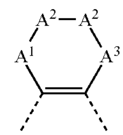

Formula (45)

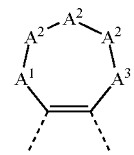

Formula (46)

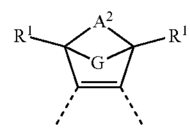

Formula (47)

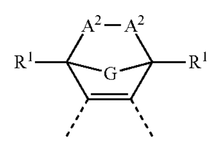

Formula (48)

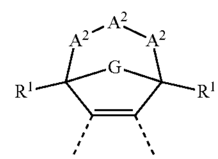

Formula (49)

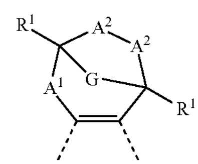

where $R^1$ and $R^2$ have the definitions given above, the dotted bonds signify the linkage of the two carbon atoms in the ligand and, in addition:

$A^1$, $A^3$ is the same or different at each instance and is $C(R^3)_2$, O, S, $NR^3$ or C(═O);

$A^2$ is $C(R^1)_2$, O, S, $NR^3$ or C(═O);

G is an alkylene group which has 1, 2 or 3 carbon atoms and may be substituted by one or more $R^2$ radicals, —$CR^2$═$CR^2$— or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C$═$CR^2$, C≡C, $Si(R^2)_2$, C═O, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system;

with the proviso that no two heteroatoms in these groups are bonded directly to one another and no two C=O groups are bonded directly to one another.

In the above-depicted structures of the formulae (43) to (49) and the further embodiments of these structures specified as preferred, a double bond is formed in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (43) to (45) is achieved by virtue of $A^1$ and $A^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycyclic, are significantly less acidic than benzylic protons on carbon atoms which are not bonded within a bi- or polycyclic structure, and are regarded as non-acidic protons in the context of the present invention. Thus, the absence of acidic benzylic protons in formulae (46) to (49) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (46) to (49) is H, this is therefore a non-acidic proton in the context of the present application.

In a preferred embodiment of the invention, $R^3$ is not H.

In a preferred embodiment of the structure of the formulae (43) to (49), not more than one of the $A^1$, $A^2$ and $A^3$ groups is a heteroatom, especially O or $NR^3$, and the other groups are $C(R^3)_2$ or $C(R^1)_2$, or $A^1$ and $A^3$ are the same or different at each instance and are O or $NR^3$ and $A^2$ is $C(R^1)_2$. In a particularly preferred embodiment of the invention, $A^1$ and $A^3$ are the same or different at each instance and are $C(R^3)_2$, and $A^2$ is $C(R^1)_2$ and more preferably $C(R^3)_2$ or $CH_2$.

Preferred embodiments of the formula (43) are thus the structures of the formulae (43-A), (43-B), (43-C) and (43-D), and a particularly preferred embodiment of the formula (43-A) is the structures of the formulae (43-E) and (43-F):

Formula (43-A)

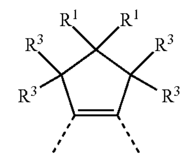

Formula (43-B)

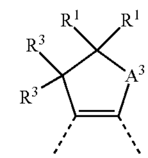

Formula (43-C)

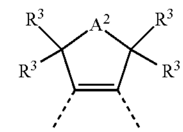

Formula (43-D)

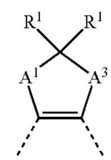

Formula (43-E)

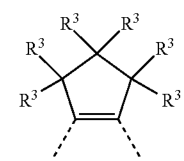

Formula (43-F)

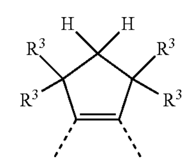

where $R^1$ and $R^3$ have the definitions given above and $A^1$, $A^2$ and $A^3$ are the same or different at each instance and are O or $NR^3$.

Preferred embodiments of the formula (44) are the structures of the following formulae (44-A) to (44-F):

Formula (44-A)

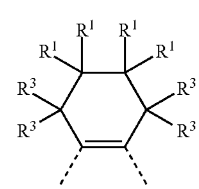

Formula (44-B)

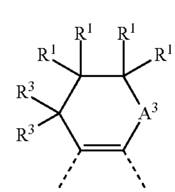

-continued

Formula (44-C)

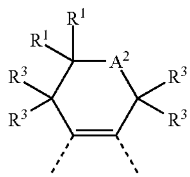

Formula (44-D)

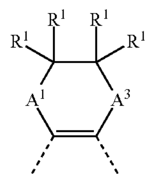

Formula (44-E)

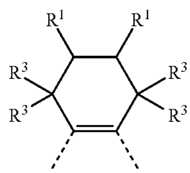

Formula (44-F)

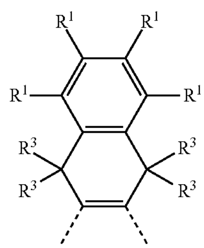

where $R^1$ and $R^3$ have the definitions given above and $A^1$, $A^2$ and $A^3$ are the same or different at each instance and are O or $NR^3$.

Preferred embodiments of the formula (45) are the structures of the following formulae (45-A) to (45-E):

Formula (45-A)

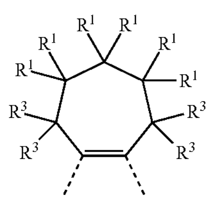

Formula (45-B)

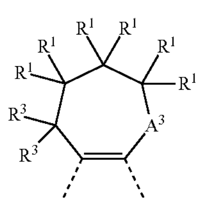

Formula (45-C)

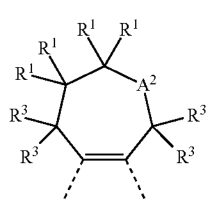

-continued

Formula (45-D)

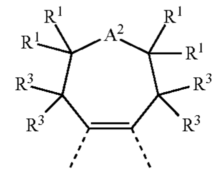

Formula (45-E)

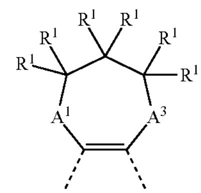

where $R^1$ and $R^3$ have the definitions given above and $A^1$, $A^2$ and $A^3$ are the same or different at each instance and are O or $NR^3$.

In a preferred embodiment of the structure of formula (46), the $R^1$ radicals bonded to the bridgehead are H, D, F or $CH_3$. Further preferably, $A^2$ is $C(R^1)_2$ or O, and more preferably $C(R^3)_2$. Preferred embodiments of the formula (46) are thus structures of the formulae (46-A) and (46-B), and a particularly preferred embodiment of the formula (46-A) is a structure of the formula (46-C):

Formula (46-A)

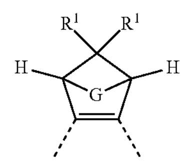

Formula (46-B)

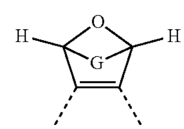

Formula (46-C)

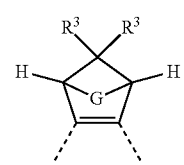

where the symbols used have the definitions given above.

In a preferred embodiment of the structure of formulae (47), (48) and (49), the $R^1$ radicals bonded to the bridgehead are H, D, F or $CH_3$. Further preferably, $A^2$ is $C(R^1)_2$. Preferred embodiments of the formula (47), (48) and (49) are thus the structures of the formulae (47-A), (48-A) and (49-A):

Formula (47-A)

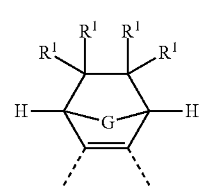

-continued

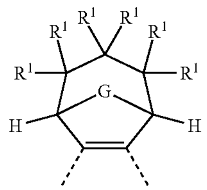

Formula (47-B)

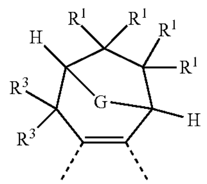

Formula (47-C)

where the symbols used have the definitions given above.

Further preferably, the G group in the formulae (46), (46-A), (46-B), (46-C), (47), (47-A), (48), (48-A), (49) and (49-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (43) to (49) and in the preferred embodiments is the same or different at each instance and is F, a straight-chain alkyl group having 1 to 10 carbon atoms or a branched or cyclic alkyl group having 3 to 20 carbon atoms, where one or more nonadjacent $CH_2$ groups in each case may be replaced by $R^2C{=}CR^2$ and one or more hydrogen atoms may be replaced by D or F, or an aromatic or heteroaromatic ring system which has 5 to 14 aromatic ring atoms and may be substituted in each case by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (43) to (49) and in the preferred embodiments is the same or different at each instance and is F, a straight-chain alkyl group having 1 to 3 carbon atoms, especially methyl, or an aromatic or heteroaromatic ring system which has 5 to 12 aromatic ring atoms and may be substituted in each case by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (43) are the groups (43-1) to (43-71) listed below:

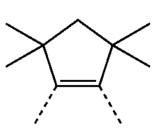

(43-1)

-continued

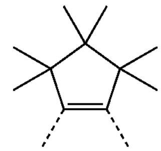

(43-2)

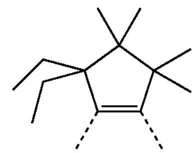

(43-3)

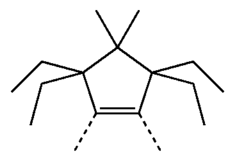

(43-4)

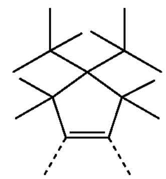

(43-5)

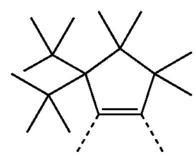

(43-6)

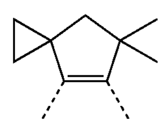

(43-7)

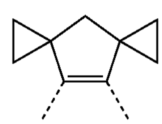

(43-8)

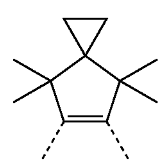

(43-9)

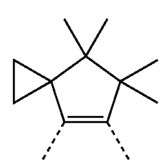

(43-10)

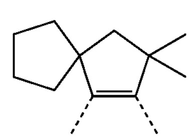

(43-11)

-continued
(43-12)
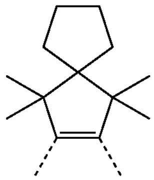
(43-13)
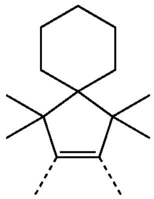
(43-14)
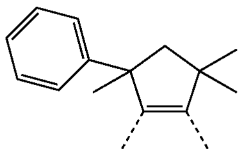
(43-15)
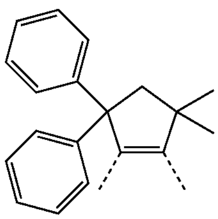
(43-16)
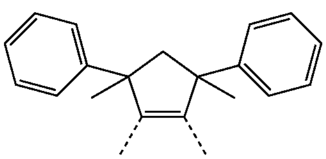
(43-17)
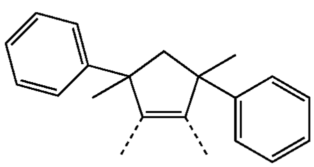
(43-18)
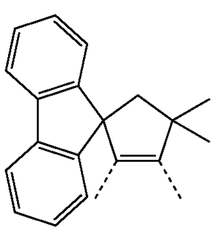
(43-19)
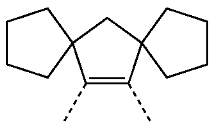
-continued
(43-20)
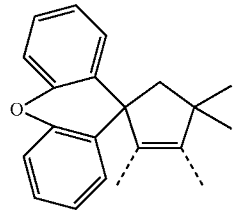
(43-21)
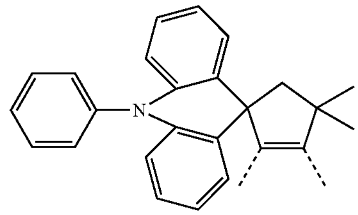
(43-22)
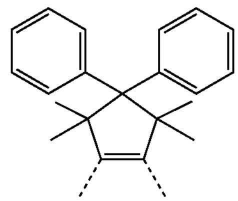
(43-24)
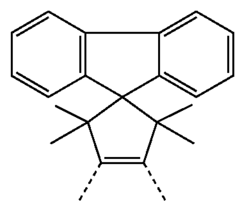
(43-25)
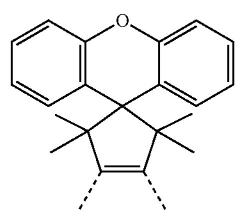
(43-26)
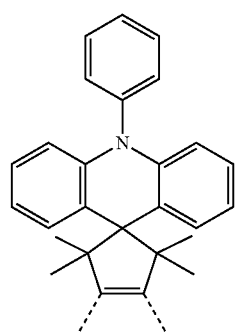
(43-27)
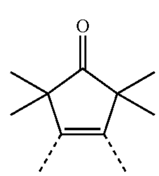

-continued
(43-28)
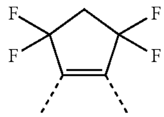
(43-29)
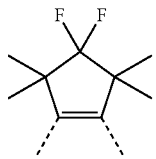
(43-30)
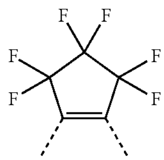
(43-31)
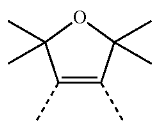
(43-32)
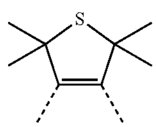
(43-33)
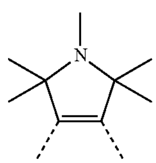
(43-34)
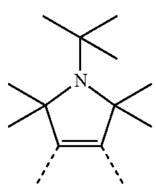
(43-35)
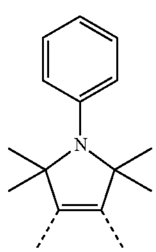
(43-36)
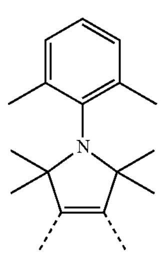
-continued
(43-37)
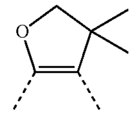
(43-38)
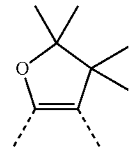
(43-39)
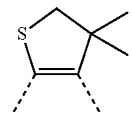
(43-40)
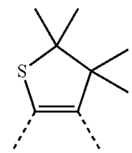
(43-41)
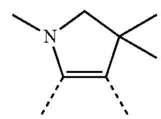
(43-42)
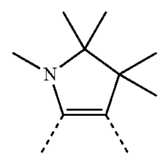
(43-43)
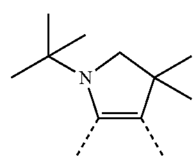
(43-44)
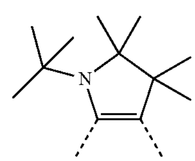
(43-45)
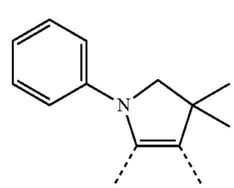
(43-46)
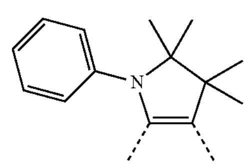

(43-47)
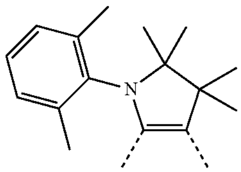
(43-48)
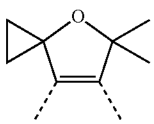
(43-49)
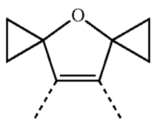
(43-50)
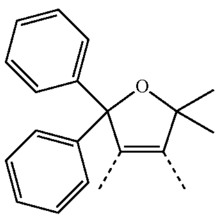
(43-51)
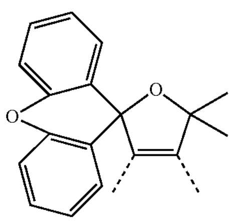
(43-52)
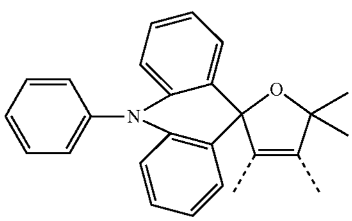
(43-53)
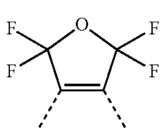
(43-54)
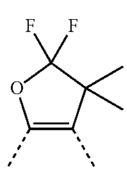
(43-55)
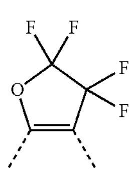
(43-56)
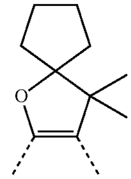
(43-57)
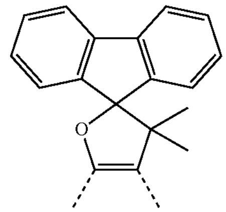
(43-58)
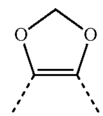
(43-59)
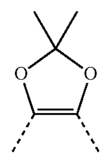
(43-60)
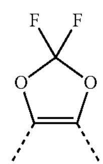
(43-61)
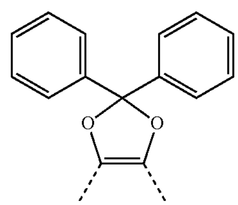
(43-62)
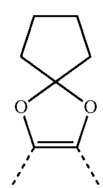
(43-63)
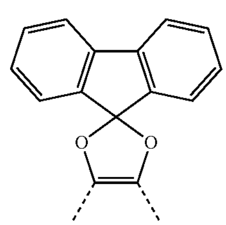

-continued
(43-64)
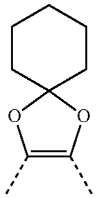
(43-65)
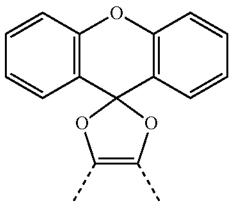
(43-66)
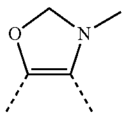
(43-67)
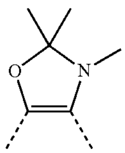
(43-68)
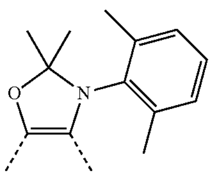
(43-69)
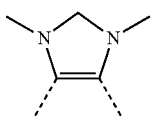
(43-70)
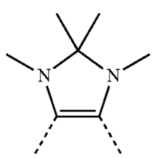
(43-71)
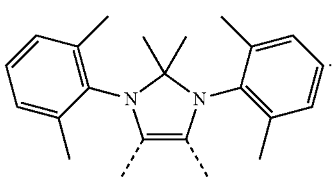
Examples of particularly suitable groups of the formula (44) are the groups (44-1) to (44-14) listed below:
(44-1)
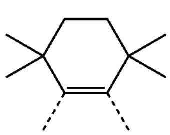
-continued
(44-2)
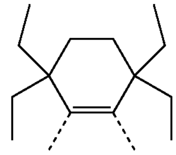
(44-3)
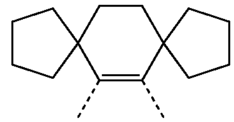
(44-4)
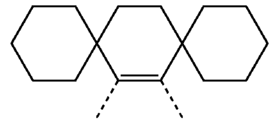
(44-5)
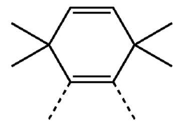
(44-6)
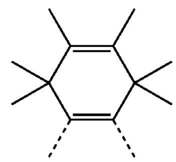
(44-7)
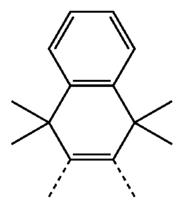
(44-8)
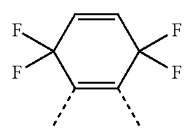
(44-9)
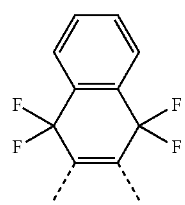
(44-10)
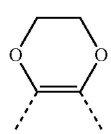
(44-11)
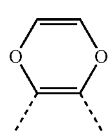

-continued
(44-12)
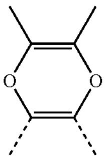
(44-13)
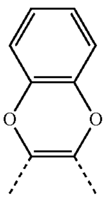
(44-14)
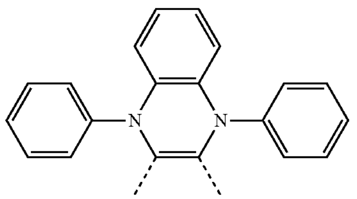
Examples of particularly suitable groups of the formulae (45), (48) and (49) are the groups (45-1), (48-1) and (49-1) listed below:
(45-1)
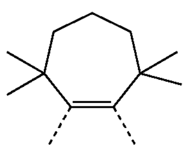
(48-1)
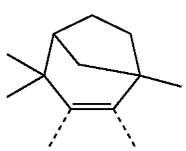
(49-1)
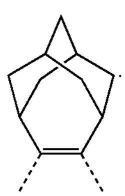
Examples of particularly suitable groups of the formula (46) are the groups (46-1) to (46-22) listed below:
(46-1)
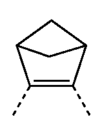
(46-2)
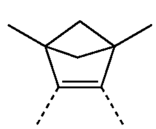
-continued
(46-3)
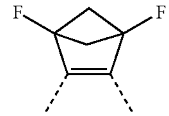
(46-4)
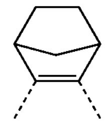
(46-5)
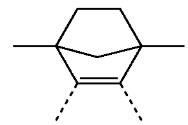
(46-6)
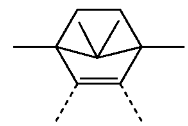
(46-7)
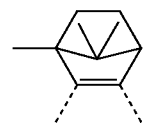
(46-8)
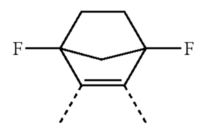
(46-9)
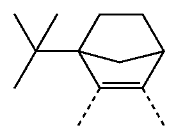
(46-10)
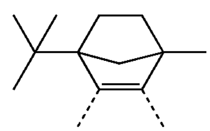
(46-11)
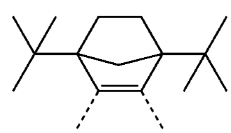
(46-12)
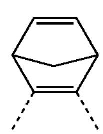
(46-13)
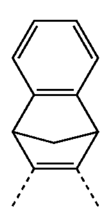

-continued (46-14)

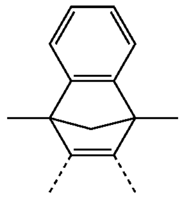

(46-15)

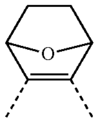

(46-16)

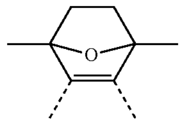

(46-17)

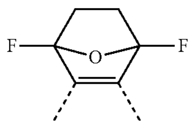

(46-18)

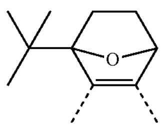

(46-19)

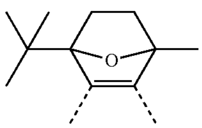

(46-20)

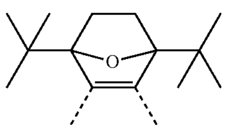

(46-21)

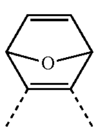

(46-22)

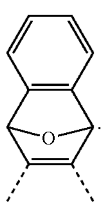

Examples of particularly suitable groups of the formula (47) are the groups (47-1) to (47-5) listed below:

(47-1)

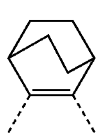

-continued (47-2)

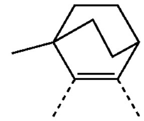

(47-3)

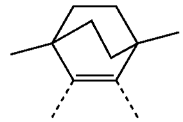

(47-4)

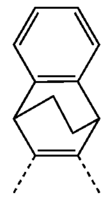

(47-5)

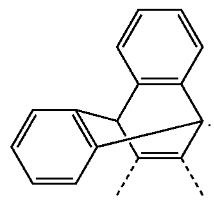

When R radicals are bonded within the bidentate subligands or within the bivalent arylene or heteroarylene groups of the formula (6) bonded within the formulae (1) to (5) or the preferred embodiments, these R radicals are the same or different at each instance and are preferably selected from the group consisting of H, D, F, Br, I, $N(R^1)_2$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms and may be substituted in each case by one or more $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13 aromatic ring atoms and may be substituted in each case by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

The abovementioned preferred embodiments can be combined with one another as desired. In a particularly preferred embodiment of the invention, the abovementioned preferred embodiments apply simultaneously.

As described above, the metal complexes of the invention may also be ring-closed by a further bridge to give a cryptate. Examples of suitable cryptates are adduced in the examples at the back. A particularly suitable bridge which can be used to form cryptates is a bridge of the abovementioned formula (1) or the preferred embodiments. Further examples of suitable bridges which can be used to form cryptates are the structures depicted below:

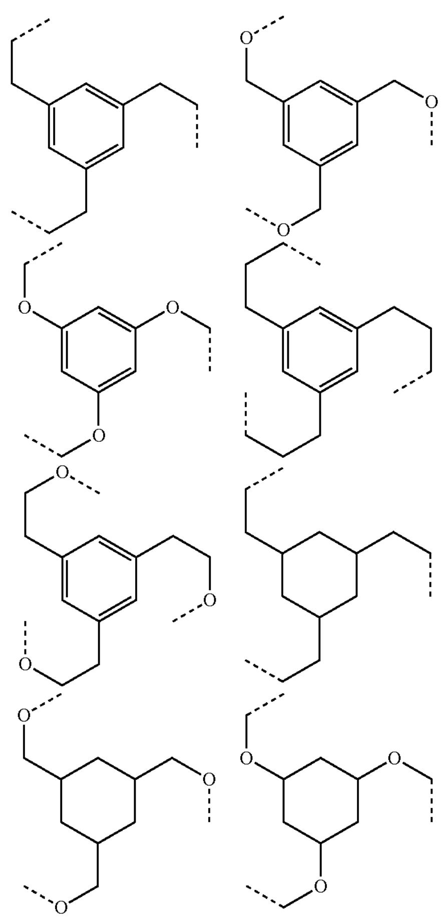

cis,cis-1,3,5-Cyclohexyl

-continued

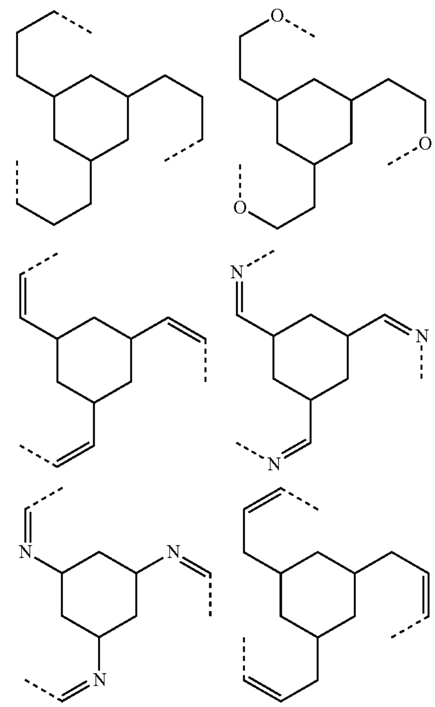

cis,cis-1,3,5-Cyclohexyl

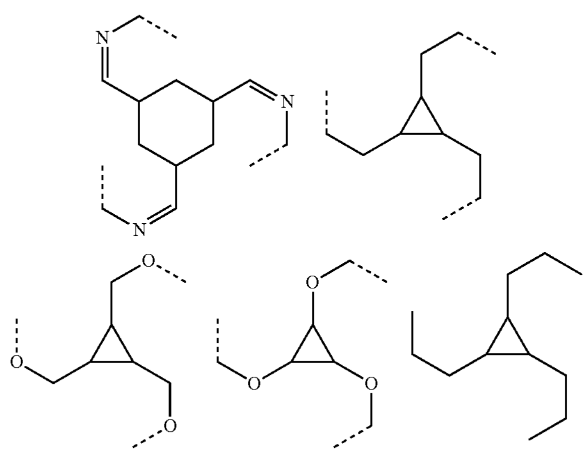

cis,cis-1,2,3-Cyclopropyl

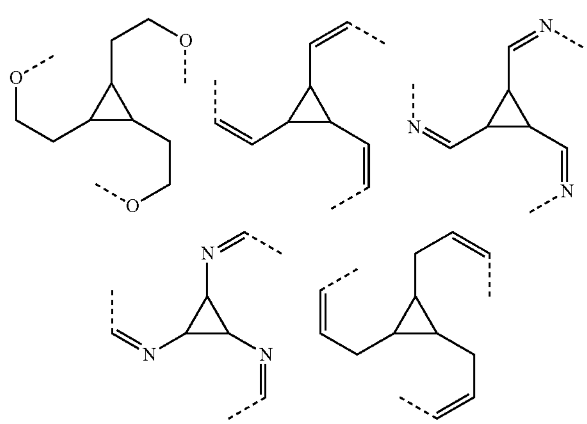

cis,cis-1,2,3-Cyclopropyl

-continued

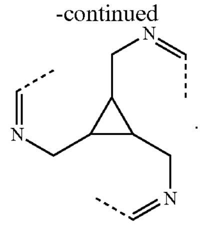

For the formation of cryptates, these bridges are preferably bonded to the ligand in each case in the meta position to the coordination to the metal. Thus, if the sub-ligands contain the structures (CyC-1) to (CyC-20) or (CyD-1) to (CyD-20) or the preferred embodiments of these groups, the abovementioned bridges, for formation of cryptates, are preferably each bonded in the positions signified by "o".

The metal complexes of the invention are chiral structures. If the tripodal ligand of the complexes is additionally also chiral, the formation of diastereomers and multiple enantiomer pairs is possible. In that case, the complexes of the invention include both the mixtures of the different diastereomers or the corresponding racemates and the individual isolated diastereomers or enantiomers.

If $C_3$- or $C_{3v}$-symmetric ligands are used in the ortho-metallation, what is obtained is typically a racemic mixture of the $C_3$-symmetric complexes, i.e. of the Δ and Λ enantiomers. These may be separated by standard methods (chromatography on chiral materials/columns or optical resolution by crystallization). This is shown in the scheme which follows using the example of a $C_3$-symmetric ligand bearing three phenylpyridine sub-ligands and also applies analogously to all other $C_3$- or $C_{3v}$-symmetric ligands.

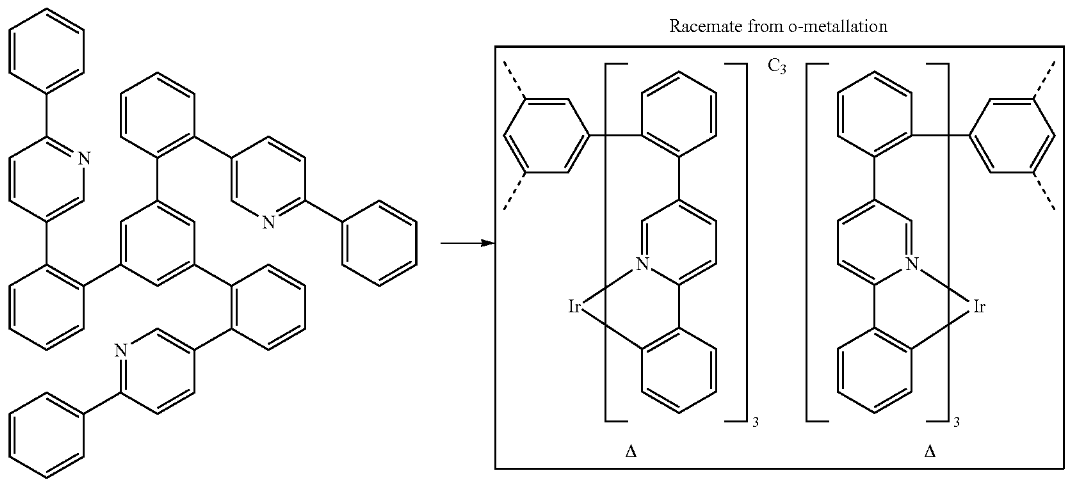

$C_3$

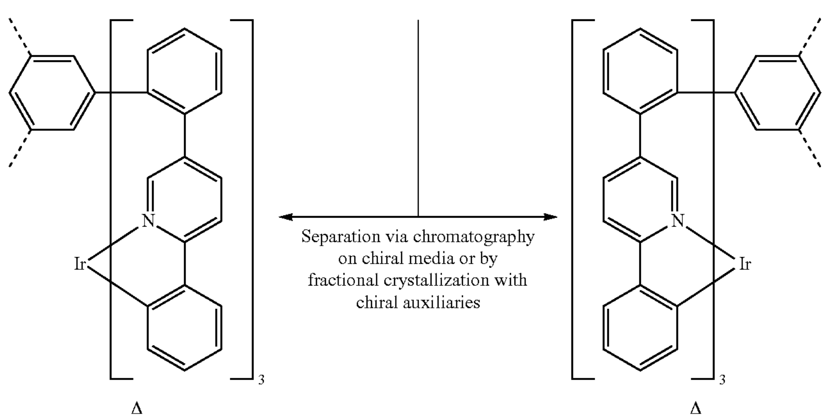

Optical resolution via fractional crystallization of diastereomeric salt pairs can be effected by customary methods. One option for this purpose is to oxidize the uncharged Ir(III) complexes (for example with peroxides or $H_2O_2$ or by electrochemical means), add the salt of an enantiomerically pure monoanionic base (chiral base) to the cationic Ir(IV) complexes thus produced, separate the diastereomeric salts thus produced by fractional crystallization, and then reduce them with the aid of a reducing agent (e.g. zinc, hydrazine hydrate, ascorbic acid, etc.) to give the enantiomerically pure uncharged complex, as shown schematically below:

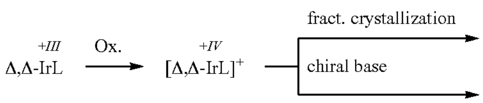

-continued $$\overset{+IV}{[\Delta\text{-IrL}]^{+}}[\text{chiral base}]^{-} \xrightarrow{\text{Red.}} \Delta\text{-Ir}^{+III}\text{L}$$

$$\overset{+IV}{[\Lambda\text{-IrL}]^{+}}[\text{chiral base}]^{-} \xrightarrow{\text{Red.}} \Lambda\text{-Ir}^{+III}\text{L}$$

In addition, an enantiomerically pure or enantiomerically enriching synthesis is possible by complexation in a chiral medium (e.g. R- or S-1,1-binaphthol).

Analogous processes can also be conducted with complexes of $C_1$- or $C_s$-symmetric ligands.

If $C_1$-symmetric ligands are used in the complexation, what is typically obtained is a diastereomer mixture of the complexes which can be separated by standard methods (chromatography, crystallization).

Enantiomerically pure $C_3$-symmetric complexes can also be synthesized selectively, as shown in the scheme which follows. For this purpose, an enantiomerically pure $C_3$-symmetric ligand is prepared and complexed, the diastereomer mixture obtained is separated and then the chiral group is detached.

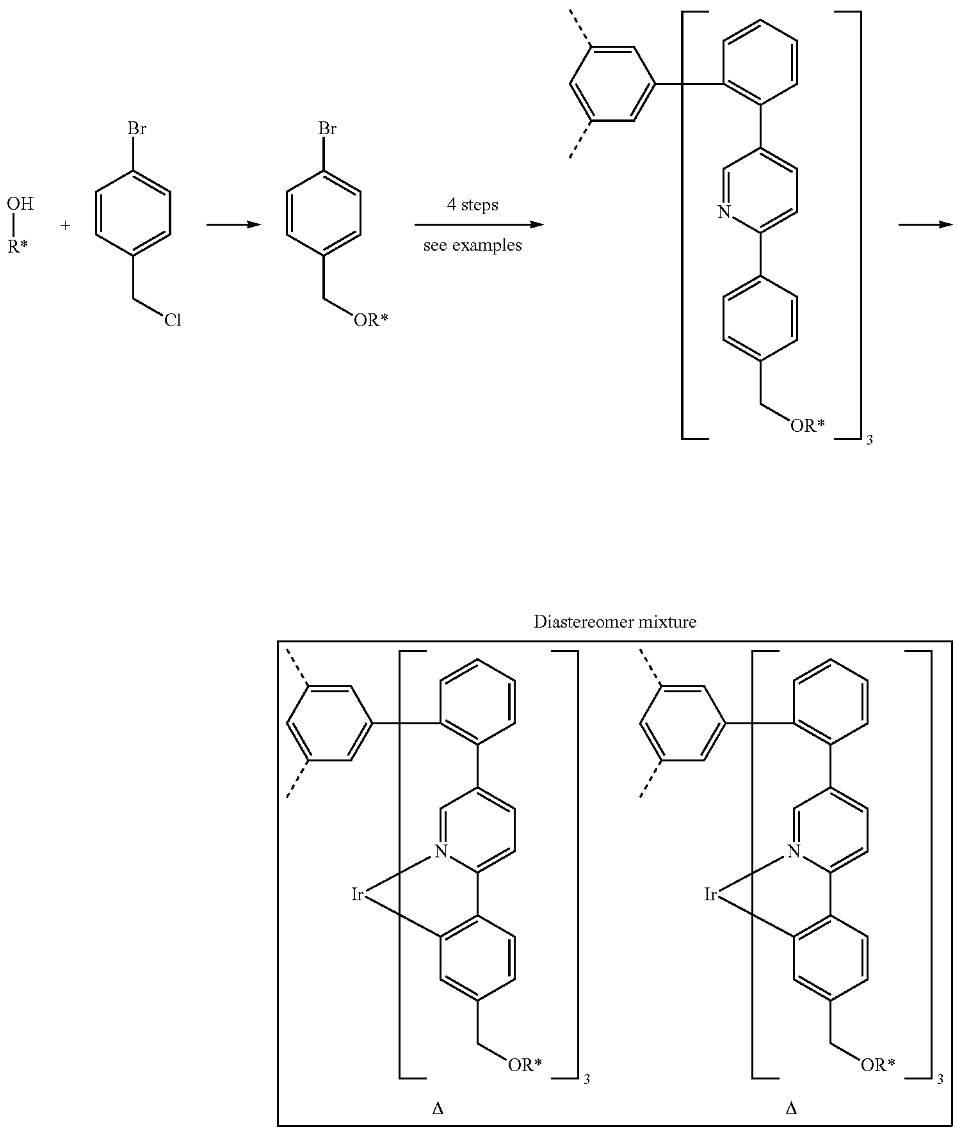

-continued

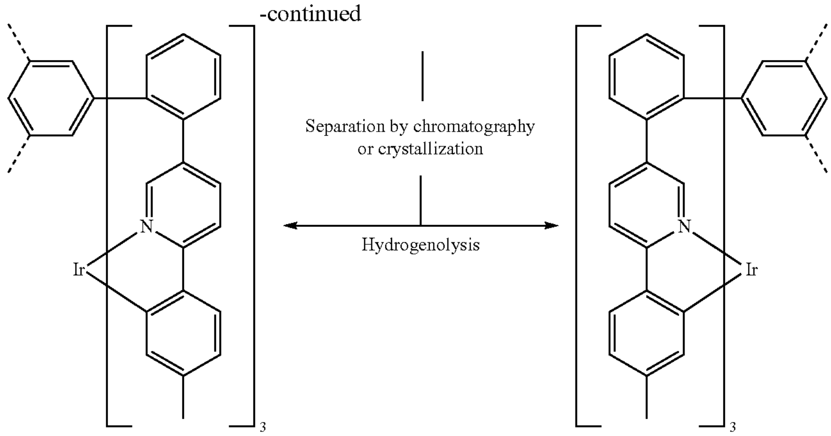

Δ Δ

R*: enantiomerically pure radical

The metal complexes of the invention are preparable in principle by various processes. In general, for this purpose, a metal salt is reacted with the corresponding free ligand.

Therefore, the present invention further provides a process for preparing the metal complexes of the invention by reacting the corresponding free ligands with metal alkoxides of the formula (50), with metal ketoketonates of the formula (51), with metal halides of the formula (52) or with metal carboxylates of the formula (53)

$M(OR)_n$ Formula (50)

Formula (51)

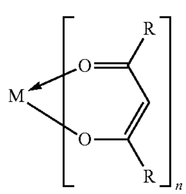

$MHal_n$ Formula (52)

$M(OOCR)_n$ Formula (53)

where M is the metal in the metal complex of the invention which is synthesized, n is the valency of the metal M, R has the definitions given above, Hal=F, Cl, Br or I and the metal reactants may also be present in the form of the corresponding hydrates. R here is preferably an alkyl group having 1 to 4 carbon atoms.

It is likewise possible to use metal compounds, especially iridium compounds, bearing both alkoxide and/or halide and/or hydroxyl and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato)iridium, and $IrCl_3.xH_2O$ where x is typically a number from 2 to 4.

The synthesis of the complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metallated. It is optionally also possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulphoxides (DMSO) or sulphones (dimethyl sulphone, sulpholane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, etc. Particular preference is given here to the use of hydroquinone.

It is possible by these processes, if necessary followed by purification, for example recrystallization or sublimation, to obtain the inventive compounds of formula (1) in high purity, preferably more than 99% (determined by means of $^1H$ NMR and/or HPLC).

The metal complexes of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (43) to (49) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

The metal complexes of the invention may also be mixed with a polymer. It is likewise possible to incorporate these metal complexes covalently into a polymer. This is especially possible with compounds substituted by reactive leaving groups such as bromine, iodine, chlorine, boronic acid or boronic ester, or by reactive polymerizable groups such as olefins or oxetanes. These may find use as monomers for production of corresponding oligomers, dendrimers or polymers. The oligomerization or polymerization is preferably effected via the halogen functionality or the boronic acid functionality or via the polymerizable group. It is additionally possible to crosslink the polymers via groups of this kind. The compounds of the invention and polymers may be used in the form of a crosslinked or uncrosslinked layer.

The invention therefore further provides oligomers, polymers or dendrimers containing one or more of the above-detailed metal complexes of the invention, wherein one or more bonds of the metal complex of the invention to the polymer, oligomer or dendrimer are present rather than one or more hydrogen atoms and/or substituents. According to the linkage of the metal complex of the invention, it therefore forms a side chain of the oligomer or polymer or is incorporated in the main chain. The polymers, oligomers or dendrimers may be conjugated, partly conjugated or non-conjugated. The oligomers or polymers may be linear, branched or dendritic. For the repeat units of the metal complexes of the invention in oligomers, dendrimers and polymers, the same preferences apply as described above.

For preparation of the oligomers or polymers, the monomers of the invention are homopolymerized or copolymerized with further monomers. Preference is given to copolymers wherein the metal complexes of the invention are present to an extent of 0.01 to 99.9 mol %, preferably 5 to 90 mol %, more preferably 5 to 50 mol %. Suitable and preferred comonomers which form the polymer base skeleton are chosen from fluorenes (for example according to EP 842208 or WO 2000/022026), spirobifluorenes (for example according to EP 707020, EP 894107 or WO 2006/061181), paraphenylenes (for example according to WO 92/18552), carbazoles (for example according to WO 2004/070772 or WO 2004/113468), thiophenes (for example according to EP 1028136), dihydrophenanthrenes (for example according to WO 2005/014689), cis- and trans-indenofluorenes (for example according to WO 2004/041901 or WO 2004/113412), ketones (for example according to WO 2005/040302), phenanthrenes (for example according to WO 2005/104264 or WO 2007/017066) or else a plurality of these units. The polymers, oligomers and dendrimers may contain still further units, for example hole transport units, especially those based on triarylamines, and/or electron transport units.

For the processing of the metal complexes of the invention from the liquid phase, for example by spin-coating or by printing methods, formulations of the metal complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane or mixtures of these solvents.

The present invention therefore further provides a formulation comprising at least one metal complex of the invention or at least one oligomer, polymer or dendrimer of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The above-described metal complex of the invention or the above-detailed preferred embodiments may be used in the electronic device as active component, preferably as emitter in the emissive layer or as hole or electron transport material in a hole- or electron-transporting layer, or as oxygen sensitizer or as photoinitiator or photocatalyst. The present invention thus further provides for the use of a compound of the invention in an electronic device or as oxygen sensitizer or as photoinitiator or photocatalyst. Enantiomerically pure metal complexes of the invention are suitable as photocatalysts for chiral photoinduced syntheses.

The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one metal complex of the invention. Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one metal complex of the invention in at least one layer. Particular preference is given to organic electroluminescent devices. This is especially true when the metal is iridium or aluminium. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis. Especially when the metal is ruthenium, preference is given to use as a photosensitizer in a dye-sensitized solar cell ("Grätzel cell").

The organic electroluminescent device comprises cathode, anode and at least one emitting layer. Apart from these layers, it may comprise further layers, for example in each case one or more hole injection layers, hole transport layers, hole blocker layers, electron transport layers, electron injection layers, exciton blocker layers, electron blocker layers, charge generation layers and/or organic or inorganic p/n junctions. In this case, it is possible that one or more hole transport layers are p-doped, for example with metal oxides such as $MoO_3$ or $WO_3$, or with (per)fluorinated electron-deficient aromatics or with electron-deficient cyano-substituted heteroaromatics (for example according to JP 4747558, JP 2006-135145, US 2006/0289882, WO 2012/095143), or with quinoid systems (for example according to EP1336208) or with Lewis acids, or with boranes (for example according to US 2003/0006411, WO 2002/051850, WO 2015/049030) or with carboxylates of the elements of main group 3, 4 or 5 (WO 2015/018539), and/or that one or more electron transport layers are n-doped.

Suitable charge transport materials as usable in the hole injection or hole transport layer or electron blocker layer or in the electron transport layer of the organic electroluminescent device of the invention are, for example, the compounds disclosed in Y. Shirota et al., Chem. Rev. 2007, 107(4), 953-1010, or other materials as used in these layers according to the prior art.

Preferred hole transport materials which can be used in a hole transport, hole injection or electron blocker layer in the electroluminescent device of the invention are indenofluorenamine derivatives (for example according to WO 06/122630 or WO 06/100896), the amine derivatives disclosed in EP 1661888, hexaazatriphenylene derivatives (for example according to WO 01/049806), amine derivatives having fused aromatic systems (for example according to U.S. Pat. No. 5,061,569), the amine derivatives disclosed in WO 95/09147, monobenzoindenofluorenamines (for example according to WO 08/006449), dibenzoindenofluorenamines (for example according to WO 07/140847), spirobifluorenamines (for example according to WO 2012/034627, WO2014/056565), fluorenamines (for example according to EP 2875092, EP 2875699 and EP 2875004), spirodibenzopyranamines (e.g. EP 2780325) and dihydroacridine derivatives (for example according to WO 2012/150001).

Examples of suitable hole injection and hole transport materials and electron blocker materials are the structures depicted in the following table:

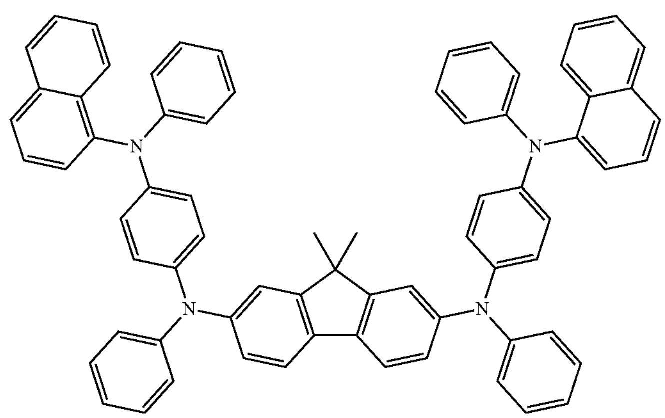 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]

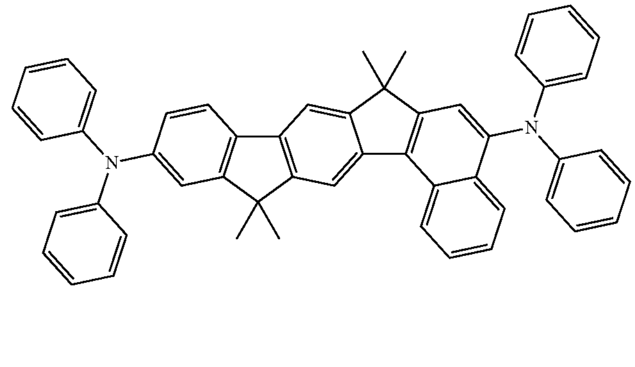 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]

-continued
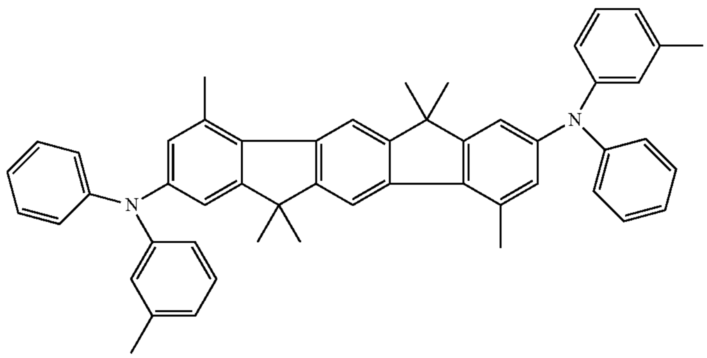 [SMILES: Cc1cccc(N(c2ccccc2)c2cc(C)c3c(c2)C(C)(C)c2cc4c(cc2-3)C(C)(C)c2cc(N(c3ccccc3)c3cccc(C)c3)cc(C)c2-4)c1]
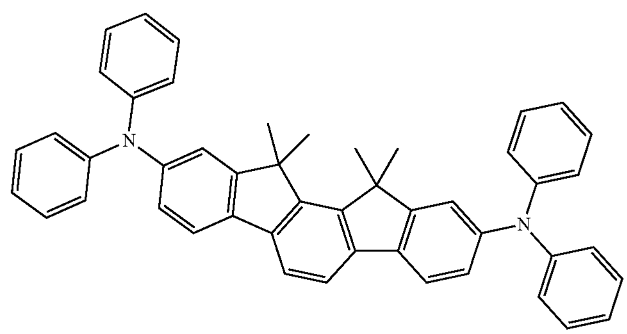 [SMILES: CC1(C)c2cc(N(c3ccccc3)c3ccccc3)ccc2-c2ccc3c(c21)C(C)(C)c1cc(N(c2ccccc2)c2ccccc2)ccc1-3]
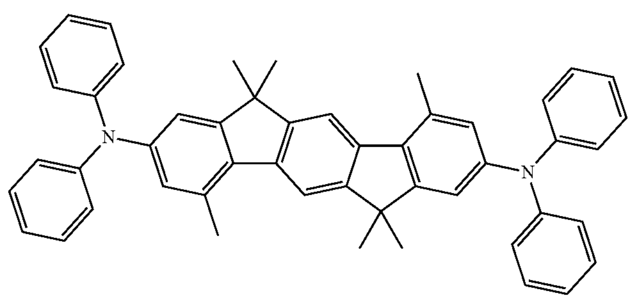 [SMILES: Cc1cc(N(c2ccccc2)c2ccccc2)cc2c1-c1cc3c(cc1C2(C)C)-c1c(C)cc(N(c2ccccc2)c2ccccc2)cc1C3(C)C]
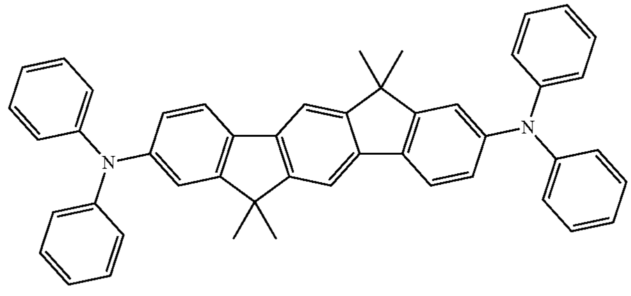 [SMILES: CC1(C)c2cc(N(c3ccccc3)c3ccccc3)ccc2-c2cc3c(cc21)-c1ccc(N(c2ccccc2)c2ccccc2)cc1C3(C)C]

-continued
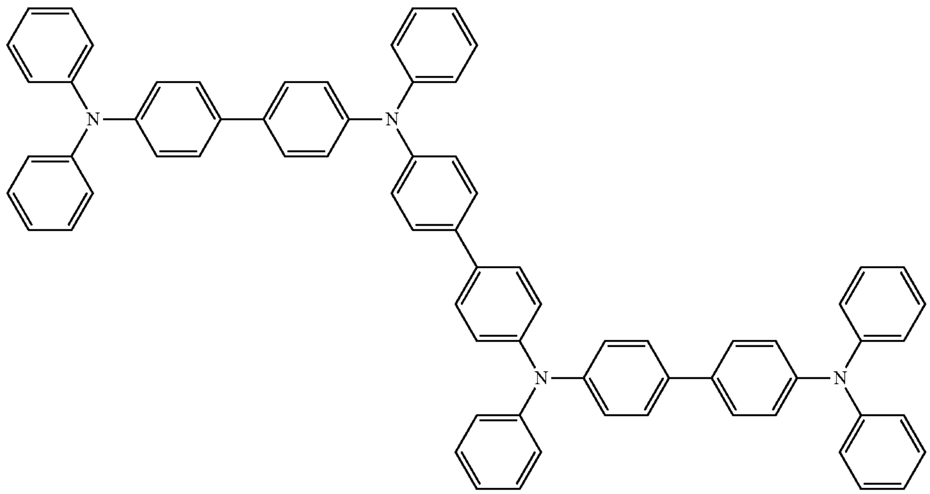 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
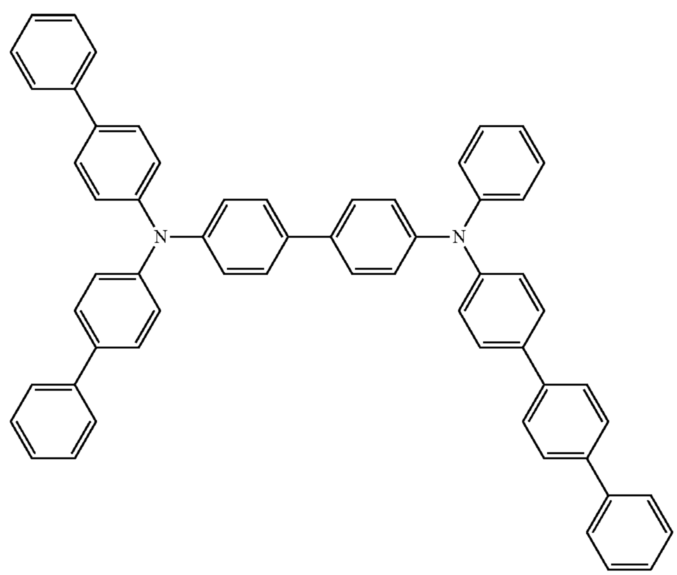 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
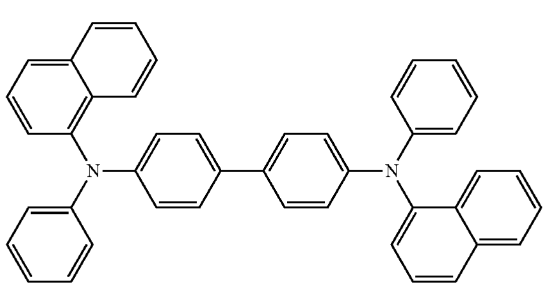 [SMILES: c1ccc(N(c2ccc(-c3ccc(N(c4ccccc4)c4cccc5ccccc45)cc3)cc2)c2cccc3ccccc23)cc1]

-continued
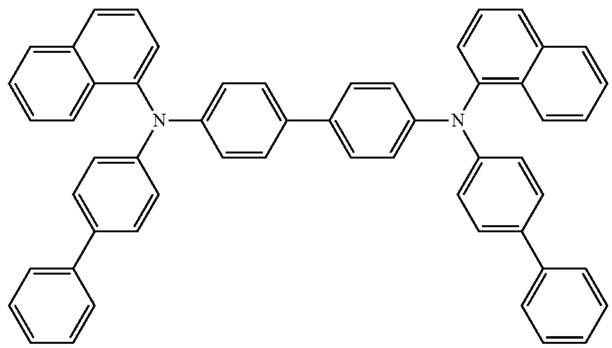 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]
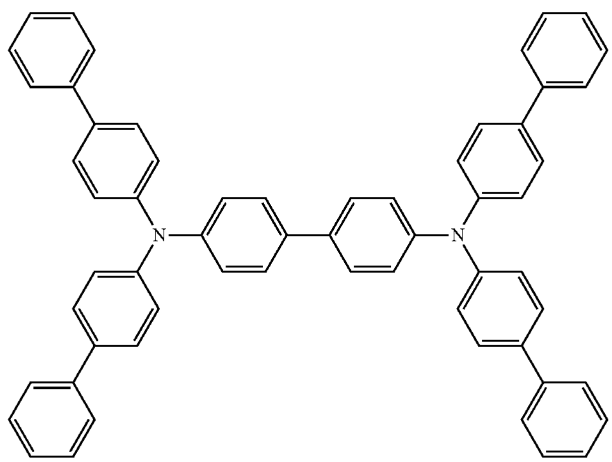 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
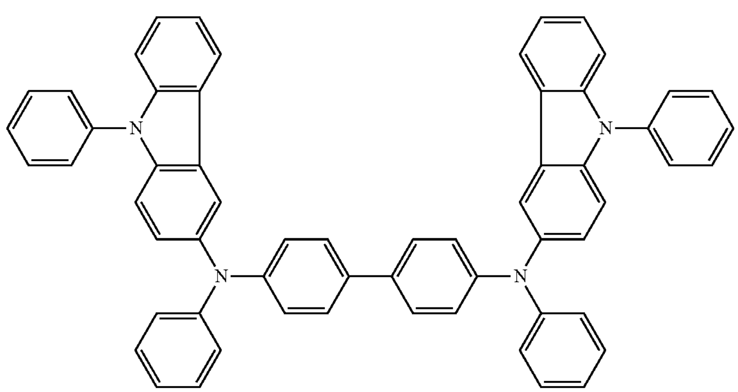 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]
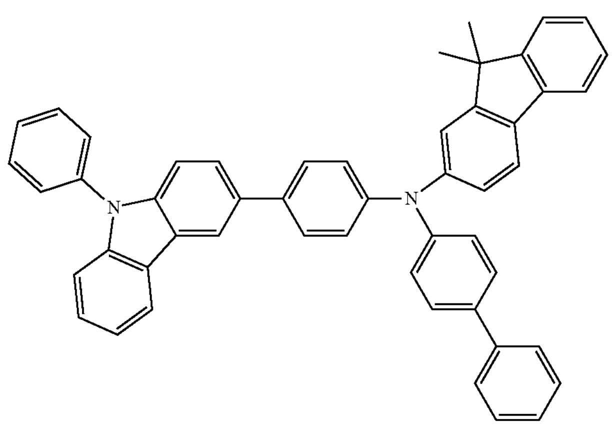 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

-continued
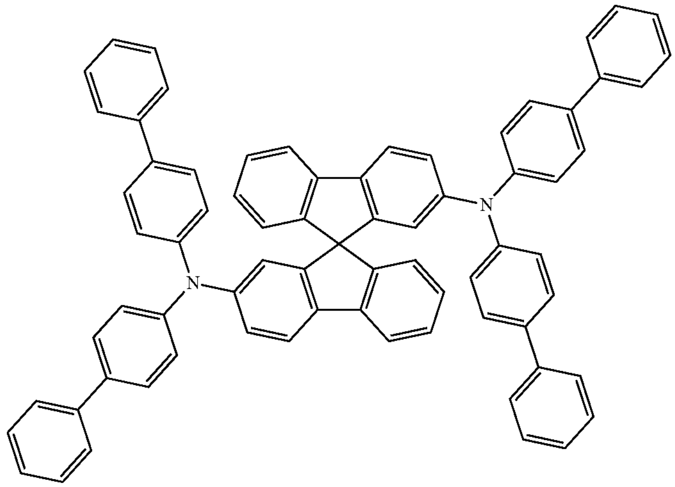 [SMILES: c1ccc(-c2ccc(N(c3ccc(-c4ccccc4)cc3)c3ccc4c(c3)C3(c5ccccc5-4)c4ccccc4-c4ccc(N(c5ccc(-c6ccccc6)cc5)c5ccc(-c6ccccc6)cc5)cc43)cc2)cc1]
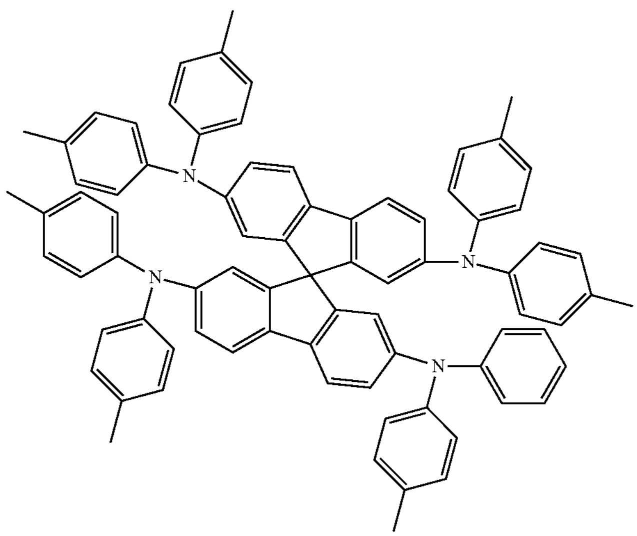
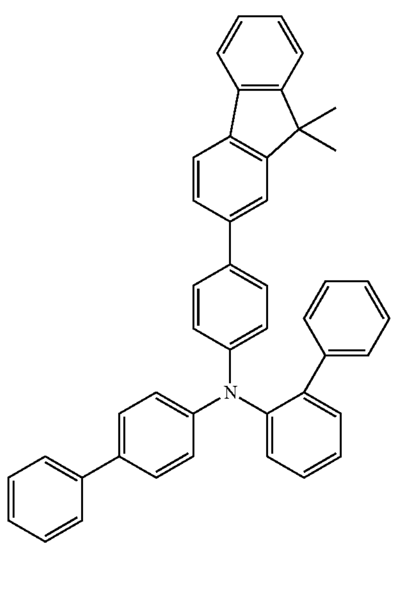 [SMILES: CC1(C)c2ccccc2-c2ccc(-c3ccc(N(c4ccc(-c5ccccc5)cc4)c4ccccc4-c4ccccc4)cc3)cc21]

-continued
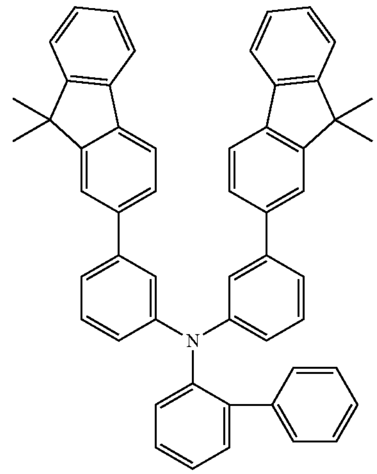
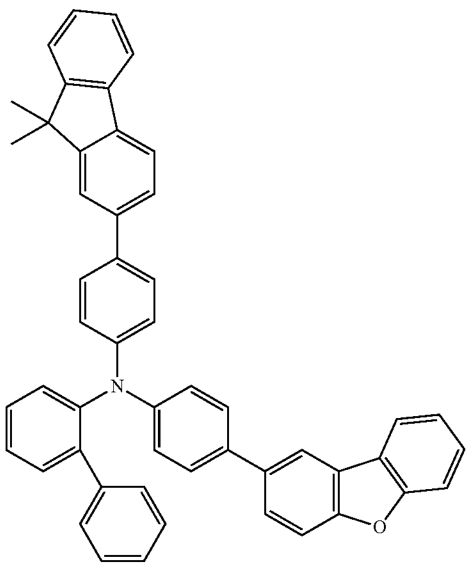 [SMILES: CC1(C)c2ccccc2-c2ccc(-c3ccc(N(c4ccc(-c5ccc6oc7ccccc7c6c5)cc4)c4ccccc4-c4ccccc4)cc3)cc21]
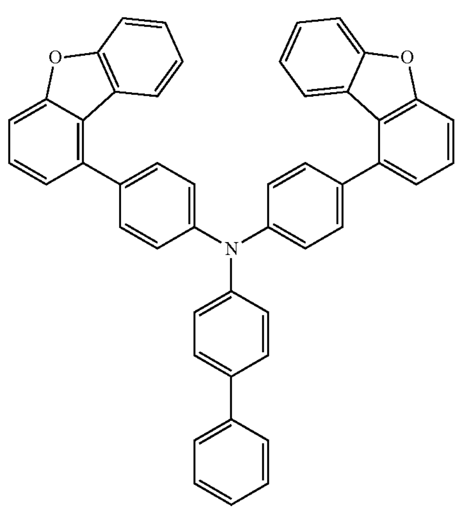 [SMILES: c1ccc(-c2ccc(N(c3ccc(-c4cccc5oc6ccccc6c45)cc3)c3ccc(-c4cccc5oc6ccccc6c45)cc3)cc2)cc1]

-continued
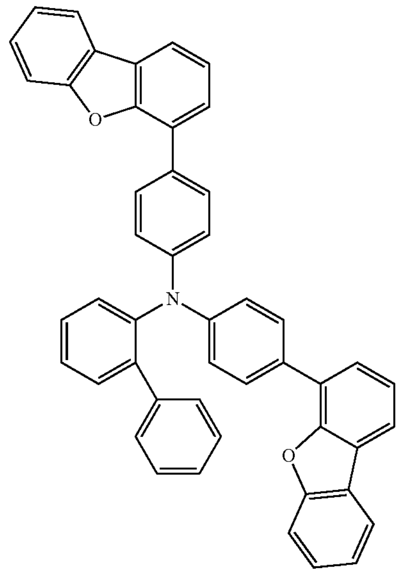 [SMILES: c1ccc(-c2ccccc2N(c2ccc(-c3cccc4c3oc3ccccc34)cc2)c2ccc(-c3cccc4c3oc3ccccc34)cc2)cc1]
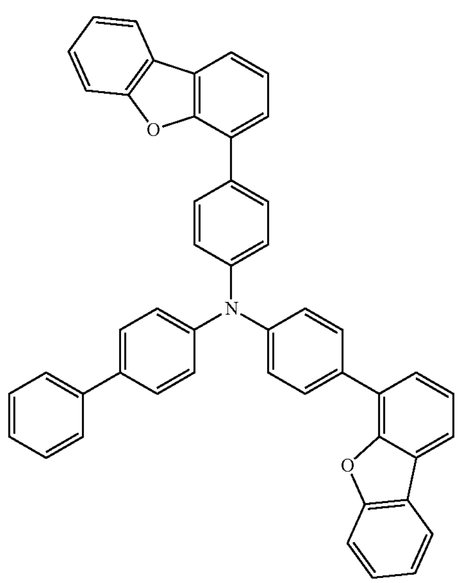 [SMILES: c1ccc(-c2ccc(N(c3ccc(-c4cccc5c4oc4ccccc45)cc3)c3ccc(-c4cccc5c4oc4ccccc45)cc3)cc2)cc1]

-continued
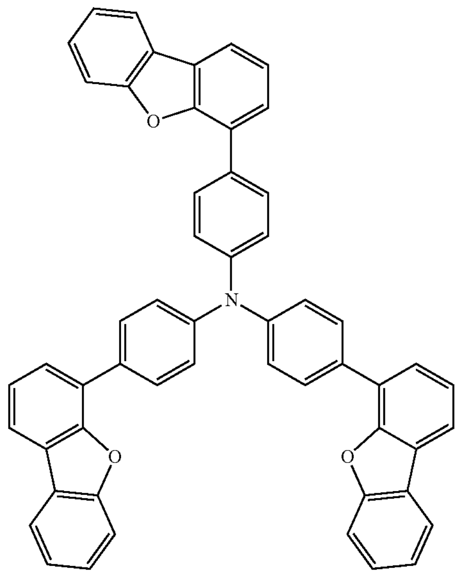 [SMILES: c1ccc2c(c1)oc1c(-c3ccc(N(c4ccc(-c5cccc6c5oc5ccccc56)cc4)c4ccc(-c5cccc6c5oc5ccccc56)cc4)cc3)cccc12]
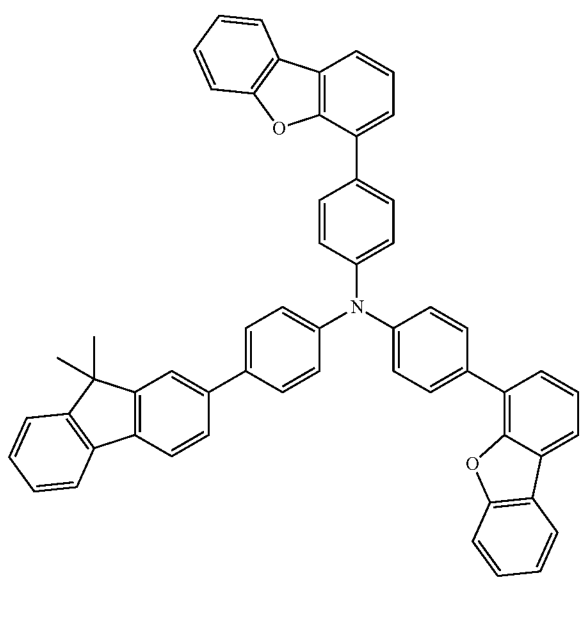 [SMILES: CC1(C)c2ccccc2-c2ccc(-c3ccc(N(c4ccc(-c5cccc6c5oc5ccccc56)cc4)c4ccc(-c5cccc6c5oc5ccccc56)cc4)cc3)cc21]

-continued
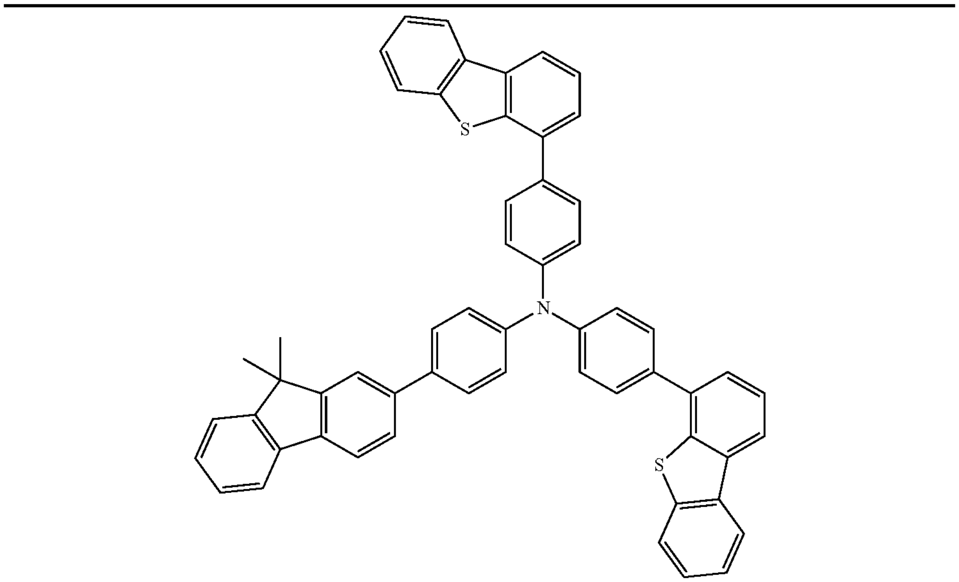
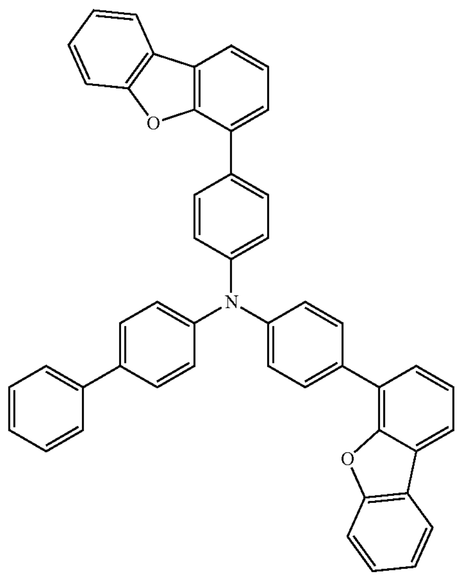 [SMILES: c1ccc(-c2ccc(N(c3ccc(-c4cccc5c4oc4ccccc45)cc3)c3ccc(-c4cccc5c4oc4ccccc45)cc3)cc2)cc1]
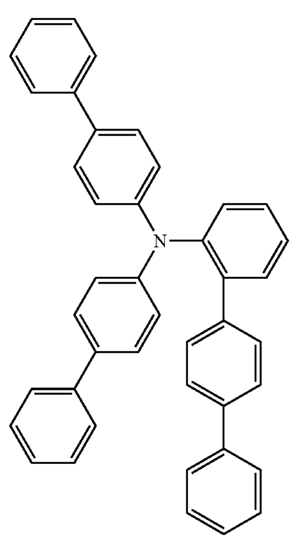 [SMILES: c1ccc(-c2ccc(-c3ccccc3N(c3ccc(-c4ccccc4)cc3)c3ccc(-c4ccccc4)cc3)cc2)cc1]

-continued
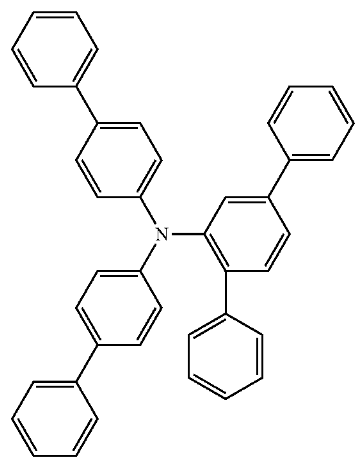 [SMILES: c1ccc(-c2ccc(N(c3ccc(-c4ccccc4)cc3)c3cc(-c4ccccc4)ccc3-c3ccccc3)cc2)cc1]
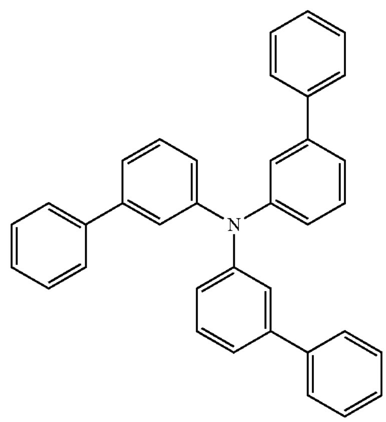 [SMILES: c1ccc(-c2cccc(N(c3cccc(-c4ccccc4)c3)c3cccc(-c4ccccc4)c3)c2)cc1]
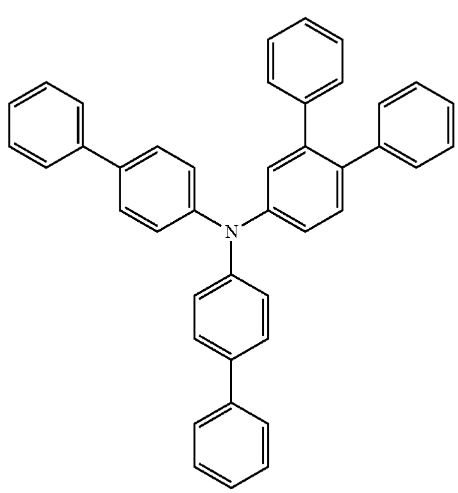 [SMILES: c1ccc(-c2ccc(N(c3ccc(-c4ccccc4)cc3)c3ccc(-c4ccccc4)c(-c4ccccc4)c3)cc2)cc1]

-continued
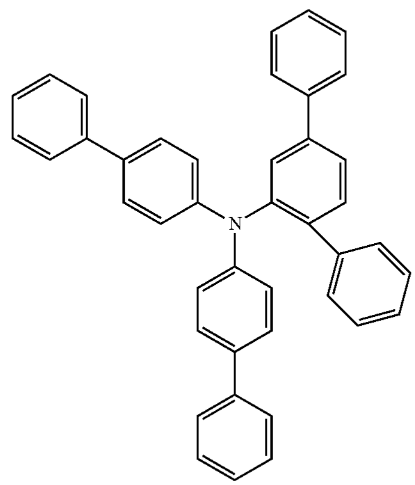 [SMILES: c1ccc(-c2ccc(N(c3ccc(-c4ccccc4)cc3)c3cc(-c4ccccc4)ccc3-c3ccccc3)cc2)cc1]
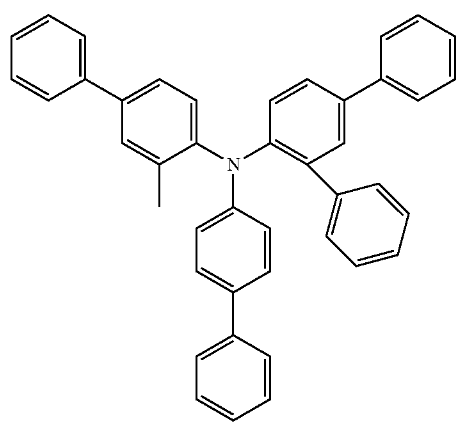 [SMILES: Cc1cc(-c2ccccc2)ccc1N(c1ccc(-c2ccccc2)cc1)c1ccc(-c2ccccc2)cc1-c1ccccc1]
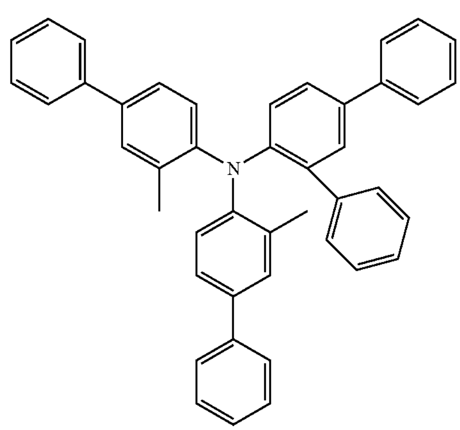 [SMILES: Cc1cc(-c2ccccc2)ccc1N(c1ccc(-c2ccccc2)cc1C)c1ccc(-c2ccccc2)cc1-c1ccccc1]

-continued
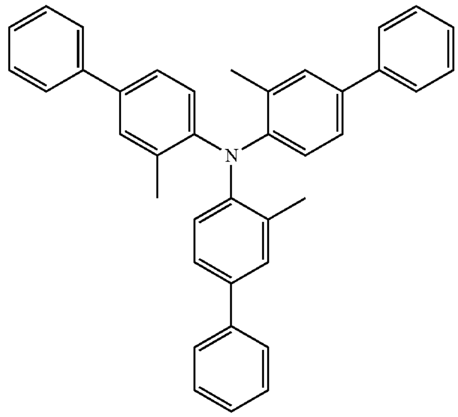 [SMILES: Cc1cc(-c2ccccc2)ccc1N(c1ccc(-c2ccccc2)cc1C)c1ccc(-c2ccccc2)cc1C]
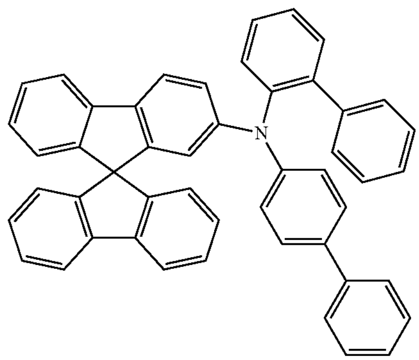 [SMILES: c1ccc(-c2ccc(N(c3ccc4c(c3)C3(c5ccccc5-c5ccccc53)c3ccccc3-4)c3ccccc3-c3ccccc3)cc2)cc1]
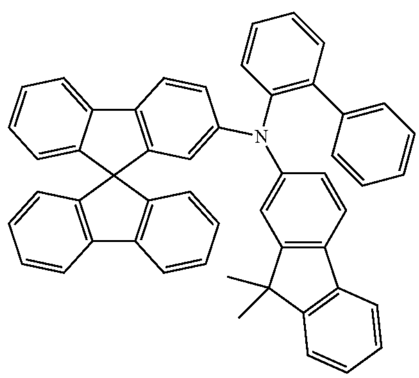 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
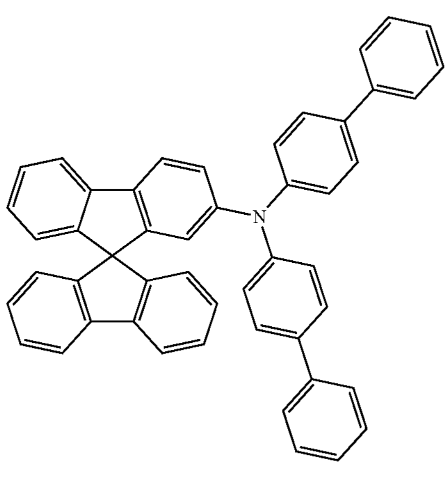 [SMILES: c1ccc(-c2ccc(N(c3ccc(-c4ccccc4)cc3)c3ccc4c(c3)C3(c5ccccc5-c5ccccc53)c3ccccc3-4)cc2)cc1]

-continued
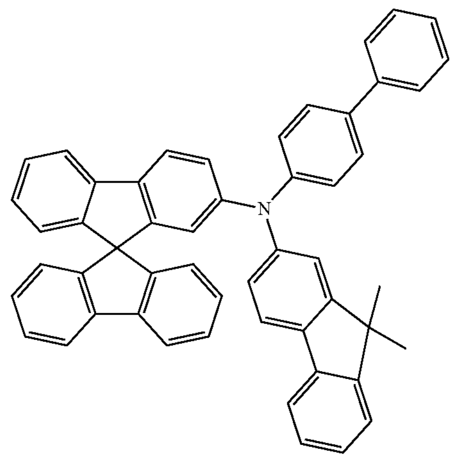 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]
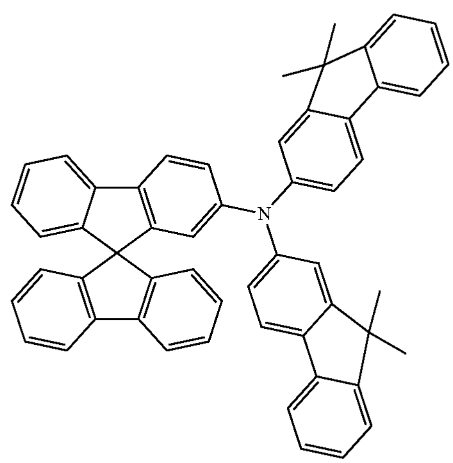 [SMILES: CC1(C)c2ccccc2-c2ccc(N(c3ccc4c(c3)C(C)(C)c3ccccc3-4)c3ccc4c(c3)C3(c5ccccc5-c5ccccc53)c3ccccc3-4)cc21]
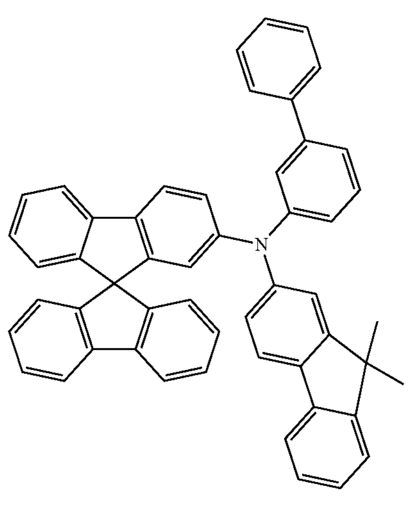 [SMILES: CC1(C)c2ccccc2-c2ccc(N(c3cccc(-c4ccccc4)c3)c3ccc4c(c3)C3(c5ccccc5-c5ccccc53)c3ccccc3-4)cc21]

-continued
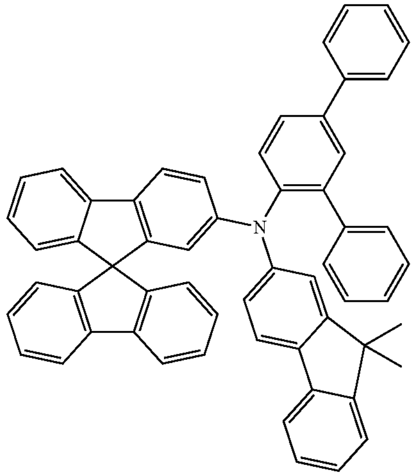 [SMILES: CC1(C)c2ccccc2-c2ccc(N(c3ccc4c(c3)C3(c5ccccc5-c5ccccc53)c3ccccc3-4)c3ccc(-c4ccccc4)cc3-c3ccccc3)cc21]
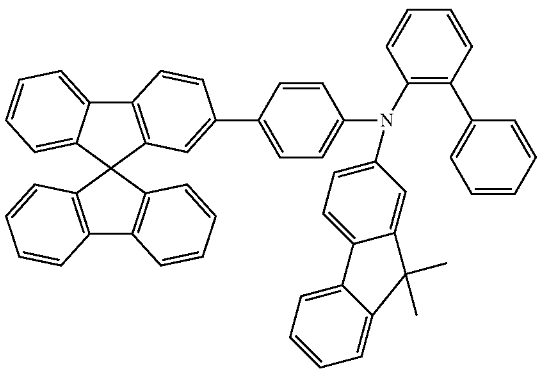 [SMILES: CC1(C)c2ccccc2-c2ccc(N(c3ccc(-c4ccc5c(c4)C4(c6ccccc6-c6ccccc64)c4ccccc4-5)cc3)c3ccccc3-c3ccccc3)cc21]
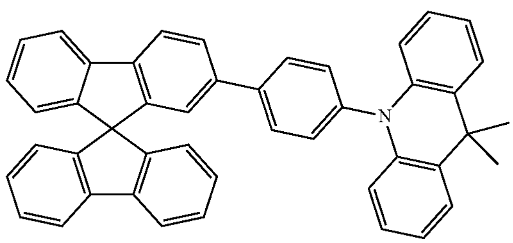 [SMILES: CC1(C)c2ccccc2N(c2ccc(-c3ccc4c(c3)C3(c5ccccc5-c5ccccc53)c3ccccc3-4)cc2)c2ccccc21]
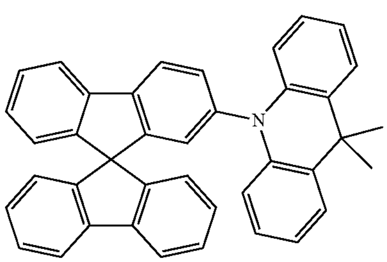 [SMILES: CC1(C)c2ccccc2N(c2ccc3c(c2)C2(c4ccccc4-c4ccccc42)c2ccccc2-3)c2ccccc21]
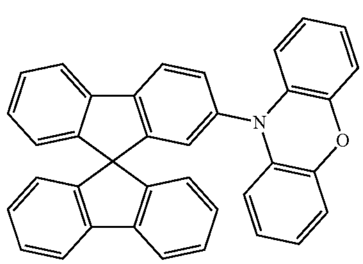 [SMILES: c1ccc2c(c1)Oc1ccccc1N2c1ccc2c(c1)C1(c3ccccc3-c3ccccc31)c1ccccc1-2]

-continued
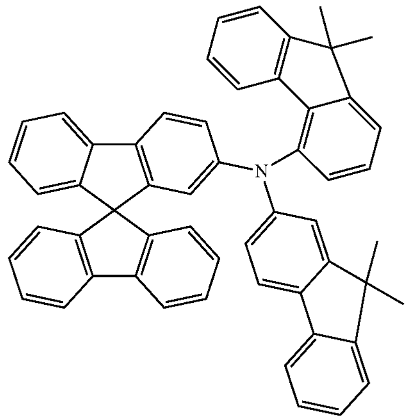 [SMILES: CC1(C)c2ccccc2-c2ccc(N(c3ccc4c(c3)C3(c5ccccc5-c5ccccc53)c3ccccc3-4)c3cccc4c3-c3ccccc3C4(C)C)cc21]
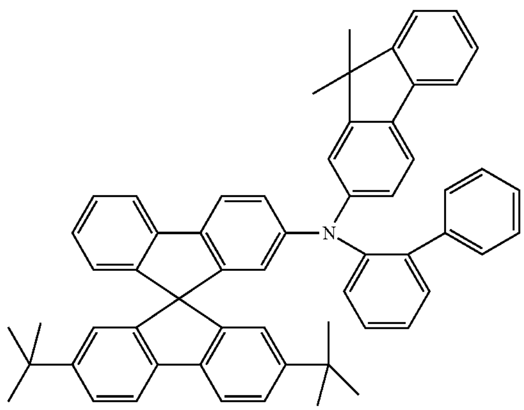 [SMILES: CC(C)(C)c1ccc2c(c1)C1(c3ccccc3-c3ccc(N(c4ccc5c(c4)C(C)(C)c4ccccc4-5)c4ccccc4-c4ccccc4)cc31)c1cc(C(C)(C)C)ccc1-2]
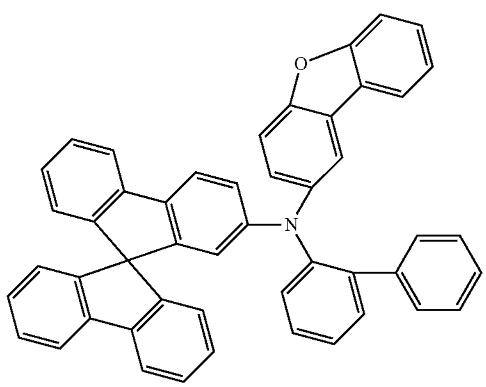 [SMILES: c1ccc(-c2ccccc2N(c2ccc3c(c2)C2(c4ccccc4-c4ccccc42)c2ccccc2-3)c2ccc3oc4ccccc4c3c2)cc1]
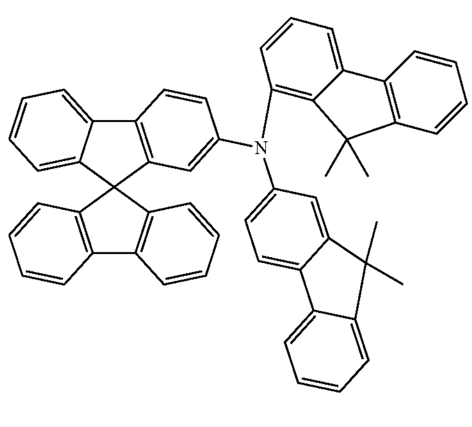 [SMILES: CC1(C)c2ccccc2-c2ccc(N(c3ccc4c(c3)C3(c5ccccc5-c5ccccc53)c3ccccc3-4)c3cccc4c3C(C)(C)c3ccccc3-4)cc21]

-continued
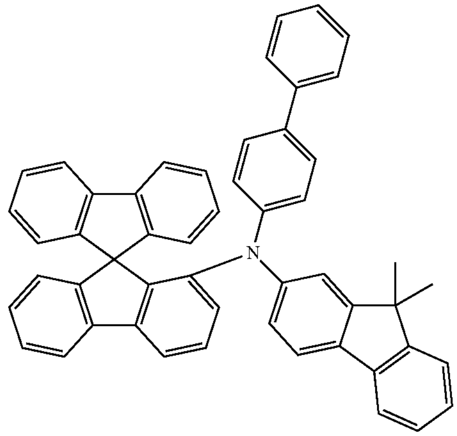 [SMILES: CC1(C)c2ccccc2-c2ccc(N(c3ccc(-c4ccccc4)cc3)c3cccc4c3C3(c5ccccc5-c5ccccc53)c3ccccc3-4)cc21]
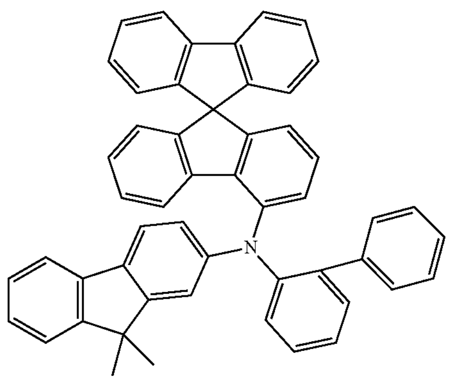 [SMILES: CC1(C)c2ccccc2-c2ccc(N(c3ccccc3-c3ccccc3)c3cccc4c3-c3ccccc3C43c4ccccc4-c4ccccc43)cc21]
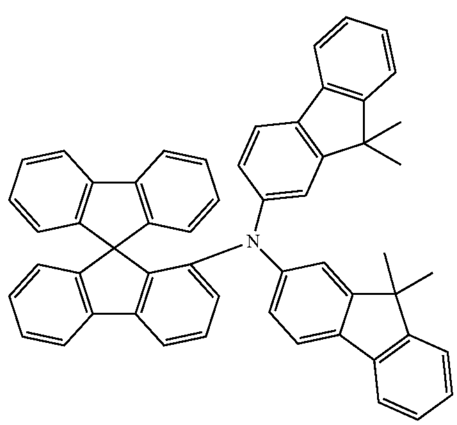 [SMILES: CC1(C)c2ccccc2-c2ccc(N(c3ccc4c(c3)C(C)(C)c3ccccc3-4)c3cccc4c3C3(c5ccccc5-c5ccccc53)c3ccccc3-4)cc21]

-continued
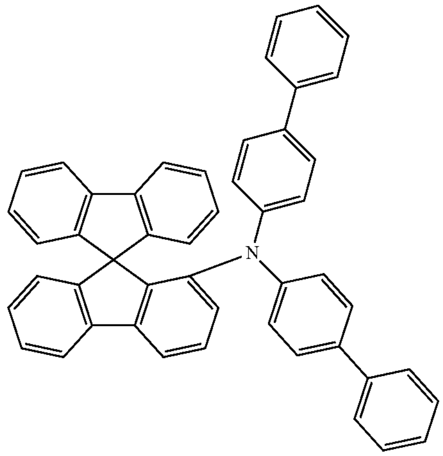 [SMILES: c1ccc(-c2ccc(N(c3ccc(-c4ccccc4)cc3)c3cccc4c3C3(c5ccccc5-c5ccccc53)c3ccccc3-4)cc2)cc1]
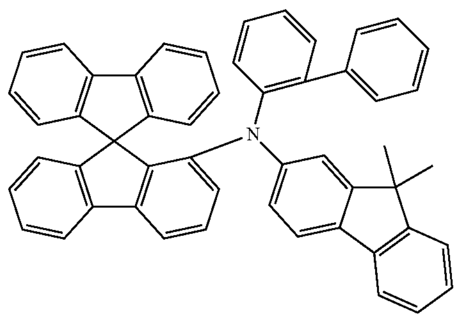 [SMILES: CC1(C)c2ccccc2-c2ccc(N(c3ccccc3-c3ccccc3)c3cccc4c3C3(c5ccccc5-c5ccccc53)c3ccccc3-4)cc21]
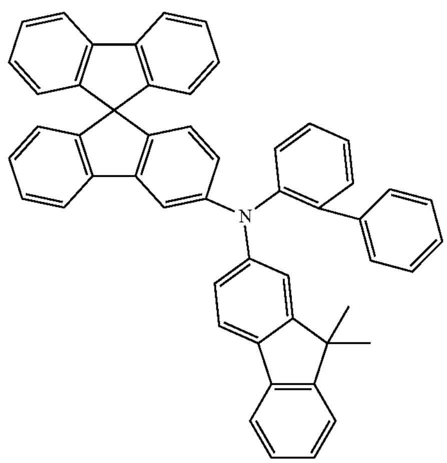 [SMILES: CC1(C)c2ccccc2-c2ccc(N(c3ccc4c(c3)-c3ccccc3C43c4ccccc4-c4ccccc43)c3ccccc3-c3ccccc3)cc21]

-continued
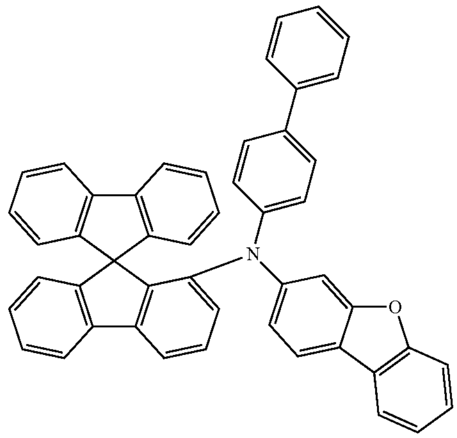 [SMILES: c1ccc(-c2ccc(N(c3ccc4c(c3)oc3ccccc34)c3cccc4c3C3(c5ccccc5-c5ccccc53)c3ccccc3-4)cc2)cc1]
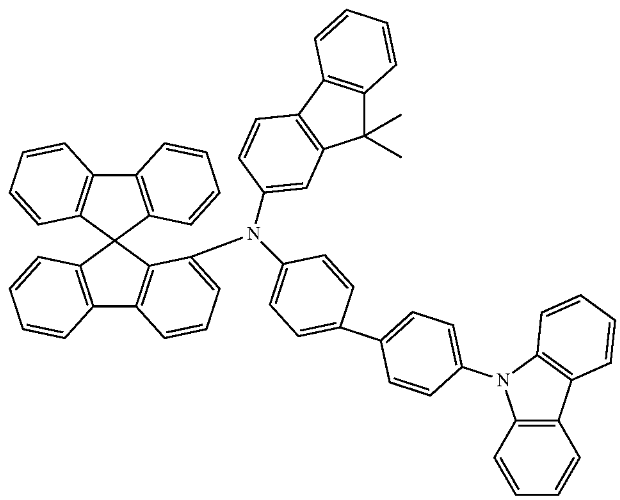 [SMILES: CC1(C)c2ccccc2-c2ccc(N(c3ccc(-c4ccc(-n5c6ccccc6c6ccccc65)cc4)cc3)c3cccc4c3C3(c5ccccc5-c5ccccc53)c3ccccc3-4)cc21]
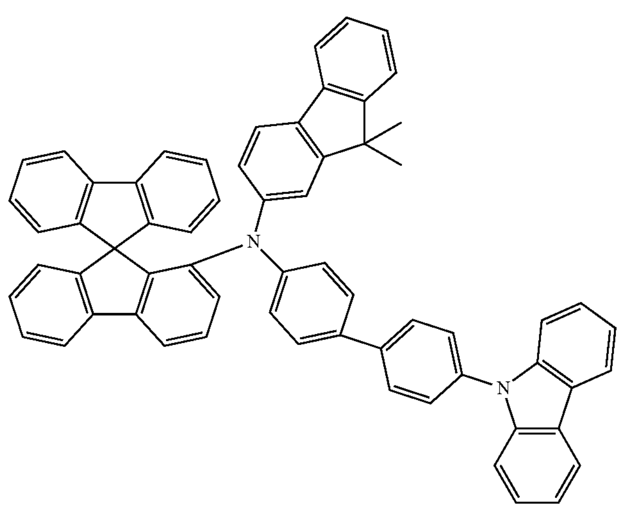 [SMILES: CC1(C)c2ccccc2-c2ccc(N(c3ccc(-c4ccc(-n5c6ccccc6c6ccccc65)cc4)cc3)c3cccc4c3C3(c5ccccc5-c5ccccc53)c3ccccc3-4)cc21]

-continued
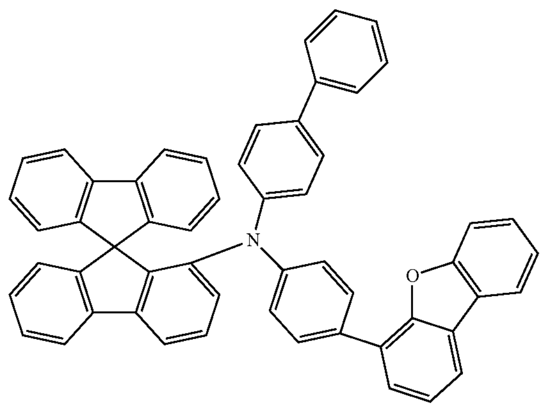 [SMILES: c1ccc(-c2ccc(N(c3ccc(-c4cccc5c4oc4ccccc45)cc3)c3cccc4c3C3(c5ccccc5-c5ccccc53)c3ccccc3-4)cc2)cc1]
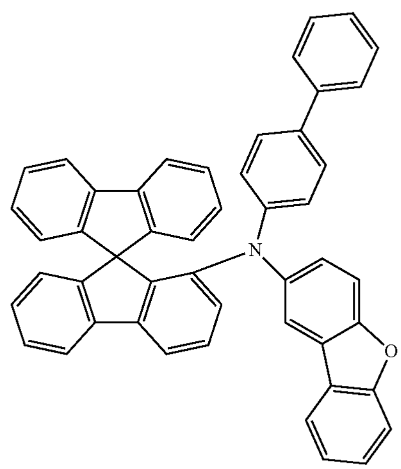 [SMILES: c1ccc(-c2ccc(N(c3ccc4oc5ccccc5c4c3)c3cccc4c3C3(c5ccccc5-c5ccccc53)c3ccccc3-4)cc2)cc1]
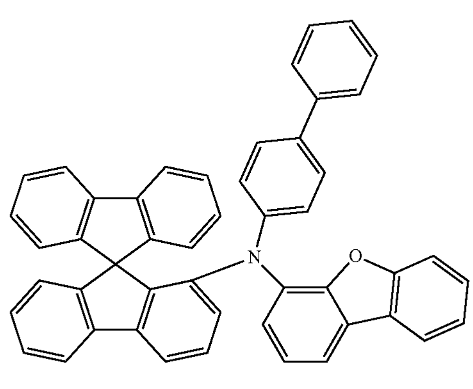 [SMILES: c1ccc(-c2ccc(N(c3cccc4c3C3(c5ccccc5-c5ccccc53)c3ccccc3-4)c3cccc4c3oc3ccccc34)cc2)cc1]

-continued
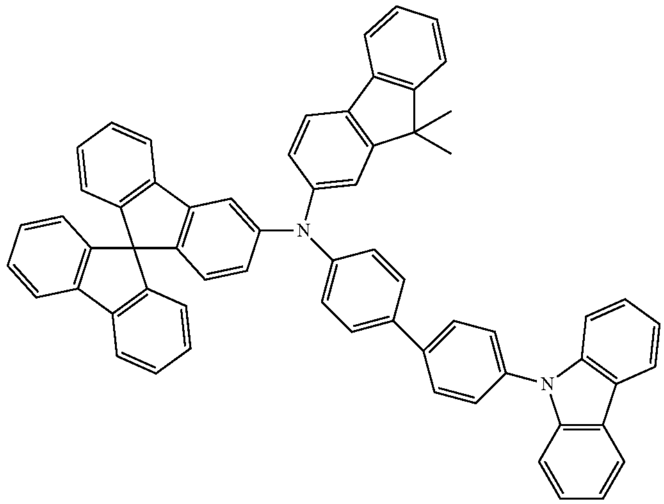 [SMILES: CC1(C)c2ccccc2-c2ccc(N(c3ccc(-c4ccc(-n5c6ccccc6c6ccccc65)cc4)cc3)c3ccc4c(c3)-c3ccccc3C43c4ccccc4-c4ccccc43)cc21]
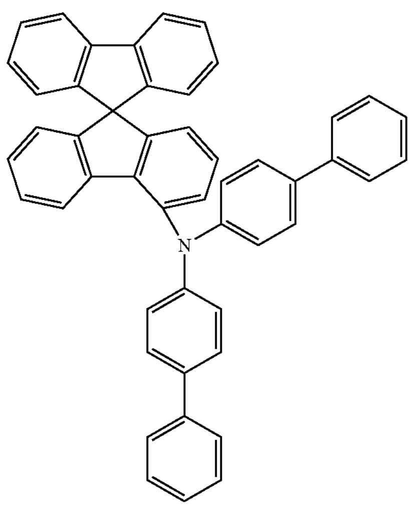 [SMILES: c1ccc(-c2ccc(N(c3ccc(-c4ccccc4)cc3)c3cccc4c3-c3ccccc3C43c4ccccc4-c4ccccc43)cc2)cc1]
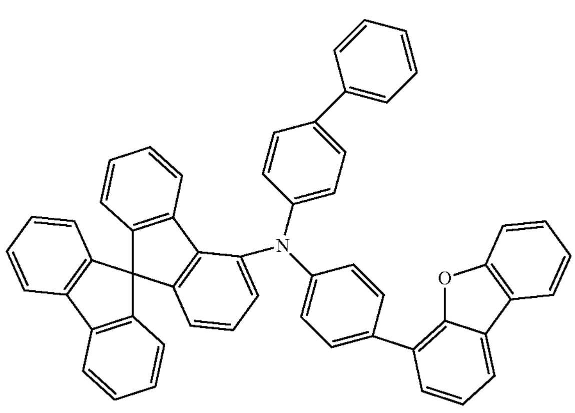 [SMILES: c1ccc(-c2ccc(N(c3ccc(-c4cccc5c4oc4ccccc45)cc3)c3cccc4c3-c3ccccc3C43c4ccccc4-c4ccccc43)cc2)cc1]

-continued
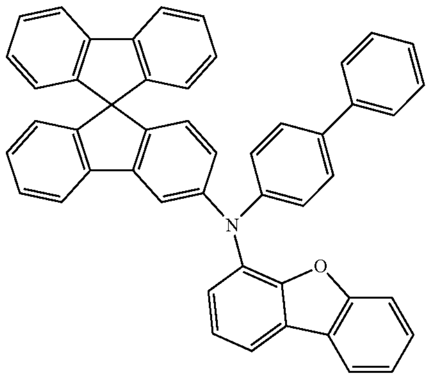 [SMILES: c1ccc(-c2ccc(N(c3ccc4c(c3)-c3ccccc3C43c4ccccc4-c4ccccc43)c3cccc4c3oc3ccccc34)cc2)cc1]
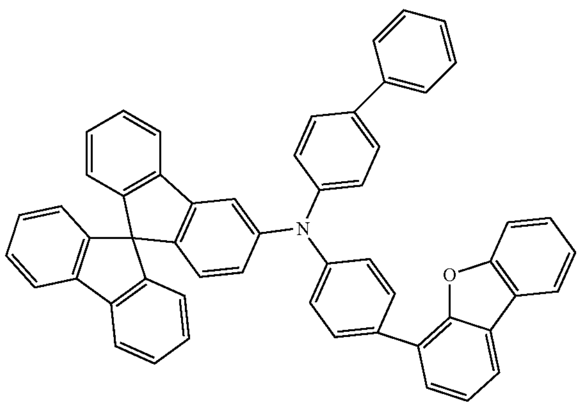 [SMILES: c1ccc(-c2ccc(N(c3ccc(-c4cccc5c4oc4ccccc45)cc3)c3ccc4c(c3)-c3ccccc3C43c4ccccc4-c4ccccc43)cc2)cc1]
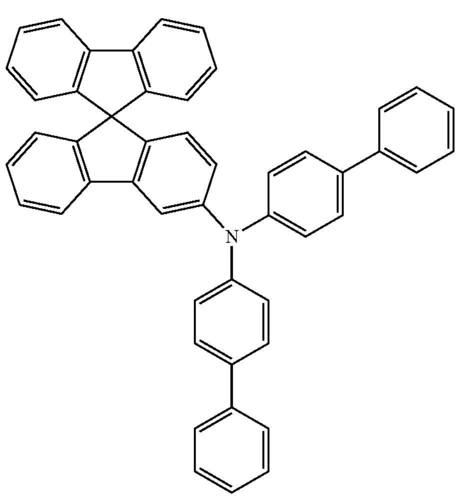 [SMILES: c1ccc(-c2ccc(N(c3ccc(-c4ccccc4)cc3)c3ccc4c(c3)-c3ccccc3C43c4ccccc4-c4ccccc43)cc2)cc1]

-continued
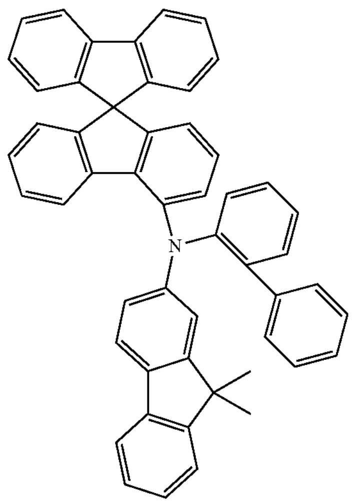 [SMILES: CC1(C)c2ccccc2-c2ccc(N(c3ccccc3-c3ccccc3)c3cccc4c3-c3ccccc3C43c4ccccc4-c4ccccc43)cc21]
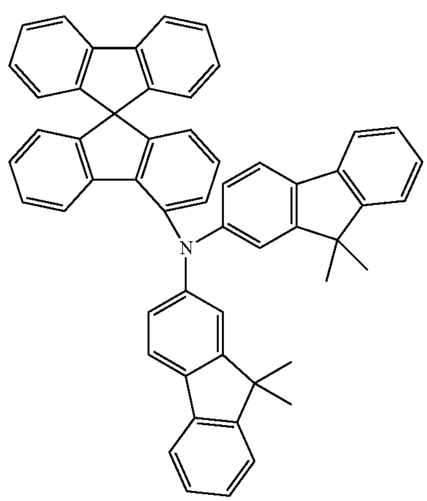 [SMILES: CC1(C)c2ccccc2-c2ccc(N(c3ccc4c(c3)C(C)(C)c3ccccc3-4)c3cccc4c3-c3ccccc3C43c4ccccc4-c4ccccc43)cc21]
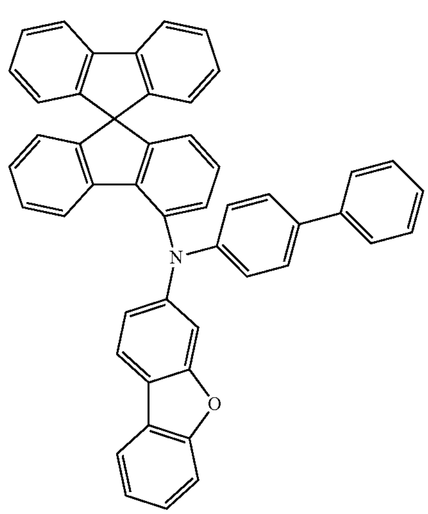 [SMILES: c1ccc(-c2ccc(N(c3ccc4c(c3)oc3ccccc34)c3cccc4c3-c3ccccc3C43c4ccccc4-c4ccccc43)cc2)cc1]

-continued
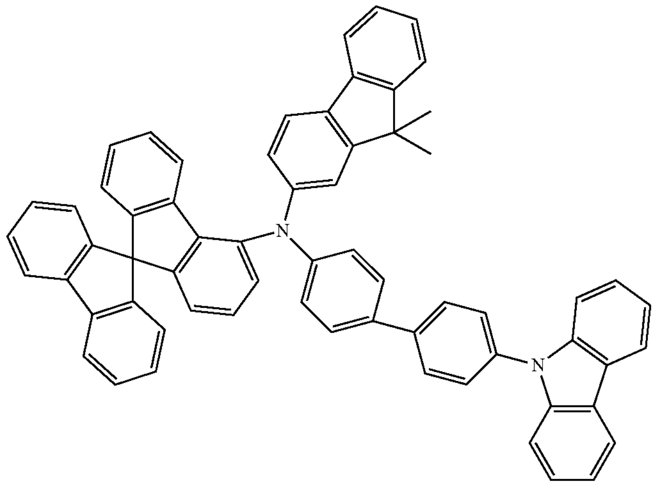 [SMILES: CC1(C)c2ccccc2-c2ccc(N(c3ccc(-c4ccc(-n5c6ccccc6c6ccccc65)cc4)cc3)c3cccc4c3-c3ccccc3C43c4ccccc4-c4ccccc43)cc21]
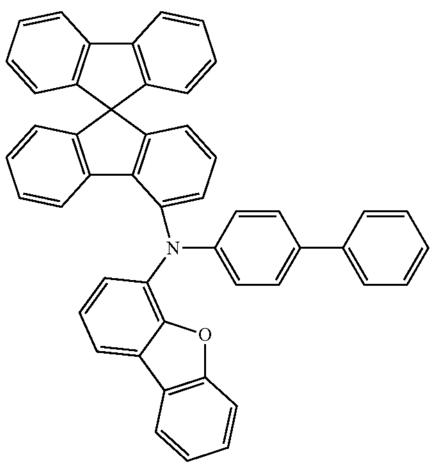 [SMILES: c1ccc(-c2ccc(N(c3cccc4c3-c3ccccc3C43c4ccccc4-c4ccccc43)c3cccc4c3oc3ccccc34)cc2)cc1]
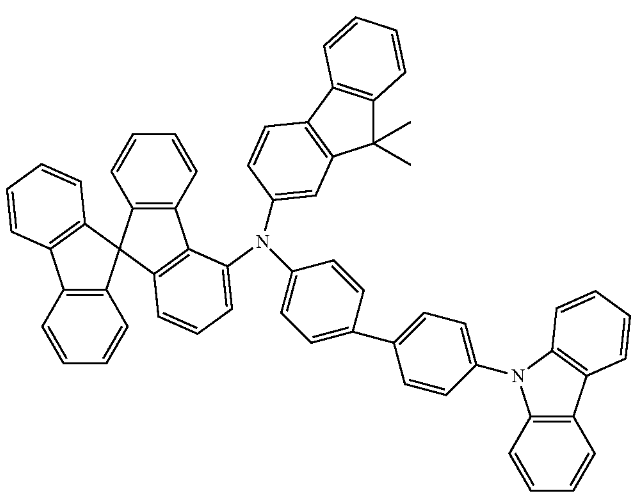 [SMILES: CC1(C)c2ccccc2-c2ccc(N(c3ccc(-c4ccc(-n5c6ccccc6c6ccccc65)cc4)cc3)c3cccc4c3-c3ccccc3C43c4ccccc4-c4ccccc43)cc21]

-continued
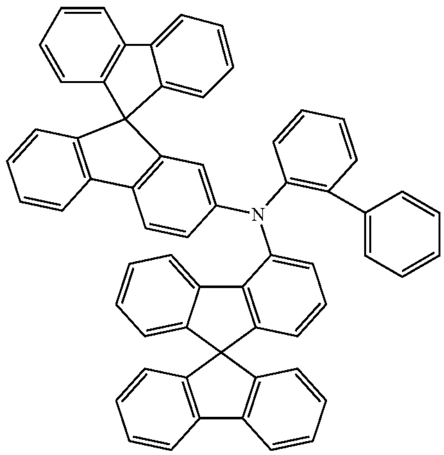 [SMILES: c1ccc(-c2ccccc2N(c2ccc3c(c2)C2(c4ccccc4-c4ccccc42)c2ccccc2-3)c2cccc3c2-c2ccccc2C32c3ccccc3-c3ccccc32)cc1]
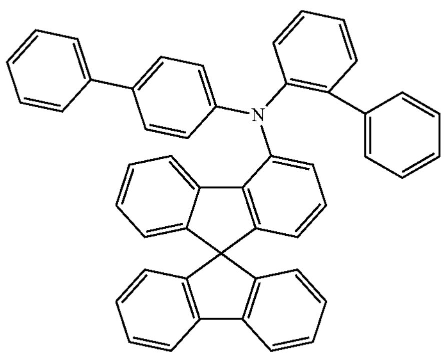 [SMILES: c1ccc(-c2ccc(N(c3ccccc3-c3ccccc3)c3cccc4c3-c3ccccc3C43c4ccccc4-c4ccccc43)cc2)cc1]
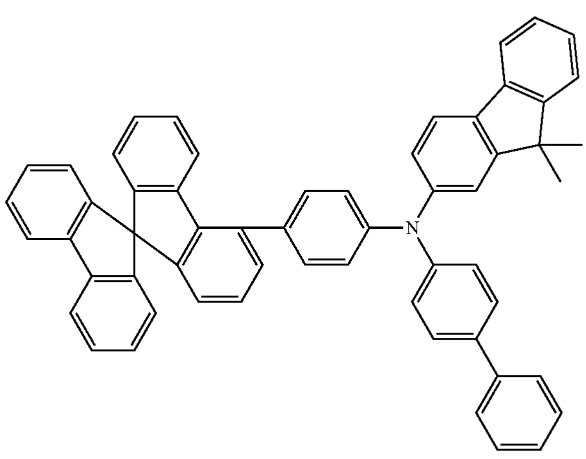 [SMILES: CC1(C)c2ccccc2-c2ccc(N(c3ccc(-c4ccccc4)cc3)c3ccc(-c4cccc5c4-c4ccccc4C54c5ccccc5-c5ccccc54)cc3)cc21]

-continued
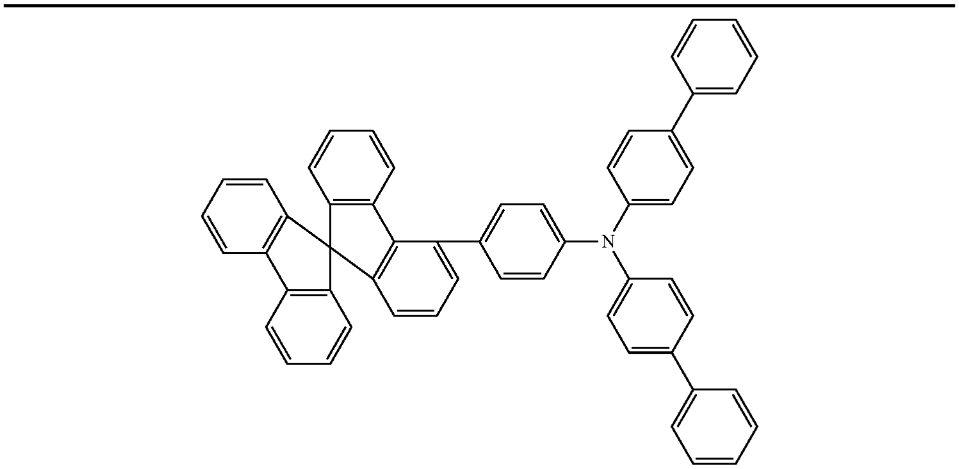
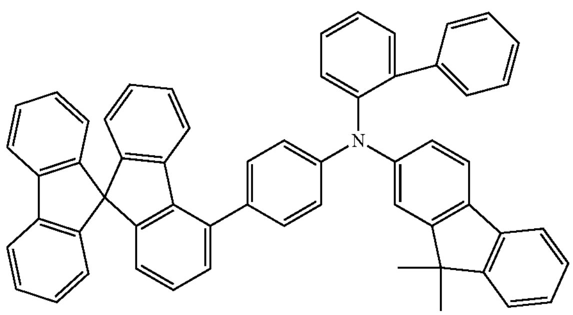 [SMILES: CC1(C)c2ccccc2-c2ccc(N(c3ccc(-c4cccc5c4-c4ccccc4C54c5ccccc5-c5ccccc54)cc3)c3ccccc3-c3ccccc3)cc21]
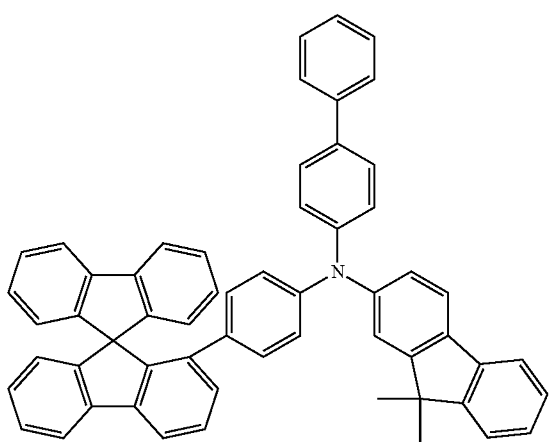 [SMILES: CC1(C)c2ccccc2-c2ccc(N(c3ccc(-c4ccccc4)cc3)c3ccc(-c4cccc5c4C4(c6ccccc6-c6ccccc64)c4ccccc4-5)cc3)cc21]
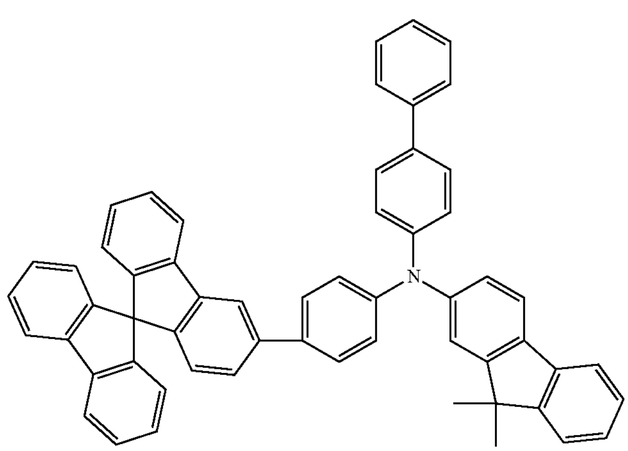 [SMILES: CC1(C)c2ccccc2-c2ccc(N(c3ccc(-c4ccccc4)cc3)c3ccc(-c4ccc5c(c4)-c4ccccc4C54c5ccccc5-c5ccccc54)cc3)cc21]

-continued
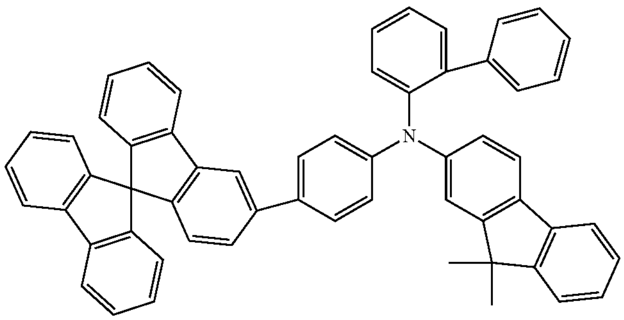 [SMILES: CC1(C)c2ccccc2-c2ccc(N(c3ccc(-c4ccc5c(c4)-c4ccccc4C54c5ccccc5-c5ccccc54)cc3)c3ccccc3-c3ccccc3)cc21]
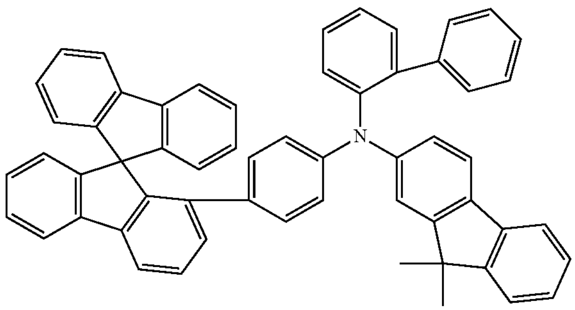 [SMILES: CC1(C)c2ccccc2-c2ccc(N(c3ccc(-c4cccc5c4C4(c6ccccc6-c6ccccc64)c4ccccc4-5)cc3)c3ccccc3-c3ccccc3)cc21]
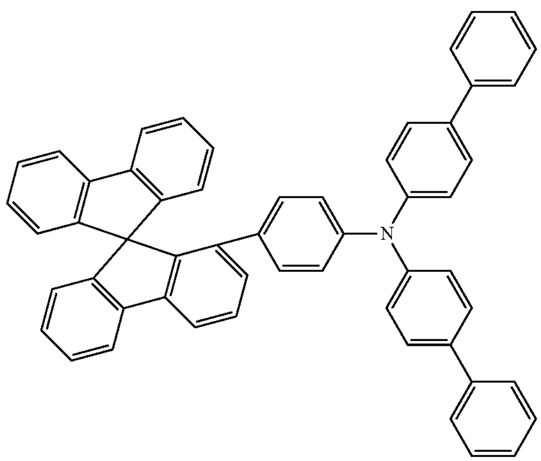 [SMILES: c1ccc(-c2ccc(N(c3ccc(-c4ccccc4)cc3)c3ccc(-c4cccc5c4C4(c6ccccc6-c6ccccc64)c4ccccc4-5)cc3)cc2)cc1]
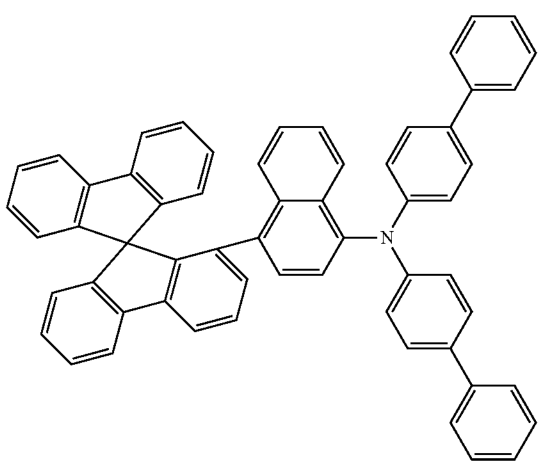 [SMILES: c1ccc(-c2ccc(N(c3ccc(-c4ccccc4)cc3)c3ccc(-c4cccc5c4C4(c6ccccc6-c6ccccc64)c4ccccc4-5)c4ccccc34)cc2)cc1]

-continued
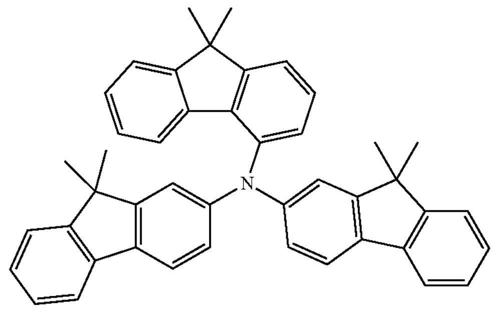 [SMILES: CC1(C)c2ccccc2-c2ccc(N(c3ccc4c(c3)C(C)(C)c3ccccc3-4)c3cccc4c3-c3ccccc3C4(C)C)cc21]
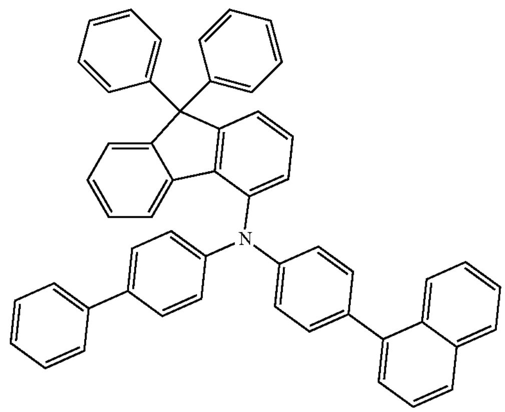 [SMILES: c1ccc(-c2ccc(N(c3ccc(-c4cccc5ccccc45)cc3)c3cccc4c3-c3ccccc3C4(c3ccccc3)c3ccccc3)cc2)cc1]
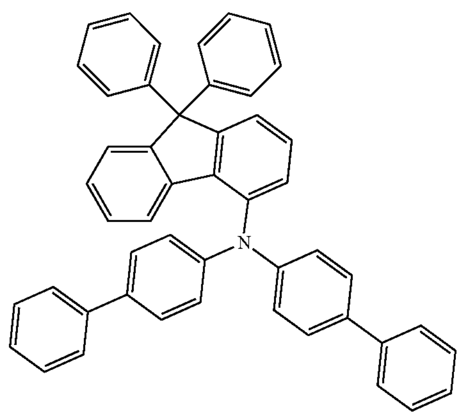 [SMILES: c1ccc(-c2ccc(N(c3ccc(-c4ccccc4)cc3)c3cccc4c3-c3ccccc3C4(c3ccccc3)c3ccccc3)cc2)cc1]
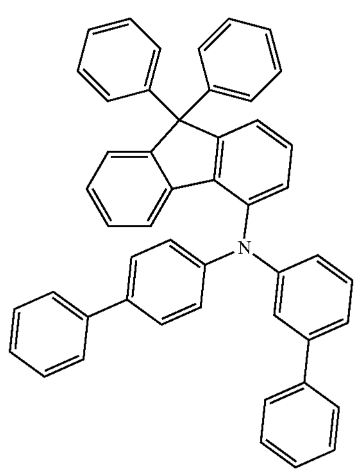 [SMILES: c1ccc(-c2ccc(N(c3cccc(-c4ccccc4)c3)c3cccc4c3-c3ccccc3C4(c3ccccc3)c3ccccc3)cc2)cc1]

-continued
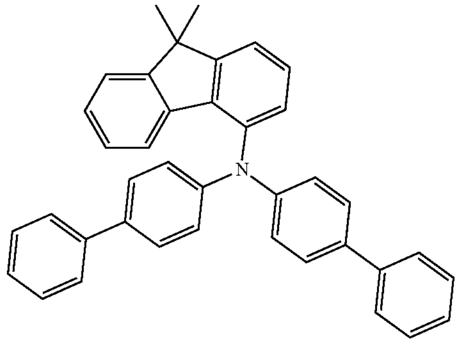 [SMILES: CC1(C)c2ccccc2-c2c(N(c3ccc(-c4ccccc4)cc3)c3ccc(-c4ccccc4)cc3)cccc21]
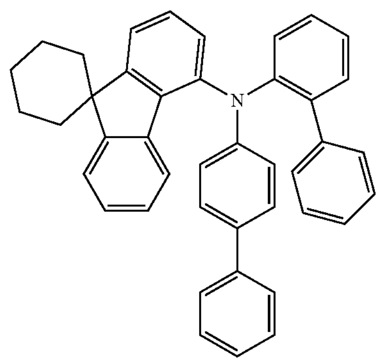 [SMILES: c1ccc(-c2ccc(N(c3ccccc3-c3ccccc3)c3cccc4c3-c3ccccc3C43CCCCC3)cc2)cc1]
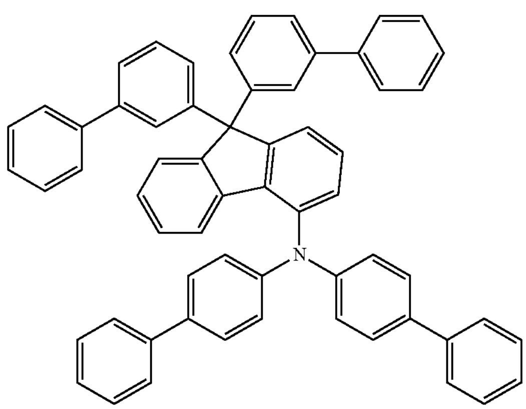 [SMILES: c1ccc(-c2ccc(N(c3ccc(-c4ccccc4)cc3)c3cccc4c3-c3ccccc3C4(c3cccc(-c4ccccc4)c3)c3cccc(-c4ccccc4)c3)cc2)cc1]
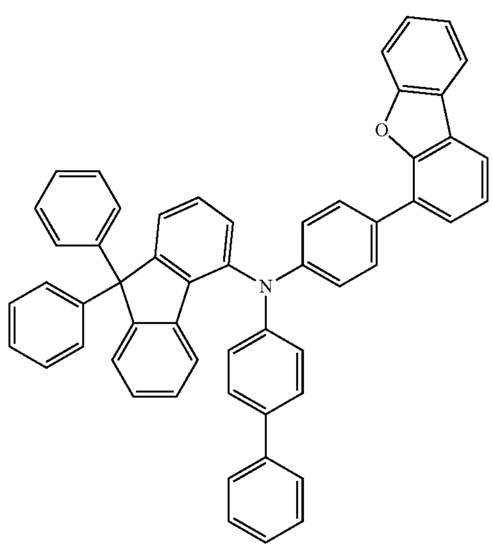 [SMILES: c1ccc(-c2ccc(N(c3ccc(-c4cccc5c4oc4ccccc45)cc3)c3cccc4c3-c3ccccc3C4(c3ccccc3)c3ccccc3)cc2)cc1]

-continued
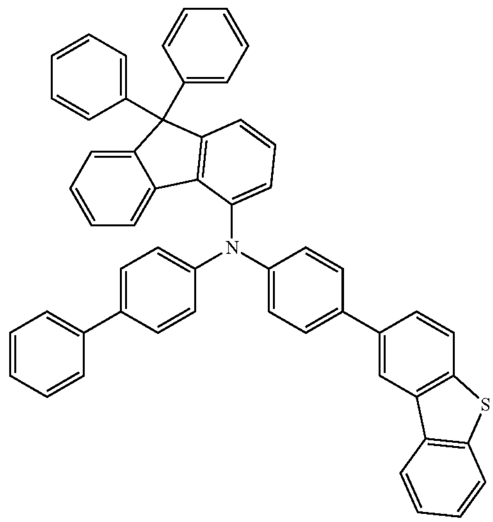 [SMILES: c1ccc(-c2ccc(N(c3ccc(-c4ccc5sc6ccccc6c5c4)cc3)c3cccc4c3-c3ccccc3C4(c3ccccc3)c3ccccc3)cc2)cc1]
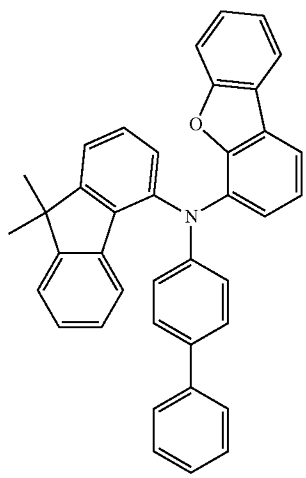 [SMILES: CC1(C)c2ccccc2-c2c(N(c3ccc(-c4ccccc4)cc3)c3cccc4c3oc3ccccc34)cccc21]
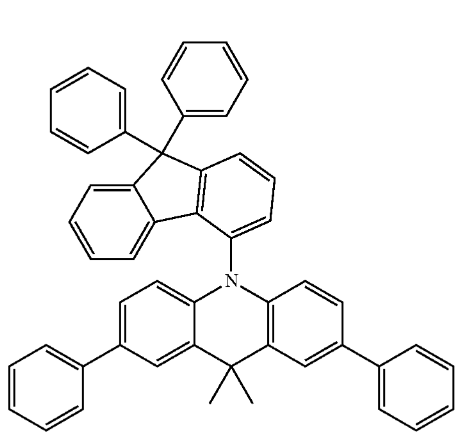 [SMILES: CC1(C)c2cc(-c3ccccc3)ccc2N(c2cccc3c2-c2ccccc2C3(c2ccccc2)c2ccccc2)c2ccc(-c3ccccc3)cc21]

-continued
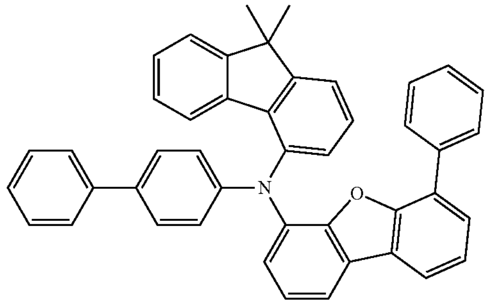 [SMILES: CC1(C)c2ccccc2-c2c(N(c3ccc(-c4ccccc4)cc3)c3cccc4c3oc3c(-c5ccccc5)cccc34)cccc21]
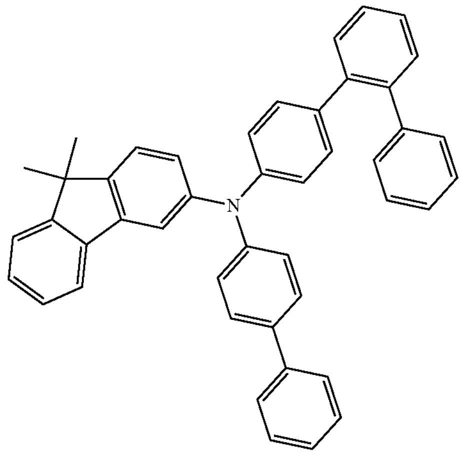 [SMILES: CC1(C)c2ccccc2-c2cc(N(c3ccc(-c4ccccc4)cc3)c3ccc(-c4ccccc4-c4ccccc4)cc3)ccc21]
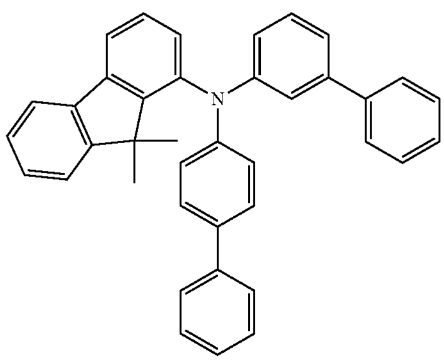 [SMILES: CC1(C)c2ccccc2-c2cccc(N(c3ccc(-c4ccccc4)cc3)c3cccc(-c4ccccc4)c3)c21]
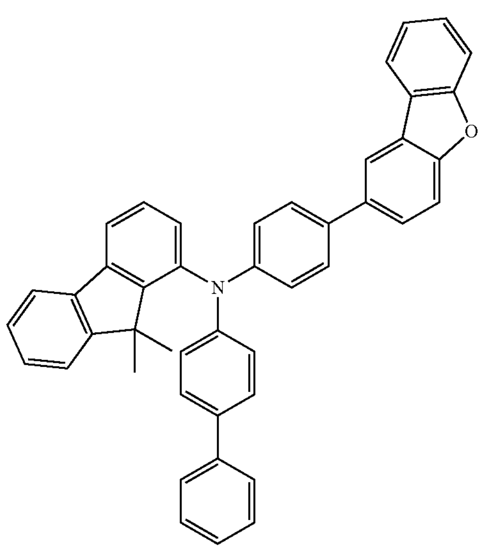 [SMILES: CC1(C)c2ccccc2-c2cccc(N(c3ccc(-c4ccccc4)cc3)c3ccc(-c4ccc5oc6ccccc6c5c4)cc3)c21]

-continued
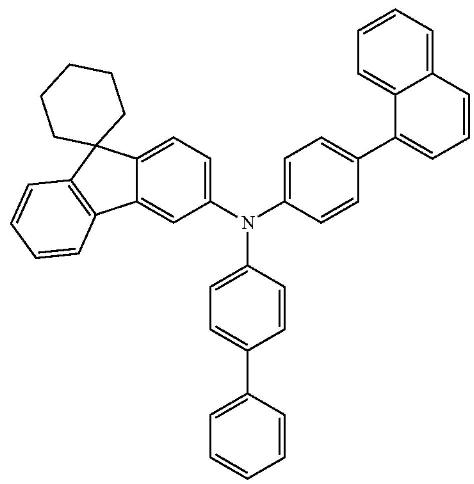 [SMILES: c1ccc(-c2ccc(N(c3ccc(-c4cccc5ccccc45)cc3)c3ccc4c(c3)-c3ccccc3C43CCCCC3)cc2)cc1]
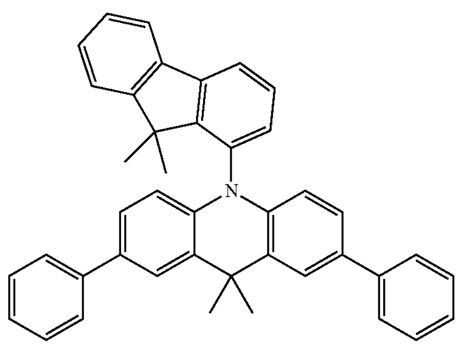 [SMILES: CC1(C)c2cc(-c3ccccc3)ccc2N(c2cccc3c2C(C)(C)c2ccccc2-3)c2ccc(-c3ccccc3)cc21]
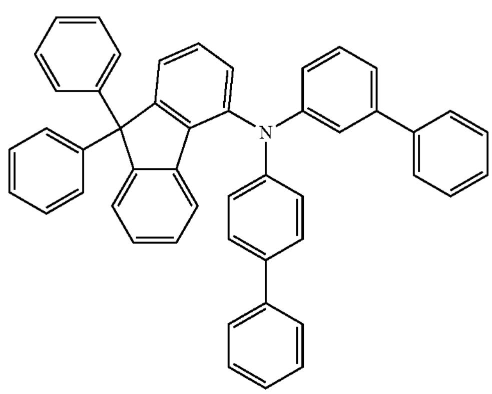 [SMILES: c1ccc(-c2ccc(N(c3cccc(-c4ccccc4)c3)c3cccc4c3-c3ccccc3C4(c3ccccc3)c3ccccc3)cc2)cc1]

-continued
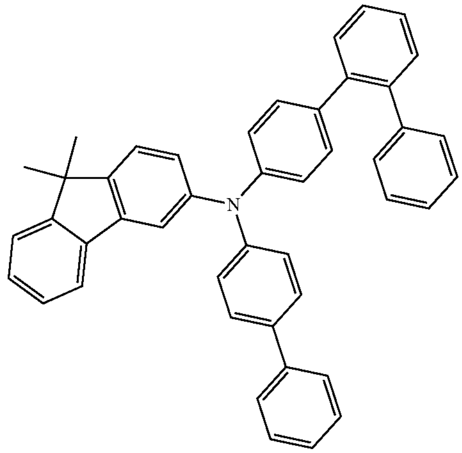 [SMILES: CC1(C)c2ccccc2-c2cc(N(c3ccc(-c4ccccc4)cc3)c3ccc(-c4ccccc4-c4ccccc4)cc3)ccc21]
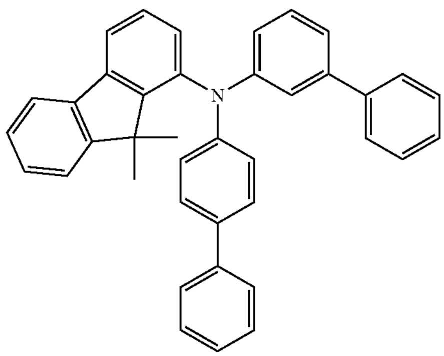 [SMILES: CC1(C)c2ccccc2-c2cccc(N(c3ccc(-c4ccccc4)cc3)c3cccc(-c4ccccc4)c3)c21]
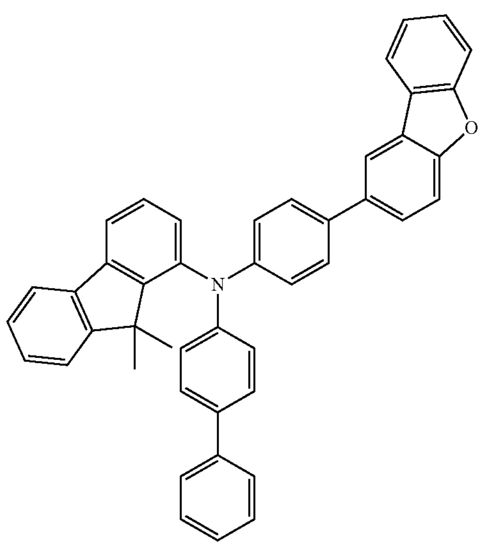 [SMILES: CC1(C)c2ccccc2-c2cccc(N(c3ccc(-c4ccccc4)cc3)c3ccc(-c4ccc5oc6ccccc6c5c4)cc3)c21]

-continued
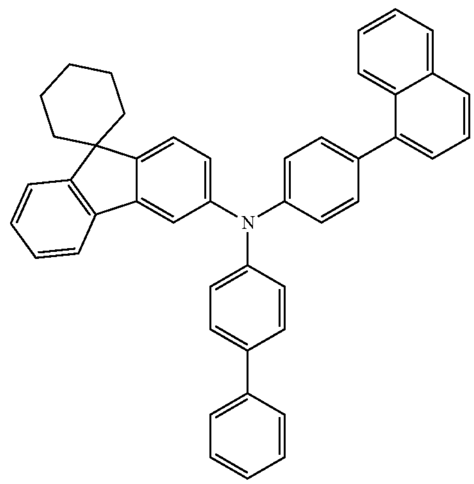 [SMILES: c1ccc(-c2ccc(N(c3ccc(-c4cccc5ccccc45)cc3)c3ccc4c(c3)-c3ccccc3C43CCCCC3)cc2)cc1]
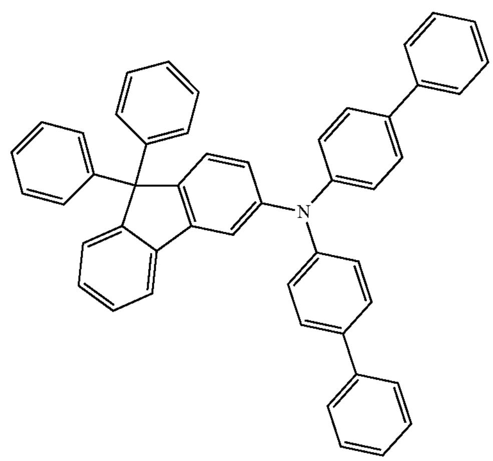 [SMILES: c1ccc(-c2ccc(N(c3ccc(-c4ccccc4)cc3)c3ccc4c(c3)-c3ccccc3C4(c3ccccc3)c3ccccc3)cc2)cc1]
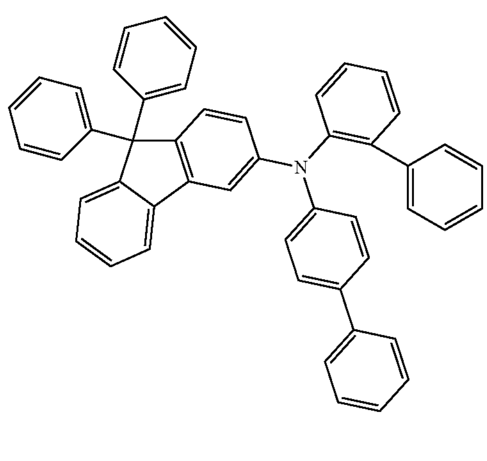 [SMILES: c1ccc(-c2ccc(N(c3ccc4c(c3)-c3ccccc3C4(c3ccccc3)c3ccccc3)c3ccccc3-c3ccccc3)cc2)cc1]

-continued
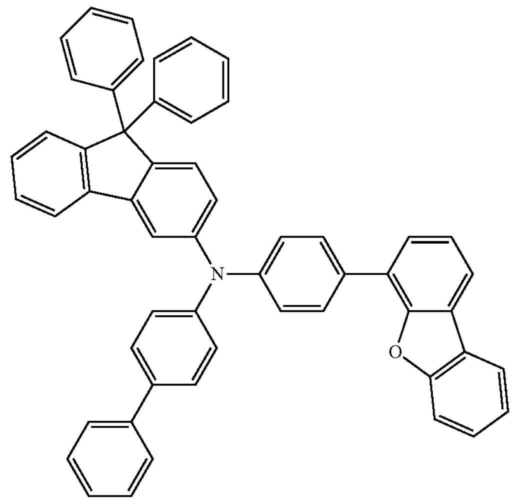 [SMILES: c1ccc(-c2ccc(N(c3ccc(-c4cccc5c4oc4ccccc45)cc3)c3ccc4c(c3)-c3ccccc3C4(c3ccccc3)c3ccccc3)cc2)cc1]
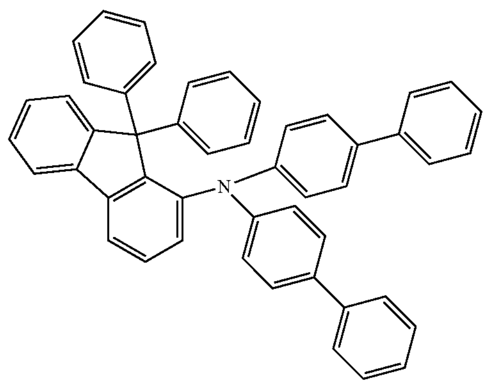 [SMILES: c1ccc(-c2ccc(N(c3ccc(-c4ccccc4)cc3)c3cccc4c3C(c3ccccc3)(c3ccccc3)c3ccccc3-4)cc2)cc1]
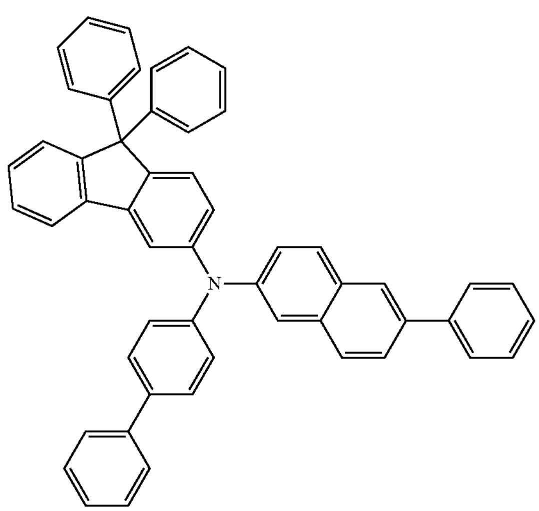 [SMILES: c1ccc(-c2ccc(N(c3ccc4c(c3)-c3ccccc3C4(c3ccccc3)c3ccccc3)c3ccc4cc(-c5ccccc5)ccc4c3)cc2)cc1]

-continued
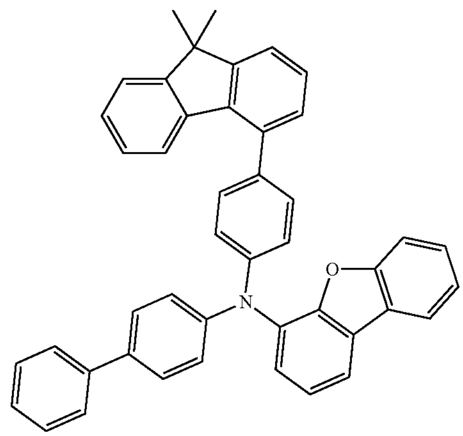 [SMILES: CC1(C)c2ccccc2-c2c(-c3ccc(N(c4ccc(-c5ccccc5)cc4)c4cccc5c4oc4ccccc45)cc3)cccc21]
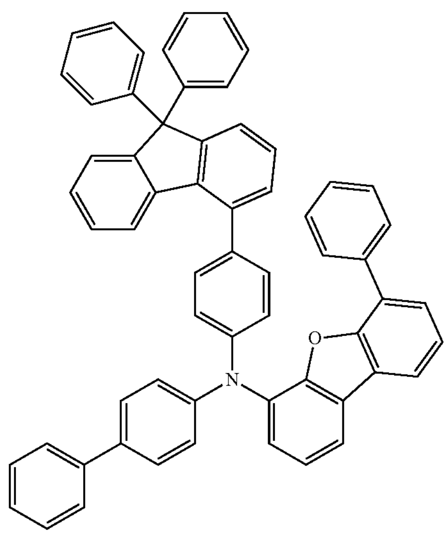 [SMILES: c1ccc(-c2ccc(N(c3ccc(-c4cccc5c4-c4ccccc4C5(c4ccccc4)c4ccccc4)cc3)c3cccc4c3oc3c(-c5ccccc5)cccc34)cc2)cc1]
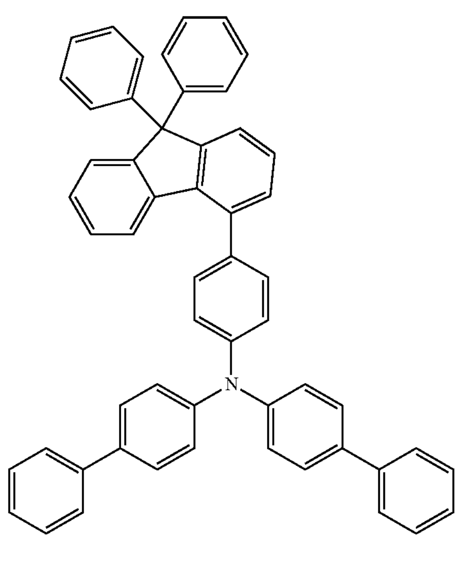 [SMILES: c1ccc(-c2ccc(N(c3ccc(-c4ccccc4)cc3)c3ccc(-c4cccc5c4-c4ccccc4C5(c4ccccc4)c4ccccc4)cc3)cc2)cc1]

-continued
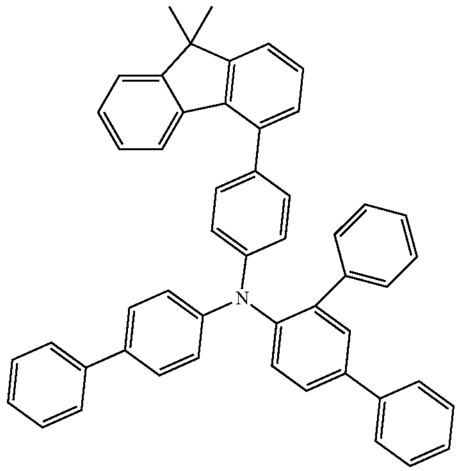 [SMILES: CC1(C)c2ccccc2-c2c(-c3ccc(N(c4ccc(-c5ccccc5)cc4)c4ccc(-c5ccccc5)cc4-c4ccccc4)cc3)cccc21]
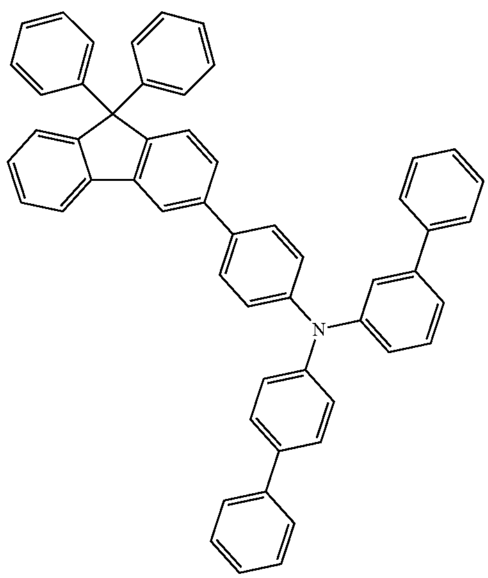 [SMILES: c1ccc(-c2ccc(N(c3ccc(-c4ccc5c(c4)-c4ccccc4C5(c4ccccc4)c4ccccc4)cc3)c3cccc(-c4ccccc4)c3)cc2)cc1]
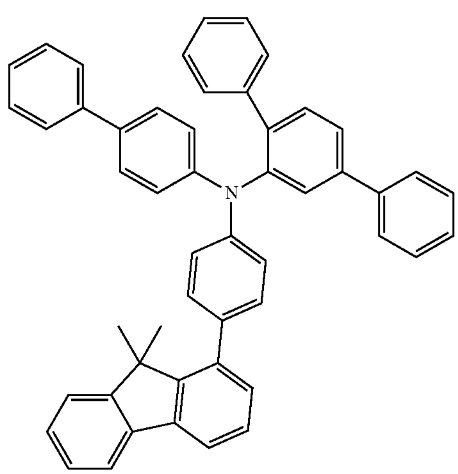 [SMILES: CC1(C)c2ccccc2-c2cccc(-c3ccc(N(c4ccc(-c5ccccc5)cc4)c4cc(-c5ccccc5)ccc4-c4ccccc4)cc3)c21]

-continued
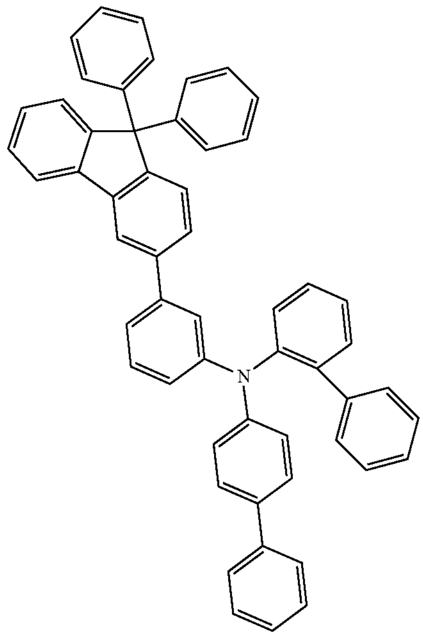 [SMILES: c1ccc(-c2ccc(N(c3cccc(-c4ccc5c(c4)-c4ccccc4C5(c4ccccc4)c4ccccc4)c3)c3ccccc3-c3ccccc3)cc2)cc1]
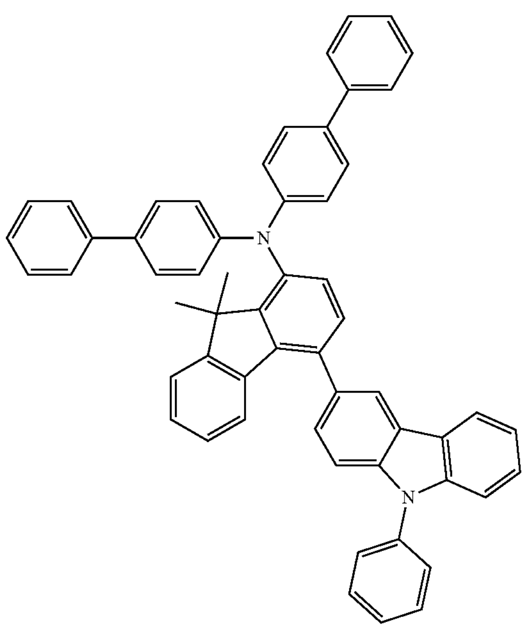 [SMILES: CC1(C)c2ccccc2-c2c(-c3ccc4c(c3)c3ccccc3n4-c3ccccc3)ccc(N(c3ccc(-c4ccccc4)cc3)c3ccc(-c4ccccc4)cc3)c21]

-continued
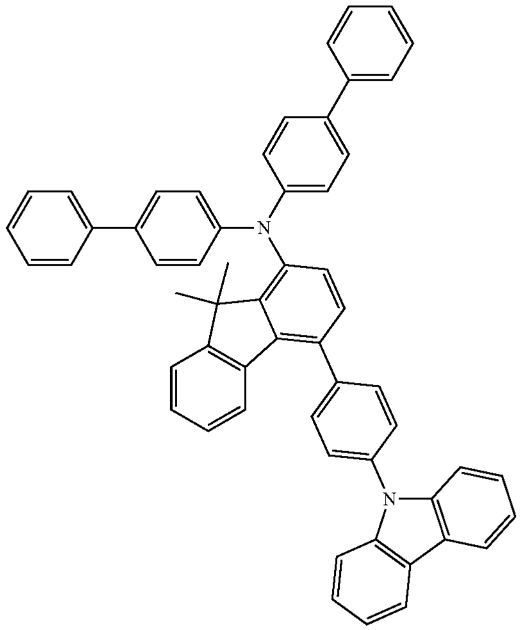 [SMILES: CC1(C)c2ccccc2-c2c(-c3ccc(-n4c5ccccc5c5ccccc54)cc3)ccc(N(c3ccc(-c4ccccc4)cc3)c3ccc(-c4ccccc4)cc3)c21]
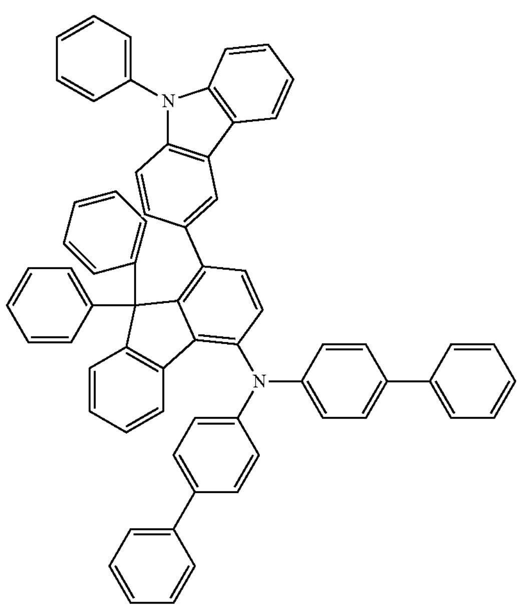 [SMILES: c1ccc(-c2ccc(N(c3ccc(-c4ccccc4)cc3)c3ccc(-c4ccc5c(c4)c4ccccc4n5-c4ccccc4)c4c3-c3ccccc3C4(c3ccccc3)c3ccccc3)cc2)cc1]

-continued
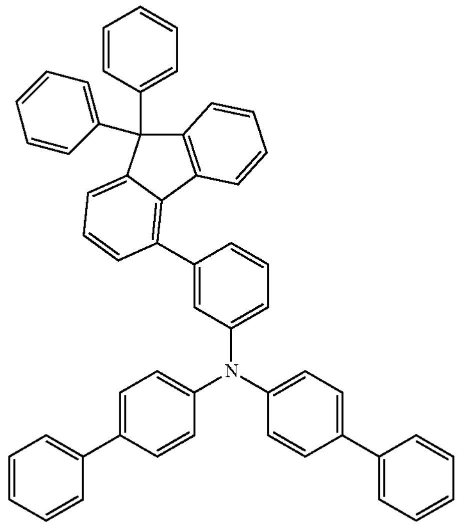 [SMILES: c1ccc(-c2ccc(N(c3ccc(-c4ccccc4)cc3)c3cccc(-c4cccc5c4-c4ccccc4C5(c4ccccc4)c4ccccc4)c3)cc2)cc1]
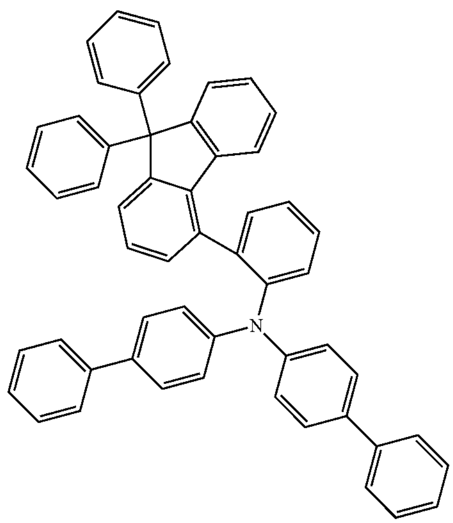 [SMILES: c1ccc(-c2ccc(N(c3ccc(-c4ccccc4)cc3)c3ccccc3-c3cccc4c3-c3ccccc3C4(c3ccccc3)c3ccccc3)cc2)cc1]
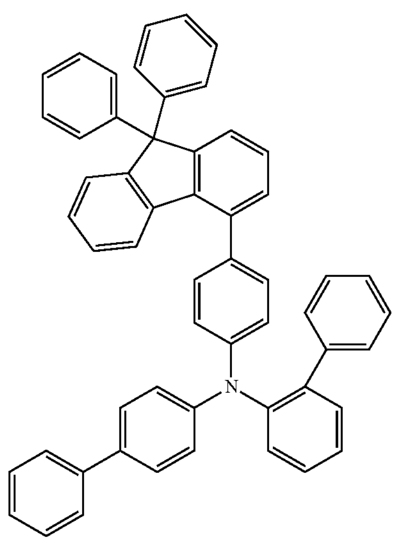 [SMILES: c1ccc(-c2ccc(N(c3ccc(-c4cccc5c4-c4ccccc4C5(c4ccccc4)c4ccccc4)cc3)c3ccccc3-c3ccccc3)cc2)cc1]

-continued
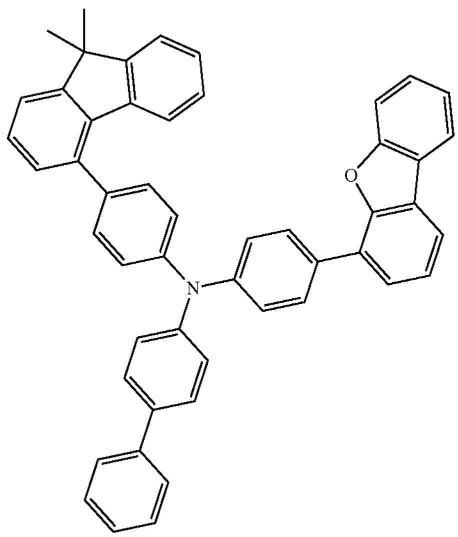 [SMILES: CC1(C)c2ccccc2-c2c(-c3ccc(N(c4ccc(-c5ccccc5)cc4)c4ccc(-c5cccc6c5oc5ccccc56)cc4)cc3)cccc21]
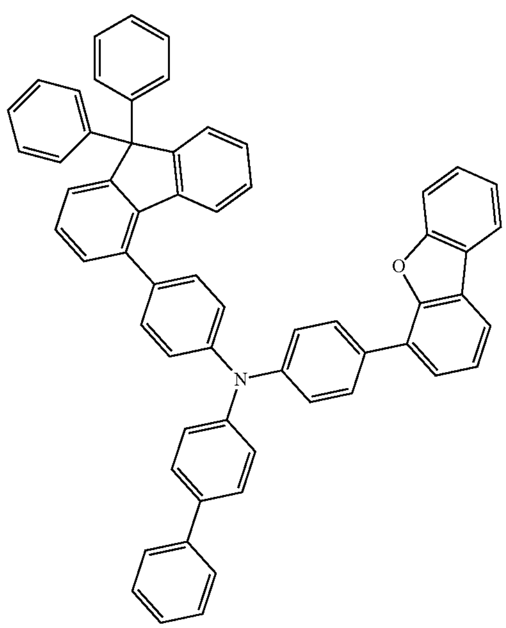 [SMILES: c1ccc(-c2ccc(N(c3ccc(-c4cccc5c4-c4ccccc4C5(c4ccccc4)c4ccccc4)cc3)c3ccc(-c4cccc5c4oc4ccccc45)cc3)cc2)cc1]

-continued
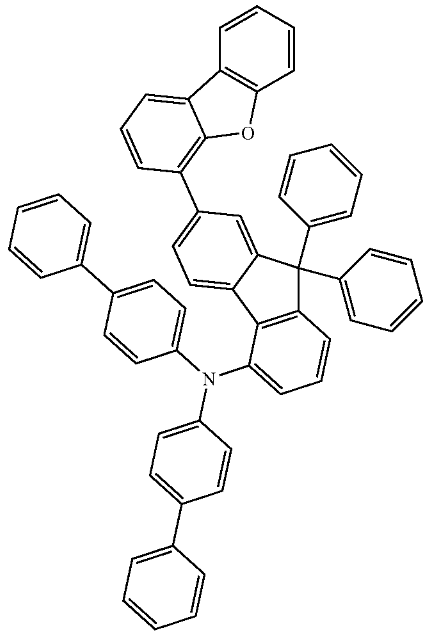 [SMILES: c1ccc(-c2ccc(N(c3ccc(-c4ccccc4)cc3)c3cccc4c3-c3ccc(-c5cccc6c5oc5ccccc56)cc3C4(c3ccccc3)c3ccccc3)cc2)cc1]
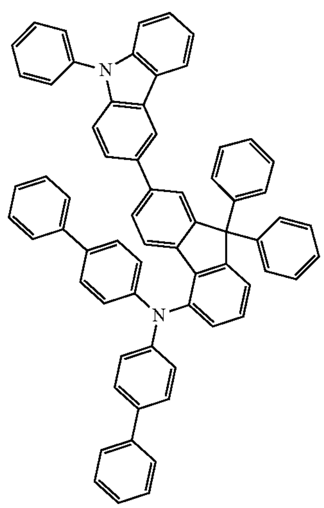 [SMILES: c1ccc(-c2ccc(N(c3ccc(-c4ccccc4)cc3)c3cccc4c3-c3ccc(-c5ccc6c(c5)c5ccccc5n6-c5ccccc5)cc3C4(c3ccccc3)c3ccccc3)cc2)cc1]
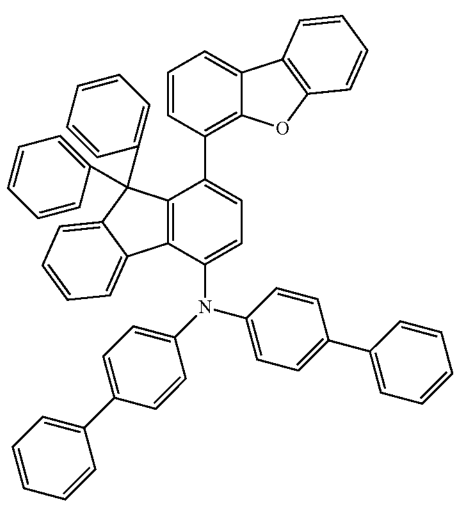 [SMILES: c1ccc(-c2ccc(N(c3ccc(-c4ccccc4)cc3)c3ccc(-c4cccc5c4oc4ccccc45)c4c3-c3ccccc3C4(c3ccccc3)c3ccccc3)cc2)cc1]

-continued
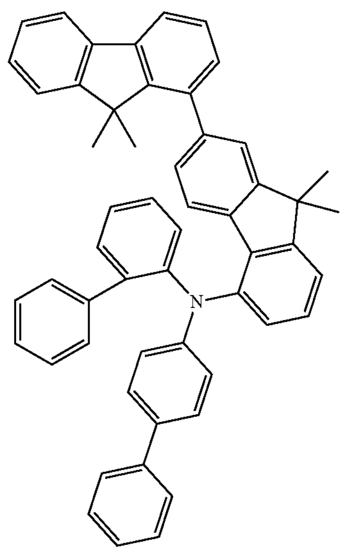 [SMILES: CC1(C)c2cc(-c3cccc4c3C(C)(C)c3ccccc3-4)ccc2-c2c(N(c3ccc(-c4ccccc4)cc3)c3ccccc3-c3ccccc3)cccc21]
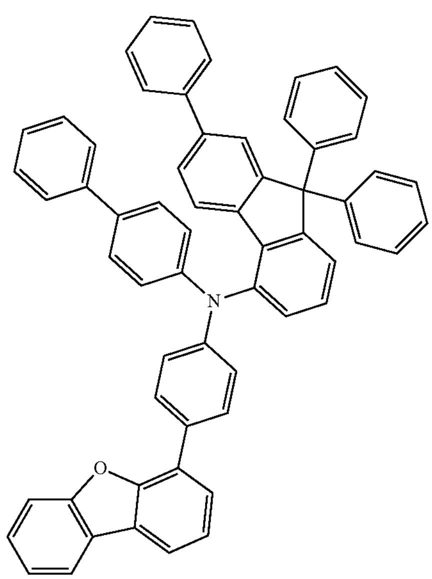 [SMILES: c1ccc(-c2ccc(N(c3ccc(-c4cccc5c4oc4ccccc45)cc3)c3cccc4c3-c3ccc(-c5ccccc5)cc3C4(c3ccccc3)c3ccccc3)cc2)cc1]

-continued
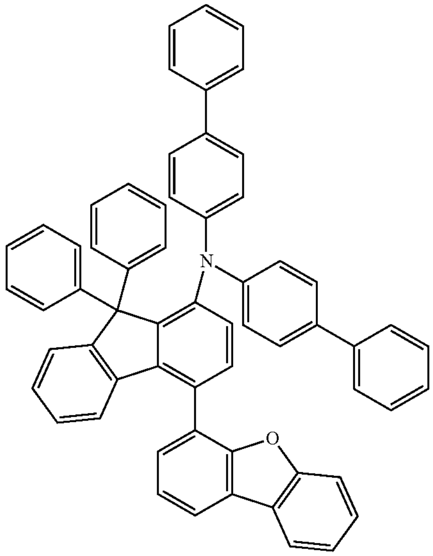 [SMILES: c1ccc(-c2ccc(N(c3ccc(-c4ccccc4)cc3)c3ccc(-c4cccc5c4oc4ccccc45)c4c3C(c3ccccc3)(c3ccccc3)c3ccccc3-4)cc2)cc1]
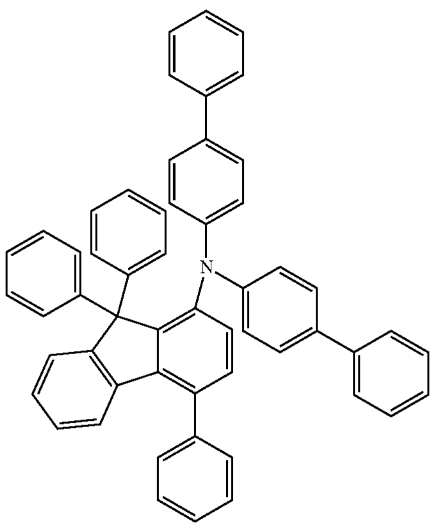 [SMILES: c1ccc(-c2ccc(N(c3ccc(-c4ccccc4)cc3)c3ccc(-c4ccccc4)c4c3C(c3ccccc3)(c3ccccc3)c3ccccc3-4)cc2)cc1]
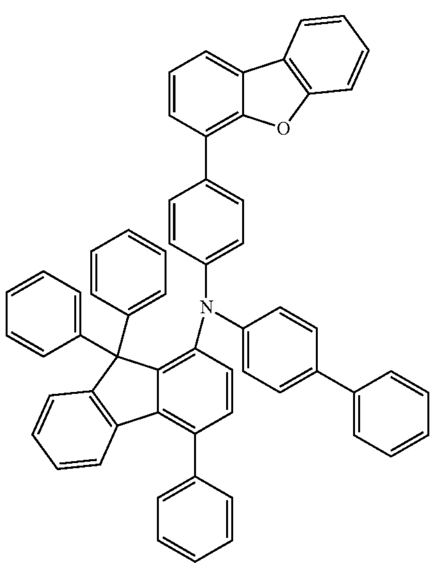 [SMILES: c1ccc(-c2ccc(N(c3ccc(-c4cccc5c4oc4ccccc45)cc3)c3ccc(-c4ccccc4)c4c3C(c3ccccc3)(c3ccccc3)c3ccccc3-4)cc2)cc1]

-continued
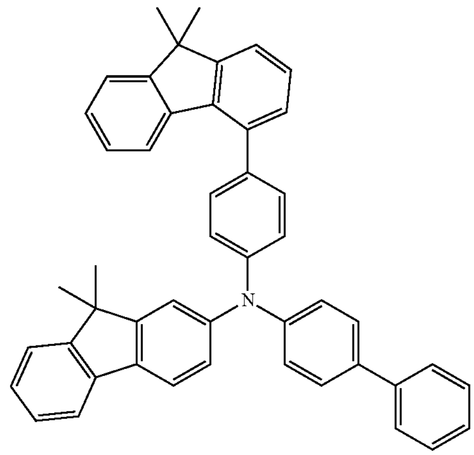 [SMILES: CC1(C)c2ccccc2-c2ccc(N(c3ccc(-c4ccccc4)cc3)c3ccc(-c4cccc5c4-c4ccccc4C5(C)C)cc3)cc21]
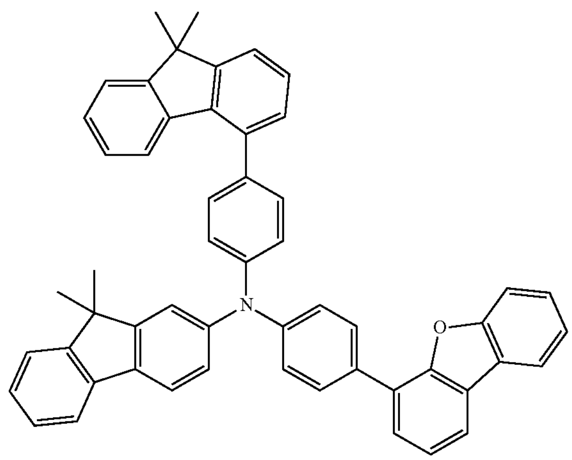 [SMILES: CC1(C)c2ccccc2-c2ccc(N(c3ccc(-c4cccc5c4-c4ccccc4C5(C)C)cc3)c3ccc(-c4cccc5c4oc4ccccc45)cc3)cc21]
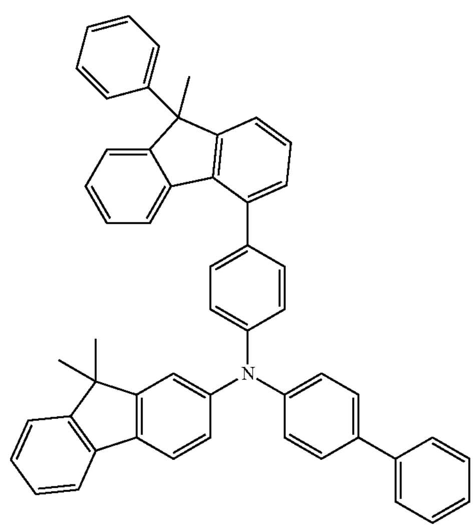 [SMILES: CC1(C)c2ccccc2-c2ccc(N(c3ccc(-c4ccccc4)cc3)c3ccc(-c4cccc5c4-c4ccccc4C5(C)c4ccccc4)cc3)cc21]

-continued
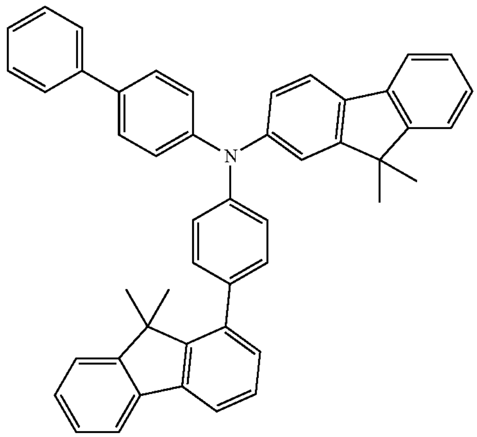 [SMILES: CC1(C)c2ccccc2-c2ccc(N(c3ccc(-c4ccccc4)cc3)c3ccc(-c4cccc5c4C(C)(C)c4ccccc4-5)cc3)cc21]
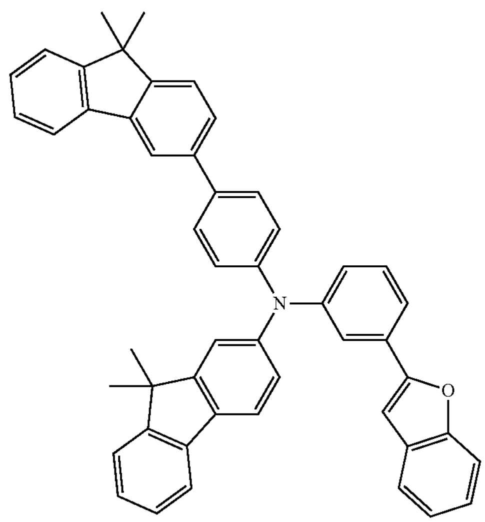 [SMILES: CC1(C)c2ccccc2-c2cc(-c3ccc(N(c4cccc(-c5cc6ccccc6o5)c4)c4ccc5c(c4)C(C)(C)c4ccccc4-5)cc3)ccc21]
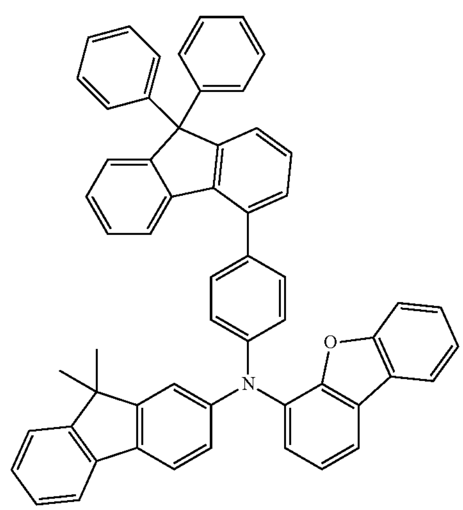 [SMILES: CC1(C)c2ccccc2-c2ccc(N(c3ccc(-c4cccc5c4-c4ccccc4C5(c4ccccc4)c4ccccc4)cc3)c3cccc4c3oc3ccccc34)cc21]

-continued
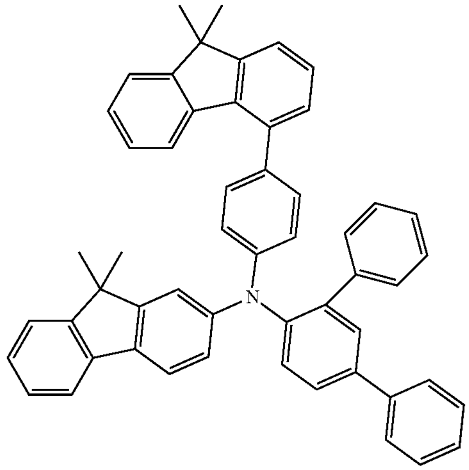 [SMILES: CC1(C)c2ccccc2-c2ccc(N(c3ccc(-c4cccc5c4-c4ccccc4C5(C)C)cc3)c3ccc(-c4ccccc4)cc3-c3ccccc3)cc21]
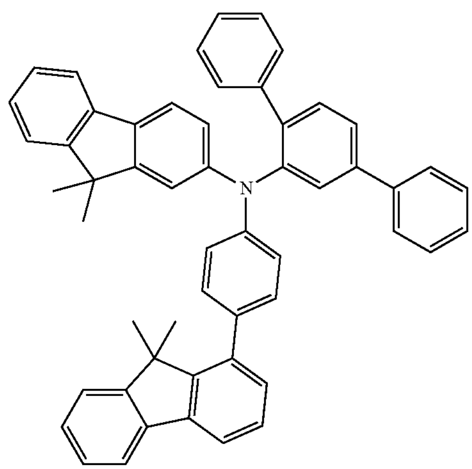 [SMILES: CC1(C)c2ccccc2-c2ccc(N(c3ccc(-c4cccc5c4C(C)(C)c4ccccc4-5)cc3)c3cc(-c4ccccc4)ccc3-c3ccccc3)cc21]
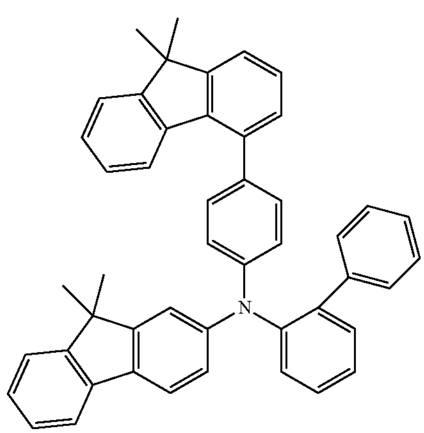 [SMILES: CC1(C)c2ccccc2-c2ccc(N(c3ccc(-c4cccc5c4-c4ccccc4C5(C)C)cc3)c3ccccc3-c3ccccc3)cc21]

-continued
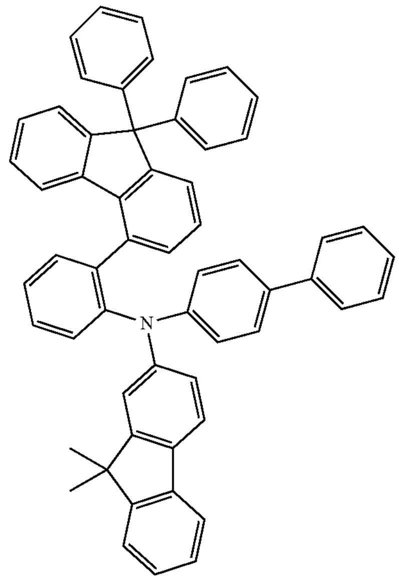 [SMILES: CC1(C)c2ccccc2-c2ccc(N(c3ccc(-c4ccccc4)cc3)c3ccccc3-c3cccc4c3-c3ccccc3C4(c3ccccc3)c3ccccc3)cc21]
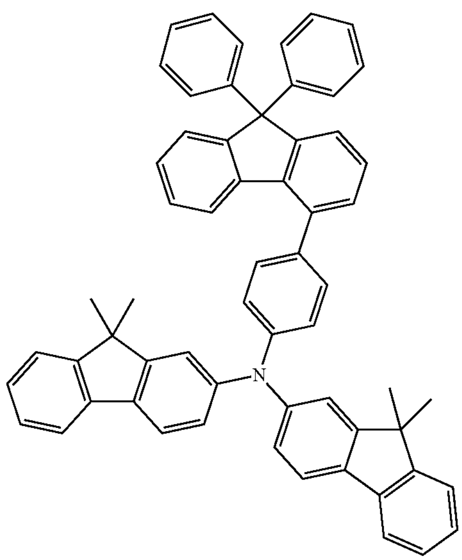 [SMILES: CC1(C)c2ccccc2-c2ccc(N(c3ccc(-c4cccc5c4-c4ccccc4C5(c4ccccc4)c4ccccc4)cc3)c3ccc4c(c3)C(C)(C)c3ccccc3-4)cc21]
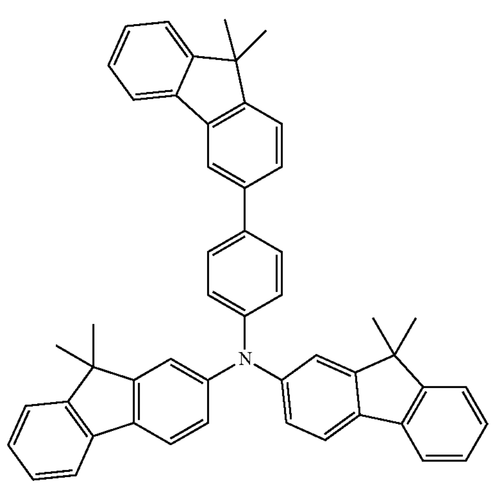 [SMILES: CC1(C)c2ccccc2-c2cc(-c3ccc(N(c4ccc5c(c4)C(C)(C)c4ccccc4-5)c4ccc5c(c4)C(C)(C)c4ccccc4-5)cc3)ccc21]

-continued
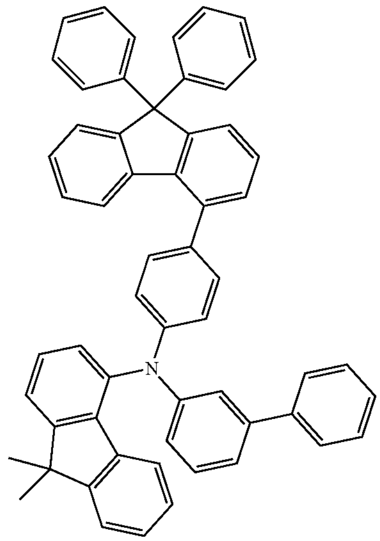 [SMILES: CC1(C)c2ccccc2-c2c(N(c3ccc(-c4cccc5c4-c4ccccc4C5(c4ccccc4)c4ccccc4)cc3)c3cccc(-c4ccccc4)c3)cccc21]
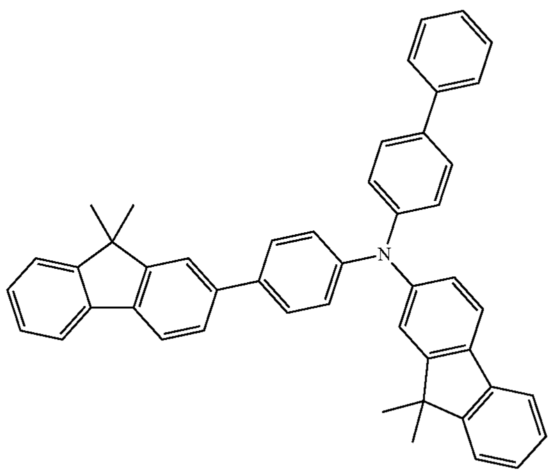 [SMILES: CC1(C)c2ccccc2-c2ccc(-c3ccc(N(c4ccc(-c5ccccc5)cc4)c4ccc5c(c4)C(C)(C)c4ccccc4-5)cc3)cc21]
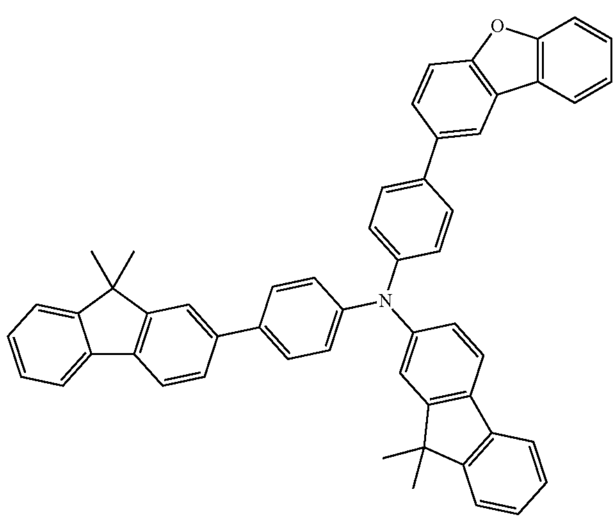 [SMILES: CC1(C)c2ccccc2-c2ccc(-c3ccc(N(c4ccc(-c5ccc6oc7ccccc7c6c5)cc4)c4ccc5c(c4)C(C)(C)c4ccccc4-5)cc3)cc21]

-continued
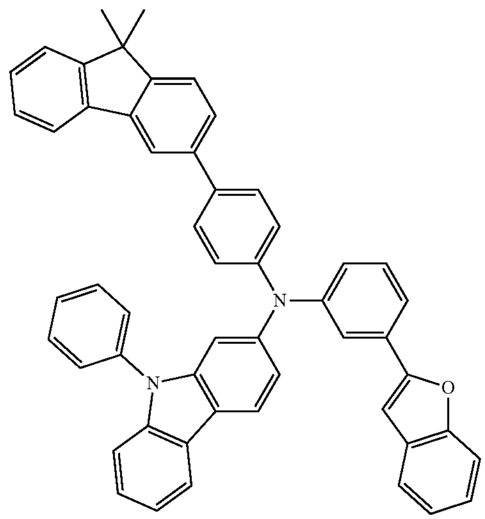 [SMILES: CC1(C)c2ccccc2-c2cc(-c3ccc(N(c4cccc(-c5cc6ccccc6o5)c4)c4ccc5c6ccccc6n(-c6ccccc6)c5c4)cc3)ccc21]
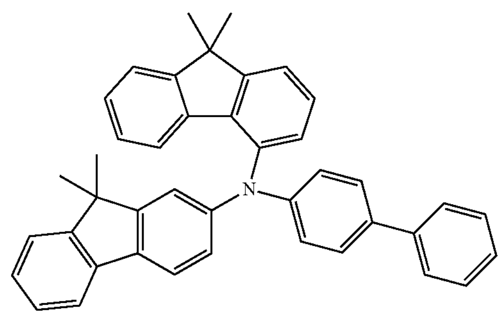 [SMILES: CC1(C)c2ccccc2-c2ccc(N(c3ccc(-c4ccccc4)cc3)c3cccc4c3-c3ccccc3C4(C)C)cc21]
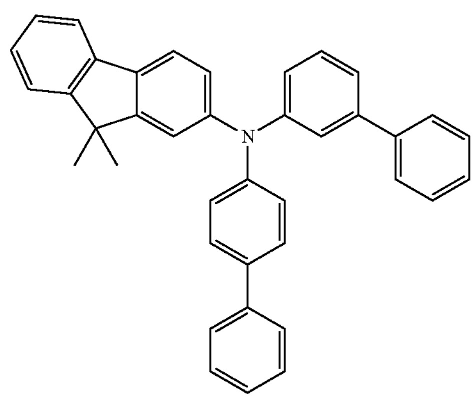 [SMILES: CC1(C)c2ccccc2-c2ccc(N(c3ccc(-c4ccccc4)cc3)c3cccc(-c4ccccc4)c3)cc21]
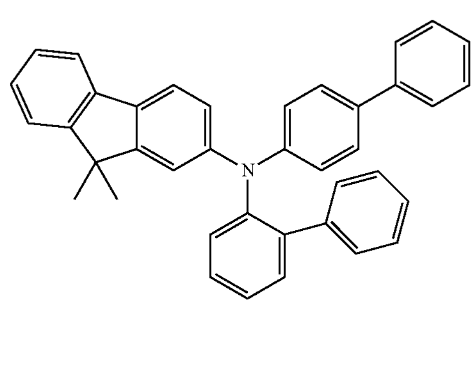 [SMILES: CC1(C)c2ccccc2-c2ccc(N(c3ccc(-c4ccccc4)cc3)c3ccccc3-c3ccccc3)cc21]

-continued
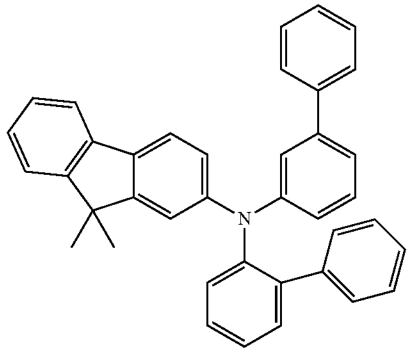 [SMILES: CC1(C)c2ccccc2-c2ccc(N(c3cccc(-c4ccccc4)c3)c3ccccc3-c3ccccc3)cc21]
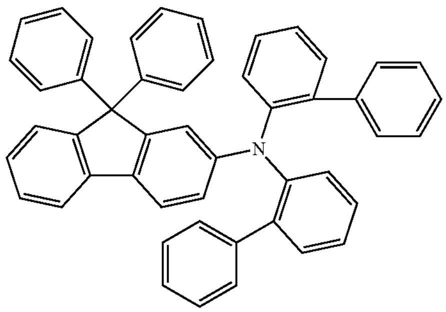 [SMILES: c1ccc(-c2ccccc2N(c2ccc3c(c2)C(c2ccccc2)(c2ccccc2)c2ccccc2-3)c2ccccc2-c2ccccc2)cc1]
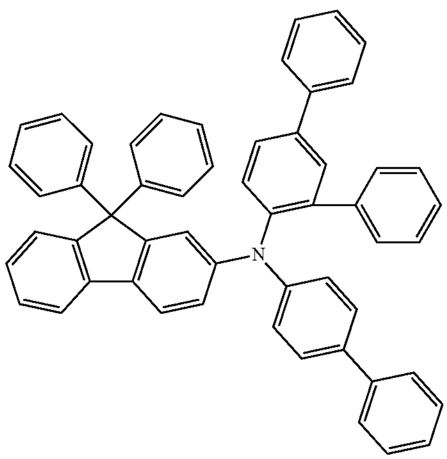 [SMILES: c1ccc(-c2ccc(N(c3ccc4c(c3)C(c3ccccc3)(c3ccccc3)c3ccccc3-4)c3ccc(-c4ccccc4)cc3-c3ccccc3)cc2)cc1]
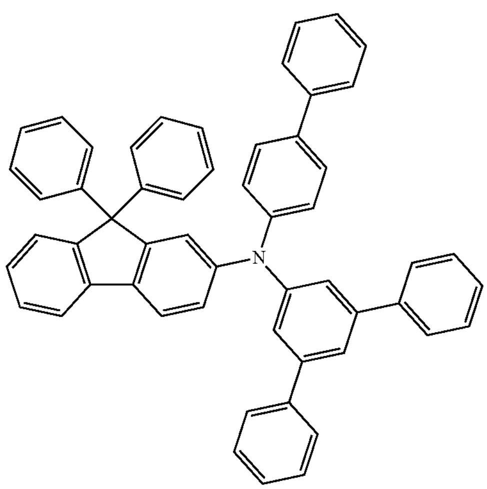 [SMILES: c1ccc(-c2ccc(N(c3cc(-c4ccccc4)cc(-c4ccccc4)c3)c3ccc4c(c3)C(c3ccccc3)(c3ccccc3)c3ccccc3-4)cc2)cc1]

-continued
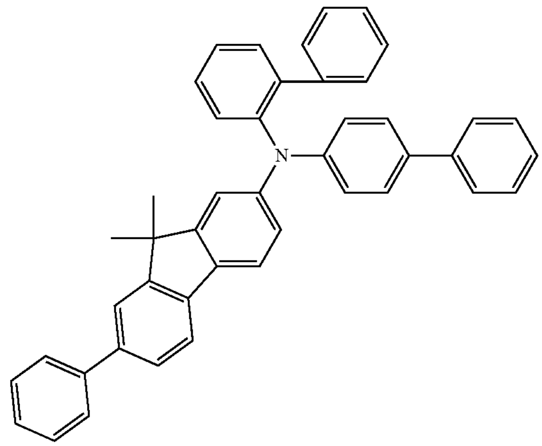 [SMILES: CC1(C)c2cc(-c3ccccc3)ccc2-c2ccc(N(c3ccc(-c4ccccc4)cc3)c3ccccc3-c3ccccc3)cc21]
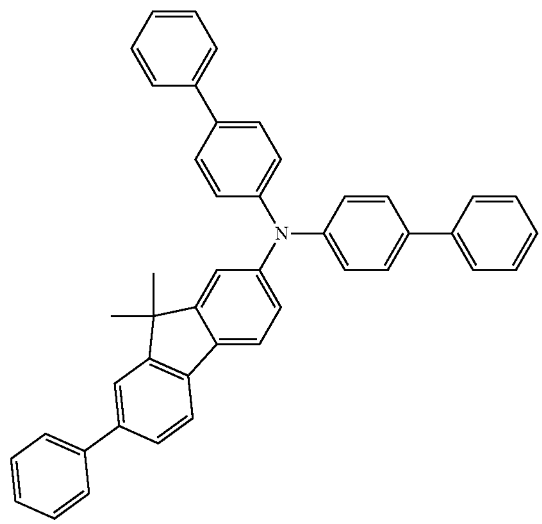 [SMILES: CC1(C)c2cc(-c3ccccc3)ccc2-c2ccc(N(c3ccc(-c4ccccc4)cc3)c3ccc(-c4ccccc4)cc3)cc21]
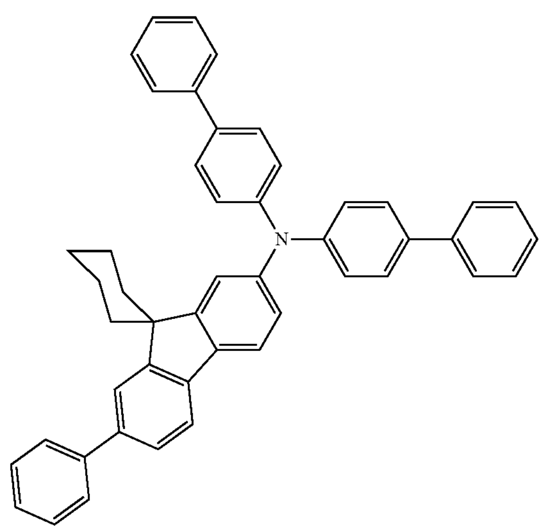 [SMILES: c1ccc(-c2ccc(N(c3ccc(-c4ccccc4)cc3)c3ccc4c(c3)C3(CCCCC3)c3cc(-c5ccccc5)ccc3-4)cc2)cc1]

-continued
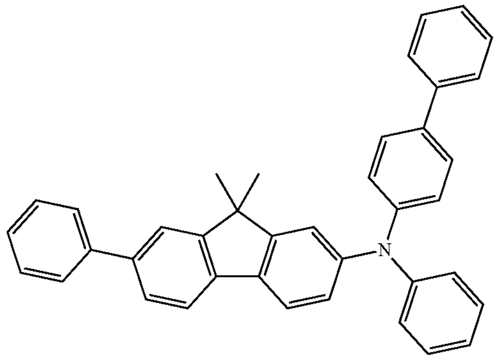 [SMILES: CC1(C)c2cc(-c3ccccc3)ccc2-c2ccc(N(c3ccccc3)c3ccc(-c4ccccc4)cc3)cc21]
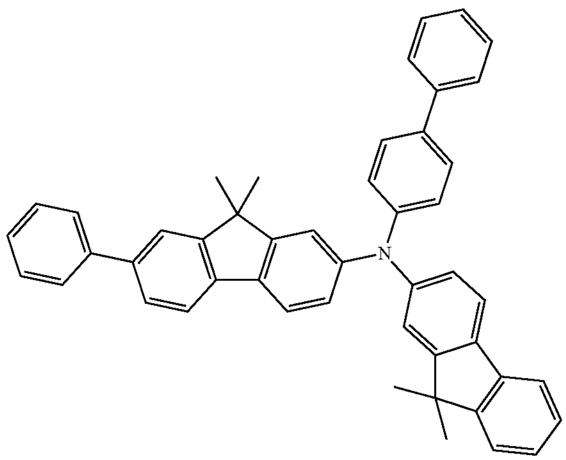 [SMILES: CC1(C)c2ccccc2-c2ccc(N(c3ccc(-c4ccccc4)cc3)c3ccc4c(c3)C(C)(C)c3cc(-c5ccccc5)ccc3-4)cc21]
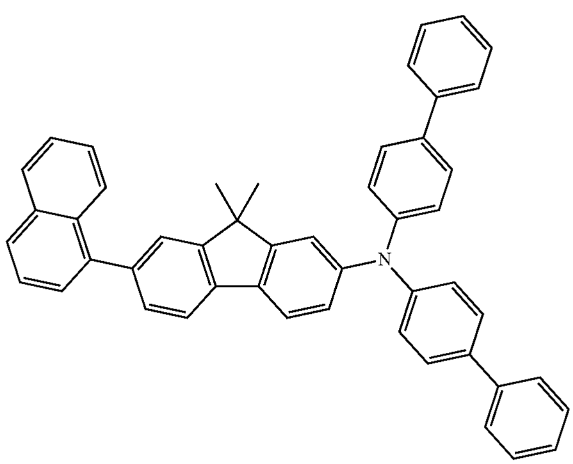 [SMILES: CC1(C)c2cc(-c3cccc4ccccc34)ccc2-c2ccc(N(c3ccc(-c4ccccc4)cc3)c3ccc(-c4ccccc4)cc3)cc21]

-continued
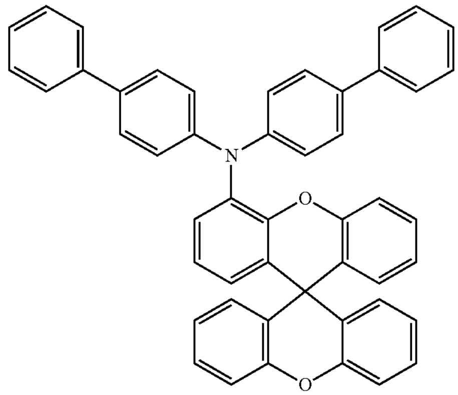 [SMILES: c1ccc(-c2ccc(N(c3ccc(-c4ccccc4)cc3)c3cccc4c3Oc3ccccc3C43c4ccccc4Oc4ccccc43)cc2)cc1]
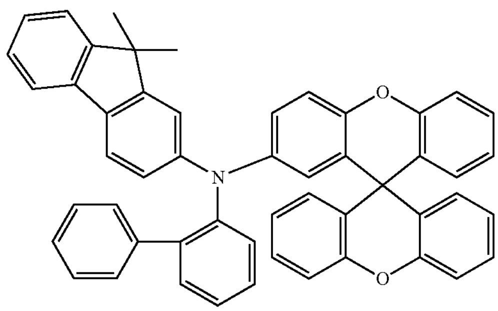 [SMILES: CC1(C)c2ccccc2-c2ccc(N(c3ccc4c(c3)C3(c5ccccc5Oc5ccccc53)c3ccccc3O4)c3ccccc3-c3ccccc3)cc21]
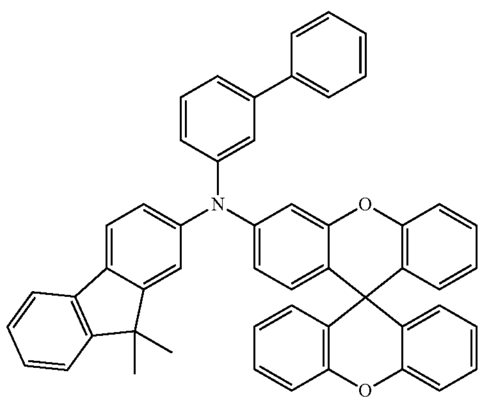 [SMILES: CC1(C)c2ccccc2-c2ccc(N(c3cccc(-c4ccccc4)c3)c3ccc4c(c3)Oc3ccccc3C43c4ccccc4Oc4ccccc43)cc21]
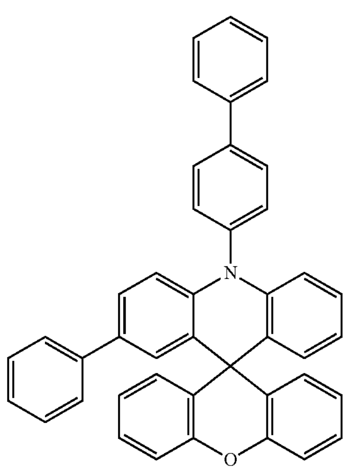 [SMILES: c1ccc(-c2ccc(N3c4ccccc4C4(c5ccccc5Oc5ccccc54)c4cc(-c5ccccc5)ccc43)cc2)cc1]

-continued
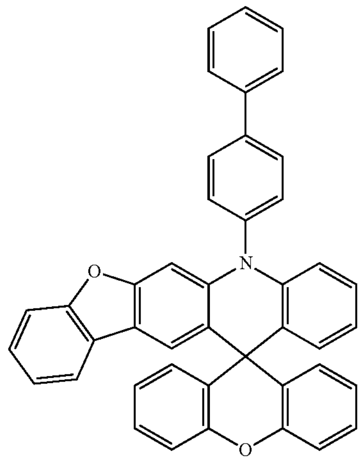 [SMILES: c1ccc(-c2ccc(N3c4ccccc4C4(c5ccccc5Oc5ccccc54)c4cc5c(cc43)oc3ccccc35)cc2)cc1]
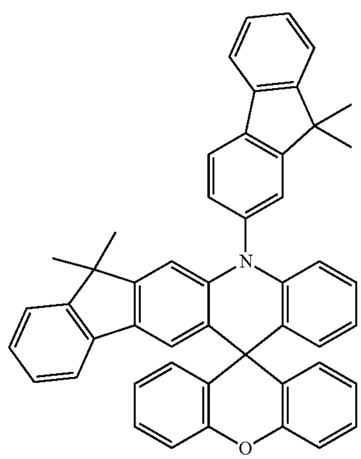 [SMILES: CC1(C)c2ccccc2-c2ccc(N3c4ccccc4C4(c5ccccc5Oc5ccccc54)c4cc5c(cc43)C(C)(C)c3ccccc3-5)cc21]
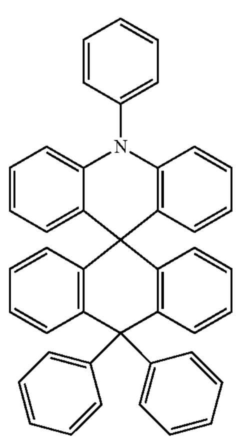 [SMILES: c1ccc(N2c3ccccc3C3(c4ccccc42)c2ccccc2C(c2ccccc2)(c2ccccc2)c2ccccc23)cc1]

-continued
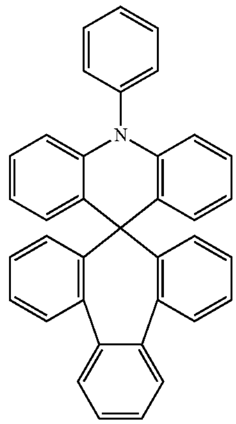 [SMILES: c1ccc(N2c3ccccc3C3(c4ccccc4-c4ccccc4-c4ccccc43)c3ccccc32)cc1]
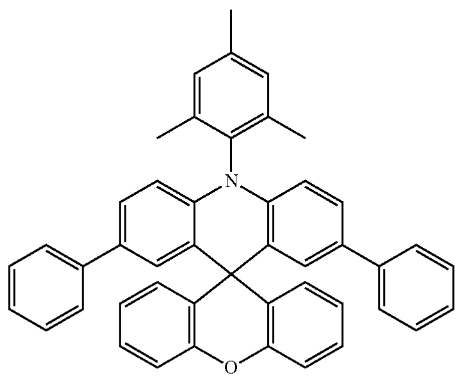 [SMILES: Cc1cc(C)c(N2c3ccc(-c4ccccc4)cc3C3(c4ccccc4Oc4ccccc43)c3cc(-c4ccccc4)ccc32)c(C)c1]
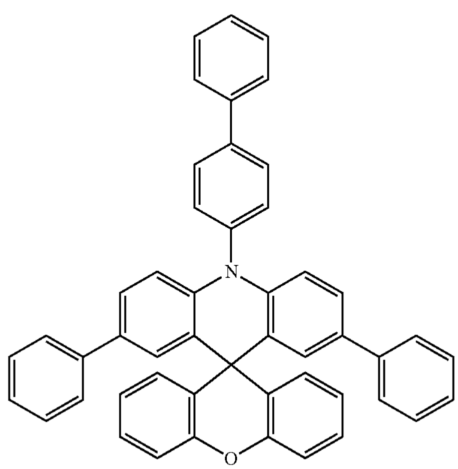 [SMILES: c1ccc(-c2ccc(N3c4ccc(-c5ccccc5)cc4C4(c5ccccc5Oc5ccccc54)c4cc(-c5ccccc5)ccc43)cc2)cc1]

-continued
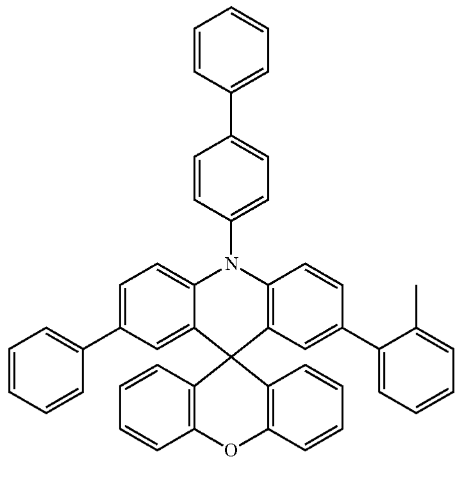 [SMILES: Cc1ccccc1-c1ccc2c(c1)C1(c3ccccc3Oc3ccccc31)c1cc(-c3ccccc3)ccc1N2c1ccc(-c2ccccc2)cc1]
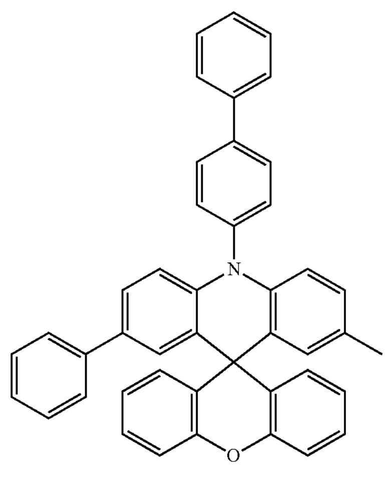 [SMILES: Cc1ccc2c(c1)C1(c3ccccc3Oc3ccccc31)c1cc(-c3ccccc3)ccc1N2c1ccc(-c2ccccc2)cc1]
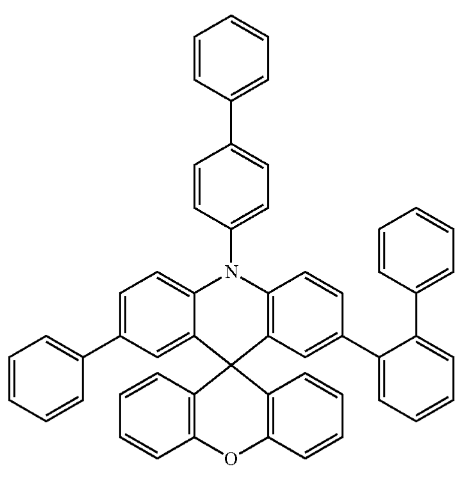 [SMILES: c1ccc(-c2ccc(N3c4ccc(-c5ccccc5)cc4C4(c5ccccc5Oc5ccccc54)c4cc(-c5ccccc5-c5ccccc5)ccc43)cc2)cc1]

-continued
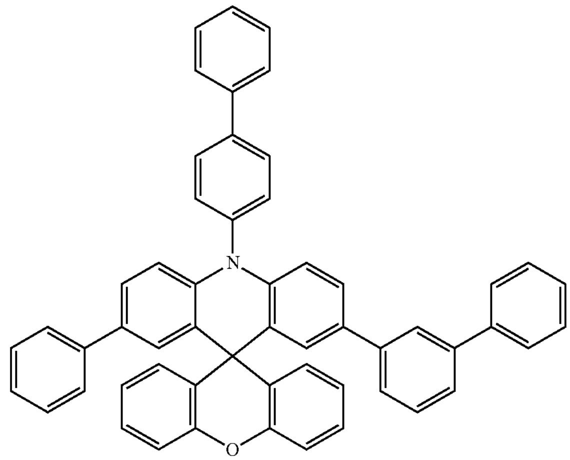 [SMILES: c1ccc(-c2ccc(N3c4ccc(-c5ccccc5)cc4C4(c5ccccc5Oc5ccccc54)c4cc(-c5cccc(-c6ccccc6)c5)ccc43)cc2)cc1]
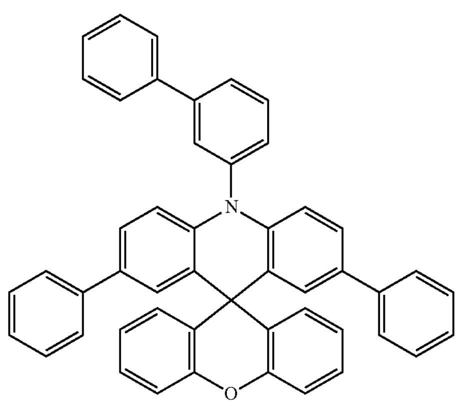 [SMILES: c1ccc(-c2cccc(N3c4ccc(-c5ccccc5)cc4C4(c5ccccc5Oc5ccccc54)c4cc(-c5ccccc5)ccc43)c2)cc1]
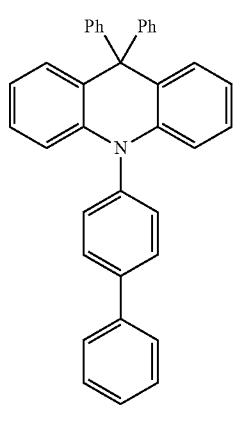 [SMILES: c1ccc(-c2ccc(N3c4ccccc4C(c4ccccc4)(c4ccccc4)c4ccccc43)cc2)cc1]

-continued
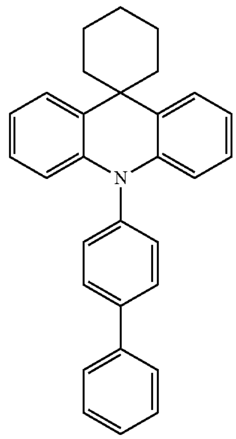 [SMILES: c1ccc(-c2ccc(N3c4ccccc4C4(CCCCC4)c4ccccc43)cc2)cc1]
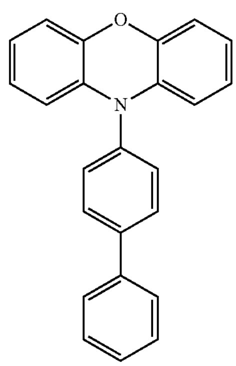 [SMILES: c1ccc(-c2ccc(N3c4ccccc4Oc4ccccc43)cc2)cc1]
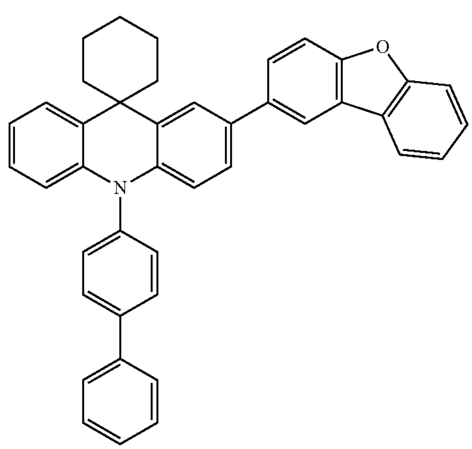 [SMILES: c1ccc(-c2ccc(N3c4ccccc4C4(CCCCC4)c4cc(-c5ccc6oc7ccccc7c6c5)ccc43)cc2)cc1]

-continued
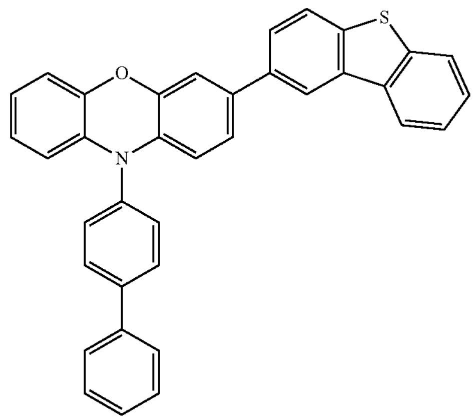 [SMILES: c1ccc(-c2ccc(N3c4ccccc4Oc4cc(-c5ccc6sc7ccccc7c6c5)ccc43)cc2)cc1]
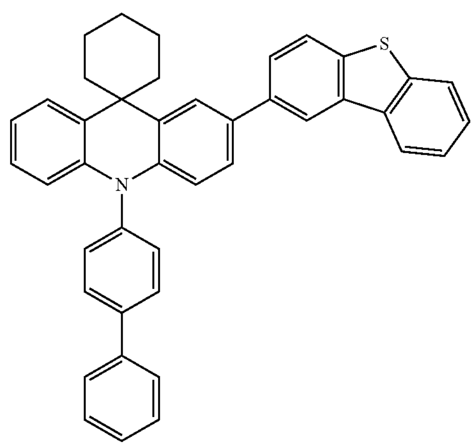 [SMILES: c1ccc(-c2ccc(N3c4ccccc4C4(CCCCC4)c4cc(-c5ccc6sc7ccccc7c6c5)ccc43)cc2)cc1]
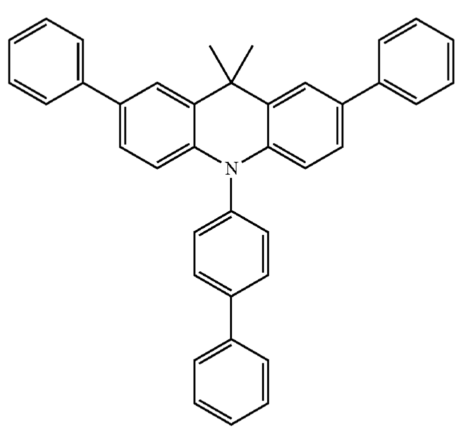 [SMILES: CC1(C)c2cc(-c3ccccc3)ccc2N(c2ccc(-c3ccccc3)cc2)c2ccc(-c3ccccc3)cc21]

-continued
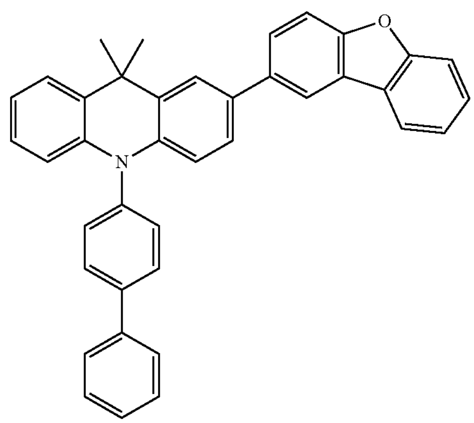
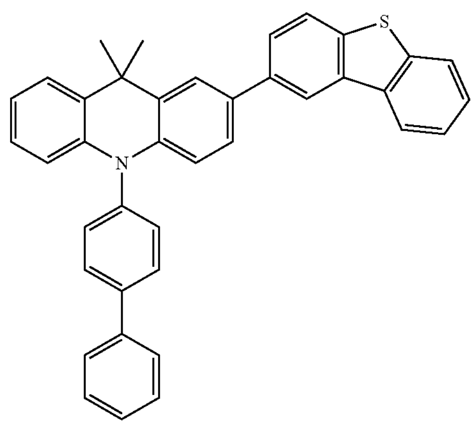 [SMILES: CC1(C)c2ccccc2N(c2ccc(-c3ccccc3)cc2)c2ccc(-c3ccc4sc5ccccc5c4c3)cc21]
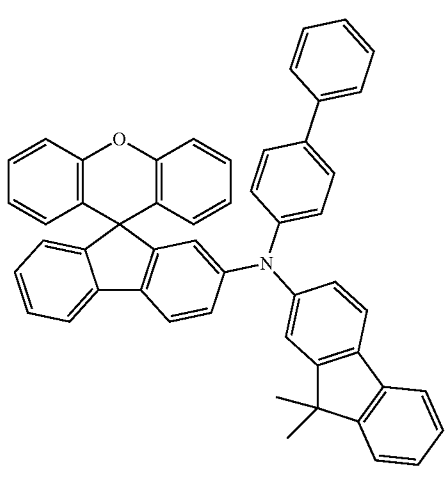 [SMILES: CC1(C)c2ccccc2-c2ccc(N(c3ccc(-c4ccccc4)cc3)c3ccc4c(c3)C3(c5ccccc5Oc5ccccc53)c3ccccc3-4)cc21]

-continued
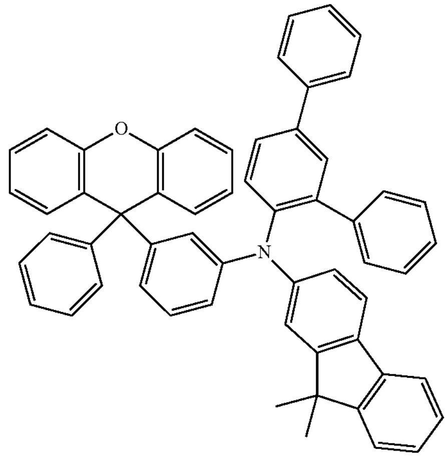 [SMILES: CC1(C)c2ccccc2-c2ccc(N(c3cccc(C4(c5ccccc5)c5ccccc5Oc5ccccc54)c3)c3ccc(-c4ccccc4)cc3-c3ccccc3)cc21]
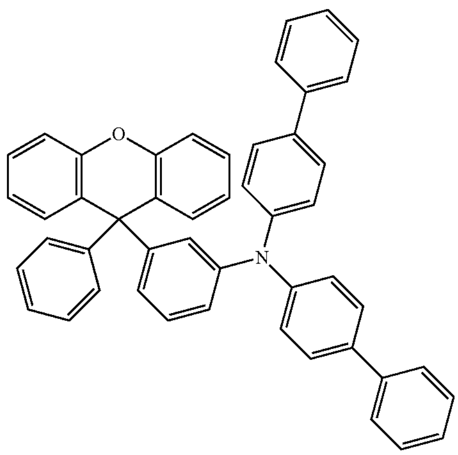 [SMILES: c1ccc(-c2ccc(N(c3ccc(-c4ccccc4)cc3)c3cccc(C4(c5ccccc5)c5ccccc5Oc5ccccc54)c3)cc2)cc1]
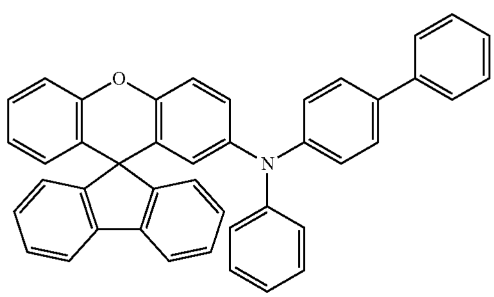 [SMILES: c1ccc(-c2ccc(N(c3ccccc3)c3ccc4c(c3)C3(c5ccccc5O4)c4ccccc4-c4ccccc43)cc2)cc1]
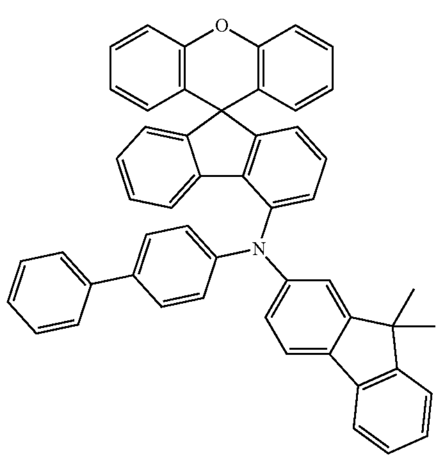 [SMILES: CC1(C)c2ccccc2-c2ccc(N(c3ccc(-c4ccccc4)cc3)c3cccc4c3-c3ccccc3C43c4ccccc4Oc4ccccc43)cc21]

-continued
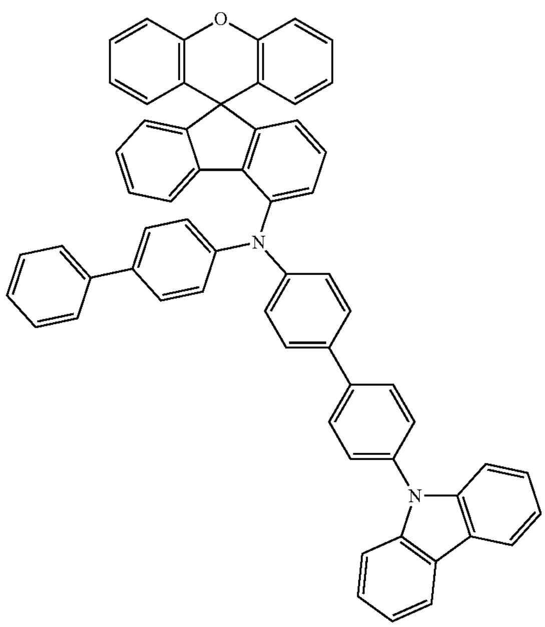 [SMILES: c1ccc(-c2ccc(N(c3ccc(-c4ccc(-n5c6ccccc6c6ccccc65)cc4)cc3)c3cccc4c3-c3ccccc3C43c4ccccc4Oc4ccccc43)cc2)cc1]
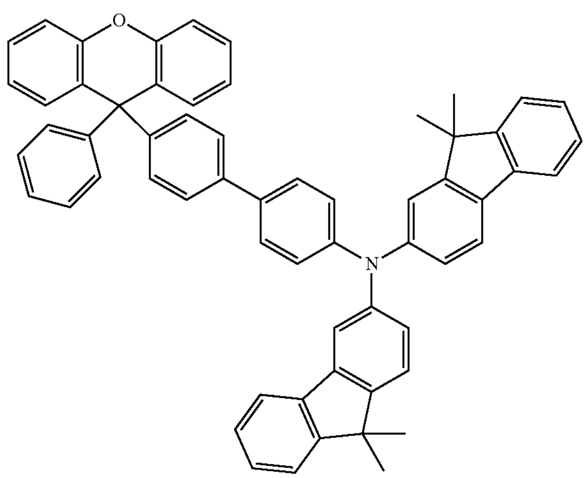 [SMILES: CC1(C)c2ccccc2-c2cc(N(c3ccc(-c4ccc(C5(c6ccccc6)c6ccccc6Oc6ccccc65)cc4)cc3)c3ccc4c(c3)C(C)(C)c3ccccc3-4)ccc21]
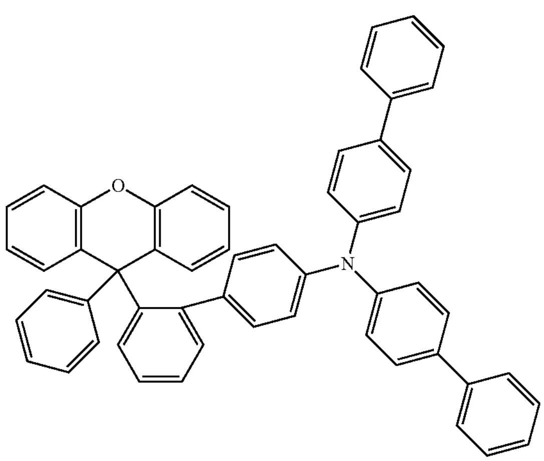 [SMILES: c1ccc(-c2ccc(N(c3ccc(-c4ccccc4)cc3)c3ccc(-c4ccccc4C4(c5ccccc5)c5ccccc5Oc5ccccc54)cc3)cc2)cc1]

-continued
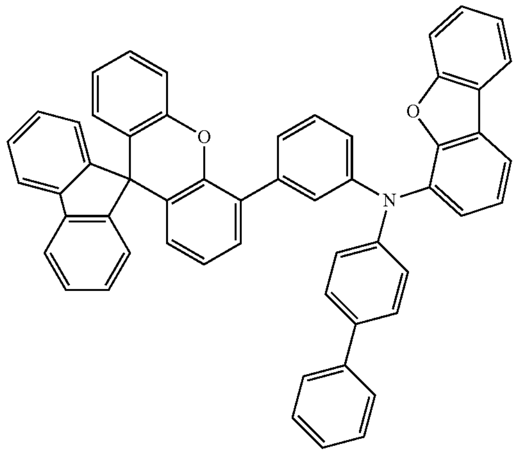 [SMILES: c1ccc(-c2ccc(N(c3cccc(-c4cccc5c4Oc4ccccc4C54c5ccccc5-c5ccccc54)c3)c3cccc4c3oc3ccccc34)cc2)cc1]
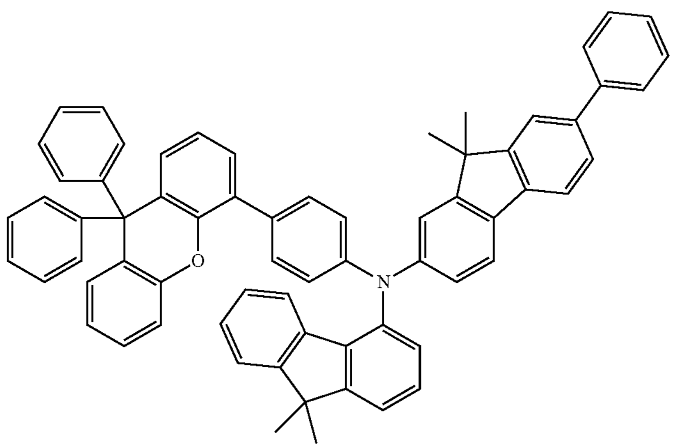 [SMILES: CC1(C)c2cc(-c3ccccc3)ccc2-c2ccc(N(c3ccc(-c4cccc5c4Oc4ccccc4C5(c4ccccc4)c4ccccc4)cc3)c3cccc4c3-c3ccccc3C4(C)C)cc21]
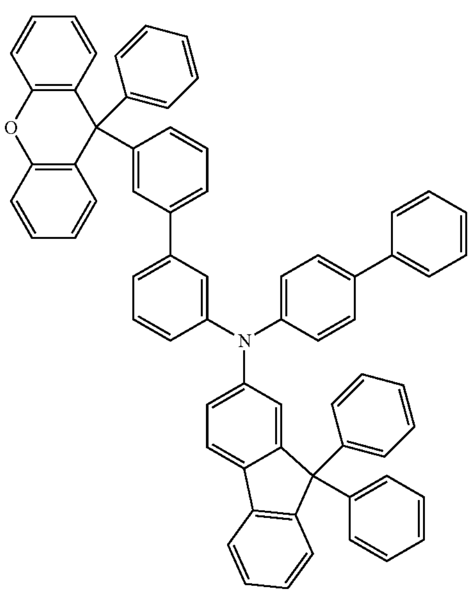 [SMILES: c1ccc(-c2ccc(N(c3cccc(-c4cccc(C5(c6ccccc6)c6ccccc6Oc6ccccc65)c4)c3)c3ccc4c(c3)C(c3ccccc3)(c3ccccc3)c3ccccc3-4)cc2)cc1]

-continued
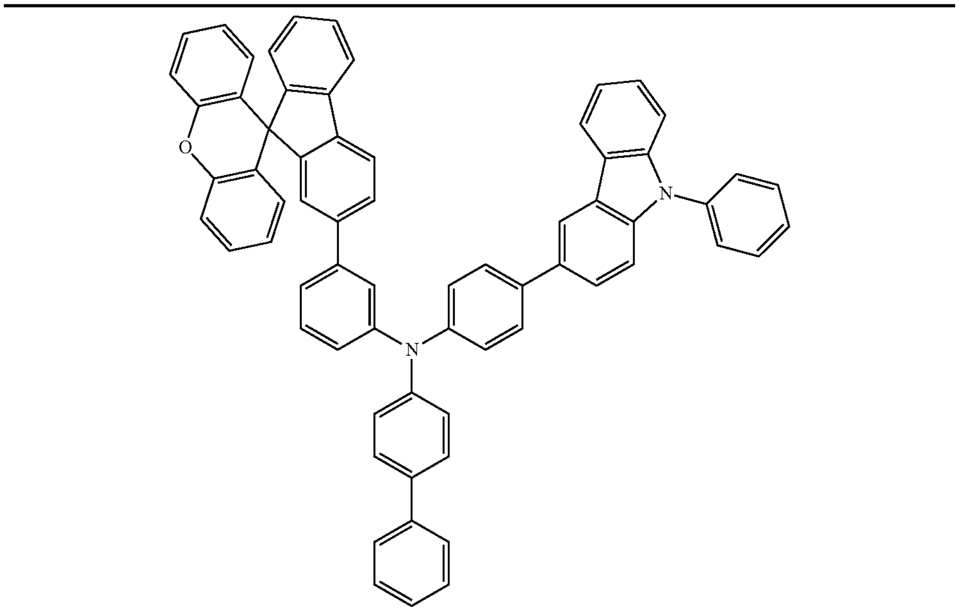
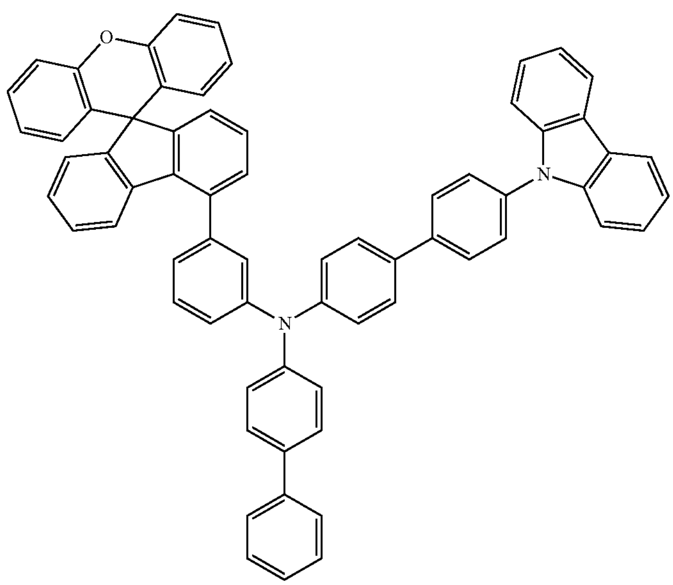 [SMILES: c1ccc(-c2ccc(N(c3ccc(-c4ccc(-n5c6ccccc6c6ccccc65)cc4)cc3)c3cccc(-c4cccc5c4-c4ccccc4C54c5ccccc5Oc5ccccc54)c3)cc2)cc1]
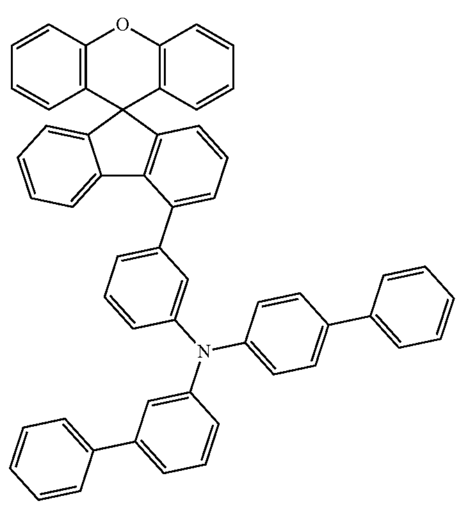 [SMILES: c1ccc(-c2ccc(N(c3cccc(-c4ccccc4)c3)c3cccc(-c4cccc5c4-c4ccccc4C54c5ccccc5Oc5ccccc54)c3)cc2)cc1]

-continued
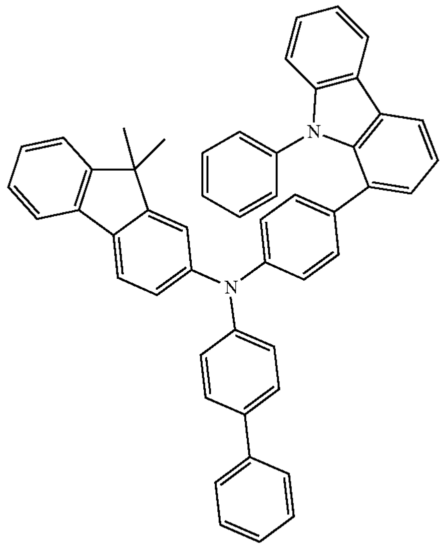 [SMILES: CC1(C)c2ccccc2-c2ccc(N(c3ccc(-c4ccccc4)cc3)c3ccc(-c4cccc5c6ccccc6n(-c6ccccc6)c45)cc3)cc21]
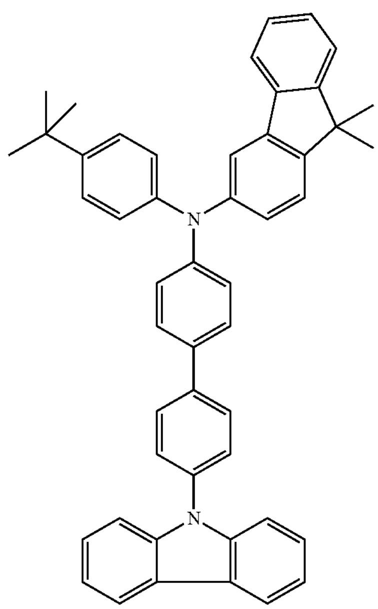 [SMILES: CC(C)(C)c1ccc(N(c2ccc(-c3ccc(-n4c5ccccc5c5ccccc54)cc3)cc2)c2ccc3c(c2)-c2ccccc2C3(C)C)cc1]

-continued
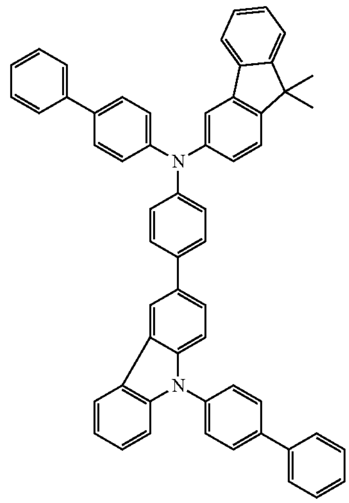 [SMILES: CC1(C)c2ccccc2-c2cc(N(c3ccc(-c4ccccc4)cc3)c3ccc(-c4ccc5c(c4)c4ccccc4n5-c4ccc(-c5ccccc5)cc4)cc3)ccc21]
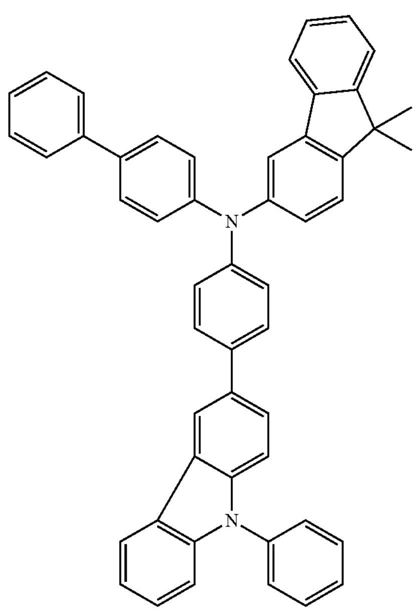 [SMILES: CC1(C)c2ccccc2-c2cc(N(c3ccc(-c4ccccc4)cc3)c3ccc(-c4ccc5c(c4)c4ccccc4n5-c4ccccc4)cc3)ccc21]

-continued
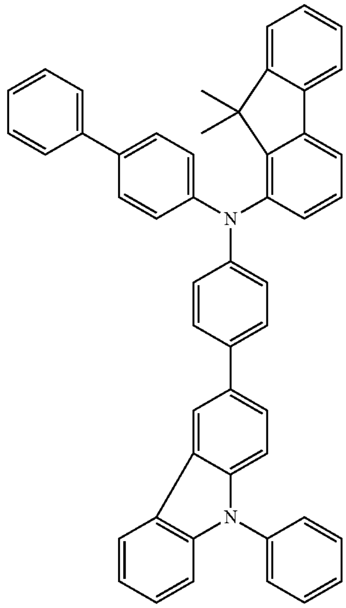 [SMILES: CC1(C)c2ccccc2-c2cccc(N(c3ccc(-c4ccccc4)cc3)c3ccc(-c4ccc5c(c4)c4ccccc4n5-c4ccccc4)cc3)c21]
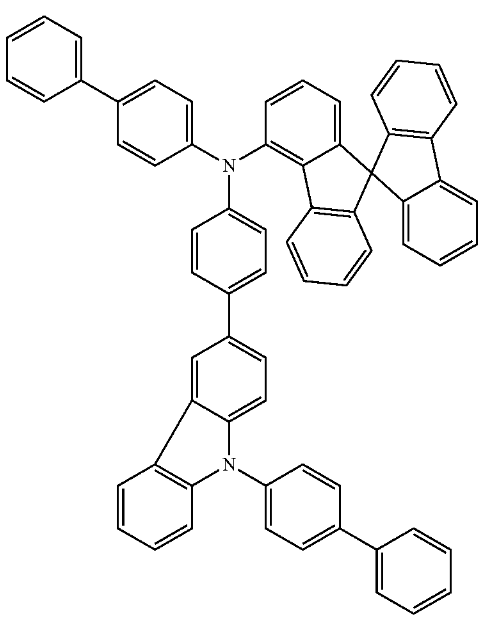 [SMILES: c1ccc(-c2ccc(N(c3ccc(-c4ccc5c(c4)c4ccccc4n5-c4ccc(-c5ccccc5)cc4)cc3)c3cccc4c3-c3ccccc3C43c4ccccc4-c4ccccc43)cc2)cc1]

-continued
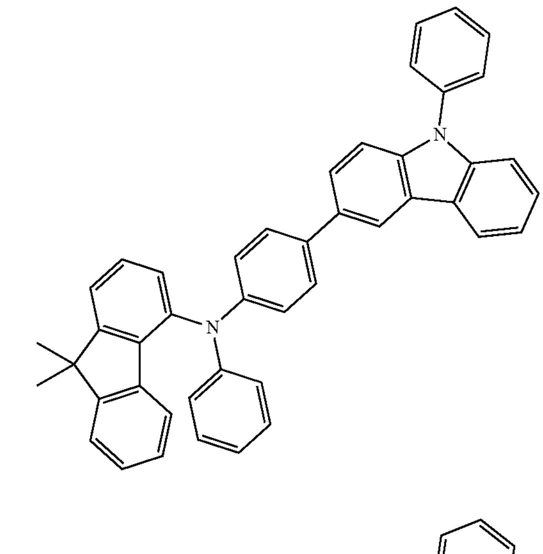
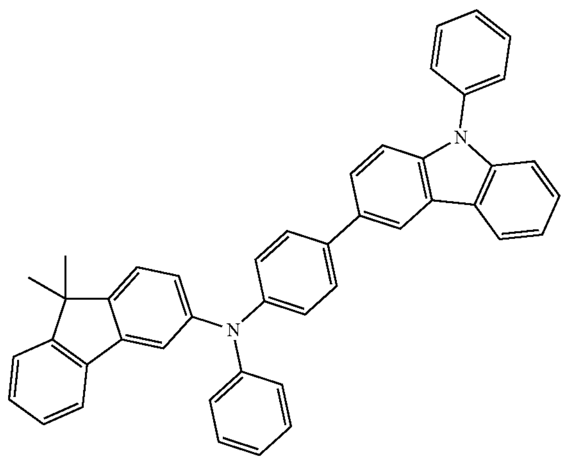 [SMILES: CC1(C)c2ccccc2-c2cc(N(c3ccccc3)c3ccc(-c4ccc5c(c4)c4ccccc4n5-c4ccccc4)cc3)ccc21]
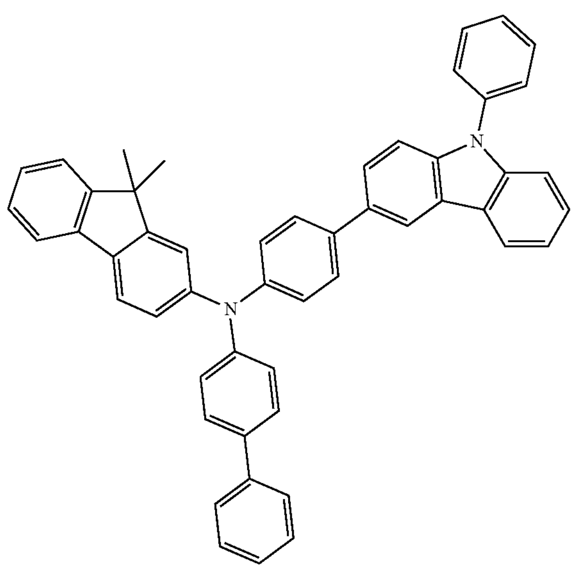 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

-continued
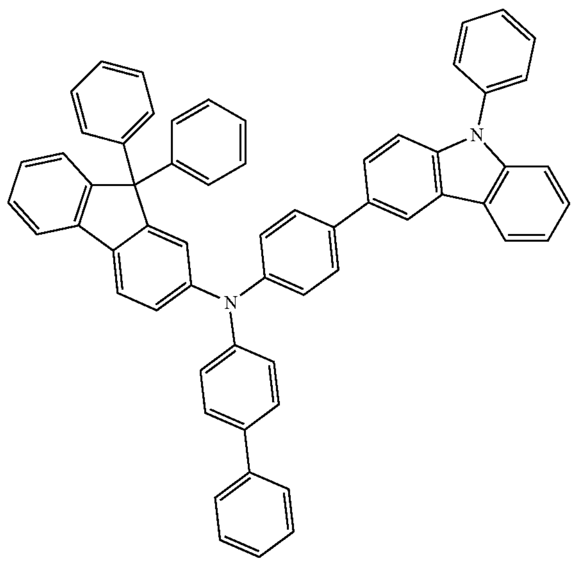 [SMILES: c1ccc(-c2ccc(N(c3ccc(-c4ccc5c(c4)c4ccccc4n5-c4ccccc4)cc3)c3ccc4c(c3)C(c3ccccc3)(c3ccccc3)c3ccccc3-4)cc2)cc1]
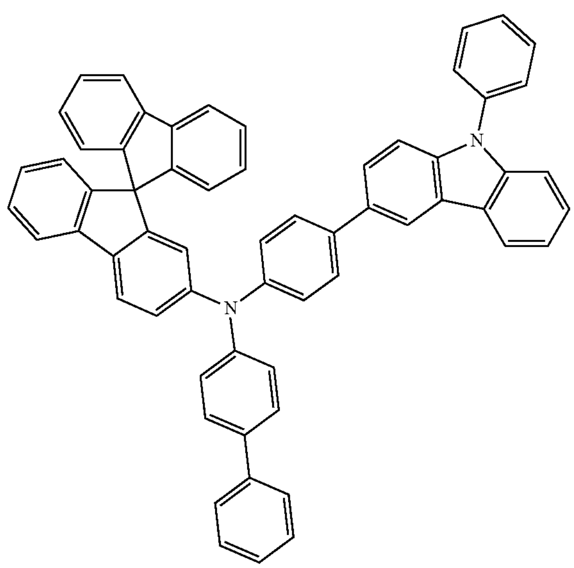 [SMILES: c1ccc(-c2ccc(N(c3ccc(-c4ccc5c(c4)c4ccccc4n5-c4ccccc4)cc3)c3ccc4c(c3)C3(c5ccccc5-c5ccccc53)c3ccccc3-4)cc2)cc1]

-continued
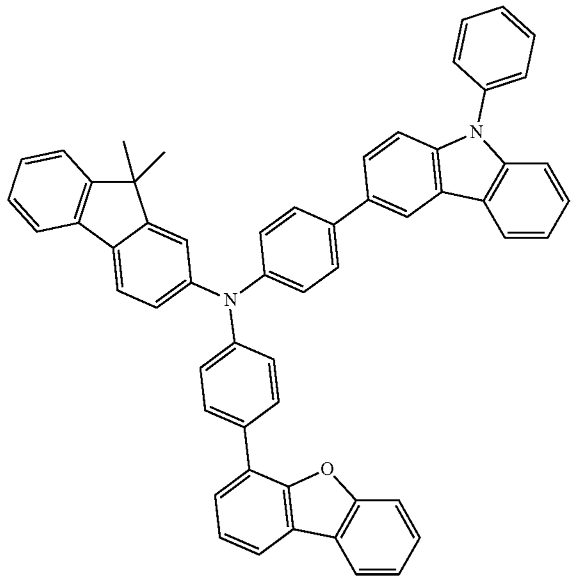
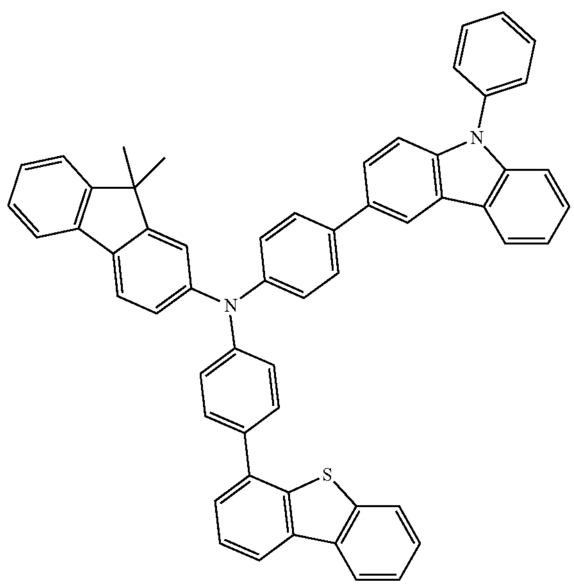 [SMILES: CC1(C)c2ccccc2-c2ccc(N(c3ccc(-c4ccc5c(c4)c4ccccc4n5-c4ccccc4)cc3)c3ccc(-c4cccc5c4oc4ccccc45)cc3)cc21]
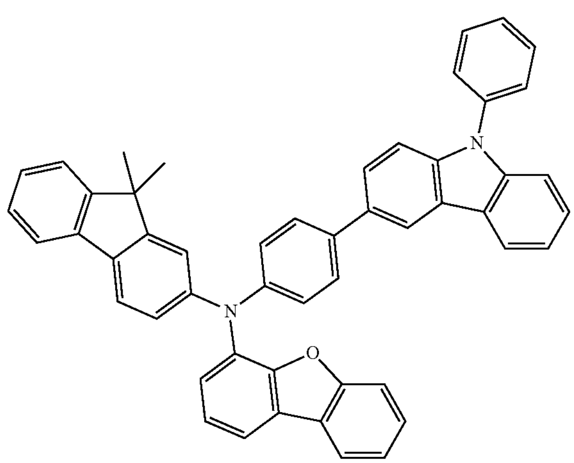 [SMILES: CC1(C)c2ccccc2-c2ccc(N(c3ccc(-c4ccc5c(c4)c4ccccc4n5-c4ccccc4)cc3)c3cccc4c3sc3ccccc34)cc21]

-continued
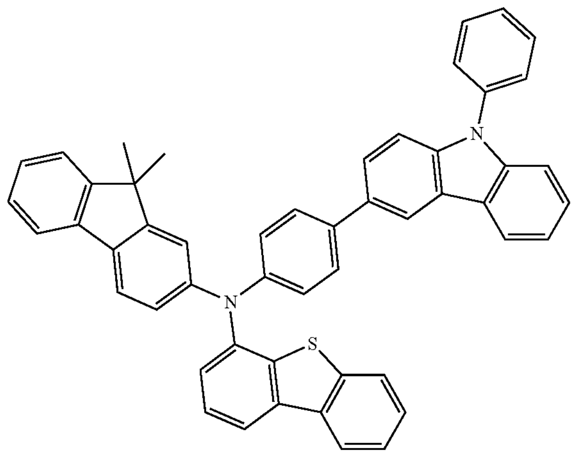
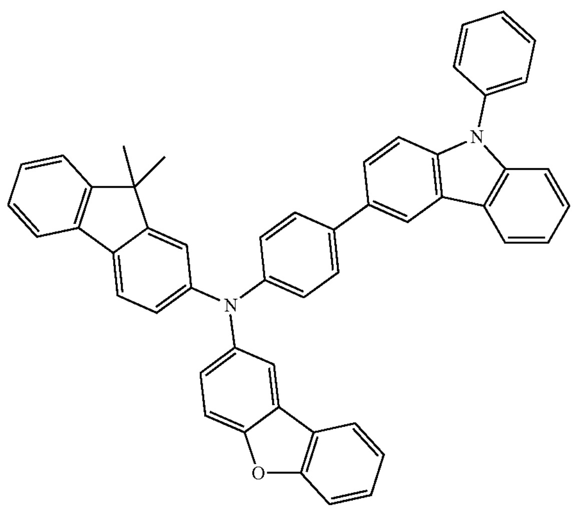 [SMILES: CC1(C)c2ccccc2-c2ccc(N(c3ccc(-c4ccc5c(c4)c4ccccc4n5-c4ccccc4)cc3)c3ccc4oc5ccccc5c4c3)cc21]
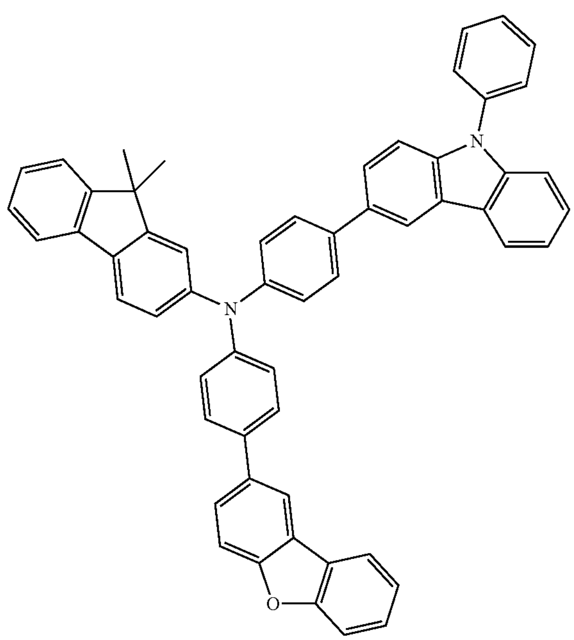 [SMILES: CC1(C)c2ccccc2-c2ccc(N(c3ccc(-c4ccc5oc6ccccc6c5c4)cc3)c3ccc(-c4ccc5c(c4)c4ccccc4n5-c4ccccc4)cc3)cc21]

-continued
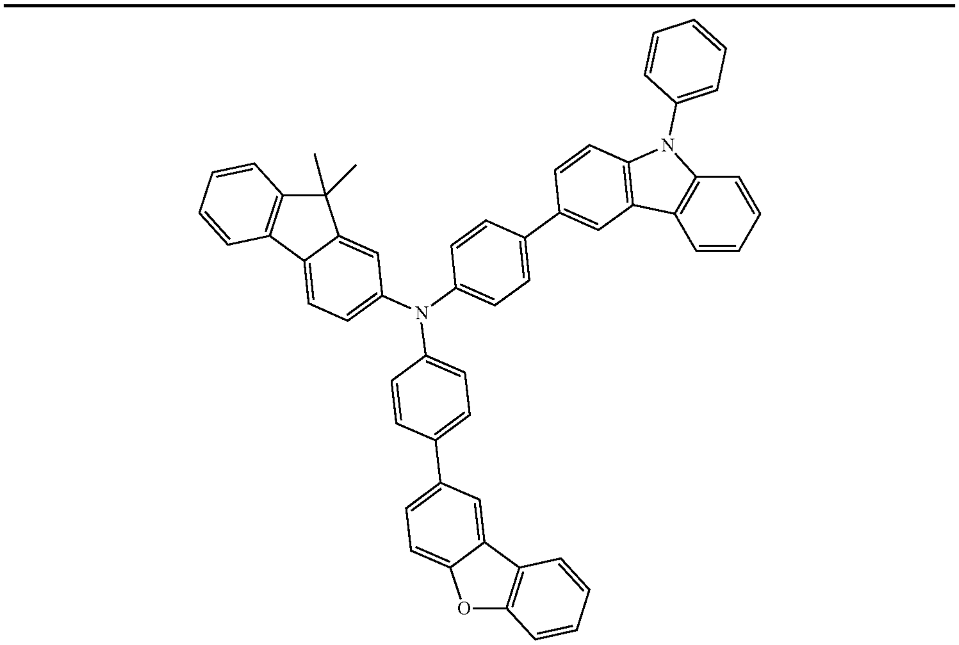
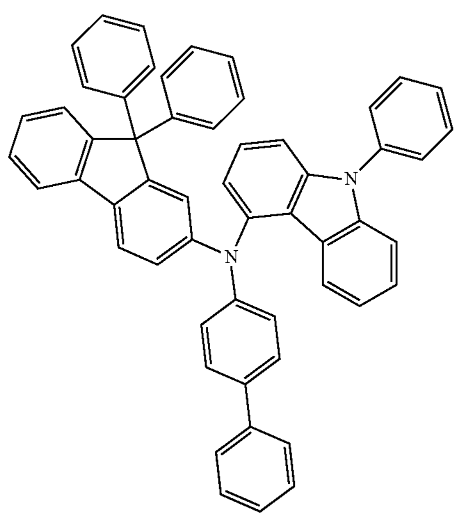 [SMILES: c1ccc(-c2ccc(N(c3ccc4c(c3)C(c3ccccc3)(c3ccccc3)c3ccccc3-4)c3cccc4c3c3ccccc3n4-c3ccccc3)cc2)cc1]
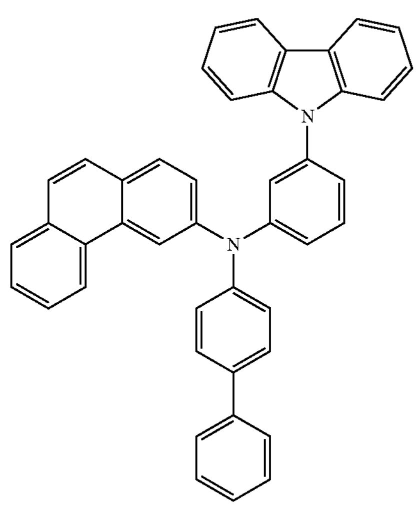 [SMILES: c1ccc(-c2ccc(N(c3cccc(-n4c5ccccc5c5ccccc54)c3)c3ccc4ccc5ccccc5c4c3)cc2)cc1]

-continued
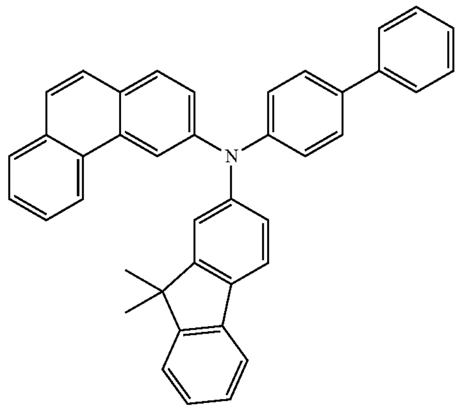 [SMILES: CC1(C)c2ccccc2-c2ccc(N(c3ccc(-c4ccccc4)cc3)c3ccc4ccc5ccccc5c4c3)cc21]
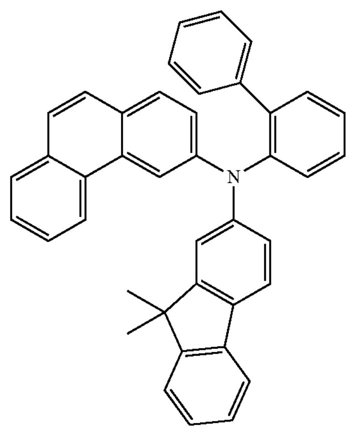 [SMILES: CC1(C)c2ccccc2-c2ccc(N(c3ccc4ccc5ccccc5c4c3)c3ccccc3-c3ccccc3)cc21]
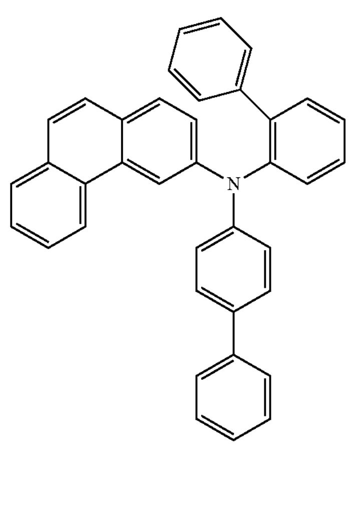 [SMILES: c1ccc(-c2ccc(N(c3ccc4ccc5ccccc5c4c3)c3ccccc3-c3ccccc3)cc2)cc1]

-continued
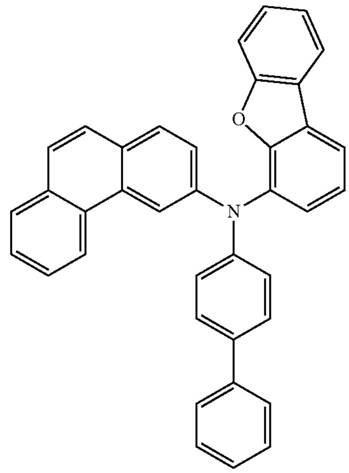 [SMILES: c1ccc(-c2ccc(N(c3ccc4ccc5ccccc5c4c3)c3cccc4c3oc3ccccc34)cc2)cc1]
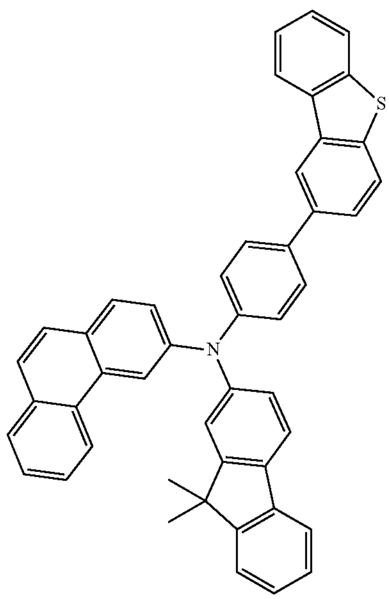 [SMILES: CC1(C)c2ccccc2-c2ccc(N(c3ccc(-c4ccc5sc6ccccc6c5c4)cc3)c3ccc4ccc5ccccc5c4c3)cc21]
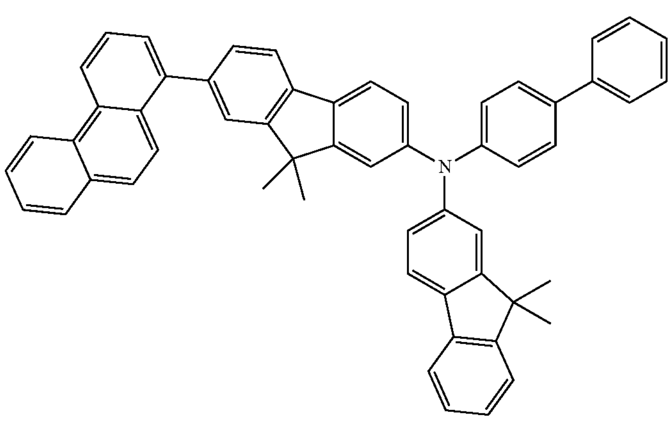 [SMILES: CC1(C)c2ccccc2-c2ccc(N(c3ccc(-c4ccccc4)cc3)c3ccc4c(c3)C(C)(C)c3cc(-c5cccc6c5ccc5ccccc56)ccc3-4)cc21]

-continued
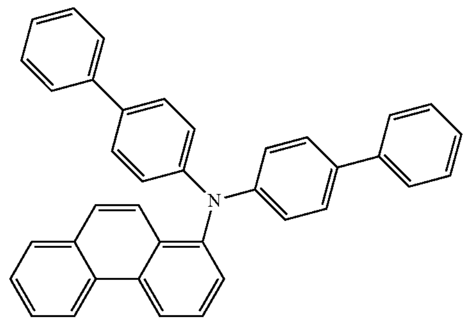 [SMILES: c1ccc(-c2ccc(N(c3ccc(-c4ccccc4)cc3)c3cccc4c3ccc3ccccc34)cc2)cc1]
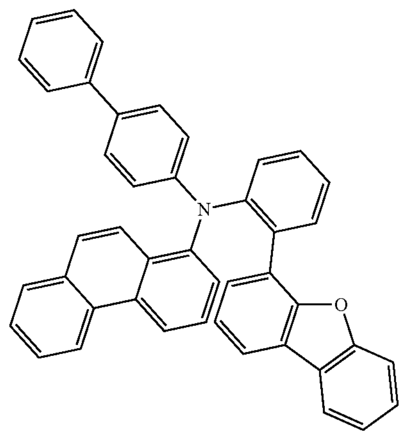 [SMILES: c1ccc(-c2ccc(N(c3ccccc3-c3cccc4c3oc3ccccc34)c3cccc4c3ccc3ccccc34)cc2)cc1]
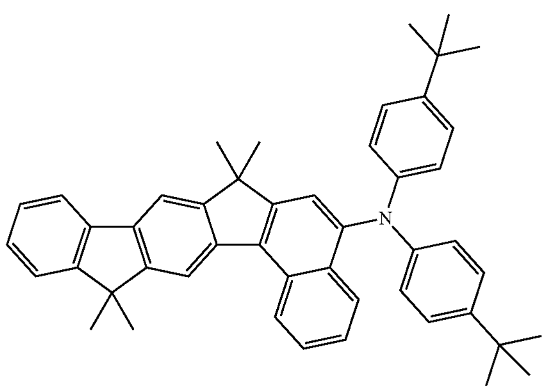 [SMILES: CC(C)(C)c1ccc(N(c2ccc(C(C)(C)C)cc2)c2cc3c(c4ccccc24)-c2cc4c(cc2C3(C)C)-c2ccccc2C4(C)C)cc1]
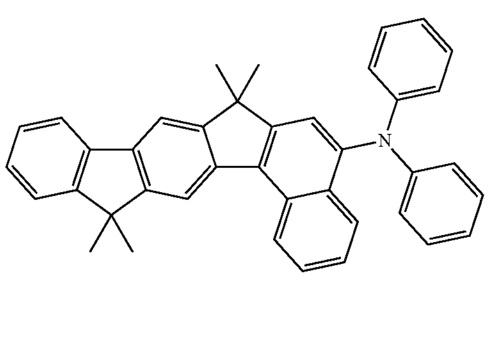 [SMILES: CC1(C)c2ccccc2-c2cc3c(cc21)-c1c(cc(N(c2ccccc2)c2ccccc2)c2ccccc12)C3(C)C]

-continued
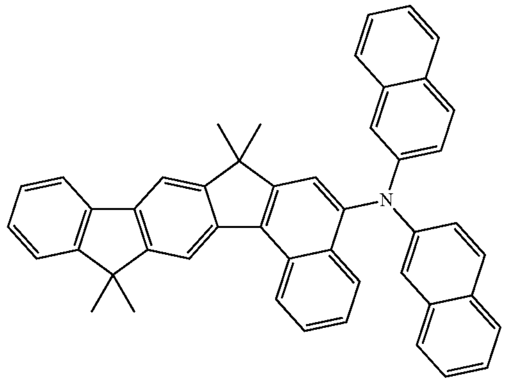 [SMILES: CC1(C)c2ccccc2-c2cc3c(cc21)-c1c(cc(N(c2ccc4ccccc4c2)c2ccc4ccccc4c2)c2ccccc12)C3(C)C]
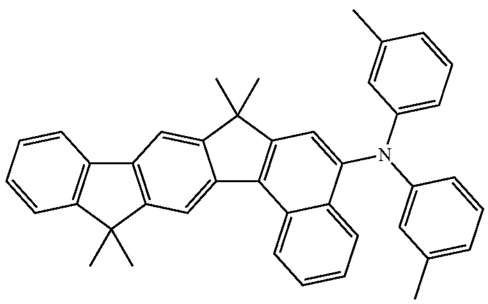 [SMILES: Cc1cccc(N(c2cccc(C)c2)c2cc3c(c4ccccc24)-c2cc4c(cc2C3(C)C)-c2ccccc2C4(C)C)c1]
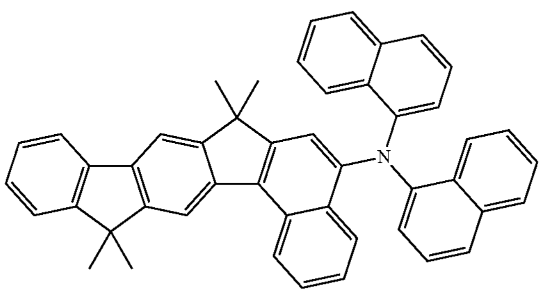 [SMILES: CC1(C)c2ccccc2-c2cc3c(cc21)-c1c(cc(N(c2cccc4ccccc24)c2cccc4ccccc24)c2ccccc12)C3(C)C]
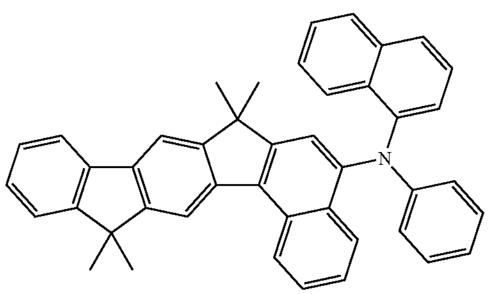 [SMILES: CC1(C)c2ccccc2-c2cc3c(cc21)-c1c(cc(N(c2ccccc2)c2cccc4ccccc24)c2ccccc12)C3(C)C]
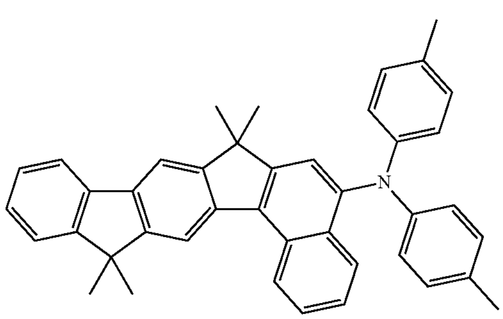 [SMILES: Cc1ccc(N(c2ccc(C)cc2)c2cc3c(c4ccccc24)-c2cc4c(cc2C3(C)C)-c2ccccc2C4(C)C)cc1]

-continued
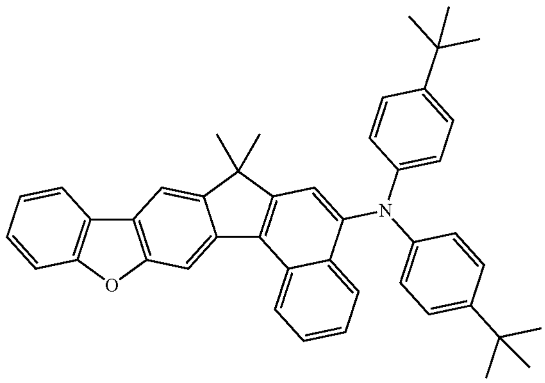 [SMILES: CC(C)(C)c1ccc(N(c2ccc(C(C)(C)C)cc2)c2cc3c(c4ccccc24)-c2cc4oc5ccccc5c4cc2C3(C)C)cc1]
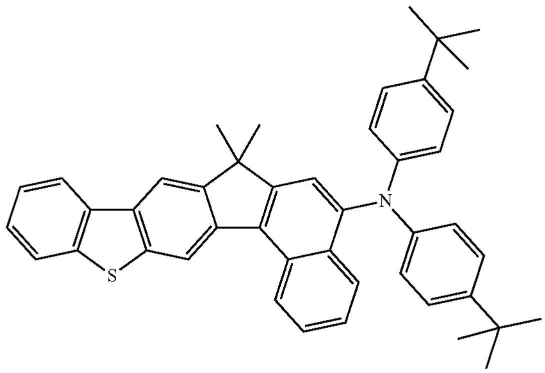 [SMILES: CC(C)(C)c1ccc(N(c2ccc(C(C)(C)C)cc2)c2cc3c(c4ccccc24)-c2cc4sc5ccccc5c4cc2C3(C)C)cc1]
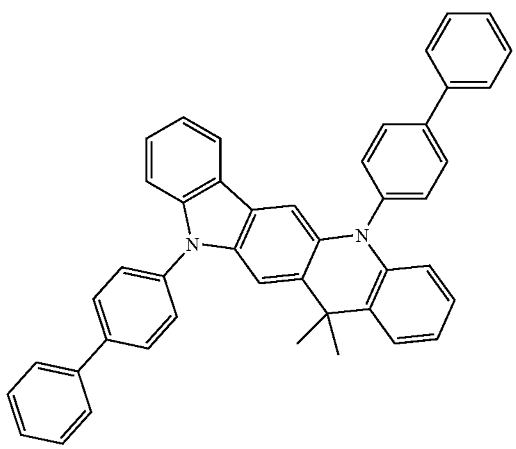 [SMILES: CC1(C)c2ccccc2N(c2ccc(-c3ccccc3)cc2)c2cc3c4ccccc4n(-c4ccc(-c5ccccc5)cc4)c3cc21]
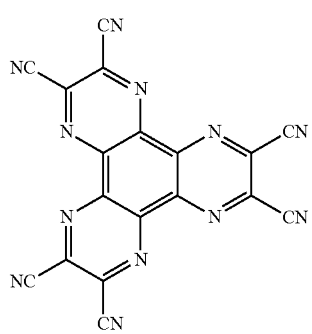 [SMILES: N#Cc1nc2c3nc(C#N)c(C#N)nc3c3nc(C#N)c(C#N)nc3c2nc1C#N]

-continued
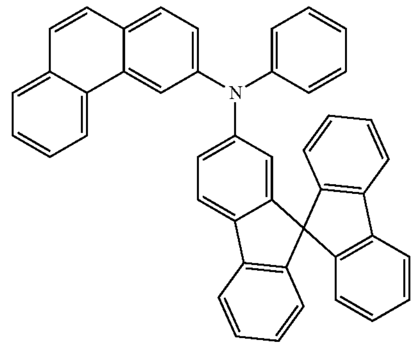 [SMILES: c1ccc(N(c2ccc3c(c2)C2(c4ccccc4-c4ccccc42)c2ccccc2-3)c2ccc3ccc4ccccc4c3c2)cc1]
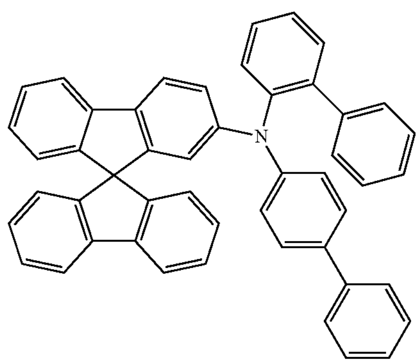 [SMILES: c1ccc(-c2ccc(N(c3ccc4c(c3)C3(c5ccccc5-c5ccccc53)c3ccccc3-4)c3ccccc3-c3ccccc3)cc2)cc1]
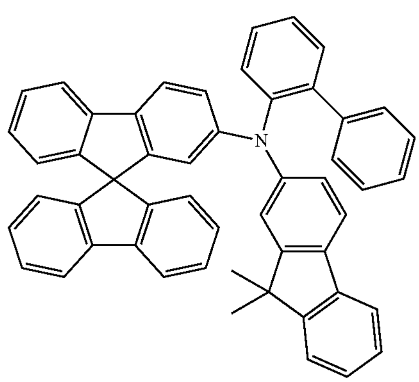 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
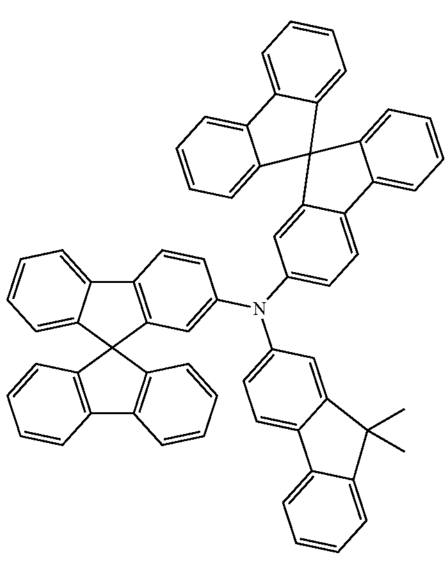 [SMILES: CC1(C)c2ccccc2-c2ccc(N(c3ccc4c(c3)C3(c5ccccc5-c5ccccc53)c3ccccc3-4)c3ccc4c(c3)C3(c5ccccc5-c5ccccc53)c3ccccc3-4)cc21]

-continued
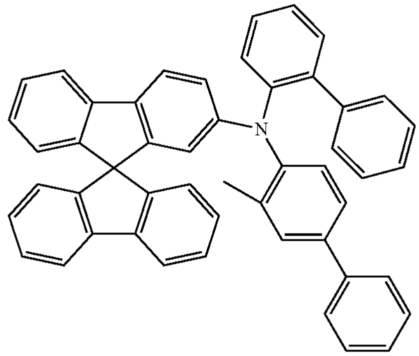 [SMILES: Cc1cc(-c2ccccc2)ccc1N(c1ccc2c(c1)C1(c3ccccc3-c3ccccc31)c1ccccc1-2)c1ccccc1-c1ccccc1]
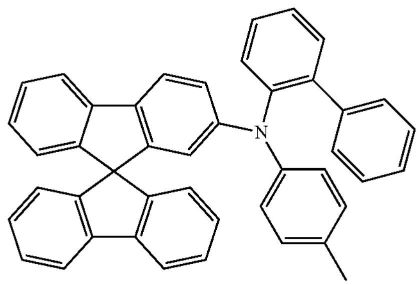 [SMILES: Cc1ccc(N(c2ccc3c(c2)C2(c4ccccc4-c4ccccc42)c2ccccc2-3)c2ccccc2-c2ccccc2)cc1]
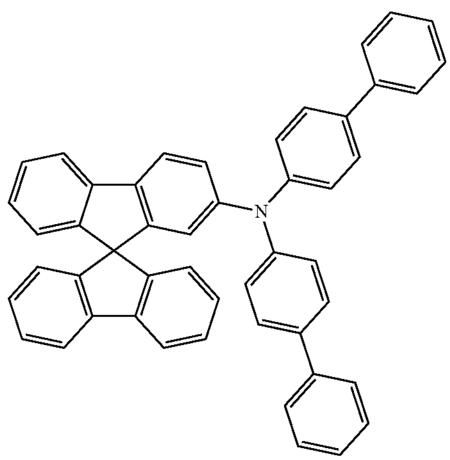 [SMILES: c1ccc(-c2ccc(N(c3ccc(-c4ccccc4)cc3)c3ccc4c(c3)C3(c5ccccc5-c5ccccc53)c3ccccc3-4)cc2)cc1]
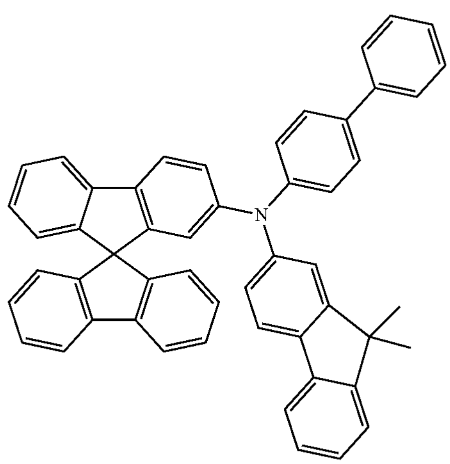 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

-continued
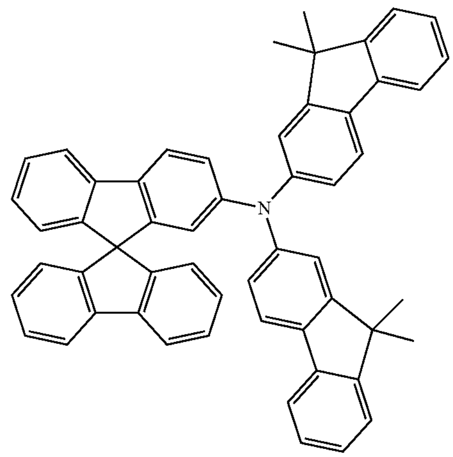 [SMILES: CC1(C)c2ccccc2-c2ccc(N(c3ccc4c(c3)C(C)(C)c3ccccc3-4)c3ccc4c(c3)C3(c5ccccc5-c5ccccc53)c3ccccc3-4)cc21]
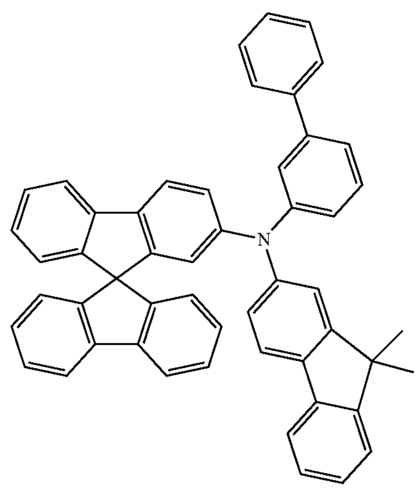 [SMILES: CC1(C)c2ccccc2-c2ccc(N(c3cccc(-c4ccccc4)c3)c3ccc4c(c3)C3(c5ccccc5-c5ccccc53)c3ccccc3-4)cc21]
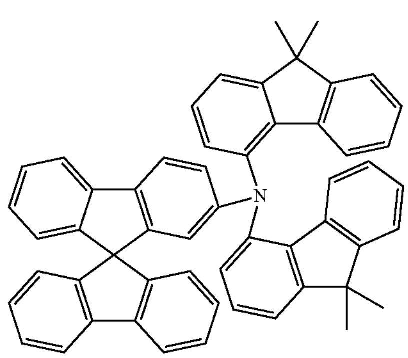 [SMILES: CC1(C)c2ccccc2-c2c(N(c3ccc4c(c3)C3(c5ccccc5-c5ccccc53)c3ccccc3-4)c3cccc4c3-c3ccccc3C4(C)C)cccc21]

-continued
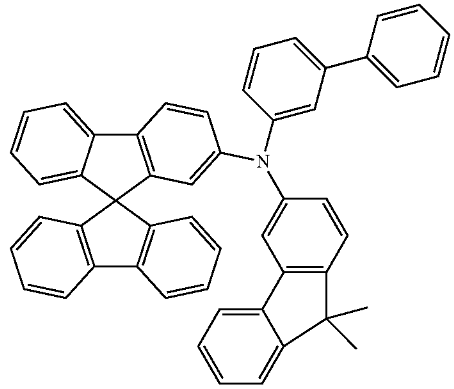 [SMILES: CC1(C)c2ccccc2-c2cc(N(c3cccc(-c4ccccc4)c3)c3ccc4c(c3)C3(c5ccccc5-c5ccccc53)c3ccccc3-4)ccc21]
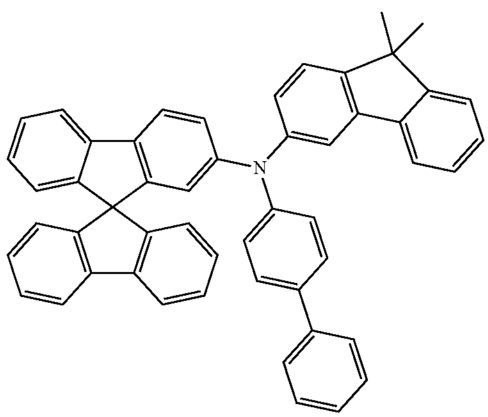 [SMILES: CC1(C)c2ccccc2-c2cc(N(c3ccc(-c4ccccc4)cc3)c3ccc4c(c3)C3(c5ccccc5-c5ccccc53)c3ccccc3-4)ccc21]
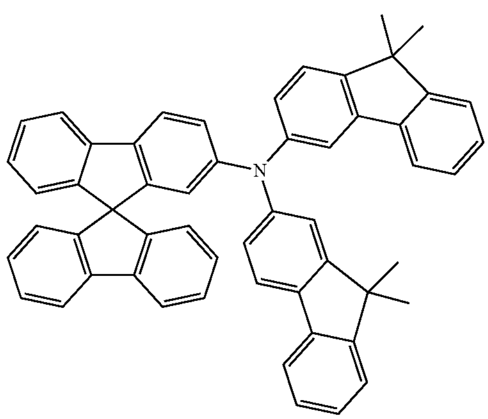 [SMILES: CC1(C)c2ccccc2-c2cc(N(c3ccc4c(c3)C(C)(C)c3ccccc3-4)c3ccc4c(c3)C3(c5ccccc5-c5ccccc53)c3ccccc3-4)ccc21]
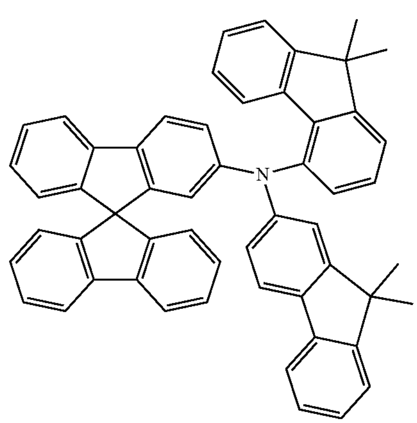 [SMILES: CC1(C)c2ccccc2-c2ccc(N(c3ccc4c(c3)C3(c5ccccc5-c5ccccc53)c3ccccc3-4)c3cccc4c3-c3ccccc3C4(C)C)cc21]

-continued
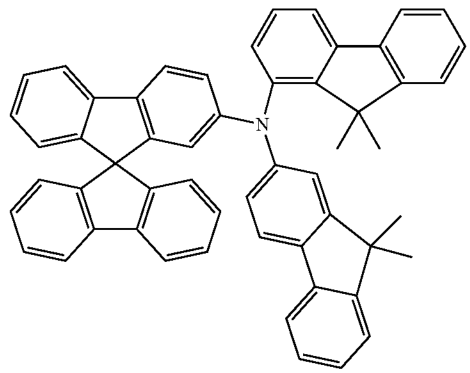 [SMILES: CC1(C)c2ccccc2-c2ccc(N(c3ccc4c(c3)C3(c5ccccc5-c5ccccc53)c3ccccc3-4)c3cccc4c3C(C)(C)c3ccccc3-4)cc21]
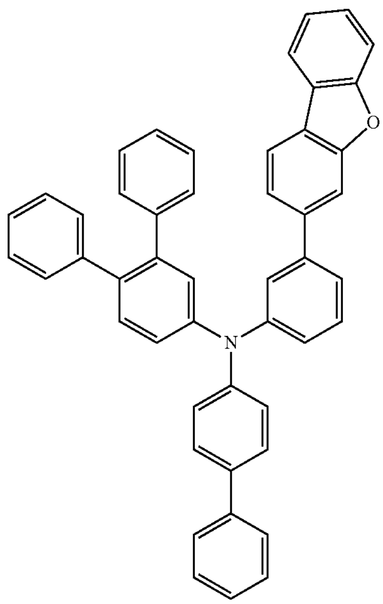 [SMILES: c1ccc(-c2ccc(N(c3cccc(-c4ccc5c(c4)oc4ccccc45)c3)c3ccc(-c4ccccc4)c(-c4ccccc4)c3)cc2)cc1]
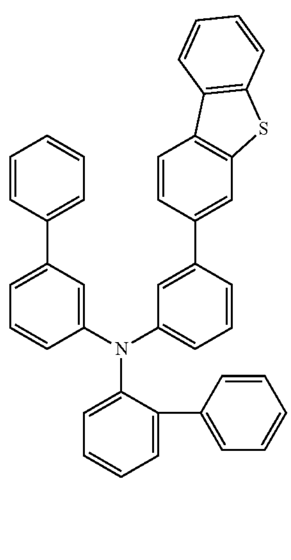 [SMILES: c1ccc(-c2cccc(N(c3cccc(-c4ccc5c(c4)sc4ccccc45)c3)c3ccccc3-c3ccccc3)c2)cc1]

-continued
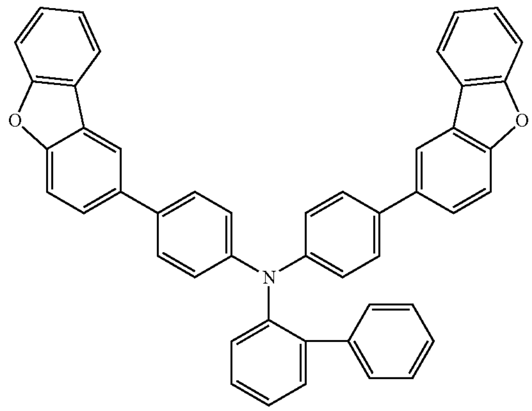 [SMILES: c1ccc(-c2ccccc2N(c2ccc(-c3ccc4oc5ccccc5c4c3)cc2)c2ccc(-c3ccc4oc5ccccc5c4c3)cc2)cc1]
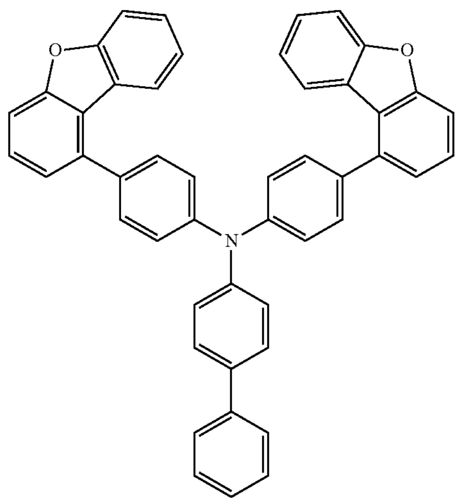 [SMILES: c1ccc(-c2ccc(N(c3ccc(-c4cccc5oc6ccccc6c45)cc3)c3ccc(-c4cccc5oc6ccccc6c45)cc3)cc2)cc1]
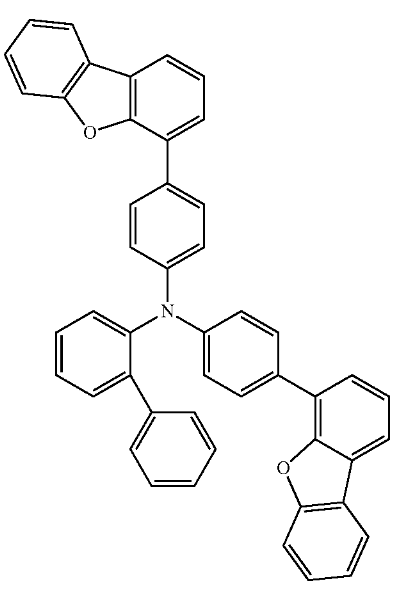 [SMILES: c1ccc(-c2ccccc2N(c2ccc(-c3cccc4c3oc3ccccc34)cc2)c2ccc(-c3cccc4c3oc3ccccc34)cc2)cc1]

-continued
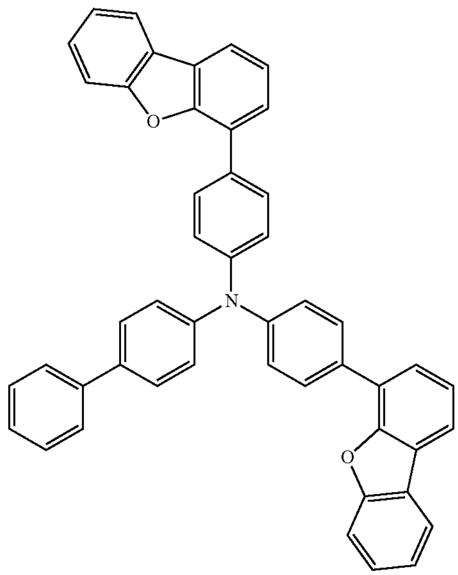 [SMILES: c1ccc(-c2ccc(N(c3ccc(-c4cccc5c4oc4ccccc45)cc3)c3ccc(-c4cccc5c4oc4ccccc45)cc3)cc2)cc1]
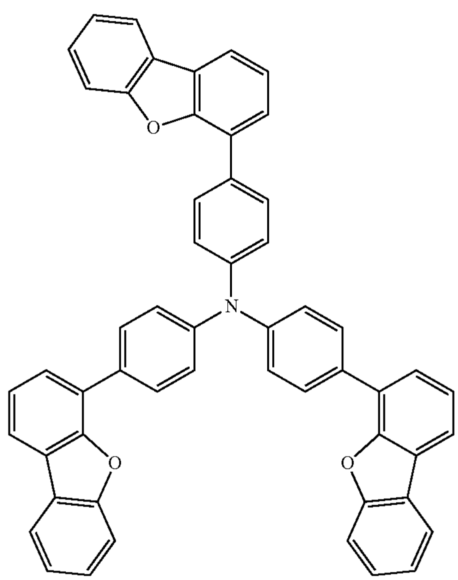 [SMILES: c1ccc2c(c1)oc1c(-c3ccc(N(c4ccc(-c5cccc6c5oc5ccccc56)cc4)c4ccc(-c5cccc6c5oc5ccccc56)cc4)cc3)cccc12]

-continued
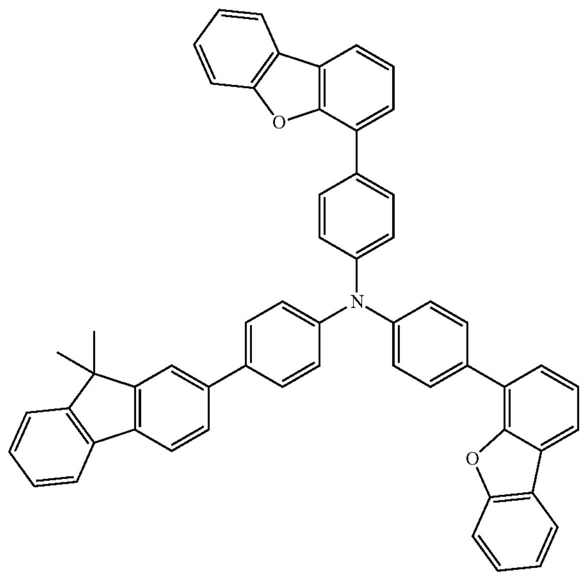 [SMILES: CC1(C)c2ccccc2-c2ccc(-c3ccc(N(c4ccc(-c5cccc6c5oc5ccccc56)cc4)c4ccc(-c5cccc6c5oc5ccccc56)cc4)cc3)cc21]
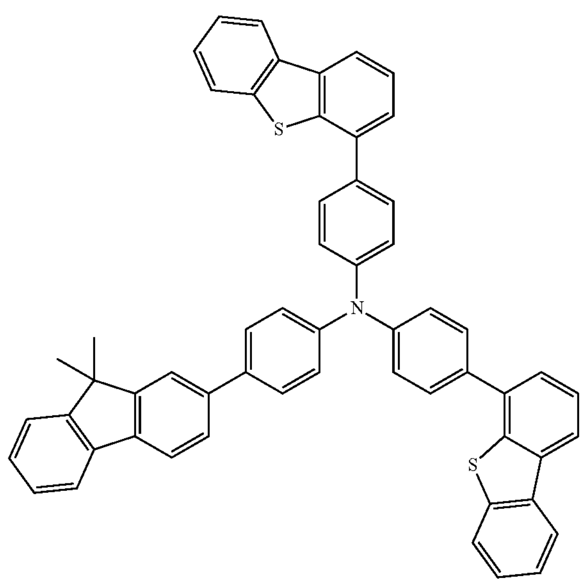

-continued
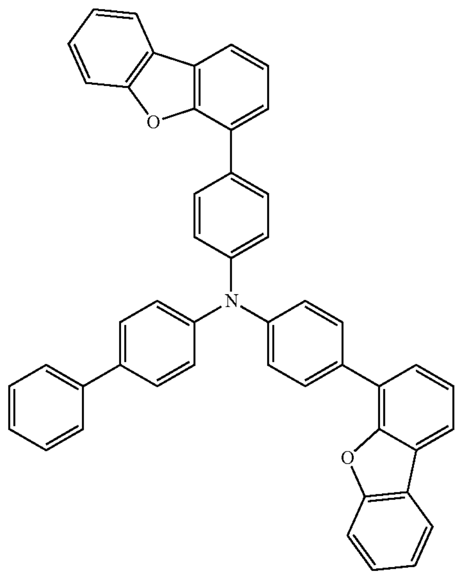 [SMILES: c1ccc(-c2ccc(N(c3ccc(-c4cccc5c4oc4ccccc45)cc3)c3ccc(-c4cccc5c4oc4ccccc45)cc3)cc2)cc1]
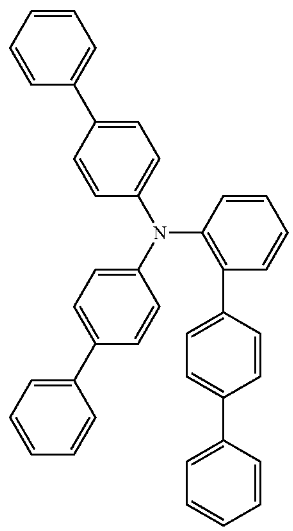 [SMILES: c1ccc(-c2ccc(-c3ccccc3N(c3ccc(-c4ccccc4)cc3)c3ccc(-c4ccccc4)cc3)cc2)cc1]
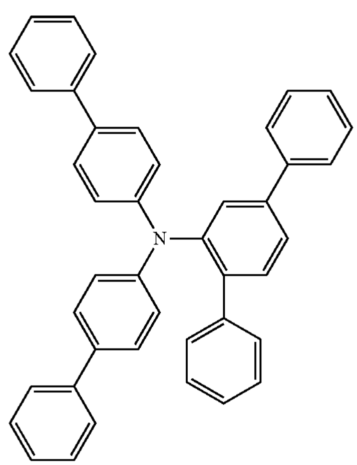 [SMILES: c1ccc(-c2ccc(N(c3ccc(-c4ccccc4)cc3)c3cc(-c4ccccc4)ccc3-c3ccccc3)cc2)cc1]

-continued
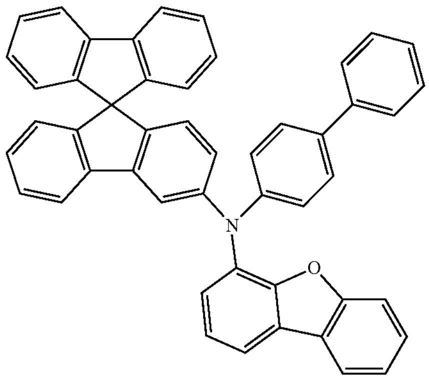 [SMILES: c1ccc(-c2ccc(N(c3ccc4c(c3)-c3ccccc3C43c4ccccc4-c4ccccc43)c3cccc4c3oc3ccccc34)cc2)cc1]
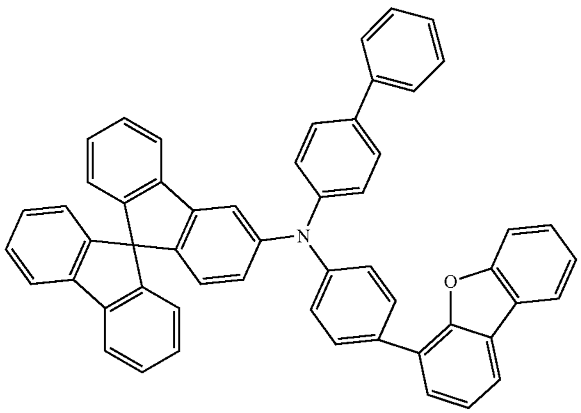 [SMILES: c1ccc(-c2ccc(N(c3ccc(-c4cccc5c4oc4ccccc45)cc3)c3ccc4c(c3)-c3ccccc3C43c4ccccc4-c4ccccc43)cc2)cc1]
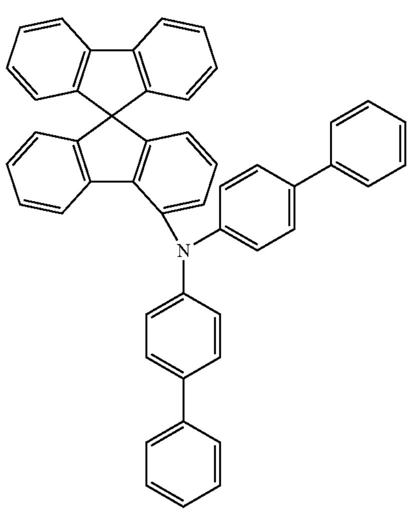 [SMILES: c1ccc(-c2ccc(N(c3ccc(-c4ccccc4)cc3)c3cccc4c3-c3ccccc3C43c4ccccc4-c4ccccc43)cc2)cc1]

-continued
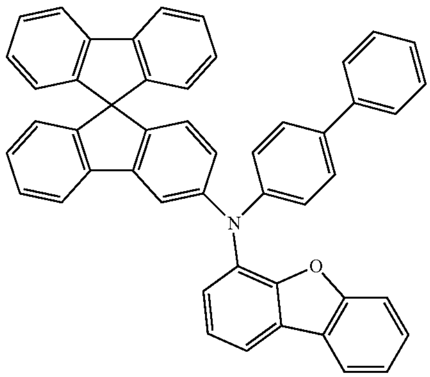 [SMILES: c1ccc(-c2ccc(N(c3ccc4c(c3)-c3ccccc3C43c4ccccc4-c4ccccc43)c3cccc4c3oc3ccccc34)cc2)cc1]
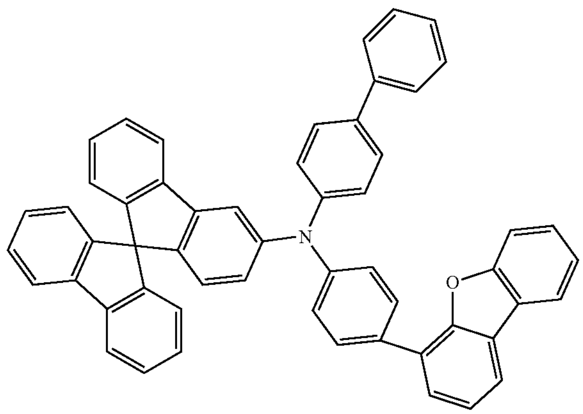 [SMILES: c1ccc(-c2ccc(N(c3ccc(-c4cccc5c4oc4ccccc45)cc3)c3ccc4c(c3)-c3ccccc3C43c4ccccc4-c4ccccc43)cc2)cc1]
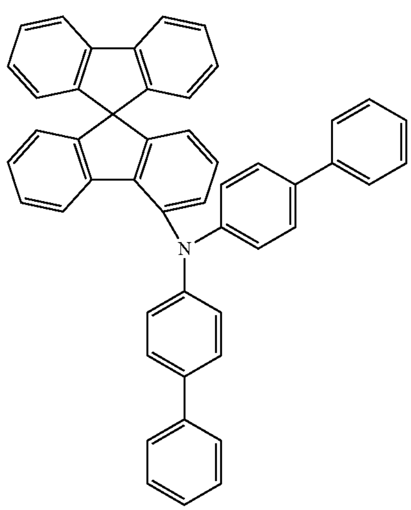 [SMILES: c1ccc(-c2ccc(N(c3ccc(-c4ccccc4)cc3)c3cccc4c3-c3ccccc3C43c4ccccc4-c4ccccc43)cc2)cc1]

-continued
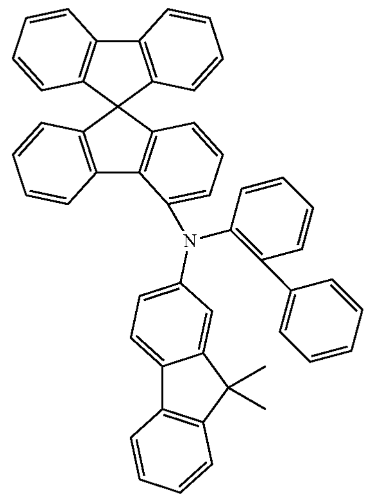 [SMILES: CC1(C)c2ccccc2-c2ccc(N(c3ccccc3-c3ccccc3)c3cccc4c3-c3ccccc3C43c4ccccc4-c4ccccc43)cc21]
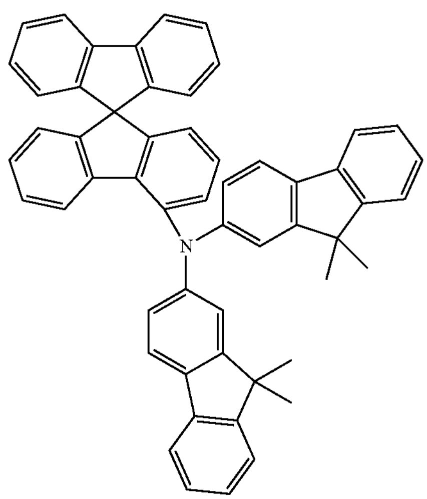 [SMILES: CC1(C)c2ccccc2-c2ccc(N(c3ccc4c(c3)C(C)(C)c3ccccc3-4)c3cccc4c3-c3ccccc3C43c4ccccc4-c4ccccc43)cc21]
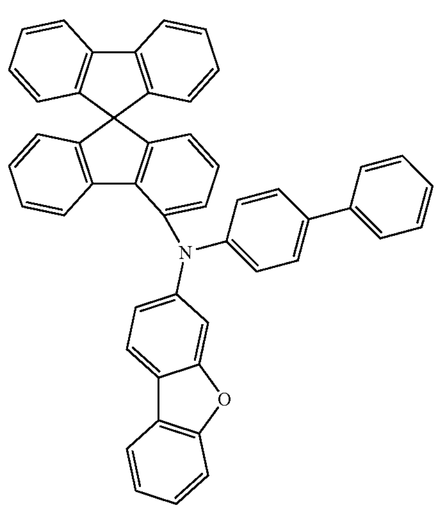 [SMILES: c1ccc(-c2ccc(N(c3ccc4c(c3)oc3ccccc34)c3cccc4c3-c3ccccc3C43c4ccccc4-c4ccccc43)cc2)cc1]

-continued
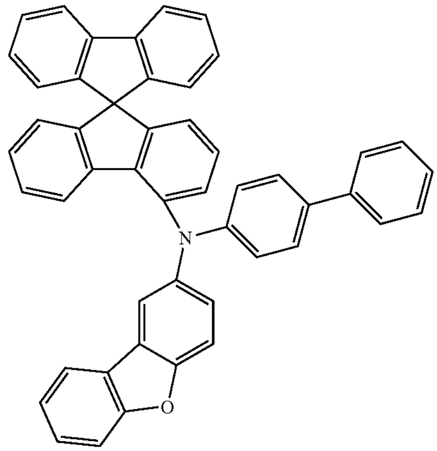 [SMILES: c1ccc(-c2ccc(N(c3ccc4oc5ccccc5c4c3)c3cccc4c3-c3ccccc3C43c4ccccc4-c4ccccc43)cc2)cc1]
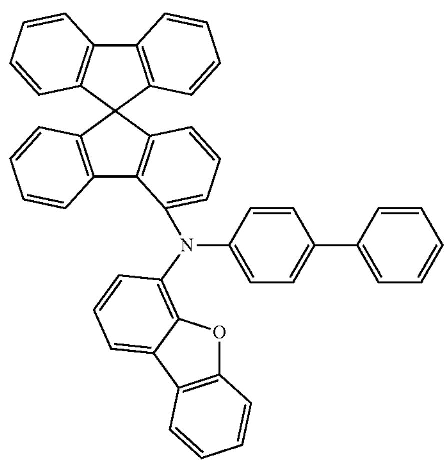 [SMILES: c1ccc(-c2ccc(N(c3cccc4c3-c3ccccc3C43c4ccccc4-c4ccccc43)c3cccc4c3oc3ccccc34)cc2)cc1]
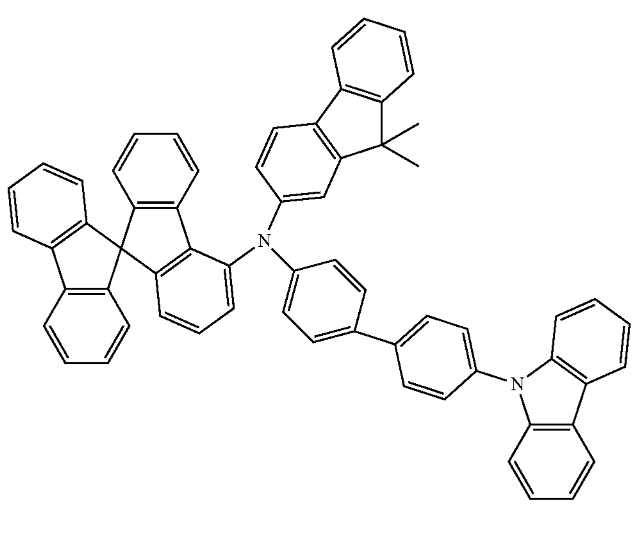 [SMILES: CC1(C)c2ccccc2-c2ccc(N(c3ccc(-c4ccc(-n5c6ccccc6c6ccccc65)cc4)cc3)c3cccc4c3-c3ccccc3C43c4ccccc4-c4ccccc43)cc21]

-continued
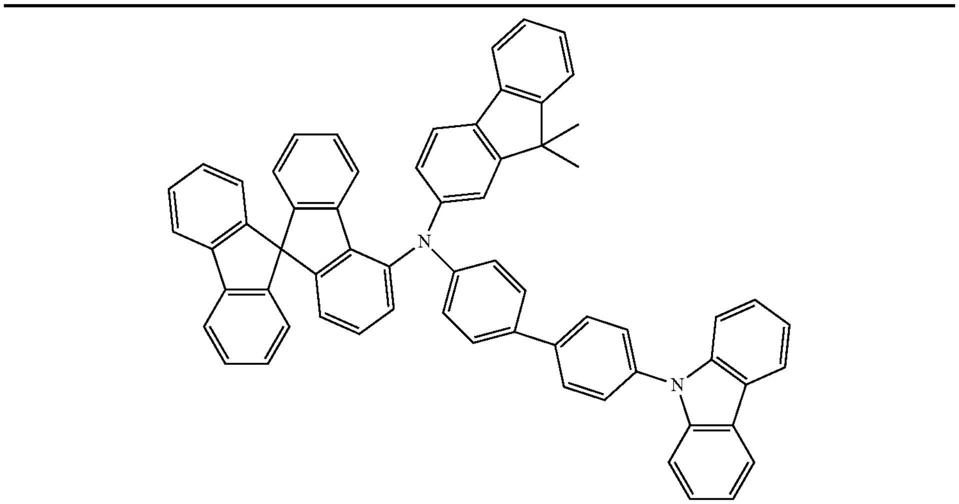
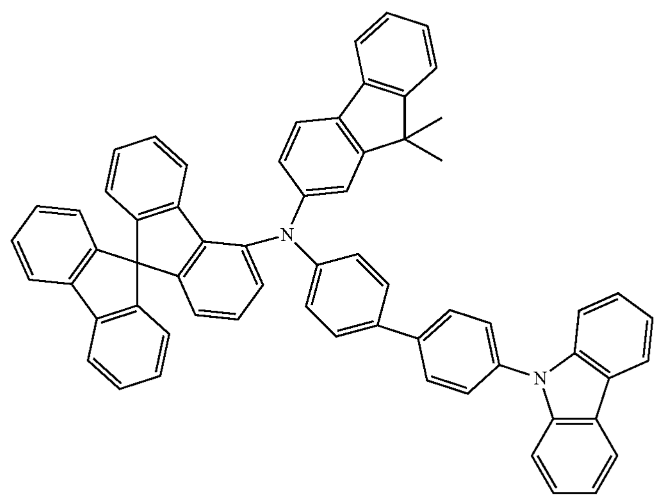 [SMILES: CC1(C)c2ccccc2-c2ccc(N(c3ccc(-c4ccc(-n5c6ccccc6c6ccccc65)cc4)cc3)c3cccc4c3-c3ccccc3C43c4ccccc4-c4ccccc43)cc21]
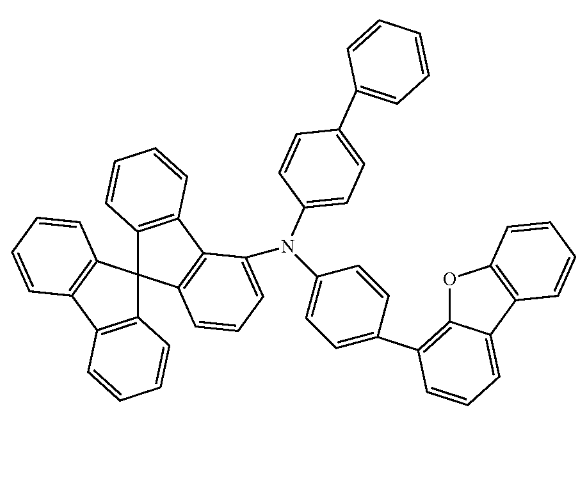 [SMILES: c1ccc(-c2ccc(N(c3ccc(-c4cccc5c4oc4ccccc45)cc3)c3cccc4c3-c3ccccc3C43c4ccccc4-c4ccccc43)cc2)cc1]

-continued
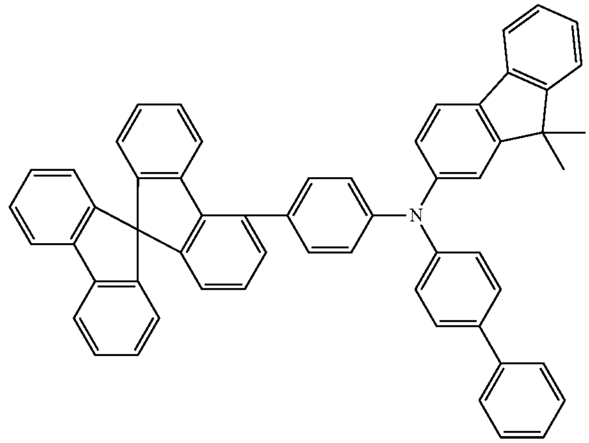 [SMILES: CC1(C)c2ccccc2-c2ccc(N(c3ccc(-c4ccccc4)cc3)c3ccc(-c4cccc5c4-c4ccccc4C54c5ccccc5-c5ccccc54)cc3)cc21]
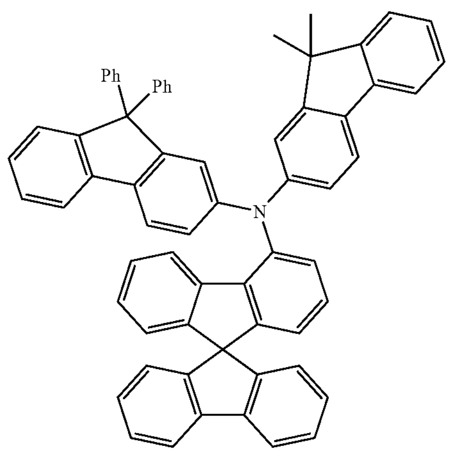 [SMILES: CC1(C)c2ccccc2-c2ccc(N(c3ccc4c(c3)C(c3ccccc3)(c3ccccc3)c3ccccc3-4)c3cccc4c3-c3ccccc3C43c4ccccc4-c4ccccc43)cc21]
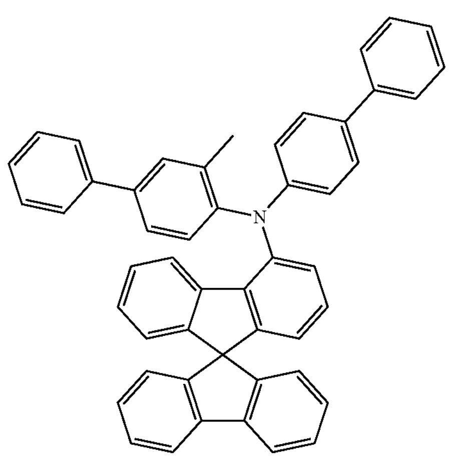 [SMILES: Cc1cc(-c2ccccc2)ccc1N(c1ccc(-c2ccccc2)cc1)c1cccc2c1-c1ccccc1C21c2ccccc2-c2ccccc21]

-continued
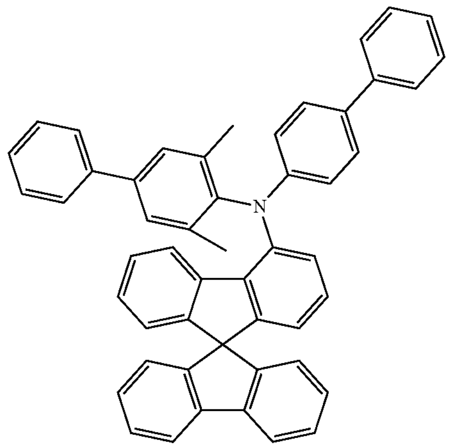 [SMILES: Cc1cc(-c2ccccc2)cc(C)c1N(c1ccc(-c2ccccc2)cc1)c1cccc2c1-c1ccccc1C21c2ccccc2-c2ccccc21]
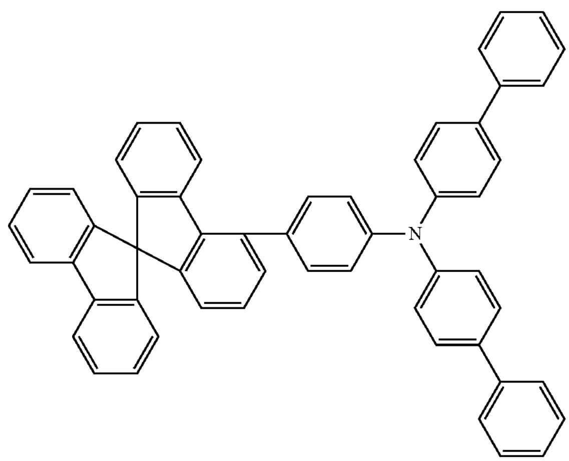 [SMILES: c1ccc(-c2ccc(N(c3ccc(-c4ccccc4)cc3)c3ccc(-c4cccc5c4-c4ccccc4C54c5ccccc5-c5ccccc54)cc3)cc2)cc1]
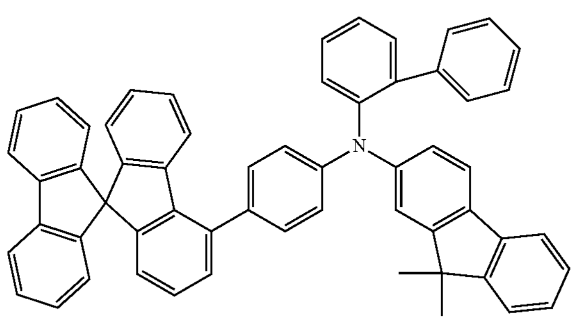 [SMILES: CC1(C)c2ccccc2-c2ccc(N(c3ccc(-c4cccc5c4-c4ccccc4C54c5ccccc5-c5ccccc54)cc3)c3ccccc3-c3ccccc3)cc21]

-continued
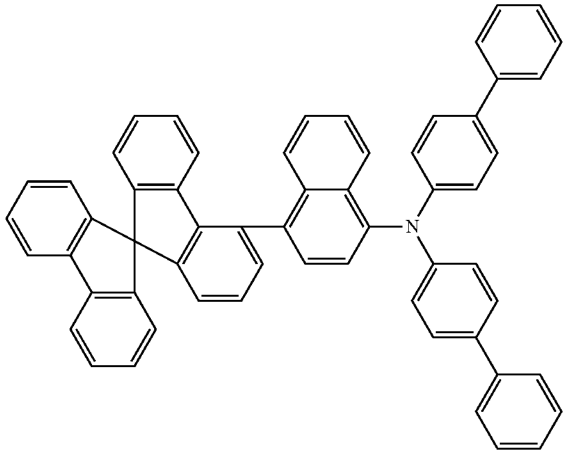 [SMILES: c1ccc(-c2ccc(N(c3ccc(-c4ccccc4)cc3)c3ccc(-c4cccc5c4-c4ccccc4C54c5ccccc5-c5ccccc54)c4ccccc34)cc2)cc1]
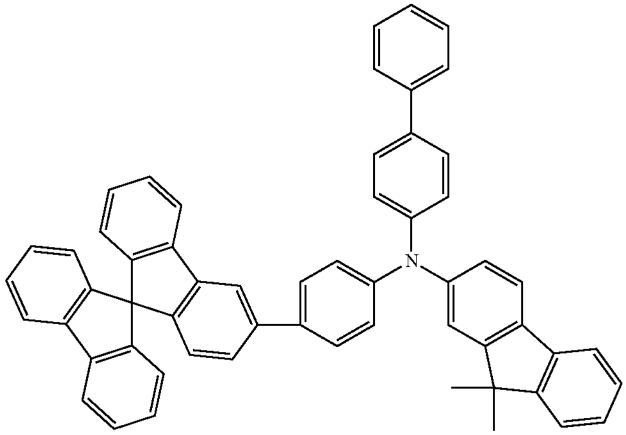 [SMILES: CC1(C)c2ccccc2-c2ccc(N(c3ccc(-c4ccccc4)cc3)c3ccc(-c4ccc5c(c4)-c4ccccc4C54c5ccccc5-c5ccccc54)cc3)cc21]
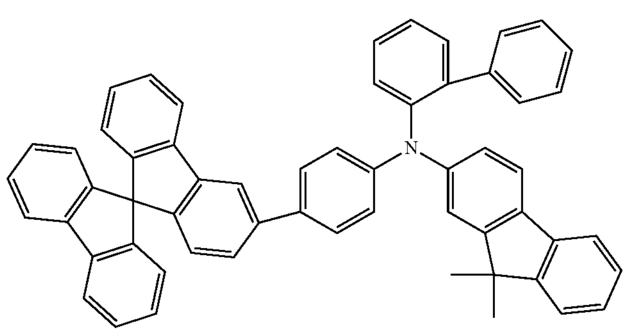 [SMILES: CC1(C)c2ccccc2-c2ccc(N(c3ccc(-c4ccc5c(c4)-c4ccccc4C54c5ccccc5-c5ccccc54)cc3)c3ccccc3-c3ccccc3)cc21]

-continued
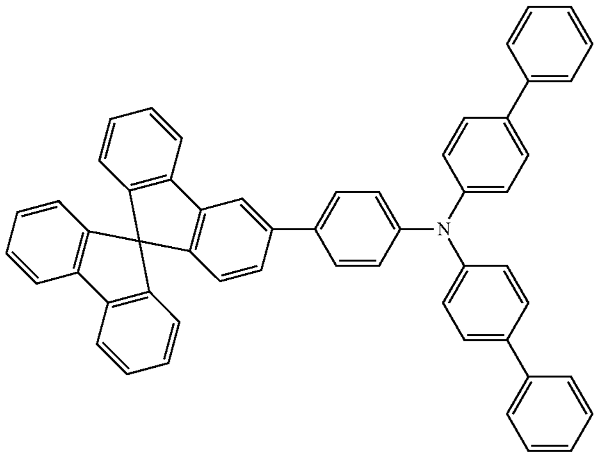 [SMILES: c1ccc(-c2ccc(N(c3ccc(-c4ccccc4)cc3)c3ccc(-c4ccc5c(c4)-c4ccccc4C54c5ccccc5-c5ccccc54)cc3)cc2)cc1]
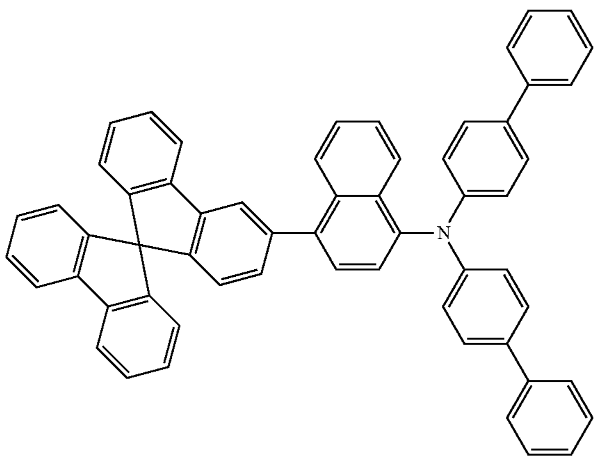 [SMILES: c1ccc(-c2ccc(N(c3ccc(-c4ccccc4)cc3)c3ccc(-c4ccc5c(c4)-c4ccccc4C54c5ccccc5-c5ccccc54)c4ccccc34)cc2)cc1]
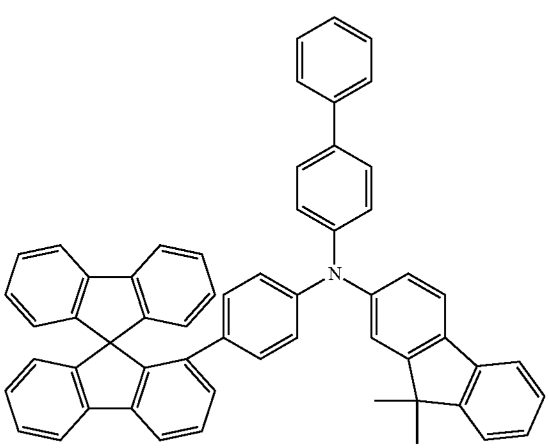 [SMILES: CC1(C)c2ccccc2-c2ccc(N(c3ccc(-c4ccccc4)cc3)c3ccc(-c4cccc5c4C4(c6ccccc6-c6ccccc64)c4ccccc4-5)cc3)cc21]

-continued
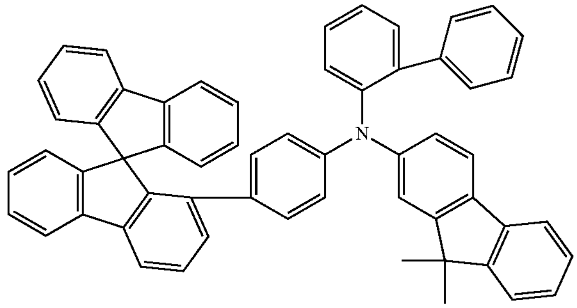 [SMILES: CC1(C)c2ccccc2-c2ccc(N(c3ccc(-c4cccc5c4C4(c6ccccc6-c6ccccc64)c4ccccc4-5)cc3)c3ccccc3-c3ccccc3)cc21]
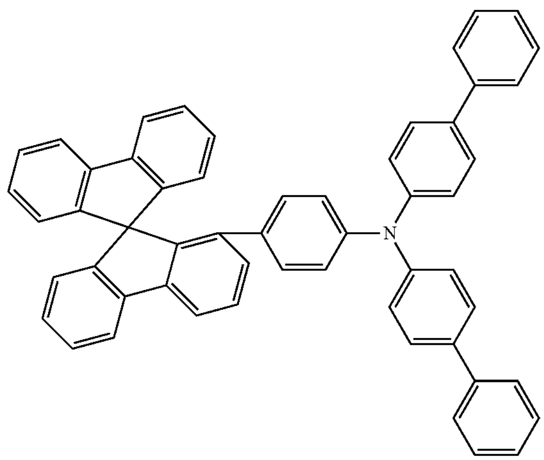 [SMILES: c1ccc(-c2ccc(N(c3ccc(-c4ccccc4)cc3)c3ccc(-c4cccc5c4C4(c6ccccc6-c6ccccc64)c4ccccc4-5)cc3)cc2)cc1]
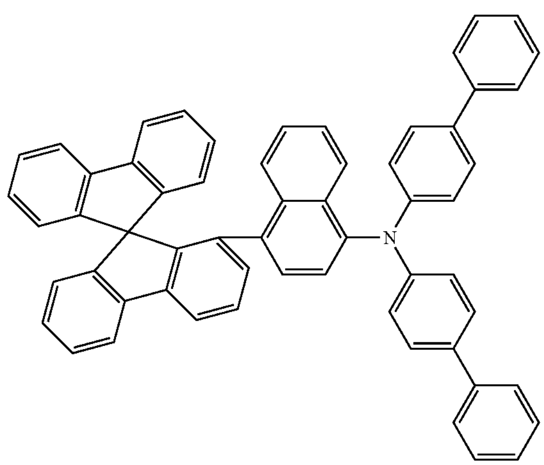 [SMILES: c1ccc(-c2ccc(N(c3ccc(-c4ccccc4)cc3)c3ccc(-c4cccc5c4C4(c6ccccc6-c6ccccc64)c4ccccc4-5)c4ccccc34)cc2)cc1]
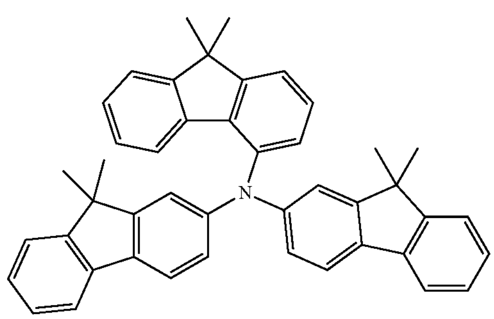 [SMILES: CC1(C)c2ccccc2-c2ccc(N(c3ccc4c(c3)C(C)(C)c3ccccc3-4)c3cccc4c3-c3ccccc3C4(C)C)cc21]

-continued

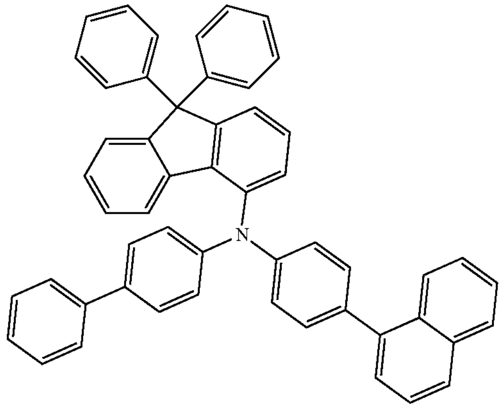 [SMILES: c1ccc(-c2ccc(N(c3ccc(-c4cccc5ccccc45)cc3)c3cccc4c3-c3ccccc3C4(c3ccccc3)c3ccccc3)cc2)cc1]

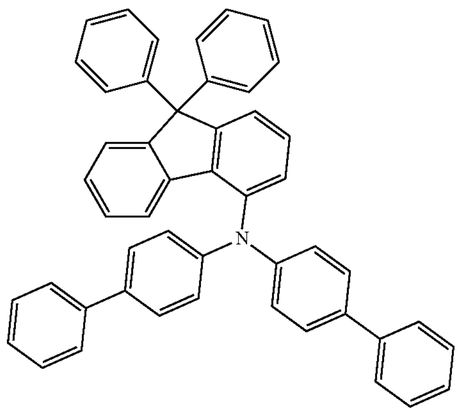 [SMILES: c1ccc(-c2ccc(N(c3ccc(-c4ccccc4)cc3)c3cccc4c3-c3ccccc3C4(c3ccccc3)c3ccccc3)cc2)cc1]

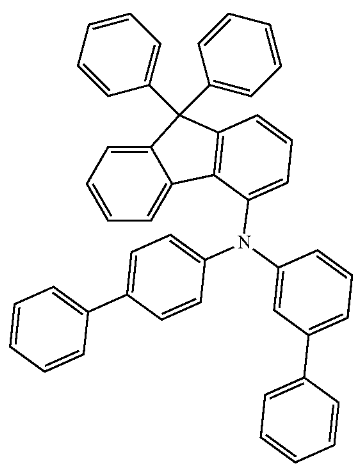 [SMILES: c1ccc(-c2ccc(N(c3cccc(-c4ccccc4)c3)c3cccc4c3-c3ccccc3C4(c3ccccc3)c3ccccc3)cc2)cc1]

It is likewise possible for interlayers to be introduced between two emitting layers, which have, for example, an exciton-blocking function and/or control charge balance in the electroluminescent device and/or generate charges (charge generation layer, for example in layer systems having two or more emitting layers, for example in white-emitting OLED components).

However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce. White-emitting organic electroluminescent devices may be used for lighting applications or else with colour filters for full-colour displays.

In a preferred embodiment of the invention, the organic electroluminescent device comprises the metal complex of the invention as emitting compound in one or more emitting layers.

When the metal complex of the invention is used as emitting compound in an emitting layer, it is preferably used in combination with one or more matrix materials. The mixture of the metal complex of the invention and the matrix material contains between 0.1% and 99% by volume, preferably between 1% and 90% by volume, more preferably between 3% and 40% by volume and especially between 5% and 15% by volume of the metal complex of the invention, based on the overall mixture of emitter and matrix material. Correspondingly, the mixture contains between 99.9% and 1% by volume, preferably between 99% and 10% by volume, more preferably between 97% and 60% by volume and especially between 95% and 85% by volume of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds of the invention are ketones, phosphine oxides, sulphoxides and sulphones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, combinations of triazines and carbazoles, for example according to WO 2011/057706 or WO 2014/015931, indolocarbazole derivatives, for example according to WO 2007/063754 or WO 2008/056746, indenocarbazole derivatives, for example according to WO 2010/136109, WO 2011/000455, WO 2013/041176 or WO 2013/056776, spiroindenocarbazole derivatives, for example according to WO 2014/094963 or WO 2015/124255, azacarbazoles, for example according to EP 1617710, EP 1617711, EP 1731584, JP 2005/347160, bipolar matrix materials, for example according to WO 2007/137725, lactams, for example according to WO 2011/116865, WO 2011/137951, WO 2013/064206 or WO 2014/056567, silanes, for example according to WO 2005/111172, azaboroles or boronic esters, for example according to WO 2006/117052 or WO 2013/091762, diazasilole derivatives, for example according to WO 2010/054729, diazaphosphole derivatives, for example according to WO 2010/054730, triazine derivatives, for example according to WO 2010/015306, WO 2007/063754, WO 2008/056746 or WO 2014/023388, zinc complexes, for example according to EP 652273 or WO 2009/062578, dibenzofuran derivatives, for example according to WO 2009/148015 or the unpublished applications EP 14001573.6, EP 14002642.8 or EP 14002819.2, bridged carbazole derivatives, for example according to US 2009/0136779, WO 2010/050778, WO 2011/042107 or WO 2011/088877, or triphenylene derivatives, for example according to WO 2012/048781.

Examples of suitable triplet matrix materials are listed in the tables which follow.

Examples of suitable triazine and pyrimidine derivatives are the following structures:

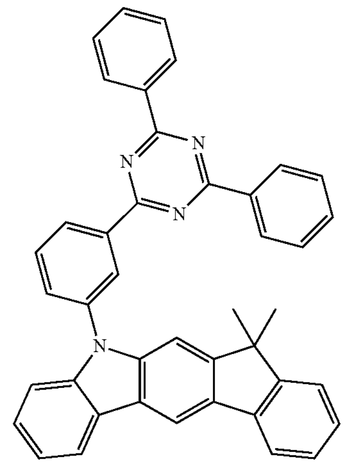 [SMILES: CC1(C)c2ccccc2-c2cc3c4ccccc4n(-c4cccc(-c5nc(-c6ccccc6)nc(-c6ccccc6)n5)c4)c3cc21]

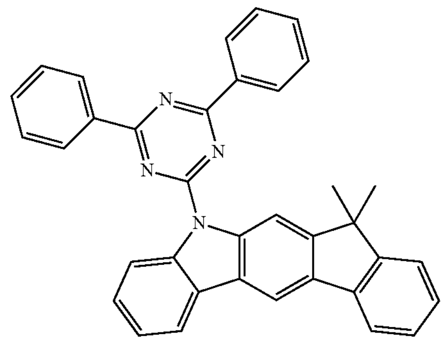 [SMILES: CC1(C)c2ccccc2-c2cc3c4ccccc4n(-c4nc(-c5ccccc5)nc(-c5ccccc5)n4)c3cc21]

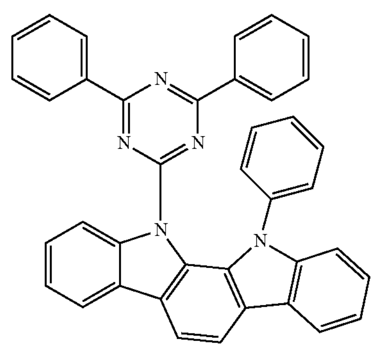 [SMILES: c1ccc(-c2nc(-c3ccccc3)nc(-n3c4ccccc4c4ccc5c6ccccc6n(-c6ccccc6)c5c43)n2)cc1]

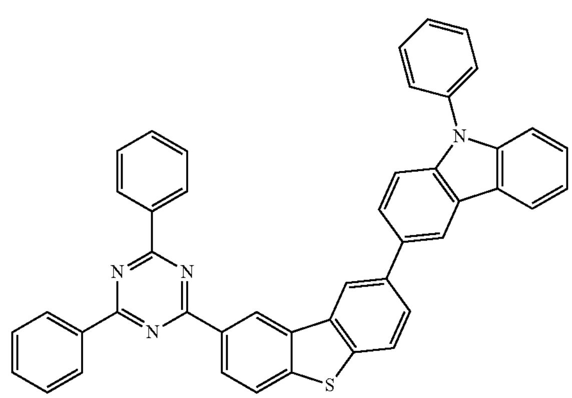 [SMILES: c1ccc(-c2nc(-c3ccccc3)nc(-c3ccc4sc5ccc(-c6ccc7c(c6)c6ccccc6n7-c6ccccc6)cc5c4c3)n2)cc1]

-continued
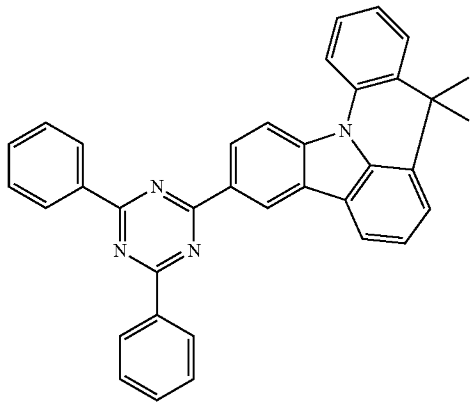 [SMILES: CC1(C)c2ccccc2-n2c3ccc(-c4nc(-c5ccccc5)nc(-c5ccccc5)n4)cc3c3cccc1c32]
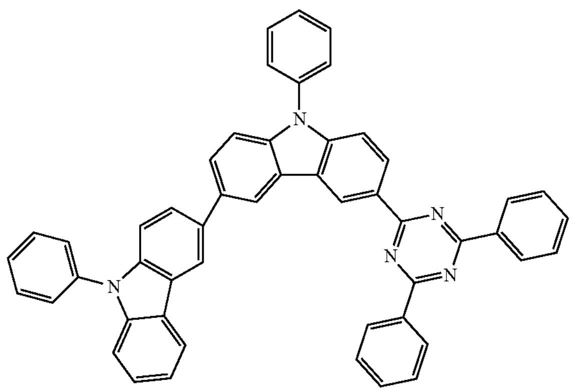 [SMILES: c1ccc(-c2nc(-c3ccccc3)nc(-c3ccc4c(c3)c3cc(-c5ccc6c(c5)c5ccccc5n6-c5ccccc5)ccc3n4-c3ccccc3)n2)cc1]
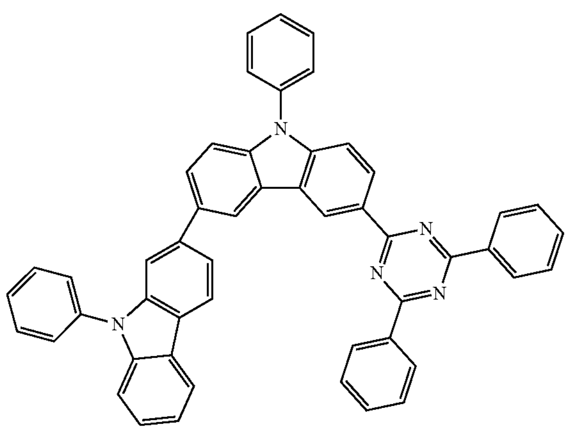 [SMILES: c1ccc(-c2nc(-c3ccccc3)nc(-c3ccc4c(c3)c3cc(-c5ccc6c7ccccc7n(-c7ccccc7)c6c5)ccc3n4-c3ccccc3)n2)cc1]
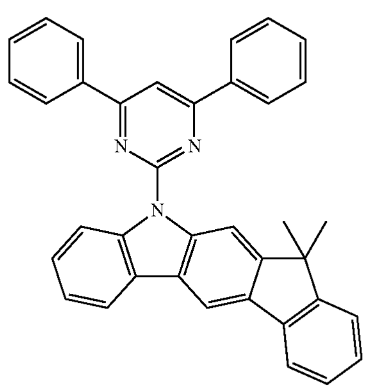 [SMILES: CC1(C)c2ccccc2-c2cc3c4ccccc4n(-c4nc(-c5ccccc5)cc(-c5ccccc5)n4)c3cc21]
-continued
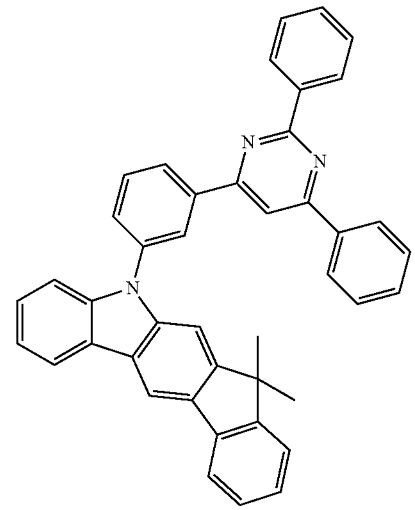 [SMILES: CC1(C)c2ccccc2-c2cc3c4ccccc4n(-c4cccc(-c5cc(-c6ccccc6)nc(-c6ccccc6)n5)c4)c3cc21]
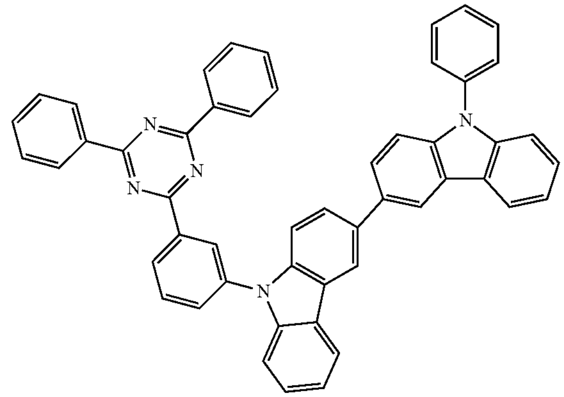 [SMILES: c1ccc(-c2nc(-c3ccccc3)nc(-c3cccc(-n4c5ccccc5c5cc(-c6ccc7c(c6)c6ccccc6n7-c6ccccc6)ccc54)c3)n2)cc1]
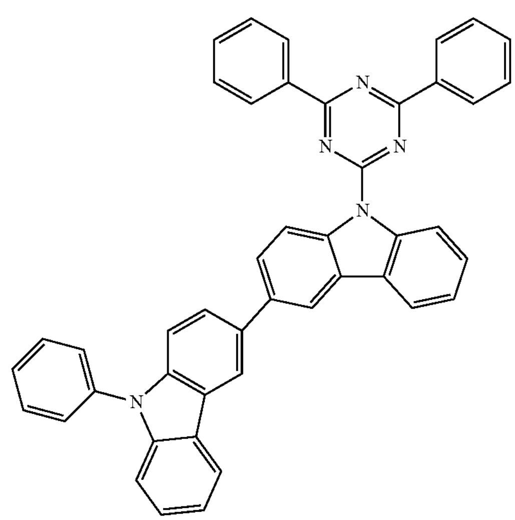 [SMILES: c1ccc(-c2nc(-c3ccccc3)nc(-n3c4ccccc4c4cc(-c5ccc6c(c5)c5ccccc5n6-c5ccccc5)ccc43)n2)cc1]

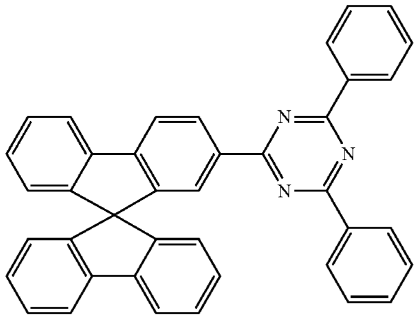 [SMILES: c1ccc(-c2nc(-c3ccccc3)nc(-c3ccc4c(c3)C3(c5ccccc5-c5ccccc53)c3ccccc3-4)n2)cc1]
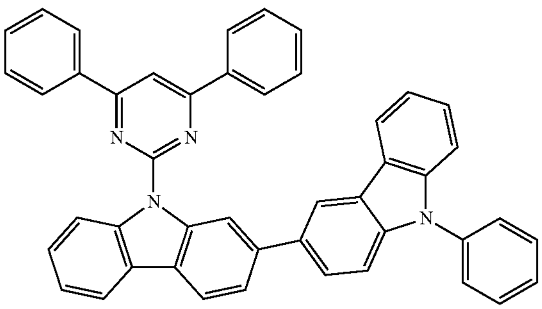 [SMILES: c1ccc(-c2cc(-c3ccccc3)nc(-n3c4ccccc4c4ccc(-c5ccc6c(c5)c5ccccc5n6-c5ccccc5)cc43)n2)cc1]
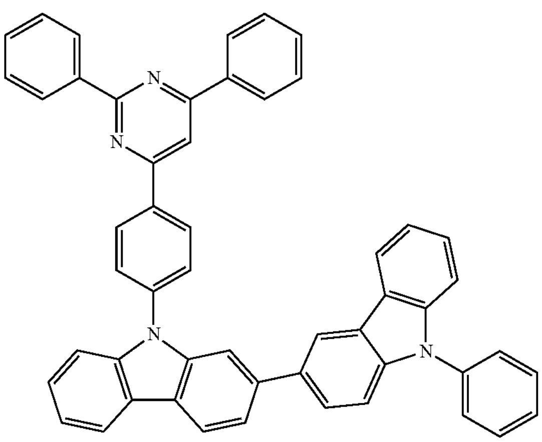 [SMILES: c1ccc(-c2cc(-c3ccc(-n4c5ccccc5c5ccc(-c6ccc7c(c6)c6ccccc6n7-c6ccccc6)cc54)cc3)nc(-c3ccccc3)n2)cc1]
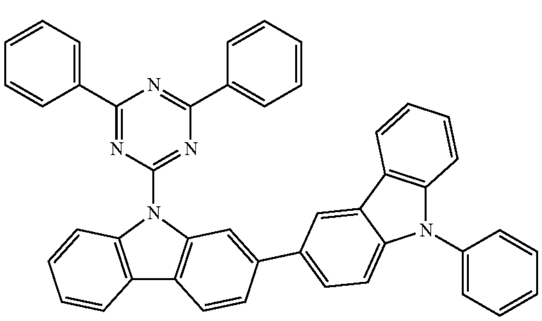 [SMILES: c1ccc(-c2nc(-c3ccccc3)nc(-n3c4ccccc4c4ccc(-c5ccc6c(c5)c5ccccc5n6-c5ccccc5)cc43)n2)cc1]
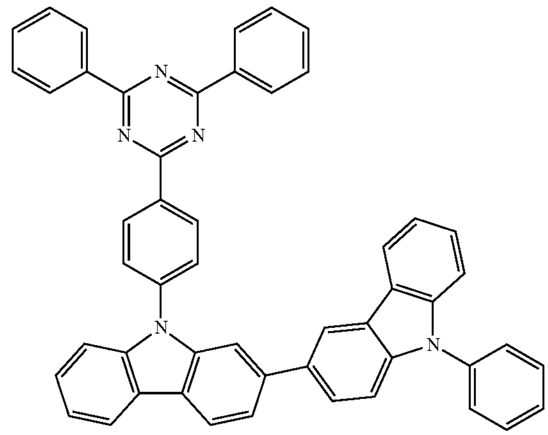 [SMILES: c1ccc(-c2nc(-c3ccccc3)nc(-c3ccc(-n4c5ccccc5c5ccc(-c6ccc7c(c6)c6ccccc6n7-c6ccccc6)cc54)cc3)n2)cc1]
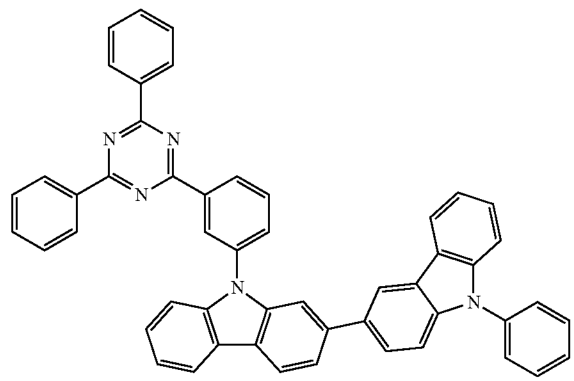 [SMILES: c1ccc(-c2nc(-c3ccccc3)nc(-c3cccc(-n4c5ccccc5c5ccc(-c6ccc7c(c6)c6ccccc6n7-c6ccccc6)cc54)c3)n2)cc1]
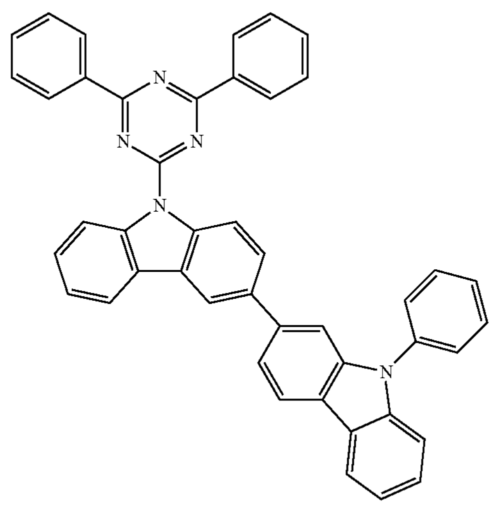 [SMILES: c1ccc(-c2nc(-c3ccccc3)nc(-n3c4ccccc4c4cc(-c5ccc6c7ccccc7n(-c7ccccc7)c6c5)ccc43)n2)cc1]

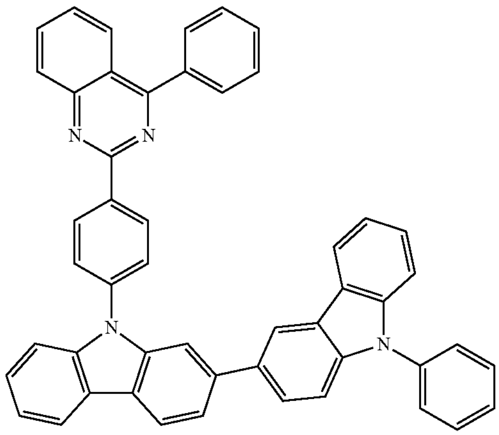 [SMILES: c1ccc(-c2nc(-c3ccc(-n4c5ccccc5c5ccc(-c6ccc7c(c6)c6ccccc6n7-c6ccccc6)cc54)cc3)nc3ccccc23)cc1]
N
N
N
N
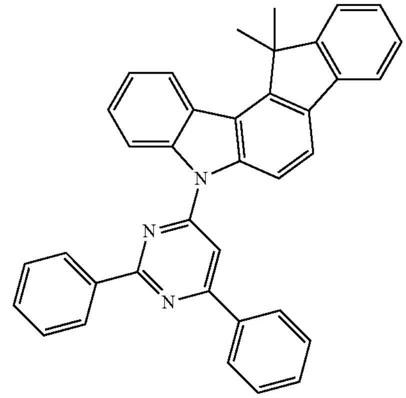 [SMILES: CC1(C)c2ccccc2-c2ccc3c(c21)c1ccccc1n3-c1cc(-c2ccccc2)nc(-c2ccccc2)n1]
N
N
N
N
N
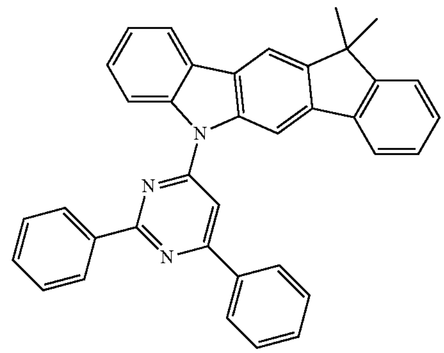
N
N
N
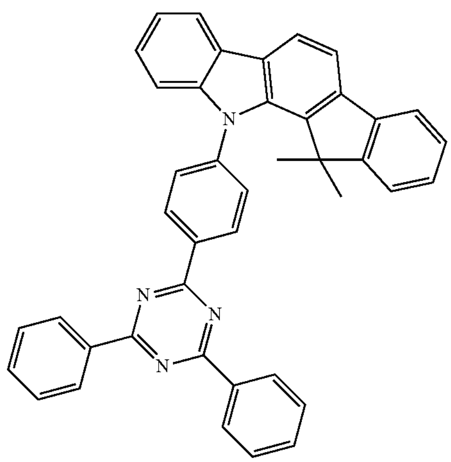
N
N
N
N
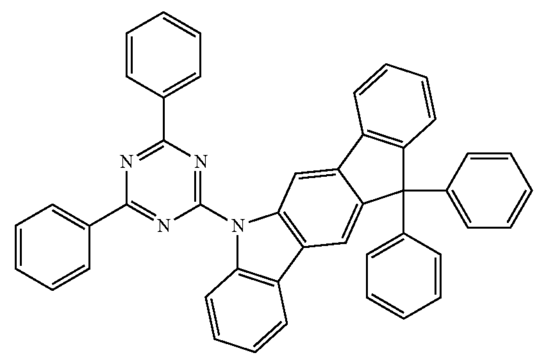 [SMILES: c1ccc(-c2nc(-c3ccccc3)nc(-n3c4ccccc4c4cc5c(cc43)-c3ccccc3C5(c3ccccc3)c3ccccc3)n2)cc1]
N
N
N
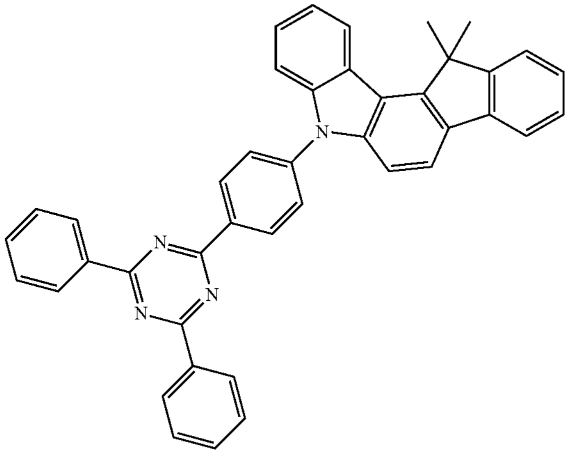
N
N
N
N
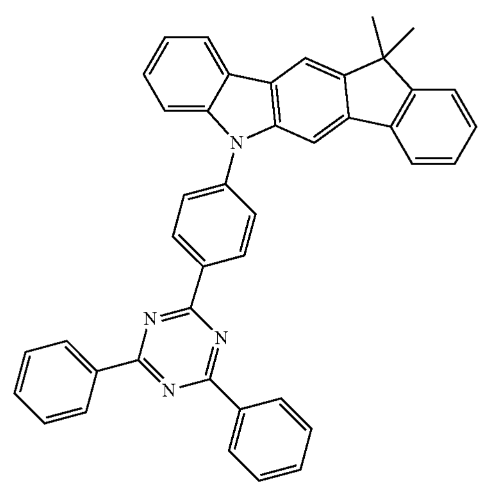 [SMILES: CC1(C)c2ccccc2-c2cc3c(cc21)c1ccccc1n3-c1ccc(-c2nc(-c3ccccc3)nc(-c3ccccc3)n2)cc1]
N
N
N
N -continued
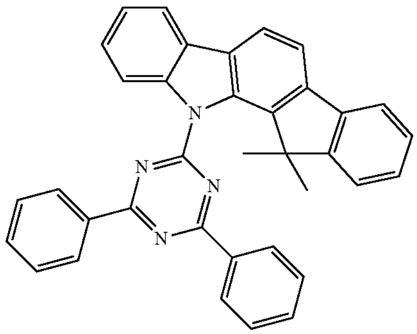 [SMILES: CC1(C)c2ccccc2-c2ccc3c4ccccc4n(-c4nc(-c5ccccc5)nc(-c5ccccc5)n4)c3c21]
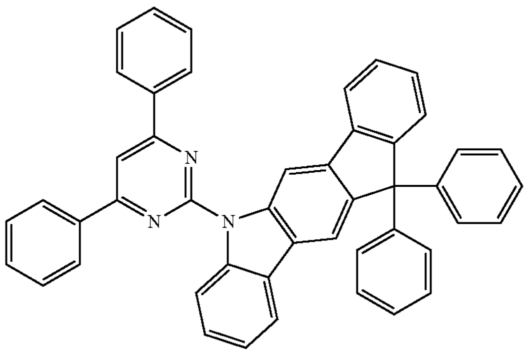 [SMILES: c1ccc(-c2cc(-c3ccccc3)nc(-n3c4ccccc4c4cc5c(cc43)-c3ccccc3C5(c3ccccc3)c3ccccc3)n2)cc1]
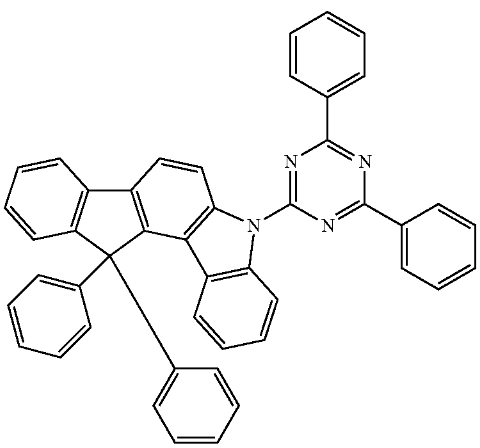 [SMILES: c1ccc(-c2nc(-c3ccccc3)nc(-n3c4ccccc4c4c5c(ccc43)-c3ccccc3C5(c3ccccc3)c3ccccc3)n2)cc1]
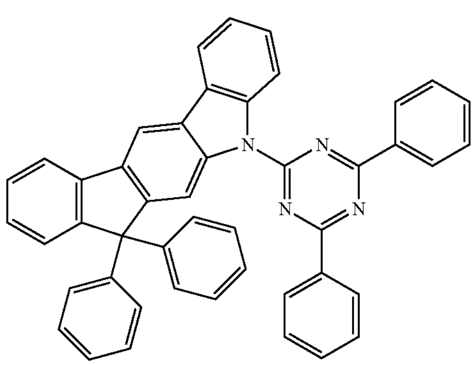 [SMILES: c1ccc(-c2nc(-c3ccccc3)nc(-n3c4ccccc4c4cc5c(cc43)C(c3ccccc3)(c3ccccc3)c3ccccc3-5)n2)cc1]
-continued
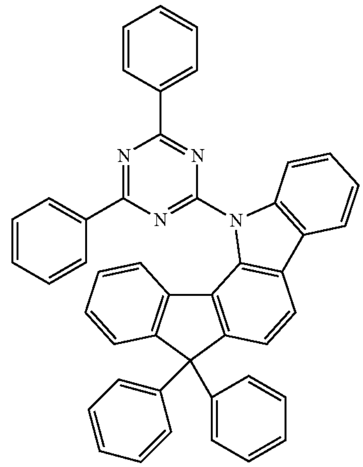 [SMILES: c1ccc(-c2nc(-c3ccccc3)nc(-n3c4ccccc4c4ccc5c(c43)-c3ccccc3C5(c3ccccc3)c3ccccc3)n2)cc1]
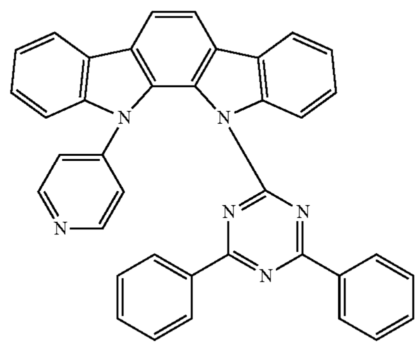 [SMILES: c1ccc(-c2nc(-c3ccccc3)nc(-n3c4ccccc4c4ccc5c6ccccc6n(-c6ccncc6)c5c43)n2)cc1]
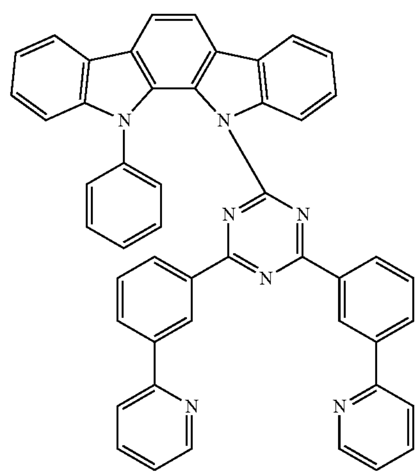 [SMILES: c1ccc(-n2c3ccccc3c3ccc4c5ccccc5n(-c5nc(-c6cccc(-c7ccccn7)c6)nc(-c6cccc(-c7ccccn7)c6)n5)c4c32)cc1]

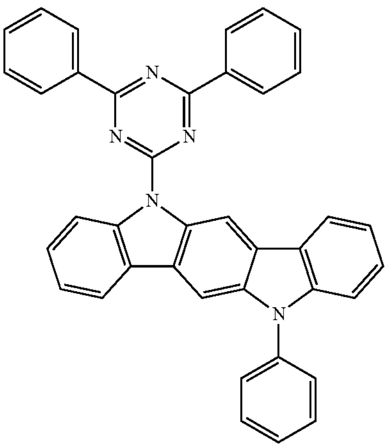 [SMILES: c1ccc(-c2nc(-c3ccccc3)nc(-n3c4ccccc4c4cc5c(cc43)c3ccccc3n5-c3ccccc3)n2)cc1]
N
N
N
N
N
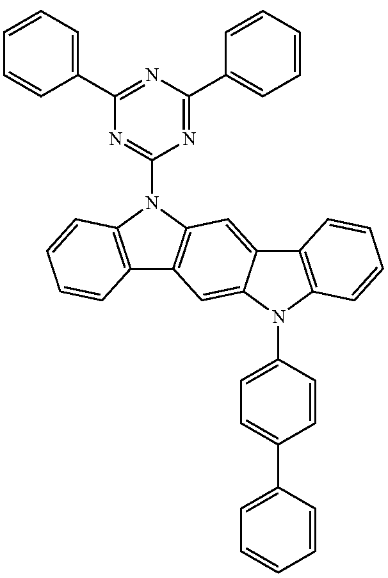 [SMILES: c1ccc(-c2ccc(-n3c4ccccc4c4cc5c(cc43)c3ccccc3n5-c3nc(-c4ccccc4)nc(-c4ccccc4)n3)cc2)cc1]
N
N
N
N
N
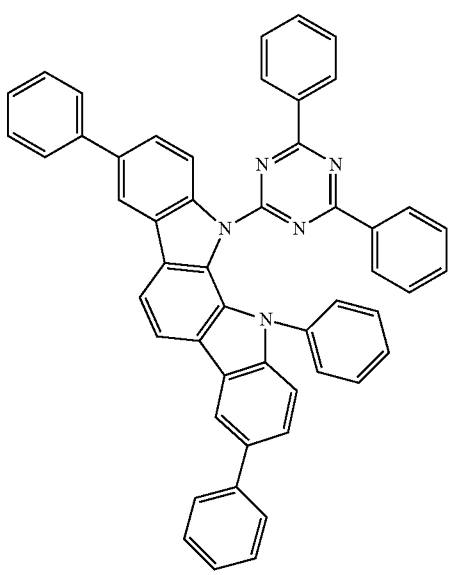 [SMILES: c1ccc(-c2ccc3c(c2)c2ccc4c5cc(-c6ccccc6)ccc5n(-c5nc(-c6ccccc6)nc(-c6ccccc6)n5)c4c2n3-c2ccccc2)cc1]
N
N
N
N
N
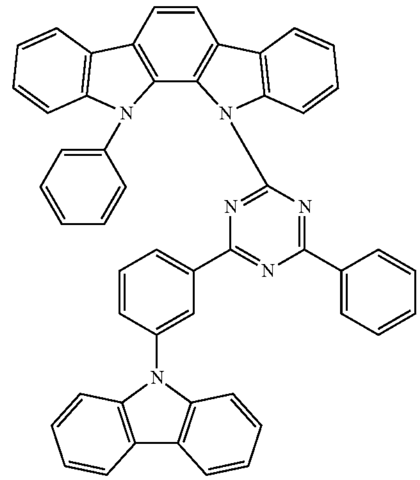 [SMILES: c1ccc(-c2nc(-c3cccc(-n4c5ccccc5c5ccccc54)c3)nc(-n3c4ccccc4c4ccc5c6ccccc6n(-c6ccccc6)c5c43)n2)cc1]
N
N
N
N
N
N
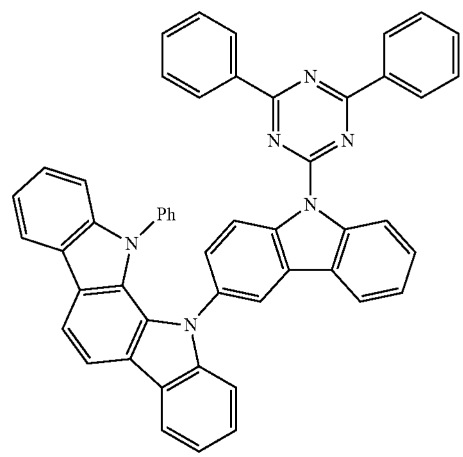 [SMILES: c1ccc(-c2nc(-c3ccccc3)nc(-n3c4ccccc4c4cc(-n5c6ccccc6c6ccc7c8ccccc8n(-c8ccccc8)c7c65)ccc43)n2)cc1]
N
N
N
N
Ph
N
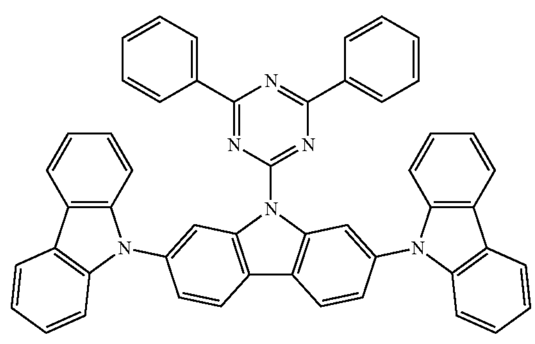 [SMILES: c1ccc(-c2nc(-c3ccccc3)nc(-n3c4cc(-n5c6ccccc6c6ccccc65)ccc4c4ccc(-n5c6ccccc6c6ccccc65)cc43)n2)cc1]
N
N
N
N
N
N -continued
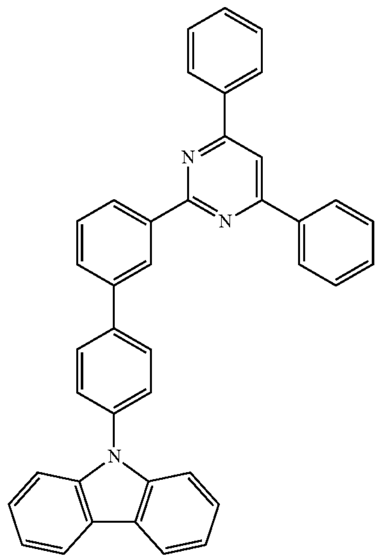 [SMILES: c1ccc(-c2cc(-c3ccccc3)nc(-c3cccc(-c4ccc(-n5c6ccccc6c6ccccc65)cc4)c3)n2)cc1]
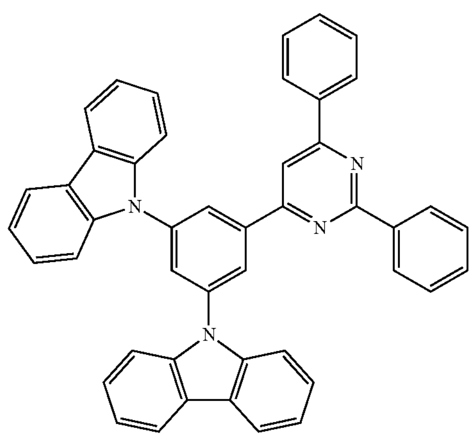 [SMILES: c1ccc(-c2cc(-c3cc(-n4c5ccccc5c5ccccc54)cc(-n4c5ccccc5c5ccccc54)c3)nc(-c3ccccc3)n2)cc1]
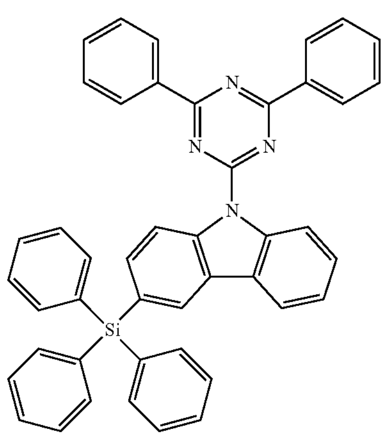 [SMILES: c1ccc(-c2nc(-c3ccccc3)nc(-n3c4ccccc4c4cc([Si](c5ccccc5)(c5ccccc5)c5ccccc5)ccc43)n2)cc1]
-continued
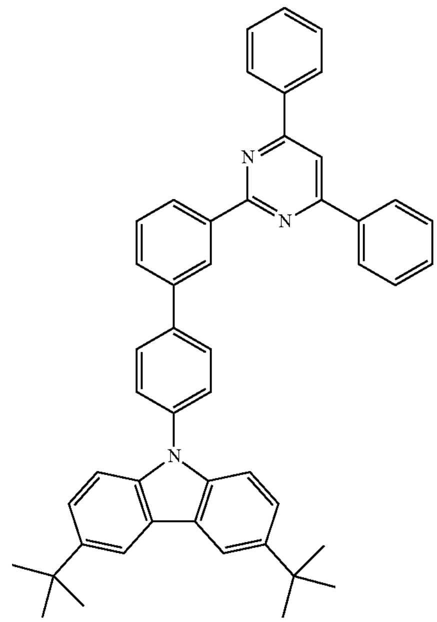 [SMILES: CC(C)(C)c1ccc2c(c1)c1cc(C(C)(C)C)ccc1n2-c1ccc(-c2cccc(-c3nc(-c4ccccc4)cc(-c4ccccc4)n3)c2)cc1]
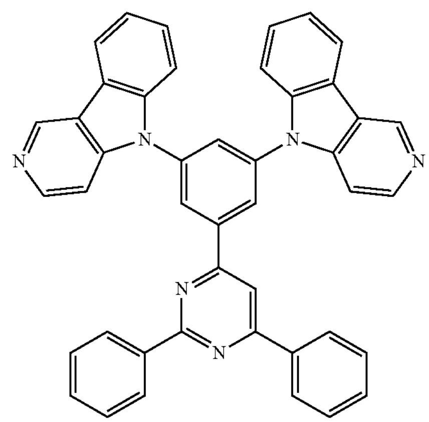 [SMILES: c1ccc(-c2cc(-c3cc(-n4c5ccccc5c5cnccc54)cc(-n4c5ccccc5c5cnccc54)c3)nc(-c3ccccc3)n2)cc1]
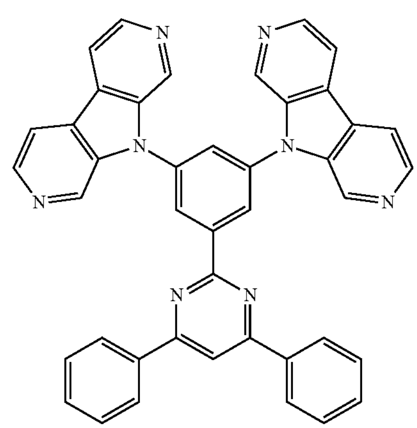 [SMILES: c1ccc(-c2cc(-c3ccccc3)nc(-c3cc(-n4c5cnccc5c5ccncc54)cc(-n4c5cnccc5c5ccncc54)c3)n2)cc1]

-continued
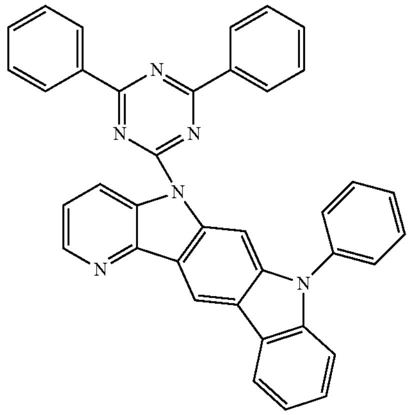 [SMILES: c1ccc(-c2nc(-c3ccccc3)nc(-n3c4cc5c(cc4c4ncccc43)c3ccccc3n5-c3ccccc3)n2)cc1]
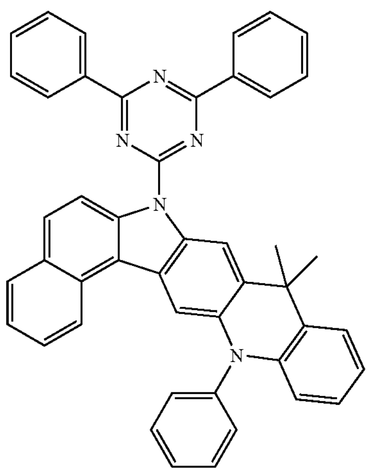 [SMILES: CC1(C)c2ccccc2N(c2ccccc2)c2cc3c4c5ccccc5ccc4n(-c4nc(-c5ccccc5)nc(-c5ccccc5)n4)c3cc21]
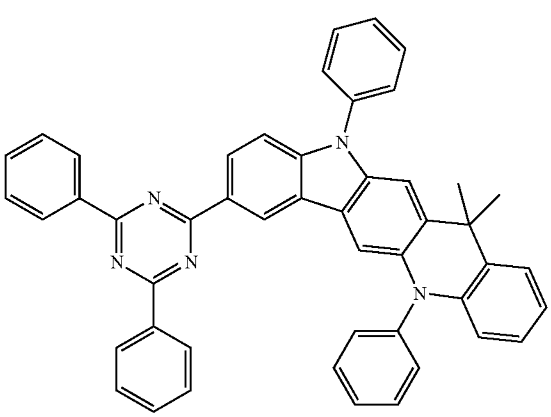 [SMILES: CC1(C)c2ccccc2N(c2ccccc2)c2cc3c4cc(-c5nc(-c6ccccc6)nc(-c6ccccc6)n5)ccc4n(-c4ccccc4)c3cc21]
-continued
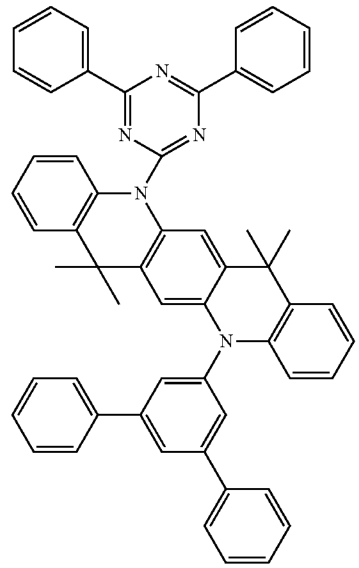 [SMILES: CC1(C)c2ccccc2N(c2cc(-c3ccccc3)cc(-c3ccccc3)c2)c2cc3c(cc21)N(c1nc(-c2ccccc2)nc(-c2ccccc2)n1)c1ccccc1C3(C)C]
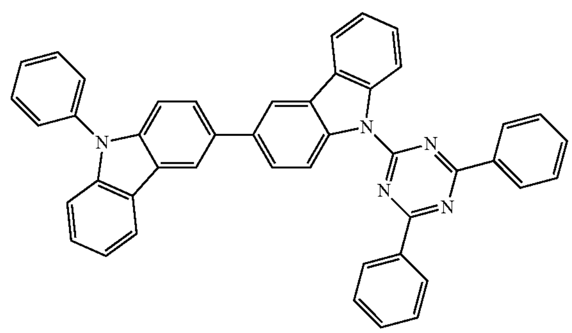 [SMILES: c1ccc(-c2nc(-c3ccccc3)nc(-n3c4ccccc4c4cc(-c5ccc6c(c5)c5ccccc5n6-c5ccccc5)ccc43)n2)cc1]
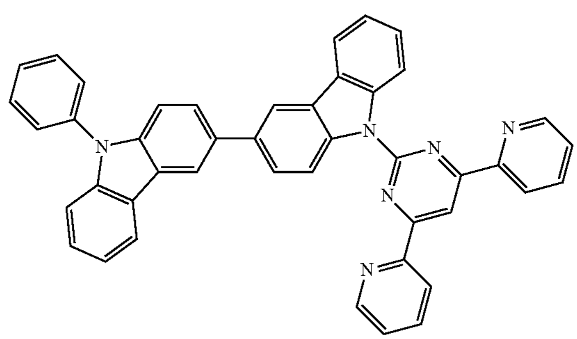 [SMILES: c1ccc(-n2c3ccccc3c3cc(-c4ccc5c(c4)c4ccccc4n5-c4nc(-c5ccccn5)cc(-c5ccccn5)n4)ccc32)cc1]

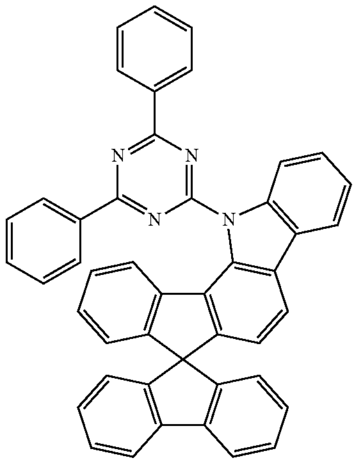 [SMILES: c1ccc(-c2nc(-c3ccccc3)nc(-n3c4ccccc4c4ccc5c(c43)-c3ccccc3C53c4ccccc4-c4ccccc43)n2)cc1]
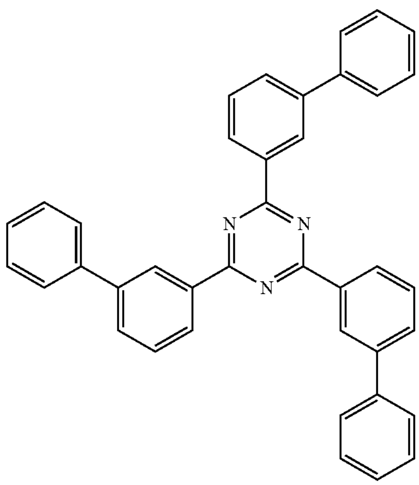 [SMILES: c1ccc(-c2cccc(-c3nc(-c4cccc(-c5ccccc5)c4)nc(-c4cccc(-c5ccccc5)c4)n3)c2)cc1]
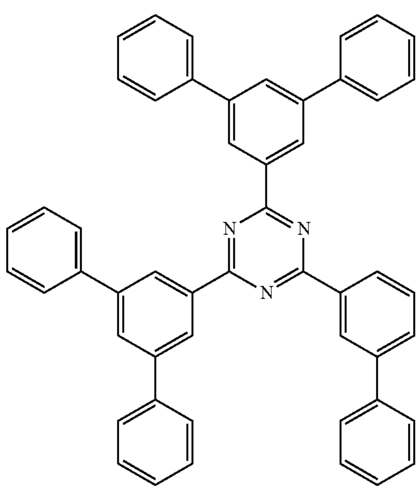 [SMILES: c1ccc(-c2cccc(-c3nc(-c4cc(-c5ccccc5)cc(-c5ccccc5)c4)nc(-c4cc(-c5ccccc5)cc(-c5ccccc5)c4)n3)c2)cc1]
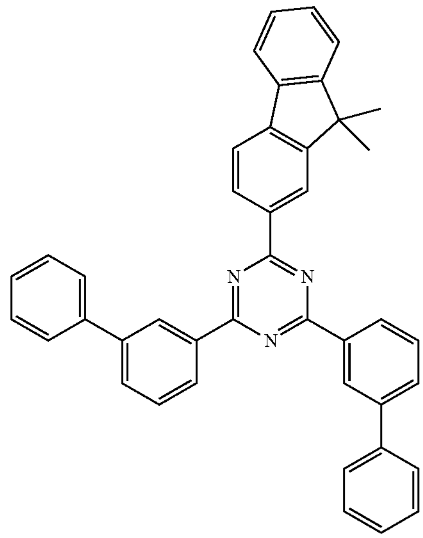 [SMILES: CC1(C)c2ccccc2-c2ccc(-c3nc(-c4cccc(-c5ccccc5)c4)nc(-c4cccc(-c5ccccc5)c4)n3)cc21]
Examples of suitable lactam derivatives are the following structures:
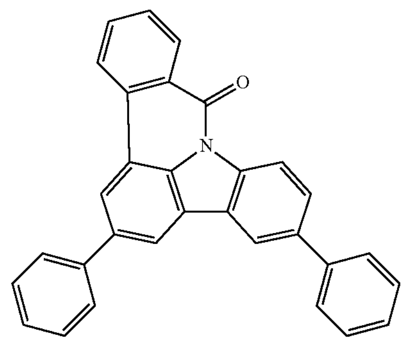 [SMILES: O=c1c2ccccc2c2cc(-c3ccccc3)cc3c4cc(-c5ccccc5)ccc4n1c23]
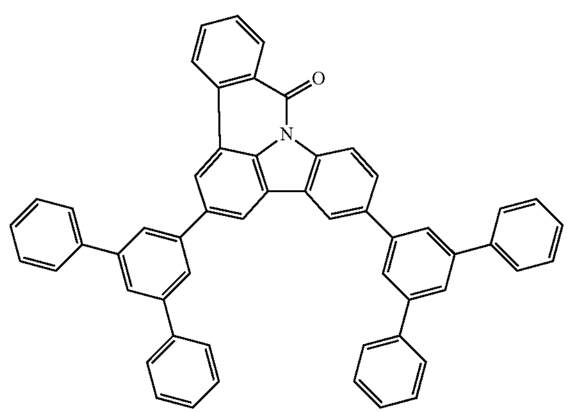 [SMILES: O=c1c2ccccc2c2cc(-c3cc(-c4ccccc4)cc(-c4ccccc4)c3)cc3c4cc(-c5cc(-c6ccccc6)cc(-c6ccccc6)c5)ccc4n1c23]

-continued
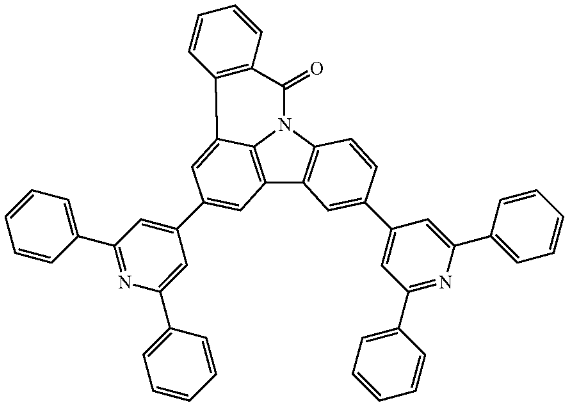 [SMILES: O=c1c2ccccc2c2cc(-c3cc(-c4ccccc4)nc(-c4ccccc4)c3)cc3c4cc(-c5cc(-c6ccccc6)nc(-c6ccccc6)c5)ccc4n1c23]
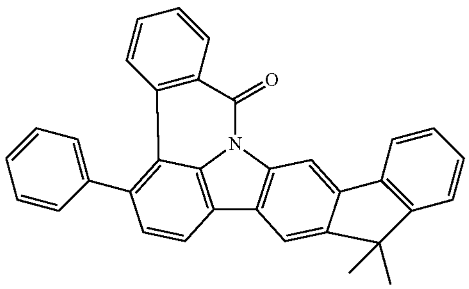 [SMILES: CC1(C)c2ccccc2-c2cc3c(cc21)c1ccc(-c2ccccc2)c2c4ccccc4c(=O)n3c12]
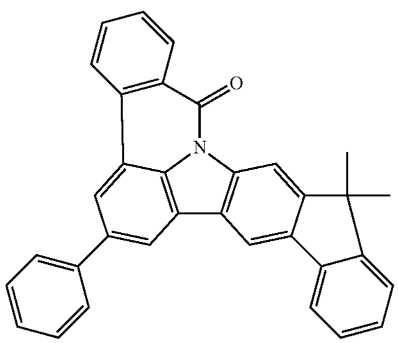 [SMILES: CC1(C)c2ccccc2-c2cc3c4cc(-c5ccccc5)cc5c6ccccc6c(=O)n(c3cc21)c54]
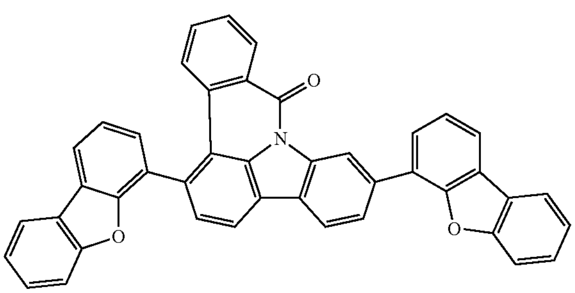 [SMILES: O=c1c2ccccc2c2c(-c3cccc4c3oc3ccccc34)ccc3c4ccc(-c5cccc6c5oc5ccccc56)cc4n1c32]
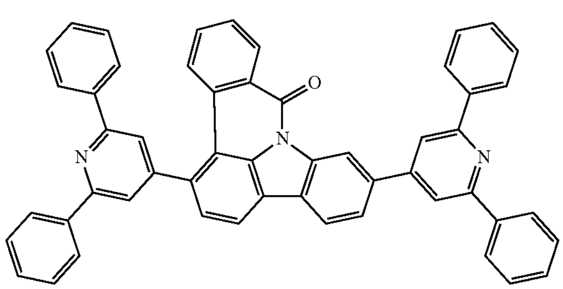 [SMILES: O=c1c2ccccc2c2c(-c3cc(-c4ccccc4)nc(-c4ccccc4)c3)ccc3c4ccc(-c5cc(-c6ccccc6)nc(-c6ccccc6)c5)cc4n1c32]
-continued
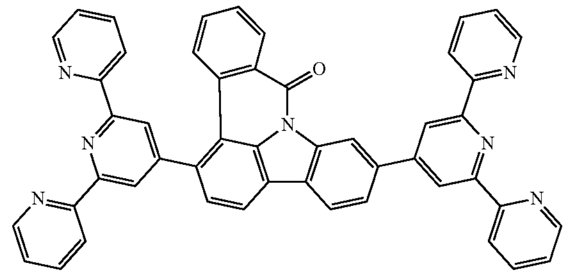 [SMILES: O=c1c2ccccc2c2c(-c3cc(-c4ccccn4)nc(-c4ccccn4)c3)ccc3c4ccc(-c5cc(-c6ccccn6)nc(-c6ccccn6)c5)cc4n1c32]
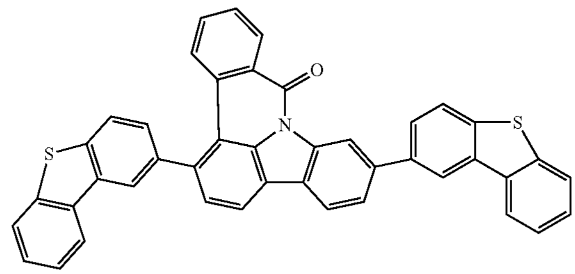 [SMILES: O=c1c2ccccc2c2c(-c3ccc4sc5ccccc5c4c3)ccc3c4ccc(-c5ccc6sc7ccccc7c6c5)cc4n1c32]
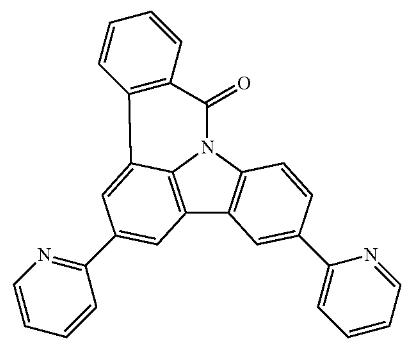 [SMILES: O=c1c2ccccc2c2cc(-c3ccccn3)cc3c4cc(-c5ccccn5)ccc4n1c23]
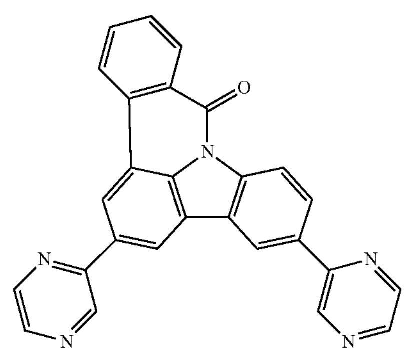 [SMILES: O=c1c2ccccc2c2cc(-c3cnccn3)cc3c4cc(-c5cnccn5)ccc4n1c23]

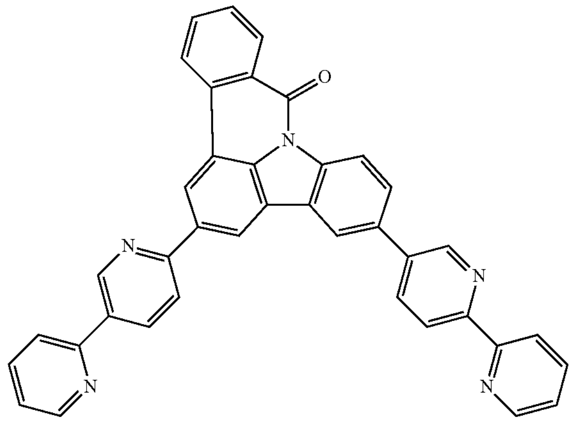 [SMILES: O=c1c2ccccc2c2cc(-c3ccc(-c4ccccn4)cn3)cc3c4cc(-c5ccc(-c6ccccn6)nc5)ccc4n1c23]
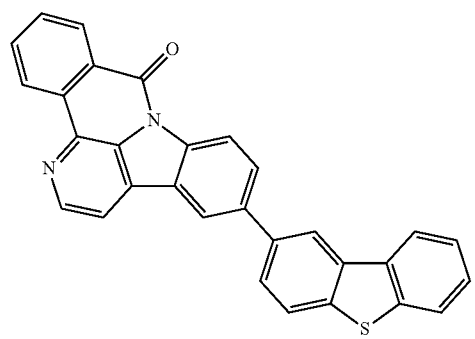 [SMILES: O=c1c2ccccc2c2nccc3c4cc(-c5ccc6sc7ccccc7c6c5)ccc4n1c32]
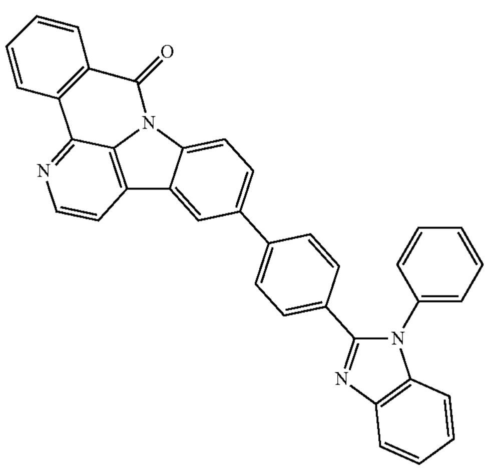 [SMILES: O=c1c2ccccc2c2nccc3c4cc(-c5ccc(-c6nc7ccccc7n6-c6ccccc6)cc5)ccc4n1c32]
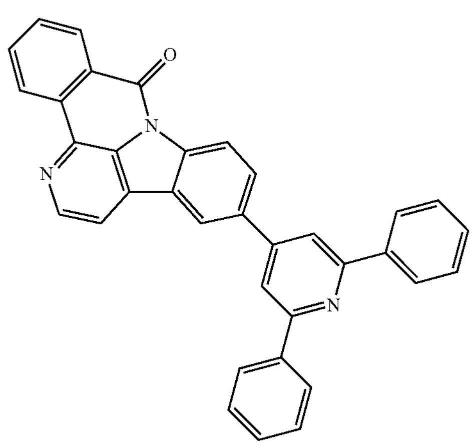 [SMILES: O=c1c2ccccc2c2nccc3c4cc(-c5cc(-c6ccccc6)nc(-c6ccccc6)c5)ccc4n1c32]
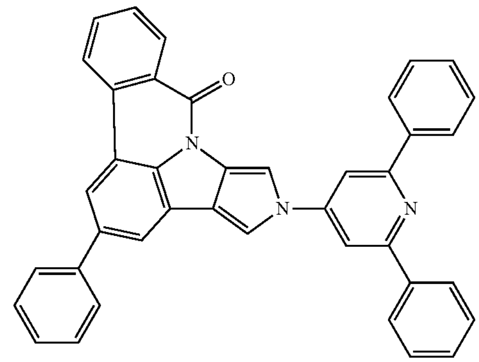 [SMILES: O=c1c2ccccc2c2cc(-c3ccccc3)cc3c4cn(-c5cc(-c6ccccc6)nc(-c6ccccc6)c5)cc4n1c23]
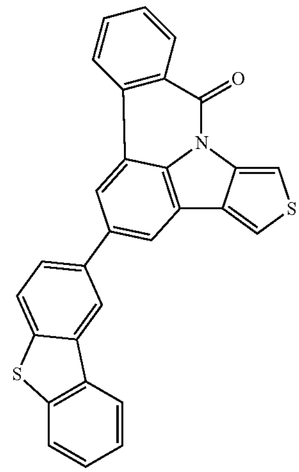 [SMILES: O=c1c2ccccc2c2cc(-c3ccc4sc5ccccc5c4c3)cc3c4cscc4n1c23]
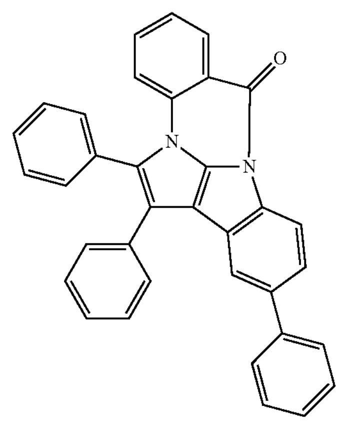 [SMILES: O=c1c2ccccc2n2c(-c3ccccc3)c(-c3ccccc3)c3c4cc(-c5ccccc5)ccc4n1c32]
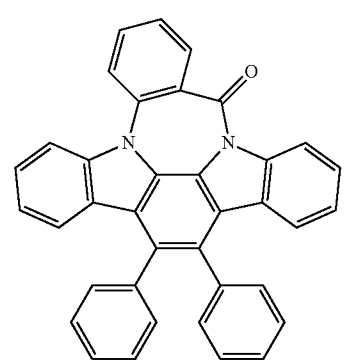 [SMILES: O=c1c2ccccc2n2c3ccccc3c3c(-c4ccccc4)c(-c4ccccc4)c4c5ccccc5n1c4c32]

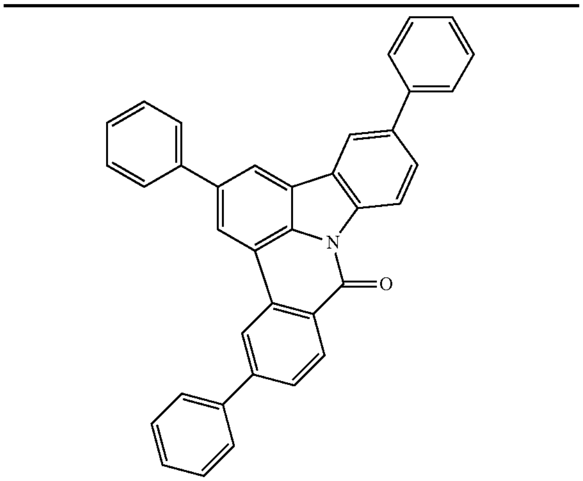
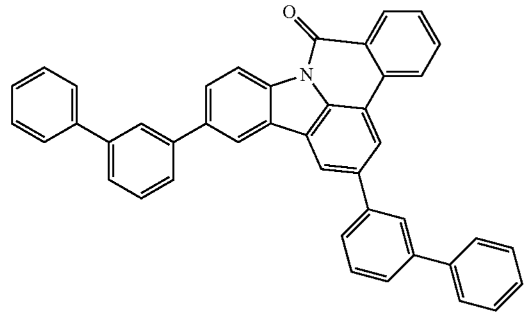 [SMILES: O=c1c2ccccc2c2cc(-c3cccc(-c4ccccc4)c3)cc3c4cc(-c5cccc(-c6ccccc6)c5)ccc4n1c23]
Examples of suitable ketone derivatives are the following structures:
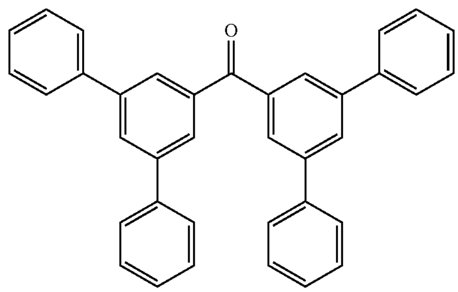 [SMILES: O=C(c1cc(-c2ccccc2)cc(-c2ccccc2)c1)c1cc(-c2ccccc2)cc(-c2ccccc2)c1]
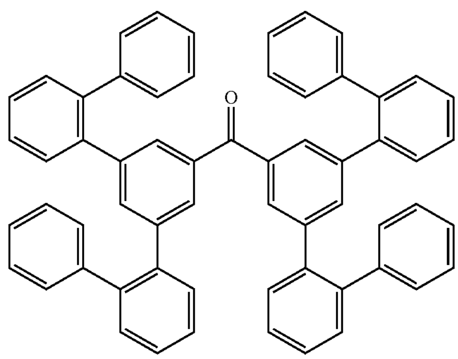 [SMILES: O=C(c1cc(-c2ccccc2-c2ccccc2)cc(-c2ccccc2-c2ccccc2)c1)c1cc(-c2ccccc2-c2ccccc2)cc(-c2ccccc2-c2ccccc2)c1]
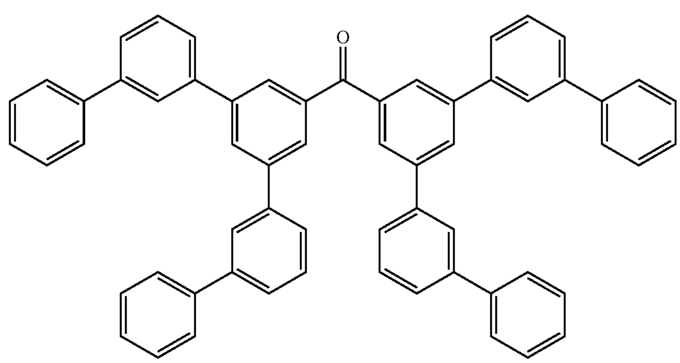 [SMILES: O=C(c1cc(-c2cccc(-c3ccccc3)c2)cc(-c2cccc(-c3ccccc3)c2)c1)c1cc(-c2cccc(-c3ccccc3)c2)cc(-c2cccc(-c3ccccc3)c2)c1]

-continued
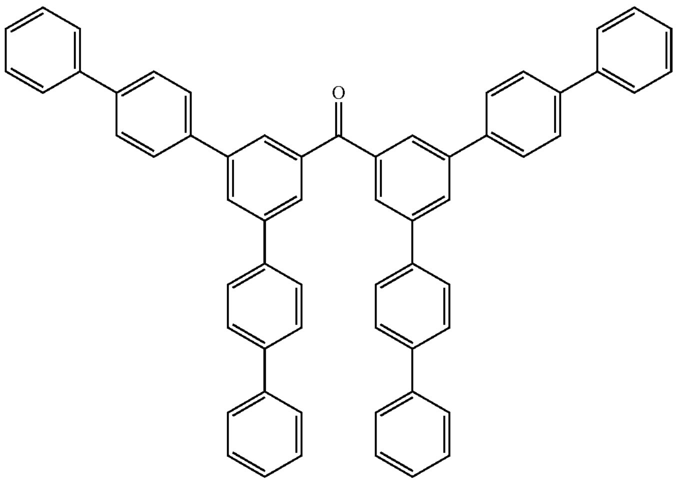 [SMILES: O=C(c1cc(-c2ccc(-c3ccccc3)cc2)cc(-c2ccc(-c3ccccc3)cc2)c1)c1cc(-c2ccc(-c3ccccc3)cc2)cc(-c2ccc(-c3ccccc3)cc2)c1]
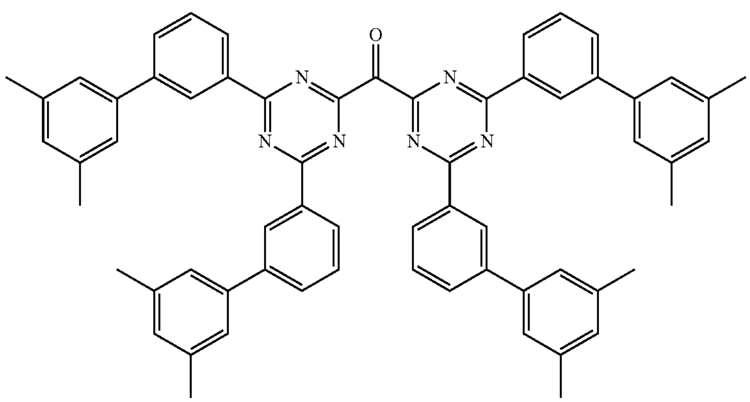
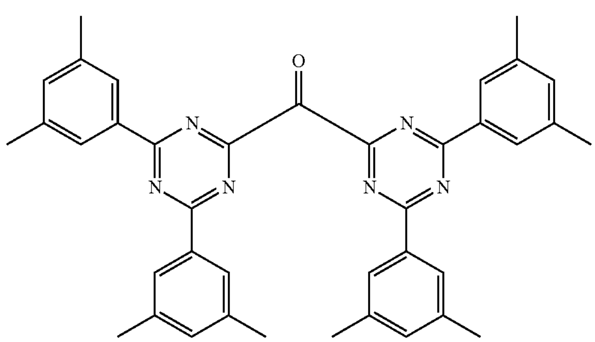
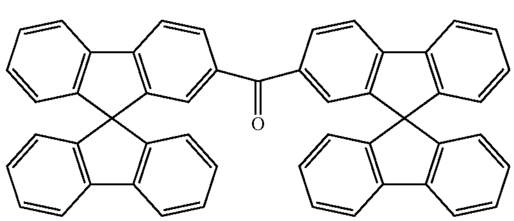 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2]

-continued
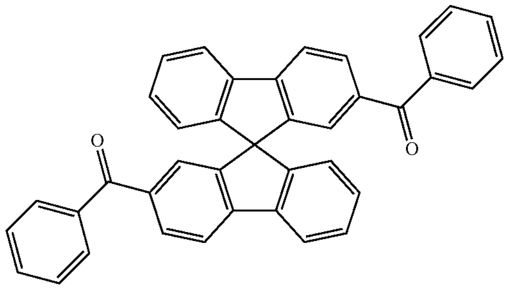 [SMILES: O=C(c1ccccc1)c1ccc2c(c1)C1(c3ccccc3-2)c2ccccc2-c2ccc(C(=O)c3ccccc3)cc21]
Examples of suitable metal complexes are the following structures:
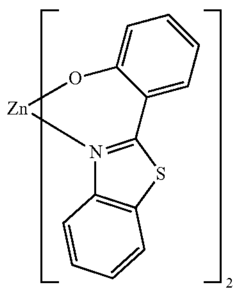
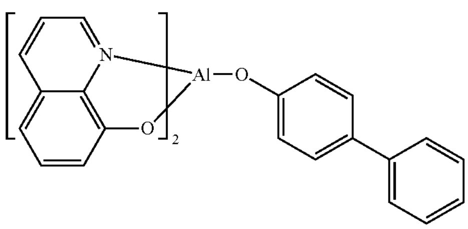
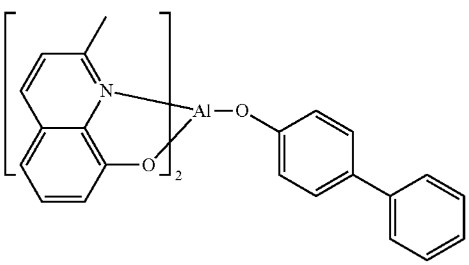
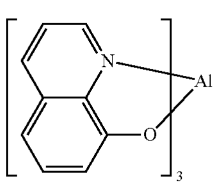
-continued
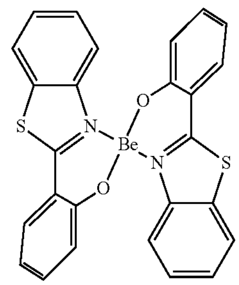
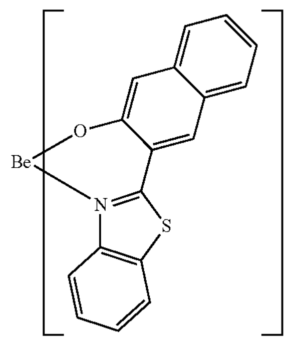
Examples of suitable indeno- and indolocarbazole derivatives are the following structures:
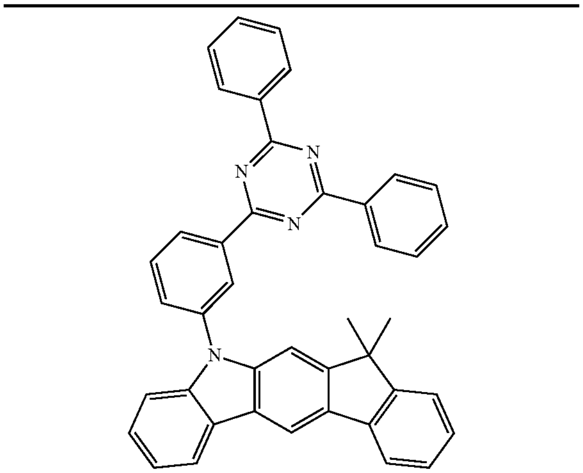

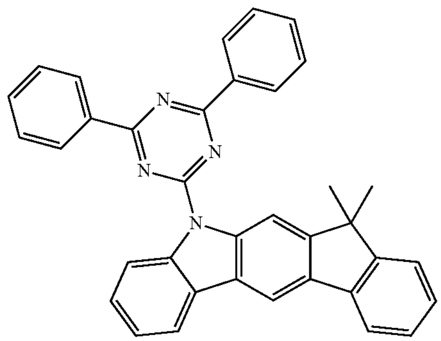 [SMILES: CC1(C)c2ccccc2-c2cc3c4ccccc4n(-c4nc(-c5ccccc5)nc(-c5ccccc5)n4)c3cc21]
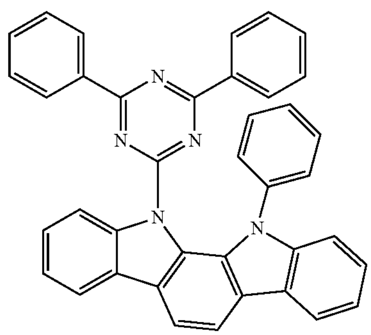 [SMILES: c1ccc(-c2nc(-c3ccccc3)nc(-n3c4ccccc4c4ccc5c6ccccc6n(-c6ccccc6)c5c43)n2)cc1]
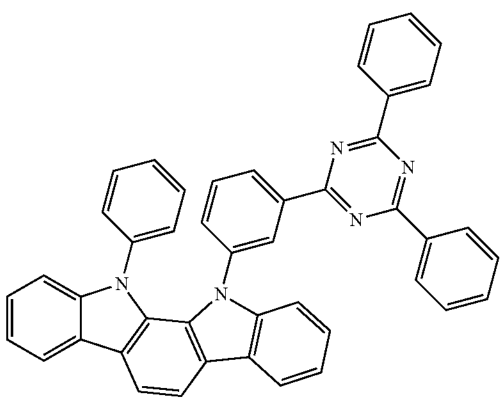 [SMILES: c1ccc(-c2nc(-c3ccccc3)nc(-c3cccc(-n4c5ccccc5c5ccc6c7ccccc7n(-c7ccccc7)c6c54)c3)n2)cc1]
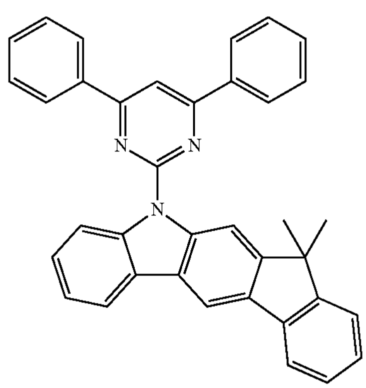 [SMILES: CC1(C)c2ccccc2-c2cc3c4ccccc4n(-c4nc(-c5ccccc5)cc(-c5ccccc5)n4)c3cc21]
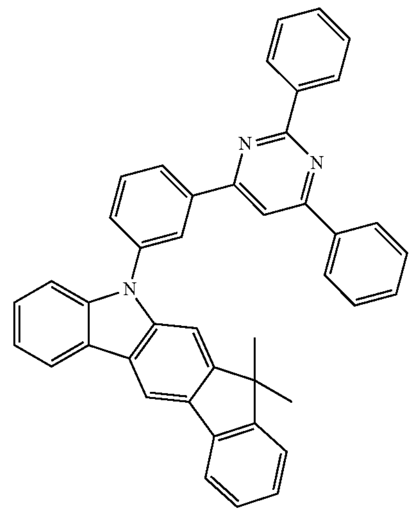 [SMILES: CC1(C)c2ccccc2-c2cc3c4ccccc4n(-c4cccc(-c5cc(-c6ccccc6)nc(-c6ccccc6)n5)c4)c3cc21]
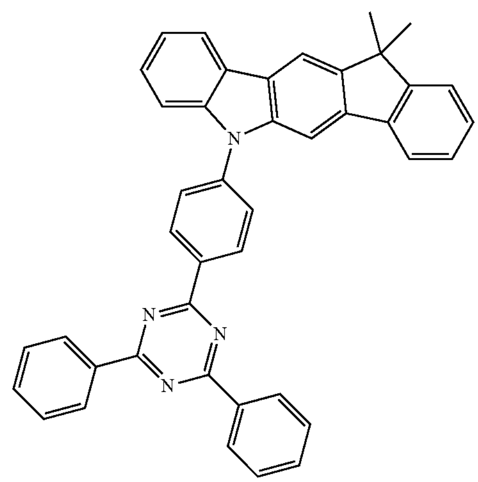 [SMILES: CC1(C)c2ccccc2-c2cc3c(cc21)c1ccccc1n3-c1ccc(-c2nc(-c3ccccc3)nc(-c3ccccc3)n2)cc1]
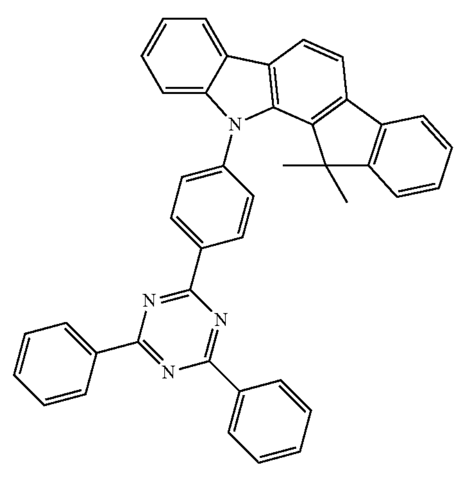 [SMILES: CC1(C)c2ccccc2-c2ccc3c4ccccc4n(-c4ccc(-c5nc(-c6ccccc6)nc(-c6ccccc6)n5)cc4)c3c21]

-continued
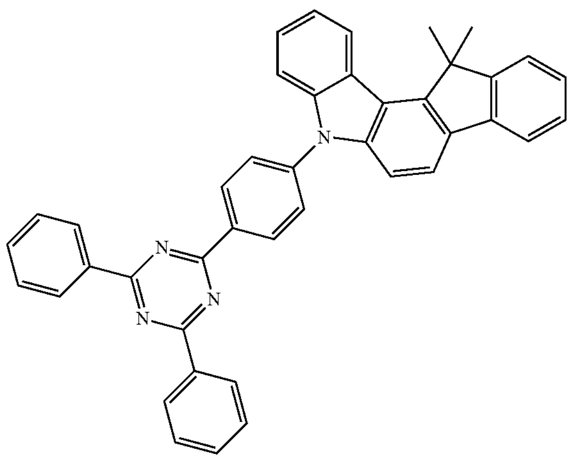 [SMILES: CC1(C)c2ccccc2-c2ccc3c(c21)c1ccccc1n3-c1ccc(-c2nc(-c3ccccc3)nc(-c3ccccc3)n2)cc1]
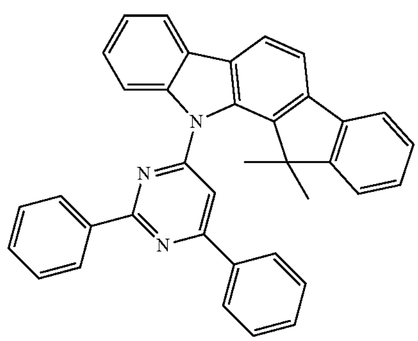 [SMILES: CC1(C)c2ccccc2-c2ccc3c4ccccc4n(-c4cc(-c5ccccc5)nc(-c5ccccc5)n4)c3c21]
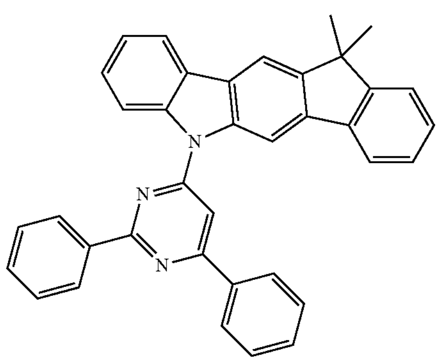 [SMILES: CC1(C)c2ccccc2-c2cc3c(cc21)c1ccccc1n3-c1cc(-c2ccccc2)nc(-c2ccccc2)n1]
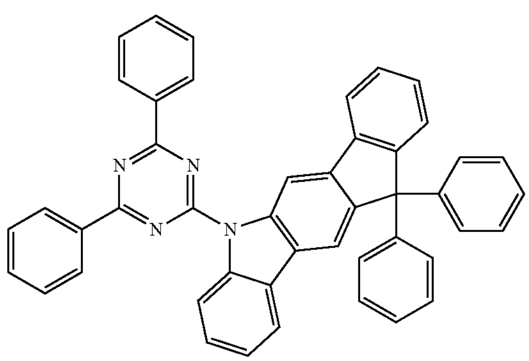 [SMILES: c1ccc(-c2nc(-c3ccccc3)nc(-n3c4ccccc4c4cc5c(cc43)-c3ccccc3C5(c3ccccc3)c3ccccc3)n2)cc1]
-continued
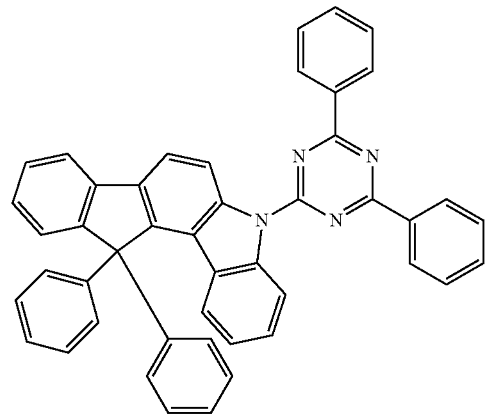 [SMILES: c1ccc(-c2nc(-c3ccccc3)nc(-n3c4ccccc4c4c5c(ccc43)-c3ccccc3C5(c3ccccc3)c3ccccc3)n2)cc1]
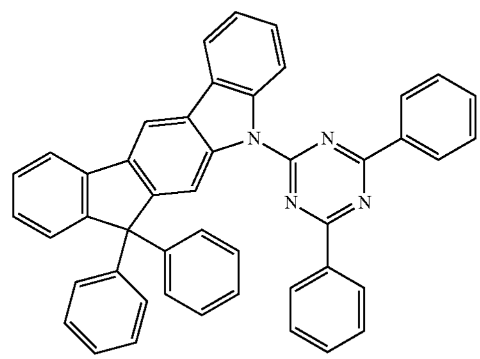 [SMILES: c1ccc(-c2nc(-c3ccccc3)nc(-n3c4ccccc4c4cc5c(cc43)C(c3ccccc3)(c3ccccc3)c3ccccc3-5)n2)cc1]
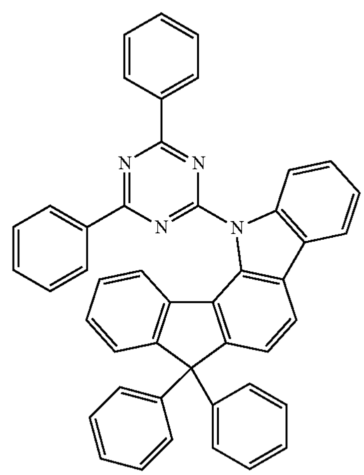 [SMILES: c1ccc(-c2nc(-c3ccccc3)nc(-n3c4ccccc4c4ccc5c(c43)-c3ccccc3C5(c3ccccc3)c3ccccc3)n2)cc1]
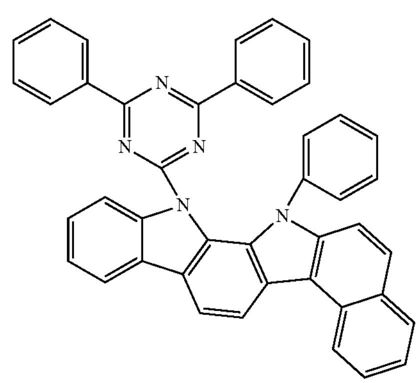 [SMILES: c1ccc(-c2nc(-c3ccccc3)nc(-n3c4ccccc4c4ccc5c6c7ccccc7ccc6n(-c6ccccc6)c5c43)n2)cc1]

-continued
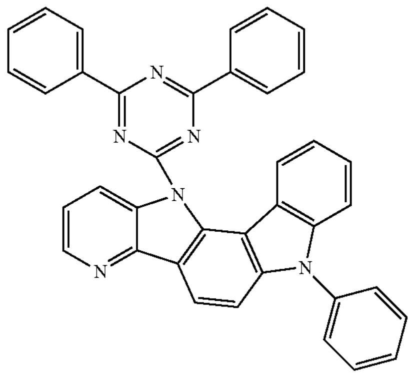 [SMILES: c1ccc(-c2nc(-c3ccccc3)nc(-n3c4cccnc4c4ccc5c(c6ccccc6n5-c5ccccc5)c43)n2)cc1]
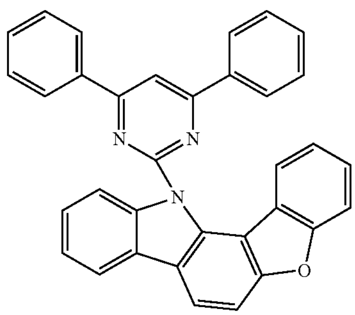 [SMILES: c1ccc(-c2cc(-c3ccccc3)nc(-n3c4ccccc4c4ccc5oc6ccccc6c5c43)n2)cc1]
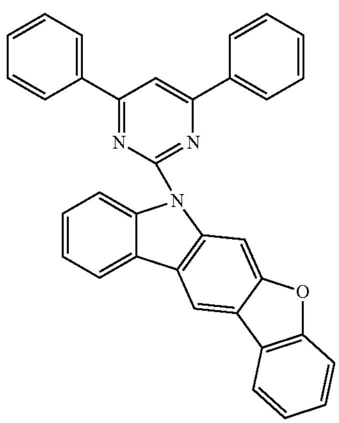 [SMILES: c1ccc(-c2cc(-c3ccccc3)nc(-n3c4ccccc4c4cc5c(cc43)oc3ccccc35)n2)cc1]
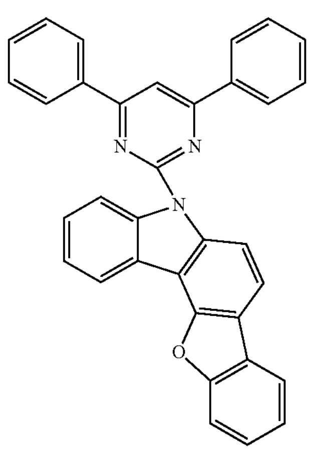 [SMILES: c1ccc(-c2cc(-c3ccccc3)nc(-n3c4ccccc4c4c5oc6ccccc6c5ccc43)n2)cc1]
-continued
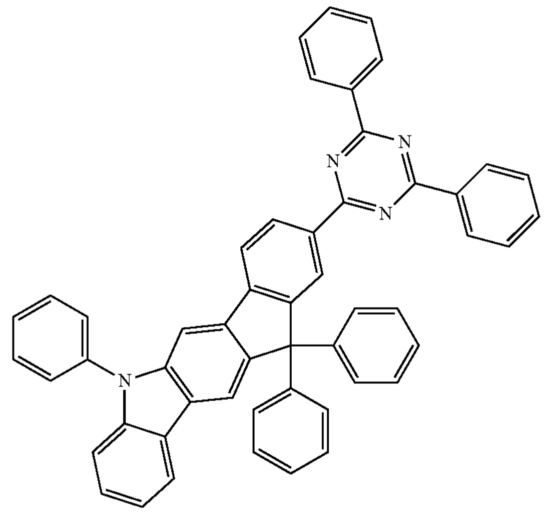 [SMILES: c1ccc(-c2nc(-c3ccccc3)nc(-c3ccc4c(c3)C(c3ccccc3)(c3ccccc3)c3cc5c6ccccc6n(-c6ccccc6)c5cc3-4)n2)cc1]
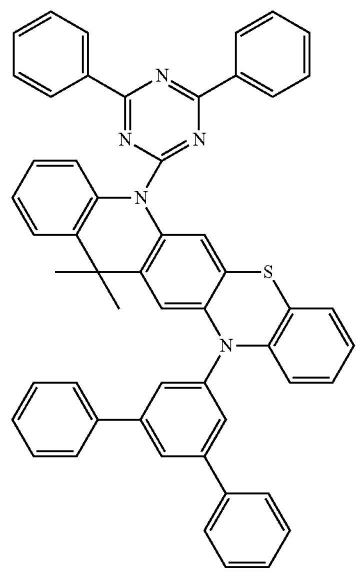 [SMILES: CC1(C)c2ccccc2N(c2nc(-c3ccccc3)nc(-c3ccccc3)n2)c2cc3c(cc21)N(c1cc(-c2ccccc2)cc(-c2ccccc2)c1)c1ccccc1S3]
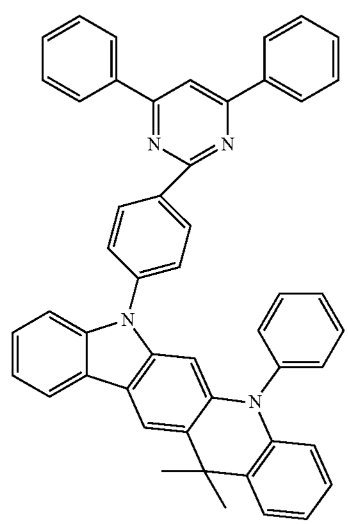 [SMILES: CC1(C)c2ccccc2N(c2ccccc2)c2cc3c(cc21)c1ccccc1n3-c1ccc(-c2nc(-c3ccccc3)cc(-c3ccccc3)n2)cc1]

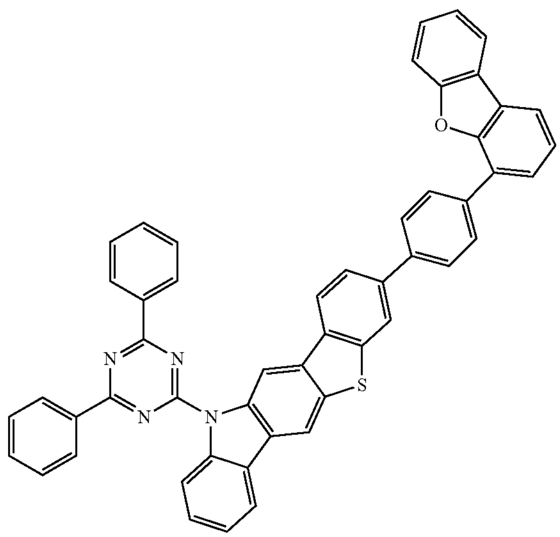 [SMILES: c1ccc(-c2nc(-c3ccccc3)nc(-n3c4ccccc4c4cc5sc6cc(-c7ccc(-c8cccc9c8oc8ccccc89)cc7)ccc6c5cc43)n2)cc1]
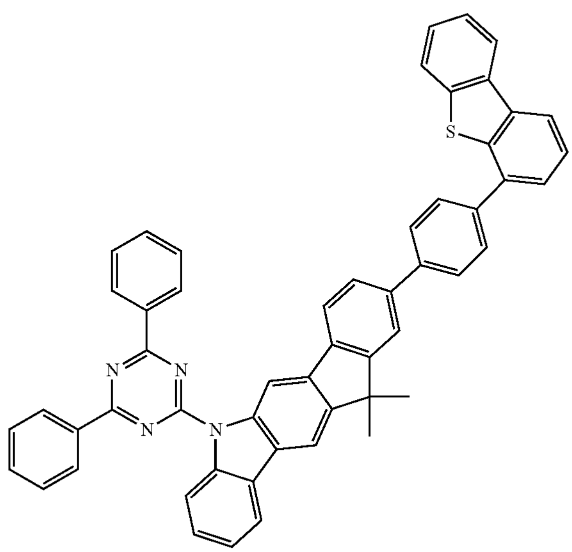 [SMILES: CC1(C)c2cc(-c3ccc(-c4cccc5c4sc4ccccc45)cc3)ccc2-c2cc3c(cc21)c1ccccc1n3-c1nc(-c2ccccc2)nc(-c2ccccc2)n1]
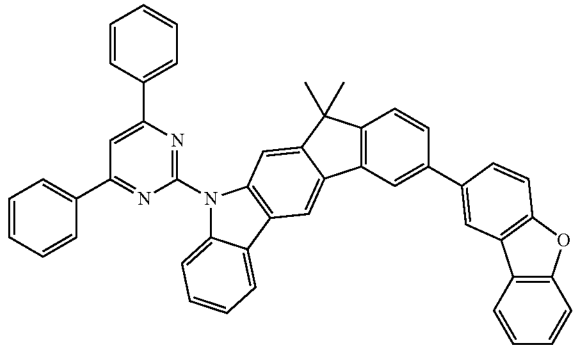 [SMILES: CC1(C)c2ccc(-c3ccc4oc5ccccc5c4c3)cc2-c2cc3c4ccccc4n(-c4nc(-c5ccccc5)cc(-c5ccccc5)n4)c3cc21]
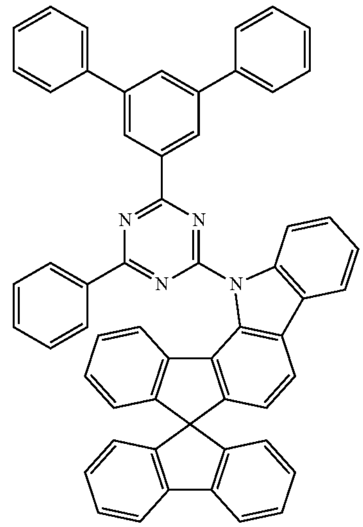 [SMILES: c1ccc(-c2cc(-c3ccccc3)cc(-c3nc(-c4ccccc4)nc(-n4c5ccccc5c5ccc6c(c54)-c4ccccc4C64c5ccccc5-c5ccccc54)n3)c2)cc1]
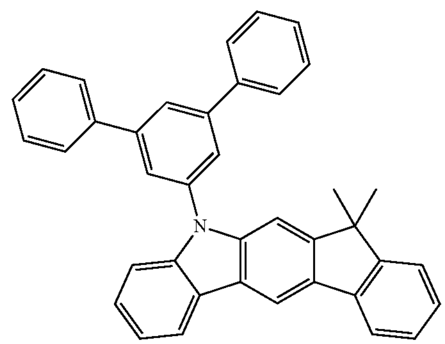 [SMILES: CC1(C)c2ccccc2-c2cc3c4ccccc4n(-c4cc(-c5ccccc5)cc(-c5ccccc5)c4)c3cc21]
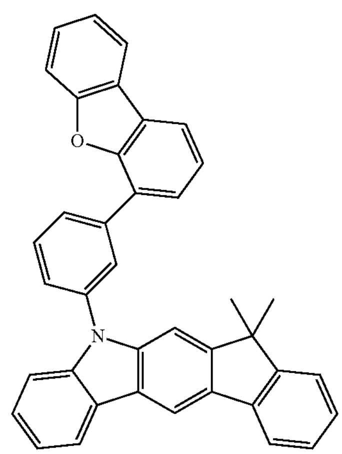 [SMILES: CC1(C)c2ccccc2-c2cc3c4ccccc4n(-c4cccc(-c5cccc6c5oc5ccccc56)c4)c3cc21]
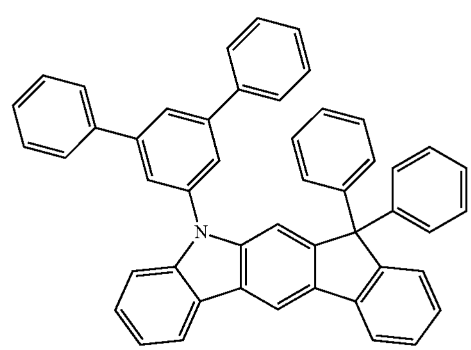 [SMILES: c1ccc(-c2cc(-c3ccccc3)cc(-n3c4ccccc4c4cc5c(cc43)C(c3ccccc3)(c3ccccc3)c3ccccc3-5)c2)cc1]

-continued
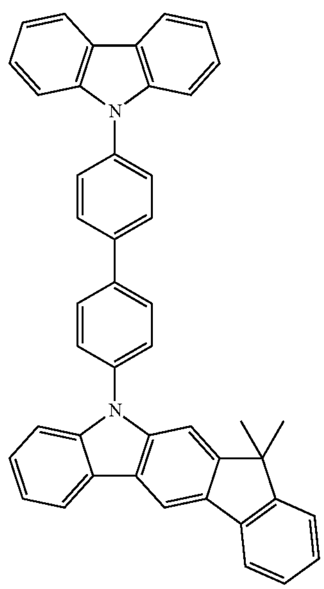 [SMILES: CC1(C)c2ccccc2-c2cc3c4ccccc4n(-c4ccc(-c5ccc(-n6c7ccccc7c7ccccc76)cc5)cc4)c3cc21]
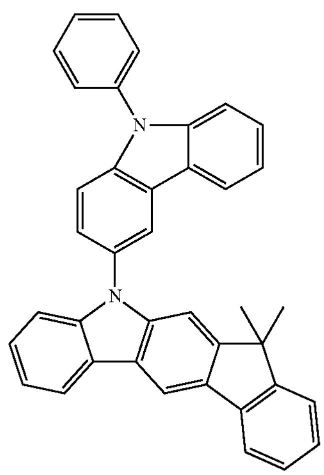 [SMILES: CC1(C)c2ccccc2-c2cc3c4ccccc4n(-c4ccc5c(c4)c4ccccc4n5-c4ccccc4)c3cc21]
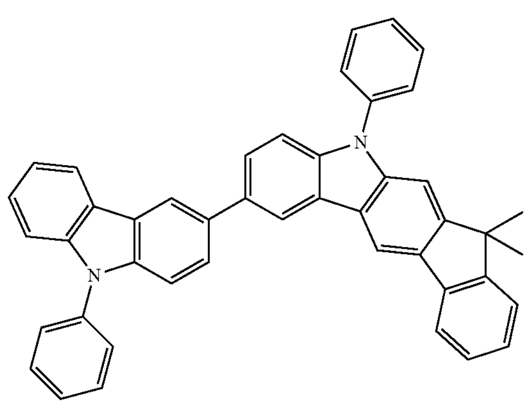 [SMILES: CC1(C)c2ccccc2-c2cc3c4cc(-c5ccc6c(c5)c5ccccc5n6-c5ccccc5)ccc4n(-c4ccccc4)c3cc21]
-continued
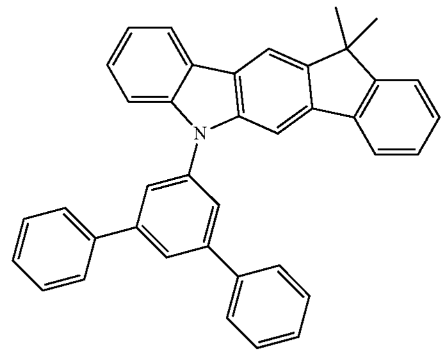 [SMILES: CC1(C)c2ccccc2-c2cc3c(cc21)c1ccccc1n3-c1cc(-c2ccccc2)cc(-c2ccccc2)c1]
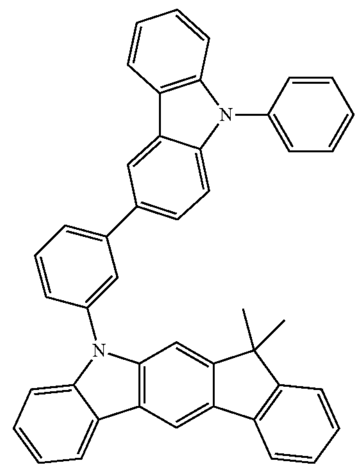 [SMILES: CC1(C)c2ccccc2-c2cc3c4ccccc4n(-c4cccc(-c5ccc6c(c5)c5ccccc5n6-c5ccccc5)c4)c3cc21]
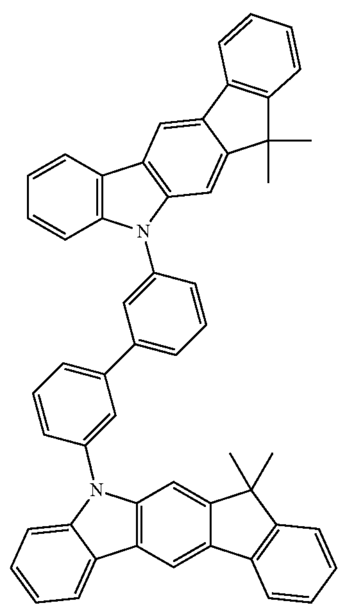 [SMILES: CC1(C)c2ccccc2-c2cc3c4ccccc4n(-c4cccc(-c5cccc(-n6c7ccccc7c7cc8c(cc76)C(C)(C)c6ccccc6-8)c5)c4)c3cc21]

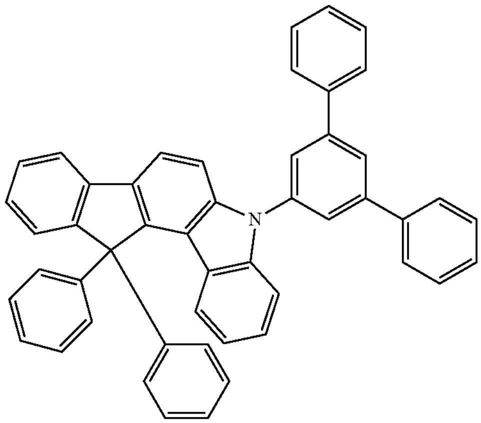 [SMILES: c1ccc(-c2cc(-c3ccccc3)cc(-n3c4ccccc4c4c5c(ccc43)-c3ccccc3C5(c3ccccc3)c3ccccc3)c2)cc1]
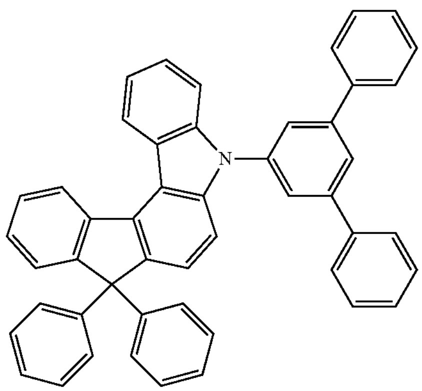 [SMILES: c1ccc(-c2cc(-c3ccccc3)cc(-n3c4ccccc4c4c5c(ccc43)C(c3ccccc3)(c3ccccc3)c3ccccc3-5)c2)cc1]
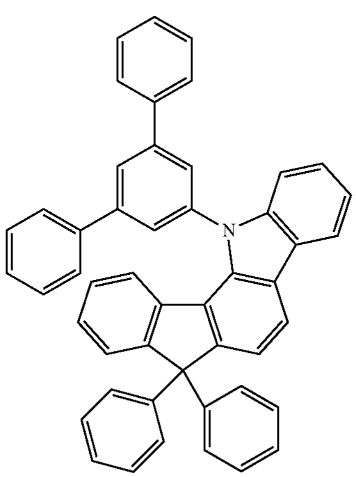 [SMILES: c1ccc(-c2cc(-c3ccccc3)cc(-n3c4ccccc4c4ccc5c(c43)-c3ccccc3C5(c3ccccc3)c3ccccc3)c2)cc1]
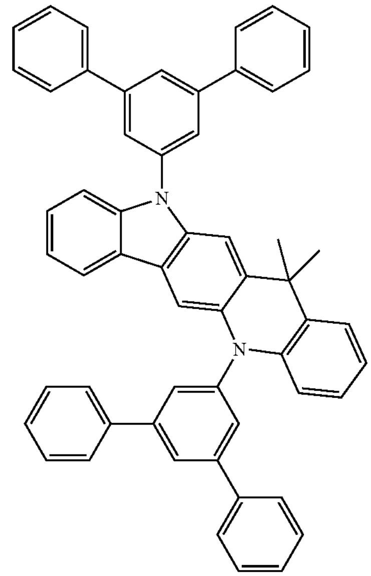 [SMILES: CC1(C)c2ccccc2N(c2cc(-c3ccccc3)cc(-c3ccccc3)c2)c2cc3c4ccccc4n(-c4cc(-c5ccccc5)cc(-c5ccccc5)c4)c3cc21]
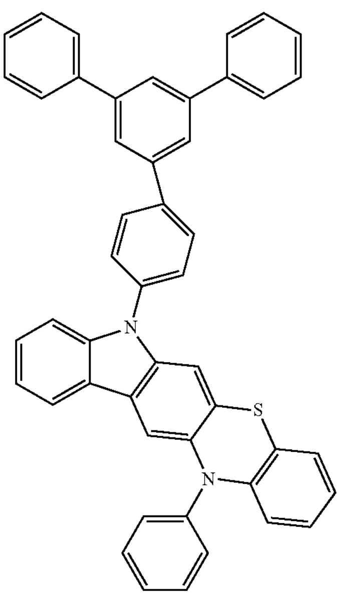 [SMILES: c1ccc(-c2cc(-c3ccccc3)cc(-c3ccc(-n4c5ccccc5c5cc6c(cc54)Sc4ccccc4N6c4ccccc4)cc3)c2)cc1]
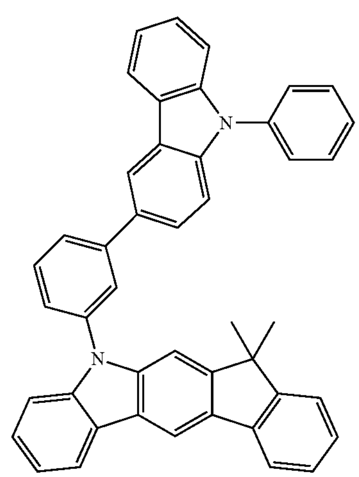 [SMILES: CC1(C)c2ccccc2-c2cc3c4ccccc4n(-c4cccc(-c5ccc6c(c5)c5ccccc5n6-c5ccccc5)c4)c3cc21]

-continued
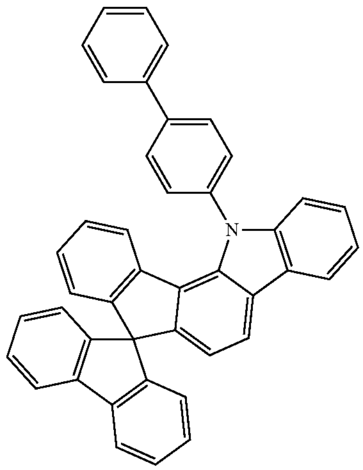 [SMILES: c1ccc(-c2ccc(-n3c4ccccc4c4ccc5c(c43)-c3ccccc3C53c4ccccc4-c4ccccc43)cc2)cc1]
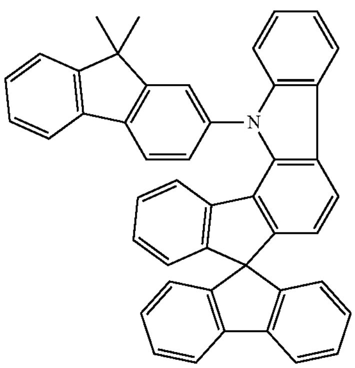 [SMILES: CC1(C)c2ccccc2-c2ccc(-n3c4ccccc4c4ccc5c(c43)-c3ccccc3C53c4ccccc4-c4ccccc43)cc21]
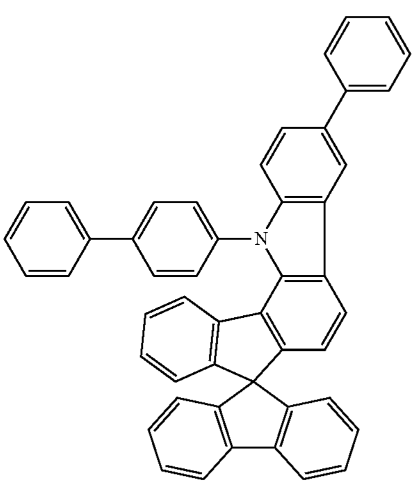 [SMILES: c1ccc(-c2ccc(-n3c4ccc(-c5ccccc5)cc4c4ccc5c(c43)-c3ccccc3C53c4ccccc4-c4ccccc43)cc2)cc1]
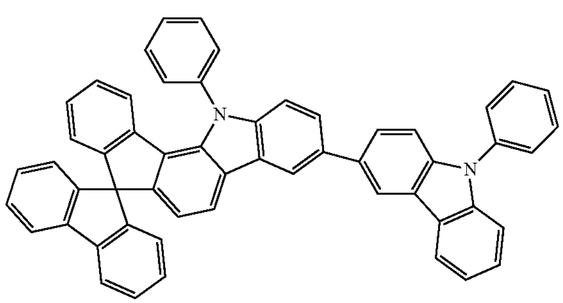 [SMILES: c1ccc(-n2c3ccccc3c3cc(-c4ccc5c(c4)c4ccc6c(c4n5-c4ccccc4)-c4ccccc4C64c5ccccc5-c5ccccc54)ccc32)cc1]
-continued
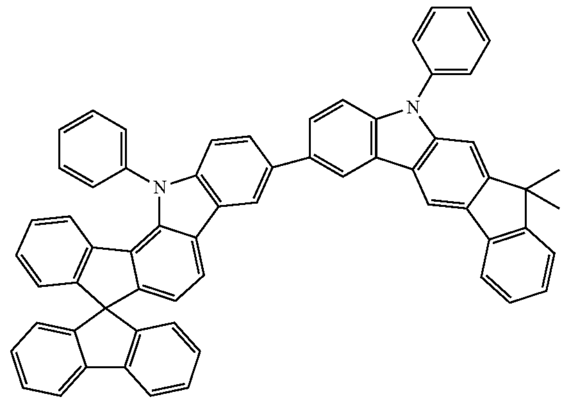 [SMILES: CC1(C)c2ccccc2-c2cc3c4cc(-c5ccc6c(c5)c5ccc7c(c5n6-c5ccccc5)-c5ccccc5C75c6ccccc6-c6ccccc65)ccc4n(-c4ccccc4)c3cc21]
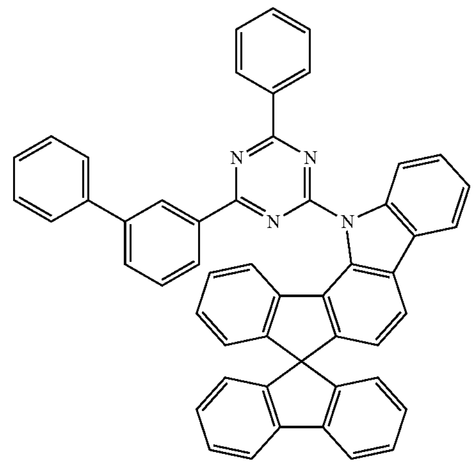 [SMILES: c1ccc(-c2cccc(-c3nc(-c4ccccc4)nc(-n4c5ccccc5c5ccc6c(c54)-c4ccccc4C64c5ccccc5-c5ccccc54)n3)c2)cc1]
Examples of suitable phosphine oxide derivatives are the following structures:
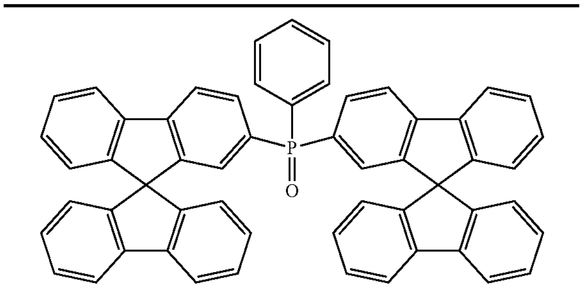
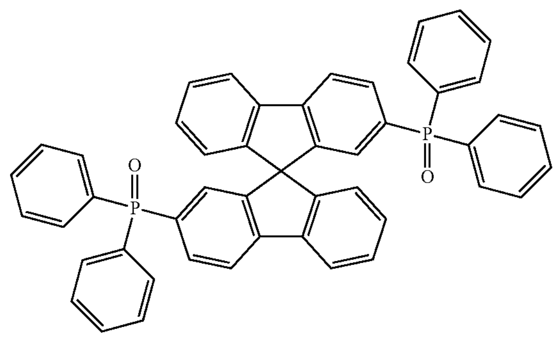 [SMILES: O=P(c1ccccc1)(c1ccccc1)c1ccc2c(c1)C1(c3ccccc3-2)c2ccccc2-c2ccc(P(=O)(c3ccccc3)c3ccccc3)cc21]

-continued
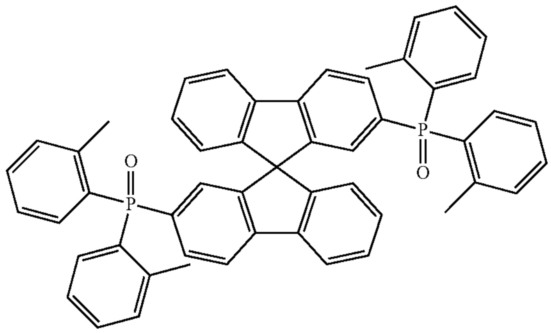 [SMILES: Cc1ccccc1P(=O)(c1ccc2c(c1)C1(c3ccccc3-2)c2ccccc2-c2ccc(P(=O)(c3ccccc3C)c3ccccc3C)cc21)c1ccccc1C]
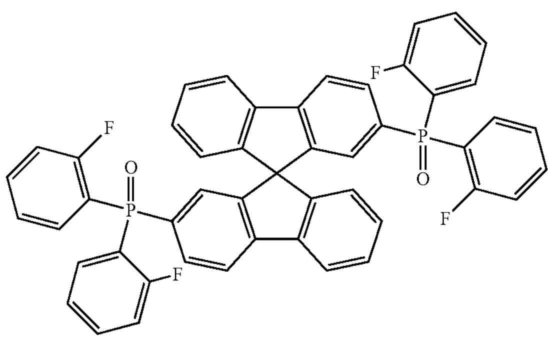 [SMILES: O=P(c1ccc2c(c1)C1(c3ccccc3-2)c2ccccc2-c2ccc(P(=O)(c3ccccc3F)c3ccccc3F)cc21)(c1ccccc1F)c1ccccc1F]
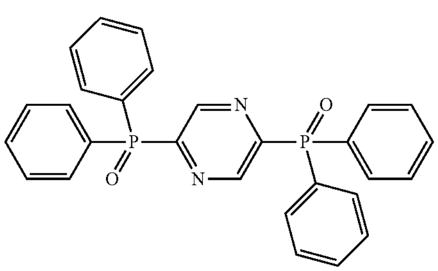 [SMILES: O=P(c1ccccc1)(c1ccccc1)c1cnc(P(=O)(c2ccccc2)c2ccccc2)cn1]
-continued
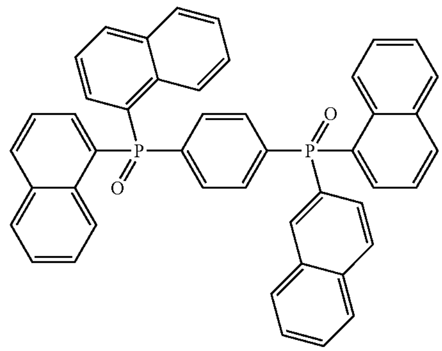 [SMILES: O=P(c1ccc(P(=O)(c2cccc3ccccc23)c2cccc3ccccc23)cc1)(c1ccc2ccccc2c1)c1cccc2ccccc12]
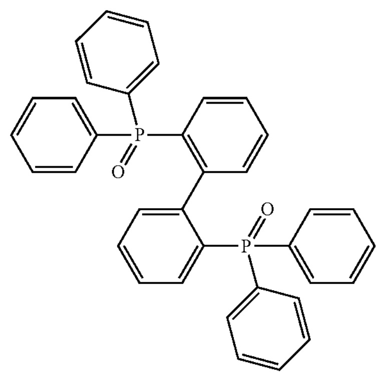 [SMILES: O=P(c1ccccc1)(c1ccccc1)c1ccccc1-c1ccccc1P(=O)(c1ccccc1)c1ccccc1]
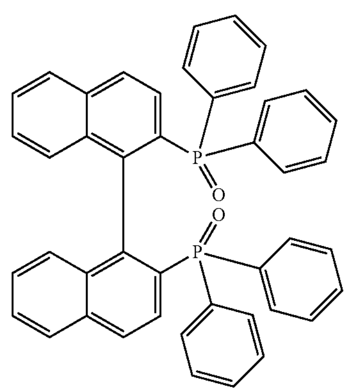 [SMILES: O=P(c1ccccc1)(c1ccccc1)c1ccc2ccccc2c1-c1c(P(=O)(c2ccccc2)c2ccccc2)ccc2ccccc12]
Examples of suitable carbazole derivatives are the following structures:

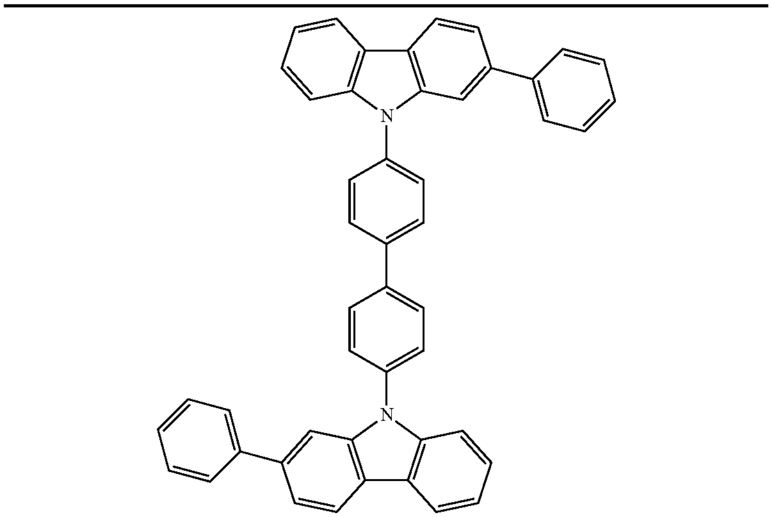
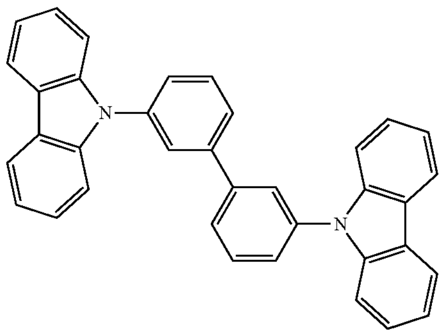 [SMILES: c1cc(-c2cccc(-n3c4ccccc4c4ccccc43)c2)cc(-n2c3ccccc3c3ccccc32)c1]
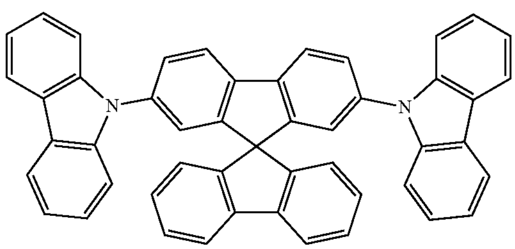 [SMILES: c1ccc2c(c1)-c1ccccc1C21c2cc(-n3c4ccccc4c4ccccc43)ccc2-c2ccc(-n3c4ccccc4c4ccccc43)cc21]
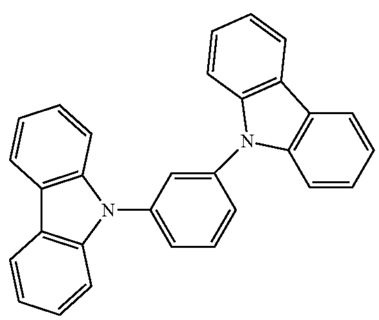 [SMILES: c1cc(-n2c3ccccc3c3ccccc32)cc(-n2c3ccccc3c3ccccc32)c1]
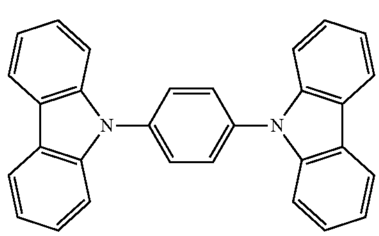 [SMILES: c1ccc2c(c1)c1ccccc1n2-c1ccc(-n2c3ccccc3c3ccccc32)cc1]

-continued
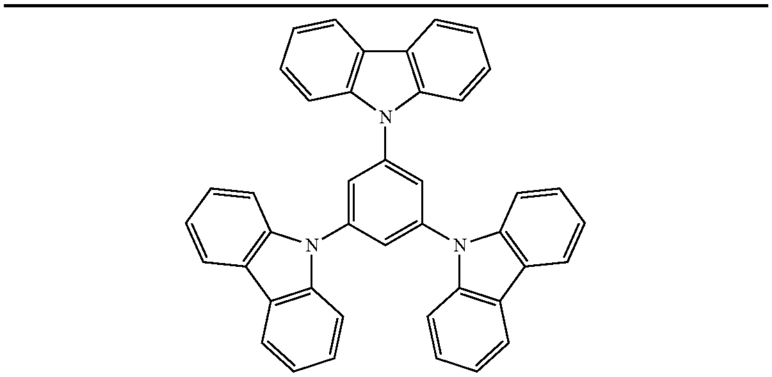
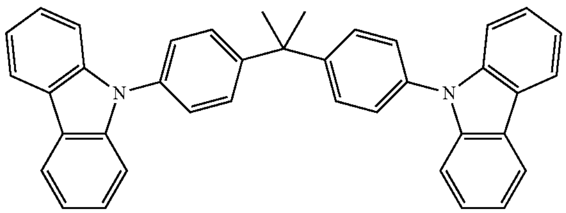 [SMILES: CC(C)(c1ccc(-n2c3ccccc3c3ccccc32)cc1)c1ccc(-n2c3ccccc3c3ccccc32)cc1]
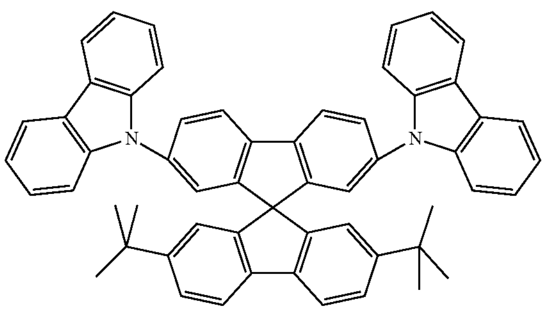 [SMILES: CC(C)(C)c1ccc2c(c1)C1(c3cc(-n4c5ccccc5c5ccccc54)ccc3-c3ccc(-n4c5ccccc5c5ccccc54)cc31)c1cc(C(C)(C)C)ccc1-2]
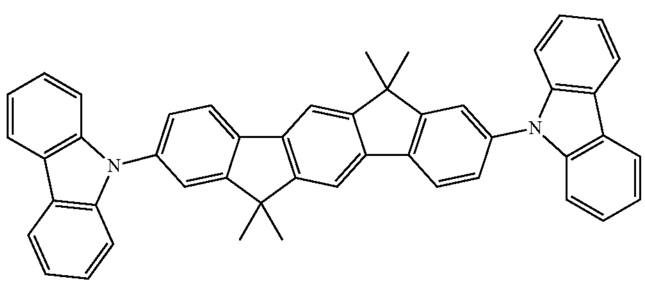 [SMILES: CC1(C)c2cc(-n3c4ccccc4c4ccccc43)ccc2-c2cc3c(cc21)-c1ccc(-n2c4ccccc4c4ccccc42)cc1C3(C)C]
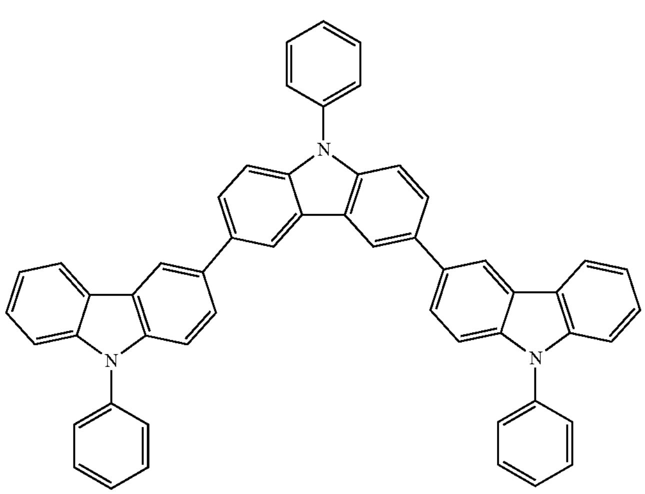 [SMILES: c1ccc(-n2c3ccccc3c3cc(-c4ccc5c(c4)c4cc(-c6ccc7c(c6)c6ccccc6n7-c6ccccc6)ccc4n5-c4ccccc4)ccc32)cc1]

-continued
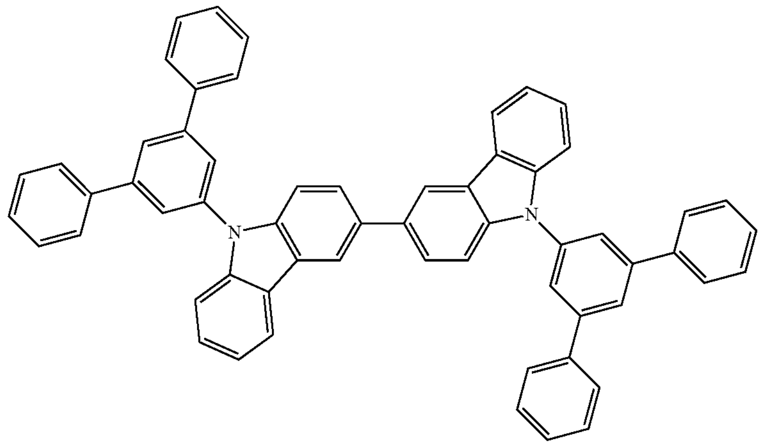 [SMILES: c1ccc(-c2cc(-c3ccccc3)cc(-n3c4ccccc4c4cc(-c5ccc6c(c5)c5ccccc5n6-c5cc(-c6ccccc6)cc(-c6ccccc6)c5)ccc43)c2)cc1]
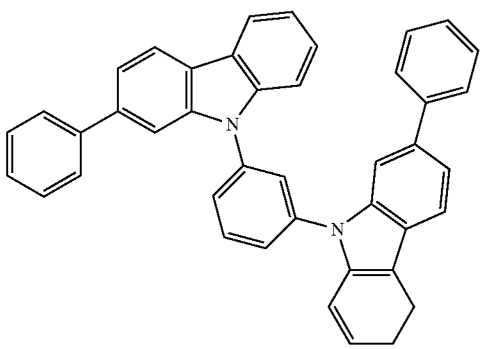 [SMILES: C1=Cc2c(c3ccc(-c4ccccc4)cc3n2-c2cccc(-n3c4ccccc4c4ccc(-c5ccccc5)cc43)c2)CC1]
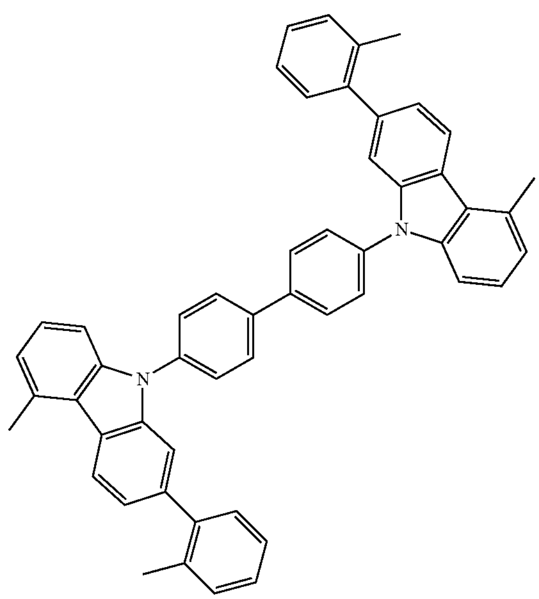

-continued
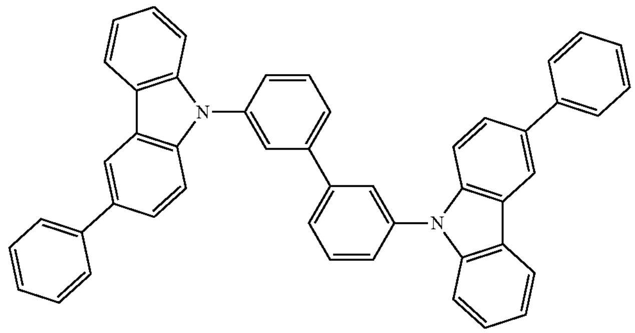 [SMILES: c1ccc(-c2ccc3c(c2)c2ccccc2n3-c2cccc(-c3cccc(-n4c5ccccc5c5cc(-c6ccccc6)ccc54)c3)c2)cc1]
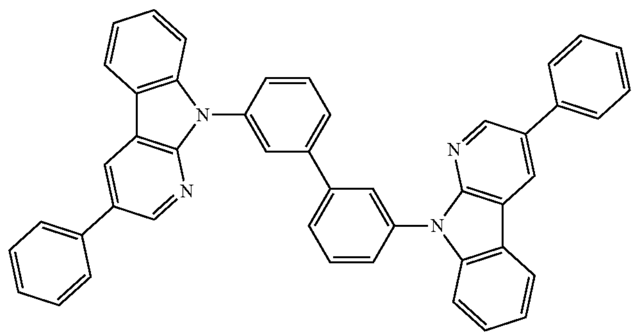 [SMILES: c1ccc(-c2cnc3c(c2)c2ccccc2n3-c2cccc(-c3cccc(-n4c5ccccc5c5cc(-c6ccccc6)cnc54)c3)c2)cc1]
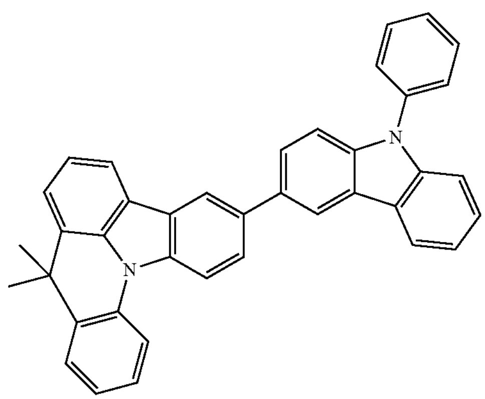 [SMILES: CC1(C)c2ccccc2-n2c3ccc(-c4ccc5c(c4)c4ccccc4n5-c4ccccc4)cc3c3cccc1c32]
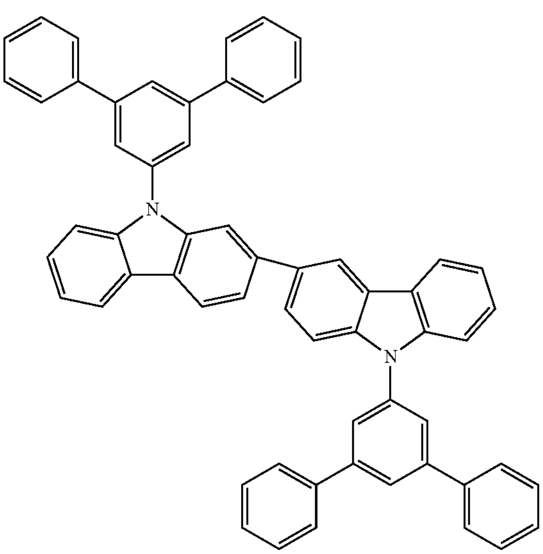 [SMILES: c1ccc(-c2cc(-c3ccccc3)cc(-n3c4ccccc4c4cc(-c5ccc6c7ccccc7n(-c7cc(-c8ccccc8)cc(-c8ccccc8)c7)c6c5)ccc43)c2)cc1]

-continued

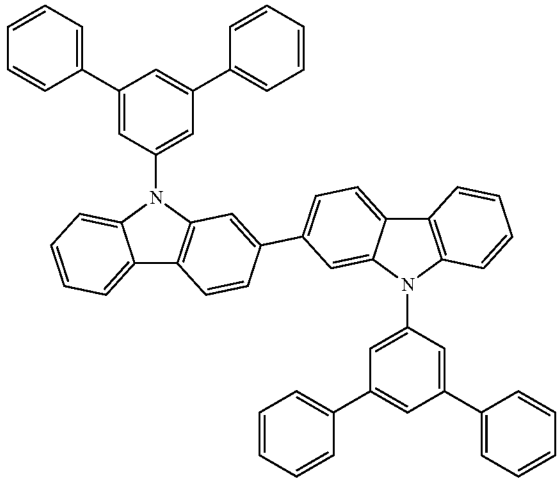 [SMILES: c1ccc(-c2cc(-c3ccccc3)cc(-n3c4ccccc4c4ccc(-c5ccc6c7ccccc7n(-c7cc(-c8ccccc8)cc(-c8ccccc8)c7)c6c5)cc43)c2)cc1]

It may also be preferable to use a plurality of different matrix materials as a mixture, especially of at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579. Preference is likewise given to the use of two electron-transporting matrix materials, for example triazine derivatives and lactam derivatives, as described, for example, in WO 2014/094964.

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the metal complexes of the invention as co-matrix for longer-wave emitting triplet emitters, for example for green- or red-emitting triplet emitters. In this case, it may also be preferable when both the shorter-wave- and the longer-wave-emitting metal complexes are a compound of the invention.

The metal complexes of the invention can also be used in other functions in the electronic device, for example as hole transport material in a hole injection or transport layer, as charge generation material, as electron blocker material, as hole blocker material or as electron transport material, for example in an electron transport layer, according to the choice of metal and the exact structure of the ligand. When the metal complex of the invention is an aluminium complex, it is preferably used in an electron transport layer. It is likewise possible to use the metal complexes of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferable. For some applications, at least one of the electrodes has to be transparent or partly transparent in order to enable either the irradiation of the organic material (O-SC) or the emission of light (OLED/PLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example, M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The organic electroluminescent device can also be produced as a hybrid system by applying one or more layers from solution and applying one or more other layers by vapour deposition. For example, it is possible to apply an emitting layer comprising a metal complex of the invention and a matrix material from solution, and to apply a hole blocker layer and/or an electron transport layer thereto by vapour deposition under reduced pressure.

These methods are known in general terms to those skilled in the art and can be applied without difficulty to organic electroluminescent devices comprising compounds of formula (1) or the above-detailed preferred embodiments.

The electronic devices of the invention, especially organic electroluminescent devices, are notable for one or more of the following surprising advantages over the prior art:

1. The metal complexes of the invention can be synthesized in very high yield and very high purity with exceptionally short reaction times and at comparatively low reaction temperatures.
2. The metal complexes of the invention have excellent thermal stability, which is also manifested in the sublimation of the complexes.
3. The metal complexes of the invention exhibit neither thermal nor photochemical fac/mer or mer/fac isomerization, which leads to advantages in the use of these complexes.
4. Some of the metal complexes of the invention have a very narrow emission spectrum, which leads to a high colour purity in the emission, as is desirable particularly for display applications.
5. Organic electroluminescent devices comprising the metal complexes of the invention as emitting materials have a very good lifetime. This is particularly true even in simple OLEDs in which the metal complex of the invention is incorporated into a single matrix—i.e. a matrix and host material.

6. Organic electroluminescent devices comprising the metal complexes of the invention as emitting materials have excellent efficiency.
7. The metal complexes of the invention are notable for very good oxidation and reduction stability, and they can therefore also be used as hole or electron transport materials.

These abovementioned advantages are not accompanied by a deterioration in the further electronic properties.

The invention is illustrated in detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature.

A: Synthesis of the Synthons S—Part 1

Example S1: 4,4,5,5-Tetramethyl-2-(1,1,3,3-tetramethylindan-5-yl)-[1,3,2]dioxaborolane, [1312464-73-5]

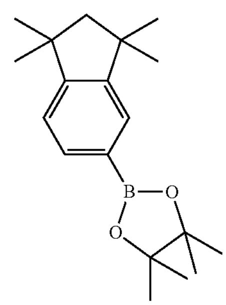

To 800 ml of n-heptane are added 3.3 g (5 mmol) of bis[(1,2,5,6-η)-1,5-cyclooctadiene]di-μ-methoxydiiridium (I) [12148-71-9], then 2.7 g (10 mmol) of 4,4'-di-tert-butyl-[2,2']bipyridinyl [72914-19-3] and then 5.1 g (10 mmol) of bis(pinacolato)diborane, and the mixture is stirred at room temperature for 15 min. Subsequently, 127.0 g (500 mmol) of bis(pinacolato)diborane [73183-34-3] and then 87.2 g (500 mmol) of 1,1,3,3-tetramethylindane [4834-33-7] are added and the mixture is heated to 80° C. for 12 h (TLC monitoring: heptane:ethyl acetate 5:1). After cooling, 300 ml of ethyl acetate are added to the reaction mixture, which is filtered through a silica gel bed, and the filtrate is concentrated completely under reduced pressure. The crude product is recrystallized twice from acetone (about 800 ml). Yield: 136.6 g (455 mmol), 91%; purity: about 99% by $^1$H NMR.

In an analogous manner, it is possible to prepare the following compounds:

-continued

| Ex. | Reactant | Product Boronic ester | Yield |
|---|---|---|---|
| S2 | 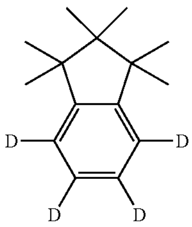 142076-41-3 | 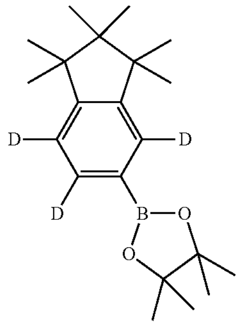 [SMILES: [2H]c1c([2H])c2c(c([2H])c1B1OC(C)(C)C(C)(C)O1)C(C)(C)C(C)(C)C2(C)C] | 87% |
| S3 | 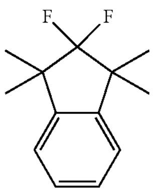 59508-28-0 | 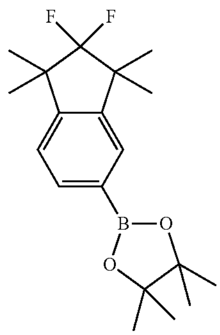 | 78% |
| S4 | 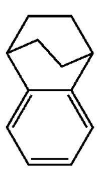 4175-52-4 | 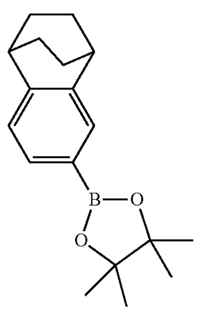 [SMILES: CC1(C)OB(c2ccc3c(c2)C2CCC3CC2)OC1(C)C] | 93% |
| S5 | 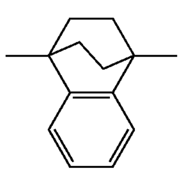 2615-23-6 | 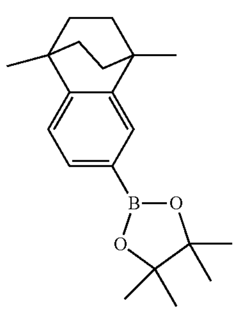 | 90% |
| S6 | 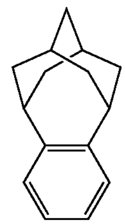 60749-53-3 | 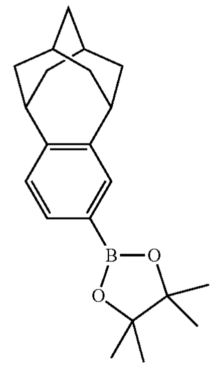 [SMILES: CC1(C)OB(c2ccc3c(c2)C2CC4CC(CC3C4)C2)OC1(C)C] | 94% |

Example S7: syn,anti-tris-1,3,5-(2-hydroxyphenyl) tris-2,4,6-methylbenzenetristrifluoromethanesulphonate

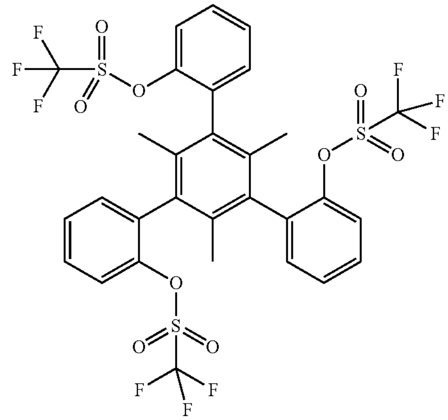 [SMILES: Cc1c(-c2ccccc2OS(=O)(=O)C(F)(F)F)c(C)c(-c2ccccc2OS(=O)(=O)C(F)(F)F)c(C)c1-c1ccccc1OS(=O)(=O)C(F)(F)F]

To a solution of 11.9 g (30 mmol) of tris-1,3,5-(2-hydroxyphenyl)-tris-2,4,6-methylbenzene (syn-[1421368-51-5] and anti-[1421368-52-6] mixture) in 500 ml of dichloromethane are added, at −5° C., 12.1 ml (150 mmol) of pyridine. Then a mixture of 25.2 ml (150 mmol) of trifluoromethanesulphonic anhydride and 200 ml of dichloromethane is added dropwise over the course of 1 h, and the mixture is stirred at 0° C. for a further 1 h and left to warm up to room temperature while stirring overnight. The reaction mixture is washed cautiously twice with 500 ml each time of 1 N HCl, once with 500 ml of water and once with 500 ml of saturated sodium chloride solution, and then dried over sodium sulphate. The crude product obtained after the dichloromethane has been drawn off is converted further without further purification. Yield: 22.1 g (28 mmol), 93%. Purity: about 95% by $^{1}H$ NMR, syn/anti mixture.

Example S8: 10-Bromo-6-tert-butylbenzo[4,5]imidazo[1,2-c]quinazoline

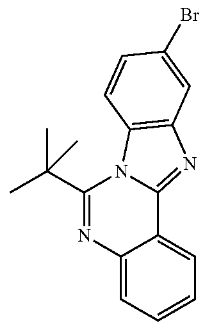 [SMILES: CC(C)(C)c1nc2ccccc2c2nc3cc(Br)ccc3n12]

A mixture of 28.8 g (100 mmol) of 2-[5-bromo-1H-benzimidazol-2-yl]phenylamine [1178172-85-4], 42.2 g (350 mmol) of pivaloyl chloride and 30.6 g (300 mmol) of pivalic acid is heated under reflux for 50 h. The reaction mixture is allowed to cool down to about 60° C., 100 ml of ethanol are added, the mixture thus obtained is stirred into a mixture of 500 g of ice and 500 ml of conc. ammonia and stirred for a further 15 min, then the precipitated solid is filtered off with suction, washed twice with 100 ml each time of water and sucked dry. The crude product is taken up in 200 ml of dichloromethane, filtered through a short silica gel column and washed with 200 ml of dichloromethane, and the dichloromethane is removed under reduced pressure. The crude product is chromatographed on silica gel with n-heptane:ethyl acetate (2:1). Yield: 12.0 g (34 mmol), 34%. Purity: about 97% by $^{1}$H NMR.

Example S9: 5-Bromo-1,1,3,3-tetramethyl-2,3-dihydro-1H-3b,7-diazacyclopenta[I]phenanthren-6-one

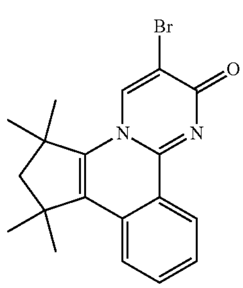 [SMILES: CC1(C)CC(C)(C)c2c1c1ccccc1c1nc(=O)c(Br)cn21]

To a suspension of 2.9 g (10 mmol) of 1,1,3,3-tetramethyl-2,3-dihydro-1H-3b,7-diazacyclopenta[l]phenanthren-6-one [1616465-59-8] in 50 ml of glacial acetic acid is added dropwise at room temperature a solution of 615 μl (12 mmol) of bromine in 10 ml of glacial acetic acid. After the addition has ended, the mixture is heated to 60° C. for another 5 h, then the glacial acetic acid is substantially removed under reduced pressure. The residue is taken up in 200 ml of ethyl acetate, washed once with 50 ml of saturated sodium carbonate solution, twice with 50 ml each time of water and once with 50 ml of saturated sodium chloride solution, and dried over magnesium sulphate. The crude product is chromatographed on silica gel with n-heptane: ethyl acetate (2:1). Yield: 2.4 g (6.5 mmol), 65%. Purity: about 97% by $^{1}$H NMR.

Example S10: 5-Bromo-2-[1,1,2,2,3,3-hexamethylindan-5-yl]pyridine

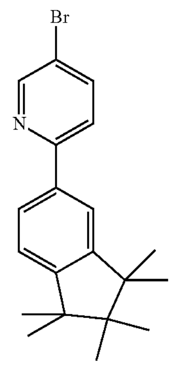 [SMILES: CC1(C)c2ccc(-c3ccc(Br)cn3)cc2C(C)(C)C1(C)C]

A mixture of 164.2 g (500 mmol) of 2-(1,1,2,2,3,3-hexamethylindan-5-yl)-4,4,5,5-tetramethyl-[1,3,2]dioxaborolane [152418-16-9] (it is analogously possible to use boronic acids), 142.0 g (500 mmol) of 5-bromo-2-iodopyridine [223463-13-6], 159.0 g (1.5 mol) of sodium carbonate, 5.8 g (5 mmol) of tetrakis(triphenylphosphino)palladium(0), 700 ml of toluene, 300 ml of ethanol and 700 ml of water is heated under reflux with good stirring for 16 h. After cooling, 1000 ml of toluene are added, the organic phase is removed and the aqueous phase is re-extracted with 300 ml of toluene. The combined organic phases are washed once with 500 ml of saturated sodium chloride solution. After the organic phase has been dried over sodium sulphate and the solvent has been removed under reduced pressure, the crude product is recrystallized twice from about 300 ml of EtOH. Yield: 130.8 g (365 mmol), 73%. Purity: about 95% by $^{1}$H NMR.

It is analogously possible to prepare the following compounds, generally using 5-bromo-2-iodopyridine ([223463-13-6]) as pyridine derivative, which is not listed separately in the table which follows, and only different pyridine derivatives are listed explicitly in the table:

| Ex. | Boronic acid/ester Pyridine | Product | Yield |
|---|---|---|---|
| S11 | 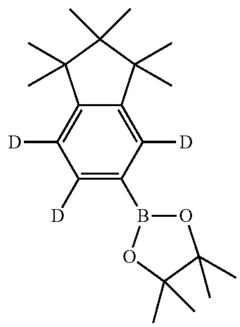 S2 | 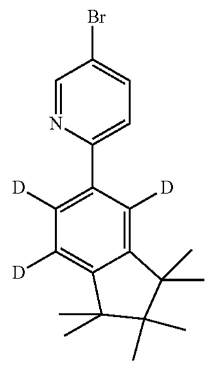 [SMILES: [2H]c1c([2H])c2c(c([2H])c1-c1ccc(Br)cn1)C(C)(C)C(C)(C)C2(C)C] | 76% |
| S12 | 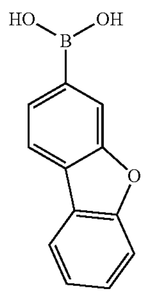 395087-89-5 | 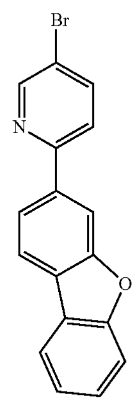 [SMILES: Brc1ccc(-c2ccc3c(c2)oc2ccccc23)nc1] | 75% |
| S13 | 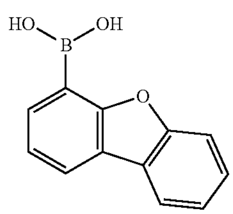 100124-06-9 | 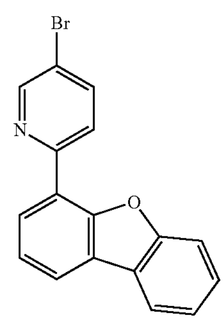 [SMILES: Brc1ccc(-c2cccc3c2oc2ccccc23)nc1] | 69% |
| S14 | 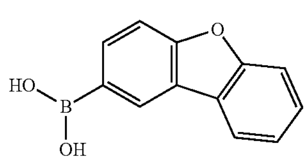 402936-15-6 | 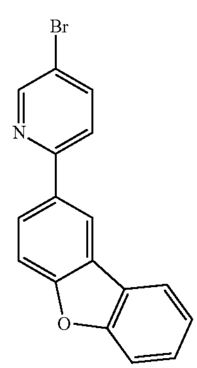 | 71% |

-continued
| Ex. | Boronic acid/ester Pyridine | Product | Yield |
|---|---|---|---|
| S15 | 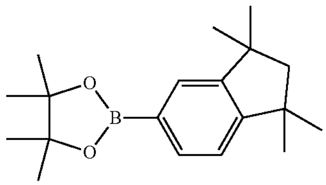 1312464-73-5 | 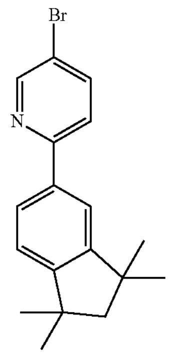 [SMILES: CC1(C)CC(C)(C)c2cc(-c3ccc(Br)cn3)ccc21] | 80% |
| S16 | 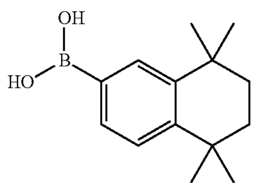 169126-63-0 | 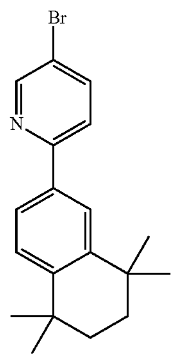 | 78% |
| S17 | 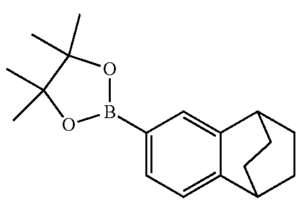 S4 | 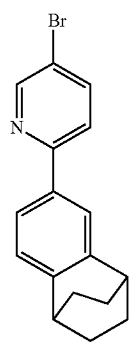 [SMILES: Brc1ccc(-c2ccc3c(c2)C2CCC3CC2)nc1] | 78% |
| S18 | 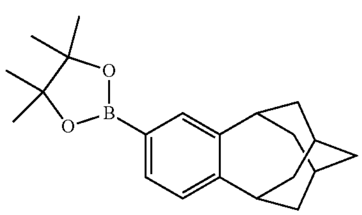 S6 | 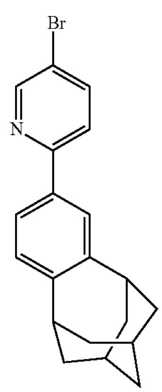 [SMILES: Brc1ccc(-c2ccc3c(c2)C2CC4CC(CC3C4)C2)nc1] | 81% |

-continued
| Ex. | Boronic acid/ester Pyridine | Product | Yield |
|---|---|---|---|
| S19 | 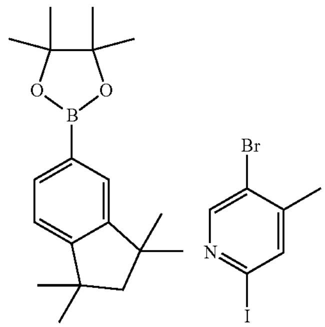 1312464-73-5/941294-57-1 | 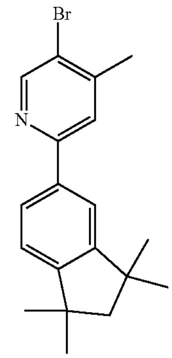 [SMILES: Cc1cc(-c2ccc3c(c2)C(C)(C)CC3(C)C)ncc1Br] | 77% |
| S20 | 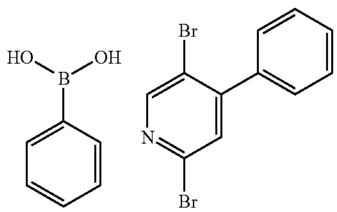 98-80-6/1381937-40-1 | 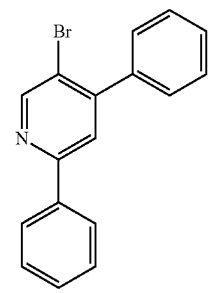 [SMILES: Brc1cnc(-c2ccccc2)cc1-c1ccccc1] | 73% |
| S59 | 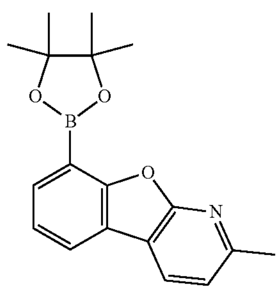 1609374-04-0 | 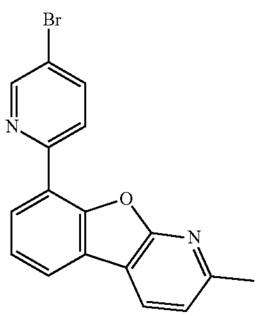 [SMILES: Cc1ccc2c(n1)oc1c(-c3ccc(Br)cn3)cccc12] | 68% |
| S71 | 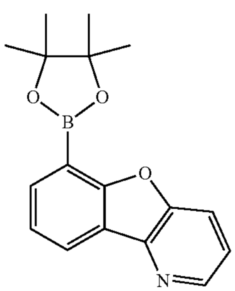 S63 | 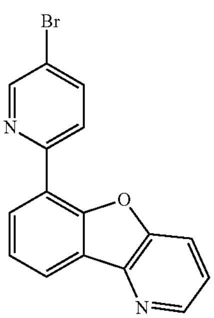 [SMILES: Brc1ccc(-c2cccc3c2oc2cccnc23)nc1] | 70% |
| S72 | 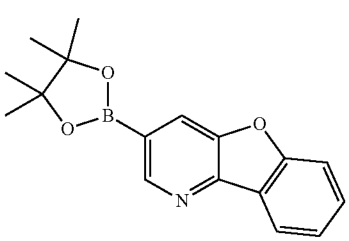 S64 | 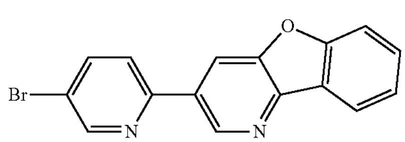 [SMILES: Brc1ccc(-c2cnc3c(c2)oc2ccccc23)nc1] | 65% |

-continued
| Ex. | Boronic acid/ester Pyridine | Product | Yield |
|---|---|---|---|
| S73 | 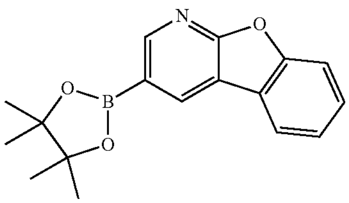 S65 | 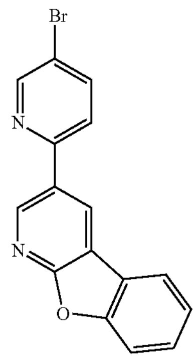 [SMILES: Brc1ccc(-c2cnc3oc4ccccc4c3c2)nc1] | 60% |
| S74 | 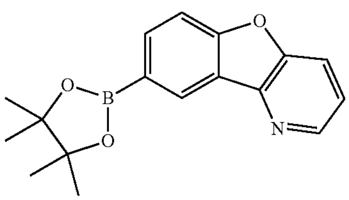 S66 | 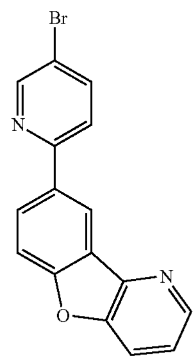 [SMILES: Brc1ccc(-c2ccc3oc4cccnc4c3c2)nc1] | 71% |
| S75 | 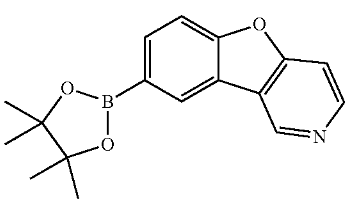 S67 | 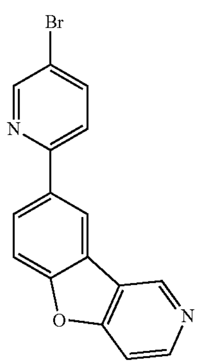 [SMILES: Brc1ccc(-c2ccc3oc4ccncc4c3c2)nc1] | 69% |
| S76 | 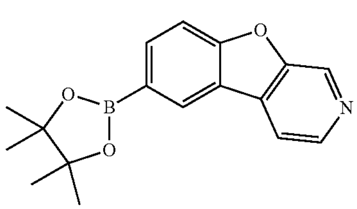 S68 | 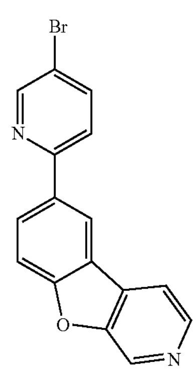 [SMILES: Brc1ccc(-c2ccc3oc4cnccc4c3c2)nc1] | 67% |

-continued
| Ex. | Boronic acid/ester Pyridine | Product | Yield |
|---|---|---|---|
| S77 | 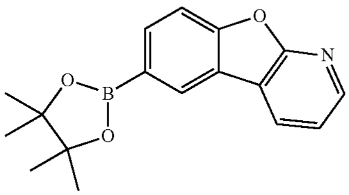 S69 | 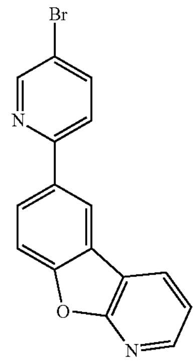 [SMILES: Brc1ccc(-c2ccc3oc4ncccc4c3c2)nc1] | 62% |
| S78 | 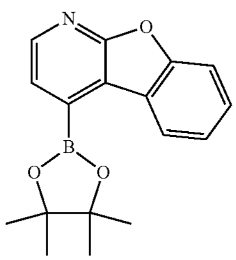 S70 | 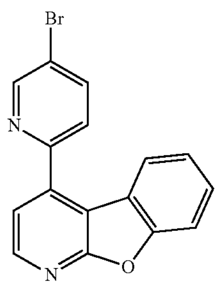 [SMILES: Brc1ccc(-c2ccnc3oc4ccccc4c23)nc1] | 48% |
| S79 | 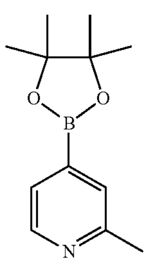 660867-80-1 | 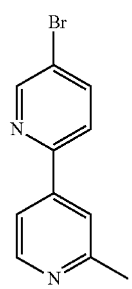 | 67% |
| S80 | 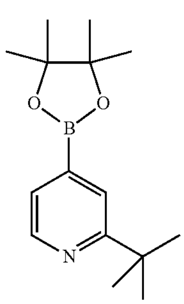 1627722-65-9 | 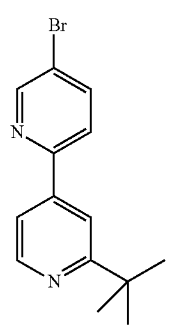 [SMILES: CC(C)(C)c1cc(-c2ccc(Br)cn2)ccn1] | 60% |

-continued
| Ex. | Boronic acid/ester Pyridine | Product | Yield |
|---|---|---|---|
| S81 | 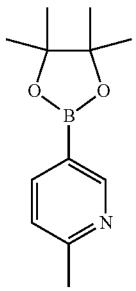 610768-32-6 | 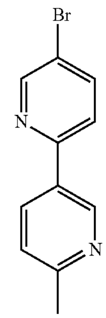 | 65% |
| S82 | 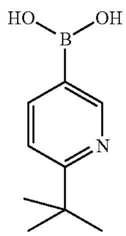 1174312-53-8 | 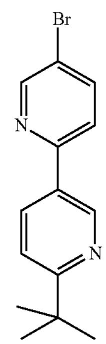 | 63% |
| S94 | 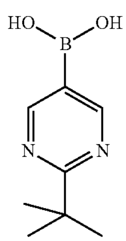 1352570-51-4 | 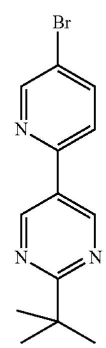 | 43% |
| S108 | 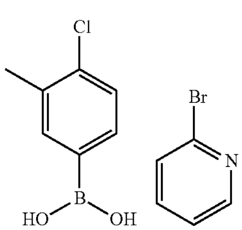 161950-10-3/109-04-6 | 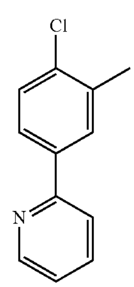 | 76% |

-continued
| Ex. | Boronic acid/ester Pyridine | Product | Yield |
|---|---|---|---|
| S125 | 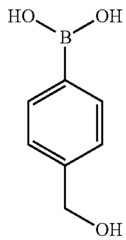 59016-93-2 | 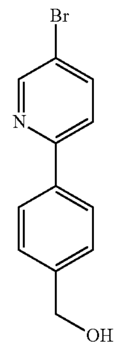 [SMILES: OCc1ccc(-c2ccc(Br)cn2)cc1] | 61% |
| S126 | 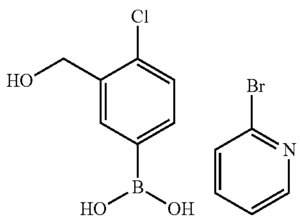 1430237-54-9/109-04-6 | 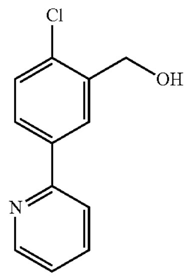 [SMILES: OCc1cc(-c2ccccn2)ccc1Cl] | 58% |
| S140 | 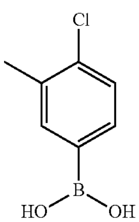 161950-10-3 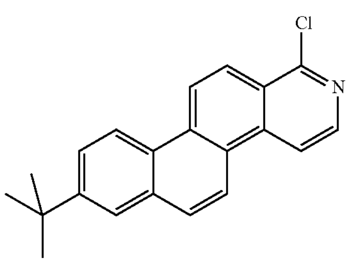 1620789-34-5 | 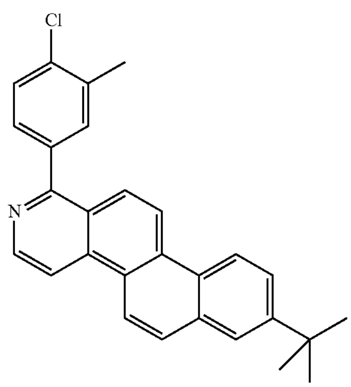 [SMILES: Cc1cc(-c2nccc3c2ccc2c4ccc(C(C)(C)C)cc4ccc32)ccc1Cl] | 53% |
| S141 | 161950-10-3 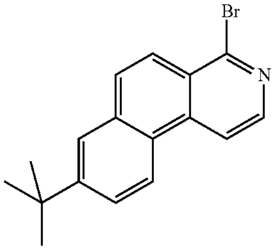 1616510-96-3 | 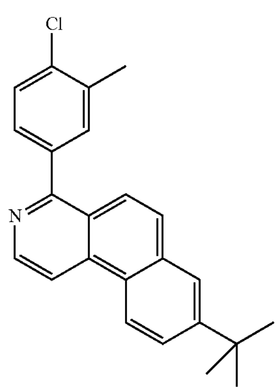 [SMILES: Cc1cc(-c2nccc3c2ccc2cc(C(C)(C)C)ccc23)ccc1Cl] | 58% |

-continued
| Ex. | Boronic acid/ester Pyridine | Product | Yield |
|---|---|---|---|
| S144 | 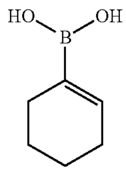 89490-05-1 | 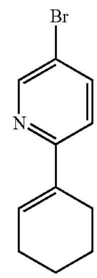 [SMILES: Brc1ccc(C2=CCCCC2)nc1] | 48% |
| S145 | 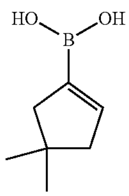 1146616-04-7 | 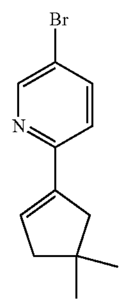 | 39% |
| S146 | 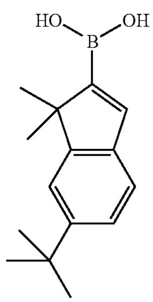 1599428-90-6 | 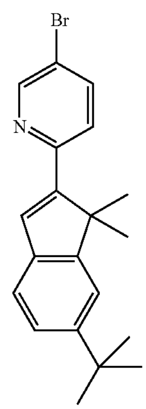 [SMILES: CC(C)(C)c1ccc2c(c1)C(C)(C)C(c1ccc(Br)cn1)=C2] | 65% |
| S147 | 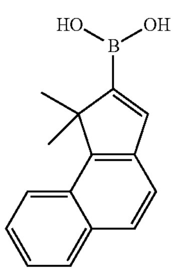 1603843-09-9 | 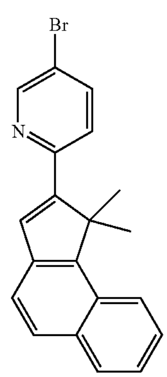 [SMILES: CC1(C)C(c2ccc(Br)cn2)=Cc2ccc3ccccc3c21] | 57% |

-continued
| Ex. | Boronic acid/ester Pyridine | Product | Yield |
| --- | --- | --- | --- |
| S148 | 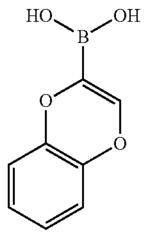 1107064-32-3 | 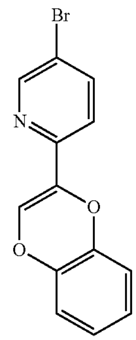 [SMILES: Brc1ccc(C2=COc3ccccc3O2)nc1] | 81% |
| S149 | 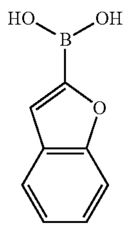 98437-24-2 | 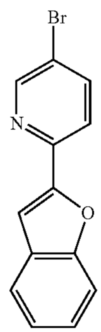 [SMILES: Brc1ccc(-c2cc3ccccc3o2)nc1] | 78% |
| S150 | 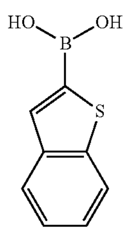 98437-23-1 | 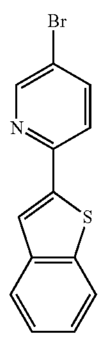 [SMILES: Brc1ccc(-c2cc3ccccc3s2)nc1] | 68% |
| S151 | 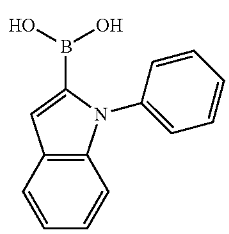 98437-23-1 | 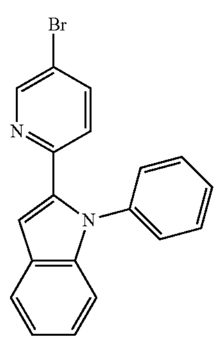 [SMILES: Brc1ccc(-c2cc3ccccc3n2-c2ccccc2)nc1] | 24% |

Example S21: 2-[1,1,2,2,3,3-Hexamethylindan-5-yl]-5-(4,4,5,5-tetramethyl-[1,3,2]dioxaborolan-2-yl)pyridine Variant A:

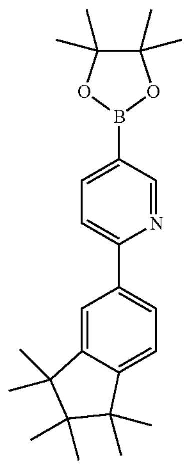

A mixture of 35.8 g (100 mmol) of S10, 25.4 g (100 mmol) of bis(pinacolato)diborane [73183-34-3], 49.1 g (500 mmol) of potassium acetate, 1.5 g (2 mmol) of 1,1-bis(diphenylphosphino)ferrocenedichloropalladium(II) complex with DCM [95464-05-4], 200 g of glass beads (diameter 3 mm), 700 ml of 1,4-dioxane and 700 ml of toluene is heated under reflux for 16 h. After cooling, the suspension is filtered through a Celite bed and the solvent is removed under reduced pressure. The black residue is digested with 1000 ml of hot n-heptane, cyclohexane or toluene and filtered through a Celite bed while still hot, then concentrated to about 200 ml, in the course of which the product begins to crystallize. Alternatively, hot extraction with ethyl acetate is possible. The crystallization is completed in a refrigerator overnight, and the crystals are filtered off and washed with a little n-heptane. A second product fraction can be obtained from the mother liquor. Yield: 31.6 g (78 mmol) 78%. Purity: about 95% by $^{1}$H NMR.

Variant B: Conversion of Aryl Chlorides

As variant A, except that, rather than 1,1-bis(diphenylphosphino)-ferrocenedichloropalladium(II) complex with DCM, 2 mmol of SPhos [657408-07-6] and 1 mmol of palladium(II) acetate are used.

In an analogous manner, it is possible to prepare the following compounds, and it is also possible to use cyclohexane, toluene, acetonitrile or mixtures of said solvents for purification rather than n-heptane:

| Ex. | Bromide—Variant A<br>Chloride—Variant B | Product | Yield |
|---|---|---|---|
| S22 | 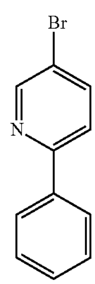<br>27012-25-5 | 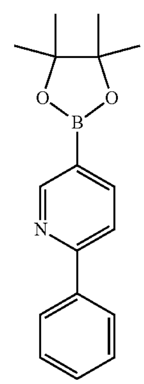 | 85% |
| S23 | 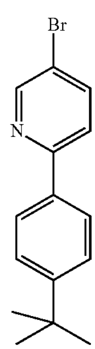<br>1215073-34-9 | 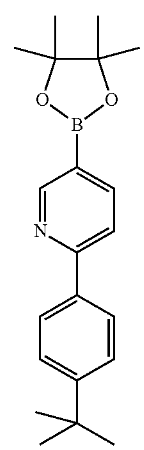 | 80% |

-continued
| Ex. | Bromide—Variant A<br>Chloride—Variant B | Product | Yield |
|---|---|---|---|
| S24 | 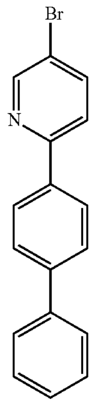<br>1035556-84-3 | 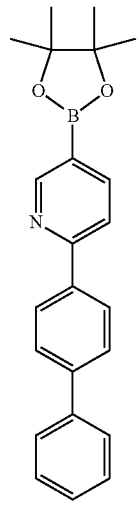 | 83% |
| S25 | 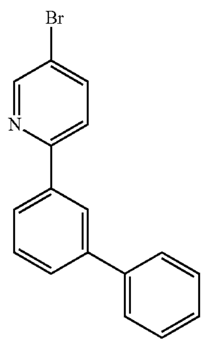<br>875462-73-0 | 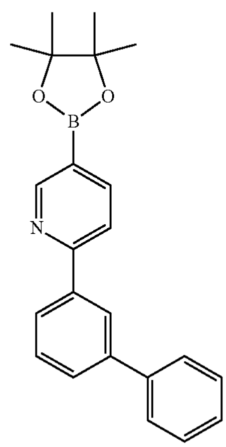 [SMILES: CC1(C)OB(c2ccc(-c3cccc(-c4ccccc4)c3)nc2)OC1(C)C] | 74% |
| S26 | 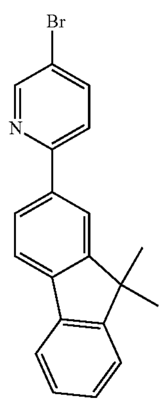<br>1486482-87-4 | 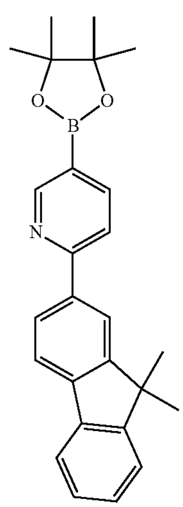 | 77% |

-continued
| Ex. | Bromide—Variant A Chloride—Variant B | Product | Yield |
|---|---|---|---|
| S27 | 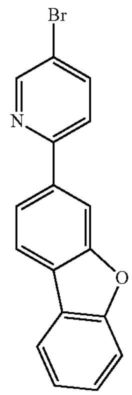 S12 | 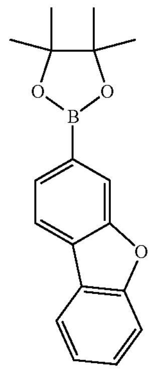 [SMILES: CC1(C)OB(c2ccc3c(c2)oc2ccccc23)OC1(C)C] | 79% |
| S28 | 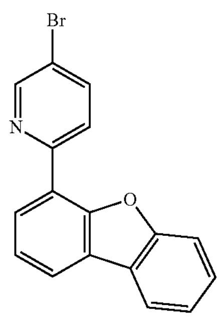 S13 | 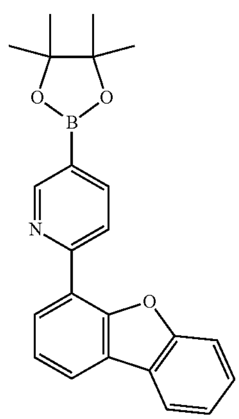 [SMILES: CC1(C)OB(c2ccc(-c3cccc4c3oc3ccccc34)nc2)OC1(C)C] | 67% |
| S29 | 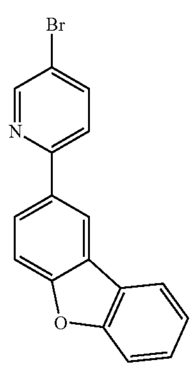 S14 | 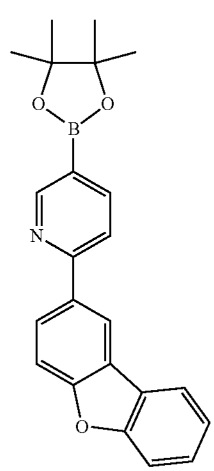 [SMILES: CC1(C)OB(c2ccc(-c3ccc4oc5ccccc5c4c3)nc2)OC1(C)C] | 70% |

-continued
| Ex. | Bromide—Variant A<br>Chloride—Variant B | Product | Yield |
|---|---|---|---|
| S30 | 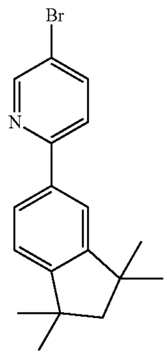<br>S15 | 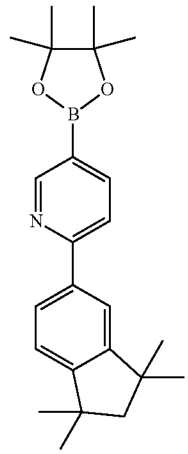 | 82% |
| S31 | 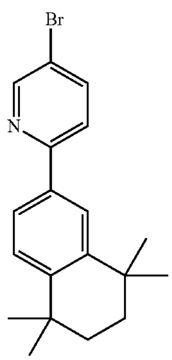<br>S16 | 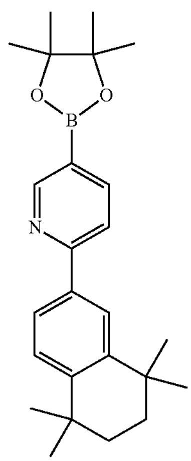 | 80% |
| S32 | 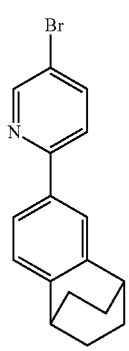<br>S17 | 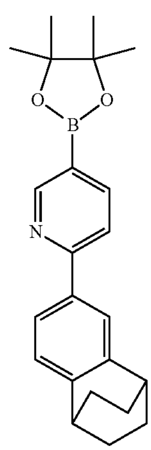 [SMILES: CC1(C)OB(c2ccc(-c3ccc4c(c3)C3CCC4CC3)nc2)OC1(C)C] | 80% |

-continued
| Ex. | Bromide—Variant A<br>Chloride—Variant B | Product | Yield |
| --- | --- | --- | --- |
| S33 | 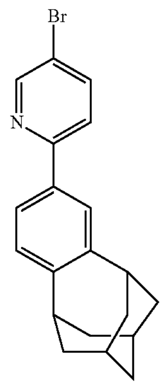<br>S18 | 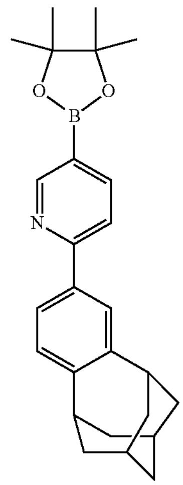 [SMILES: CC1(C)OB(c2ccc(-c3ccc4c(c3)C3CC5CC(CC4C5)C3)nc2)OC1(C)C] | 78% |
| S34 | 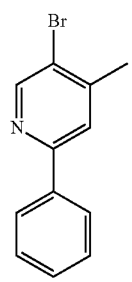<br>31686-64-3 | 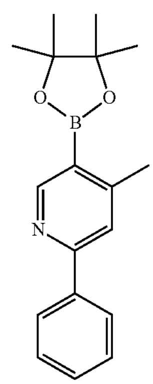 | 74% |
| S35 | 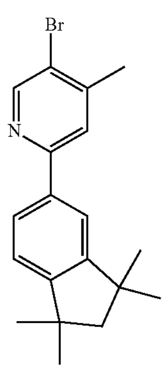<br>S19 | 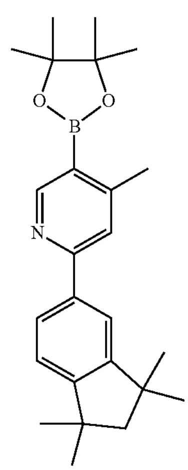 | 76% |

-continued
| Ex. | Bromide—Variant A<br>Chloride—Variant B | Product | Yield |
|---|---|---|---|
| S36 | 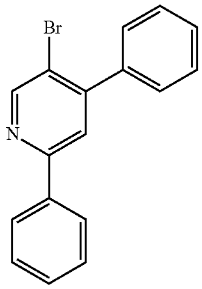<br>S20 | 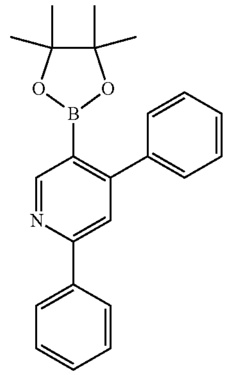 [SMILES: CC1(C)OB(c2cnc(-c3ccccc3)cc2-c2ccccc2)OC1(C)C] | 70% |
| S37 | 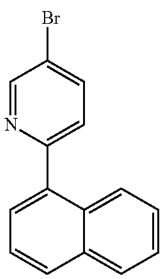<br>88345-95-3 | 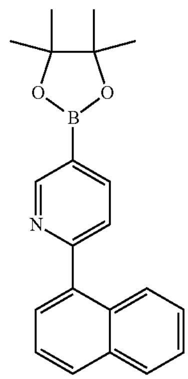 [SMILES: CC1(C)OB(c2ccc(-c3cccc4ccccc34)nc2)OC1(C)C] | 68% |
| S38 | 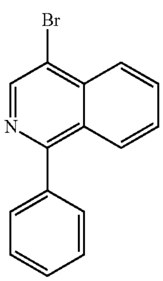<br>22960-25-4 | 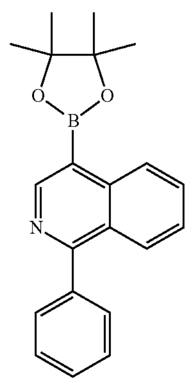 [SMILES: CC1(C)OB(c2cnc(-c3ccccc3)c3ccccc23)OC1(C)C] | 76% |
| S39 | 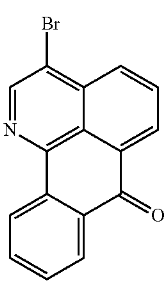<br>57669-37-1 | 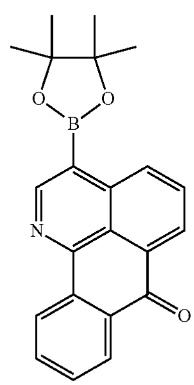 [SMILES: CC1(C)OB(c2cnc3c4c(cccc24)C(=O)c2ccccc2-3)OC1(C)C] | 83% |

-continued
| Ex. | Bromide—Variant A<br>Chloride—Variant B | Product | Yield |
|---|---|---|---|
| S40 | 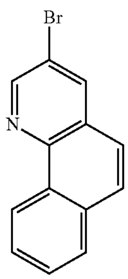<br>68473-51-8 | 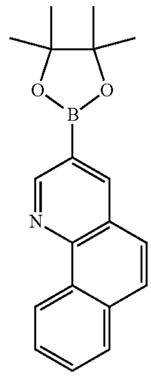 [SMILES: CC1(C)OB(c2cnc3c(ccc4ccccc43)c2)OC1(C)C] | 85% |
| S41 | 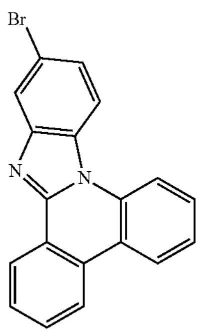<br>1623150-49-1 | 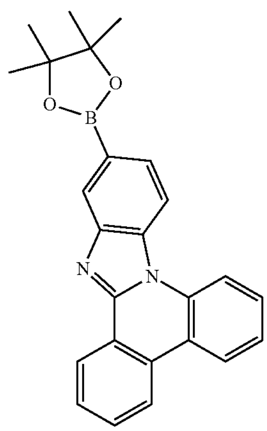 [SMILES: CC1(C)OB(c2ccc3c(c2)nc2c4ccccc4c4ccccc4n32)OC1(C)C] | 80% |
| S42 | 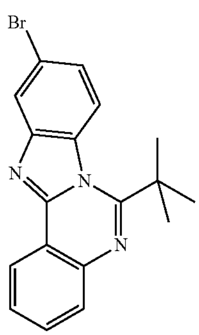<br>S8 | 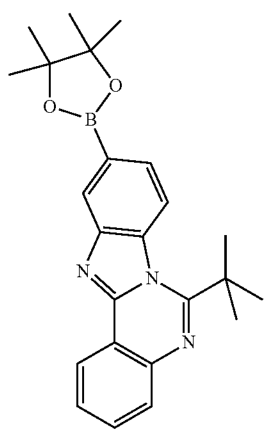 [SMILES: CC(C)(C)c1nc2ccccc2c2nc3cc(B4OC(C)(C)C(C)(C)O4)ccc3n12] | 78% |

-continued
| Ex. | Bromide—Variant A<br>Chloride—Variant B | Product | Yield |
|---|---|---|---|
| S43 | 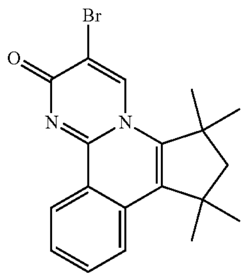<br>S9 | 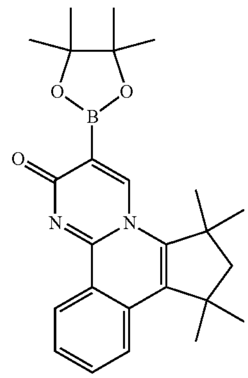 [SMILES: CC1(C)CC(C)(C)c2c1c1ccccc1c1nc(=O)c(B3OC(C)(C)C(C)(C)O3)cn21] | 76% |
| S54 | 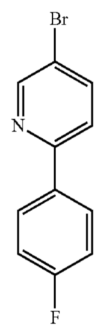<br>463336-07-4 | 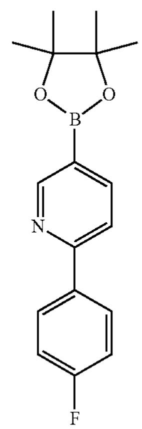 | 72% |
| S55 | 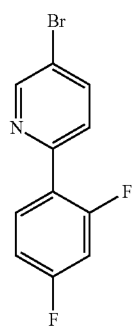<br>453530-70-6 | 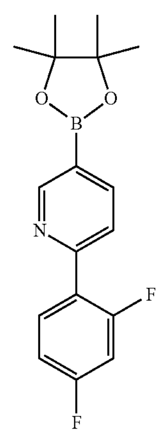 [SMILES: CC1(C)OB(c2ccc(-c3ccc(F)cc3F)nc2)OC1(C)C] | 69% |
| S56 | 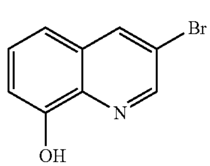<br>139399-62-5 | 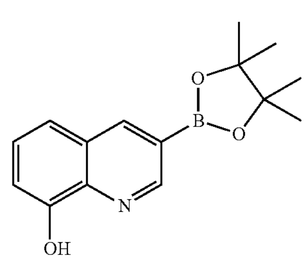 [SMILES: CC1(C)OB(c2cnc3c(O)cccc3c2)OC1(C)C] | 54% |

-continued
| Ex. | Bromide—Variant A<br>Chloride—Variant B | Product | Yield |
|---|---|---|---|
| S57 | 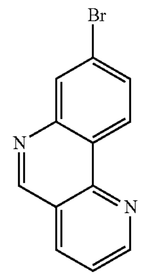<br>1039080-00-6 | 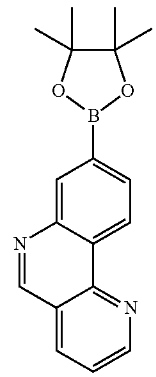 [SMILES: CC1(C)OB(c2ccc3c(c2)ncc2cccnc23)OC1(C)C] | 41% |
| S58 | 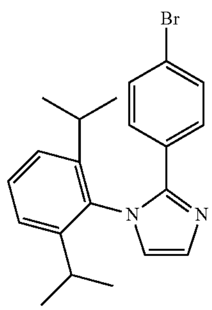 [SMILES: CC(C)c1cccc(C(C)C)c1-n1ccnc1-c1ccc(Br)cc1]<br>1492036-006 | 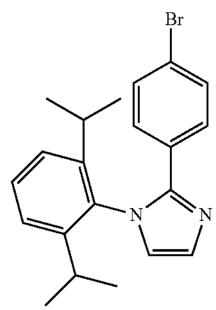 | 58% |
| S60 | 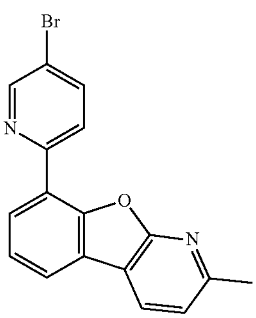<br>S59 | 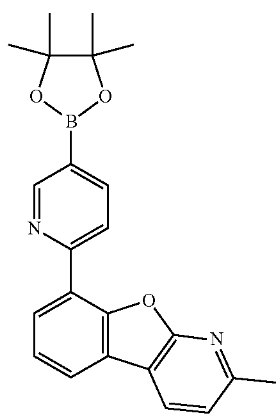 | 60% |
| S61 | 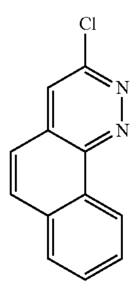<br>361979-42-2 | 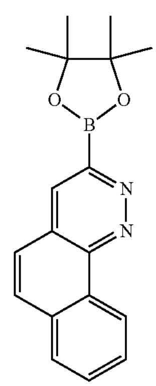 [SMILES: CC1(C)OB(c2cc3ccc4ccccc4c3nn2)OC1(C)C] | 66% |

-continued
| Ex. | Bromide—Variant A<br>Chloride—Variant B | Product | Yield |
|---|---|---|---|
| S62 | 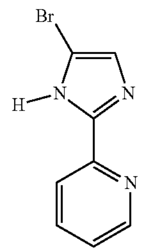<br>71048-48-1 | 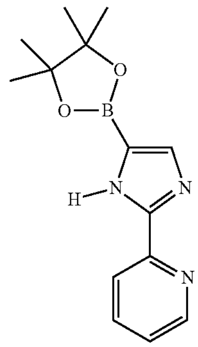 [SMILES: CC1(C)OB(c2cnc(-c3ccccn3)[nH]2)OC1(C)C] | 33% |
| S83 | 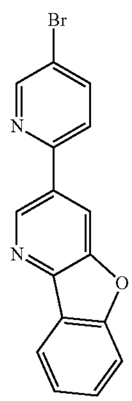<br>S72 | 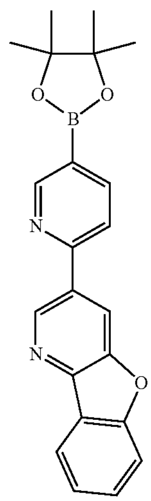 [SMILES: CC1(C)OB(c2ccc(-c3cnc4c(c3)oc3ccccc34)nc2)OC1(C)C] | 81% |
| S84 | 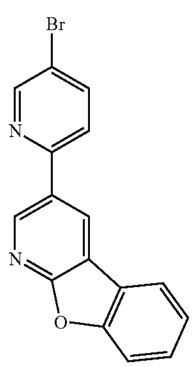<br>S73 | 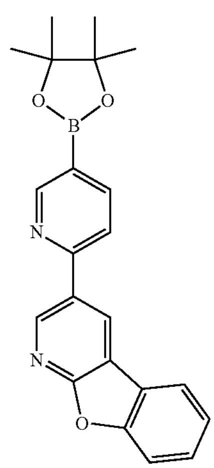 [SMILES: CC1(C)OB(c2ccc(-c3cnc4oc5ccccc5c4c3)nc2)OC1(C)C] | 77% |

-continued
| Ex. | Bromide—Variant A Chloride—Variant B | Product | Yield |
| --- | --- | --- | --- |
| S85 | 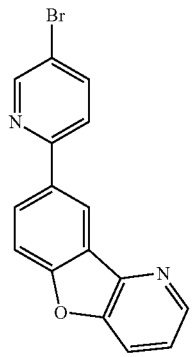 S74 | 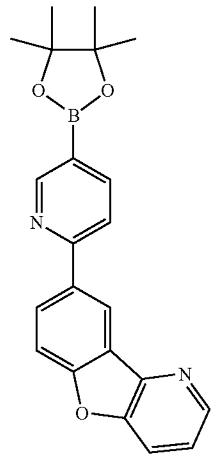 [SMILES: CC1(C)OB(c2ccc(-c3ccc4oc5cccnc5c4c3)nc2)OC1(C)C] | 75% |
| S86 | 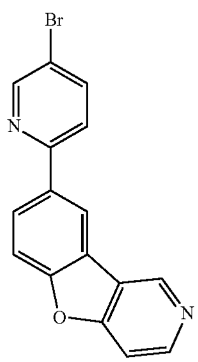 S75 | 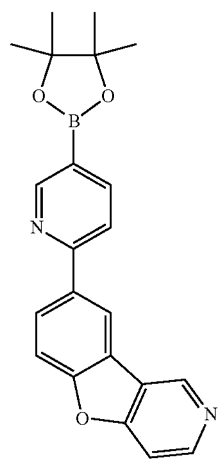 [SMILES: CC1(C)OB(c2ccc(-c3ccc4oc5ccncc5c4c3)nc2)OC1(C)C] | 78% |
| S87 | 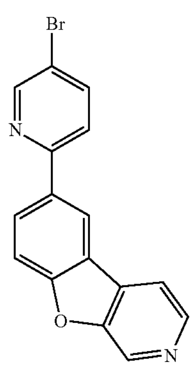 S76 | 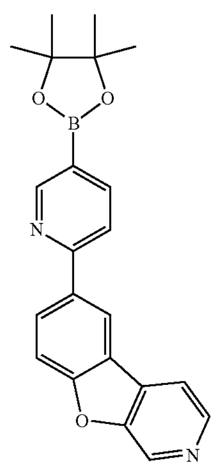 [SMILES: CC1(C)OB(c2ccc(-c3ccc4oc5cnccc5c4c3)nc2)OC1(C)C] | 70% |

-continued
| Ex. | Bromide—Variant A<br>Chloride—Variant B | Product | Yield |
|---|---|---|---|
| S88 | 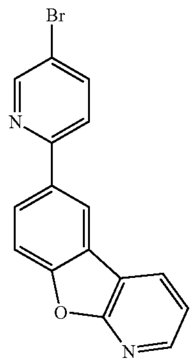<br>S77 | 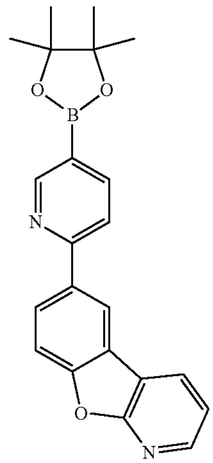 [SMILES: CC1(C)OB(c2ccc(-c3ccc4oc5ncccc5c4c3)nc2)OC1(C)C] | 74% |
| S89 | 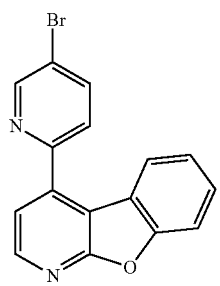<br>S78 | 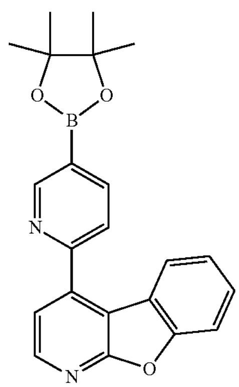 [SMILES: CC1(C)OB(c2ccc(-c3ccnc4oc5ccccc5c34)nc2)OC1(C)C] | 69% |
| S90 | 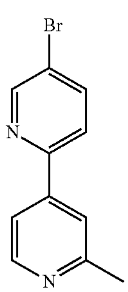<br>S79 | 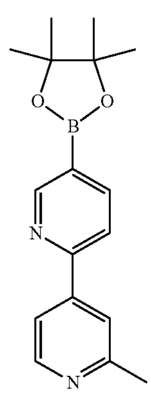 | 73% |

-continued
| Ex. | Bromide—Variant A<br>Chloride—Variant B | Product | Yield |
| --- | --- | --- | --- |
| S91 | 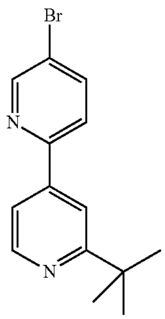<br>S80 | 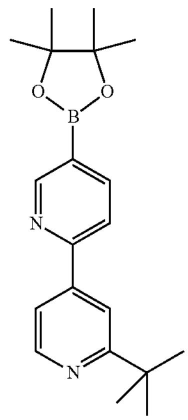 [SMILES: CC(C)(C)c1cc(-c2ccc(B3OC(C)(C)C(C)(C)O3)cn2)ccn1] | 69% |
| S92 | 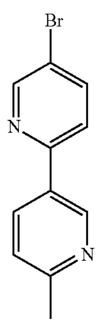<br>S81 | 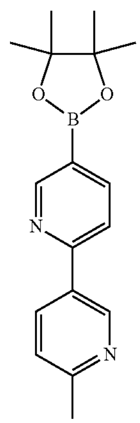 | 76% |
| S93 | 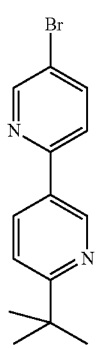<br>S82 | 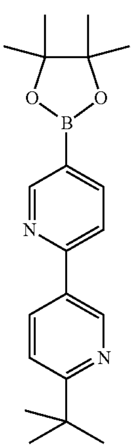 | 75% |

-continued
| Ex. | Bromide—Variant A<br>Chloride—Variant B | Product | Yield |
|---|---|---|---|
| S95 | 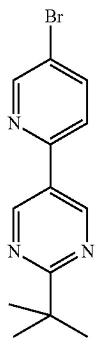<br>S94 | 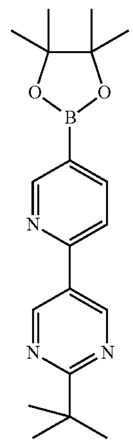 | 67% |
| S96 | 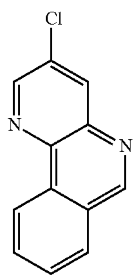<br>1421504-00-8 | 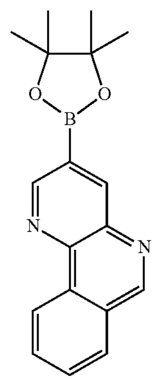 [SMILES: CC1(C)OB(c2cnc3c(c2)ncc2ccccc23)OC1(C)C] | 63% |
| S97 | 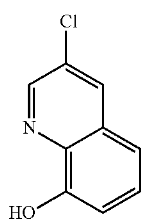<br>102878-83-1 | 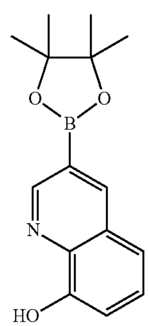 [SMILES: CC1(C)OB(c2cnc3c(O)cccc3c2)OC1(C)C] | 48% |
| S98 | 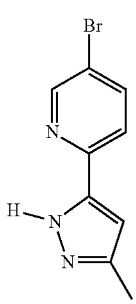<br>1239480-83-1 | 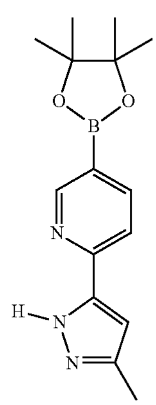 [SMILES: Cc1cc(-c2ccc(B3OC(C)(C)C(C)(C)O3)cn2)[nH]n1] | 46% |

-continued
| Ex. | Bromide—Variant A<br>Chloride—Variant B | Product | Yield |
|---|---|---|---|
| S99 | 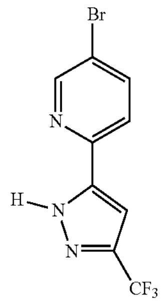<br>188918-99-2 | 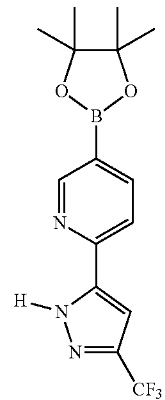 [SMILES: CC1(C)OB(c2ccc(-c3cc(C(F)(F)F)n[nH]3)nc2)OC1(C)C] | 51% |
| S100 | 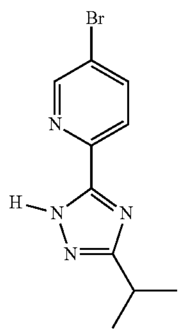<br>1342192-56-6 | 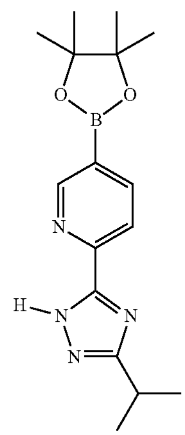 [SMILES: CC(C)c1n[nH]c(-c2ccc(B3OC(C)(C)C(C)(C)O3)cn2)n1] | 48% |
| S103 | 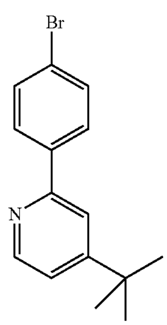<br>1246851-70-6 | 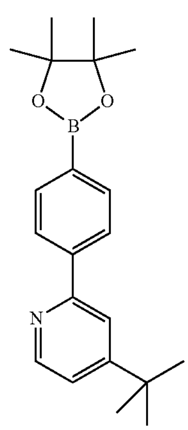 [SMILES: CC(C)(C)c1ccnc(-c2ccc(B3OC(C)(C)C(C)(C)O3)cc2)c1] | 88% |

-continued
| Ex. | Bromide—Variant A<br>Chloride—Variant B | Product | Yield |
|---|---|---|---|
| S109 | 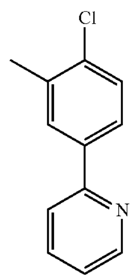<br>S108 | 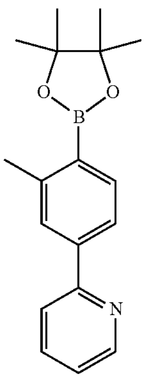 | 90% |
| S127 | 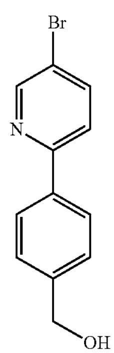<br>S125 | 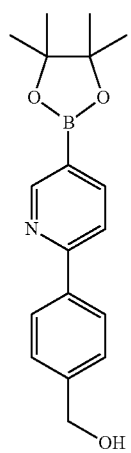<br>Hot extraction with ethyl acetate | 87% |
| S128 | 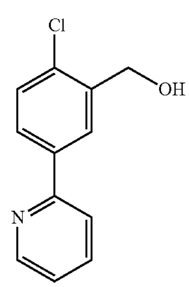<br>S126 | 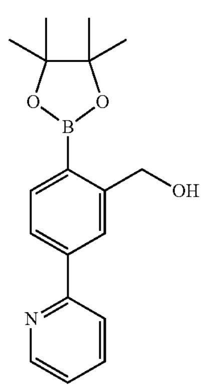<br>Hot extraction with ethyl acetate | 66% |

-continued
| Ex. | Bromide—Variant A<br>Chloride—Variant B | Product | Yield |
|---|---|---|---|
| S129 | 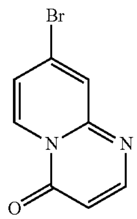<br>1198413-10-3 | 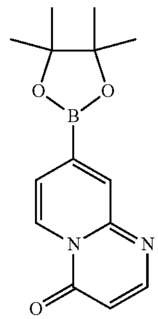 [SMILES: CC1(C)OB(c2ccn3c(=O)ccnc3c2)OC1(C)C] | 72% |
| S130 | 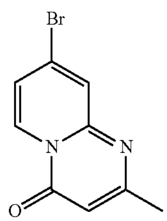<br>1781699-85-1 | 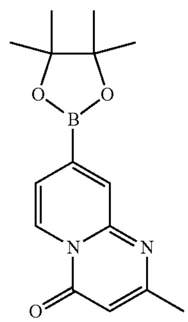 | 75% |
| S131 | 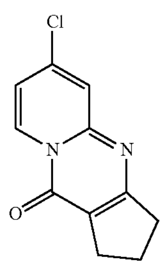<br>60781-85-3 | 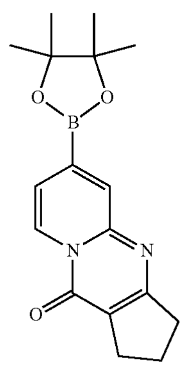 [SMILES: CC1(C)OB(c2ccn3c(=O)c4c(nc3c2)CCC4)OC1(C)C] | 78% |
| S132 | 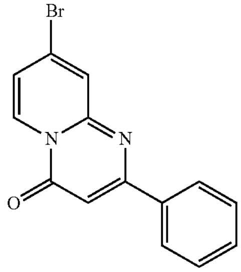<br>1338923-08-2 | 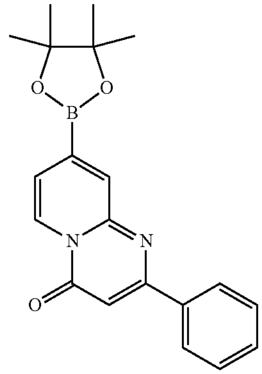 [SMILES: CC1(C)OB(c2ccn3c(=O)cc(-c4ccccc4)nc3c2)OC1(C)C] | 82% |

-continued
| Ex. | Bromide—Variant A<br>Chloride—Variant B | Product | Yield |
|---|---|---|---|
| S133 | 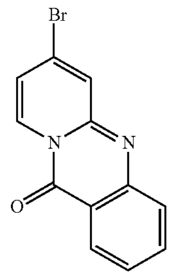<br>1446208-20-3 | 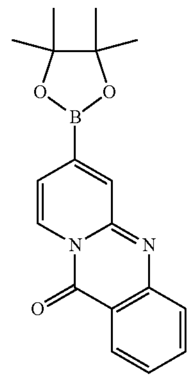 [SMILES: CC1(C)OB(c2ccn3c(=O)c4ccccc4nc3c2)OC1(C)C] | 80% |
| S134 | 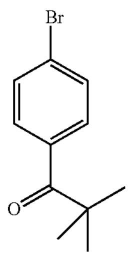<br>30314-45-5 | 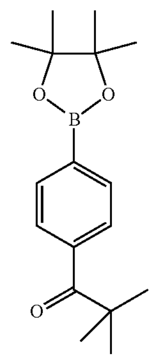 [SMILES: CC(C)(C)C(=O)c1ccc(B2OC(C)(C)C(C)(C)O2)cc1] | 75% |
| S135 | 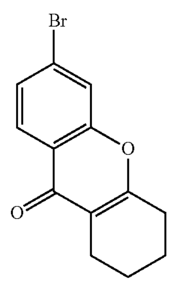<br>80268-54-8 | 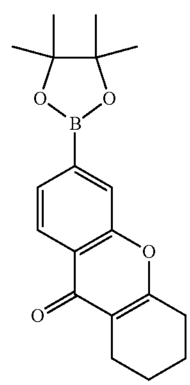 [SMILES: CC1(C)OB(c2ccc3c(=O)c4c(oc3c2)CCCC4)OC1(C)C] | 68% |
| S136 | 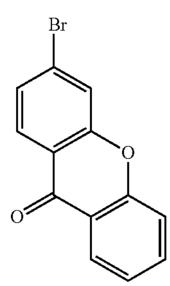<br>500286-36-2 | 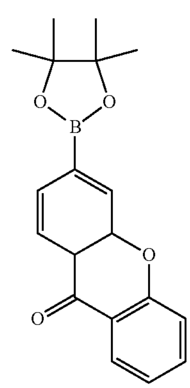 [SMILES: CC1(C)OB(C2=CC3Oc4ccccc4C(=O)C3C=C2)OC1(C)C] | 80% |

-continued
| Ex. | Bromide—Variant A<br>Chloride—Variant B | Product | Yield |
|---|---|---|---|
| S137 | 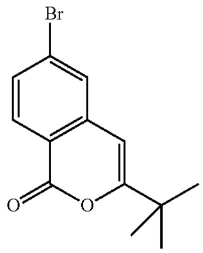<br>1257834-06-2 | 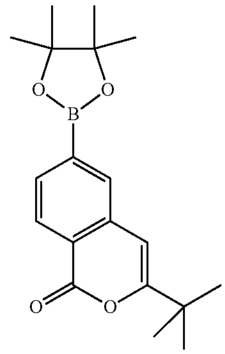 [SMILES: CC(C)(C)c1cc2cc(B3OC(C)(C)C(C)(C)O3)ccc2c(=O)o1] | 79% |
| S138 | 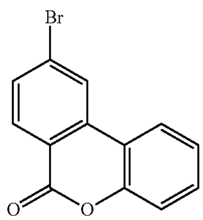<br>1469912-47-7 | 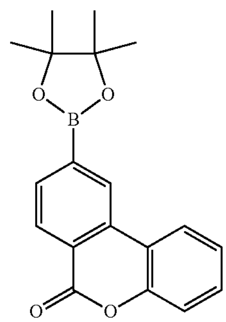 [SMILES: CC1(C)OB(c2ccc3c(=O)oc4ccccc4c3c2)OC1(C)C] | 71% |
| S139 | 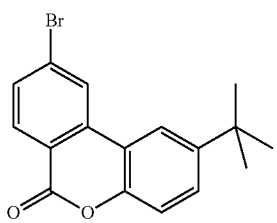<br>1469912-48-8 | 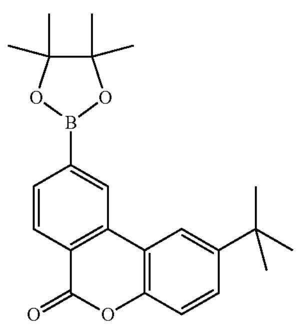 [SMILES: CC(C)(C)c1ccc2oc(=O)c3ccc(B4OC(C)(C)C(C)(C)O4)cc3c2c1] | 76% |
| S142 | 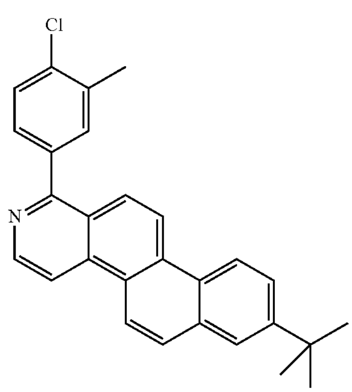<br>S140 | 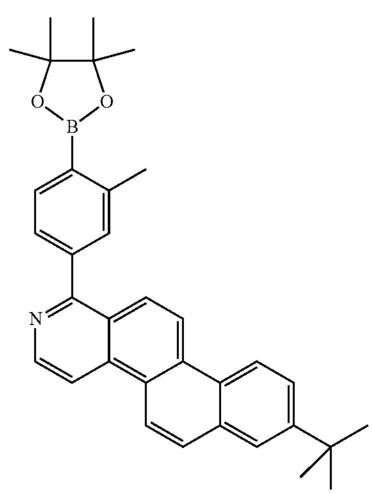 [SMILES: Cc1cc(-c2nccc3c2ccc2c4ccc(C(C)(C)C)cc4ccc32)ccc1B1OC(C)(C)C(C)(C)O1] | 81% |

-continued
| Ex. | Bromide—Variant A<br>Chloride—Variant B | Product | Yield |
|---|---|---|---|
| S143 | 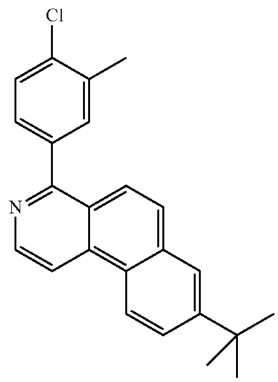<br>S141 | 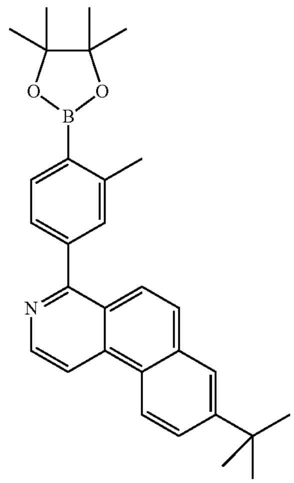 [SMILES: Cc1cc(-c2nccc3c2ccc2cc(C(C)(C)C)ccc23)ccc1B1OC(C)(C)C(C)(C)O1] | 79% |
| S152 | 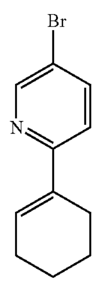<br>S144 | 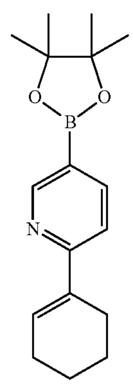 | 76% |
| S153 | 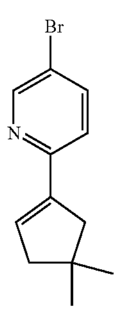<br>S145 | 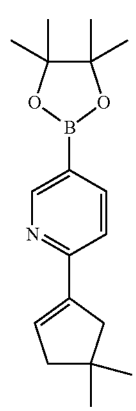 | 70% |

-continued
| Ex. | Bromide—Variant A Chloride—Variant B | Product | Yield |
|---|---|---|---|
| S154 | 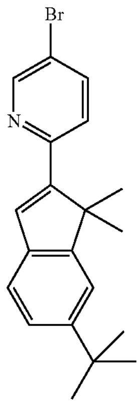 S146 | 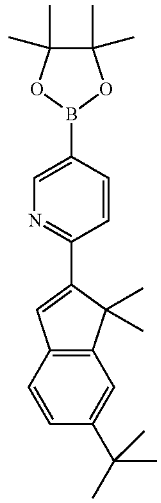 [SMILES: CC(C)(C)c1ccc2c(c1)C(C)(C)C(c1ccc(B3OC(C)(C)C(C)(C)O3)cn1)=C2] | 81% |
| S155 | 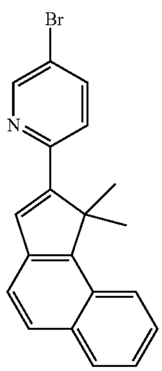 S147 | 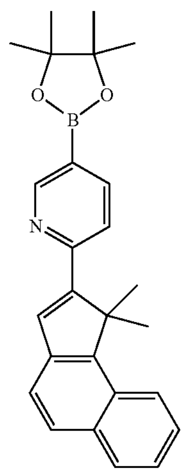 [SMILES: CC1(C)C(c2ccc(B3OC(C)(C)C(C)(C)O3)cn2)=Cc2ccc3ccccc3c21] | 84% |
| S156 | 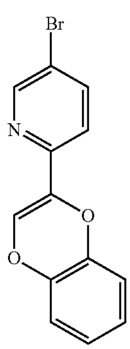 S148 | 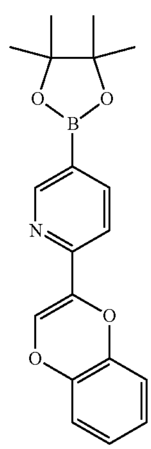 [SMILES: CC1(C)OB(c2ccc(C3=COc4ccccc4O3)nc2)OC1(C)C] | 91% |

-continued
| Ex. | Bromide—Variant A Chloride—Variant B | Product | Yield |
|---|---|---|---|
| S157 | 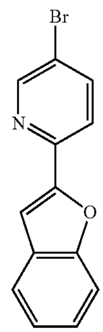 S149 | 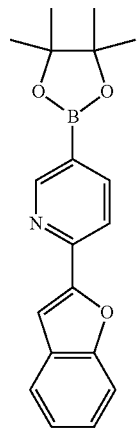 | 89% |
| S158 | 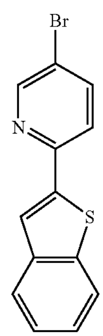 S150 | 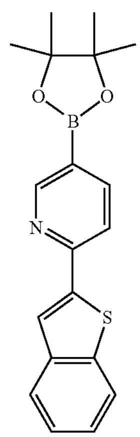 | 90% |
| S159 | 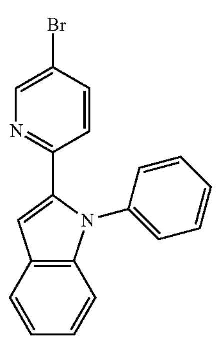 S151 | 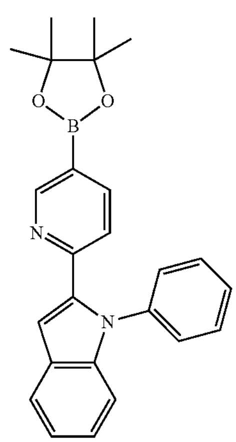 [SMILES: CC1(C)OB(c2ccc(-c3cc4ccccc4n3-c3ccccc3)nc2)OC1(C)C] | 66% |

Example S44: 1,3,5-Tris(6-bromo-1,1,3,3-tetramethylindan-5-yl)benzene

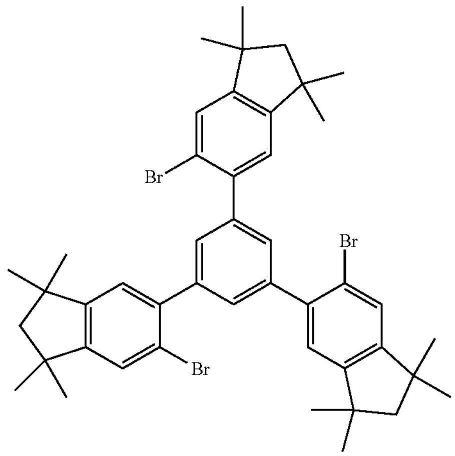

a) 1-(6-Bromo-1,1,3,3-tetramethyl-indan-5-yl)ethanone

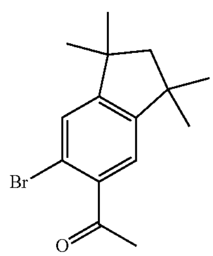 [SMILES: CC(=O)c1cc2c(cc1Br)C(C)(C)CC2(C)C]

Procedure according to I. Pravst et al., Tetrahedron Lett., 2006, 47, 4707. A mixture of 21.6 g (100 mmol) of 1-(1,1,3,3-tetramethylindan-5-yl)ethanone [17610-14-9], 39.2 g (220 mmol) of N-bromosuccinimide, 1.6 g (2.5 mmol) of $[Cp^*RhCl_2]_2$ [12354-85-7], 3.4 g (10 mmol) of silver(I) hexafluoroantimonate [26042-64-8], 20.0 g (110 mmol) of copper(II) acetate [142-71-2] and 500 ml of 1,2-dichloroethane is stirred at 120° C. for 20 h. After cooling, the solids are filtered off using a silica gel bed, the solvent is removed under reduced pressure and the residue is recrystallized three times from acetonitrile. Yield: 12.1 g (41 mmol), 41%. Purity: about 97% by $^1$H NMR.

b) 1,3,5-Tris(6-bromo-1,1,3,3-tetramethylindan-5-yl)benzene, S44

A mixture of 12.1 g (41 mmol) of 1-(6-bromo-1,1,3,3-tetramethylindan-5-yl)ethanone and 951 mg (5 mmol) of toluenesulphonic acid monohydrate [6192-52-5] (or trifluoromethanesulphonic acid, Variant B) is stirred on a water separator at 150° C. for 48 h. After cooling, the residue is taken up in 300 ml of ethyl acetate, washed three times with 100 ml each time of water and once with 100 ml of saturated sodium chloride solution, and then dried over magnesium sulphate. The crude product is chromatographed on silica gel with n-heptane:ethyl acetate (5:1). Yield: 4.3 g (5 mmol), 38%. Purity: about 97% by $^1$H NMR.

In an analogous manner, it is possible to prepare the following compounds:

| Ex. | Ketone or bromoketone Variant | Product | Yield |
|---|---|---|---|
| S45 | 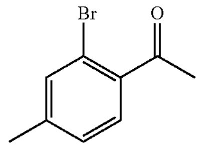 103286-27-7 B | 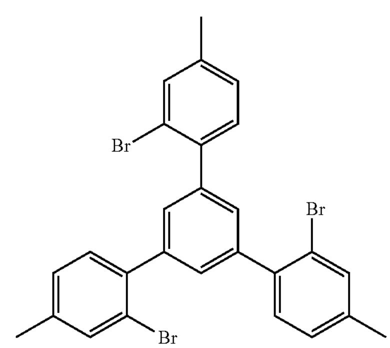 | 52% |

-continued
| Ex. | Ketone or bromoketone Variant | Product | Yield |
|---|---|---|---|
| S46 | 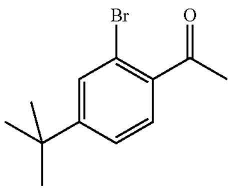 147438-85-5 | 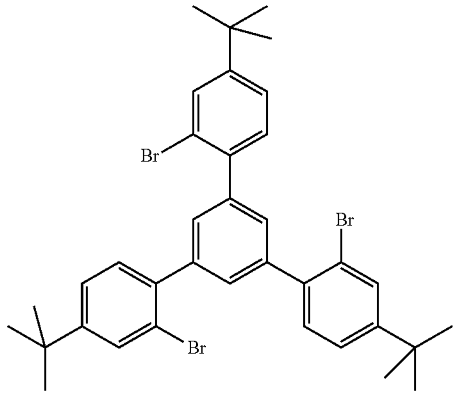 [SMILES: CC(C)(C)c1ccc(-c2cc(-c3ccc(C(C)(C)C)cc3Br)cc(-c3ccc(C(C)(C)C)cc3Br)c2)c(Br)c1] | 33% |
| S47 | 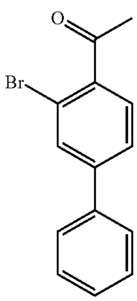 628735-63-7 B | 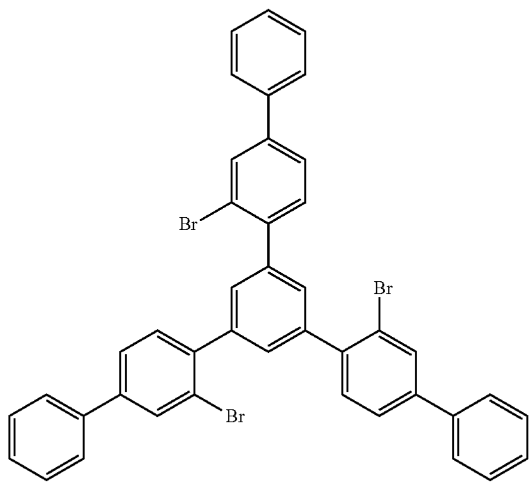 [SMILES: Brc1cc(-c2ccccc2)ccc1-c1cc(-c2ccc(-c3ccccc3)cc2Br)cc(-c2ccc(-c3ccccc3)cc2Br)c1] | 60% |
| S48 | 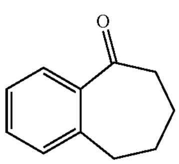 826-73-3 B | 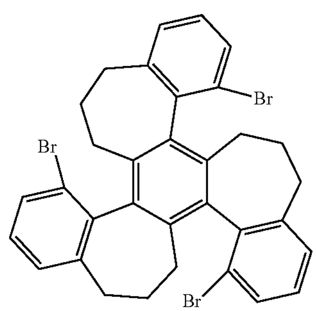 [SMILES: Brc1cccc2c1-c1c(c3c(c4c1CCCc1cccc(Br)c1-4)CCCc1cccc(Br)c1-3)CCC2] | 23% |
| S49 | 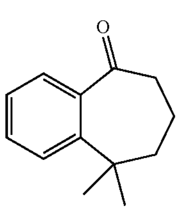 3345-09-3 B | 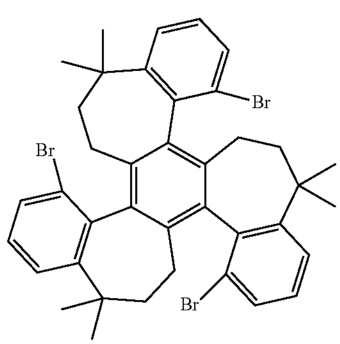 [SMILES: CC1(C)CCc2c(c3c(c4c2-c2c(Br)cccc2C(C)(C)CC4)-c2c(Br)cccc2C(C)(C)CC3)-c2c(Br)cccc21] | 20% |

The following compounds known from the literature can be used as synthons:

| Synthon |
| --- |
| 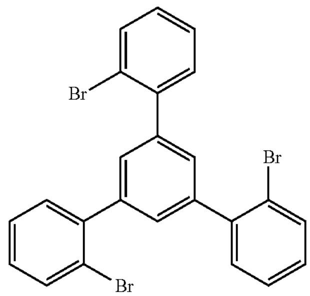 380626-56-2 S50 |
| 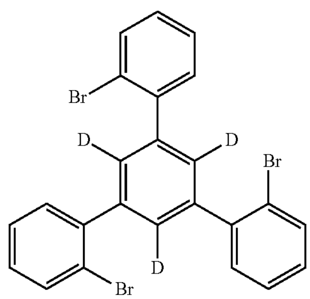 1272029-05-6 S51 |
| 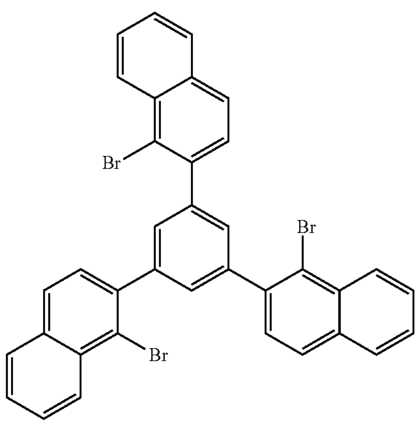 1422181-40-5 S52 |
| 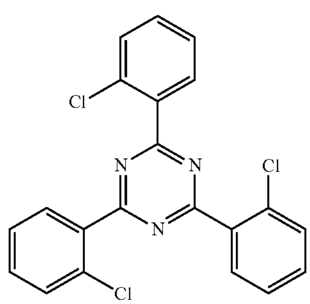 857972-74-8 S53 |

-continued

| Synthon |
| --- |
| 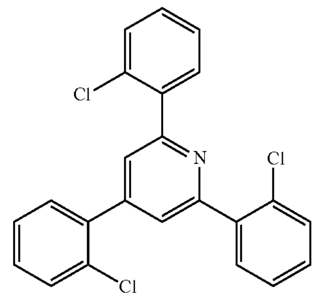 857500-72-2 S101 |

Example S102

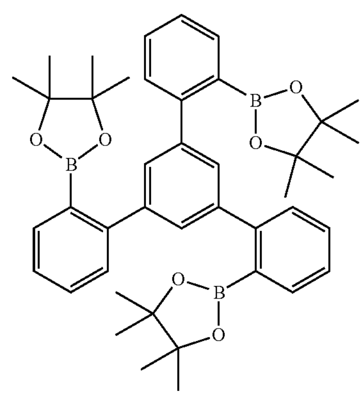

A mixture of 54.3 g (100 mmol) of 1,3,5-tris(2-bromophenyl)benzene, S50, [380626-56-2], 80.0 g (315 mmol) of bis(pinacolato)diborane [73183-34-3], 30.9 g (315 mmol) of potassium acetate, 701 mg (2.50 mmol) of tricyclohexylphosphine, 281 mg (1.25 mmol) of palladium(II) acetate, 1000 ml of 1,4-dioxane and 200 g of glass beads (diameter 3 mm) is heated under reflux for 16 h. After cooling, the suspension is filtered through a Celite bed and the solvent is removed under reduced pressure. The residue is taken up in 1000 ml of ethyl acetate, washed three times with 300 ml each time of water and once with 300 ml of saturated sodium chloride solution, and then dried over magnesium sulphate. After the solvent has been removed, the residue is recrystallized from ethyl acetate/methanol. Yield: 56.8 g (83 mmol) 83%. Purity: about 95% by $^{1}H$ NMR.

In an analogous manner, it is possible to prepare the following compound:

| Ex. | Aryl halide | Boronic ester | Yield |
|---|---|---|---|
| S160 | 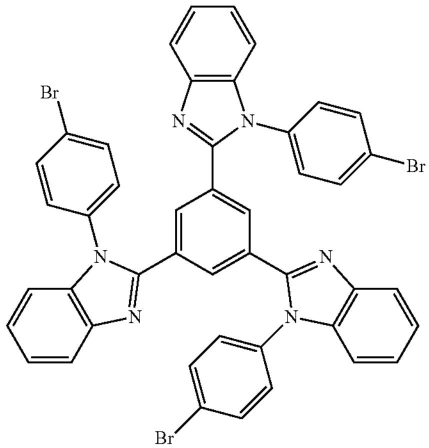 1149597-92-1 | 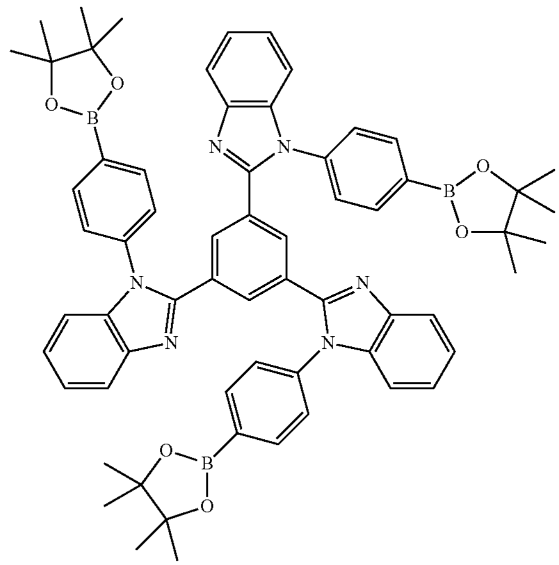 | 86% |

Example S63: 6-(4,4,5,5-Tetramethyl-[1,3,2]dioxaborolan-2-yl]-benzo[4,5]furo[3,2-b]pyridine

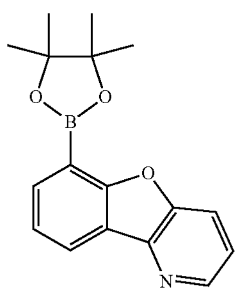 [SMILES: CC1(C)OB(c2cccc3c2oc2cccnc23)OC1(C)C]

Procedure according to Ishiyama, T. et al., Tetrahedron, 2001, 57(49), 9813.

To a well-stirred mixture of 20.4 g (100 mmol) of 6-bromobenzo[4,5]furo[3,2-b]pyridine [1609623-76-8], 27.9 g (110 mmol) of bis(pinacolato)diborane [73183-34-3], 19.6 g (200 mmol) of anhydrous potassium acetate and 200 g of glass beads (diameter 3 mm) in 500 ml of dioxane are consecutively added 1.7 g (6 mmol) of tricyclohexylphosphine [2622-14-2] and then 1.7 g (3 mmol) of $Pd(dba)_2$ [32005-36-0], and the mixture is stirred at 90° C. for 16 h. An alternative catalyst system that can be used is 534 mg (1.3 mmol) of SPhos [657408-07-6] and 225 mg (1 mmol) of palladium(II) acetate. After cooling, the solids are filtered off and washed with 200 ml of dioxane, and then the dioxane is substantially removed under reduced pressure. The residue is taken up in 500 ml of ethyl acetate, washed three times with 300 ml each time of water and once with 300 ml of saturated sodium chloride solution, and then dried over magnesium sulphate. The foam obtained after the ethyl acetate has been removed is recrystallized from acetonitrile/methanol.

Yield: 23.0 g (78 mmol), 78%. Purity: about 95% by $^1H$ NMR.

In an analogous manner, it is possible to synthesize the following compounds:

| Ex. | Aryl halide | Boronic ester | Yield |
|---|---|---|---|
| S64 | 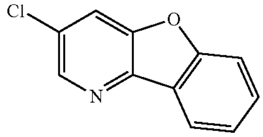 54168-14-8 | 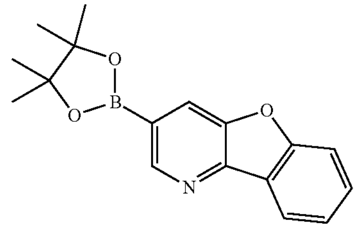 [SMILES: CC1(C)OB(c2cnc3c(c2)oc2ccccc23)OC1(C)C] | 56% |

-continued
| Ex. | Aryl halide | Boronic ester | Yield |
|---|---|---|---|
| S65 | 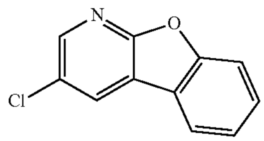 1424369-37-8 | 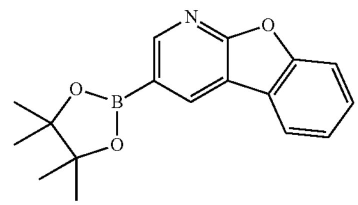 [SMILES: CC1(C)OB(c2cnc3oc4ccccc4c3c2)OC1(C)C] | 64% |
| S66 | 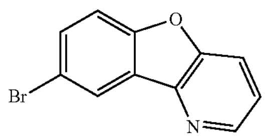 1384187-12-5 | 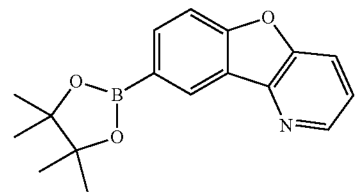 [SMILES: CC1(C)OB(c2ccc3oc4cccnc4c3c2)OC1(C)C] | 76% |
| S67 | 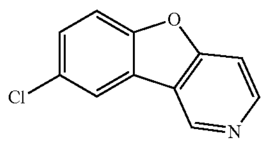 1174752-58-9 | 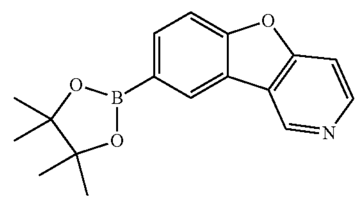 [SMILES: CC1(C)OB(c2ccc3oc4ccncc4c3c2)OC1(C)C] | 64% |
| S68 | 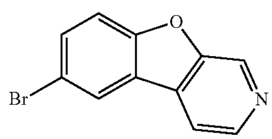 1585249-35-9 | 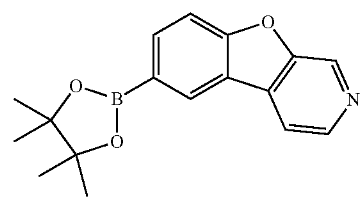 [SMILES: CC1(C)OB(c2ccc3oc4cnccc4c3c2)OC1(C)C] | 73% |
| S69 | 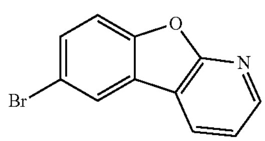 1507349-39-4 | 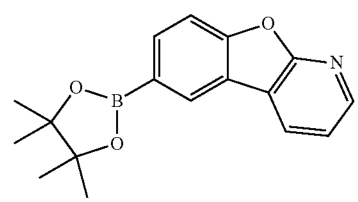 [SMILES: CC1(C)OB(c2ccc3oc4ncccc4c3c2)OC1(C)C] | 70% |
| S70 | 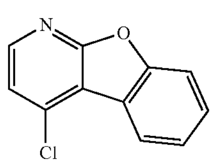 31874-94-9 | 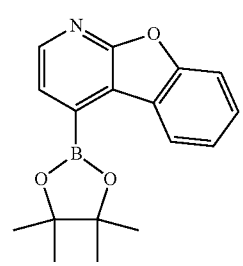 [SMILES: CC1(C)OB(c2ccnc3oc4ccccc4c23)OC1(C)C] | 48% |
| S105 | 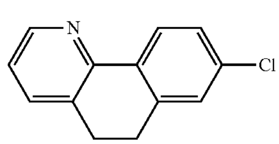 S104 | 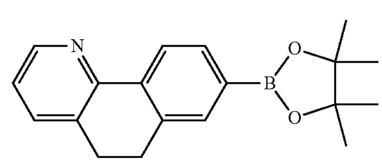 [SMILES: CC1(C)OB(c2ccc3c(c2)CCc2cccnc2-3)OC1(C)C] | 88% |

-continued
| Ex. | Aryl halide | Boronic ester | Yield |
| --- | --- | --- | --- |
| S106 | 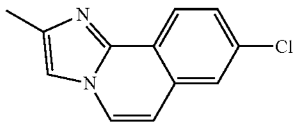 102200-03-3 | 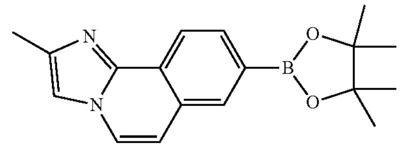 | 76% |
| S107 | 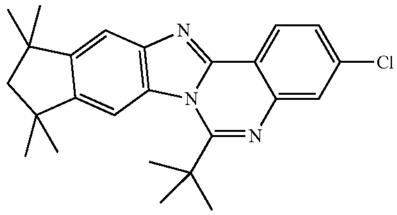 [SMILES: CC(C)(C)c1nc2cc(Cl)ccc2c2nc3cc4c(cc3n12)C(C)(C)CC4(C)C] | 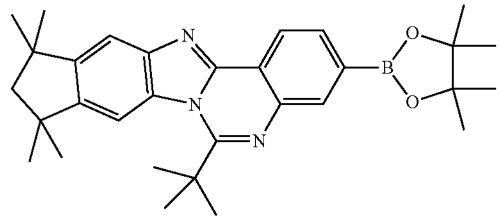 [SMILES: CC(C)(C)c1nc2cc(B3OC(C)(C)C(C)(C)O3)ccc2c2nc3cc4c(cc3n12)C(C)(C)CC4(C)C] | 80% |
| S118 | 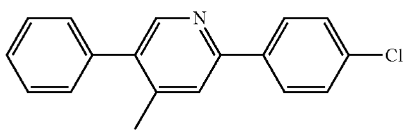 S111 | 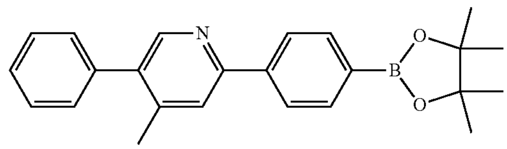 [SMILES: Cc1cc(-c2ccc(B3OC(C)(C)C(C)(C)O3)cc2)ncc1-c1ccccc1] | 81% |
| S119 | 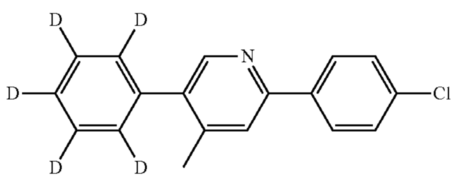 S112 | 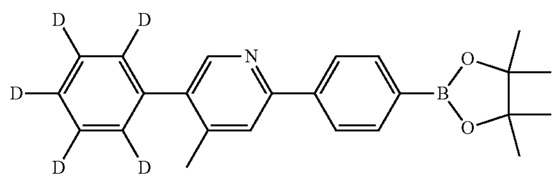 [SMILES: [2H]c1c([2H])c([2H])c(-c2cnc(-c3ccc(B4OC(C)(C)C(C)(C)O4)cc3)cc2C)c([2H])c1[2H]] | 78% |
| S120 | 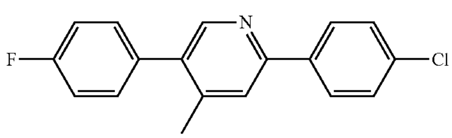 S113 | 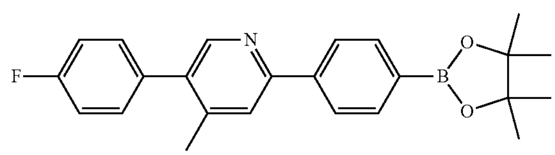 [SMILES: Cc1cc(-c2ccc(B3OC(C)(C)C(C)(C)O3)cc2)ncc1-c1ccc(F)cc1] | 75% |
| S121 | 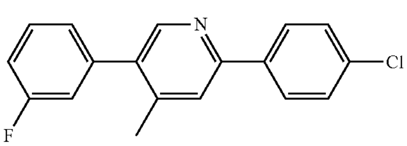 S114 | 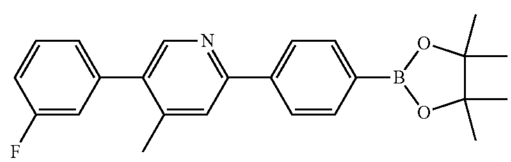 [SMILES: Cc1cc(-c2ccc(B3OC(C)(C)C(C)(C)O3)cc2)ncc1-c1cccc(F)c1] | 77% |
| S122 | 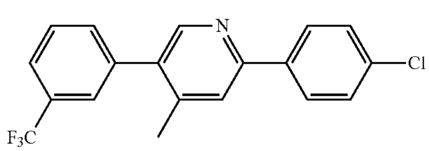 S115 | 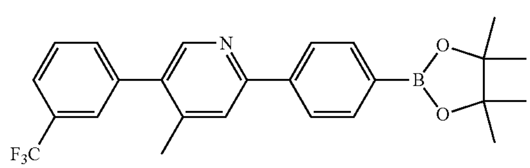 [SMILES: Cc1cc(-c2ccc(B3OC(C)(C)C(C)(C)O3)cc2)ncc1-c1cccc(C(F)(F)F)c1] | 70% |
| S123 | 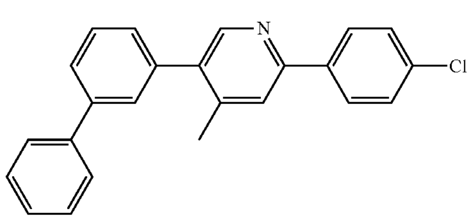 S116 | 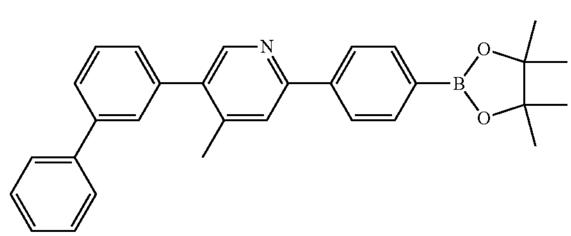 [SMILES: Cc1cc(-c2ccc(B3OC(C)(C)C(C)(C)O3)cc2)ncc1-c1cccc(-c2ccccc2)c1] | 80% |

-continued

| Ex. | Aryl halide | Boronic ester | Yield |
| --- | --- | --- | --- |
| S124 | 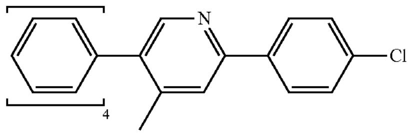<br>S117<br>250 ml of dioxane / 250 ml of oxylene | 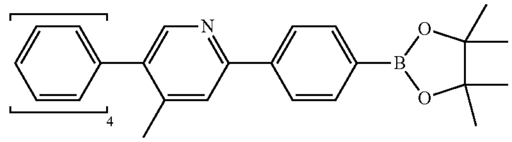 | 87% |

Example S104

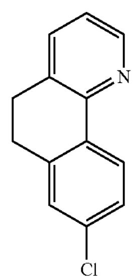 [SMILES: Clc1ccc2c(c1)CCc1cccnc1-2]

A mixture of 18.1 g (100 mmol) of 6-chlorotetralone [26673-31-4], 16.5 g (300 mmol) of propargylamine [2450-71-7], 796 mg [2 mmol] of sodium tetrachloroaurate(III) dihydrate and 200 ml of ethanol is stirred in an autoclave at 120° C. for 24 h. After cooling, the ethanol is removed under reduced pressure, the residue is taken up in 200 ml of ethyl acetate, the solution is washed three times with 200 ml of water and once with 100 ml of saturated sodium chloride solution and dried over magnesium sulphate, and then the latter is filtered off using a pre-slurried silica gel bed. After the ethyl acetate has been removed under reduced pressure, the residue is chromatographed on silica gel with n-heptane/ethyl acetate (1:2 v/v). Yield: 9.7 g (45 mmol), 45%. Purity: about 98% by $^1$H NMR.

Example S110

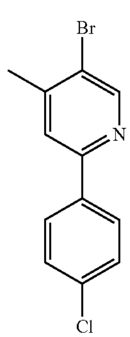

A mixture of 25.1 g (100 mmol) of 2,5-dibromopyridine [3430-26-0], 15.6 g (100 mmol) of 4-chlorophenylboronic acid [1679-18-1], 27.6 g (200 mmol) of potassium carbonate, 1.57 g (6 mmol) of triphenylphosphine [603-35-0], 676 mg (3 mmol) of palladium(II) acetate [3375-31-3], 200 g of glass beads (diameter 3 mm), 200 ml of acetonitrile and 100 ml of ethanol is heated under reflux for 48 h. After cooling, the solvents are removed under reduced pressure, 500 ml of toluene are added, the mixture is washed twice with 300 ml each time of water and once with 200 ml of saturated sodium chloride solution, dried over magnesium sulphate and filtered through a pre-slurried silica gel bed, which is washed with 300 ml of toluene. After the toluene has been removed under reduced pressure, it is recrystallized once from methanol/ethanol (1:1 v/v) and once from n-heptane. Yield: 17.3 g (61 mmol), 61%. Purity: about 95% by $^1$H NMR.

Example S111

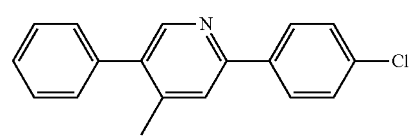

A mixture of 28.3 g (100 mmol) of S110, 12.8 g (105 mmol) of phenylboronic acid, 31.8 g (300 mmol) of sodium carbonate, 787 mg (3 mmol) of triphenylphosphine, 225 mg (1 mmol) of palladium(II) acetate, 300 ml of toluene, 150 ml of ethanol and 300 ml of water is heated under reflux for 48 h. After cooling, the mixture is extended with 300 ml of toluene, and the organic phase is removed, washed once with 300 ml of water and once with 200 ml of saturated sodium chloride solution and dried over magnesium sulphate. After the solvent has been removed, the residue is chromatographed on silica gel (toluene/ethyl acetate, 9:1 v/v). Yield: 17.1 g (61 mmol), 61%. Purity: about 97% by $^1$H NMR.

In an analogous manner, it is possible to synthesize the following compounds:

| Ex. | Boronic ester | Product | Yield |
|---|---|---|---|
| S112 | 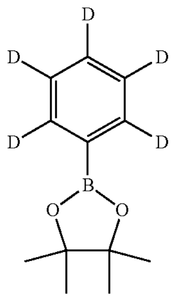 245043-33-8 | 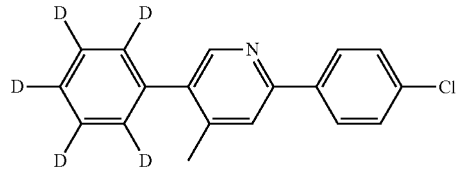 [SMILES: [2H]c1c([2H])c([2H])c(-c2cnc(-c3ccc(Cl)cc3)cc2C)c([2H])c1[2H]] | 56% |
| S113 | 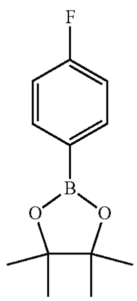 214360-58-4 | 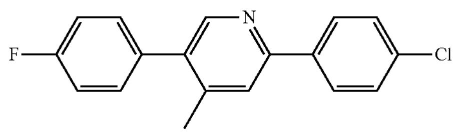 [SMILES: Cc1cc(-c2ccc(Cl)cc2)ncc1-c1ccc(F)cc1] | 61% |
| S114 | 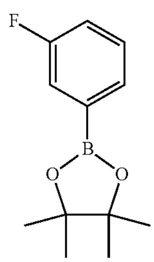 936618-92-7 | 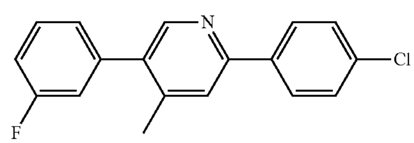 [SMILES: Cc1cc(-c2ccc(Cl)cc2)ncc1-c1cccc(F)c1] | 51% |
| S115 | 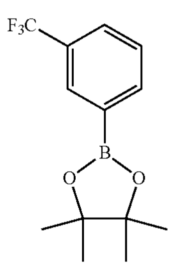 325142-82-3 | 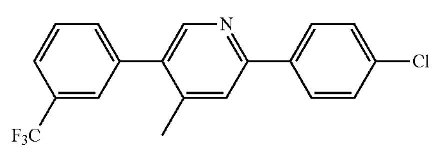 [SMILES: Cc1cc(-c2ccc(Cl)cc2)ncc1-c1cccc(C(F)(F)F)c1] | 55% |
| S116 | 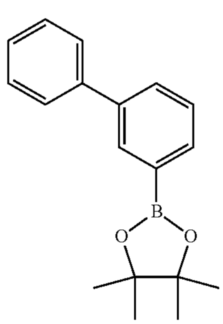 912844-88-3 | 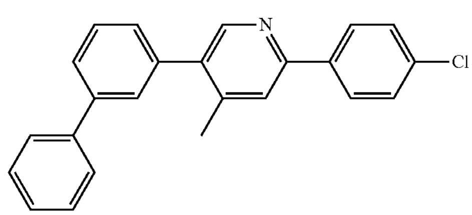 [SMILES: Cc1cc(-c2ccc(Cl)cc2)ncc1-c1cccc(-c2ccccc2)c1] | 61% |

-continued

| Ex. | Boronic ester | Product | Yield |
|---|---|---|---|
| S117 | 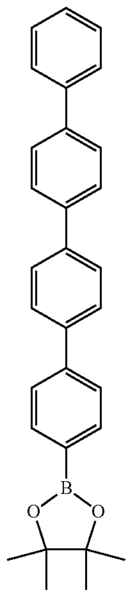 1802233-15-3 | 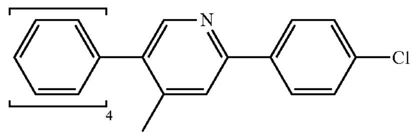 | 76% |

Example S200

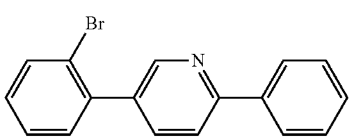 [SMILES: Brc1ccccc1-c1ccc(-c2ccccc2)nc1]

A mixture of 28.1 g (100 mmol) of 2-phenyl-5-[4,4,5,5-tetramethyl-1,3,2-dioxaborolan-2-yl)pyridine [879291-27-7], 28.2 g (100 mmol) of 1-bromo-2-iodobenzene [583-55-1], 31.8 g (300 mmol) of sodium carbonate, 787 mg (3 mmol) of triphenylphosphine, 225 mg (1 mmol) of palladium(II) acetate, 300 ml of toluene, 150 ml of ethanol and 300 ml of water is heated under reflux for 24 h. After cooling, the mixture is extended with 500 ml of toluene, and the organic phase is removed, washed once with 500 ml of water and once with 500 ml of saturated sodium chloride solution and dried over magnesium sulphate. After the solvent has been removed, the residue is recrystallized from ethyl acetate/n-heptane or chromatographed on silica gel (toluene/ethyl acetate, 9:1 v/v).

Yield: 22.7 g (73 mmol), 73%. Purity: about 97% by $^{1}$H NMR.

In an analogous manner, it is possible to synthesize the following compounds:

| Ex. | Boronic ester | Product | Yield |
|---|---|---|---|
| S201 | 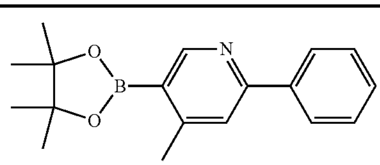 S34 | 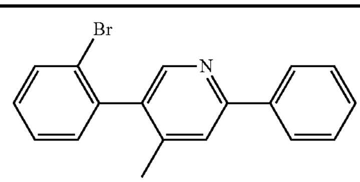 | 56% |
| S202 | 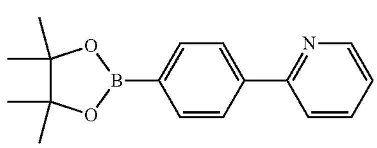 908350-80-1 | 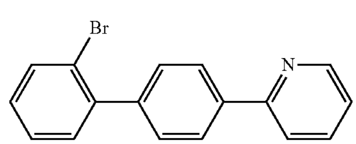 [SMILES: Brc1ccccc1-c1ccc(-c2ccccn2)cc1] | 72% |

-continued
| Ex. | Boronic ester | Product | Yield |
|---|---|---|---|
| S203 | 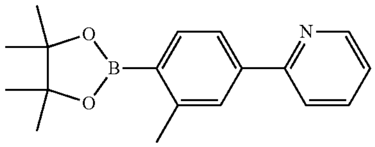 S109 | 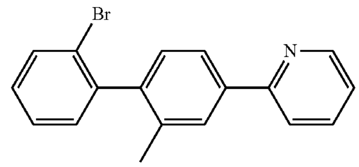 [SMILES: Cc1cc(-c2ccccn2)ccc1-c1ccccc1Br] | 75% |
| S204 | 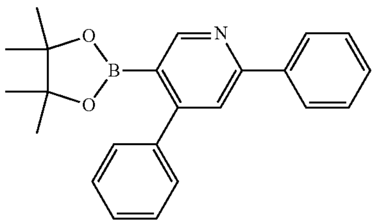 S36 | 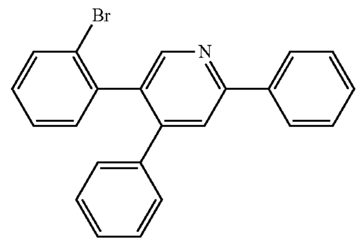 [SMILES: Brc1ccccc1-c1cnc(-c2ccccc2)cc1-c1ccccc1] | 71% |
| S205 | 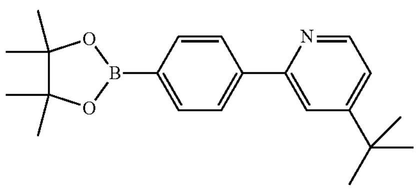 S103 | 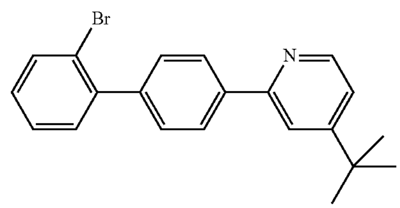 [SMILES: CC(C)(C)c1ccnc(-c2ccc(-c3ccccc3Br)cc2)c1] | 70% |
| S206 | 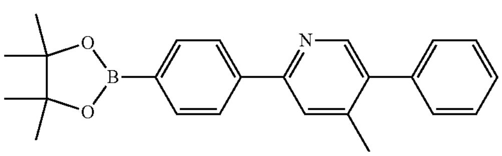 S118 | 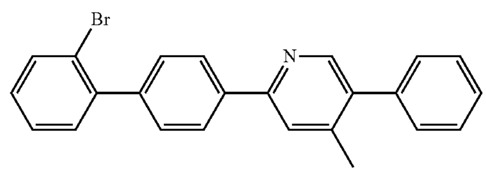 [SMILES: Cc1cc(-c2ccc(-c3ccccc3Br)cc2)ncc1-c1ccccc1] | 69% |
| S207 | 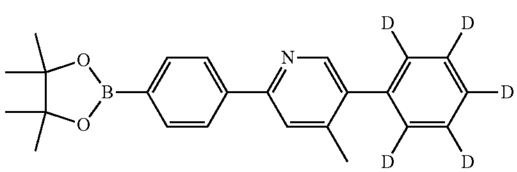 S119 | 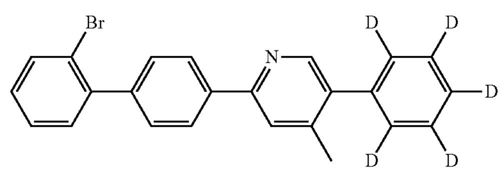 [SMILES: [2H]c1c([2H])c([2H])c(-c2cnc(-c3ccc(-c4ccccc4Br)cc3)cc2C)c([2H])c1[2H]] | 67% |
| S208 | 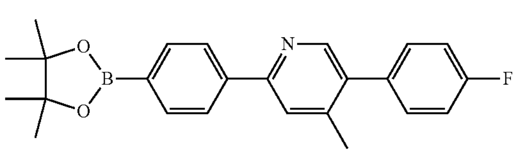 S120 | 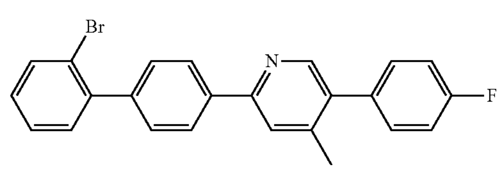 [SMILES: Cc1cc(-c2ccc(-c3ccccc3Br)cc2)ncc1-c1ccc(F)cc1] | 63% |
| S209 | 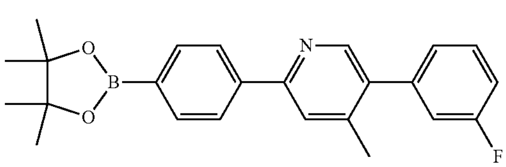 S121 | 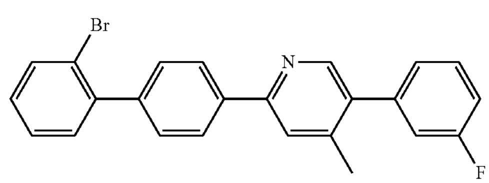 [SMILES: Cc1cc(-c2ccc(-c3ccccc3Br)cc2)ncc1-c1cccc(F)c1] | 59% |

-continued
| Ex. | Boronic ester | Product | Yield |
| --- | --- | --- | --- |
| S210 | 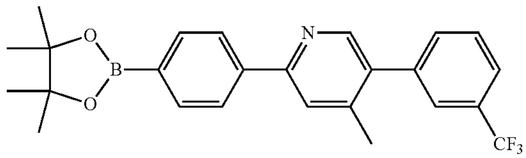 S122 | 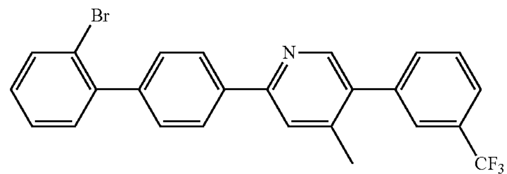 [SMILES: Cc1cc(-c2ccc(-c3ccccc3Br)cc2)ncc1-c1cccc(C(F)(F)F)c1] | 48% |
| S211 | 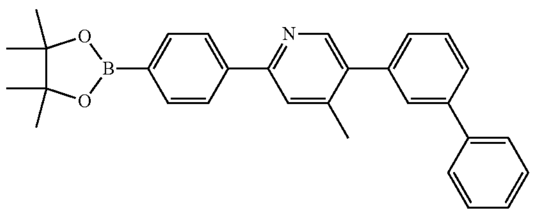 S123 | 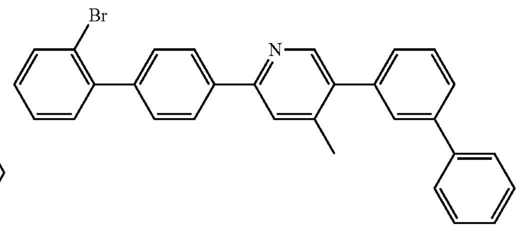 | 68% |
| S212 | 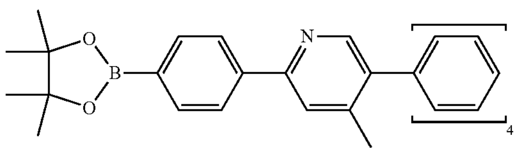 S124 | 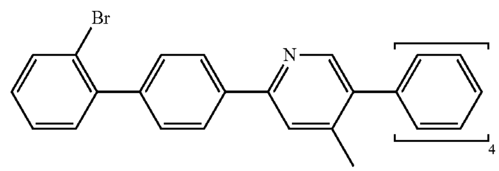 | 79% |
| S213 | 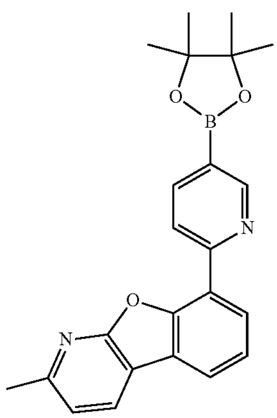 S60 | 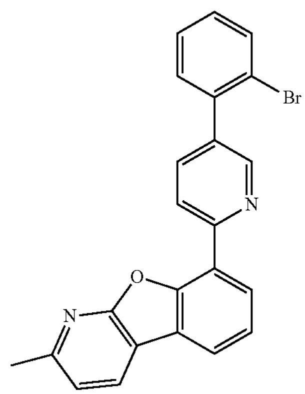 [SMILES: Cc1ccc2c(n1)oc1c(-c3ccc(-c4ccccc4Br)cn3)cccc12] | 70% |
| S214 | 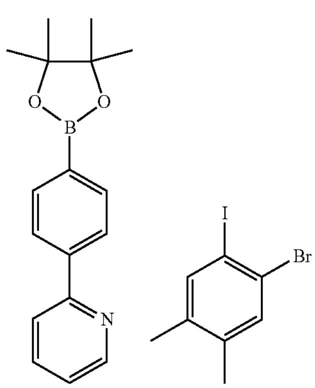 908350-80-1 / 96843-22-0 | 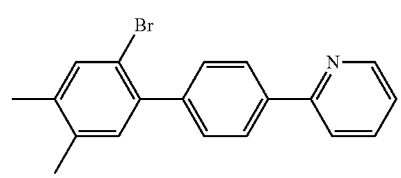 [SMILES: Cc1cc(Br)c(-c2ccc(-c3ccccn3)cc2)cc1C] | 73% |

-continued
| Ex. | Boronic ester | Product | Yield |
|---|---|---|---|
| S215 | 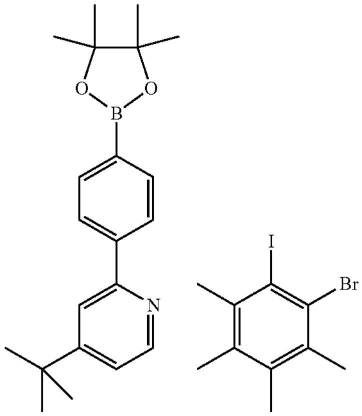 S103 / 41571-55-5 | 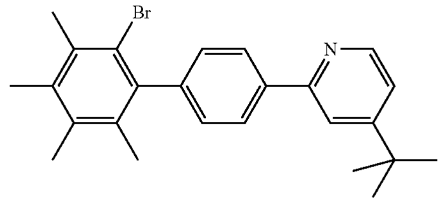 [SMILES: Cc1c(C)c(C)c(-c2ccc(-c3cc(C(C)(C)C)ccn3)cc2)c(Br)c1C] | 68% |
| S216 | 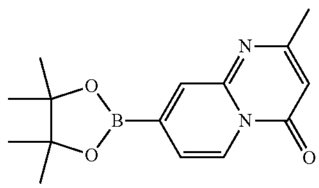 S130 | 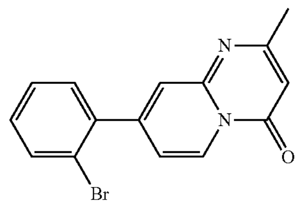 [SMILES: Cc1cc(=O)n2ccc(-c3ccccc3Br)cc2n1] | 65% |
| S217 | 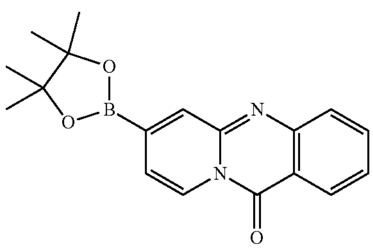 S133 | 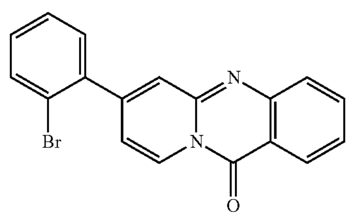 [SMILES: O=c1c2ccccc2nc2cc(-c3ccccc3Br)ccn12] | 72% |
| S218 | 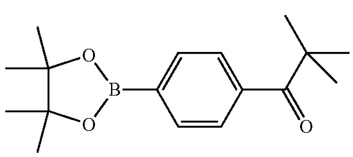 S134 | 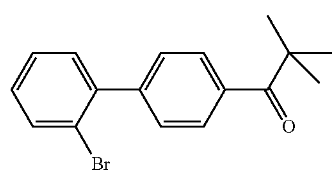 [SMILES: CC(C)(C)C(=O)c1ccc(-c2ccccc2Br)cc1] | 70% |
| S219 | 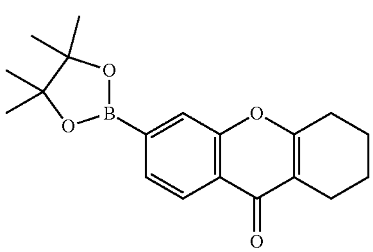 S135 | 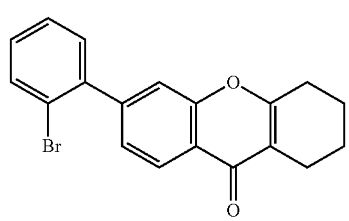 [SMILES: O=c1c2c(oc3cc(-c4ccccc4Br)ccc13)CCCC2] | 55% |

-continued
| Ex. | Boronic ester | Product | Yield |
| --- | --- | --- | --- |
| S220 | 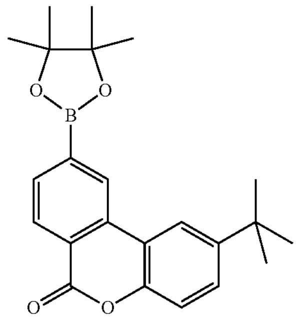 S139 | 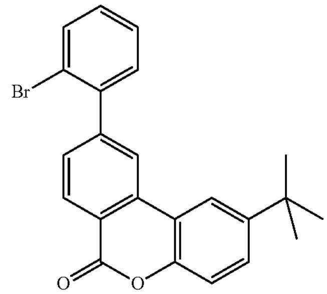 [SMILES: CC(C)(C)c1ccc2oc(=O)c3ccc(-c4ccccc4Br)cc3c2c1] | 70% |
| S221 | 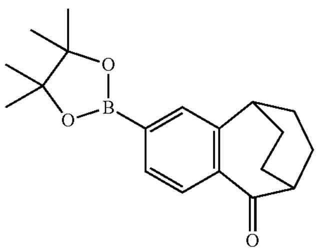 S628 | 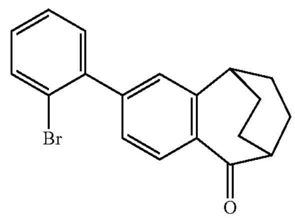 [SMILES: O=C1c2ccc(-c3ccccc3Br)cc2C2CCC1CC2] | 62% |
| S222 | 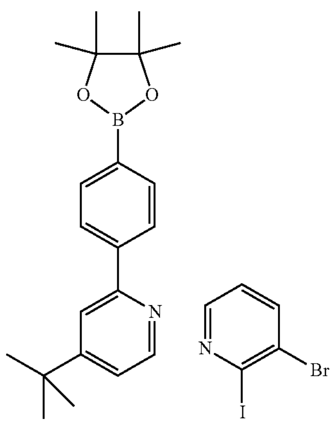 S103 / 408502-43-2 | 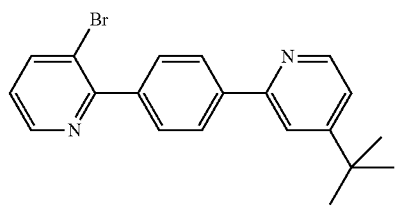 [SMILES: CC(C)(C)c1ccnc(-c2ccc(-c3ncccc3Br)cc2)c1] | 48% |
| S223 | 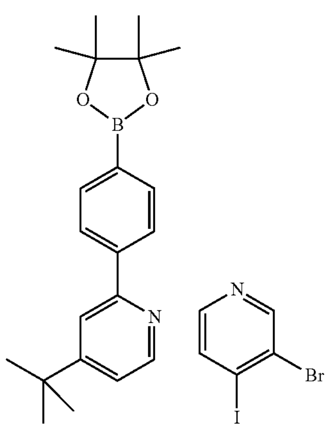 S103 / 89167-19-1 | 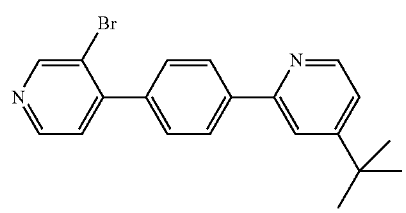 [SMILES: CC(C)(C)c1ccnc(-c2ccc(-c3ccncc3Br)cc2)c1] | 55% |

-continued
| Ex. | Boronic ester | Product | Yield |
| --- | --- | --- | --- |
| S224 | 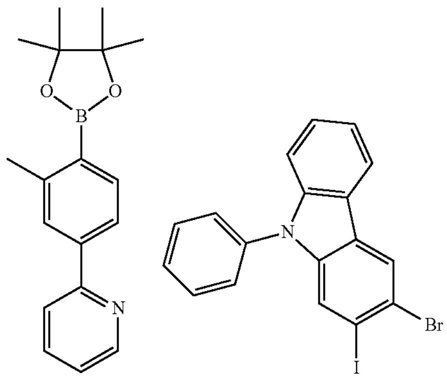 S109 / 1549979-37-4 | 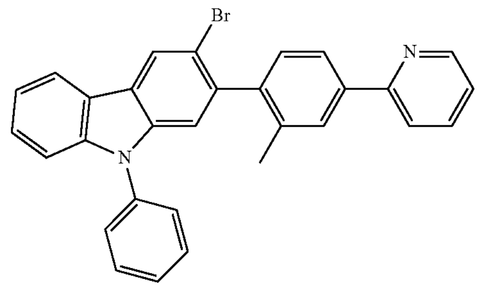 [SMILES: Cc1cc(-c2ccccn2)ccc1-c1cc2c(cc1Br)c1ccccc1n2-c1ccccc1] | 60% |
| S225 | 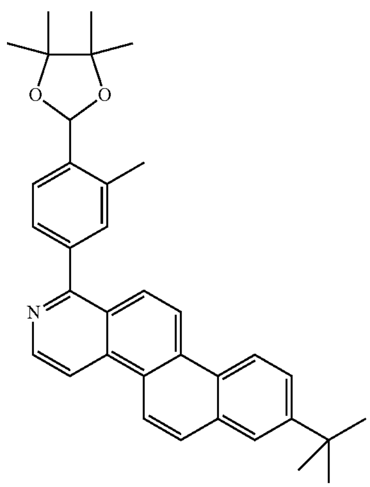 S142 | 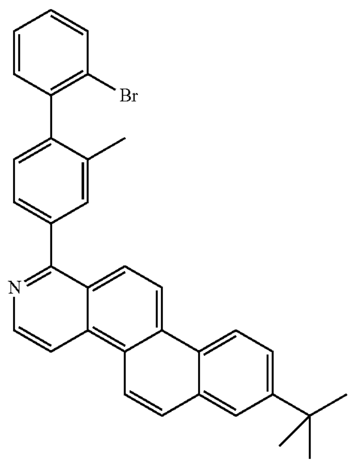 [SMILES: Cc1cc(-c2nccc3c2ccc2c4ccc(C(C)(C)C)cc4ccc32)ccc1-c1ccccc1Br] | 64% |
| S226 | 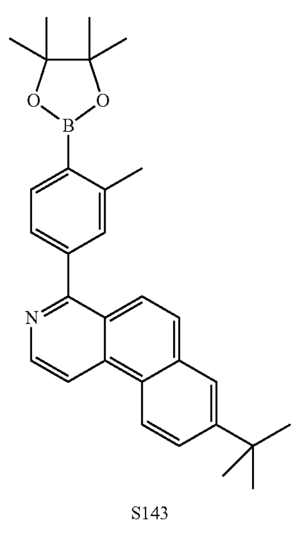 [SMILES: Cc1cc(-c2nccc3c2ccc2cc(C(C)(C)C)ccc23)ccc1B1OC(C)(C)C(C)(C)O1 ; "S143"] S143 | 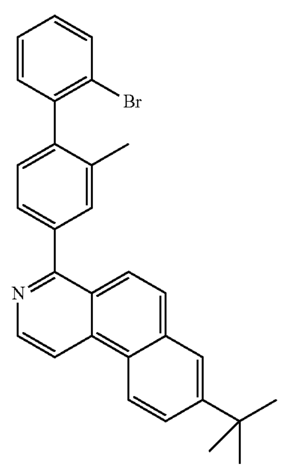 [SMILES: Cc1cc(-c2nccc3c2ccc2cc(C(C)(C)C)ccc23)ccc1-c1ccccc1Br] | 58% |

Example S300

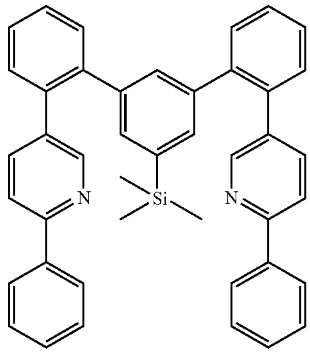 [SMILES: C[Si](C)(C)c1cc(-c2ccccc2-c2ccc(-c3ccccc3)nc2)cc(-c2ccccc2-c2ccc(-c3ccccc3)nc2)c1]

A mixture of 40.2 g (100 mmol) of 2,2'-[5-(trimethylsilyl)-1,3-phenylene]bis[4,4,5,5-tetramethyl-1,3,2-dioxaborolane [383175-93-7], 65.2 g (210 mmol) of S200, 42.4 g (400 mmol) of sodium carbonate, 1.57 g (6 mmol) of triphenylphosphine, 500 mg (2 mmol) of palladium(II) acetate, 500 ml of toluene, 200 ml of ethanol and 500 ml of water is heated under reflux for 48 h. After cooling, the mixture is extended with 500 ml of toluene, and the organic phase is removed, washed once with 500 ml of water and once with 500 ml of saturated sodium chloride solution and dried over magnesium sulphate. After the solvent has been removed, the residue is chromatographed on silica gel (n-heptane/ethyl acetate, 2:1 v/v). Yield: 41.4 g (68 mmol), 68%. Purity: about 95% by $^{1}H$ NMR.

In an analogous manner, it is possible to synthesize the following compounds:

| Ex. | Bromide | Product | Yield |
|---|---|---|---|
| S301 | 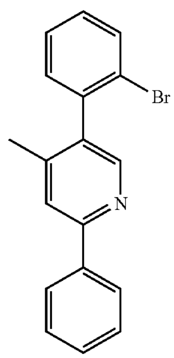 S201 | 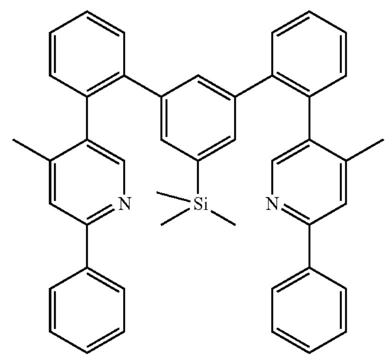 | 70% |
| S302 | 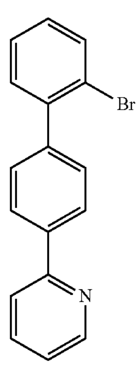 S202 | 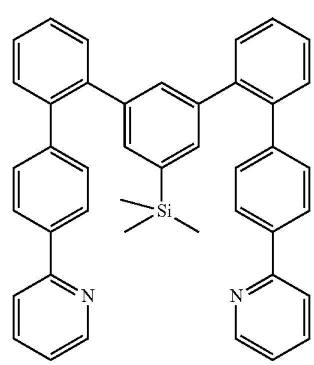 [SMILES: C[Si](C)(C)c1cc(-c2ccccc2-c2ccc(-c3ccccn3)cc2)cc(-c2ccccc2-c2ccc(-c3ccccn3)cc2)c1] | 83% |

-continued
| Ex. | Bromide | Product | Yield |
|---|---|---|---|
| S303 | 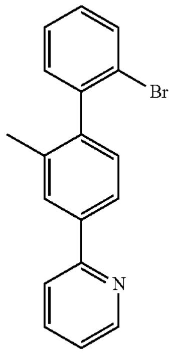 S203 | 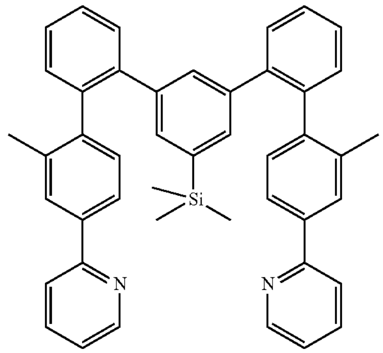 | 72% |
| S304 | 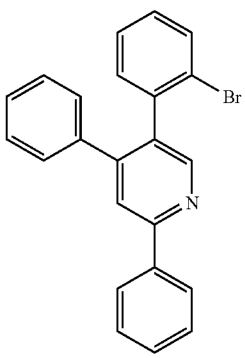 S204 | 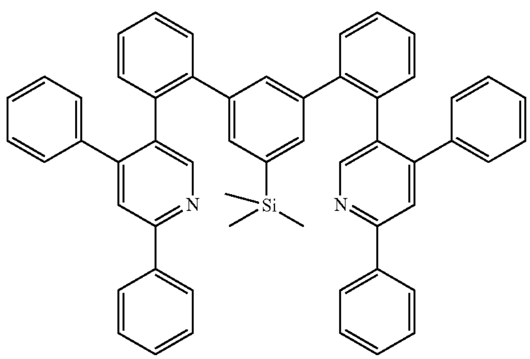 [SMILES: C[Si](C)(C)c1cc(-c2ccccc2-c2cnc(-c3ccccc3)cc2-c2ccccc2)cc(-c2ccccc2-c2cnc(-c3ccccc3)cc2-c2ccccc2)c1] | 68% |
| S305 | 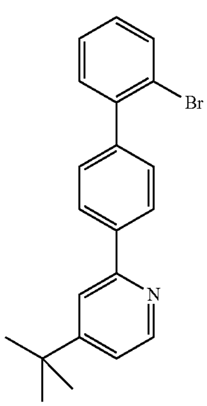 S205 | 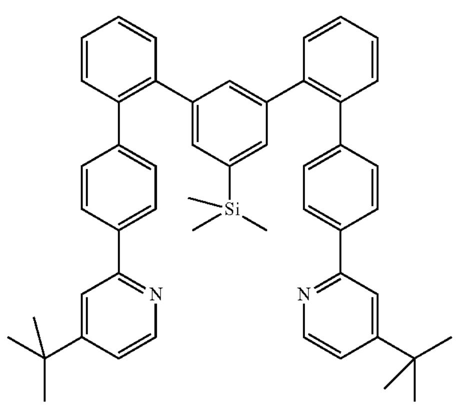 | 79% |

-continued

| Ex. | Bromide | Product | Yield |
|---|---|---|---|
| S306 | 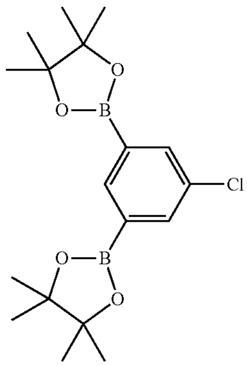 1417036-49-7 | 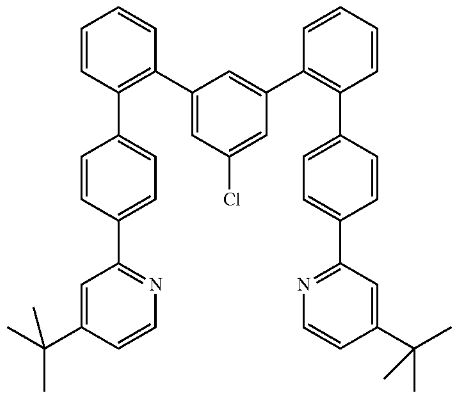 [SMILES: CC(C)(C)c1ccnc(-c2ccc(-c3ccccc3-c3cc(Cl)cc(-c4ccccc4-c4ccc(-c5cc(C(C)(C)C)ccn5)cc4)c3)cc2)c1] | 80% |

Example S400

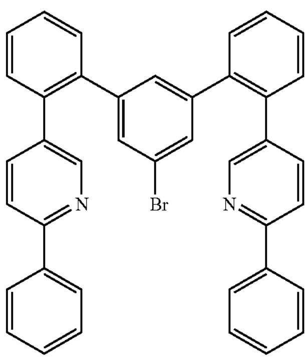 [SMILES: Brc1cc(-c2ccccc2-c2ccc(-c3ccccc3)nc2)cc(-c2ccccc2-c2ccc(-c3ccccc3)nc2)c1]

To a solution, cooled to 0° C., of 60.9 g (100 mmol) of S300 in 500 ml of dichloromethane is added dropwise, in the dark, a mixture of 8.2 ml (160 mmol) of bromine and 100 ml of dichloromethane. After the addition has ended, the mixture is allowed to warm up to room temperature and stirred for a further 16 h. Then 100 ml of water, 300 ml of sodium hydrogencarbonate solution and then 150 ml of aqueous 5% NaOH solution are added. The organic phase is removed, washed three times with 200 ml of water and once with 200 ml of saturated sodium chloride solution, and then dried over magnesium sulphate. After the solvent has been removed, the oily residue is recrystallized from ethyl acetate (about 1.5 ml/g). Yield: about 20 g of crude product 1. The mother liquor is chromatographed (CombiFlash Torrent from A. Semrau). Yield: about 20 g of crude product 2. The combined crude products together are recrystallized again from ethyl acetate.

Yield: 33.8 g (55 mmol), 55%. Purity: about 97% by $^{1}$H NMR.

In an analogous manner, it is possible to synthesize the following compounds:

| Ex. | Reactant | Product | Yield |
|---|---|---|---|
| S401 | 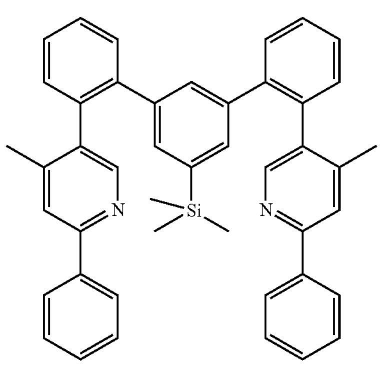 S301 | 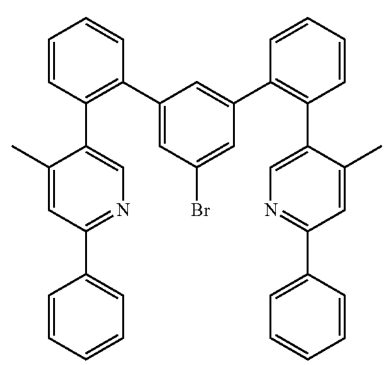 | 48% |

-continued
| Ex. | Reactant | Product | Yield |
| --- | --- | --- | --- |
| S402 | 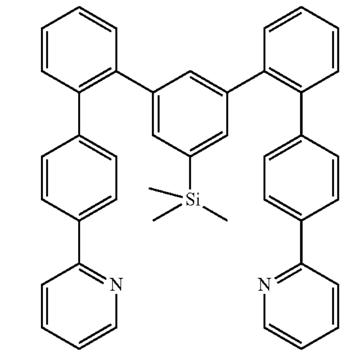 S302 | 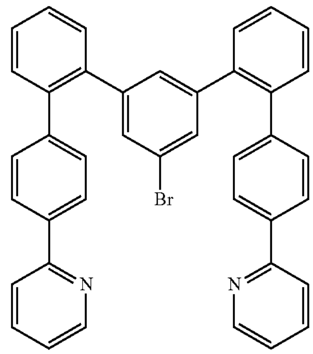 [SMILES: Brc1cc(-c2ccccc2-c2ccc(-c3ccccn3)cc2)cc(-c2ccccc2-c2ccc(-c3ccccn3)cc2)c1] | 50% |
| S403 | 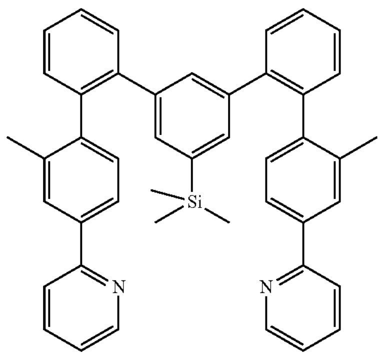 S303 | 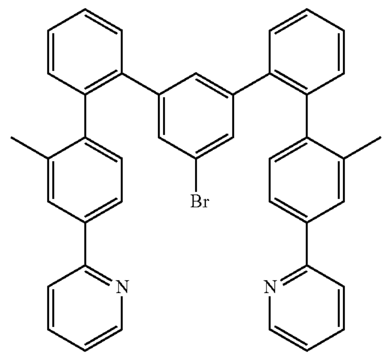 | 54% |
| S404 | 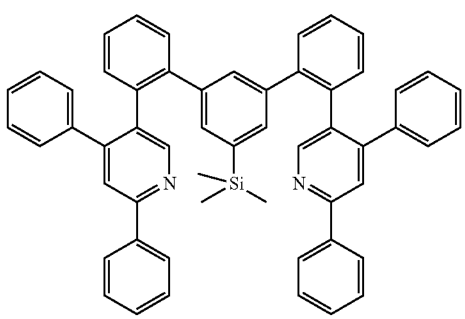 S304 | 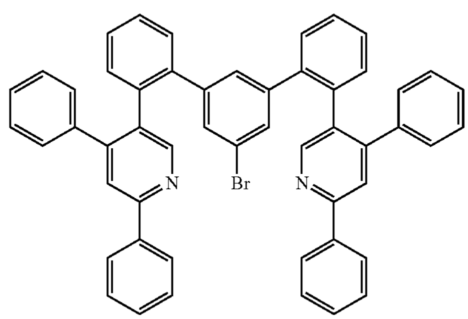 [SMILES: Brc1cc(-c2ccccc2-c2cnc(-c3ccccc3)cc2-c2ccccc2)cc(-c2ccccc2-c2cnc(-c3ccccc3)cc2-c2ccccc2)c1] | 55% |
| S405 | 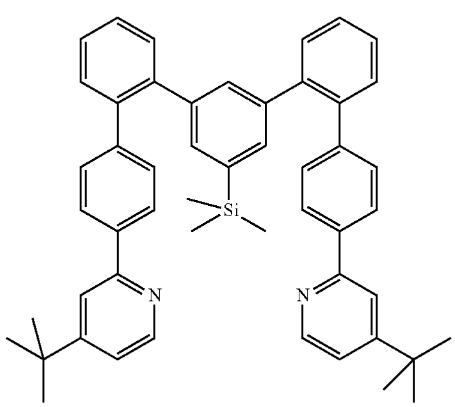 S305 | 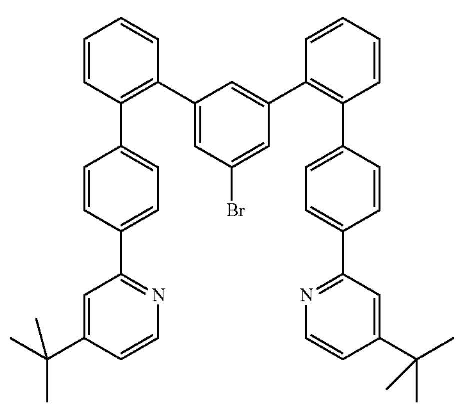 | 61% |

Example S500

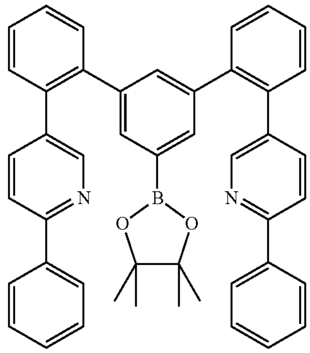 [SMILES: CC1(C)OB(c2cc(-c3ccccc3-c3ccc(-c4ccccc4)nc3)cc(-c3ccccc3-c3ccc(-c4ccccc4)nc3)c2)OC1(C)C]

A mixture of 61.6 g (100 mmol) of S400, 27.9 g (110 mmol) of bis(pinacolato)diborane [73183-34-3], 29.4 g (300 mmol) of potassium acetate, 561 mg (2 mmol) of tricyclohexylphosphine, 225 mg (1 mmol) of palladium(II) acetate, 100 g of glass beads (diameter 3 mm) and 500 ml of 1,4-dioxane is heated under reflux for 16 h. After cooling, the suspension is freed of the 1,4-dioxane under reduced pressure, and the residue is taken up in 500 ml of ethyl acetate, washed twice with 300 ml of water and once with 200 ml of saturated sodium chloride solution, dried over magnesium sulphate and then filtered through a pre-slurried Celite bed, which is washed through with a little ethyl acetate. The filtrate is concentrated to dryness and then recrystallized from ethyl acetate/methanol. Yield: 55.0 g (83 mmol), 83%. Purity: about 97% by $^{1}$H NMR.

In an analogous manner, it is possible to synthesize the following compounds:

| Ex. | Reactant | Product | Yield |
| --- | --- | --- | --- |
| S501 | 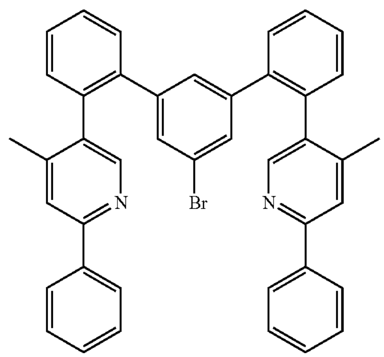 S401 | 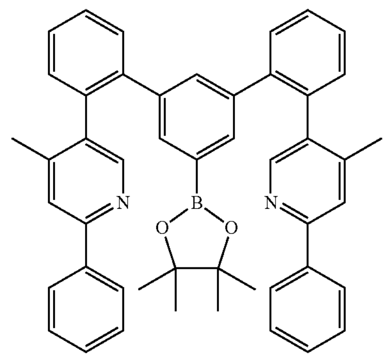 | 78% |
| S502 | 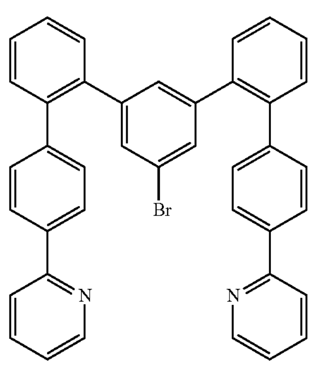 S402 | 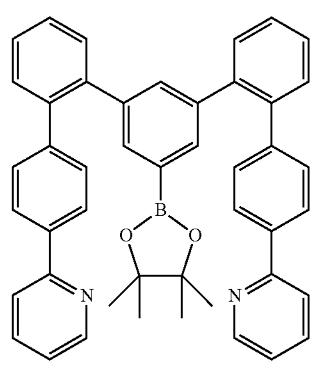 [SMILES: CC1(C)OB(c2cc(-c3ccccc3-c3ccc(-c4ccccn4)cc3)cc(-c3ccccc3-c3ccc(-c4ccccn4)cc3)c2)OC1(C)C] | 70% |

-continued
| Ex. | Reactant | Product | Yield |
|---|---|---|---|
| S503 | 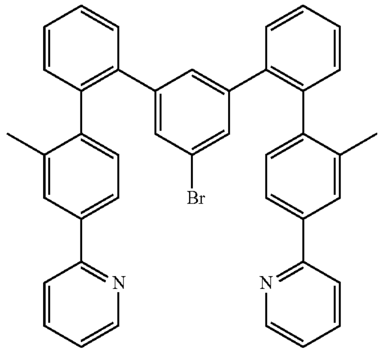 S403 | 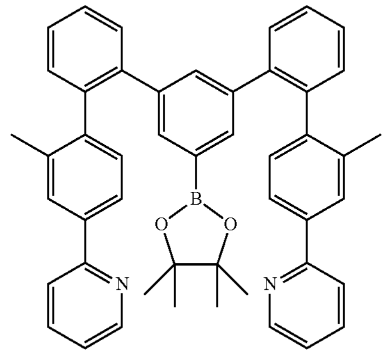 | 64% |
| S504 | 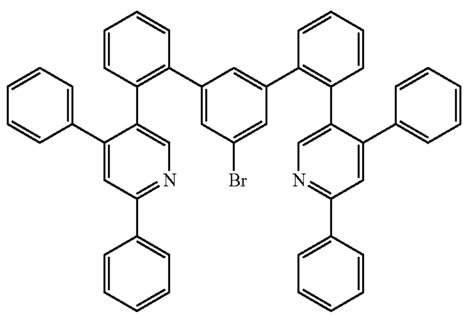 S404 | 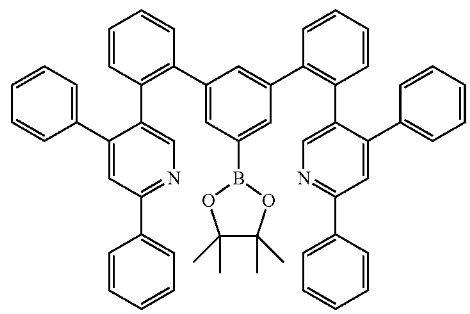 [SMILES: CC1(C)OB(c2cc(-c3ccccc3-c3cnc(-c4ccccc4)cc3-c3ccccc3)cc(-c3ccccc3-c3cnc(-c4ccccc4)cc3-c3ccccc3)c2)OC1(C)C] | 77% |
| S505 | 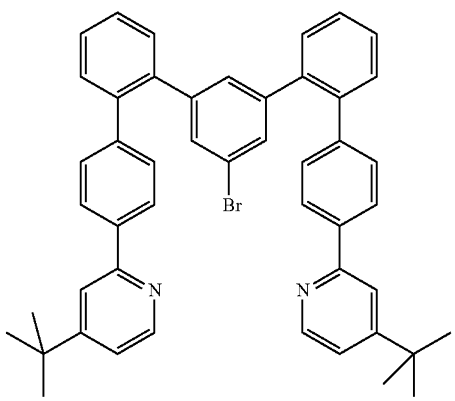 S405 | 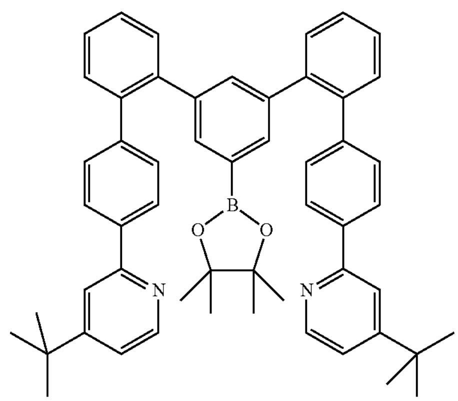 [SMILES: CC(C)(C)c1ccnc(-c2ccc(-c3ccccc3-c3cc(B4OC(C)(C)C(C)(C)O4)cc(-c4ccccc4-c4ccc(-c5cc(C(C)(C)C)ccn5)cc4)c3)cc2)c1] | 73% |
| S505 | 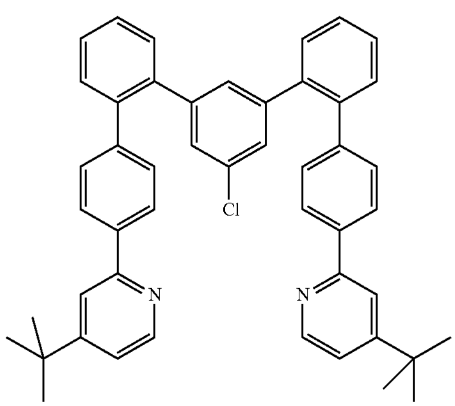 S306 | 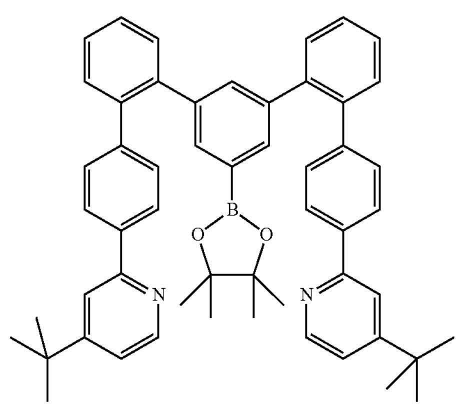 [SMILES: CC(C)(C)c1ccnc(-c2ccc(-c3ccccc3-c3cc(B4OC(C)(C)C(C)(C)O4)cc(-c4ccccc4-c4ccc(-c5cc(C(C)(C)C)ccn5)cc4)c3)cc2)c1] | 80% |

Example S600

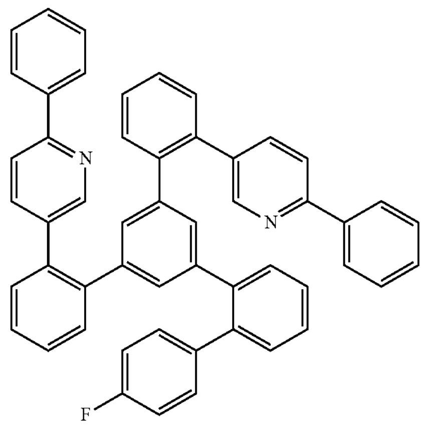 [SMILES: Fc1ccc(-c2ccccc2-c2cc(-c3ccccc3-c3ccc(-c4ccccc4)nc3)cc(-c3ccccc3-c3ccc(-c4ccccc4)nc3)c2)cc1]

A mixture of 66.3 g (100 mmol) of S500, 27.6 g (110 mmol) of 2-bromo-4'-fluoro-1,1'-biphenyl [89346-54-3], 63.7 g (300 mmol) of tripotassium phosphate, 1.64 g (4 mmol) of SPhos [657408-07-6], 449 mg (2 mmol) of palladium(II) acetate, 700 ml of toluene, 300 ml of dioxane and 500 ml of water is heated under reflux for 8 h. After cooling, the organic phase is removed, washed twice with 300 ml of water and once with 200 ml of saturated sodium chloride solution, dried over magnesium sulphate and then filtered through a pre-slurried Celite bed, which is washed through with toluene. The filtrate is concentrated to dryness and the solid thus obtained is then recrystallized twice from ethyl acetate/methanol. Yield: 49.5 g (70 mmol), 70%. Purity: about 97% by $^{1}$H NMR.

In an analogous manner, it is possible to synthesize the following compounds:

| Ex. | Reactants | Product | Yield |
|---|---|---|---|
| S601 | S501 | 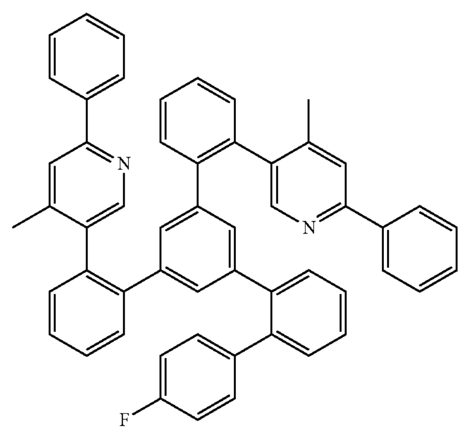 [SMILES: Cc1cc(-c2ccccc2)ncc1-c1ccccc1-c1cc(-c2ccccc2-c2ccc(F)cc2)cc(-c2ccccc2-c2cnc(-c3ccccc3)cc2C)c1] | 74% |
| S602 | S504 | 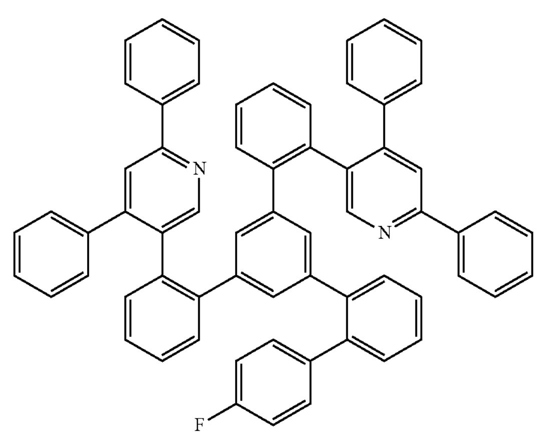 [SMILES: Fc1ccc(-c2ccccc2-c2cc(-c3ccccc3-c3cnc(-c4ccccc4)cc3-c3ccccc3)cc(-c3ccccc3-c3cnc(-c4ccccc4)cc3-c3ccccc3)c2)cc1] | 71% |

-continued

| Ex. | Reactants | Product | Yield |
|---|---|---|---|
| S603 | S503 | 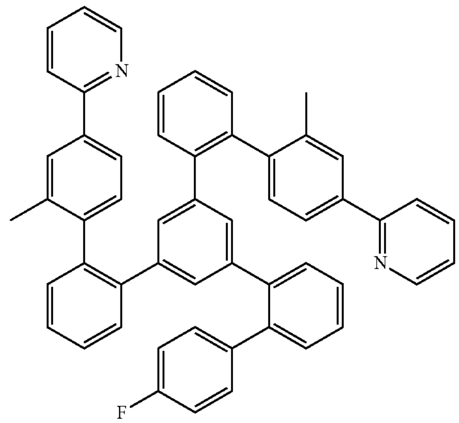 [SMILES: Cc1cc(-c2ccccn2)ccc1-c1ccccc1-c1cc(-c2ccccc2-c2ccc(F)cc2)cc(-c2ccccc2-c2ccc(-c3ccccn3)cc2C)c1] | 73% |
| S604 | S505 | 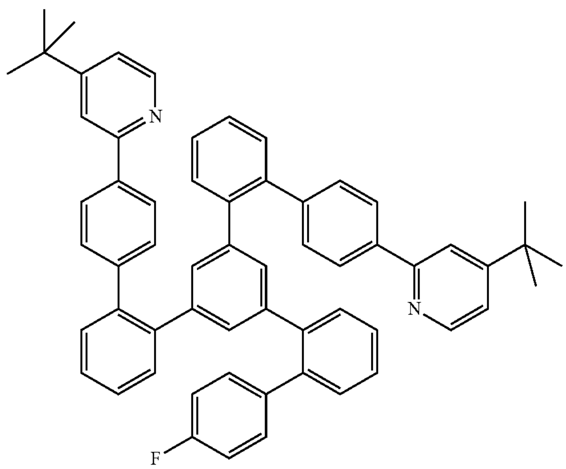 [SMILES: CC(C)(C)c1ccnc(-c2ccc(-c3ccccc3-c3cc(-c4ccccc4-c4ccc(F)cc4)cc(-c4ccccc4-c4ccc(-c5cc(C(C)(C)C)ccn5)cc4)c3)cc2)c1] | 81% |

Example S610

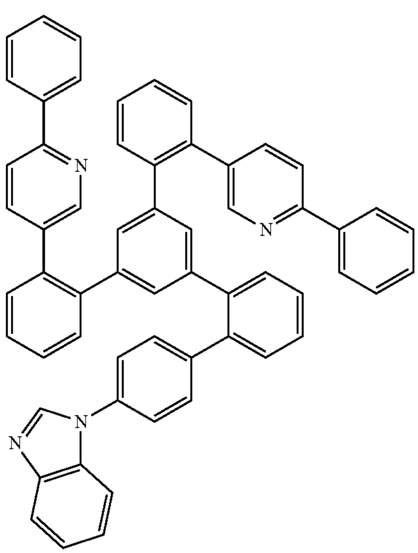 [SMILES: c1ccc(-c2ccc(-c3ccccc3-c3cc(-c4ccccc4-c4ccc(-n5cnc6ccccc65)cc4)cc(-c4ccccc4-c4ccc(-c5ccccc5)nc4)c3)cn2)cc1]

Analogous to F. Diness et al., Angew. Chem. Int. Ed., 2012, 51, 8012. A mixture of 35.3 g (50 mmol) of S600, 11.8 g (100 mmol) of benzimidazole and 97.9 g (300 mmol) of caesium carbonate in 500 ml of N,N-dimethylacetamide is heated to 175° C. in a stirred autoclave for 16 h. After cooling, the solvent is substantially drawn off and the residue is taken up in 500 ml of toluene, washed three times with 300 ml each time of water and once with 300 ml of saturated sodium chloride solution, dried over magnesium sulphate and then filtered through a pre-slurried Celite bed. After the solvent has been removed under reduced pressure, the residue is recrystallized from ethyl acetate/methanol. Yield: 33.0 g (41 mmol), 82%. Purity: about 97% by $^1$H NMR.

In an analogous manner, it is possible to synthesize the following compounds:

| Ex. | Reactants | Product | Yield |
|---|---|---|---|
| S611 | S600 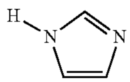 233-32-4 | 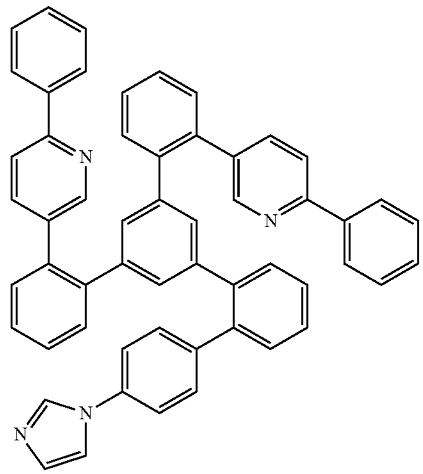 [SMILES: c1ccc(-c2ccc(-c3ccccc3-c3cc(-c4ccccc4-c4ccc(-n5ccnc5)cc4)cc(-c4ccccc4-c4ccc(-c5ccccc5)nc4)c3)cn2)cc1] | 74% |
| S612 | S601 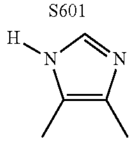 2302-39-8 | 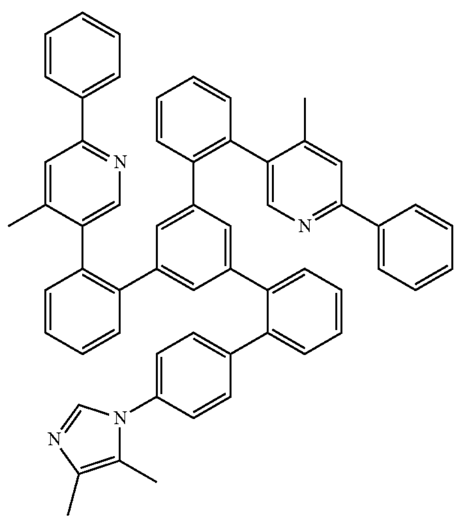 [SMILES: Cc1cc(-c2ccccc2)ncc1-c1ccccc1-c1cc(-c2ccccc2-c2ccc(-n3cnc(C)c3C)cc2)cc(-c2ccccc2-c2cnc(-c3ccccc3)cc2C)c1] | 64% |
| S613 | S601 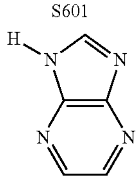 273-94-9 | 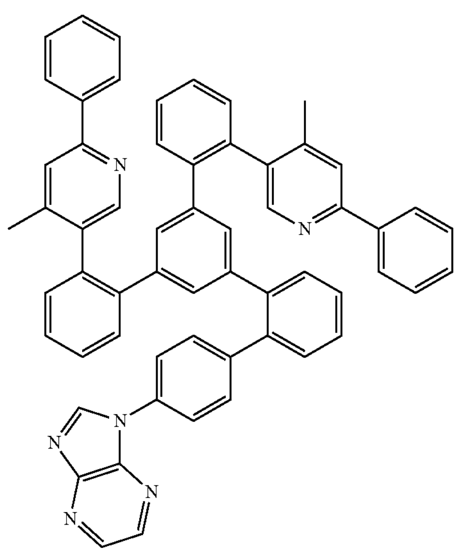 [SMILES: Cc1cc(-c2ccccc2)ncc1-c1ccccc1-c1cc(-c2ccccc2-c2ccc(-n3cnc4nccnc43)cc2)cc(-c2ccccc2-c2cnc(-c3ccccc3)cc2C)c1] | 78% |

-continued
| Ex. | Reactants | Product | Yield |
|---|---|---|---|
| S614 | S602<br>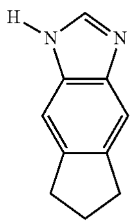<br>83655-80-5 | 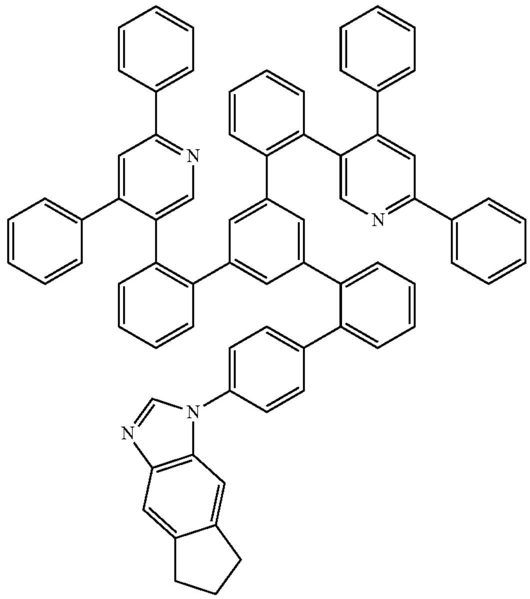 [SMILES: c1ccc(-c2cc(-c3ccccc3)c(-c3ccccc3-c3cc(-c4ccccc4-c4ccc(-n5cnc6cc7c(cc65)CCC7)cc4)cc(-c4ccccc4-c4cnc(-c5ccccc5)cc4-c4ccccc4)c3)cn2)cc1] | 75% |
| S615 | S603<br>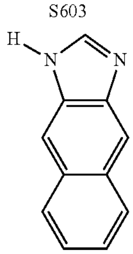<br>269-07-8 | 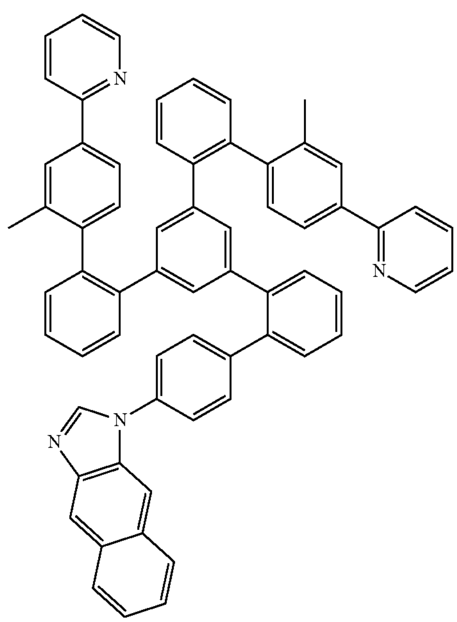 [SMILES: Cc1cc(-c2ccccn2)ccc1-c1ccccc1-c1cc(-c2ccccc2-c2ccc(-n3cnc4cc5ccccc5cc43)cc2)cc(-c2ccccc2-c2ccc(-c3ccccn3)cc2C)c1] | 70% |

-continued
| Ex. | Reactants | Product | Yield |
| --- | --- | --- | --- |
| S616 | S604 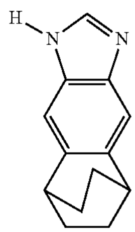 7271-60-5 | 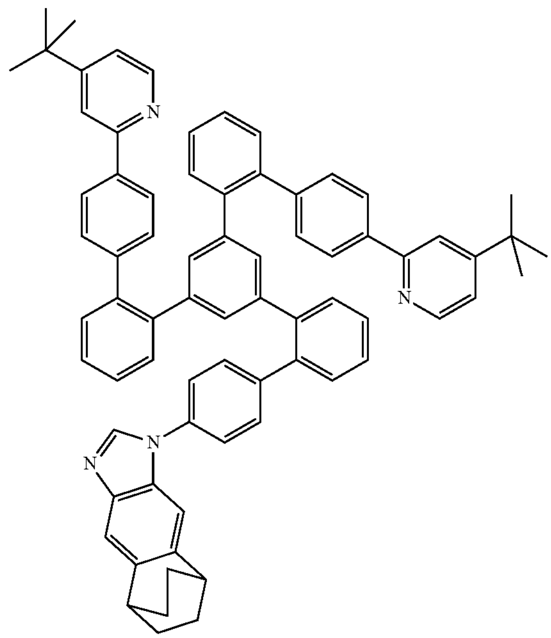 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-n5cnc6cc7c(cc65)C5CCC7CC5)cc4)c3)cc2)c1] | 64% |
| S617 | S604 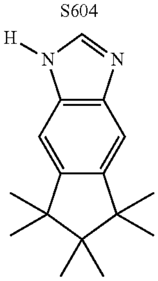 1562420-66-9 | 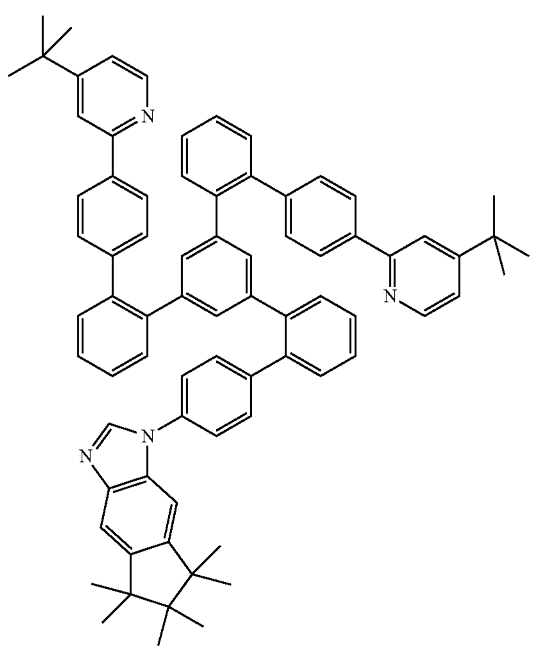 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-n5cnc6cc7c(cc65)C(C)(C)C(C)(C)C7(C)C)cc4)c3)cc2)c1] | 68% |

Example S620

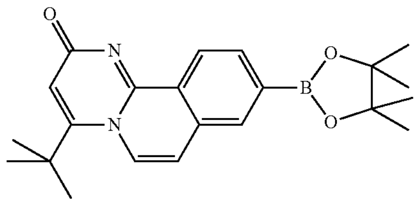 [SMILES: CC(C)(C)c1cc(=O)nc2c3ccc(B4OC(C)(C)C(C)(C)O4)cc3ccn12]

To a mixture of 12.6 g (50 mmol) of 4-tert-butyl-2H-pyrimido[2,1-a]isoquinolin-2-one, 12.7 g (50 mmol) of bis (pinacolato)diborane [73183-34-3] and 200 ml of mesitylene are added 1.7 g (2.5 mmol) of bis[(1,2,5,6-η)-1,5-cyclooctadiene]di-μ-methoxydiiridium(I) [12148-71-9] and then 1.4 g (5 mmol) of 4,4'-di-tert-butyl-[2,2']bipyridinyl [72914-19-3], and then the mixture is stirred at 120° C. for 16 h. After cooling, the solvent is removed under reduced pressure, the residue is taken up in dichloromethane and filtered through a pre-slurried Celite bed, and the filtrate is concentrated to dryness and then chromatographed with dichloromethane:ethyl acetate (9:1) on silica gel. Yield: 8.0 g (21 mmol), 42%; purity: about 95% by $^{1}H$ NMR.

In an analogous manner, it is possible to prepare the following compounds:

| Ex. | Reactant | Product Boronic ester | Yield |
|---|---|---|---|
| S621 | 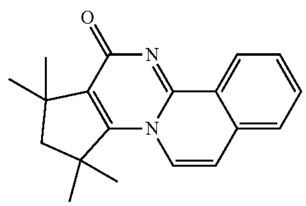 1616465-35-0 | 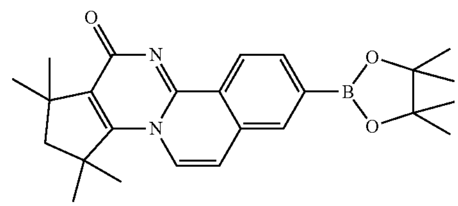 | 31% |
| S622 | 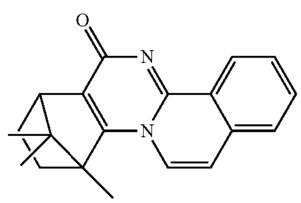 1616465-31-6 | 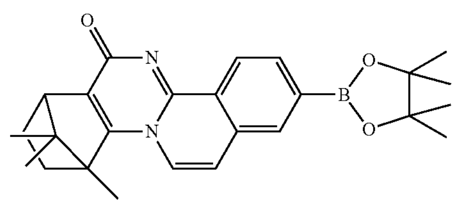 | 37% |
| S623 | 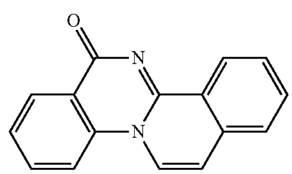 1615694-84-2 | 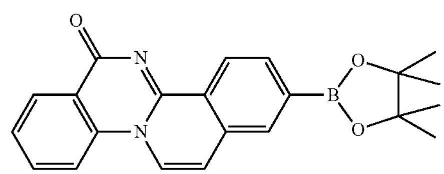 [SMILES: CC1(C)OB(c2ccc3c(ccn4c5ccccc5c(=O)nc34)c2)OC1(C)C] | 17% |
| S624 | 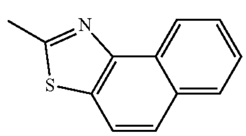 2682-45-3 | 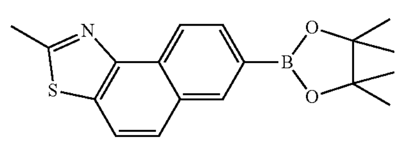 | 27% |
| S625 | 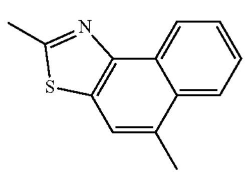 109129-67-1 | 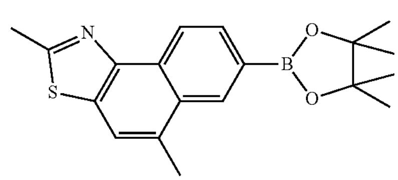 | 51% |

-continued

| Ex. | Reactant | Product Boronic ester | Yield |
|---|---|---|---|
| S626 | 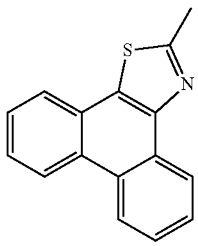 21639-90-7 | 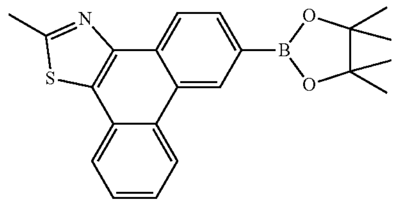 | 13% |
| S627 | 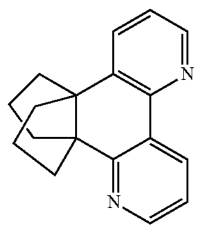 S651 | 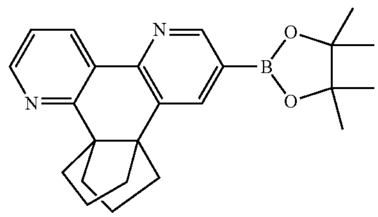 [SMILES: CC1(C)OB(c2cnc3c(c2)C24CCCC2(CCC4)c2ncccc2-3)OC1(C)C] | 23% |
| S628 | 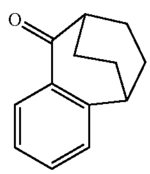 56129-78-3 | 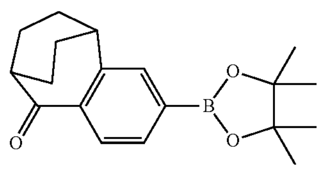 [SMILES: CC1(C)OB(c2ccc3c(c2)C2CCC(CC2)C3=O)OC1(C)C] | 21% |

Example S650

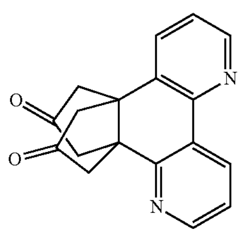 [SMILES: O=C1CC23CC(=O)CC2(C1)c1ncccc1-c1ncccc13]

A sodium methoxide solution is prepared from 11.5 g (500 mmol) of sodium and 1000 ml of methanol. To the latter are added, while stirring, 43.6 g (250 mmol) of dimethyl 1,3-acetonedicarboxylate [1830-54-2] and the mixture is stirred for a further 10 min. Then 21.0 g (100 mmol) of 1,7-phenanthroline-5,6-dione [82701-91-5] are added in solid form. After stirring under reflux for 16 h, the methanol is removed under reduced pressure. To the residue are cautiously added 1000 ml of glacial acetic acid (caution: foaming!), and to the brown solution are added 60 ml of water and 180 ml of conc. hydrochloric acid. The reaction mixture is heated under reflux for 16 h, then allowed to cool, poured onto 5 kg of ice and neutralized while cooling by addition of solid sodium hydroxide solution. The precipitated solids are filtered off with suction, washed three times with 300 ml each time of water and dried under reduced pressure. The crude product is stirred in 1000 ml of dichloromethane at 40° C. for 1 h and then filtered while still warm through a Celite bed in order to remove insoluble fractions. After the dichloromethane has been removed under reduced pressure, the residue is dissolved in 100 ml of dioxane at boiling and then 500 ml of methanol are added dropwise starting from 80° C. After cooling and stirring at room temperature for a further 12 h, the solids are filtered off with suction, washed with a little methanol and dried under reduced pressure. Yield: 18.3 g (63 mmol), 63%; purity: about 90% by $^{1}$H NMR. The product thus obtained is converted further without purification.

Example S651

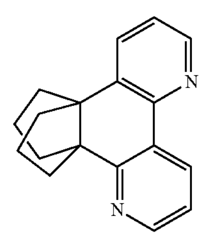 [SMILES: c1cnc2c(c1)-c1ncccc1C13CCCC21CCC3]

A mixture of 21.0 g (100 mmol) of S650, 50.1 g (1 mol) of hydrazine hydrate, 67.3 g (1.2 mol) of potassium hydroxide and 400 ml of ethylene glycol is heated under reflux for 4 h. Then the temperature is increased gradually and the water formed and excess hydrazine hydrate are distilled off on a water separator. After 16 h under reflux, the reaction mixture is allowed to cool, poured into 2 l of water and extracted three times with 500 ml each time of dichloromethane. The dichloromethane phase is washed five times with 300 ml each time of water and twice with 300 ml each time of saturated sodium chloride solution, and dried over magnesium sulphate.

After the dichloromethane has been removed under reduced pressure, the oily residue is chromatographed on silica gel with dichloromethane (Rf about 0.5). For further purification, the pale yellow oil thus obtained can be subjected to Kugelrohr distillation or recrystallized from methanol. Yield: 15.5 g (59 mmol), 59%; purity: about 97% by $^1$H NMR.

Examples S660 and S661

S660

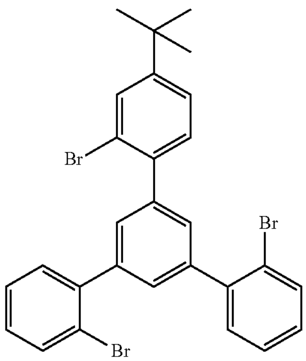

-continued

S661

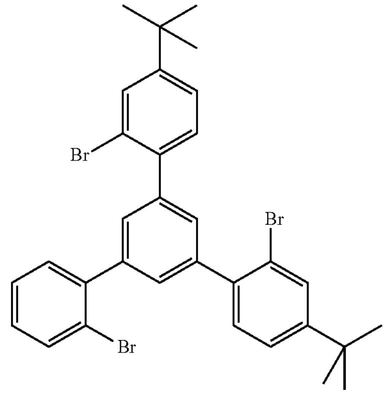

A mixture of 10.0 g (50 mmol) of 2-bromoacetophenone [2142-69-0], 11.3 g (50 mmol) of 2-bromo-4-tert-butylacetophenone [147438-85-5] and 1.5 g (10 mmol) of trifluoromethanesulphonic acid [1493-13-6] is stirred at 140° C. on a water separator for 18 h. After cooling, the residue is taken up in 300 ml of ethyl acetate, washed three times with 100 ml each time of water and once with 100 ml of saturated sodium chloride solution, and then dried over magnesium sulphate. The crude product is chromatographed (Torrent from Axel Semrau). Yield based on acetophenone groups: S660: 2.6 g (4.3 mmol), 12%; S661: 2.5 g (3.8 mmol) 11%. Purity in each case: about 97% by $^1$H NMR.

In an analogous manner, it is possible to prepare the following compounds:

| Ex. | Reactants | Products | Yield |
|---|---|---|---|
| S662 | 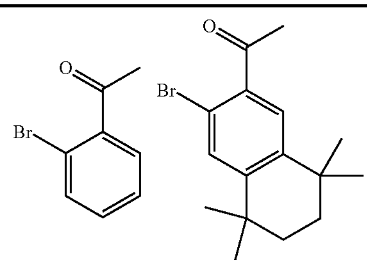  2142-69-0/27452-18-2 | 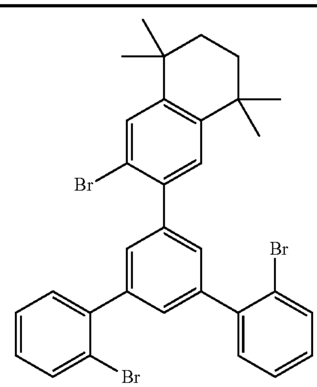  | 11% |
| S663 | as S662 | 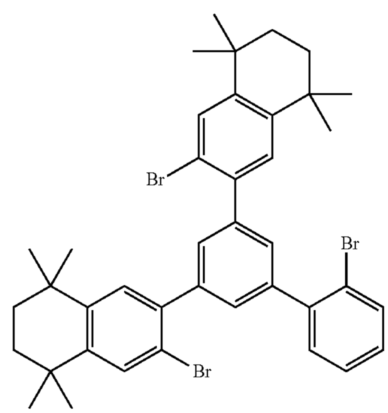 [SMILES: CC1(C)CCC(C)(C)c2cc(-c3cc(-c4ccccc4Br)cc(-c4cc5c(cc4Br)C(C)(C)CCC5(C)C)c3)c(Br)cc21]  | 10% |

-continued
| Ex. | Reactants | Products | Yield |
|---|---|---|---|
| S664 | 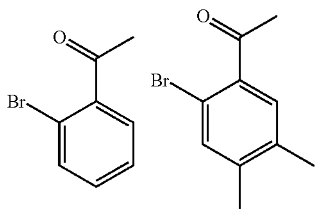 2142-69-0/15089-75-5 | 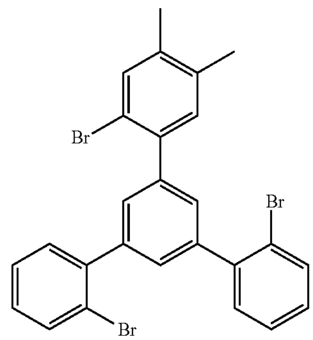 [SMILES: Cc1cc(Br)c(-c2cc(-c3ccccc3Br)cc(-c3ccccc3Br)c2)cc1C] | 12% |
| S665 | as S664 | 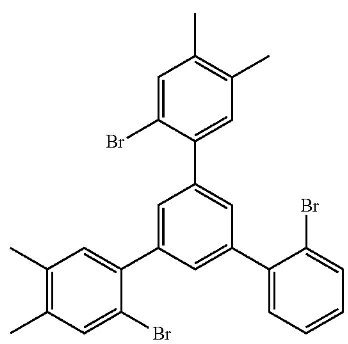 [SMILES: Cc1cc(Br)c(-c2cc(-c3ccccc3Br)cc(-c3cc(C)c(C)cc3Br)c2)cc1C] | 14% |
| S666 | 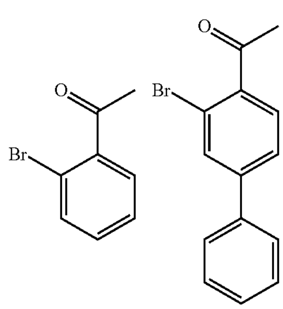 2142-69-0/628735-63-7 | 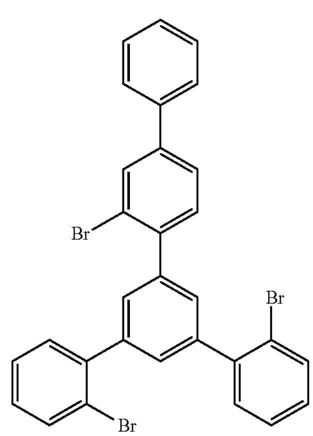 [SMILES: Brc1ccccc1-c1cc(-c2ccccc2Br)cc(-c2ccc(-c3ccccc3)cc2Br)c1] | 16% |

-continued

| Ex. | Reactants | Products | Yield |
| --- | --- | --- | --- |
| S667 | as S666 | 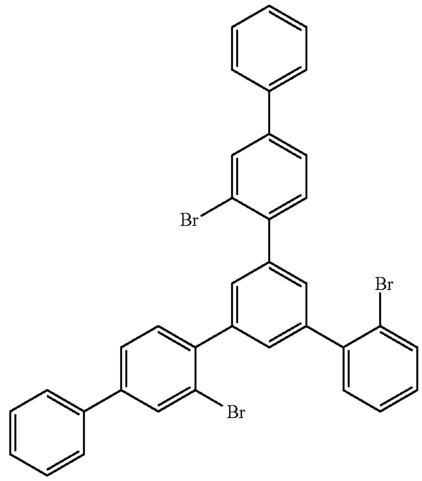 [SMILES: Brc1ccccc1-c1cc(-c2ccc(-c3ccccc3)cc2Br)cc(-c2ccc(-c3ccccc3)cc2Br)c1] | 17% |

Example S680

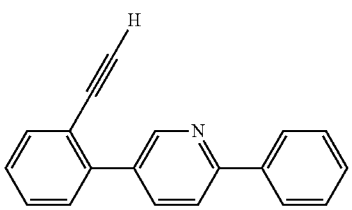 [SMILES: C#Cc1ccccc1-c1ccc(-c2ccccc2)nc1]

To a mixture of 29.7 g (100 mmol) of S200, 11.0 g (110 mmol) of trimethylsilylacetylene [1066-54-2], 300 ml of DMF and 20.8 ml (150 mmol) of triethylamine [121-44-8] are added 762 mg (4 mmol) of copper(I) iodide [7681-65-4] and then 1.4 g (2 mmol) of bis(triphenylphosphino)palladium(II) chloride [13965-03-2], and then the mixture is stirred at 80° C. for 6 h. After cooling, the precipitated triethylammonium hydrochloride is filtered off, the filtrate is concentrated to dryness under reduced pressure, the residue is taken up in 300 ml of DCM and filtered through a pre-slurried Celite bed, and the filtrate is washed three times with 100 ml each time of water and once with 100 ml of saturated sodium chloride solution, and dried over magnesium sulphate. The magnesium sulphate is filtered off, the filtrate is concentrated under reduced pressure, the oily residue is taken up in 300 ml of methanol, 27.6 g (200 mmol) of potassium carbonate [584-08-7] and 50 g of glass beads (diameter 3 mm) are added, the mixture is stirred at room temperature for 12 h, the potassium carbonate and glass beads are filtered off using a pre-slurried Celite bed and the filtrate is concentrated completely under reduced pressure. Yield: 22.7 g (89 mmol), 89%; purity: about 95% by $^{1}$H NMR. The product thus obtained is converted further without purification.

In an analogous manner, it is possible to prepare the following compound:

| Ex. | Reactant | Product | Yield |
| --- | --- | --- | --- |
| S681 | 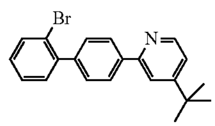 S205 | 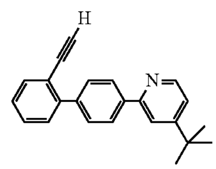 [SMILES: C#Cc1ccccc1-c1ccc(-c2cc(C(C)(C)C)ccn2)cc1] | 90% |

B: Synthesis of Ligands and Ligand Precursors L—Part 1

Example L1

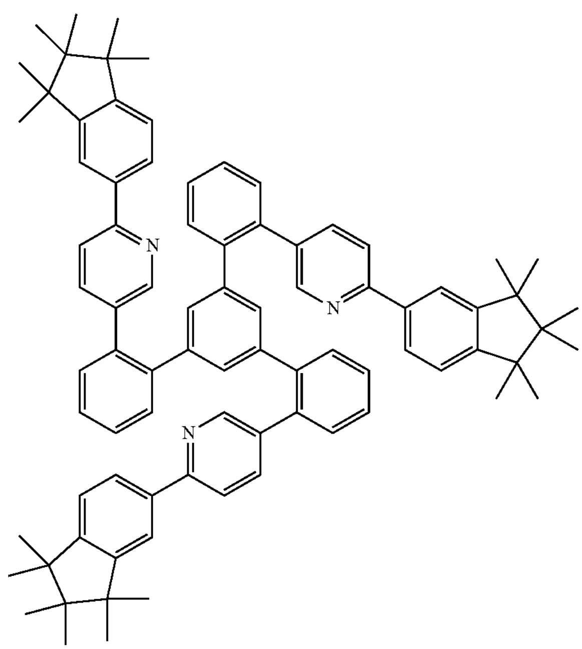

Variant A:

A mixture of 54.1 g (100 mmol) of 1,3,5-tris(2-bromophenyl)benzene, S50, [380626-56-2], 141.9 g (350 mmol) of 2-[1,1,2,2,3,3-hexamethylindan-5-yl]-5-(4,4,5,5-tetramethyl-[1,3,2]dioxaborolan-2-yl)pyridine S21, 106.0 g (1 mol) of sodium carbonate, 5.8 g (5 mmol) of tetrakis (triphenylphosphino)palladium(0), or alternatively triphenyl- or tri-o-tolylphosphine and palladium(II) acetate in a molar ratio of 3:1, 750 ml of toluene, 200 ml of ethanol and 500 ml of water is heated under reflux with very good stirring for 24 h. After 24 h, 300 ml of 5% by weight aqueous acetylcysteine solution are added, the mixture is stirred under reflux for a further 16 h and allowed to cool, the aqueous phase is removed and the organic phase is concentrated to dryness. The brown foam is taken up in 300 ml of ethyl acetate and filtered through a silica gel bed pre-slurried with ethyl acetate (diameter 15 cm, length 20 cm) in order to remove brown components. After concentrating to 200 ml, the solution is added dropwise to 1000 ml of methanol with very good stirring, in the course of which a beige solid precipitates out. The solid is filtered off with suction, washed twice with 200 ml each time of methanol and dried under reduced pressure. The reprecipitation process is repeated again. Yield: 54.7 g (48 mmol), 48%. Purity: about 95% by $^{1}$H NMR.

Remaining secondary components are frequently the disubstitution product and/or the debrominated disubstitution product. A purity of about 90% or even less is sufficient for use in the o-metallation reaction. The ligands can be purified further if required by chromatography on silica gel (n-heptane or cyclohexane or toluene in combination with ethyl acetate, dichloromethane, acetone, etc., optionally with addition of a polar protic component such as methanol or acetic acid). Alternatively, it is possible to recrystallize ligands lacking bulky alkyl groups from ethyl acetate or acetonitrile, optionally with addition of MeOH or EtOH. Ligands having a molar mass of less than about 1000-1200 g/mol can be subjected to Kugelrohr sublimation under high vacuum (p about $10^{-5}$ mbar).

The NMR spectra of the ligands—especially those of ligands having bridged sub-ligands—are frequently complex, since there are frequently mixtures of syn and anti rotamers in solution.

Example L2

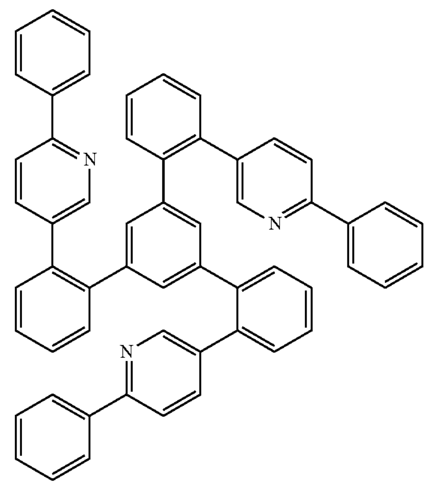 [SMILES: c1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cc1]

Variant B:

Procedure analogous to Example L1, with S21 replaced by S22.

Purification: After the organic phase from the Suzuki coupling has been concentrated, the brown foam is taken up in 300 ml of a mixture of dichloromethane:ethyl acetate (8:1, v/v) and filtered through a silica gel bed pre-slurried with dichloromethane:ethyl acetate (8:1, v/v) (diameter 15 cm, length 20 cm), in order to remove brown components. After concentration, the remaining foam is recrystallized from 800 ml of ethyl acetate with addition of 400 ml of methanol at boiling and then for a second time from 1000 ml of pure ethyl acetate and then subjected to Kugelrohr sublimation under high vacuum (p about $10^{-5}$ mbar, T 280° C.). Ligands having a molar mass greater than about 1000-1200 g/mol are used without Kugelrohr sublimation/distillation. Yield: 50.6 g (66 mmol), 66%. Purity: about 99.7% by $^{1}$H NMR.

Variant C:

Procedure analogous to Example L1, with replacement of S21 by S22, of the sodium carbonate by 127.4 g (600 mmol) of tripotassium phosphate [7778-53-2] and of the tetrakis (triphenylphosphino)palladium(0) by 1.6 g (4 mmol) of SPhos [657408-07-6] and 674 mg (3 mmol) of palladium(II) acetate [3375-31-3]. Purification: as under Variant B. Yield: 40.6 g (53 mmol), 53%. Purity: about 99.5% by $^{1}$H NMR.

Variant D:

The aqueous phase is extracted five times with 200 ml of DCM. The combined organic phases are freed of the solvent. The residue is taken up in 1000 ml of DCM:acetonitrile: methanol 1:1:0.1 and filtered through Celite. The filtrate is freed of the solvent under reduced pressure, and the residue is extracted by stirring from 300 ml of hot methanol and then dried under reduced pressure.

In an analogous manner, it is possible to prepare the following compounds:

| Ex. | Bromide Boronic acid/ ester/ tetrafluoro- borate | Product Variant | Yield |
|---|---|---|---|
| L3 | S50<br>S23 | 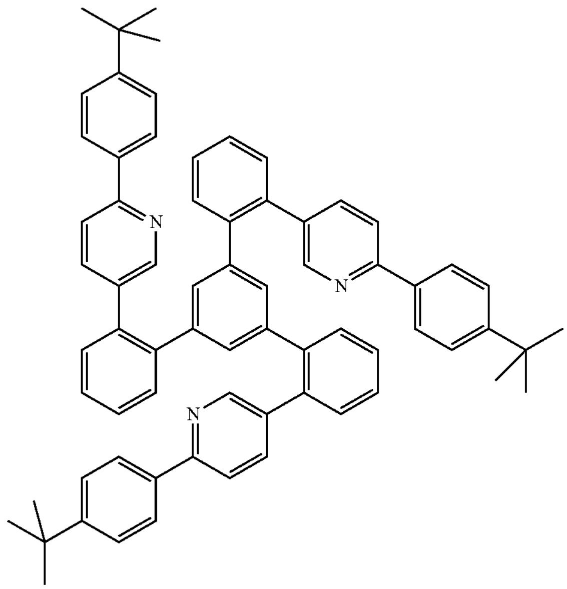<br>B | 63% |
| L4 | S50<br>S24 | 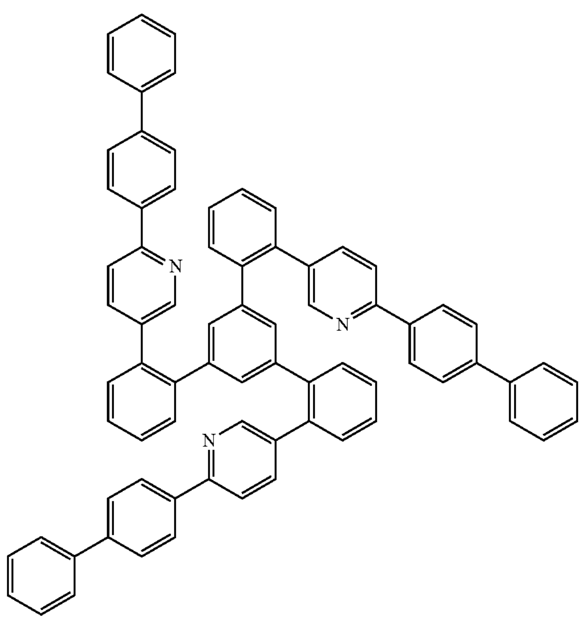<br>B | 72% |

-continued
| Ex. | Bromide Boronic acid/ ester/ tetrafluoro- borate | Product Variant | Yield |
|---|---|---|---|
| L5 | S50 S25 | 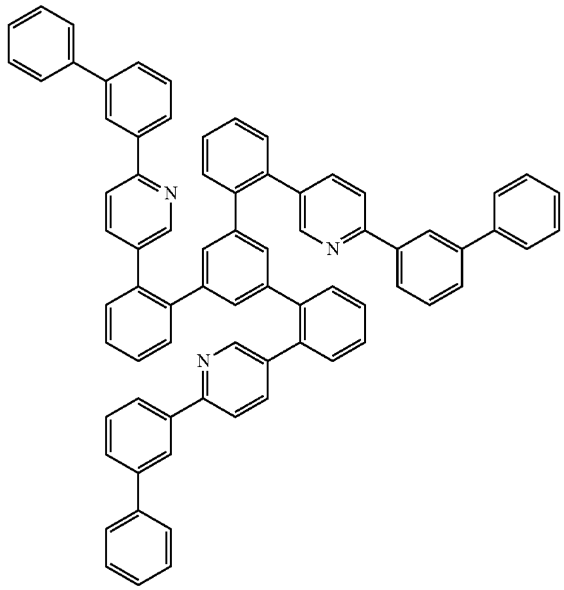 A | 58% |
| L6 | S50 S26 | 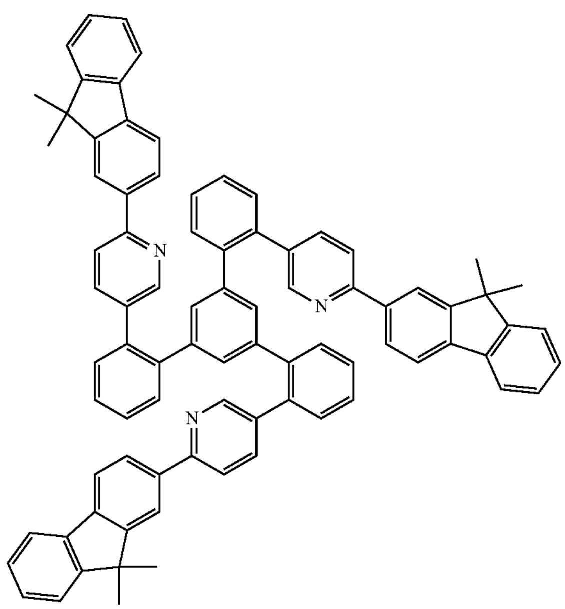 A | 60% |

-continued
| Ex. | Bromide Boronic acid/ ester/ tetrafluoro-borate | Product Variant | Yield |
|---|---|---|---|
| L7 | S50<br>S27 | 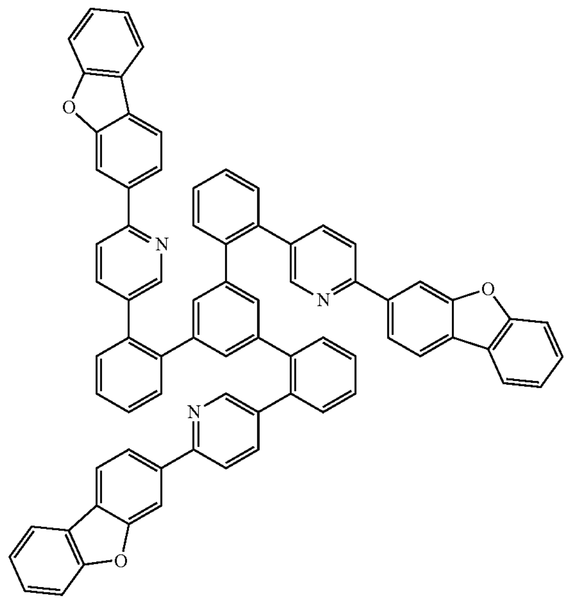<br>B | 58% |
| L8 | S50<br>S28 | 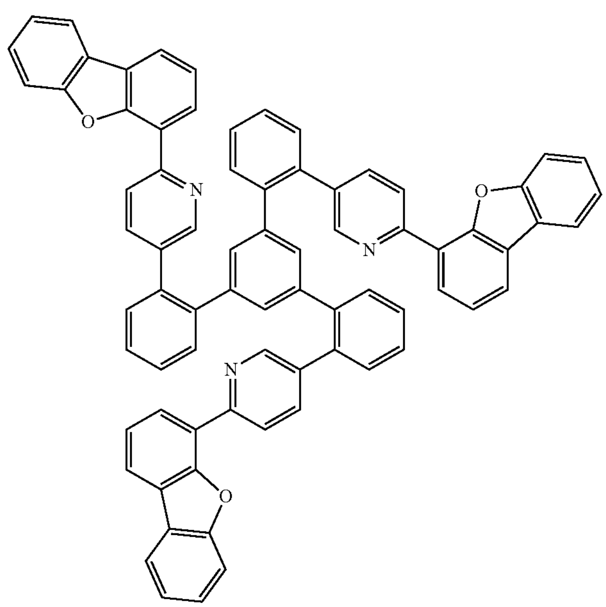<br>A | 51% |

-continued
| Ex. | Bromide Boronic acid/ ester/ tetrafluoro-borate | Product Variant | Yield |
|---|---|---|---|
| L9 | S50<br>S29 | 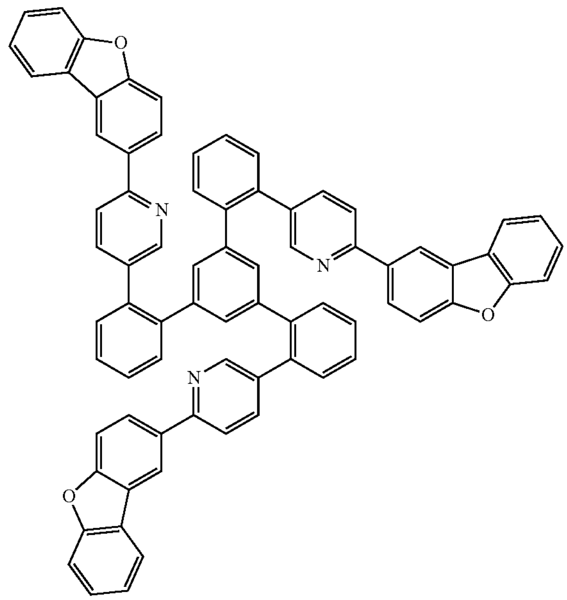<br>B | 52% |
| L10 | S50<br>S30 | 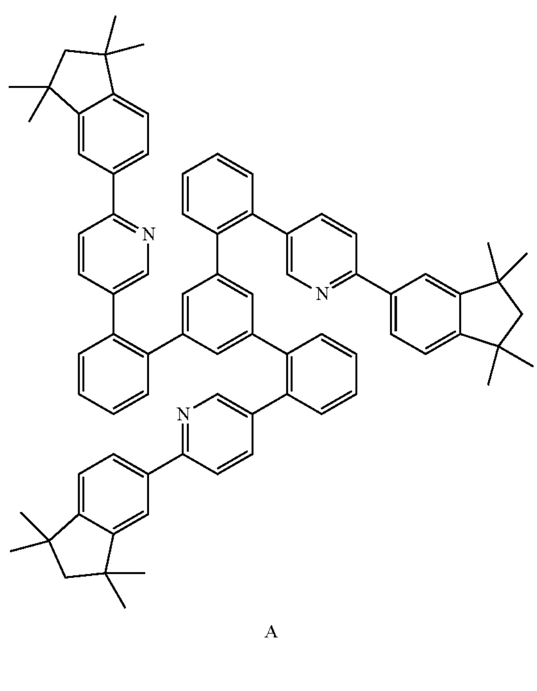<br>A | 51% |

-continued
| Ex. | Bromide Boronic acid/ ester/ tetrafluoro- borate | Product Variant | Yield |
|---|---|---|---|
| L11 | S50<br>S31 | 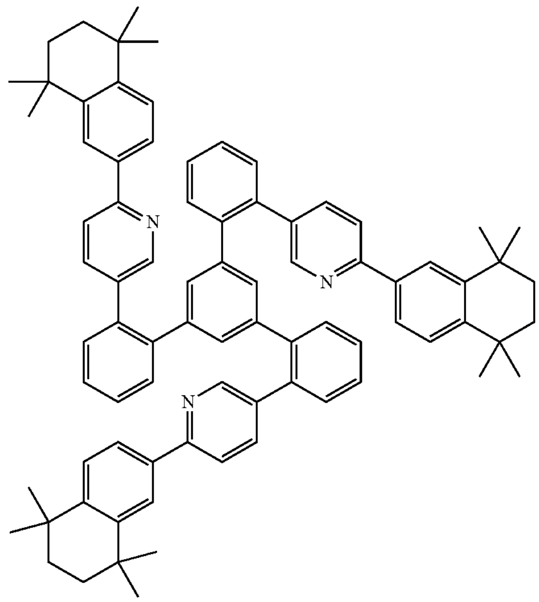<br>A | 47% |
| L12 | S50<br>S32 | 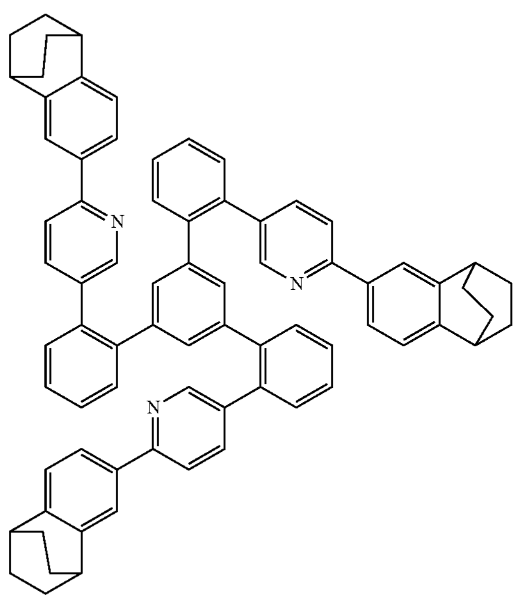<br>A | 50% |

-continued
| Ex. | Bromide Boronic acid/ ester/ tetrafluoro-borate | Product Variant | Yield |
|---|---|---|---|
| L13 | S50<br>S33 | 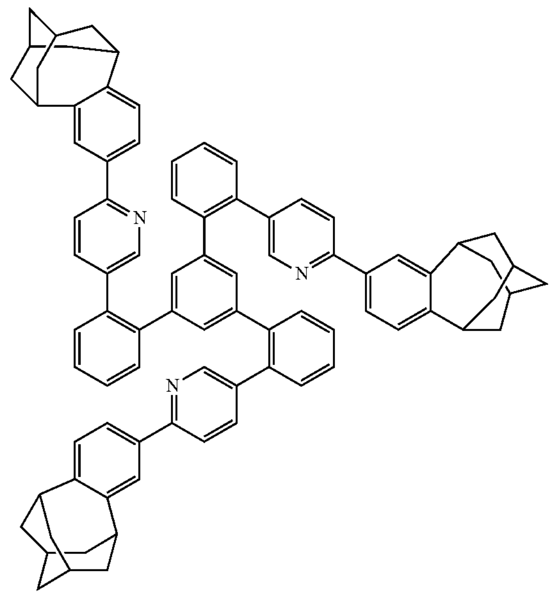<br>A | 53% |
| L14 | S50<br>S34 | 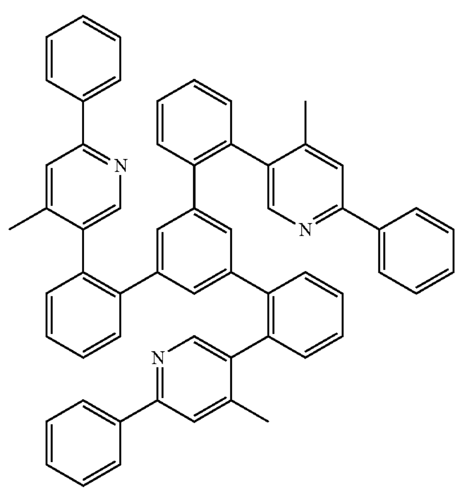<br>C | 43% |

-continued
| Ex. | Bromide Boronic acid/ ester/ tetrafluoro-borate | Product Variant | Yield |
|---|---|---|---|
| L15 | S50<br>S35 | 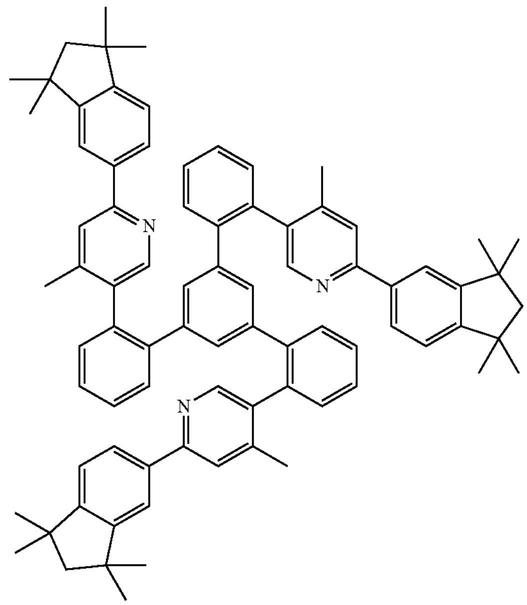<br>C | 40% |
| L16 | S50<br>S36 | 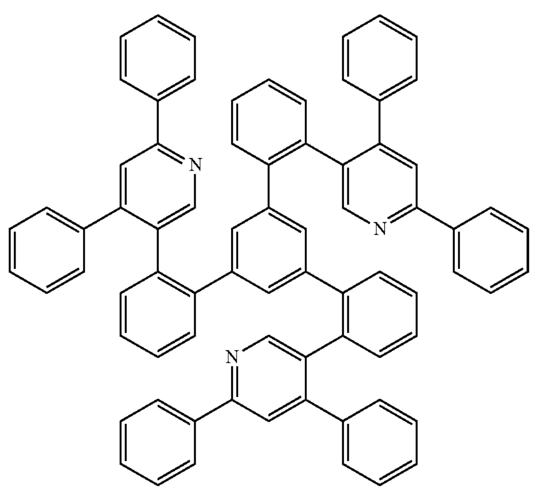<br>C | 54% |

-continued
| Ex. | Bromide Boronic acid/ ester/ tetrafluoro-borate | Product Variant | Yield |
|---|---|---|---|
| L17 | S50<br>S37 | 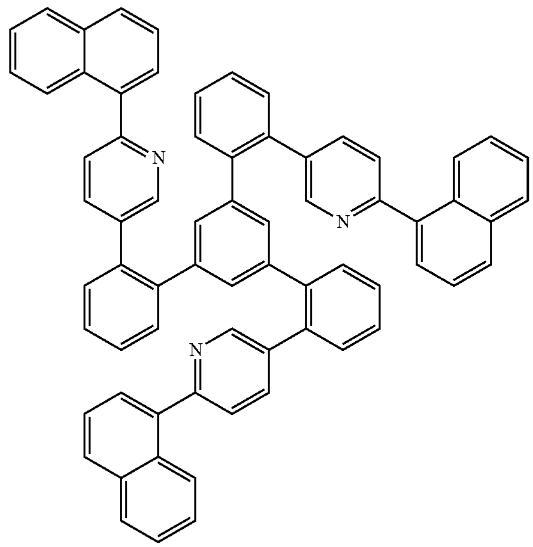<br>B | 59% |
| L18 | S50<br>S38 | 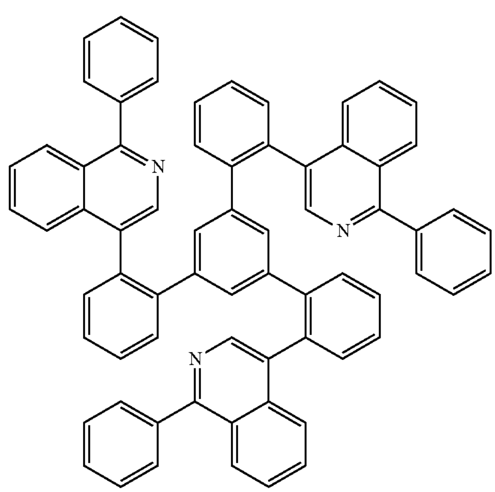<br>B | 45% |

-continued
| Ex. | Bromide Boronic acid/ ester/ tetrafluoro-borate | Product Variant | Yield |
| --- | --- | --- | --- |
| L19 | S50<br>S39 | 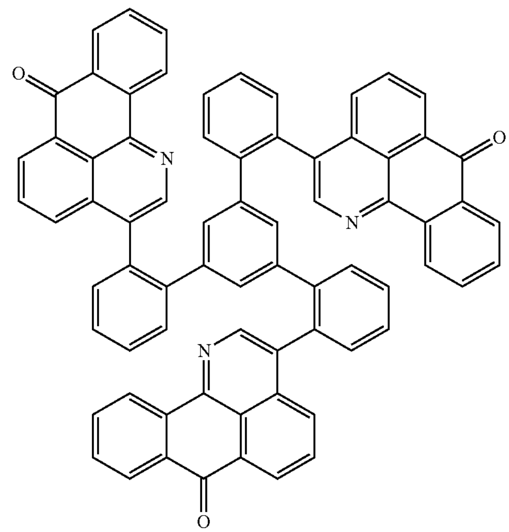<br>B | 57% |
| L20 | S50<br>S40 | 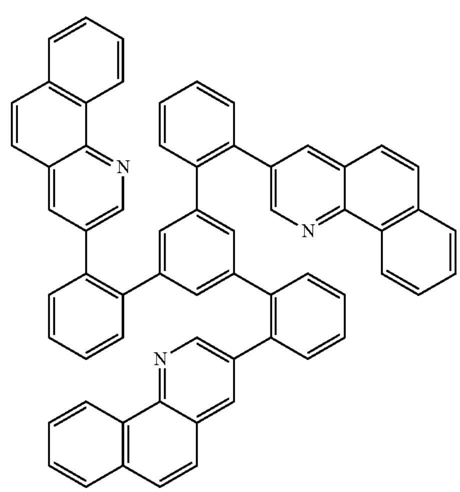<br>C | 60% |

-continued
| Ex. | Bromide Boronic acid/ ester/ tetrafluoro-borate | Product Variant | Yield |
|---|---|---|---|
| L21 | S50<br>S41 | 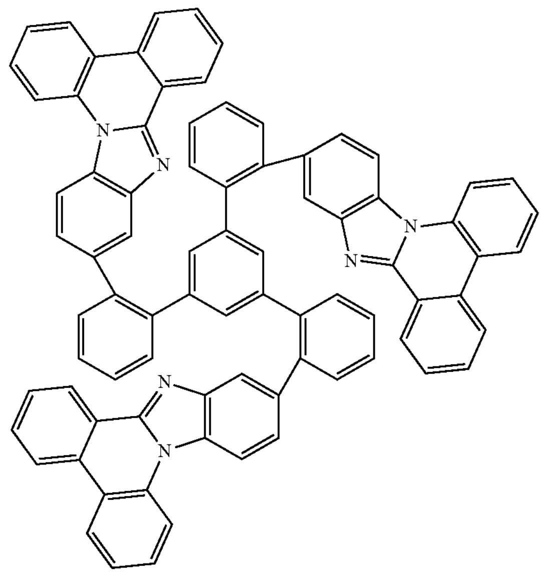<br>B | 62% |
| L22 | S50<br>S42 | 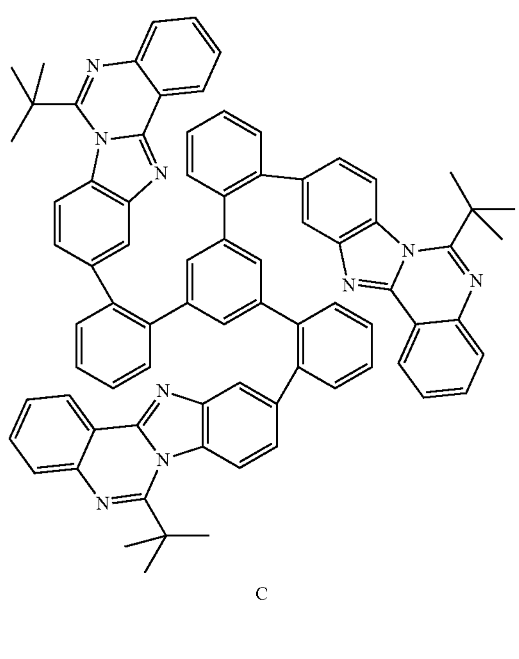<br>C | 60% |

-continued
| Ex. | Bromide Boronic acid/ ester/ tetrafluoro- borate | Product Variant | Yield |
|---|---|---|---|
| L23 | S50<br>S43 | 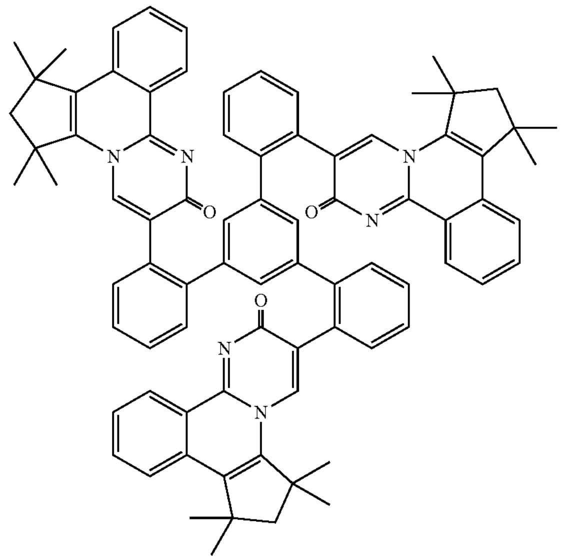<br>A | 57% |
| L24 | S44<br>S22 | 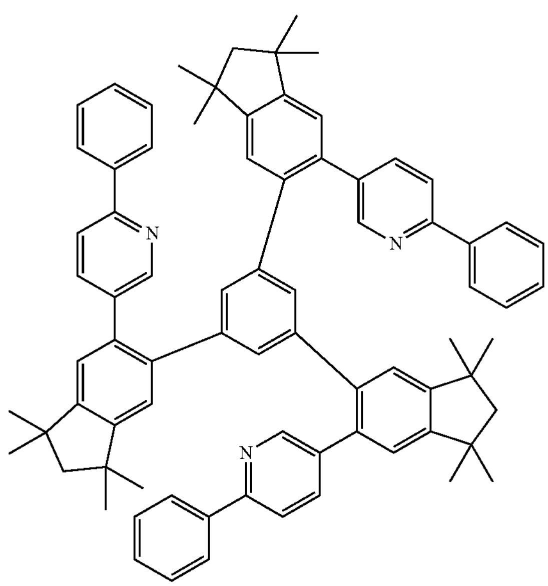<br>A | 43% |

-continued
| Ex. | Bromide Boronic acid/ ester/ tetrafluoro-borate | Product Variant | Yield |
| --- | --- | --- | --- |
| L25 | S44<br>S34 | 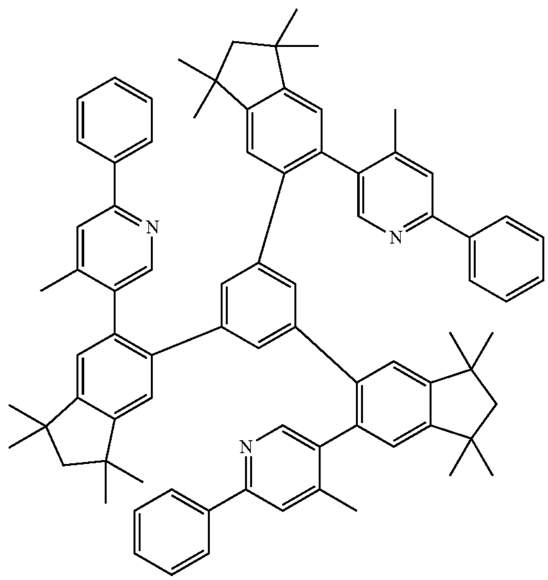<br>C | 40% |
| L26 | S45<br>S22 | 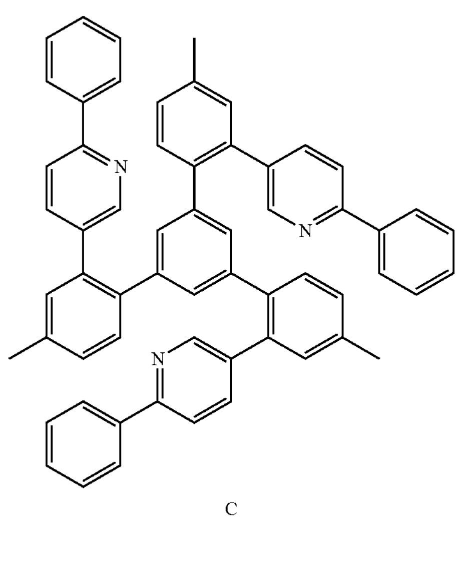<br>C | 59% |

-continued
| Ex. | Bromide Boronic acid/ ester/ tetrafluoro- borate | Product Variant | Yield |
|---|---|---|---|
| L27 | S46<br>S36 | 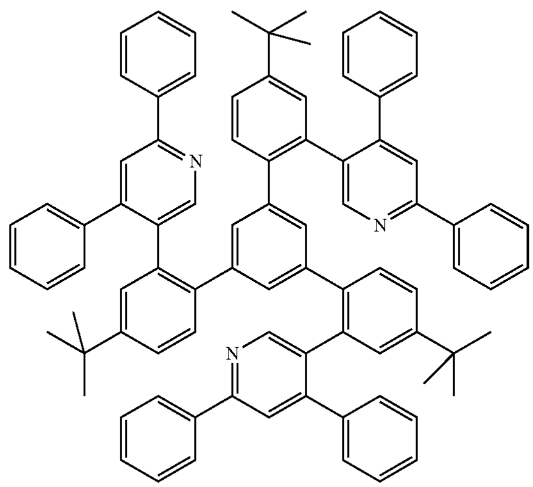<br>C | 55% |
| L28 | S47<br>S22 | 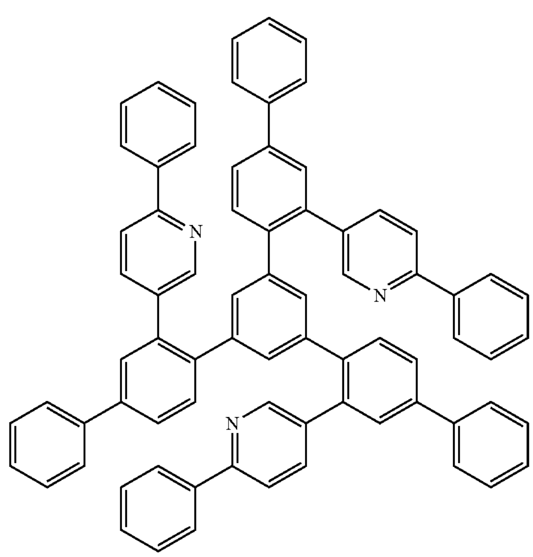<br>B | 62% |

-continued
| Ex. | Bromide Boronic acid/ ester/ tetrafluoro-borate | Product Variant | Yield |
| --- | --- | --- | --- |
| L29 | S47<br>S33 | 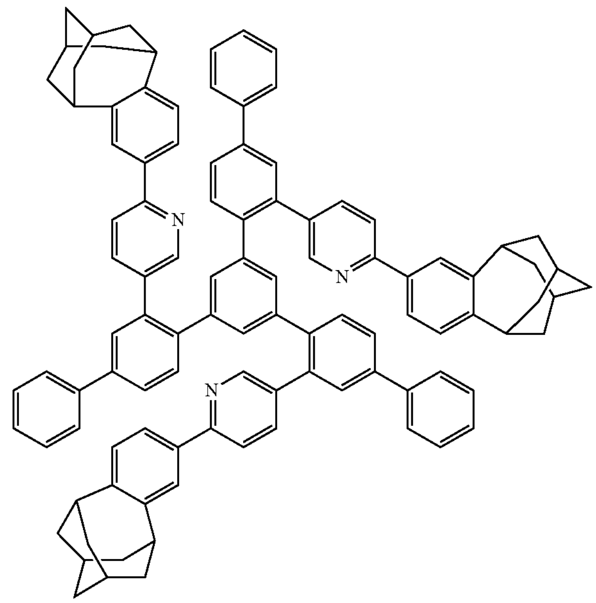<br>A | 49% |
| L30 | S48<br>S22 | 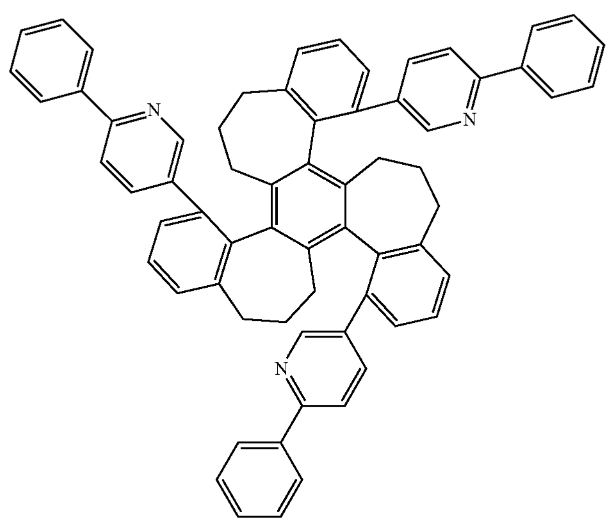<br>A | 38% |

-continued
| Ex. | Bromide Boronic acid/ ester/ tetrafluoro-borate | Product Variant | Yield |
|---|---|---|---|
| L31 | S49 S28 | 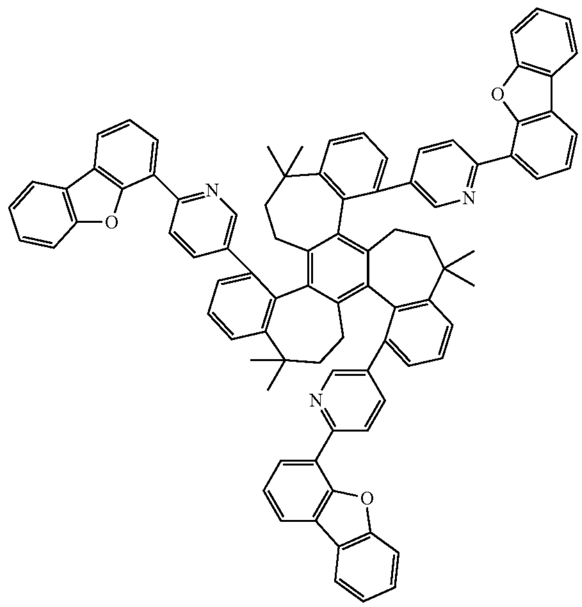 C | 40% |
| L32 | S51 S24 | 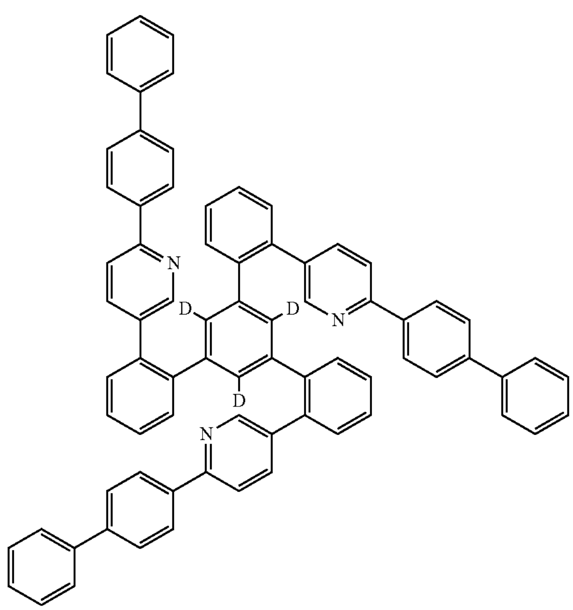 A | 69% |

-continued
| Ex. | Bromide Boronic acid/ ester/ tetrafluoro-borate | Product Variant | Yield |
|---|---|---|---|
| L33 | S52<br>S34 | 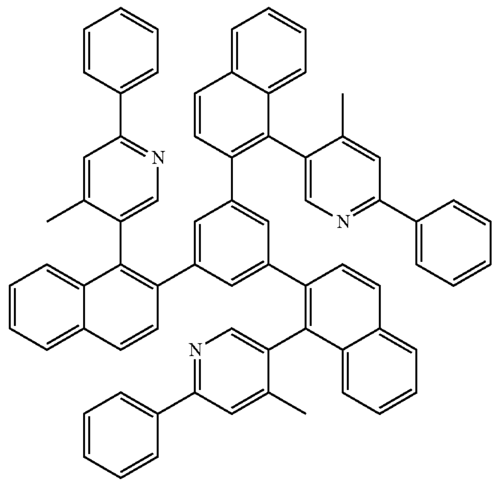<br>C | 53% |
| L34 | S53<br>S21 | 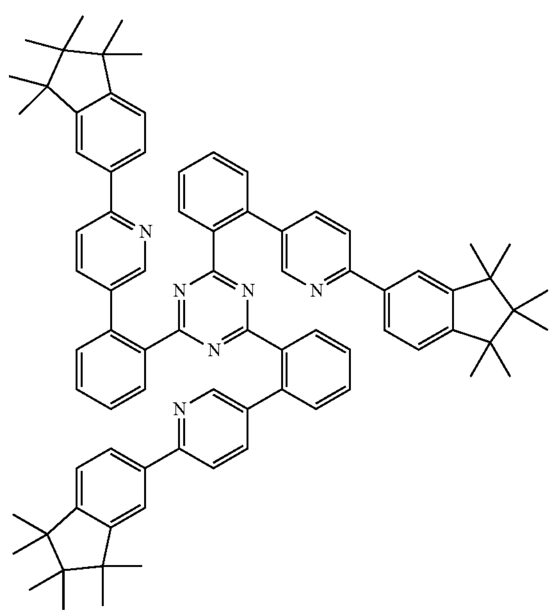<br>A | 64% |

-continued
| Ex. | Bromide Boronic acid/ ester/ tetrafluoro-borate | Product Variant | Yield |
|---|---|---|---|
| L35 syn + anti | S7 S22 | 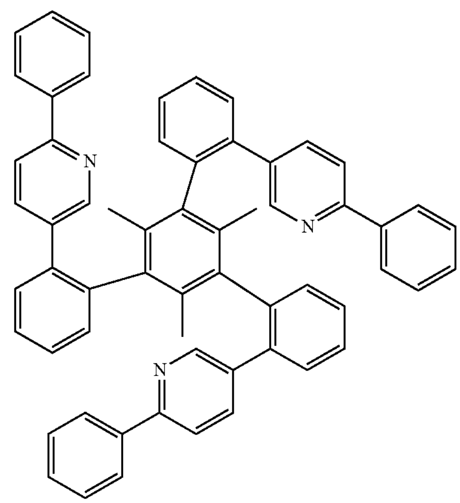 A | 46% |
| L36 syn + anti | S7 S34 | 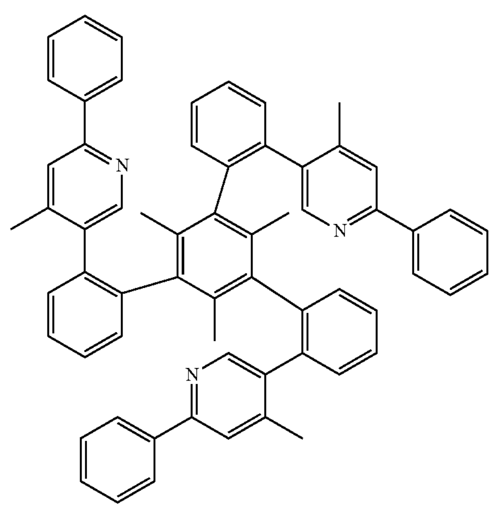 C | 39% |

-continued
| Ex. | Bromide Boronic acid/ ester/ tetrafluoro- borate | Product Variant | Yield |
|---|---|---|---|
| L37 | S50<br>S54 | 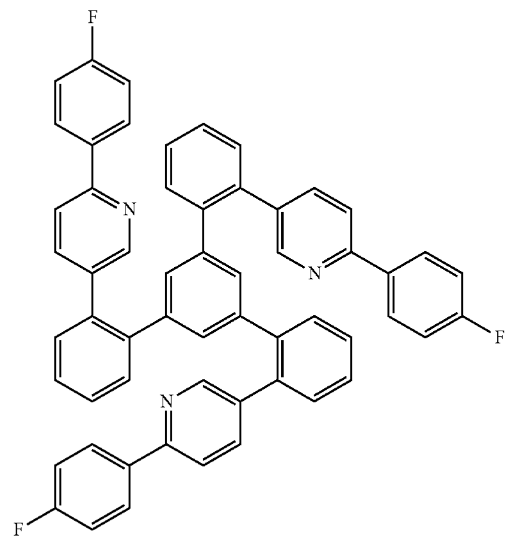<br>B | 71% |
| L38 | S50<br>S55 | 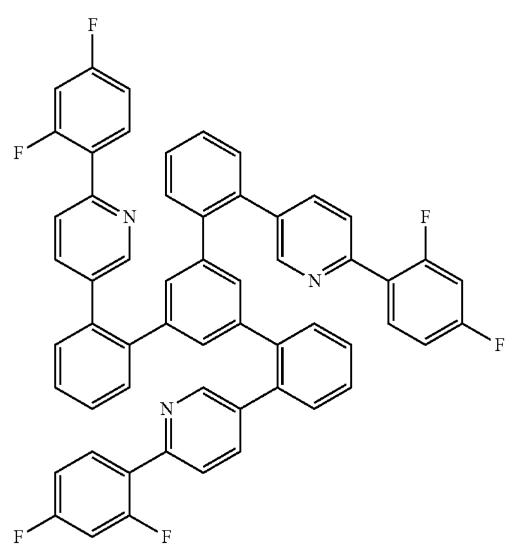<br>B | 62% |

-continued
| Ex. | Bromide Boronic acid/ ester/ tetrafluoro-borate | Product Variant | Yield |
|---|---|---|---|
| L63 | S50<br>S57 | 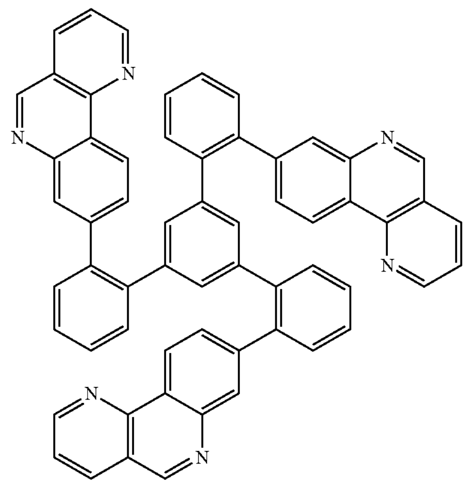<br>B | 57% |
| L63 | S50<br>S58 | 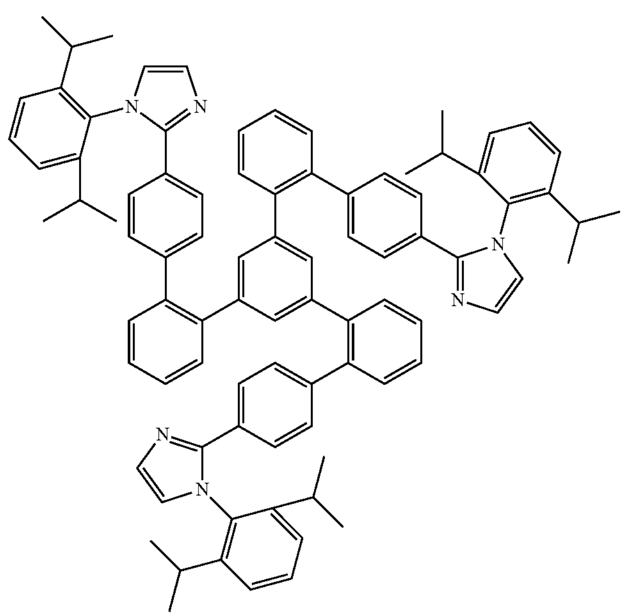<br>B | 49% |

-continued
| Ex. | Bromide Boronic acid/ ester/ tetrafluoro- borate | Product Variant | Yield |
|---|---|---|---|
| L72 | S50 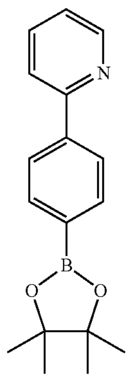 [908350-80-1] | 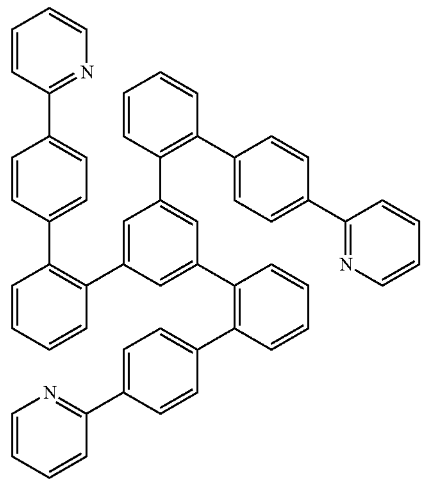 B | 58% |
| L74 | S50 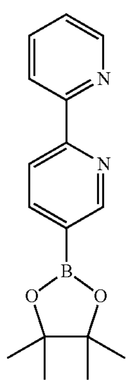 [562098-24-2] | 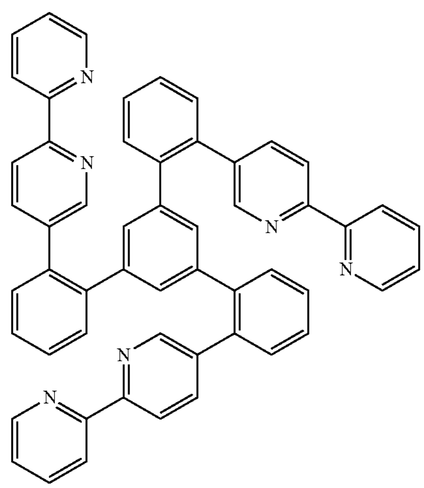 C | 28% |
| L76 | S50 S62 | 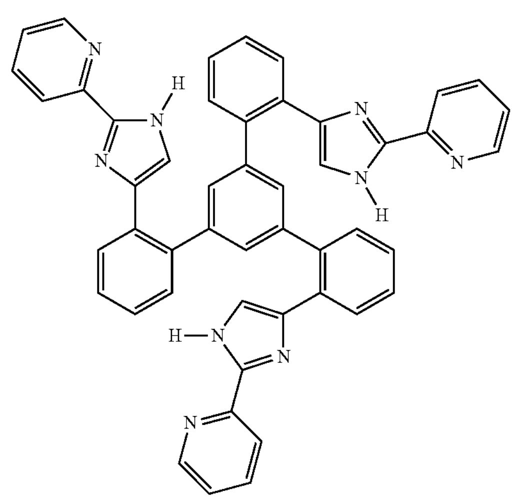 B | 34% |

-continued
| Ex. | Bromide Boronic acid/ ester/ tetrafluoro-borate | Product Variant | Yield |
|---|---|---|---|
| L91 | S50<br>S97 | 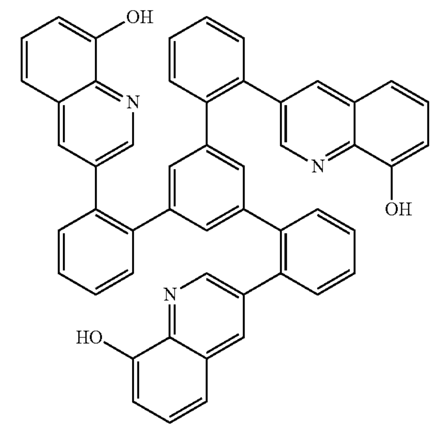<br>B | 38% |
| L92 | S50<br>S98 | 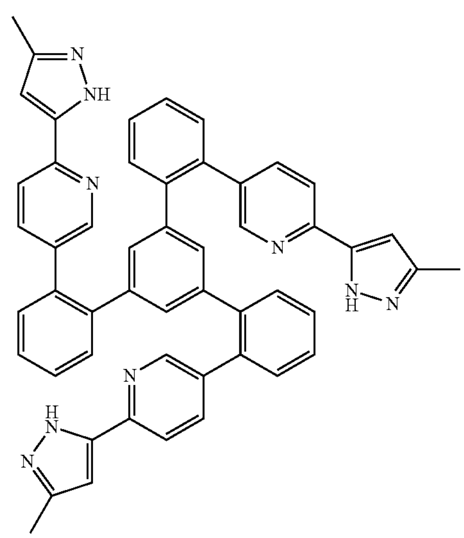<br>A | 41% |

-continued
| Ex. | Bromide Boronic acid/ ester/ tetrafluoro-borate | Product Variant | Yield |
|---|---|---|---|
| L93 | S50<br>S99 | 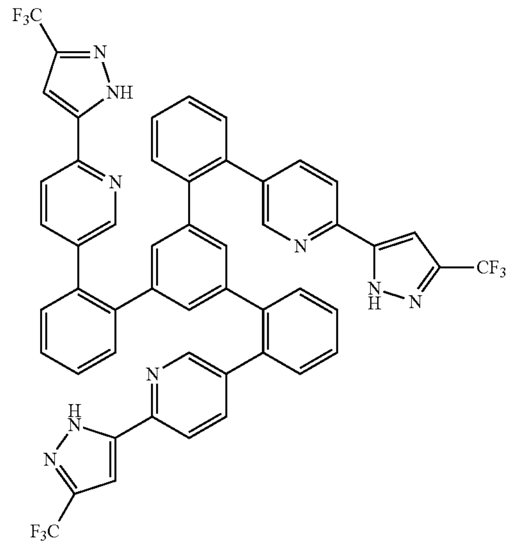<br>A | 37% |
| L94 | S50<br>S100 | 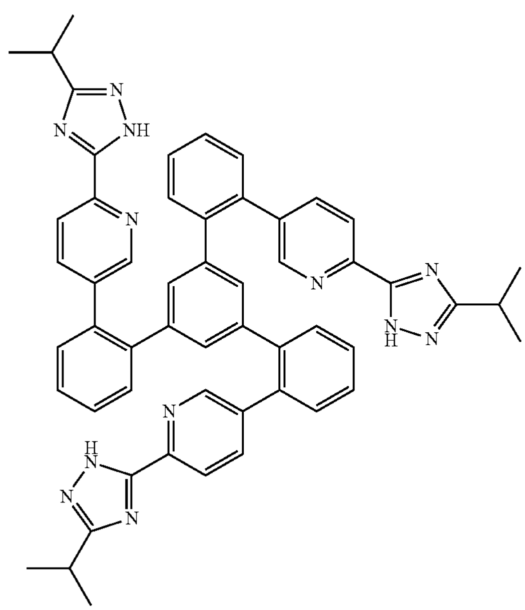<br>A | 34% |

-continued
| Ex. | Bromide Boronic acid/ ester/ tetrafluoro- borate | Product Variant | Yield |
|---|---|---|---|
| L95 | S101<br>S22 | 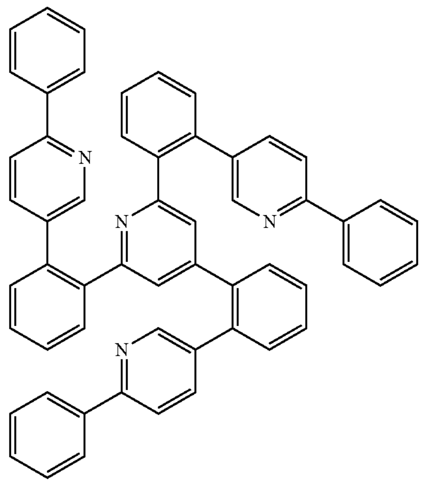<br>B | 50% |
| L96 | S50<br>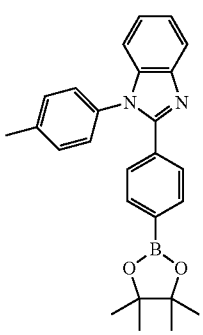<br>[1397275-52-3] | 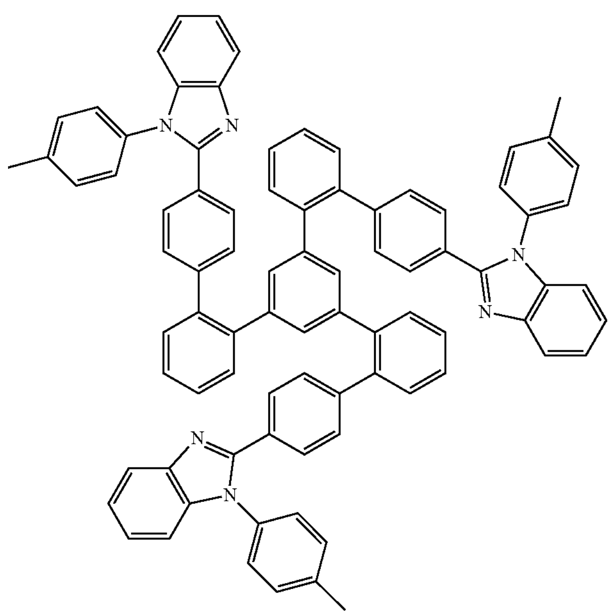<br>B | 56% |

-continued
| Ex. | Bromide Boronic acid/ ester/ tetrafluoro-borate | Product Variant | Yield |
|---|---|---|---|
| L97 | S50 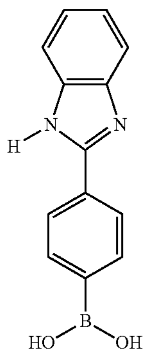 [1191061-89-8] | 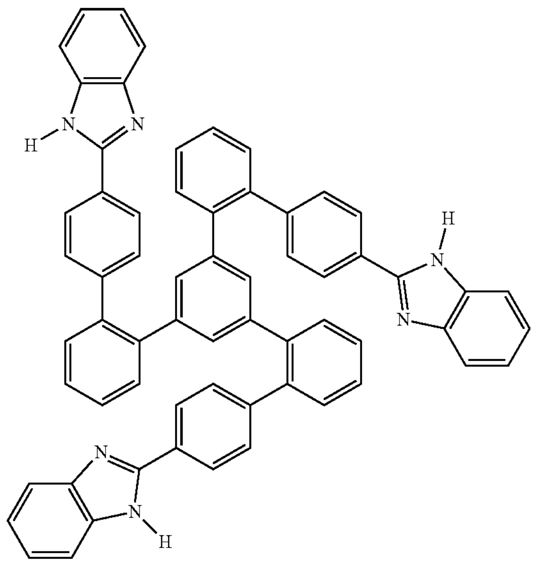 A | 48% |
| L98 | S50 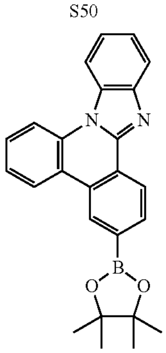 [1228267-13-7] | 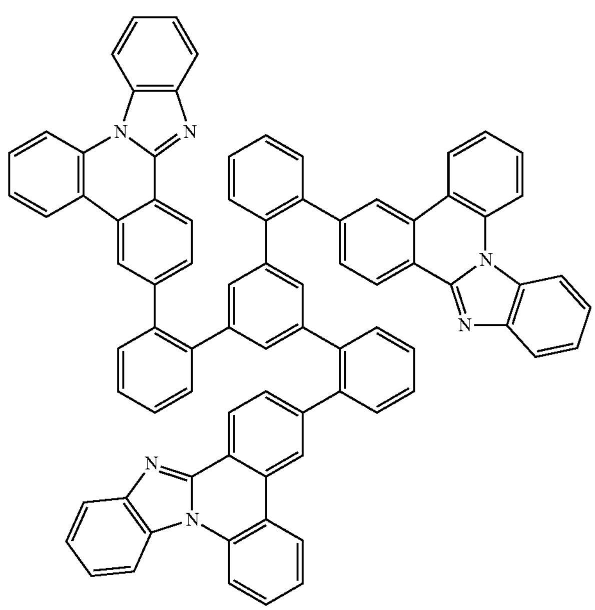 B | 66% |

-continued
| Ex. | Bromide Boronic acid/ ester/ tetrafluoro- borate | Product Variant | Yield |
| --- | --- | --- | --- |
| L99 | S50 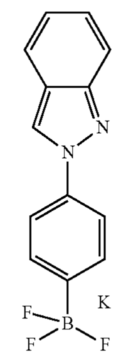 [1432475-28-9] | 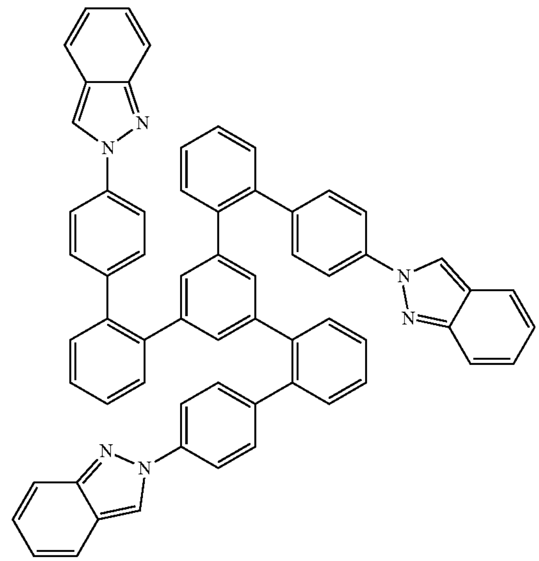 B | 34% |
| L100 | S50 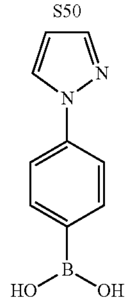 [891270-35-2] | 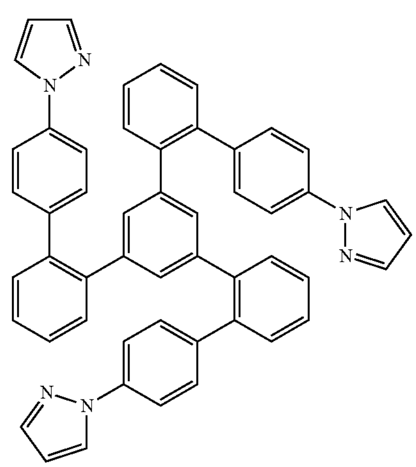 B | 37% |

-continued
| Ex. | Bromide Boronic acid/ ester/ tetrafluoro- borate | Product Variant | Yield |
|---|---|---|---|
| L101 | S50 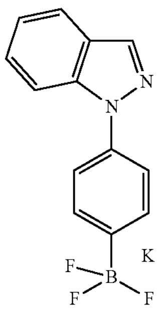 [1432475-27-8] | 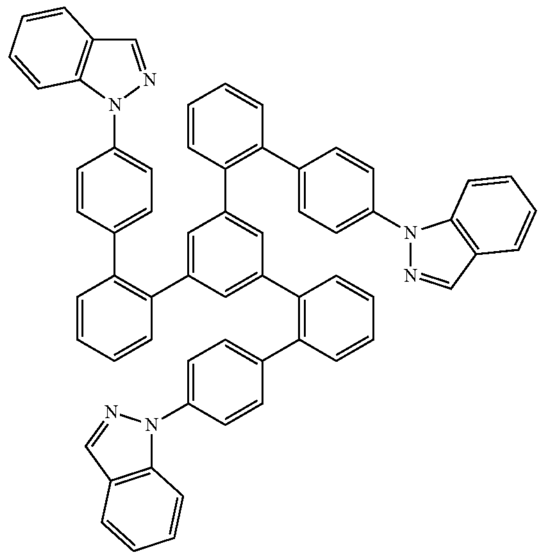 B | 46% |
| L102 | S50 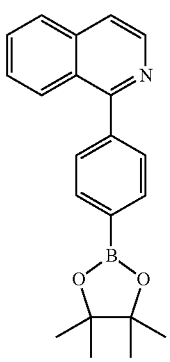 [1116082-29-1] | 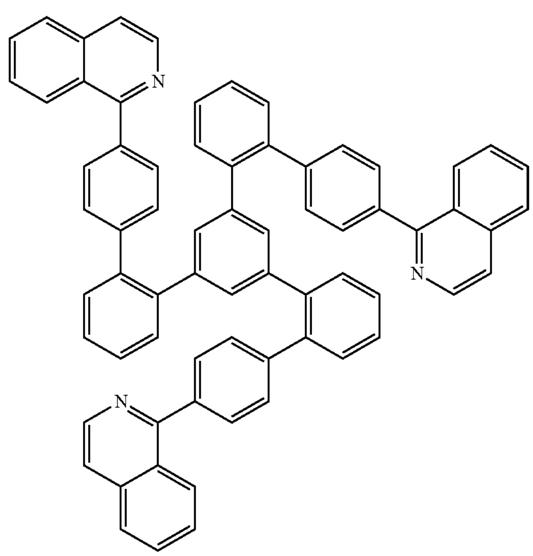 A | 54% |

-continued
| Ex. | Bromide Boronic acid/ ester/ tetrafluoro-borate | Product Variant | Yield |
|---|---|---|---|
| L103 | S50 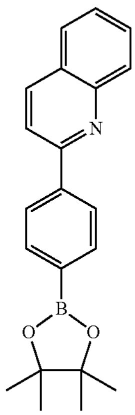 [1383803-71-1] | 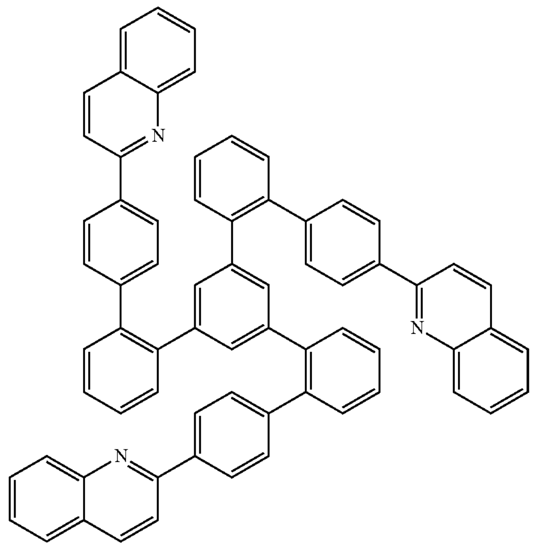 A | 58% |
| L104 | S50 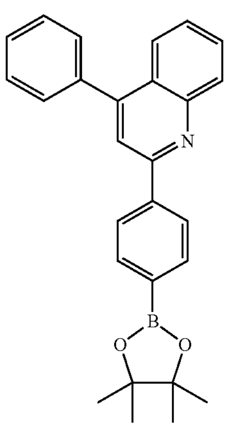 [1204238-11-8] | 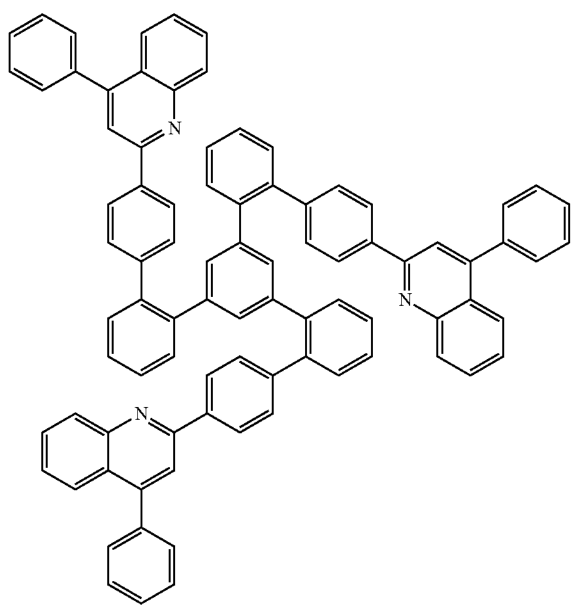 A | 50% |

-continued
| Ex. | Bromide Boronic acid/ ester/ tetrafluoro-borate | Product Variant | Yield |
|---|---|---|---|
| L105 | S102 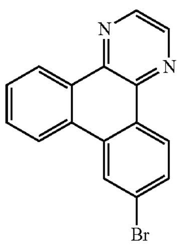 [1182724-82-8] | 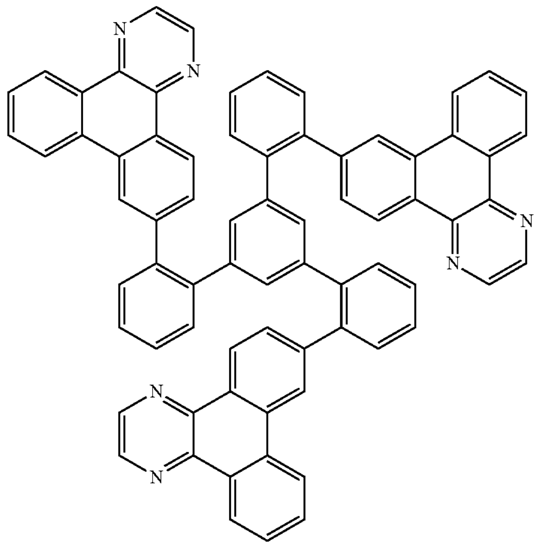 B | 63% |
| L106 | S102 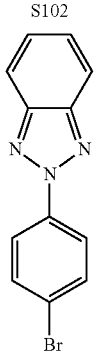 [3682-79-9] | 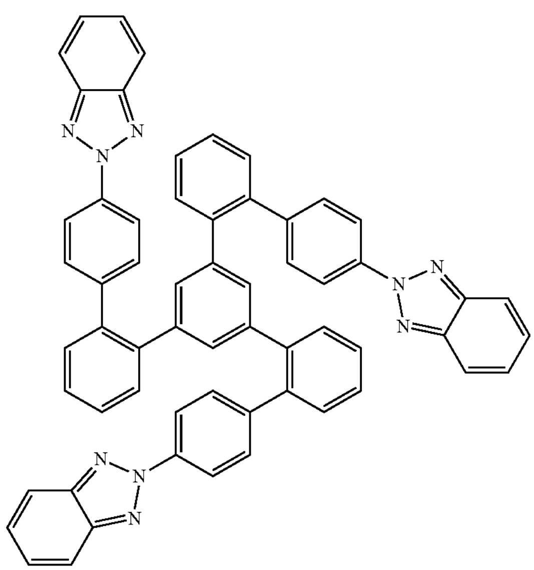 B | 55% |

-continued
| Ex. | Bromide Boronic acid/ ester/ tetrafluoro-borate | Product Variant | Yield |
|---|---|---|---|
| L107 | S102 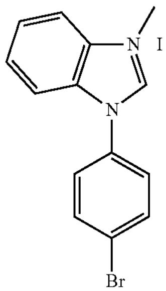 [1402749-00-1] | 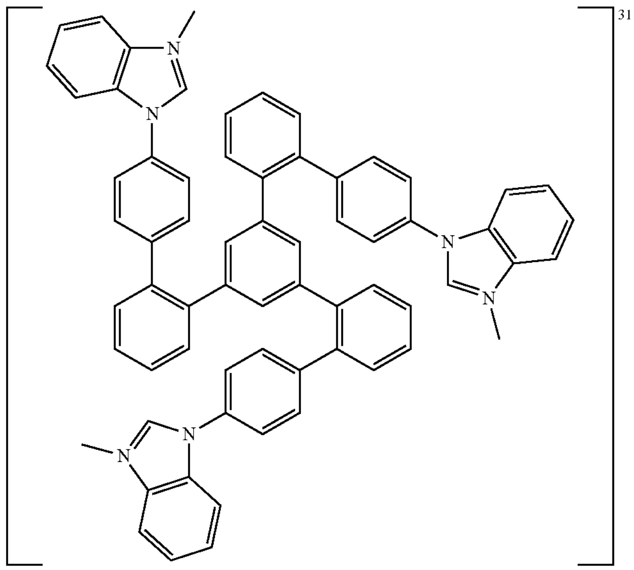 A Use of $NaHCO_3$ rather than $Na_2CO_3$ | 30% |
| L108 | S102 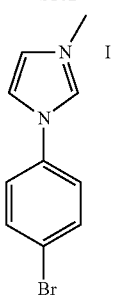 [1265899-48-6] | 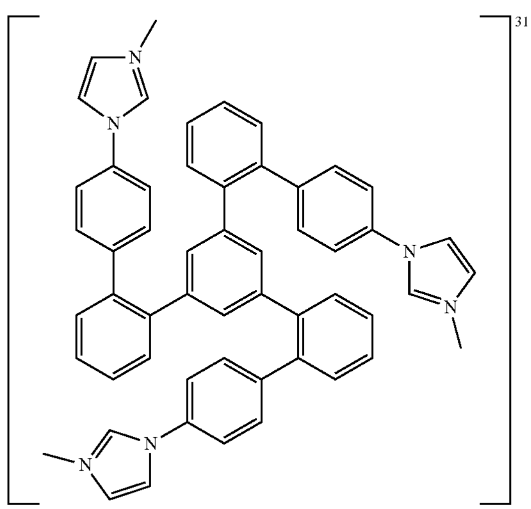 A Use of $NaHCO_3$ rather than $Na_2CO_3$ D | 28% 48% |

-continued
| Ex. | Bromide Boronic acid/ ester/ tetrafluoro- borate | Product Variant | Yield |
|---|---|---|---|
| L109 | S102 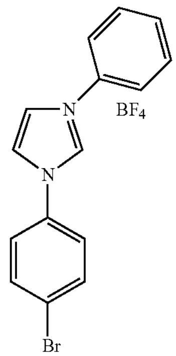 Br [1434057-17-6] | 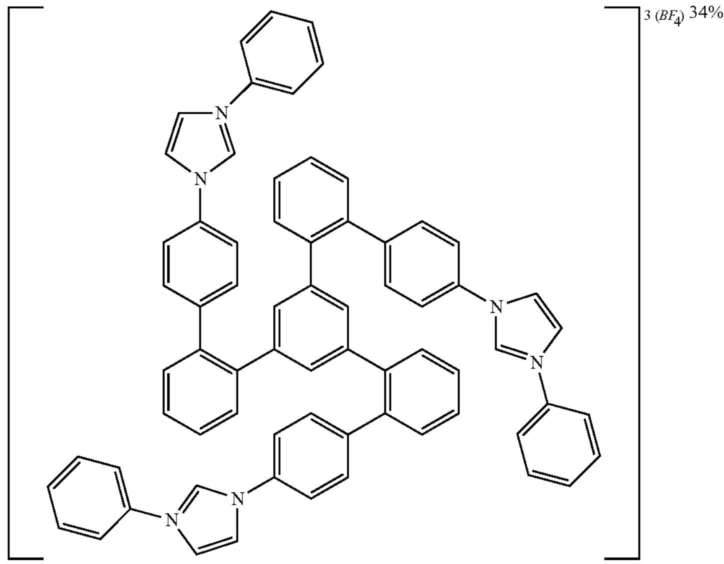 3 $(BF_4)$ A Use of $NaHCO_3$ rather than $Na_2CO_3$ | 34% |
| L111 | S50 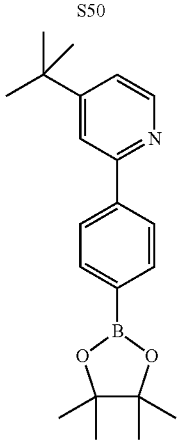 S103 | 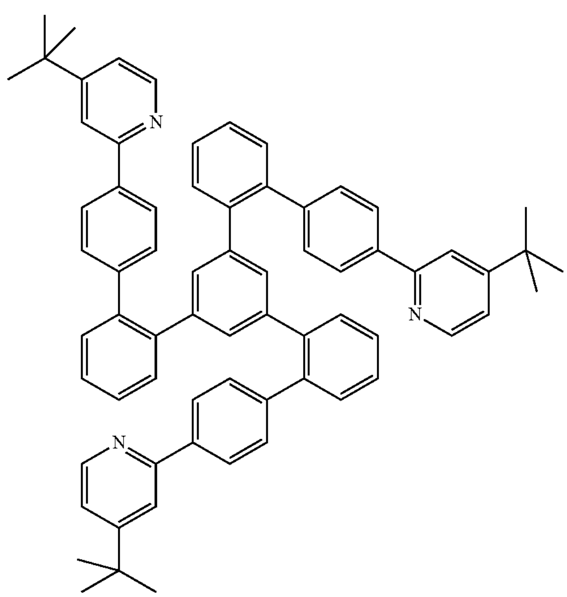 B | 56% |

-continued
| Ex. | Bromide Boronic acid/ ester/ tetrafluoro-borate | Product Variant | Yield |
|---|---|---|---|
| L112 | S50 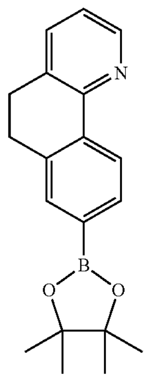 S105 | 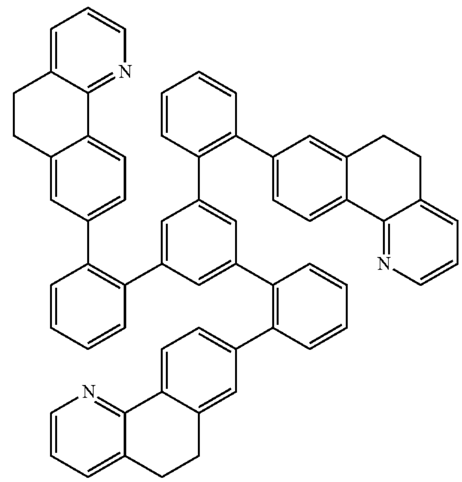 B | 64% |
| L113 | S50 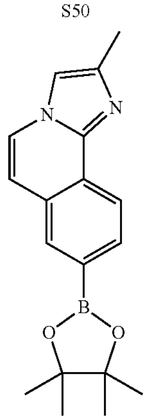 S106 | 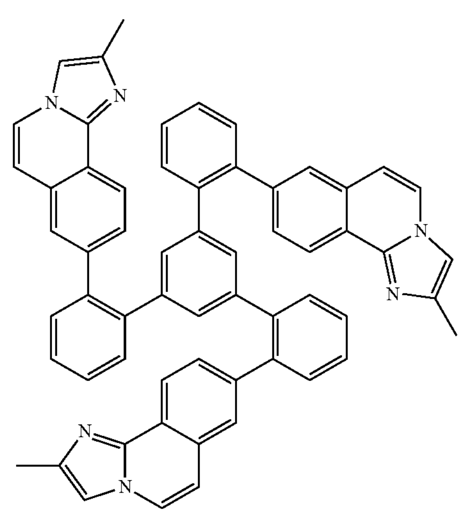 B | 51% |

-continued
| Ex. | Bromide Boronic acid/ ester/ tetrafluoro-borate | Product Variant | Yield |
|---|---|---|---|
| L114 | S50 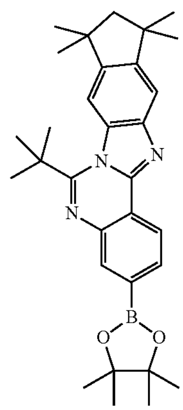 S107 | 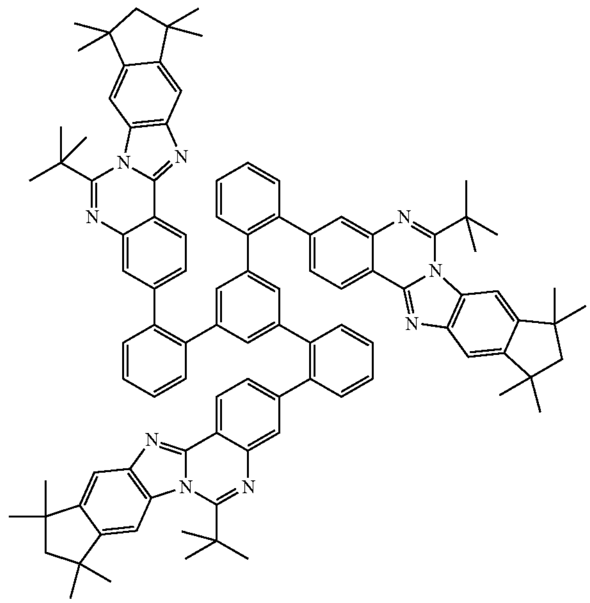 C | 68% |
| L116 | S50 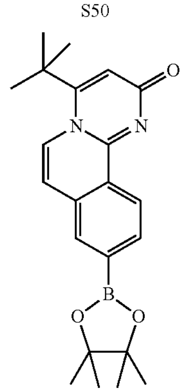 S620 | 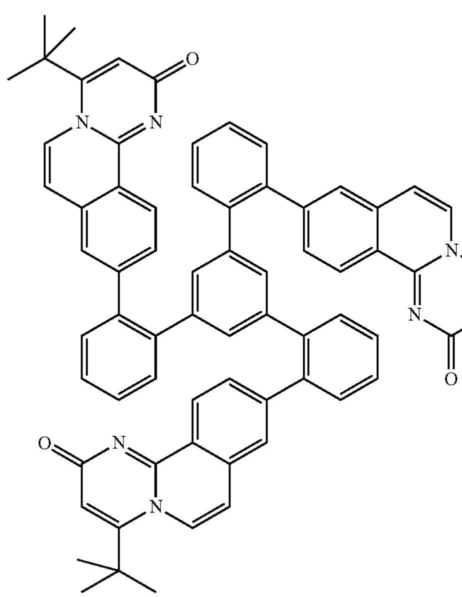 C | 57% |

-continued
| Ex. | Bromide Boronic acid/ ester/ tetrafluoro- borate | Product Variant | Yield |
|---|---|---|---|
| L117 | S50 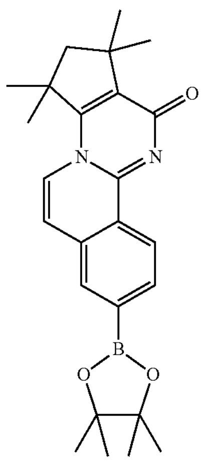 S621 | 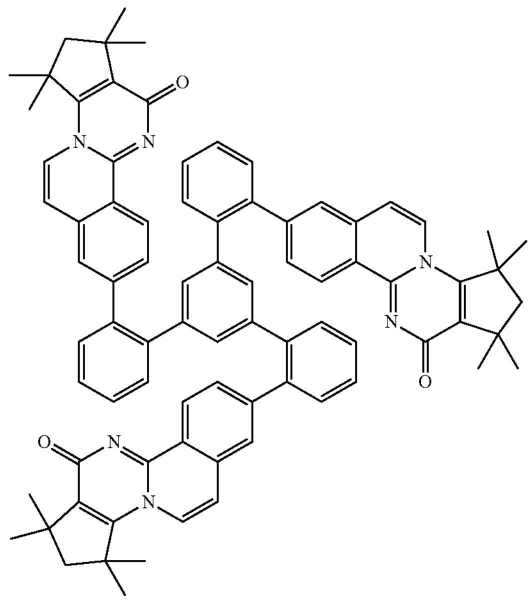 C | 64% |
| L118 | S50 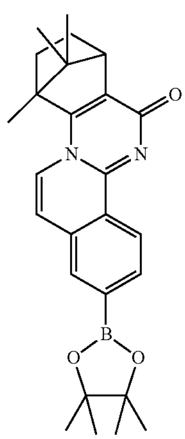 S622 | 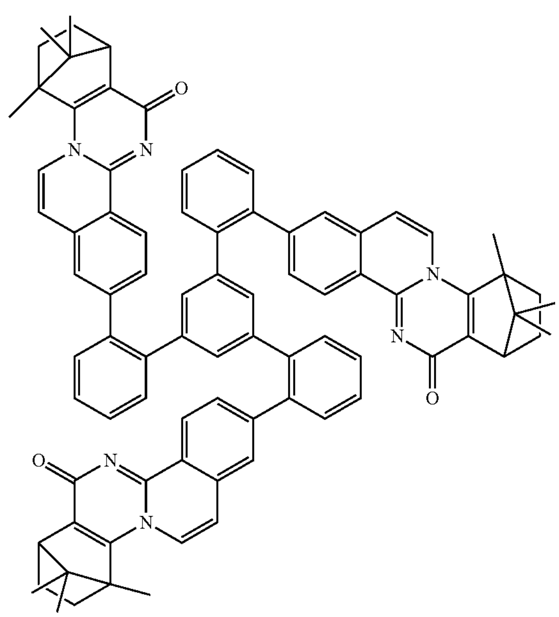 C | 62% |

-continued
| Ex. | Bromide Boronic acid/ ester/ tetrafluoro-borate | Product Variant | Yield |
| --- | --- | --- | --- |
| L119 | S50 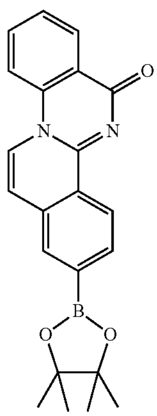 S623 | 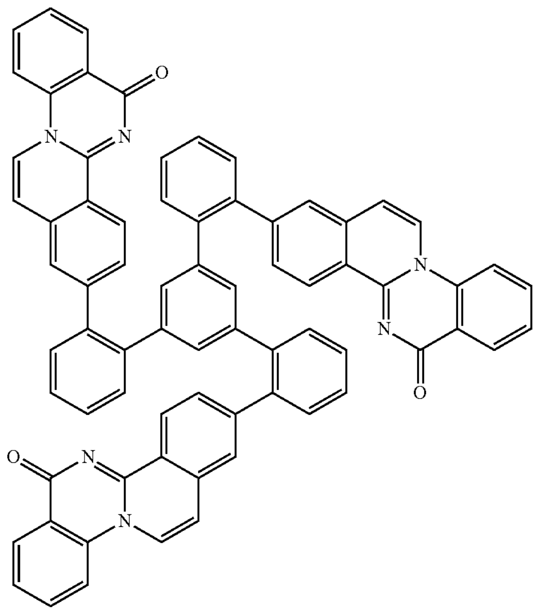 B | 68% |
| L120 | S50 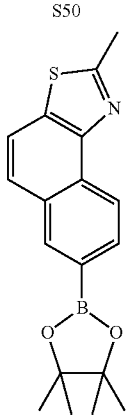 S624 | 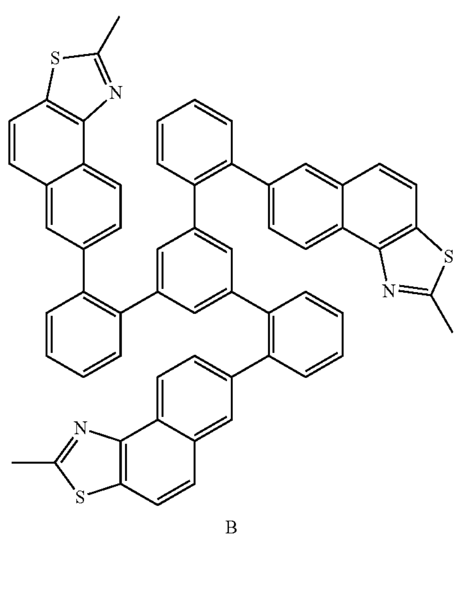 B | 70% |

-continued
| Ex. | Bromide Boronic acid/ ester/ tetrafluoro-borate | Product Variant | Yield |
|---|---|---|---|
| L121 | S50 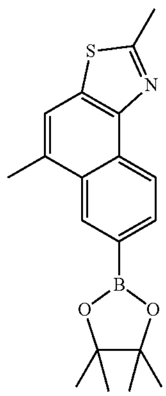 S625 | 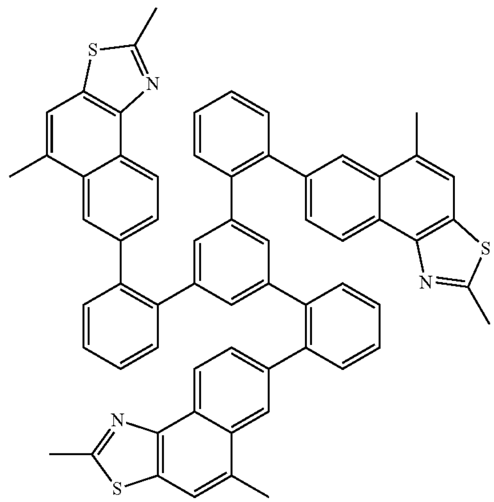 B | 72% |
| L122 | S50 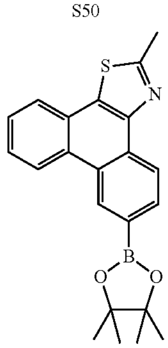 S626 | 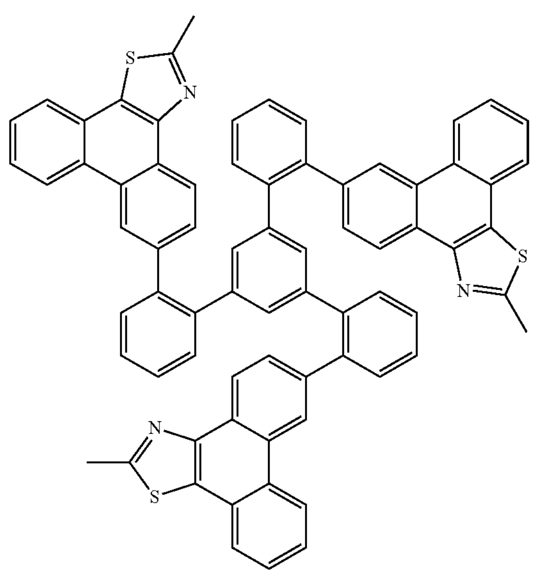 B | 84% |

-continued
| Ex. | Bromide Boronic acid/ ester/ tetrafluoro-borate | Product Variant | Yield |
|---|---|---|---|
| L123 | S50 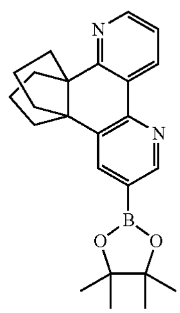 S627 | 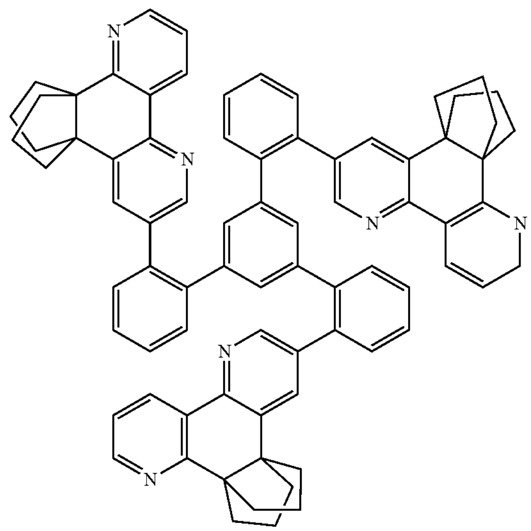 C | 67% |
| L124 | S50 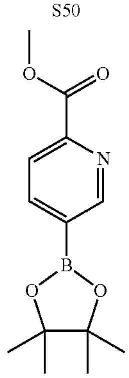 1072945-86-8 | 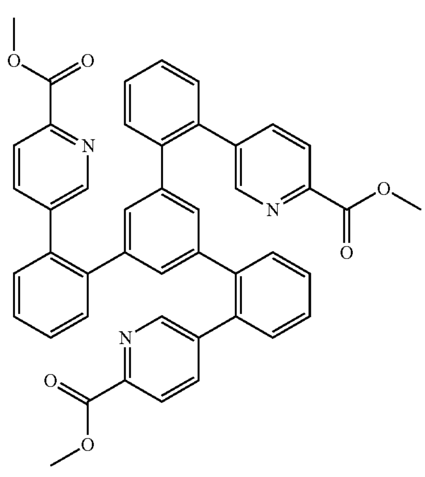 Cat.: 2 mmol $Pd(Ac)_2$/6 mmol $PPh_3$, base: $NaHCO_3$ | 51% |

-continued
| Ex. | Bromide Boronic acid/ ester/ tetrafluoro- borate | Product Variant | Yield |
|---|---|---|---|
| L125 | S50 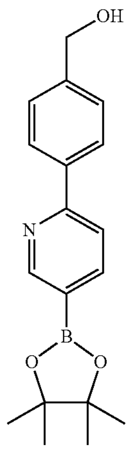 S127 | 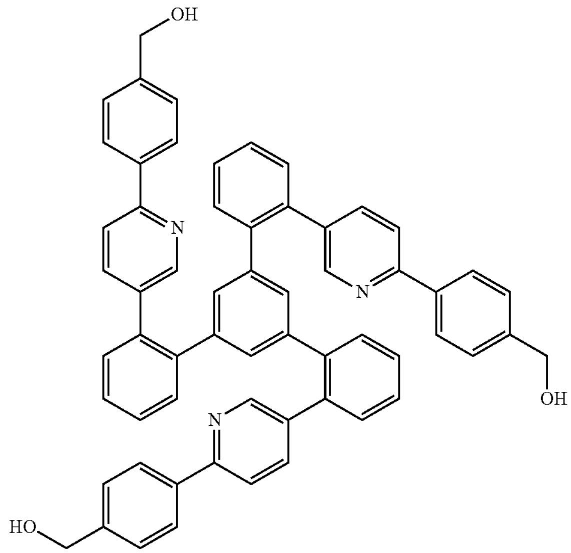 B | 68% |
| L126 | S50 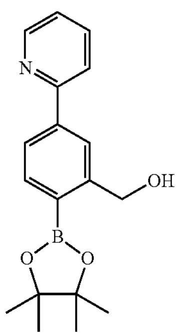 S128 | 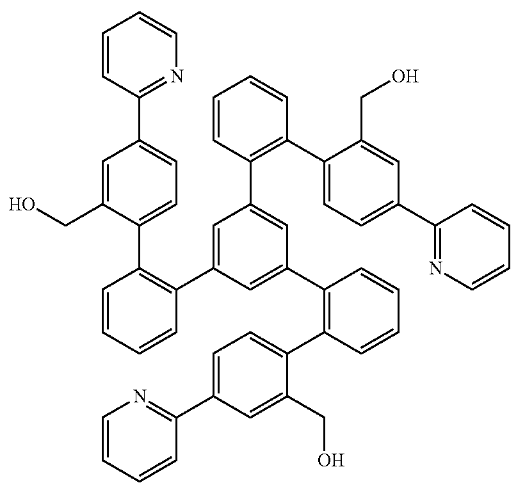 B | 62% |
| L127 | S50 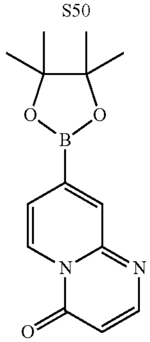 S129 | 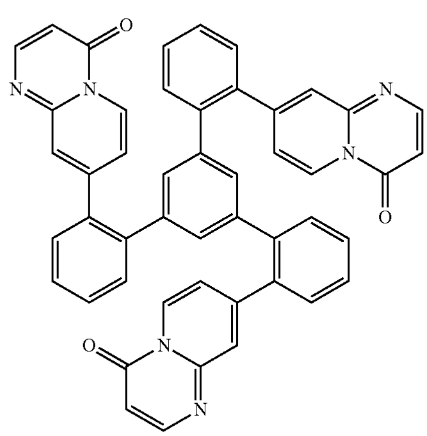 B | 71% |

-continued
| Ex. | Bromide Boronic acid/ ester/ tetrafluoro- borate | Product Variant | Yield |
|---|---|---|---|
| L128 | S50 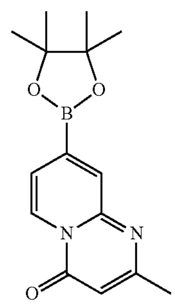 S130 | 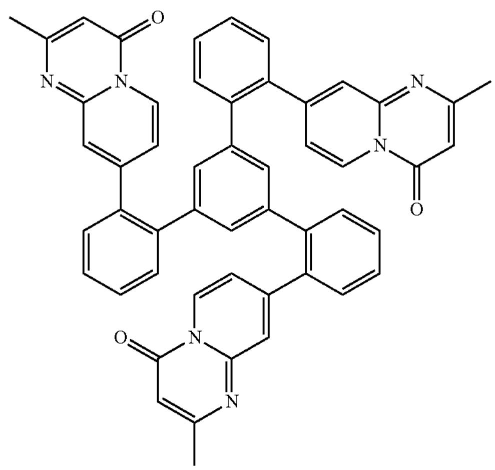 B | 70% |
| L129 | S50 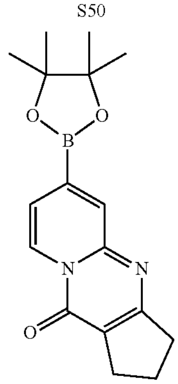 S131 | 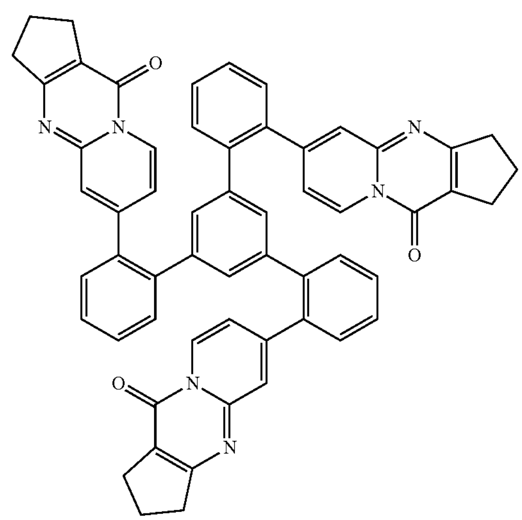 B | 66% |

-continued
| Ex. | Bromide Boronic acid/ ester/ tetrafluoro-borate | Product Variant | Yield |
|---|---|---|---|
| L130 | S50 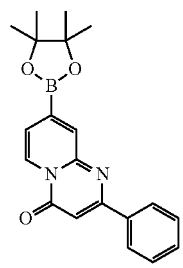 S132 | 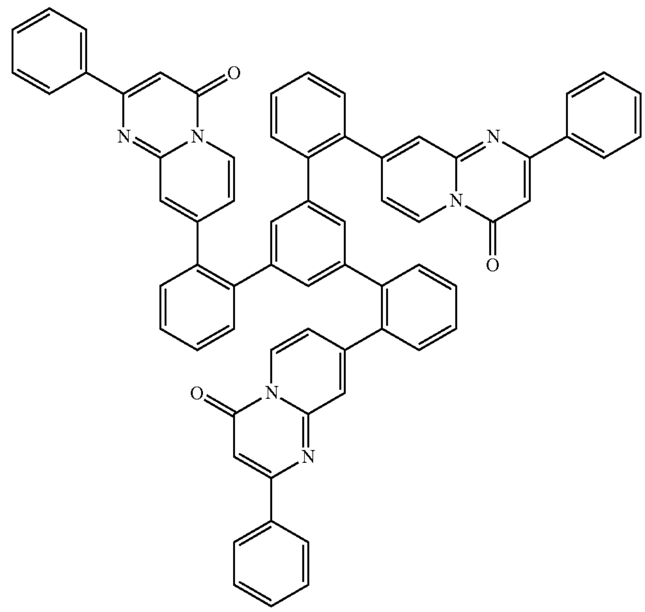 B | 75% |
| L131 | S50 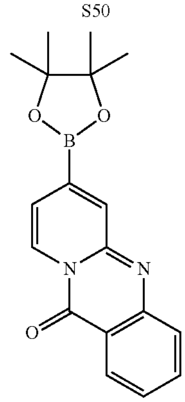 S133 | 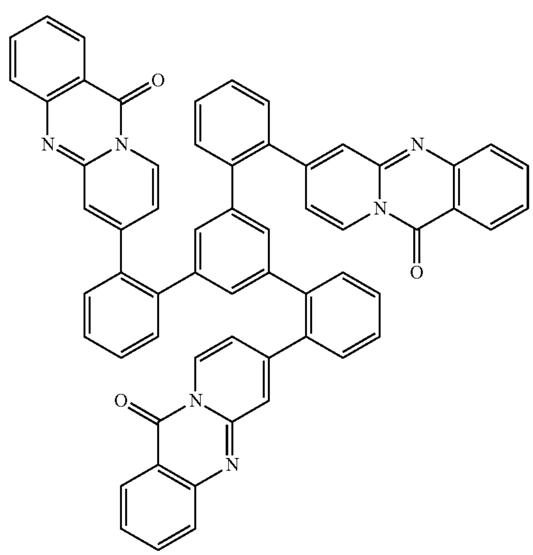 B | 81% |

-continued
| Ex. | Bromide Boronic acid/ ester/ tetrafluoro-borate | Product Variant | Yield |
|---|---|---|---|
| L132 | S50 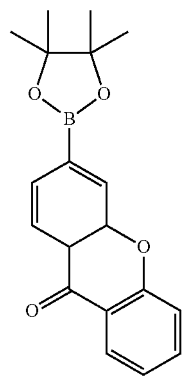 S136 | 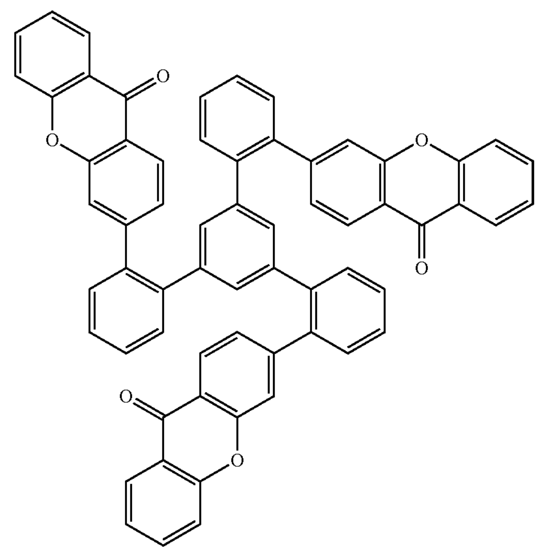 B | 80% |
| L133 | S50 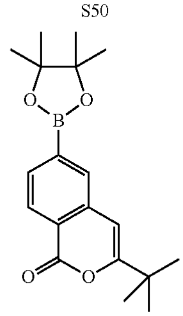 S137 | 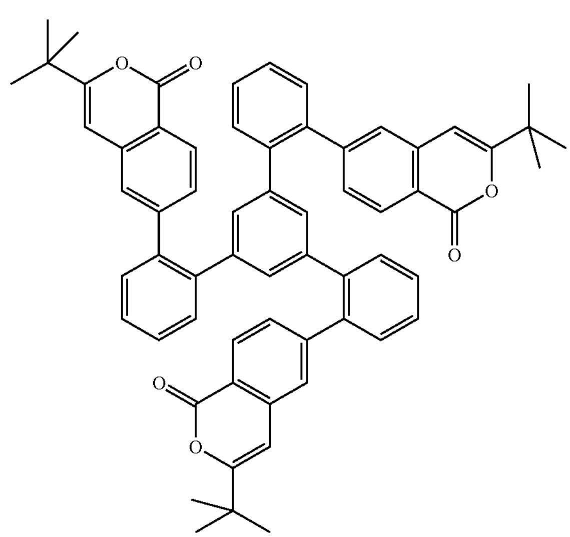 B | 58% |

-continued
| Ex. | Bromide Boronic acid/ ester/ tetrafluoro-borate | Product Variant | Yield |
| --- | --- | --- | --- |
| L134 | S50 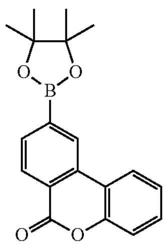 S138 | 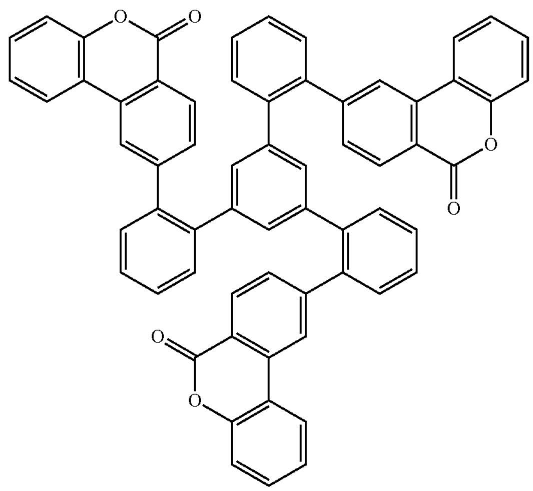 B | 79% |
| L135 | S50 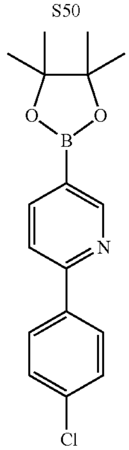 S1001 | 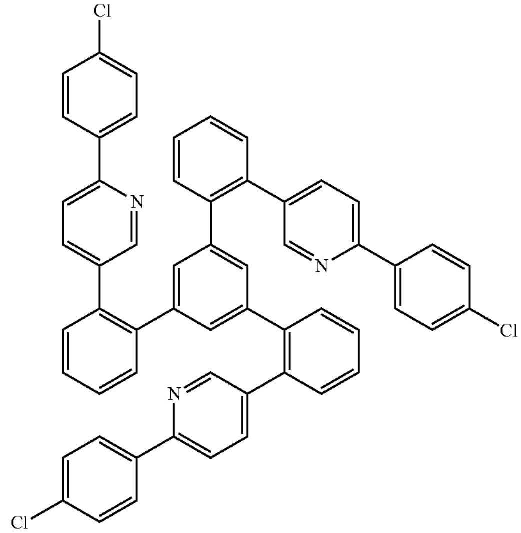 B | 68% |

-continued
| Ex. | Bromide Boronic acid/ ester/ tetrafluoro-borate | Product Variant | Yield |
|---|---|---|---|
| L136 | S50 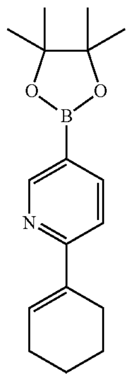 S144 | 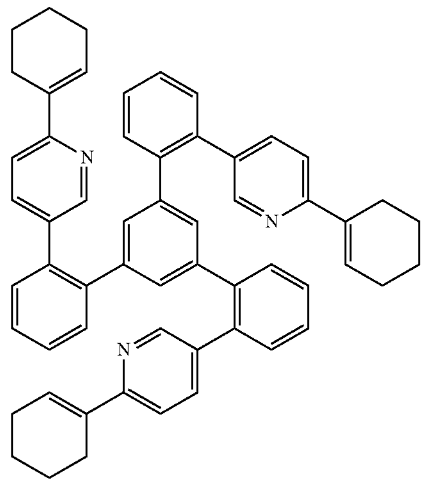 B | 58% |
| L137 | S50 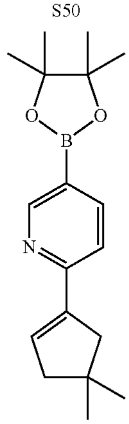 S145 | 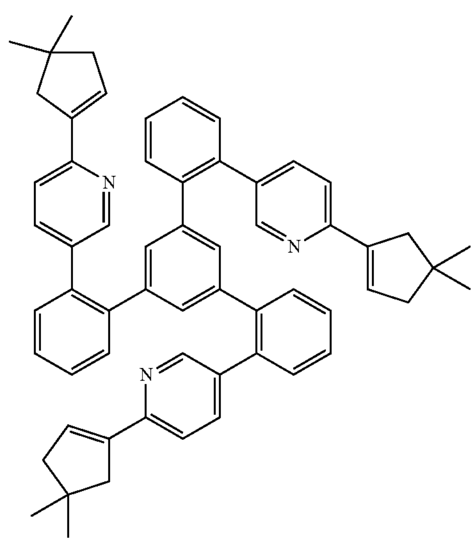 A | 61% |

-continued
| Ex. | Bromide Boronic acid/ ester/ tetrafluoro-borate | Product Variant | Yield |
|---|---|---|---|
| L138 | S50 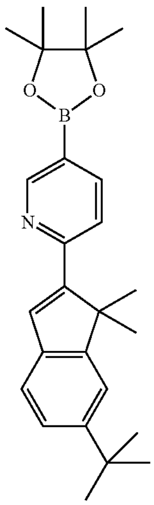 S146 | 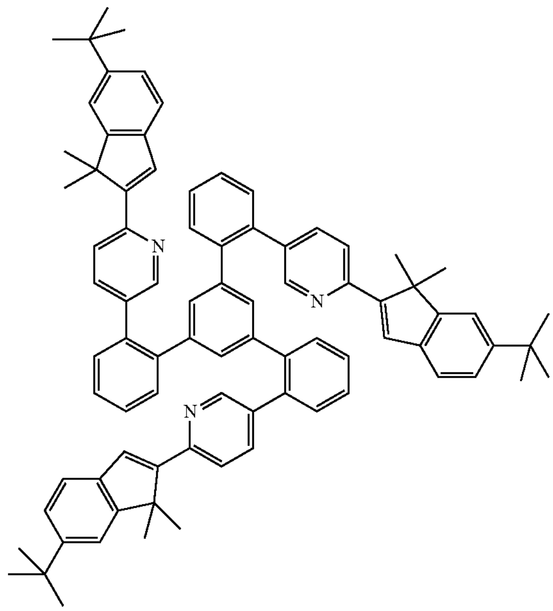 B | 70% |
| L139 | S50 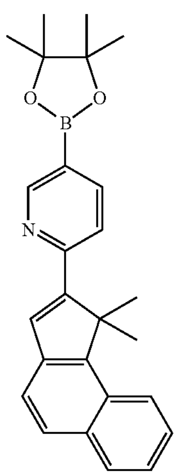 S147 | 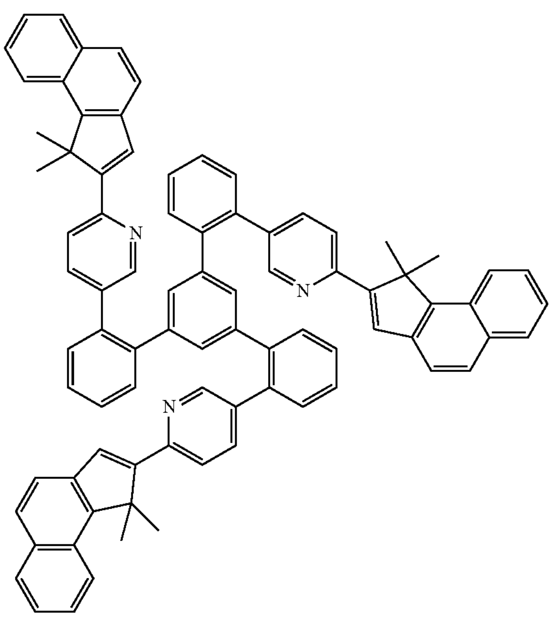 B | 69% |

-continued
| Ex. | Bromide Boronic acid/ ester/ tetrafluoro-borate | Product Variant | Yield |
| --- | --- | --- | --- |
| L140 | S50 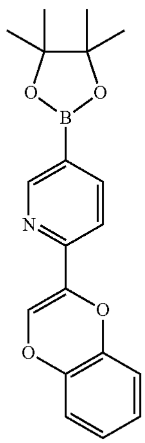 S148 | 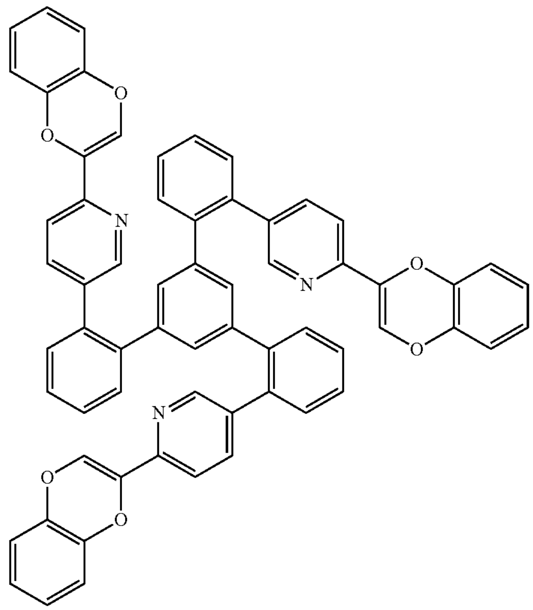 B | 66% |
| L141 | S50 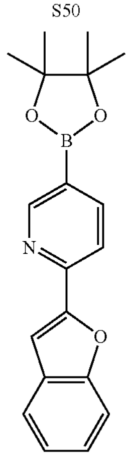 S149 | 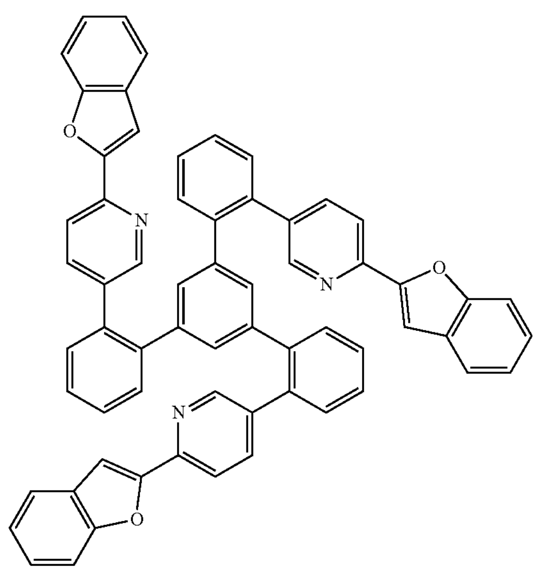 B | 80% |

-continued
| Ex. | Bromide Boronic acid/ ester/ tetrafluoro-borate | Product Variant | Yield |
|---|---|---|---|
| L142 | S50 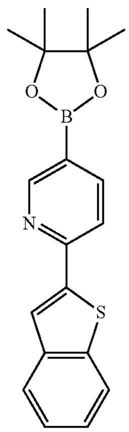 S150 | 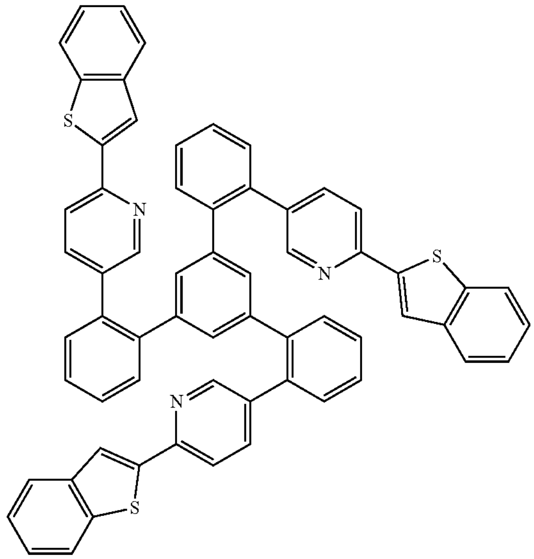 B | 77% |
| L143 | S50 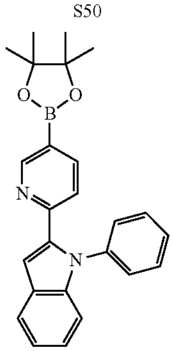 S151 | 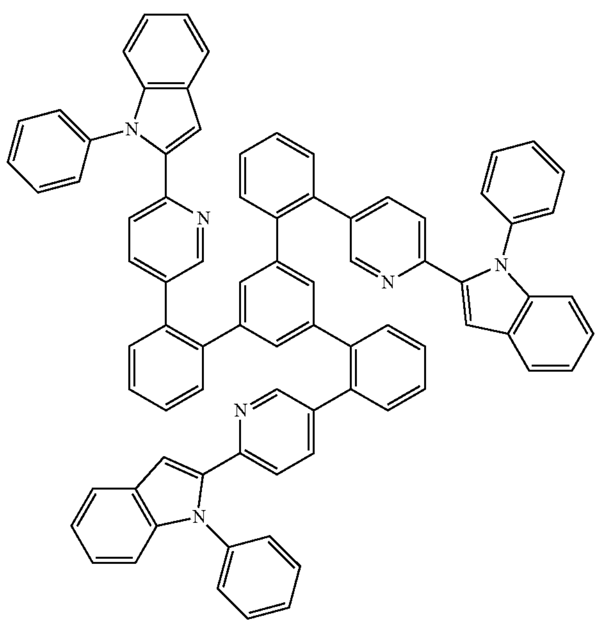 B | 54% |

-continued
| Ex. | Bromide Boronic acid/ ester/ tetrafluoro-borate | Product Variant | Yield |
|---|---|---|---|
| L144 | 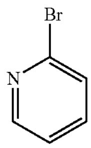 109-04-6 S160 | 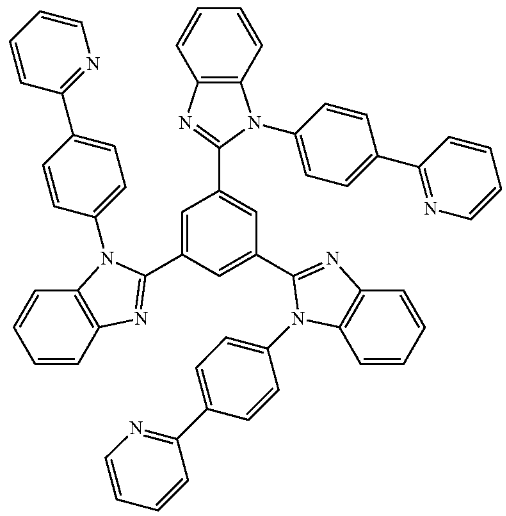 B | 61% |
| L145 | 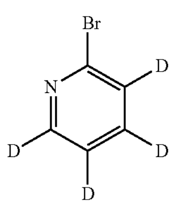 70766-71-1 S160 | 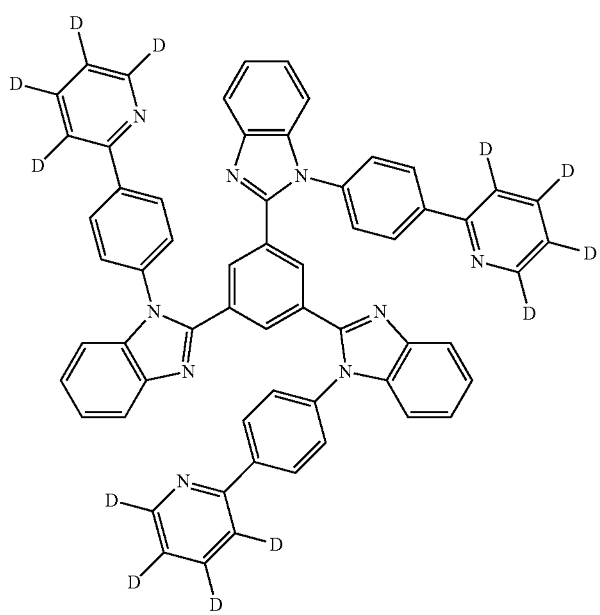 B | 64% |

-continued
| Ex. | Bromide Boronic acid/ ester/ tetrafluoro-borate | Product Variant | Yield |
|---|---|---|---|
| L146 | 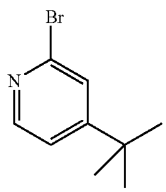 50488-34-1 S160 | 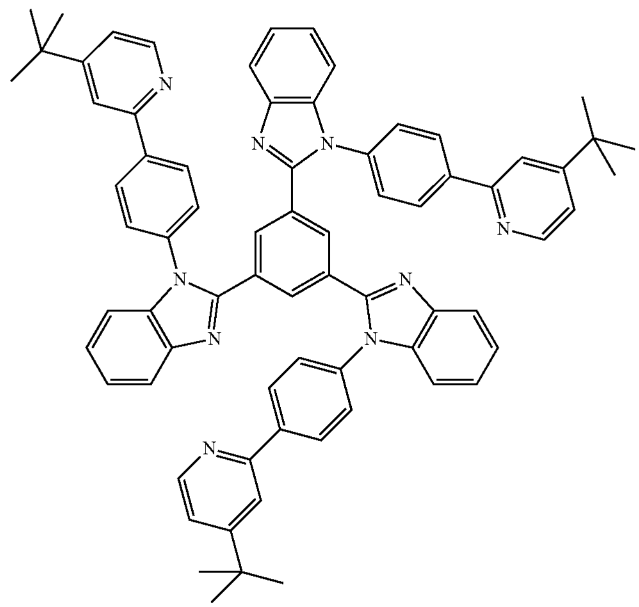 B | 67% |
| L147 | 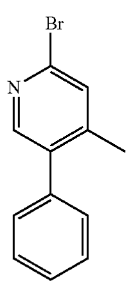 1438809-78-9 S160 | 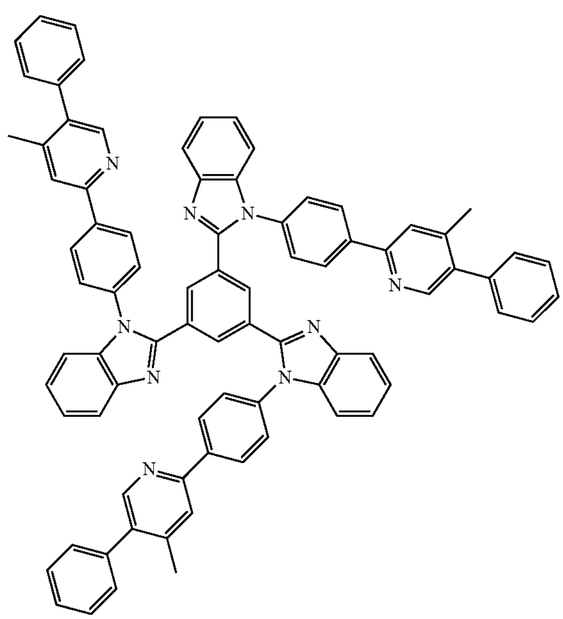 B | 70% |

-continued
| Ex. | Bromide Boronic acid/ ester/ tetrafluoro-borate | Product Variant | Yield |
|---|---|---|---|
| L148 | 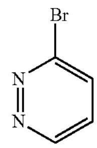 88491-61-6 S160 | 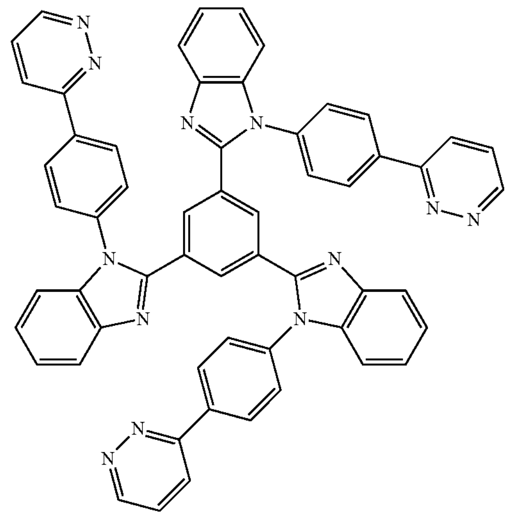 B | |
| L149 | S50 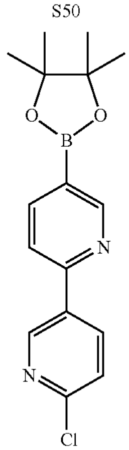 1216756-37-4 | 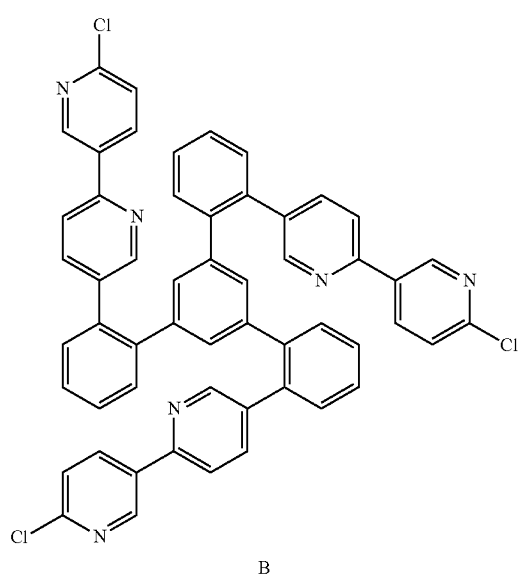 B | 28% |

Example L39

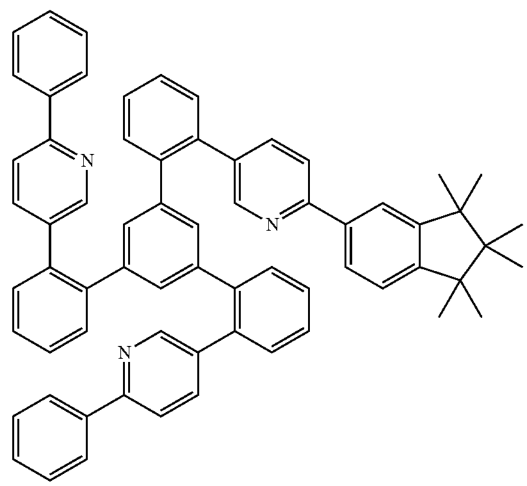 [SMILES: CC1(C)c2ccc(-c3ccc(-c4ccccc4-c4cc(-c5ccccc5-c5ccc(-c6ccccc6)nc5)cc(-c5ccccc5-c5ccc(-c6ccccc6)nc5)c4)cn3)cc2C(C)(C)C1(C)C]

a) L39-Intermediate1

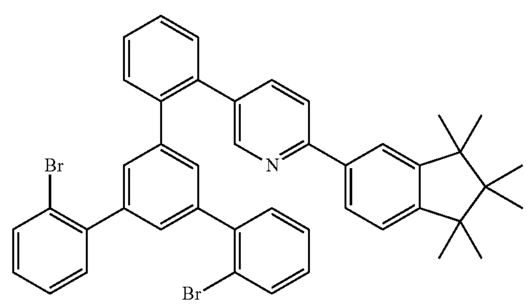 [SMILES: CC1(C)c2ccc(-c3ccc(-c4ccccc4-c4cc(-c5ccccc5Br)cc(-c5ccccc5Br)c4)cn3)cc2C(C)(C)C1(C)C]

A mixture of 54.1 g (100 mmol) of 1,3,5-tris(2-bromophenyl)benzene, S50, [380626-56-2], 40.5 g (100 mmol) of 2-[1,1,2,2,3,3-hexamethylindan-5-yl]-5-(4,4,5,5-tetramethyl-[1,3,2]dioxaborolan-2-yl)pyridine S21, also referred to hereinafter as boronic ester 1, 31.8 g (300 mmol) of sodium carbonate, 1.2 g (1 mmol) of tetrakis(triphenylphosphino)palladium(0), 300 ml of toluene, 100 ml of ethanol and 200 ml of water is heated under reflux with very good stirring for 24 h. After cooling, the aqueous phase is removed and the organic phase is concentrated to dryness. The brown foam is taken up in 300 ml of ethyl acetate and filtered through a silica gel bed pre-slurried with ethyl acetate (diameter 15 cm, length 20 cm) in order to remove brown components. Subsequently, the foam is chromatographed twice on silica gel (n-heptane:ethyl acetate 5:1). Yield: 25.2 g (34 mmol), 34%. Purity: about 95% by $^1$H NMR.

b) L39

A mixture of 22.3 g (30 mmol) of L39-Intermediate), 22.5 g (80 mmol) of 2-phenyl-5-(4,4,5,5-tetramethyl-[1,3,2]dioxaborolan-2-yl)pyridine, S22, also referred to hereinafter as boronic ester 2, 63.6 g (600 mmol) of sodium carbonate, 3.5 g (3 mmol) of tetrakis(triphenylphosphino)palladium(0), 600 ml of toluene, 200 ml of ethanol and 400 ml of water is heated under reflux with very good stirring for 24 h. After 24 h, 200 ml of 5% by weight aqueous acetylcysteine solution are added, the mixture is stirred under reflux for a further 16 h and allowed to cool, the aqueous phase is removed and the organic phase is concentrated to dryness. The brown foam is taken up in 300 ml of ethyl acetate and filtered through a silica gel bed pre-slurried with ethyl acetate (diameter 15 cm, length 20 cm) in order to remove brown components. After concentrating to 200 ml, the solution is added dropwise to 1000 ml of methanol with very good stirring, in the course of which a beige solid precipitates out. The solids are filtered off with suction, washed twice with 200 ml each time of methanol and dried under reduced pressure. The reprecipitation process is repeated again. Subsequently, the foam is chromatographed twice on silica gel (n-heptane:ethyl acetate 3:1). Yield: 16.0 g (18 mmol), 60%. Purity: about 99.0% by $^1$H NMR.

Remaining secondary components are frequently the disubstitution product and/or the debrominated disubstitution product. The purity is sufficient to be able to use the ligand in the o-metallation reaction. The ligands can be purified further if required by repeated chromatography on silica gel (n-heptane or cyclohexane or toluene in combination with ethyl acetate). Alternatively, it is possible to recrystallize the ligands from ethyl acetate, optionally with addition of MeOH or EtOH. Ligands having a molar mass of less than about 1000-1200 g/mol can be subjected to Kugelrohr sublimation under high vacuum (p about $10^{-5}$ mbar).

In an analogous manner, it is possible to prepare the following compounds:

| Ex. | Bromide boronic acid/ester 1 and 2 | Product | Yield |
|---|---|---|---|
| L40 | S50<br>1 × S22<br>2 × S21 | 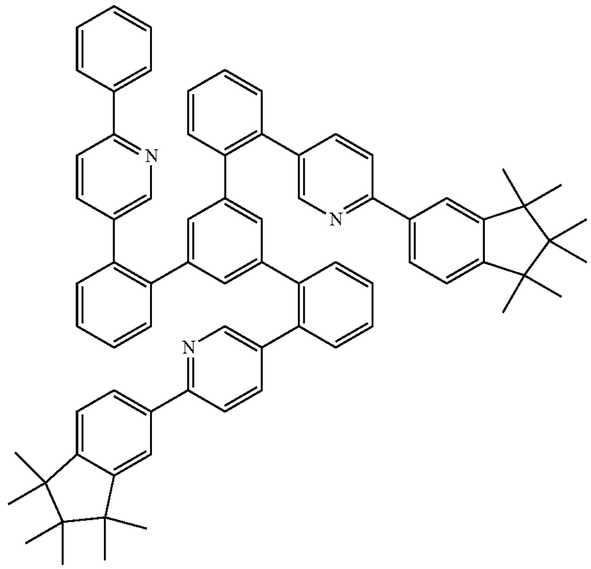 | 20% |
| L41 | S50<br>1 × S23<br>2 × S22 | 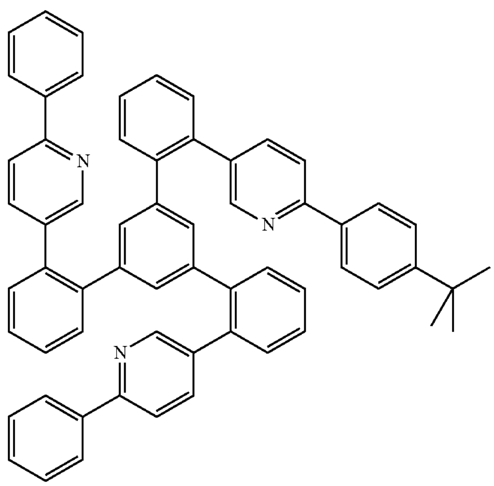 [SMILES: CC(C)(C)c1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cc1] | 22% |
| L42 | S50<br>1 × S24<br>2 × S22 | 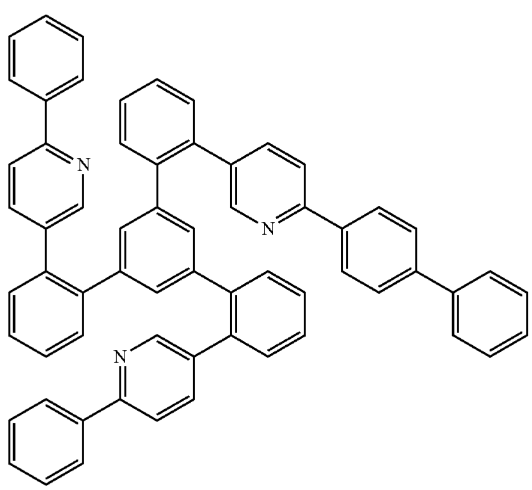 [SMILES: c1ccc(-c2ccc(-c3ccc(-c4ccccc4-c4cc(-c5ccccc5-c5ccc(-c6ccccc6)nc5)cc(-c5ccccc5-c5ccc(-c6ccccc6)nc5)c4)cn3)cc2)cc1] | 25% |

-continued
| Ex. | Bromide boronic acid/ester 1 and 2 | Product | Yield |
| --- | --- | --- | --- |
| L43 | S50<br>1 × S22<br>2 × S24 | 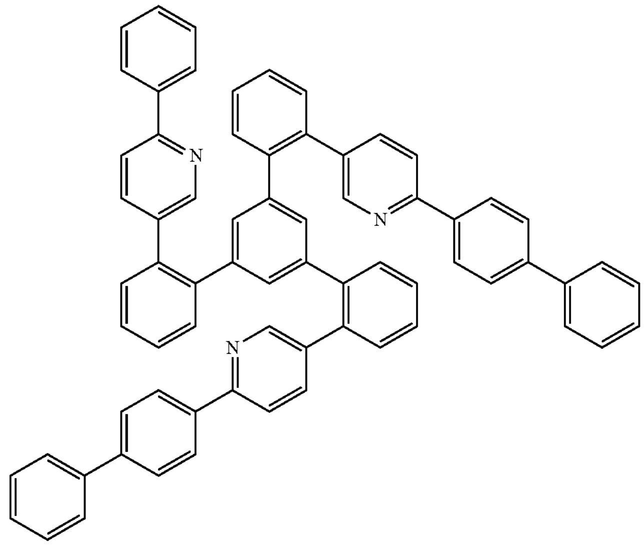 [SMILES: c1ccc(-c2ccc(-c3ccc(-c4ccccc4-c4cc(-c5ccccc5-c5ccc(-c6ccccc6)nc5)cc(-c5ccccc5-c5ccc(-c6ccc(-c7ccccc7)cc6)nc5)c4)cn3)cc2)cc1] | 24% |
| L44 | S50<br>1 × S25<br>2 × S22 | 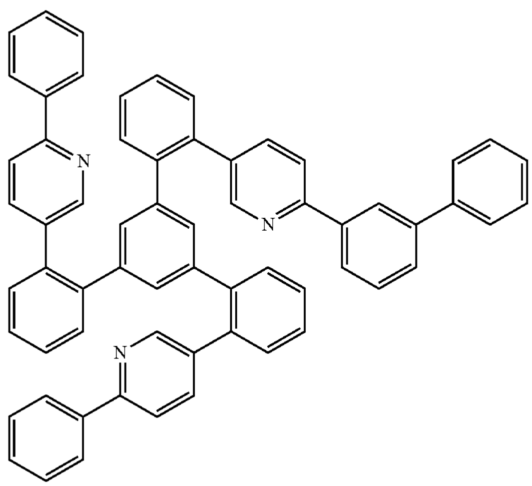 [SMILES: c1ccc(-c2cccc(-c3ccc(-c4ccccc4-c4cc(-c5ccccc5-c5ccc(-c6ccccc6)nc5)cc(-c5ccccc5-c5ccc(-c6ccccc6)nc5)c4)cn3)c2)cc1] | 18% |
| L45 | S50<br>1 × S26<br>2 × S22 | 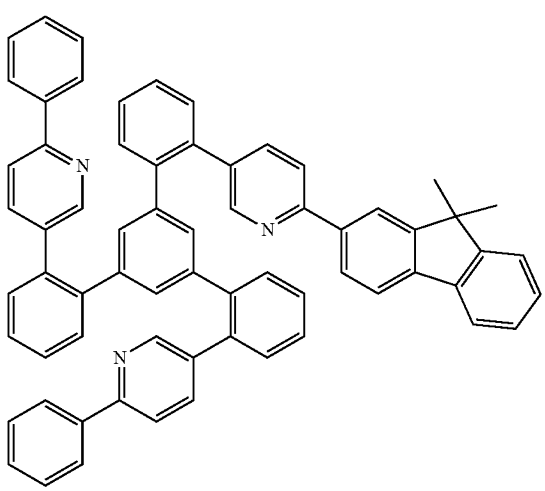 [SMILES: CC1(C)c2ccccc2-c2ccc(-c3ccc(-c4ccccc4-c4cc(-c5ccccc5-c5ccc(-c6ccccc6)nc5)cc(-c5ccccc5-c5ccc(-c6ccccc6)nc5)c4)cn3)cc21] | 21% |

-continued
| Ex. | Bromide boronic acid/ester 1 and 2 | Product | Yield |
|---|---|---|---|
| L46 | S50<br>1 × S22<br>2 × S27 | 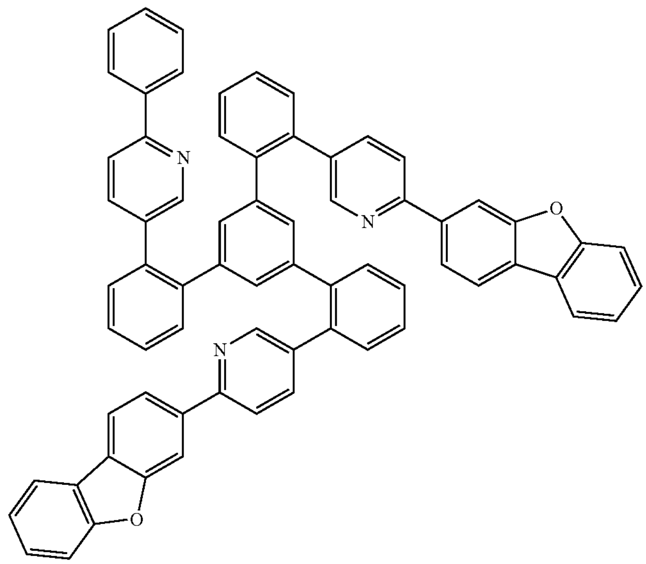 [SMILES: c1ccc(-c2ccc(-c3ccccc3-c3cc(-c4ccccc4-c4ccc(-c5ccc6c(c5)oc5ccccc56)nc4)cc(-c4ccccc4-c4ccc(-c5ccc6c(c5)oc5ccccc56)nc4)c3)cn2)cc1] | 20% |
| L47 | S50<br>1 × S28<br>2 × S30 | 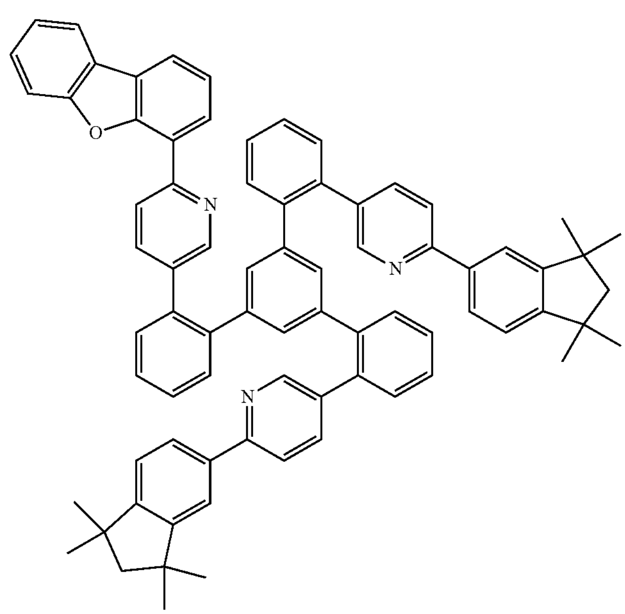 [SMILES: CC1(C)CC(C)(C)c2cc(-c3ccc(-c4ccccc4-c4cc(-c5ccccc5-c5ccc(-c6ccc7c(c6)C(C)(C)CC7(C)C)nc5)cc(-c5ccccc5-c5ccc(-c6cccc7c6oc6ccccc67)nc5)c4)cn3)ccc21] | 17% |

-continued
| Ex. | Bromide boronic acid/ester 1 and 2 | Product | Yield |
| --- | --- | --- | --- |
| L48 | S50<br>1 × S34<br>2 × S22 | 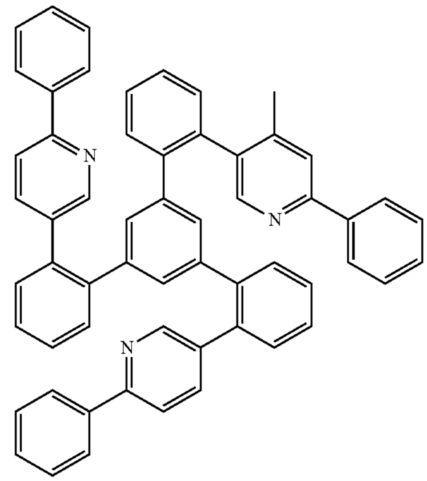 | 20% |
| L49 | S50<br>1 × S31<br>2 × S34 | 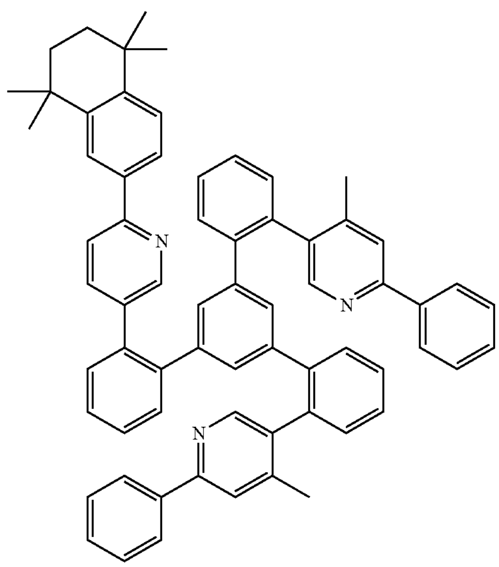 [SMILES: Cc1cc(-c2ccccc2)ncc1-c1ccccc1-c1cc(-c2ccccc2-c2ccc(-c3ccc4c(c3)C(C)(C)CCC4(C)C)nc2)cc(-c2ccccc2-c2cnc(-c3ccccc3)cc2C)c1] | 23% |
| L50 | S50<br>1 × S35<br>2 × S34 | 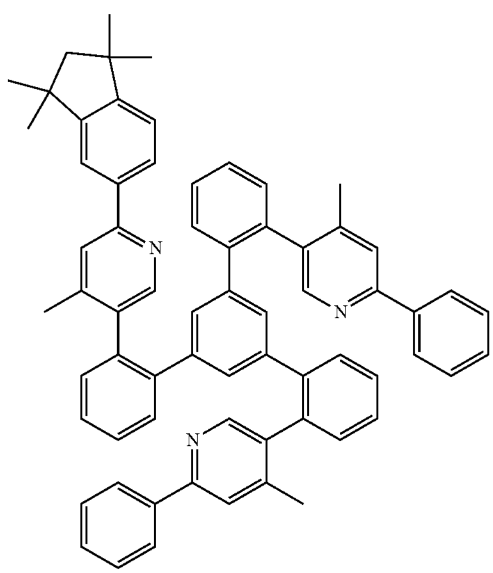 [SMILES: Cc1cc(-c2ccccc2)ncc1-c1ccccc1-c1cc(-c2ccccc2-c2cnc(-c3ccccc3)cc2C)cc(-c2ccccc2-c2cnc(-c3ccc4c(c3)C(C)(C)CC4(C)C)cc2C)c1] | 23% |

-continued
| Ex. | Bromide boronic acid/ester 1 and 2 | Product | Yield |
|---|---|---|---|
| L51 | S50<br>1 × S36<br>2 × S22 | 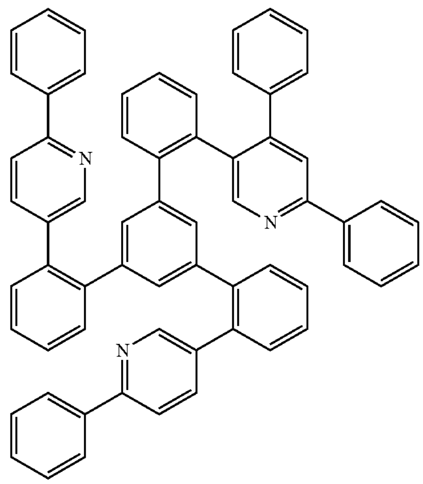 [SMILES: c1ccc(-c2ccc(-c3ccccc3-c3cc(-c4ccccc4-c4ccc(-c5ccccc5)nc4)cc(-c4ccccc4-c4cnc(-c5ccccc5)cc4-c4ccccc4)c3)cn2)cc1] | 20% |
| L52 | S50<br>1 × S34<br>2 × S36 | 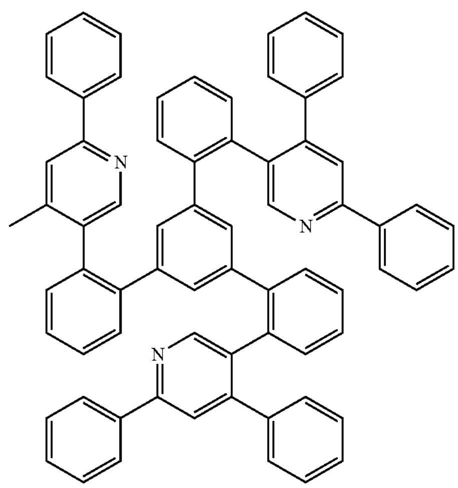 [SMILES: Cc1cc(-c2ccccc2)ncc1-c1ccccc1-c1cc(-c2ccccc2-c2cnc(-c3ccccc3)cc2-c2ccccc2)cc(-c2ccccc2-c2cnc(-c3ccccc3)cc2-c2ccccc2)c1] | 24% |
| L53 | S46<br>1 × S34<br>2 × S36 | 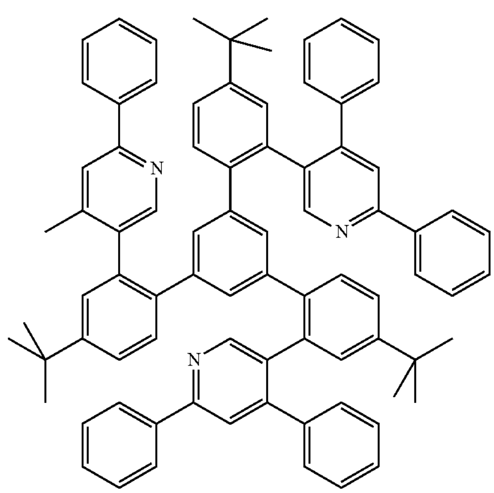 [SMILES: Cc1cc(-c2ccccc2)ncc1-c1cc(C(C)(C)C)ccc1-c1cc(-c2ccc(C(C)(C)C)cc2-c2cnc(-c3ccccc3)cc2-c2ccccc2)cc(-c2ccc(C(C)(C)C)cc2-c2cnc(-c3ccccc3)cc2-c2ccccc2)c1] | 19% |

-continued
| Ex. | Bromide boronic acid/ester 1 and 2 | Product | Yield |
|---|---|---|---|
| L54 | S47<br>1 × S22<br>2 × S36 | 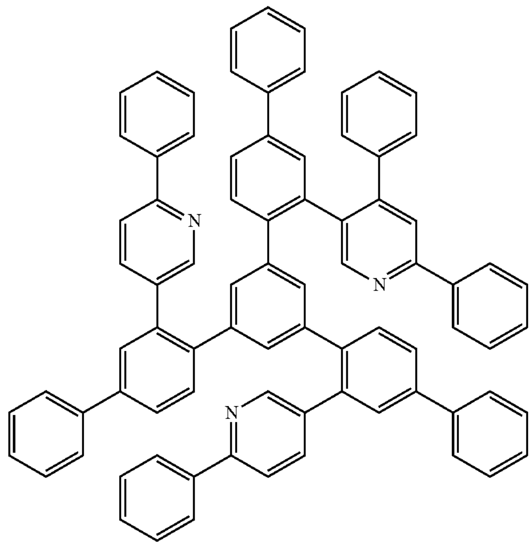 [SMILES: c1ccc(-c2ccc(-c3cc(-c4ccc(-c5ccccc5)cc4-c4ccc(-c5ccccc5)nc4)cc(-c4ccc(-c5ccccc5)cc4-c4cnc(-c5ccccc5)cc4-c4ccccc4)c3)c(-c3ccc(-c4ccccc4)nc3)c2)cc1] | 20% |
| L55 | S50<br>1 × S40<br>2 × S22 | 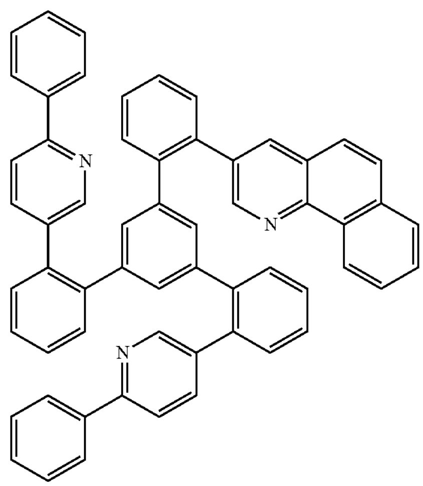 [SMILES: c1ccc(-c2ccc(-c3ccccc3-c3cc(-c4ccccc4-c4ccc(-c5ccccc5)nc4)cc(-c4ccccc4-c4cnc5c(ccc6ccccc65)c4)c3)cn2)cc1] | 24% |
| L56 | S50<br>1 × S40<br>2 × S36 | 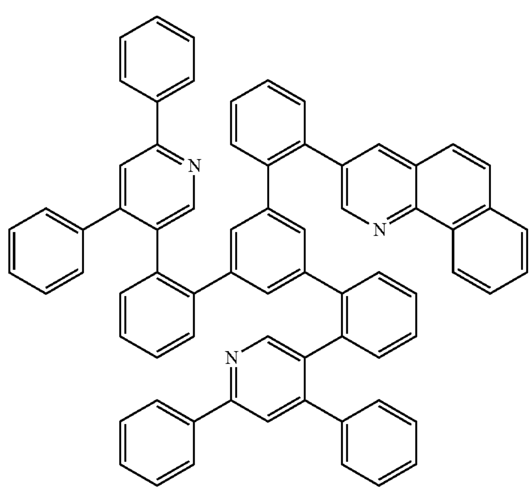 [SMILES: c1ccc(-c2cc(-c3ccccc3)c(-c3ccccc3-c3cc(-c4ccccc4-c4cnc5c(ccc6ccccc65)c4)cc(-c4ccccc4-c4cnc(-c5ccccc5)cc4-c4ccccc4)c3)cn2)cc1] | 22% |

-continued
| Ex. | Bromide boronic acid/ester 1 and 2 | Product | Yield |
|---|---|---|---|
| L57 | S50<br>1 × S41<br>2 × S22 | 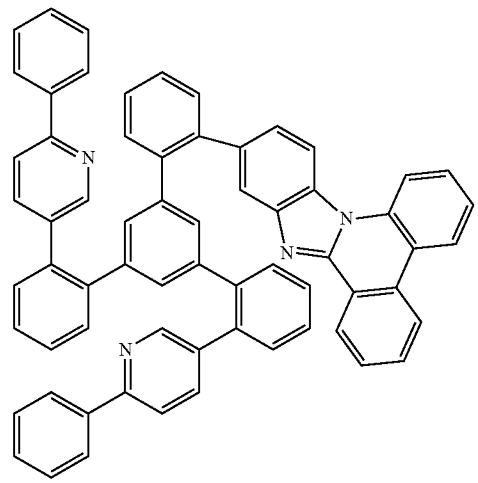 [SMILES: c1ccc(-c2ccc(-c3ccccc3-c3cc(-c4ccccc4-c4ccc(-c5ccccc5)nc4)cc(-c4ccccc4-c4ccc5c(c4)nc4c6ccccc6c6ccccc6n54)c3)cn2)cc1] | 26% |
| L58 | S50<br>1 × S22<br>2 × S43 | 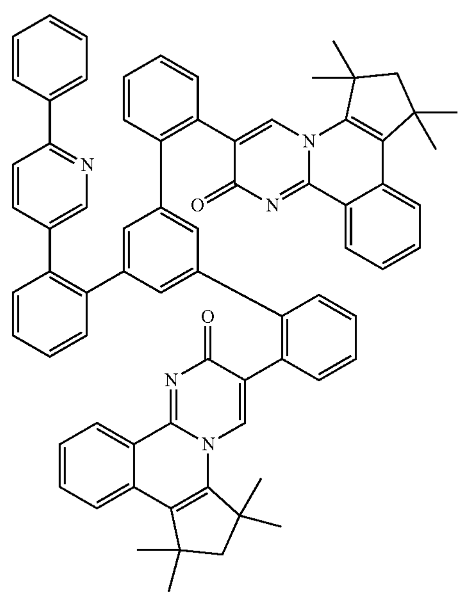 [SMILES: CC1(C)CC(C)(C)c2c1c1ccccc1c1nc(=O)c(-c3ccccc3-c3cc(-c4ccccc4-c4ccc(-c5ccccc5)nc4)cc(-c4ccccc4-c4cn5c6c(c7ccccc7c5nc4=O)C(C)(C)CC6(C)C)c3)cn21] | 25% |
| L71 | S50<br>1 × S60<br>2 × S22 | 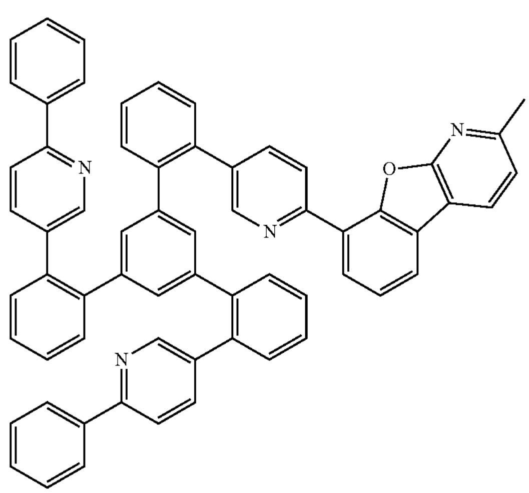 [SMILES: Cc1ccc2c(n1)oc1c(-c3ccc(-c4ccccc4-c4cc(-c5ccccc5-c5ccc(-c6ccccc6)nc5)cc(-c5ccccc5-c5ccc(-c6ccccc6)nc5)c4)cn3)cccc12] | 28% |

-continued
| Ex. | Bromide boronic acid/ester 1 and 2 | Product | Yield |
|---|---|---|---|
| L73 | S50 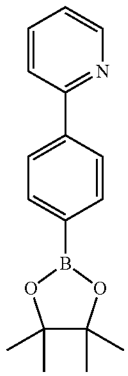 1 × [908350-80-1] 2 × S22 | 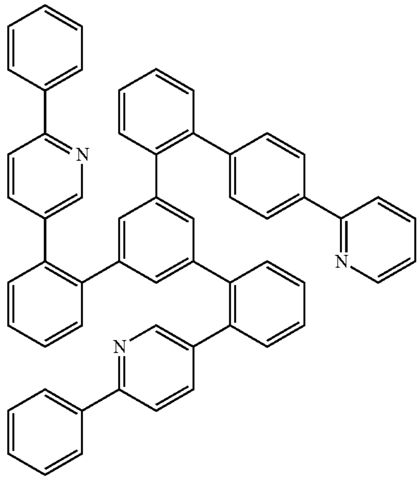 | 24% |
| L75 | S50 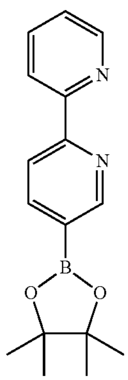 1 × [562098-24-2] 2 × S22 | 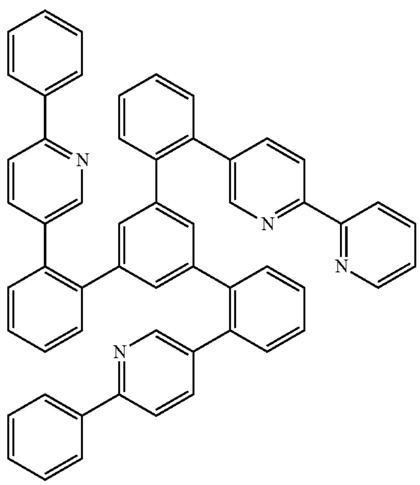 | 19% |
| L77 | S50 1 × S83 2 × S22 | 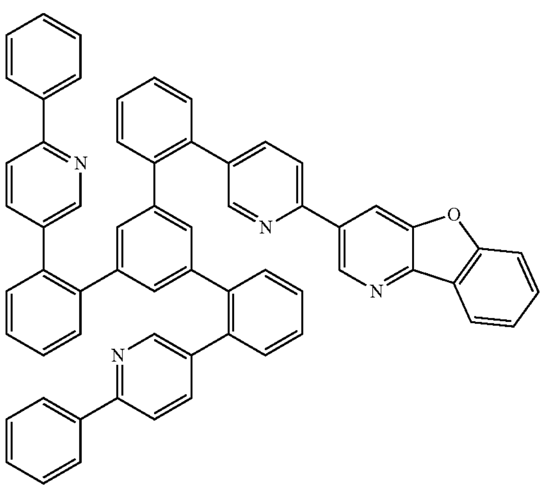 [SMILES: c1ccc(-c2ccc(-c3ccccc3-c3cc(-c4ccccc4-c4ccc(-c5ccccc5)nc4)cc(-c4ccccc4-c4ccc(-c5cnc6c(c5)oc5ccccc56)nc4)c3)cn2)cc1] | 17% |

-continued
| Ex. | Bromide boronic acid/ester 1 and 2 | Product | Yield |
|---|---|---|---|
| L78 | S50<br>1 × S83<br>2 × S34 | 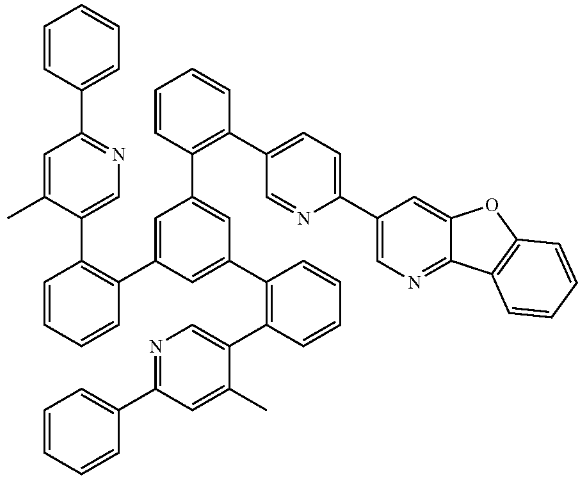 [SMILES: Cc1cc(-c2ccccc2)ncc1-c1ccccc1-c1cc(-c2ccccc2-c2ccc(-c3cnc4c(c3)oc3ccccc34)nc2)cc(-c2ccccc2-c2cnc(-c3ccccc3)cc2C)c1] | 25% |
| L79 | S50<br>1 × S84<br>2 × S34 | 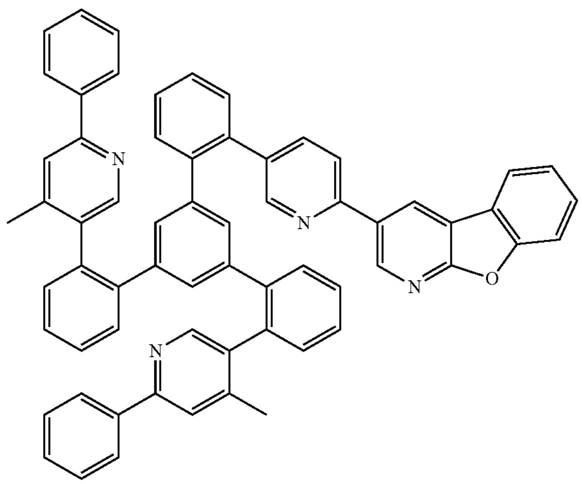 [SMILES: Cc1cc(-c2ccccc2)ncc1-c1ccccc1-c1cc(-c2ccccc2-c2ccc(-c3cnc4oc5ccccc5c4c3)nc2)cc(-c2ccccc2-c2cnc(-c3ccccc3)cc2C)c1] | 27% |
| L80 | S50<br>1 × S85<br>2 × S22 | 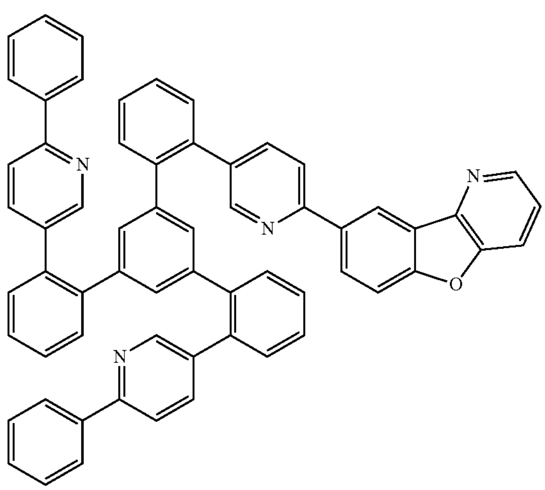 [SMILES: c1ccc(-c2ccc(-c3ccccc3-c3cc(-c4ccccc4-c4ccc(-c5ccccc5)nc4)cc(-c4ccccc4-c4ccc(-c5ccc6oc7cccnc7c6c5)nc4)c3)cn2)cc1] | 25% |

-continued
| Ex. | Bromide boronic acid/ester 1 and 2 | Product | Yield |
|---|---|---|---|
| L81 | S50<br>1 × S86<br>2 × S22 | 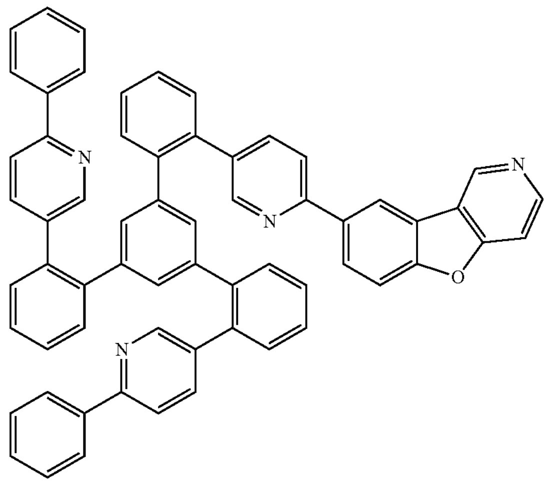 [SMILES: c1ccc(-c2ccc(-c3ccccc3-c3cc(-c4ccccc4-c4ccc(-c5ccccc5)nc4)cc(-c4ccccc4-c4ccc(-c5ccc6oc7ccncc7c6c5)nc4)c3)cn2)cc1] | 23% |
| L82 | S50<br>1 × S87<br>2 × S22 | 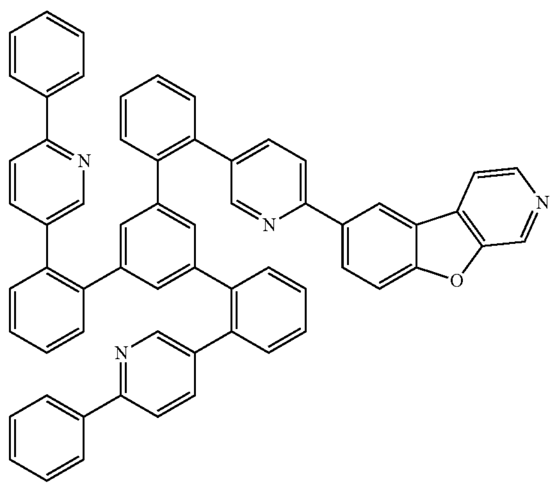 [SMILES: c1ccc(-c2ccc(-c3ccccc3-c3cc(-c4ccccc4-c4ccc(-c5ccccc5)nc4)cc(-c4ccccc4-c4ccc(-c5ccc6oc7cnccc7c6c5)nc4)c3)cn2)cc1] | 26% |
| L83 | S50<br>1 × S88<br>2 × S22 | 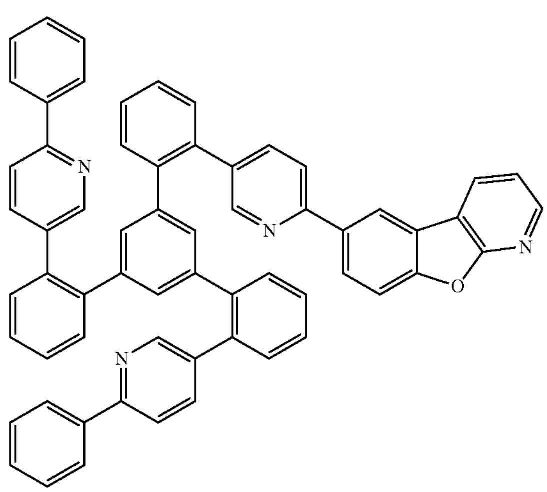 [SMILES: c1ccc(-c2ccc(-c3ccccc3-c3cc(-c4ccccc4-c4ccc(-c5ccccc5)nc4)cc(-c4ccccc4-c4ccc(-c5ccc6oc7ncccc7c6c5)nc4)c3)cn2)cc1] | 30% |

-continued
| Ex. | Bromide boronic acid/ester 1 and 2 | Product | Yield |
|---|---|---|---|
| L84 | S50<br>1 × S89<br>2 × S36 | 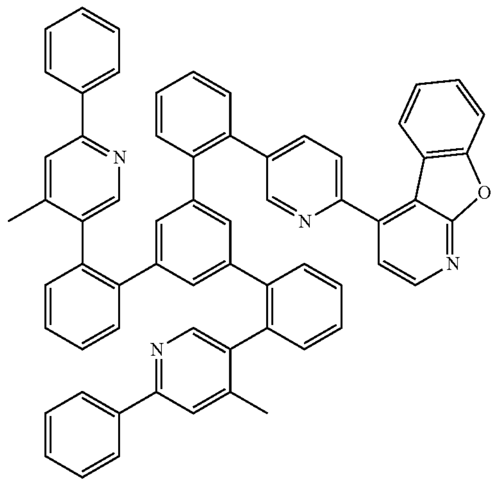 [SMILES: Cc1cc(-c2ccccc2)ncc1-c1ccccc1-c1cc(-c2ccccc2-c2ccc(-c3ccnc4oc5ccccc5c34)nc2)cc(-c2ccccc2-c2cnc(-c3ccccc3)cc2C)c1] | 22% |
| L85 | S50<br>1 × S90<br>2 × S22 | 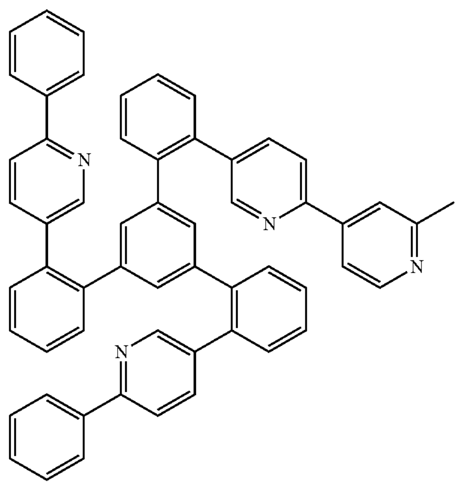 [SMILES: Cc1cc(-c2ccc(-c3ccccc3-c3cc(-c4ccccc4-c4ccc(-c5ccccc5)nc4)cc(-c4ccccc4-c4ccc(-c5ccccc5)nc4)c3)cn2)ccn1] | 21% |
| L86 | S50<br>1 × S91<br>2 × S22 | 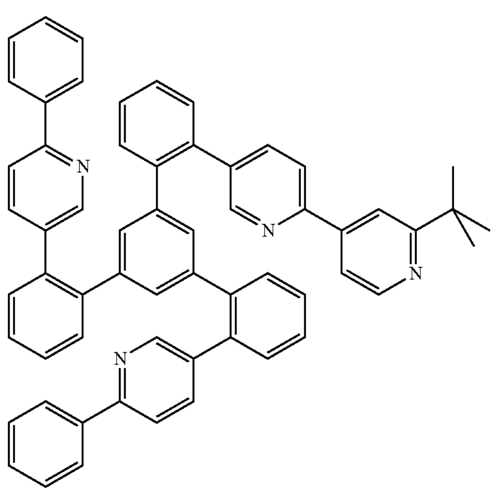 [SMILES: CC(C)(C)c1cc(-c2ccc(-c3ccccc3-c3cc(-c4ccccc4-c4ccc(-c5ccccc5)nc4)cc(-c4ccccc4-c4ccc(-c5ccccc5)nc4)c3)cn2)ccn1] | 25% |

-continued
| Ex. | Bromide boronic acid/ester 1 and 2 | Product | Yield |
|---|---|---|---|
| L87 | S50<br>1 × S92<br>2 × S22 | 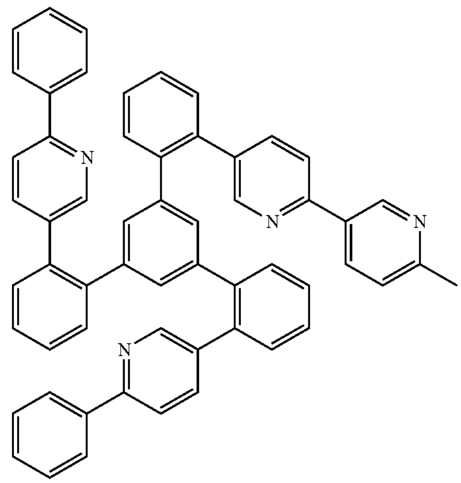 [SMILES: Cc1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cn1] | 25% |
| L88 | S50<br>1 × S93<br>2 × S22 | 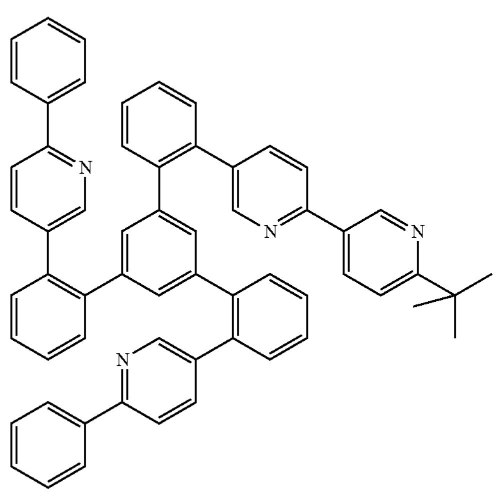 [SMILES: CC(C)(C)c1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cn1] | 27% |

-continued
| Ex. | Bromide boronic acid/ester 1 and 2 | Product | Yield |
| --- | --- | --- | --- |
| L89 | S50<br>1 × S95<br>2 × S22 | 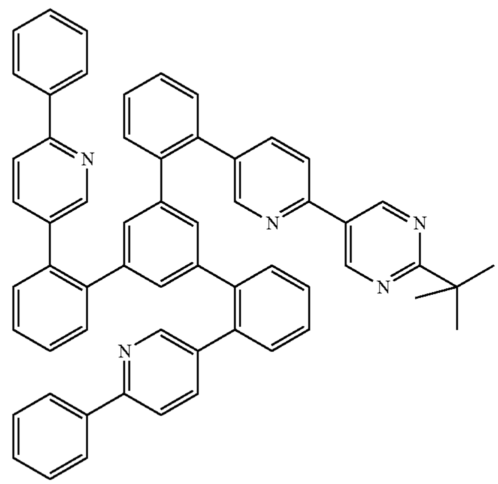 [SMILES: CC(C)(C)c1ncc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cn1] | 24% |
| L90 | S50<br>1 × S96<br>2 × S22 | 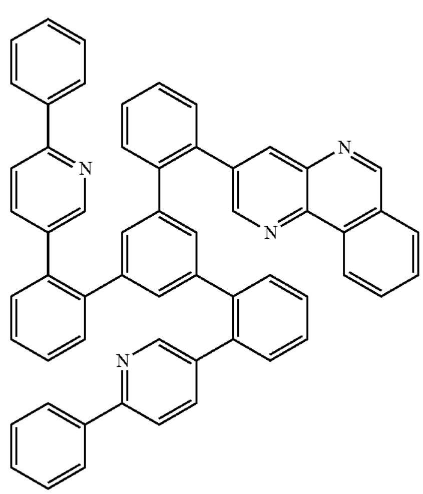 [SMILES: c1ccc(-c2ccc(-c3ccccc3-c3cc(-c4ccccc4-c4ccc(-c5ccccc5)nc4)cc(-c4ccccc4-c4cnc5c(c4)ncc4ccccc45)c3)cn2)cc1] | 26% |

Example L200

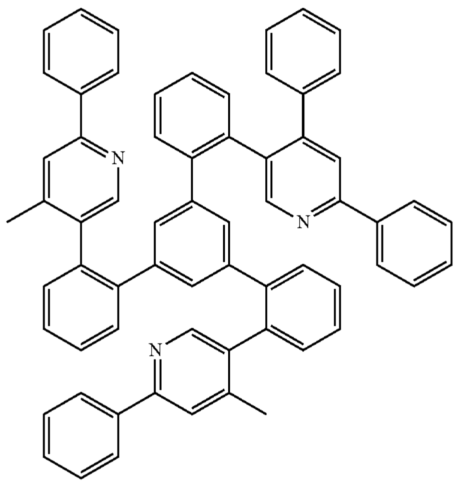 [SMILES: Cc1cc(-c2ccccc2)ncc1-c1ccccc1-c1cc(-c2ccccc2-c2cnc(-c3ccccc3)cc2C)cc(-c2ccccc2-c2cnc(-c3ccccc3)cc2-c2ccccc2)c1]

A mixture of 69.1 g (100 mmol) of S501, 42.5 g (110 mmol) of S204, 63.7 g (300 mmol) of tripotassium phosphate, 1.64 g (4 mmol) of SPhos [657408-07-6], 449 mg (2 mmol) of palladium(II) acetate, 700 ml of toluene, 300 ml of dioxane and 500 ml of water is heated under reflux for 8 h. After cooling, the organic phase is removed, washed twice with 300 ml of water and once with 200 ml of saturated sodium chloride solution, dried over magnesium sulphate and then filtered through a pre-slurried Celite bed, which is washed through with toluene. The filtrate is concentrated to dryness and the residue is then recrystallized twice from ethyl acetate/methanol. Yield: 45.5 g (54 mmol), 54%. Purity: about 97% by $^{1}H$ NMR.

In an analogous manner, it is possible to synthesize the following compounds:

| Ex. | Reactants | Product | Yield |
|---|---|---|---|
| L71 | S500<br>S213 | 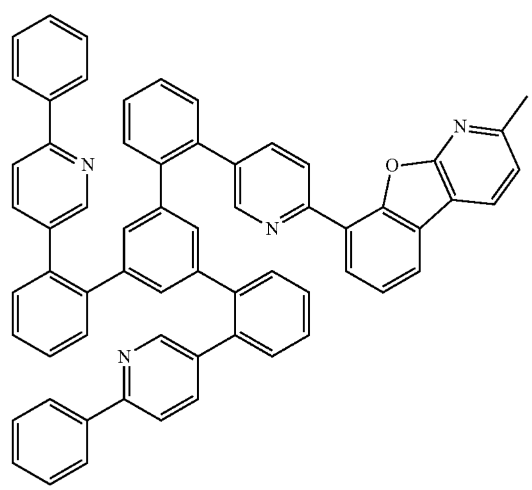 [SMILES: Cc1ccc2c(n1)oc1c(-c3ccc(-c4ccccc4-c4cc(-c5ccccc5-c5ccc(-c6ccccc6)nc5)cc(-c5ccccc5-c5ccc(-c6ccccc6)nc5)c4)cn3)cccc12] | 76% |
| L201 | S501<br>S200 | 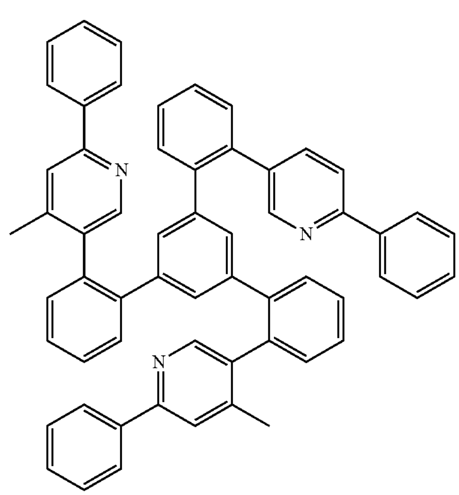 [SMILES: Cc1cc(-c2ccccc2)ncc1-c1ccccc1-c1cc(-c2ccccc2-c2ccc(-c3ccccc3)nc2)cc(-c2ccccc2-c2cnc(-c3ccccc3)cc2C)c1] | 74% |

-continued
| Ex. | Reactants | Product | Yield |
|---|---|---|---|
| L202 | S501<br>S205 | 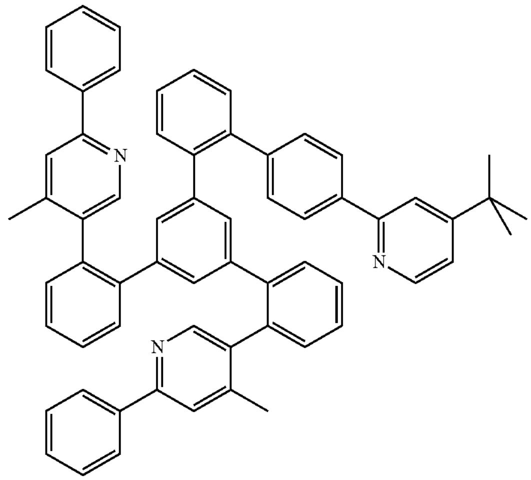 [SMILES: Cc1cc(-c2ccccc2)ncc1-c1ccccc1-c1cc(-c2ccccc2-c2ccc(-c3cc(C(C)(C)C)ccn3)cc2)cc(-c2ccccc2-c2cnc(-c3ccccc3)cc2C)c1] | 70% |
| L203 | S502<br>S205 | 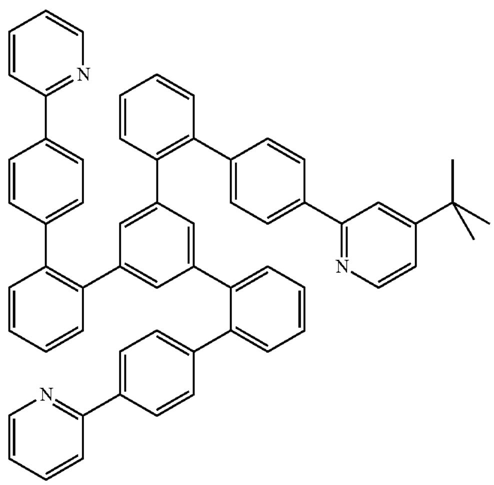 [SMILES: CC(C)(C)c1ccnc(-c2ccc(-c3ccccc3-c3cc(-c4ccccc4-c4ccc(-c5ccccn5)cc4)cc(-c4ccccc4-c4ccc(-c5ccccn5)cc4)c3)cc2)c1] | 71% |
| L204 | S502<br>S206 | 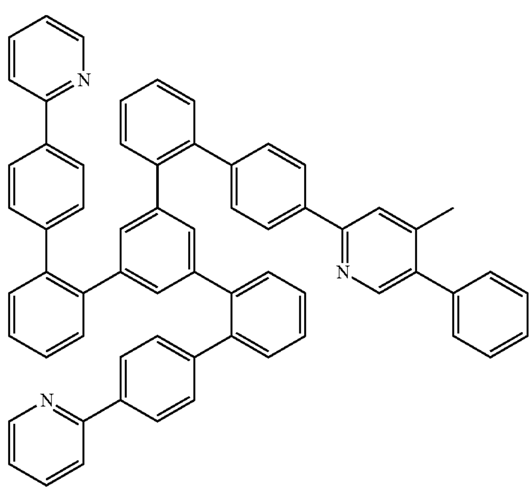 [SMILES: Cc1cc(-c2ccc(-c3ccccc3-c3cc(-c4ccccc4-c4ccc(-c5ccccn5)cc4)cc(-c4ccccc4-c4ccc(-c5ccccn5)cc4)c3)cc2)ncc1-c1ccccc1] | 76% |

-continued
| Ex. | Reactants | Product | Yield |
| --- | --- | --- | --- |
| L205 | S502<br>S209 | 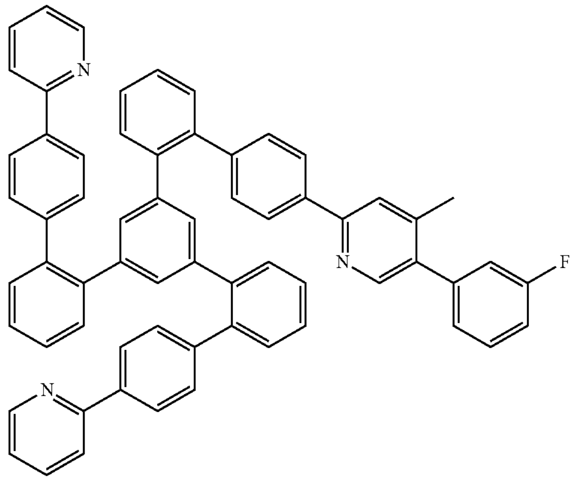 [SMILES: Cc1cc(-c2ccc(-c3ccccc3-c3cc(-c4ccccc4-c4ccc(-c5ccccn5)cc4)cc(-c4ccccc4-c4ccc(-c5ccccn5)cc4)c3)cc2)ncc1-c1cccc(F)c1] | 77% |
| L206 | S503<br>S205 | 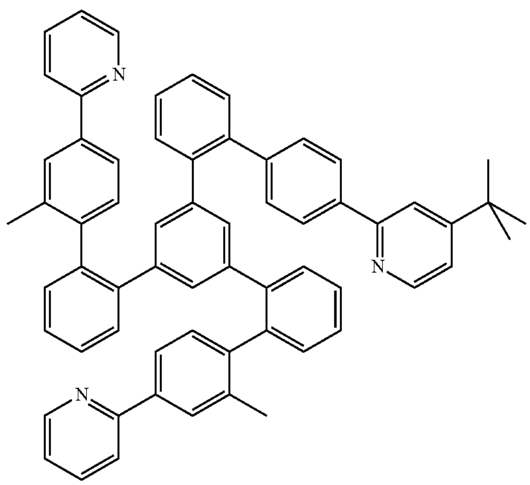 [SMILES: Cc1cc(-c2ccccn2)ccc1-c1ccccc1-c1cc(-c2ccccc2-c2ccc(-c3cc(C(C)(C)C)ccn3)cc2)cc(-c2ccccc2-c2ccc(-c3ccccn3)cc2C)c1] | 81% |
| L207 | S503<br>S208 | 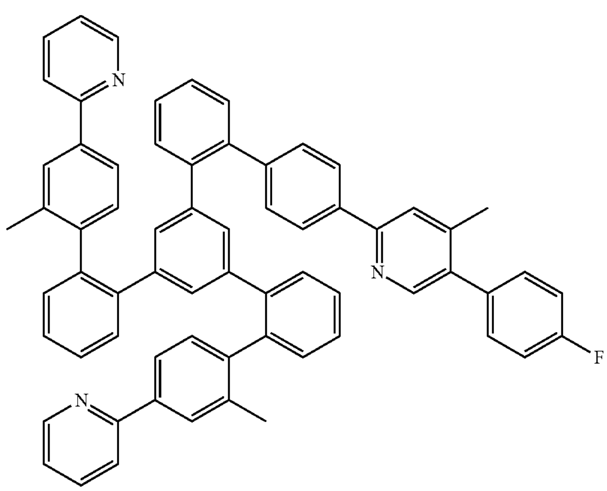 [SMILES: Cc1cc(-c2ccc(-c3ccccc3-c3cc(-c4ccccc4-c4ccc(-c5ccccn5)cc4C)cc(-c4ccccc4-c4ccc(-c5ccccn5)cc4C)c3)cc2)ncc1-c1ccc(F)cc1] | 77% |

-continued
| Ex. | Reactants | Product | Yield |
|---|---|---|---|
| L208 | S503<br>S211 | 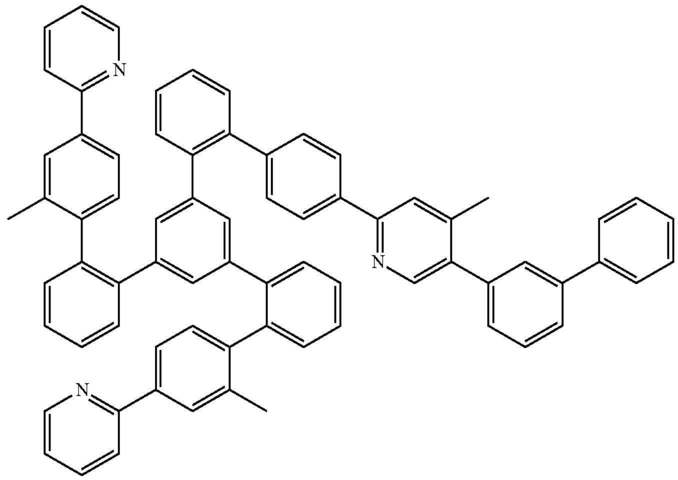 [SMILES: Cc1cc(-c2ccc(-c3ccccc3-c3cc(-c4ccccc4-c4ccc(-c5ccccn5)cc4C)cc(-c4ccccc4-c4ccc(-c5ccccn5)cc4C)c3)cc2)ncc1-c1cccc(-c2ccccc2)c1] | 68% |
| L209 | S504<br>S200 | 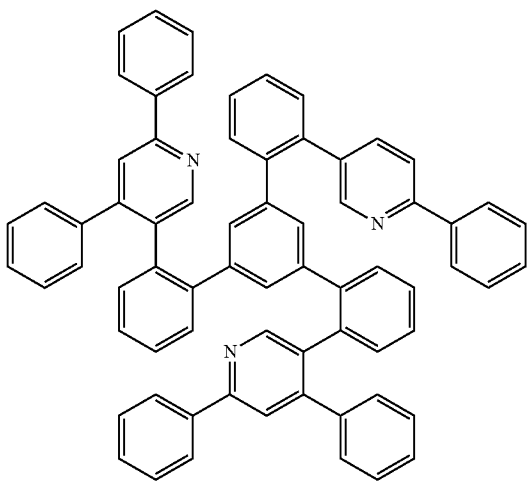 [SMILES: c1ccc(-c2ccc(-c3ccccc3-c3cc(-c4ccccc4-c4cnc(-c5ccccc5)cc4-c4ccccc4)cc(-c4ccccc4-c4cnc(-c5ccccc5)cc4-c4ccccc4)c3)cn2)cc1] | 75% |
| L210 | S504<br>S213 | 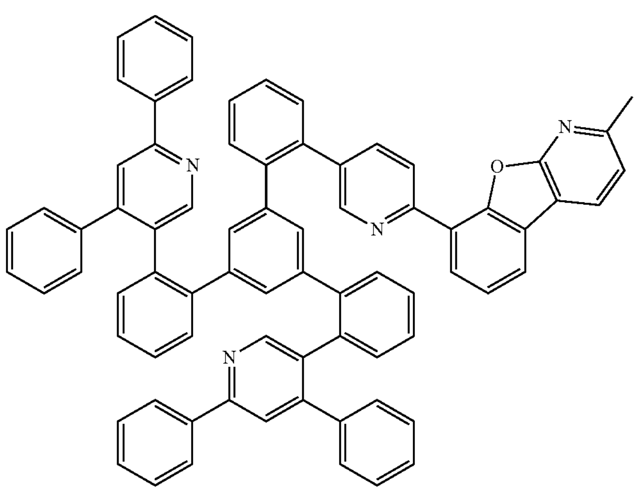 [SMILES: Cc1ccc2c(n1)oc1c(-c3ccc(-c4ccccc4-c4cc(-c5ccccc5-c5cnc(-c6ccccc6)cc5-c5ccccc5)cc(-c5ccccc5-c5cnc(-c6ccccc6)cc5-c5ccccc5)c4)cn3)cccc12] | 80% |

-continued
| Ex. | Reactants | Product | Yield |
|---|---|---|---|
| L211 | S504<br>S201 | 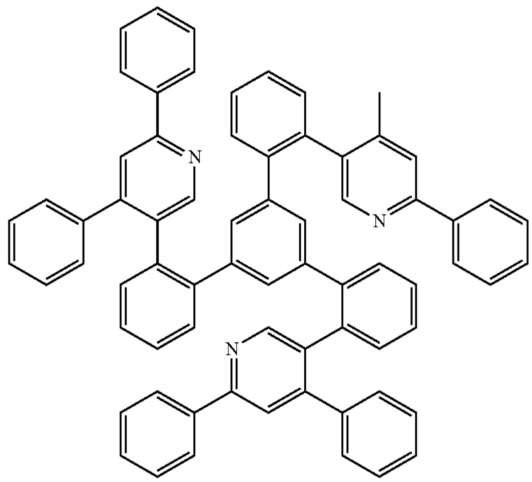 [SMILES: Cc1cc(-c2ccccc2)ncc1-c1ccccc1-c1cc(-c2ccccc2-c2cnc(-c3ccccc3)cc2-c2ccccc2)cc(-c2ccccc2-c2cnc(-c3ccccc3)cc2-c2ccccc2)c1] | 69% |
| L212 | S505<br>S202 | 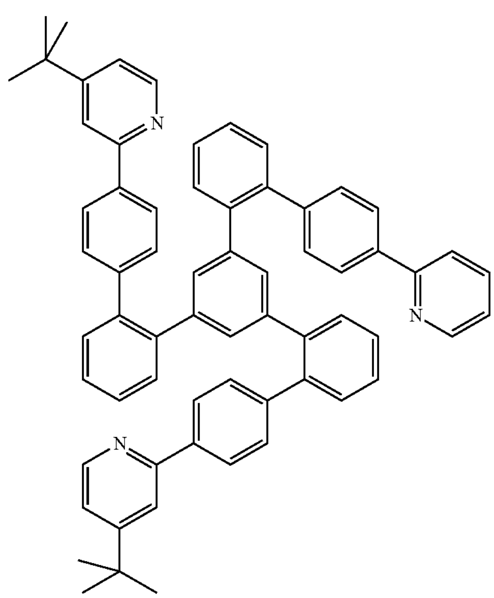 [SMILES: CC(C)(C)c1ccnc(-c2ccc(-c3ccccc3-c3cc(-c4ccccc4-c4ccc(-c5ccccn5)cc4)cc(-c4ccccc4-c4ccc(-c5cc(C(C)(C)C)ccn5)cc4)c3)cc2)c1] | 75% |

-continued
| Ex. | Reactants | Product | Yield |
|---|---|---|---|
| L213 | S505<br>S206 | 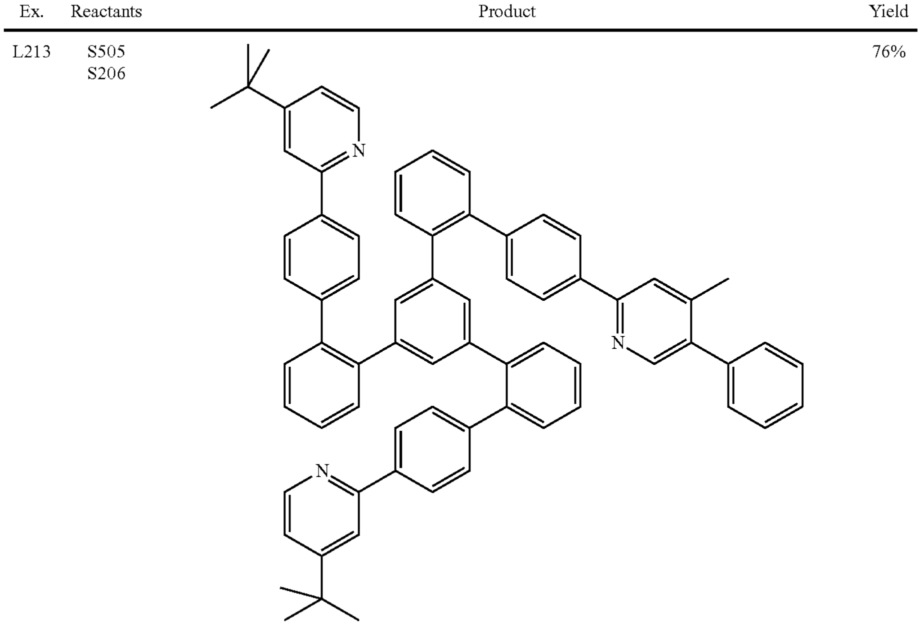 | 76% |
| L214 | S505<br>S207 | 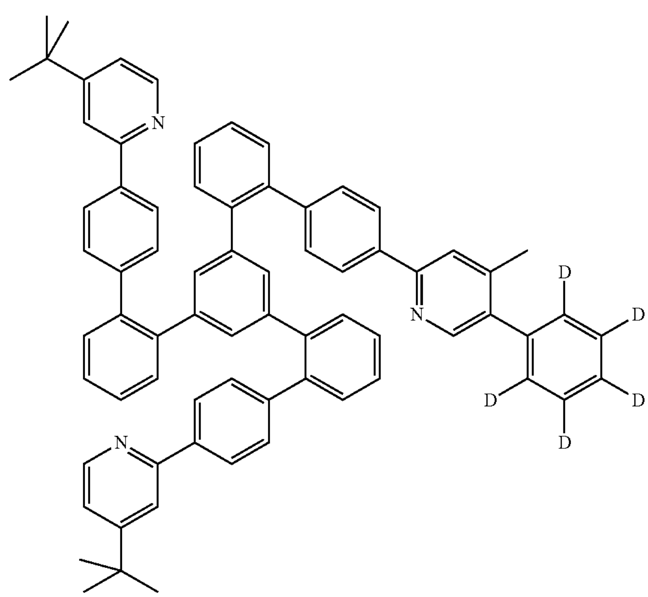 [SMILES: [2H]c1c([2H])c([2H])c(-c2cnc(-c3ccc(-c4ccccc4-c4cc(-c5ccccc5-c5ccc(-c6cc(C(C)(C)C)ccn6)cc5)cc(-c5ccccc5-c5ccc(-c6cc(C(C)(C)C)ccn6)cc5)c4)cc3)cc2C)c([2H])c1[2H]] | 71% |

-continued
| Ex. | Reactants | Product | Yield |
|---|---|---|---|
| L215 | S505<br>S208 | 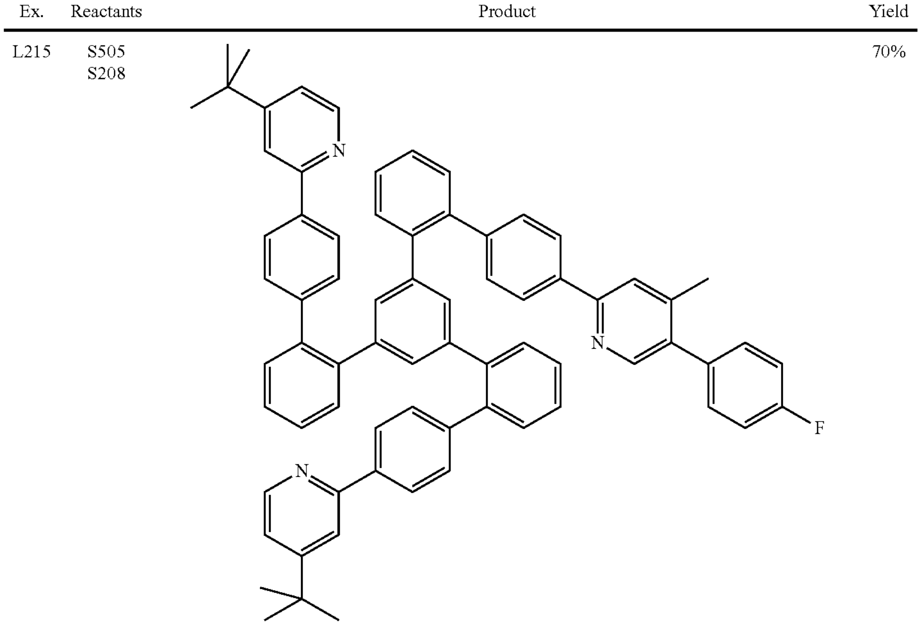 | 70% |
| L216 | S505<br>S209 | 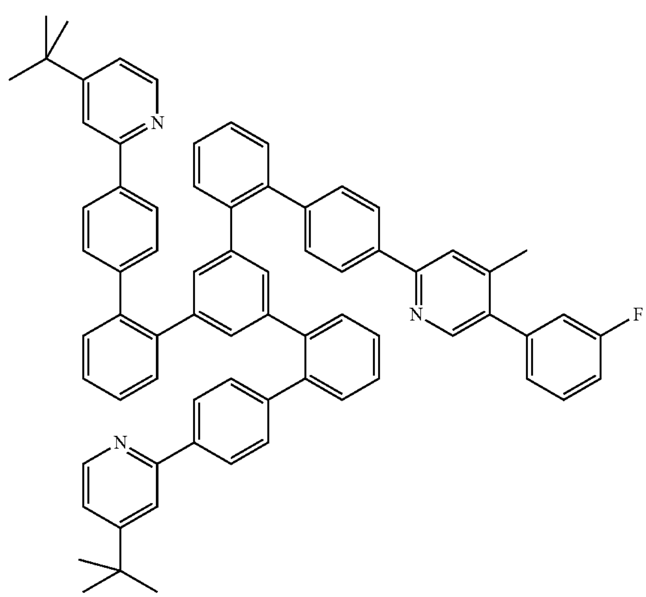 [SMILES: Cc1cc(-c2ccc(-c3ccccc3-c3cc(-c4ccccc4-c4ccc(-c5cc(C(C)(C)C)ccn5)cc4)cc(-c4ccccc4-c4ccc(-c5cc(C(C)(C)C)ccn5)cc4)c3)cc2)ncc1-c1cccc(F)c1] | 73% |

-continued
| Ex. | Reactants | Product | Yield |
| --- | --- | --- | --- |
| L217 | S505<br>S211 | 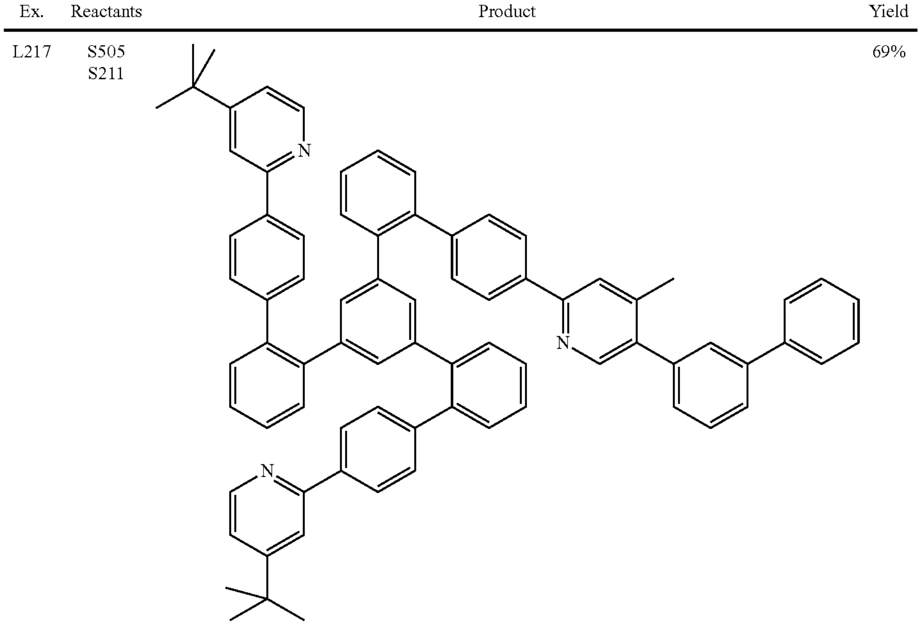 | 69% |
| L218 | S505<br>S212 | 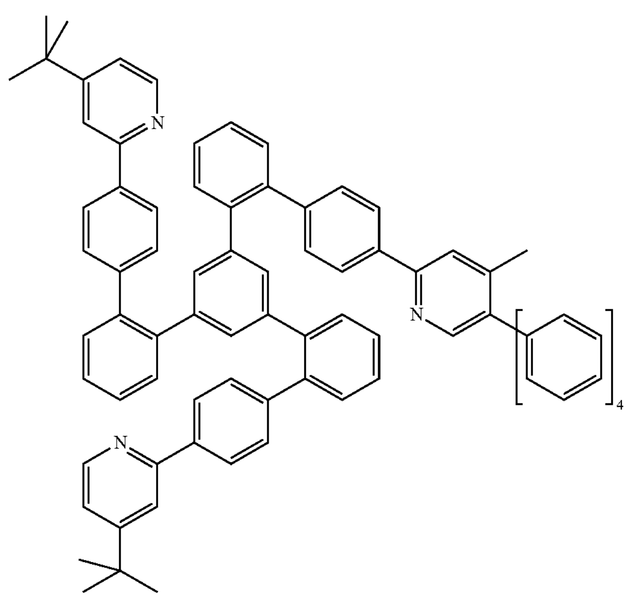 | 80% |

-continued
| Ex. | Reactants | Product | Yield |
|---|---|---|---|
| L219 | S505<br>S210 | 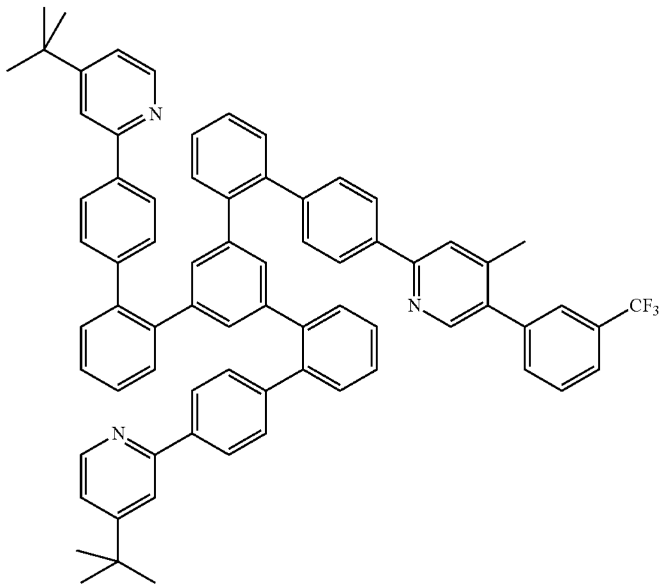 [SMILES: Cc1cc(-c2ccc(-c3ccccc3-c3cc(-c4ccccc4-c4ccc(-c5cc(C(C)(C)C)ccn5)cc4)cc(-c4ccccc4-c4ccc(-c5cc(C(C)(C)C)ccn5)cc4)c3)cc2)ncc1-c1cccc(C(F)(F)F)c1] | 68% |
| L220 | S502<br>S203 | 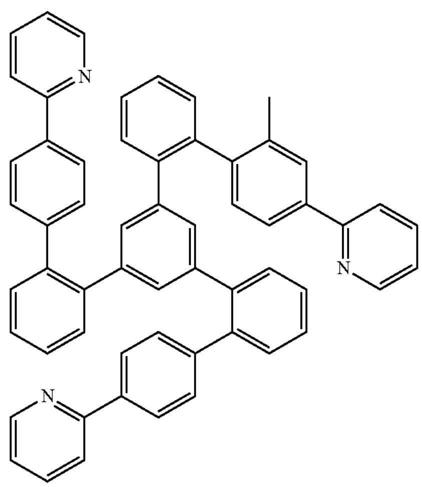 [SMILES: Cc1cc(-c2ccccn2)ccc1-c1ccccc1-c1cc(-c2ccccc2-c2ccc(-c3ccccn3)cc2)cc(-c2ccccc2-c2ccc(-c3ccccn3)cc2)c1] | 70% |
| L221 | S502<br>S214 | 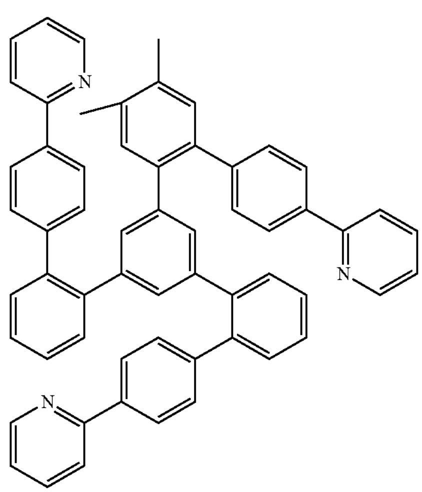 [SMILES: Cc1cc(-c2ccc(-c3ccccn3)cc2)c(-c2cc(-c3ccccc3-c3ccc(-c4ccccn4)cc3)cc(-c3ccccc3-c3ccc(-c4ccccn4)cc3)c2)cc1C] | 67% |

-continued
| Ex. | Reactants | Product | Yield |
| --- | --- | --- | --- |
| L222 | S502<br>S215 | 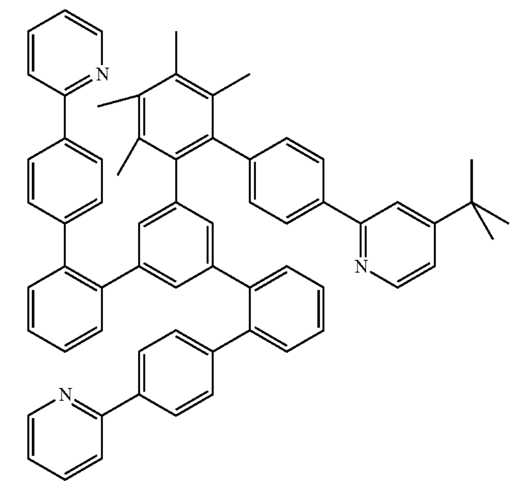 [SMILES: Cc1c(C)c(C)c(-c2cc(-c3ccccc3-c3ccc(-c4ccccn4)cc3)cc(-c3ccccc3-c3ccc(-c4ccccn4)cc3)c2)c(-c2ccc(-c3cc(C(C)(C)C)ccn3)cc2)c1C] | 70% |
| L223 | S502<br>S216 | 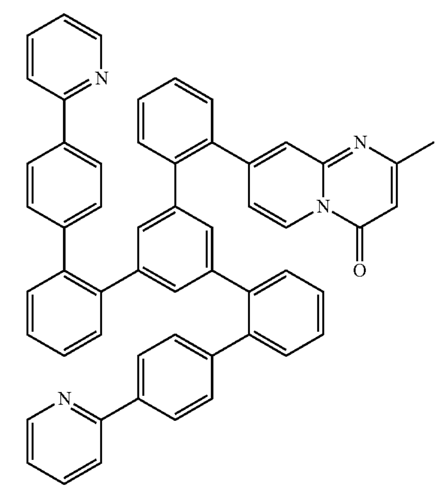 [SMILES: Cc1cc(=O)n2ccc(-c3ccccc3-c3cc(-c4ccccc4-c4ccc(-c5ccccn5)cc4)cc(-c4ccccc4-c4ccc(-c5ccccn5)cc4)c3)cc2n1] | 63% |
| L224 | S505<br>S217 | 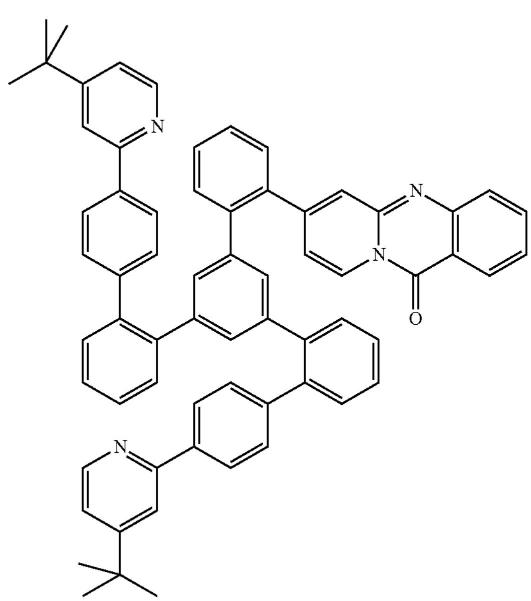 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccn5c(=O)c6ccccc6nc5c4)c3)cc2)c1] | 70% |

-continued
| Ex. | Reactants | Product | Yield |
|---|---|---|---|
| L225 | S505<br>S220 | 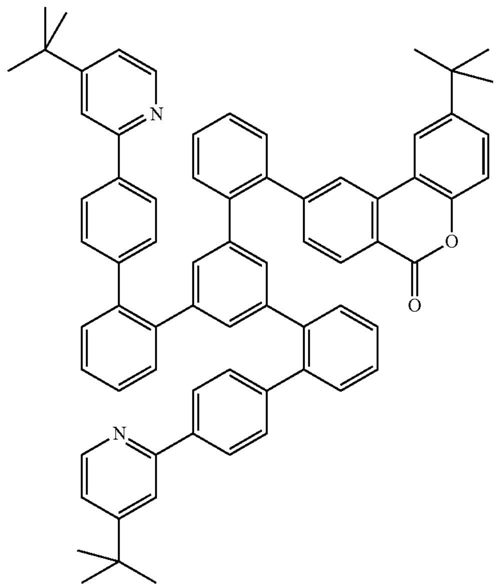 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc5c(=O)oc6ccc(C(C)(C)C)cc6c5c4)c3)cc2)c1] | 68% |
| L226 | S504<br>S218 | 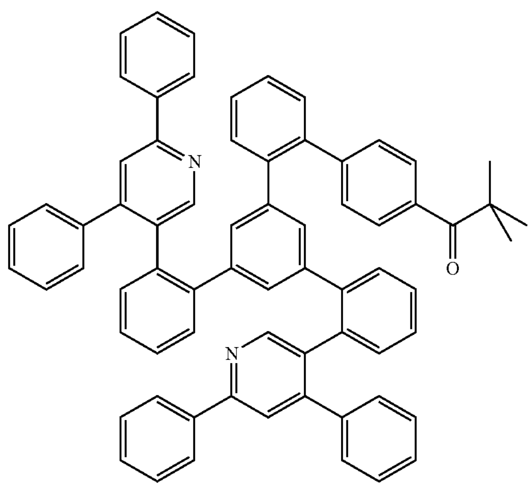 [SMILES: CC(C)(C)C(=O)c1ccc(-c2ccccc2-c2cc(-c3ccccc3-c3cnc(-c4ccccc4)cc3-c3ccccc3)cc(-c3ccccc3-c3cnc(-c4ccccc4)cc3-c3ccccc3)c2)cc1] | 75% |
| L227 | S502<br>S219 | 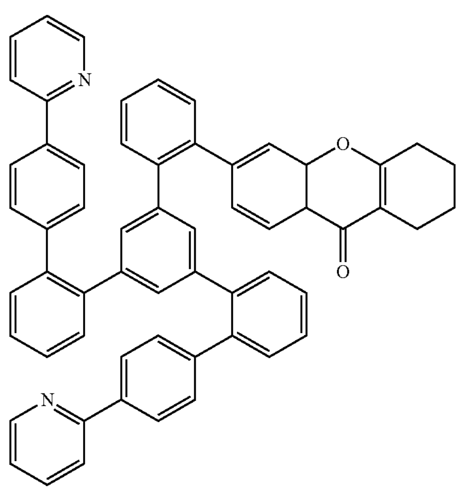 [SMILES: O=C1C2=C(CCCC2)OC2C=C(c3ccccc3-c3cc(-c4ccccc4-c4ccc(-c5ccccn5)cc4)cc(-c4ccccc4-c4ccc(-c5ccccn5)cc4)c3)C=CC12] | 48% |

-continued
| Ex. | Reactants | Product | Yield |
|---|---|---|---|
| L228 | S502<br>S221 | 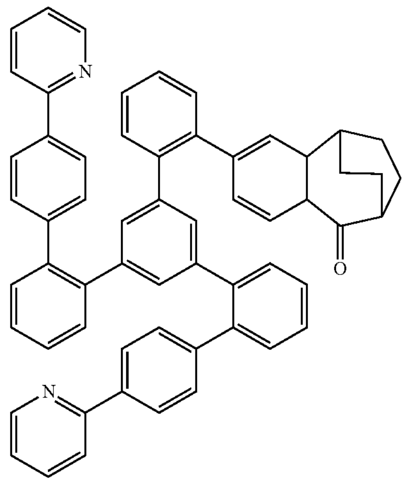 [SMILES: O=C1C2CCC(CC2)C2C=C(c3ccccc3-c3cc(-c4ccccc4-c4ccc(-c5ccccn5)cc4)cc(-c4ccccc4-c4ccc(-c5ccccn5)cc4)c3)C=CC12] | 66% |
| L229 | S505<br>S225 | 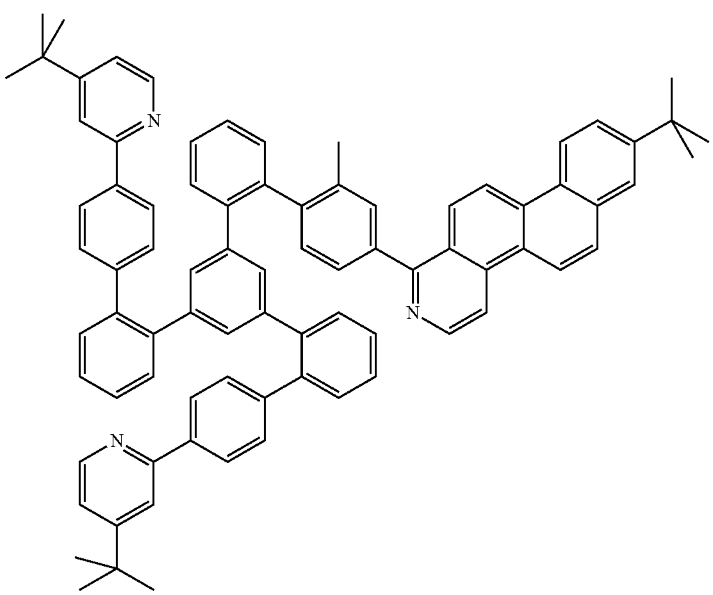 [SMILES: Cc1cc(-c2nccc3c2ccc2c4ccc(C(C)(C)C)cc4ccc32)ccc1-c1ccccc1-c1cc(-c2ccccc2-c2ccc(-c3cc(C(C)(C)C)ccn3)cc2)cc(-c2ccccc2-c2ccc(-c3cc(C(C)(C)C)ccn3)cc2)c1] | 57% |

-continued
| Ex. | Reactants | Product | Yield |
|---|---|---|---|
| L230 | S505<br>S226 | 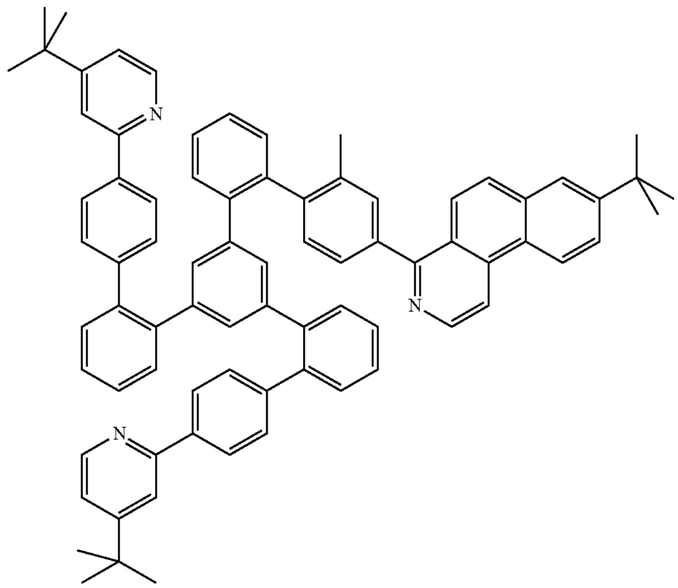 [SMILES: Cc1cc(-c2nccc3c2ccc2cc(C(C)(C)C)ccc23)ccc1-c1ccccc1-c1cc(-c2ccccc2-c2ccc(-c3cc(C(C)(C)C)ccn3)cc2)cc(-c2ccccc2-c2ccc(-c3cc(C(C)(C)C)ccn3)cc2)c1] | 69% |
| L231 | S502<br>S222 | 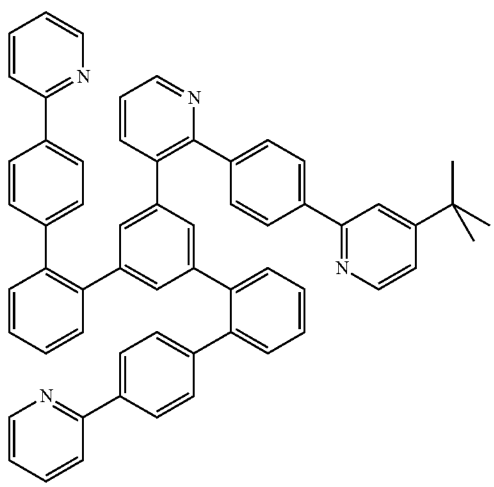 [SMILES: CC(C)(C)c1ccnc(-c2ccc(-c3ncccc3-c3cc(-c4ccccc4-c4ccc(-c5ccccn5)cc4)cc(-c4ccccc4-c4ccc(-c5ccccn5)cc4)c3)cc2)c1] | 64% |
| L232 | S502<br>S223 | 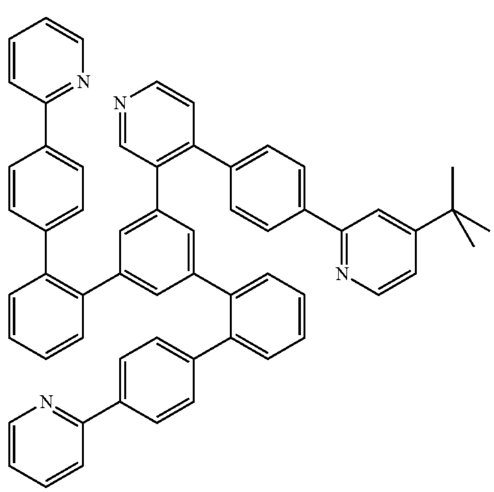 [SMILES: CC(C)(C)c1ccnc(-c2ccc(-c3ccncc3-c3cc(-c4ccccc4-c4ccc(-c5ccccn5)cc4)cc(-c4ccccc4-c4ccc(-c5ccccn5)cc4)c3)cc2)c1] | 67% |

-continued

| Ex. | Reactants | Product | Yield |
|---|---|---|---|
| L233 | S505<br>S224 | 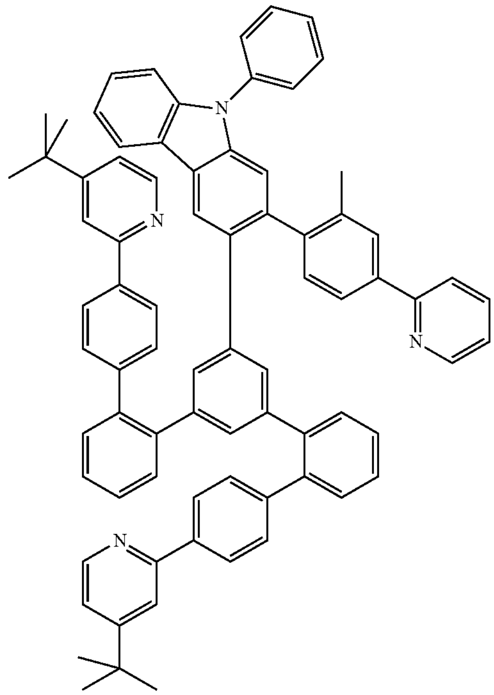 [SMILES: Cc1cc(-c2ccccn2)ccc1-c1cc2c(cc1-c1cc(-c3ccccc3-c3ccc(-c4cc(C(C)(C)C)ccn4)cc3)cc(-c3ccccc3-c3ccc(-c4cc(C(C)(C)C)ccn4)cc3)c1)c1ccccc1n2-c1ccccc1] | 61% |

Example L250

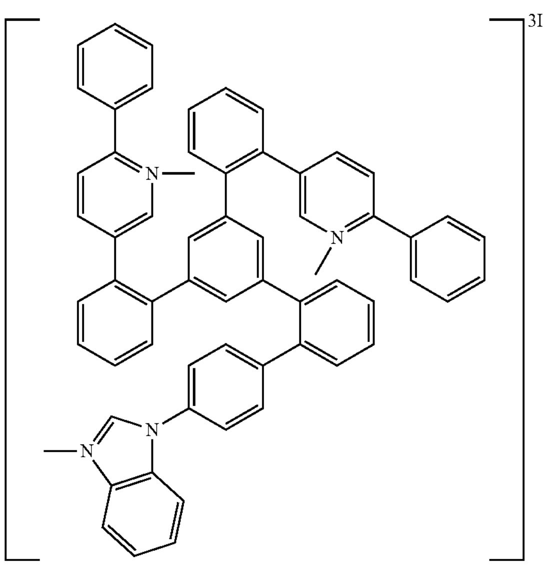

To a solution of 40.3 g (50 mmol) of S610 in 300 ml of DCM are added dropwise 18.8 ml (300 mmol) of methyl iodide [74-88-4] and the mixture is heated to 60° C. in a stirred autoclave for 24 h. After cooling, the solvent and excess methyl iodide are drawn off under reduced pressure. The ligand precursor thus obtained is converted without further purification. Yield: 61.5 g (50 mmol), quantitative. Purity: about 95% by $^1$H NMR.

In an analogous manner, it is possible to synthesize the following compounds:

| Ex. | Reactants | Product | Yield |
|---|---|---|---|
| L251 | S611 | 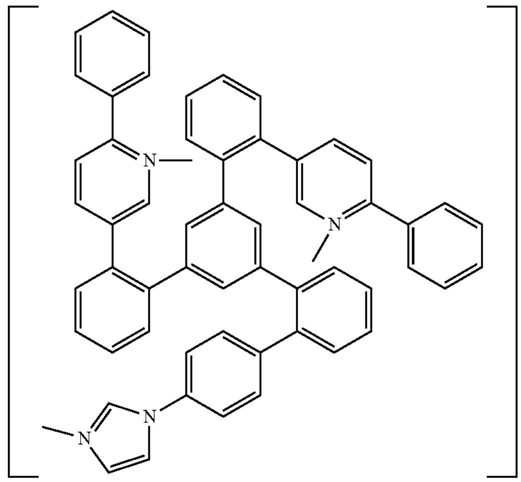 3I | quant. |
| L252 | S612 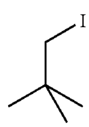 15502-33-4 | 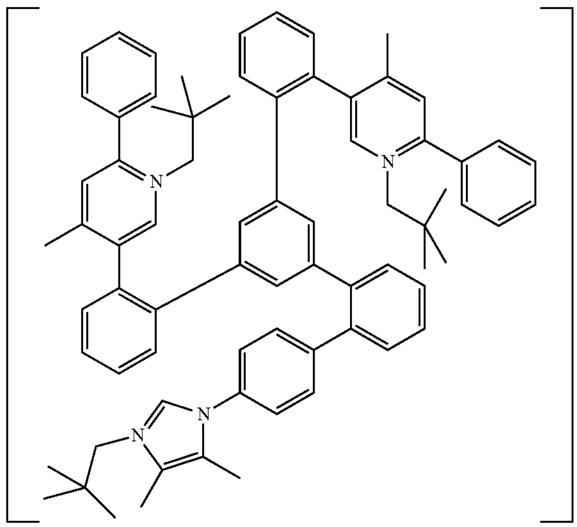 3I Dioxan, 140° C. | quant. |
| L253 | S613 | 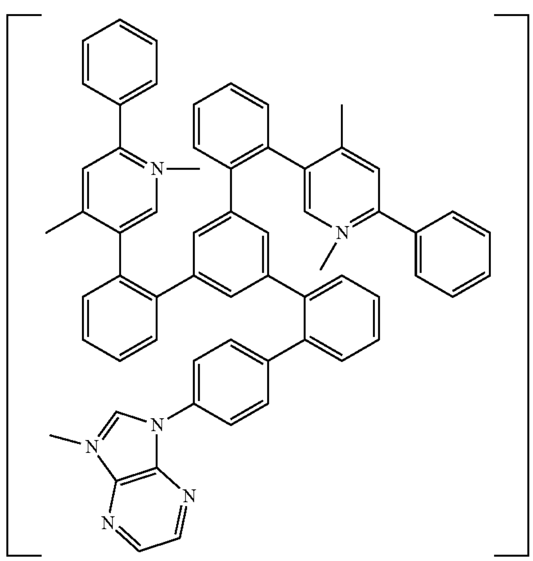 3I | quant. |

-continued
| Ex. | Reactants | Product | Yield |
|---|---|---|---|
| L254 | S614 | 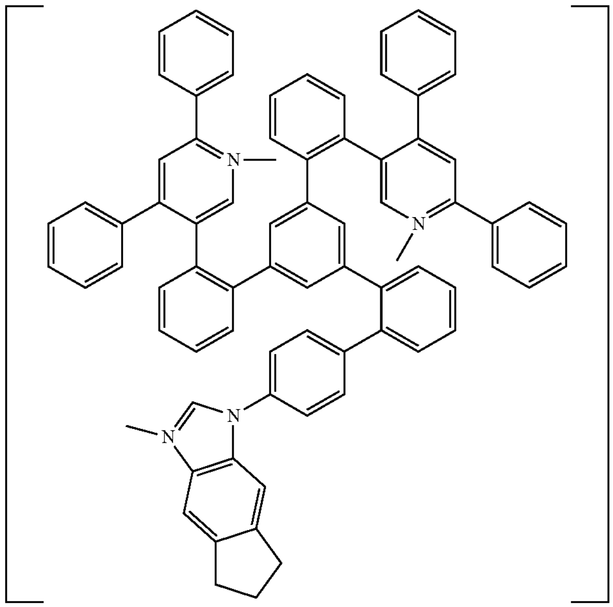 3I | quant. |
| L255 | S615 | 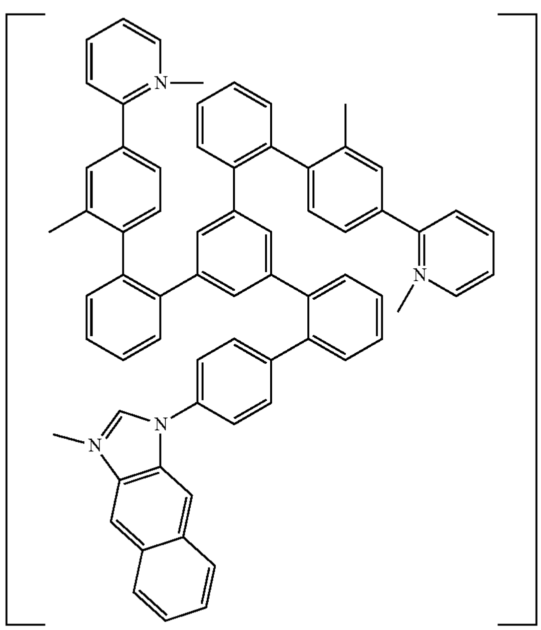 3I | quant. |

-continued
| Ex. | Reactants | Product | Yield |
|---|---|---|---|
| L256 | S616 | 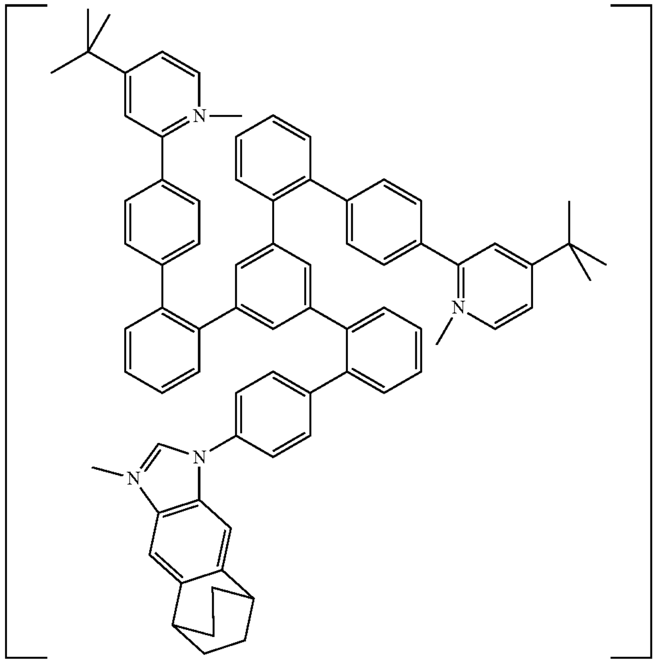 3I | quant. |
| L257 | S617<br>$D_3C$—I<br>865-50-9 | 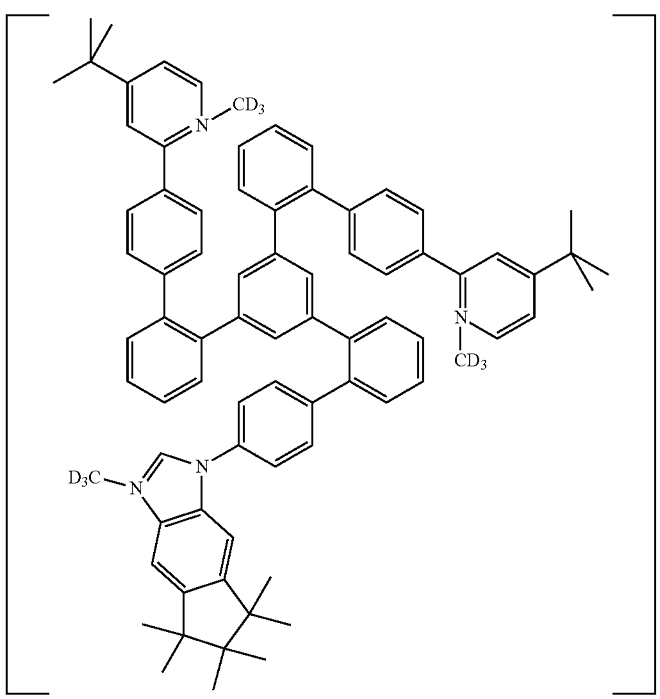 3I | quant. |

Example L260

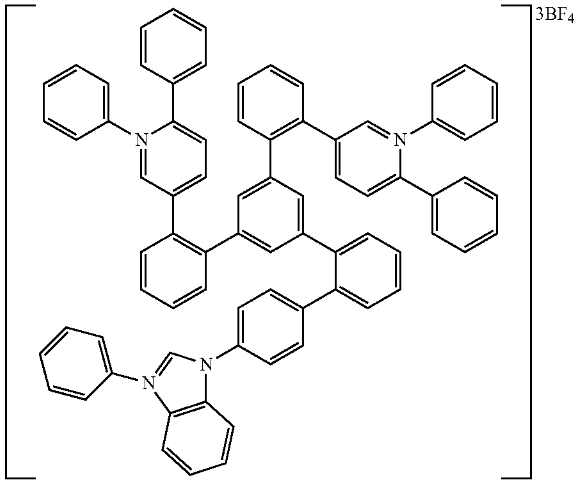

A mixture of 16.1 g (20 mmol) of S610, 23.9 g (85 mmol) of diphenyliodonium tetrafluoroborate [313-39-3], 363 mg (2 mmol) of copper(II) acetate [142-71-2] in 200 ml of DMF is heated to 100° C. for 8 h. After cooling, the solvent is removed under reduced pressure, the residue is taken up in a mixture of 100 ml of dichloromethane, 100 ml of acetone and 20 ml of methanol and filtered through a silica gel bed, and the core fraction is extracted and concentrated to dryness. The ligand precursor thus obtained is converted without further purification. Yield: 22.1 g (17 mmol) 85%. Purity: about 90% by $^{1}$H NMR.

In an analogous manner, it is possible to synthesize the following compounds:

| Ex. | Reactants | Product | Yield |
|---|---|---|---|
| L261 | S615 | 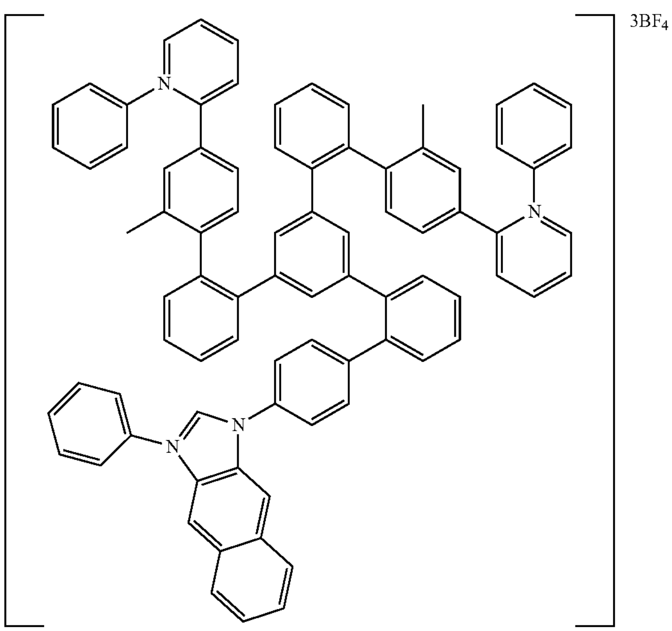 | 89% |

Example L270
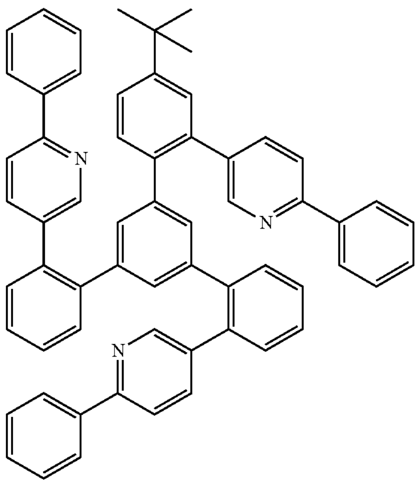 [SMILES: CC(C)(C)c1ccc(-c2cc(-c3ccccc3-c3ccc(-c4ccccc4)nc3)cc(-c3ccccc3-c3ccc(-c4ccccc4)nc3)c2)c(-c2ccc(-c3ccccc3)nc2)c1]
Procedure according to Ex. L2. Use of 12.0 g (20 mmol) of S660 and 19.7 g (70 mmol) of S22, the remaining components are adjusted proportionally. Yield: 10.7 g (13 mmol) 65%. Purity: 98% by $^1$H NMR.
In an analogous manner, it is possible to synthesize the following compounds:
| Ex. | Reactants | Product | Yield |
| --- | --- | --- | --- |
| L271 | S661<br>S103 | 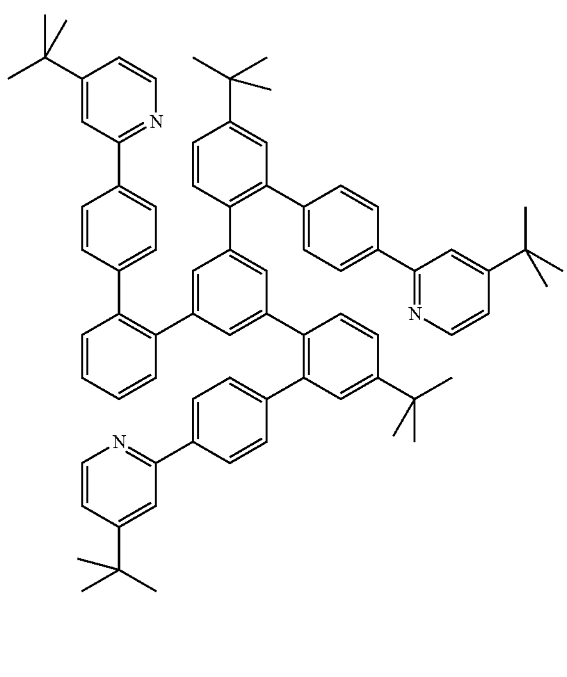 [SMILES: CC(C)(C)c1ccnc(-c2ccc(-c3ccccc3-c3cc(-c4ccc(C(C)(C)C)cc4-c4ccc(-c5cc(C(C)(C)C)ccn5)cc4)cc(-c4ccc(C(C)(C)C)cc4-c4ccc(-c5cc(C(C)(C)C)ccn5)cc4)c3)cc2)c1] | 69% |

-continued
| Ex. | Reactants | Product | Yield |
|---|---|---|---|
| L272 | S662<br>S121 | 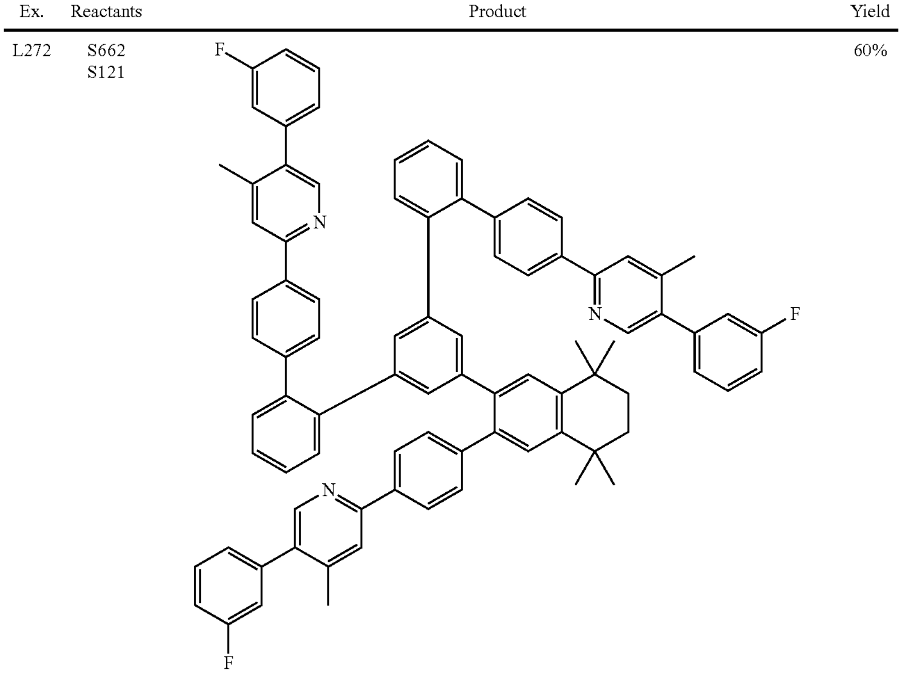 | 60% |
| L273 | S663<br>S118 | 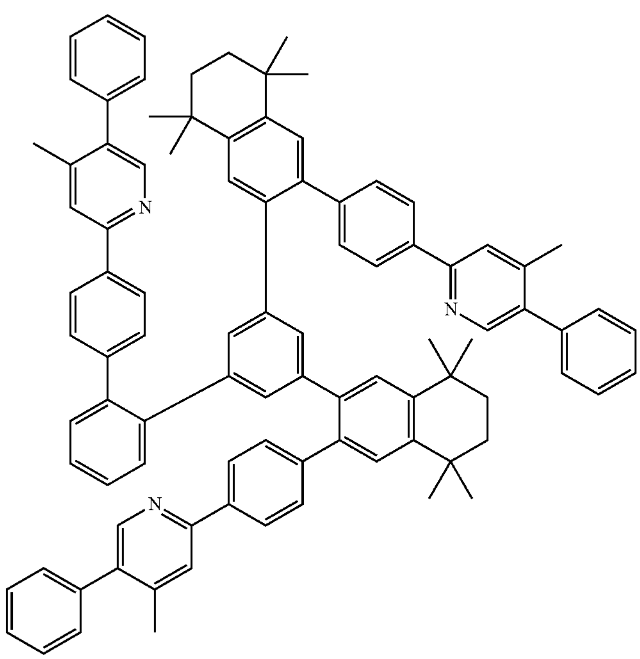 [SMILES: Cc1cc(-c2ccc(-c3ccccc3-c3cc(-c4cc5c(cc4-c4ccc(-c6cc(C)c(-c7ccccc7)cn6)cc4)C(C)(C)CCC5(C)C)cc(-c4cc5c(cc4-c4ccc(-c6cc(C)c(-c7ccccc7)cn6)cc4)C(C)(C)CCC5(C)C)c3)cc2)ncc1-c1ccccc1] | 65% |

-continued
| Ex. | Reactants | Product | Yield |
|---|---|---|---|
| L274 | S664<br>S627 | 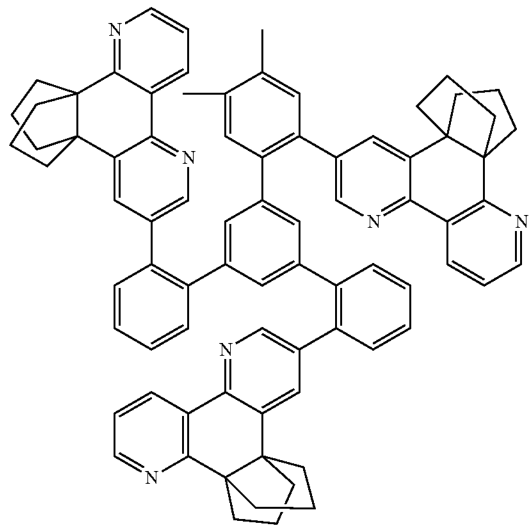 [SMILES: Cc1cc(-c2cc(-c3ccccc3-c3cnc4c(c3)C35CCCC3(CCC5)c3ncccc3-4)cc(-c3ccccc3-c3cnc4c(c3)C35CCCC3(CCC5)c3ncccc3-4)c2)c(-c2cnc3c(c2)C24CCCC2(CCC4)c2ncccc2-3)cc1C] | 70% |
| L275 | S665<br>S93 | 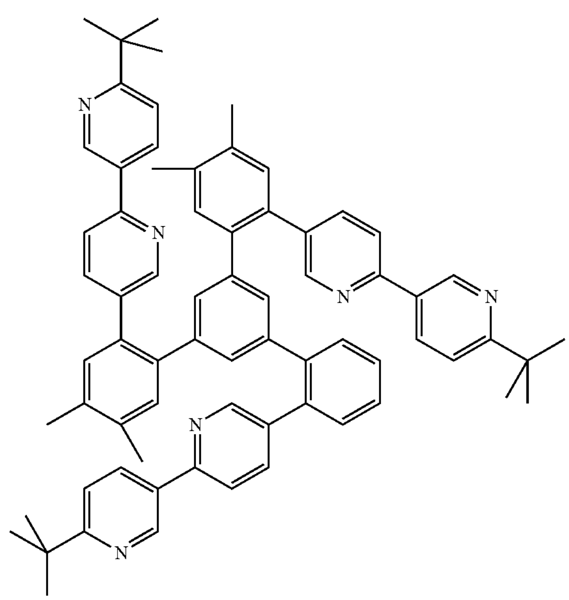 [SMILES: Cc1cc(-c2ccc(-c3ccc(C(C)(C)C)nc3)nc2)c(-c2cc(-c3ccccc3-c3ccc(-c4ccc(C(C)(C)C)nc4)nc3)cc(-c3cc(C)c(C)cc3-c3ccc(-c4ccc(C(C)(C)C)nc4)nc3)c2)cc1C] | 49% |

-continued
| Ex. | Reactants | Product | Yield |
| --- | --- | --- | --- |
| L276 | S666<br>S36 | 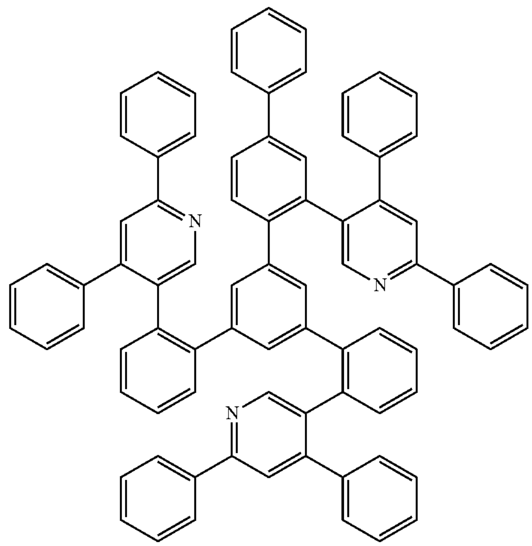 [SMILES: c1ccc(-c2ccc(-c3cc(-c4ccccc4-c4cnc(-c5ccccc5)cc4-c4ccccc4)cc(-c4ccccc4-c4cnc(-c5ccccc5)cc4-c4ccccc4)c3)c(-c3cnc(-c4ccccc4)cc3-c3ccccc3)c2)cc1] | 64% |
| L277 | S667<br>S60 | 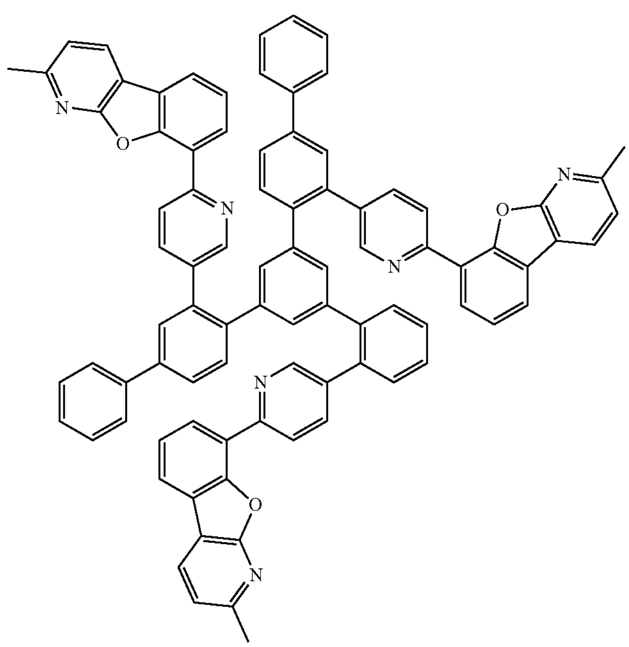 | 71% |

Example L59

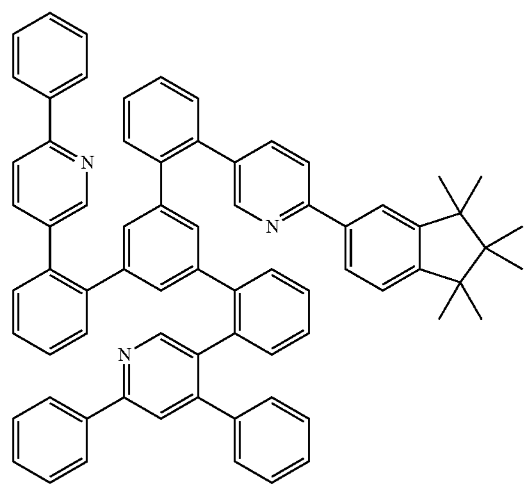 [SMILES: CC1(C)c2ccc(-c3ccc(-c4ccccc4-c4cc(-c5ccccc5-c5ccc(-c6ccccc6)nc5)cc(-c5ccccc5-c5cnc(-c6ccccc6)cc5-c5ccccc5)c4)cn3)cc2C(C)(C)C1(C)C]

a) L59-Intermediate1=L39-Intermediate1

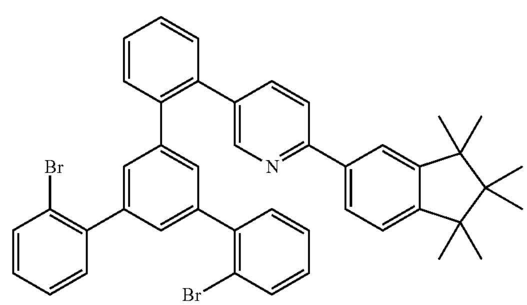 [SMILES: CC1(C)c2ccc(-c3ccc(-c4ccccc4-c4cc(-c5ccccc5Br)cc(-c5ccccc5Br)c4)cn3)cc2C(C)(C)C1(C)C]

b) L59-Intermediate2

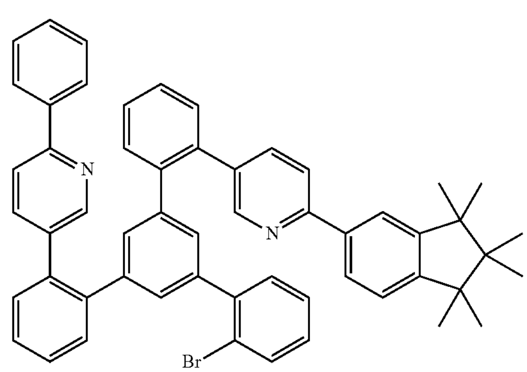 [SMILES: CC1(C)c2ccc(-c3ccc(-c4ccccc4-c4cc(-c5ccccc5Br)cc(-c5ccccc5-c5ccc(-c6ccccc6)nc5)c4)cn3)cc2C(C)(C)C1(C)C]

A mixture of 74.2 g (100 mmol) of L59-Intermediate1, 28.1 g (100 mmol) of 2-phenyl-5-(4,4,5,5-tetramethyl-[1,3,2]dioxaborolan-2-yl)pyridine, S22, also referred to hereinafter as boronic ester 2, 31.8 g (300 mmol) of sodium carbonate, 1.2 g (1 mmol) of tetrakis(triphenylphosphino)palladium(0), 300 ml of toluene, 100 ml of ethanol and 200 ml of water is heated under reflux with very good stirring for 24 h. After cooling, the aqueous phase is removed and the organic phase is concentrated to dryness. The brown foam is taken up in 300 ml of ethyl acetate and filtered through a silica gel bed pre-slurried with ethyl acetate (diameter 15 cm, length 20 cm) in order to remove brown components. Subsequently, the foam is chromatographed twice on silica gel (n-heptane:ethyl acetate 5:1). Yield: 29.4 g (36 mmol), 36%. Purity: about 95% by $^1$H NMR.

c) L59

A mixture of 24.5 g (30 mmol) of L59-Intermediate2, 22.5 g (40 mmol) of 2,4-diphenyl-5-(4,4,5,5-tetramethyl-[1,3,2]dioxaborolan-2-yl)pyridine, S36, also referred to hereinafter as boronic ester 3, 10.6 g (100 mmol) of sodium carbonate, 633 mg (0.6 mmol) of tetrakis(triphenylphosphino)palladium(0), 100 ml of toluene, 70 ml of ethanol and 150 ml of water is heated under reflux with very good stirring for 24 h. After 24 h, 100 ml of 5% by weight aqueous acetylcysteine solution are added, the mixture is stirred under reflux for a further 16 h and allowed to cool, the aqueous phase is removed and the organic phase is concentrated to dryness. The brown foam is taken up in 300 ml of ethyl acetate and filtered through a silica gel bed pre-slurried with ethyl acetate (diameter 15 cm, length 20 cm) in order to remove brown components. After concentrating to 100 ml, the solution is added dropwise to 500 ml of methanol with very good stirring, in the course of which a beige solid precipitates out. The solid is filtered off with suction, washed twice with 100 ml each time of methanol and dried under reduced pressure. The reprecipitation process is repeated again. Subsequently, the foam is chromatographed twice on silica gel (n-heptane:ethyl acetate 3:1). Yield: 15.4 g (16 mmol), 53%. Purity: about 99.0% by $^1$H NMR.

Remaining secondary components are frequently the disubstitution product and/or the debrominated disubstitution product. The purity is sufficient to use the ligands in the o-metallation reaction. The ligands can be purified further if required by repeated chromatography on silica gel (n-heptane or cyclohexane or toluene in combination with ethyl acetate). Alternatively, it is possible to recrystallize the ligands from ethyl acetate, optionally with addition of MeOH or EtOH. Ligands having a molar mass of less than about 1000-1200 g/mol can be subjected to Kugelrohr sublimation under high vacuum (p about $10^{-5}$ mbar).

In an analogous manner, it is possible to prepare the following compounds:

| Ex. | Bromide Boronic acid/ ester 1, 2 and 3 | Product | Yield |
|---|---|---|---|
| L60 | S50<br>S22<br>S24<br>S36 | 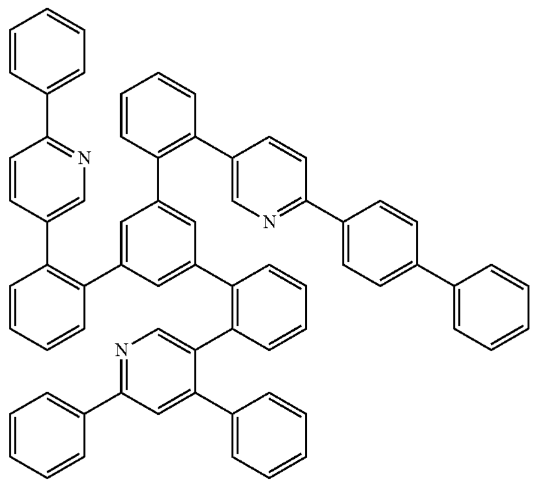 [SMILES: c1ccc(-c2ccc(-c3ccc(-c4ccccc4-c4cc(-c5ccccc5-c5ccc(-c6ccccc6)nc5)cc(-c5ccccc5-c5cnc(-c6ccccc6)cc5-c5ccccc5)c4)cn3)cc2)cc1] | 11% |
| L61 | S50<br>S22<br>S26<br>S27 | 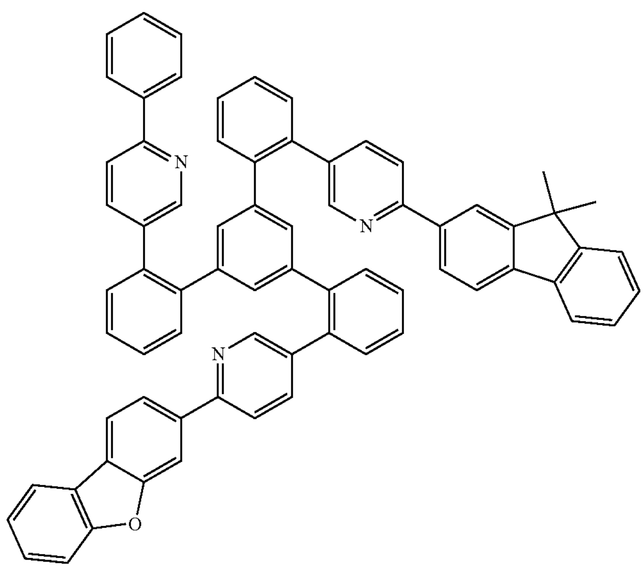 | 10% |
| L62 | S50<br>S22<br>S33<br>S40 | 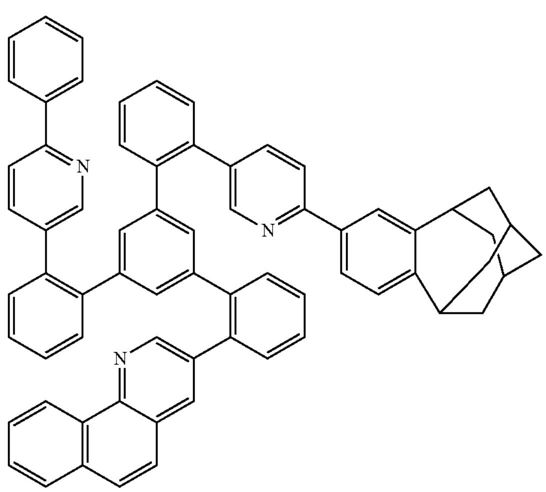 [SMILES: c1ccc(-c2ccc(-c3ccccc3-c3cc(-c4ccccc4-c4ccc(-c5ccc6c(c5)C5CC7CC(CC6C7)C5)nc4)cc(-c4ccccc4-c4cnc5c(ccc6ccccc65)c4)c3)cn2)cc1] | 13% |

Example L65

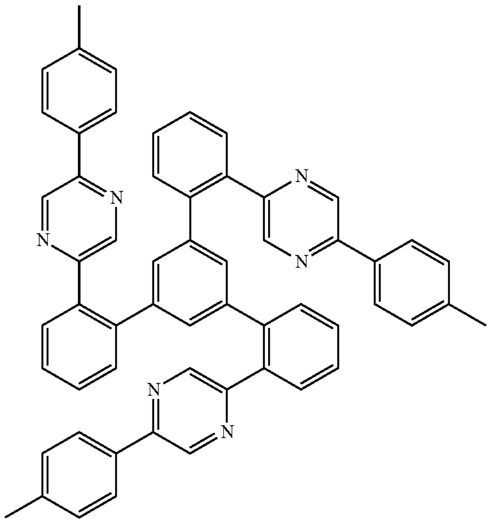

Procedure analogous to Example L1, with replacement of S21 by 103.7 g (350 mmol) of 2-(4-methylphenyl)-5-(4,4,5,5-tetramethyl-1,3,2-dioxaborolan-2-yl)pyrazine [1402172-34-2]. Purification: After the organic phase from the Suzuki coupling has been concentrated, the brown foam is taken up in 300 ml of a mixture of dichloromethane:ethyl acetate (8:1, v/v) and filtered through a silica gel bed pre-slurried with dichloromethane:ethyl acetate (8:1, v/v) (diameter 15 cm, length 20 cm), in order to remove brown components. After concentration, the remaining foam is recrystallized three times from 600 ml of ethyl acetate and then subjected to Kugelrohr sublimation under high vacuum (p about $10^{-5}$ mbar, T=290° C.). Yield: 38.9 g (48 mmol), 48%. Purity: about 99.5% by $^{1}$H NMR.

In an analogous manner, it is possible to prepare the following compounds:

| Ex. | Bromide/boronic acid or ester | Product | Yield |
|---|---|---|---|
| L66 | S50 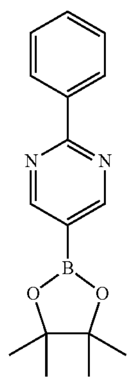 [1264510-78-2] | 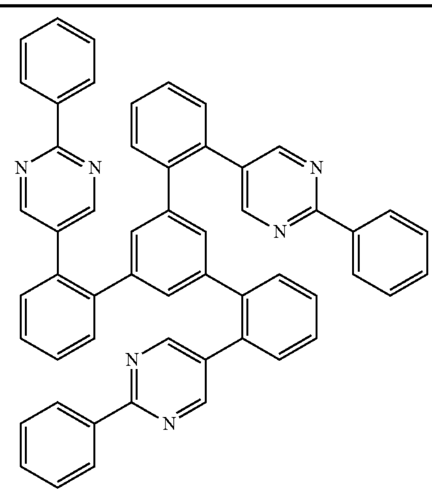 | 53% |
| L67 | S50 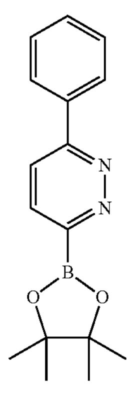 [1258867-70-7] | 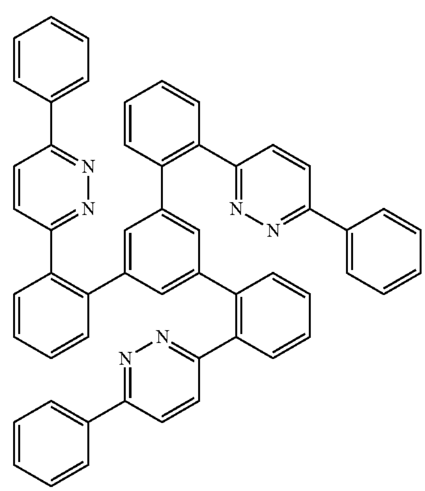 | 46% |

-continued

| Ex. | Bromide/boronic acid or ester | Product | Yield |
|---|---|---|---|
| L110 | S50<br>S61 | 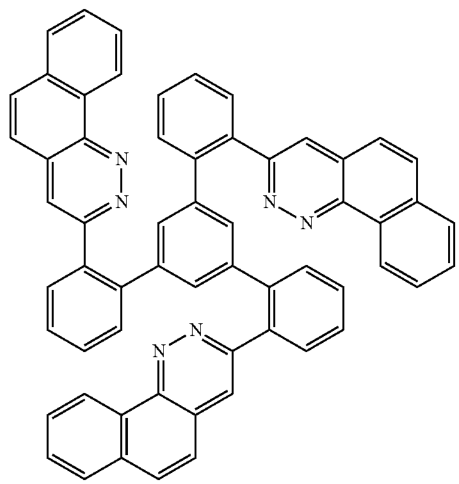 [SMILES: c1ccc(-c2cc3ccc4ccccc4c3nn2)c(-c2cc(-c3ccccc3-c3cc4ccc5ccccc5c4nn3)cc(-c3ccccc3-c3cc4ccc5ccccc5c4nn3)c2)c1] | 63% |

Example L68

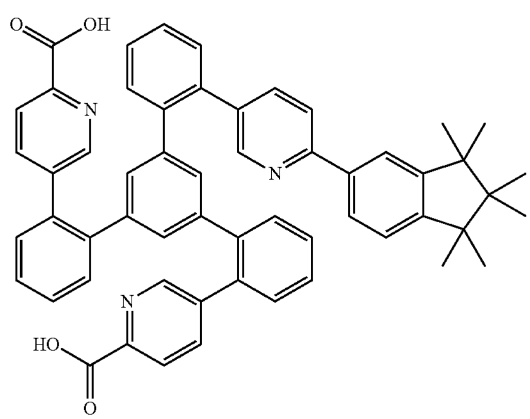 [SMILES: CC1(C)c2ccc(-c3ccc(-c4ccccc4-c4cc(-c5ccccc5-c5ccc(C(=O)O)nc5)cc(-c5ccccc5-c5ccc(C(=O)O)nc5)c4)cn3)cc2C(C)(C)C1(C)C]

a) L68 Intermediate1=L39-Intermediate1

For preparation see L39.

b) L68:

A mixture of 22.3 g (30 mmol) of L68-Intermediate1, 22.5 g (80 mmol) of 5-borono-2-pyridinecarboxylic acid [913836-11-0], also referred to hereinafter as boronic ester 2, 63.6 g (600 mmol) of sodium carbonate, 3.5 g (3 mmol) of tetrakis(triphenylphosphino)palladium(0), 600 ml of toluene, 200 ml of ethanol and 400 ml of water is heated under reflux with very good stirring for 24 h. After cooling, the mixture is cautiously neutralized by adding 10 N hydrochloric acid, the aqueous phase is removed and re-extracted with 200 ml of ethyl acetate, and the combined organic phases are filtered through Celite and then concentrated to dryness. The residue is recrystallized three times from DMF with addition of ethanol and then twice from acetonitrile. Yield: 10.7 g (13 mmol), 43%. Purity: about 99.0% by $^1$H NMR.

Remaining secondary components are frequently the disubstitution product and/or the debrominated disubstitution product. The purity is sufficient to use the ligands in the o-metallation reaction. The ligands can be purified further if required by repeated chromatography on silica gel (n-heptane or cyclohexane or toluene in combination with ethyl acetate). Alternatively, it is possible to recrystallize the ligands from ethyl acetate, optionally with addition of MeOH or EtOH. Ligands having a molar mass of less than about 1000-1200 g/mol can be subjected to Kugelrohr sublimation under high vacuum (p about $10^{-5}$ mbar).

In an analogous manner, it is possible to prepare the following compounds:

| Ex. | Bromide boronic acid/ester 1 and 2 | Product | Yield |
|---|---|---|---|
| L69 | S50 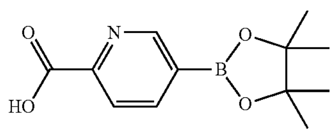 [SMILES: CC1(C)OB(c2ccc(C(=O)O)nc2)OC1(C)C] 1 × [913836-11-0] 2 × S22 | 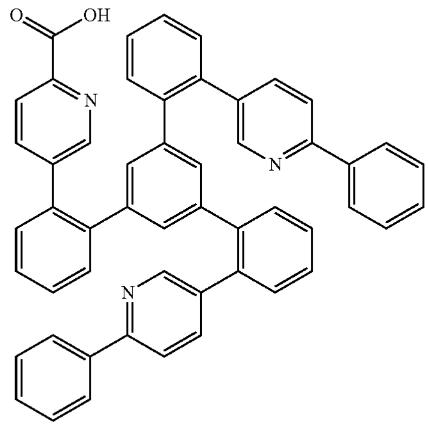 [SMILES: O=C(O)c1ccc(-c2ccccc2-c2cc(-c3ccccc3-c3ccc(-c4ccccc4)nc3)cc(-c3ccccc3-c3ccc(-c4ccccc4)nc3)c2)cn1] | 26% |
| L70 | S50 1 × S56 2 × S22 | 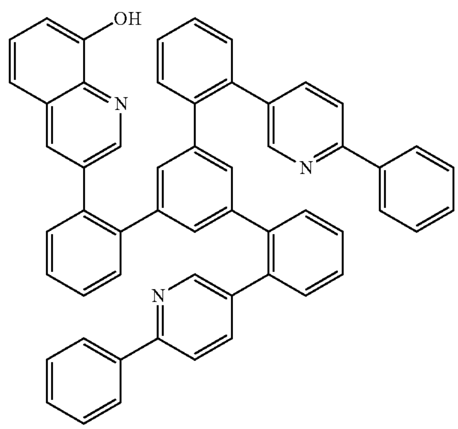 [SMILES: Oc1cccc2cc(-c3ccccc3-c3cc(-c4ccccc4-c4ccc(-c5ccccc5)nc4)cc(-c4ccccc4-c4ccc(-c5ccccc5)nc4)c3)cnc12] | 21% |

Example L280

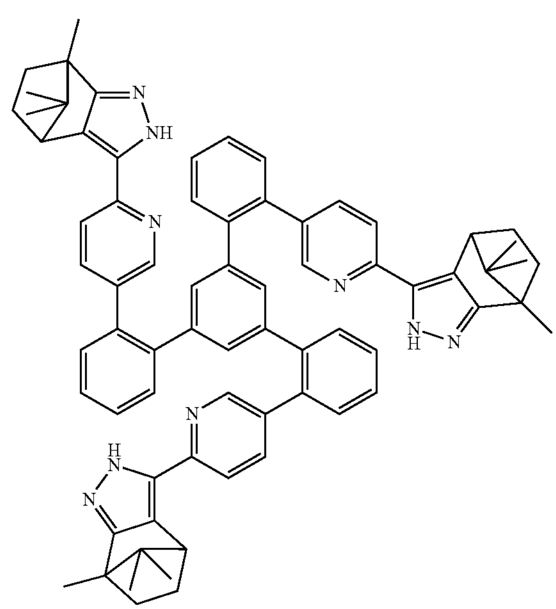 [SMILES: CC12CCC(c3c1n[nH]c3-c1ccc(-c3ccccc3-c3cc(-c4ccccc4-c4ccc(-c5[nH]nc6c5C5CCC6(C)C5(C)C)nc4)cc(-c4ccccc4-c4ccc(-c5[nH]nc6c5C5CCC6(C)C5(C)C)nc4)c3)cn1)C2(C)C]

To a well-stirred suspension, cooled to 0° C., of 2.4 g (100 mmol) of sodium hydride in 200 ml of THF is added dropwise a solution of 15.2 g (100 mmol) of (1R)-(+)-camphor [464-49-3] in 100 ml of THF (caution: evolution of hydrogen). After stirring at 0° C. for a further 15 min and at room temperature for a further 30 min, the reaction mixture is admixed with 21.4 g (30 mmol) of L124 and then stirred under reflux for 5 h. After cooling, quenching is effected by cautious addition of 5% by weight hydrochloric acid to pH=8. The mixture is extended with 300 ml of water and 300 ml of ethyl acetate, the organic phase is removed, the aqueous phase is extracted three times with 200 ml each time of ethyl acetate, and the organic phases are combined and washed twice with 300 ml of water and once with 300 ml of saturated sodium chloride solution and then dried over magnesium sulphate. The yellow oil obtained after removal of the ethyl acetate is dissolved in 200 ml of ethanol, 21.0 ml (150 mmol) of hydrazine hydrate are added dropwise while stirring and then the mixture is heated under reflux for 16 h. After cooling, the solvent is removed under reduced pressure, and the residue is dissolved in 500 ml of ethyl acetate, washed twice with 300 ml of water and once with 300 ml of saturated sodium chloride solution, and then dried over magnesium sulphate. The residue obtained after the solvent has been removed is recrystallized twice from acetonitrile/ethyl acetate. Yield: 14.6 g (13.8 mmol), 46%. Purity: about 97.0% by $^{1}$H NMR.

Example L290

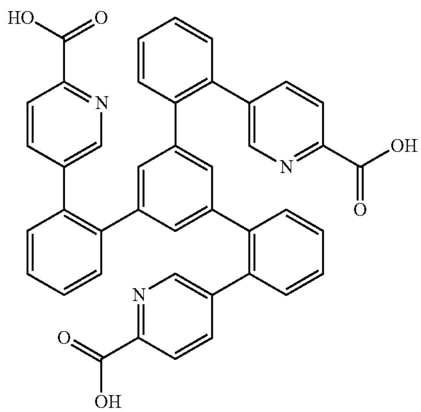 [SMILES: O=C(O)c1ccc(-c2ccccc2-c2cc(-c3ccccc3-c3ccc(C(=O)O)nc3)cc(-c3ccccc3-c3ccc(C(=O)O)nc3)c2)cn1]

A mixture of 71.2 g (100 mmol) of L124, 22.4 g (400 mmol) of KOH, 400 ml of ethanol and 100 ml of water is heated under reflux for 8 h. The solvent is substantially removed under reduced pressure, 300 ml of water are added and the mixture is acidified with acetic acid to pH 5-6. The mixture is extracted five times with 200 ml of dichloromethane each time and the combined extracts are dried over magnesium sulphate. The crude product obtained after the solvent has been removed is converted without further purification. Yield: 63.6 g (95 mmol), 92%. Purity: about 95.0% by $^{1}H$ NMR.

Example L2: Preparation by Cyclotrimerization of Alkynes

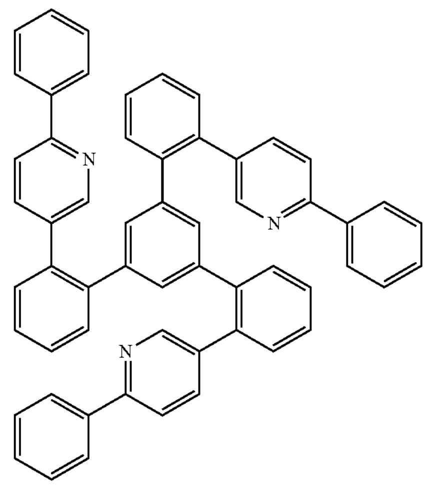 [SMILES: c1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cc1]

To a solution of 25.5 g (100 mmol) of S680 in 200 ml of dioxane are added 1.8 g (10 mmol) of dicarbonylcyclopentadienylcobalt [12078-25-0] and the mixture is heated under reflux for three days. After cooling, the solvent is removed under reduced pressure, and the residue is taken up in dichloromethane and filtered through a pre-slurried silica gel bed. After concentration, the remaining foam is recrystallized from 200 ml of ethyl acetate with addition of 100 ml of methanol at boiling and then for a second time from 400 ml of pure ethyl acetate and then subjected to Kugelrohr sublimation under high vacuum (p about $10^{-5}$ mbar, T 280° C.). Yield: 20.7 g (27 mmol), 81%. Purity: about 99.5% by $^{1}H$ NMR.

In an analogous manner, it is possible to prepare L111 from S681; yield: 77%.

Example L2: Preparation from 2,2,2"-(1,3,5-benzenetriyl)tris [4,4,5,5-tetramethyl-1,3,2-dioxaborolane Procedure according to Ex. L2, Variant B. Use of 45.6 g (100 mmol) of 2,2',2"-(1,3,5-benzenetriyl)tris[4,4,5,5-tetramethyl-1,3,2-dioxaborolane [365564-05-2] and 96.2 g (310 mmol) of S200; the remaining components are adjusted proportionally. Yield: 52.1 g (68 mmol) 68%. Purity: 98% by $^{1}H$ NMR.

In an analogous manner, it is possible to prepare the following compounds:

| Ex. | Boronic ester bromide | Product | Yield |
|---|---|---|---|
| L300 | 365564-05-2 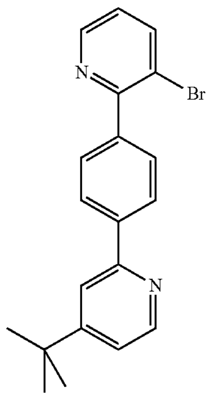 [SMILES: CC(C)(C)c1ccnc(-c2ccc(-c3ncccc3Br)cc2)c1] S222 | 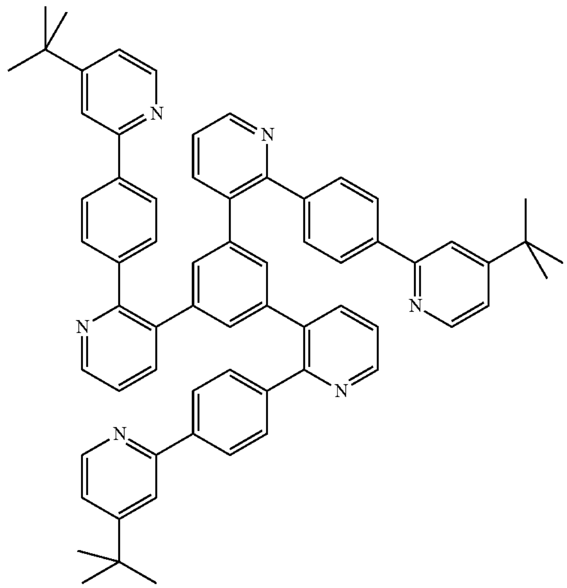 [SMILES: CC(C)(C)c1ccnc(-c2ccc(-c3ncccc3-c3cc(-c4cccnc4-c4ccc(-c5cc(C(C)(C)C)ccn5)cc4)cc(-c4cccnc4-c4ccc(-c5cc(C(C)(C)C)ccn5)cc4)c3)cc2)c1] | 41% |
| L301 | 365564-05-2 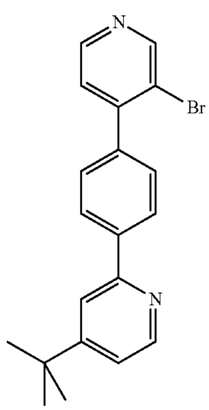 [SMILES: CC(C)(C)c1ccnc(-c2ccc(-c3ccncc3Br)cc2)c1] S223 | 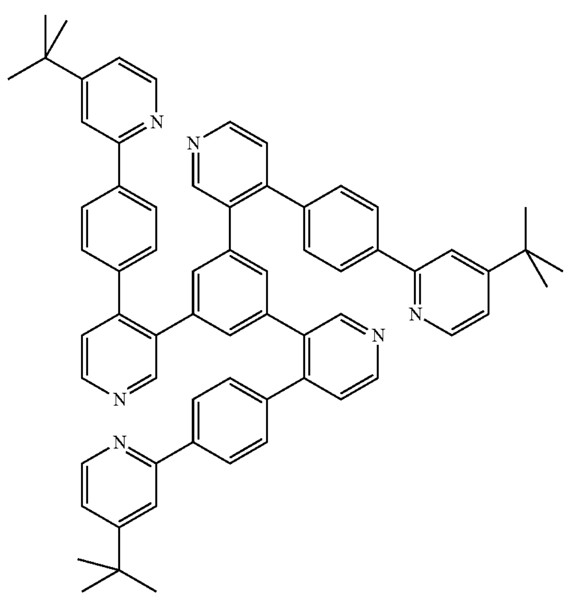 [SMILES: CC(C)(C)c1ccnc(-c2ccc(-c3ccncc3-c3cc(-c4cnccc4-c4ccc(-c5cc(C(C)(C)C)ccn5)cc4)cc(-c4cnccc4-c4ccc(-c5cc(C(C)(C)C)ccn5)cc4)c3)cc2)c1] | 62% |

-continued

| Ex. | Boronic ester bromide | Product | Yield |
|---|---|---|---|
| L302 | 365564-05-2 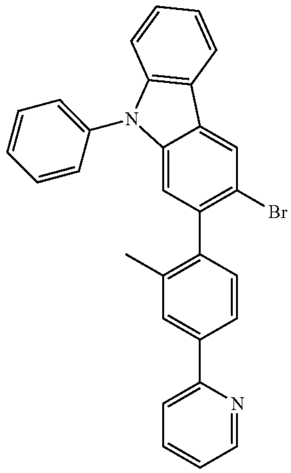 [SMILES: Cc1cc(-c2ccccn2)ccc1-c1cc2c(cc1Br)c1ccccc1n2-c1ccccc1] S224 | 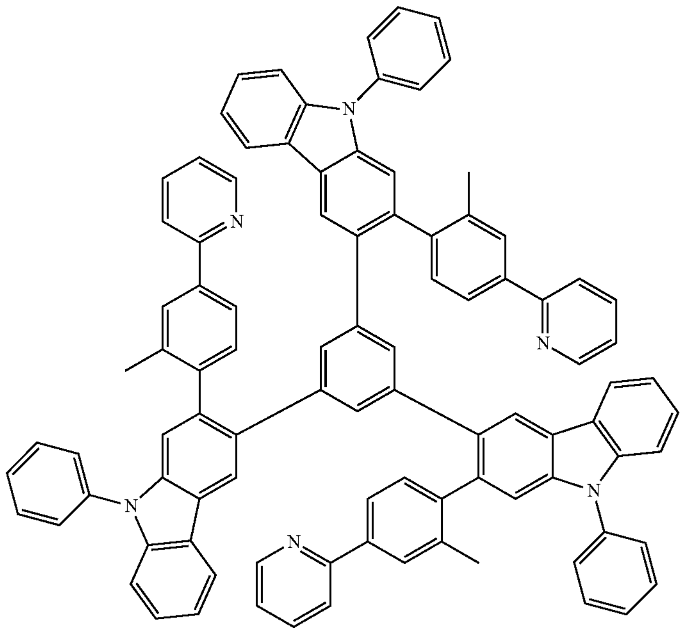 [SMILES: Cc1cc(-c2ccccn2)ccc1-c1cc2c(cc1-c1cc(-c3cc4c5ccccc5n(-c5ccccc5)c4cc3-c3ccc(-c4ccccn4)cc3C)cc(-c3cc4c5ccccc5n(-c5ccccc5)c4cc3-c3ccc(-c4ccccn4)cc3C)c1)c1ccccc1n2-c1ccccc1] | 60% |

C: Synthesis of the Metal Complexes—Part 1

Example Ir(L1)

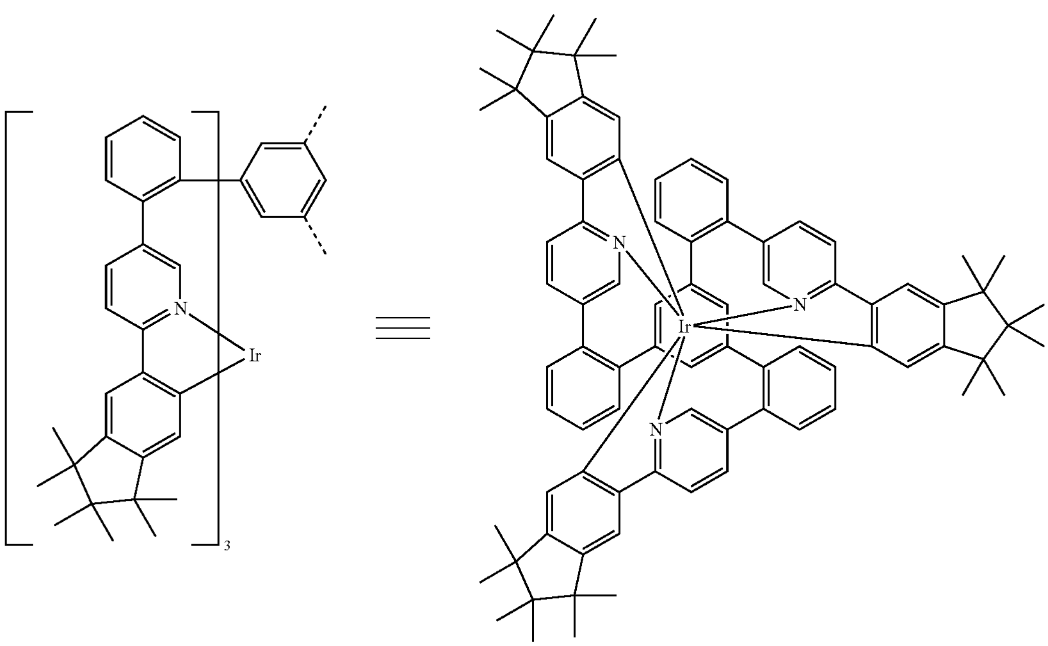

Variant A:

A mixture of 11.39 g (10 mmol) of ligand L1, 4.90 g (10 mmol) of trisacetylacetonatoiridium(III) [15635-87-7] and 120 g of hydroquinone [123-31-9] is initially charged in a 500 ml two-neck round-bottomed flask with a glass-sheathed magnetic core. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer core. Then the apparatus is thermally insulated with several loose windings of domestic aluminium foil, the insulation being run up to the middle of the riser tube of the water separator. Then the apparatus is heated rapidly with a heated laboratory stirrer system to 250-260° C., measured with the Pt-100 thermal sensor which dips into the molten stirred reaction mixture. Over the next 1.5 h, the reaction mixture is kept at 250-260° C., in the course of which a small amount of condensate is distilled off and collects in the water separator. After cooling, the melt cake is mechanically comminuted and extracted by boiling with 500 ml of methanol. The beige suspension thus obtained is filtered through a double-ended frit, and the beige solid is washed once with 50 ml of methanol and then dried under reduced pressure. Crude yield: quantitative. The solid thus obtained is dissolved in 200 ml of dichloromethane and filtered through about 1 kg of dichloromethane-preslurried silica gel (column diameter about 18 cm) with exclusion of air in the dark, leaving dark-coloured components at the start. The core fraction is cut out and concentrated on a rotary evaporator, with simultaneous continuous dropwise addition of MeOH until crystallization. After removal with suction, washing with a little MeOH and drying under reduced pressure, the orange product is purified further by continuous hot extraction five times with toluene/acetonitrile 3:1 (v/v) and hot extraction twice with ethyl acetate (amount initially charged in each case about 150 ml, extraction thimble: standard Soxhlet thimbles made from cellulose from Whatman) with careful exclusion of air and light. Finally, the product is heat-treated at 330° C. under high vacuum. Yield: 11.15 g (8.4 mmol), 84%. Purity: >99.9% by HPLC.

Example Ir(L2)

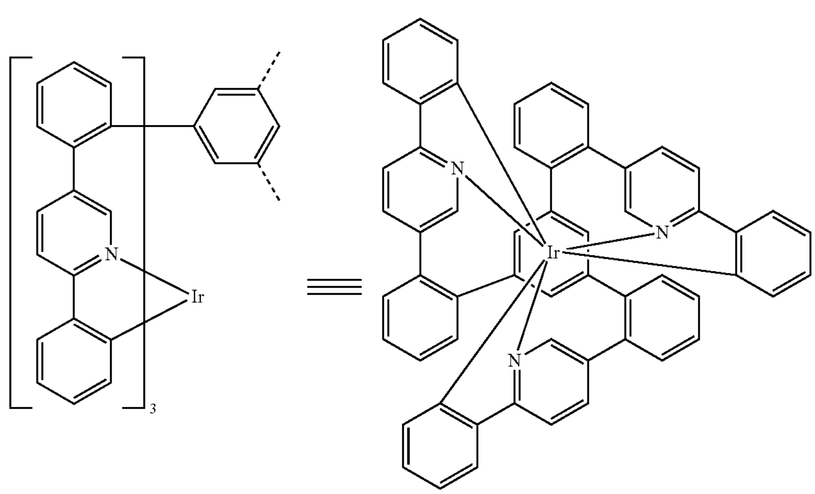

Variant B:

Procedure analogous to Ir(L1). Crude yield: quantitative. The solid thus obtained is dissolved in 1500 ml of dichloromethane and filtered through about 1 kg of dichloromethane-preslurried silica gel (column diameter about 18 cm) with exclusion of air in the dark, leaving dark-coloured components at the start. The core fraction is cut out and substantially concentrated on a rotary evaporator, with simultaneous continuous dropwise addition of MeOH until crystallization. After removal with suction, washing with a little MeOH and drying under reduced pressure, the yellow product is purified further by continuous hot extraction three times with toluene/acetonitrile (3:1, v/v) and hot extraction five times with toluene (amount initially charged in each case about 150 ml, extraction thimble: standard Soxhlet thimbles made from cellulose from Whatman) with careful exclusion of air and light. Finally, the product is subjected to fractional sublimation twice under high vacuum at p about $10^{-5}$ mbar and T about 380° C. Yield: 7.74 g (8.1 mmol), 81%. Purity: >99.9% by HPLC.

Variant C:

Procedure analogous to Ir(L2) Variant B, except that 300 ml of diethylene glycol [111-46-6] are used rather than 120 g of hydroquinone and the mixture is stirred at 225° C. for 16 h. After cooling to 70° C., the mixture is diluted with 300 ml of ethanol, and the solids are filtered off with suction (P3), washed three times with 100 ml each time of ethanol and then dried under reduced pressure. Further purification is effected as described in Variant B. Yield: 7.35 g (7.7 mmol), 77%. Purity: >99.9% by HPLC.

Variant C*:

Procedure analogous to Ir(L2) Variant B, except that 300 ml of ethylene glycol [107-21-1] are used rather than 120 g of hydroquinone and the mixture is stirred under reflux for 24 h. After cooling to 70° C., the mixture is diluted with 300 ml of ethanol, and the solids are filtered off with suction (P3), washed three times with 100 ml each time of ethanol and then dried under reduced pressure. Further purification is effected as described in Variant B. Yield: 7.54 g (7.9 mmol), 79%. Purity: >99.9% by HPLC.

Variant D:

Procedure analogous to Ir(L2) Variant B, except that 3.53 g (10 mmol) of iridium(III) chloride×n $H_2O$ (n about 3) are used rather than 4.90 g (10 mmol) of trisacetylacetonatoiridium(III) [15635-87-7] and 300 ml of diethylene glycol [111-46-6] rather than 120 g of hydroquinone, and the mixture is stirred at 225° C. for 16 h. After cooling to 70° C., the mixture is diluted with 300 ml of ethanol, and the solids are filtered off with suction (P3), washed three times with 100 ml each time of ethanol and then dried under reduced pressure. Further purification is effected as described in Variant B. Yield: 5.64 g (5.9 mmol), 59%. Purity: >99.9% by HPLC.

Variant E: Tris-Carbene Complexes

A suspension of 20 mmol of the carbene ligand and 60 mmol of $Ag_2O$ in 300 ml of dioxane is stirred at 30° C. for 12 h. Then 10 mmol of $[Ir(COD)Cl]_2$ [12112-67-3] are added and the mixture is heated under reflux for 8 h. The solids are filtered off while the mixture is still hot and they are washed three times with 50 ml each time of hot dioxane, and the filtrates are combined and concentrated to dryness under reduced pressure. The crude product thus obtained is chromatographed twice on basic alumina with ethyl acetate/cyclohexane or toluene. The product is purified further by continuous hot extraction five times with acetonitrile and hot extraction twice with ethyl acetate/methanol (amount initially charged in each case about 200 ml, extraction thimble: standard Soxhlet thimbles made from cellulose from Whatman) with careful exclusion of air and light. Finally, the product is sublimed and/or heat-treated under high vacuum. Purity: >99.8% by HPLC.

Variant F: Complexes with a Mixed Phenylpyridine and Carbene Coordination Set

Procedure analogous to Variant A, except that 2.5 g (20 mmol) of 4-dimethylaminopyridine [112258-3] and 2.3 g (10 mmol) of silver(I) oxide [20667-12-3] are added to the reaction mixture.

The metal complexes are typically obtained as a 1:1 mixture of the Λ and Δ isomers/enantiomers. Images of complexes adduced hereinafter typically show only one isomer. If ligands having three different sub-ligands are used, or chiral ligands are used as a racemate, the metal complexes derived are obtained as a diastereomer mixture. These can be separated by fractional crystallization or by chromatographic means. If chiral ligands are used in enantiomerically pure form, the metal complexes derived are obtained as a diastereomer mixture, the separation of which by fractional crystallization or chromatography leads to pure enantiomers.

In an analogous manner, it is possible to prepare the following compounds:

| Ex. | Ligand Metal synthon* | Product | Variant Reaction time* Reaction temperature* Extractant* | Yield |
|---|---|---|---|---|
| Rh(L2) | L2 Rh(acac)$_3$ 14284-92-5 | Rh(L2) | 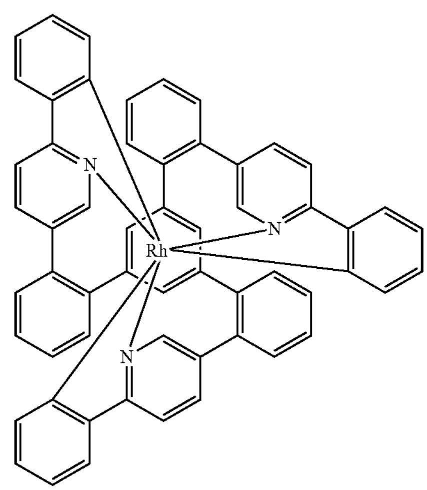 B | 56% |
| Ir(L3) | L3 | Ir(L3) | A<br>C | 76%<br>78% |
| Ru(L3) | L3 RuCl$_3$ * 3H2O 13815-94-6 | Ru(L3) | B | 48% |
| Ir(L4) | L4 | Ir(L4) | A<br>C | 72%<br>69% |
| Ir(L5) | L5 | Ir(L5) | A | 64% |
| Ir(L6) | L6 | Ir(L6) | A | 71% |
| Ir(L7) | L7 | Ir(L7) | A | 70% |
| Ir(L8) | L8 | Ir(L8) | A | 63% |
| Ir(L9) | L9 | Ir(L9) | A | 69% |
| Ir(L10) | L10 | Ir(L10) | A<br>D | 77%<br>51% |
| Ir(L11) | L11 | Ir(L11) | A | 74% |
| Ir(L12) | L12 | Ir(L12) | A | 69% |
| Ir(L13) | L13 | Ir(L13) | A | 75% |
| Ir(L14) | L14 | Ir(L14) | B o-xylene | 80% |
| Ir(L15) | L15 | Ir(L15) | A | 78% |
| Ir(L16) | L16 | Ir(L16) | A | 74% |

-continued

| Ex. | Ligand Metal synthon* | Product | Variant Reaction time* Reaction temperature* Extractant* | Yield |
|---|---|---|---|---|
| Ir(L17) | L17 | Ir(L17) | A | 77% |
| Ir(L18) | L18 | Ir(L18) | A | 54% |
| Ir(L19) | L19 | Ir(L19) | B 12 h o-xylene | 67% |
| Ir(L20) | L20 | Ir(L20) | B 10 h 260° C. | 51% |
| Ir(L21) | L21 | Ir(L21) | B 16 h o-xylene | 59% |
| Ir(L22) | L22 | Ir(L22) | B 16 h | 62% |
| Ir(L23) | L23 | Ir(L23) | B 16 h 270° C. | 54% |
| Ir(L24) | L24 | Ir(L24) | A | 67% |
| Ir(L25) | L25 | Ir(L25) | A | 69% |
| Ir(L26) | L26 | Ir(L26) | A | 73% |
| Ir(L27) | L27 | Ir(L27) | B | 64% |
| Ir(L28) | L28 | Ir(L28) | B | 76% |
| Ir(L29) | L29 | Ir(L29) | A | 71% |
| Ir(L30) | L30 | Ir(L30) | A | 51% |
| Ir(L31) | L31 | Ir(L31) | A | 55% |
| Ir(L32) | L32 | Ir(L32) | A | 70% |
| | | | C | 71% |
| Ir(L33) | L33 | Ir(L33) | A | 38% |
| Ir(L34) | L34 | Ir(L34) | B | 42% |
| Ir(L35) | L35 | Ir(L35) | B | 68% |
| Ir(L36) | L36 | Ir(L36) | B | 65% |
| Ir(L37) | L37 | Ir(L37) | B | 70% |
| Ir(L38) | L38 | Ir(L38) | B | 66% |
| Ir(L39) | L39 | Ir(L39) | A | 61% |
| Ir(L40) | L40 | Ir(L40) | A | 58% |
| Ir(L41) | L41 | Ir(L41) | B | 69% |
| Ir(L42) | L42 | Ir(L42) | B | 64% |
| Ir(L43) | L43 | Ir(L43) | B | 64% |
| Ir(L44) | L44 | Ir(L44) | B | 59% |
| Ir(L45) | L45 | Ir(L45) | B | 66% |
| Ir(L46) | L46 | Ir(L46) | B | 70% |
| | | | D | 56% |
| Ir(L47) | L47 | Ir(L47) | B cyclohexane:toluene (1:1, v/v) | 59% |
| Ir(L48) | L48 | Ir(L48) | B | 61% |
| Ir(L49) | L49 | Ir(L49) | B | 64% |
| Ir(L50) | L50 | Ir(L50) | B | 67% |
| Ir(L51) | L51 | Ir(L51) | B | 69% |
| Rh(L51) | L51 $Rh(acac)_3$ 14284-92-5 | Rh(L51) | B | 60% |
| Ir(L52) | L52 | Ir(L52) | B cyclohexane:toluene (1:1, v/v) | 60% |
| Ir(L53) | L53 | Ir(L53) | B cyclohexane:toluene (1:1, v/v) | 59% |
| Ir(L54) | L54 | Ir(L54) | B | 66% |
| Ir(L55) | L55 | Ir(L55) | B | 67% |
| Ir(L56) | L56 | Ir(L56) | B | 70% |
| Ir(L57) | L57 | Ir(L57) | B | 65% |
| Ir(L58) | L58 | Ir(L58) | B | 53% |
| Ir(L59) | L59 | Ir(L59) | B cyclohexane:toluene (1:1, v/v) diaseteromer mixture | 60% |
| Ir(L60) | L60 | Ir(L60) | B diastereomer mixture | 62% |
| Ir(L61) | L61 | Ir(L61) | B cyclohexane:toluene (1:1, v/v) diastereomer mixture | 65% |

-continued
| Ex. | Ligand Metal synthon* | Product | Variant Reaction time* Reaction temperature* Extractant* | Yield |
|---|---|---|---|---|
| Ir(L62) | L62 | Ir(L62) | B diastereomer mixture | 58% |
| Ir(L63) | L63 | Ir(L63) | B | 68% |
| Ir(L64) | L64 | Ir(L64) | B | 44% |
| Ir(L65) | L65 | Ir(L65) | B | 39% |
| Ir(L66) | L66 | Ir(L66) | B | 43% |
| Ir(L67) | L67 | Ir(L67) | B | 40% |
| Ir(L68) | L68 | Ir(L68) | 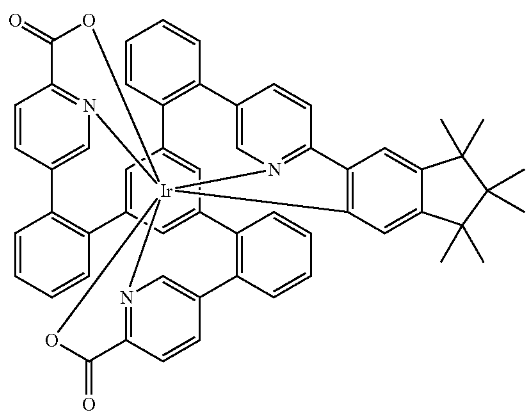 C | 67% |
| Ir(L69) | L69 | Ir(L69) | C | 70% |
| Ir(L70) | L70 | Ir(L70) | C | 65% |
| Ir(L71) | L71 | Ir(L71) | B | 74% |
| Rh(L71) | L71 $Rh(acac)_3$ 14284-92-5 | Rh(L71) | B | 70% |
| Ir(L72) | L72 | Ir(L72) | 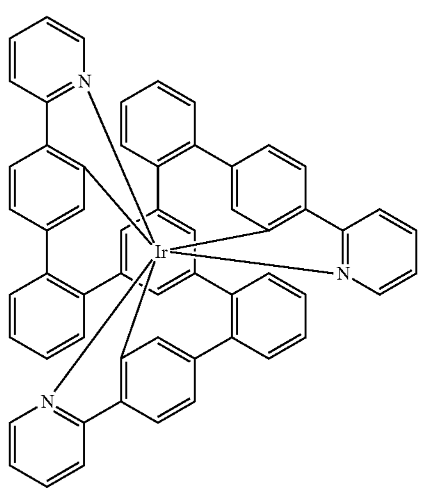 B | 74% |
| Ir(L72) | L72 | Ir(L72) | C* | 68% |

-continued

| Ex. | Ligand Metal synthon* | Product | Variant Reaction time* Reaction temperature* Extractant* | Yield |
|---|---|---|---|---|
| Ir(L73) | L73 | Ir(L73) | 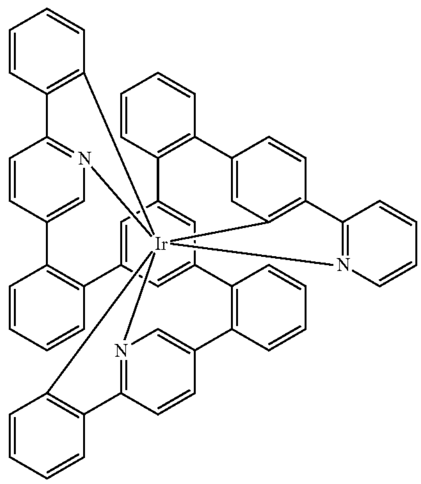 B | 58% |
| Ir(L75) | L75 | Ir(L75) | 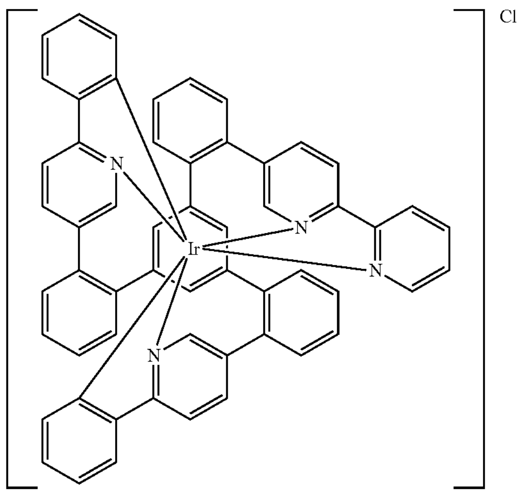 D Addition of 30 mmol of 2,6-dimethylpyridine Purification by recrystallization from DMF/acetonitrile | 34% |
| Ir(L77) | L77 | Ir(L77) | B | 70% |
| Ir(L78) | L78 | Ir(L78) | B | 58% |
| Ir(L79) | L79 | Ir(L79) | B | 61% |
| Ir(L80) | L80 | Ir(L80) | B | 65% |
| Ir(L81) | L81 | Ir(L81) | B | 67% |
| Ir(L82) | L82 | Ir(L82) | B | 71% |
| Ir(L83) | L83 | Ir(L83) | B | 65% |
| Ir(L84) | L84 | Ir(L84) | B | 66% |
| Ir(L85) | L85 | Ir(L85) | B | 58% |
| Ir(L86) | L86 | Ir(L86) | B | 57% |
| Ir(L87) | L87 | Ir(L87) | B | 61% |
| Ir(L88) | L88 | Ir(L88) | B | 58% |
| Ir(L89) | L89 | Ir(L89) | B | 58% |
| Ir(L90) | L90 | Ir(L90) | B | 50% |
| Ir(L95) | L95 | Ir(L95) | B | 55% |
| Ir(L96) | L96 | Ir(L96) | B | 72% |

-continued
| Ex. | Ligand Metal synthon* | Product | Variant Reaction time* Reaction temperature* Extractant* | Yield |
|---|---|---|---|---|
| Ir(L97) | L97 | Ir(L97) | 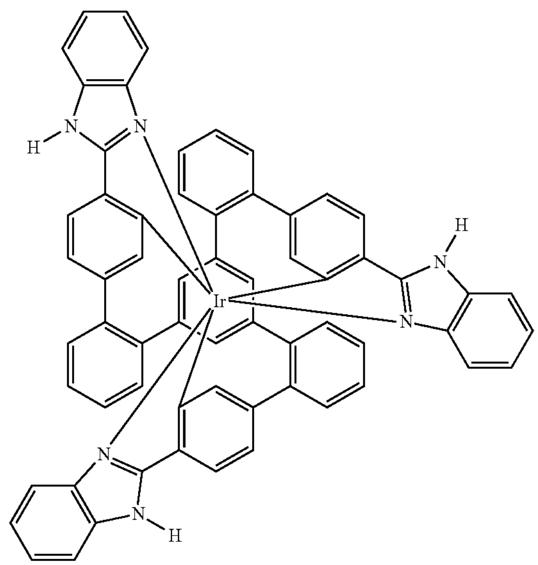 B ethyl acetate | 30% |
| Ir(L98) | L98 | Ir(L98) | B mesitylene | 66% |
| Ir(L99) | L99 | Ir(L99) | B | 51% |
| Ir(L100) | L100 | Ir(L100) | B | 40% |
| Ir(L101) | L101 | Ir(L101) | B | 48% |
| Ir(L102) | L102 | Ir(L102) | B | 63% |
| Ir(L103) | L103 | Ir(L103) | B | 31% |
| Ir(L104) | L104 | Ir(L104) | A | 34% |
| Ir(L105) | L105 | Ir(L105) | B | 54% |
| Ir(L106) | L106 | Ir(L106) | B | 67% |
| Ir(L107) | L107 | Ir(L107) | 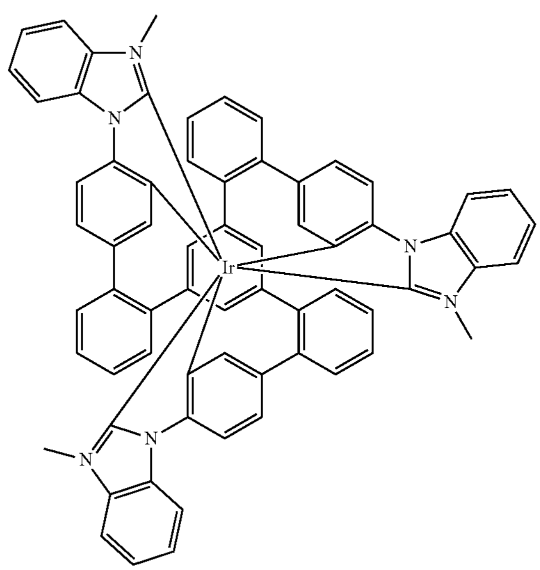 E | 39% |
| Ir(L108) | L108 | Ir(L108) | E | 33% |
| Ir(L109) | L109 | Ir(L109) | E | 27% |
| Ir(L110) | L110 | Ir(L110) | B | 56% |

-continued

| Ex. | Ligand Metal synthon* | Product | Variant Reaction time* Reaction temperature* Extractant* | Yield |
|---|---|---|---|---|
| Ir(L111) | L111 | Ir(L111) | B | 85% |
| Rh(L111) | L111 $Rh(acac)_3$ 14284-92-5 | Rh(L111) | B | 71% |
| Ru(L111) | L111 $RuCl_3$ * 3H2O 13815-94-6 | Ru(L111) | B | 36% |
| Ir(L112) | L112 | Ir(L112) | B | 81% |
| Ir(L113) | L113 | Ir(L113) | B 260° C./5 h | 61% |
| Ir(L114) | L114 | Ir(L114) | 265° C./6 h B | 58% |
| Ir(L116) | L116 | Ir(L116) | B 265° C. 2 h mesitylene | 40% |
| Ir(L117) | L117 | Ir(L117) | as Ir(L116) | 39% |
| Ir(L118) | L118 | Ir(L118) | as Ir(L116) diastereomer mixture Chromatographic separation with DCM on silica gel possible | 42% |
| Ir(L119) | L119 | Ir(L119) | as Ir(L116) | 58% |
| Ir(L120) | L120 | Ir(L120) | 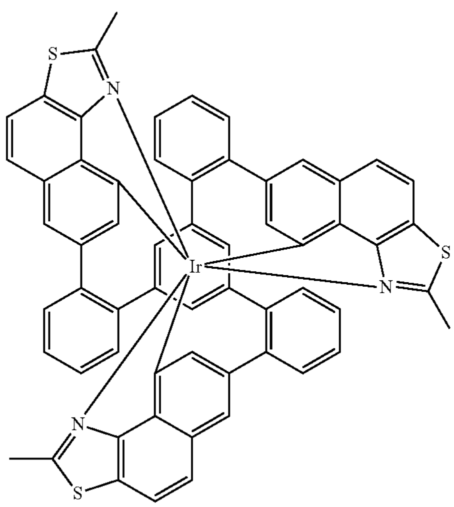 as Ir(L116) | 66% |
| Ir(L121) | L121 | Ir(L121) | as Ir(L116) | 53% |
| Ir(L122) | L122 | Ir(L122) | as Ir(L116) | 59% |
| Ir(L123) | L123 | Ir(L123) | as Ir(L116) | 62% |
| Ir(L125) | L125 | Ir(L125) | B 255° C. 2.5 h | 66% |
| Ir(L126) | L126 | Ir(L126) | as Ir(L125) | 63% |
| Ir(L127) | L127 | Ir(L127) | B ethyl acetate | 64% |
| Ir(L128) | L128 | Ir(L128) | as Ir(L127) | 58% |
| Ir(L129) | L129 | Ir(L129) | as Ir(L127) | 55% |
| Ir(L130) | L130 | Ir(L130) | B toluene | 60% |
| Ir(L131) | L131 | Ir(L131) | B mesitylene | 63% |
| Ir(L132) | L132 | Ir(L132) | as Ir(L127) | 36% |
| Ir(L133) | L133 | Ir(L133) | as Ir(L131) | 44% |
| Ir(L134) | L134 | Ir(L134) | as Ir(L131) | 40% |
| Ir(L135) | L135 | Ir(L135) | B dichloromethane | 75% |

-continued
| Ex. | Ligand Metal synthon* | Product | Variant Reaction time* Reaction temperature* Extractant* | Yield |
|---|---|---|---|---|
| Ir(L136) | L136 | Ir(L136) | 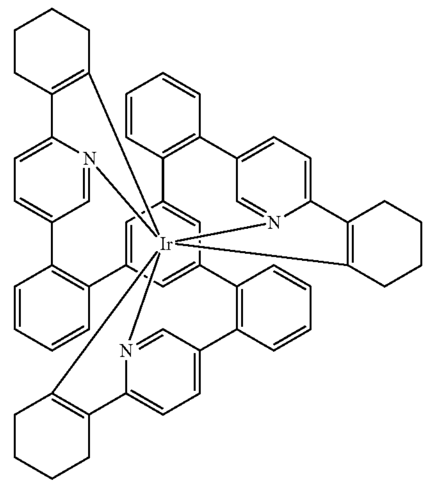 B 250° C./2 h ethyl acetate | 44% |
| Ir(L137) | L137 | Ir(L137) | as Ir(L136) | 51% |
| Ir(L138) | L138 | Ir(L138) | as Ir(L136) | 73% |
| Ir(L139) | L139 | Ir(L139) | as Ir(L136) | 70% |
| Ir(L140) | L140 | Ir(L140) | as Ir(L97) | 68% |
| Ir(L141) | L141 | Ir(L141) | as Ir(L97) | 61% |
| Ir(L142) | L142 | Ir(L142) | as Ir(L97) | 65% |
| Ir(L143) | L143 | Ir(L143) | as Ir(L97) | 37% |
| Ir(L144) | L144 | Ir(L144) | 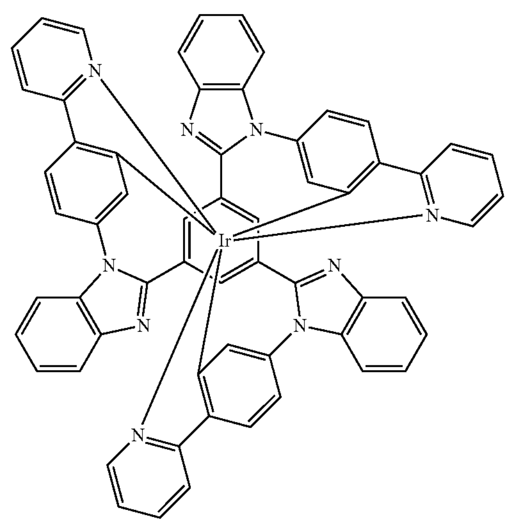 B o-xylene | 63% |
| Ir(L145) | L145 | Ir(L145) | Ir(L144) | 55% |
| Ir(L146) | L146 | Ir(L146) | Ir(L144) | 66% |
| Ir(L147) | L147 | Ir(L147) | Ir(L144) | 68% |
| Ir(L148) | L148 | Ir(L148) | Ir(L144) | 48% |

-continued

| Ex. | Ligand Metal synthon* | Product | Variant Reaction time* Reaction temperature* Extractant* | Yield |
|---|---|---|---|---|
| Ir(L149) | L149 | Ir(L149) | 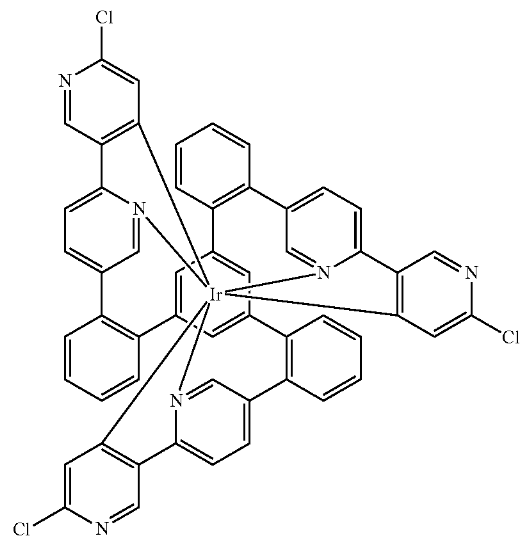 B | 31% |
| Ir(L200) | L200 | Ir(L200) | B | 73% |
| Ir(L201) | L201 | Ir(L201) | B ethyl acetate | 70% |
| Ir(L202) | L202 | Ir(L202) | as Ir(L201) | 67% |
| Ir(L203) | L203 | Ir(L203) | as Ir(L201) | 70% |
| Ir(L204) | L204 | Ir(L204) | as Ir(L201) | 70% |
| Ir(L205) | L205 | Ir(L205) | as Ir(L201) | 73% |
| Ir(L206) | L206 | Ir(L206) | as Ir(L201) | 75% |
| Ir(L207) | L207 | Ir(L207) | B n-butyl acetate | 75% |
| Ir(L208) | L208 | Ir(L208) | as Ir(L201) | 72% |
| Ir(L209) | L209 | Ir(L209) | as Ir(L201) | 70% |
| Ir(L210) | L210 | Ir(L210) | B | 76% |
| Ir(L211) | L211 | Ir(L211) | as Ir(L201) | 75% |
| Ir(L212) | L212 | Ir(L212) | as Ir(L201) | 68% |
| Ir(L213) | L213 | Ir(L213) | as Ir(L201) | 79% |
| Ir(L214) | L214 | Ir(L214) | as Ir(L201) | 67% |
| Ir(L215) | L215 | Ir(L215) | as Ir(L201) | 70% |
| Ir(L216) | L216 | Ir(L216) | as Ir(L201) | 71% |
| Ir(L217) | L217 | Ir(L217) | as Ir(L201) | 66% |
| Ir(L218) | L218 | Ir(L218) | B | 69% |
| Ir(L219) | L219 | Ir(L219) | B fluorobenzene | 55% |
| Ir(L22) | L220 | Ir(L220) | as Ir(L201) | 63% |
| Os(L220) | L220 | Os(L220) | C Chromatography with DCM on alox, neutral | 39% |
| Ir(L221) | L221 | Ir(L221) | as Ir(L201) | 67% |
| Ir(L222) | L222 | Ir(L222) | B butyl acetate | 64% |
| Ir(L223) | L223 | Ir(L223) | B butyl acetate | 57% |
| It(L224) | L224 | It(L224) | as Ir(L223) | 61% |
| Ir(L225) | L225 | Ir(L225) | as Ir(L201) | 33% |
| Ir(L226) | L226 | Ir(L226) | B | 14% |
| Ir(L227) | L227 | Ir(L227) | as Ir(L201) | 21% |
| Ir(L228) | L228 | Ir(L228) | as Ir(L201) | 26% |
| Ir(L229) | L229 | Ir(L229) | B mesitylene | 67% |
| Ir(L230) | L230 | Ir(L230) | as Ir(L229) | 63% |
| Ir(L231) | L231 | Ir(L231) | B | 50% |
| Ir(L232) | L232 | Ir(L232) | B | 61% |

-continued
| Ex. | Ligand Metal synthon* | Product | Variant Reaction time* Reaction temperature* Extractant* | Yield |
|---|---|---|---|---|
| Ir(L233) | L233 | Ir(L233) 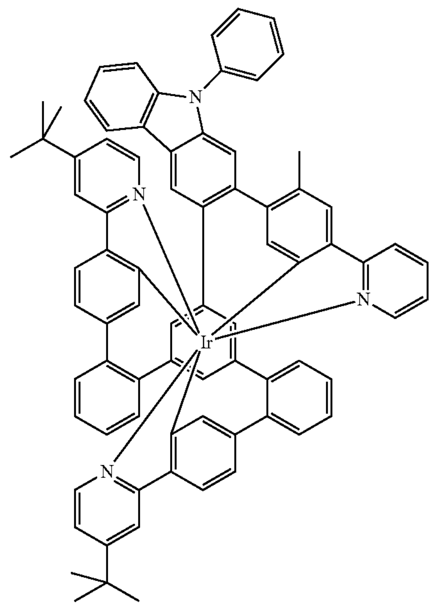 | B butyl acetate | 63% |
| Ir(L250) | L250 | Ir(L250) 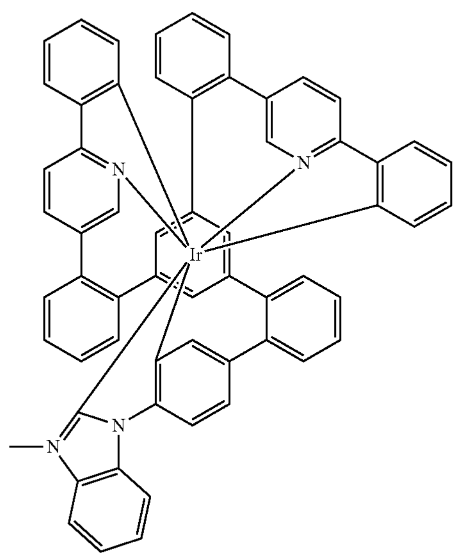 | F 2× hot ethyl acetate extraction 5× hot toluene extraction | 31% |
| Ir(L251) | L251 | Ir(L251) | as Ir(L250) | 40% |
| Ir(L252) | L252 | Ir(L252) | as Ir(L250) | 38% |
| Ir(L253) | L253 | Ir(L253) | as Ir(L250) | 27% |
| Ir(L254) | L254 | Ir(L254) | as Ir(L250) | 33% |
| Ir(L255) | L255 | Ir(L255) | as Ir(L250) | 30% |
| Ir(L256) | L256 | Ir(L256) | as Ir(L250) | 30% |
| Ir(L257) | L257 | Ir(L257) | as Ir(L250) | 40% |
| Ir(L260) | L260 | Ir(L260) | as Ir(L250) | 40% |
| Ir(L261) | L261 | Ir(L261) | as Ir(L250) | 42% |

-continued

| Ex. | Ligand Metal synthon* | Product | Variant Reaction time* Reaction temperature* Extractant* | Yield |
|---|---|---|---|---|
| Ir(L270) | L270 | Ir(L270) | 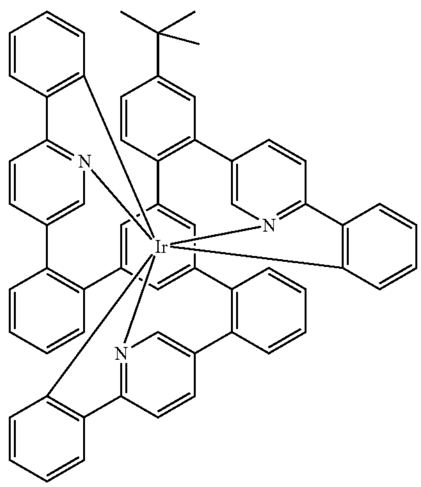 B | 65% |
| Ir(L271) | L271 | Ir(L271) | as Ir(L270) | 70% |
| Ir(L272) | L272 | Ir(L272) | as Ir(L270) | 61% |
| Ir(L273) | L273 | Ir(L273) | as Ir(L270) | 64% |
| Ir(L274) | L274 | Ir(L274) | as Ir(L270) | 64% |
| Ir(L275) | L275 | Ir(L275) | B 2.5 h 265° C. dichloromethane | 48% |
| Ir(L276) | L276 | Ir(L276) | as Ir(L270) | 70% |
| Ir(L277) | L277 | Ir(L277) | as Ir(L270) | 69% |
| Ir(L300) | L300 | Ir(L300) | B | 27% |
| Ir(L301) | L301 | Ir(L301) | B | 48% |
| It(L302) | L302 | It(L302) | B toluene | 66% |

*Stated if different from general method

Metal Complexes of Ligand L74:

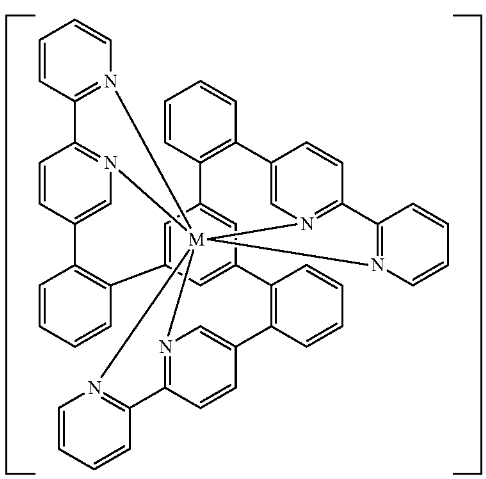

To a solution of 769 mg (1 mmol) of L74 in 10 ml of DMSO is added dropwise, at 75° C., a solution, heated to 75° C., of 1 mmol of the appropriate metal salt in 20 ml of EtOH or EtOH/water (1:1 v/v) and the mixture is stirred for a further 5 h. If appropriate, with addition of 6 mmol of the appropriate salt ($KPF_6$, $(NH_4)PF_6$, $KBF_4$, etc.) in 10 ml of EtOH or EtOH/water (1:1, v/v), an anion exchange is conducted. After cooling, the microcrystalline precipitate is filtered off with suction, washed with cold MeOH and dried under reduced pressure. The purification can be effected by recrystallization from acetonitrile/methanol.

In an analogous manner, it is possible to prepare the following compounds:

| Ex. | Ligand Metal salt | Product | Yield |
|---|---|---|---|
| M1 | L74 $Fe(ClO_4)_2$ | $[Fe(L74)](ClO_4)_2$ | 68% |
| M2 | L74 $Fe(ClO_4)_3$ | $[Fe(L74)](ClO_4)_3$ | 76% |
| M3 | L74 $Ru(ClO_4)_3$ | $[Ru(L74)](ClO_4)_3$ | 70% |
| M4 | L74 $Os(ClO_4)_2$ | $[Os(L74)](ClO_4)_2$ | 39% |
| M5 | L74 $Co(ClO_4)_3$ | $[Co(L74)](ClO_4)_3$ | 63% |
| M6 | L74 $RhCl_3 \times H_2O$ $KPF_6$ | $[Rh(L74)](PF_6)_3$ | 58% |

-continued

| Ex. | Ligand Metal salt | Product | Yield |
|---|---|---|---|
| M7 | L74 $(NH_4)_3[IrCl_6]$ × $H_2O$ $KPF_6$ | $[Ir(L74)](PF_6)_3$ | 69% |
| M8 | $ZnCl_2$ $KBF_4$ | $[Zn(L74)](BF_4)_3$ | 73% |

Metal Complexes of Ligand L76:

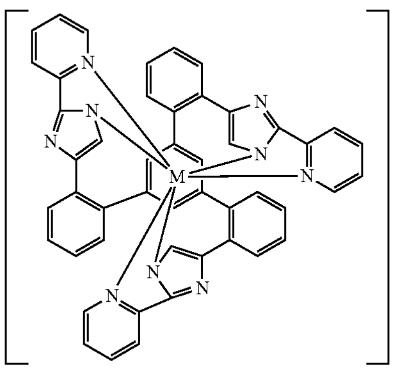

To a solution of 736 mg (1 mmol) of L76 and 643 mg (6 mmol) of 2,6-dimethylpyridine in 10 ml of DMSO is added dropwise, at 75° C., a solution, heated to 75° C., of 1 mmol of the appropriate metal salt in 20 ml of EtOH or EtOH/water (1:1 v/v) and the mixture is stirred for a further 10 h. If appropriate, with addition of 6 mmol of the appropriate salt ($KPF_6$, $(NH_4)PF_6$, $KBF_4$, etc.) in 10 ml of EtOH or EtOH/water (1:1, v/v), an anion exchange is conducted. After cooling, the microcrystalline precipitate is filtered off with suction, washed with cold MeOH and dried under reduced pressure. The purification can be effected by recrystallization from acetonitrile/methanol.

In an analogous manner, it is possible to prepare the following compounds:

| Ex. | Ligand Metal salt | Product | Yield |
|---|---|---|---|
| M100 | L76 $FeCl_3$ hydrate | Fe(L76) | 68% |
| M101 | L76 $[Ru(NH_3)_6]Cl_2$ no 2,6-dimethylpyridine | $NH_4[Ru(L76)]$ | 47% |
| M102 | L76 $RuCl_3$ hydrate | Ru(L76) | 56% |
| M103 | L76 $OsCl_3$ hydrate | Os(L76) | 61% |
| M104 | L76 $RhCl_3$ hydrate | Rh(L76) | 47% |
| M105 | L76 $IrCl_3$ hydrate | Ir(L76) | 72% |
| M106 | L76 $(NH_4)_2[PtCl_6]$ added as solid $NH_4PF_6$ | $[Pt(L76)](PF_6)$ | 64% |

Metal Complexes of Ligand L91:

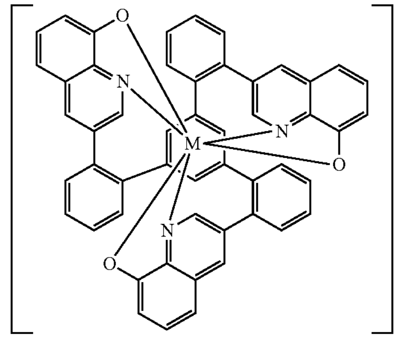

To a solution of 736 mg (1 mmol) of L91 and 643 mg (6 mmol) of 2,6-dimethylpyridine in 10 ml of DMSO is added dropwise, at 75° C., a solution, heated to 75° C., of 1 mmol of the appropriate metal salt in 20 ml of EtOH or EtOH/water (1:1 v/v) and the mixture is stirred for a further 10 h. If appropriate, with addition of 6 mmol of the appropriate salt ($KPF_6$, $(NH_4)PF_6$, $KBF_4$, etc.) in 10 ml of EtOH or EtOH/water (1:1, v/v), an anion exchange is conducted. After cooling, the microcrystalline precipitate is filtered off with suction, washed with cold MeOH and dried under reduced pressure. The purification can be effected by recrystallization from acetonitrile/methanol.

In an analogous manner, it is possible to prepare the following compounds:

| Ex. | Ligand Metal salt | Product | Yield |
|---|---|---|---|
| M200 | L91 $AlCl_3$ | Al(L91) | 86% |
| M201 | L91 $GaCl_3$ | Ga(L91) | 78% |
| M202 | L91 $InCl_3$ | In(L91) | 75% |
| M203 | L91 $LaCl_3$ | La(L91) | 44% |
| M204 | L91 $CeCl_3$ | Ce(L91) | 48% |
| M205 | L91 $FeCl_3$ | Fe(L91) | 91% |
| M206 | L91 $RuCl_3$ | Ru(L91) | 88% |

Metal Complexes of Ligand L92:

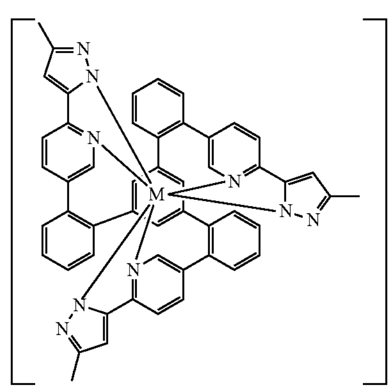

To a solution of 778 mg (1 mmol) of L92 and 643 mg (6 mmol) of 2,6-dimethylpyridine in 10 ml of DMSO is added dropwise, at 75° C., a solution, heated to 75° C., of 1 mmol of the appropriate metal salt in 20 ml of EtOH or EtOH/water (1:1 v/v) and the mixture is stirred for a further 10 h. If appropriate, with addition of 6 mmol of the appropriate salt ($KPF_6$, $(NH_4)PF_6$, $KBF_4$, etc.) in 10 ml of EtOH or EtOH/water (1:1, v/v), an anion exchange is conducted. After cooling, the microcrystalline precipitate is filtered off with suction, washed with cold MeOH and dried under reduced pressure. Purification can be effected by recrystallization from acetonitrile/methanol or by hot extraction and subsequent fractional sublimation. The diastereomer mixtures which form in the case of the chiral ligand L280 can be separated by chromatography on silanized silica gel.

In an analogous manner, it is possible to prepare the following compounds:

| Ex. | Ligand Metal salt | Product | Yield |
|---|---|---|---|
| M300 | L92<br>$GaCl_3$ | Ga(L92) | 68% |
| M301 | L92<br>$InCl_3$ | In(L92) | 70% |
| M302 | L92<br>$IrCl_3$ hydrate | Ir(L92) | 76% |
| M303 | L93<br>$LaCl_3$ | La(L93) | 55% |
| M304 | L93<br>$FeCl_3$ | Fe(L93) | 86% |
| M305 | L93<br>$IrCl_3$ hydrate | Ir(L93) | 84% |
| M306 | L94<br>$RuCl_3$ | Ru(L94) | 78% |
| M307 | L94<br>$IrCl_3$ hydrate | Ir(L94) | 81% |
| M308 | L280<br>$AlCl_3$ | Al(L280)<br>diastereomer mixture | 58% |
| M309 | L280<br>$FeCl_3$ | Fe(L280)<br>diastereomer mixture | 86% |
| M310 | L280<br>$RuCl_3$ | Ru(L280)<br>diastereomer mixture | 74% |
| M311 | L280<br>$IrCl_3$ hydrate | Ir(L280)<br>diastereomer mixture | 79% |

Metal Complexes of Ligand L290:

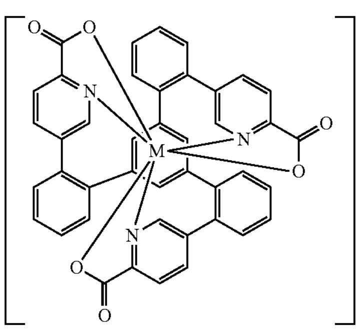

Procedure analogous to Example M200.

In an analogous manner, it is possible to prepare the following compounds:

| Ex. | Ligand Metal salt | Product | Yield |
|---|---|---|---|
| M400 | L290<br>$AlCl_3$ | Al(L290) | 66% |

-continued

| Ex. | Ligand Metal salt | Product | Yield |
|---|---|---|---|
| M401 | L290<br>$GaCl_3$ | Ga(L290) | 70% |
| M402 | L290<br>$LaCl_3$ | La(L290) | 48% |
| M403 | L290<br>$CeCl_3$ | Ce(L290) | 53% |
| M404 | L290<br>$FeCl_3$ | Fe(L290) | 89% |
| M405 | L290<br>$RuCl_3$ | Ru(L290) | 87% |
| M406 | L290<br>$IrCl_3$ hydrate | Ir(L290) | 77% |

D: Functionalization of the Metal Complexes—Part 1

1) Halogenation of the Iridium Complexes

To a solution or suspension of 10 mmol of a complex bearing A×C—H groups (with A=1, 2, 3) in the para position to the iridium in 500 ml to 2000 ml of dichloromethane according to the solubility of the metal complexes is added, in the dark and with exclusion of air, at −30 to +30° C., A x 10.5 mmol of N-halosuccinimide (halogen: Cl, Br, I), and the mixture is stirred for 20 h. Complexes of sparing solubility in DCM may also be converted in other solvents (TCE, THF, DMF, chlorobenzene, etc.) and at elevated temperature. Subsequently, the solvent is substantially removed under reduced pressure. The residue is extracted by boiling with 100 ml of methanol, and the solids are filtered off with suction, washed three times with 30 ml of methanol and then dried under reduced pressure. This gives the iridium complexes brominated in the para position to the iridium. Complexes having a HOMO (CV) of about −5.1 to −5.0 eV and of smaller magnitude have a tendency to oxidation (Ir(III)>Ir(IV)), the oxidizing agent being bromine released from NBS. This oxidation reaction is apparent by a distinct green hue in the otherwise yellow to red solutions/suspensions of the emitters. In such cases, a further equivalent of NBS is added. For workup, 300-500 ml of methanol and 2 ml of hydrazine hydrate as reducing agent are added, which causes the green solutions/suspensions to turn yellow (reduction of Ir(IV)>Ir(III)). Then the solvent is substantially drawn off under reduced pressure, 300 ml of methanol are added, and the solids are filtered off with suction, washed three times with 100 ml each time of methanol and dried under reduced pressure.

Substoichiometric brominations, for example mono- and dibrominations of complexes having 3 C—H groups in the para position to iridium, usually proceed less selectively than the stoichiometric brominations. The crude products of these brominations can be separated by chromatography (CombiFlash Torrent from A. Semrau).

Synthesis of Ir(L2-3Br):

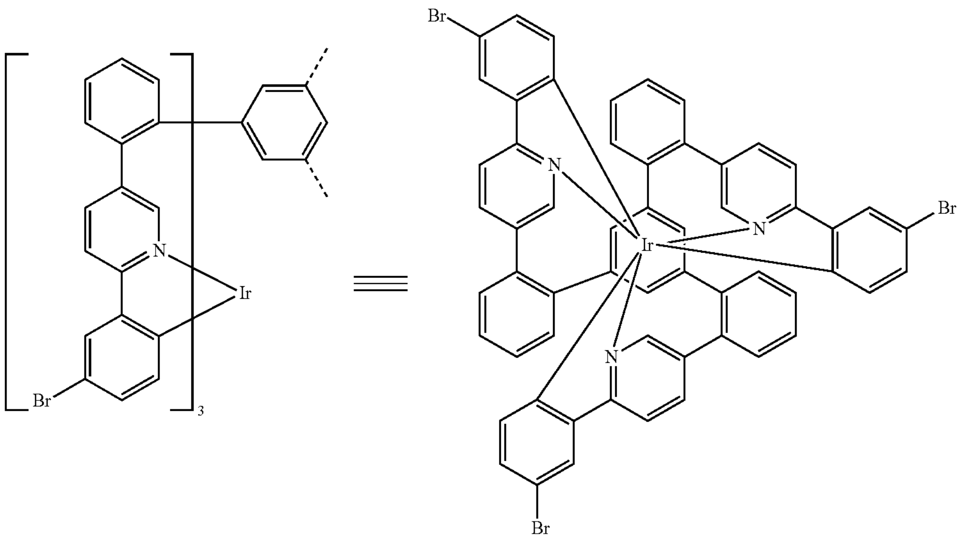

To a suspension, stirred at 0° C., of 9.6 g (10 mmol) of Ir(L2) in 2000 ml of DCM are added 5.6 g (31.5 mmol) of N-bromosuccinimide all at once and then the mixture is stirred for a further 20 h. After removing about 1900 ml of the DCM under reduced pressure, 100 ml of methanol are added to the yellow suspension, and the solids are filtered off with suction, washed three times with about 50 ml of methanol and then dried under reduced pressure. Yield: 11.3 g (9.5 mmol), 95%; purity: >99.0% by NMR.

In an analogous manner, it is possible to prepare the following compounds:

| Ex. | Reactant > brominated complex | Yield |
| --- | --- | --- |
| | Tribromination | |
| Ir(L14-3Br) | 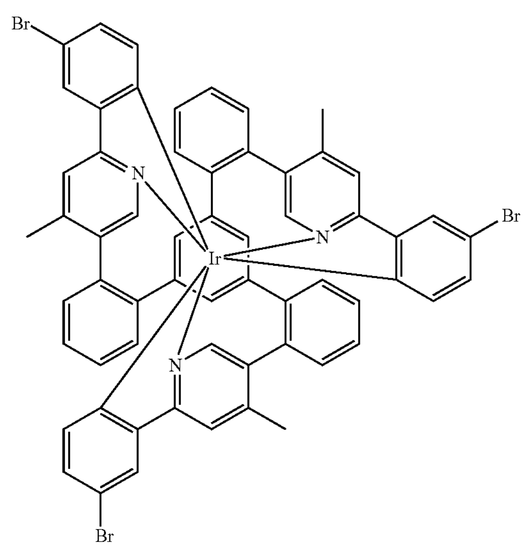  Ir(L14) > Ir(L14-3Br) | 95% |

-continued
| Ex. | Reactant > brominated complex | Yield |
|---|---|---|
| Ir(L16-3Br) | 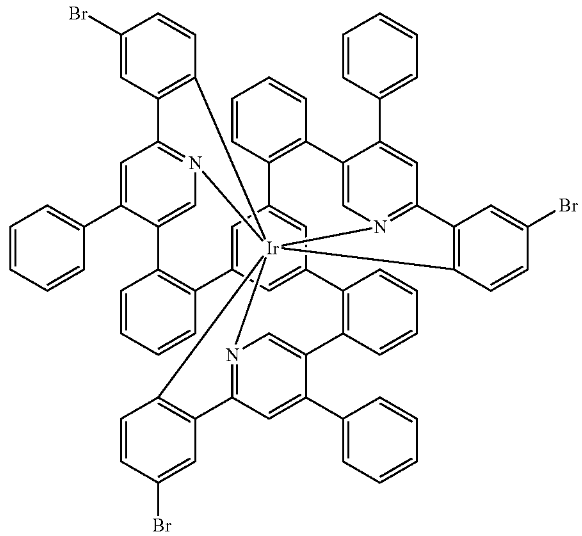 Ir(L16) > Ir(L16-3Br) | 90% |
| Ir(L20-3Br) | 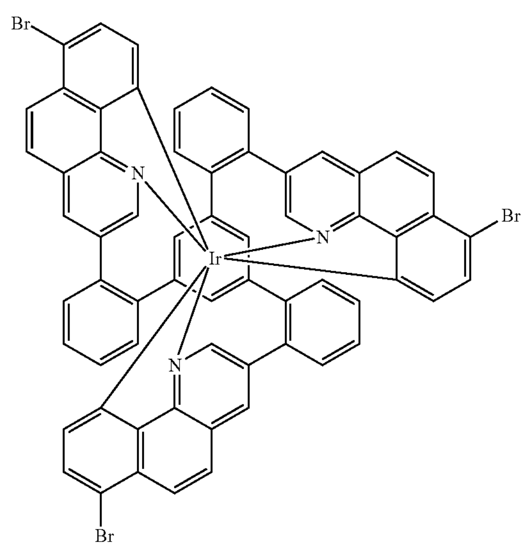 Ir(L20) > Ir(L20-3Br) | 97% |

-continued
| Ex. | Reactant > brominated complex | Yield |
|---|---|---|
| Ir(L22-3Br) | 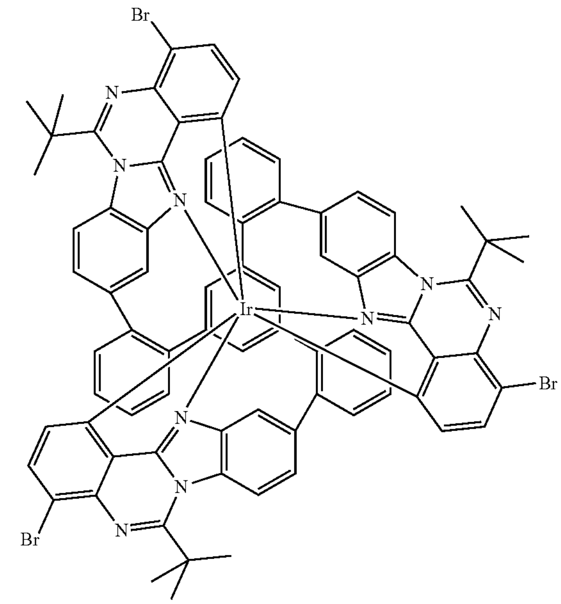 Ir(L22) > Ir(L22-3Br) | 96% |
| Ir(L24-3Br) | 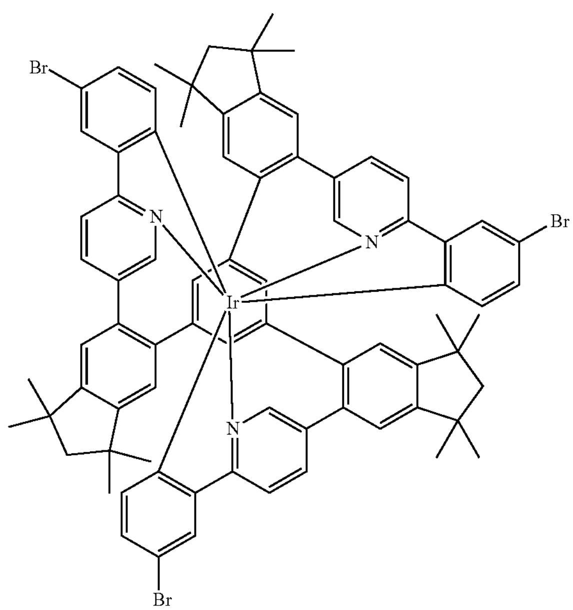 Ir(L24) > Ir(L24-3Br) | 93% |

-continued
| Ex. | Reactant > brominated complex | Yield |
|---|---|---|
| Ir(L27-3Br) | 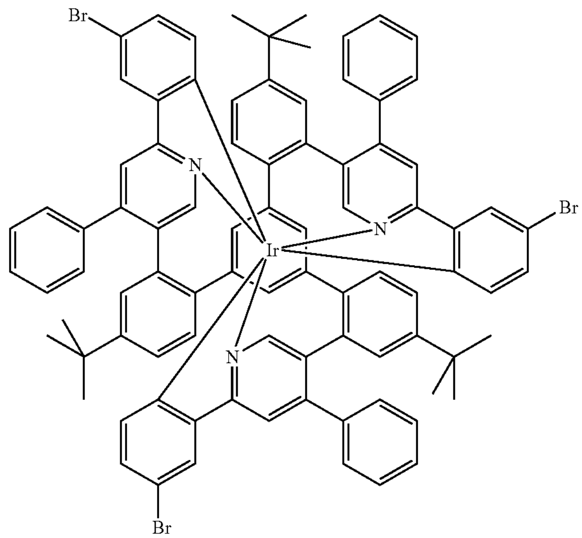 Ir(L27) > Ir(L27-3Br) | 90% |
| Ir(L35-3Br) | 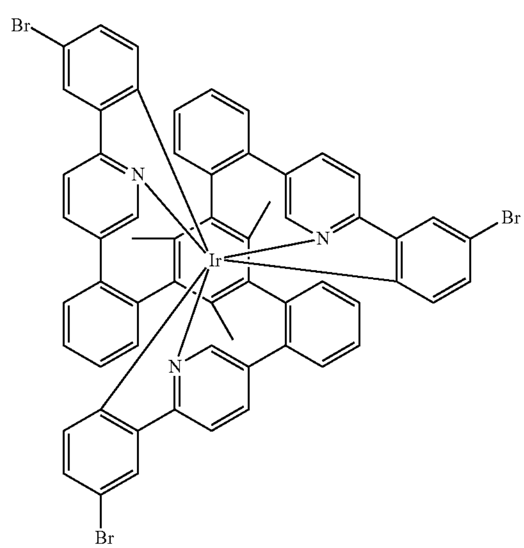 Ir(L35) > Ir(L35-3Br) | 95% |

-continued
| Ex. | Reactant > brominated complex | Yield |
| --- | --- | --- |
| Ir(L37-3Br) | 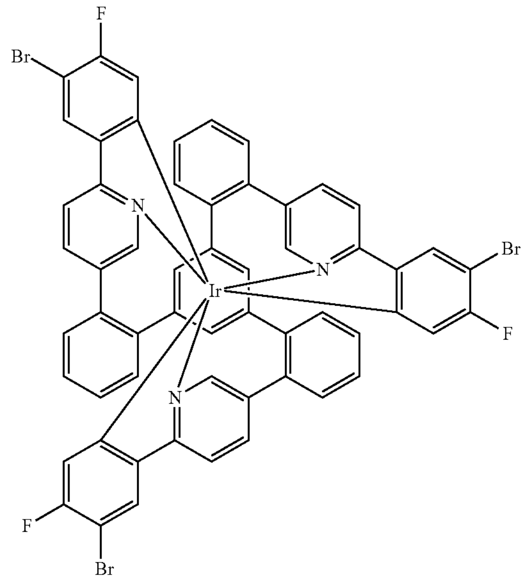 Ir(L37) > Ir(L37-3Br) | 92% |
| Ir(L48-3Br) | 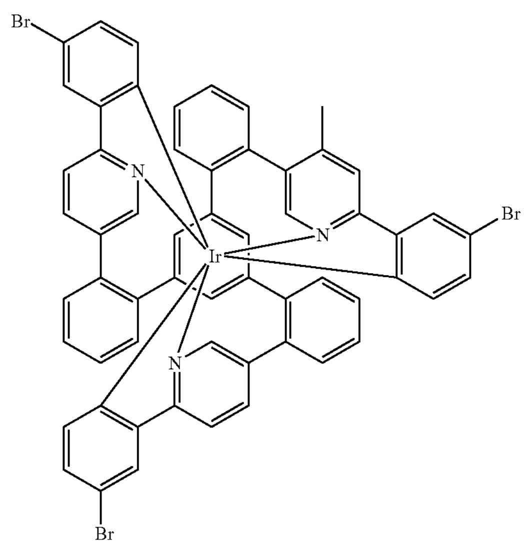 Ir(L48) > Ir(L48-3Br) | 90% |

-continued
| Ex. | Reactant > brominated complex | Yield |
|---|---|---|
| Ir(L51-3Br) | 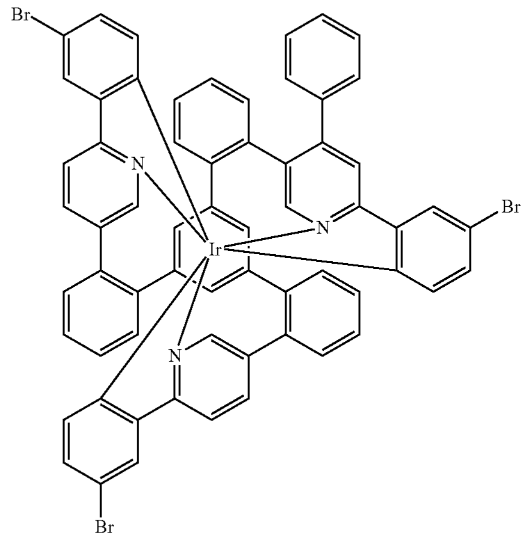 Ir(L51) > Ir(L51-3Br) | 90% |
| Ir(L55-3Br) | 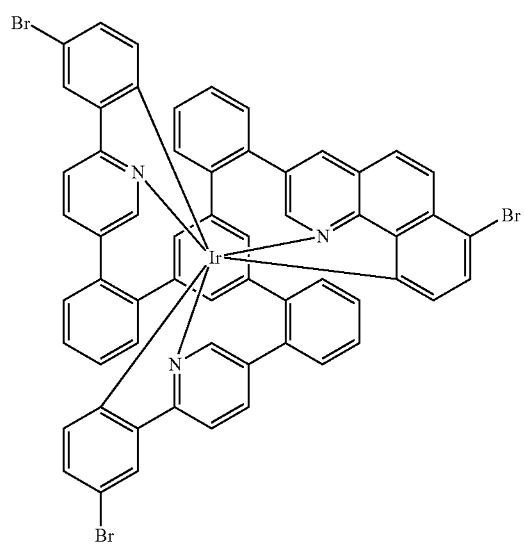 Ir(L55) > Ir(L55-3Br) | 95% |

-continued
| Ex. | Reactant > brominated complex | Yield |
|---|---|---|
| Ir(L72-3Br) | 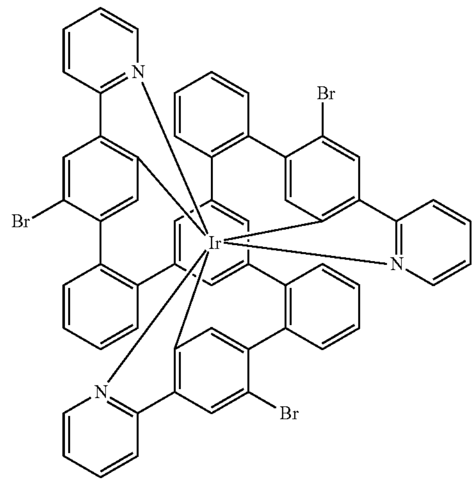 Ir(L72) > Ir(L72-3Br) | 86% |
| Ir(L73-3Br) | 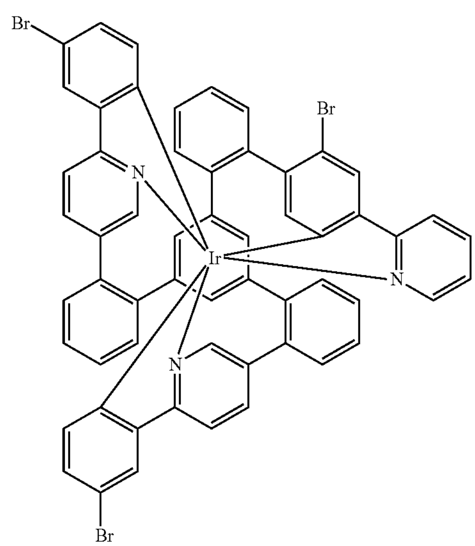 Ir(L73) > Ir(L73-3Br) | 91% |

-continued
| Ex. | Reactant > brominated complex | Yield |
|---|---|---|
| Ir(L96-3Br) | 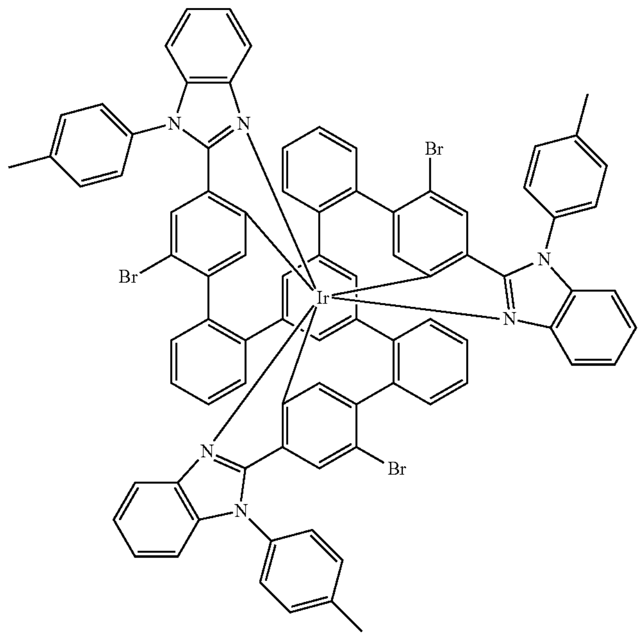 Ir(L96) > Ir(L96-3Br) | 89% |
| Ir(L100-3Br) | 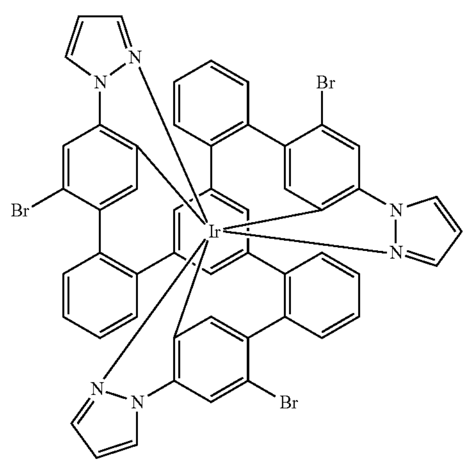 Ir(L100) > Ir(L100-3Br) | 87% |

-continued
| Ex. | Reactant > brominated complex | Yield |
| --- | --- | --- |
| Ir(L101-3Br) | 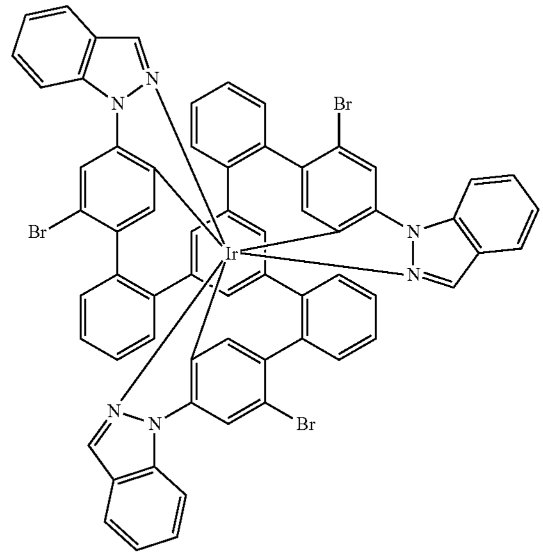 Ir(L101) > Ir(L101-3Br) | 46% |
| Ir(L107-3Br) | 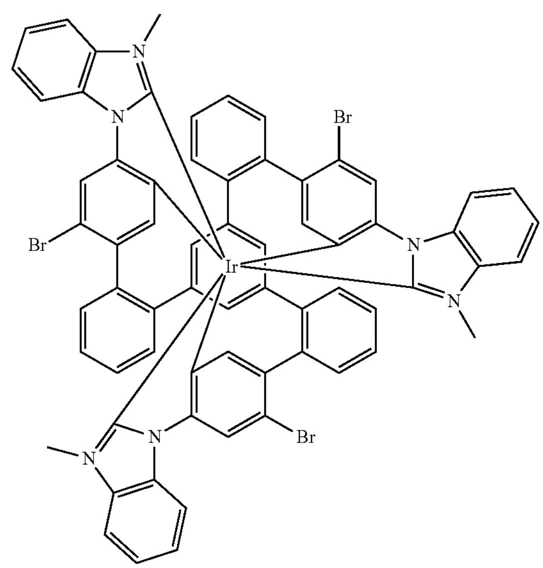 Ir(L107) > Ir(L107-3Br) Chromatography on silica gel | 67% |

-continued
| Ex. | Reactant > brominated complex | Yield |
| --- | --- | --- |
| Ir(L111-3Br) | 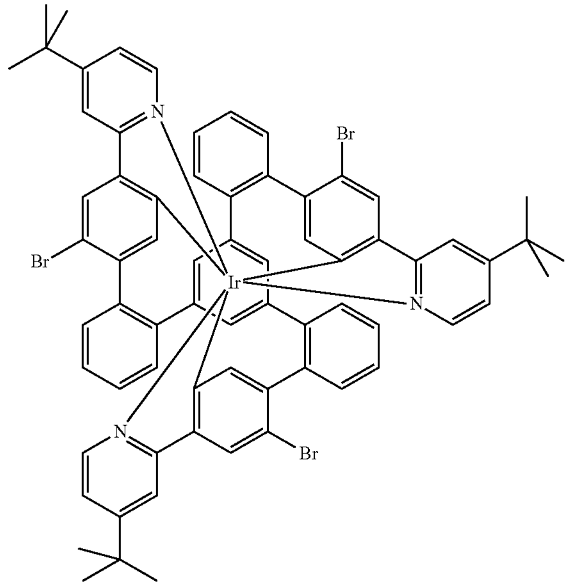<br>Ir(L111) > Ir(L111-3Br) | 96% |
| Ir(L116-3Br) | 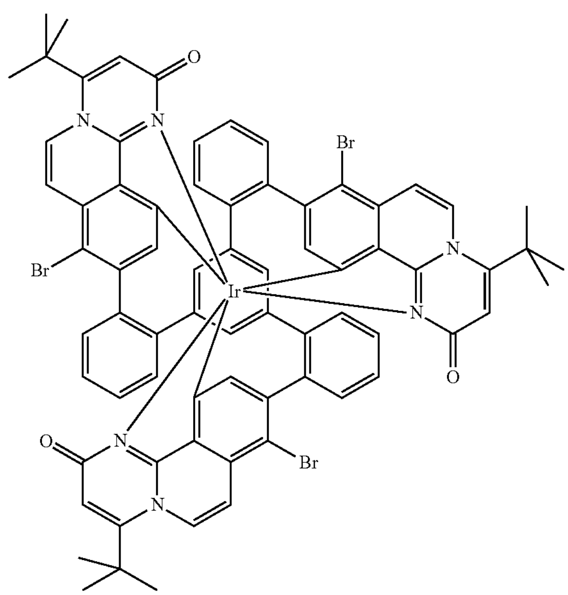<br>Ir(L116) > Ir(L116-3Br) | 95% |

-continued
| Ex. | Reactant > brominated complex | Yield |
| --- | --- | --- |
| Ir(L120-3Br) | 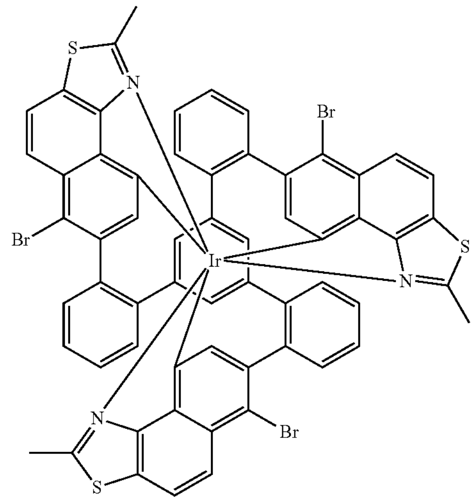 Ir(L120) > Ir(L120-3Br) | 90% |
| Ir123-3Br | 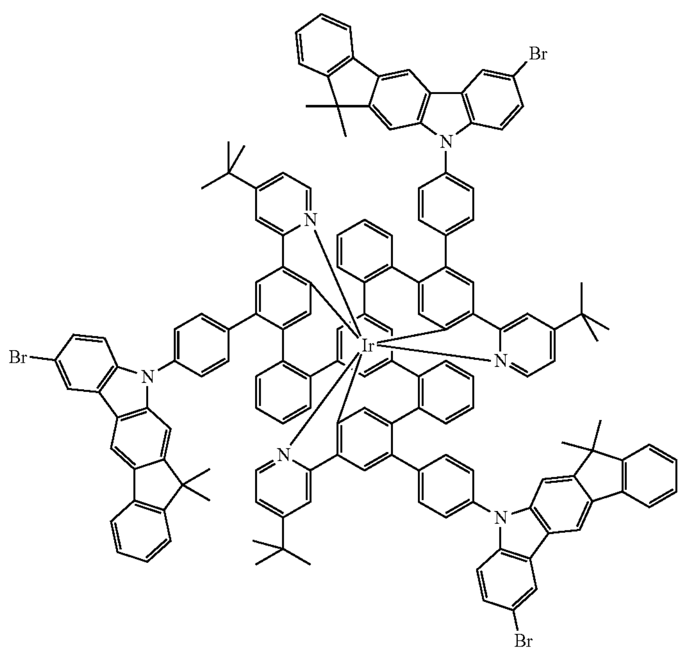 Ir123 > Ir123-3Br Use of 4.15 mmol of NBS Addition of 2 ml of hydrazine hydrate to the MeOH | 92% |

-continued
| Ex. | Reactant > brominated complex | Yield |
|---|---|---|
| Ir(L203-3Br) | 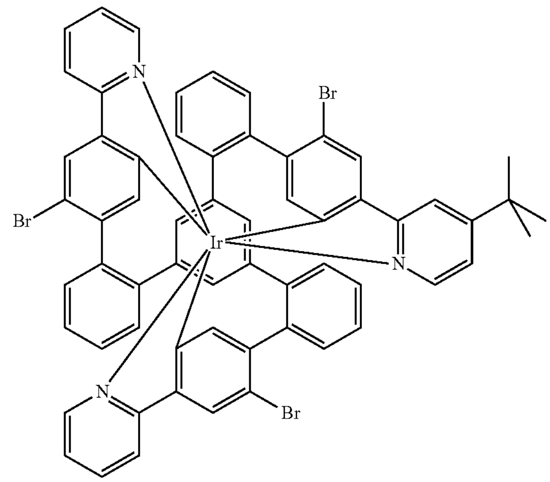<br>Ir(L203) > Ir(L203-3Br) | 95% |
| Ir(L204-3Br) | 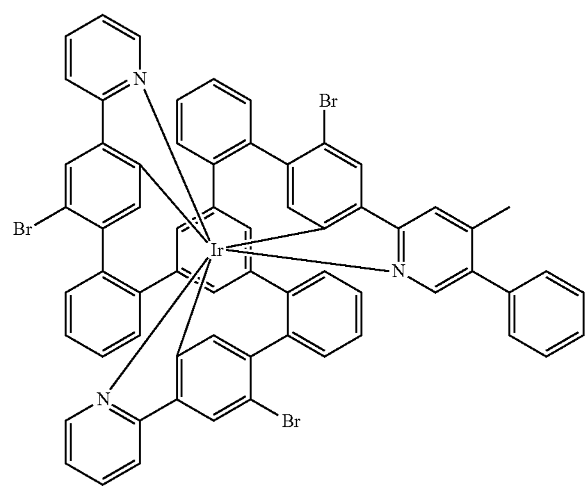<br>Ir(L204) > Ir(L204-3Br) | 96% |
| Ir(L205-3Br) | 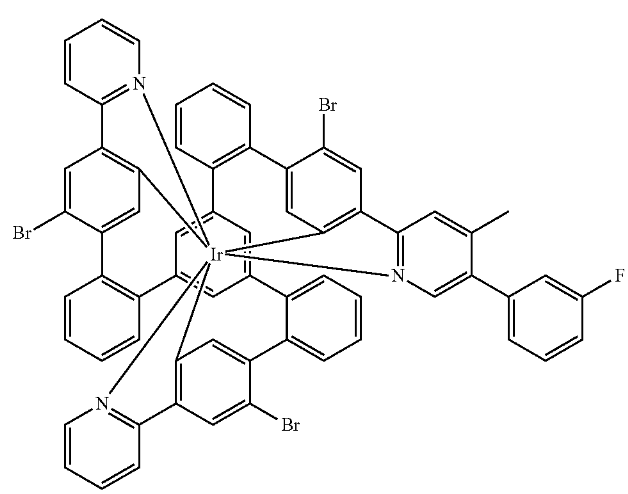<br>Ir(L205) > Ir(L205-3Br) | 94% |

-continued
| Ex. | Reactant > brominated complex | Yield |
|---|---|---|
| Ir(L212-3Br) | 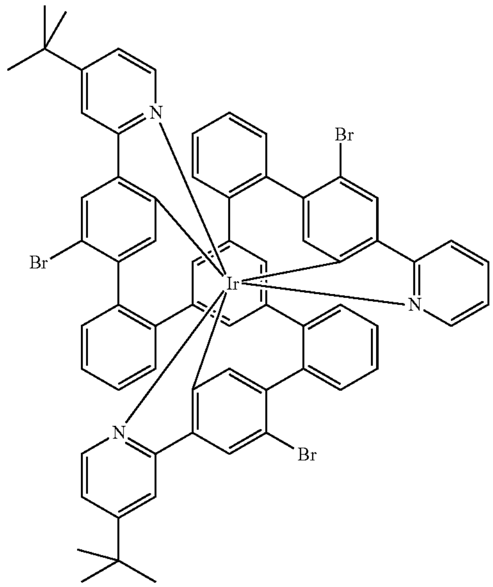 Ir(L212) > Ir(L212-3Br) | 96% |
| Ir(L213-3Br) | 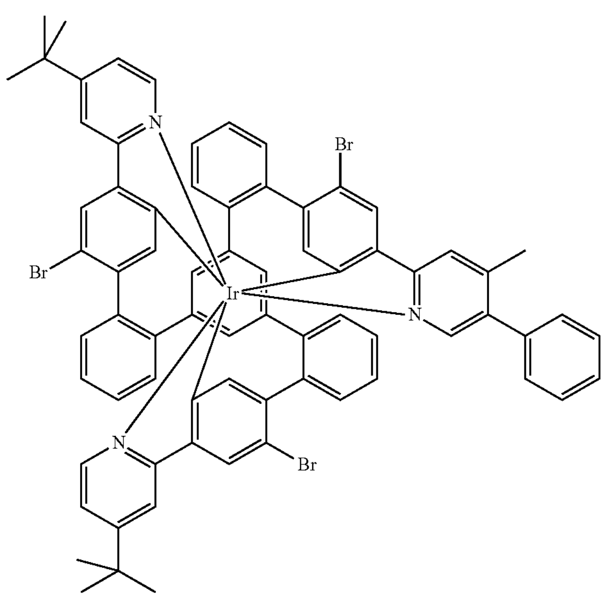 Ir(L213) > Ir(L213-3Br) | 95% |

-continued
| Ex. | Reactant > brominated complex | Yield |
|---|---|---|
| Ir(L216-3Br) | 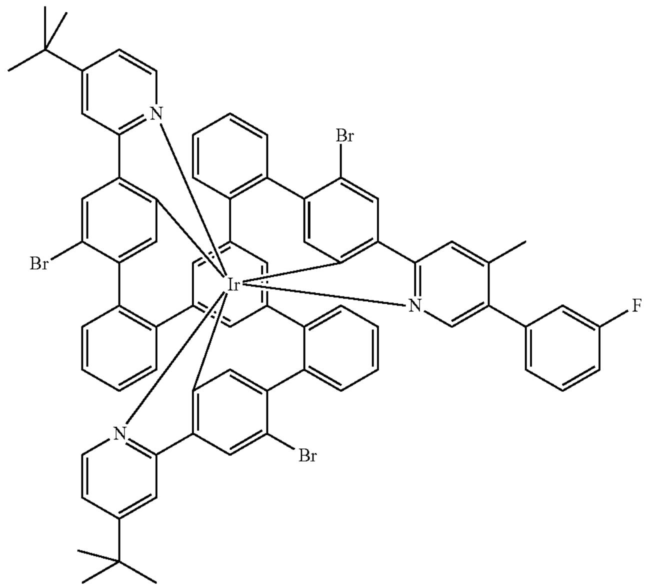 Ir(L216) > Ir(L216-3Br) | 95% |
| Ir(L218-3Br) | 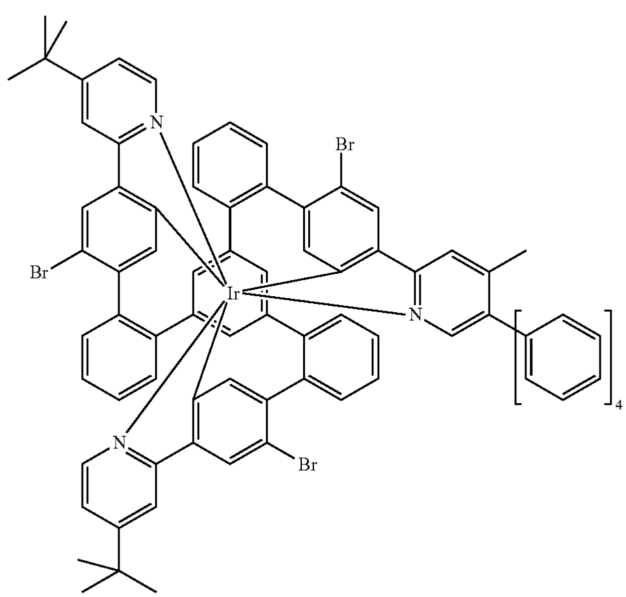 Ir(L218) > Ir(L218-3Br) | 95% |

-continued
| Ex. | Reactant > brominated complex | Yield |
| --- | --- | --- |
| Ir150-3Br | 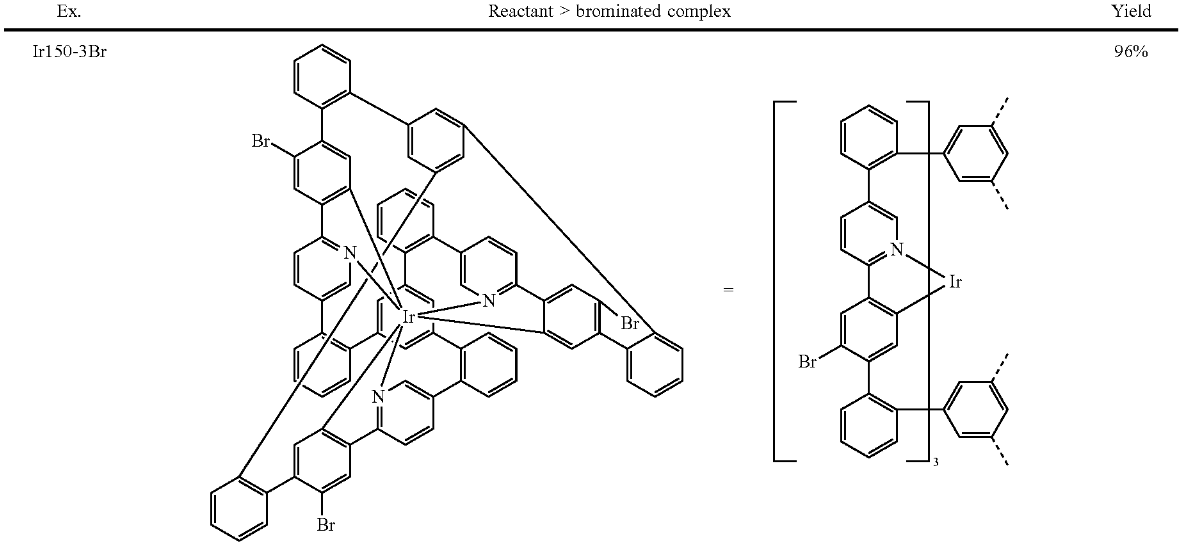 Ir150 > Ir150-3Br | 96% |
Dibromination
| | | |
| --- | --- | --- |
| Ir(L2-2Br) | 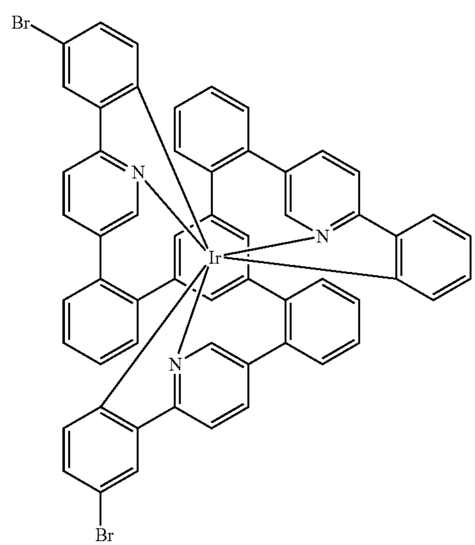 Ir(L2) > Ir(L2-2Br) | 33% |

-continued
| Ex. | Reactant > brominated complex | Yield |
| --- | --- | --- |
| Ir(L39-2Br) | 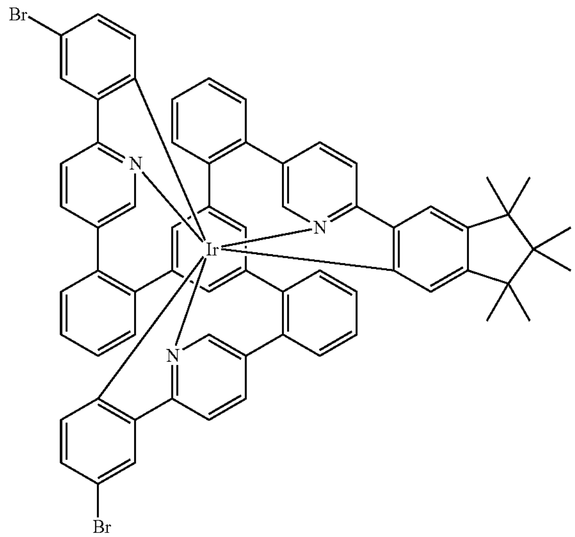<br>Ir(L39) > Ir(L39-2Br) | 63% |
| Ir(L44-2Br) | 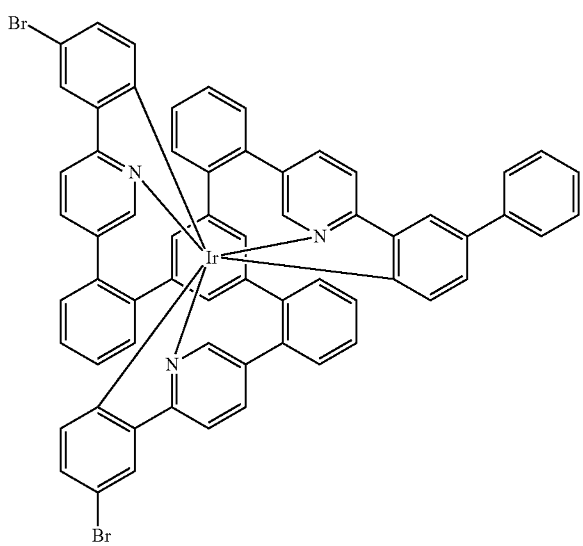<br>Ir(L44) > Ir(L44-2Br) | 62% |

-continued
| Ex. | Reactant > brominated complex | Yield |
|---|---|---|
| Ir(L49-2Br) | 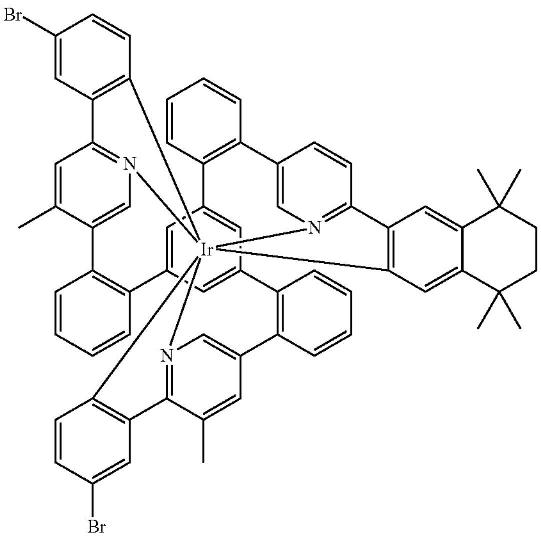  Ir(L49) > Ir(L49-2Br) | 67% |
| Ir(L71-2Br) | 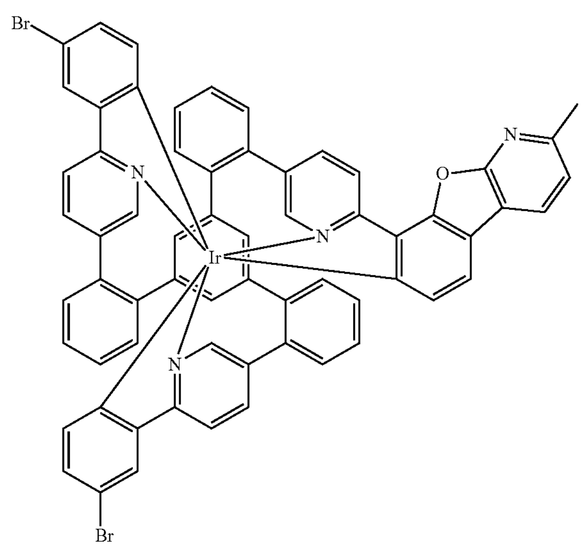  Ir(L71) > Ir(L71-2Br) | 96% |

-continued
| Ex. | Reactant > brominated complex | Yield |
| --- | --- | --- |
| Ir(L220-2Br) | 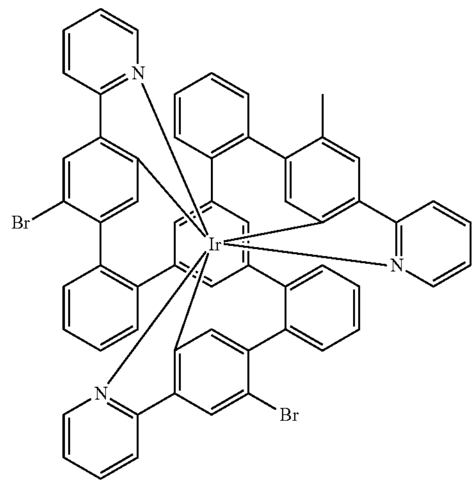 Ir(L220) > Ir(L220-2Br) DMSO solvent | 95% |
Monobromination
| | | |
| --- | --- | --- |
| Ir(L2-Br) | 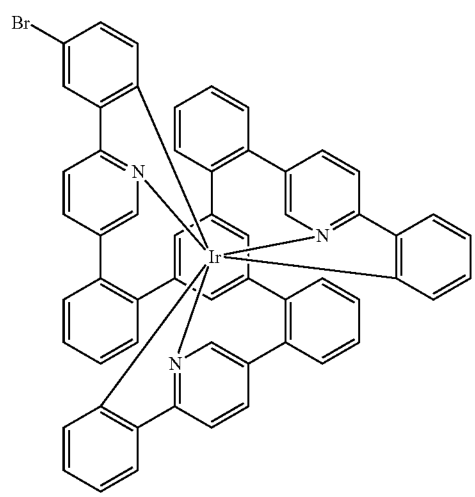 Ir(L2) > Ir(L2-Br) DMSO solvent | 24% |

-continued
| Ex. | Reactant > brominated complex | Yield |
| --- | --- | --- |
| Ir(L40-Br) | 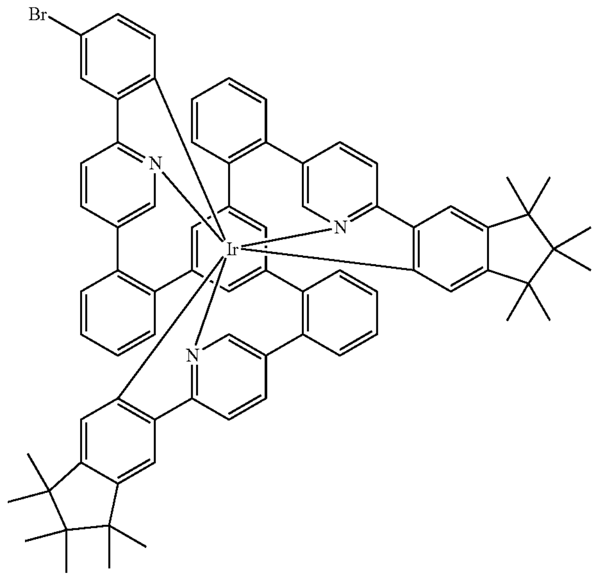 Ir(L40) > Ir(L40-Br) | 64% |
| Ir(L206-Br) | 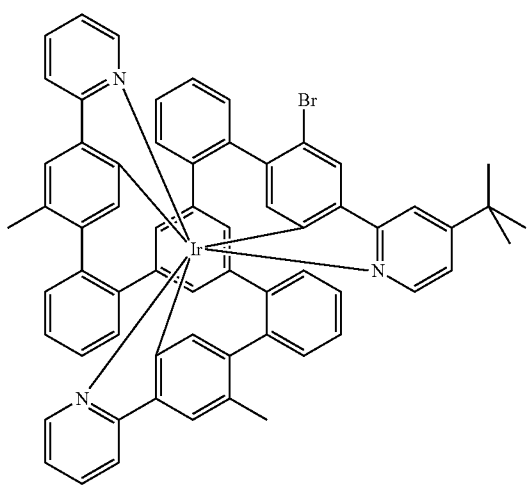 Ir(L206) > Ir(L206-Br) Use of 2.1 mmol of NBS Addition of 2 ml of hydrazine hydrate to the MeOH | 93% |

-continued
| Ex. | Reactant > brominated complex | Yield |
| --- | --- | --- |
| Ir(L207-Br) | 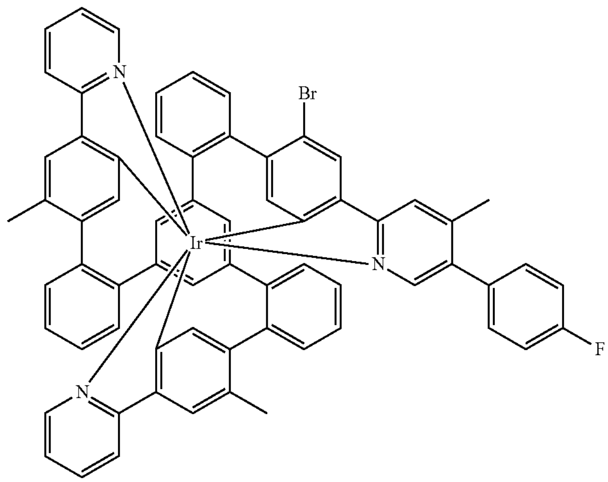 Ir(L207) > Ir(L207-Br) Use of 2.1 mmol of NBS Addition of 2 ml of hydrazine hydrate to the MeOH | 94% |
| Ir(L208-Br) | 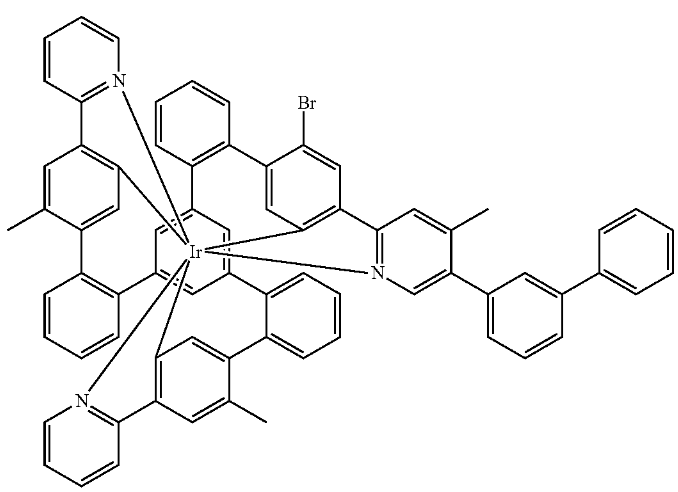 Ir(L208) > Ir(L208-Br) Use of 2.1 mmol of NBS Addition of 2 ml of hydrazine hydrate to the MeOH | 89% |

2) Suzuki Coupling with the Brominated Iridium Complexes

Variant A, Biphasic Reaction Mixture:

To a suspension of 10 mmol of a brominated complex, 12-20 mmol of boronic acid or boronic ester per Br function and 40-80 mmol of tripotassium phosphate in a mixture of 300 ml of toluene, 100 ml of dioxane and 300 ml of water are added 0.6 mmol of tri-o-tolylphosphine and then 0.1 mmol of palladium(II) acetate, and the mixture is heated under reflux for 16 h. After cooling, 500 ml of water and 200 ml of toluene are added, the aqueous phase is removed, and the organic phase is washed three times with 200 ml of water and once with 200 ml of saturated sodium chloride solution and dried over magnesium sulphate. The mixture is filtered through a Celite bed and washed through with toluene, the toluene is removed almost completely under reduced pressure, 300 ml of methanol are added, and the precipitated crude product is filtered off with suction, washed three times with 50 ml each time of methanol and dried under reduced pressure. The crude product is columned on silica gel. The metal complex is finally heat-treated or sublimed. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

Variant B, Monophasic Reaction Mixture:

To a suspension of 10 mmol of a brominated complex, 12-20 mmol of boronic acid or boronic ester per Br function and 60-100 mmol of the base (potassium fluoride, tripotassium phosphate (anhydrous or monohydrate or trihydrate), potassium carbonate, caesium carbonate etc.) and 100 g of glass beads (diameter 3 mm) in 100 ml-500 ml of an aprotic solvent (THF, dioxane, xylene, mesitylene, dimethylacetamide, NMP, DMSO, etc.) are added 0.6 mmol of tri-o-tolylphosphine and then 0.1 mmol of palladium(II) acetate, and the mixture is heated under reflux for 1-24 h. Alternatively, it is possible to use other phosphines such as triphenylphosphine, tri-tert-butylphosphine, Sphos, Xphos, RuPhos, XanthPhos, etc., the preferred phosphine: palladium ratio in the case of these phosphines being 3:1 to 1.2:1. The solvent is removed under reduced pressure, the product is taken up in a suitable solvent (toluene, dichloromethane, ethyl acetate, etc.) and purification is effected as described in Variant A.

Synthesis of Ir100:

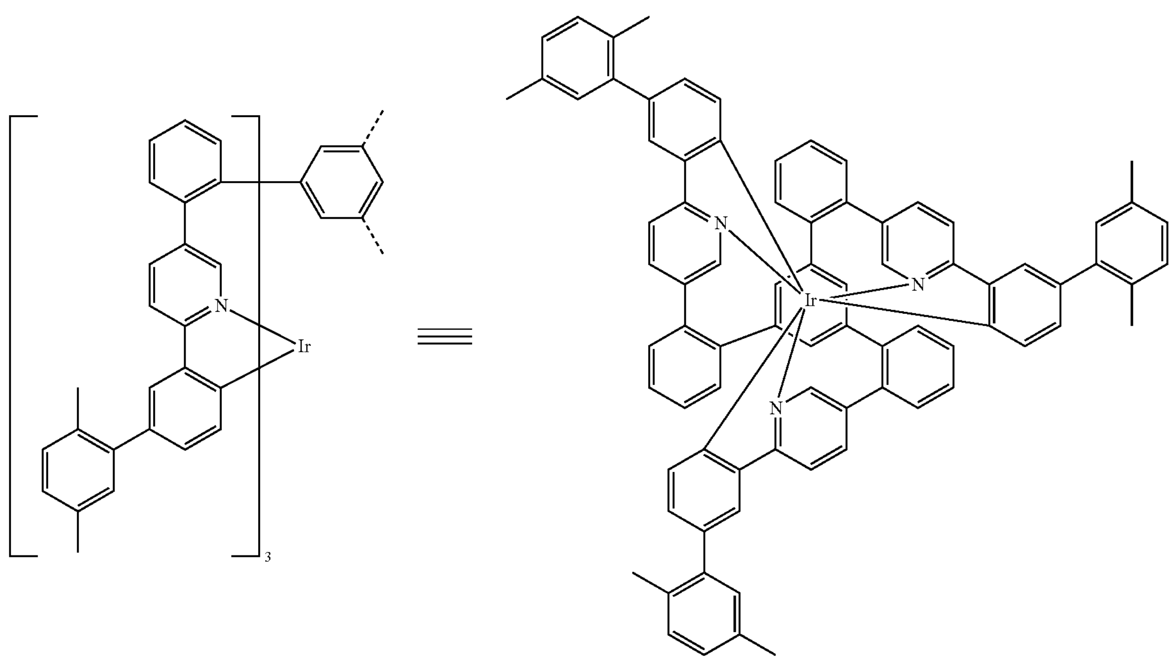

Variant A:

Use of 11.9 g (10.0 mmol) of Ir(L2-3Br) and 9.0 g (60.0 mmol) of 2,5-dimethylphenylboronic acid [85199-06-0], 17.7 g (60 mmol) of tripotassium phosphate (anhydrous), 183 mg (0.6 mmol) of tri-o-tolylphosphine [6163-58-2], 23 mg (0.1 mmol) of palladium(II) acetate, 300 ml of toluene, 100 ml of dioxane and 300 ml of water, reflux, 16 h. Chromatographic separation twice on silica gel with toluene/ethyl acetate (9:1, v/v), followed by hot extraction five times with ethyl acetate/dichloromethane (1:1, v/v). Yield: 6.8 g (5.7 mmol), 57%; purity: about 99.9% by HPLC.

In an analogous manner, it is possible to prepare the following compounds:

| Ex. | Bromide/boronic acid/variant<br>Product | Yield |
|---|---|---|
| Ir101 | 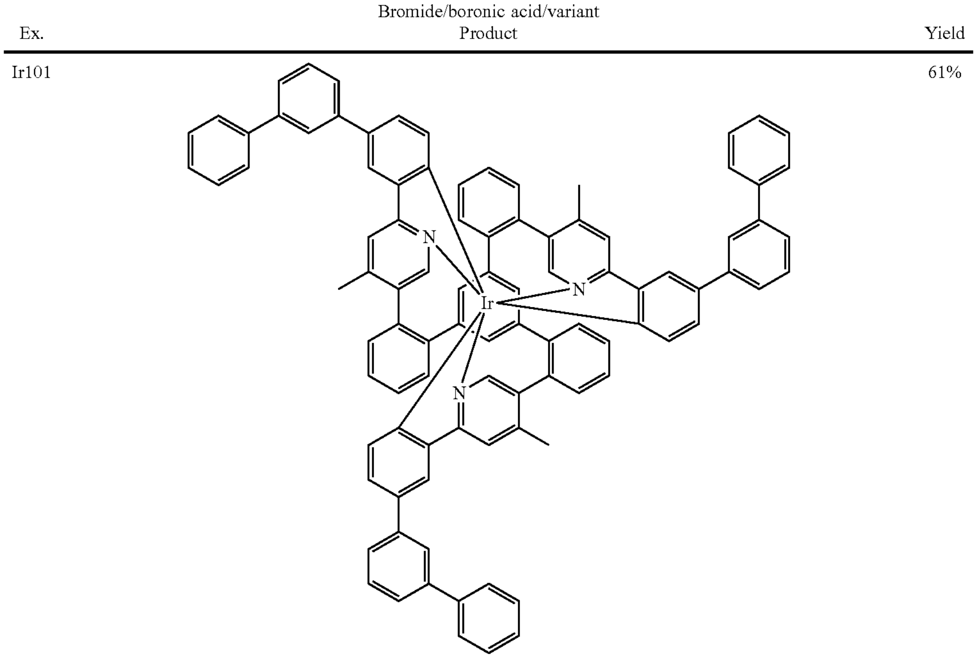<br>Ir(14-3Br)/5122-95-2<br>A | 61% |
| Ir102 | 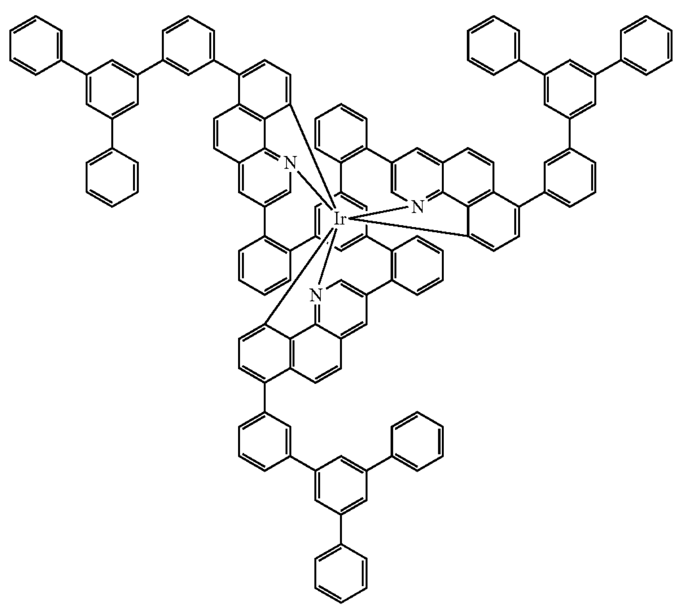<br>Ir(L20-3Br)/1233200-59-3<br>A | 53% |

-continued
| Ex. | Bromide/boronic acid/variant<br>Product | Yield |
|---|---|---|
| Ir103 | 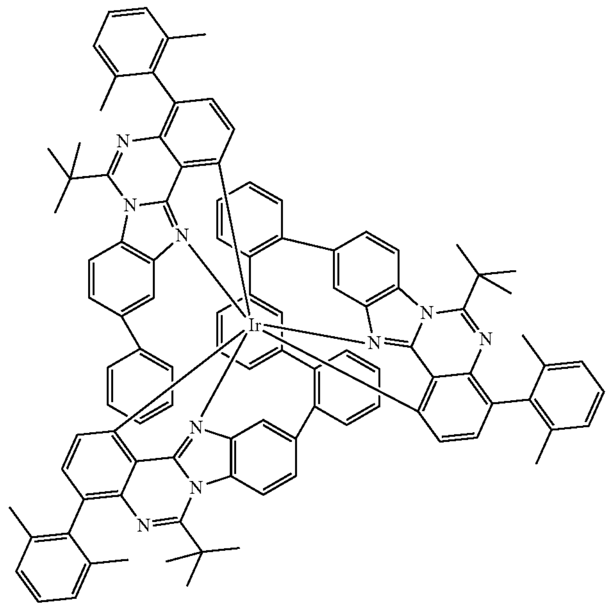<br>Ir(L22-3Br)/100379-00-8/B<br>SPhos:Pd(ac)$_2$/2:1/$Cs_2CO_3$/dioxane<br>Chromatographic separation with Tol/DCM (8:2 v/v) | 41% |
| Ir104 | 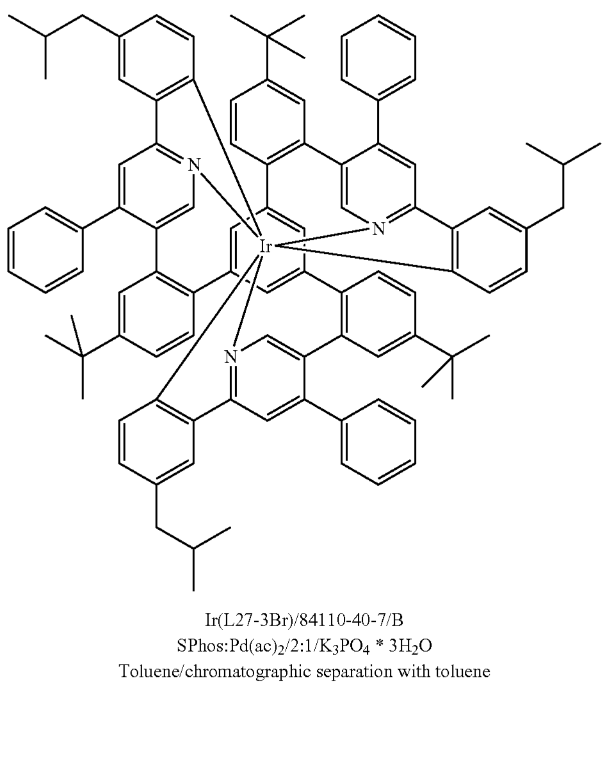<br>Ir(L27-3Br)/84110-40-7/B<br>SPhos:Pd(ac)$_2$/2:1/$K_3PO_4$ * $3H_2O$<br>Toluene/chromatographic separation with toluene | 66% |

-continued
| Ex. | Bromide/boronic acid/variant Product | Yield |
|---|---|---|
| Ir105 | 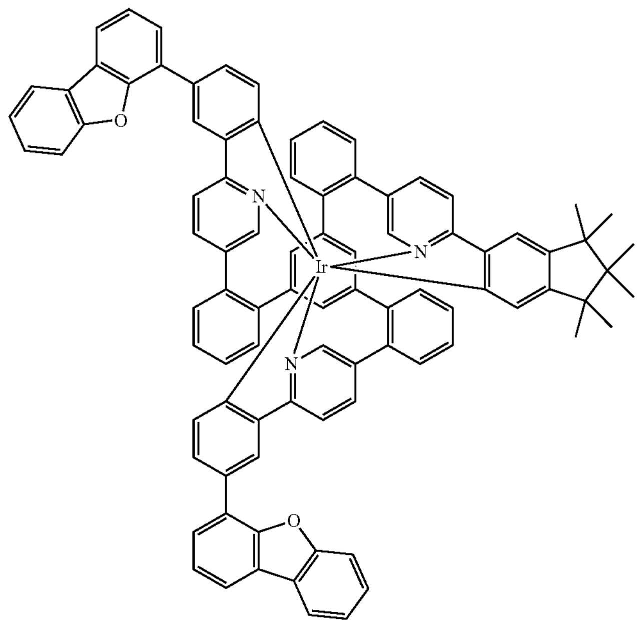 Ir(L39-2Br)/100124-06-9/A | 55% |
| Ir106 | 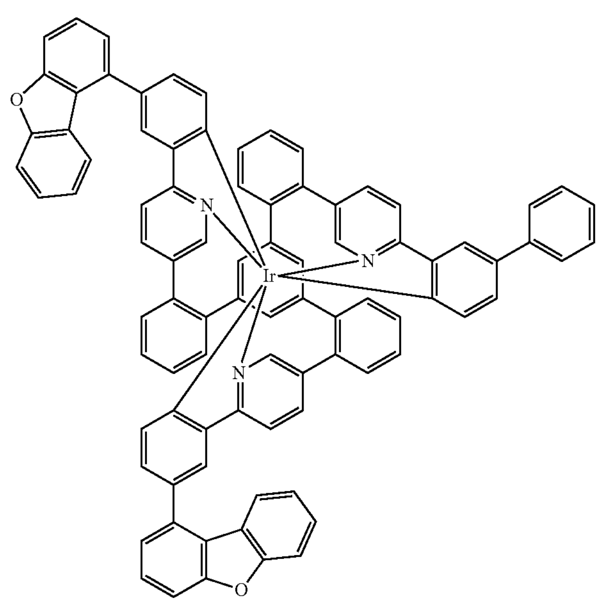 Ir(L44-2Br)/162607-19-4/A | 46% |

-continued
| Ex. | Bromide/boronic acid/variant Product | Yield |
|---|---|---|
| Ir107 | 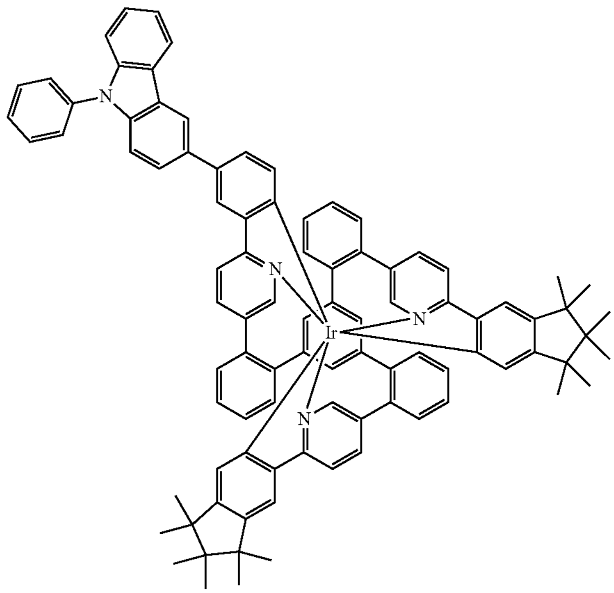 Ir(L40-Br)/854952-58-2/A | 62% |
| Ir108 | 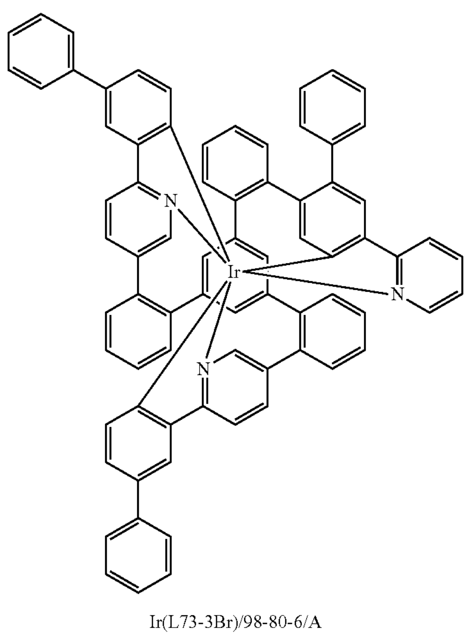 Ir(L73-3Br)/98-80-6/A | 47% |

-continued
| Ex. | Bromide/boronic acid/variant Product | Yield |
| --- | --- | --- |
| Ir109 | 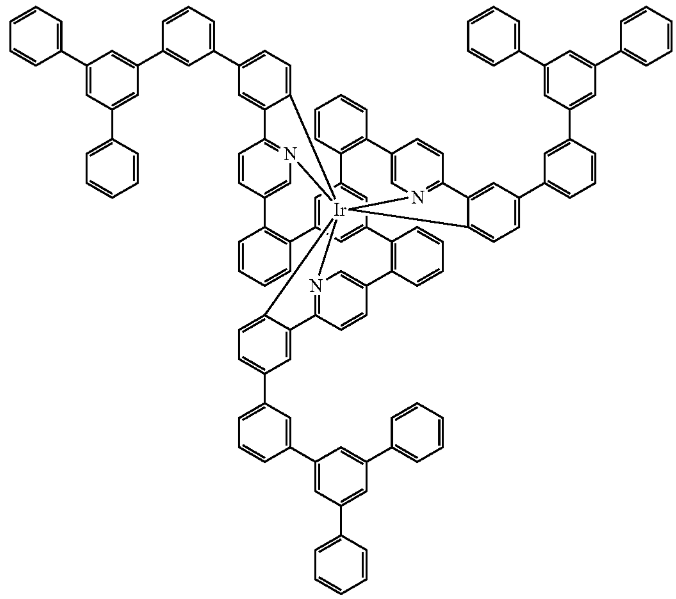 Ir(L2-3Br)/1233200-59-3/A | 57% |
| Ir110 | 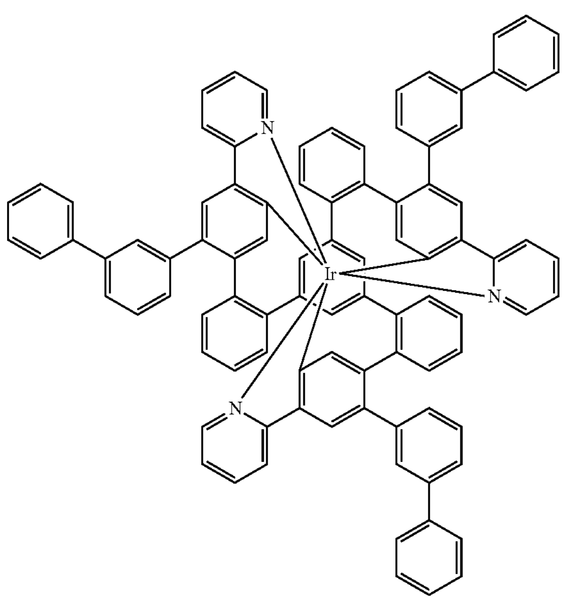 Ir(L72-3Br)/5122-95-2/B<br>9 mol % $Pd(PPh_3)_4/K_3PO_4 \times 1\ H_2O$/DMSO/80° C./60 h<br>Chromatographic purification with DCM<br>and 8 × hot extraction with ethyl acetate<br>Separation of the Δ and Λ enantiomers see 14) | 55% |

-continued
| Ex. | Bromide/boronic acid/variant<br>Product | Yield |
|---|---|---|
| Ir111 | 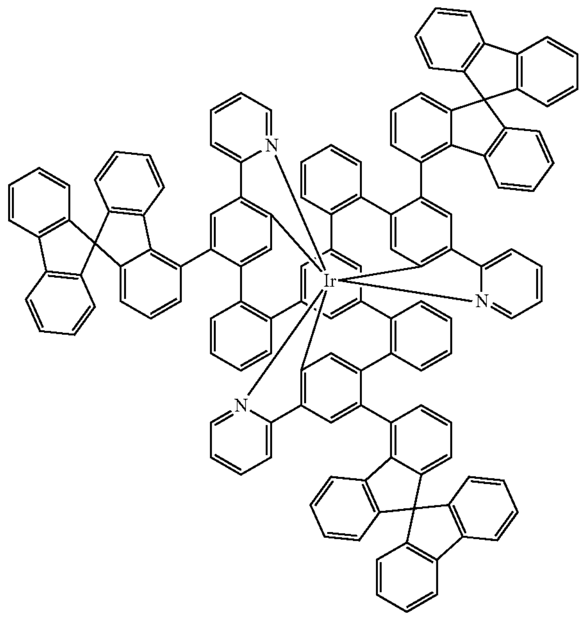<br>Ir(L72-3Br)/1421789-05-0/conditions as Ir110 | 46% |
| Ir112 | 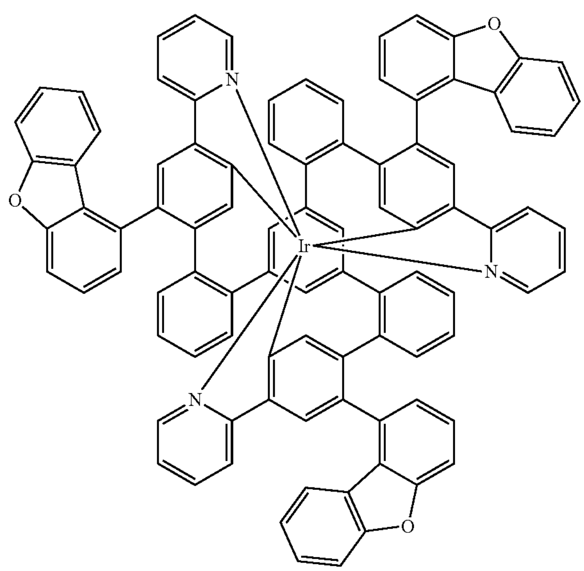<br>Ir(L72-3Br)/162607-19-4/conditions as Ir110 | 53% |

-continued
| Ex. | Bromide/boronic acid/variant<br>Product | Yield |
|---|---|---|
| Ir113 | 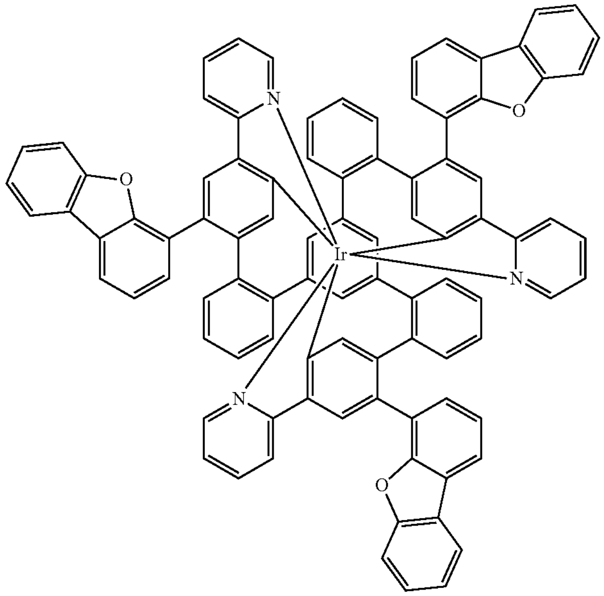<br>Ir(L72-3Br)/100124-06-9/conditions as Ir110<br>3 × hot extraction with butyl acetate/3 × hot extraction with toluene | 55% |
| Ir114 | 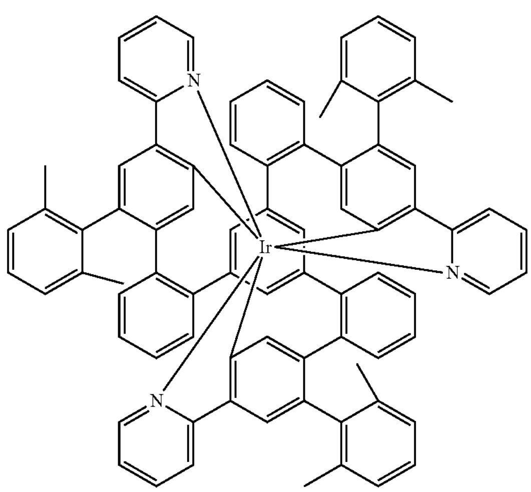<br>Ir(L72-3Br)/100379-00-8/conditions as Ir110<br>Hot extraction with toluene | 50% |

-continued
| Ex. | Bromide/boronic acid/variant<br>Product | Yield |
|---|---|---|
| Ir115 | 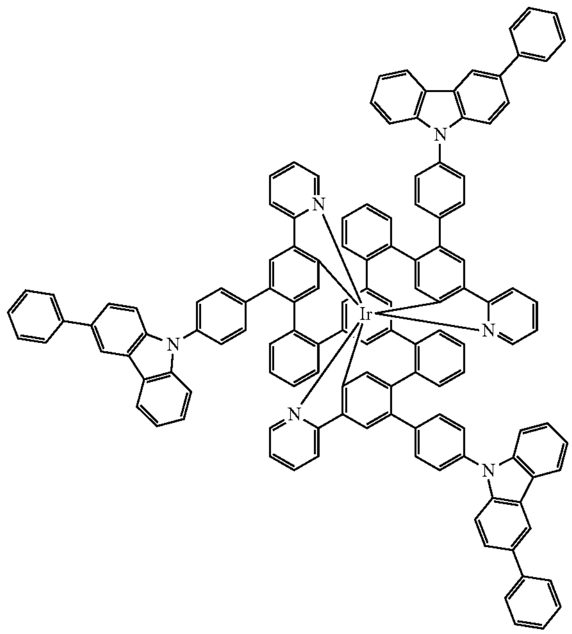<br>Ir(L72-3Br)/1703019-86-6/conditions as Ir110<br>Hot extraction with toluene | 49% |
| Ir116 | 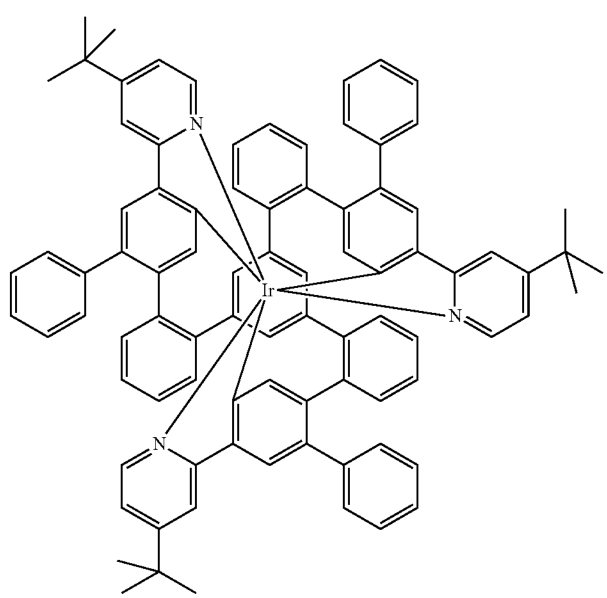<br>Ir(L111-3Br)/5122-95-2/A<br>Chrom. purification with DCM/5 × hot extraction with ethyl acetate<br>Fractional sublimation: p about $10^{-5}$ mbar/T about 390° C. | 52% |

-continued
| Ex. | Bromide/boronic acid/variant<br>Product | Yield |
|---|---|---|
| Ir117 | 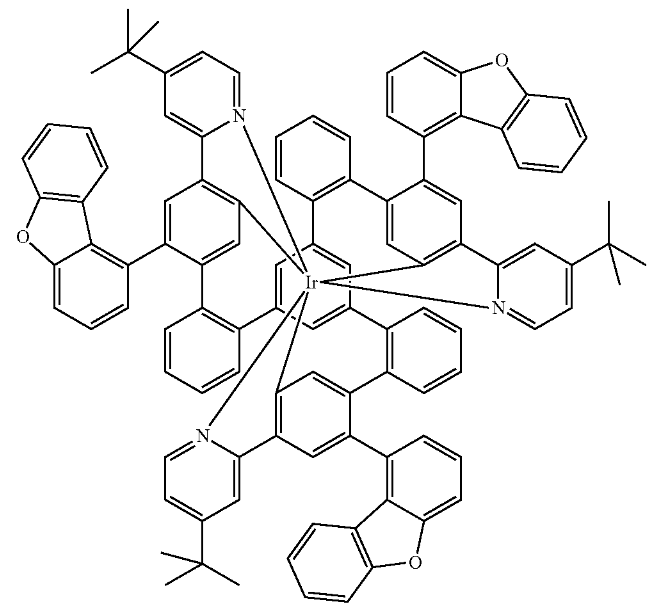<br>Ir(L111-3Br)/162607-19-4/conditions as Ir116 | 43% |
| Ir118 | 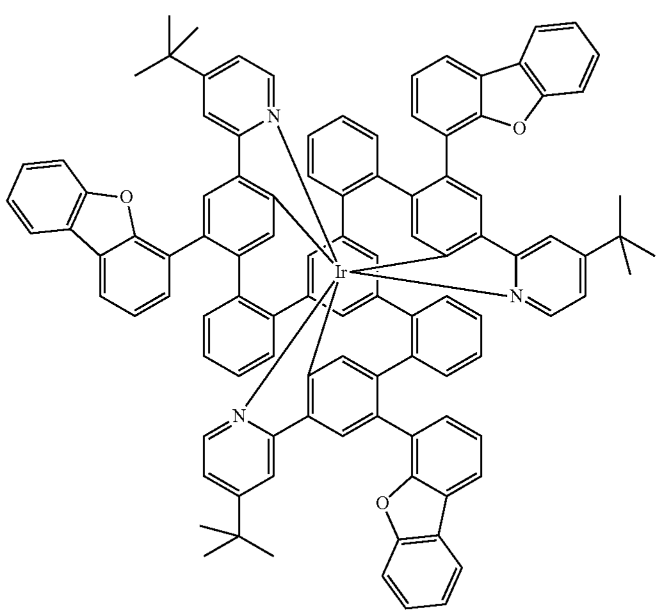<br>Ir(L111-3Br)/100124-06-9/conditions as Ir116<br>5 × hot extraction with toluene | 61% |

-continued
| Ex. | Bromide/boronic acid/variant Product | Yield |
| --- | --- | --- |
| Ir119 | 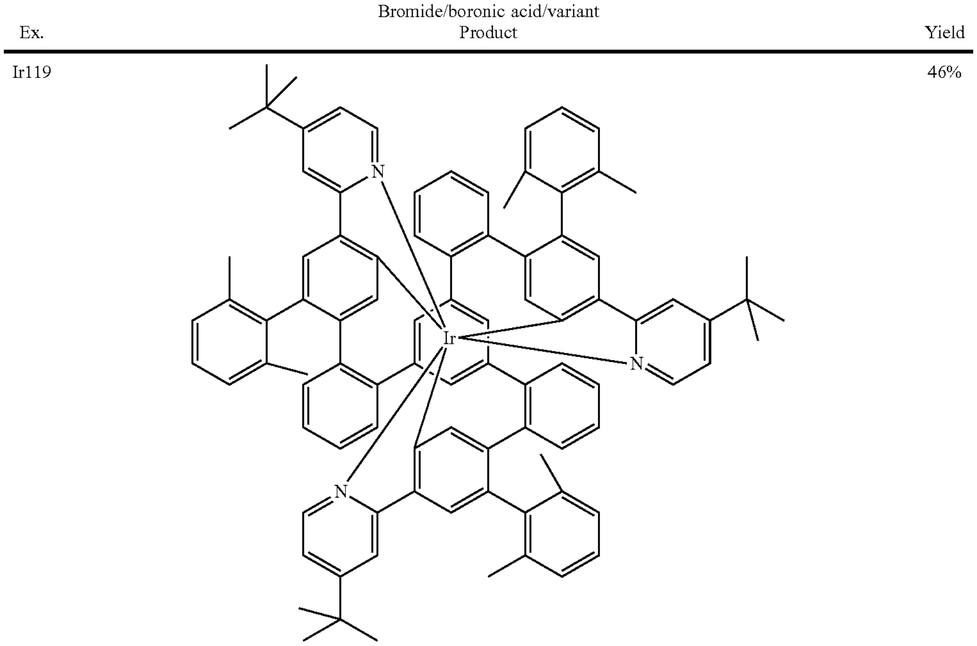 Ir(L111-3Br)/100379-00-8/conditions as Ir110 | 46% |
| Ir120 | 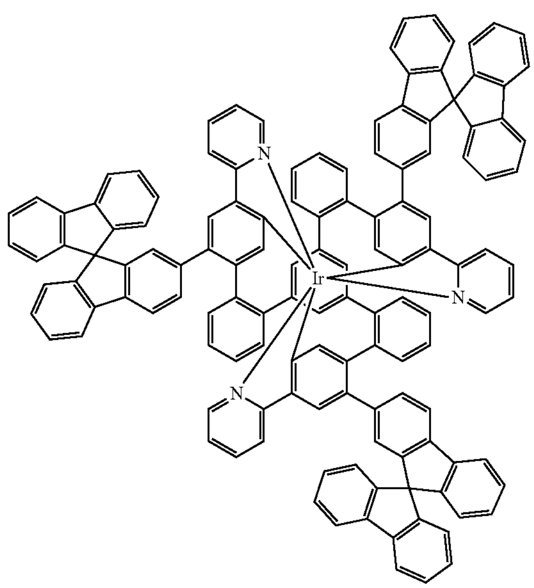 Ir(L72-3Br)/236389-21-2/conditions as Ir116 | 59% |

-continued
| Ex. | Bromide/boronic acid/variant<br>Product | Yield |
|---|---|---|
| Ir121 | 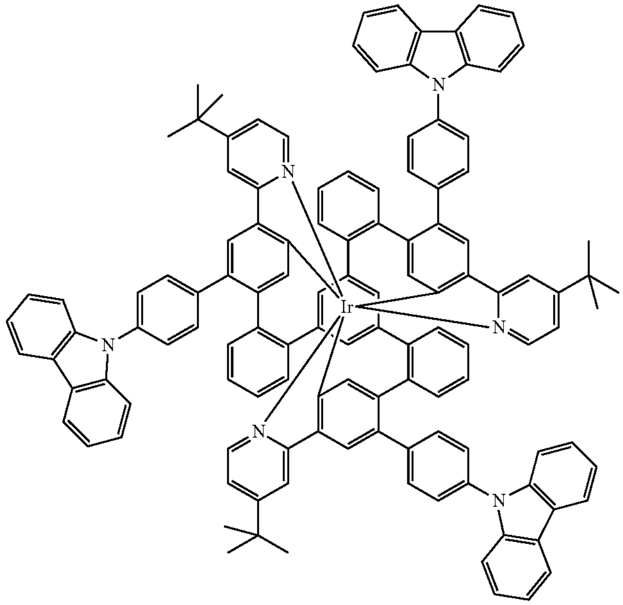<br>Ir(L111-3Br)/419536-33-7/conditions as Ir116<br>5 × hot extraction with toluene | 67% |
| Ir122 | 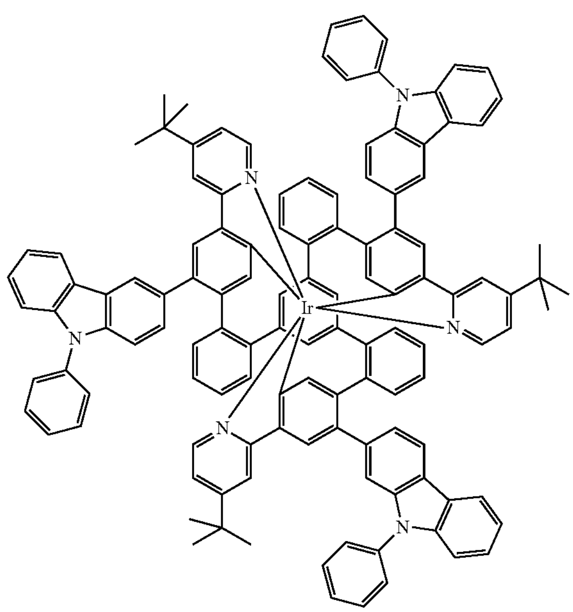<br>Ir(L111-3Br)/854952-58-2/conditions as Ir116 | 51% |

-continued
| Ex. | Bromide/boronic acid/variant<br>Product | Yield |
|---|---|---|
| Ir123 | 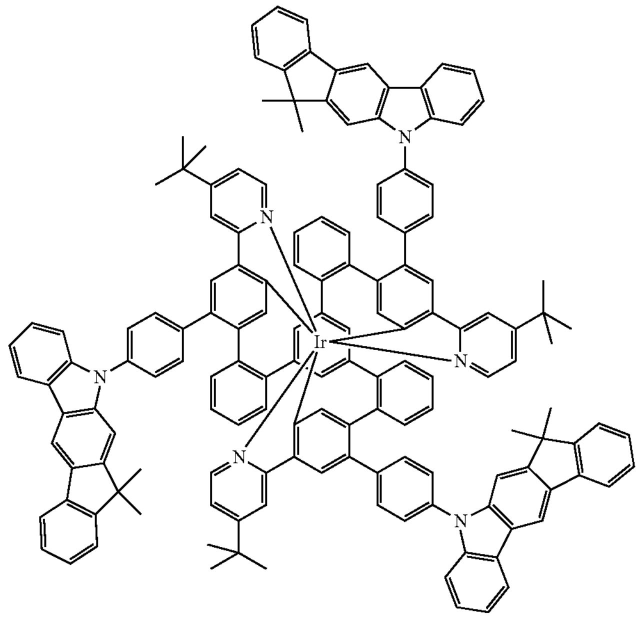<br>Ir(L111-3Br)/1357066-50-2/conditions as Ir116<br>5 × hot extraction with toluene | 71% |
| Ir124 | 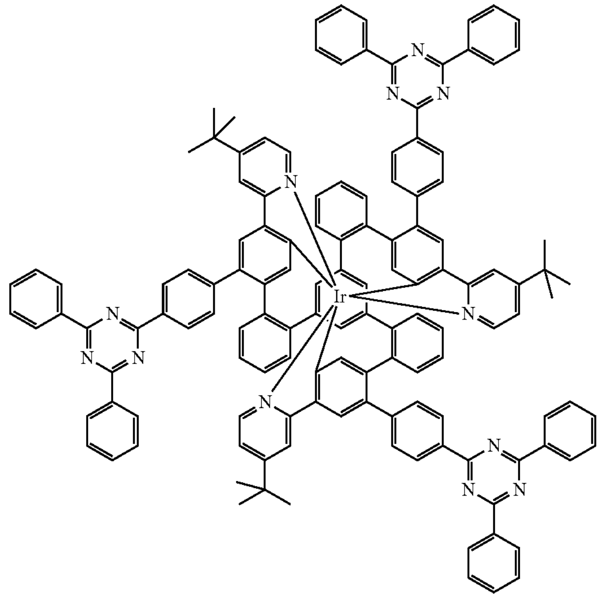<br>Ir(L111-3Br)/1313018-07-3/conditions as Ir116 | 68% |

-continued
| Ex. | Bromide/boronic acid/variant Product | Yield |
|---|---|---|
| Ir126 | 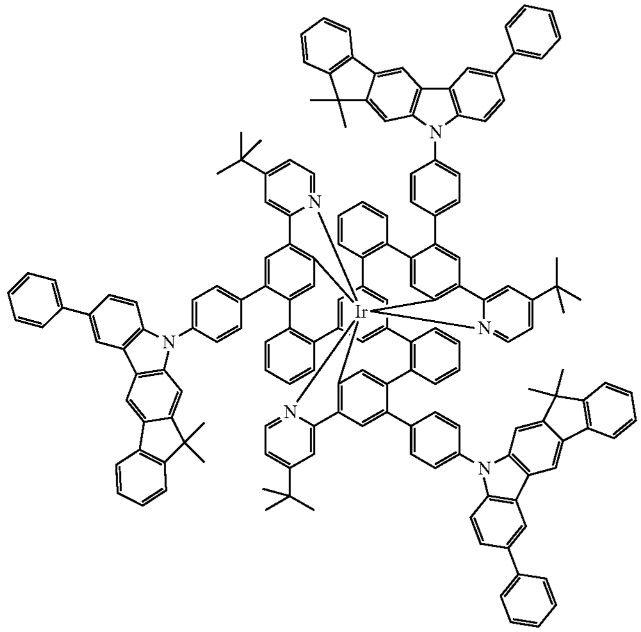 Ir123-3Br/98-80-6/conditions as Ir116 8 × hot extraction with butyl acetate/toluene 2:1; v/v | 50% |
| Ir127 | 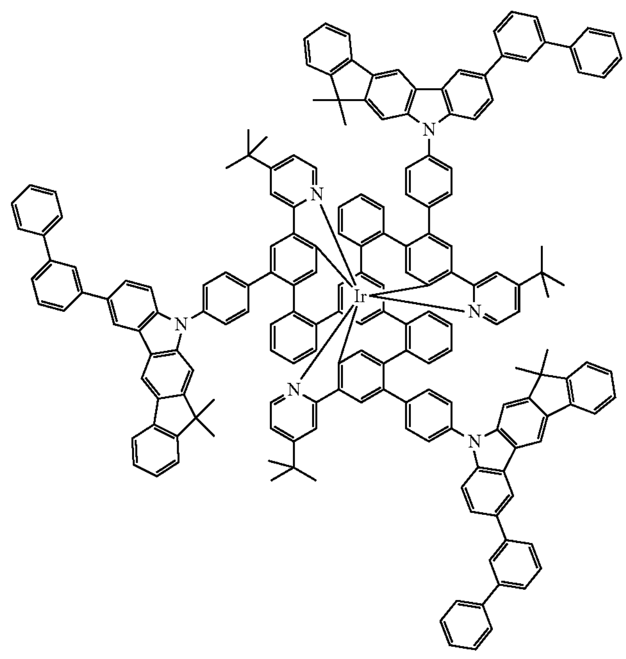 Ir123-3Br/5122-95-2/conditions as Ir116 | 55% |

-continued
| Ex. | Bromide/boronic acid/variant<br>Product | Yield |
|---|---|---|
| Ir128 | 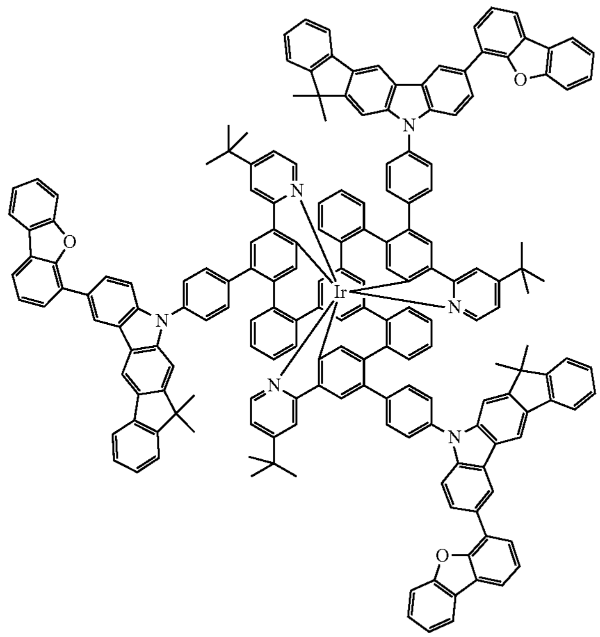<br>Ir123-3Br/100124-06-9/conditions as Ir116 | 63% |
| Ir129 | 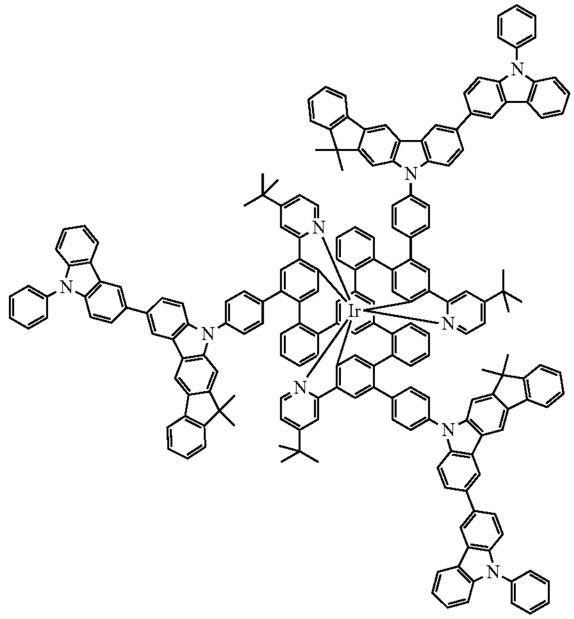<br>Ir123-3Br/854952-58-2/conditions as Ir116 | 59% |

-continued
| Ex. | Bromide/boronic acid/variant<br>Product | Yield |
|---|---|---|
| Ir131 | 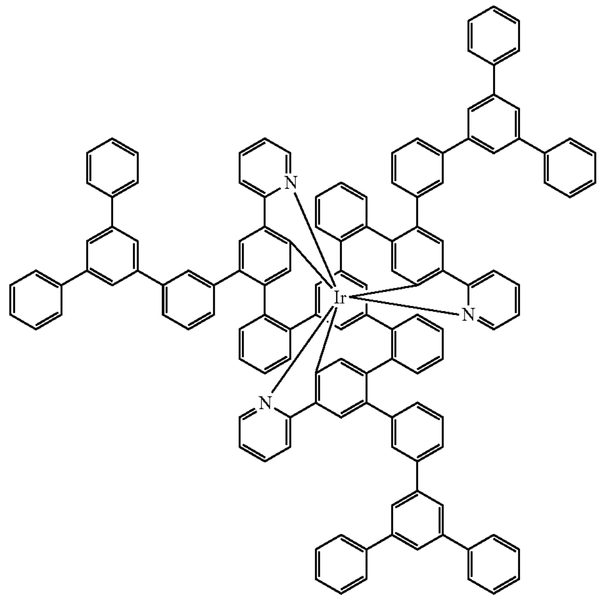<br>Ir(L72-3Br)/1233200-59-3/conditions as Ir110 | 51% |
| Ir132 | 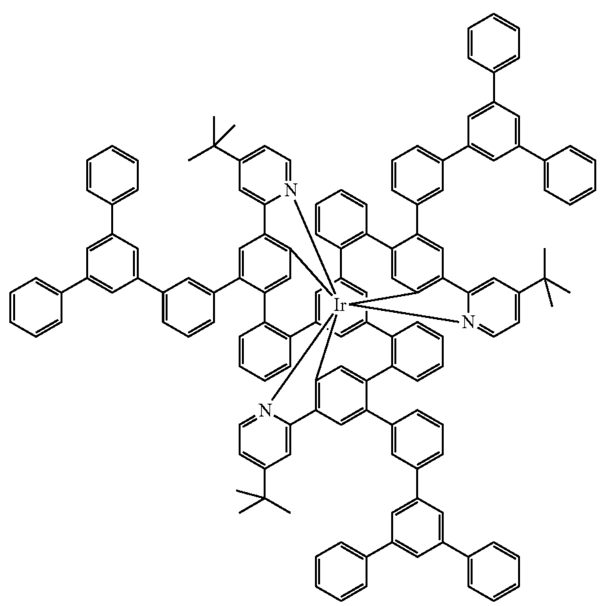<br>Ir(L111-3Br)/1233200-59-3/conditions as Ir116 | 54% |

-continued
| Ex. | Bromide/boronic acid/variant<br>Product | Yield |
|---|---|---|
| Ir133 | 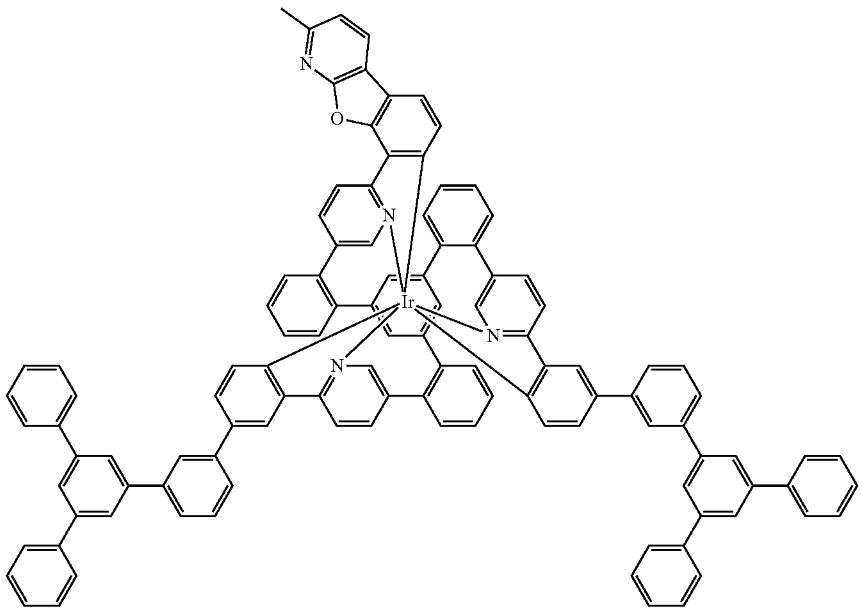<br>Ir(L71-2Br)/1233200-59-3/conditions as Ir116 | 60% |
| Ir134 | 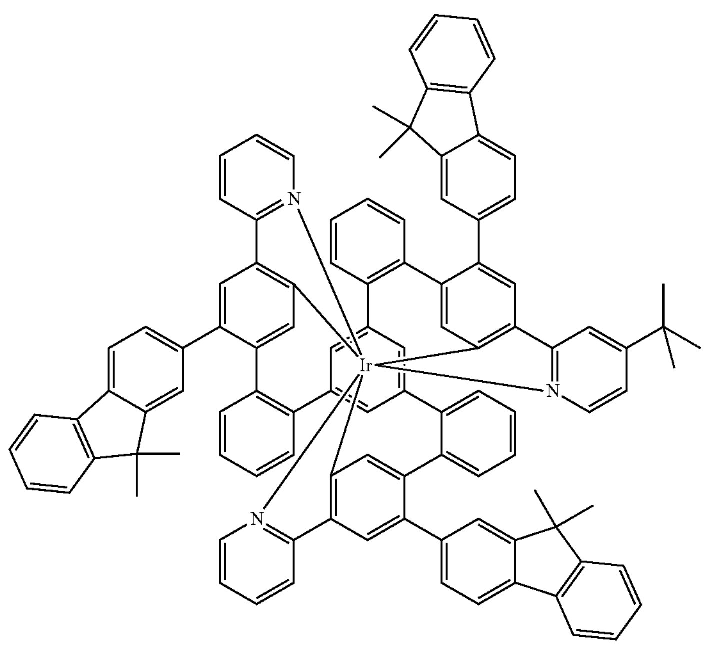<br>Ir(L203-3Br)/333432-28-3/conditions as Ir116 | 57% |

-continued
| Ex. | Bromide/boronic acid/variant<br>Product | Yield |
|---|---|---|
| Ir135 | 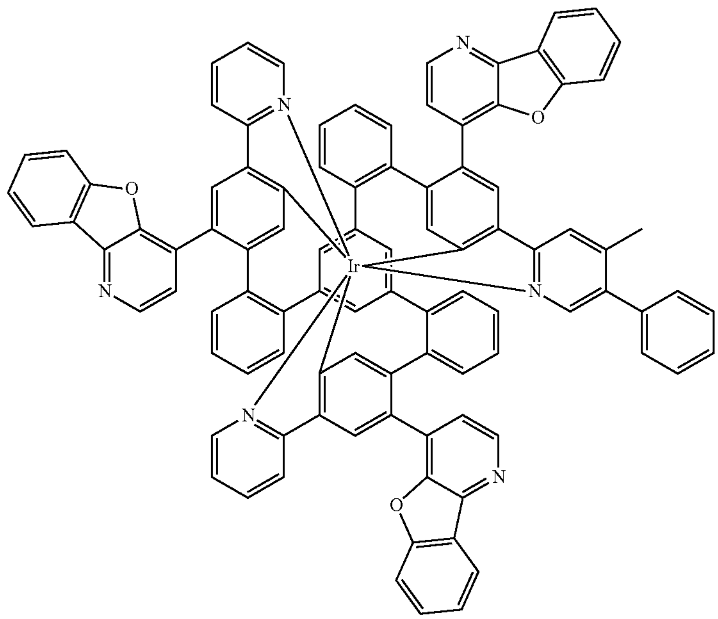<br>Ir(L204-3Br)/1680179-22-9/conditions as Ir116 | 62% |
| Ir136 | 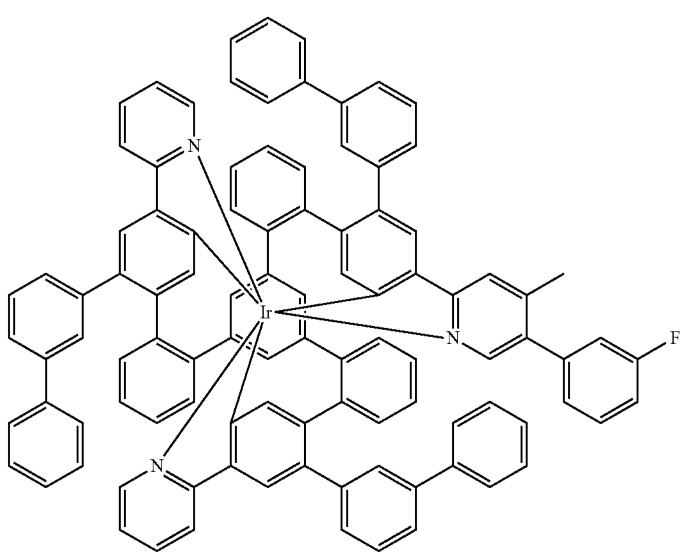<br>Ir(L205-3Br)/5122-95-2/conditions as Ir116 | 59% |

-continued
| Ex. | Bromide/boronic acid/variant<br>Product | Yield |
|---|---|---|
| Ir137 | 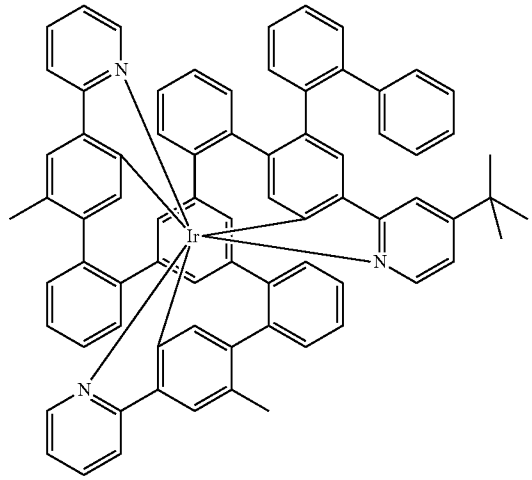<br>Ir(L206-Br)/5122-95-2/conditions as Ir116 | 61% |
| Ir138 | 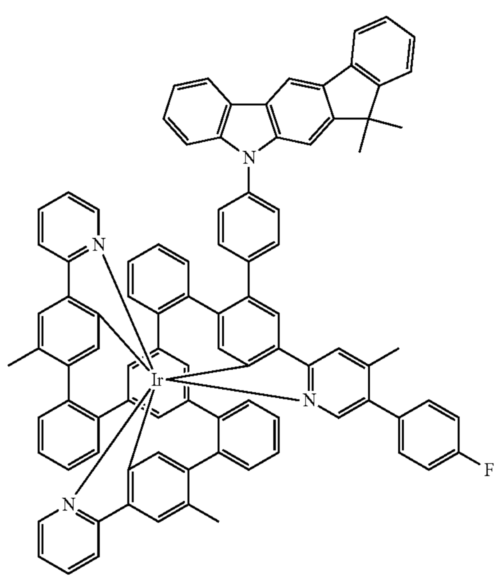<br>Ir(L207-Br)/1357066-50-2/conditions as Ir116 | 58% |

-continued
| Ex. | Bromide/boronic acid/variant<br>Product | Yield |
|---|---|---|
| Ir139 | 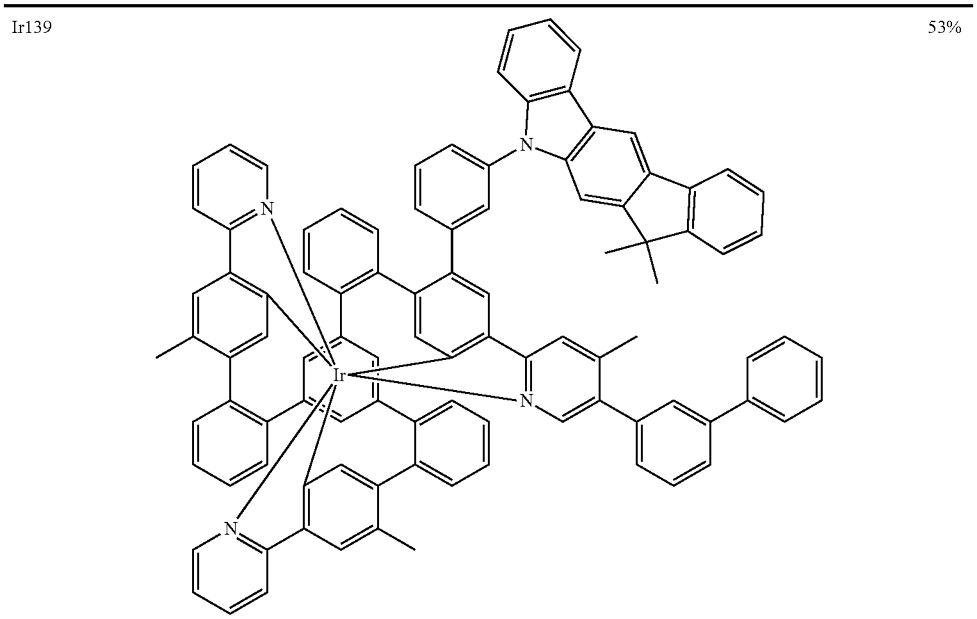<br>Ir(L208-Br)/1369587-64-3/conditions as Ir116 | 53% |
| Ir140 | 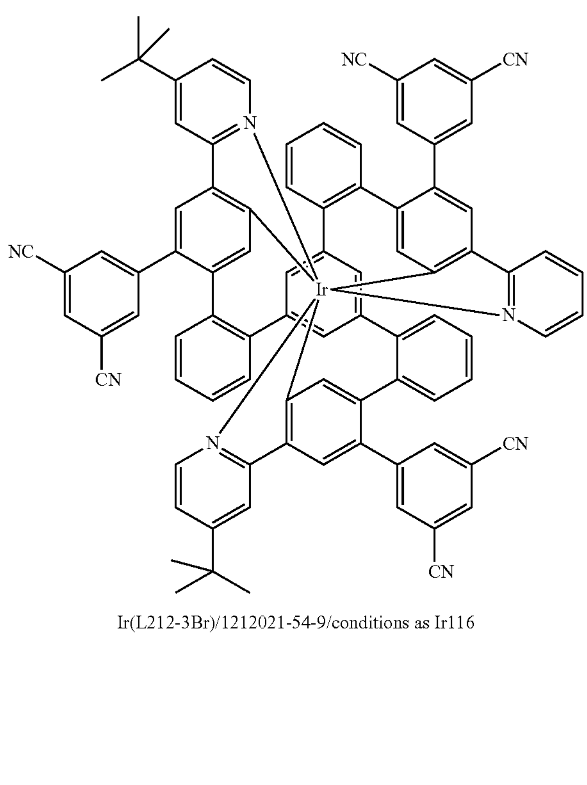<br>Ir(L212-3Br)/1212021-54-9/conditions as Ir116 | 68% |

-continued
| Ex. | Bromide/boronic acid/variant<br>Product | Yield |
|---|---|---|
| Ir141 | 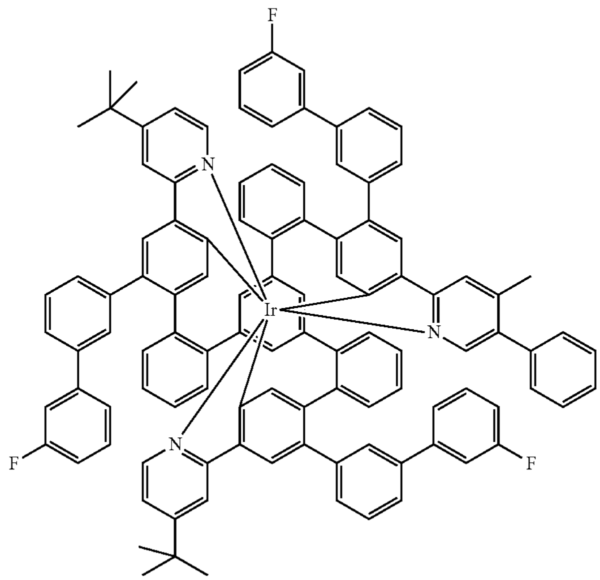<br>Ir(L213-Br)/1106676-79-2/conditions as Ir116 | 55% |
| Ir142 | 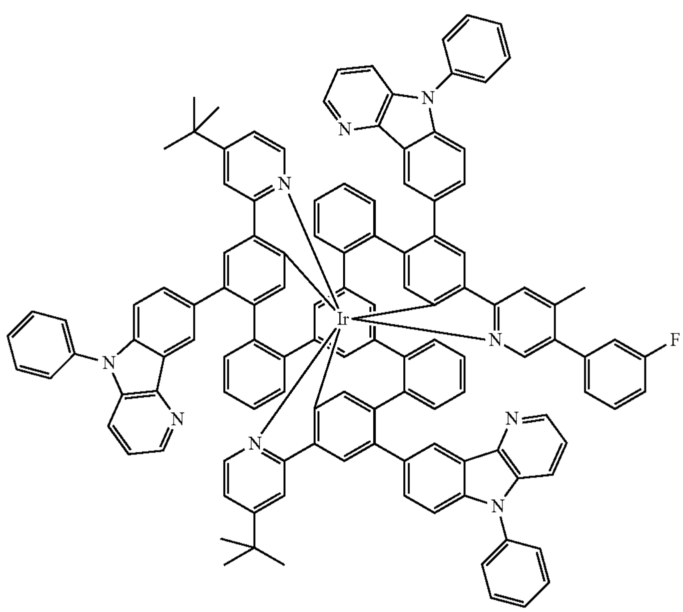<br>Ir(L216-Br)/1259025-43-8/conditions as Ir116 | 57% |

-continued
| Ex. | Bromide/boronic acid/variant Product | Yield |
|---|---|---|
| Ir143 | 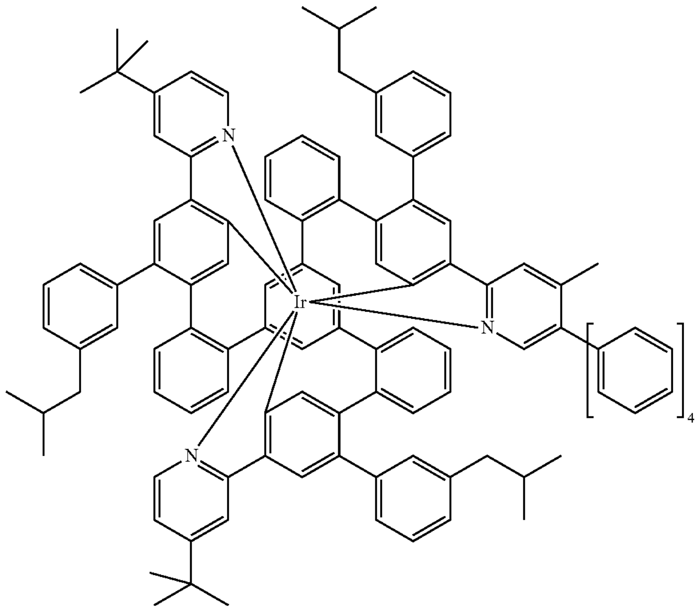 Ir(L218-3Br)/153624-42-1/conditions as Ir116 | 48% |
| Ir144 | 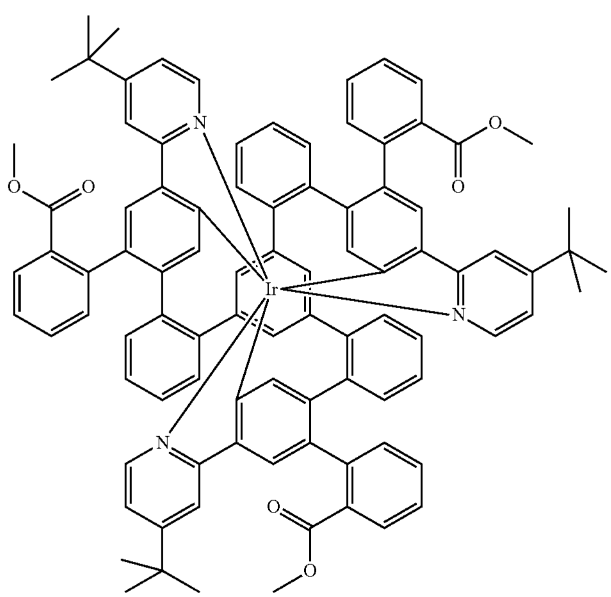 Ir(L111-3Br)/374538-03-1/B 6 mol % $Pd(PPh_3)_4$/$K_3PO_4$ × 1 $H_2O$/DMSO/100° C./40 h Chromatographic purification with DCM | 55% |

-continued
| Ex. | Bromide/boronic acid/variant<br>Product | Yield |
|---|---|---|
| Ir145 | 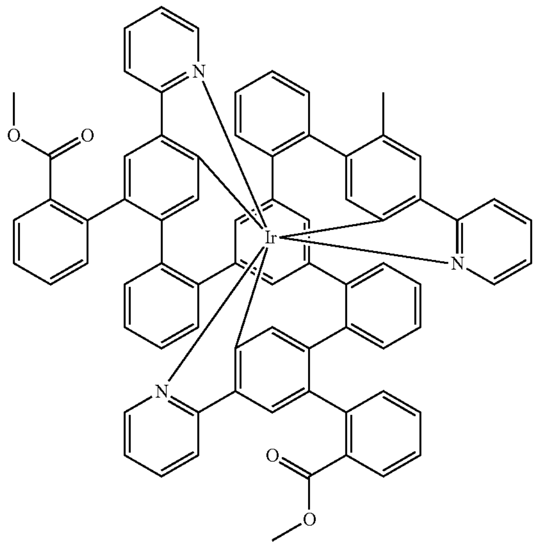<br>Ir(L220-2Br)/374538-03-1/as Ir144 | 61% |
| Ir146 | 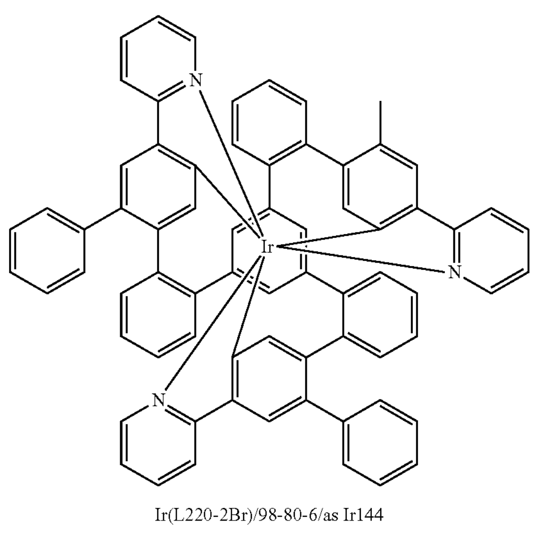<br>Ir(L220-2Br)/98-80-6/as Ir144 | 65% |

-continued
| Ex. | Bromide/boronic acid/variant Product | Yield |
|---|---|---|
| Ir151 | 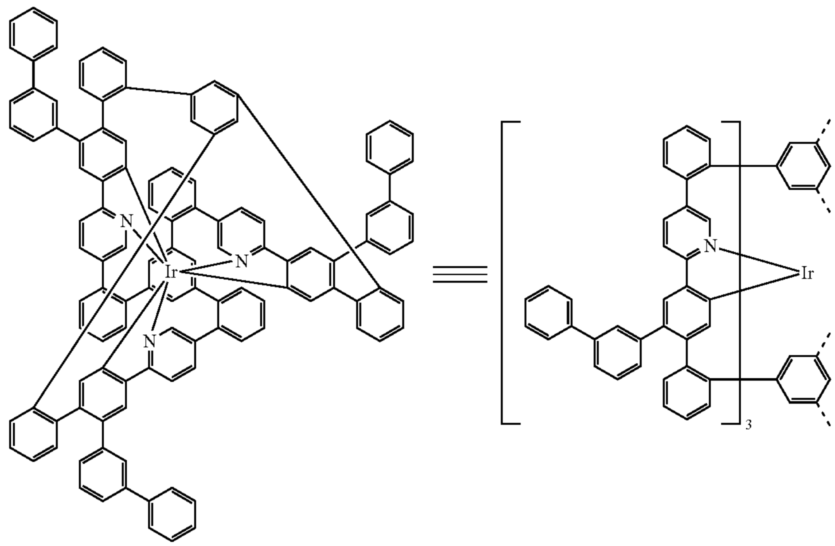 Ir150-3Br/5122-95-2/B 9 mol % $Pd(PPh_3)_4/K_3PO_4 \times 1\ H_2O$/DMSO/80° C./60 h Chrom. purification with DCM/and 5 × hot extracton with butyl acetate | 60% |
| Ir152 | 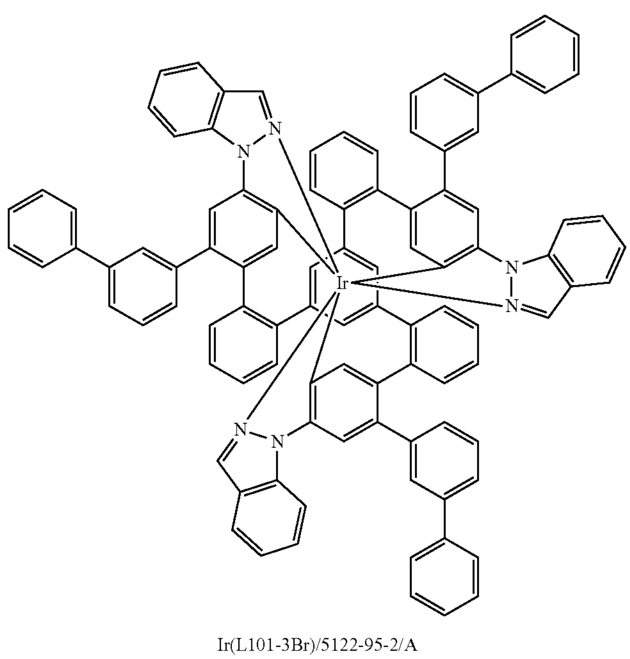 Ir(L101-3Br)/5122-95-2/A | 42% |

-continued

| Ex. | Bromide/boronic acid/variant Product | Yield |
|---|---|---|
| Ir153 | 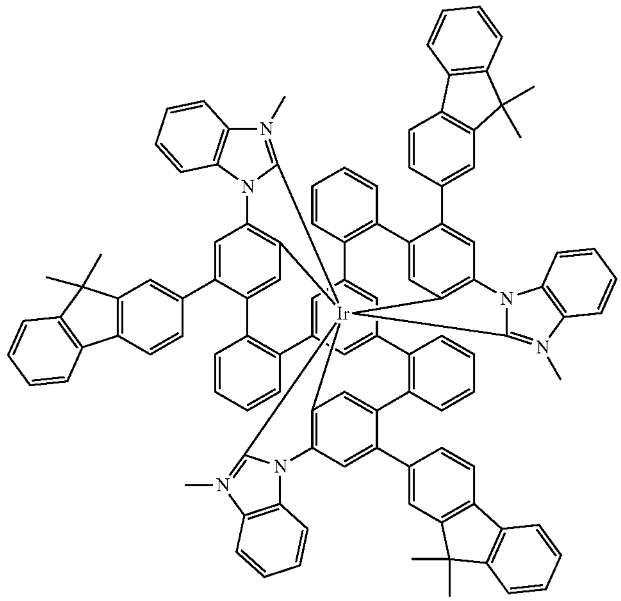 Ir(L107-3Br)/333432-28-3/conditions as Ir151 | 66% |
| Ir154 | 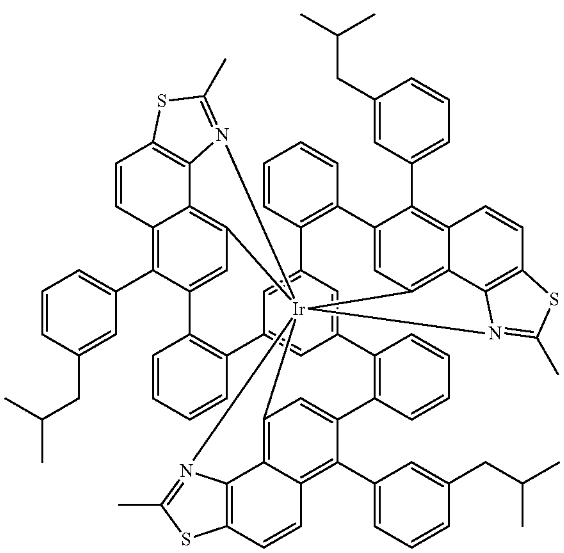 Ir(L120-3Br)/153624-42-1/conditions as Ir151 | 55% |

3) Buchwald Coupling with the Ir Complexes

To a mixture of 10 mmol of the brominated complex, 12-20 mmol of the diarylamine or carbazole per bromine function, a 1.1 molar amount of sodium tert-butoxide per amine used or 80 mmol of tripotassium phosphate (anhydrous) in the case of carbazoles, 100 g of glass beads (diameter 3 mm) and 300-500 ml of toluene or o-xylene in the case of carbazoles are added 0.4 mmol of tri-tert-butylphosphine and then 0.3 mmol of palladium(II) acetate, and the mixture is heated under reflux with good stirring for 16-30 h. After cooling, 500 ml of water are added, the aqueous phase is removed, and the organic phase is washed twice with 200 ml of water and once with 200 ml of saturated sodium chloride solution and dried over magnesium sulphate. The mixture is filtered through a Celite bed and washed through with toluene or o-xylene, the solvent is removed almost completely under reduced pressure, 300 ml of ethanol are added, and the precipitated crude product is filtered off with suction, washed three times with 50 ml each time of EtOH and dried under reduced pressure. The crude product is purified by chromatography on silica gel or by hot extraction. The metal complex is finally heat-treated or sublimed. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

Synthesis of Ir200:
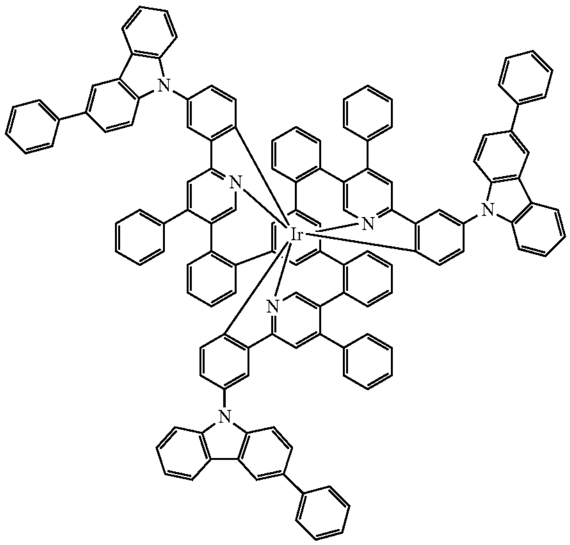
Use of 14.2 g (10 mmol) of Ir(L16-3Br) and 9.7 g (40 mmol) of 3-phenylcarbazole [103012-26-6]. Chromatography with toluene on silica gel three times, heat treatment. Yield: 6.5 g (3.4 mmol), 34%; purity: about 99.8% by HPLC.
In an analogous manner, it is possible to Prepare the following compounds:
| Ex. | Reactant/amine or carbazole<br>Product | Yield |
|---|---|---|
| Ir201 | 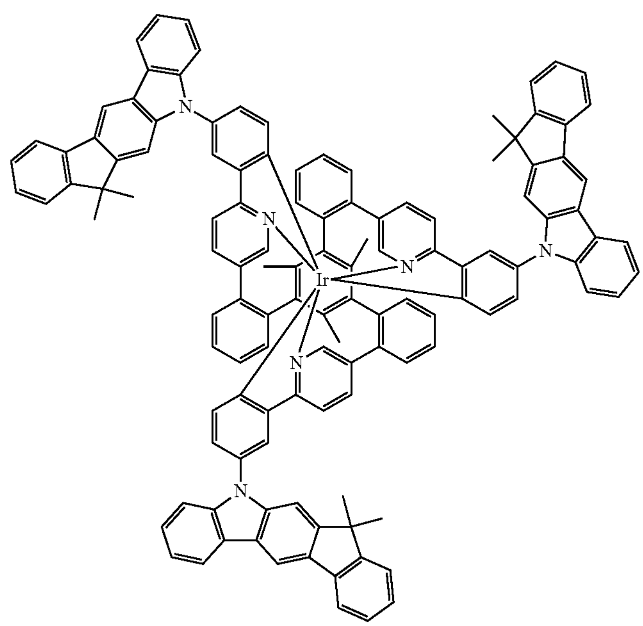<br>Ir(L35-3Br)/n 1257220-47-5 | 39% |

-continued
| Ex. | Reactant/amine or carbazole Product | Yield |
|---|---|---|
| Ir202 | 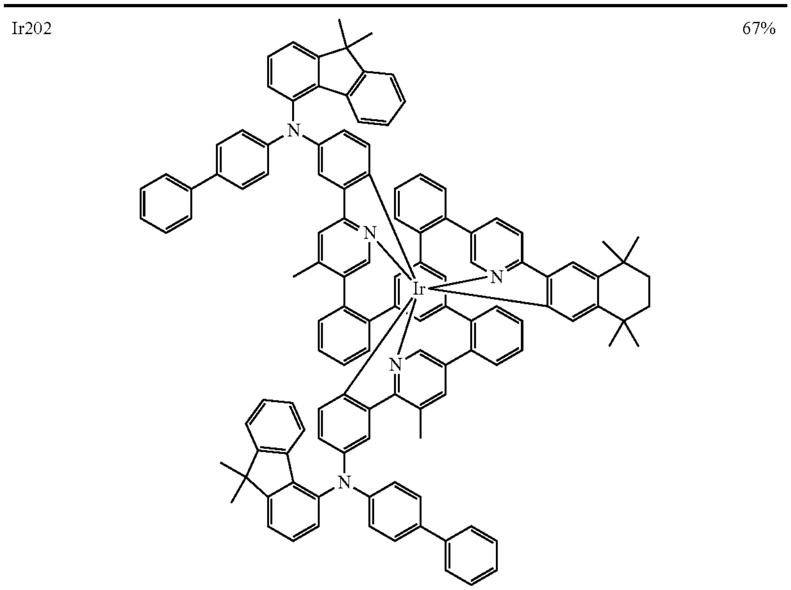 Ir(L49-2Br)/1421789-16-3 | 67% |
| Ir203 | 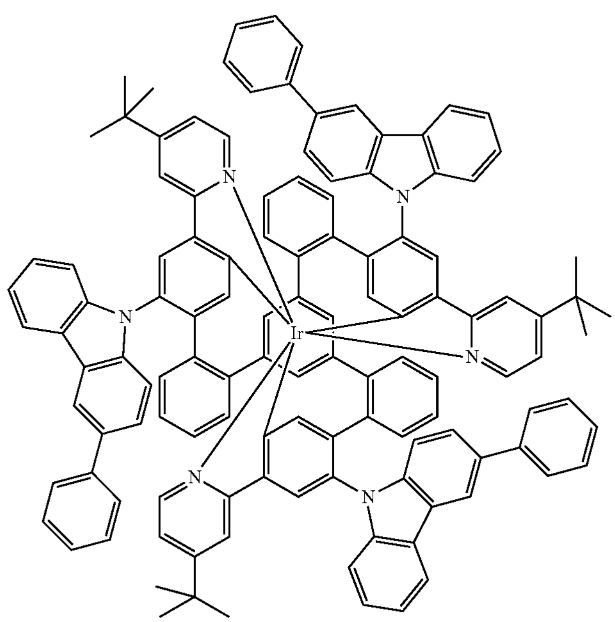 Ir(L111-3Br)/103012-26-6 Use of $PCy_3$ rather than $P(t\text{-}Bu)_3$ | 27% |

-continued

| Ex. | Reactant/amine or carbazole Product | Yield |
|---|---|---|
| Ir204 | 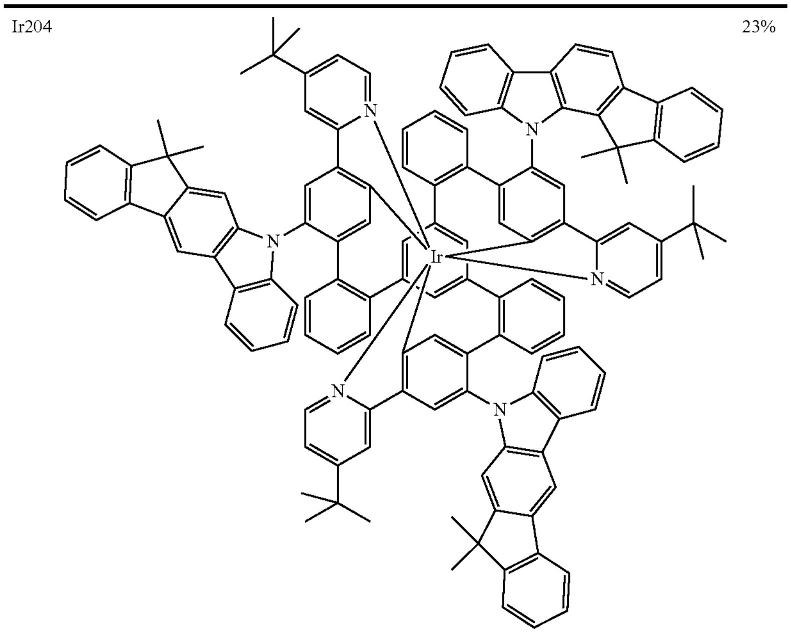 Ir(L111-3Br)/1257220-47-5 Use of $PCy_3$ rather than $P(t\text{-}Bu)_3$ | 23% |
| Ir205 | 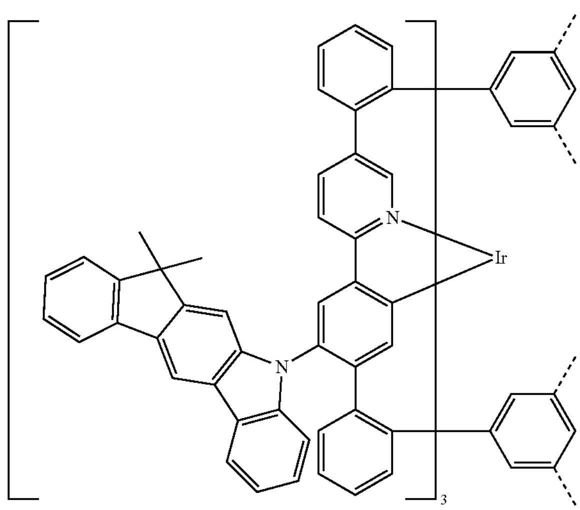 Ir150-3Br/1257220-47-5 Use of $PCy_3$ rather than $P(t\text{-}Bu)_3$ | 28% |

4) Cyanation of the Iridium Complexes

A mixture of 10 mmol of the brominated complex, 13 mmol of copper(I) cyanide per bromine function and 300 ml of NMP is stirred at 180° C. for 20 h. After cooling, the solvent is removed under reduced pressure, the residue is taken up in 500 ml of dichloromethane, the copper salts are filtered off using Celite, the dichloromethane is concentrated almost to dryness under reduced pressure, 100 ml of ethanol are added, and the precipitated solids are filtered off with suction, washed twice with 50 ml each time of ethanol and dried under reduced pressure. The crude product is purified by chromatography and/or hot extraction. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

Synthesis of Ir300:
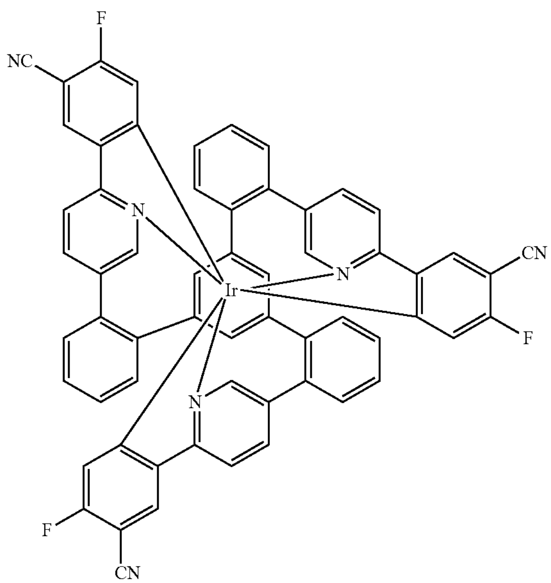
Use of 12.4 g (10 mmol) of Ir(L37-3Br) and 3.5 g (39 mmol) of copper(I) cyanide. Chromatography on silica gel with dichloromethane twice, sublimation. Yield: 5.6 g (4.9 mmol), 49%; purity: about 99.9% by HPLC.
In an analogous manner, it is possible to prepare the following compounds:
| Ex. | Reactant<br>Cyanation product | |
|---|---|---|
| Ir301 | 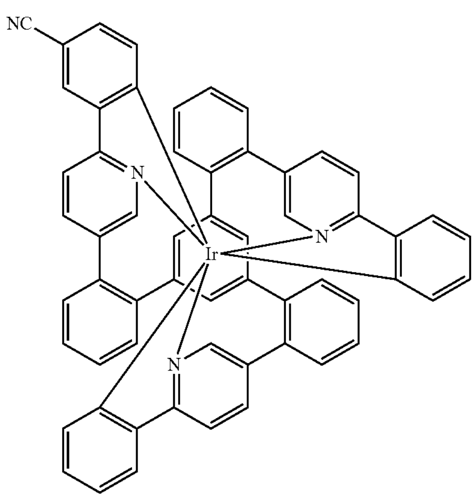 Ir(L2-Br) | 44% |

-continued
| Ex. | Reactant<br>Cyanation product | |
|---|---|---|
| Ir302 | 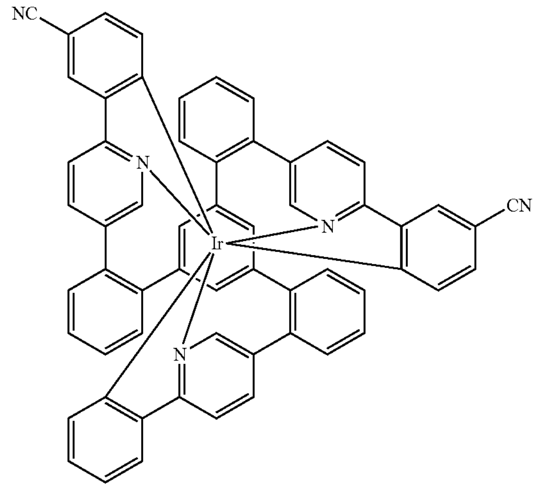<br>Ir(L2-2Br) | 44% |
| Ir303 | 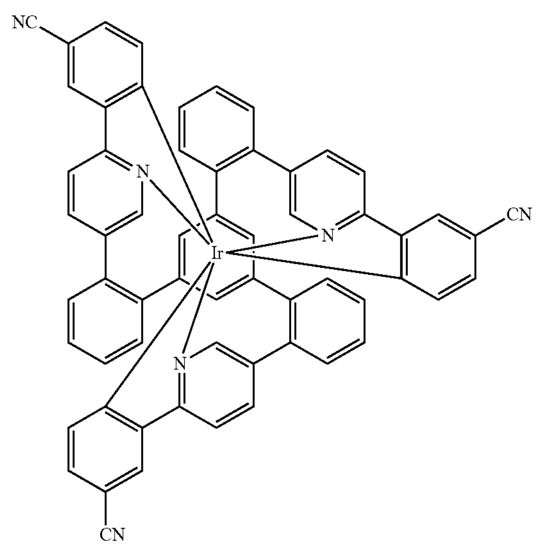<br>Ir(L2-3Br) | 51% |

-continued
| Ex. | Reactant<br>Cyanation product | |
|---|---|---|
| Ir304 | 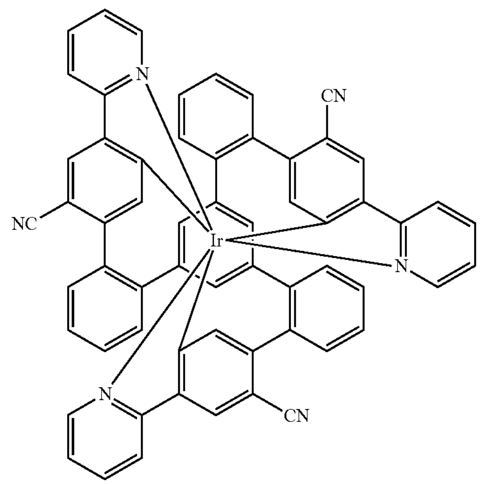<br>Ir(L72-3Br) | 60% |
| Ir305 | 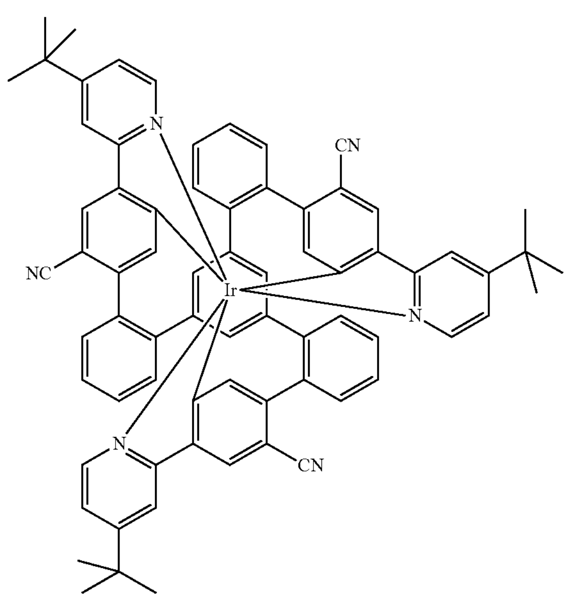<br>Ir(L111-3Br) | 58% |

-continued
| Ex. | Reactant<br>Cyanation product | |
|---|---|---|
| Ir306 | 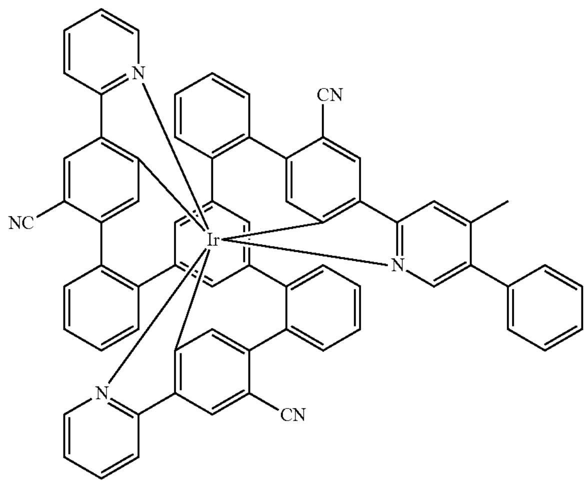Ir(L204-3Br) | 62% |
| Ir307 | 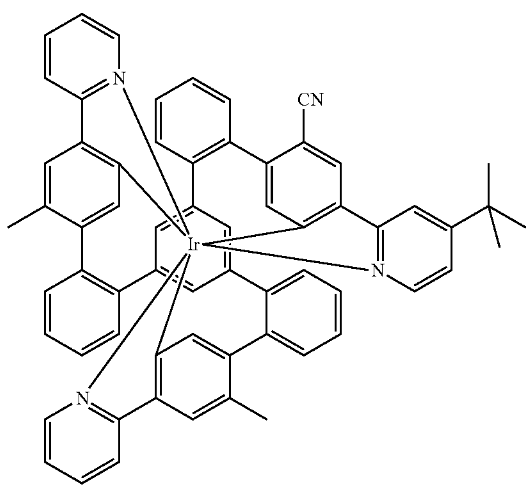Ir(L206-Br) | 64% |
| Ir308 | 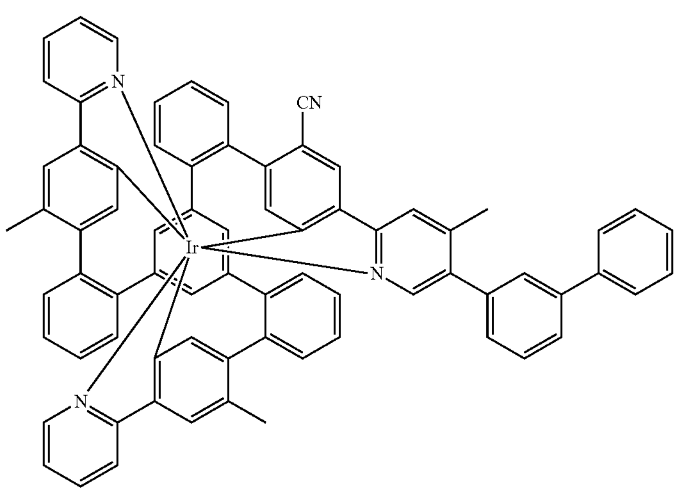Ir(L208-Br) | 60% |

-continued
| Ex. | Reactant<br>Cyanation product | |
|---|---|---|
| Ir309 | 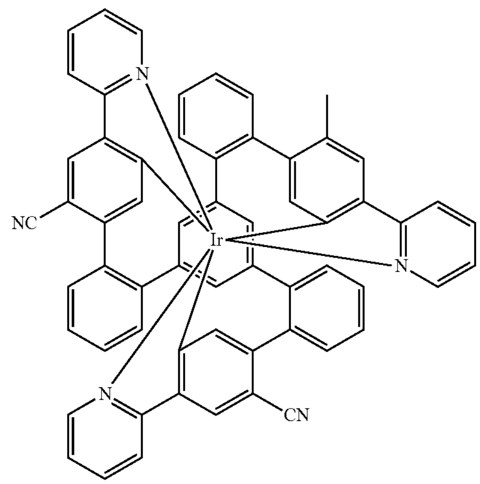<br>Ir(L220-2Br) | 67% |
| Ir310 | 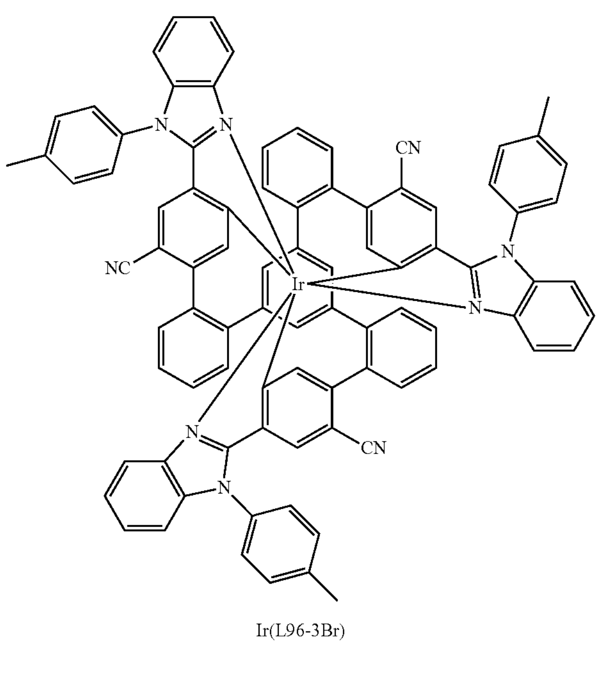<br>Ir(L96-3Br) | 67% |

-continued
| Ex. | Reactant<br>Cyanation product | |
|---|---|---|
| Ir311 | 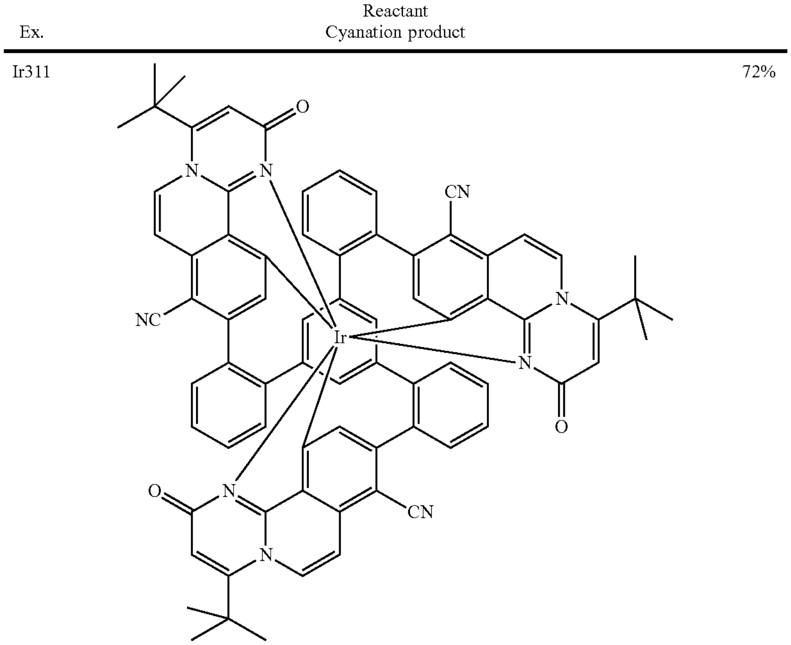<br>Ir(L116-3Br) | 72% |
| Ir312 | 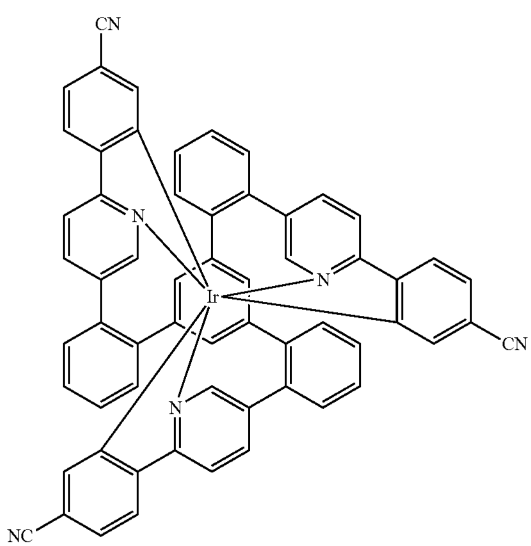<br>Ir(L135) | 68% |

-continued

| Ex. | Reactant<br>Cyanation product | |
|---|---|---|
| Ir313 | 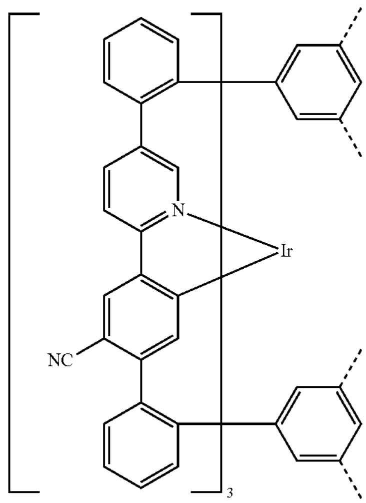<br>Ir150-3Br | 64% |

5) Borylation of the Iridium Complexes

A mixture of 10 mmol of the brominated complex, 12 mmol of bis(pinacolato)diborane [73183-34-3] per bromine function, 30 mmol of anhydrous potassium acetate per bromine function, 0.2 mmol of tricyclohexylphosphine, 0.1 mmol of palladium(II) acetate and 300 ml of solvent (dioxane, DMSO, NMP, toluene, etc.) is stirred at 80-160° C. for 4-16 h. After the solvent has been removed under reduced pressure, the residue is taken up in 300 ml of dichloromethane, THF or ethyl acetate and filtered through a Celite bed, the filtrate is concentrated under reduced pressure until commencement of crystallization and about 100 ml of methanol are finally added dropwise in order to complete the crystallization. The compounds can be recrystallized from dichloromethane, ethyl acetate or THF with addition of methanol.

Synthesis of Ir400:

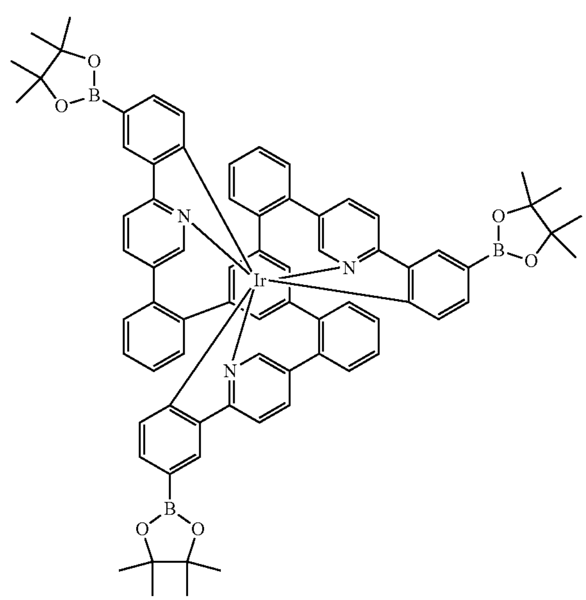

Use of 11.9 g (10 mmol) of Ir(L2-3Br) and 9.1 g (36 mmol) of bis(pinacolato)diborane [73183-34-3], dioxane/toluene 1:1 v/v, 120° C., 16 h, taking up and Celite filtration in THF. Recrystallization from THF:methanol. Yield: 7.3 g (5.5 mmol), 55%; purity: about 99.8% by HPLC.

In an analogous manner, it is possible to prepare the following compounds:
| Ex. | Product Reactant | Yield |
|---|---|---|
| Ir401 | 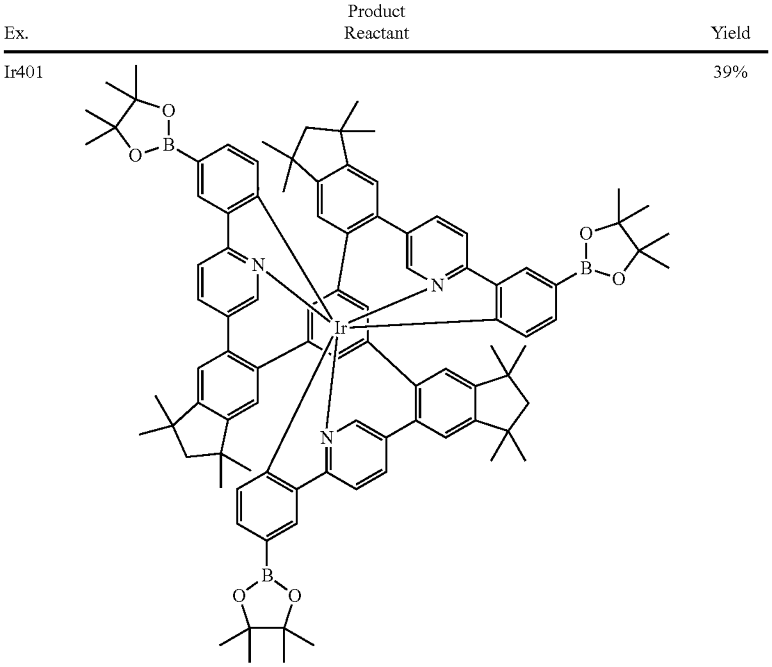 Ir(L24-3Br) | 39% |
| Ir402 | 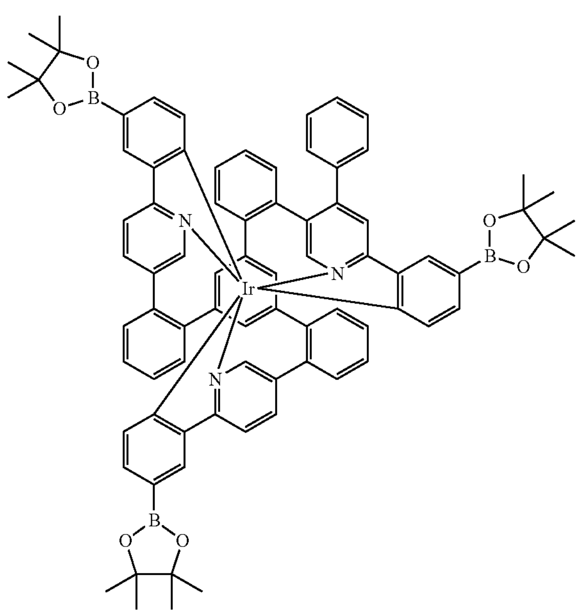 Ir(L51-3Br) | 48% |

-continued
| Ex. | Product<br>Reactant | Yield |
|---|---|---|
| Ir403 | 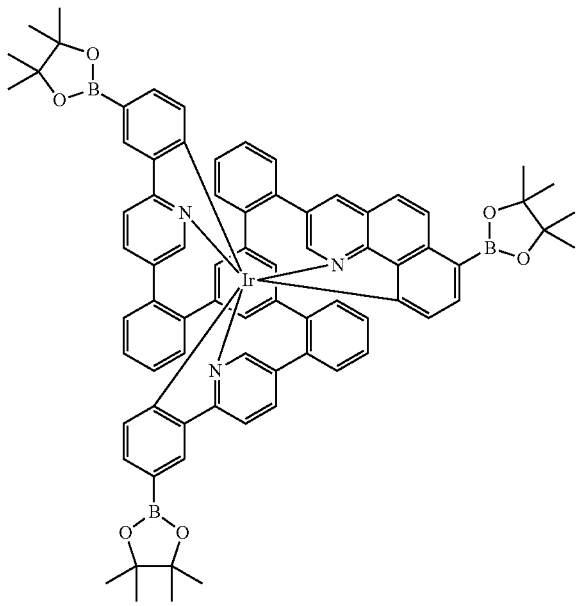<br>Ir(L55-3Br) | 55% |
| Ir404 | 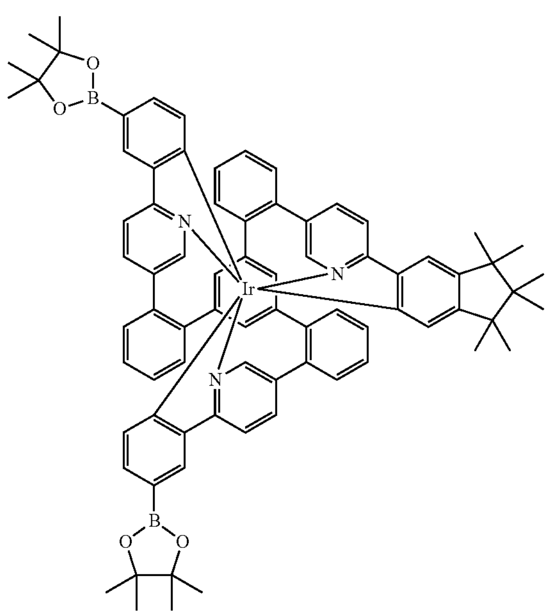<br>Ir(L-39-2Br) | 63% |

-continued
| Ex. | Product<br>Reactant | Yield |
|---|---|---|
| Ir405 | 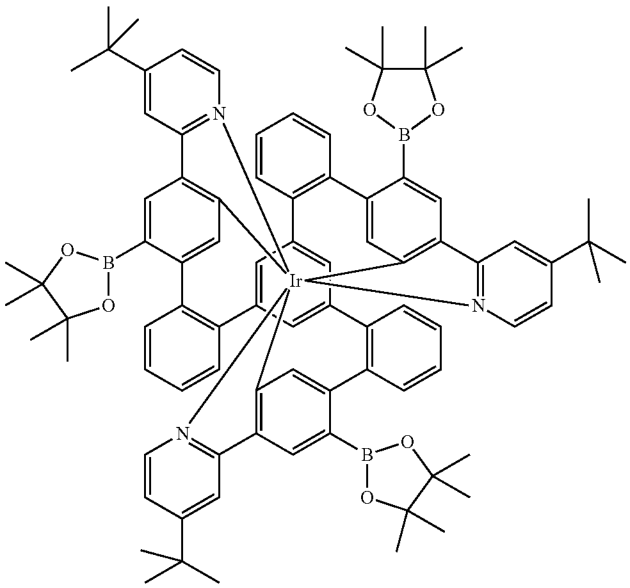<br>Ir(L111-3Br) | 48% |
| Ir406 | 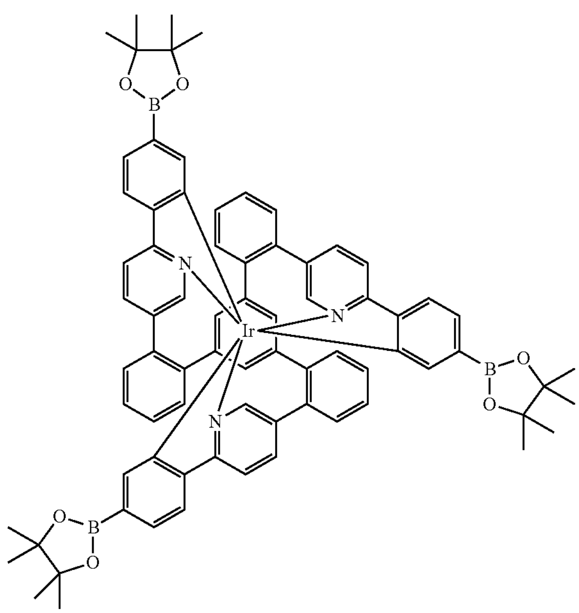<br>Ir(L135)<br>Dioxane/DMSO | 68% |

-continued
| Ex. | Product<br>Reactant | Yield |
|---|---|---|
| Ir407 | 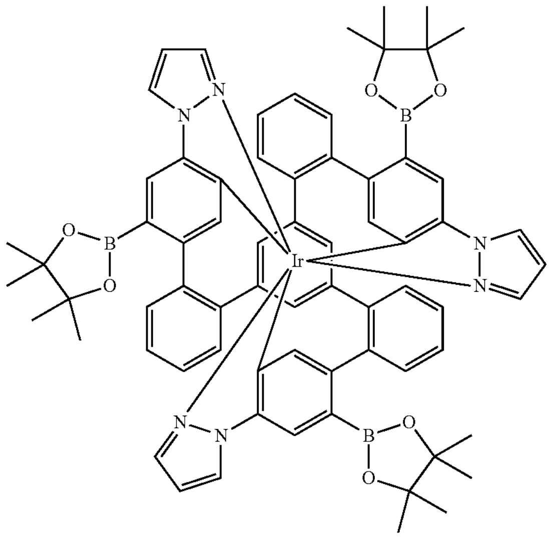<br>Ir(L100-3Br) | 60% |
| Ir408 | 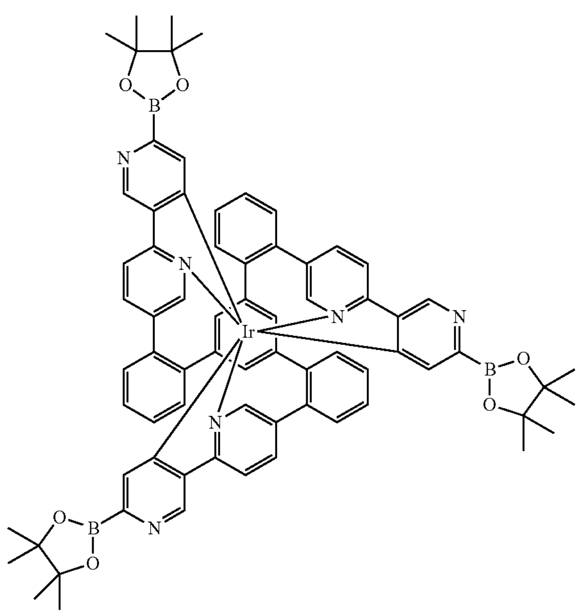<br>Ir(L149)<br>Dioxane/DMSO | 76% |

6) Suzuki Coupling with the Borylated Iridium Complexes

Variant A, Biphasic Reaction Mixture:

To a suspension of 10 mmol of a borylated complex, 12-20 mmol of aryl bromide per $(RO)_2B$ function and 80 mmol of tripotassium phosphate in a mixture of 300 ml of toluene, 100 ml of dioxane and 300 ml of water are added 0.6 mmol of tri-o-tolylphosphine and then 0.1 mmol of palladium(II) acetate, and the mixture is heated under reflux for 16 h. After cooling, 500 ml of water and 200 ml of toluene are added, the aqueous phase is removed, and the organic phase is washed three times with 200 ml of water and once with 200 ml of saturated sodium chloride solution and dried over magnesium sulphate. The mixture is filtered through a Celite bed and washed through with toluene, the toluene is removed almost completely under reduced pressure, 300 ml of methanol are added, and the precipitated crude product is filtered off with suction, washed three times with 50 ml each time of methanol and dried under reduced pressure. The crude product is columned twice on silica gel and/or purified by hot extraction. The metal complex is finally heat-treated or sublimed. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

Variant B, Monophasic Reaction Mixture:

To a suspension of 10 mmol of a borylated complex, 12-20 mmol of aryl bromide per $(RO)_2B$ function and 60-100 mmol of the base (potassium fluoride, tripotassium phosphate (anhydrous or monohydrate or trihydrate), potassium carbonate, caesium carbonate etc.) and 100 g of glass beads (diameter 3 mm) in 100 ml-500 ml of an aprotic solvent (THF, dioxane, xylene, mesitylene, dimethylacetamide, NMP, DMSO, etc.) are added 0.6 mmol of tri-o-tolylphosphine and then 0.1 mmol of palladium(II) acetate, and the mixture is heated under reflux for 1-24 h. Alternatively, it is possible to use other phosphines such as triphenylphosphine, tri-tert-butylphosphine, Sphos, Xphos, RuPhos, XanthPhos, etc., the preferred phosphine: palladium ratio in the case of these phosphines being 3:1 to 1.2:1. The solvent is removed under reduced pressure, the product is taken up in a suitable solvent (toluene, dichloromethane, ethyl acetate, etc.) and purification is effected as described in Variant A.

Synthesis of Ir100:

Variant A:

Use of 13.3 g (10.0 mmol) of Ir400 and 7.4 g (40.0 mmol) of 1-bromo-2,5-dimethylbenzene [553-94-6], 17.7 g (60 mmol) of tripotassium phosphate (anhydrous), 183 mg (0.6 mmol) of tri-o-tolylphosphine [6163-58-2], 23 mg (0.1 mmol) of palladium(II) acetate, 300 ml of toluene, 100 ml of dioxane and 300 ml of water, 100° C., 16 h. Chromatographic separation twice on silica gel with toluene/ethyl acetate (9:1, v/v). Yield: 6.7 g (5.3 mmol), 53%; purity: about 99.9% by HPLC.

In an analogous manner, it is possible to prepare the following compounds:

| Ex. | Reactants/catalyst/variant/base/solvent<br>Product | Yield |
|---|---|---|
| Ir125 | 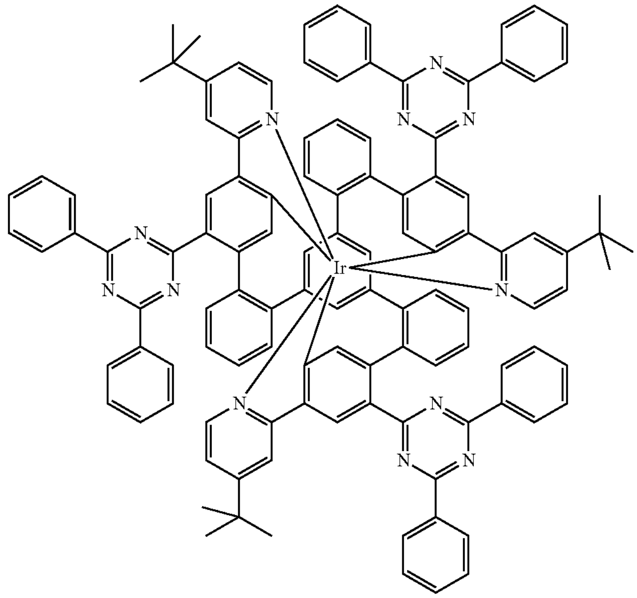<br>Ir405/3842-55-5/A | 39% |

-continued
| Ex. | Reactants/catalyst/variant/base/solvent Product | Yield |
|---|---|---|
| Ir130 | 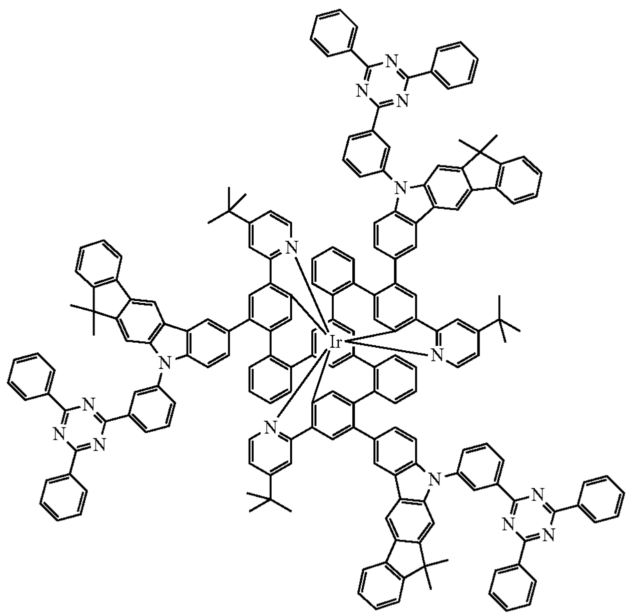 Ir405/1613576-58-1/A | 35% |
| Ir147 | 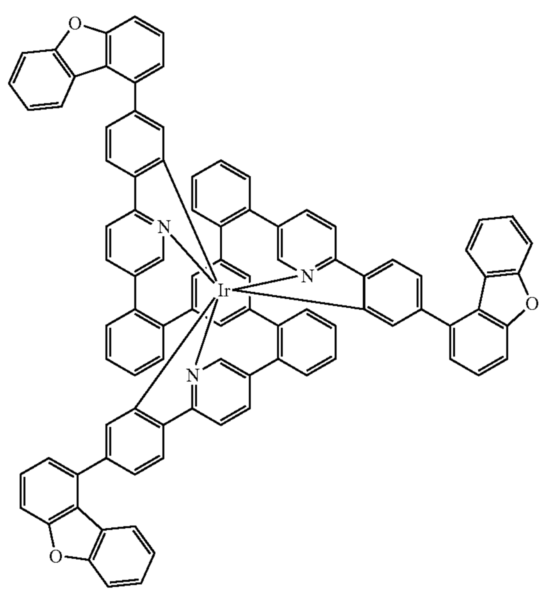 Ir406/50548-45-3/B/S-Phos/Pd(ac)$_2$/ $K_3PO_4$ * $H_2O$/DMSO/100° C./24 h | 58% |

-continued
| Ex. | Reactants/catalyst/variant/base/solvent<br>Product | Yield |
|---|---|---|
| Ir148 | 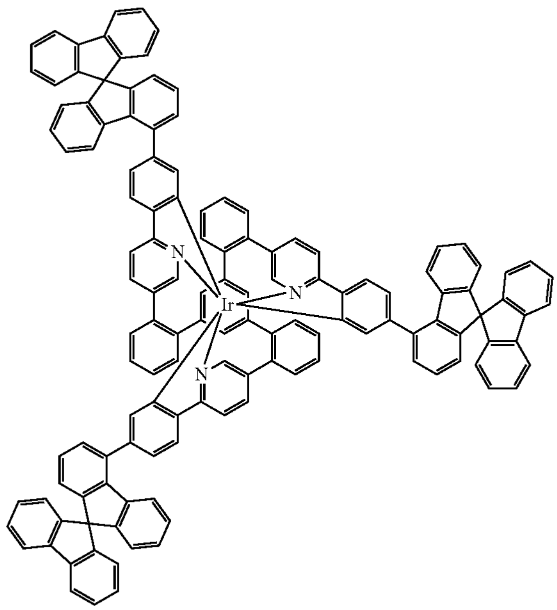<br>Ir406/1161009-88-6/A | 63% |
| Ir149 | 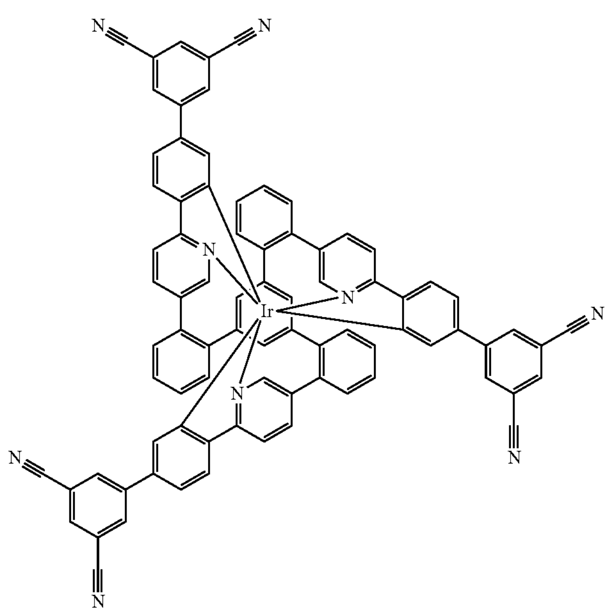<br>Ir406/160892-07-9/A | 72% |

-continued
| Ex. | Reactants/catalyst/variant/base/solvent<br>Product | Yield |
|---|---|---|
| Ir150 | 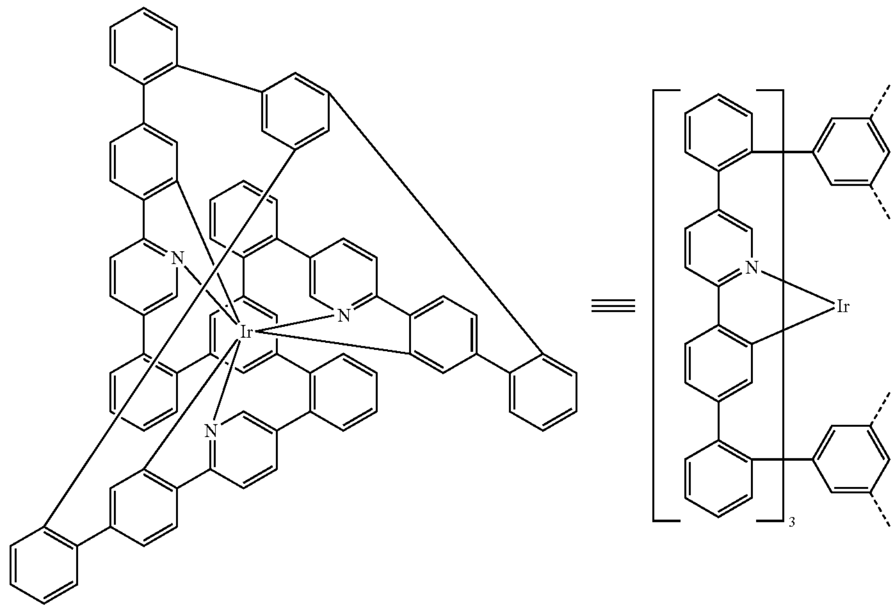<br>Ir406/380626-56-2/A | 33% |
| Ir155 | 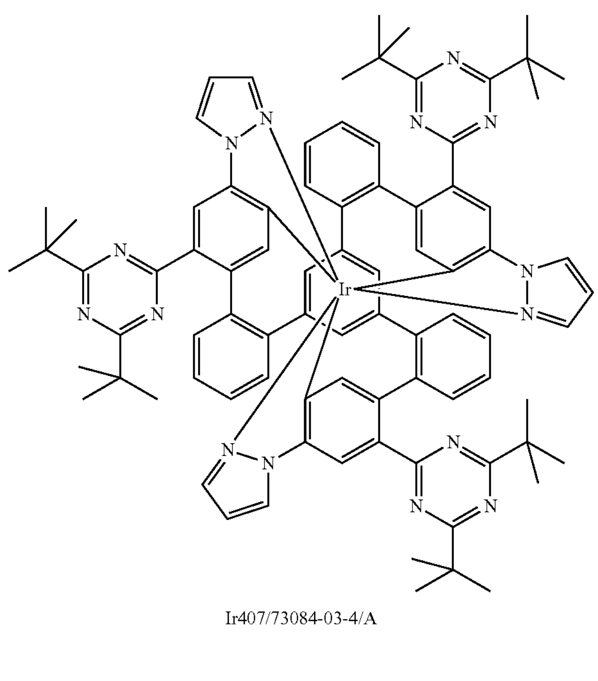<br>Ir407/73084-03-4/A | 58% |

-continued
| Ex. | Reactants/catalyst/variant/base/solvent<br>Product | Yield |
|---|---|---|
| Ir156 | 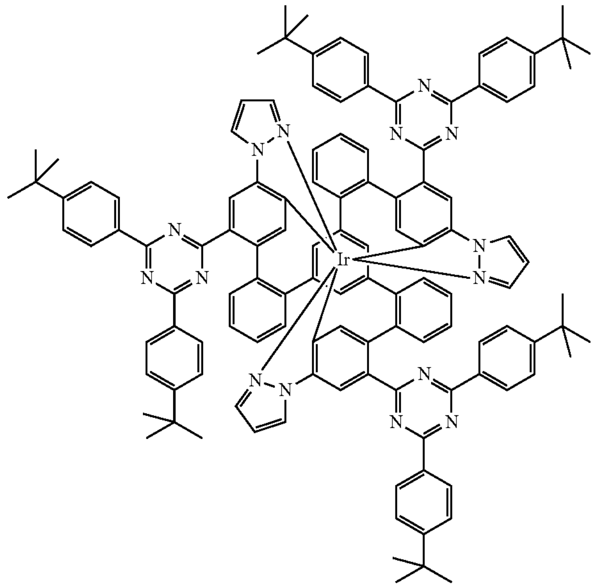<br>Ir407/253158-13-3/B/$K_3PO_4$ x 3 $H_2O$/$PPh_3$:<br>$Pd(ac)_2$ (3:1)/DMSO 100° C. | 55% |
| Ir157 | 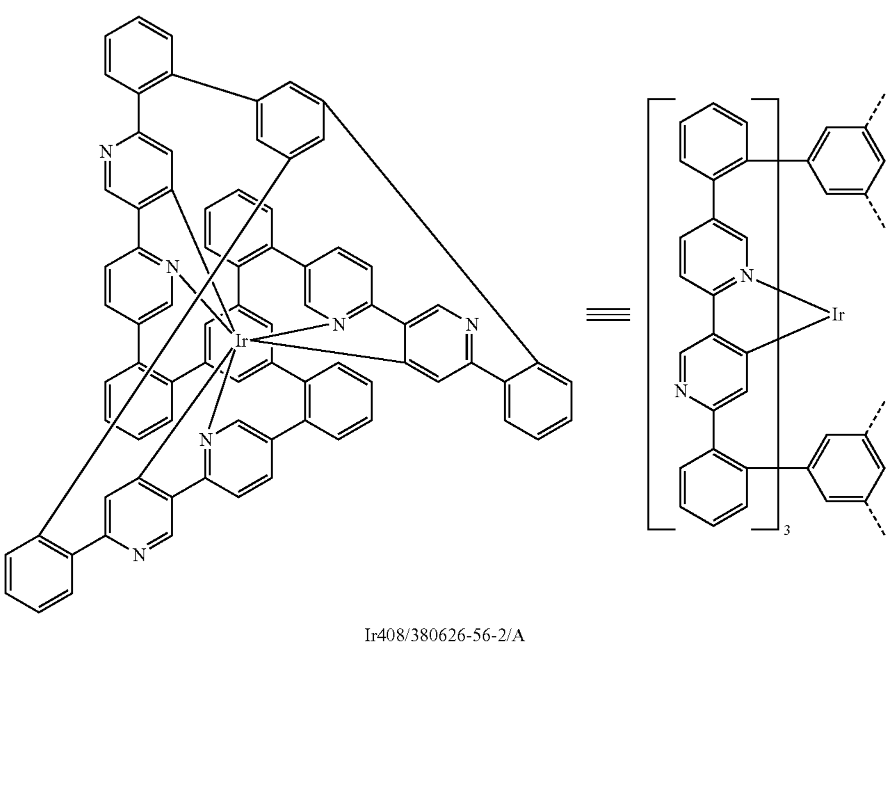<br>Ir408/380626-56-2/A | 21% |

-continued
| Ex. | Reactants/catalyst/variant/base/solvent<br>Product | Yield |
|---|---|---|
| Ir158 | 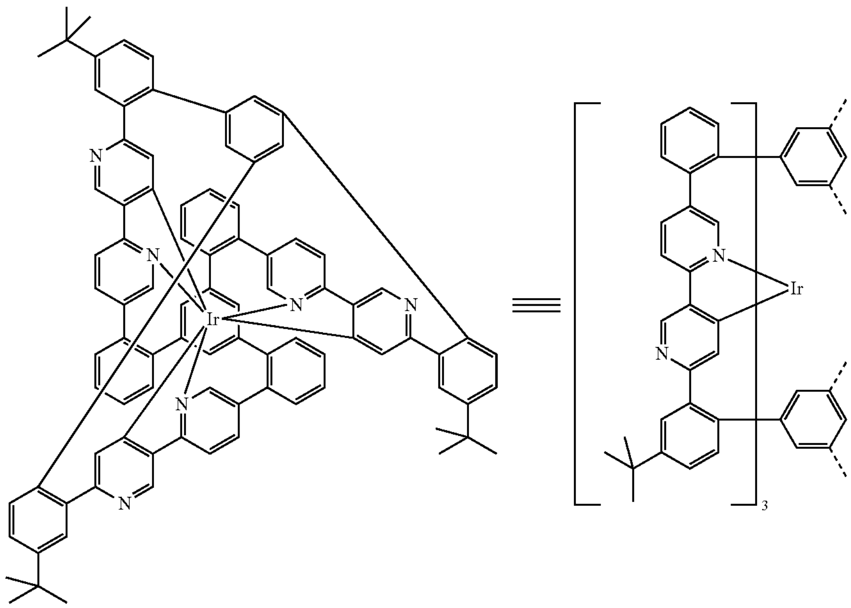<br>Ir408/S46/A | 27% |
| Ir159 | 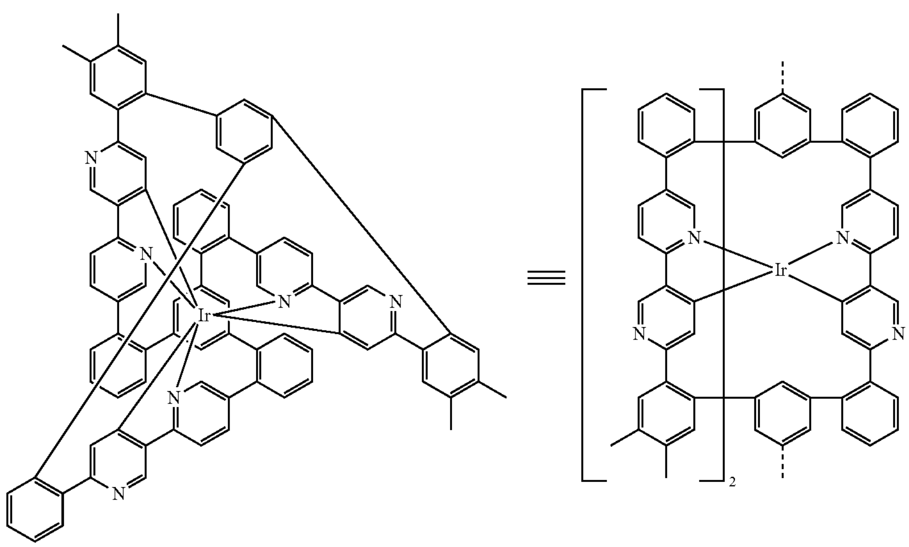<br>Ir408/S665/A | 25% |

-continued

| Ex. | Reactants/catalyst/variant/base/solvent<br>Product | Yield |
|---|---|---|
| Ir160 | 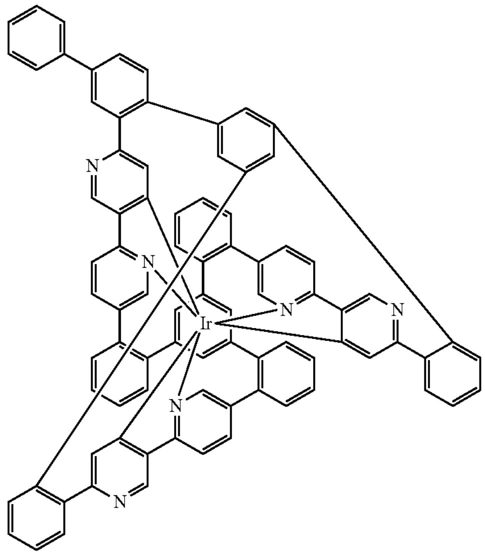 ≡ 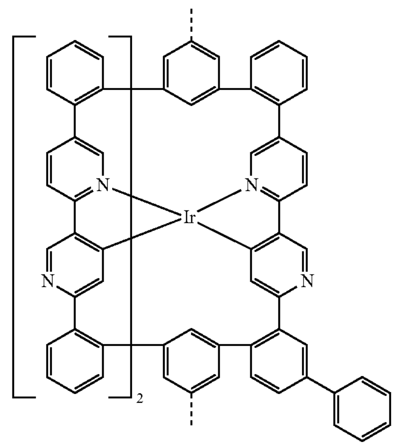<br>Ir408/S666/A | 23% |

7) Alkylation of Iridium Complexes

To a suspension of 10 mmol of the complex in 1500 ml of THF are added 50 ml of a freshly prepared LDA solution, 1 molar in THF, and the mixture is stirred at 25° C. for 24 h. Then 200 mmol of the alkylating agent are added all at once with good stirring, liquid alkylating agents being added without dilution and solid alkylating agents as a solution in THF. The mixture is stirred at room temperature for a further 60 min, the THF is removed under reduced pressure and the residue is chromatographed on silica gel. Further purification can be effected by hot extraction—as described above. The metal complex is finally heat-treated or sublimed. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

Synthesis of Ir700:

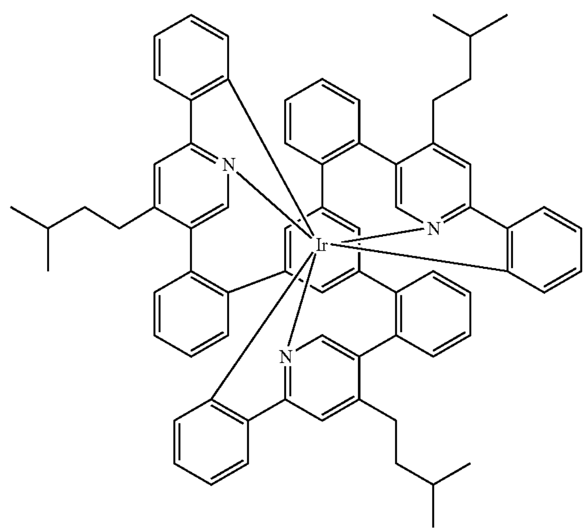

Use of 9.8 g (10.0 mmol) of Ir(L14) and 21.7 ml (200 mmol) of 1-bromo-2-methylpropane [78-77-3]. Chromatographic separation twice on silica gel with toluene, followed by hot extraction five times with acetonitrile. Yield: 2.7 g (2.3 mmol), 23%; purity: about 99.7% by HPLC.

In an analogous manner, it is possible to prepare the following compounds:

| Ex. | Reactant/alkylating agent<br>Product | Yield |
|---|---|---|
| Ir701 | 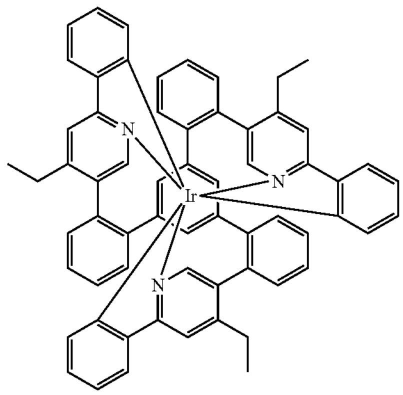<br>Ir(L14)/74-83-9 | 29% |
| Ir702 | 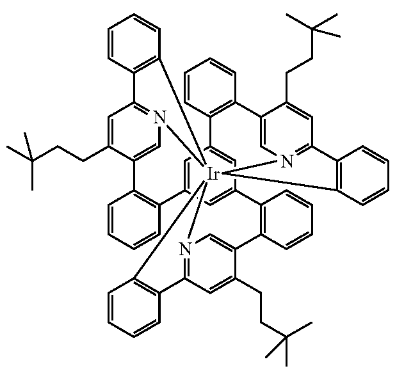<br>Ir(L14)/630-17-1 | 27% |
| Ir703 | 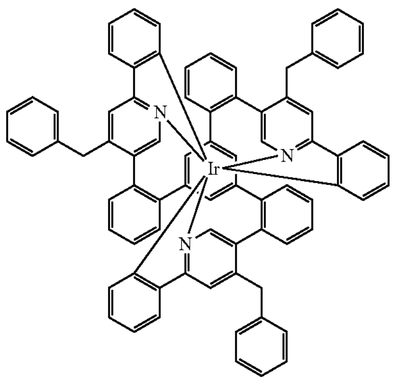<br>Ir(L14)/100-39-0 | 34% |
-continued
| Ex. | Reactant/alkylating agent<br>Product | Yield |
|---|---|---|
| Ir704 | 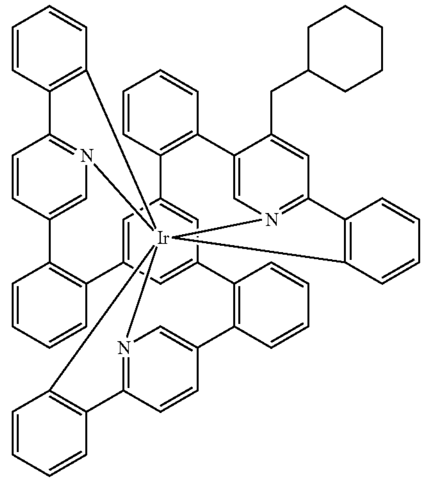<br>Ir(L52)/108-85-0<br>1.6 eq LDA/6.7 eq alkylating agent | 35% |
| Ir705 | 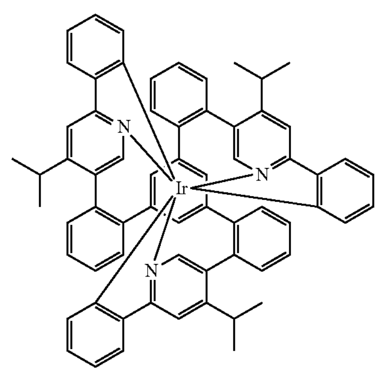<br>Ir701/74-83-9 | 26% |

8) Arylation of Iridium Complexes

Synthesis of Ir(L98):

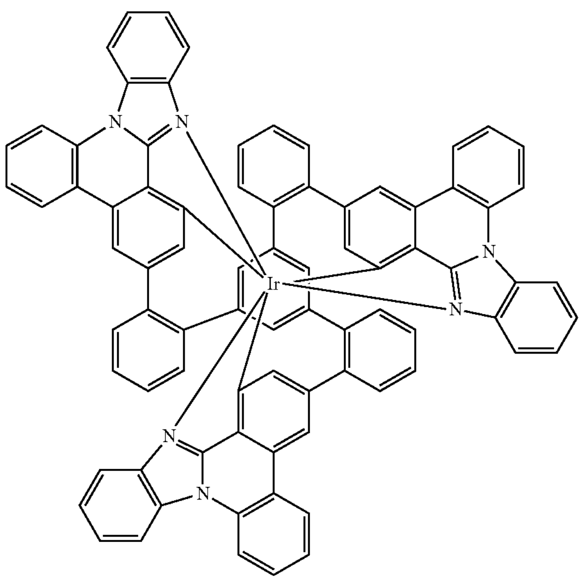

To a mixture of 10.7 g (10 mmol) of Ir(L97), 14.2 g (60 mmol) of o-dibromobenzene [583-53-9] and 39.1 g (120 mmol) of caesium carbonate in 400 ml of dimethylacetamide (DMAC) are added 578.62 mg (1 mmol) of Xanthphos [161265-03-8] and then 1156 mg (1 mmol) of tetrakis (triphenylphosphino)palladium(0) [14221-01-3], and the mixture is stirred under reflux for 60 h. After cooling, 300 ml of DMAC are removed under reduced pressure, the mixture is diluted with 1000 ml of methanol and stirred for 1 h, and the yellow solids are filtered off with suction, washed with 100 ml of methanol and dried under reduced pressure. The yellow solids are extracted by stirring in a hot mixture of 200 ml of water and 100 ml of methanol, filtered off with suction, washed with methanol and dried under reduced pressure. Further purification is effected as described in "C: Synthesis of the metal complexes".

Yield: 6.9 g (5.3 mmol), 53%; purity: about 99.7% by HPLC.

In an analogous manner, it is possible to prepare the following compounds:

| Ex. | Reactant = Ir(L97)/dibromoaromatic/product | Yield |
|---|---|---|
| Ir710 | 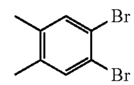 24932-48-7 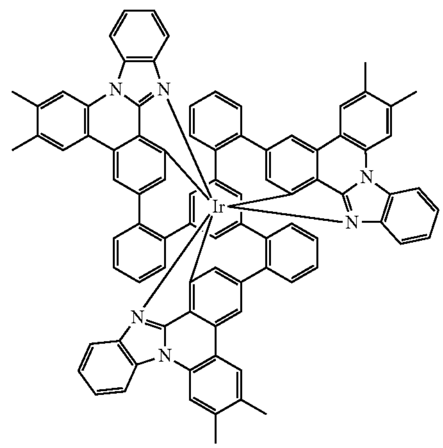 | 59% |
| Ir711 | 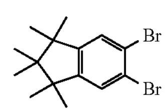 15411011-19-2 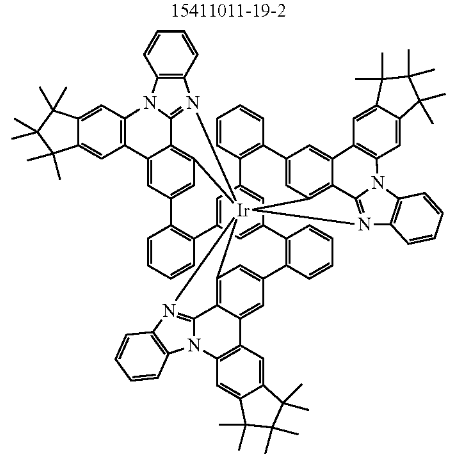 | 53% |

-continued

| Ex. | Reactant = Ir(L97)/dibromoaromatic/product | Yield |
|---|---|---|
| Ir712 | 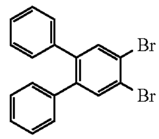 912922-63-5 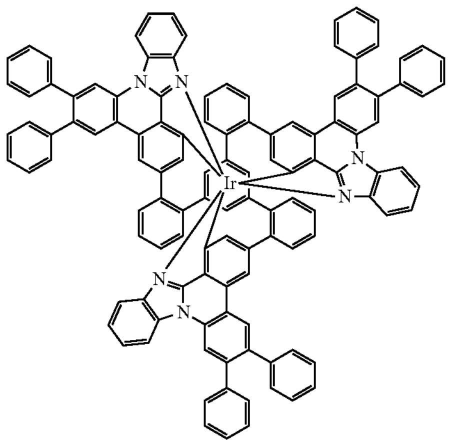 | 46% |

9) Carbonyl-Containing Ir Complexes, Synthesis of Ir720

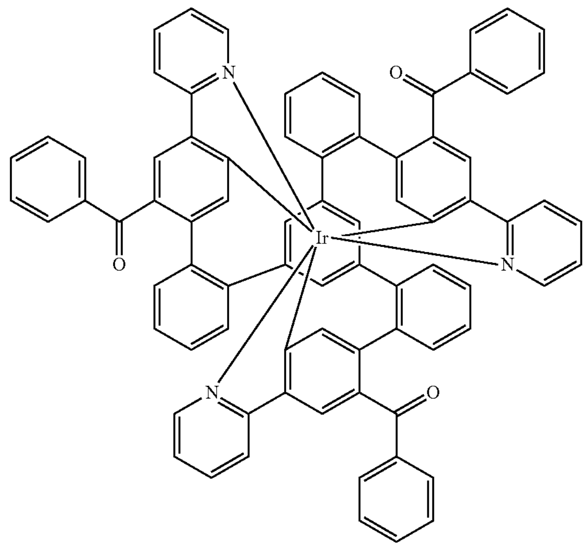

To a suspension of 10.3 g (10 mmol) of Ir304 in 500 ml of THF are added dropwise, at room temperature, 60 ml of a 1 molar phenylmagnesium bromide solution in THF. Subsequently, the reaction mixture is stirred under reflux for another 2 h, then allowed to cool and quenched by dropwise addition of 20 ml of methanol and 20 ml of water. After the solvent has been removed under reduced pressure, the residue is taken up in 300 ml of N,N-dimethylacetamide, 20 ml of aqueous 5 N HCl are added and the mixture is boiled under reflux for 12 h. After the solvent has been removed under reduced pressure, the residue is taken up in 500 ml of toluene, washed three times with 200 ml each time of water, once with 200 ml of saturated sodium carbonate solution and once with 200 ml of saturated sodium chloride solution, and then dried over magnesium sulphate. After the solvent has been removed, further purification is effected by chromatographic separation twice on silica gel with DCM, followed by hot extraction five times with toluene. Yield: 4.8 g (3.8 mmol), 38%; purity: about 99.8% by HPLC.

In an analogous manner, it is possible to prepare the following compounds:
| Ex. | Reactant/Grignard compound/product | Yield |
|---|---|---|
| Ir721 | 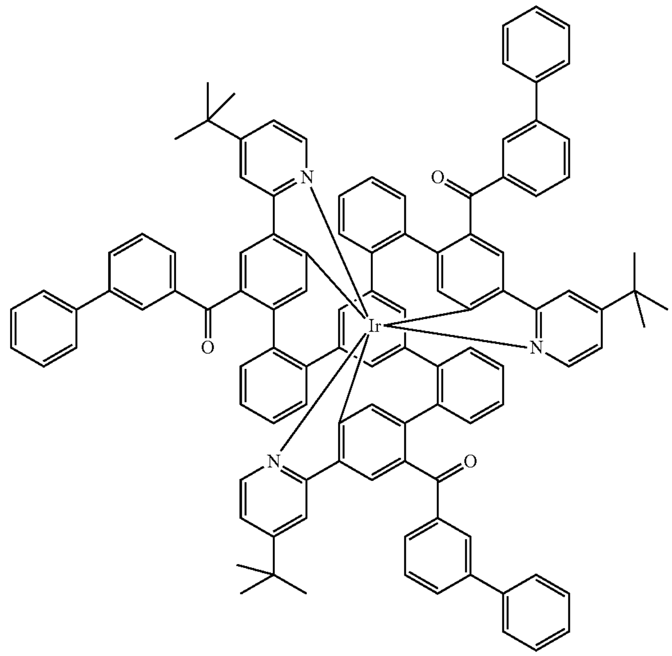 Ir305/103068-18-4 | 43% |
| Ir722 | 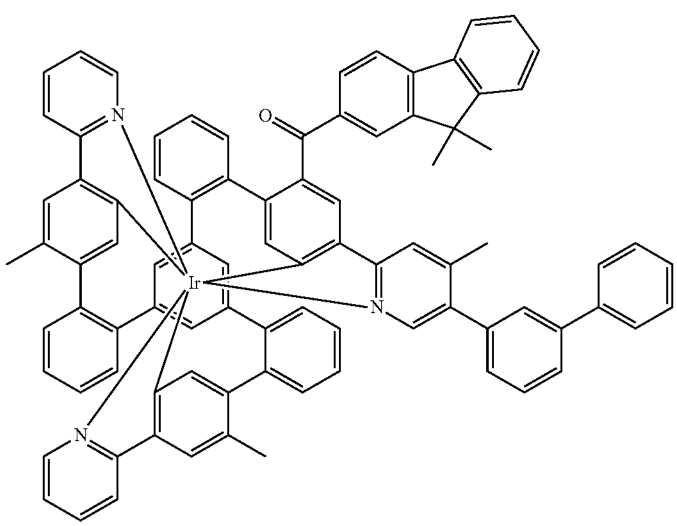 Ir308/20 mmol 1155294-76-0 | 63% |

10) Lactam-Containing Ir Complexes

Synthesis of Ir730:

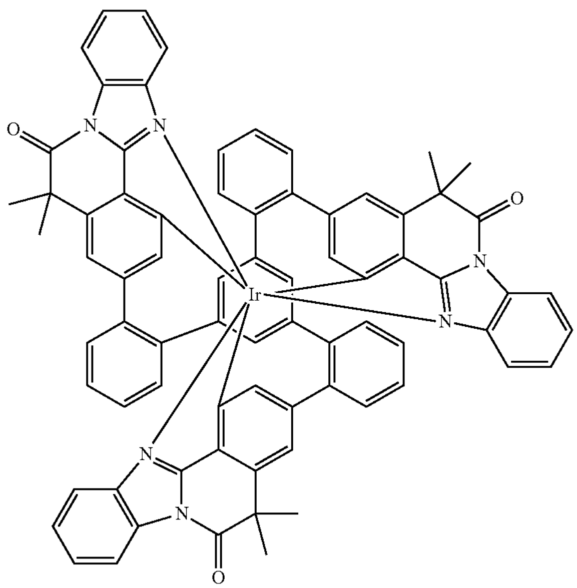

To a solution of 10.7 g (10 mmol) of Ir(L97) in 300 ml of THF are added 1.2 g (50 mmol) of sodium hydride in portions. After stirring at room temperature for 10 minutes, 3.8 ml (40 mmol) of methacryloyl chloride [920-46-7] in 50 ml of THF are added dropwise while cooling with ice. The mixture is allowed to warm up to room temperature and stirred for a further 12 h. After the solvent has been removed under reduced pressure, the residue is taken up in 100 ml of methanol and stirred for a further 30 min, and the precipitated solid is filtered off with suction, washed three times with 50 ml of methanol and dried at 30° C. under reduced pressure. The solids thus obtained are dissolved in 500 ml of DCM, the solution is cooled to 0° C. in an ice/salt bath and then 3.1 ml (40 mmol) of trifluoromethanesulphonic acid [76-05-1] are added dropwise. After stirring at room temperature for 16 h, 50 ml of triethylamine are added dropwise, then the mixture is washed three times with 200 ml each time of water and once with 200 ml of saturated sodium chloride solution and dried over magnesium sulphate, the latter is filtered off using a Celite bed and the filtrate is concentrated to dryness under reduced pressure. The crude product thus obtained is chromatographed with DCM on silica gel and then purified by hot extraction five times with o-xylene. Yield: 5.6 g (4.4 mmol), 44%; purity: about 99.8% by HPLC.

11) Carbonyl-Containing Ir Complexes

Synthesis of Ir740

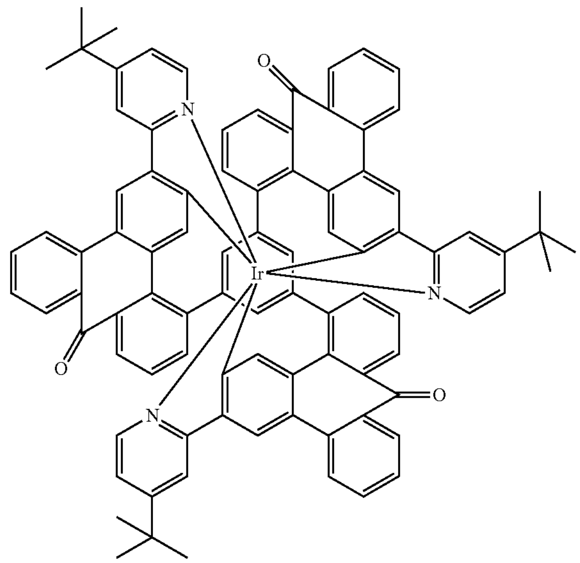

To a solution of 15.3 g (10 mmol) of Ir144 in 1000 ml of mesitylene are added dropwise, at 60° C. with good stirring, 5.3 ml (60 mmol) of trifluoromethanesulphonic acid [1493-13-6] and then the mixture is stirred for 12 h. After cooling, 300 ml of ice-water are added, the mixture is neutralized with saturated sodium hydrogencarbonate solution, and the organic phase is removed and washed twice with 300 ml each time of water and once with 200 ml of saturated sodium chloride solution and dried over magnesium sulphate. The desiccant is filtered off, the filtrate is concentrated to dryness and the residue is chromatographed twice on silica gel (DCM/ethyl acetate, 9:1 v/v). Subsequent purification by hot extraction five times with ethyl acetate. Yield: 3.9 g (2.7 mmol), 27%; purity: about 99.8% by HPLC.

In an analogous manner, it is possible to prepare the following compounds:

| Ex. | Reactant Product | Yield |
|---|---|---|
| Ir741 | 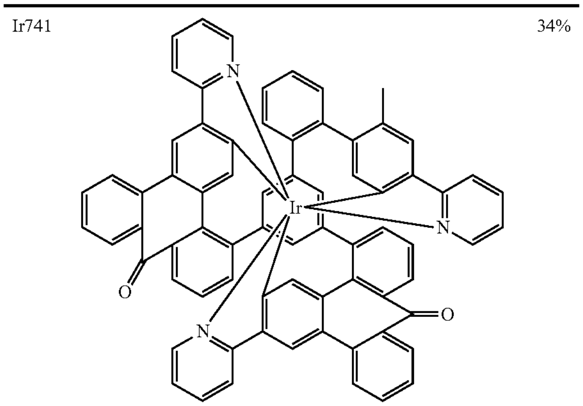 Ir145 | 34% |

12) Alkylation of Ir Complexes with Benzyl Alcohol Function

Synthesis of the Diastereomer Mixture Ir750:

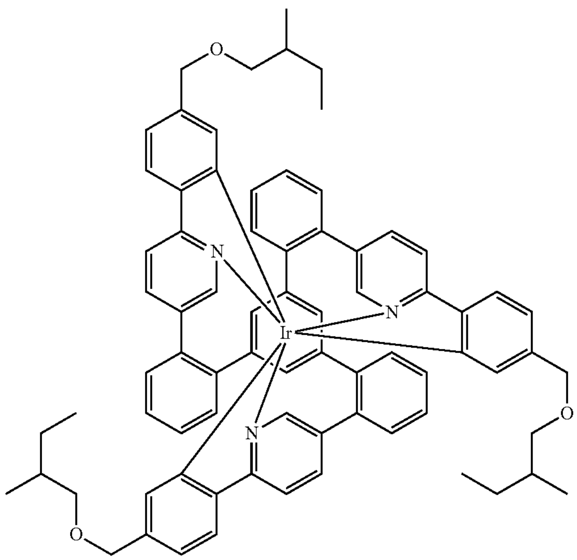

To a suspension of 10.5 g (10 mmol) Ir(L125) in 300 ml of DMF are added, with good stirring, 960 mg (40 mmol) of sodium hydride in portions (caution: evolution of hydrogen). After heating and stirring at 60° C. for 30 min, a mixture of 9.9 g (50 mmol) of (2S)-1-iodo-2-methylbutane [29394-58-9] in 50 ml of DMF is added dropwise and then the mixture is stirred at 80° C. for 16 h. After cooling, all volatile fractions are removed under reduced pressure, and the residue is taken up in 500 ml of DCM, washed three times with 200 ml of water and once with 200 ml of saturated sodium chloride solution and dried over magnesium sulphate. The desiccant is filtered off using a pre-slurried Celite bed, 300 ml of methanol are added to the filtrate and then about 90% of the solvent is distilled off on a rotary evaporator (water bath at 70° C.), the product being obtained as an orange-yellow solid. The solid is filtered off with suction and washed three times with 50 ml each time of methanol and then dried under reduced pressure. Yield: 9.2 g (7.3 mmol) 73% diastereomer mixture.

In an analogous manner, it is possible to prepare the following compounds:

| Ex. | Reactant/product | Yield |
|---|---|---|
| Ir751 | 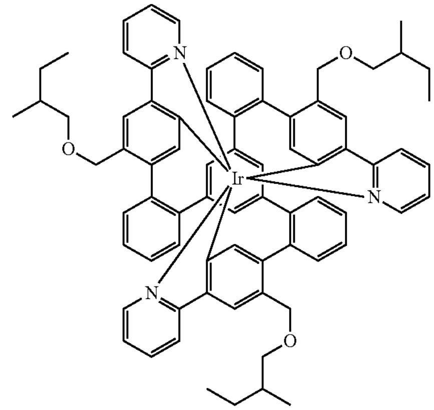 Ir(L126)/diastereomer mixture | 69% |

Separation of the Diastereomers of Ir750:

The diastereomer mixture Ir750 is divided with toluene on silica gel (about 1200 g, column geometry about 10×50 cm) into the two enantiomerically pure diastereomers Ir750-1 (Rf about 0.6, 3.7 g) and Ir750-2 (Rf about 0.4, 4.0 g).

It is possible in an analogous manner to divide the diastereomer mixture of Ir751 into the two enantiomerically pure diastereomers Ir751-1 and Ir751-2.

13) Hydrogenolysis of Ir Complexes with Benzyl Ether Function

Synthesis of the Enantiomers Ir760-1 and Ir760-2

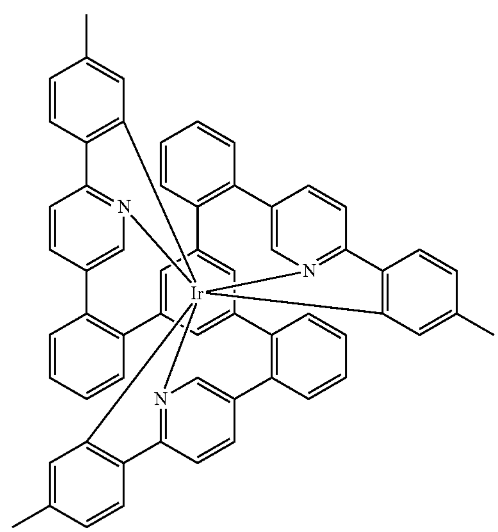

Δ- or Λ enantiomer

To a solution of 3.7 g (2.9 mmol) of Ir750-1 in 50 ml of toluene and 50 ml of methanol are added 2 ml (10 mmol) of polymethylhydrosiloxane [9004-73-3] and 87 mg (0.5 mmol) of palladium(II)chloride [7647-10-1] and the mixture is stirred in an autoclave at 60° C. for 30 h. After cooling, the solvent is removed under reduced pressure and the residue is chromatographed twice with dichloromethane on silica gel. Further purification is effected by hot extraction with acetonitrile/ethyl acetate (2:1, v/v).

Yield of Ir760-1: 2.1 g (2.1 mmol), 72%; purity: about 99.8% by HPLC.

It is possible in an analogous manner to convert Ir750-2.

In an analogous manner, it is possible the following compounds:

| Ex. | Reactant/product | Yield |
|---|---|---|
| Ir761-1<br>Ir761-2 | 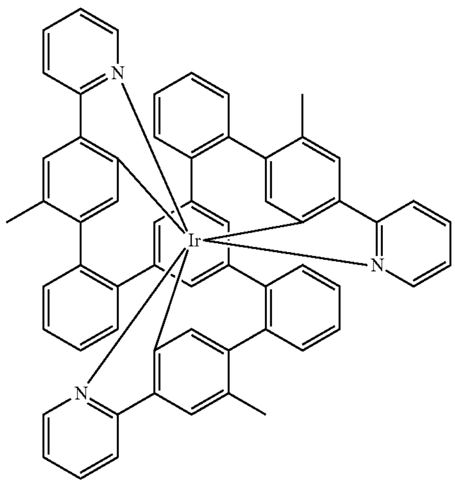<br>Ir751-1 and Ir751-2<br>Δ- or Λ enantiomer | 67%<br>64% |

In general, the pure Δ and Λ enantiomers of a complex, compared to the racemate, have much better solubility in organic solvents (dichloromethane, ethyl acetate, acetone, THF, toluene, anisole, 3-phenoxytoluene, DMSO, DMF, etc.) and sublime at much lower temperatures (typically 30-60° C. lower), for example:

racemate of Ir761, prepared by co-crystallization of equal amounts of Ir761-1 and Ir761-2: solubility in toluene at RT<1 mg/ml, Tsubl.: 390° C./p about $10^{-5}$ mbar.

Ir761-1 or Ir761-2: solubility in toluene at RT about 5 mg/ml, Tsubl.: 350° C./p about $10^{-5}$ mbar.

14) Separation of the Δ and Λ Enantiomers of the Metal Complexes by Means of Chromatography on Chiral Columns The Δ and Λ enantiomers of the complexes can be separated by means of analytical and/or preparative chromatography on chiral columns by standard laboratory methods, for example separation of Ir110 on ChiralPak AZ-H (from Chiral Technologies INC.) with n-hexane/ethanol (90:10), retention times 18.5 min. and 26.0 min.

15) Deuteration of Ir Complexes

Example: Ir(L14-D9)

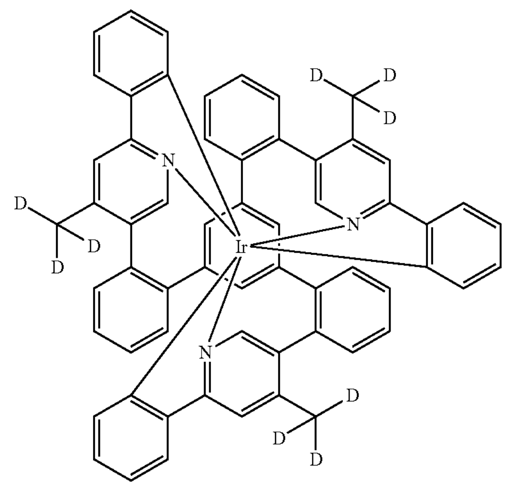

A mixture of 1.0 g (1 mmol) of Ir(L14), 68 mg (1 mmol) of sodium ethoxide, 30 ml of ethanol-D1 and 50 ml of DMSO-D6 is heated in an autoclave to 90° C. for 80 h. After cooling, the solvent is removed under reduced pressure and the residue is chromatographed with DCM on silica gel. Yield: 0.88 g (0.87 mmol), 87%, deuteration level >90%.

In an analogous manner, it is possible the following compounds:

| Ex. | Reactant/product | Yield |
|---|---|---|
| Ir(L52-D3) | 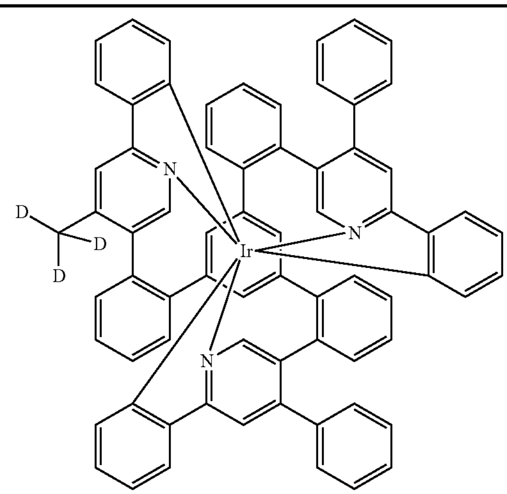<br>Ir(L52) | 90% |

-continued
| Ex. | Reactant/product | Yield |
| --- | --- | --- |
| Ir(L71-D3) | 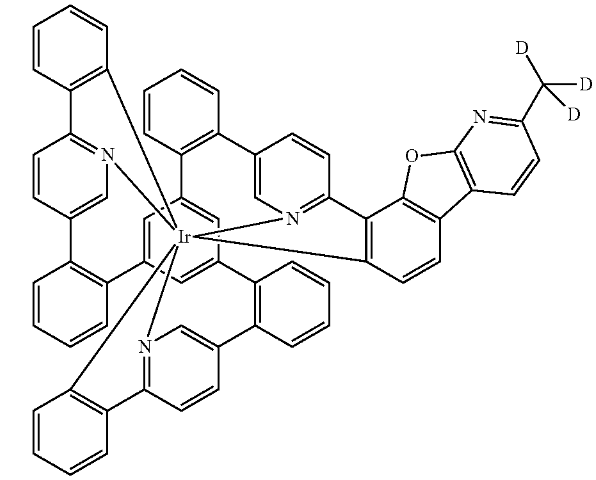 Ir(L71) | 87% |
| Ir(L79-D6) | 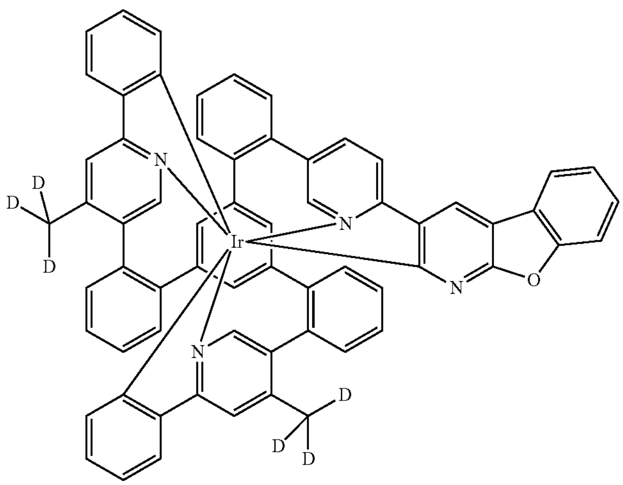 Ir(L79) | 85% |
| Ir(L204-D3) | 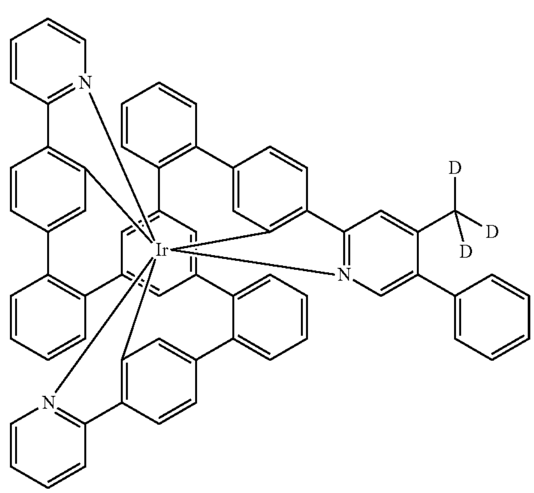 Ir(L204) | 88% |

-continued
| Ex. | Reactant/product | Yield |
|---|---|---|
| Ir(L210-D3) | 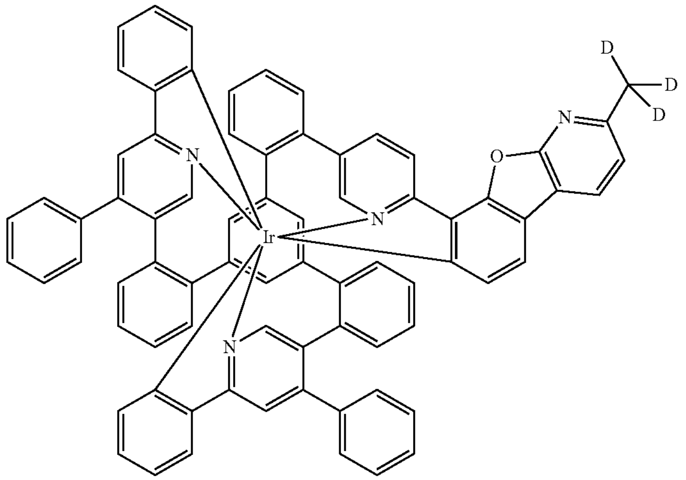<br>Ir(L210) | 89% |
| Ir700-D6 | 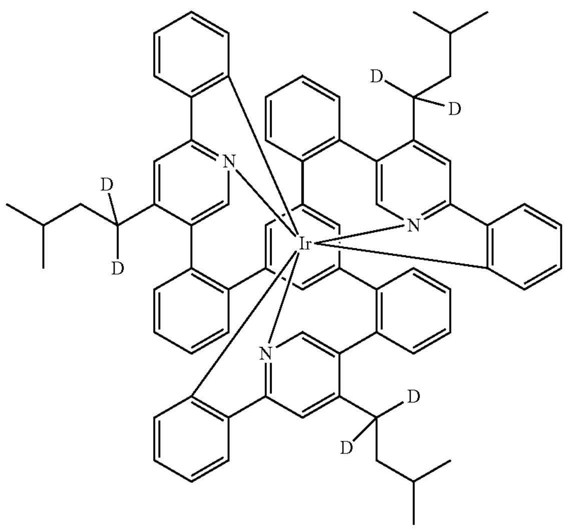<br>Ir700 | 83% |
| Ir701-D6 | 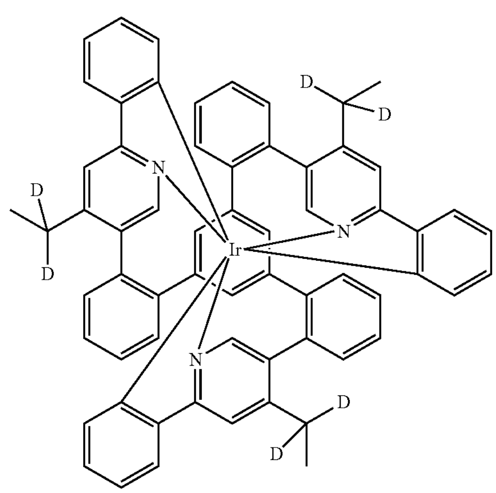<br>Ir701 | 85% |

-continued

| Ex. | Reactant/product | Yield |
|---|---|---|
| Ir705-D3 | 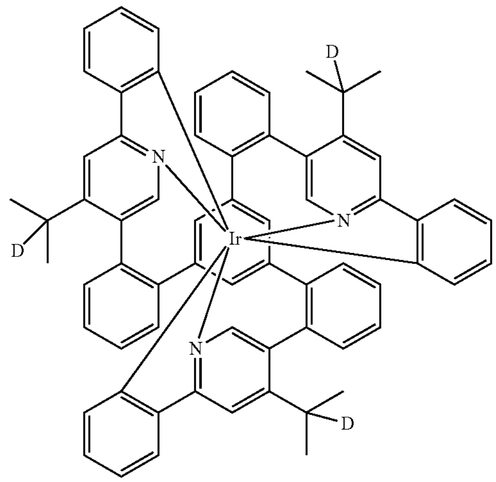 Ir705 | 83% |

16) Cryptates with Two Different Bridging Units

Example Ir800

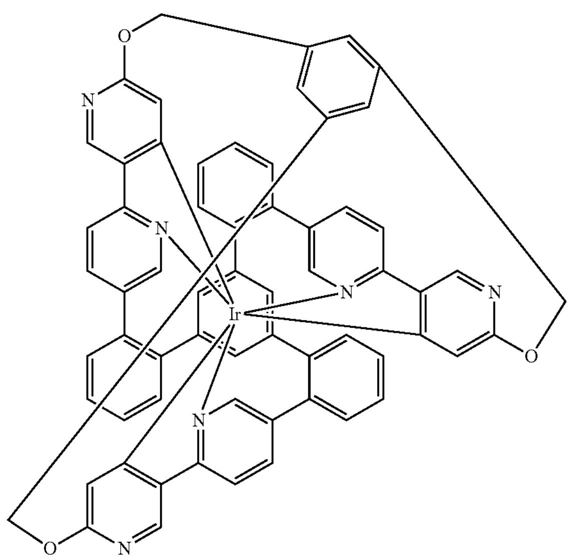

To a suspension of 202 mg (1.2 mmol) of 1,3,5-benzenetrimethanol [4464-18-0] in 50 ml of anhydrous DMSO are added 120 mg (5 mmol) of sodium hydride and the mixture is stirred at 60° C. for 1 h. Then 1058 mg (1 mmol) of Ir(L149) are added and the reaction mixture is stirred at 120° C. for 16 h. After cooling, the DMSO is removed under reduced pressure, the residue is taken up in 200 ml of dichloromethane, and the solution is washed three times with 100 ml each time of water and once with 200 ml of saturated sodium chloride solution and then dried over magnesium sulphate. The desiccant is filtered off, the filtrate is concentrated to dryness and the residue is chromatographed with dichloromethane/ethyl acetate (9:1 v/v) on silica gel. Yield: 179 mg (0.16 mmol), 16%; purity: about 99.8% by HPLC.

In an analogous manner, it is possible to prepare the following compounds:

| Ex. | Reactant/product | Yield |
|---|---|---|
| Ir801 | 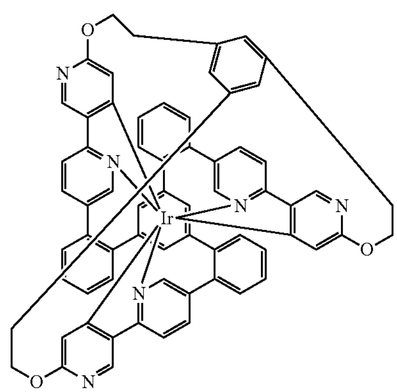 Ir(L149) 18226-43-2 | 37% |
| Ir802 | 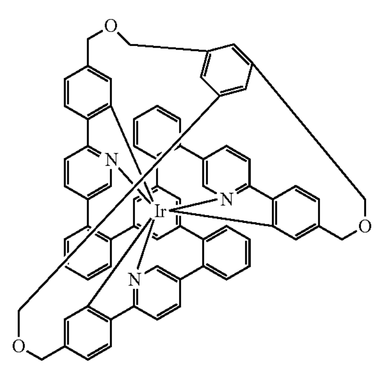 Ir(L125) Deprotonation with NaH in DMSO, then addition of 18226-42-1 | 34% |

17) Polymers Containing the Metal Complexes

General Polymerization Method for the Bromides or Boronic Acid Derivatives as Polymerizable Group, Suzuki Polymerization Variant A—Biphasic Reaction Mixture:

The monomers (bromides and boronic acids or boronic esters, purity by HPLC>99.8%) are dissolved or suspended in the composition specified in the table in a total concentration of about 100 mmol/1 in a mixture of 2 parts by volume of toluene:6 parts by volume of dioxane:1 part by volume of water. Then 2 molar equivalents of tripotassium phosphate are added per Br functionality used, the mixture is stirred for a further 5 min, then 0.03 to 0.003 molar equivalent of tri-ortho-tolylphosphine and then 0.005 to 0.0005 molar equivalent of palladium(II) acetate (ratio of phosphine to Pd preferably 6:1) per Br functionality used are added and the mixture is heated under reflux with very good stirring for 2-3 h. If the viscosity of the mixture rises too significantly, dilution is possible with a mixture of 2 parts by volume of toluene:3 parts by volume of dioxane. After a total reaction time of 4-6 h, for end-capping, 0.05 molar equivalent per boronic acid functionality used of a monobromoaromatic and then, 30 min thereafter, 0.05 molar equivalent per Br functionality used of a monoboronic acid or a monoboronic ester are added and the mixture is boiled for a further 1 h. After cooling, the mixture is diluted with 300 ml of toluene, the aqueous phase is removed, and the organic phase is washed twice with 300 ml each time of water, dried over magnesium sulphate, filtered through a Celite bed in order to remove palladium and then concentrated to dryness. The crude polymer is dissolved in THF (concentration about 10-30 g/l) and the solution is allowed to run gradually into twice the volume of methanol with very good stirring. The polymer is filtered off with suction and washed three times with methanol. The reprecipitation operation is repeated five times, then the polymer is dried under reduced pressure to constant weight at 30-50° C.

Variant B—Monophasic Reaction Mixture:

The monomers (bromides and boronic acids or boronic esters, purity by HPLC>99.8%) are dissolved or suspended in the composition specified in the table in a total concentration of about 100 mmol/1 in a solvent (THF, dioxane, xylene, mesitylene, dimethylacetamide, NMP, DMSO, etc.). Then 3 molar equivalents of base (potassium fluoride, tripotassium phosphate (anhydrous, monohydrate or trihydrate), potassium carbonate, caesium carbonate, etc., each in anhydrous form) per Br functionality and the equivalent weight of glass beads (diameter 3 mm) are added, the mixture is stirred for a further 5 min, then 0.03 to 0.003 molar equivalent of tri-ortho-tolylphosphine and then 0.005 to 0.0005 molar equivalent of palladium(II) acetate (ratio of phosphine to Pd preferably 6:1) per Br functionality are added and the mixture is heated under reflux with very good stirring for 2-3 h. Alternatively, it is possible to use other phosphines such as tri-tert-butylphosphine, Sphos, Xphos, RuPhos, XanthPhos, etc., the preferred phosphine: palladium ratio in the case of these phosphines being 2:1 to 1.3:1. After a total reaction time of 4-12 h, for end-capping, 0.05 molar equivalent of a monobromoaromatic and then, 30 min thereafter, 0.05 molar equivalent of a monoboronic acid or a monoboronic ester are added and the mixture is boiled for a further 1 h. The solvent is substantially removed under reduced pressure, the residue is taken up in toluene and the polymer is purified as described in Variant A.

Monomers M/End-Cappers E:

M1

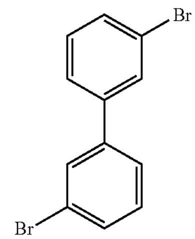

16400-51-4

M2

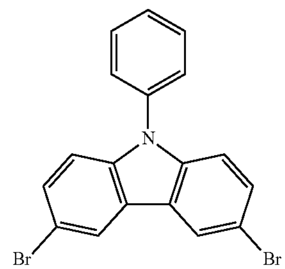

57103-20-5

M3

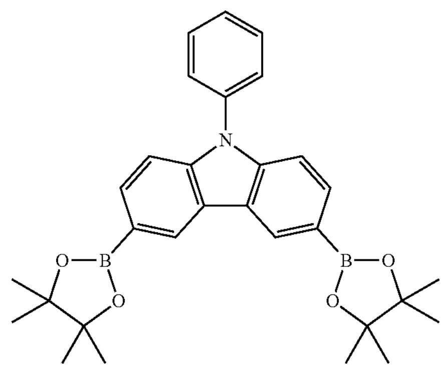

618442-57-2

M4

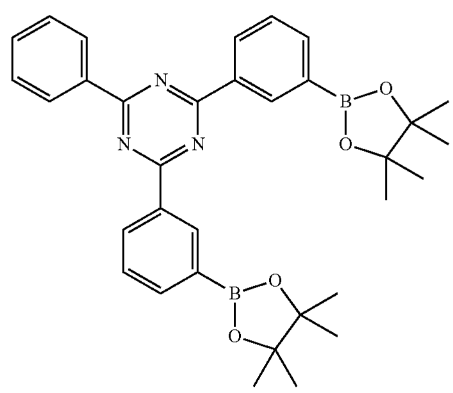

1238752-26-5

-continued

E1

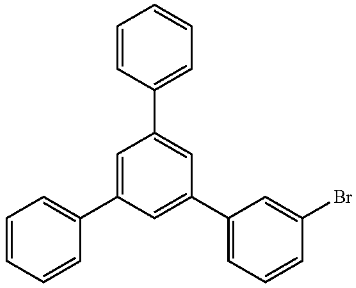

1233200-57-1

E2

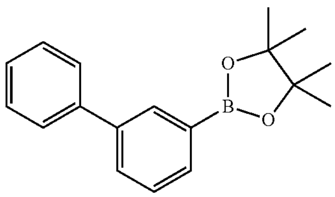

912844-88-3

Polymers:
Composition of the polymers, mmol:

| Polymer | M1 | M2 | M3 | M4 | Ir complex |
|---|---|---|---|---|---|
| P1 | — | 30 | — | 45 | Ir(L14-3Br)/10 |
| P2 | 5 | 25 | — | 40 | Ir(L39-2Br)/10 |
| P3 | 10 | 40 | 25 | 20 | Ir404/5 |

Molecular weights and yield of the polymers of the invention:

| Polymer | Mn [$gmol^{-1}$] | Polydispersity | Yield |
|---|---|---|---|
| P1 | 240 000 | 4.6 | 71% |
| P2 | 250 000 | 2.3 | 57% |
| P3 | 200 000 | 2.2 | 60% |

D: Synthesis of the Synthons—Part 2

Example S1000: 5-Bromo-2-(4-chlorophenyl)pyridine

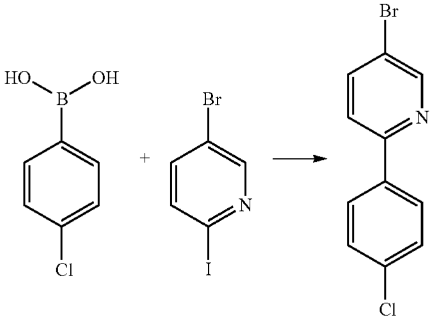 [SMILES: OB(O)c1ccc(Cl)cc1 ; Brc1ccc(I)nc1 ; Clc1ccc(-c2ccc(Br)cn2)cc1]

Into a 4 l four-neck flask with reflux condenser, argon blanketing, precision glass stirrer and internal thermometer are weighed 129.9 g of 4-chlorophenylboronic acid (810 mmol) [1679-18-1], 250.0 g of 5-bromo-2-iodopyridine (250 mmol) [223463-13-6] and 232.7 g of potassium carbonate (1.68 mol), the flask is inertized with argon, and 1500 ml of acetonitrile and 1000 ml of absolute ethanol are added. 100 g of glass beads (diameter 3 mm) are also added thereto and the suspension is homogenized for 5 minutes. Then 5.8 g of bis(triphenylphosphine)palladium(II) chloride (8.3 mmol) [13965-03-2] are added. The reaction mixture is heated to reflux while stirring vigorously overnight. After cooling, the solvent is removed by rotary evaporation and the residue is worked up by extraction with toluene and water in a separating funnel. The organic phase is washed 2× with 500 ml of water and 1× with 300 ml of saturated sodium chloride solution and dried over anhydrous sodium sulphate, and then the solvent is removed under reduced pressure. The precipitated solid is filtered off with suction and washed with ethanol. The yellow solid obtained is recrystallized from 800 ml of acetonitrile at reflux. A beige solid is obtained. Yield: 152.2 g (567.0 mmol), 70%; purity: about 95% by $^{1}$H NMR.

Example S1001: 2-(4-Chlorophenyl)-5-(4,4,5,5-tetramethyl[1,3,2]dioxaborolan-2-yl)pyridine

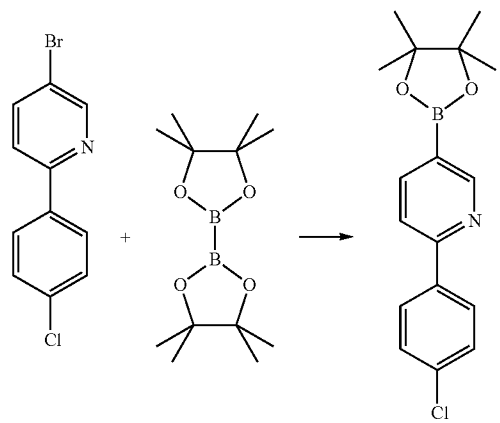

Into a 4 l four-neck flask with reflux condenser, precision glass stirrer, heating bath and argon connection are weighed 162.0 g (600 mmol) of S1000, 158.0 g (622 mmol) of bis(pinacolato)diborane [73183-34-3], 180.1 g (1.83 mol) of potassium acetate [127-08-2] and 8.9 g (12.1 mmol) of trans-dichlorobis(tricyclohexylphosphine)palladium(II) [29934-17-6], and 2200 ml of 1,4-dioxane are added. 100 g of glass beads (diameter 3 mm) are also added and the reaction mixture is inertized with argon and stirred under reflux for 24 hours. After cooling, the solvent is removed under reduced pressure, and the residue obtained is worked up by extraction in a separating funnel with 1000 ml of ethyl acetate and 1500 ml of water. The organic phase is washed 1× with 500 ml of water and 1× with 300 ml of saturated sodium chloride solution, dried over anhydrous sodium sulphate and filtered through a silica gel-packed frit. The silica gel bed is washed through 2× with 500 ml of ethyl acetate and the filtrate obtained is concentrated under reduced pressure. The brown solid obtained is recrystallized from 1000 ml of n-heptane at reflux. A beige solid is obtained. Yield: 150.9 g (478 mmol), 80%; purity: 97% by $^{1}$H NMR.

Example S1002: Synthesis of Symmetric Triazine Units

2-Chloro-4,6-bis(3,5-di-tert-butylphenyl)[1,3,5]triazine

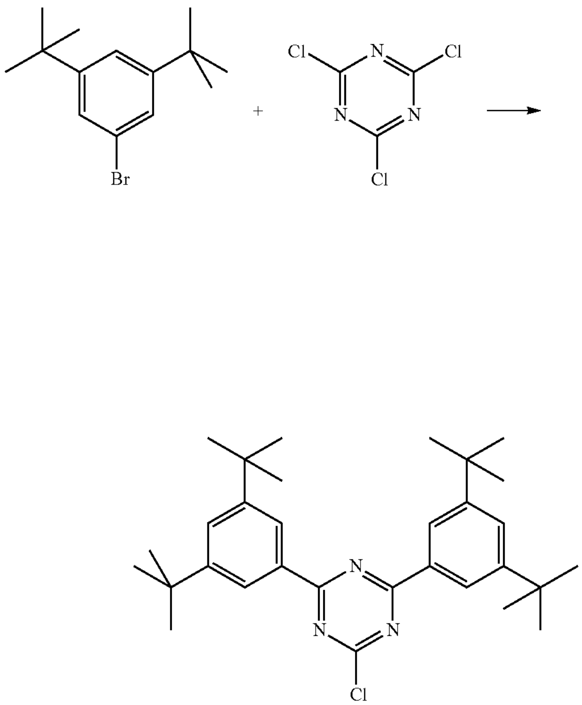

A baked-out flask is initially charged with 5.8 g (239 mmol) of magnesium turnings and a solution of 73.0 g (271 mmol) of bromo-3,5-di-tert-butylbenzene [22385-77-9] in 400 ml of dry THF is slowly added dropwise, such that the reaction solution boils constantly under reflux. On completion of addition, the solution is boiled under reflux for a further two hours, then allowed to cool. A further flask is additionally charged with 20.0 g (108.5 mmol) of cyanuric chloride in 400 ml of dry THF and cooled to 0° C. The Grignard reagent is added dropwise in such a way that an internal temperature of 20° C. is not exceeded. On completion of addition, the reaction mixture is allowed to warm up to room temperature overnight. The reaction is quenched by addition of 500 ml of 1 mol/l HCl solution while cooling with ice. The phases are separated and the aqueous phase is extracted 3 times with ethyl acetate. The organic phases are combined and washed with saturated NaCl solution, then dried over sodium sulphate, and the filtrate is concentrated under reduced pressure. The light brown oil obtained is admixed with methanol and heated to reflux. After cooling, the precipitated colourless solid is filtered off with suction, washed with heptane and dried under reduced pressure. Yield: 23.6 g (48 mmol), 47%; purity: about 97% by $^1$H NMR.

In an analogous manner, it is possible to prepare the following compounds:

| Ex. | Bromine reactant | Product | Yield |
| --- | --- | --- | --- |
| S1003 | 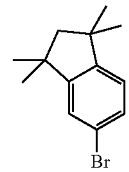 [169695-24-3] | 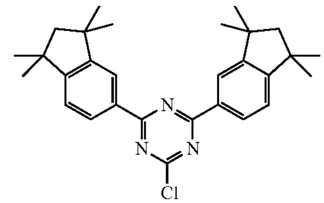 | 60% |
| S1004 | 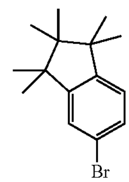 [1562418-80-7] | 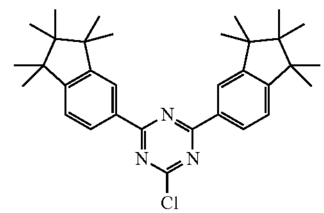 | 57% |

Example S1005 Synthesis of Asymmetric Triazine Units 2-tert-Butyl-4-(4-tert-butylphenyl)-6-chloro[1,3,5]triazine A baked-out flask is initially charged with 3.4 g (140 mmol) of magnesium turnings and a solution of 30.0 g (141 mmol) of 1-bromo-4-tert-butylbenzene [3972-65-4] in 50 ml of dry THF is slowly added dropwise, such that the reaction solution boils constantly under reflux. On completion of addition, the solution is boiled under reflux for a further two hours, then allowed to cool. A further flask is additionally charged with 30.1 g (146 mmol) of 2-tert-butyl-4,6-dichloro[1,3,5]triazine [705-23-7] in 75 ml of dry THF and cooled to 0° C. The Grignard reagent is added dropwise in such a way that an internal temperature of 20° C. is not exceeded. On completion of addition, the reaction mixture is allowed to warm up to room temperature overnight. The reaction is quenched by addition of 200 ml of 1 mol/l HCl solution while cooling with ice. The phases are separated and the aqueous phase is extracted three times with toluene. The organic phases are combined and washed with saturated NaCl solution, then dried over sodium sulphate, and the filtrate is concentrated under reduced pressure. The red-brown oil obtained is used without further purification. Yield: 34 g (112 mmol), 79%; purity: about 90% by $^1$H NMR.

In an analogous manner, it is possible to prepare the following compounds:

| Ex. | Triazine | Bromide | Product | Yield |
|---|---|---|---|---|
| S1006 | 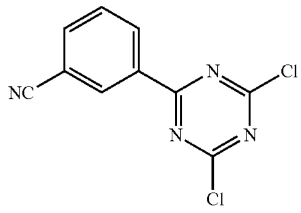 [1207841-72-2] | 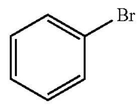 [108-86-1] | 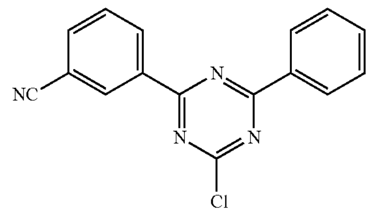 [SMILES: N#Cc1cccc(-c2nc(Cl)nc(-c3ccccc3)n2)c1] | 52% |
| S1007 | 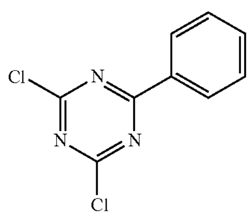 [1700-02-3] | 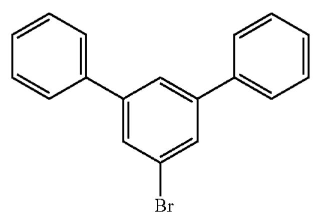 [103068-20-8] | 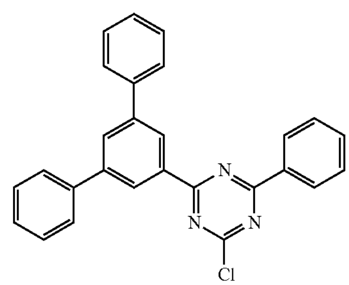 [SMILES: Clc1nc(-c2ccccc2)nc(-c2cc(-c3ccccc3)cc(-c3ccccc3)c2)n1] | 61% |

Example S1008: 5-Bromo-2-(1,1,2,2,3,3-hexamethylindan-5-yl)pyridine

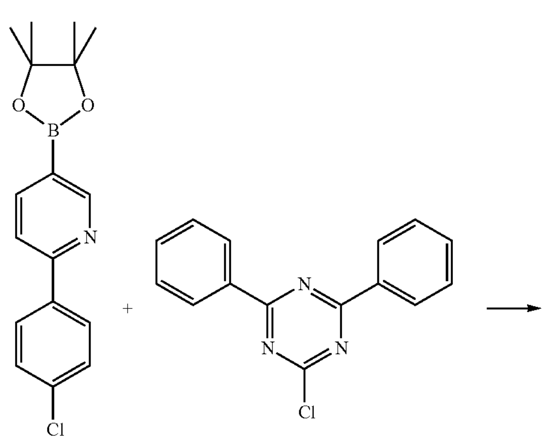

-continued

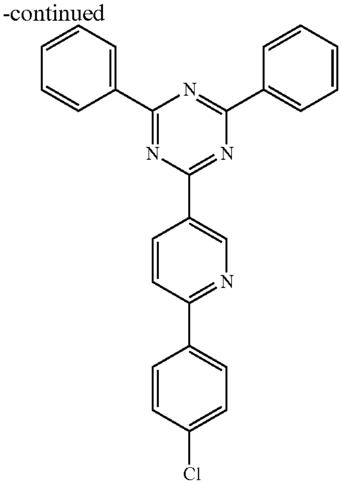

Into a 2 l four-neck flask are weighed 76.5 g (242 mmol) of S1001, 65.6 g (245 mmol) of 2-chloro-4,6-diphenyl-[1,3,5]-triazine [3842-55-5], 2.8 g (2.4 mmol) of tetrakis(triphenylphosphine)palladium(0) and 64.3 g (606 mmol) of sodium carbonate, the mixture is inertized, and 1200 ml of degassed toluene and 200 ml of degassed water are added. The reaction mixture is stirred under reflux for 24 hours. After the reaction has ended, the precipitated solid is filtered off and washed 3× with 50 ml of water, 3× with 50 ml of ethanol and 2× with 20 ml of toluene. The grey solid obtained is used without further purification. Yield: 75.5 g (179 mmol), 74%; purity: 98% by $^{1}$H NMR.

In an analogous manner, it is additionally possible to construct the following ligands:

| Ex. | Chloride | Product | Yield |
| --- | --- | --- | --- |
| S1009 | 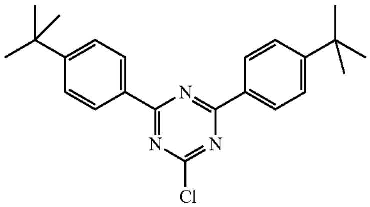 [253158-13-3] | 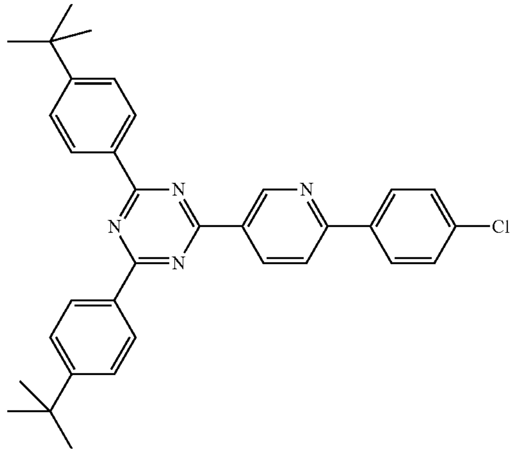 | 60% |
| S1010 | S1002 | 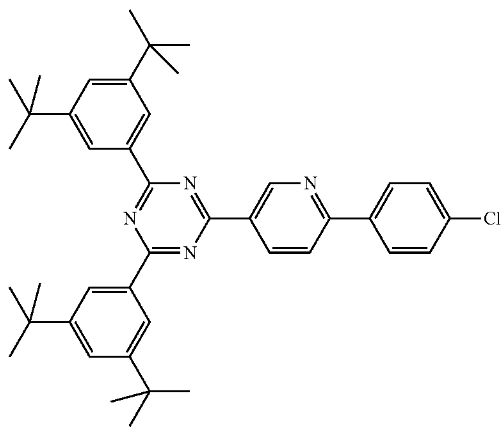 [SMILES: CC(C)(C)c1cc(-c2nc(-c3ccc(-c4ccc(Cl)cc4)nc3)nc(-c3cc(C(C)(C)C)cc(C(C)(C)C)c3)n2)cc(C(C)(C)C)c1] | 58% |
| S1011 | S1005 | 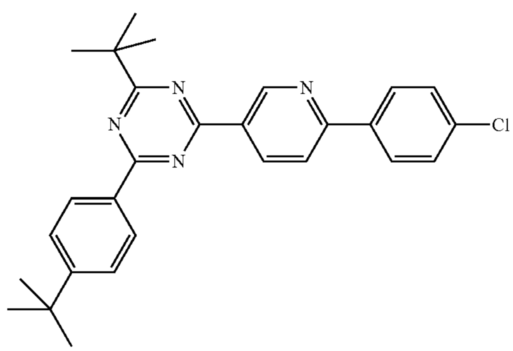 [SMILES: CC(C)(C)c1ccc(-c2nc(-c3ccc(-c4ccc(Cl)cc4)nc3)nc(C(C)(C)C)n2)cc1] | 73% |
| S1012 | 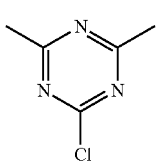 [30894-84-9] | 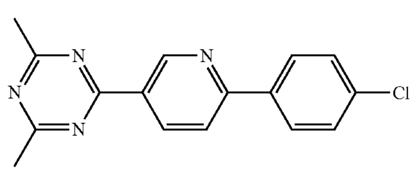 [SMILES: Cc1nc(C)nc(-c2ccc(-c3ccc(Cl)cc3)nc2)n1] | 41% |

-continued
| Ex. | Chloride | Product | Yield |
|---|---|---|---|
| S1013 | 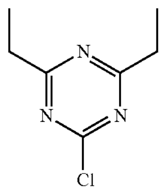 [701-77-9] | 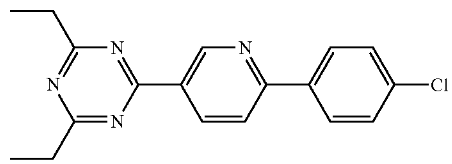 [SMILES: CCc1nc(CC)nc(-c2ccc(-c3ccc(Cl)cc3)nc2)n1] | 50% |
| S1014 | 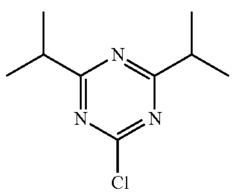 [911798-79-3] | 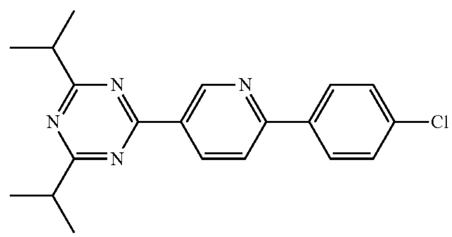 [SMILES: CC(C)c1nc(-c2ccc(-c3ccc(Cl)cc3)nc2)nc(C(C)C)n1] | 56% |
| S1015 | 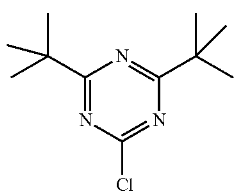 [73084-03-4] | 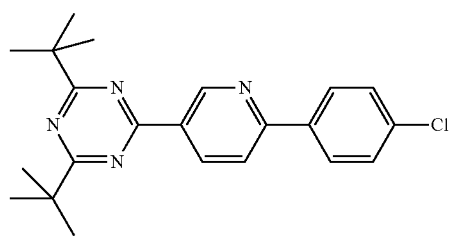 | 66% |
| S1016 | 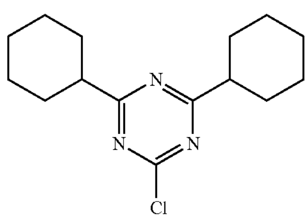 [78941-35-2] | 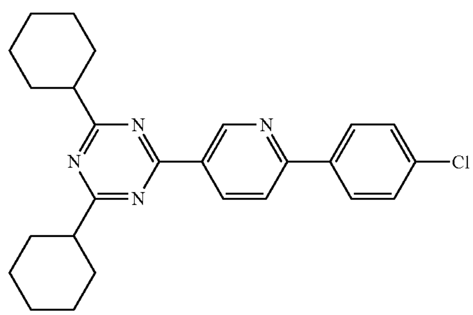 [SMILES: Clc1ccc(-c2ccc(-c3nc(C4CCCCC4)nc(C4CCCCC4)n3)cn2)cc1] | 61% |
| S1017 | 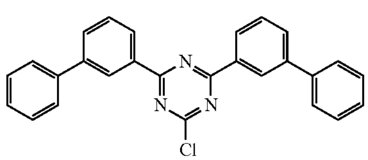 [1205748-61-3] | 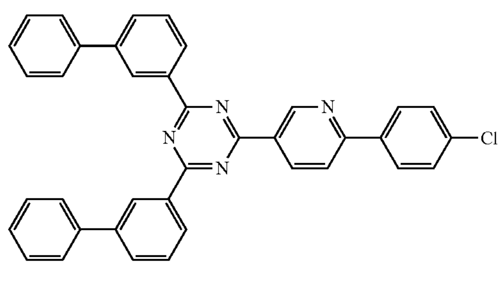 [SMILES: Clc1ccc(-c2ccc(-c3nc(-c4cccc(-c5ccccc5)c4)nc(-c4cccc(-c5ccccc5)c4)n3)cn2)cc1] | 77% |

-continued
| Ex. | Chloride | Product | Yield |
|---|---|---|---|
| S1018 | 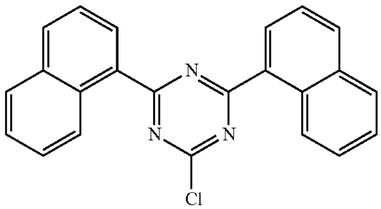 [78941-32-9] | 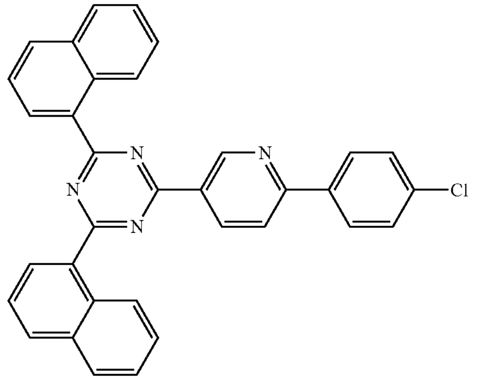 [SMILES: Clc1ccc(-c2ccc(-c3nc(-c4cccc5ccccc45)nc(-c4cccc5ccccc45)n3)cn2)cc1] | 58% |
| S1019 | 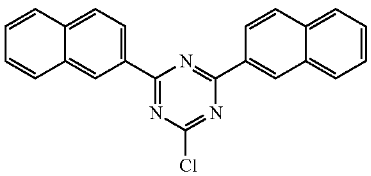 [1247124-77-1] | 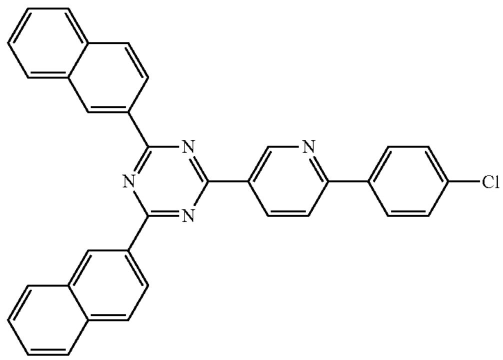 [SMILES: Clc1ccc(-c2ccc(-c3nc(-c4ccc5ccccc5c4)nc(-c4ccc5ccccc5c4)n3)cn2)cc1] | 52% |
| S1020 | 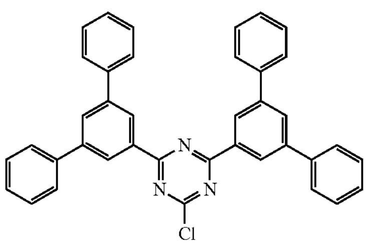 [1205748-51-1] | 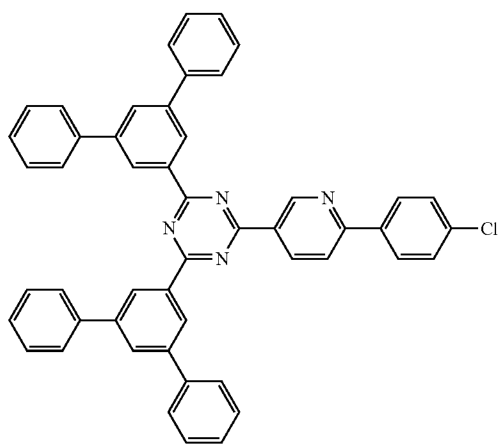 [SMILES: Clc1ccc(-c2ccc(-c3nc(-c4cc(-c5ccccc5)cc(-c5ccccc5)c4)nc(-c4cc(-c5ccccc5)cc(-c5ccccc5)c4)n3)cn2)cc1] | 78% |
| S1021 | 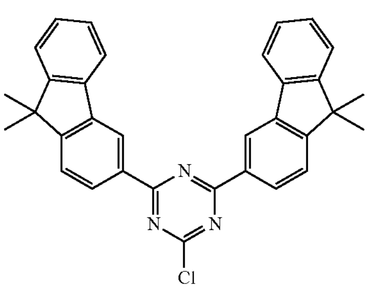 [1646532-00-4] | 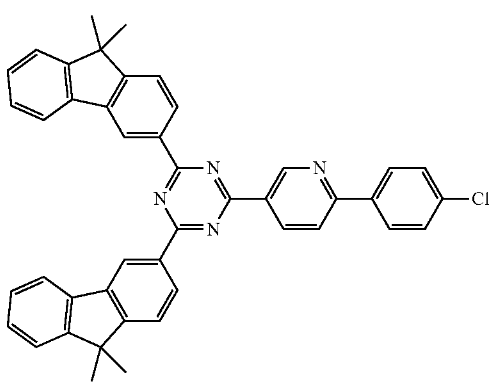 [SMILES: CC1(C)c2ccccc2-c2cc(-c3nc(-c4ccc(-c5ccc(Cl)cc5)nc4)nc(-c4ccc5c(c4)-c4ccccc4C5(C)C)n3)ccc21] | 69% |

-continued
| Ex. | Chloride | Product | Yield |
|---|---|---|---|
| S1022 | 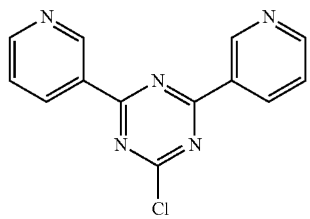 [1418124-08-9] | 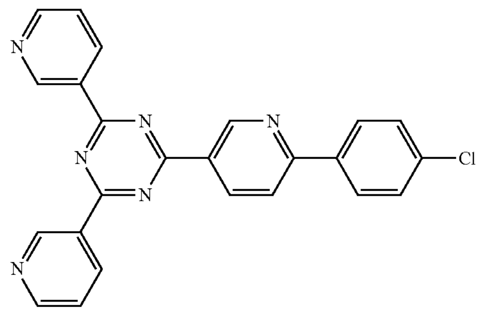 [SMILES: Clc1ccc(-c2ccc(-c3nc(-c4cccnc4)nc(-c4cccnc4)n3)cn2)cc1] | 45% |
| S1023 | 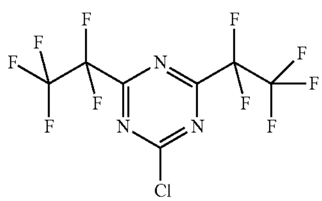 [736-68-5] | 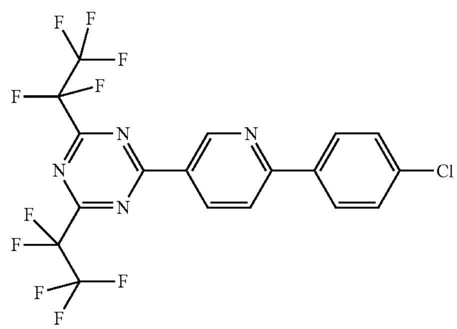 [SMILES: FC(F)(F)C(F)(F)c1nc(-c2ccc(-c3ccc(Cl)cc3)nc2)nc(C(F)(F)C(F)(F)F)n1] | 49% |
| S1024 | 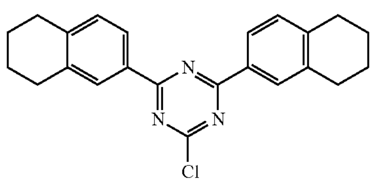 [253133-88-9] | 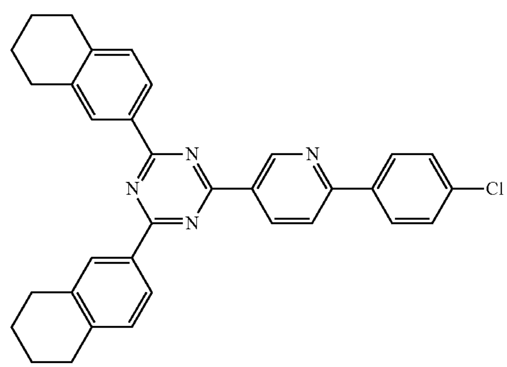 [SMILES: Clc1ccc(-c2ccc(-c3nc(-c4ccc5c(c4)CCCC5)nc(-c4ccc5c(c4)CCCC5)n3)cn2)cc1] | 71% |
| S1025 | S1003 | 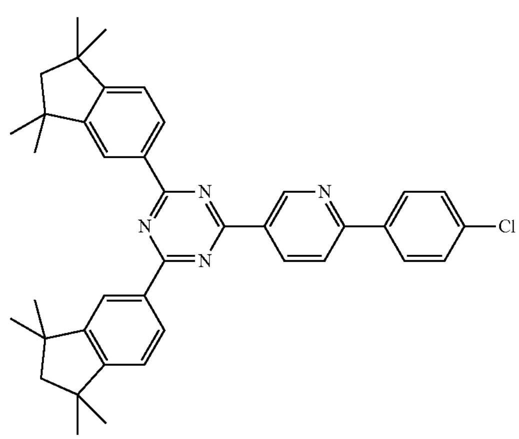 [SMILES: CC1(C)CC(C)(C)c2cc(-c3nc(-c4ccc(-c5ccc(Cl)cc5)nc4)nc(-c4ccc5c(c4)C(C)(C)CC5(C)C)n3)ccc21] | 77% |

-continued
| Ex. | Chloride | Product | Yield |
| --- | --- | --- | --- |
| S1026 | S1004 | 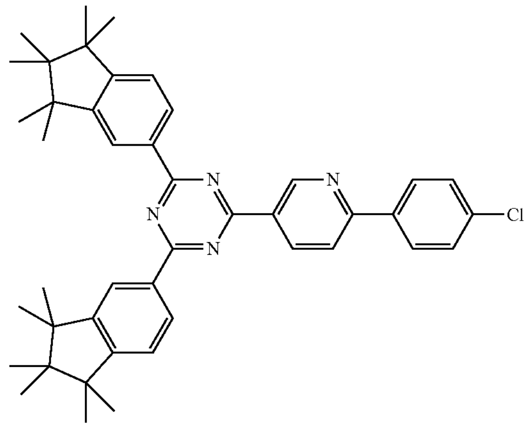 [SMILES: CC1(C)c2ccc(-c3nc(-c4ccc(-c5ccc(Cl)cc5)nc4)nc(-c4ccc5c(c4)C(C)(C)C(C)(C)C5(C)C)n3)cc2C(C)(C)C1(C)C] | 75% |
| S1027 | 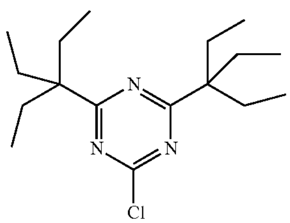 [1092838-17-9] | 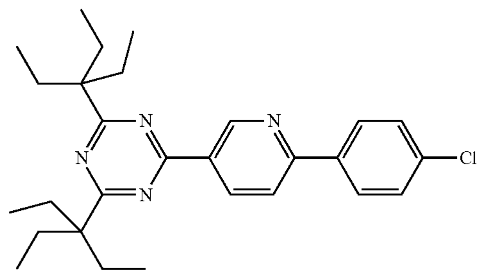 [SMILES: CCC(CC)(CC)c1nc(-c2ccc(-c3ccc(Cl)cc3)nc2)nc(C(CC)(CC)CC)n1] | 68% |
| S1028 | S1006 | 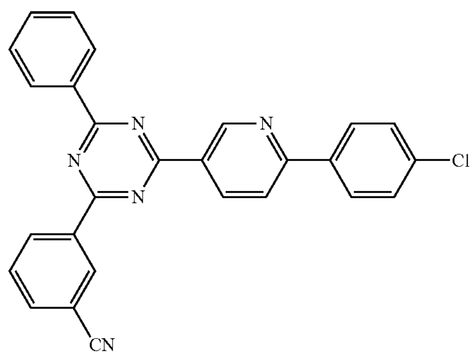 [SMILES: N#Cc1cccc(-c2nc(-c3ccccc3)nc(-c3ccc(-c4ccc(Cl)cc4)nc3)n2)c1] | 59% |
| S1029 | S1007 | 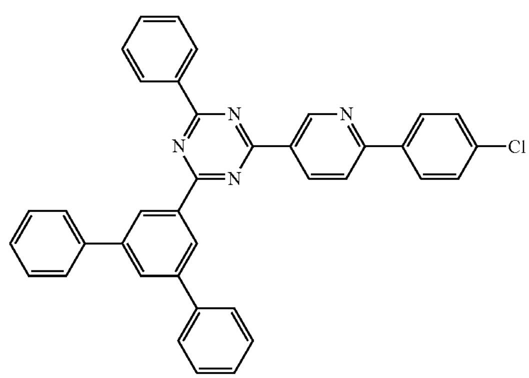 [SMILES: Clc1ccc(-c2ccc(-c3nc(-c4ccccc4)nc(-c4cc(-c5ccccc5)cc(-c5ccccc5)c4)n3)cn2)cc1] | 74% |

-continued
| Ex. | Chloride | Product | Yield |
|---|---|---|---|
| S1030 | 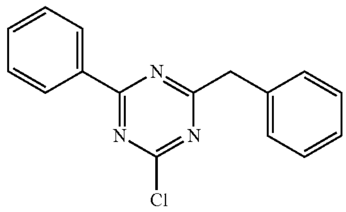 [80984-77-6] | 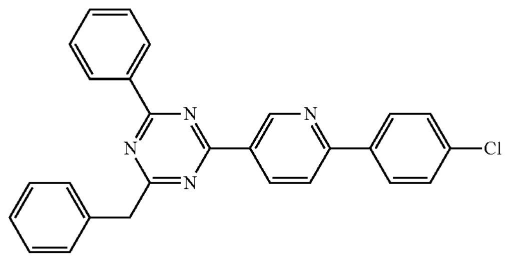 [SMILES: Clc1ccc(-c2ccc(-c3nc(Cc4ccccc4)nc(-c4ccccc4)n3)cn2)cc1] | 60% |
| S1031 | 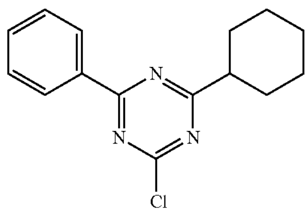 [1426435-09-7] | 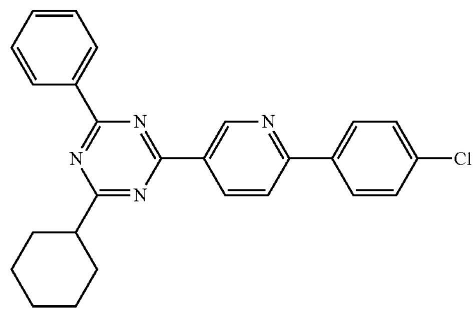 [SMILES: Clc1ccc(-c2ccc(-c3nc(-c4ccccc4)nc(C4CCCCC4)n3)cn2)cc1] | 61% |
| S1032 | 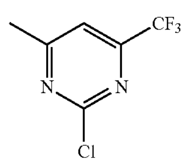 [241164-09-0] | 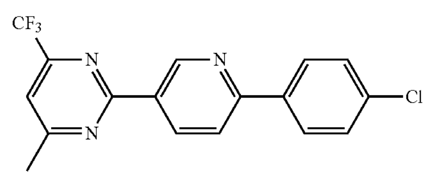 [SMILES: Cc1cc(C(F)(F)F)nc(-c2ccc(-c3ccc(Cl)cc3)nc2)n1] | 31% |
| S1034 | 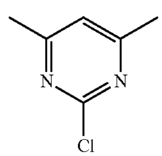 [4472-44-0] | 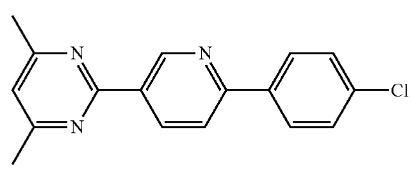 [SMILES: Cc1cc(C)nc(-c2ccc(-c3ccc(Cl)cc3)nc2)n1] | 41% |
| S1035 | 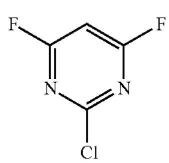 [38953-30-9] | 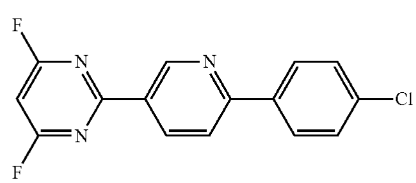 [SMILES: Fc1cc(F)nc(-c2ccc(-c3ccc(Cl)cc3)nc2)n1] | 35% |
| S1036 | 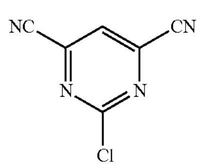 [29872-58-0] | 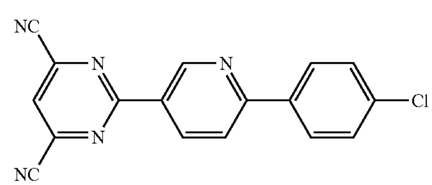 [SMILES: N#Cc1cc(C#N)nc(-c2ccc(-c3ccc(Cl)cc3)nc2)n1] | 41% |
| S1036 | 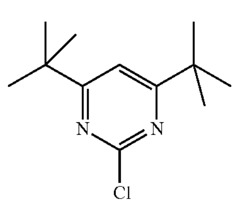 [71162-19-1] | 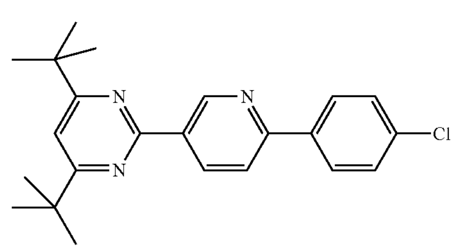 [SMILES: CC(C)(C)c1cc(C(C)(C)C)nc(-c2ccc(-c3ccc(Cl)cc3)nc2)n1] | 72% |

-continued
| Ex. | Chloride | Product | Yield |
|---|---|---|---|
| S1037 | 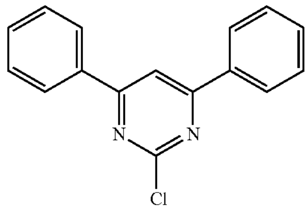 [2915-16-4] | 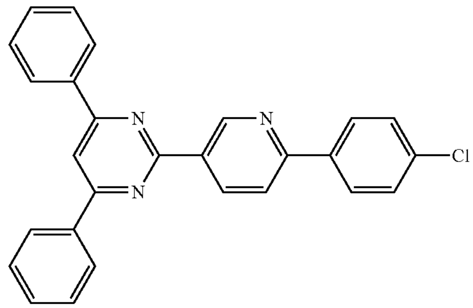 [SMILES: Clc1ccc(-c2ccc(-c3nc(-c4ccccc4)cc(-c4ccccc4)n3)cn2)cc1] | 81% |
| S1038 | 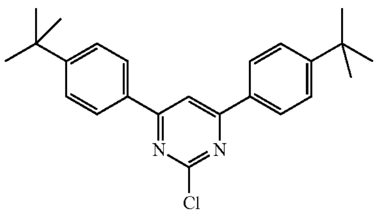 [1035556-77-4] | 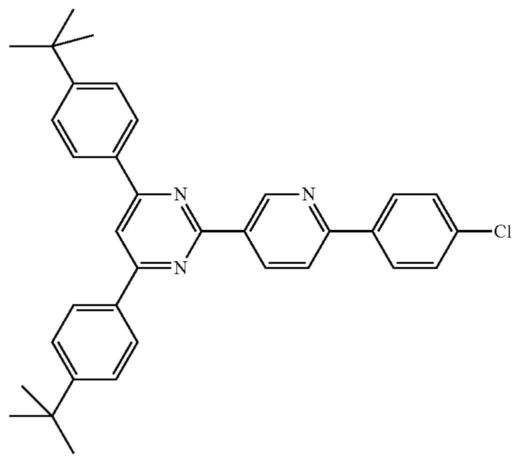 [SMILES: CC(C)(C)c1ccc(-c2cc(-c3ccc(C(C)(C)C)cc3)nc(-c3ccc(-c4ccc(Cl)cc4)nc3)n2)cc1] | 79% |
| S1039 | 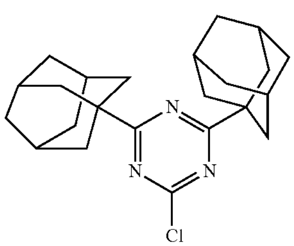 [1092838-15-7] | 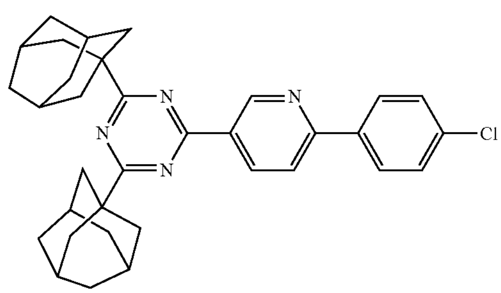 [SMILES: Clc1ccc(-c2ccc(-c3nc(C45CC6CC(CC(C6)C4)C5)nc(C45CC6CC(CC(C6)C4)C5)n3)cn2)cc1] | 70% |
| S1040 | 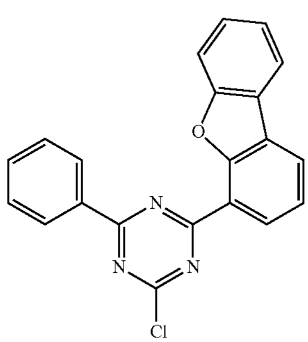 [1472729-25-1] | 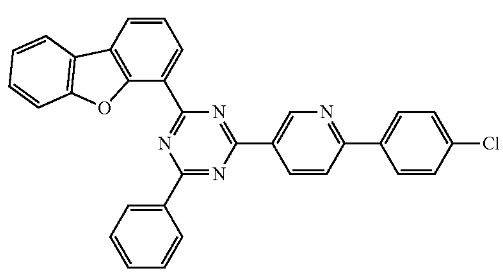 [SMILES: Clc1ccc(-c2ccc(-c3nc(-c4ccccc4)nc(-c4cccc5c4oc4ccccc45)n3)cn2)cc1] | 80% |

-continued

| Ex. | Chloride | Product | Yield |
|---|---|---|---|
| S1041 | 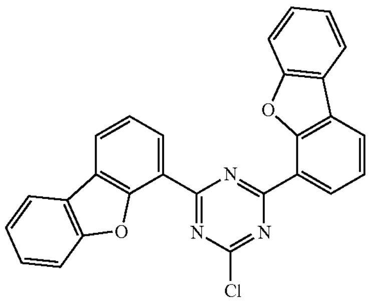 [1699739-83-7] | 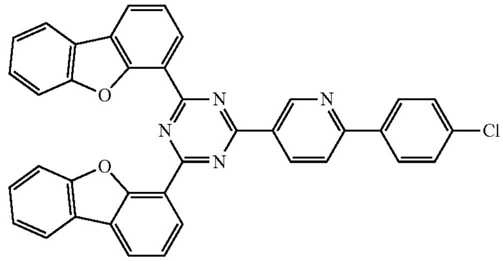 [SMILES: Clc1ccc(-c2ccc(-c3nc(-c4cccc5c4oc4ccccc45)nc(-c4cccc5c4oc4ccccc45)n3)cn2)cc1] | 85% |
| S1042 | 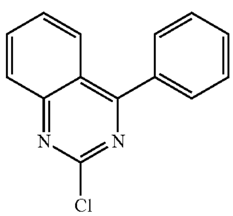 [29874-83-7] | 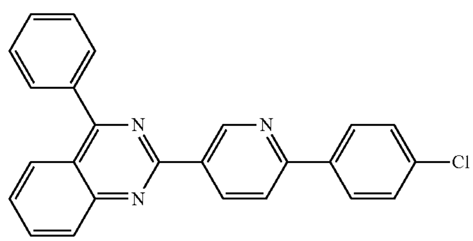 [SMILES: Clc1ccc(-c2ccc(-c3nc(-c4ccccc4)c4ccccc4n3)cn2)cc1] | 60% |

Example S1100: 2,4-Diphenyl-6-{6-[4-(4,4,5,5-tetramethyl-[1,3,2]dioxaborolan-2-yl)phenyl]pyridin-3-yl}[1,3,5]triazine

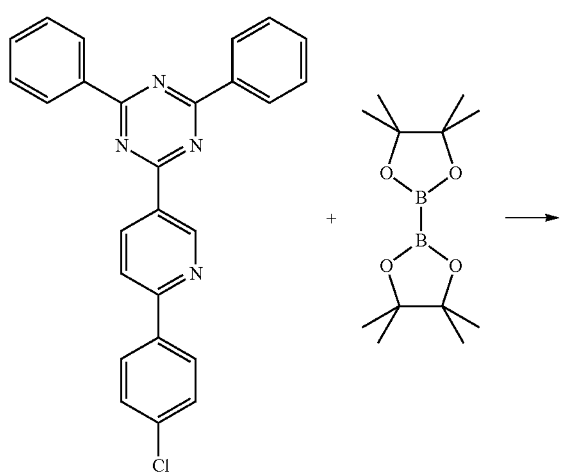

-continued

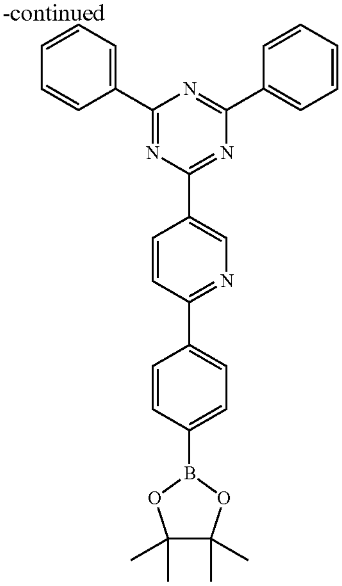

Into a 2 l four-neck flask with reflux condenser, precision glass stirrer, heating bath and argon connection are weighed 99.5 g (236.4 mmol) of S1000, 61.6 g (243 mmol) of bis(pinacolato)diborane [73183-34-3], 69.6 g (709 mmol) of potassium acetate [127-08-2], 1.9 g (4.7 mmol) of 2-dicyclohexylphosphino-2',6'-dimethoxybiphenyl [657408-07-6] and 800 mg (3.6 mmol) of palladium(II) acetate [3375-31-

3], the mixture is inertized and 1000 ml of degassed 1,4-dioxane are added. 100 g of glass beads (diameter 3 mm) are also added, then the reaction mixture is stirred under reflux for 24 hours. After cooling, the solvent is removed under reduced pressure, and the residue obtained is extracted by stirring with a hot mixture of 1000 ml of ethanol and 500 ml of water. The grey solid obtained is filtered off with suction and washed 3× with 100 ml of ethanol, and dried in a vacuum drying cabinet at 70° C. and 30 mbar. Further purification is effected by continuous hot extraction three times (extractant, amount initially charged in each case about 300 ml, extraction thimble: standard Soxhlet thimbles made from cellulose from Whatman) with 1,4-dioxane. A pale yellow solid is obtained. Yield: 90.8 g (177 mmol), 75%; purity: 99% by $^{1}$H NMR.

In an analogous manner, it is possible to prepare the following compounds:

| Ex. | Chloride/ synthon | Extractant | Product | Yield |
| --- | --- | --- | --- | --- |
| S1101 | S1009 | cyclohexane | 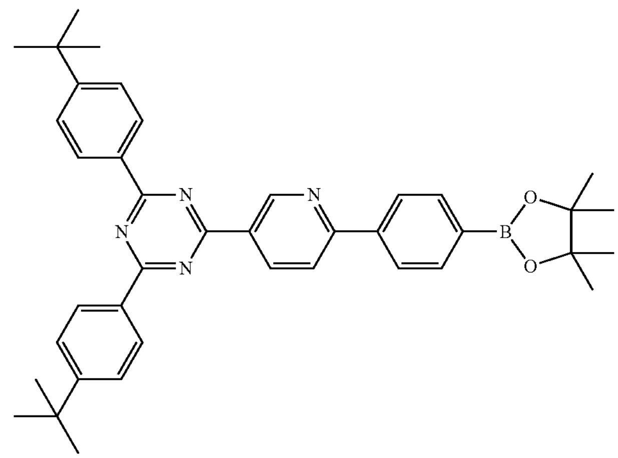 [SMILES: CC(C)(C)c1ccc(-c2nc(-c3ccc(C(C)(C)C)cc3)nc(-c3ccc(-c4ccc(B5OC(C)(C)C(C)(C)O5)cc4)nc3)n2)cc1] | 77% |
| S1102 | S1010 | cyclohexane | 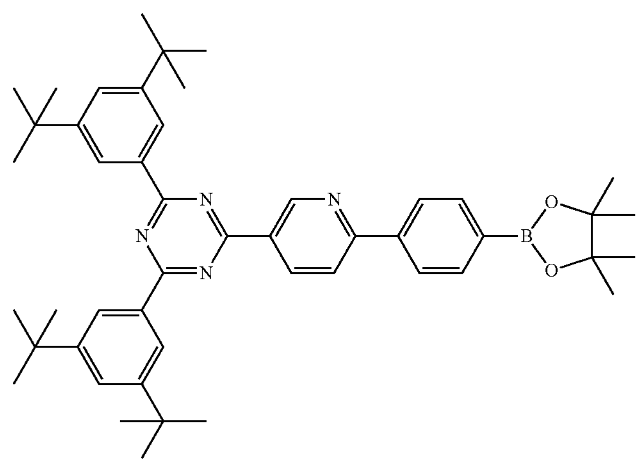 [SMILES: CC(C)(C)c1cc(-c2nc(-c3ccc(-c4ccc(B5OC(C)(C)C(C)(C)O5)cc4)nc3)nc(-c3cc(C(C)(C)C)cc(C(C)(C)C)c3)n2)cc(C(C)(C)C)c1] | 80% |
| S1103 | S1011 | acetonitrile | 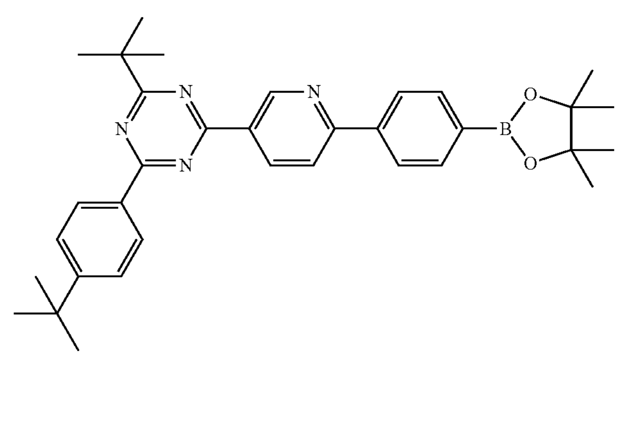 [SMILES: CC(C)(C)c1ccc(-c2nc(-c3ccc(-c4ccc(B5OC(C)(C)C(C)(C)O5)cc4)nc3)nc(C(C)(C)C)n2)cc1] | 73% |

-continued
| Ex. | Chloride/ synthon | Extractant | Product | Yield |
|---|---|---|---|---|
| S1104 | S1012 | ethyl acetate | 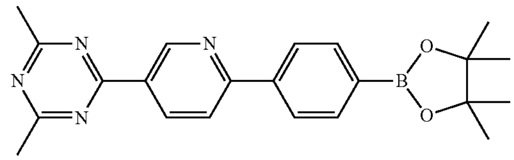 [SMILES: Cc1nc(C)nc(-c2ccc(-c3ccc(B4OC(C)(C)C(C)(C)O4)cc3)nc2)n1] | 75% |
| S1105 | S1013 | ethyl acetate | 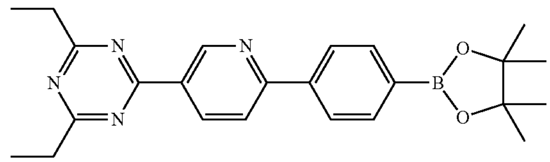 [SMILES: CCc1nc(CC)nc(-c2ccc(-c3ccc(B4OC(C)(C)C(C)(C)O4)cc3)nc2)n1] | 67% |
| S1106 | S1014 | ethyl acetate | 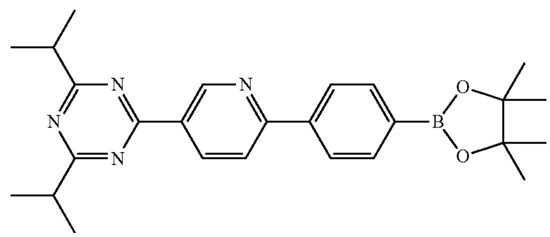 [SMILES: CC(C)c1nc(-c2ccc(-c3ccc(B4OC(C)(C)C(C)(C)O4)cc3)nc2)nc(C(C)C)n1] | 65% |
| S1107 | S1015 | cyclohexane | 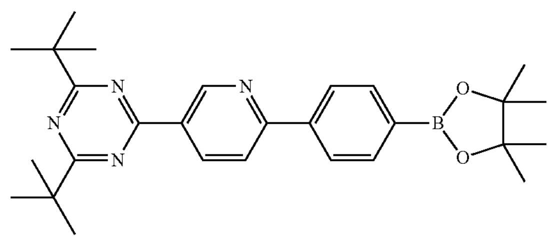 | 66% |
| S1108 | S1016 | cyclohexane | 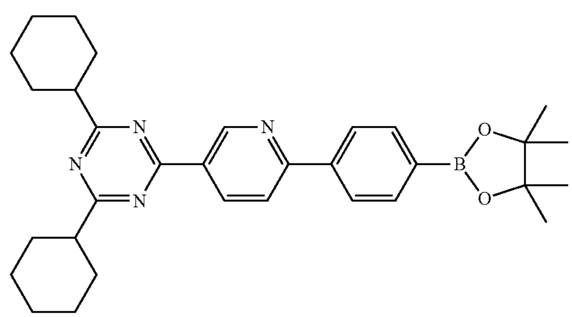 [SMILES: CC1(C)OB(c2ccc(-c3ccc(-c4nc(C5CCCCC5)nc(C5CCCCC5)n4)cn3)cc2)OC1(C)C] | 61% |
| S1109 | S1017 | o-xylene | 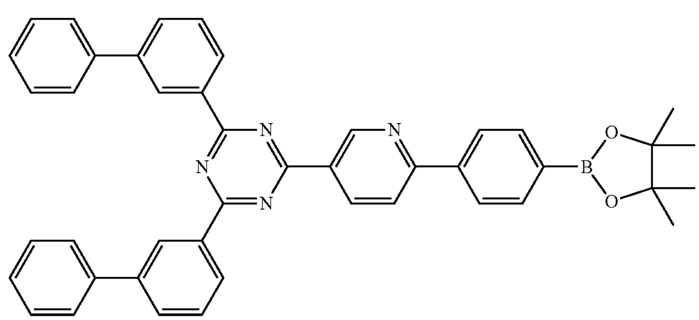 [SMILES: CC1(C)OB(c2ccc(-c3ccc(-c4nc(-c5cccc(-c6ccccc6)c5)nc(-c5cccc(-c6ccccc6)c5)n4)cn3)cc2)OC1(C)C] | 77% |

-continued
| Ex. | Chloride/ synthon | Extractant | Product | Yield |
|---|---|---|---|---|
| S1110 | S1018 | o-xylene | 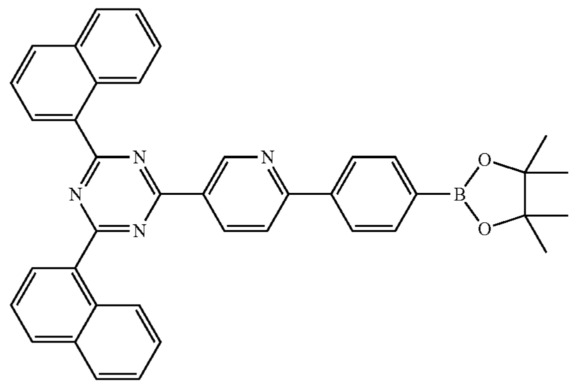 [SMILES: CC1(C)OB(c2ccc(-c3ccc(-c4nc(-c5cccc6ccccc56)nc(-c5cccc6ccccc56)n4)cn3)cc2)OC1(C)C] | 76% |
| S1111 | S1019 | toluene | 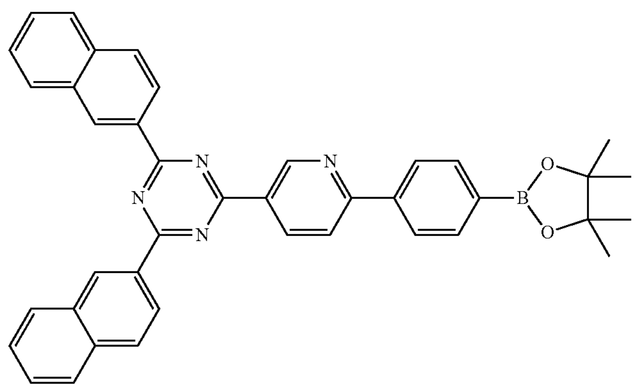 [SMILES: CC1(C)OB(c2ccc(-c3ccc(-c4nc(-c5ccc6ccccc6c5)nc(-c5ccc6ccccc6c5)n4)cn3)cc2)OC1(C)C] | 78% |
| S1112 | S1020 | mesitylene | 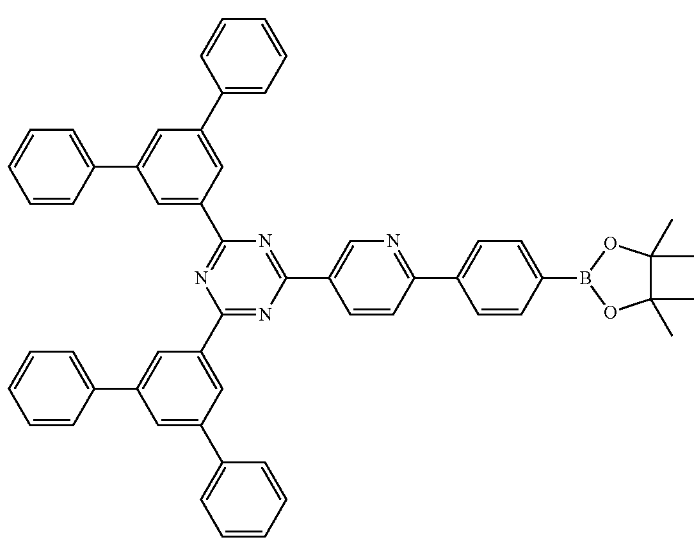 [SMILES: CC1(C)OB(c2ccc(-c3ccc(-c4nc(-c5cc(-c6ccccc6)cc(-c6ccccc6)c5)nc(-c5cc(-c6ccccc6)cc(-c6ccccc6)c5)n4)cn3)cc2)OC1(C)C] | 86% |

-continued
| Ex. | Chloride/ synthon | Extractant | Product | Yield |
|---|---|---|---|---|
| S1113 | S1021 | toluene | 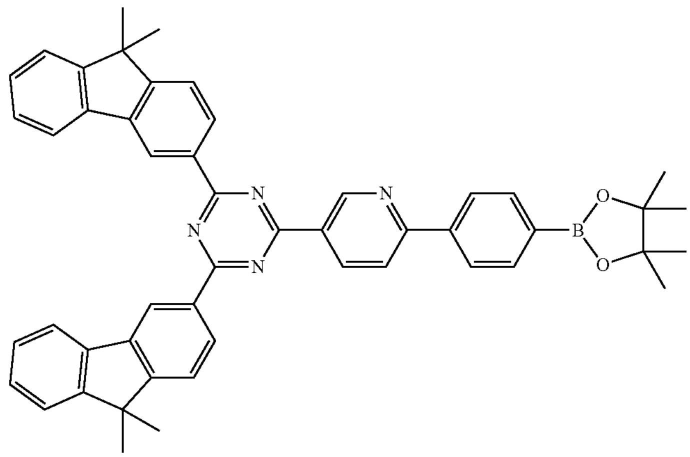 [SMILES: CC1(C)c2ccccc2-c2cc(-c3nc(-c4ccc(-c5ccc(B6OC(C)(C)C(C)(C)O6)cc5)nc4)nc(-c4ccc5c(c4)-c4ccccc4C5(C)C)n3)ccc21] | 80% |
| S1114 | S1022 | toluene | 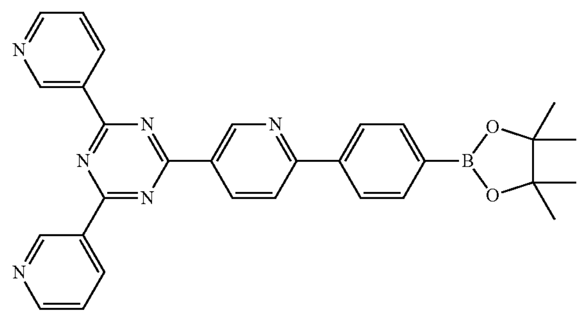 [SMILES: CC1(C)OB(c2ccc(-c3ccc(-c4nc(-c5cccnc5)nc(-c5cccnc5)n4)cn3)cc2)OC1(C)C] | 70% |
| S1115 | S1023 | ethyl acetate | 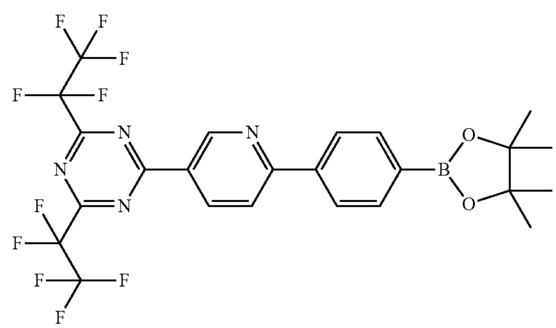 [SMILES: CC1(C)OB(c2ccc(-c3ccc(-c4nc(C(F)(F)C(F)(F)F)nc(C(F)(F)C(F)(F)F)n4)cn3)cc2)OC1(C)C] | 59% |
| S1116 | S1024 | toluene | 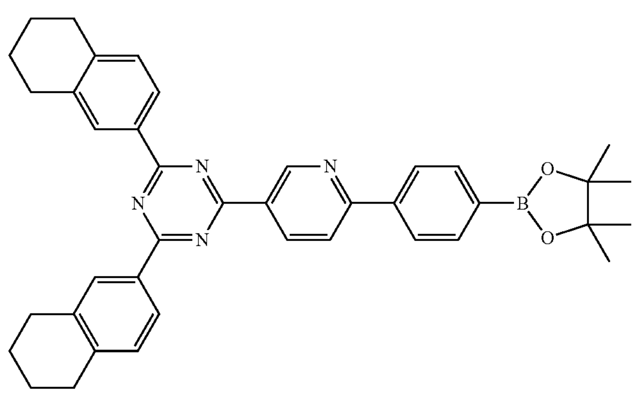 [SMILES: CC1(C)OB(c2ccc(-c3ccc(-c4nc(-c5ccc6c(c5)CCCC6)nc(-c5ccc6c(c5)CCCC6)n4)cn3)cc2)OC1(C)C] | 65% |

-continued
| Ex. | Chloride/ synthon | Extractant | Product | Yield |
|---|---|---|---|---|
| S1117 | S1025 | cyclohexane | 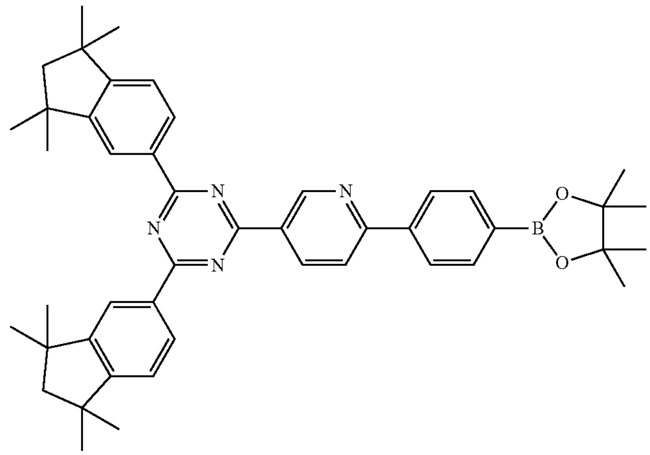 | 72% |
| S1118 | S1026 | cyclohexane | 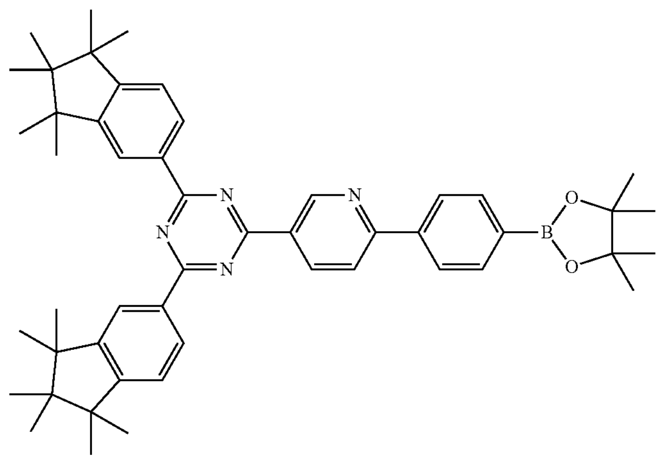 | 70% |
| S1119 | S1027 | cyclohexane | 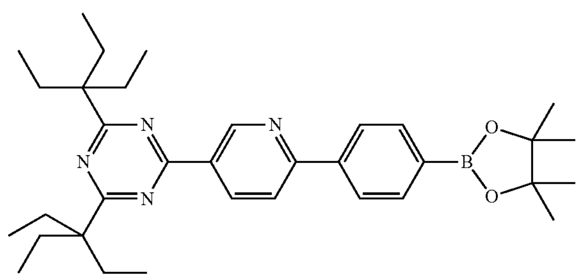 [SMILES: CCC(CC)(CC)c1nc(-c2ccc(-c3ccc(B4OC(C)(C)C(C)(C)O4)cc3)nc2)nc(C(CC)(CC)CC)n1] | 78% |
| S1120 | S1028 | toluene | 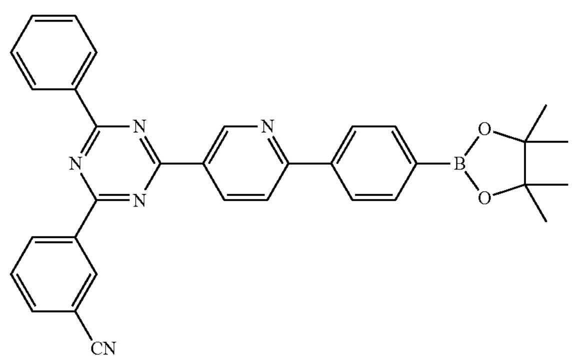 [SMILES: CC1(C)OB(c2ccc(-c3ccc(-c4nc(-c5ccccc5)nc(-c5cccc(C#N)c5)n4)cn3)cc2)OC1(C)C] | 80% |

-continued
| Ex. | Chloride/ synthon | Extractant | Product | Yield |
|---|---|---|---|---|
| S1121 | S1029 | toluene | 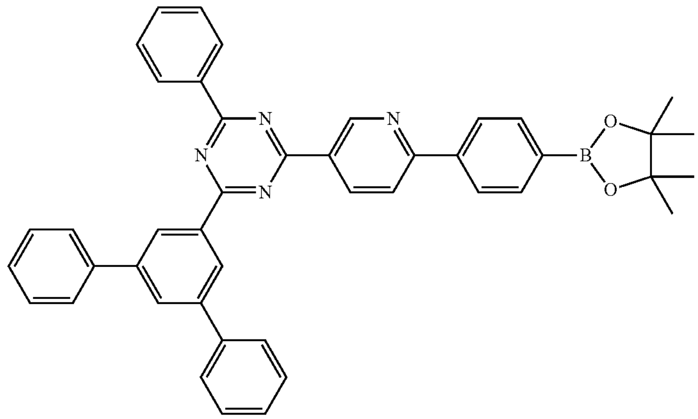 [SMILES: CC1(C)OB(c2ccc(-c3ccc(-c4nc(-c5ccccc5)nc(-c5cc(-c6ccccc6)cc(-c6ccccc6)c5)n4)cn3)cc2)OC1(C)C] | 74% |
| S1122 | S1030 | dioxane | 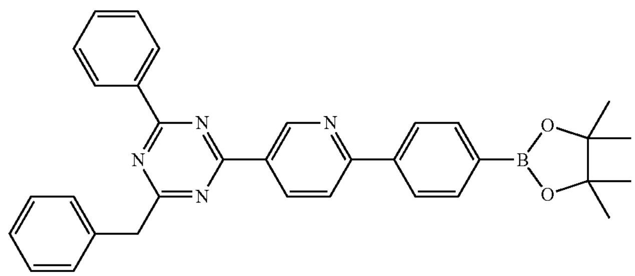 [SMILES: CC1(C)OB(c2ccc(-c3ccc(-c4nc(Cc5ccccc5)nc(-c5ccccc5)n4)cn3)cc2)OC1(C)C] | 77% |
| S1123 | S1031 | dioxane | 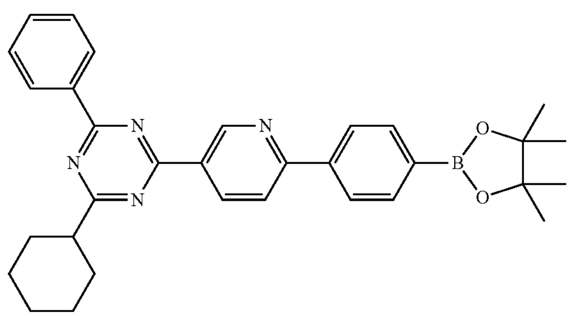 [SMILES: CC1(C)OB(c2ccc(-c3ccc(-c4nc(-c5ccccc5)nc(C5CCCCC5)n4)cn3)cc2)OC1(C)C] | 70% |
| S1124 | S1032 | acetonitrile | 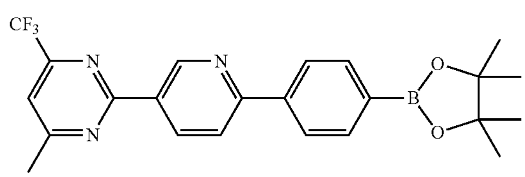 [SMILES: Cc1cc(C(F)(F)F)nc(-c2ccc(-c3ccc(B4OC(C)(C)C(C)(C)O4)cc3)nc2)n1] | 72% |
| S1125 | S1034 | ethyl acetate | 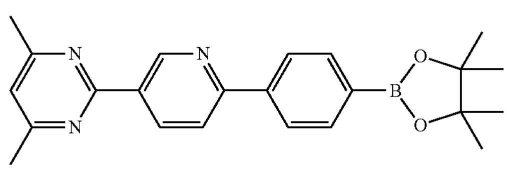 [SMILES: Cc1cc(C)nc(-c2ccc(-c3ccc(B4OC(C)(C)C(C)(C)O4)cc3)nc2)n1] | 65% |
| S1126 | S1035 | ethanol | 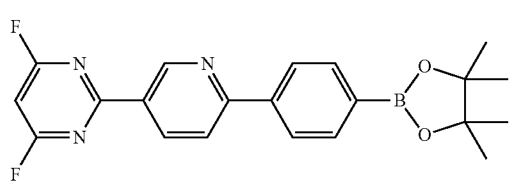 [SMILES: CC1(C)OB(c2ccc(-c3ccc(-c4nc(F)cc(F)n4)cn3)cc2)OC1(C)C] | 68% |

-continued
| Ex. | Chloride/ synthon | Extractant | Product | Yield |
|---|---|---|---|---|
| S1127 | S1036 | acetonitrile | 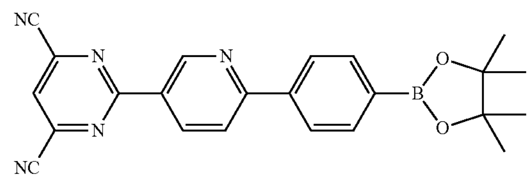 [SMILES: CC1(C)OB(c2ccc(-c3ccc(-c4nc(C#N)cc(C#N)n4)cn3)cc2)OC1(C)C] | 70% |
| S1128 | S1036 | cyclohexane | 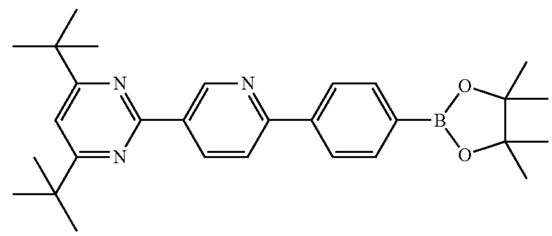 [SMILES: CC(C)(C)c1cc(C(C)(C)C)nc(-c2ccc(-c3ccc(B4OC(C)(C)C(C)(C)O4)cc3)nc2)n1] | 75% |
| S1129 | S1037 | toluene | 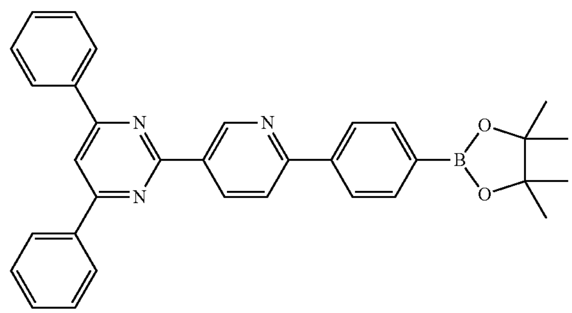 [SMILES: CC1(C)OB(c2ccc(-c3ccc(-c4nc(-c5ccccc5)cc(-c5ccccc5)n4)cn3)cc2)OC1(C)C] | 80% |
| S1130 | S1038 | cyclohexane | 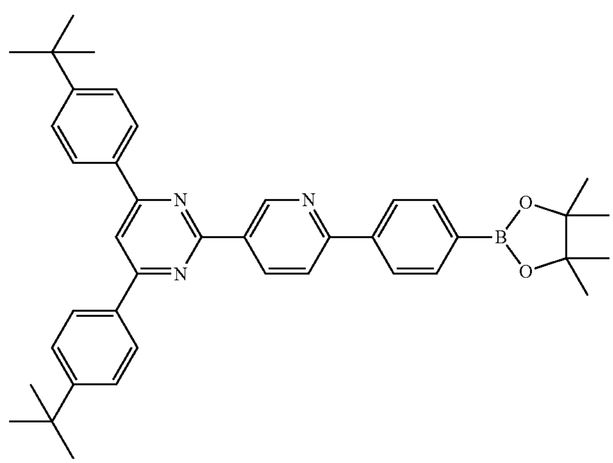 | 79% |
| S1131 | S1039 | ethyl acetate | 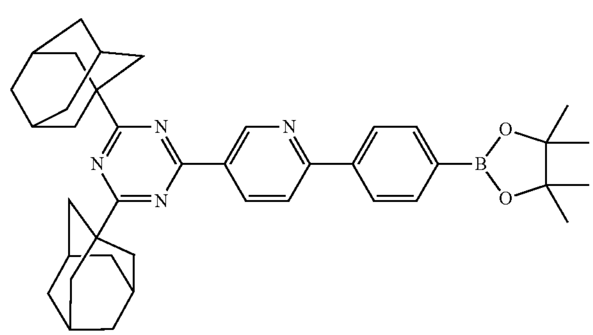 [SMILES: CC1(C)OB(c2ccc(-c3ccc(-c4nc(C56CC7CC(CC(C7)C5)C6)nc(C56CC7CC(CC(C7)C5)C6)n4)cn3)cc2)OC1(C)C] | 72% |

-continued
| Ex. | Chloride/ synthon | Extractant | Product | Yield |
| --- | --- | --- | --- | --- |
| S1132 | S1040 | ethyl acetate | 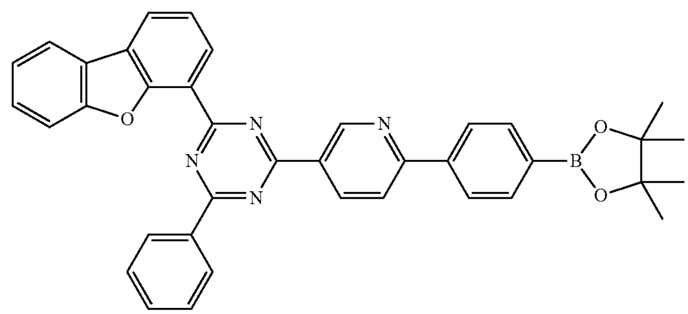 [SMILES: CC1(C)OB(c2ccc(-c3ccc(-c4nc(-c5ccccc5)nc(-c5cccc6c5oc5ccccc56)n4)cn3)cc2)OC1(C)C] | 74% |
| S1133 | S1041 | p-xylene | 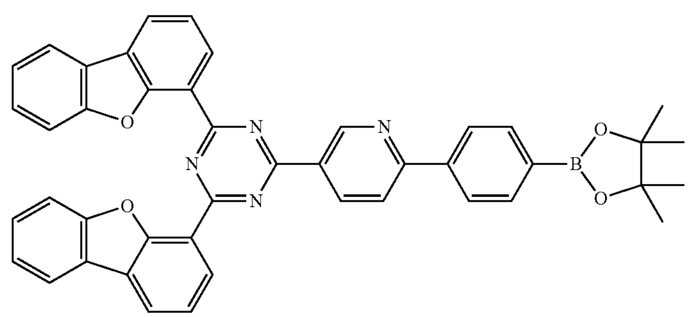 [SMILES: CC1(C)OB(c2ccc(-c3ccc(-c4nc(-c5cccc6c5oc5ccccc56)nc(-c5cccc6c5oc5ccccc56)n4)cn3)cc2)OC1(C)C] | 82% |
| S1134 | 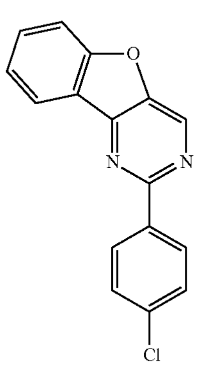 [1374216-04-2] | ethyl acetate | 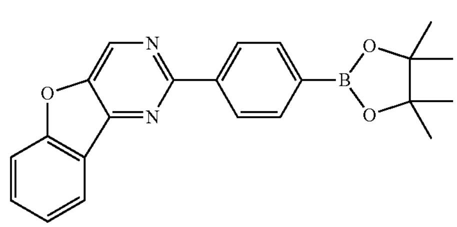 [SMILES: CC1(C)OB(c2ccc(-c3ncc4oc5ccccc5c4n3)cc2)OC1(C)C] | 78% |

-continued
| Ex. | Chloride/ synthon | Extractant | Product | Yield |
|---|---|---|---|---|
| S1135 | 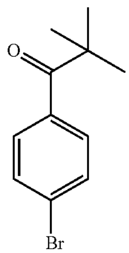 [30314-45-5] | chroma-tography | 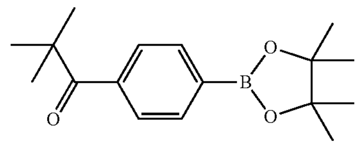 [SMILES: CC(C)(C)C(=O)c1ccc(B2OC(C)(C)C(C)(C)O2)cc1] | 80% |
| S1136 | S1042 | toluene | 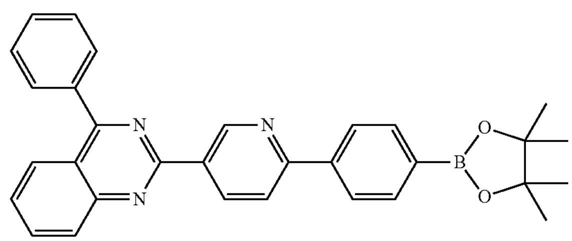 [SMILES: CC1(C)OB(c2ccc(-c3ccc(-c4nc(-c5ccccc5)c5ccccc5n4)cn3)cc2)OC1(C)C] | 70% |
| S1137 | 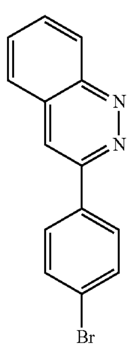 [SMILES: Brc1ccc(-c2cc3ccccc3nn2)cc1] [1401421-23-5] | dioxane | 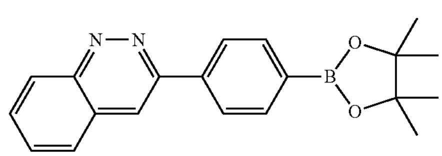 | 74% |

E: Synthesis of the Ligands Part 2
Example L1000: 2-[6-[4-[2-[3,5-bis[2-[4-[5-(4,6-diphenyl-1,3,5-triazin-2-yl)-2-pyridyl]phenyl]phenyl]phenyl]phenyl]-3-pyridyl]-4,6-diphenyl-1,3,5-triazine
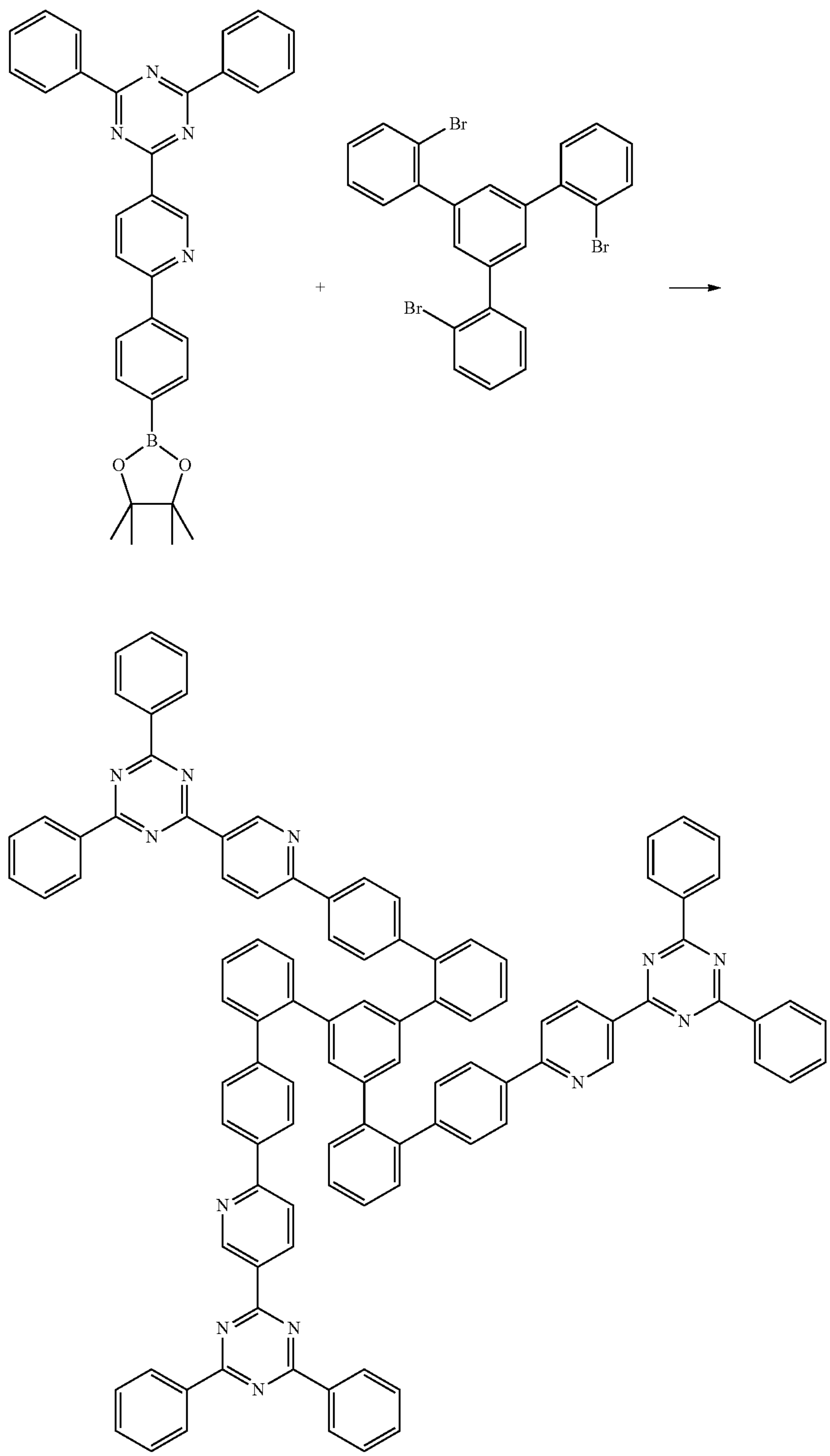 [SMILES: CC1(C)OB(c2ccc(-c3ccc(-c4nc(-c5ccccc5)nc(-c5ccccc5)n4)cn3)cc2)OC1(C)C ; Brc1ccccc1-c1cc(-c2ccccc2Br)cc(-c2ccccc2Br)c1 ; c1ccc(-c2nc(-c3ccccc3)nc(-c3ccc(-c4ccc(-c5ccccc5-c5cc(-c6ccccc6-c6ccc(-c7ccc(-c8nc(-c9ccccc9)nc(-c9ccccc9)n8)cn7)cc6)cc(-c6ccccc6-c6ccc(-c7ccc(-c8nc(-c9ccccc9)nc(-c9ccccc9)n8)cn7)cc6)c5)cc4)nc3)n2)cc1]

Into a 2 l four-neck flask with reflux condenser, precision glass stirrer, heating bath and argon connection are weighed 40.0 g (76.1 mmol) of S1100, 12.1 g (22.3 mmol) of 1,3,5-tris(2-bromophenyl)benzene [380626-56-2], 17.2 g (162 mmol) of sodium carbonate, 526 mg (2.0 mmol) of triphenylphosphine [603-35-0] and 150 mg (0.67 mmol) of palladium(II) acetate [3375-31-3], and 400 ml of toluene, 200 ml of ethanol and 200 ml of water are added. The reaction mixture is inertized with argon and stirred under reflux for 48 hours. After cooling, the precipitated grey solid is filtered off with suction and washed 5× with 100 ml of ethanol and then dried in a vacuum drying cabinet at 70° C. Further purification is effected by continuous hot extraction three times (extractant, amount initially charged in each case about 300 ml, extraction thimble: standard Soxhlet thimbles made from cellulose from Whatman) with o-xylene. Derivatives of better solubility can be purified by means of chromatographic methods. A pale yellow solid is obtained. Yield: 23.7 g (177 mmol), 69%; purity: 97% by $^{1}$H NMR.

In an analogous manner, it is possible to prepare the following compounds:

| Ex. | Product/ synthon/ extractant/purification | Yield |
|---|---|---|
| L1001 | 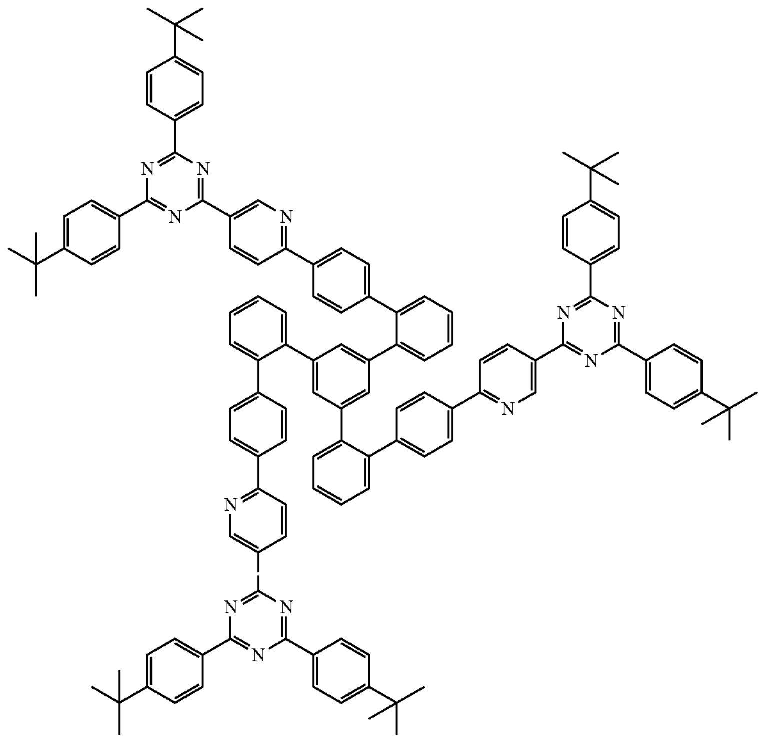 S1101 chromatography | 55% |
| L1002 | 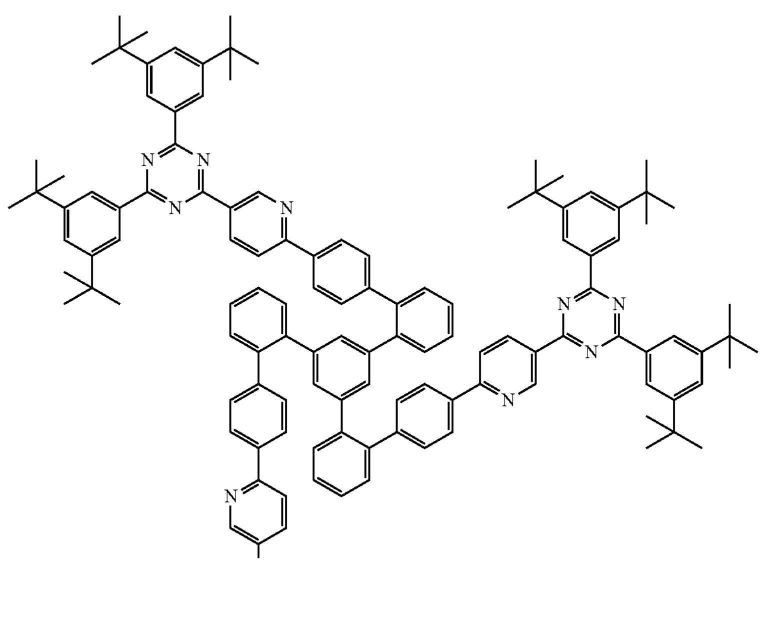 | 60% |

-continued
| Ex. | Product/ synthon/ extractant/purification | Yield |
| --- | --- | --- |
| | 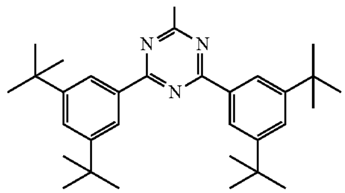 S1102 | |
| L1003 | 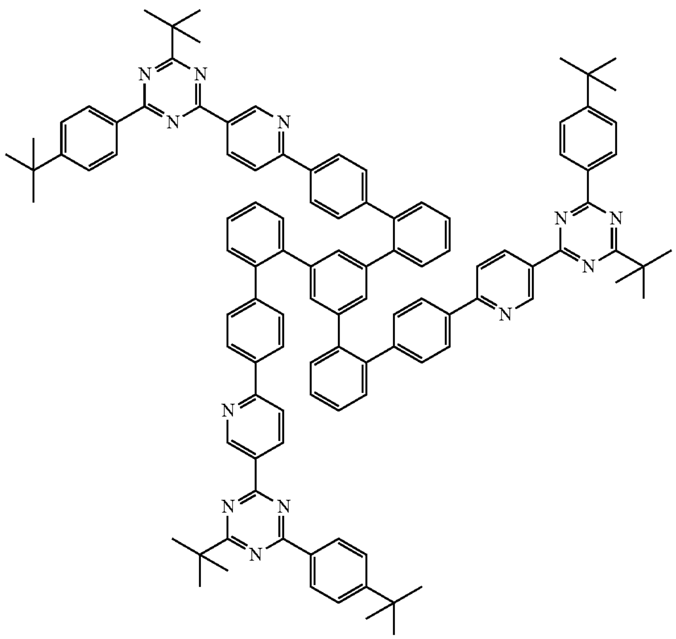 S1103 chromatography | 66% |
| L1004 | 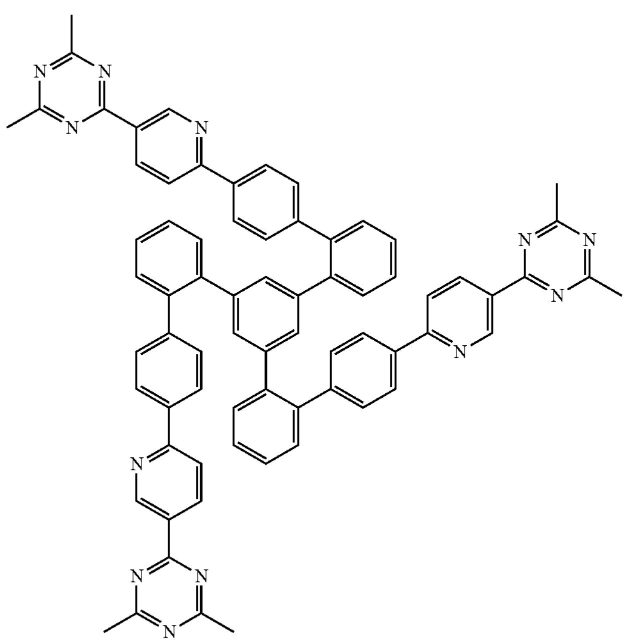 | 70% |

-continued
| Ex. | Product/ synthon/ extractant/purification | Yield |
|---|---|---|
| | S1104 toluene | |
| L1005 | 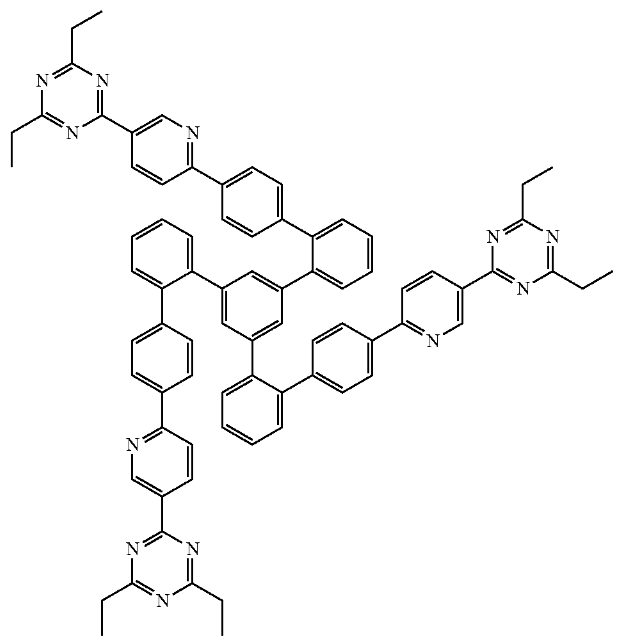 [SMILES: CCc1nc(CC)nc(-c2ccc(-c3ccc(-c4ccccc4-c4cc(-c5ccccc5-c5ccc(-c6ccc(-c7nc(CC)nc(CC)n7)cn6)cc5)cc(-c5ccccc5-c5ccc(-c6ccc(-c7nc(CC)nc(CC)n7)cn6)cc5)c4)cc3)nc2)n1] | 62% |
| | S1105 toluene | |
| L1006 | 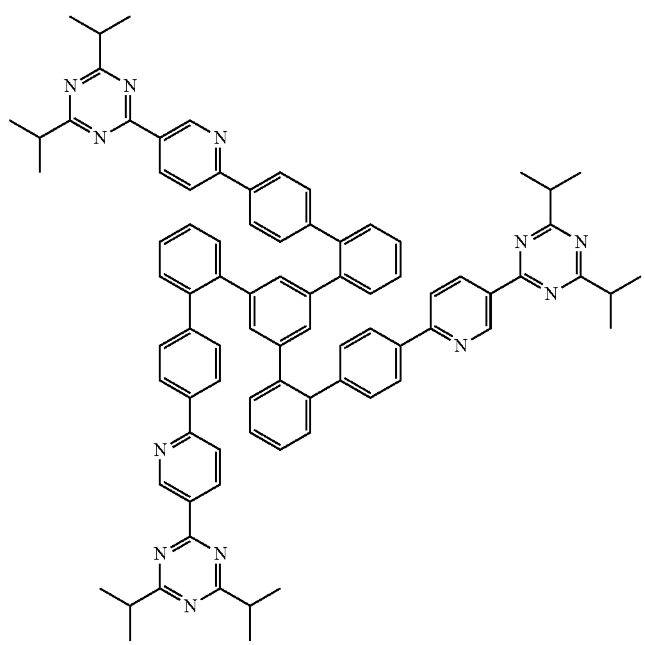 [SMILES: CC(C)c1nc(-c2ccc(-c3ccc(-c4ccccc4-c4cc(-c5ccccc5-c5ccc(-c6ccc(-c7nc(C(C)C)nc(C(C)C)n7)cn6)cc5)cc(-c5ccccc5-c5ccc(-c6ccc(-c7nc(C(C)C)nc(C(C)C)n7)cn6)cc5)c4)cc3)nc2)nc(C(C)C)n1] | 60% |
| | S1106 toluene | |

-continued
| Ex. | Product/ synthon/ extractant/purification | Yield |
|---|---|---|
| L1007 | 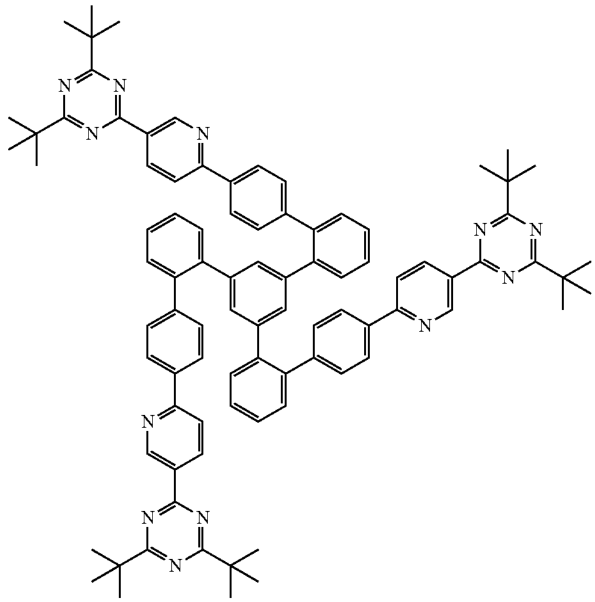 [SMILES: CC(C)(C)c1nc(-c2ccc(-c3ccc(-c4ccccc4-c4cc(-c5ccccc5-c5ccc(-c6ccc(-c7nc(C(C)(C)C)nc(C(C)(C)C)n7)cn6)cc5)cc(-c5ccccc5-c5ccc(-c6ccc(-c7nc(C(C)(C)C)nc(C(C)(C)C)n7)cn6)cc5)c4)cc3)nc2)nc(C(C)(C)C)n1] S1107 ethyl acetate | 71% |
| L1008 | 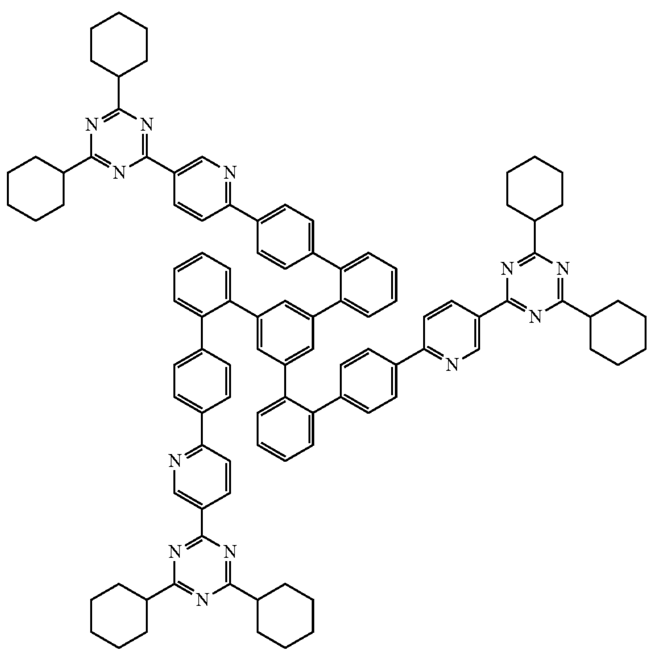 [SMILES: c1ccc(-c2cc(-c3ccccc3-c3ccc(-c4ccc(-c5nc(C6CCCCC6)nc(C6CCCCC6)n5)cn4)cc3)cc(-c3ccccc3-c3ccc(-c4ccc(-c5nc(C6CCCCC6)nc(C6CCCCC6)n5)cn4)cc3)c2)c(-c2ccc(-c3ccc(-c4nc(C5CCCCC5)nc(C5CCCCC5)n4)cn3)cc2)c1] S1108 toluene | 75% |

-continued
| Ex. | Product/ synthon/ extractant/purification | Yield |
|---|---|---|
| L1009 | 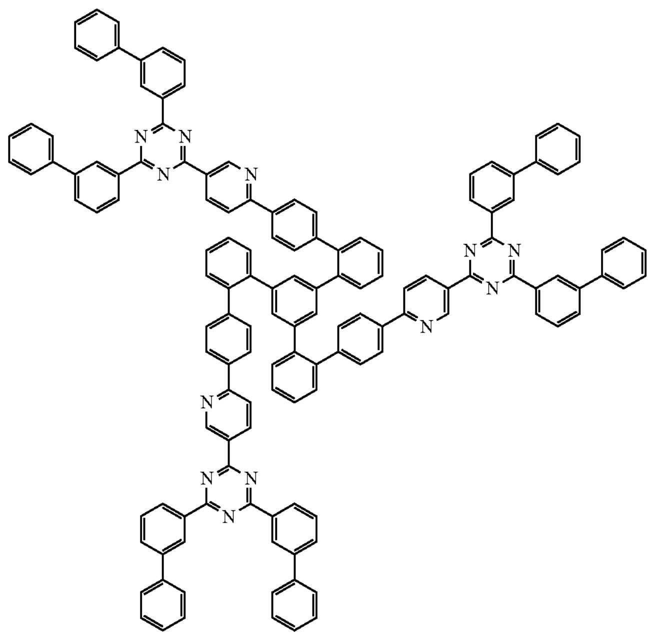 [SMILES: c1ccc(-c2cccc(-c3nc(-c4ccc(-c5ccc(-c6ccccc6-c6cc(-c7ccccc7-c7ccc(-c8ccc(-c9nc(-c%10cccc(-c%11ccccc%11)c%10)nc(-c%10cccc(-c%11ccccc%11)c%10)n9)cn8)cc7)cc(-c7ccccc7-c7ccc(-c8ccc(-c9nc(-c%10cccc(-c%11ccccc%11)c%10)nc(-c%10cccc(-c%11ccccc%11)c%10)n9)cn8)cc7)c6)cc5)nc4)nc(-c4cccc(-c5ccccc5)c4)n3)c2)cc1] S1109 o-xylene | 82% |
| L1010 | 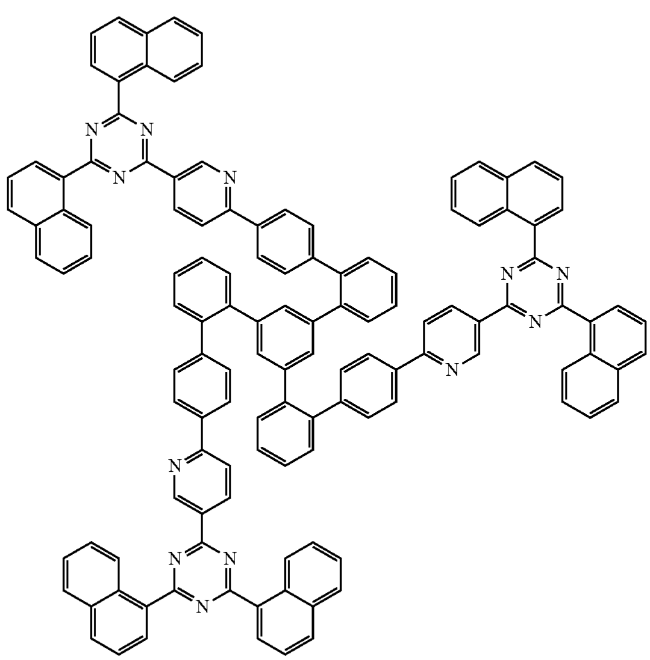 [SMILES: c1ccc(-c2cc(-c3ccccc3-c3ccc(-c4ccc(-c5nc(-c6cccc7ccccc67)nc(-c6cccc7ccccc67)n5)cn4)cc3)cc(-c3ccccc3-c3ccc(-c4ccc(-c5nc(-c6cccc7ccccc67)nc(-c6cccc7ccccc67)n5)cn4)cc3)c2)c(-c2ccc(-c3ccc(-c4nc(-c5cccc6ccccc56)nc(-c5cccc6ccccc56)n4)cn3)cc2)c1] S1110 toluene | 80% |

-continued
| Ex. | Product/ synthon/ extractant/purification | Yield |
|---|---|---|
| L1011 | 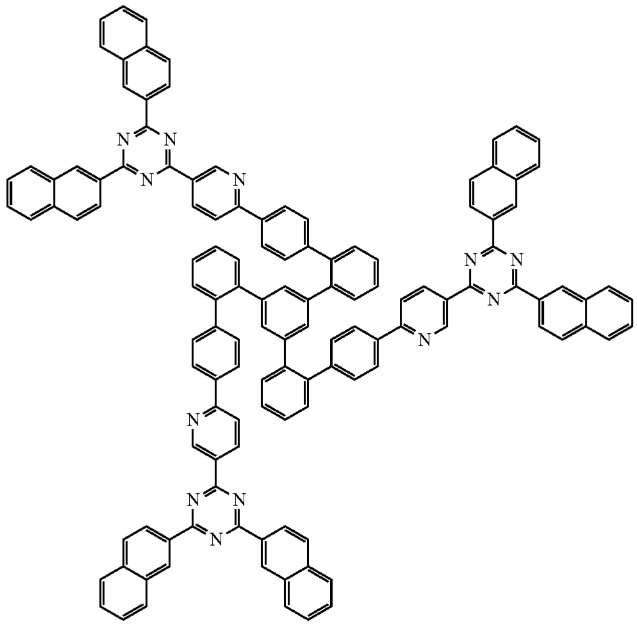 [SMILES: c1ccc(-c2cc(-c3ccccc3-c3ccc(-c4ccc(-c5nc(-c6ccc7ccccc7c6)nc(-c6ccc7ccccc7c6)n5)cn4)cc3)cc(-c3ccccc3-c3ccc(-c4ccc(-c5nc(-c6ccc7ccccc7c6)nc(-c6ccc7ccccc7c6)n5)cn4)cc3)c2)c(-c2ccc(-c3ccc(-c4nc(-c5ccc6ccccc6c5)nc(-c5ccc6ccccc6c5)n4)cn3)cc2)c1] S1111 toluene | 81% |
| L1012 | 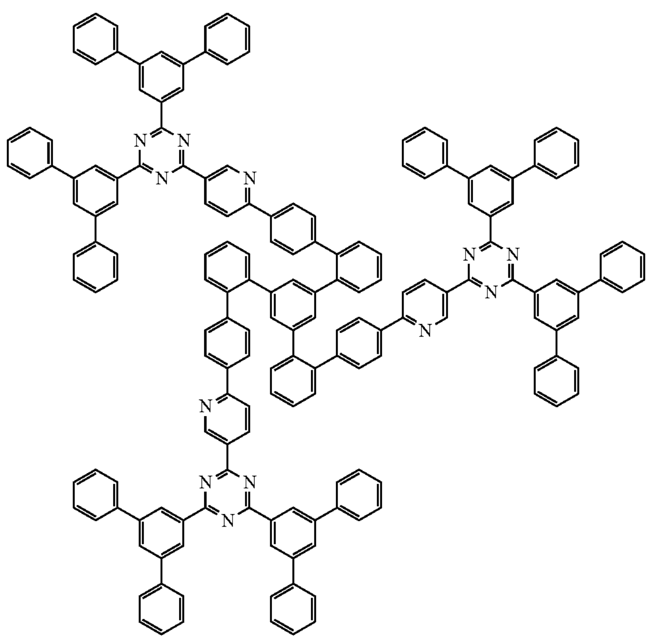 [SMILES: c1ccc(-c2cc(-c3ccccc3)cc(-c3nc(-c4ccc(-c5ccc(-c6ccccc6-c6cc(-c7ccccc7-c7ccc(-c8ccc(-c9nc(-c%10cc(-c%11ccccc%11)cc(-c%11ccccc%11)c%10)nc(-c%10cc(-c%11ccccc%11)cc(-c%11ccccc%11)c%10)n9)cn8)cc7)cc(-c7ccccc7-c7ccc(-c8ccc(-c9nc(-c%10cc(-c%11ccccc%11)cc(-c%11ccccc%11)c%10)nc(-c%10cc(-c%11ccccc%11)cc(-c%11ccccc%11)c%10)n9)cn8)cc7)c6)cc5)nc4)nc(-c4cc(-c5ccccc5)cc(-c5ccccc5)c4)n3)c2)cc1] S1112 p-xylene | 88% |

-continued
| Ex. | Product/ synthon/ extractant/purification | Yield |
|---|---|---|
| L1013 | 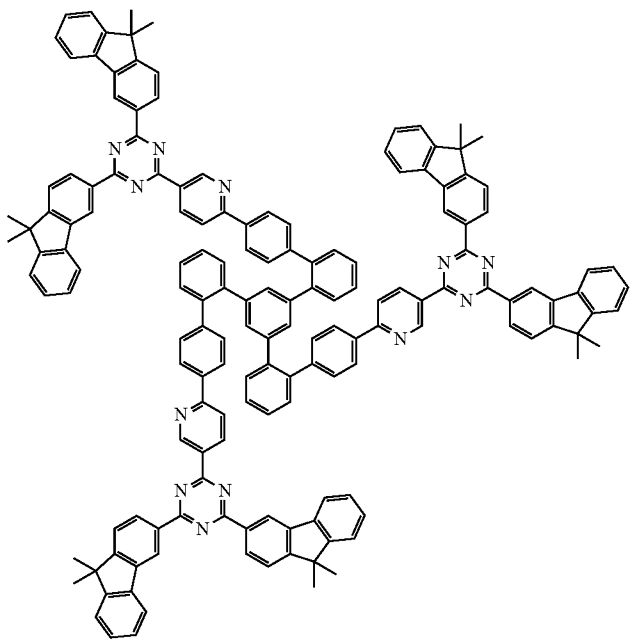 [SMILES: CC1(C)c2ccccc2-c2cc(-c3nc(-c4ccc(-c5ccc(-c6ccccc6-c6cc(-c7ccccc7-c7ccc(-c8ccc(-c9nc(-c%10ccc%11c(c%10)-c%10ccccc%10C%11(C)C)nc(-c%10ccc%11c(c%10)-c%10ccccc%10C%11(C)C)n9)cn8)cc7)cc(-c7ccccc7-c7ccc(-c8ccc(-c9nc(-c%10ccc%11c(c%10)-c%10ccccc%10C%11(C)C)nc(-c%10ccc%11c(c%10)-c%10ccccc%10C%11(C)C)n9)cn8)cc7)c6)cc5)nc4)nc(-c4ccc5c(c4)-c4ccccc4C5(C)C)n3)ccc21] S1113 mesitylene | 85% |
| L1014 | 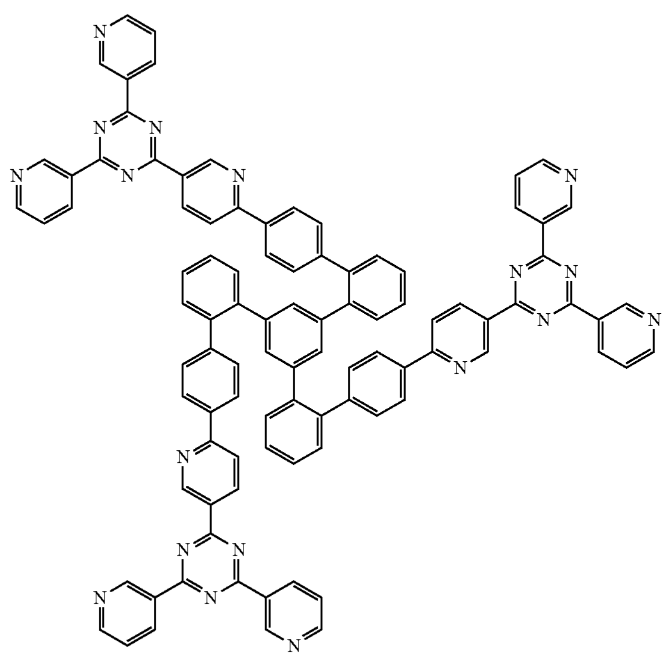 [SMILES: c1cncc(-c2nc(-c3cccnc3)nc(-c3ccc(-c4ccc(-c5ccccc5-c5cc(-c6ccccc6-c6ccc(-c7ccc(-c8nc(-c9cccnc9)nc(-c9cccnc9)n8)cn7)cc6)cc(-c6ccccc6-c6ccc(-c7ccc(-c8nc(-c9cccnc9)nc(-c9cccnc9)n8)cn7)cc6)c5)cc4)nc3)n2)c1] S1114 o-xylene | 73% |

-continued
| Ex. | Product/ synthon/ extractant/purification | Yield |
| --- | --- | --- |
| L1015 | 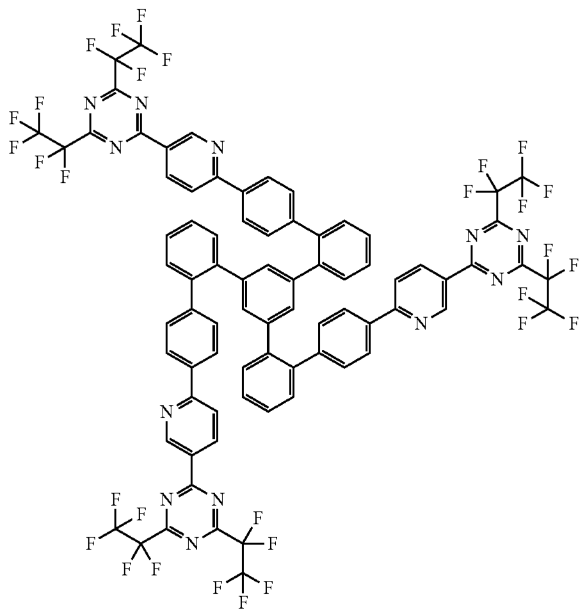 [SMILES: FC(F)(F)C(F)(F)c1nc(-c2ccc(-c3ccc(-c4ccccc4-c4cc(-c5ccccc5-c5ccc(-c6ccc(-c7nc(C(F)(F)C(F)(F)F)nc(C(F)(F)C(F)(F)F)n7)cn6)cc5)cc(-c5ccccc5-c5ccc(-c6ccc(-c7nc(C(F)(F)C(F)(F)F)nc(C(F)(F)C(F)(F)F)n7)cn6)cc5)c4)cc3)nc2)nc(C(F)(F)C(F)(F)F)n1] S1115 ethyl acetate | 55% |
| L1016 | 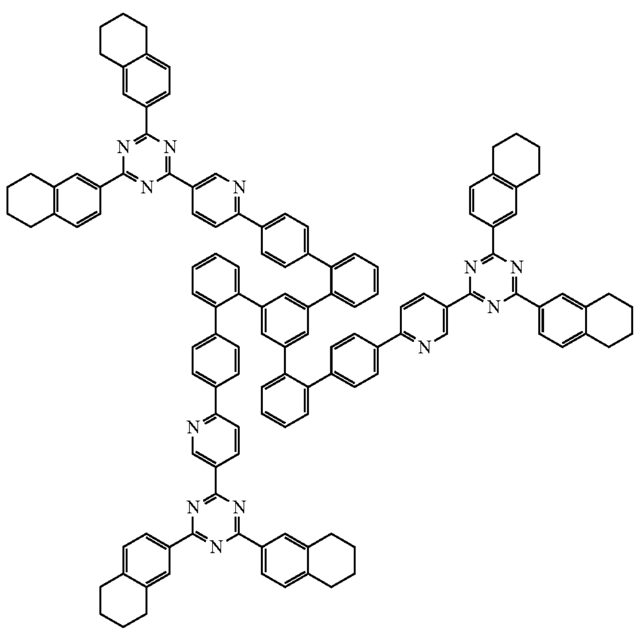 [SMILES: c1ccc(-c2cc(-c3ccccc3-c3ccc(-c4ccc(-c5nc(-c6ccc7c(c6)CCCC7)nc(-c6ccc7c(c6)CCCC7)n5)cn4)cc3)cc(-c3ccccc3-c3ccc(-c4ccc(-c5nc(-c6ccc7c(c6)CCCC7)nc(-c6ccc7c(c6)CCCC7)n5)cn4)cc3)c2)c(-c2ccc(-c3ccc(-c4nc(-c5ccc6c(c5)CCCC6)nc(-c5ccc6c(c5)CCCC6)n4)cn3)cc2)c1] S1116 toluene | 59% |

-continued
| Ex. | Product/ synthon/ extractant/purification | Yield |
|---|---|---|
| L1016 | 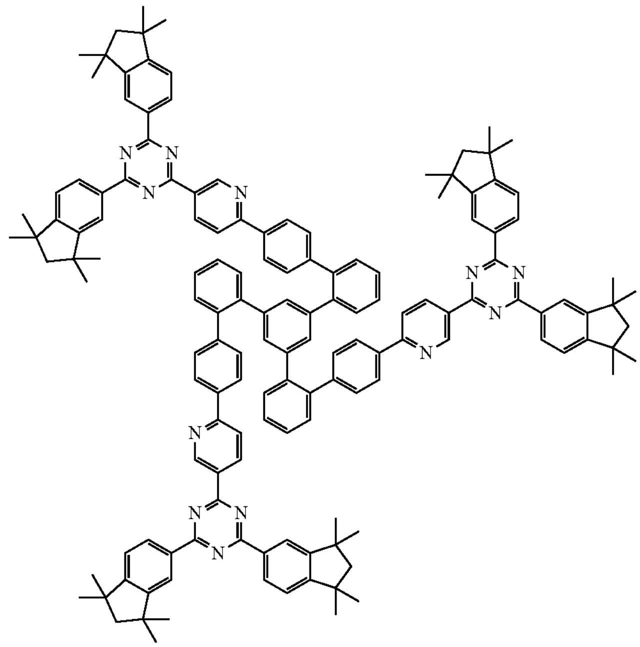 S1117 dioxane | 71% |
| L1018 | 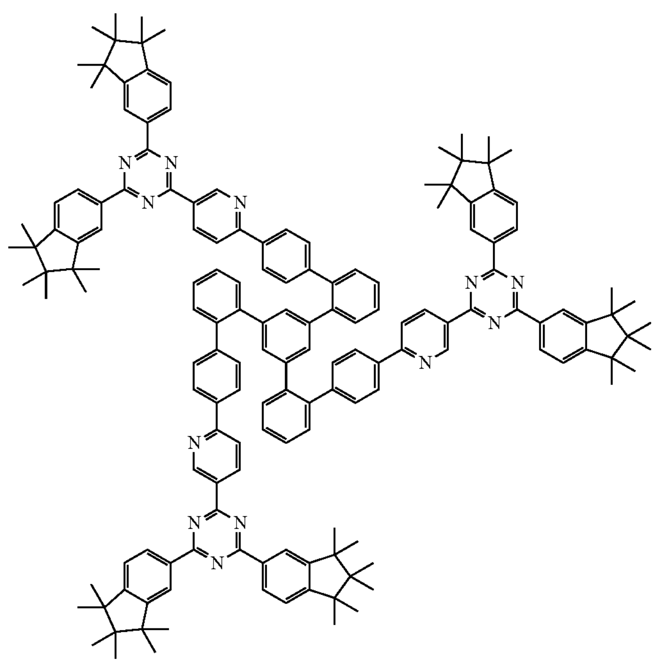 S1118 dioxane | 78% |

-continued
| Ex. | Product/ synthon/ extractant/purification | Yield |
|---|---|---|
| L1019 | 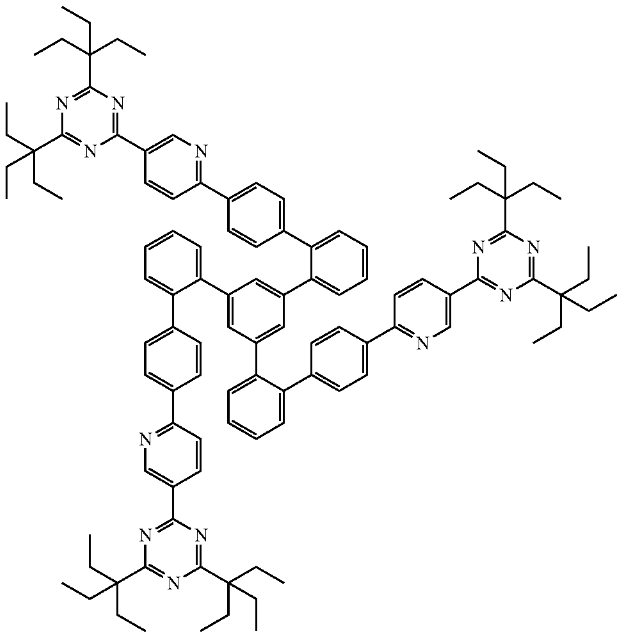 [SMILES: CCC(CC)(CC)c1nc(-c2ccc(-c3ccc(-c4ccccc4-c4cc(-c5ccccc5-c5ccc(-c6ccc(-c7nc(C(CC)(CC)CC)nc(C(CC)(CC)CC)n7)cn6)cc5)cc(-c5ccccc5-c5ccc(-c6ccc(-c7nc(C(CC)(CC)CC)nc(C(CC)(CC)CC)n7)cn6)cc5)c4)cc3)nc2)nc(C(CC)(CC)CC)n1] S1119 toluene | 78% |
| L1020 | 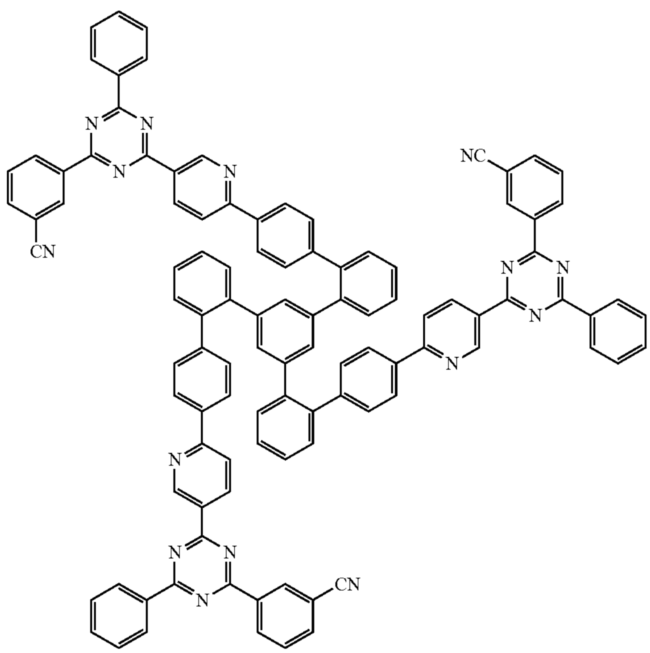 [SMILES: N#Cc1cccc(-c2nc(-c3ccccc3)nc(-c3ccc(-c4ccc(-c5ccccc5-c5cc(-c6ccccc6-c6ccc(-c7ccc(-c8nc(-c9ccccc9)nc(-c9cccc(C#N)c9)n8)cn7)cc6)cc(-c6ccccc6-c6ccc(-c7ccc(-c8nc(-c9ccccc9)nc(-c9cccc(C#N)c9)n8)cn7)cc6)c5)cc4)nc3)n2)c1] S1120 toluene | 80% |

-continued
| Ex. | Product/ synthon/ extractant/purification | Yield |
|---|---|---|
| L1021 | 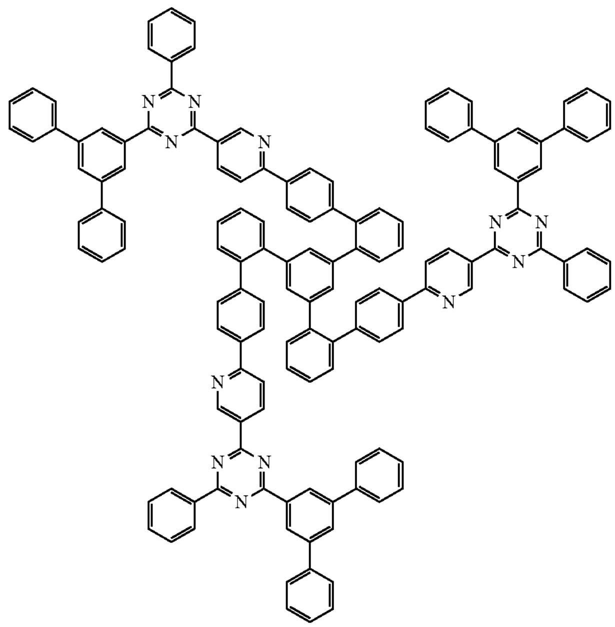 [SMILES: c1ccc(-c2cc(-c3ccccc3)cc(-c3nc(-c4ccccc4)nc(-c4ccc(-c5ccc(-c6ccccc6-c6cc(-c7ccccc7-c7ccc(-c8ccc(-c9nc(-c%10ccccc%10)nc(-c%10cc(-c%11ccccc%11)cc(-c%11ccccc%11)c%10)n9)cn8)cc7)cc(-c7ccccc7-c7ccc(-c8ccc(-c9nc(-c%10ccccc%10)nc(-c%10cc(-c%11ccccc%11)cc(-c%11ccccc%11)c%10)n9)cn8)cc7)c6)cc5)nc4)n3)c2)cc1] S1121 o-xylene | 74% |
| L1022 | 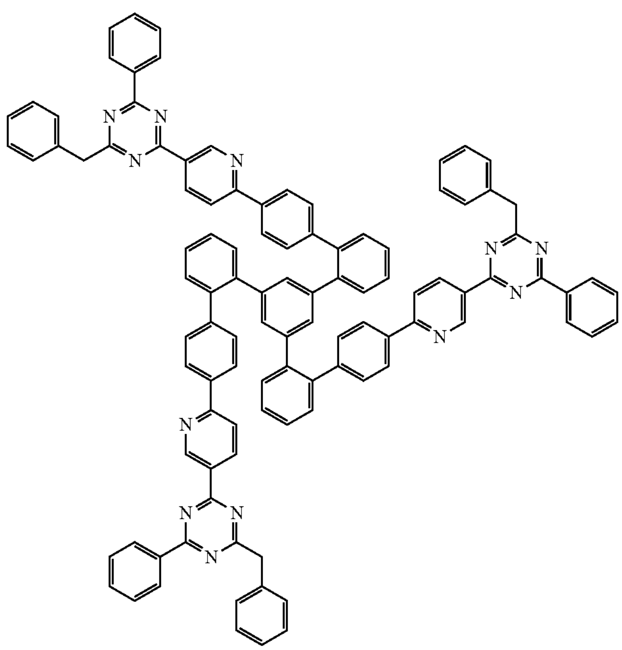 [SMILES: c1ccc(Cc2nc(-c3ccccc3)nc(-c3ccc(-c4ccc(-c5ccccc5-c5cc(-c6ccccc6-c6ccc(-c7ccc(-c8nc(Cc9ccccc9)nc(-c9ccccc9)n8)cn7)cc6)cc(-c6ccccc6-c6ccc(-c7ccc(-c8nc(Cc9ccccc9)nc(-c9ccccc9)n8)cn7)cc6)c5)cc4)nc3)n2)cc1] S1122 o-xylene | 77% |

-continued
| Ex. | Product/ synthon/ extractant/purification | Yield |
|---|---|---|
| L1023 | 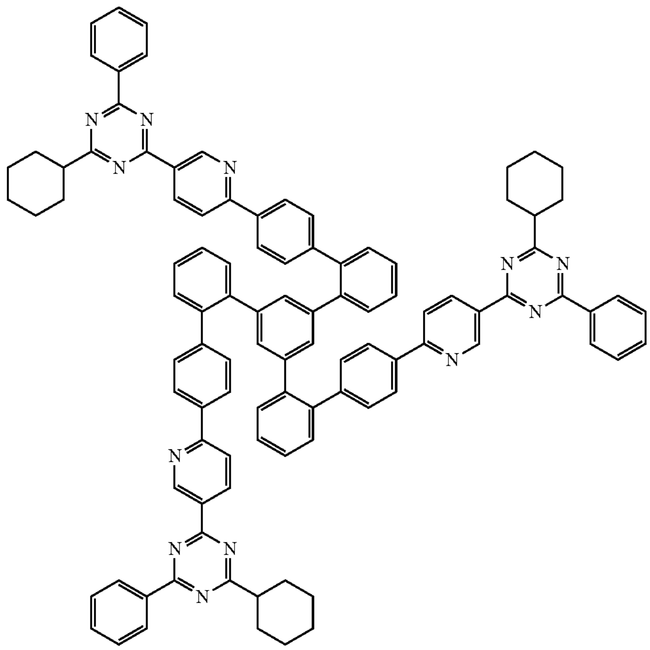 [SMILES: c1ccc(-c2nc(-c3ccc(-c4ccc(-c5ccccc5-c5cc(-c6ccccc6-c6ccc(-c7ccc(-c8nc(-c9ccccc9)nc(C9CCCCC9)n8)cn7)cc6)cc(-c6ccccc6-c6ccc(-c7ccc(-c8nc(-c9ccccc9)nc(C9CCCCC9)n8)cn7)cc6)c5)cc4)nc3)nc(C3CCCCC3)n2)cc1] S1123 dioxane | 70% |
| L1024 | 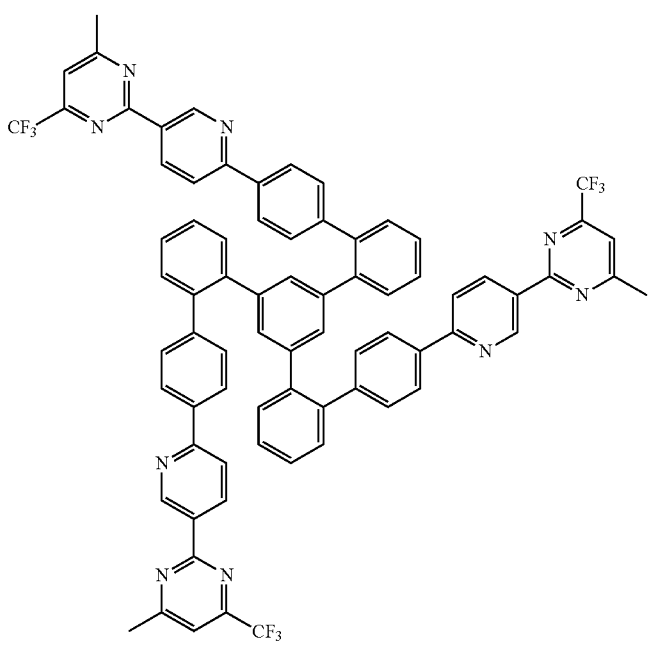 [SMILES: Cc1cc(C(F)(F)F)nc(-c2ccc(-c3ccc(-c4ccccc4-c4cc(-c5ccccc5-c5ccc(-c6ccc(-c7nc(C)cc(C(F)(F)F)n7)cn6)cc5)cc(-c5ccccc5-c5ccc(-c6ccc(-c7nc(C)cc(C(F)(F)F)n7)cn6)cc5)c4)cc3)nc2)n1] S1124 ethyl acetate | 72% |

-continued
| Ex. | Product/<br>synthon/<br>extractant/purification | Yield |
|---|---|---|
| L1025 | 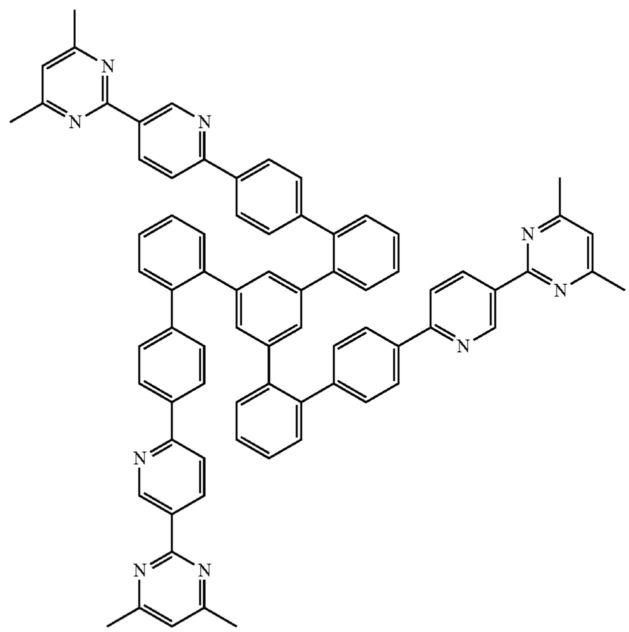<br>S1125<br>toluene | 65% |
| L1026 | 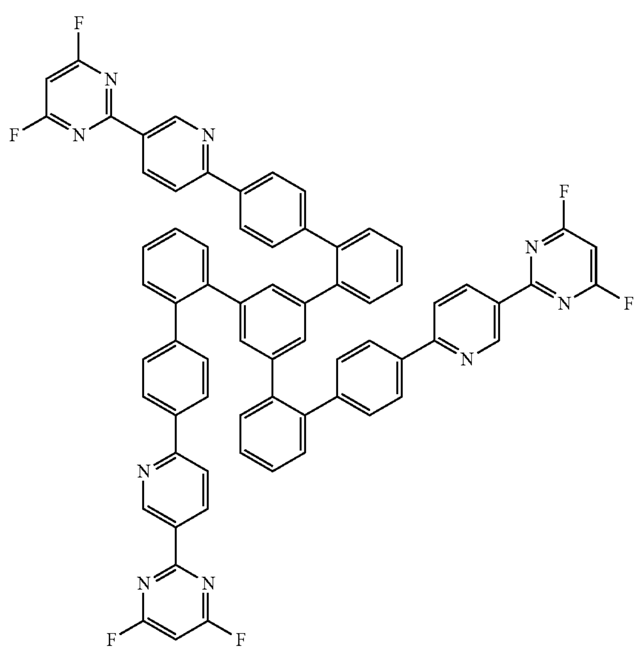 [SMILES: Fc1cc(F)nc(-c2ccc(-c3ccc(-c4ccccc4-c4cc(-c5ccccc5-c5ccc(-c6ccc(-c7nc(F)cc(F)n7)cn6)cc5)cc(-c5ccccc5-c5ccc(-c6ccc(-c7nc(F)cc(F)n7)cn6)cc5)c4)cc3)nc2)n1]<br>S1126<br>n-butanol | 68% |

-continued
| Ex. | Product/ synthon/ extractant/purification | Yield |
|---|---|---|
| L1027 | 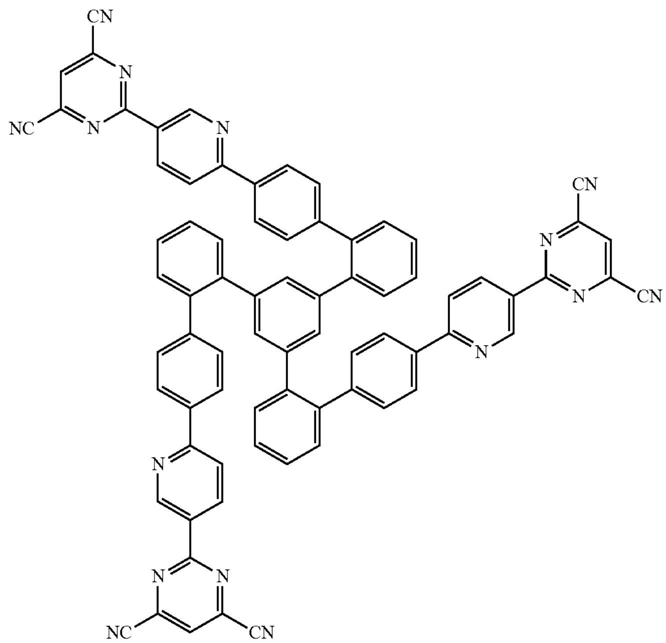 [SMILES: N#Cc1cc(C#N)nc(-c2ccc(-c3ccc(-c4ccccc4-c4cc(-c5ccccc5-c5ccc(-c6ccc(-c7nc(C#N)cc(C#N)n7)cn6)cc5)cc(-c5ccccc5-c5ccc(-c6ccc(-c7nc(C#N)cc(C#N)n7)cn6)cc5)c4)cc3)nc2)n1] S1127 acetonitrile | 70% |
| L1028 | 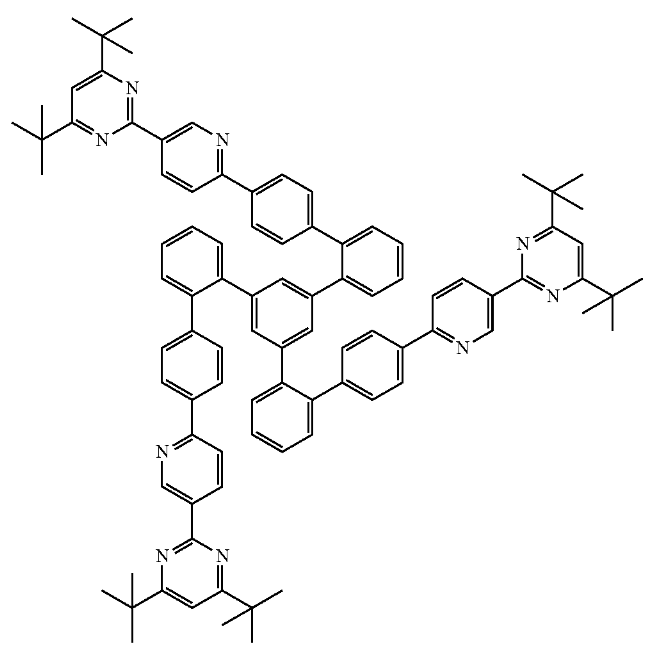 [SMILES: CC(C)(C)c1cc(C(C)(C)C)nc(-c2ccc(-c3ccc(-c4ccccc4-c4cc(-c5ccccc5-c5ccc(-c6ccc(-c7nc(C(C)(C)C)cc(C(C)(C)C)n7)cn6)cc5)cc(-c5ccccc5-c5ccc(-c6ccc(-c7nc(C(C)(C)C)cc(C(C)(C)C)n7)cn6)cc5)c4)cc3)nc2)n1] S1128 chromatography | 75% |

-continued
| Ex. | Product/<br>synthon/<br>extractant/purification | Yield |
|---|---|---|
| L1029 | 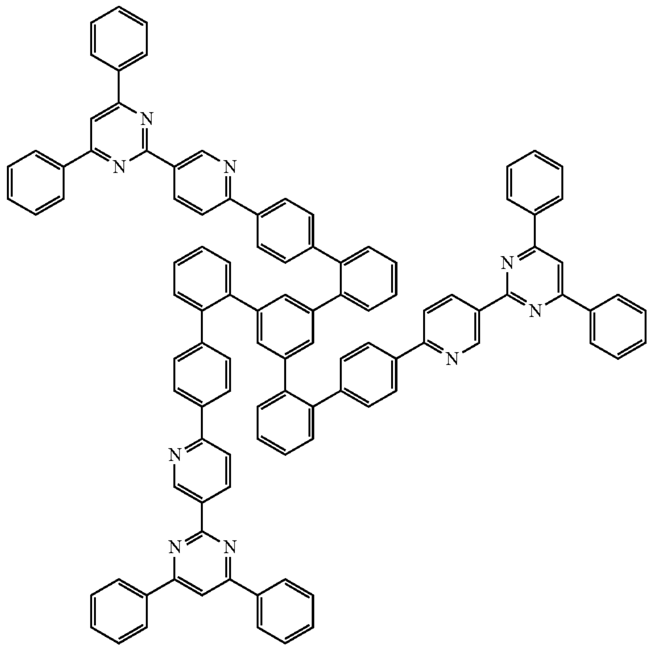 [SMILES: c1ccc(-c2cc(-c3ccccc3)nc(-c3ccc(-c4ccc(-c5ccccc5-c5cc(-c6ccccc6-c6ccc(-c7ccc(-c8nc(-c9ccccc9)cc(-c9ccccc9)n8)cn7)cc6)cc(-c6ccccc6-c6ccc(-c7ccc(-c8nc(-c9ccccc9)cc(-c9ccccc9)n8)cn7)cc6)c5)cc4)nc3)n2)cc1]<br>S1129<br>o-xylene | 80% |
| L1030 | 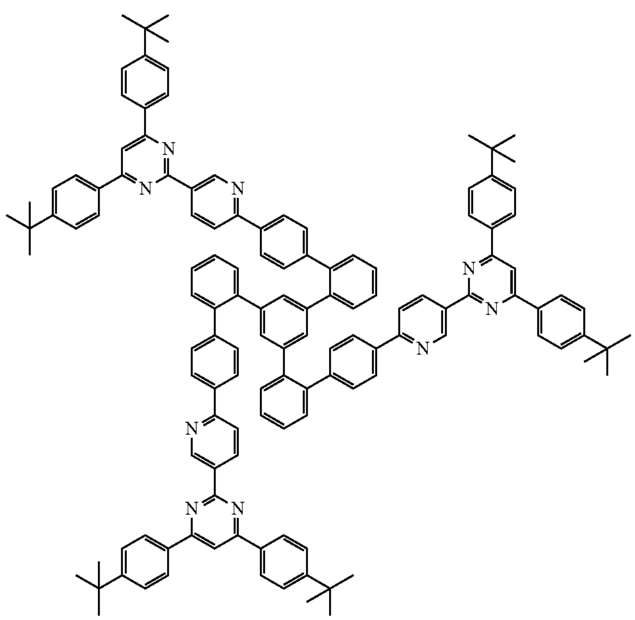 [SMILES: CC(C)(C)c1ccc(-c2cc(-c3ccc(C(C)(C)C)cc3)nc(-c3ccc(-c4ccc(-c5ccccc5-c5cc(-c6ccccc6-c6ccc(-c7ccc(-c8nc(-c9ccc(C(C)(C)C)cc9)cc(-c9ccc(C(C)(C)C)cc9)n8)cn7)cc6)cc(-c6ccccc6-c6ccc(-c7ccc(-c8nc(-c9ccc(C(C)(C)C)cc9)cc(-c9ccc(C(C)(C)C)cc9)n8)cn7)cc6)c5)cc4)nc3)n2)cc1]<br>S1130<br>chromatography | 79% |

-continued
| Ex. | Product/ synthon/ extractant/purification | Yield |
|---|---|---|
| L1031 | 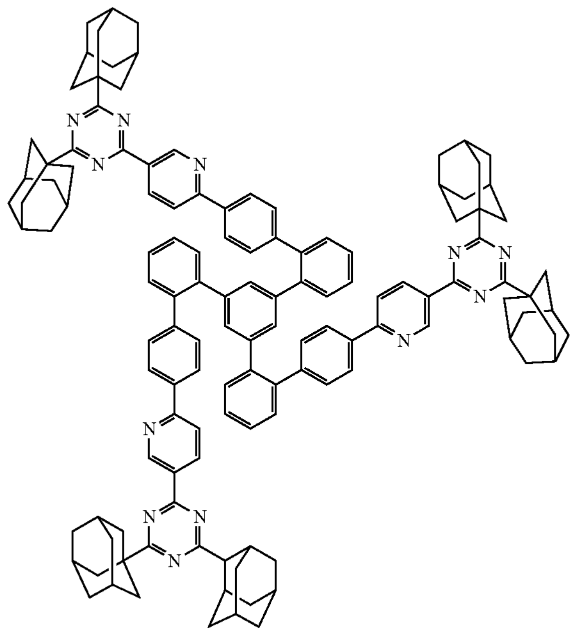 [SMILES: c1ccc(-c2cc(-c3ccccc3-c3ccc(-c4ccc(-c5nc(C67CC8CC(CC(C8)C6)C7)nc(C67CC8CC(CC(C8)C6)C7)n5)cn4)cc3)cc(-c3ccccc3-c3ccc(-c4ccc(-c5nc(C67CC8CC(CC(C8)C6)C7)nc(C67CC8CC(CC(C8)C6)C7)n5)cn4)cc3)c2)c(-c2ccc(-c3ccc(-c4nc(C5C6CC7CC(C6)CC5C7)nc(C56CC7CC(CC(C7)C5)C6)n4)cn3)cc2)c1] S1131 ethyl acetate | 72% |
| L1032 | 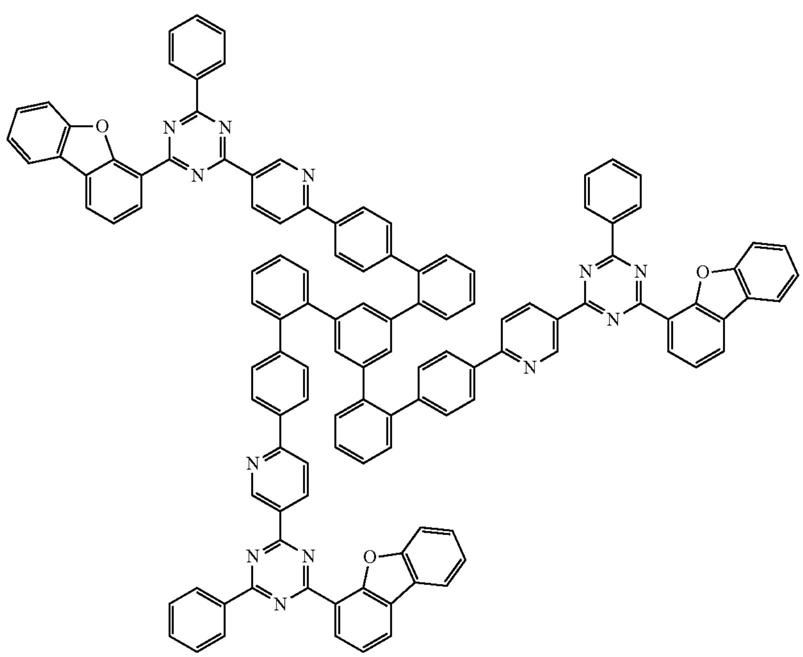 [SMILES: c1ccc(-c2nc(-c3ccc(-c4ccc(-c5ccccc5-c5cc(-c6ccccc6-c6ccc(-c7ccc(-c8nc(-c9ccccc9)nc(-c9cccc%10c9oc9ccccc9%10)n8)cn7)cc6)cc(-c6ccccc6-c6ccc(-c7ccc(-c8nc(-c9ccccc9)nc(-c9cccc%10c9oc9ccccc9%10)n8)cn7)cc6)c5)cc4)nc3)nc(-c3cccc4c3oc3ccccc34)n2)cc1] S1132 toluene | 74% |

-continued
| Ex. | Product/ synthon/ extractant/purification | Yield |
|---|---|---|
| L1033 | 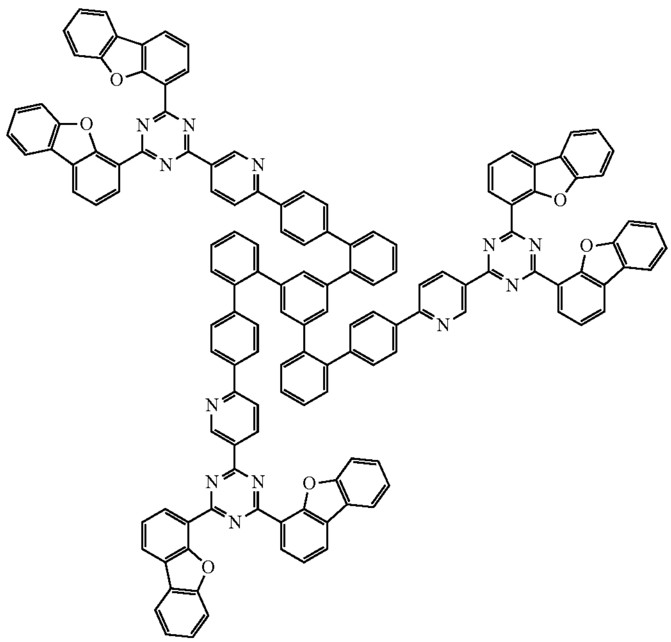 [SMILES: c1ccc(-c2cc(-c3ccccc3-c3ccc(-c4ccc(-c5nc(-c6cccc7c6oc6ccccc67)nc(-c6cccc7c6oc6ccccc67)n5)cn4)cc3)cc(-c3ccccc3-c3ccc(-c4ccc(-c5nc(-c6cccc7c6oc6ccccc67)nc(-c6cccc7c6oc6ccccc67)n5)cn4)cc3)c2)c(-c2ccc(-c3ccc(-c4nc(-c5cccc6c5oc5ccccc56)nc(-c5cccc6c5oc5ccccc56)n4)cn3)cc2)c1] S1133 o-xylene | 82% |
| L1034 | 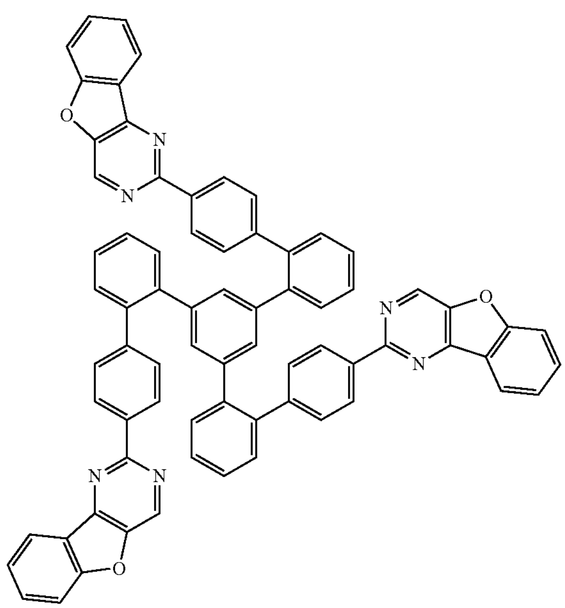 [SMILES: c1ccc(-c2cc(-c3ccccc3-c3ccc(-c4ncc5oc6ccccc6c5n4)cc3)cc(-c3ccccc3-c3ccc(-c4ncc5oc6ccccc6c5n4)cc3)c2)c(-c2ccc(-c3ncc4oc5ccccc5c4n3)cc2)c1] S1134 toluene | 76% |

-continued
| Ex. | Product/ synthon/ extractant/purification | Yield |
|---|---|---|
| L1036 | 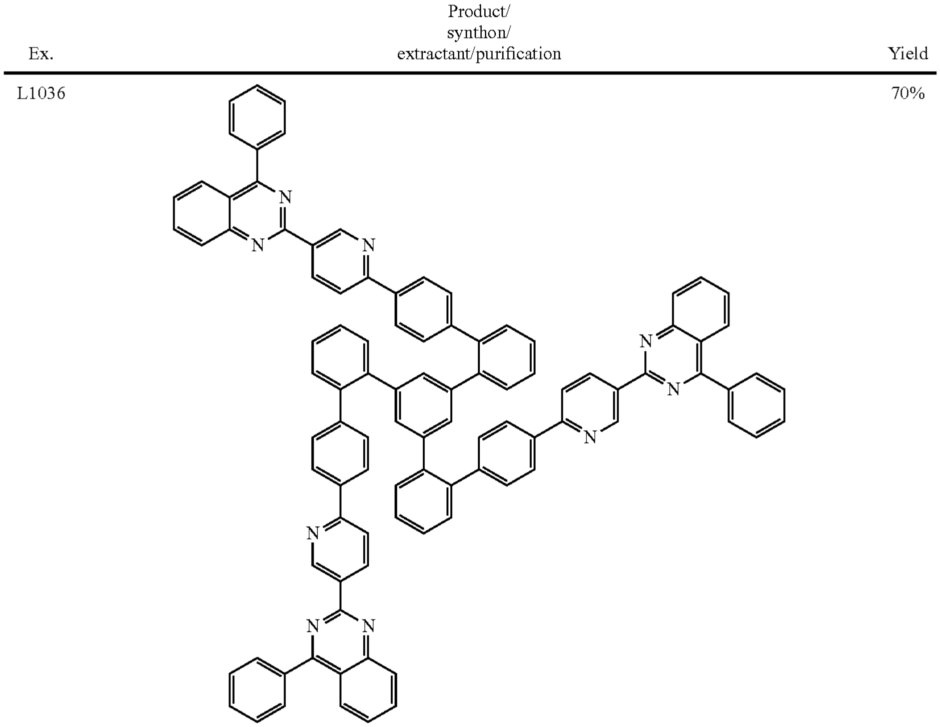 S1136 toluene | 70% |
| L1037 | 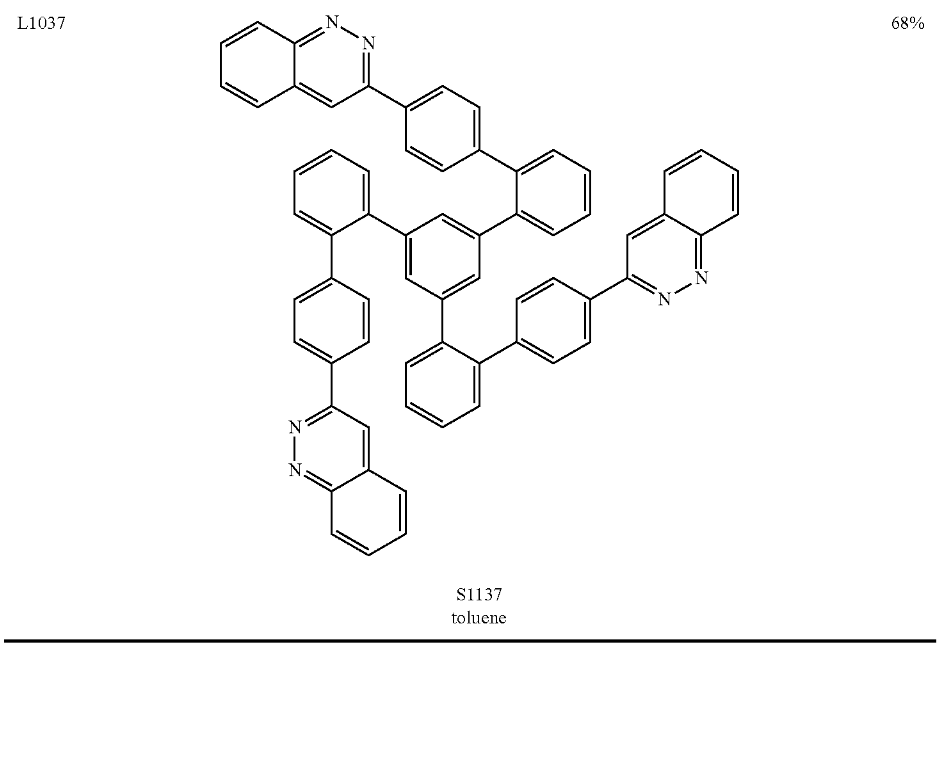 S1137 toluene | 68% |

In an analogous manner, it is possible to prepare the following ligands:

| Ex. | Boronic ester | Bromide | Product | Yield |
|---|---|---|---|---|
| L1035 | 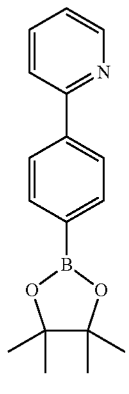 [908350-80-1] | 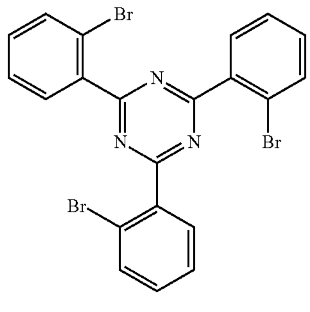 [SMILES: Brc1ccccc1-c1nc(-c2ccccc2Br)nc(-c2ccccc2Br)n1] [1690315-37-7] | 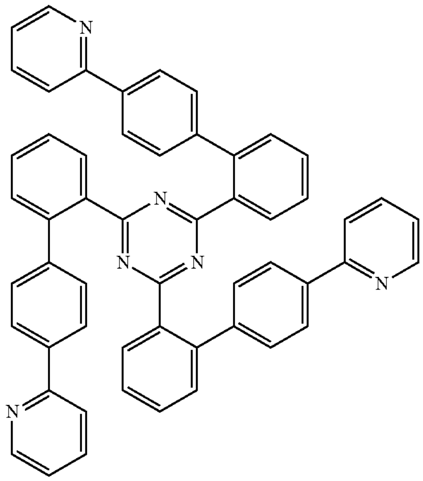 [SMILES: c1ccc(-c2ccc(-c3ccccc3-c3nc(-c4ccccc4-c4ccc(-c5ccccn5)cc4)nc(-c4ccccc4-c4ccc(-c5ccccn5)cc4)n3)cc2)nc1] | 70% |

F: Synthesis of the Metal Complexes—Part 2

Example Ir(L1000)

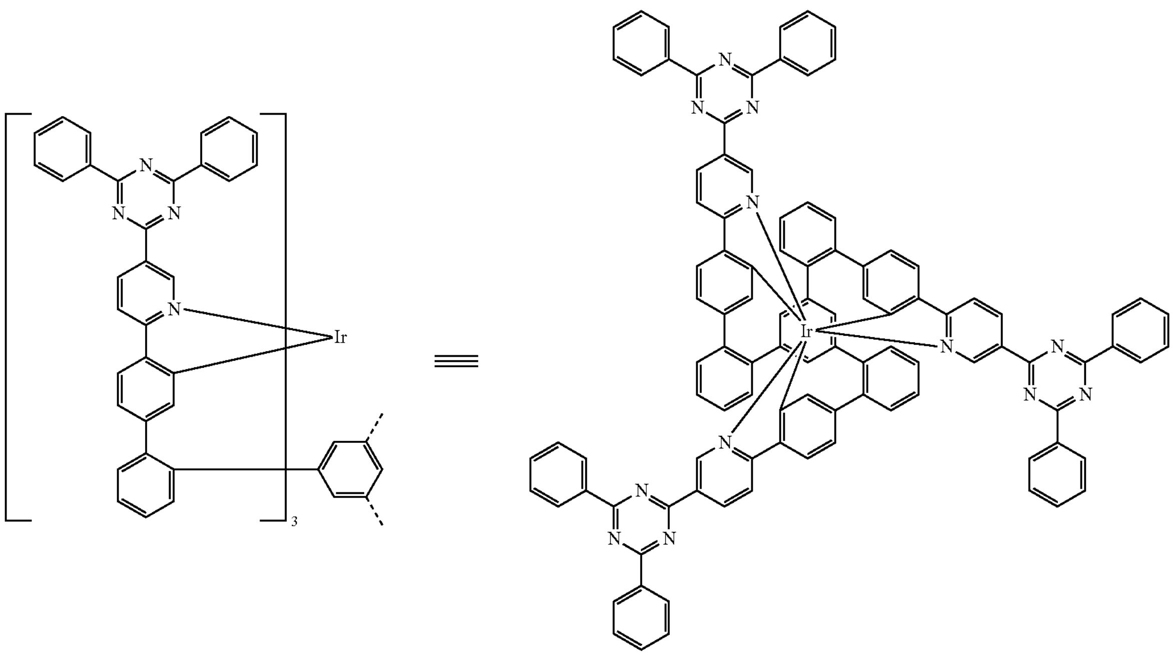

Variant A:

A mixture of 14.6 g (10 mmol) of ligand L1000, 4.9 g (10 mmol) of trisacetylacetonatoiridium(III) [15635-87-7] and 180 g of hydroquinone [123-31-9] is initially charged in a 1000 ml two-neck round-bottomed flask with a glass-sheathed magnetic core. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer core. Then the apparatus is thermally insulated with several loose windings of domestic aluminium foil, the insulation being run up to the middle of the riser tube of the water separator. Then the apparatus is heated rapidly with a heated laboratory stirrer system to 250° C. (reaction temperature), measured with the Pt-100 thermal sensor which dips into the molten stirred reaction mixture. Over the next 2 h (reaction time), the reaction mixture is kept at 250° C., in the course of which a small amount of condensate is distilled off and collects in the water separator. After cooling to 100° C., 500 ml of methanol are cautiously added to the melt cake, and boiled until a red suspension forms. The red suspension thus obtained is filtered through a double-ended frit (P3), and the red solid is washed three times with 100 ml of methanol and then dried under reduced pressure. Crude yield: quantitative. The red product is purified further by continuous hot extraction five times with ethyl acetate (extractant, amount initially charged in each case about 150 ml, extraction thimble: standard Soxhlet thimbles made from cellulose from Whatman) with careful exclusion of air and light. Finally, the product is heat-treated (p about $10^{-6}$ mbar, T up to 250° C.) or sublimed (p about $10^{-6}$ mbar, T 300-400° C.) under high vacuum. Yield: 12.1 g (6.2 mmol), 62%. Purity: >99.9% by HPLC.

It is possible to prepare the following complexes:

| Ex. | Ir complex | Ligand<br>Variant<br>Temperature<br>Reaction time<br>Extractant | Yield |
|---|---|---|---|
| Ir(L1001) | 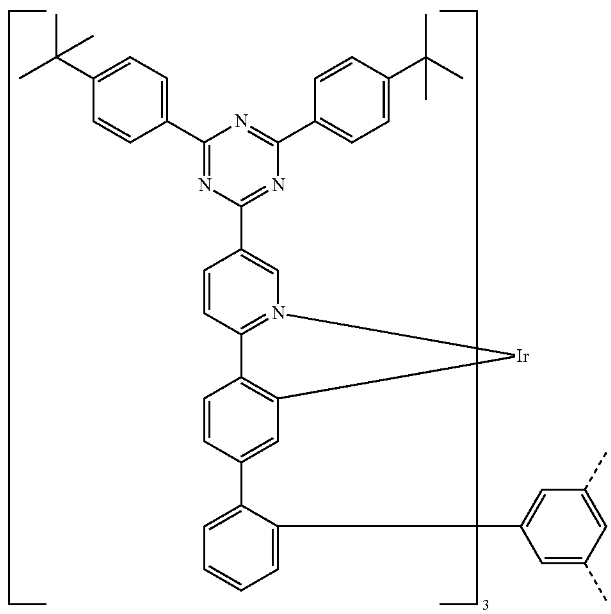 | L1001<br>A<br>250° C.<br>2 h<br>acetonitrile | 65% |
| Ir(L1002) | 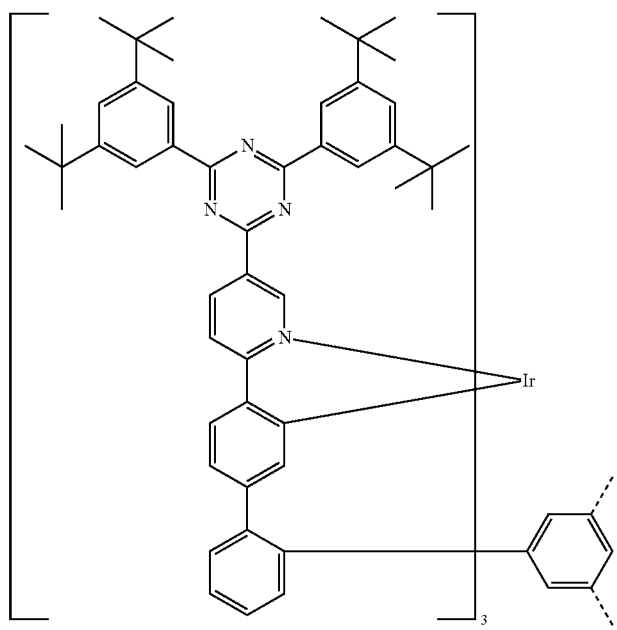 | L1002<br>A<br>250° C.<br>2.5 h<br>acetonitrile/ethyl acetate 1:1 | 70% |

-continued
| Ex. | Ir complex | Ligand Variant Temperature Reaction time Extractant | Yield |
|---|---|---|---|
| Ir(L1003) | 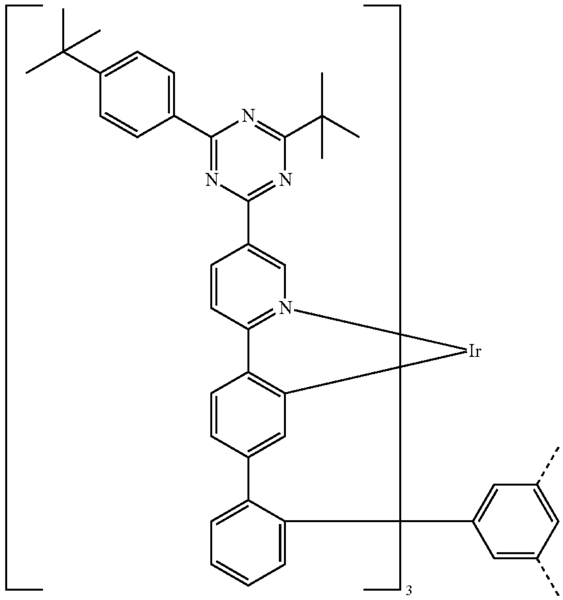 | L1003<br>A<br>250° C.<br>3 h<br>toluene/heptane<br>1:1 | 80% |
| Ir(L1004) | 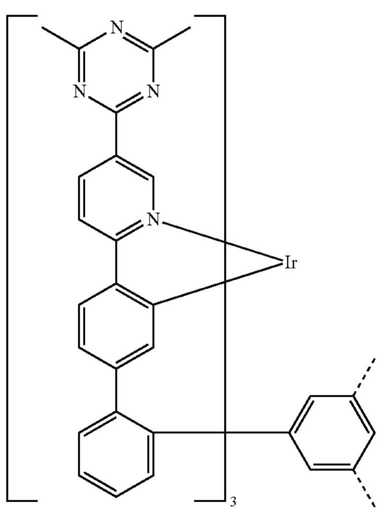 | L1004<br>A<br>250° C.<br>3 h<br>toluene | 68% |

-continued
| Ex. | Ir complex | Ligand<br>Variant<br>Temperature<br>Reaction time<br>Extractant | Yield |
|---|---|---|---|
| Ir(L1005) | 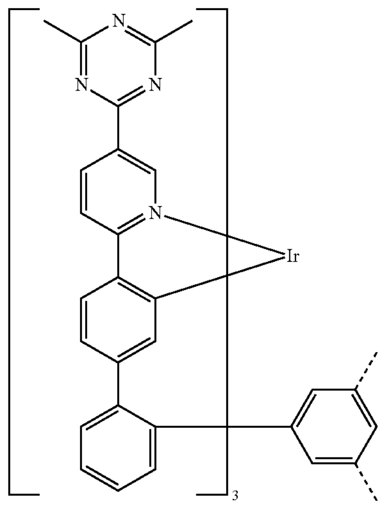 | L1005<br>A<br>250° C.<br>4 h<br>toluene | 75% |
| Ir(L1006) | 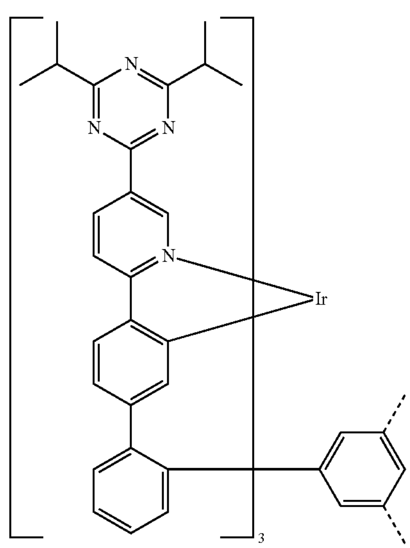 | L1006<br>A<br>250° C.<br>3 h<br>ethyl acetate | 74% |

-continued
| Ex. | Ir complex | Ligand Variant Temperature Reaction time Extractant | Yield |
|---|---|---|---|
| Ir(L1007) | 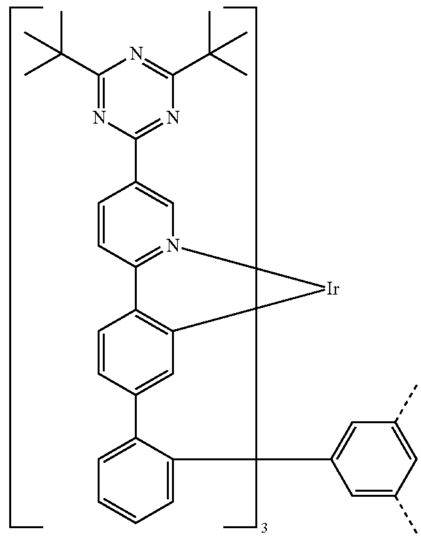 | L1007<br>A<br>250° C.<br>2 h<br>ethyl acetate/ acetonitrile 1:1 | 66% |
| Ir(L1008) | 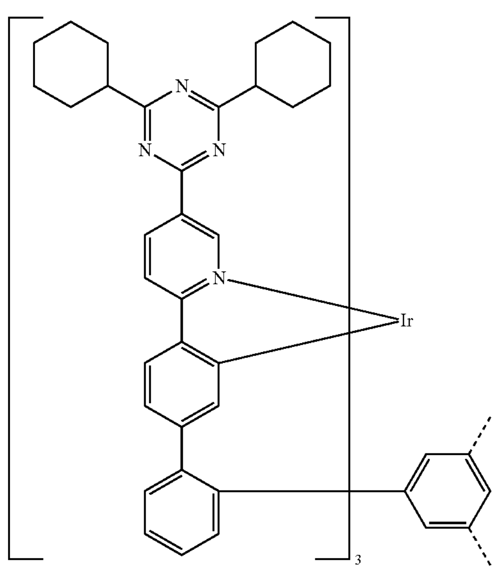 | L1008<br>A<br>250° C.<br>3 h<br>toluene | 67% |

-continued
| Ex. | Ir complex | Ligand Variant Temperature Reaction time Extractant | Yield |
| --- | --- | --- | --- |
| Ir(L1009) | 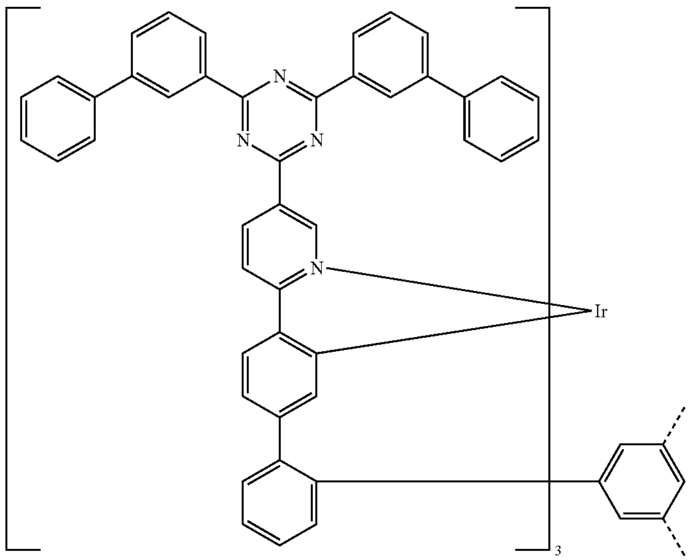 | L1009 A 250° C. 2 h toluene | 60% |
| Ir(L1010) | 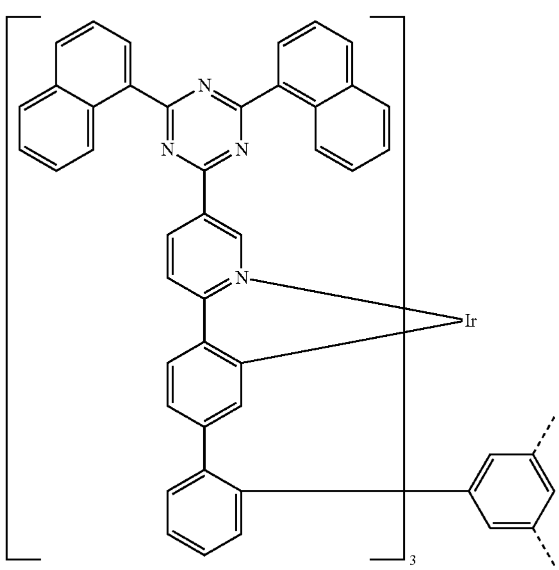 | L1010 A 250° C. 4 h toluene | 58% |

-continued
| Ex. | Ir complex | Ligand Variant Temperature Reaction time Extractant | Yield |
|---|---|---|---|
| Ir(L1011) | 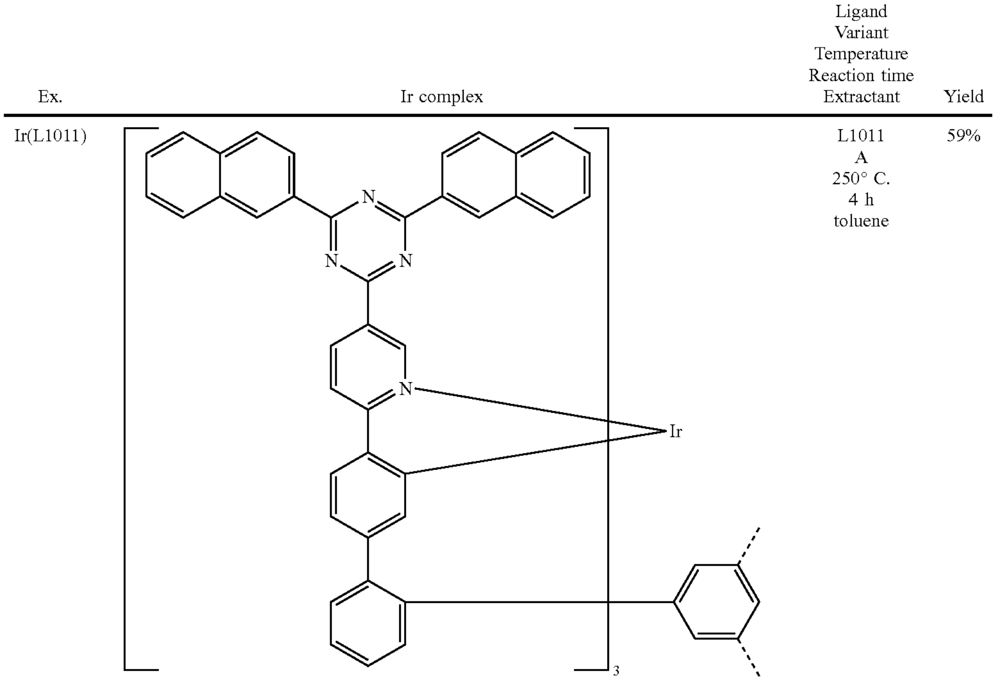 | L1011 A 250° C. 4 h toluene | 59% |
| Ir(L1012) | 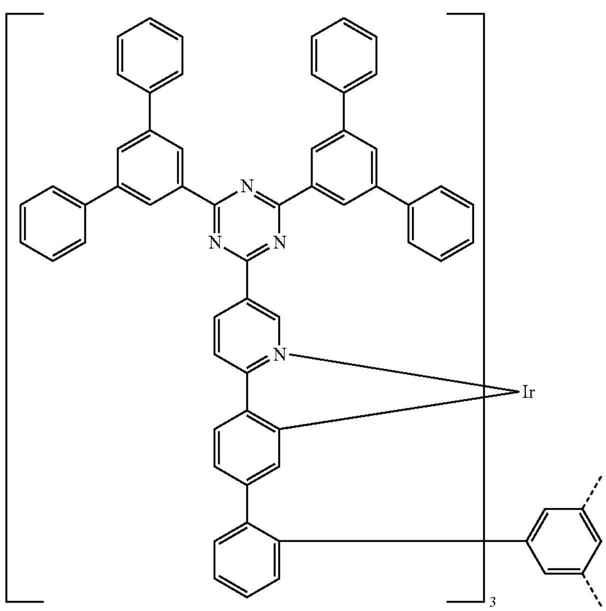 | L1012 A 250° C. 2 h o-xylene | 80% |

-continued
| Ex. | Ir complex | Ligand Variant Temperature Reaction time Extractant | Yield |
|---|---|---|---|
| Ir(L1013) | 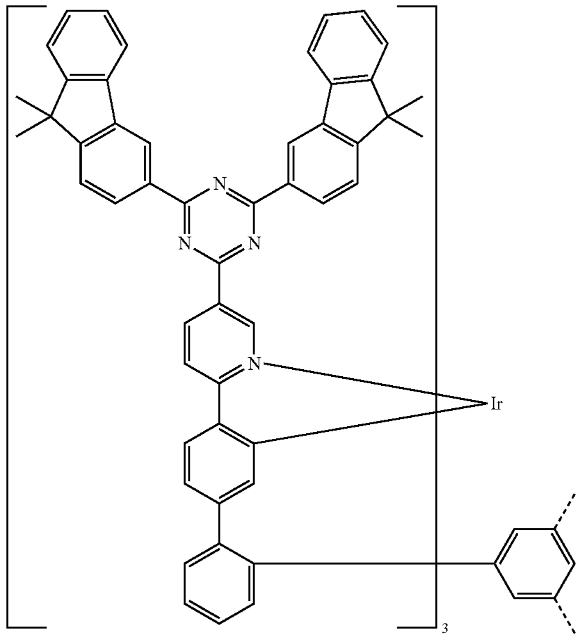 | L1013 A 250° C. 2 h toluene | 76% |
| Ir(L1014) | 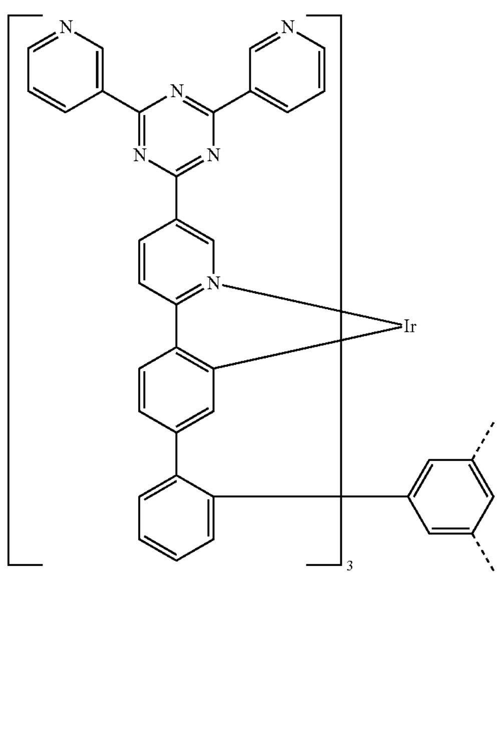 | L1014 A 250° C. 3 h toluene | 50% |

-continued
| Ex. | Ir complex | Ligand<br>Variant<br>Temperature<br>Reaction time<br>Extractant | Yield |
|---|---|---|---|
| Ir(L1015) | 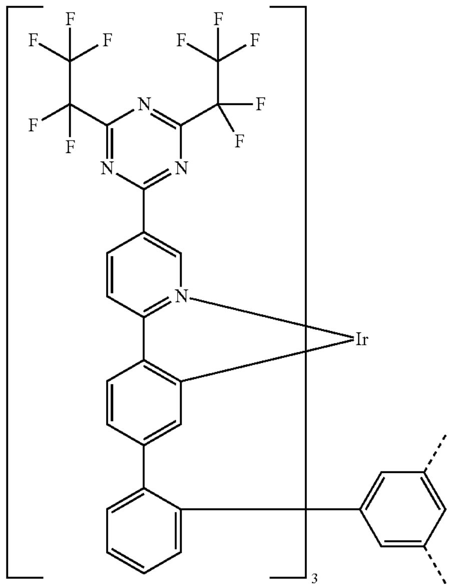 | L1015<br>A<br>250° C.<br>3 h<br>ethyl acetate | 53% |
| Ir(L1016) | 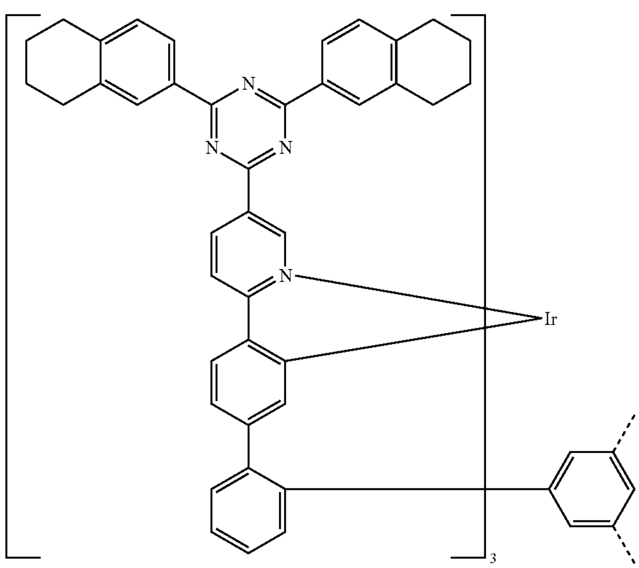 | L1016<br>A<br>250° C.<br>2 h<br>toluene | 70% |

-continued
| Ex. | Ir complex | Ligand Variant Temperature Reaction time Extractant | Yield |
|---|---|---|---|
| Ir(L1017) | 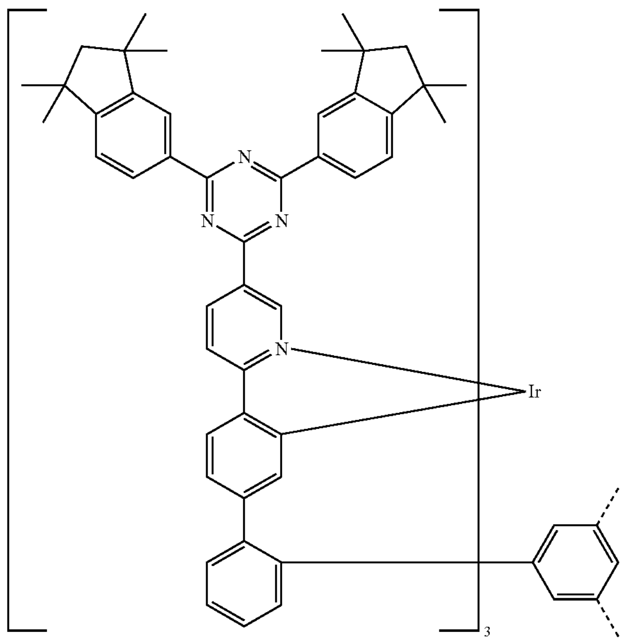 | L1017 A 250° C. 2 h ethyl acetate | 65% |
| Ir(L1018) | 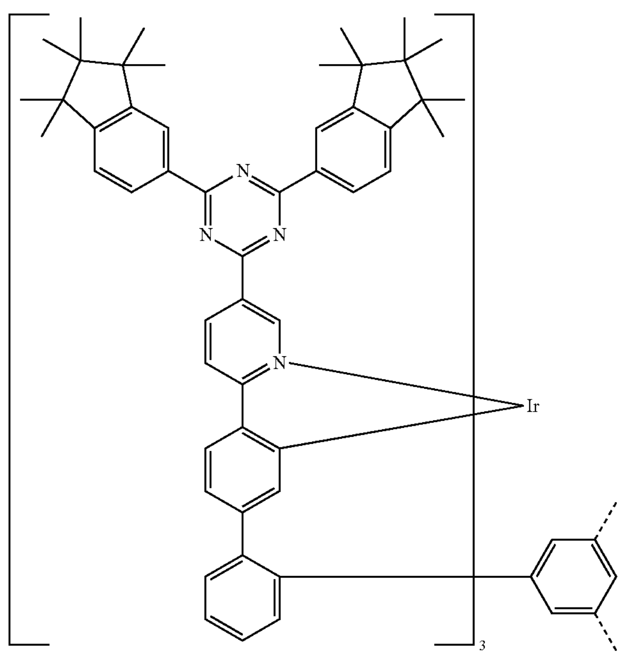 | L1018 A 250° C. 2 h ethyl acetate | 69% |

-continued
| Ex. | Ir complex | Ligand Variant Temperature Reaction time Extractant | Yield |
|---|---|---|---|
| Ir(L1019) | 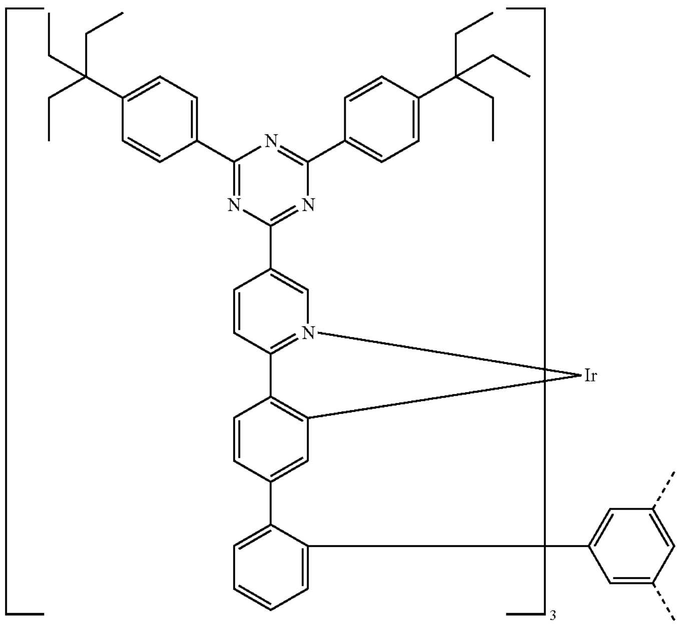 | L1019 A 250° C. 3 h cyclohexane | 72% |
| Ir(L1020) | 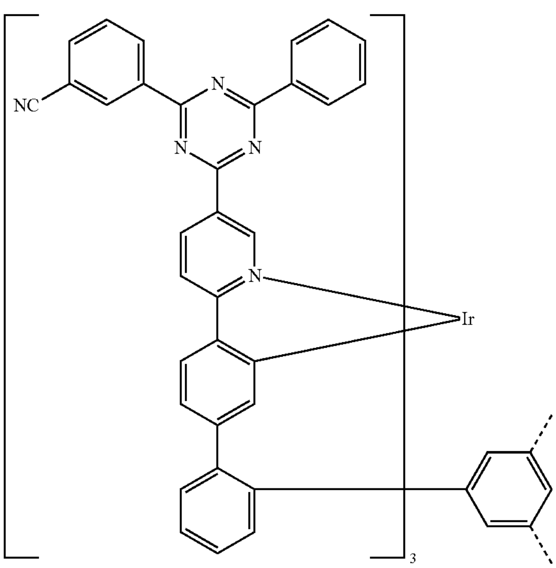 | L1020 A 250° C. 2 h toluene | 14% |

-continued
| Ex. | Ir complex | Ligand Variant Temperature Reaction time Extractant | Yield |
|---|---|---|---|
| Ir(L1021) | 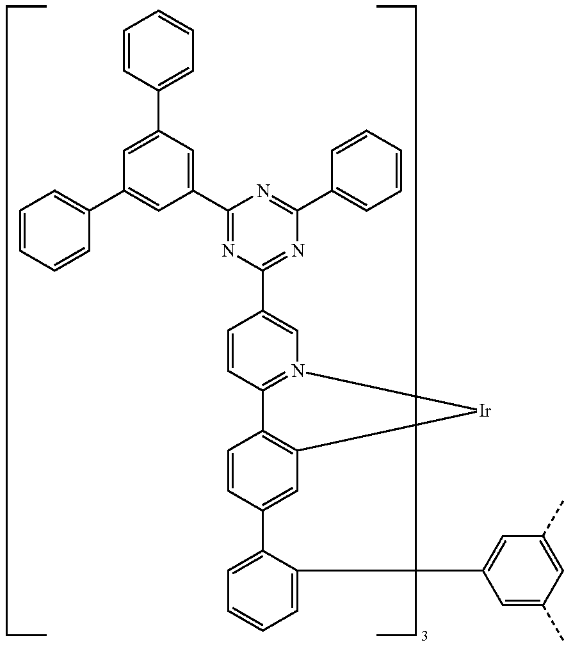 | L1021<br>A<br>250° C.<br>2 h<br>toluene/heptane<br>1:1 | 68% |
| Ir(L1022) | 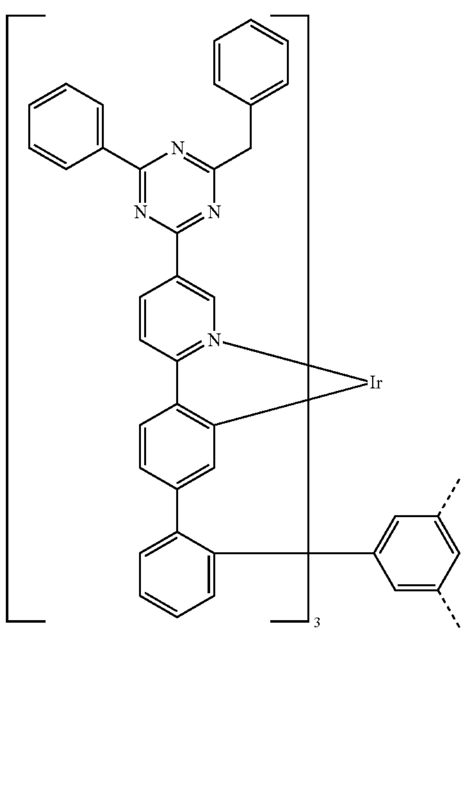 | L1022<br>A<br>250° C.<br>3 h<br>ethyl acetate | 60% |

-continued
| Ex. | Ir complex | Ligand Variant Temperature Reaction time Extractant | Yield |
| --- | --- | --- | --- |
| Ir(L1023) | 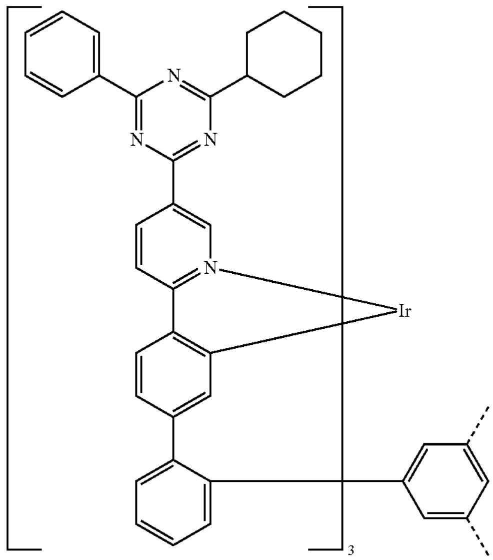 | L1023<br>A<br>250° C.<br>2 h<br>ethyl acetate | 58% |
| Ir(L1024) | 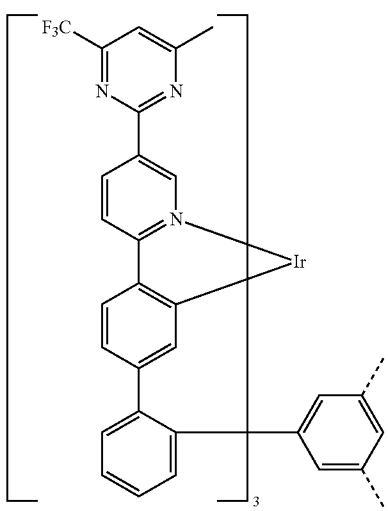 | L1024<br>A<br>250° C.<br>4 h<br>acetonitrile | 64% |

-continued
| Ex. | Ir complex | Ligand<br>Variant<br>Temperature<br>Reaction time<br>Extractant | Yield |
|---|---|---|---|
| Ir(L1025) | 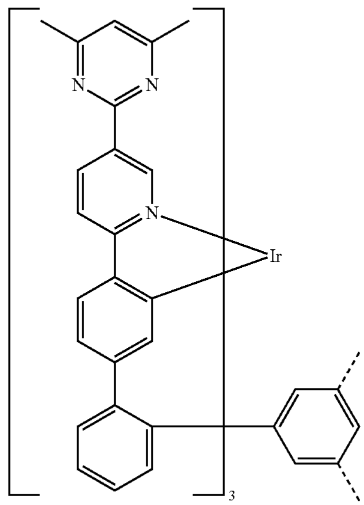 | L1025<br>A<br>250° C.<br>3 h<br>ethyl acetate | 66% |
| Ir(L1026) | 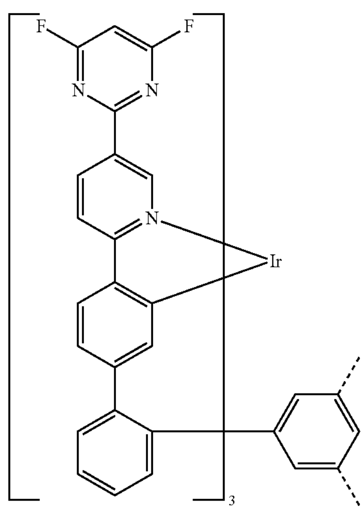 | L1026<br>A<br>250° C.<br>5 h<br>acetonitrile | 62% |
| Ir(L1027) | 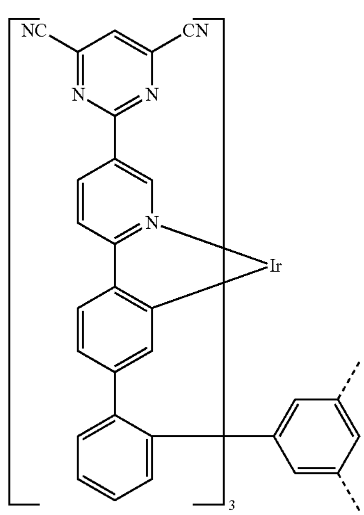 | L1027<br>A<br>250° C.<br>5 h<br>acetonitrile | 16% |

-continued
| Ex. | Ir complex | Ligand Variant Temperature Reaction time Extractant | Yield |
|---|---|---|---|
| Ir(L1028) | 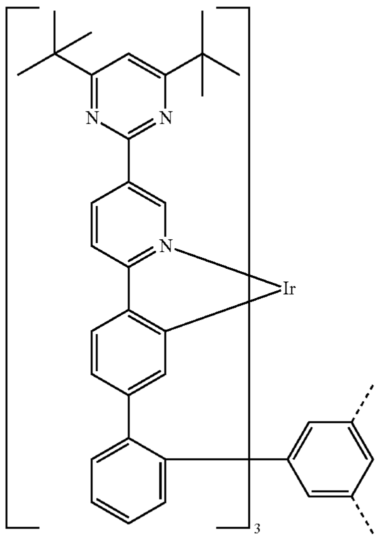 | L1028 A 250° C. 2 h cyclohexane | 75% |
| Ir(L1029) | 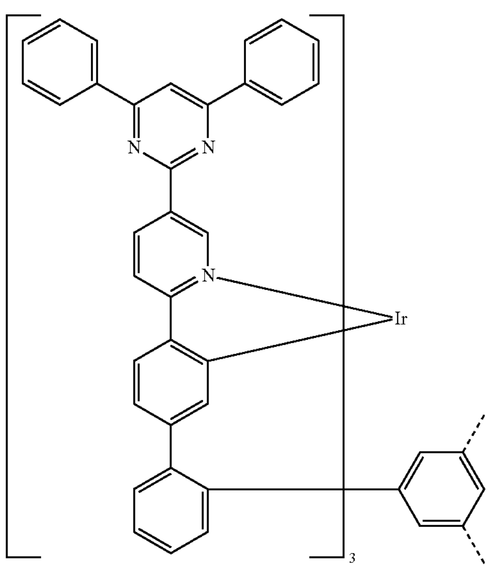 | L1029 A 250° C. 2 h ethyl acetate | 80% |

-continued
| Ex. | Ir complex | Ligand Variant Temperature Reaction time Extractant | Yield |
|---|---|---|---|
| Ir(L1030) | 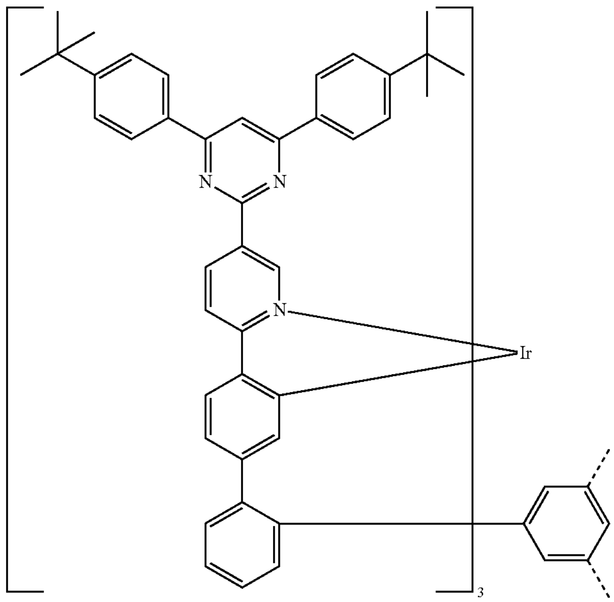 | L1030<br>A<br>250° C.<br>3 h<br>ethyl acetate/ acetonitrile 1:1 | 55% |
| Ir(L1031) | 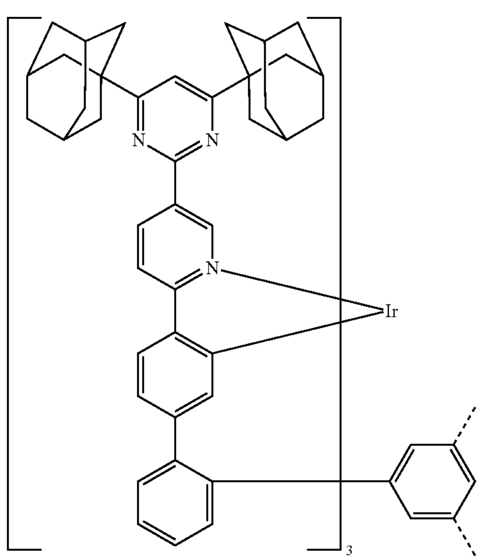 | L1031<br>A<br>250° C.<br>3 h<br>—<br>chromatography | 53% |

-continued
| Ex. | Ir complex | Ligand Variant Temperature Reaction time Extractant | Yield |
|---|---|---|---|
| Ir(L1032) | 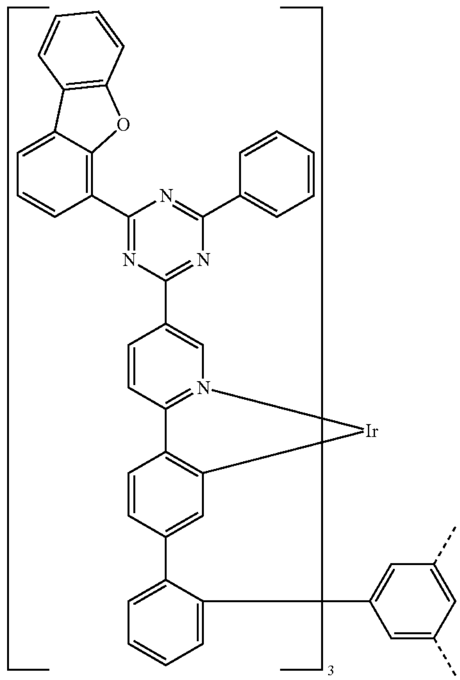 | L1032 A 250° C. 3 h toluene | 74% |
| Ir(L1033) | 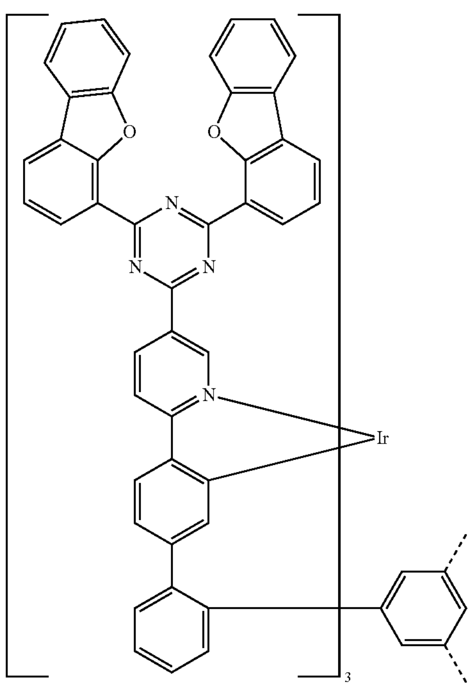 | L1033 A 250° C. 4 h toluene | 70% |

-continued
| Ex. | Ir complex | Ligand Variant Temperature Reaction time Extractant | Yield |
|---|---|---|---|
| Ir(L1034) | 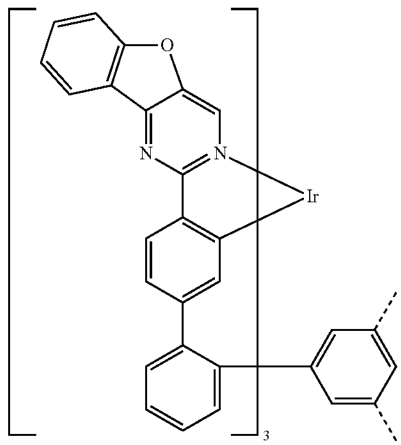 | L1034 A 250° C. 2 h ethyl acetate | 63% |
| Ir(L1035) | 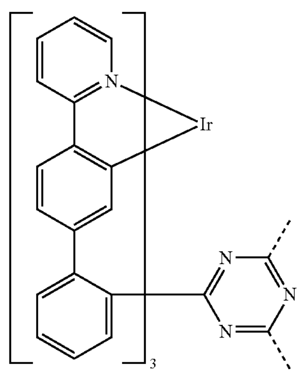 | L1035 A 250° C. 4 h toluene | 55% |
| Ir(L1036) | 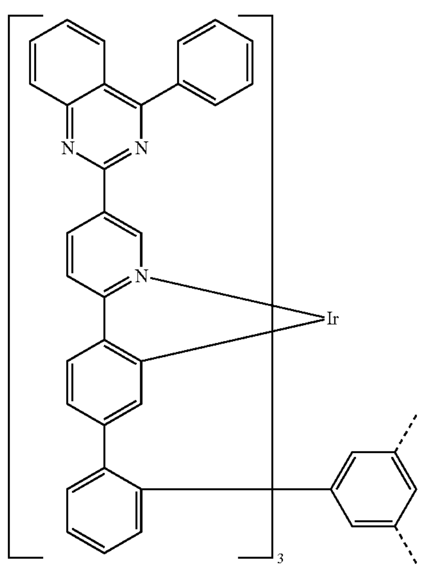 | L1036 A 250° C. 2 h toluene | 60% |

-continued

| Ex. | Ir complex | Ligand Variant Temperature Reaction time Extractant | Yield |
|---|---|---|---|
| Ir(L1037) | 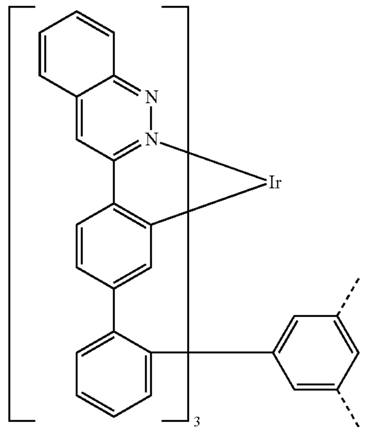 | L1037<br>A<br>225° C.<br>10 h<br>toluene | 45% |

G. Functionalization of the Metal Complexes—Part 2

1) Halogenation of the Metal Complexes:

To a solution or suspension of 10 mmol of a complex bearing A×C-H groups (with A=1, 2, 3) in the para position to the iridium in 500 ml to 2000 ml of dichloromethane according to the solubility of the metal complexes is added, in the dark and with exclusion of air, at −30 to +30° C., A×10.5 mmol of N-halosuccinimide (halogen: Cl, Br, I), and the mixture is stirred for 20 h. Complexes of sparing solubility in DCM may also be converted in other solvents (TCE, THF, DMF, etc.) and at elevated temperature. Subsequently, the solvent is substantially removed under reduced pressure. The residue is extracted by boiling with 100 ml of methanol, and the solids are filtered off with suction, washed three times with 30 ml of methanol and then dried under reduced pressure. This gives the iridium complexes brominated in the para position to the iridium.

Substoichiometric brominations, for example mono- and dibrominations of complexes having 3 C—H groups in the para position to iridium, usually proceed less selectively than the stoichiometric brominations. The crude products of these brominations can be separated by chromatography (CombiFlash Torrent from A. Semrau).

Example Ir(L1000-3Br)

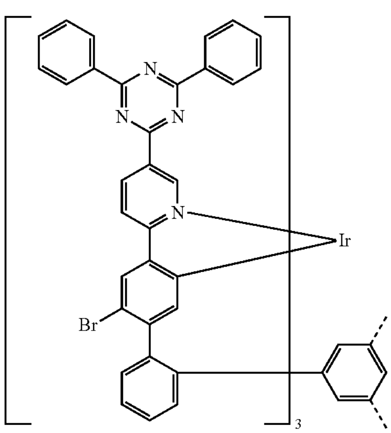

≡

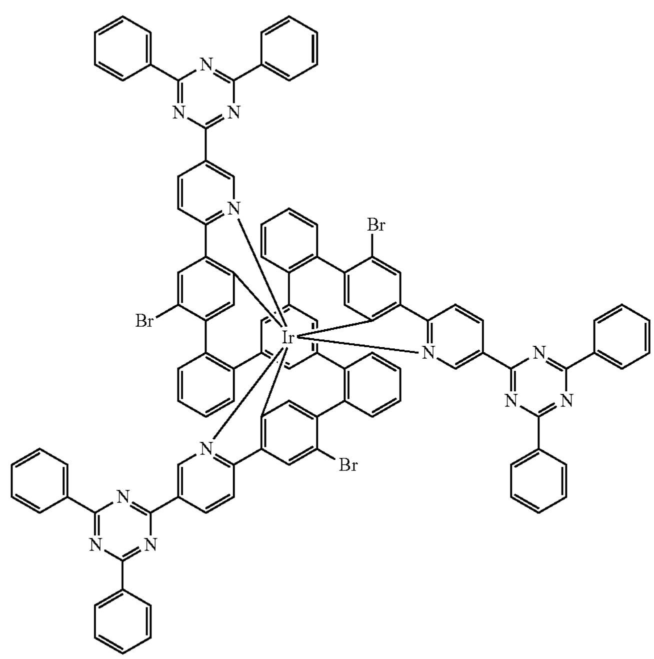

To a suspension, stirred at 0° C., of 24.7 g (15.0 mmol) of Ir(L1000) in 2000 ml of DCM are added 8.8 g (49.5 mmol) of N-bromosuccinimide all at once, and also 0.1 ml of 47% hydrobromic acid, and the mixture is stirred at 0° C. for 2 h and then at room temperature for a further 20 h. After removing about 1900 ml of the DCM under reduced pressure, 150 ml of methanol are added to the red suspension, and the solids are filtered off with suction, washed three times with about 50 ml of methanol and then dried under reduced pressure. Yield: 25.5 g (13.5 mmol), 90%; purity: >99.0% by $^{1}$H NMR.

In an analogous manner, it is possible to prepare the following compounds:

| Ex. | Reactant | Ir complex | Yield |
|---|---|---|---|
| Ir(L1001-3Br) | Ir(L1001) | 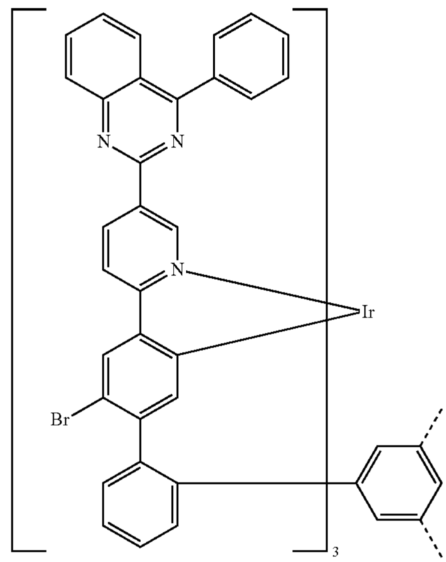 | 81% |
| Ir(L1002-3Br) | Ir(L1002) | 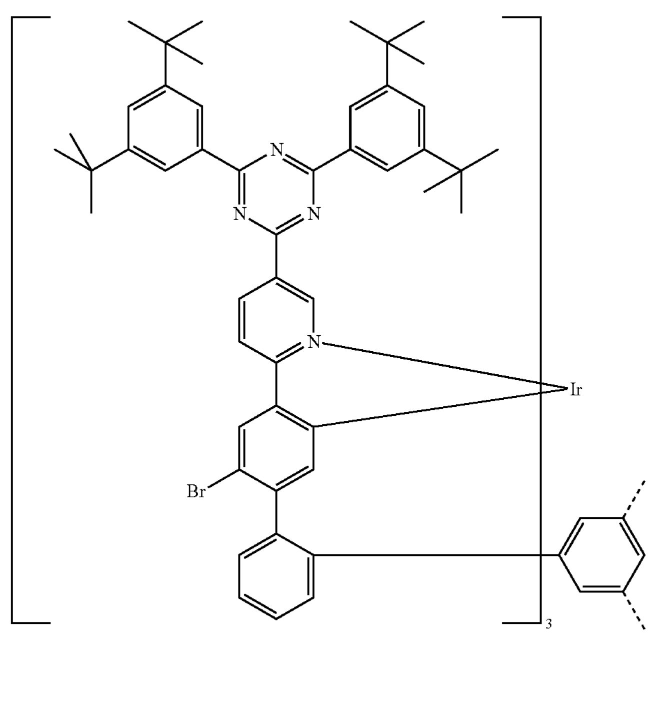 | 80% |

-continued
| Ex. | Reactant | Ir complex | Yield |
| --- | --- | --- | --- |
| Ir(L1003-3Br) | Ir(L1003) | 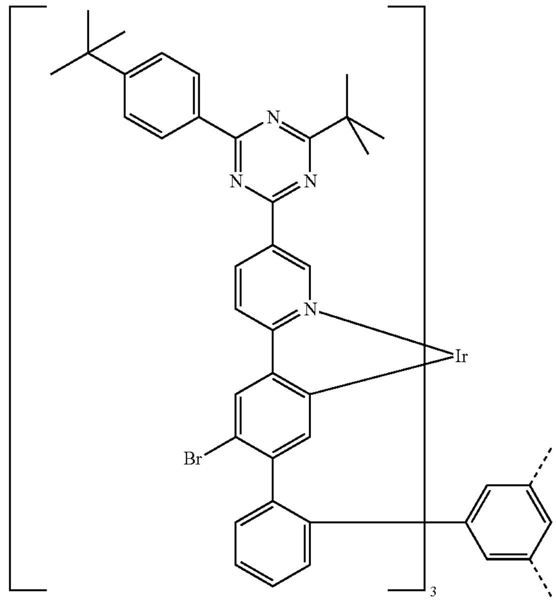 | 86% |
| Ir(L1004-3Br) | Ir(L1004) | 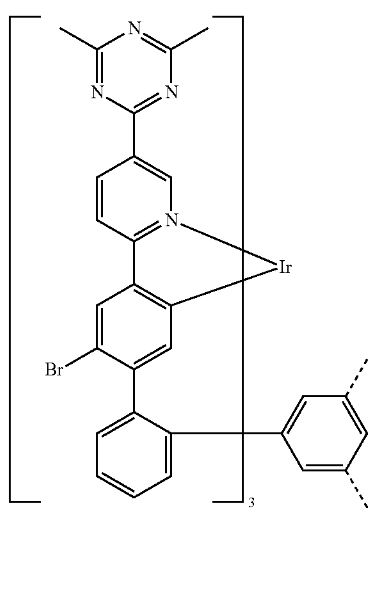 | 72% |

-continued
| Ex. | Reactant | Ir complex | Yield |
|---|---|---|---|
| Ir(L1005-3Br) | Ir(L1005) | 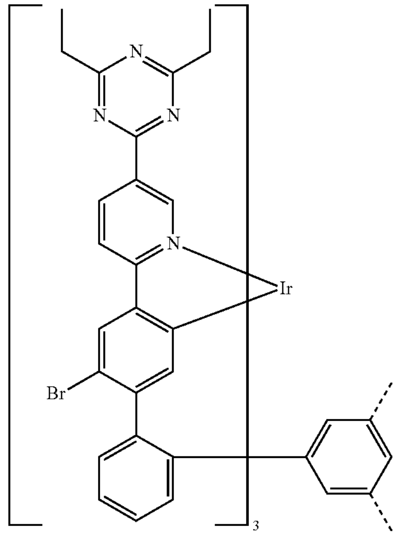 | 79% |
| Ir(L1006-3Br) | Ir(L1006) | 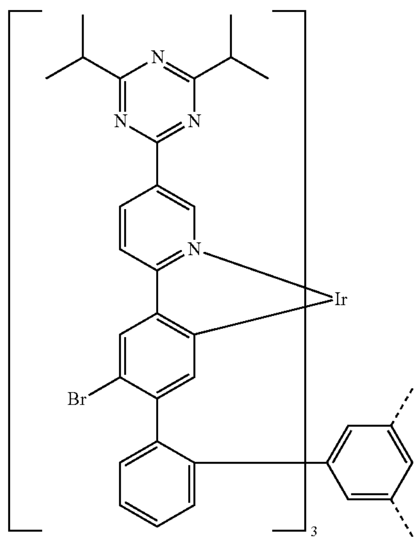 | 77% |
| Ir(L1007-3Br) | Ir(L1007) | 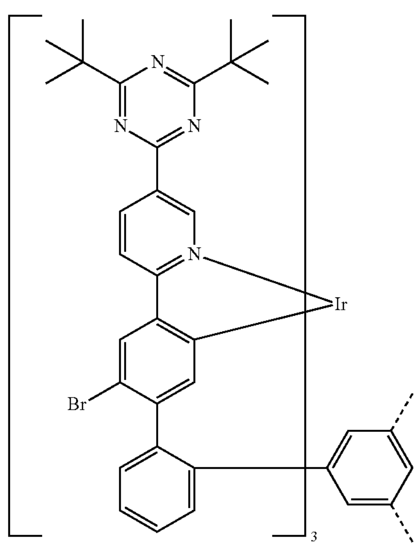 | 84% |

-continued
| Ex. | Reactant | Ir complex | Yield |
|---|---|---|---|
| Ir(L1008-3Br) | Ir(L1008) | 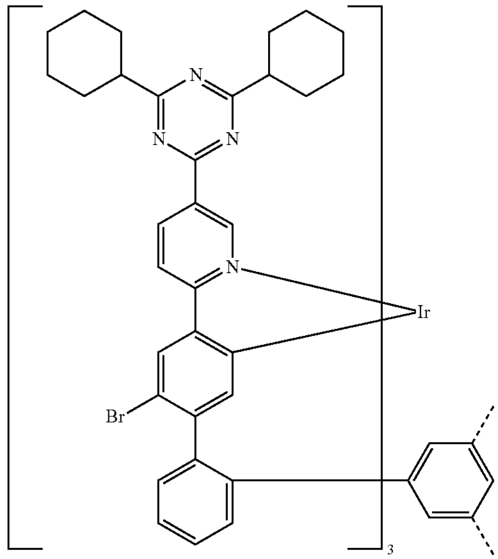 | 89% |
| Ir(L1009-3Br) | Ir(L1009) | 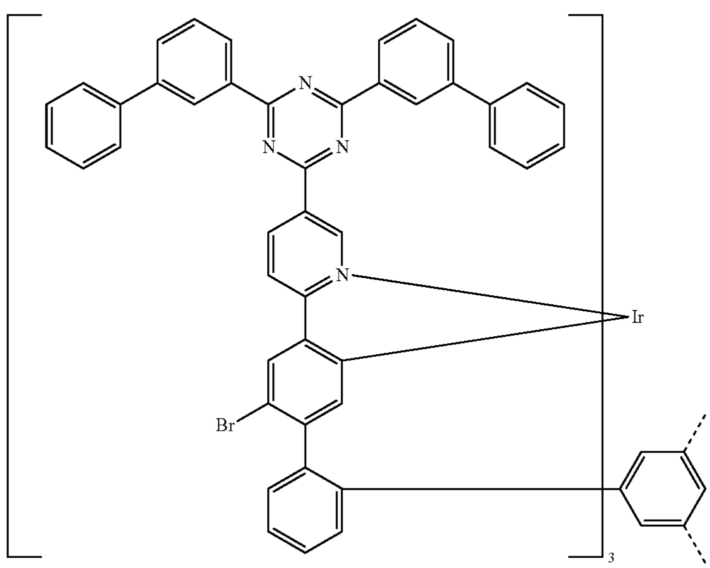 | 85% |

-continued
| Ex. | Reactant | Ir complex | Yield |
| --- | --- | --- | --- |
| Ir(L1010-3Br) | Ir(L1010) | 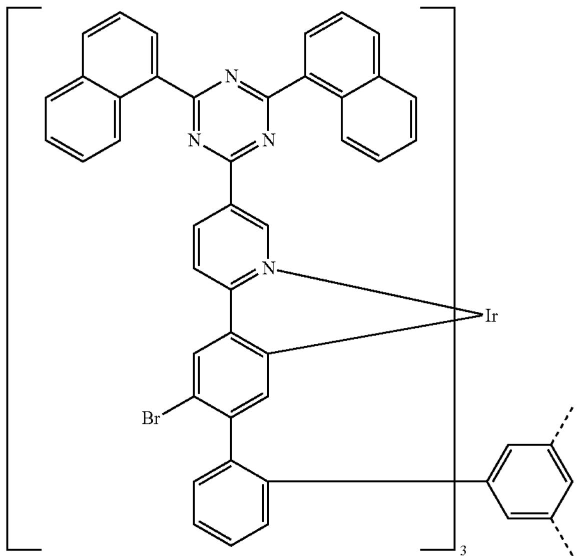 | 78% |
| Ir(L1011-3Br) | Ir(L1011) | 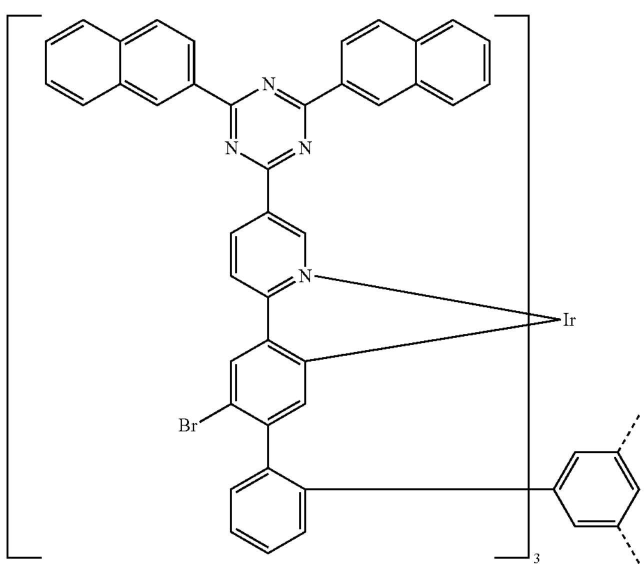 | 81% |

-continued
| Ex. | Reactant | Ir complex | Yield |
|---|---|---|---|
| Ir(L1012-3Br) | Ir(L1012) | 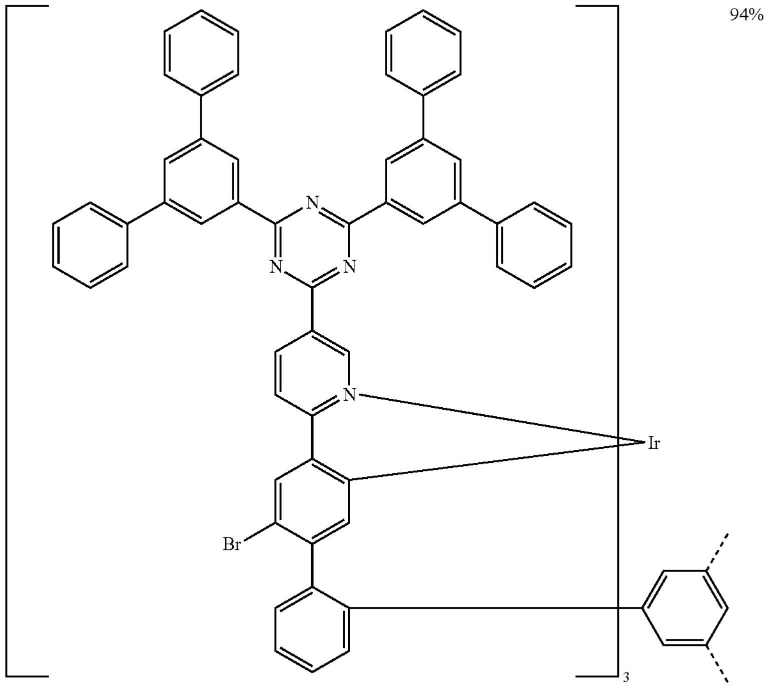 | 94% |
| Ir(L1013-3Br) | Ir(L1013) | 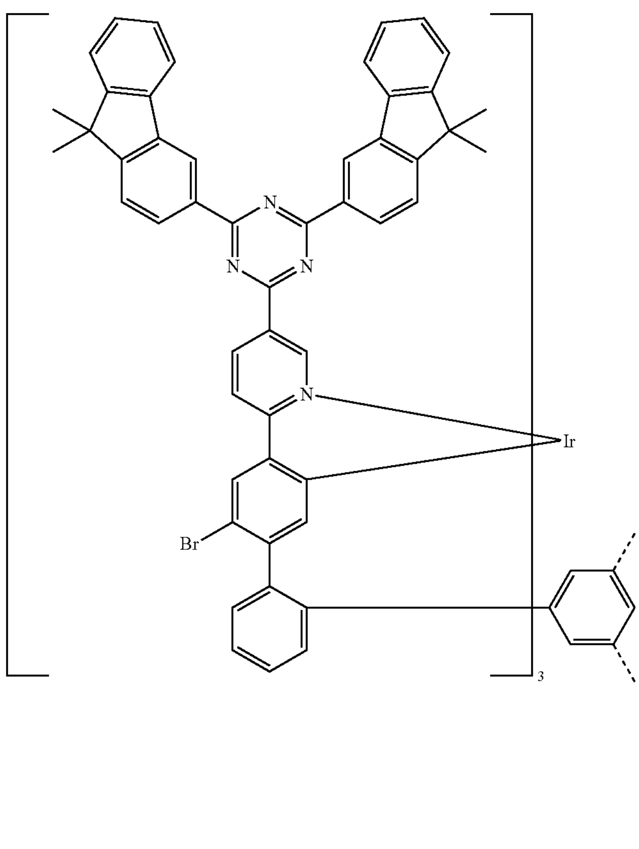 | 96% |

-continued
| Ex. | Reactant | Ir complex | Yield |
|---|---|---|---|
| Ir(L1014-3Br) | Ir(L1014) | 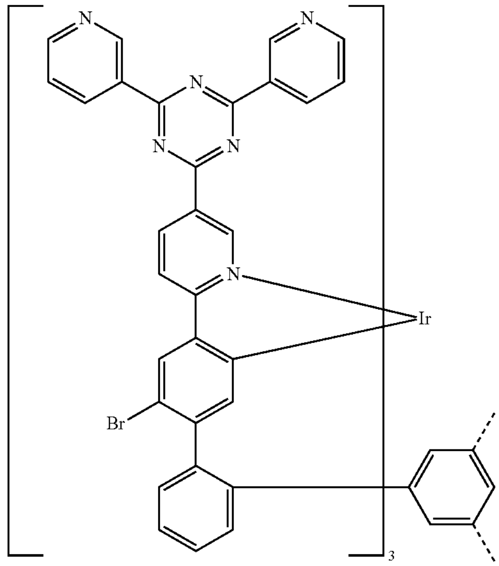 | 71% |
| Ir(L1015-3Br) | Ir(L1015) | 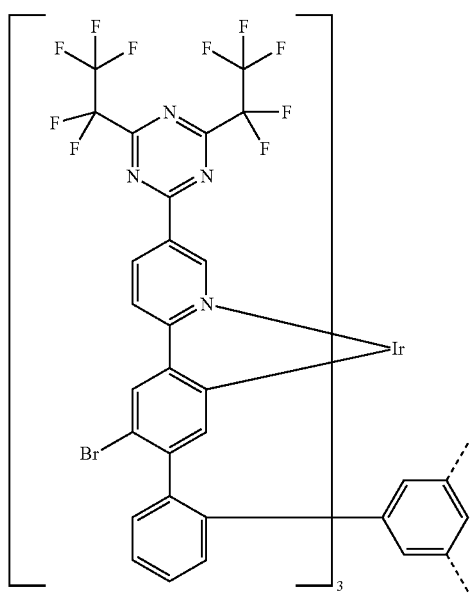 | 75% |

-continued
| Ex. | Reactant | Ir complex | Yield |
|---|---|---|---|
| Ir(L1016-3Br) | Ir(L1016) | 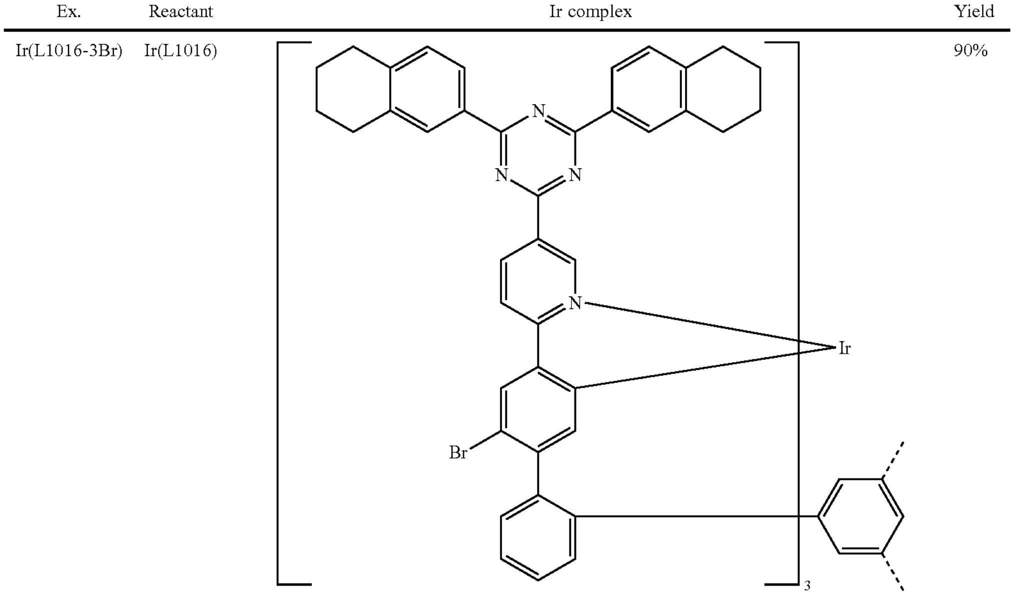 | 90% |
| Ir(L1017-3Br) | Ir(L1017) | 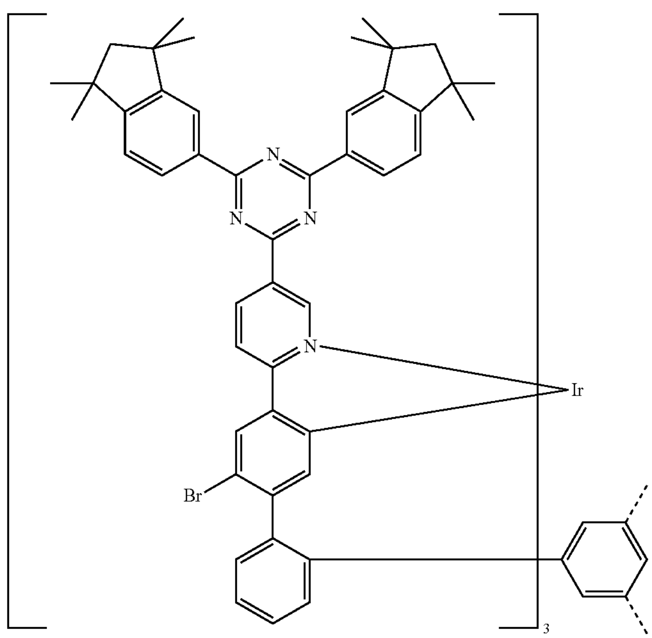 | 82% |

-continued
| Ex. | Reactant | Ir complex | Yield |
|---|---|---|---|
| Ir(L1018-3Br) | Ir(L1018) | 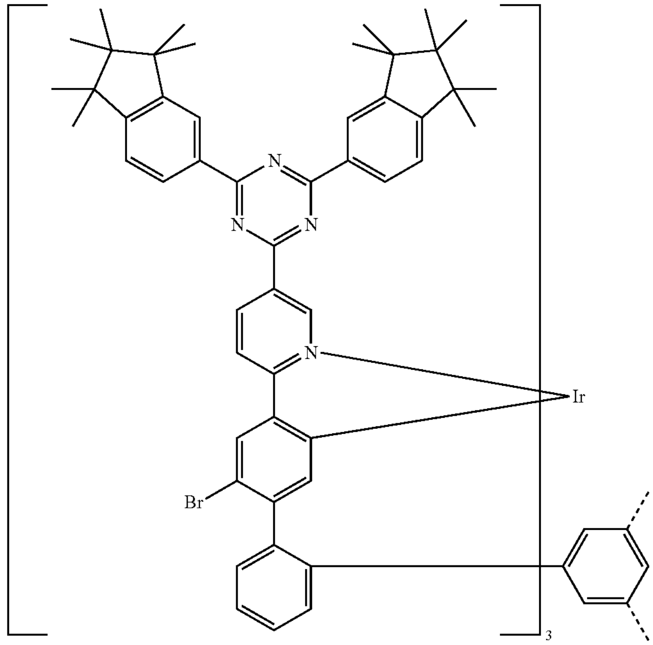 | 80% |
| Ir(L1019-3Br) | Ir(L1019) | 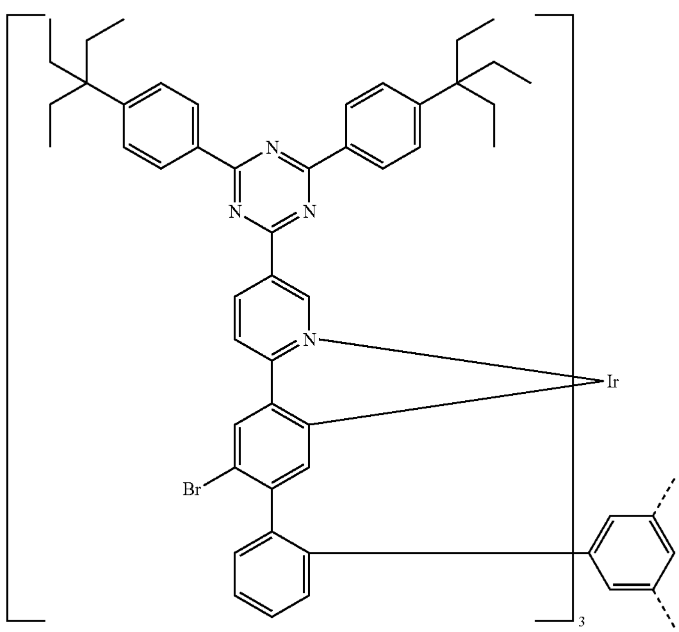 | 80% |

-continued
| Ex. | Reactant | Ir complex | Yield |
|---|---|---|---|
| Ir(L1020-3Br) | Ir(L1020) | 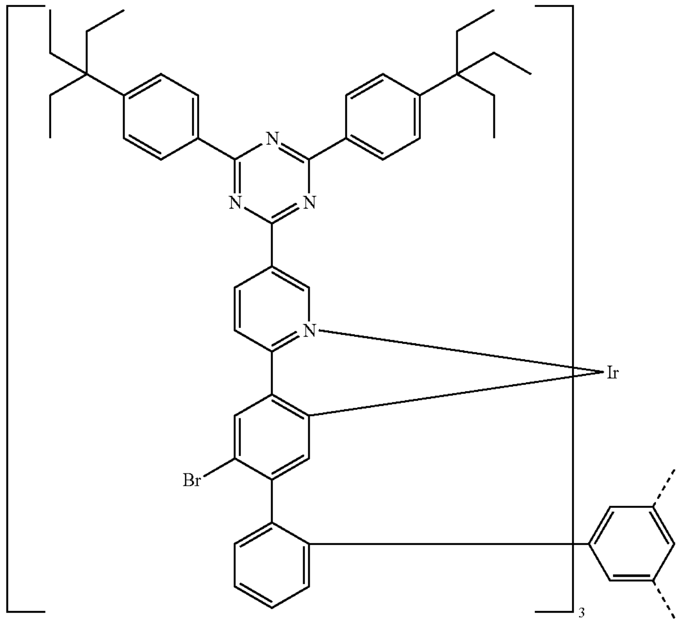 | 85% |
| Ir(L1021-3Br) | Ir(L1021) | 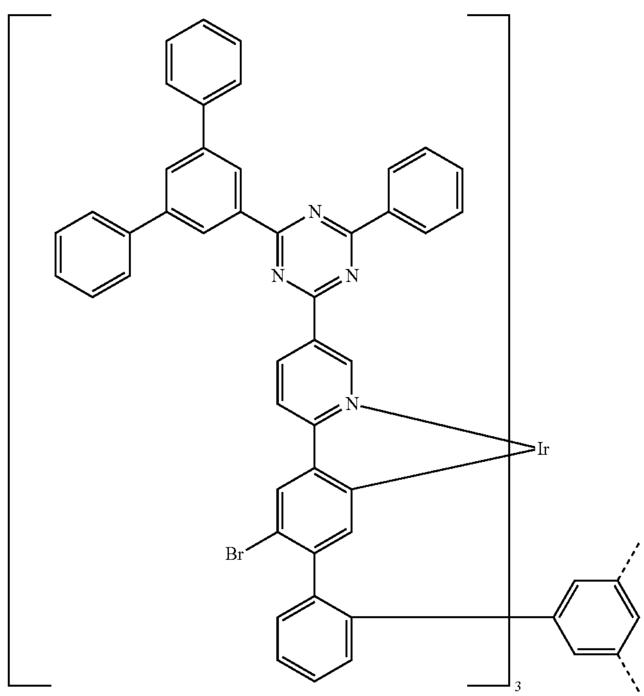 | 87% |

-continued
| Ex. | Reactant | Ir complex | Yield |
|---|---|---|---|
| Ir(L1022-3Br) | Ir(L1022) | 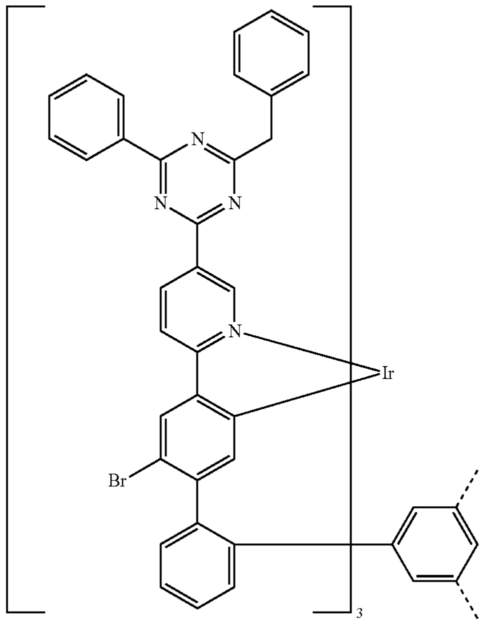 | 93% |
| Ir(L1023-3Br) | Ir(L1023) | 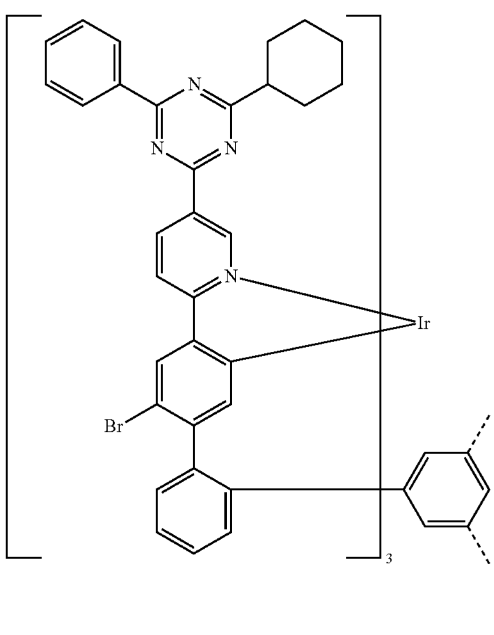 | 90% |

-continued
| Ex. | Reactant | Ir complex | Yield |
| --- | --- | --- | --- |
| Ir(L1024-3Br) | Ir(L1024) | 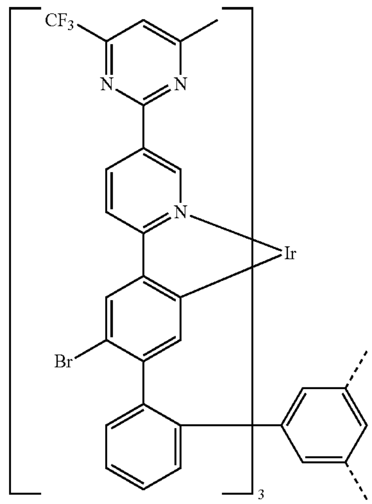 | 82% |
| Ir(L1025-3Br) | Ir(L1025) | 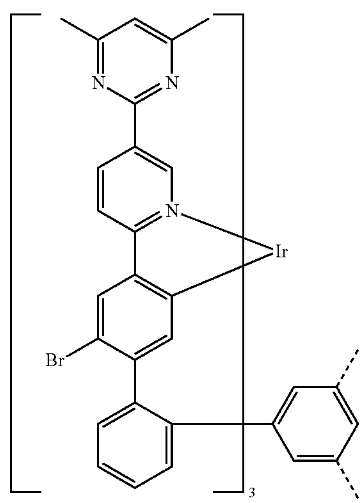 | 88% |
| Ir(L1026-3Br) | Ir(L1026) | 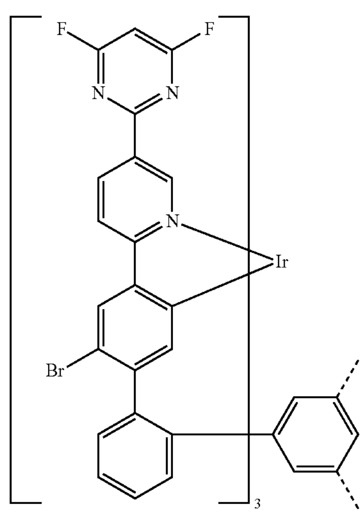 | 76% |

-continued
| Ex. | Reactant | Ir complex | Yield |
| --- | --- | --- | --- |
| Ir(L1027-3Br) | Ir(L1027) | 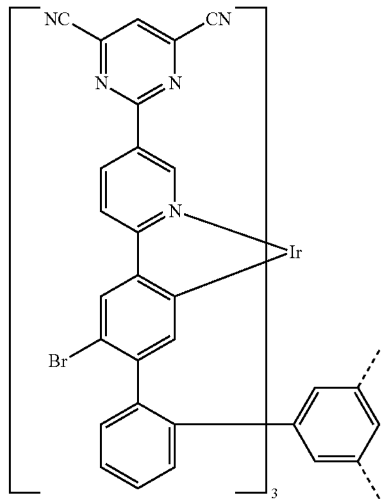 | 78% |
| Ir(L1028-3Br) | Ir(L1028) | 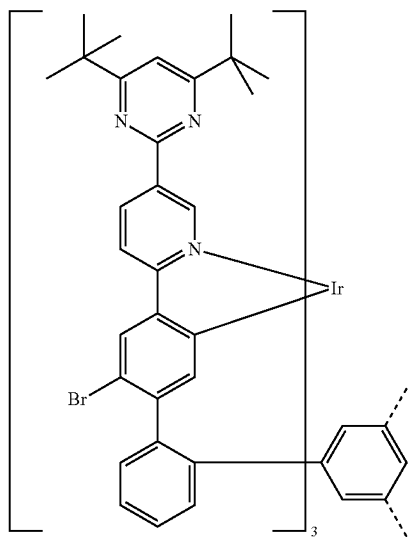 | 85% |
| Ir(L1029-3Br) | Ir(L1029) | 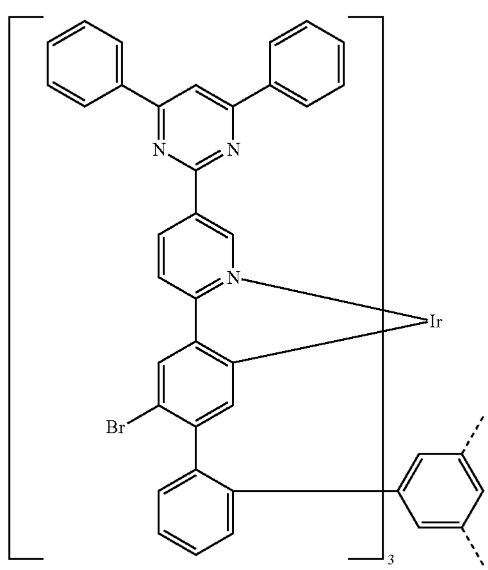 | 95% |

-continued
| Ex. | Reactant | Ir complex | Yield |
|---|---|---|---|
| Ir(L1030-3Br) | Ir(L1030) | 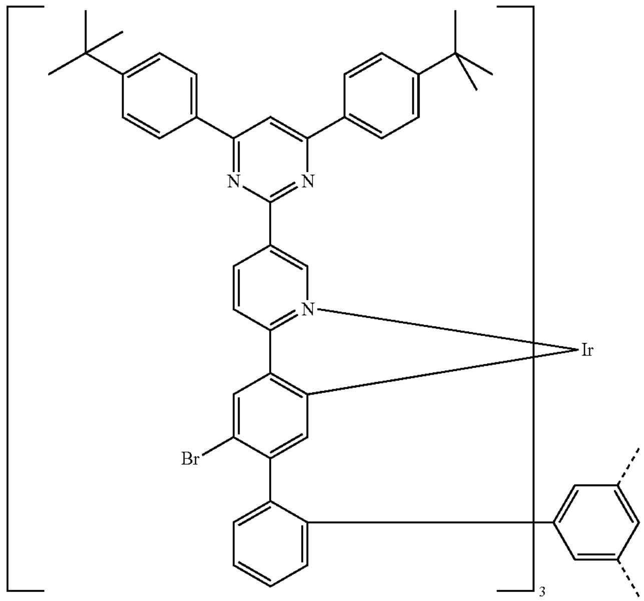 | 91% |
| Ir(L1031-3Br) | Ir(L1031) | 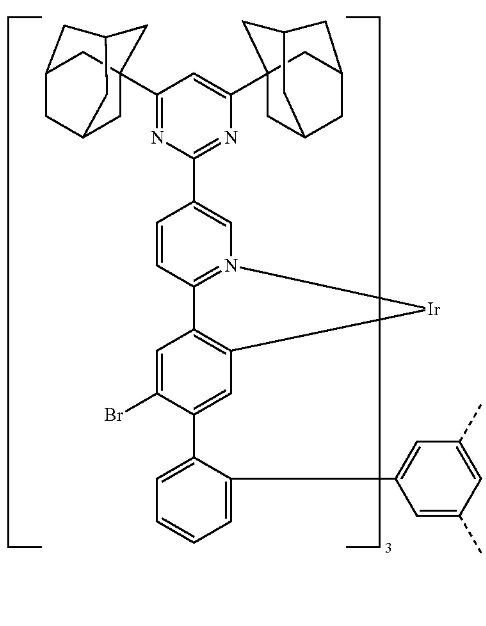 | 85% |

-continued

| Ex. | Reactant | Ir complex | Yield |
|---|---|---|---|
| Ir(L1032-3Br) | Ir(L1032) | 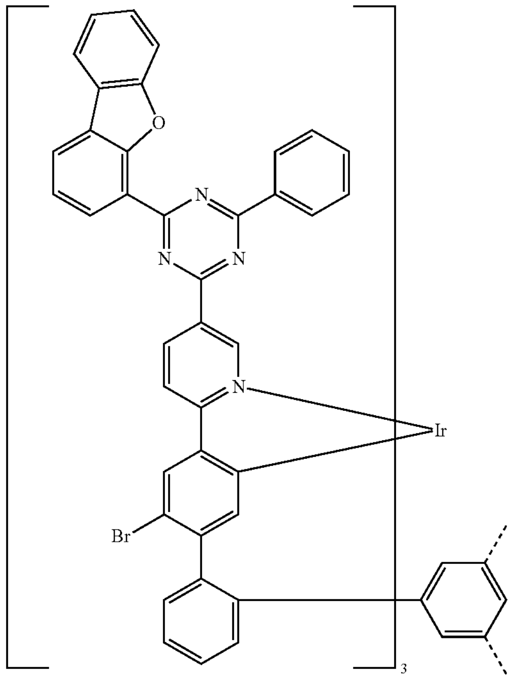 | 88% |
| Ir(L1033-3Br) | Ir(L1033) | 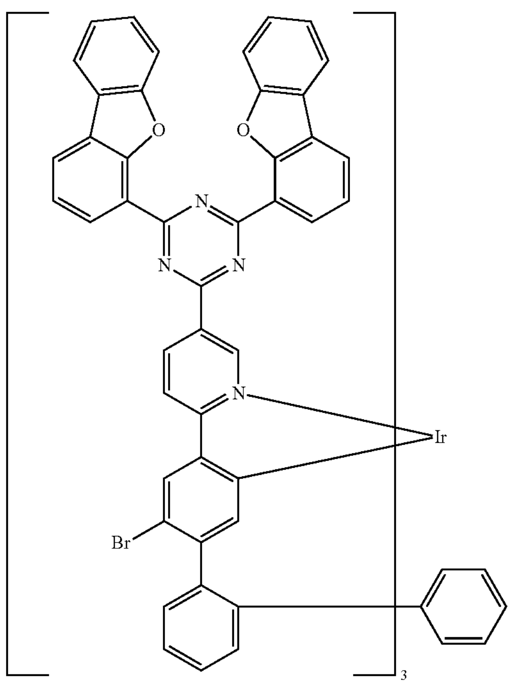 | 84% |

2) Suzuki Coupling with the Brominated Iridium Complexes. Variant a, Biphasic Reaction Mixture To a suspension of 10 mmol of a brominated complex, 12-30 mmol of boronic acid or boronic ester per Br function and 60-100 mmol of tripotassium phosphate in a mixture of 300 ml of toluene, 150 ml of ethanol and 150 ml of water are added 0.6 mmol of tri-ortho-tolylphosphine and then 0.1 mmol of palladium(II) acetate, and the mixture is heated under reflux for 24 h. After cooling, 500 ml of water and 200 ml of toluene are added, the aqueous phase is removed, and the organic phase is washed three times with 200 ml of water and once with 200 ml of saturated sodium chloride solution and dried over magnesium sulphate. The mixture is filtered through a Celite bed and washed through with toluene, the toluene is removed almost completely under reduced pressure, 300 ml of methanol are added, and the precipitated crude product is filtered off with suction, washed three times with 50 ml each time of methanol and dried under reduced pressure. The crude product is columned on silica gel. The metal complex is finally heat-treated or sublimed. The heat treatment is effected under high vacuum (p about $10^{-6}$ mbar) within the temperature range of about 200-300° C. The sublimation is effected under high vacuum (p about $10^{-6}$ mbar) within the temperature range of about 300-400° C., the sublimation preferably being conducted in the form of a fractional sublimation.

Variant B, Monophasic Reaction Mixture:

To a suspension of 10 mmol of a brominated complex, 12-30 mmol of boronic acid or boronic ester per Br function and 60-100 mmol of the base (potassium fluoride, tripotassium phosphate (anhydrous or monohydrate or trihydrate), potassium carbonate, caesium carbonate etc.) and 100 g of glass beads (diameter 3 mm) in 100 ml-500 ml of an aprotic solvent (THF, dioxane, xylene, mesitylene, dimethylacetamide, NMP, DMSO, etc.) are added 0.6 mmol of tri-ortho-tolylphosphine and then 0.1 mmol of palladium(II) acetate, and the mixture is heated under reflux for 24 h. Alternatively, it is possible to use other phosphines such as tri-tert-butylphosphine, S-Phos, X-Phos, RuPhos, XanthPhos, etc., the preferred phosphine: palladium ratio in the case of these phosphines being 2:1 to 1.2:1. The solvent is removed under reduced pressure, the product is taken up in a suitable solvent (toluene, dichloromethane, ethyl acetate, etc.) and purification is effected as described in Variant A.

Synthesis of Ir1000:

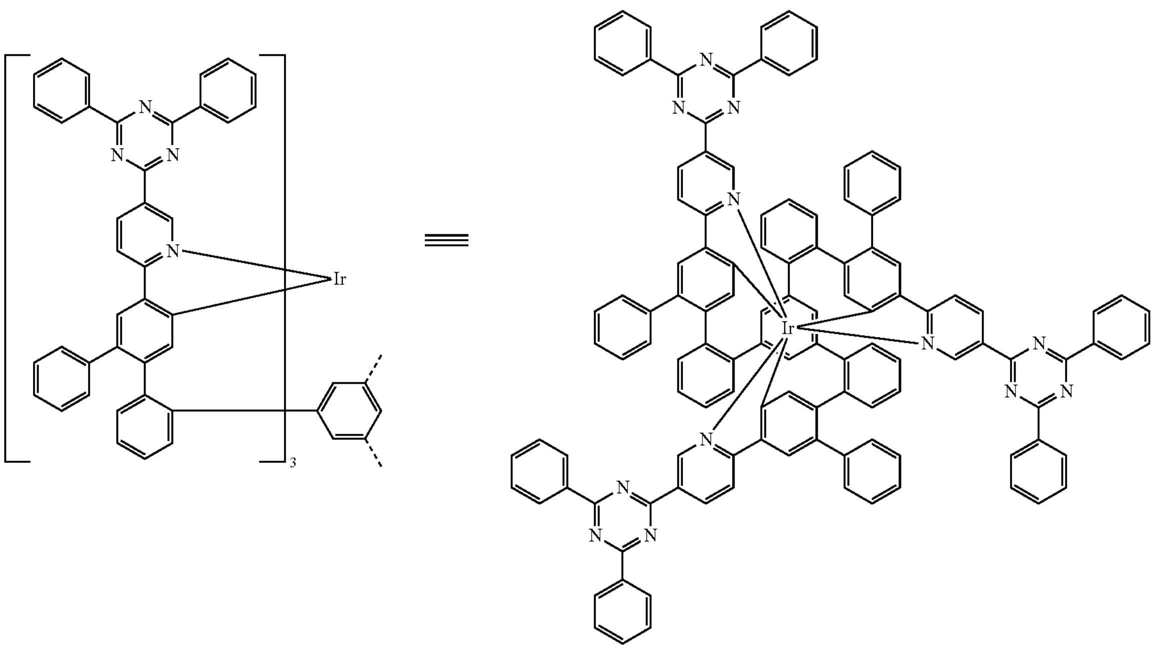

Variant A:

Use of 18.9 g (10.0 mmol) of Ir(L1000-3Br) and 9.8 g (80.0 mmol) of phenylboronic acid [98-80-6], 19.1 g (90 mmol) of tripotassium phosphate (anhydrous), 183 mg (0.6 mmol) of tri-o-tolylphosphine [6163-58-2], 23 mg (0.1 mmol) of palladium(II)acetate, 300 ml of toluene, 150 ml of ethanol and 150 ml of water, reflux, 24 h. Chromatographic separation twice on silica gel with toluene, followed by hot extraction five times with ethyl acetate. Yield: 9.8 g (5.2 mmol), 52%; purity: about 99.9% by H PLC.

In an analogous manner, it is possible to prepare the following complexes:
| Ex. | Reactant Variant/ reaction conditions Boronic acid Hot extractant | Ir complex | Yield |
|---|---|---|---|
| Ir1001 | Ir(L1000-3Br) A 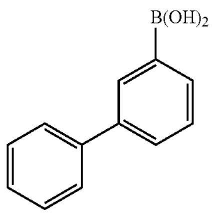 [5122-95-2] toluene/heptane 1:1 | 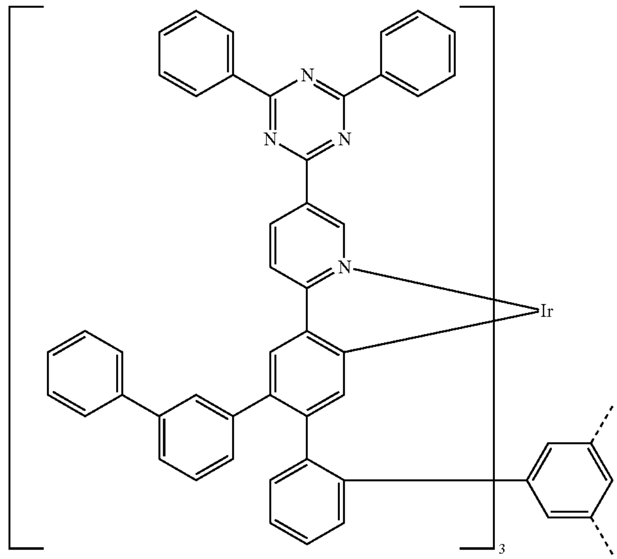 | 50% |
| Ir1002 | Ir(L1000-3Br) A 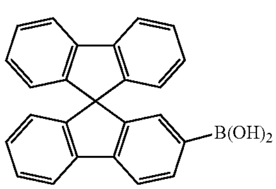 [236389-21-2] ethyl acetate | 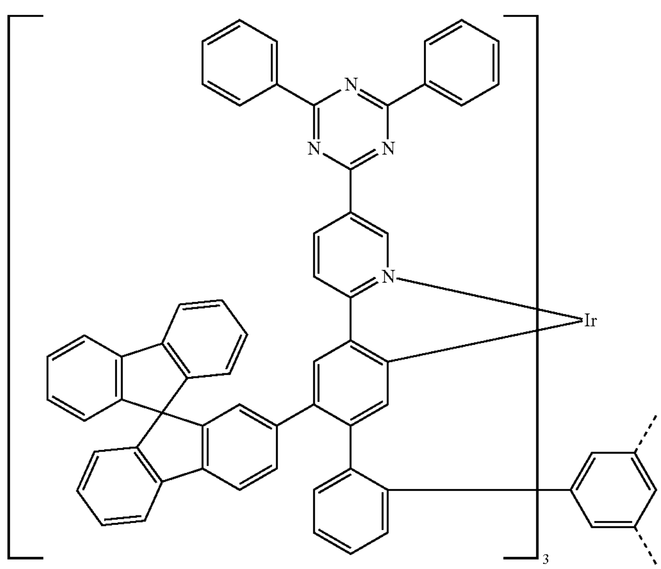 | 42% |

-continued
| Ex. | Reactant<br>Variant/<br>reaction conditions<br>Boronic acid<br>Hot extractant | Ir complex | Yield |
|---|---|---|---|
| Ir1003 | Ir(L1000-3Br)<br>A<br>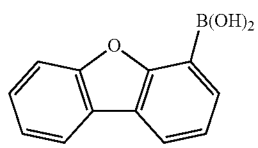<br>[100124-06-9]<br>ethyl acetate | 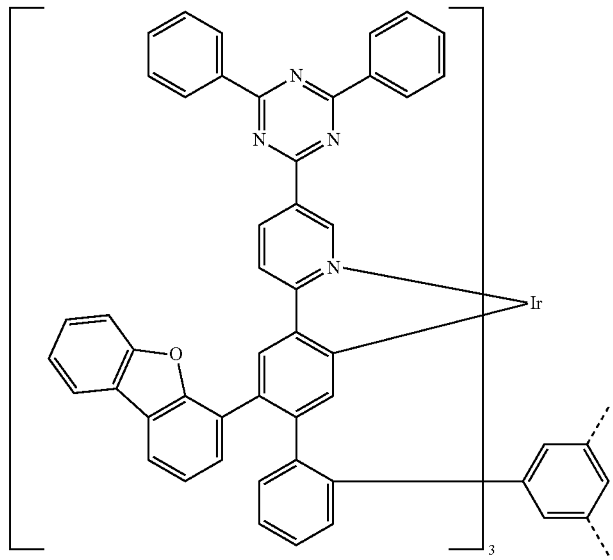 | 56% |
| Ir1004 | Ir(L1009-3Br)<br>A<br>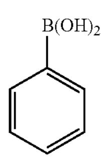<br>[98-80-6]<br>toluene | 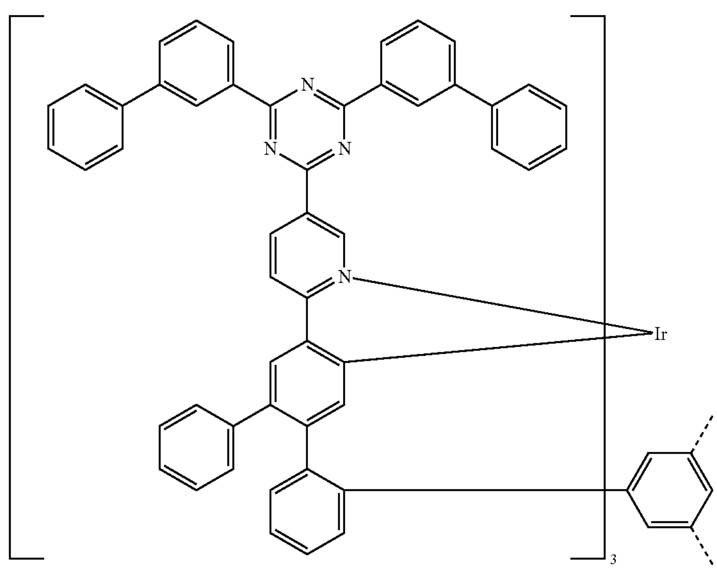 | 45% |

-continued
| Ex. | Reactant Variant/ reaction conditions Boronic acid Hot extractant | Ir complex | Yield |
|---|---|---|---|
| Ir1005 | Ir(L1009-3Br) A 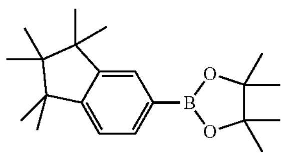 [1562418-16-9] ethyl acetate | 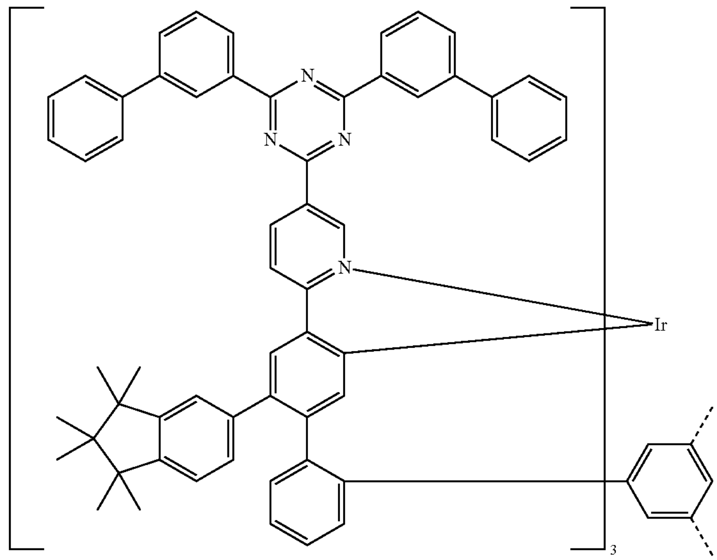 | 20% |
| Ir1006 | Ir(L1009-3Br) A 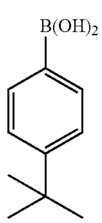 [123324-71-0] toluene/heptane 2:1 | 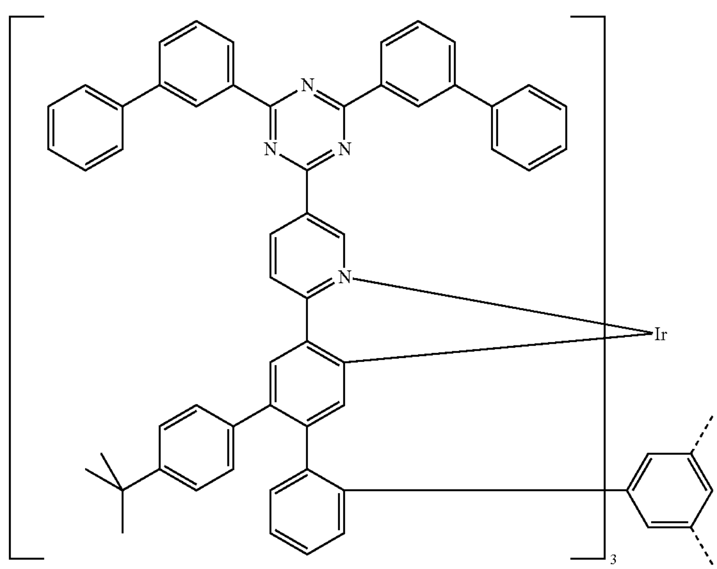 | 39% |

-continued
| Ex. | Reactant Variant/ reaction conditions Boronic acid Hot extractant | Ir complex | Yield |
|---|---|---|---|
| Ir1007 | Ir(L1009-3Br) A 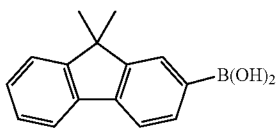 [333432-28-3] toluene | 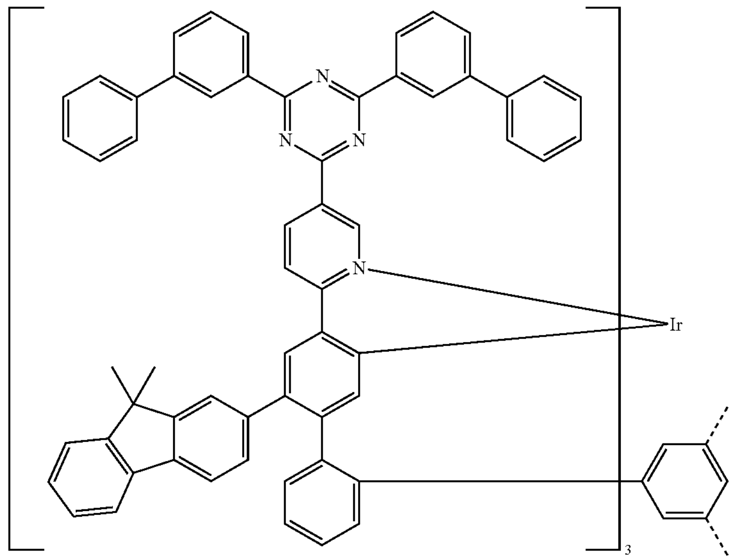 | 52% |
| Ir1008 | Ir(L1001-3Br) A 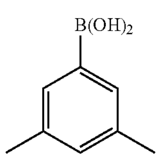 [172975-69-8] toluene/heptane 1:1 | 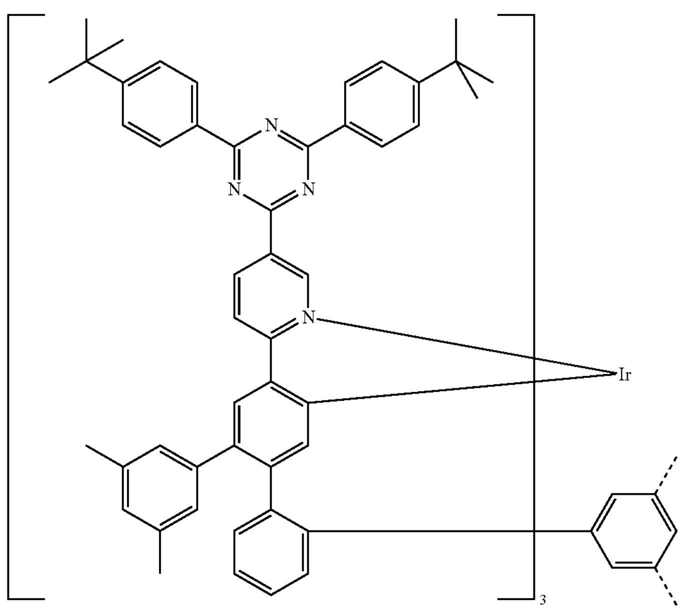 | 44% |

-continued
| Ex. | Reactant Variant/ reaction conditions Boronic acid Hot extractant | Ir complex | Yield |
|---|---|---|---|
| Ir1009 | Ir(L1001-3Br) A 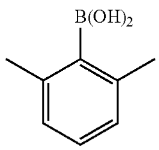 [100379-00-8] ethyl acetate | 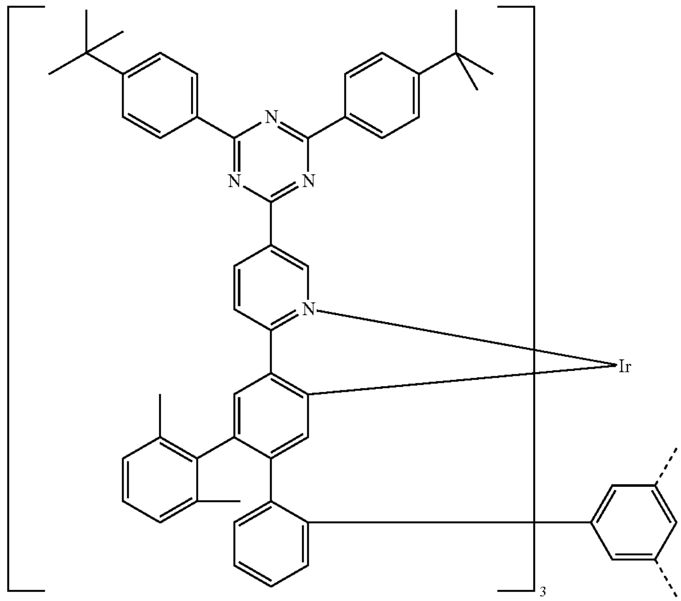 | 55% |
| Ir1010 | Ir(L1002-3Br) A 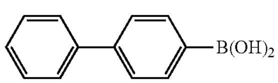 ethyl acetate | 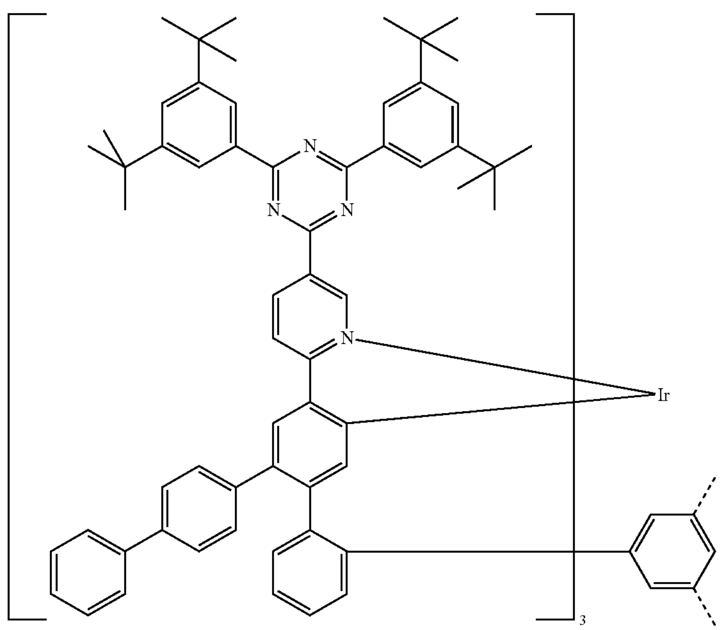 | 35% |

-continued
| Ex. | Reactant Variant/ reaction conditions Boronic acid Hot extractant | Ir complex | Yield |
|---|---|---|---|
| Ir1011 | Ir(L1003-3Br)<br>B<br>$Pd(OAc)_2$/S-Phos 1:1.3,<br>KF, dioxane<br>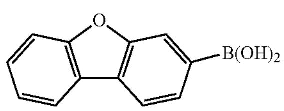<br>[395087-89-5]<br>toluene/heptane 1:1 | 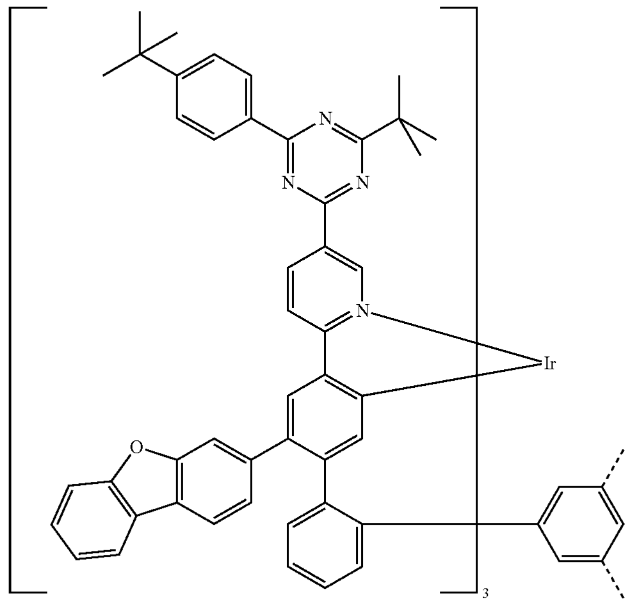 | 41% |
| Ir1012 | Ir(L1004-Br)<br>A<br>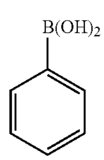<br>[98-80-6]<br>ethyl acetate | 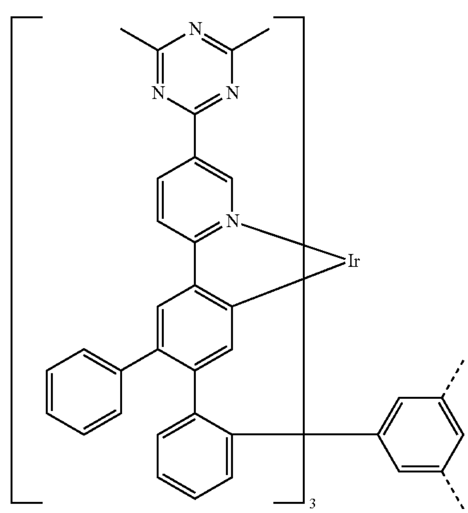 | 56% |

-continued
| Ex. | Reactant Variant/ reaction conditions Boronic acid Hot extractant | Ir complex | Yield |
|---|---|---|---|
| Ir1013 | Ir(L1005-3Br) A 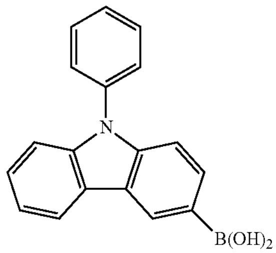 [854952-58-2] ethyl acetate | 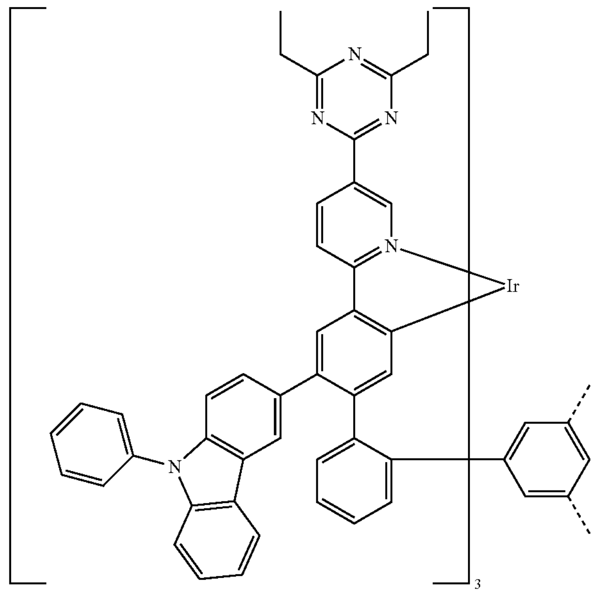 | 60% |
| Ir1014 | Ir(L1006-3Br) A 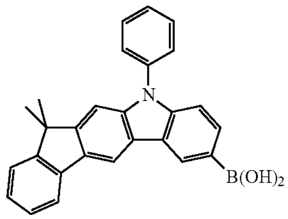 [1379585-25-7] toluene | 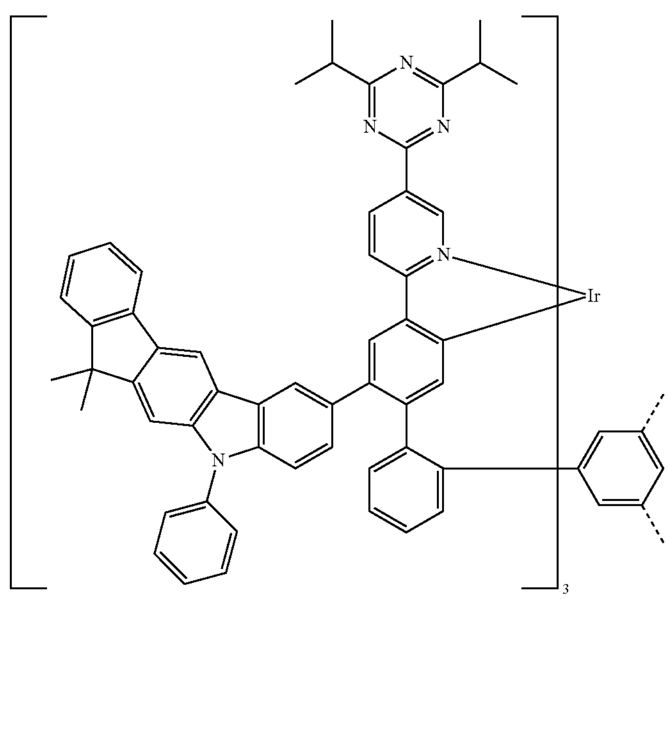 | 58% |

-continued
| Ex. | Reactant Variant/ reaction conditions Boronic acid Hot extractant | Ir complex | Yield |
|---|---|---|---|
| Ir1015 | Ir(L1007-3Br) A 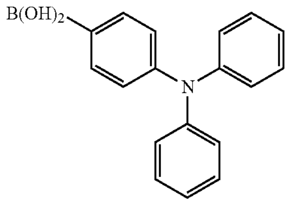 [2101802-67-7] ethyl acetate | 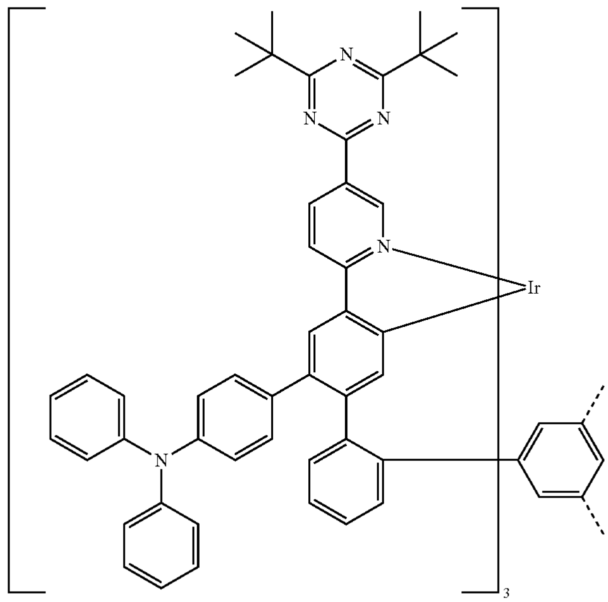 | 60% |
| Ir1016 | Ir(L1008-3Br) A 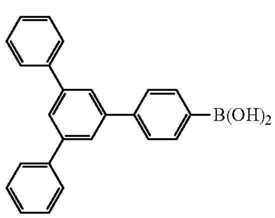 [491612-72-7] toluene | 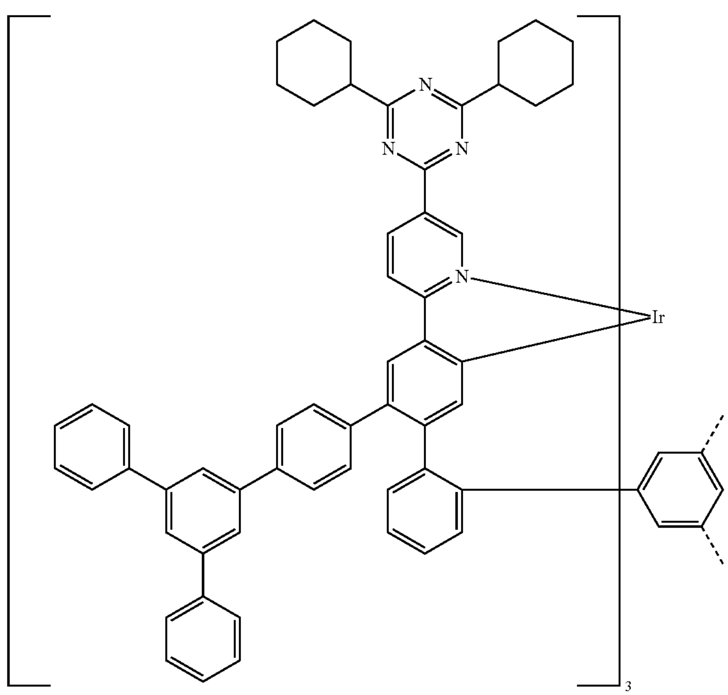 | 55% |

-continued
| Ex. | Reactant Variant/ reaction conditions Boronic acid Hot extractant | Ir complex | Yield |
|---|---|---|---|
| Ir1017 | Ir(L1010-3Br) A 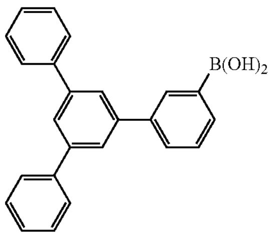 [1233200-59-3] ethyl acetate | 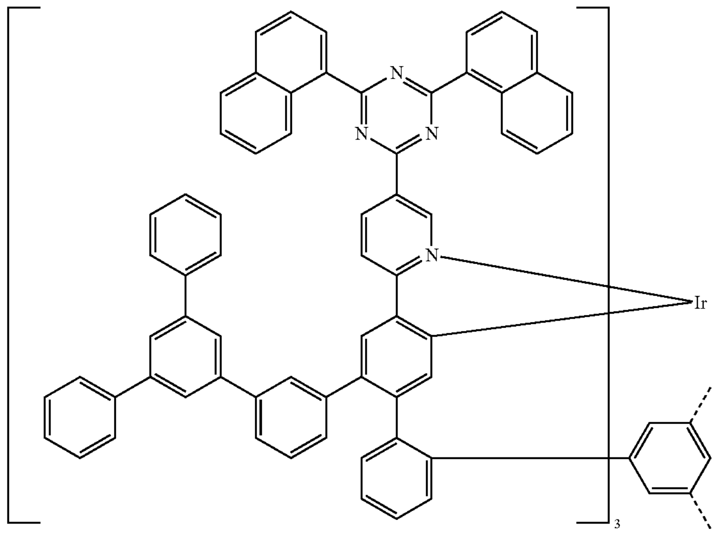 | 56% |
| Ir1018 | Ir(L1011-3Br) A 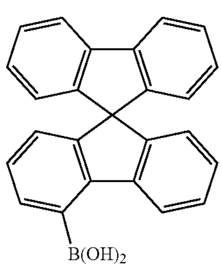 [1421789-05-0] toluene | 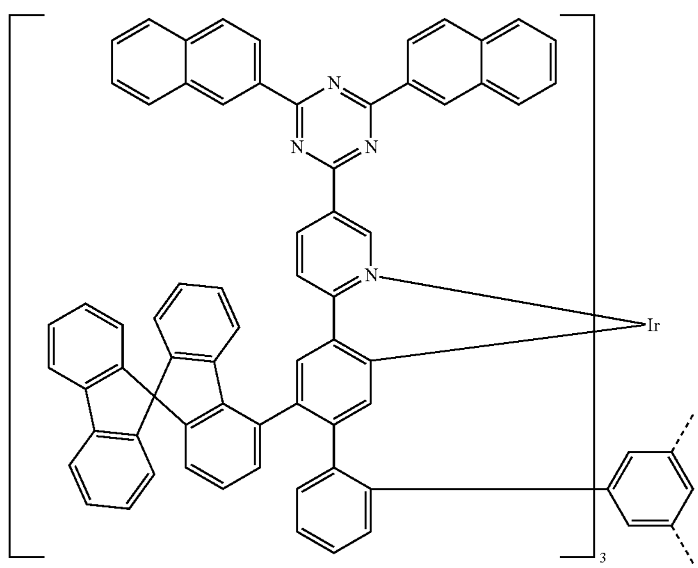 | 61% |

-continued
| Ex. | Reactant Variant/ reaction conditions Boronic acid Hot extractant | Ir complex | Yield |
|---|---|---|---|
| Ir1019 | Ir(L1012-3Br) A 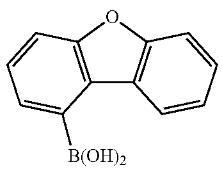 [162607-19-4] toluene | 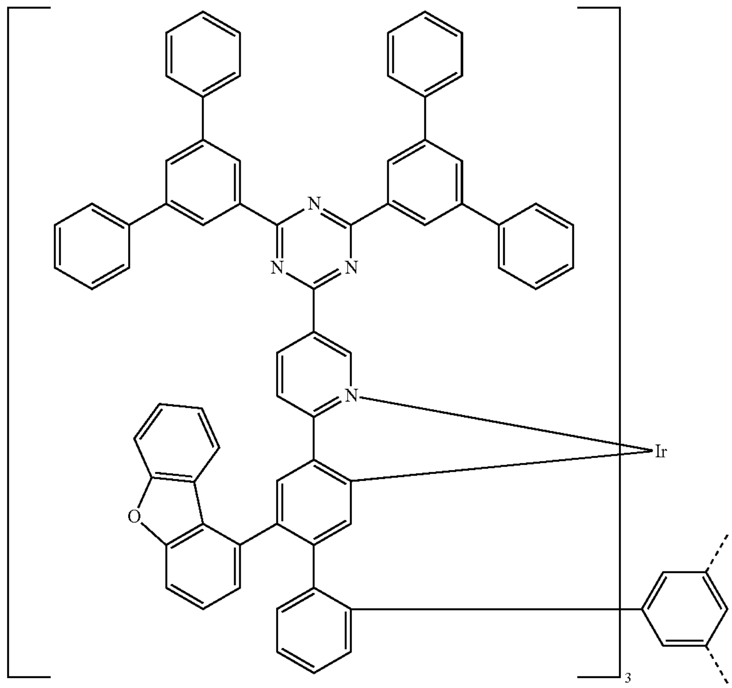 | 55% |
| Ir1020 | Ir(L1013-3Br) A 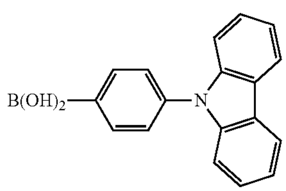 [419536-33-7] ethyl acetate | 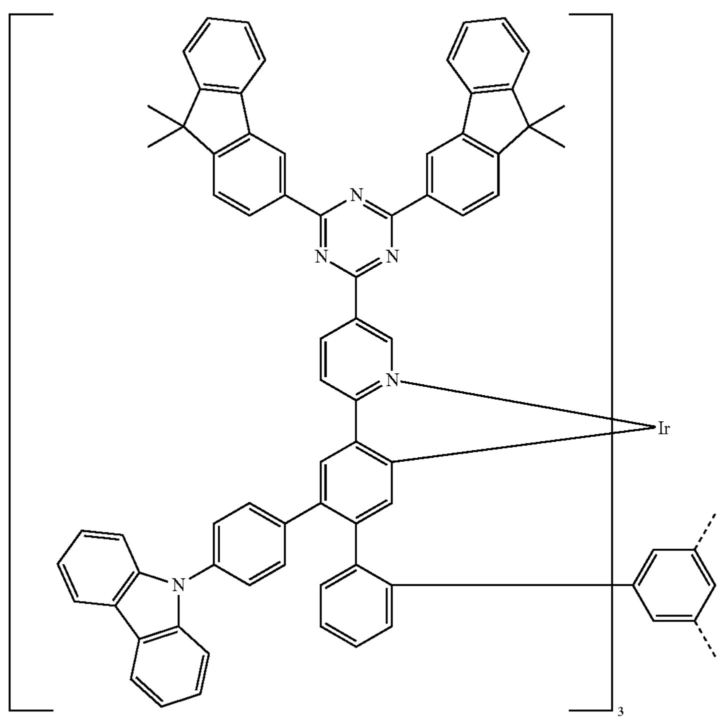 | 50% |

-continued
| Ex. | Reactant Variant/ reaction conditions Boronic acid Hot extractant | Ir complex | Yield |
|---|---|---|---|
| Ir1021 | Ir(L1014-3Br)<br>B<br>$Pd(OAc)_2$/S-Phos 1:1.3,<br>$CsCO_3$, toluene<br>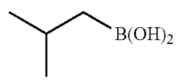<br>[84110-40-7]<br>toluene/heptane 2:1 | 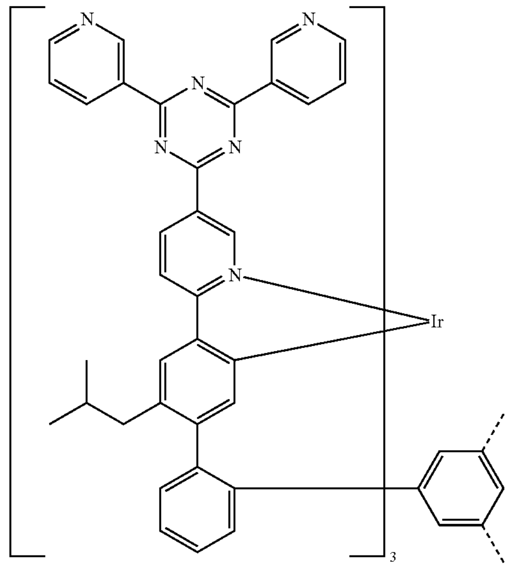 | 28% |
| Ir1022 | Ir(L1015-3Br)<br>B<br>$Pd(OAc)_2$/S-Phos 1:1.3,<br>$K_3PO_4 \times 3\ H_2O$, toluene<br>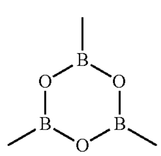<br>[823-96-1]<br>ethyl acetate | 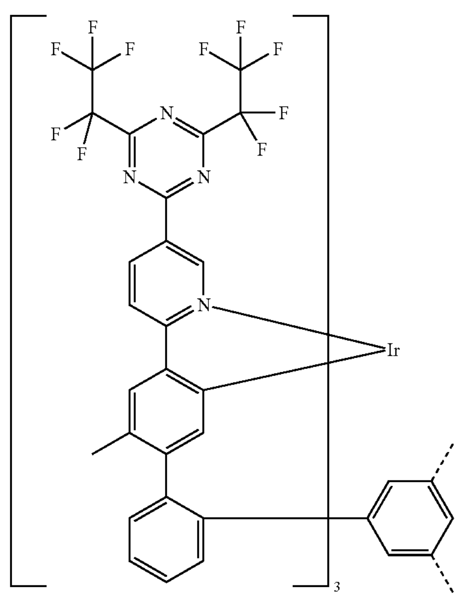 | 16% |

-continued
| Ex. | Reactant Variant/ reaction conditions Boronic acid Hot extractant | Ir complex | Yield |
|---|---|---|---|
| Ir1023 | Ir(L1016-3Br)<br>B<br>$Pd(OAc)_2$/S-Phos 1:1.3, $CsCO_3$, toluene<br>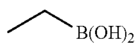<br>[4433-63-0]<br>toluene/heptane 5:1 | 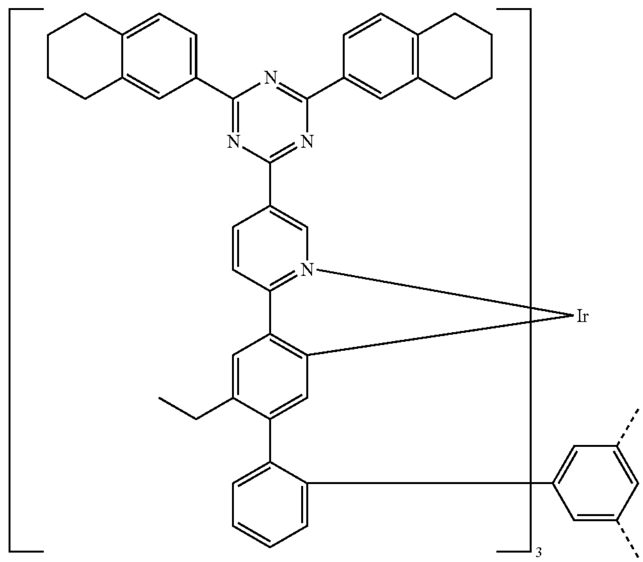 | 20% |
| Ir1024 | Ir(L1017-3Br)<br>A<br>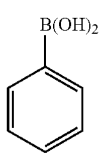<br>[98-80-6]<br>ethyl acetate | 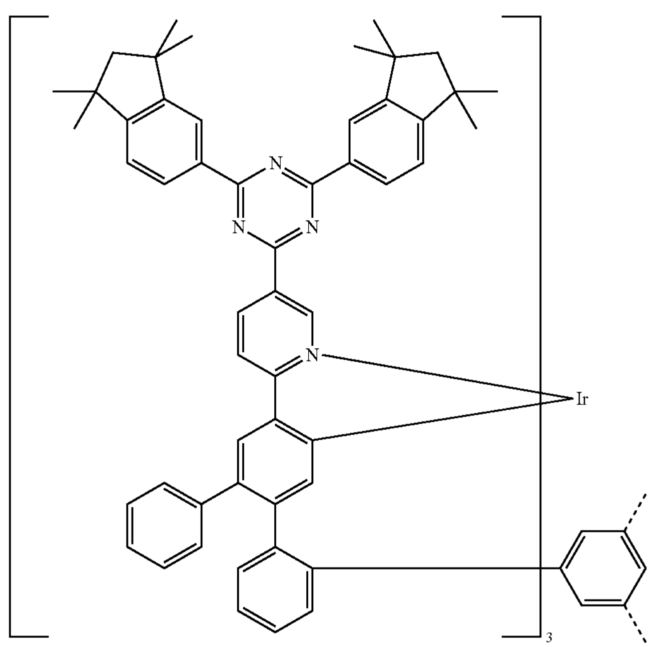 | 60% |

-continued
| Ex. | Reactant Variant/ reaction conditions Boronic acid Hot extractant | Ir complex | Yield |
|---|---|---|---|
| Ir1025 | Ir(L1018-3Br) A 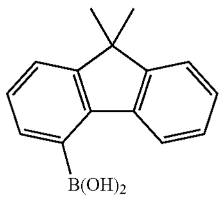 [1246022-50-3] ethyl acetate | 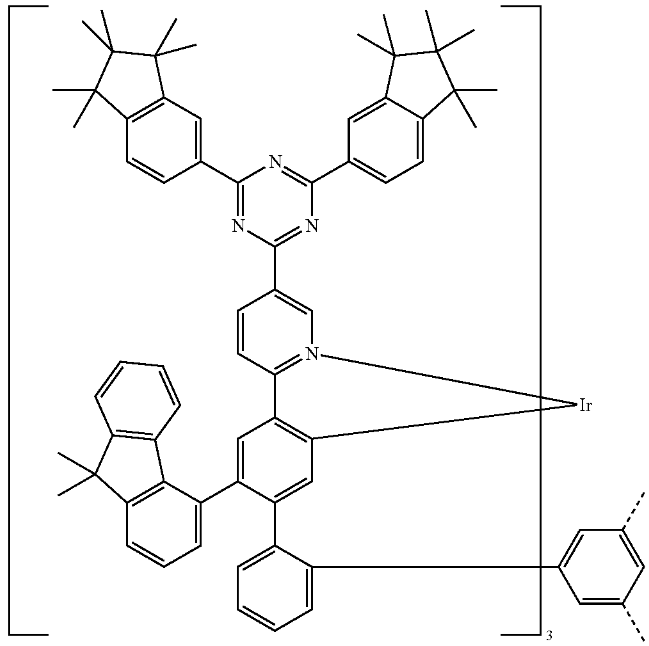 | 50% |
| Ir1026 | Ir(L1019-3Br) A 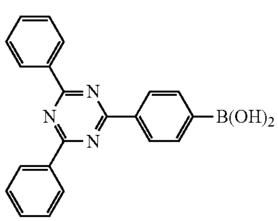 [1313018-07-3] toluene | 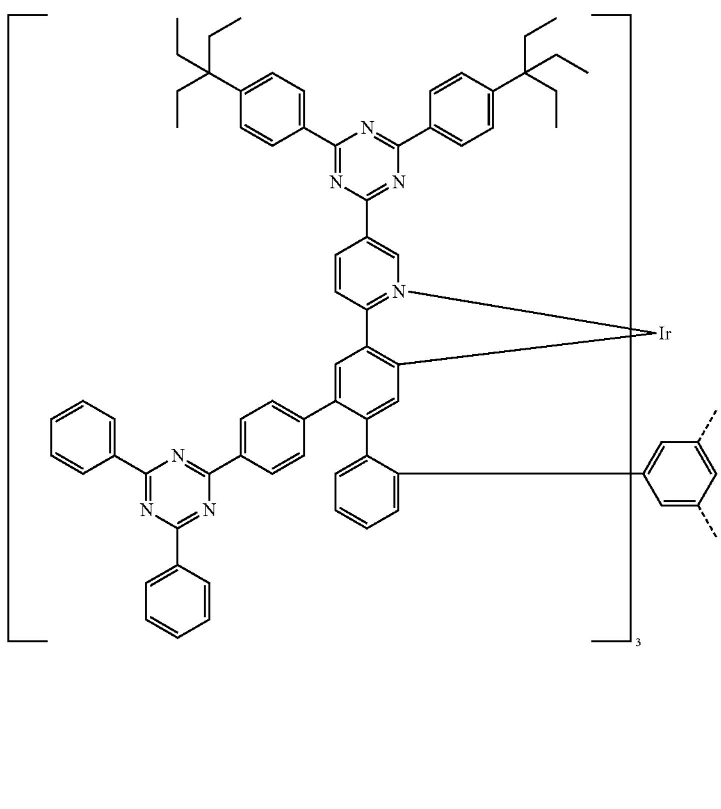 | 41% |

-continued
| Ex. | Reactant Variant/ reaction conditions Boronic acid Hot extractant | Ir complex | Yield |
|---|---|---|---|
| Ir1027 | Ir(L1020-3Br)<br>A<br>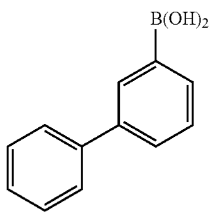<br>[5122-95-2]<br>toluene | 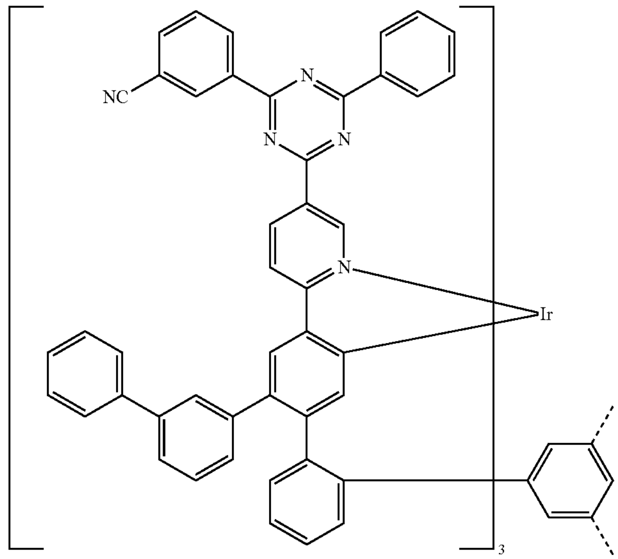 | 71% |
| Ir1028 | Ir(L1021-3Br)<br>A<br>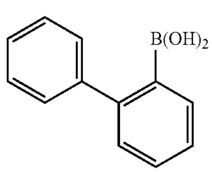<br>[4688-76-0]<br>toluene | 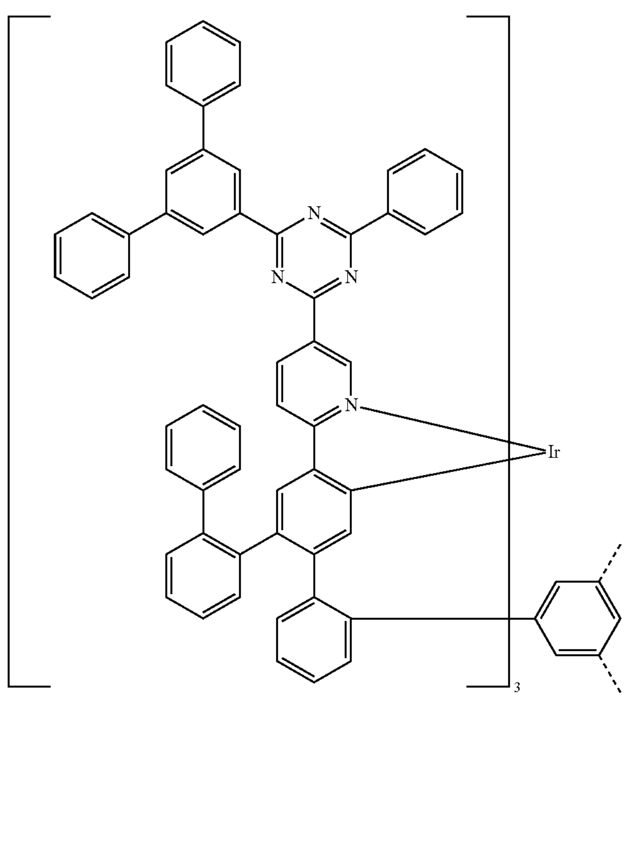 | 14% |

-continued
| Ex. | Reactant Variant/ reaction conditions Boronic acid Hot extractant | Ir complex | Yield |
|---|---|---|---|
| Ir1030 | Ir(L1022-Br) A 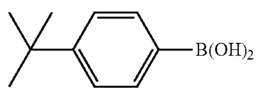 [123324-71-0] ethyl acetate | 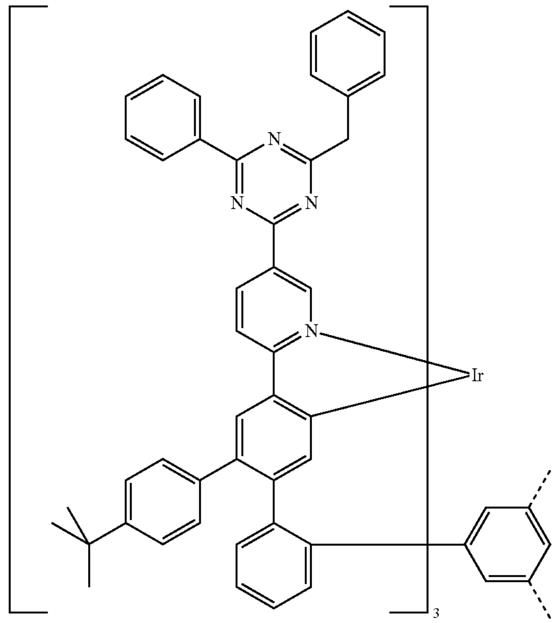 | 45% |
| Ir1031 | Ir(L1023-Br) A 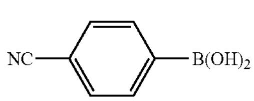 [126747-14-6] toluene/heptane 3:1 | 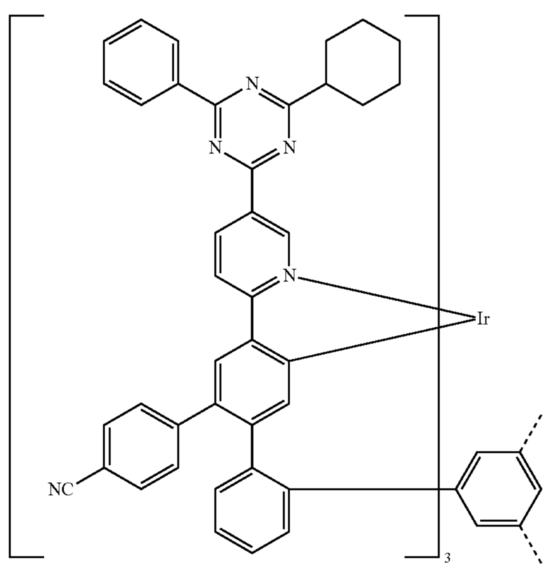 | 61% |

-continued
| Ex. | Reactant Variant/ reaction conditions Boronic acid Hot extractant | Ir complex | Yield |
|---|---|---|---|
| Ir1032 | Ir(L1024-3Br) B Pd(OAc)$_2$/S-Phos 1:1.3, $K_3PO_4 \times 3\ H_2O$, toluene 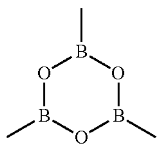 [823-96-1] ethyl acetate | 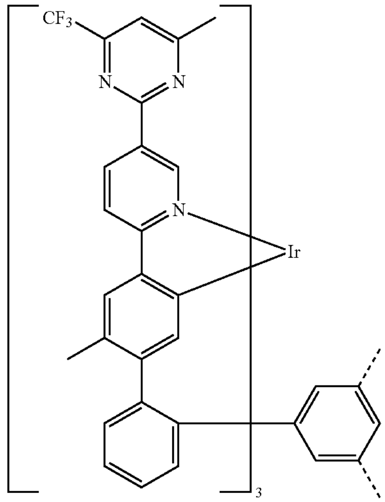 | 27% |
| Ir1033 | Ir(L1025-3Br) A 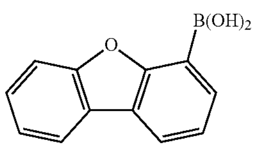 [100124-06-9] toluene | 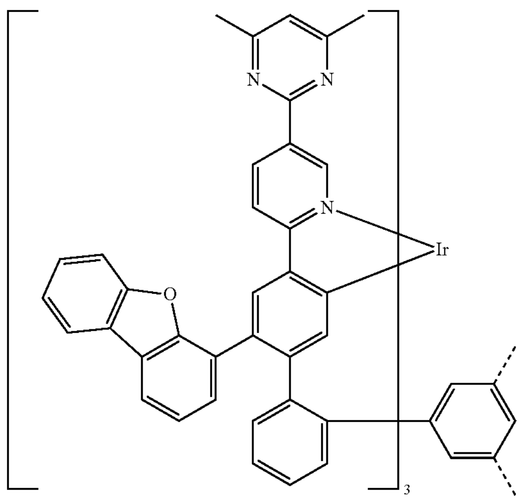 | 50% |
| Ir1034 | Ir(L1026-3Br) A 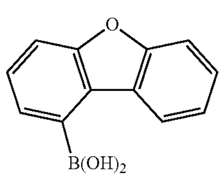 [162607-19-4] ethyl acetate | 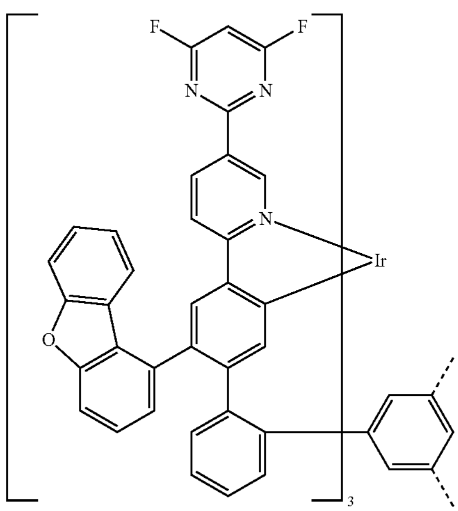 | 40% |

-continued
| Ex. | Reactant Variant/ reaction conditions Boronic acid Hot extractant | Ir complex | Yield |
|---|---|---|---|
| Ir1035 | Ir(L1027-Br) A 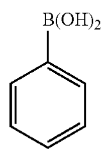 [98-80-6] toluene | 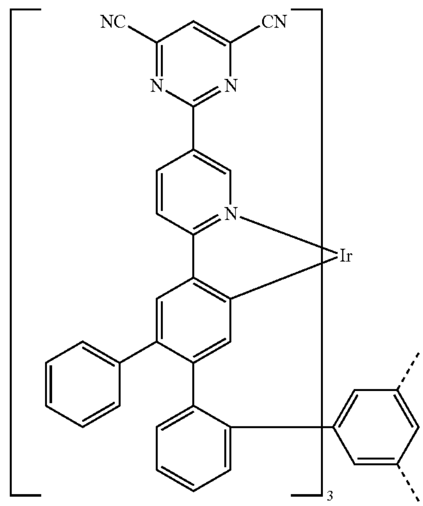 | 50% |
| Ir1036 | Ir(L1028-3Br) A 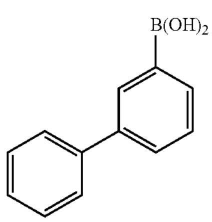 [5122-95-2] ethyl acetate | 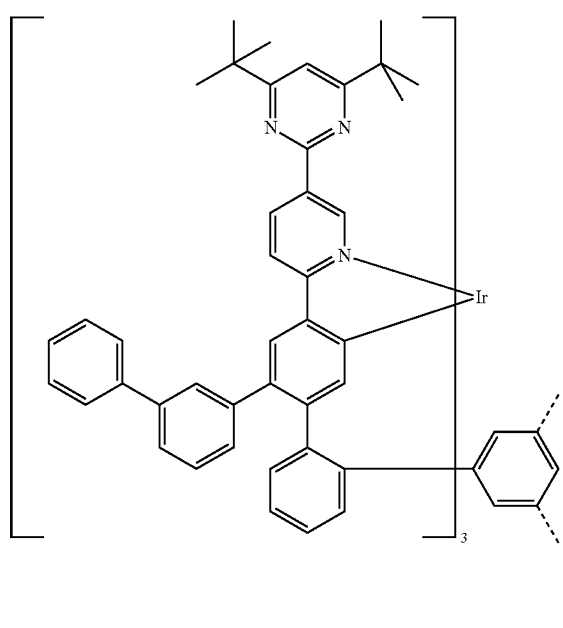 | 67% |

-continued
| Ex. | Reactant Variant/ reaction conditions Boronic acid Hot extractant | Ir complex | Yield |
|---|---|---|---|
| Ir1037 | Ir(L1029-3Br) A 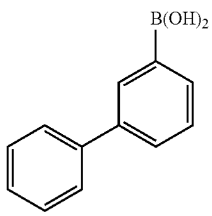 [5122-95-2] toluene | 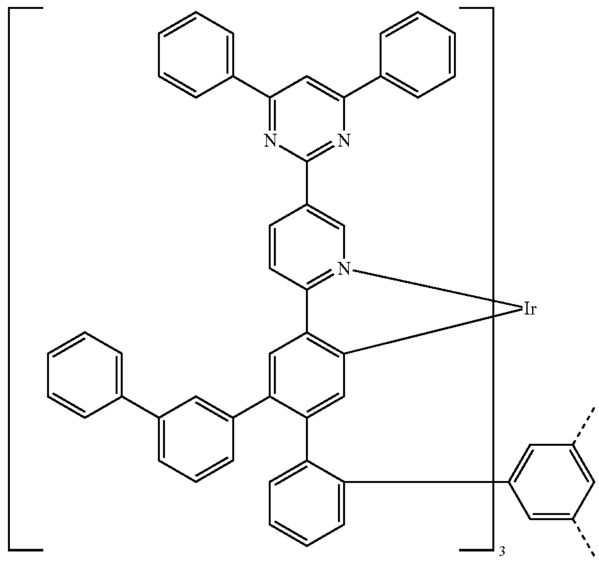 | 70% |
| Ir1038 | Ir(L1030-3Br) A 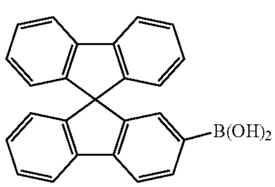 [236389-21-2] ethyl acetate | 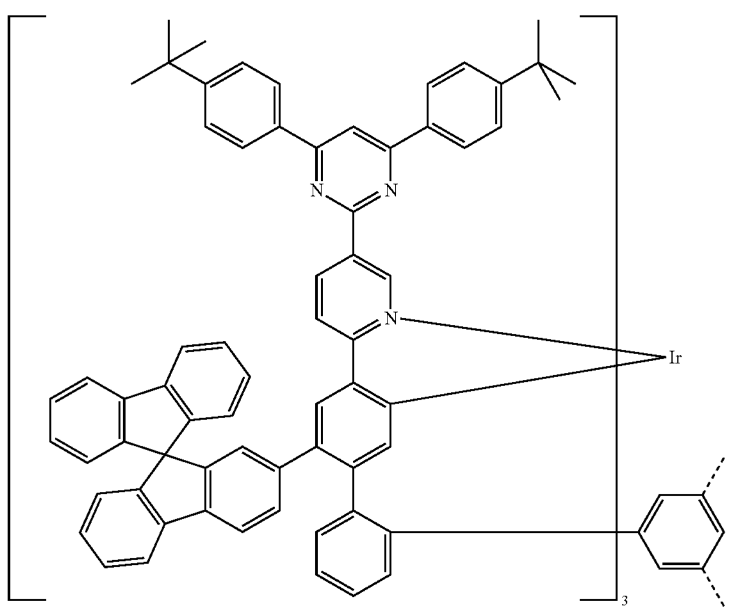 | 40% |

-continued
| Ex. | Reactant Variant/ reaction conditions Boronic acid Hot extractant | Ir complex | Yield |
|---|---|---|---|
| Ir1039 | Ir(L1031-3Br) A 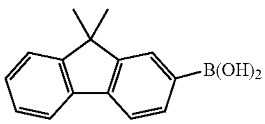 [333432-28-3] toluene/heptane 3:1 | 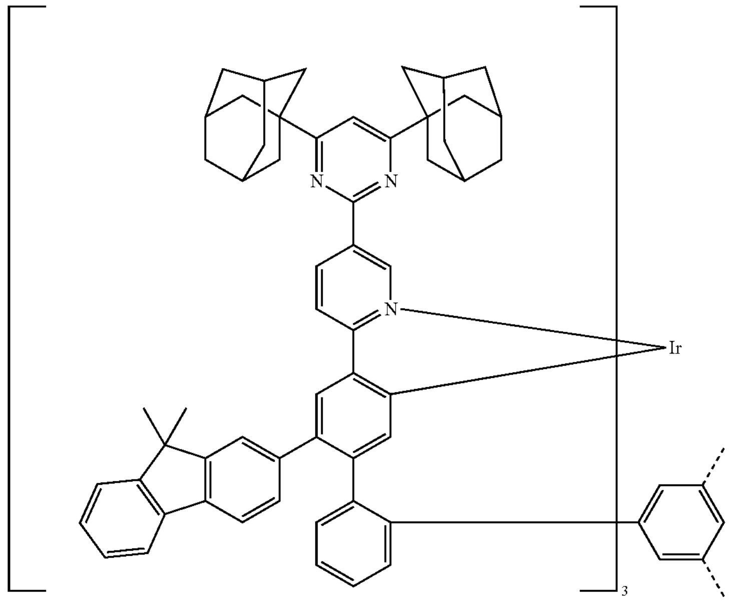 | 61% |
| Ir1040 | Ir(L1032-3Br) A 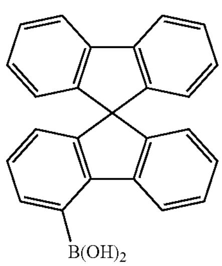 [1421789-05-0] toluene | 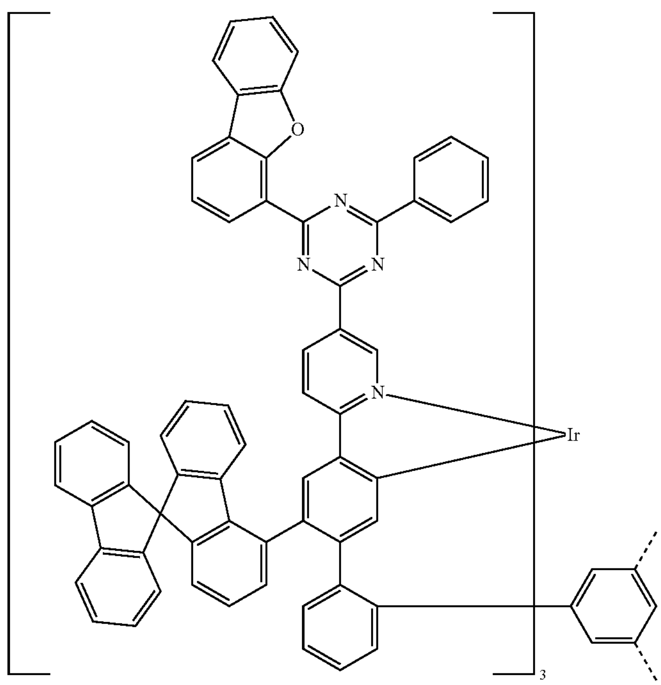 | 88% |

-continued
| Ex. | Reactant Variant/ reaction conditions Boronic acid Hot extractant | Ir complex | Yield |
|---|---|---|---|
| Ir1041 | Ir(L1033-Br) A 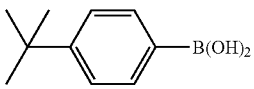 [123324-71-0] toluene | 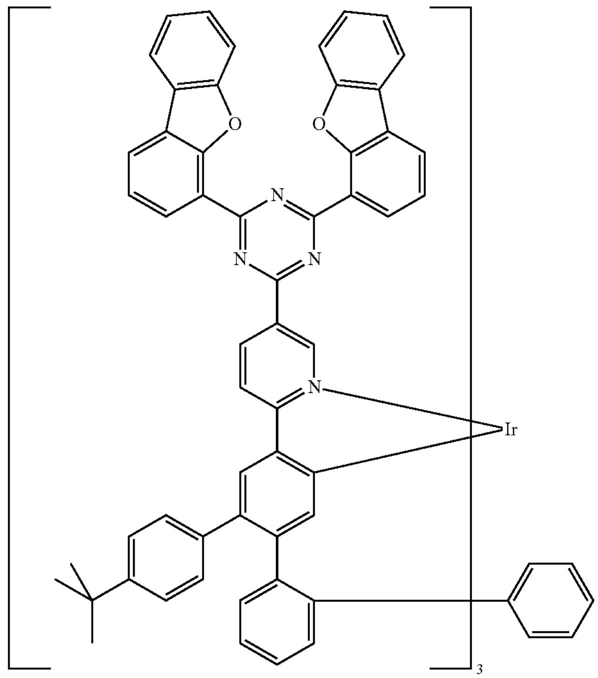 | 38% |
H: Synthesis of Unsymmetric Ligands
1st Variant
Example S1200 and S1201: Suzuki Coupling with Subsequent Chromatographic Separation
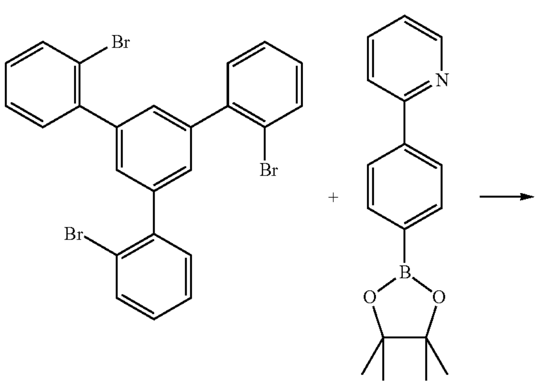
-continued
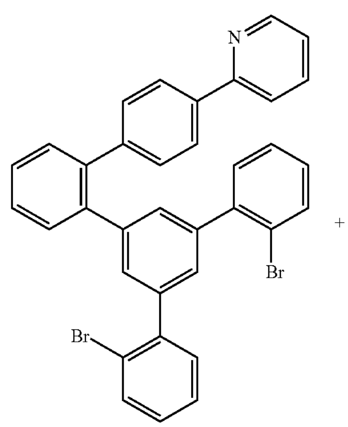

-continued

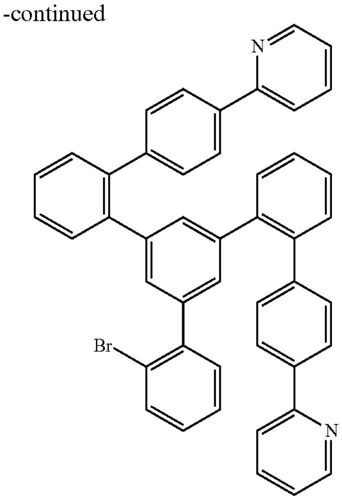

Into a 2 l four-neck flask with reflux condenser, argon blanketing, precision glass stirrer and internal thermometer are weighed 50 g of 1,3,5-tris(2-bromophenyl)benzene (92.1 mmol) [380626-56-2], 51.8 g of 2-[4-(4,4,5,5-tetramethyl-[1,3,2]dioxaborolan-2-yl)phenyl]pyridine (184.2 mmol) [908350-80-1] and 84.0 g of caesium fluoride (553 mmol), the flask is inertized with argon and then 1000 ml of diethylene glycol dimethyl ether and 100 g of glass beads (diameter 3 mm) are added. The reaction mixture is inertized with argon for 15 min, then 3.2 g of bis(triphenylphosphine) palladium(II) chloride (4.6 mmol) [13965-03-2] are added and the reaction mixture is stirred at internal temperature 130° C. overnight. After cooling, the solvent is substantially removed by rotary evaporation on a rotary evaporator at about 10 mbar and bath temperature 80° C. and the residue is worked up by extraction with 500 ml of toluene and 500 ml of water in a separating funnel. The aqueous phase is extracted once with 200 ml of toluene, then the combined organic phases are washed once with 300 ml of water and once with 150 ml of saturated sodium chloride solution and dried over sodium sulphate, and the solvent is removed under reduced pressure. The residue is chromatographed on silica gel. Gradient elution: eluent:toluene 98%/ethyl acetate 2%. Yield: monosubstituted product S1200: 11.9 g (19.3 mmol), 21% as yellow solid. Purity 95% by 1H NMR. Yield: disubstituted product S1201: 21.7 g (31.3 mmol), 34% as brown solid. Purity 95% by 1H NMR.

In an analogous manner, it is possible to prepare the following synthons:

| Ex. | Product<br>Boronic acid/ester | Yield |
|---|---|---|
| S1204/<br>S1205 | 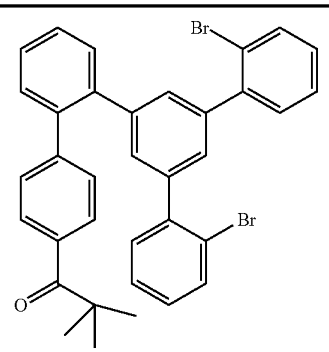 + 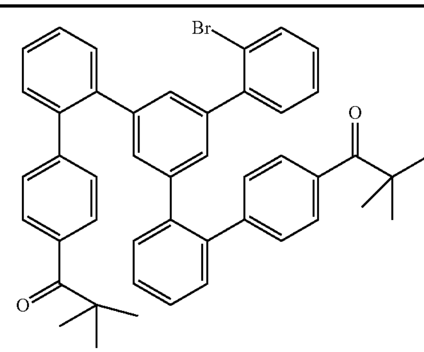<br>S1136 | 18%/<br>32% |
| S1206/<br>S1207 | 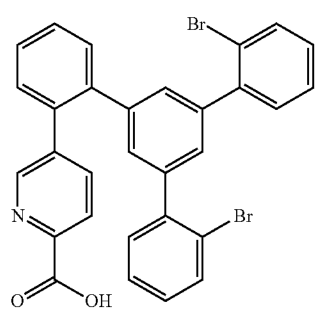 + 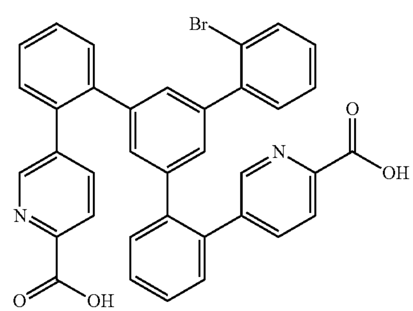<br>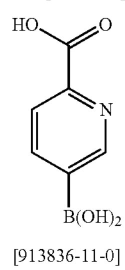<br>[913836-11-0] | 15%/<br>28% |

2nd Cariant

Example S1202: Silylation of 1,3,5-tris(2-bromophenyl)benzene

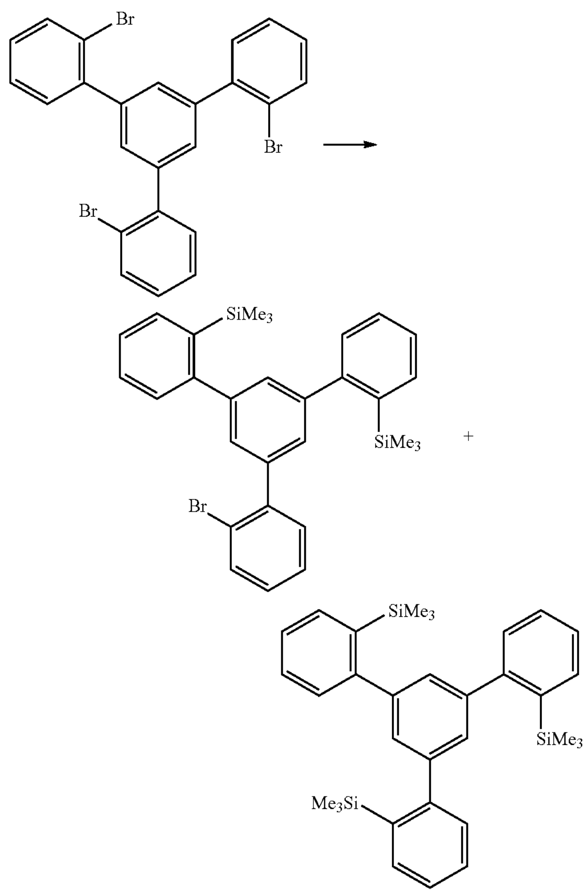

In a 2 I four-neck flask with precision glass stirrer, internal thermometer and argon blanketing, 50 g of 1,3,5-tris(2-bromophenyl)benzene (92.1 mmol) [380626-56-2] are dissolved in 1000 ml of dry THF and cooled down to −78° C. in an acetone/dry ice bath. Then 92.1 ml of a 2.5 mol/l solution of n-butyllithium (230.3 mmol) in n-hexane [109-72-8] are added dropwise in such a way that the internal temperature does not exceed −65° C. The mixture is stirred at this temperature for a further 1 h. Subsequently, 30.5 ml of chlorotrimethylsilane (239.5 mmol) [75-77-4] in 300 ml of dry THF are rapidly added dropwise via a dropping funnel, the reaction mixture is stirred at −78° C. for another 1 h and then allowed to thaw gradually to room temperature overnight. 20 ml of methanol are slowly added dropwise. Subsequently, the reaction mixture is transferred into a separating funnel and worked up by extraction with 1000 ml of ethyl acetate and 1000 ml of water. The aqueous phase is extracted once more with 500 ml of ethyl acetate, and the combined organic phases are washed with 500 ml of water and 250 ml of saturated sodium chloride solution, dried over sodium sulphate and concentrated to dryness by rotary evaporation. A yellow oil is obtained, which is converted in the next stage without further purification. Yield: 43.1 g, of which by NMR about 60% is product with 2-fold TMS substitution and about 40% product with 3-fold TMS substitution.

Example S1203: Suzuki Coupling of the Silylated Bromophenylbenzene

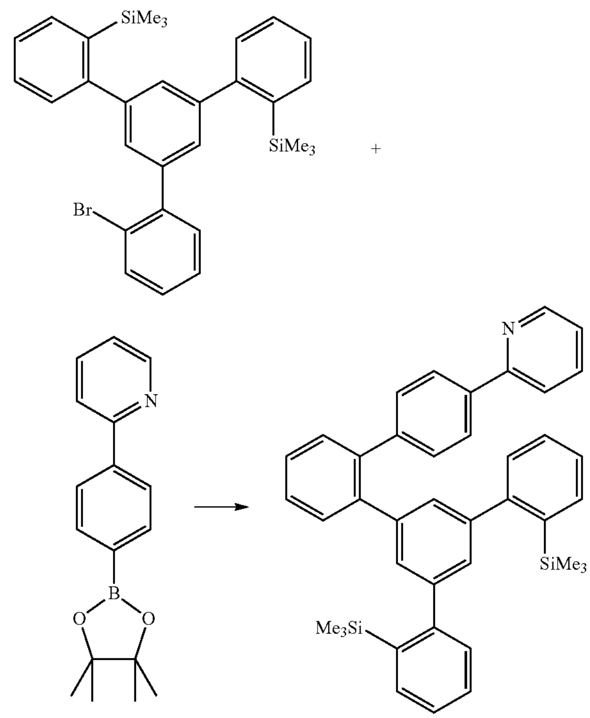

Into a 1 l four-neck flask with reflux condenser, precision glass stirrer, heating bath and argon connection are weighed 40.0 g (of which 24 mmol is [2-[3-(2-bromophenyl)-5-(2-trimethylsilylphenyl)phenyl]phenyl]trimethylsilane) of S1202, 16.2 g of 2-[4-(4,4,5,5-tetramethyl-[1,3,2]dioxaborolan-2-yl)phenyl]pyridine (57.6 mmol) [908350-80-1], 7.6 g (72 mmol) of sodium carbonate, 567 mg (2.2 mmol) of triphenylphosphine [603-35-0] and 162 mg (0.72 mmol) of palladium(II) acetate [3375-31-3], and 200 ml of toluene, 100 ml of ethanol and 100 ml of water are added. The reaction mixture is inertized with argon and stirred under reflux for 24 hours. After cooling, the organic phase is removed, the aqueous phase is extracted once with 100 ml of toluene, and the combined organic phases are washed once with 200 ml of water and once with 100 ml of saturated sodium chloride solution and dried over sodium sulphate and concentrated to 50 ml on a rotary evaporator. The resulting solution is chromatographed on silica gel. Gradient elution eluent:heptane>heptane/dichloromethane 1:1. The product fractions are concentrated by rotary evaporation, 100 ml of n-heptane are added to the pink oil obtained and the mixture is stirred at room temperature overnight. The precipitated solid is filtered off with suction and washed twice with 20 ml of n-heptane. A white solid is obtained. Yield: 11.6 g (19.2 mmol), 80%; purity: 98% by $^{1}$H NMR.

Example S1200: Bromination of S1203

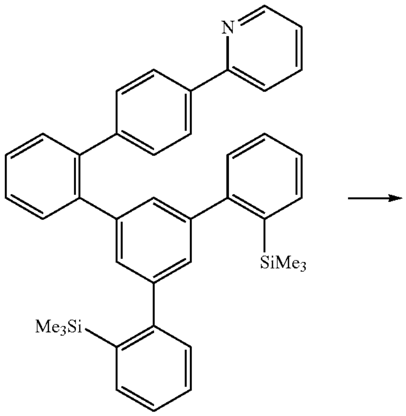

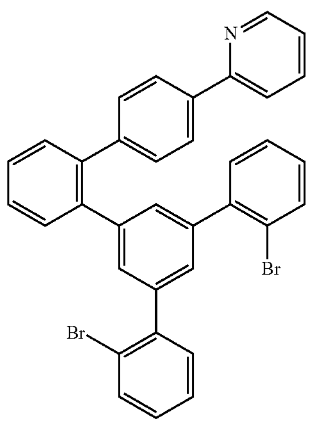

In a 500 ml 2-neck flask having a magnetic stirrer bar and argon blanketing, 11.5 g of S1203 (19.0 mmol) are dissolved in 180 ml of dichloromethane and cooled to 0° C. in an ice/water bath. In a dropping funnel, 2.5 ml of bromine (49.4 mmol) are mixed with 100 ml of dichloromethane and then slowly added dropwise. After the addition has ended, the ice/water bath is removed and the reaction mixture is stirred at room temperature for a further 6 h. Then 20 ml of saturated sodium sulphite solution are added dropwise, 50 ml of saturated sodium hydrogencarbonate solution and 3 ml of 20% (w/w) sodium hydroxide solution. The reaction mixture is transferred into a separating funnel, and the organic phase is removed and washed 5× with 100 ml of water and twice with 50 ml of saturated sodium chloride solution, dried over sodium sulphate and concentrated under reduced pressure. A yellow solid is obtained. Yield: 9.4 g (15.2 mmol), 80%; purity 95% by $^{1}$H NMR.

Example L1200: Synthesis of the Ligands

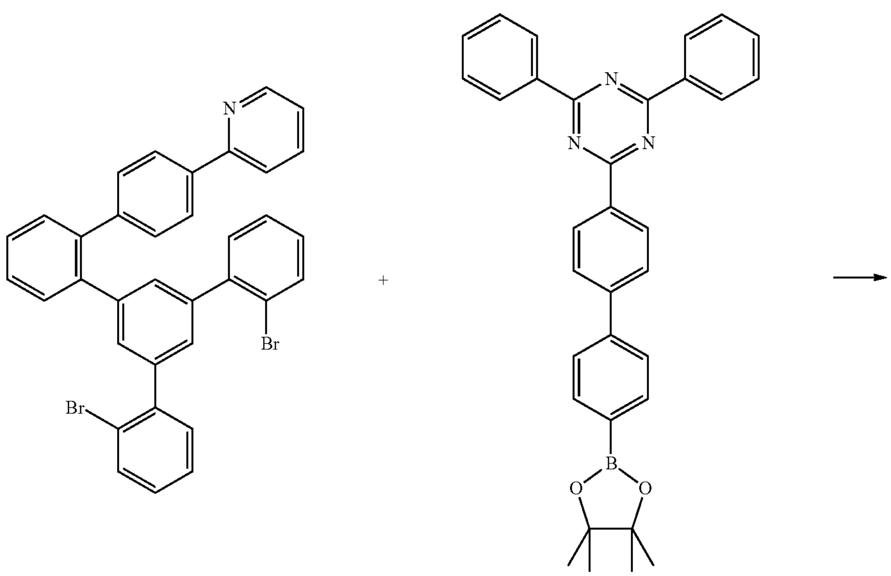

-continued

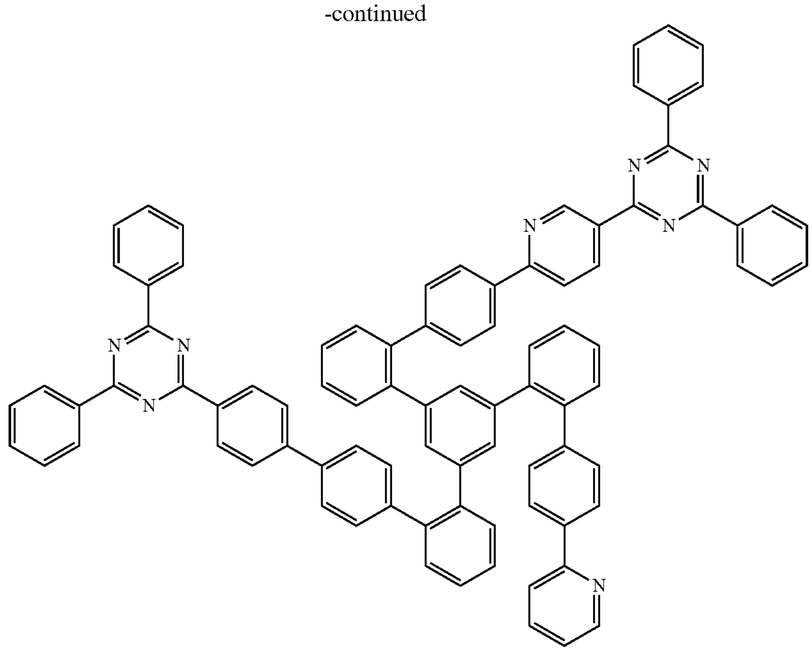

Into a 1 l four-neck flask with reflux condenser, argon blanketing, precision glass stirrer and internal thermometer are weighed 10 g of S1200 (16.2 mmol), 19.9 g of S1100 (38.9 mmol) and 14.8 g of caesium fluoride (97 mmol), the flask is inertized with argon and then 500 ml of diethylene glycol dimethyl ether and 50 g of glass beads (diameter 3 mm) are added. The reaction mixture is inertized under an argon atmosphere for 15 min, then 569 mg of bis(triphenylphosphine)palladium(II) chloride (0.81 mmol) [13965-03-2] are added and the reaction mixture is stirred at internal temperature 130° C. overnight. After cooling, the solvent is substantially removed by rotary evaporation on a rotary evaporator at about 10 mbar and bath temperature 80° C. and the residue is worked up by extraction with 200 ml of toluene and 300 ml of water in a separating funnel. The aqueous phase is extracted once with 100 ml of toluene, then the combined organic phases are washed once with 200 ml of water and once with 100 ml of saturated sodium chloride solution and dried over sodium sulphate, and the solvent is removed under reduced pressure. The residue is chromatographed on silica gel. Gradient elution: eluent: heptane/ethyl acetate 4:1>heptane/ethyl acetate 3:1. A white solid is obtained. 13.5 g (11.0 mmol), 68%, purity 97% by $^{1}$H NMR.

In an analogous manner, it is possible to synthesize the following ligands:

| Ex. | Product/synthon/purification | Yield |
|---|---|---|
| L1202 | 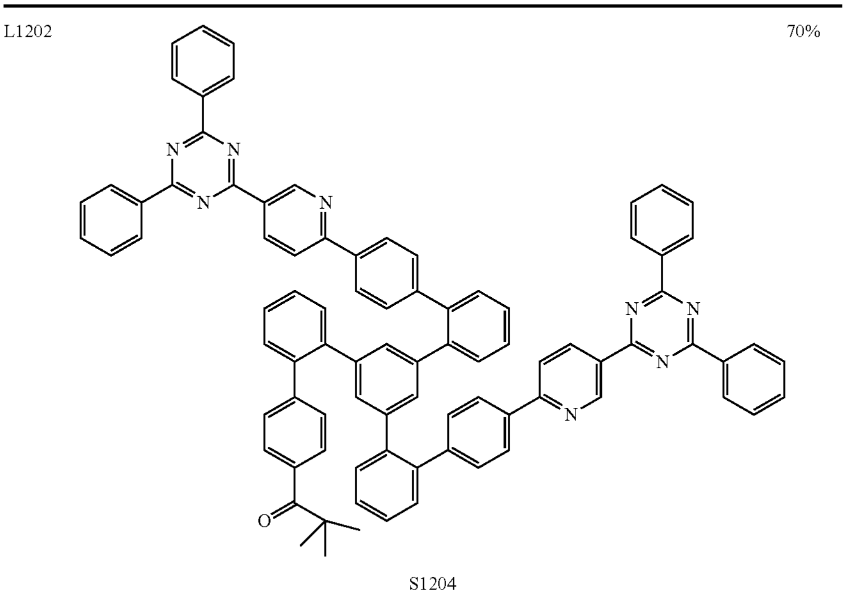 S1204 chromatography toluene/ethyl acetate 9:1 | 70% |

-continued
| Ex. | Product/synthon/purification | Yield |
| --- | --- | --- |
| L1204 | 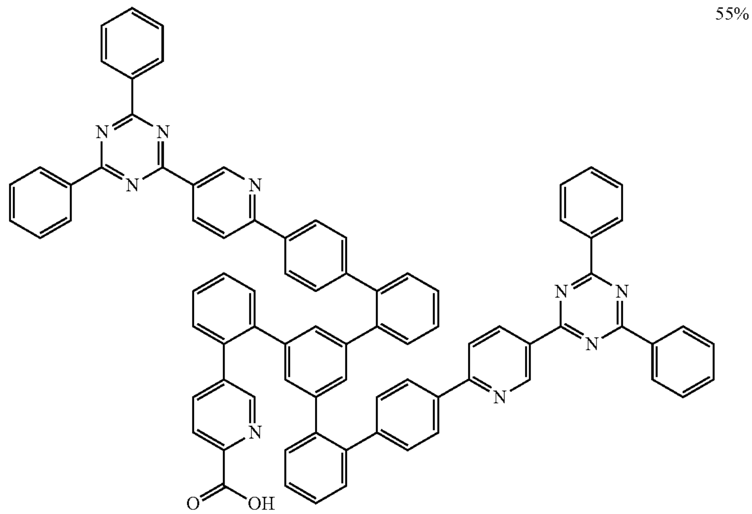 S1206 chromatography toluene/ethyl acetate 2:1 → toluene/ethyl acetate 1:2 | 55% |
Example L1201: Synthesis of the Ligands am
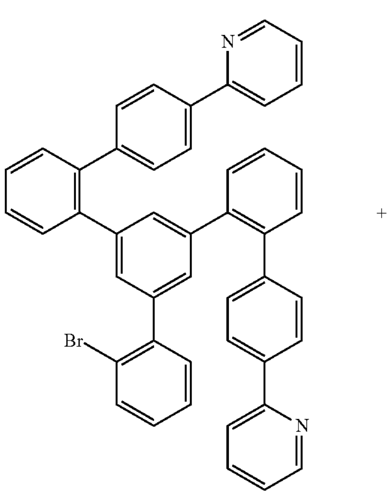
-continued
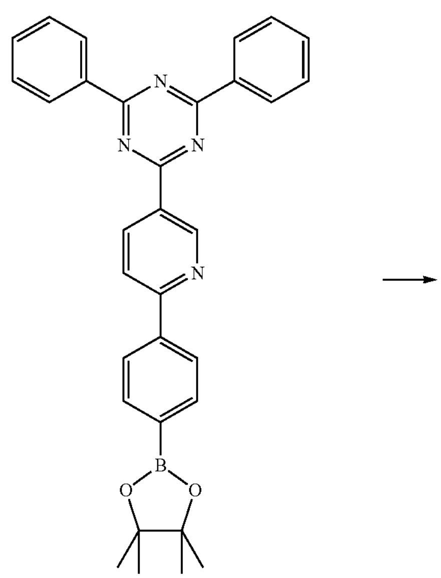

-continued

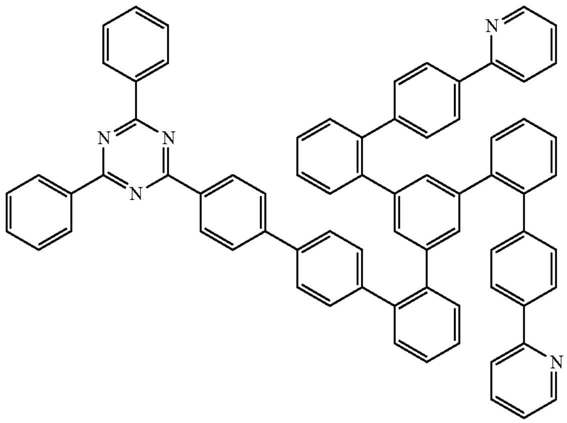

Into a 1 l four-neck flask with reflux condenser, argon blanketing, precision glass stirrer and internal thermometer are weighed 10 g of S1201 (14.5 mmol), 8.9 g of S1100 (17.3 mmol) and 13.2 g of caesium fluoride (87 mmol), the flask is inertized with argon and then 400 ml of diethylene glycol dimethyl ether and 50 g of glass beads (diameter 3 mm) are added. The reaction mixture is inertized under an argon atmosphere for 15 min, then 509 mg of bis(triphenylphosphine)palladium(II) chloride (0.73 mmol) [13965-03-2] are added and the reaction mixture is stirred at internal temperature 130° C. overnight. After cooling, the solvent is substantially removed by rotary evaporation on a rotary evaporator at about 10 mbar and bath temperature 80° C. and the residue is worked up by extraction with 200 ml of toluene and 300 ml of water in a separating funnel. The aqueous phase is extracted once with 100 ml of toluene, then the combined organic phases are washed once with 200 ml of water and once with 100 ml of saturated sodium chloride solution and dried over sodium sulphate, and the solvent is removed under reduced pressure. The residue is chromatographed on silica gel. Gradient elution: eluent: dichloromethane>dichloromethane/ethyl acetate 95:5. The yellow solid obtained is recrystallized from 60 ml of ethyl acetate at reflux. A white solid is obtained. 10.7 g (10.7 mmol), 74%, purity 99% by $^{1}$H NMR.

In an analogous manner, it is possible to synthesize the following ligands:

| Ex. | Product/synthon/purification | Yield |
| --- | --- | --- |
| L1203 | 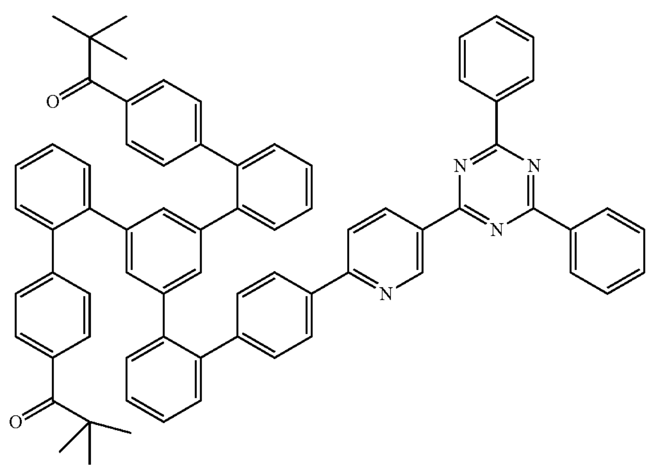 S1205 chromatography toluene/ethyl acetate 20:1 → toluene/ethyl acetate 10:1 | 65% |

-continued
| Ex. | Product/synthon/purification | Yield |
|---|---|---|
| L1205 | 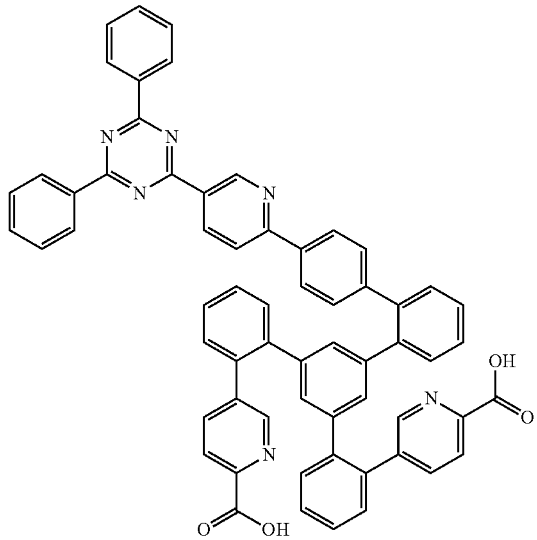 S1207 chromatography toluene/ethyl acetate 2:1 → toluene/ethyl acetate 1:3 | 58% |
I: Synthesis of the Metal Complexes—Part 3
Example Ir(L1200)
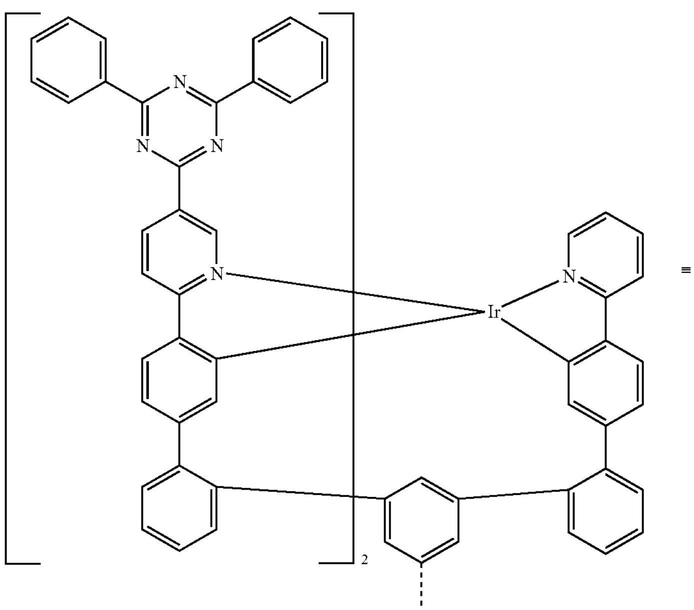

-continued

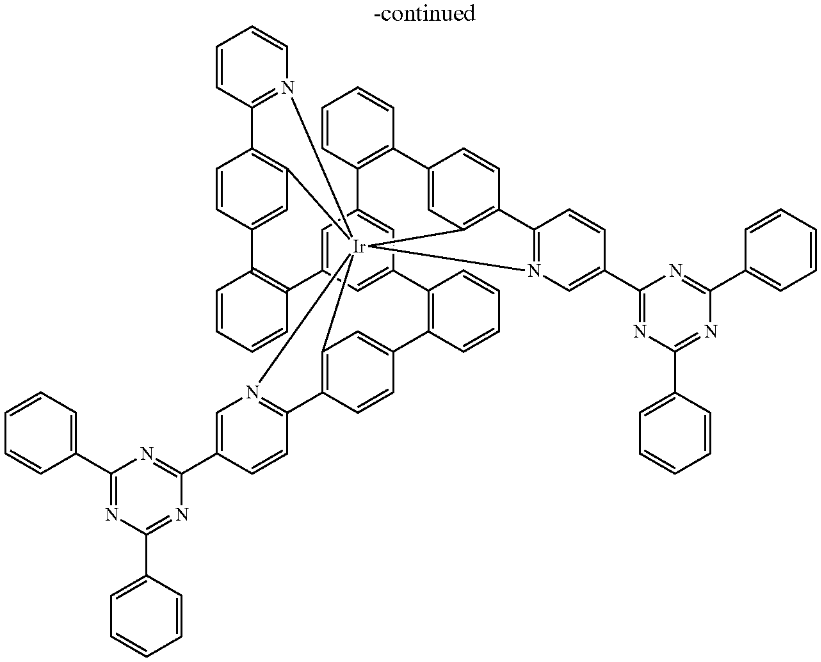

Procedure analogous to that described in the synthesis of Ir(L1000) (see B. Synthesis of the metal complexes, Variant A). The crude product is columned on silica gel with toluene as eluent. The crude product is purified further by continuous hot extraction five times with ethyl acetate/acetonitrile 1:1 (extractant, amount initially charged in each case about 150 ml, extraction thimble: standard Soxhlet thimbles made from cellulose from Whatman) with careful exclusion of air and light. Finally, the product is heat-treated (p about $10^{-6}$ mbar, T up to 250° C.) or sublimed (p about $10^{-6}$ mbar, T 300-400° C.) under high vacuum. A red solid is obtained. Yield: 8.5 g (6.0 mmol), 60%. Purity: >99.9% by HPLC.

In an analogous manner, it is possible to prepare the following complexes:

| Ex. | Ir complex | Ligand<br>Variant<br>Temperature<br>Reaction time<br>Extractant | Yield |
|---|---|---|---|
| Ir(L1201) | 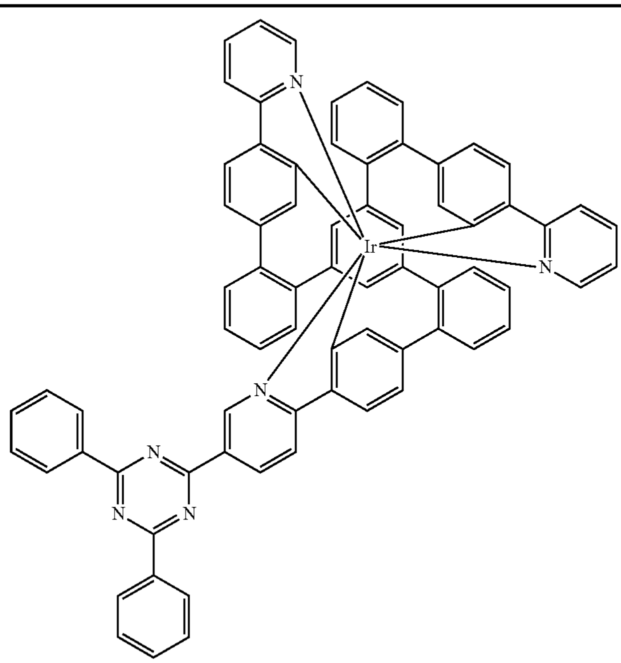 | L1201<br>A<br>250° C.<br>2 h<br>cyclohexane | 60% |

-continued
| Ex. | Ir complex | Ligand Variant Temperature Reaction time Extractant | Yield |
|---|---|---|---|
| Ir(L1202) | 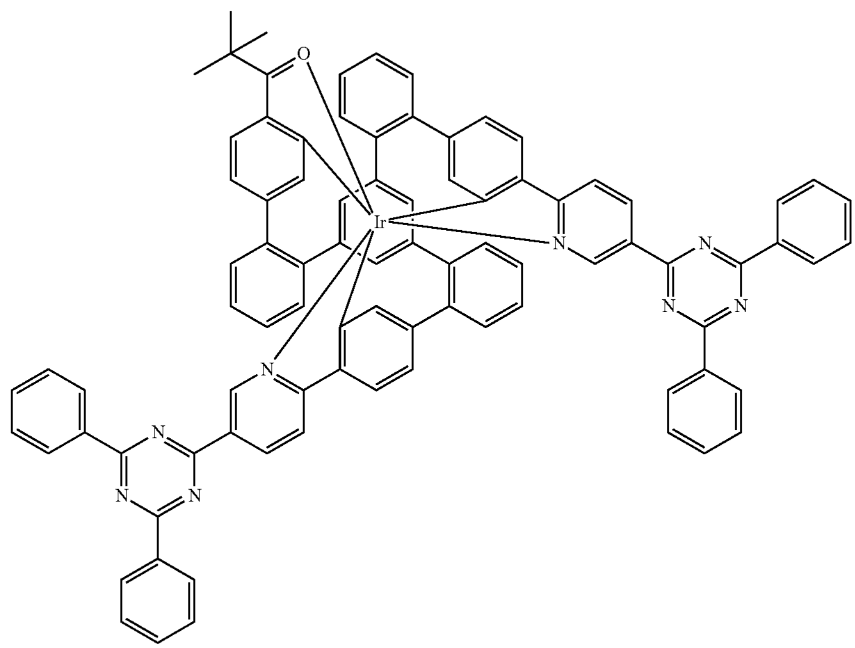 | L1202 A 250° C. 2.5 h acetonitrile/ethyl acetate 1:1 | 40% |
| Ir(L1204) | 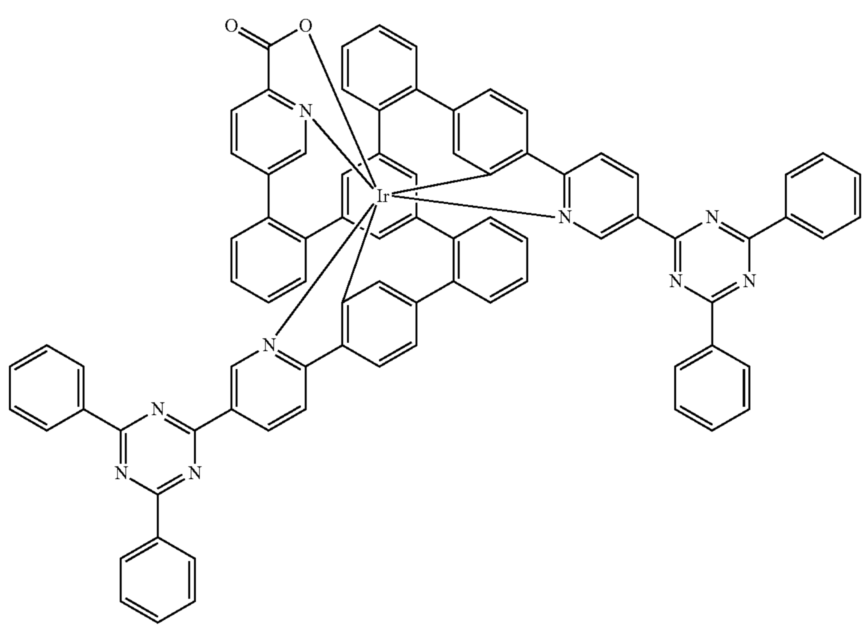 | L1204 A 250° C. 2 h cyclohexane | 54% |

-continued

| Ex. | Ir complex | Ligand Variant Temperature Reaction time Extractant | Yield |
|---|---|---|---|
| Ir(L1203) | 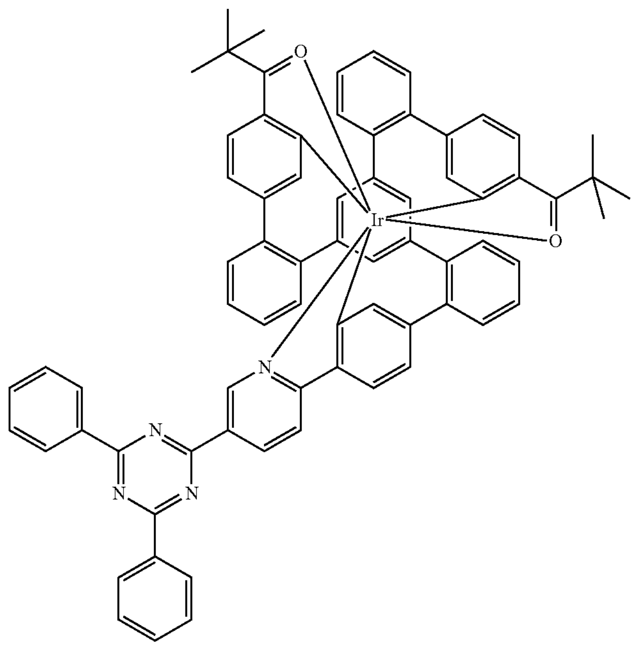 | L1203<br>A<br>250° C.<br>3 h<br>cyclohexane | 14% |
| Ir(L1205) | 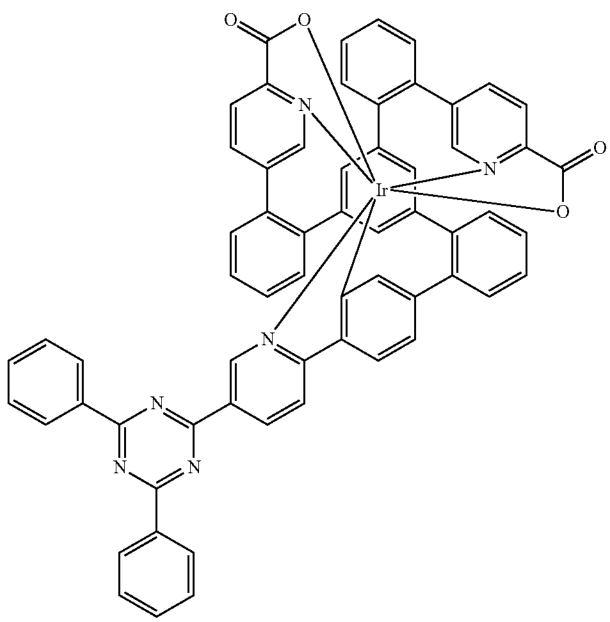 | L1205<br>A<br>250° C.<br>2 h<br>ethyl acetate | 16% |

Example A: Thermal and Photophysical Properties and Oxidation and Reduction Potentials Table 1 collates the thermal and photochemical properties and oxidation and reduction potentials of the comparative materials IrPPy, Ir1 to 4 (for structures see Table 13) and the selected materials of the invention. The compounds of the invention have improved thermal stability and photostability compared to the materials according to the prior art. While materials according to the prior art exhibit brown discolouration and ashing after thermal storage at 380° C. for 7 days and secondary components in the region of >2 mol % can be detected in the $^{1}$H NMR, the complexes of the invention are inert under these conditions. This thermal robustness is crucial especially for the processing of the materials under high vacuum (vapour small-molecule devices). In addition, the compounds of the invention have very good photostability in anhydrous $C_6D_6$ solution under irradiation with light of wavelength about 455 nm. More particularly, in contrast to prior art complexes containing bidentate ligands, no facial-meridional isomerization is detectable in the $^1$H NMR. As can be inferred from Table 1, the compounds of the invention in solution show universally very high PL quantum efficiencies.

TABLE 1

| Complex | Therm. stab.<br>Photo. stab. | PL-max.<br>FWHM | PLQE | HOMO<br>LUMO |
|---|---|---|---|---|
| Comparative examples, for structures see Table 13 | | | | |
| IrPPy | decomposition | 509 | 0.97 | — |
| | decomposition | 67 | toluene | — |
| Ir1 | — | 513 | 0.97 | −5.09 |
| | — | 60 | toluene | −1.99 |
| Ir2 | decomposition | 516 | 0.97 | −5.05 |
| | decomposition | 69 | toluene | −1.71 |
| Ir3 | decomposition | 510* | 0.76* | — |
| | decomposition | — | BuCN | — |
| Ir4 | decomposition | 524* | 0.79* | — |
| | decomposition | — | MeCN | — |
| Ir6 | decomposition | 595 | 0.82 | −5.18 |
| | decomposition | 63 | toluene | −2.70 |
| Inventive examples | | | | |
| Ir(L1) | — | 545 | 1.00 | −4.84 |
| | — | 66 | toluene | −1.99 |
| Ir(L2) | no decomp. | 530 | 0.98 | −5.07 |
| | no decomp. | 66 | toluene | −2.12 |
| | | | 0.93 | |
| | | | MeCN | |
| Ir(L14) | no decomp. | 522 | 1.00 | −5.02 |
| | no decomp. | 64 | toluene | −1.98 |
| Ir(L34) | — | 586 | 0.75 | −4.89 |
| | — | 86 | toluene | −2.42 |
| Ir(L48) | no decomp. | 535 | 0.94 | −5.06 |
| | no decomp. | 70 | toluene | −2.11 |
| Ir(L71) | no decomp. | 543 | 0.98 | — |
| | no decomp. | 74 | toluene | — |
| Ir(L72) | no decomp. | 520 | 0.97 | −5.07 |
| | no decomp. | 64 | toluene | −1.99 |
| Ir(L97) | no decomp. | 520 | 0.74 | — |
| | no decomp. | 73 | THF | — |
| Ir(L98) | no decomp. | 505 | 0.94 | — |
| | no decomp. | 38 | toluene | — |
| Ir(L111) | no decomp. | 519 | 0.99 | −4.99 |
| | no decomp. | 61 | toluene | −1.94 |
| Ir(L112) | — | 527 | 0.91 | — |
| | — | 71 | DCM | — |
| Ir(L114) | — | 497, 536 | 0.77 | −5.05 |
| | — | 32 | toluene | — |
| Ir(L200) | no decomp. | 523 | 0.97 | −5.03 |
| | no decomp. | 60 | toluene | −2.01 |
| Ir(L204) | — | 526 | 0.94 | — |
| | — | 65 | toluene | — |
| Ir(L200) | no decomp. | 523 | 0.97 | −5.03 |
| | no decomp. | 60 | toluene | −2.01 |
| Ir(L220) | no decomp. | 523 | 0.97 | — |
| | no decomp. | 60 | toluene | — |
| Ir101 | — | 526 | 0.97 | — |
| | — | 62 | toluene | — |
| Ir109 | — | 535 | 0.96 | −5.09 |
| | — | 65 | toluene | −2.19 |
| Ir110 | — | 520 | 0.97 | −5.07 |
| | — | 56 | toluene | −2.06 |
| Ir111 | — | 519 | 0.96 | — |
| | — | 60 | toluene | — |
| Ir112 | — | 517 | 0.97 | — |
| | — | 57 | toluene | — |
| Ir113 | — | 519 | 0.94 | — |
| | — | 64 | DCM | — |
| Ir114 | — | 524 | 0.97 | — |
| | — | 59 | toluene | — |
| Ir115 | — | 518 | 0.95 | — |
| | — | 56 | DCM | — |
| Ir116 | no decomp. | 520 | 0.97 | −5.01 |
| | no decomp. | 55 | toluene | −1.91 |
| Ir117 | no decomp. | 515 | 0.98 | — |
| | no decomp. | 55 | toluene | — |

TABLE 1-continued

| Complex | Therm. stab.<br>Photo. stab. | PL-max.<br>FWHM | PLQE | HOMO<br>LUMO |
|---|---|---|---|---|
| Ir118 | no decomp. | 516 | 0.98 | — |
| | no decomp. | 55 | toluene | — |
| Ir119 | — | 522 | 0.97 | — |
| | — | 59 | toluene | — |
| Ir120 | — | 523 | 0.95 | — |
| | — | 56 | toluene | — |
| Ir121 | — | 519 | 0.97 | — |
| | — | 56 | toluene | — |
| Ir122 | — | 524 | 0.95 | — |
| | — | 58 | toluene | — |
| Ir123 | — | 519 | 0.97 | −5.08 |
| | — | 54 | toluene | −2.01 |
| Ir124 | — | 524 | 0.99 | — |
| | — | 55 | toluene | — |
| Ir126 | — | 519 | 0.99 | −5.04 |
| | — | 51 | toluene | −1.97 |
| Ir146 | no decomp. | 523 | 0.98 | −5.02 |
| | no decomp. | 56 | toluene | −2.02 |
| Ir301 | no decomp. | 523 | 0.98 | — |
| | no decomp. | 68 | toluene | — |
| Ir303 | no decomp. | 505 | 0.89 | −5.56 |
| | no decomp. | 64 | toluene | −2.41 |
| Ir305 | no decomp. | 491, 526 | toluene | — |
| | no decomp. | 52 | 0.99 | — |
| Ir309 | no decomp. | 506 | toluene | −5.29 |
| | no decomp. | 59 | 0.98 | −2.25 |
| Ir405 | — | 507 | toluene | — |
| | — | 59 | 0.93 | — |
| Ir700 | — | 522 | 0.96 | −5.02 |
| | — | 63 | toluene | −2.02 |
| Ir(L1000) | no decomp. | 604 | 0.84 | −5.21 |
| | | 50 | toluene | — |
| Ir(L1001) | no decomp. | 599 | 0.88 | −5.17 |
| | | 47 | toluene | −2.70 |
| Ir(L1009) | no decomp. | 609 | 0.83 | — |
| | | 54 | toluene | — |
| Ir(L1036) | no decomp. | 593 | 0.84 | — |
| | | 47 | toluene | — |
| Ir1000 | no decomp. | 609 | 0.90 | — |
| | | 46 | toluene | — |
| Ir1001 | no decomp. | 605 | 0.90 | — |
| | | 45 | toluene | — |
| Ir1002 | no decomp. | 613 | 0.85 | −5.18 |
| | | 48 | toluene | −2.83 |
| Ir1003 | no decomp. | 604 | 0.91 | — |
| | | 47 | toluene | — |
| Ir1004 | no decomp. | 610 | — | — |
| | | 51 | — | — |
| Ir1005 | no decomp. | 618 | — | — |
| | | 55 | — | — |
| Ir1006 | no decomp. | 615 | — | — |
| | | 51 | — | — |
| Ir1007 | no decomp. | 615 | — | — |
| | | 50 | — | — |
| Ir(L1200) | no decomp. | 618 | — | — |
| | | 77 | — | — |
| Ir(L1201) | no decomp. | 626 | 0.67 | — |
| | | 86 | toluene | — |

*Data from G. St-Pierre et al., Dalton Trans, 2011, 40, 11726.

Legend:

Therm. stab. (thermal stability):

Storage in ampoules closed by fusion under reduced pressure, 7 days at 380° C. Visual assessment for colour change/brown discolouration/ashing and analysis by means of $^1$H NMR spectroscopy.

Photo. stab. (photochemical stability):

Irradiation of about 1 mmolar solutions in anhydrous $C_6D_6$ (degassed NMR tubes closed by fusion) with blue light (about 455 nm, 1.2 W Lumispot from Dialight Corporation, USA) at RT.

PL-max.:

Maximum of the PL spectrum in [nm] of a degassed about $10^{-5}$ molar solution at RT, excitation wavelength 370 nm, for solvent see PLQE column.

FWHM:

Half-height width of the PL spectrum in [nm] at RT.

PLQE.:

Abs. photoluminescence quantum efficiency of a degassed about. $10^{-5}$ molar solution in the solvent specified at RT.

HOMO, LUMO:

in [eV] vs. vacuum, determined in dichloromethane solution (oxidation) or THF (reduction) with internal ferrocene reference (−4.8 eV vs. vacuum).

Example B: Comparison of the Synthesis Yields of Ir(L2) Vs. Ir3 and Ir(L72) vs. Ir4

Compound Ir(L2) of the invention is obtained under identical synthesis conditions (Variant C*) in a much better yield (79%) than the compound according to the prior art Ir3 (33%). The same applies to Ir(L72) at 68% vs. Ir4 at 37%. Yields for Ir3 and Ir4: see G. St-Pierre et al., Dalton Trans, 2011, 40, 11726.

Example C: Solubility of Selected Complexes at 25° C.

For the processing of the complexes of the invention from solution (spin-coating, inkjet printing, nozzle printing, bar coating, etc.), solutions of prolonged stability having solids contents of about 5 mg/ml or more are required.

TABLE 2

Solubilities of selected complexes

| Complex | Solvent | Solubility |
|---|---|---|
| Ir(L1) | toluene | >5 mg/ml |
| Ir(L64) | anisole | >5 mg/ml |
| Ir(L118) | toluene | >10 mg/ml |
| Ir(L39) | 3-phenoxytoluene | >5 mg/ml |
| Ir(L49) | 3-phenoxytoluene | >10 mg/ml |
| Ir(L53) | toluene | >10 mg/ml |
| Ir(L280) | toluene | >10 mg/ml |
| Ir101 | 3-phenoxytoluene | >10 mg/ml |
| Ir104 | toluene | >20 mg/ml |
| Ir105 | 3-phenoxytoluene | >15 mg/ml |
| Ir108 | 3-phenoxytoluene | >15 mg/ml |
| Ir113 | 3-phenoxytoluene | >15 mg/ml |
| Ir116 | toluene | >5 mg/ml |
| Ir126 | o-xylene | >25 mg/ml |
| Ir127 | o-xylene | >50 mg/ml |
| Ir132 | 3-phenoxytoluene | >50 mg/ml |
| Ir151 | 3-phenoxytoluene | >30 mg/ml |
| Ir152 | 3-phenoxytoluene | >30 mg/ml |
| Ir308 | 3-phenoxytoluene | >20 mg/ml |
| Ir700 | 3-phenoxytoluene | >50 mg/ml |
| Ir1019 | 3-phenoxytoluene | >10 mg/ml |
| Ir1038 | 3-phenoxytoluene | >10 mg/ml |

Example: Production of the OLEDs

1) Vacuum-Processed Devices:

OLEDs of the invention and OLEDs according to the prior art are produced by a general method according to WO 2004/058911, which is adapted to the circumstances described here (variation in layer thickness, materials used).

In the examples which follow, the results for various OLEDs are presented. Glass plaques with structured ITO (50 nm, indium tin oxide) form the substrates to which the OLEDs are applied. The OLEDs basically have the following layer structure: substrate/hole transport layer 1 (HTL1) consisting of HTM doped with 5% NDP-9 (commercially available from Novaled), 20 nm/hole transport layer 2 (HTL2)/optional electron blocker layer (EBL)/emission layer (EML)/optional hole blocker layer (HBL)/electron transport layer (ETL)/optional electron injection layer (EIL) and finally a cathode. The cathode is formed by an aluminium layer of thickness 100 nm.

First of all, vacuum-processed OLEDs are described. For this purpose, all the materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as M3:M2:Ir(L2) (55%:35%:10%) mean here that the material M3 is present in the layer in a proportion by volume of 55%, M2 in a proportion of 35% and Ir(L2) in a proportion of 10%. Analogously, the electron transport layer may also consist of a mixture of two materials. The exact structure of the OLEDs can be found in Table 2. The materials used for production of the OLEDs are shown in Table 13.

The OLEDs are characterized in a standard manner. For this purpose, the electroluminescence spectra, the power efficiency (measured in cd/A) and the voltage (measured at 1000 cd/m$^2$ in V) are determined from current-voltage-brightness characteristics (IUL characteristics). For selected experiments, the lifetime is determined. The lifetime is defined as the time after which the luminance has fallen from a particular starting luminance to a certain proportion. The figure LD50 means that the lifetime specified is the time at which the luminance has dropped to 50% of the starting luminance, i.e. from, for example, 1000 cd/m$^2$ to 500 cd/m$^2$. According to the emission colour, different starting brightnesses are selected. The values for the lifetime can be converted to a figure for other starting luminances with the aid of conversion formulae known to those skilled in the art. In this context, the lifetime for a starting luminance of 1000 cd/m$^2$ is a standard figure.

Use of Compounds of the Invention as Emitter Materials in Phosphorescent OLEDs

One use of the compounds of the invention is as phosphorescent emitter materials in the emission layer in OLEDs. The iridium compounds according to Table 13 are used as a comparison according to the prior art. The results for the OLEDs are collated in Table 4.

TABLE 3

Structure of the OLEDs

| Ex. | HTL2 thickness | EBL thickness | EML thickness | HBL thickness | ETL thickness |
|---|---|---|---|---|---|
| Green OLEDs | | | | | |
| Ref.-D1 | HTM 40 nm | — | M1:IrPPy (90%:10%) 30 nm | — | ETM1:ETM2 (50%:50%) 30 nm |
| Ref.-D2 | HTM 40 nm | — | M1:IrPPy (90%:10%) 30 nm | HBM1 10 nm | ETM1:ETM2 (50%:50%) 30 nm |
| Ref.-D3 | HTM 40 nm | — | M1:IrPPy (85%:15%) 30 nm | HBM1 10 nm | ETM1:ETM2 (50%:50%) 30 nm |
| Ref.-D4 | HTM 40 nm | — | M1:Ir2 (90%:10%) 30 nm | — | ETM1:ETM2 (50%:50%) 30 nm |
| Ref.-D5 | HTM 40 nm | — | M1:Ir2 (90%:10%) 30 nm | HBM1 10 nm | ETM1:ETM2 (50%:50%) 30 nm |
| Ref.-D6 | HTM 40 nm | — | M1:Ir2 (85%:15%) 30 nm | HBM1 10 nm | ETM1:ETM2 (50%:50%) 30 nm |
| Ref.-D7 | HTM 40 nm | — | M1:M3:Ir2 (60%:30%:10%) 30 nm | HBM1 10 nm | ETM1:ETM2 (50%:50%) 30 nm |
| Ref.-D8 | HTM 40 nm | — | M1:Ir3 (90%:10%) 30 nm | HBM1 10 nm | ETM1:ETM2 (50%:50%) 30 nm |
| D1 | HTM 40 nm | — | M1:Ir(L2) (90%:10%) 30 nm | — | ETM1:ETM2 (50%:50%) 30 nm |

TABLE 3-continued

| Structure of the OLEDs | | | | | |
|---|---|---|---|---|---|
| Ex. | HTL2 thickness | EBL thickness | EML thickness | HBL thickness | ETL thickness |
| D2 | HTM 40 nm | — | M1:Ir(L2) (90%:10%) 30 nm | HBM1 10 nm | ETM1:ETM2 (50%:50%) 30 nm |
| D3 | HTM 40 nm | — | M1:Ir(L2) (85%:15%) 30 nm | HBM1 10 nm | ETM1:ETM2 (50%:50%) 30 nm |
| D4 | HTM 40 nm | — | M2:Ir(L2) (85%:15%) 30 nm | HBM1 10 nm | ETM1:ETM2 (50%:50%) 30 nm |
| D5 | HTM 40 nm | — | M1:M3:Ir(L2) (60%:30%:10%) 30 nm | HBM1 10 nm | ETM1:ETM2 (50%:50%) 30 nm |
| D6 | HTM 40 nm | — | M1:M3:Ir(L14) (60%:30%:10%) 30 nm | HBM1 10 nm | ETM1:ETM2 (50%:50%) 30 nm |

TABLE 4

| Results for the vacuum-processed OLEDs | | | | |
|---|---|---|---|---|
| Ex. | EQE (%) 1000 cd/m$^2$ | Voltage (V) 1000 cd/m$^2$ | CIE x/y 1000 cd/m$^2$ | LD50 (h) 1000 cd/m$^2$ |
| Green OLEDs | | | | |
| Ref.-D1 | 15.8 | 2.7 | 0.33/062 | 55000 |
| Ref.-D2 | 15.6 | 3.3 | 0.33/062 | 70000 |
| Ref.-D3 | 16.0 | 3.3 | 0.33/062 | 85000 |
| Ref.-D4 | 17.4 | 2.5 | 0.35/0.61 | 160000 |
| Ref.-D5 | 17.3 | 3.2 | 0.35/0.61 | 210000 |
| Ref.-D6 | 17.7 | 3.2 | 0.35/0.62 | 240000 |
| Ref.-D7 | 17.6 | 3.1 | 0.35/0.62 | 340000 |
| Ref.-D8 | 17.8 | 3.2 | 0.34/0.62 | 180000 |
| D1 | 17.8 | 2.6 | 0.40/0.59 | 320000 |
| D2 | 18.1 | 3.0 | 0.40/0.59 | 360000 |
| D3 | 18.3 | 2.9 | 0.40/0.58 | 430000 |
| D4 | 19.7 | 3.0 | 0.40/0.59 | 450000 |
| D5 | 19.2 | 3.0 | 0.40/0.59 | 480000 |
| D6 | 20.3 | 3.1 | 0.37/0.61 | 570000 |

2) Further Vacuum-Processed Components

Examples D7 to D84 and Ref-D9 and Ref-D14 which follow (see Tables 5 and 6) present data of further OLEDs. Processing is effected as described in 1), except that other substrates described hereinafter are used: Cleaned glass plaques (cleaning in Miele laboratory glass washer, Merck Extran detergent) coated with structured ITO (indium tin oxide) of thickness 50 nm are pretreated with UV ozone for 25 minutes (PR-100 UV ozone generator from UVP) and, within 30 min, for improved processing, coated with 20 nm of PEDOT:PSS (poly(3,4-ethylenedioxythiophene) poly (styrenesulphonate), purchased as CLEVIOS™ P VP AI 4083 from Heraeus Precious Metals GmbH Deutschland, spun on from aqueous solution) and then baked at 180° C. for 10 min. These coated glass plaques form the substrates to which the OLEDs are applied.

In Examples D27, D28, Ref-D13 and Ref-D14, rather than the 20 nm-thick HTM layer doped with 5% NDP-9, a 20 nm-thick HTM2 layer doped with 5% NDP-9 is used.

The OLEDs are characterized in a standard manner. For this purpose, the electroluminescence spectra, the current efficiency (measured in cd/A), the power efficiency (measured in Im/W) and the external quantum efficiency (EQE, measured in percent) as a function of luminance, calculated from current-voltage-luminance characteristics (IUL characteristics) assuming Lambertian radiation characteristics, and also the lifetime are determined. The electroluminescence spectra are determined at a luminance of 1000 cd/m$^2$, and the CIE 1931 x and y colour coordinates are calculated therefrom. The parameter U1000 in Table 6 refers to the voltage which is required for a luminance of 1000 cd/m$^2$. EQE1000 refers to the external quantum efficiency at an operating luminance of 1000 cd/m$^2$.

The lifetime LT80 is defined as the time after which the luminance drops to 80% of the starting luminance in the course of operation with a constant current of 40 mA/cm$^2$.

TABLE 5

| Construction of the further vacuum-processed OLEDs | | | | | |
|---|---|---|---|---|---|
| Ex. | HTL2 thickness | EBL thickness | EML thickness | HBL thickness | ETL thickness |
| D7 | HTM 40 nm | | M1:Ir116 (95%:5%) 30 nm | ETM1 10 nm | ETM1:ETM2 (50%:50%) 30 nm |
| D8 | HTM 40 nm | | M1:Ir116 (90%:10%) 30 nm | ETM1 10 nm | ETM1:ETM2 (50%:50%) 30 nm |
| D9 | HTM 40 nm | | M1:Ir116 (85%:15%) 30 nm | ETM1 10 nm | ETM1:ETM2 (50%:50%) 30 nm |
| D10 | HTM 40 nm | | M1:Ir116 (80%:20%) 30 nm | ETM1 10 nm | ETM1:ETM2 (50%:50%) 30 nm |
| D11 | HTM 40 nm | | M1:M3:Ir116 (45%:45%:10%) 30 nm | ETM1 10 nm | ETM1:ETM2 (50%:50%) 30 nm |
| D12 | HTM 40 nm | | M1:M3:Ir116 (60%:30%:10%) 30 nm | ETM1 10 nm | ETM1:ETM2 (50%:50%) 30 nm |
| D13 | HTM 40 nm | | M6:Ir116 (90%:10%) 30 nm | ETM1 10 nm | ETM1:ETM2 (50%:50%) 30 nm |
| D14 | HTM 40 nm | | M6:Ir116 (85%:15%) 30 nm | ETM1 10 nm | ETM1:ETM2 (50%:50%) 30 nm |
| D15 | HTM 40 nm | | M1:Ir(L111) (85%:15%) 30 nm | ETM1 10 nm | ETM1:ETM2 (50%:50%) 30 nm |
| D16 | HTM 40 nm | | M6:Ir(L111) (85%:15%) 30 nm | ETM1 10 nm | ETM1:ETM2 (50%:50%) 30 nm |
| D17 | HTM 40 nm | | M1:M3:Ir(L111) (40%:40%:20%) 30 nm | ETM1 10 nm | ETM1:ETM2 (50%:50%) 30 nm |
| D18 | HTM 40 nm | | M1:Ir(L48) (90%:10%) 30 nm | ETM1 10 nm | ETM1:ETM2 (50%:50%) 30 nm |
| D19 | HTM 40 nm | | M1:Ir(L48) (85%:15%) 30 nm | ETM1 10 nm | ETM1:ETM2 (50%:50%) 30 nm |
| D20 | HTM 40 nm | | M1:Ir(L48) (80%:20%) 30 nm | ETM1 10 nm | ETM1:ETM2 (50%:50%) 30 nm |
| D21 | HTM 40 nm | | M1:M3:Ir(L48) (45%:45%:10%) 30 nm | ETM1 10 nm | ETM1:ETM2 (50%:50%) 30 nm |
| D22 | HTM 40 nm | | M1:M3:Ir(L48) (42.5%:42.5%:15%) 30 nm | ETM1 10 nm | ETM1:ETM2 (50%:50%) 30 nm |
| D23 | HTM 40 nm | | M1:M3:Ir(L48) (60%:30%:10%) 30 nm | ETM1 10 nm | ETM1:ETM2 (50%:50%) 30 nm |
| D24 | HTM 40 nm | | M1:M3:Ir(L48) (30%:60%:10%) 30 nm | ETM1 10 nm | ETM1:ETM2 (50%:50%) 30 nm |
| D25 | HTM 40 nm | | M1:M3:Ir(L48) (57%:28%:15%) 30 nm | ETM1 10 nm | ETM1:ETM2 (50%:50%) 30 nm |

TABLE 5-continued

Construction of the further vacuum-processed OLEDs

| Ex. | HTL2 thickness | EBL thickness | EML thickness | HBL thickness | ETL thickness |
|---|---|---|---|---|---|
| D26 | HTM 40 nm | | M7:M3:Ir(L14) (60%:30%:10%) 30 nm | ETM1 10 nm | ETM1:ETM2 (50%:50%) 30 nm |
| D27 | HTM2 40 nm | | M1:M3:Ir(L14) (45%:45%:10%) 30 nm | ETM1 10 nm | ETM1:ETM2 (50%:50%) 30 nm |
| D28 | HTM2 40 nm | | M1:M3:Ir(L14-D9) (45%:45%:10%) 30 nm | ETM1 10 nm | ETM1:ETM2 (50%:50%) 30 nm |
| D29 | HTM2 40 nm | | M1:M3:Ir(L14) (47.5%:47.5%:5%) 30 nm | ETM1 10 nm | ETM1:ETM2 (50%:50%) 30 nm |
| D30 | HTM 40 nm | | M2:M3:Ir(L2) (45%:45%:10%) 30 nm | ETM1 10 nm | ETM1:ETM2 (50%:50%) 30 nm |
| D31 | HTM 40 nm | | M2:M3:Ir(L2) (60%:30%:10%) 30 nm | ETM1 10 nm | ETM1:ETM2 (50%:50%) 30 nm |
| D32 | HTM2 40 nm | | M1:M3:Ir(L3) (45%:45%:10%) 30 nm | ETM1 10 nm | ETM1:ETM2 (50%:50%) 30 nm |
| D33 | HTM 50 nm | | M1:M3:Ir(L20) (40%:50%:10%) 35 nm | ETM1 10 nm | ETM1:ETM2 (50%:50%) 30 nm |
| D34 | HTM 50 nm | | M1:M3:Ir(L18) (40%:50%:10%) 35 nm | ETM1 10 nm | ETM1:ETM2 (50%:50%) 30 nm |
| D35 | HTM 40 nm | | M1:M3:Ir(L23) (40%:45%:15%) 30 nm | ETM1 10 nm | ETM1:ETM2 (50%:50%) 30 nm |
| D36 | HTM 40 nm | | M1:M3:Ir(L117) (35%:55%:10%) 30 nm | ETM1 10 nm | ETM1:ETM2 (50%:50%) 30 nm |
| D37 | HTM 40 nm | | M6:Ir(L27) (85%:15%) 30 nm | ETM1 10 nm | ETM1:ETM2 (50%:50%) 30 nm |
| D38 | HTM 40 nm | | M1:M3:Ir(L51) (45%:40%:15%) 30 nm | ETM1 10 nm | ETM1:ETM2 (50%:50%) 30 nm |
| D39 | HTM 40 nm | | M1:M3:Ir(L71) (45%:40%:15%) 35 nm | ETM1 10 nm | ETM1:ETM2 (50%:50%) 30 nm |
| D40 | HTM 40 nm | | M1:M3:Ir(L79) (20%:60%:20%) 30 nm | ETM1 10 nm | ETM1:ETM2 (50%:50%) 30 nm |
| D41 | HTM 40 nm | | M8:M9:Ir(L88) (55%:30%15%) 30 nm | ETM1 10 nm | ETM1:ETM2 (50%:50%) 30 nm |
| D42 | HTM 40 nm | | M1:Ir(L112) (85%:15%) 30 nm | ETM1 10 nm | ETM1:ETM2 (50%:50%) 30 nm |
| D43 | HTM 30 nm | | M8:Ir(123) (85%:15%) 30 nm | ETM1 10 nm | ETM1:ETM2 (50%:50%) 30 nm |
| D44 | HTM 40 nm | | M1:Ir(L128) (85%:15%) 30 nm | ETM1 10 nm | ETM1:ETM2 (50%:50%) 30 nm |
| D45 | HTM 40 nm | | M8:Ir(L133) (85%:15%) 30 nm | ETM1 10 nm | ETM1:ETM2 (50%:50%) 30 nm |
| D46 | HTM 50 nm | | M1:Ir(L138) (85%:15%) 40 nm | ETM1 5 nm | ETM1:ETM2 (50%:50%) 30 nm |
| D47 | HTM 40 nm | | M1:M3:Ir(L138) (42.5%:42.5%:15%) 30 nm | ETM1 10 nm | ETM1:ETM2 (50%:50%) 30 nm |
| D48 | HTM 40 nm | | M1:M9:Ir(L146) (50%:40%:10%) 30 nm | ETM1 10 nm | ETM1:ETM2 (50%:50%) 30 nm |
| D49 | HTM 40 nm | | M1:M3:Ir(L200) (60%:30%:10%) 30 nm | ETM1 10 nm | ETM1:ETM2 (50%:50%) 30 nm |
| D50 | HTM 40 nm | | M1:M3:Ir(L201) (60%:30%:10%) 30 nm | ETM1 10 nm | ETM1:ETM2 (50%:50%) 30 nm |
| D51 | HTM 40 nm | | M1:M3:Ir(L202) (60%:30%:10%) 30 nm | ETM1 10 nm | ETM1:ETM2 (50%:50%) 30 nm |
| D52 | HTM 40 nm | | M1:M3:Ir(L206) (50%:35%:15%) 30 nm | ETM1 10 nm | ETM1:ETM2 (50%:50%) 30 nm |
| D53 | HTM 40 nm | | M1:M3:Ir(L204) (60%:30%:10%) 30 nm | ETM1 10 nm | ETM1:ETM2 (50%:50%) 30 nm |
| D54 | HTM 40 nm | | M1:M3:Ir(L222) (40%:45%:15%) 30 nm | ETM1 10 nm | ETM1:ETM2 (50%:50%) 30 nm |
| D55 | HTM 40 nm | | M1:M3:Ir(L255) (40%:45%:15%) 30 nm | ETM1 10 nm | ETM1:ETM2 (50%:50%) 30 nm |
| D56 | HTM 40 nm | | M1:M3:Ir(L271) (40%:40%:20%) 30 nm | ETM1 10 nm | ETM1:ETM2 (50%:50%) 30 nm |
| D57 | HTM 30 nm | Ir116 20 nm | M1:M9:Ir(L67) (60%:20%:20%) | ETM1 10 nm 30 nm | ETM1:ETM2 (50%:50%) 30 nm |
| D58 | HTM2 40 nm | | M1:M3:Ir(L274) (50%:40%:10%) 30 nm | ETM1 10 nm | ETM1:ETM2 (50%:50%) 30 nm |
| D59 | HTM 40 nm | | M1:M3:Ir301 (40%:45%:15%) 30 nm | ETM1 10 nm | ETM1:ETM2 (50%:50%) 30 nm |
| D60 | HTM 40 nm | | M1:M3:Ir302 (20%:70%:10%) 30 nm | ETM1 10 nm | ETM1:ETM2 (50%:50%) 30 nm |
| D61 | HTM 40 nm | | M1:M9:Ir305 (60%:30%:10%) 30 nm | ETM1 10 nm | ETM1:ETM2 (50%:50%) 30 nm |
| D62 | HTM 40 nm | | M1:M9:Ir306 (60%:30%:10%) 30 nm | ETM1 10 nm | ETM1:ETM2 (50%:50%) 30 nm |
| D63 | HTM 40 nm | | M1:M3:Ir307 (40%:45%:15%) 30 nm | ETM1 10 nm | ETM1:ETM2 (50%:50%) 30 nm |
| D64 | HTM 40 nm | | M1:M9:Ir311 (60%:30%:10%) 30 nm | ETM1 10 nm | ETM1:ETM2 (50%:50%) 30 nm |
| D65 | HTM 40 nm | | M1:M9:Ir313 (60%:25%:15%) 30 nm | ETM1 10 nm | ETM1:ETM2 (50%:50%) 30 nm |
| D66 | HTM 40 nm | | M1:M3:Ir150 (45%:45%:10%) 30 nm | ETM1 10 nm | ETM1:ETM2 (50%:50%) 30 nm |
| D67 | HTM 40 nm | | M1:M3:IrL760-1 (45%:45%:10%) 30 nm | ETM1 10 nm | ETM1:ETM2 (50%:50%) 30 nm |
| D68 | HTM 40 nm | | M1:M3:Ir146 (45%:40%:15%) 30 nm | ETM1 10 nm | ETM1:ETM2 (50%:50%) 30 nm |
| D69 | HTM 40 nm | | M7:M10:Ir(L25) (50%:30%:20%) 30 nm | ETM1 10 nm | ETM1:ETM2 (50%:50%) 30 nm |
| D70 | HTM 40 nm | | M1:M3:Ir(L8) (45%:45%:10%) 30 nm | ETM1 10 nm | ETM1:ETM2 (50%:50%) 30 nm |
| D71 | HTM 40 nm | | M1:M3:Ir(L20) (40%:40%:20%) 30 nm | ETM1 10 nm | ETM1:ETM2 (50%:50%) 30 nm |
| D72 | HTM2 40 nm | | M1:M3:Ir(L99) (60%:30%:10%) 40 nm | ETM1 10 nm | ETM1:ETM2 (50%:50%) 30 nm |
| D73 | HTM2 40 nm | | M1:M3:Ir(L101) (60%:30%:10%) 30 nm | ETM1 10 nm | ETM1:ETM2 (50%:50%) 30 nm |

TABLE 5-continued

Construction of the further vacuum-processed OLEDs

| Ex. | HTL2 thickness | EBL thickness | EML thickness | HBL thickness | ETL thickness |
|---|---|---|---|---|---|
| D74 | HTM 40 nm | | M1:M3:Ir(L121) (55%:30%:15%) 40 nm | ETM1 10 nm | ETM1:ETM2 (50%:50%) 30 nm |
| D75 | HTM 40 nm | | M1:M9:Ir(L145) (60%:30%:10%) 30 nm | ETM1 10 nm | ETM1:ETM2 (50%:50%) 30 nm |
| D76 | HTM 40 nm | | M1:M3:Ir(L82) (45%:40%:15%) 40 nm | ETM1 10 nm | ETM1:ETM2 (50%:50%) 30 nm |
| D77 | HTM 40 nm | | M1:M3:Ir(L88) (35%:50%:15%) 30 nm | ETM1 10 nm | ETM1:ETM2 (50%:50%) 30 nm |
| D78 | HTM 40 nm | | M1:M3:Ir(L89) (35%:50%:15%) 30 nm | ETM1 10 nm | ETM1:ETM2 (50%:50%) 30 nm |
| D79 | HTM2 40 nm | | M1:M3:Ir(L210) (55%:30%:15%) 40 nm | ETM1 10 nm | ETM1:ETM2 (50%:50%) 30 nm |
| D80 | HTM 40 nm | | M1:M3:Ir(L233) (65%:30%:5%) 30 nm | ETM1 10 nm | ETM1:ETM2 (50%:50%) 30 nm |
| D81 | HTM 40 nm | | M1:M3:Ir(L69) (45%:45%:10%) 30 nm | ETM1 10 nm | ETM1:ETM2 (50%:50%) 30 nm |
| D82 | HTM 40 nm | | M6:Ir116 (85%:15%) 30 nm | ETM1 10 nm | M200 30 nm |
| D83 | HTM 40 nm | | M6:Ir116 (85%:15%) 30 nm | ETM1 10 nm | M400 30 nm |
| D84 | HTM 40 nm | | M1:M3:Ir(L257) (45%:45%:10%) 30 nm | ETM1 10 nm | ETM1:ETM2 (50%:50%) 30 nm |
| Ref-D9 | HTM 40 nm | | M1:IrPPy (85%:15%) 30 nm | ETM1 10 nm | ETM1:ETM2 (50%:50%) 30 nm |
| Ref-D10 | HTM 40 nm | | M1:Ir2 (85%:15%) 30 nm | ETM1 10 nm | ETM1:ETM2 (50%:50%) 30 nm |
| Ref-D11 | HTM 40 nm | | M1:M3:IrPPy (45%:45%:10%) 30 nm | ETM1 10 nm | ETM1:ETM2 (50%:50%) 30 nm |
| Ref-D12 | HTM 40 nm | | M1:M3:Ir2 (45%:45%:10%) 30 nm | ETM 10 nm | ETM1:ETM2 (50%:50%) 30 nm |
| Ref-D13 | HTM2 40 nm | | M1:M3:Ir2 (45%:45%:10%) 30 nm | ETM 10 nm | ETM1:ETM2 (50%:50%) 30 nm |
| Ref-D14 | HTM2 40 nm | | M1:M3:Ir2 (47.5%:47.5%:5%) 30 nm | ETM1 10 nm | ETM1:ETM2 (50%:50%) 30 nm |

TABLE 6

Data of the further vacuum-processed OLEDs

| Ex. | EQE1000 (%) | U1000 (V) | CIE x/y | LT80 (h) |
|---|---|---|---|---|
| D7 | 20.6 | 2.9 | 0.33/0.64 | 50 |
| D8 | 20.5 | 2.9 | 0.33/0.64 | 130 |
| D9 | 20.1 | 2.9 | 0.33/0.64 | 230 |
| D10 | 19.4 | 2.9 | 0.33/0.63 | 255 |
| D11 | 20.8 | 3.0 | 0.32/0.64 | 245 |
| D12 | 21.9 | 3.0 | 0.32/0.64 | 260 |
| D13 | 22.9 | 3.0 | 0.33/0.64 | 90 |
| D14 | 21.9 | 3.0 | 0.33/0.64 | 175 |
| D15 | 15.7 | 3.2 | 0.36/0.62 | 290 |
| D16 | 17.9 | 3.1 | 0.35/0.62 | 190 |
| D17 | 17.0 | 3.4 | 0.35/0.62 | 305 |
| D18 | 17.8 | 3.0 | 0.39/0.59 | 170 |
| D19 | 17.6 | 2.9 | 0.40/0.59 | 400 |

TABLE 6-continued

Data of the further vacuum-processed OLEDs

| Ex. | EQE1000 (%) | U1000 (V) | CIE x/y | LT80 (h) |
|---|---|---|---|---|
| D20 | 17.2 | 3.1 | 0.40/0.58 | 515 |
| D21 | 20.1 | 3.2 | 0.39/0.59 | 465 |
| D22 | 19.5 | 3.1 | 0.40/0.59 | 500 |
| D23 | 20.5 | 3.1 | 0.40/0.59 | 330 |
| D24 | 18.1 | 3.3 | 0.39/0.59 | 260 |
| D25 | 19.5 | 3.0 | 0.40/0.59 | 500 |
| D26 | 19.4 | 3.8 | 0.35/0.62 | 280 |
| D27 | 20.5 | 3.2 | 0.35/0.62 | 240 |
| D28 | 20.9 | 3.2 | 0.34/0.62 | 290 |
| D29 | 19.2 | 3.3 | 0.36/0.61 | 305 |
| D30 | 19.3 | 3.3 | 0.36/0.60 | 210 |
| D31 | 20.3 | 3.1 | 0.36/0.61 | 195 |
| D32 | 20.4 | 3.3 | 0.37/0.62 | 280 |
| D33 | 19.8 | 3.2 | 0.46/0.53 | 580 |
| D34 | 18.0 | 3.2 | 0.67/0.33 | 490 |
| D35 | 21.1 | 3.3 | 0.33/0.64 | 360 |
| D36 | 20.3 | 3.3 | 0.32/0.65 | 370 |
| D37 | 19.9 | 3.2 | 0.45/0.52 | 390 |
| D38 | 20.9 | 3.1 | 0.45/0.53 | 420 |
| D39 | 19.9 | 3.2 | 0.42/0.57 | 510 |
| D40 | 20.3 | 3.3 | 0.28/0.65 | 280 |
| D41 | 18.8 | 3.3 | 0.18/0.38 | 330 |
| D42 | 17.0 | 3.2 | 0.37/0.62 | 450 |
| D43 | 20.7 | 3.5 | 0.20//0.55 | 370 |
| D44 | 18.0 | 3.1 | 0.36/0.60 | 210 |
| D45 | 18.5 | 3.3 | 0.18/0.39 | 190 |
| D46 | 17.9 | 3.2 | 0.67/0.33 | 90 |
| D47 | 20.2 | 3.1 | 0.64/.035 | 200 |
| D48 | 20.9 | 3.1 | 0.32/0.64 | 425 |
| D49 | 21.3 | 3.1 | 0.43/0.55 | 380 |
| D50 | 20.7 | 3.3 | 0.37/0.61 | 360 |
| D51 | 15.2 | 3.2 | 0.52/0.48 | 260 |
| D52 | 19.0 | 3.3 | 0.36/0.62 | 350 |
| D53 | 20.3 | 3.1 | 0.38/0.61 | 440 |
| D54 | 19.0 | 3.3 | 0.34/0.63 | 350 |
| D55 | 20.8 | 3.2 | 0.36/0.63 | 400 |
| D56 | 18.6 | 3.1 | 0.34/0.62 | 330 |
| D57 | 20.2 | 3.2 | 0.46/0.51 | 410 |
| D58 | 19.6 | 3.3 | 0.20/0.52 | 315 |
| D59 | 21.0 | 3.2 | 0.36/0.61 | 330 |
| D60 | 20.7 | 3.3 | 0.32/0.61 | 310 |
| D61 | 20.3 | 3.5 | 0.22/0.56 | 280 |
| D62 | 20.6 | 3.4 | 0.24/0.57 | 360 |
| D63 | 21.3 | 3.2 | 0.32/0.63 | 360 |
| D64 | 23.3 | 3.5 | 0.23/0.54 | 180 |
| D65 | 21.0 | 3.5 | 0.28/0.59 | 310 |
| D66 | 20.8 | 3.1 | 0.40/0.59 | 470 |
| D67 | 20.5 | 3.3 | 0.37/0.62 | 390 |
| D68 | 21.8 | 3.2 | 0.35/0.62 | 400 |
| D69 | 20.2 | 3.3 | 0.36/0.61 | 270 |
| D70 | 19.8 | 3.3 | 0.42/0.55 | 430 |
| D71 | 18.8 | 3.2 | 0.47/0.51 | 410 |
| D72 | 18.3 | 3.3 | 0.46/0.50 | 200 |
| D73 | 19.1 | 3.3 | 0.35/0.53 | 110 |
| D74 | 19.5 | 3.3 | 0.42/0.54 | 410 |
| D75 | 21.4 | 3.2 | 0.31/0.63 | 390 |
| D76 | 19.6 | 3.3 | 0.43/0.55 | 380 |
| D77 | 21.1 | 3.3 | 0.33/0.63 | 400 |
| D78 | 20.8 | 3.4 | 0.34/0.63 | 360 |
| D79 | 22.1 | 3.3 | 0.47/0.51 | 420 |
| D80 | 21.0 | 3.3 | 0.34/0.63 | 400 |
| D81 | 20.5 | 3.4 | 0.39/0.58 | 190 |
| D82 | 19.7 | 3.5 | 0.33/0.64 | 230 |
| D83 | 20.4 | 3.4 | 0.33/0.63 | 290 |
| D84 | 21.3 | 3.4 | 0.36/0.62 | 300 |
| Ref-D9 | 18.1 | 3.1 | 0.34/0.62 | 70 |
| Ref-D10 | 17.1 | 3.0 | 0.34/0.62 | 185 |
| Ref-D11 | 17.1 | 3.2 | 0.31/0.63 | 95 |
| Ref-D12 | 17.9 | 3.0 | 0.32/0.63 | 265 |
| Ref-D13 | 18.4 | 3.2 | 0.33/0.63 | 150 |
| Ref-D14 | 17.0 | 3.1 | 0.34/0.62 | 200 |

3) Further Vacuum-Processed Blue-Emitting Components

In Examples D85 to D90 which follow (see Tables 7 and 8), the data of blue-emitting OLEDs are presented. Processing and characterization are as described in 2).

The electroluminescence spectra are determined at a luminance of 1000 cd/m$^2$, and the CIE 1931 x and y colour coordinates are calculated therefrom. The parameter U1000 in table 8 refers to the voltage which is required for a luminance of 1000 cd/m$^2$. EQE1000 refers to the external quantum efficiency at an operating luminance of 1000 cd/m$^2$. The lifetime LT50 is defined as the time after which the luminance drops to 50% of the starting luminance with a starting brightness of 1000 cd/m$^2$.

TABLE 7

Construction of the blue vacuum-processed OLEDs

| Ex. | HTL2 thickness | EBL thickness | EML thickness | HBL thickness | ETL thickness |
|---|---|---|---|---|---|
| D85 | HTM 30 nm | EBM1 10 nm | M8:Ir(L64) (85%:15%) 30 nm | ETM1 10 nm | ETM1:ETM2 (50%:50%) 30 nm |
| D86 | HTM 30 nm | EBM1 10 nm | M8:Ir(L64) (85%:15%) 30 nm | ETM2 10 nm | M300 30 nm |
| D87 | HTM 30 nm | EBM1 10 nm | M8:Ir(L64) (85%:15%) 30 nm | ETM3 10 nm | M200 30 nm |
| D88 | HTM 30 nm | Ir(L100) 10 nm | M8:Ir(L64) (85%:15%) 30 nm | ETM3 10 nm | ETM1:ETM2 (50%:50%) 30 nm |
| D89 | HTM 30 nm | EBM1 10 nm | M9:Ir(L107) (85%:15%) 30 nm | ETM3 10 nm | ETM1:ETM2 (50%:50%) 30 nm |
| D90 | HTM 30 nm | EBM1 10 nm | M8:Ir(L114) (85%:15%) 30 nm | ETM3 10 nm | ETM1:ETM2 (50%:50%) 30 nm |

TABLE 8

Data of the blue vacuum-processed OLEDs

| Ex. | EQE1000 (%) | U1000 (V) | CIE x/y | LT50 (h) |
|---|---|---|---|---|
| D85 | 17.1 | 4.3 | 0.17/0.38 | 1800 |
| D86 | 18.6 | 4.5 | 0.18/0.38 | 2200 |
| D87 | 16.3 | 4.7 | 0.18/0.39 | 2000 |
| D88 | 18.8 | 4.5 | 0.18/0.38 | 2500 |
| D89 | 5.1 | 5.7 | 0.16/0.11 | — |
| D90 | 22.7 | 4.9 | 0.16/0.37 | 3400 |

4) White-Emitting OLEDs

According to the general methods from 1), a white-emitting OLED having the following layer structure is produced:

TABLE 9

Structure of the white OLEDs

| Ex. | HTL2 thickness | EML red thickness | EML blue thickness | EML green thickness | HBL thickness | ETL thickness |
|---|---|---|---|---|---|---|
| D-W1 | HTM 230 nm | EBM1:Ir(L105) (97%:3%) 9 nm | M8:M3:Ir(L64) (45%:50%:5%) 8 nm | M3:Ir116 (90%:10%) 7 nm | ETM1 10 nm | ETM1:ETM2 (50%:50%) 30 nm |

TABLE 10

Device results

| Ex. | EQE (%) 1000 cd/m$^2$ | Voltage (V) 1000 cd/m$^2$ | CIE x/y 1000 cd/m$^2$ CRI | LD50 (h) 1000 cd/m$^2$ |
|---|---|---|---|---|
| D-W1 | 21.8 | 6.1 | 0.43/0.46 83 | 7500 |

Solution-Processed Devices:

A: From Soluble Functional Materials of Low Molecular Weight

The iridium complexes of the invention may also be processed from solution and lead therein to OLEDs which are much simpler in terms of process technology compared to the vacuum-processed OLEDs, but nevertheless have good properties. The production of such components is based on the production of polymeric light-emitting diodes (PLEDs), which has already been described many times in the literature (for example in WO 2004/037887). The structure is composed of substrate/ITO/hole injection layer (60 nm)/interlayer (20 nm)/emission layer (60 nm)/hole blocker layer (10 nm)/electron transport layer (40 nm)/cathode. For this purpose, substrates from Technoprint (soda-lime glass) are used, to which the ITO structure (indium tin oxide, a transparent conductive anode) is applied. The substrates are cleaned in a clean room with DI water and a detergent (Deconex 15 PF) and then activated by a UV/ozone plasma treatment. Thereafter, likewise in a clean room, a 20 nm hole injection layer is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport; in this case, HL-X092 from Merck is used. The interlayer may alternatively also be replaced by one or more layers which merely have to fulfill the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16 and 25 g/l when, as here, the layer thickness of 60 nm which is typical of a device is to be achieved by means of spin-coating. The solution-processed devices of type 1a contain an emission layer composed of M4:M5:IrL (40%:45%:15%), those of type 1b contain an emission layer composed of M4:M5:IrL (20%:60%:20%), and those of type 2 contain an emission layer composed of M4:M5:IrLa:IrLb (30%:34%:30%:6%); in other words, they contain two different Ir complexes. The emission layer is spun on in an inert gas atmosphere, argon in the present case, and baked at 160° C. for 10 min. Vapour-deposited above the latter are the hole blocker layer (10 nm ETM1) and the electron transport layer (40 nm ETM1 (50%)/ETM2 (50%)) (vapour deposition systems from Lesker or the like, typical vapour deposition pressure $5\times10^{-6}$ mbar). Finally, a cathode of aluminium (100 nm) (high-purity metal from Aldrich) is applied by vapour deposition. In order to protect the device from air and air humidity, the device is finally encapsulated and then characterized. The OLED examples cited are yet to be optimized; Table 11 summarizes the data obtained.

TABLE 11

Results with materials processed from solution

| Ex. | Emitter Device | EQE (%) 1000 cd/m² | Voltage (V) 1000 cd/m² | CIE x/y | LT50 (h) 1000 cd/m² |
|---|---|---|---|---|---|
| Green, yellow, orange and red OLEDs | | | | | |
| Sol-Ref-Red1 | Ir5 Type 1a | 15.0 | 6.2 | 0.68/0.32 | 4000 |
| Sol-RedD1 | Ir(L34) Type 1a | 15.7 | 6.5 | 0.57/0.43 | 40000 |
| Sol-RedD2 | Ir1 Ir(L34) Type 2 | 15.7 | 6.6 | 0.56/0.44 | 140000 |
| Sol-RedD3 | Ir109 Ir(L34) Type 2 | 16.1 | 6.5 | 0.56/0.44 | 200000 |
| Sol-RedD4 | Ir109 Ir5 Type 2 | 17.1 | 6.3 | 0.67/0.33 | 270000 |
| Sol-RedD5 | Ir1 Ir(L1000) Type 2 | 17.4 | 6.1 | 0.64/0.36 | 210000 |
| Sol-RedD6 | Ir1 Ir(L1001) Type 2 | 17.0 | 6.1 | 0.62/0.37 | 545000 |
| Sol-RedD7 | Ir1 Ir1000 Type 2 | 17.8 | 6.3 | 0.64/0.36 | 210000 |
| Sol-RedD8 | Ir1 Ir1001 Type 2 | 18.6 | 5.7 | 0.63/0.37 | 285000 |
| Sol-RedD9 | Ir1 Ir1002 Type 2 | 18.5 | 6.2 | 0.63/0.37 | 77000 |
| Sol-RedD10 | Ir1 Ir1003 Type 2 | 19.3 | 5.4 | 0.62/0.38 | 282000 |
| Sol-RedD11 | Ir1 Ir1005 Type 2 | 17.6 | 5.9 | 0.67/0.33 | 165000 |
| Sol-RedD12 | Ir1 Ir(L1200) Type 2 | 15.9 | 6.4 | 0.67/0.33 | 130000 |
| Sol RedD13 | Ir(L1) Ir(L1200) Type 2 | 16.1 | 6.5 | 0.67/0.33 | 120000 |
| Sol RedD14 | Ir(L104) Type 1b | 18.1 | 4.8 | 0.66/0.34 | 70000 |
| Sol RedD15 | Ir110 Ir(L104) Type 2 | 19.1 | 4.8 | 0.65/0.34 | 470000 |
| Sol-RedD16 | Ir1 Ir(L1009) Type 2 | 18.2 | 6.0 | 0.65/0.35 | 250000 |
| Sol-RedD17 | Ir1 Ir1007 Type 2 | 18.4 | 6.4 | 0.66/0.34 | 270000 |
| Sol-RedD18 | Ir116 Ir(L1036) Type 2 | 18.0 | 5.9 | 0.60/0.40 | 350000 |
| Sol-RedD19 | Ir1 Ir(L1021) Type 2 | 17.8 | 6.1 | 0.64/0.36 | 255000 |
| Sol-RedD20 | Ir1 Ir(L1008) Type 2 | 18.3 | 5.8 | 0.57/0.43 | 240000 |

TABLE 11-continued

Results with materials processed from solution

| Ex. | Emitter Device | EQE (%) 1000 cd/m² | Voltage (V) 1000 cd/m² | CIE x/y | LT50 (h) 1000 cd/m² |
|---|---|---|---|---|---|
| Sol-RedD21 | Ir1 Ir(L1019) Type 2 | 17.4 | 6.2 | 0.61/0.38 | 450000 |
| Sol-RedD22 | Ir1 Ir(L1017) Type 2 | 17.2 | 6.4 | 0.60/0.40 | 400000 |
| Sol RedD23 | Ir116 Ir(L1014) Type 2 | 17.5 | 6.3 | 0.66/0.34 | 200000 |
| Sol RedD24 | Ir1 Ir(L1014) Type 2 | 17.5 | 6.3 | 0.66/0.34 | 200000 |
| Sol RedD25 | Ir110 Ir(L1020) Type 2 | 17.2 | 6.8 | 0.68/0.32 | 180000 |
| Sol RedD26 | Ir1 Ir(L1024) Type 2 | 17.0 | 6.0 | 0.63/0.36 | 140000 |
| Sol RedD27 | Ir1 Ir1019 Type 2 | 17.8 | 6.3 | 0.62/0.38 | 320000 |
| Sol RedD28 | Ir1 Ir1017 Type 2 | 17.6 | 6.1 | 0.65/0.35 | 300000 |
| Sol RedD29 | Ir1 Ir1008 Type 2 | 17.2 | 6.4 | 0.63/0.36 | 370000 |
| Sol RedD30 | Ir110 Ir1040 Type 2 | 18.0 | 6.0 | 0.64/0.36 | 330000 |
| Sol-Ref-Green1 | Ir1 Type 1a | 19.8 | 5.2 | 0.36/0.61 | 200000 |
| Sol-GreenD1 | Ir109 Type 1a | 20.9 | 5.2 | 0.40/0.59 | 450000 |
| Sol-Ref-Green2 | Ir1 Type 1b | 19.6 | 4.8 | 0.36/0.61 | 220000 |
| Sol-GreenD2 | Ir110 Type 1b | 23.3 | 4.4 | 0.34/0.62 | 360000 |
| Sol-GreenD3 | Ir114 Type 1b | 21.1 | 4.4 | 0.36/0.62 | 55000 |
| Sol-GreenD4 | Ir116 Type 1b | 21.6 | 4.5 | 0.34/0.63 | 240000 |
| Sol-GreenD5 | Ir118 Type 1b | 21.1 | 4.8 | 0.34/0.62 | 160000 |
| Sol-GreenD6 | Ir700 Type 1b | 15.2 | 5.8 | 0.40/0.60 | 240000 |
| Sol-GreenD7 | Ir702 Type 1b | 16.3 | 5.7 | 0.39/0.61 | 280000 |
| Sol-GreenD8 | Ir704 Type 1b | 16.1 | 5.8 | 0.39/0.61 | 270000 |
| Sol-GreenD9 | Ir705 Type 1b | 15.9 | 5.7 | 0.40/0.60 | 300000 |
| Sol-GreenD10 | Ir705-D3 Type 1b | 16.1 | 5.8 | 0.40/0.59 | 320000 |
| Sol-GreenD11 | Ir721 Type 1b | 19.9 | 5.0 | 0.33/0.64 | 330000 |
| Sol-GreenD12 | Ir722 Type 1b | 20.6 | 5.2 | 0.33/0.64 | 300000 |
| Sol-GreenD13 | Ir740 Type 1b | 20.1 | 5.0 | 0.37/0.61 | 320000 |
| Sol-GreenD14 | Ir101 Type 1b | 21.1 | 4.5 | 0.38/0.60 | 350000 |
| Sol-GreenD15 | Ir106 Type 1b | 21.3 | 4.5 | 0.37/0.62 | 270000 |
| Sol-GreenD16 | Ir107 Type 1b | 19.9 | 4.3 | 0.39/0.60 | 400000 |
| Sol-GreenD17 | Ir113 Type 1b | 23.0 | 4.4 | 0.34/0.62 | 260000 |
| Sol-GreenD18 | Ir111 Type 1b | 22.2 | 4.6 | 0.35/0.63 | 360000 |
| Sol-GreenD19 | Ir112 Type 1b | 21.9 | 4.5 | 0.34/0.63 | 350000 |
| Sol-GreenD20 | Ir115 Type 1b | 21.1 | 4.2 | 0.33/0.61 | 390000 |

TABLE 11-continued

| Results with materials processed from solution | | | | | |
|---|---|---|---|---|---|
| Ex. | Emitter Device | EQE (%) 1000 cd/m$^2$ | Voltage (V) 1000 cd/m$^2$ | CIE x/y | LT50 (h) 1000 cd/m$^2$ |
| Sol-GreenD21 | Ir120 Type 1b | 20.7 | 4.6 | 0.34/0.62 | 290000 |
| Sol-GreenD22 | Ir122 Type 1b | 20.0 | 4.2 | 0.36/0.61 | 310000 |
| Sol-GreenD23 | Ir124 Type 1b | 22.4 | 4.5 | 0.35/0.61 | 340000 |
| Sol-GreenD24 | Ir126 Type 1b | 21.7 | 4.2 | 0.35/0.62 | 400000 |
| Sol-GreenD25 | Ir127 Type 1b | 21.8 | 4.2 | 0.35/0.62 | 390000 |
| Sol-GreenD26 | Ir128 Type 1b | 21.5 | 4.3 | 0.35/0.63 | 420000 |
| Sol-GreenD27 | Ir129 Type 1b | 21.0 | 4.1 | 0.37/0.60 | 340000 |
| Sol-GreenD28 | Ir131 Type 1b | 23.0 | 4.4 | 0.35/0.62 | 310000 |
| Sol-GreenD29 | Ir132 Type 1b | 22.8 | 4.4 | 0.35/0.62 | 320000 |
| Sol-GreenD30 | Ir133 Type 1b | 19.0 | 4.5 | 0.42/0.57 | 310000 |
| Sol-GreenD31 | Ir136 Type 1b | 20.3 | 4.5 | 0.37/0.60 | 220000 |
| Sol-GreenD32 | Ir138 Type 1b | 21.5 | 4.3 | 0.37/0.61 | 280000 |
| Sol-GreenD33 | Ir141 Type 1b | 21.7 | 4.5 | 0.34/0.63 | 140000 |
| Sol-GreenD34 | Ir143 Type 1b | 22.7 | 4.4 | 0.38/0.61 | 340000 |
| Sol-GreenD35 | Ir146 Type 1b | 21.9 | 4.4 | 0.35/0.62 | 340000 |
| Sol-GreenD36 | Ir151 Type 1b | 22.4 | 4.5 | 0.41/0.58 | 430000 |
| Sol-GreenD37 | Ir201 Type 1b | 20.0 | 4.3 | 0.36/0.61 | 340000 |
| Sol-GreenD38 | Ir203 Type 1b | 21.7 | 4.4 | 0.34/0.63 | 380000 |
| Sol-GreenD39 | Ir205 Type 1b | 22.1 | 4.4 | 0.39/0.59 | 400000 |
| Sol-GreenD40 | Ir308 Type 1b | 20.8 | 4.5 | 0.35/0.62 | 350000 |
| Sol-GreenD41 | Ir(L11) Type 1b | 21.1 | 4.6 | 0.43/0.56 | 300000 |
| Sol-GreenD42 | Ir(L23) Type 1b | 21.6 | 4.4 | 0.34/0.61 | 190000 |
| Sol-GreenD43 | Ir(L25) Type 1b | 17.2 | 5.8 | 0.39/0.60 | 260000 |
| Sol-GreenD44 | Ir(L27) Type 1b | 19.9 | 4.8 | 0.45/0.52 | 360000 |
| Sol-GreenD45 | Ir(L96) Type 1b | 20.3 | 4.6 | 0.35/0.62 | 390000 |
| Sol-GreenD46 | Ir(L118) Type 1b | 23.1 | 4.5 | 0.34/0.62 | 200000 |
| Sol-GreenD47 | IrL(146) Type 1b | 20.2 | 4.3 | 0.31/0.64 | 380000 |
| Sol-GreenD48 | Ir(L208) Type 1b | 19.5 | 4.5 | 0.38/0.60 | 340000 |
| Sol-GreenD49 | Ir(L130) Type 1b | 16.8 | 4.6 | 0.36/0.60 | 160000 |
| Sol-GreenD50 | Ir(L47) Type 1b | 19.3 | 4.5 | 0.39/0.58 | 400000 |
| Sol-GreenD51 | Ir(L53) Type 1b | 20.9 | 4.7 | 0.46/0.51 | 260000 |
| Sol-GreenD52 | Ir(L218) Type 1b | 20.3 | 4.6 | 0.38/0.59 | 390000 |
| Sol-GreenD53 | Ir(L226) Type 1b | 21.9 | 4.4 | 0.47/0.50 | 180000 |
| Sol-GreenD54 | Ir(L273) Type 1b | 20.0 | 4.5 | 0.37/0.61 | 400000 |
| Sol-GreenD55 | Ir(L280) Type 1a | 6.3 | 4.9 | 0.39/0.55 | — |
| Sol-GreenD56 | Ir(L302) Type 1b | 22.4 | 4.4 | 0.35/0.63 | 350000 |
| Sol-GreenD57 | Ir801 Type 1b | 20.3 | 4.6 | 0.34/0.62 | 410000 |

TABLE 11-continued

| Results with materials processed from solution | | | | | |
|---|---|---|---|---|---|
| Ex. | Emitter Device | EQE (%) 1000 cd/m$^2$ | Voltage (V) 1000 cd/m$^2$ | CIE x/y | LT50 (h) 1000 cd/m$^2$ |
| Sol-GreenD58 | IrL802 Type 1b | 21.0 | 4.5 | 0.39/0.59 | 380000 |

B: From Polymeric Functional Materials:

Production of the OLEDs as described in A. For production of the emission layer, the polymers of the invention are dissolved in toluene. The typical solids content of such solutions is between 10 and 15 g/l when, as here, the layer thickness of 40 nm which is typical of a device is to be achieved by means of spin-coating. The OLED examples cited are yet to be optimized; Table 12 summarizes the data obtained.

TABLE 12

| Results with materials processed from solution | | | | |
|---|---|---|---|---|
| Ex. | Polymer | EQE (%) 1000 cd/m$^2$ | Voltage (V) 1000 cd/m$^2$ | CIE x/y 1000 cd/m$^2$ |
| Green OLEDs | | | | |
| D-P1 | P1 | 19.8 | 4.1 | 0.39/0.59 |
| Yellow OLEDs | | | | |
| D-P2 | P2 | 20.0 | 4.0 | 0.43/0.55 |
| D-P3 | P3 | 19.7 | 4.0 | 0.42/0.56 |

TABLE 13

Structural formulae of the materials used

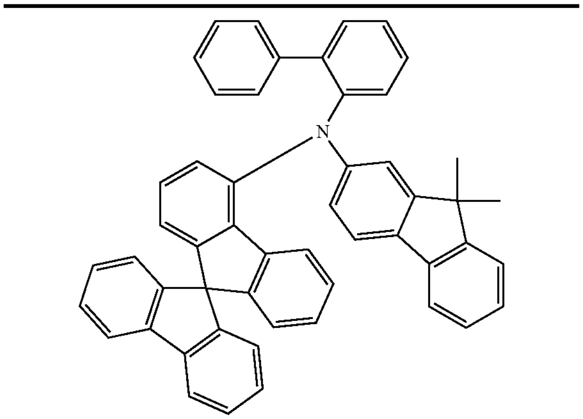

HTM = M9
1450933-44-4

TABLE 13-continued
| Structural formulae of the materials used |
|---|
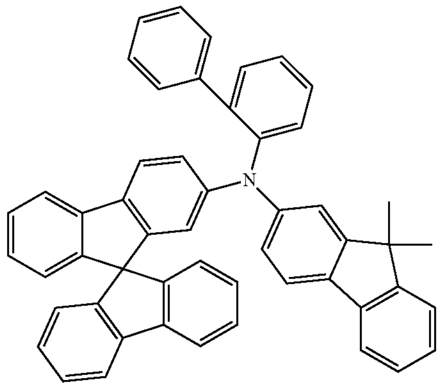
HTM2
1364603-07-5
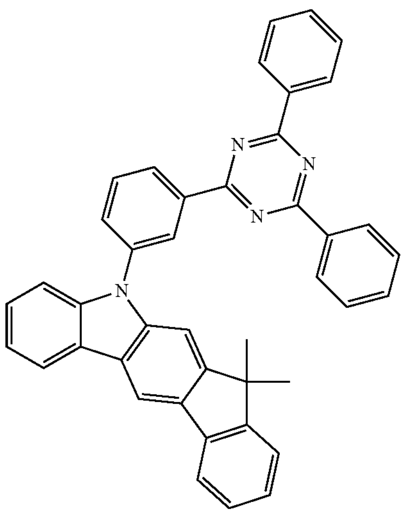
M1
1257248-13-7
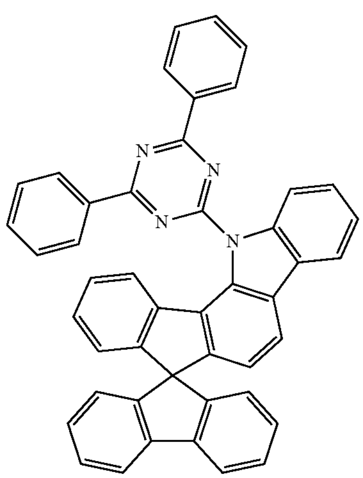
M2
1615703-29-1
TABLE 13-continued
| Structural formulae of the materials used |
|---|
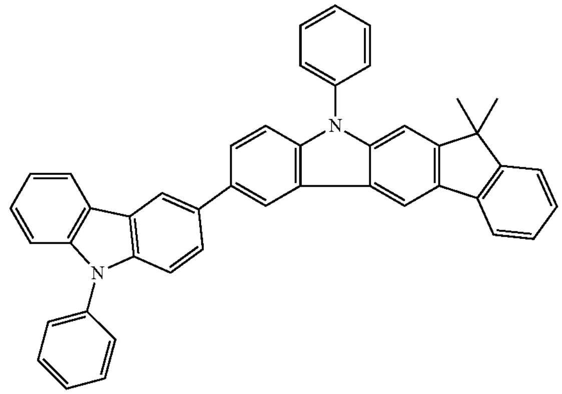
M3
1357150-54-9
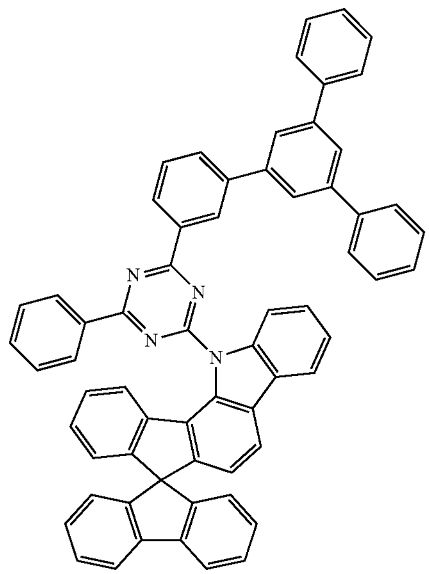
M4
1616231-60-7
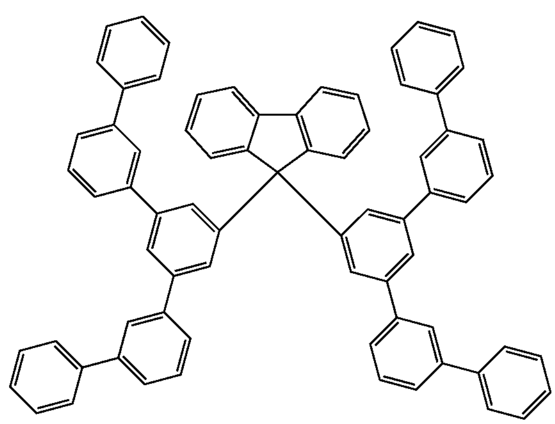
M5
1246496-85-4

TABLE 13-continued
| Structural formulae of the materials used |
|---|
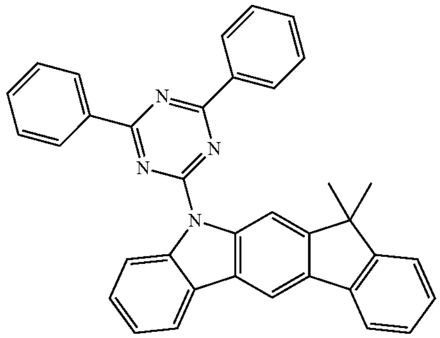
M6
1257220-48-6
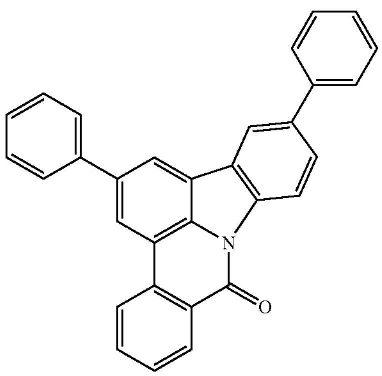
M7
1615695-76-5
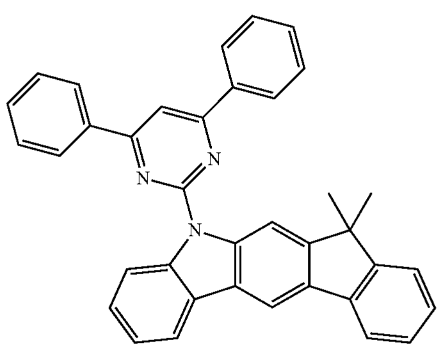
M8
1238297-78-3
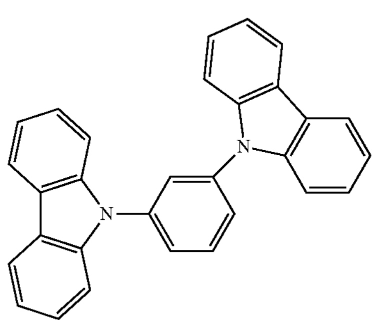
M9
550378-78-4
TABLE 13-continued
| Structural formulae of the materials used |
|---|
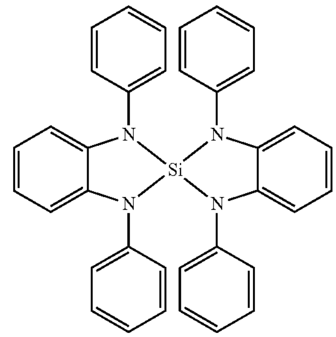
EBM1
12006465-62-4
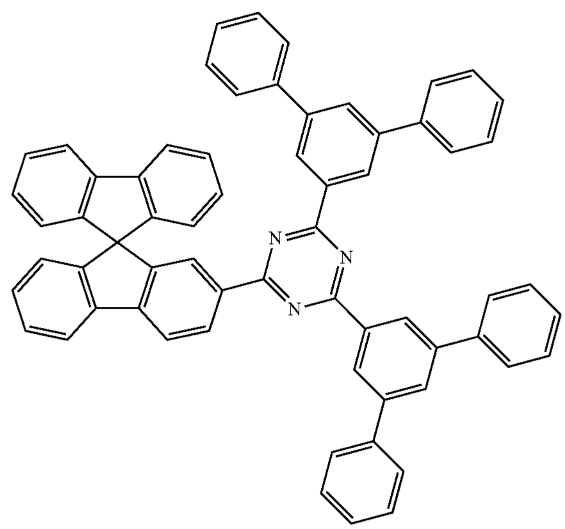
ETM1 = HBM1 = M10
1233200-52-6
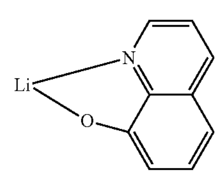
ETM2
25387-93-3

TABLE 13-continued
| Structural formulae of the materials used |
|---|
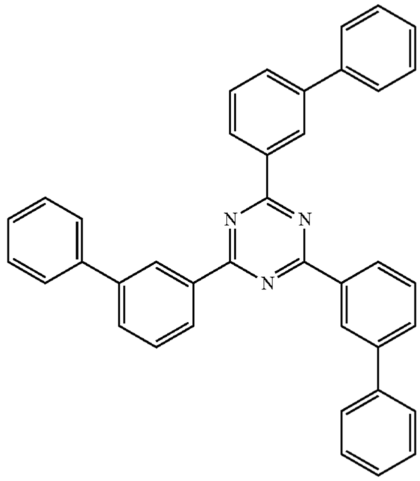
ETM3
1201800-83-0
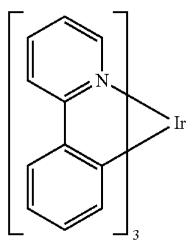
IrPPy
693794-98-8
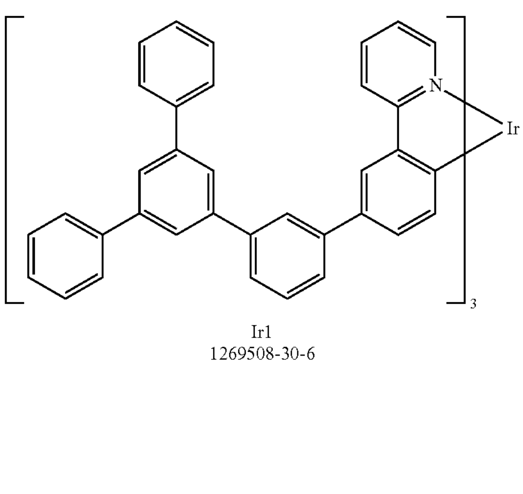
Ir1
1269508-30-6
TABLE 13-continued
| Structural formulae of the materials used |
|---|
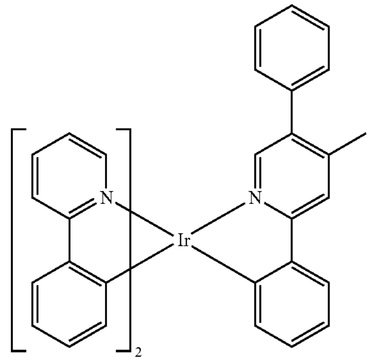
Ir2
1215692-34-4
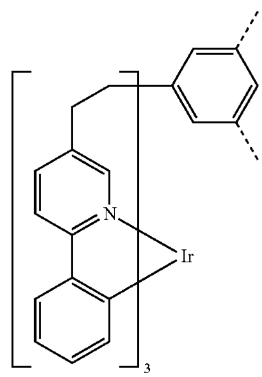
Ir3*
861806-70-4
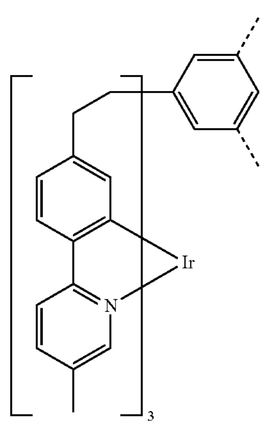
Ir4*
873436-02-3

TABLE 13-continued

Structural formulae of the materials used

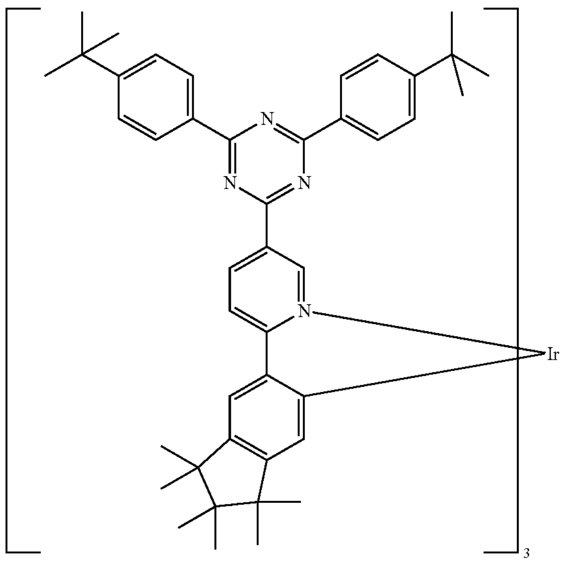

Ir5
EP14002623.8

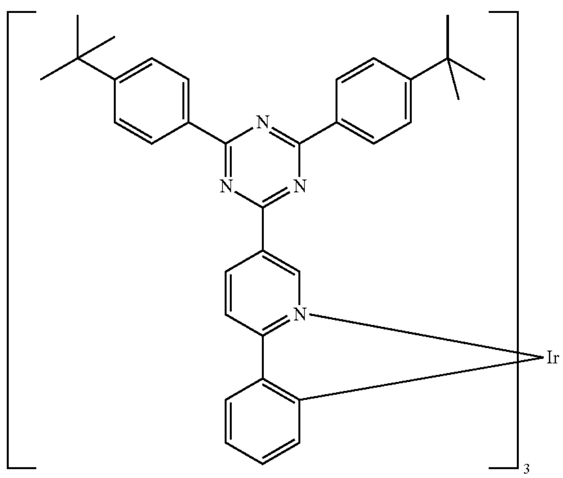

Ir6
1202823-72-0

*: G. St-Pierre et al., Dalton Trans, 2011, 40, 11726.

a) View along the (pseudo) $C_3$ axis b) Lateral view of the (pseudo) $C_3$ axis The hydrogen atoms are not shown for better clarity.

Figure 1:
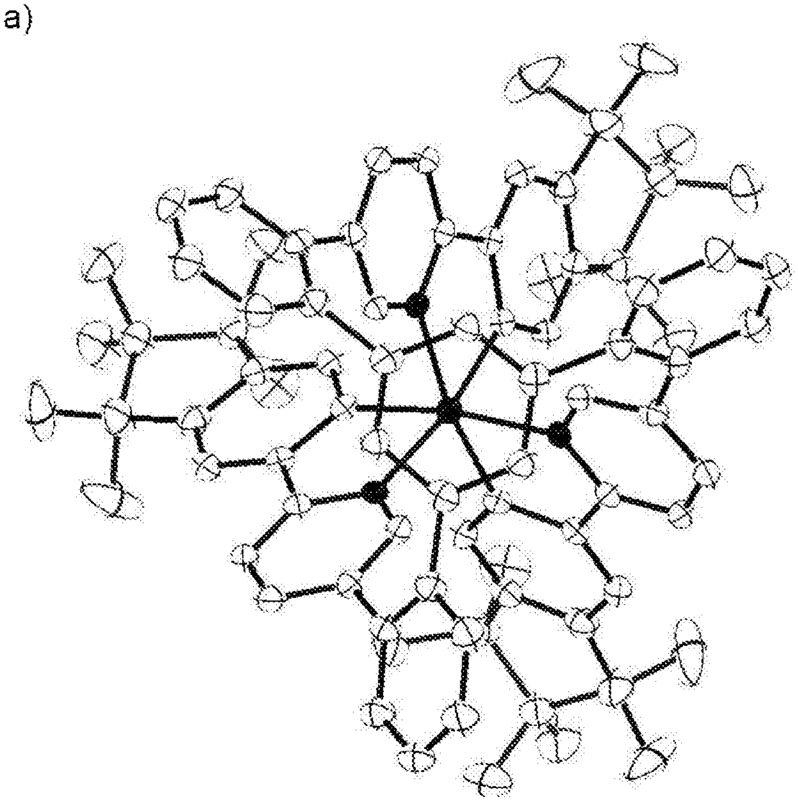
FIG. 1: Single crystal structure of the compound KU) (ORTEP representation with 50% probability level)
Figure 1:
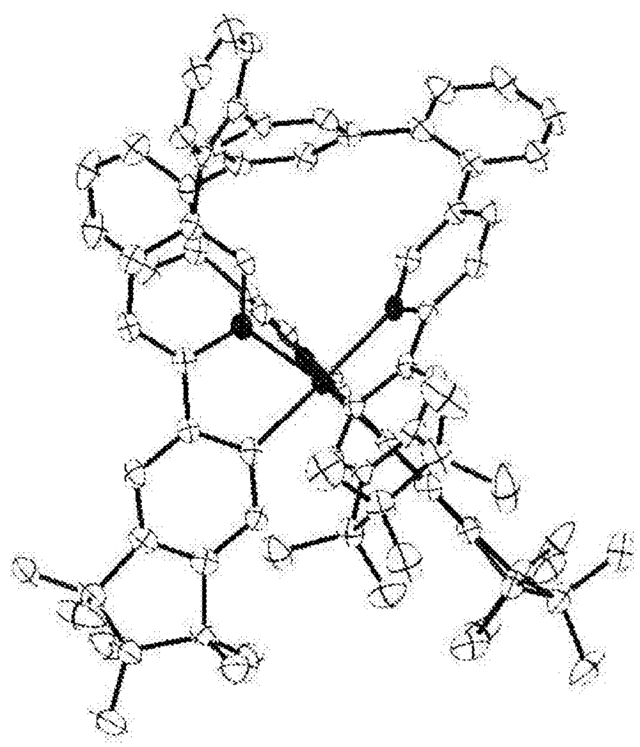
Figure 2:
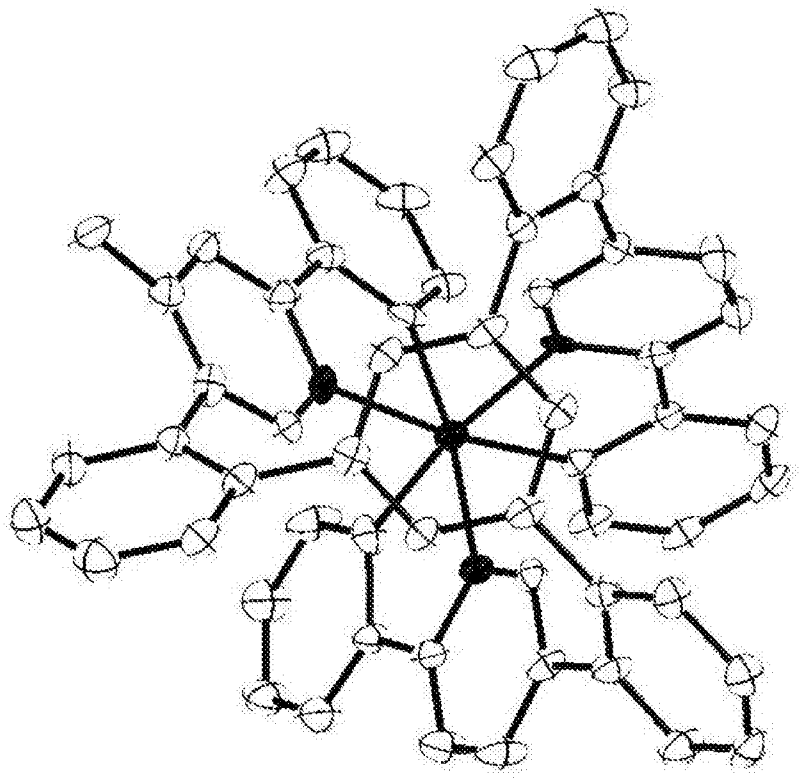
Figure 2:
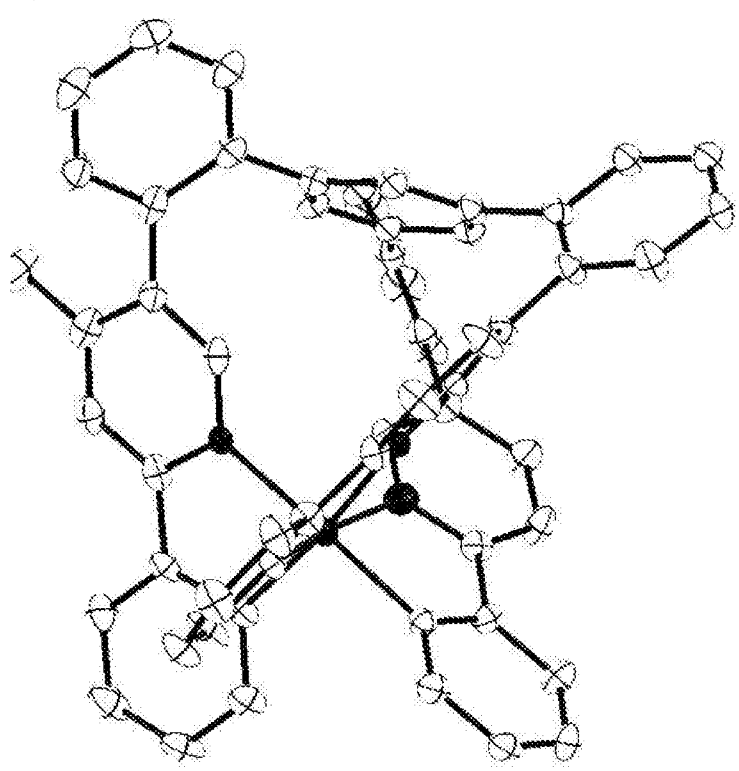

FIG. 2: Single crystal structure of the compound Ir(L48) (ORTEP representation with 50% probability level)

a) View along the (pseudo) $C_3$ axis b) Lateral view of the (pseudo) $C_3$ axis The hydrogen atoms are not shown for better clarity.

Figure 3:
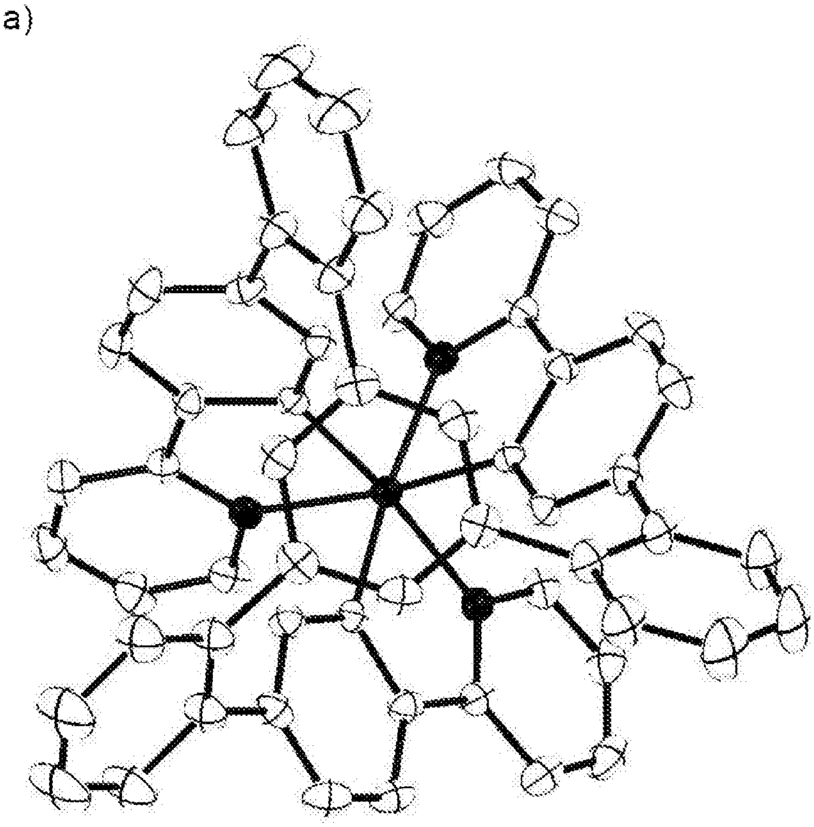
Figure 3:
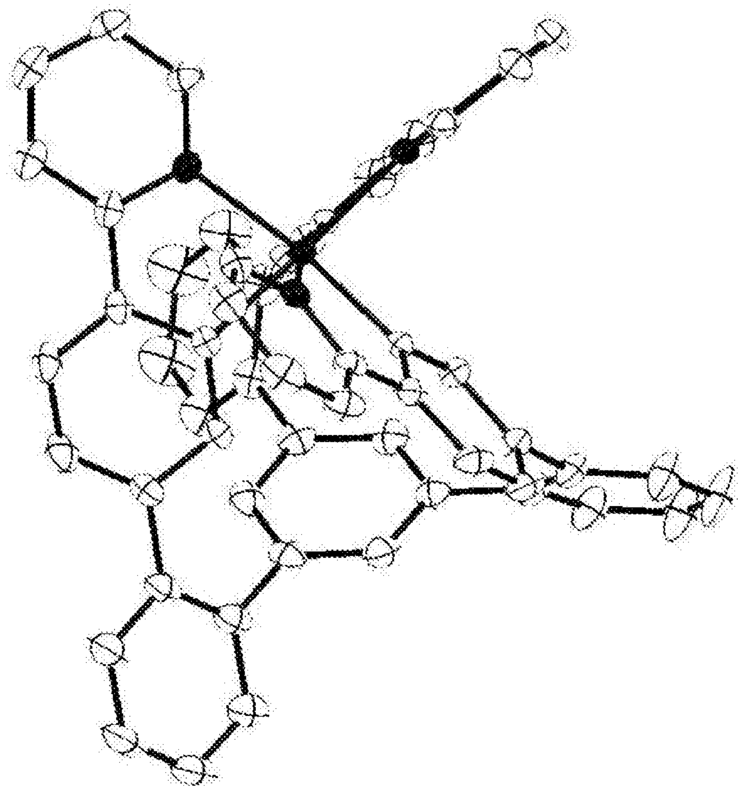

FIG. 3: Single crystal structure of the compound Ir(L72) (ORTEP representation with 50% probability level)

a) View along the (pseudo) $C_3$ axis b) Lateral view of the (pseudo) $C_3$ axis The hydrogen atoms are not shown for better clarity.

Figure 4:
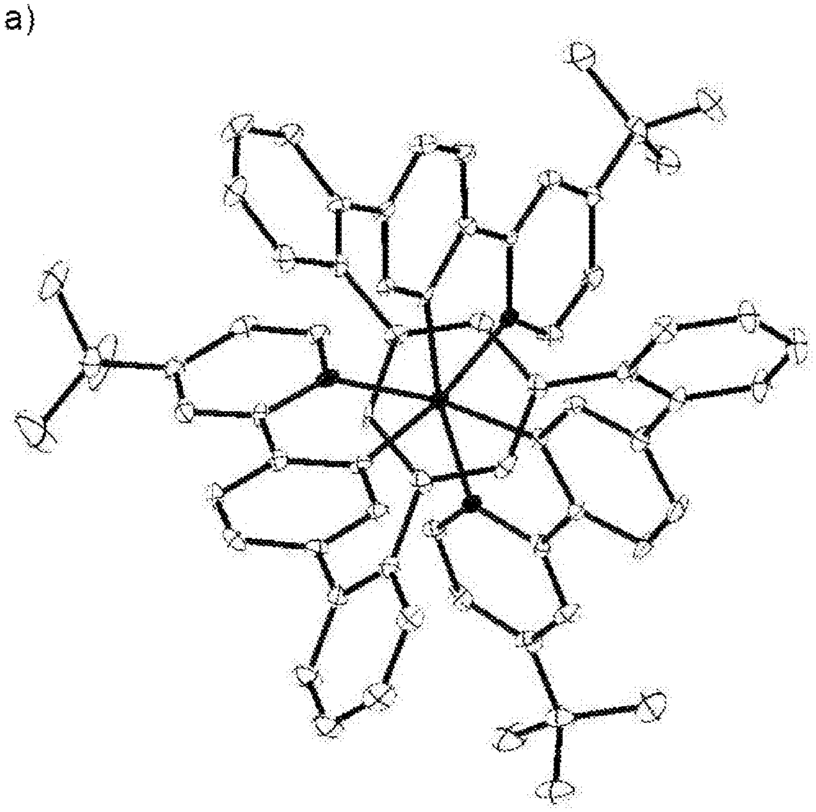
Figure 4:
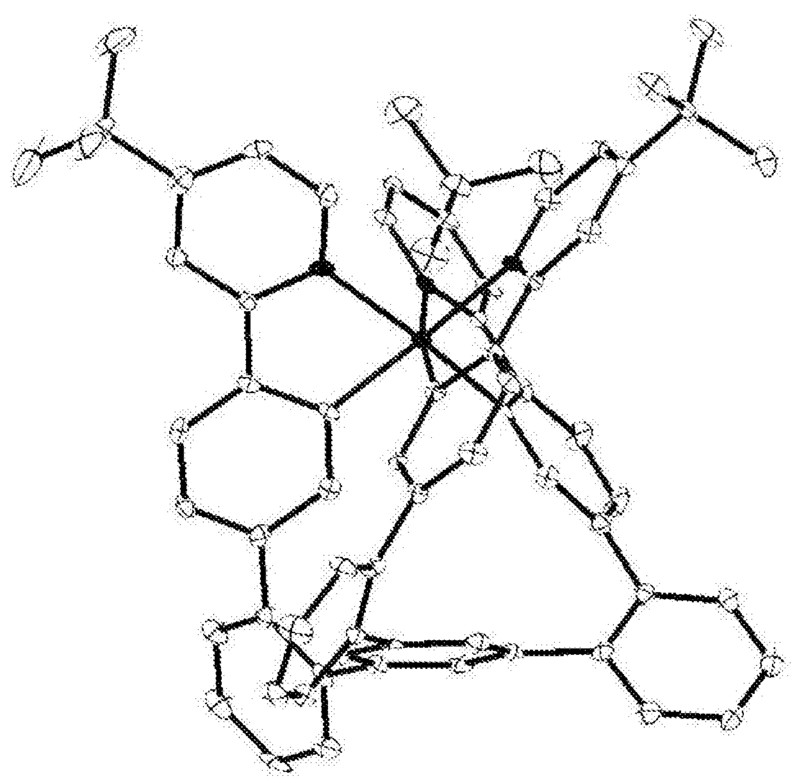

FIG. 4: Single crystal structure of the compound Ir(L111) (ORTEP representation with 50% probability level)

a) View along the (pseudo) $C_3$ axis b) Lateral view of the (pseudo) $C_3$ axis The hydrogen atoms are not shown for better clarity.

Figure 5:
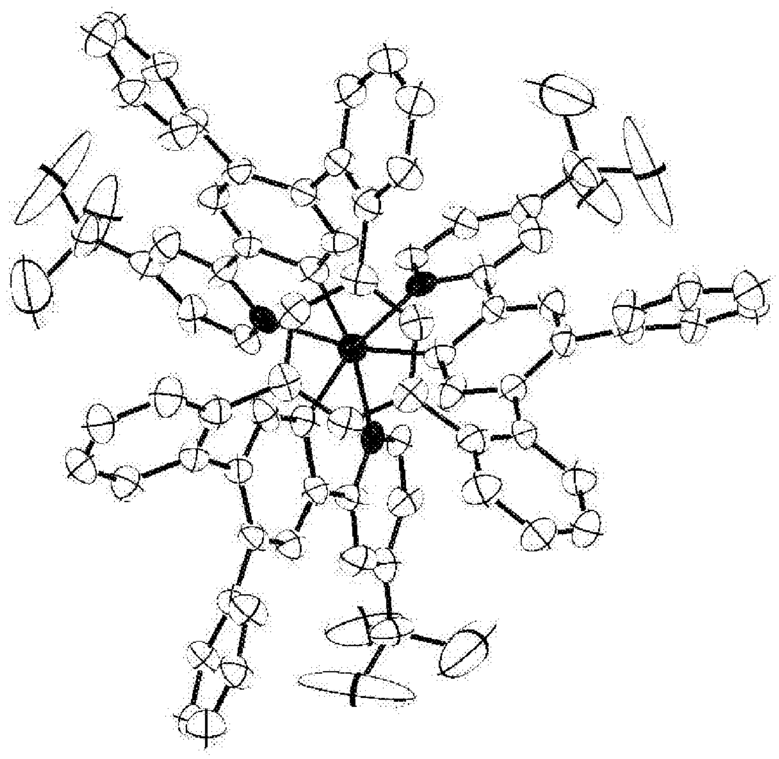
Figure 5:
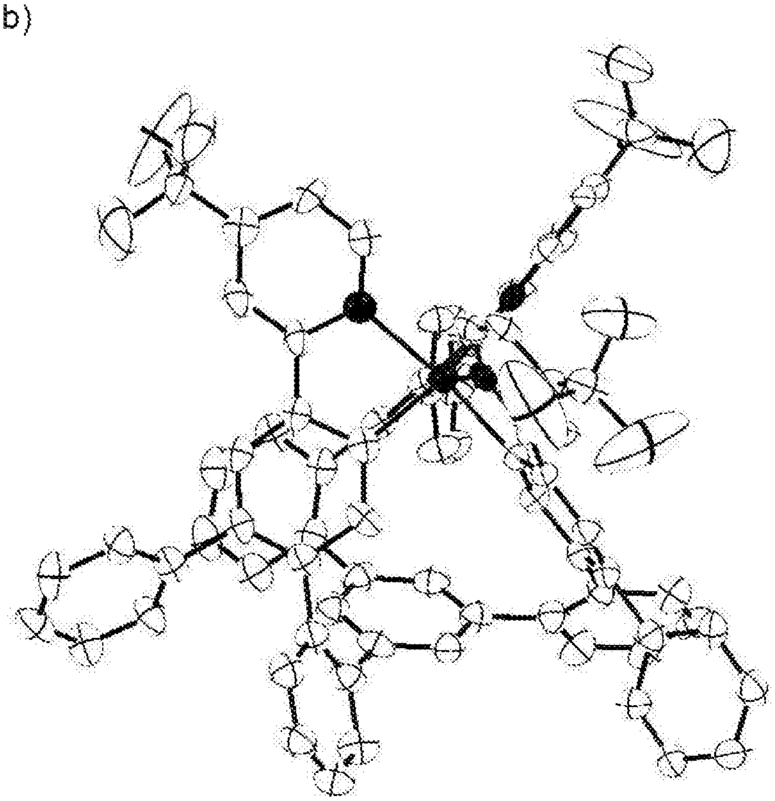

FIG. 5: Single crystal structure of the compound Ir(L116) (ORTEP representation with 50% probability level)

a) View along the (pseudo) $C_3$ axis b) Lateral view of the (pseudo) $C_3$ axis The hydrogen atoms are not shown for better clarity.

The invention claimed is:

1. A monometallic metal complex comprising a hexadentate tripodal ligand wherein three bidentate sub-ligands coordinate to a metal and the three bidentate sub-ligands, which are optionally the same or different, are joined via a bridge of formula (1):

Formula (1)

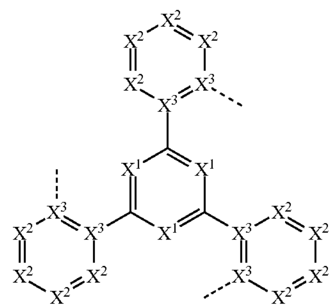

wherein the dotted bonds represent the bonds of the three bidentate sub-ligands to this structure;

$X^1$ is the same or different in each instance and is C, which is optionally substituted, or N;

$X^2$ is the same or different in each instance and is C, which is optionally substituted, or N; or two adjacent $X^2$ groups together are N, which is optionally substituted, O or S, so as to form a five-membered ring; or two adjacent $X^2$ groups together are C, which is optionally substituted, or N when one of the $X^3$ groups in the cycle is N, so as to form a five-membered ring; with the proviso that not more than two adjacent $X^2$ groups in each ring are N; and wherein any substituents optionally define a ring system with one another or with substituents bonded to $X^1$;

$X^3$ is C in each instance in one cycle or one $X^3$ group is N and the other $X^3$ group in the same cycle is C, wherein the $X^3$ groups in the three cycles are optionally selected independently, with the proviso that two adjacent $X^2$ groups together are C, which is optionally substituted, or N when one of the $X^3$ groups in the cycle is N; and wherein the three bidentate ligands, apart from via the bridge of formula (1), are optionally ring-closed by a further bridge to form a cryptate, and wherein at least one of the bidentate sub-ligands is a structure of formulae (L-1), (L-2), (L-3), (L-4), (L-33), (L-34), (L-41), (L-42), (L-43) or (L-44):

(L-1)

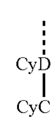

-continued (L-2)

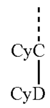

(L-3)

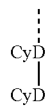

(L-4)

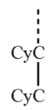

wherein the dotted bond represents the bond of the sub-ligand to the bridge of formula (1);

CyC is the same or different in each instance and is a substituted or unsubstituted aryl or heteroaryl group which has 5 to 14 aromatic ring atoms and coordinates to the metal via a carbon atom in each case and which is bonded to CyD in (L-1) and (L-2) via a covalent bond and is bonded to a further CyC group in (L-4) via a covalent bond;

CyD is the same or different in each instance and is a substituted or unsubstituted heteroaryl group which has 5 to 14 aromatic ring atoms and coordinates to the metal via a nitrogen atom or via a carbene carbon atom and which is bonded to CyC in (L-1) and (L-2) via a covalent bond and is bonded to a further CyD group in (L-3) via a covalent bond; and wherein two or more of the optional substituents together optionally define a ring system;

(L-33)

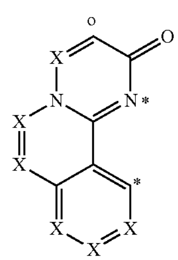

(L-34)

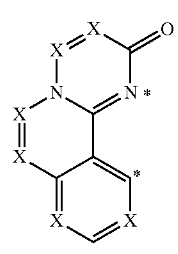

wherein

R is the same or different in each instance and is H, D, F, Cl, Br, I, $N(R^1)_2$, CN, $NO_2$, OH, COOH, $C({=}O)N(R^1)_2$, $Si(R^1)_3$, $B(OR^1)_2$, $C({=}O)R^1$, $P({=}O)(R^1)_2$, $S({=}O)R^1$, $S({=}O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1C{=}CR^1$, C≡C, $Si(R^1)_2$, C═O, $NR_1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, $C({=}O)R^2$, $P({=}O)(R^2)_2$, $S({=}O)R^2$, $S({=}O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C{=}CR^2$, C≡C, $Si(R^2)_2$, C═O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F;

* represents the position of coordination to the metal;

O represents the position of a bond to the group of the formula (1); and

X is the same or different at each instance and is CR or N, with the proviso that not more than one X symbol per cycle is N;

(L-41)

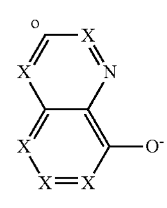

(L-42)

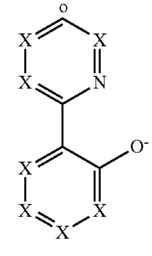

-continued (L-43)

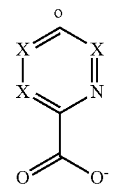

(L-44)

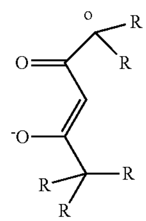

wherein the sub-ligands (L-41) to (L-43) each coordinate to the metal via the nitrogen atom explicitly shown and the negatively charged oxygen atom, and the sub-ligand (L-44) coordinates via the two oxygen atoms;

X is the same or different in each instance and is CR or N, with the proviso that not more than two X per cycle are N;

R is the same or different in each instance and is H, D, F, Cl, Br, I, $N(R^1)_2$, CN, $NO_2$, OH, COOH, C(═O)N$(R^1)_2$, $Si(R^1)_3$, $B(OR^1)_2$, C(═O)$R^1$, P(═O)$(R^1)_2$, S(═O)$R^1$, S(═O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1$C═C$R^1$, C≡C, $Si(R^1)_2$, C═O, $NR^1$, O, S, or CON$R^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, C(═O)$R^2$, P(═O)$(R^2)_2$, S(═O)$R^2$, S(═O)$_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2$C═C$R^2$, C≡C, $Si(R^2)_2$, C═O, $NR^2$, O, S, or CON$R^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F and o indicates the position of a bond to the group of the formula (1).

2. The metal complex of claim 1, wherein, when $X^1$ and/or $X^2$ is a substituted carbon atom and/or when two adjacent $X^2$ groups are a substituted nitrogen atom or a substituted carbon atom, the substituent is selected from the following substituents R:

R is the same or different in each instance and is H, D, F, Cl, Br, I, $N(R^1)_2$, CN, $NO_2$, OH, COOH, C(═O)N$(R^1)_2$, $Si(R^1)_3$, $B(OR^1)_2$, C(═O)$R^1$, P(═O)$(R^1)_2$, S(═O)$R^1$, S(═O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1$C═C$R^1$, C≡C, $Si(R^1)_2$, C═O, $NR^1$, O, S, or CON$R^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, C(═O)$R^2$, P(═O)$(R^2)_2$, S(═O)$R^2$, S(═O)$_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2$C═C$R^2$, C≡C, $Si(R^2)_2$, C═O, $NR^2$, O, S, or CON$R^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F.

3. The metal complex of claim 1, wherein the group of formula (1) is selected from the structures of formulae (2) to (5):

Formula (2)

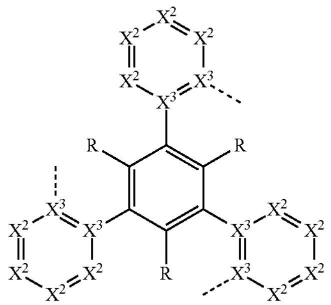

Formula (3)

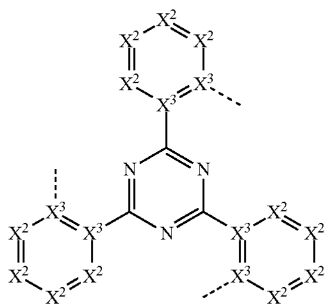

Formula (4)

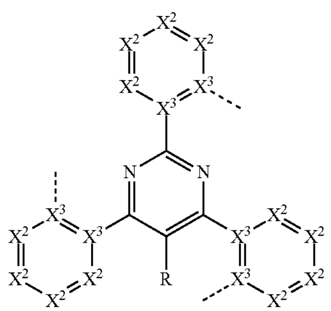

Formula (5)

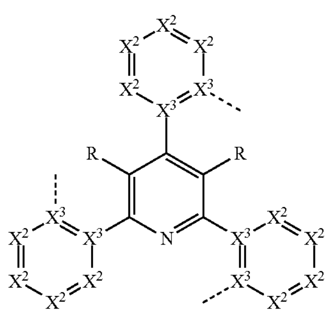

wherein

R is the same or different in each instance and is H, D, F, Cl Br, I, $N(R^1)_2$, CN, $NO_2$, OH, COOH, C(═O)N$(R^1)_2$, $Si(R^1)_3$, $B(OR^1)_2$, C(═O)$R^1$, P(═O)$(R^1)_2$, S(═O)R', S(═O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1C$═$CR^1$, C≡C, $Si(R^1)_2$, C═O, $NR^1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO^2$, $Si(R^2)_3$, $B(OR^2)_2$, C(═O)$R^2$, P(═O)$(R^2)_2$, S(═O)$R^2$, S(═O)$_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C$═$CR^2$, C≡C, $Si(R^2)_2$, C═O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F.

4. The metal complex of claim 1, wherein $X^3$ is C and the group of formula (1) is selected from formulae (2a) to (5a):

Formula (2a)

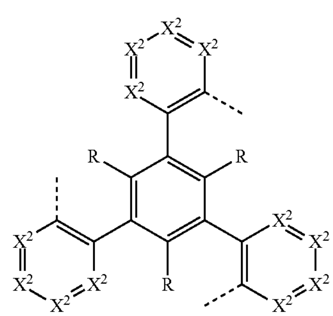

-continued

Formula (3a)

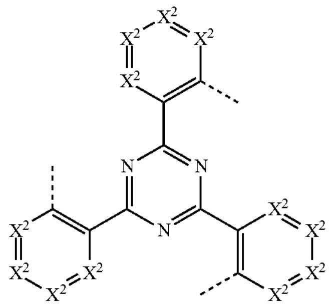

Formula (4a)

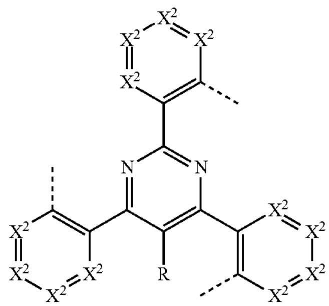

Formula (5a)

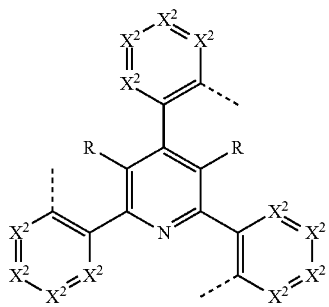

wherein

R is the same or different in each instance and is H, D, F, Cl, Br, I, $N(R^1)_2$, CN, $NO^2$, OH, COOH, $C({=}O)N(R^1)_2$, $Si(R^1)_3$, $B(OR^1)_2$, $C({=}O)R^1$, $P({=}O)(R^1)_2$, $S({=}O)R^1$, $S({=}O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1C{=}CR^1$, CC, $Si(R^1)_2$, C═O, $NR^1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, $C({=}O)R^2$, $P({=}O)(R^2)_2$, $S({=}O)R^2$, $S({=}O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C{=}CR^2$, C≡C, $Si(R^2)_2$, C═O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F.

5. The metal complex of claim 1, wherein the bivalent arylene or heteroarylene groups in formula (1) are the same or different in each instance and are selected from formulae (7) to (31):

Formula (7)

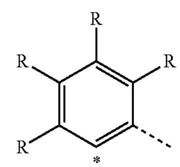

Formula (8)

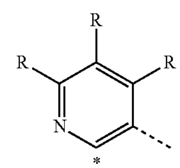

Formula (9)

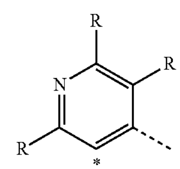

Formula (10)

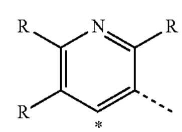

Formula (11)

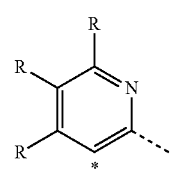

Formula (12)

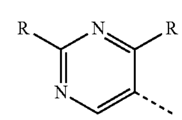

-continued

Formula (13)

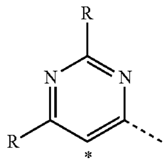

Formula (14)

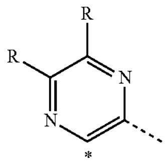

Formula (15)

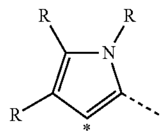

Formula (16)

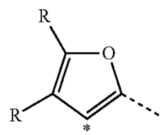

Formula (17)

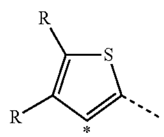

Formula (18)

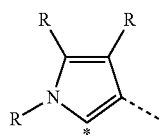

Formula (19)

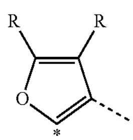

Formula (20)

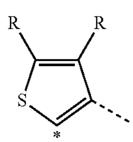

Formula (21)

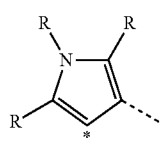

Formula (22)

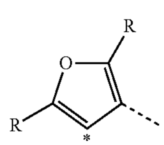

-continued

Formula (23)

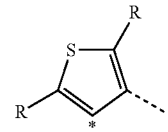

Formula (24)

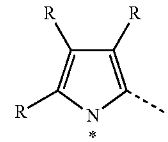

Formula (25)

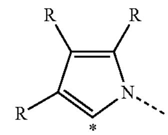

Formula (26)

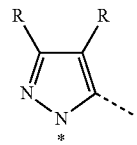

Formula (27)

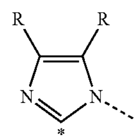

Formula (28)

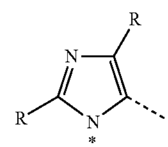

Formula (29)

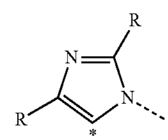

Formula (30)

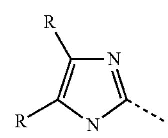

Formula (31)

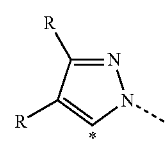

wherein the dotted bond in each case represents the position of the bidentate sub-ligand;

* represents the position of the bond to the central trivalent aryl or heteroaryl group in formula (1); and R is the same or different in each instance and is H, D, F, Cl, Br, I, $N(R^1)_2$, CN, $NO_2$, OH, COOH, C(=O)N$(R^1)_2$, $Si(R^1)_3$, $B(OR^1)_2$, C(=O)$R^1$, P(=O)$(R^1)_2$, $S({=}O)R^1$, $S({=}O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1C{=}CR^1$, $C{\equiv}C$, $Si(R^1)_2$, $C{=}O$, $NR^1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, $C({=}O)R^2$, $P({=}O)(R^2)_2$, $S({=}O)R^2$, $S({=}O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C{=}CR^2$, $C{\equiv}C$, $Si(R^2)_2$, $C{=}O$, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F.

6. The metal complex of claim 1, wherein the group of formula (1) is selected from the groups of formulae (2b) to (5b):

Formula (2b)

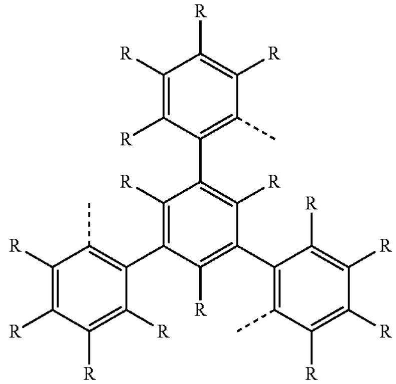

-continued

Formula (3b)

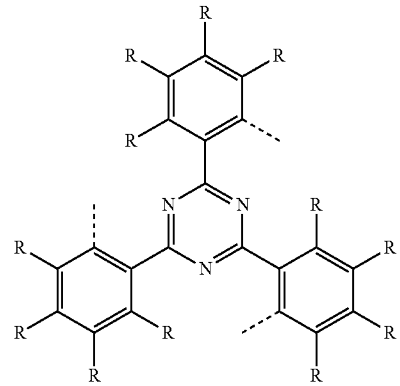

Formula (4b)

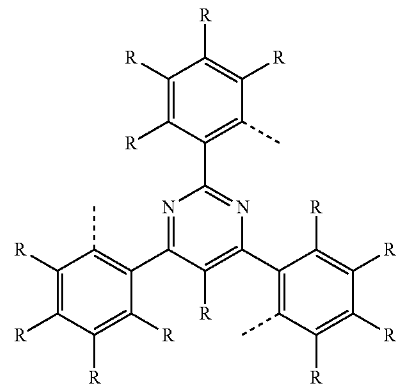

Formula (5b)

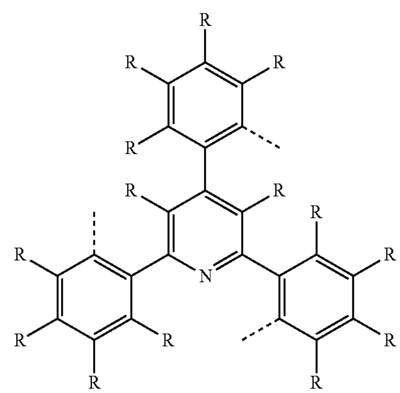

wherein

R is the same or different in each instance and is H, D, F, Cl, Br, I, $N(R^1)_2$, CN, $NO_2$, OH, COOH, $C({=}O)N(R^1)_2$, $Si(R^1)_3$, $B(OR^1)_2$, $C({=}O)R^1$, $P({=}O)(R^1)_2$, $S({=}O)R^1$, $S({=}O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1C{=}CR^1$, $C{\equiv}C$, $Si(R^1)_2$, $C{=}O$, $NR^1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system $R^1$ is the same or different in each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C{=}CR^2$, C≡C, $Si(R^2)_2$, C=O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F.

7. The metal complex of claim 1, wherein the three bidentate sub-ligands are selected identically or two of the bidentate sub-ligands are selected identically and the third bidentate sub-ligand is different from the first two bidentate sub-ligands.

8. The metal complex of claim 1, wherein the metal is selected from the group consisting of aluminium, indium, gallium, and tin, wherein the bidentate sub-ligands are the same or different in each instance and have two nitrogen atoms or two oxygen atoms or one nitrogen atom and one oxygen atom as coordinating atoms, or wherein the metal is selected from the group consisting of chromium, molybdenum, tungsten, rhenium, ruthenium, osmium, rhodium, iridium, iron, cobalt, nickel, palladium, platinum, copper, silver and gold, wherein the bidentate sub-ligands are the same or different in each instance and have one carbon atom and one nitrogen atom or two carbon atoms or two nitrogen atoms or two oxygen atoms or one oxygen atom and one nitrogen atom as coordinating atoms.

9. The metal complex of claim 1, wherein the metal is Ir(III) and two of the bidentate sub-ligands each coordinate to the iridium via one carbon atom and one nitrogen atom and the third of the bidentate sub-ligands coordinates to the iridium via one carbon atom and one nitrogen atom or via two nitrogen atoms or via one nitrogen atom and one oxygen atom or via two oxygen atoms.

10. The metal complex of claim 1, wherein CyC is selected from the structures of formulae (CyC-1) to (CyC-19), wherein the CyC group binds in each case at the position signified by # to CyD in (L-1) and (L-2) and to CyC in (L-4) and at the position signified by * to the metal, and the circle symbol ° represents a direct bond to the bridge of formula (1):

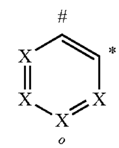

(CyC-1)

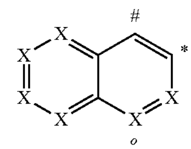

(CyC-2)

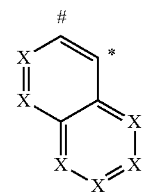

(CyC-3)

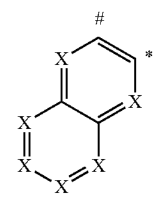

(CyC-4)

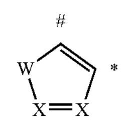

(CyC-5)

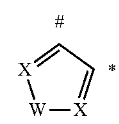

(CyC-6)

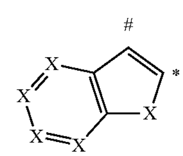

(CyC-7)

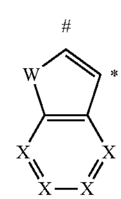

(CyC-8)

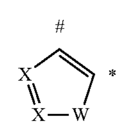

(CyC-9)

-continued
(CyC-10)
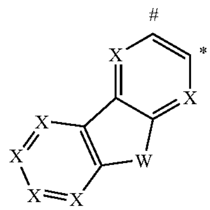
(CyC-11)
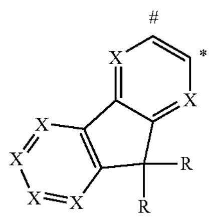
(CyC-12)
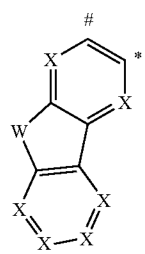
(CyC-13)
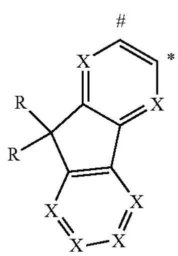
(CyC-14)
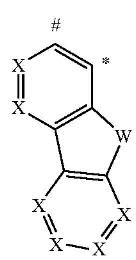
(CyC-15)
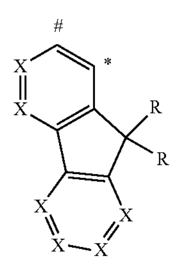
-continued
(CyC-16)
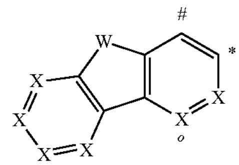
(CyC-17)
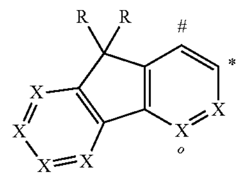
(CyC-18)
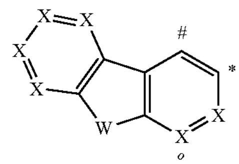
(CyC-19)
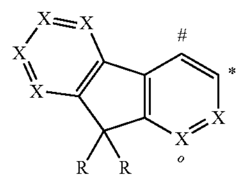
(CyC-20)
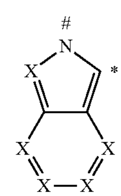
wherein CyD is selected from formulae (CyD-1) to (CyD-14), wherein the CyD group binds in each case at the position signified by # to CyC in (L-1) and (L-2) and to CyD in (L-3) and at the position signified by * to the metal:
(CyD-1)
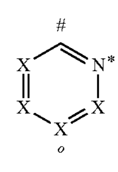
(CyD-2)
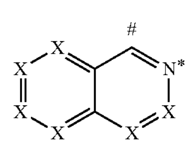

-continued (CyD-3)

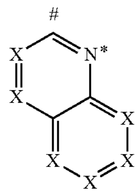

(CyD-4)

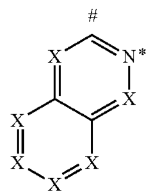

(CyD-5)

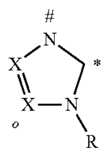

(CyD-6)

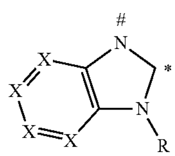

(CyD-7)

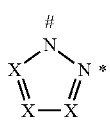

(CyD-8)

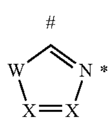

(CyD-9)

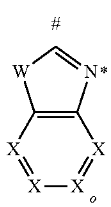

(CyD-10)

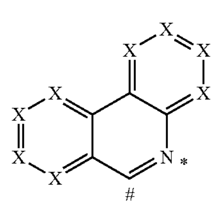

(CyD-11)

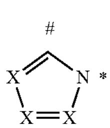

-continued (CyD-12)

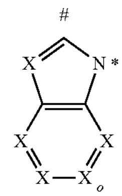

(CyD-13)

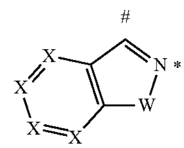

(CyD-14)

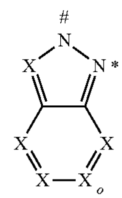

wherein

R is the same or different in each instance and is H, D, F, Cl, Br, I, $N(R^1)_2$, CN, $NO_2$, OH, COOH, C(═O)N$(R^1)_2$, $Si(R^1)_3$, $B(OR^1)_2$, C(═O)$R^1$, P(═O)$(R^1)_2$, S(═O)$R^1$, S(═O)$_2$R', $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1$C═C$R^1$, C≡C, $Si(R^1)_2$, C═O, $NR^1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, C(═O)$R^2$, P(═O)$(R^2)_2$, S(═O)$R^2$, S(═O)$_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2$C═C$R^2$, C≡C, $Si(R^2)_2$, C═O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F;

X is the same or different in each instance and is CR or N, with the proviso that not more than two X per cycle are N; and W is the same or different in each instance and is NR, O, or S;

with the proviso that, when the bridge of formula (1) is bonded to CyC, one X is C and the bridge of formula (1) is bonded to this carbon atom and, when the bridge of formula (1) is bonded to CyD, one X is C and the bridge of formula (1) is bonded to this carbon atom.

11. The metal complex of claim 1, wherein at least one of the bidentate sub-ligands is selected from the structures of formulae (L-1-1), (L-1-2), and (L-2-1) to (L-2-3):

(L-1-1)

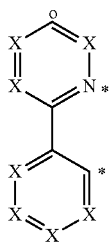

(L-1-2)

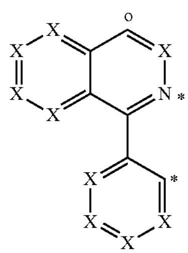

(L-2-1)

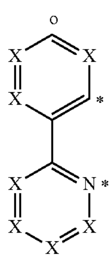

(L-2-2)

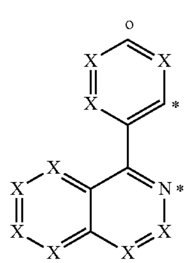

-continued (L-2-3)

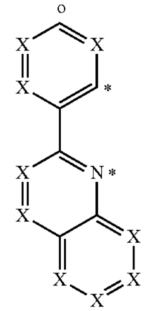

wherein

X is the same or different in each instance and is CR or N, with the proviso that not more than two X per cycle are N;

R is the same or different in each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $P(=O)(R^1)_2$, $S(=O)R^1$, $S(=O)_2R'$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1C=CR^1$, C≡C, $Si(R^1)_2$, C=O, $NR^1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C=CR^2$, C≡C, $Si(R^2)_2$, C=O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F; and o represents the position of the bond to the bridge of the formula (1);

and/or in that at least one of the bidentate sub-ligands is selected from the structures of formulae (L-5) to (L-32):
(L-5)
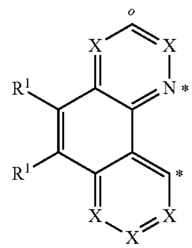
(L-6)
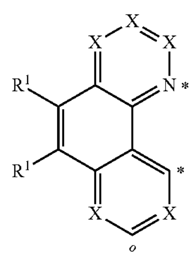
(L-7)
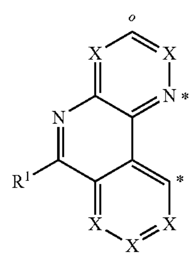
(L-8)
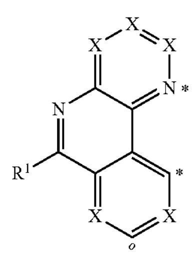
(L-9)
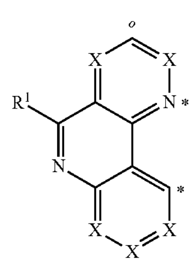
-continued
(L-10)
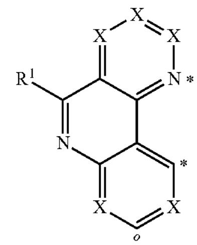
(L-11)
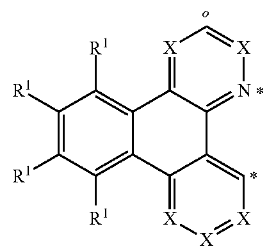
(L-12)
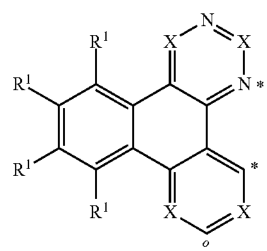
(L-13)
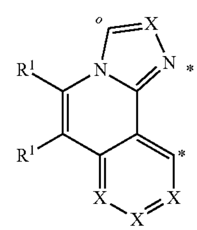
(L-14)
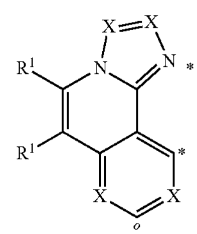
(L-15)
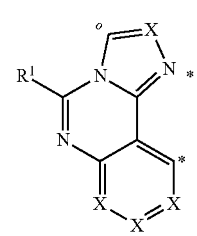

-continued
(L-16)
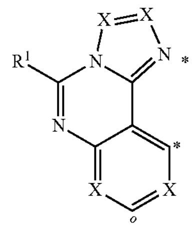
(L-17)
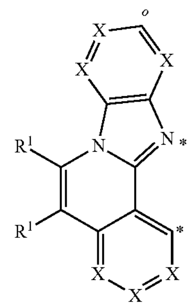
(L-18)
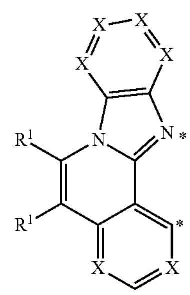
(L-19)
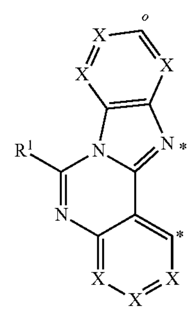
(L-20)
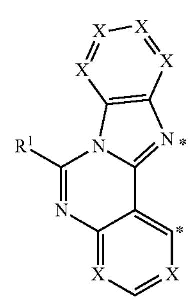
-continued
(L-21)
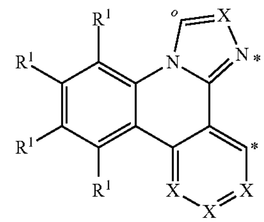
(L-22)
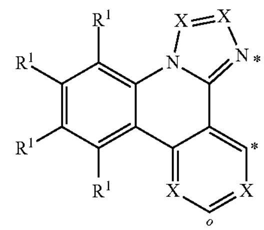
(L-23)
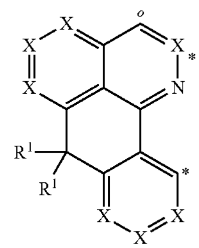
(L-24)
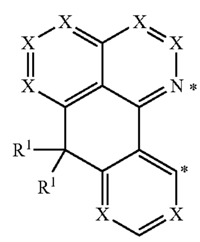
(L-25)
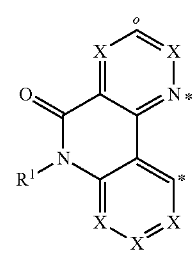
(L-26)
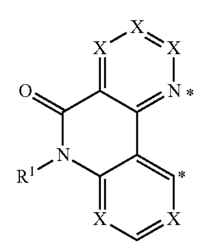

-continued (L-27)

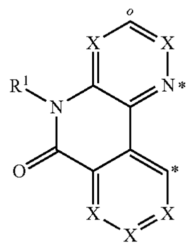

(L-28)

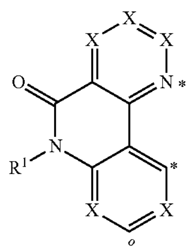

(L-29)

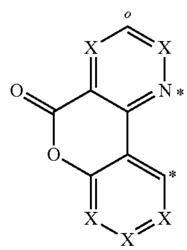

(L-30)

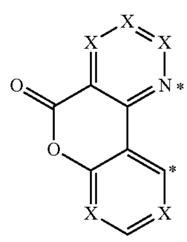

(L-31)

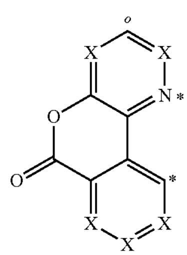

(L-32)

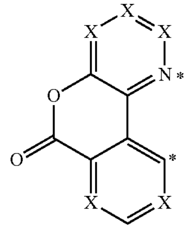

wherein

X is the same or different in each instance and is CR or N, with the proviso that not more than two X per cycle are N;

R is the same or different in each instance and is H, D, F, Cl, Br, I, $N(R^1)_2$, CN, $NO_2$, OH, COOH, C(═O)N$(R^1)_2$, $Si(R^1)_3$, $B(OR^1)_2$, C(═O)$R^1$, P(═O)$(R^1)_2$, S(═O)$R^1$, S(═O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^1$ radicals and wherein one or more nonadjacent $CH_2$ groups are optionally replaced by $R^1C$═$CR^1$, C≡C, $Si(R^1)_2$, C═O, $NR^1$, O, S, or $CONR^1$, an aromatic or heteroaromatic ring system which has 5 to 40 aromatic ring atoms and is optionally substituted in each case by one or more $R^1$ radicals, or an aryloxy or heteroaryloxy group which has 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, C(═O)$R^2$, P(═O)$(R^2)_2$, S(═O)$R^2$, S(═O)$_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C$═$CR^2$, C≡C, $Si(R^2)_2$, C═O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by F;

* represents the position of coordination to the metal; and o indicates the position of a direct bond to the group of the formula (1).

12. The metal complex of claim 1, wherein the metal complex has two substituents which are bonded to adjacent carbon atoms and together define a ring of formulae (43) to (49), and wherein R and $R^1$ of the metal complex refer to any substituent position on the metal complex:

Formula (43)

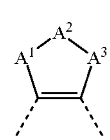

-continued

Formula (44)

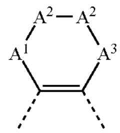

Formula (45)

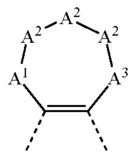

Formula (46)

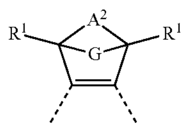

Formula (47)

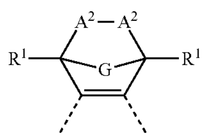

Formula (48)

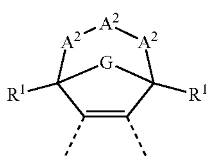

Formula (49)

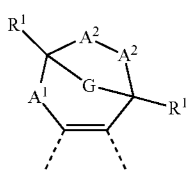

wherein $R^1$ is the same or different in each instance and is H, D, F, Cl, Br, I, $N(R^2)_2$, CN, $NO_2$, $Si(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl group is optionally substituted by one or more $R^2$ radicals and wherein one or more nonadjacent $CH_2$ groups are optionally replaced by $R^2C{=}CR^2$, $C{\equiv}C$, $Si(R^2)_2$, C=O, $NR^2$, O, S, or $CONR^2$, an aromatic or heteroaromatic ring system which has 5 to 40 aromatic ring atoms and is optionally substituted in each case by one or more $R^2$ radicals, or an aryloxy or heteroaryloxy group which has 5 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, in which one or more hydrogen atoms may also be replaced by dotted bonds signify the linkage of the two carbon atoms in the ligand and, in addition:

$A^1$ and $A^3$ are the same or different in each instance and is $C(R^3)_2$, O, S, $NR^3$, or C(=O);

$A^2$ is $C(R^1)_2$, O, S, $NR^3$, or C(=O);

G is an alkylene group which has 1, 2, or 3 carbon atoms and is optionally substituted by one or more $R^2$ radicals, $-CR^2{=}CR^2-$, or an ortho-bonded arylene or heteroarylene group which has 5 to 14 aromatic ring atoms and is optionally substituted by one or more $R^2$ radicals;

$R^3$ is the same or different in each instance and is H, F, a straight-chain alkyl or alkoxy group having 1 to 10 carbon atoms, a branched or cyclic alkyl or alkoxy group having 3 to 10 carbon atoms, wherein the alkyl or alkoxy group is optionally substituted in each case by one or more $R^2$ radicals, wherein one or more nonadjacent $CH_2$ groups are optionally replaced by $R^2C{=}CR^2$, $C{\equiv}C$, $Si(R^2)_2$, C=O, $NR^2$, O, S, or $CONR^2$, an aromatic or heteroaromatic ring system which has 5 to 24 aromatic ring atoms and is optionally substituted in each case by one or more $R^2$ radicals, or an aryloxy or heteroaryloxy group which has 5 to 24 aromatic ring atoms and is optionally substituted by one or more $R^2$ radicals; and wherein two $R^3$ radicals bonded to the same carbon atom together optionally define an aliphatic or aromatic ring system to form a spiro system; and wherein $R^3$ with an adjacent R or $R^1$ radical optionally defines an aliphatic ring system;

with the proviso that no two heteroatoms in these groups are bonded directly to one another and no two C=O groups are bonded directly to one another.

13. An oligomer, polymer, or dendrimer containing one or more metal complexes of claim 1, wherein, rather than a hydrogen atom or a substituent, one or more bonds of the metal complex to the polymer, oligomer, or dendrimer are present.

14. A formulation comprising at least one metal complex of claim 1 and at least one solvent.

15. A formulation comprising at least one oligomer, polymer, or dendrimer of claim 13 and at least one solvent.

16. An electronic device comprising at least one metal complex of claim 1.

17. The electronic device of claim 16, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field quench devices, light-emitting electrochemical cells, oxygen sensors, oxygen sensitizers, and organic laser diodes.

18. An electronic device comprising at least one oligomer, polymer, or dendrimer of claim 13.

19. The electronic device of claim 18, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field quench devices, light-emitting electrochemical cells, oxygen sensors, oxygen sensitizers, and organic laser diodes.

20. The electronic device of claim 16, wherein the electronic device is an organic electroluminescent device, wherein the at least one metal complex is used as emitting compound in one or more emitting layers or as hole transport compound in a hole injection or hole transport layer or as electron transport compound in an electron transport or hole blocking layer.

* * * * *